US011152576B2

(12) United States Patent
Heo et al.

(10) Patent No.: US 11,152,576 B2

(45) Date of Patent: Oct. 19, 2021

(54) ORGANIC LIGHT EMITTING DEVICE

(71) Applicant: LG CHEM, LTD., Seoul (KR)

(72) Inventors: Dong Uk Heo, Daejeon (KR); Dong Hoon Lee, Daejeon (KR); Jungoh Huh, Daejeon (KR); Boonjae Jang, Daejeon (KR); Yongbum Cha, Daejeon (KR); Miyeon Han, Daejeon (KR); Junghoon Yang, Daejeon (KR); Heekyung Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 226 days.

(21) Appl. No.: 16/604,117

(22) PCT Filed: May 29, 2018

(86) PCT No.: PCT/KR2018/006078

§ 371 (c)(1),
(2) Date: Oct. 9, 2019

(87) PCT Pub. No.: WO2018/221930

PCT Pub. Date: Dec. 6, 2018

(65) Prior Publication Data

US 2021/0013422 A1 Jan. 14, 2021

(30) Foreign Application Priority Data

May 29, 2017 (KR) ........................ 10-2017-0066305

(51) Int. Cl.
*H01L 51/00* (2006.01)
*H01L 51/50* (2006.01)

(52) U.S. Cl.
CPC ...... *H01L 51/0072* (2013.01); *H01L 51/0054* (2013.01); *H01L 51/0061* (2013.01);
(Continued)

(58) Field of Classification Search
None
See application file for complete search history.

(56) References Cited

U.S. PATENT DOCUMENTS 9,722,187 B2 8/2017 Jeong et al.
2009/0236590 A1* 9/2009 Ohsawa ................ H01L 51/006 257/40

(Continued)

FOREIGN PATENT DOCUMENTS

CN 102786508 11/2012
JP 2003-096072 4/2003

(Continued)

OTHER PUBLICATIONS

Adachi et al., "Enhancement of electron transport by horizontal molecular orientation of oxadiazole planar molecules in organic amorphous films," Applied Physics Letters 95: 243303, 3 pages (2009).

*Primary Examiner* — Dung A. Le
(74) *Attorney, Agent, or Firm* — Dentons US LLP

(57) ABSTRACT

Provided is an organic light emitting device including an anode; a cathode; and a light emitting layer provided between the anode and the cathode, the device further including an electron control layer provided between the light emitting layer and the cathode and including a compound of Chemical Formula 1:

(Continued)

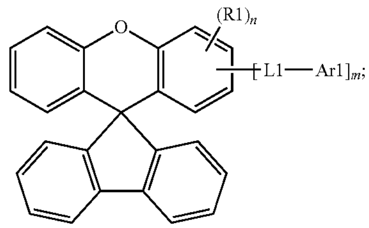

and an electron transfer layer provided between the electron control layer and the cathode and including a compound of Chemical Formula 3:

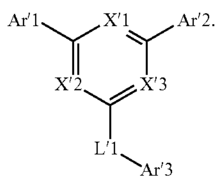

16 Claims, 12 Drawing Sheets

(52) U.S. Cl.
CPC ...... *H01L 51/0069* (2013.01); *H01L 51/0073* (2013.01); *H01L 51/0077* (2013.01); *H01L 51/5072* (2013.01); *H01L 2251/552* (2013.01)

(56) References Cited

U.S. PATENT DOCUMENTS

| | | | | |
|---|---|---|---|---|
| 2011/0253944 | A1* | 10/2011 | Han | C07D 209/02 252/500 |
| 2013/0334521 | A1* | 12/2013 | Lee | C07D 213/24 257/40 |
| 2015/0295181 | A1 | 10/2015 | Mujica-Fernaud et al. | |
| 2016/0118599 | A1 | 4/2016 | Jeong et al. | |
| 2018/0233688 | A1* | 8/2018 | Chen | H01L 51/5072 |
| 2019/0055222 | A1 | 2/2019 | Han et al. | |

FOREIGN PATENT DOCUMENTS

| | | |
|---|---|---|
| KR | 10-2000-0051826 | 8/2000 |
| KR | 10-2015-0083917 | 7/2015 |
| KR | 10-2015-0106501 | 9/2015 |
| KR | 10-2016-0047670 | 5/2016 |
| WO | 2017/074052 | 5/2017 |

* cited by examiner

【FIG. 1】
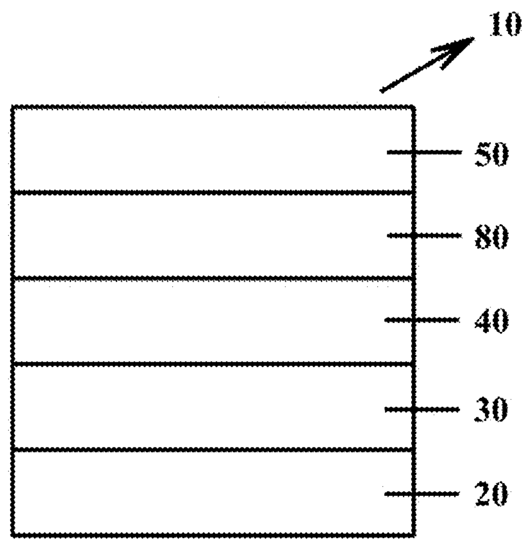
【FIG. 2】
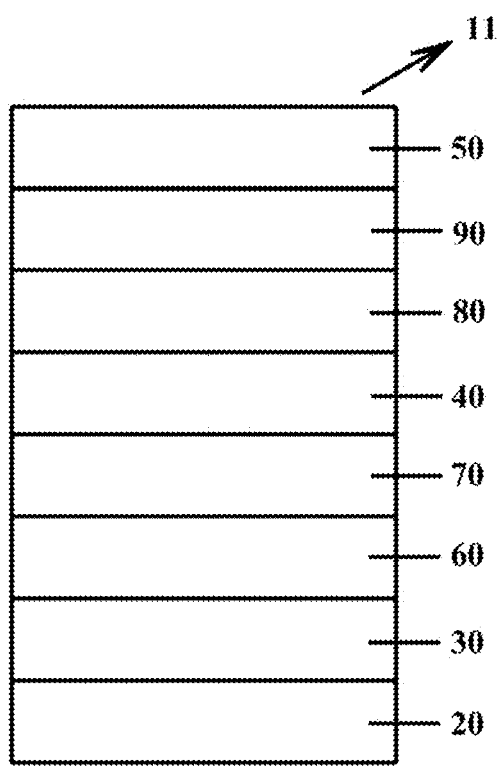

【FIG. 3】
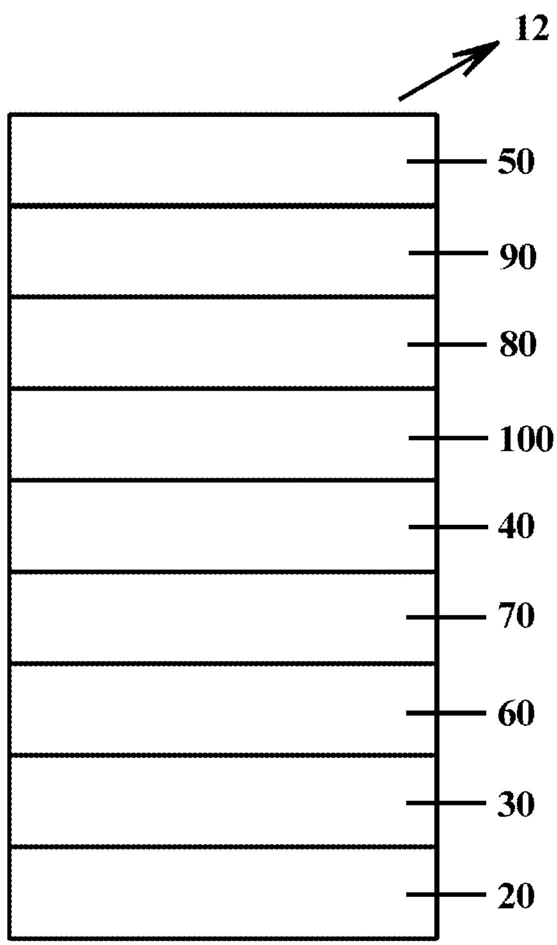

【FIG. 4】
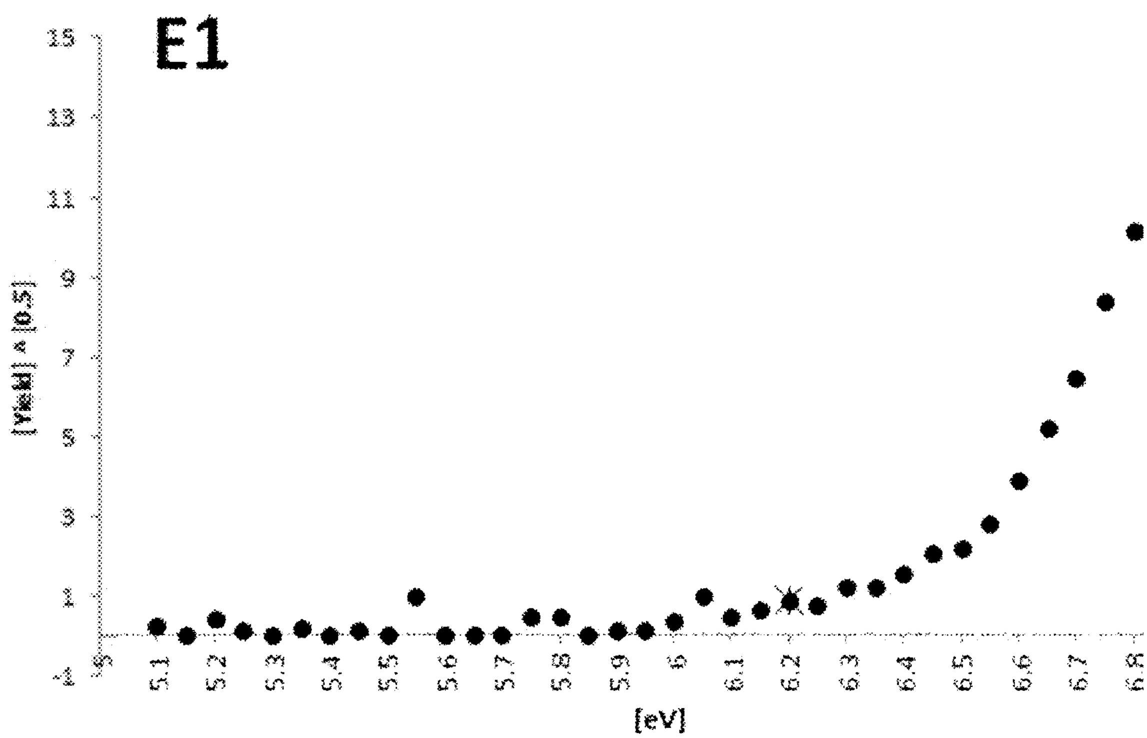
【FIG. 5】
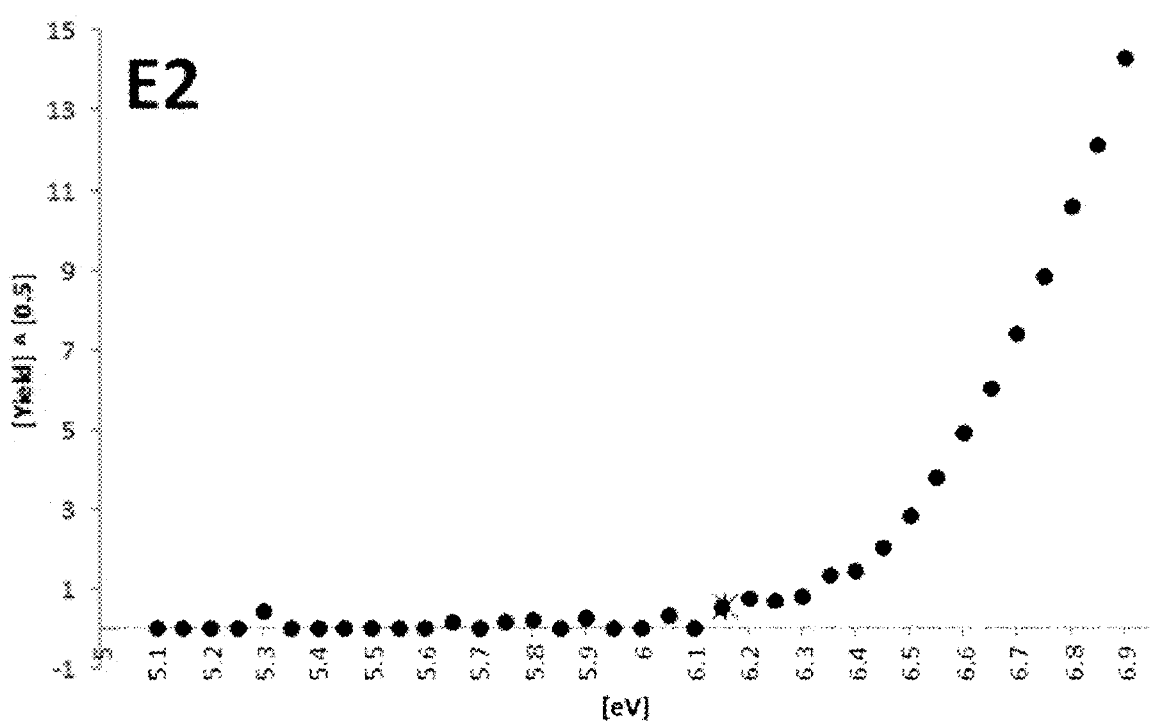

【FIG. 6】
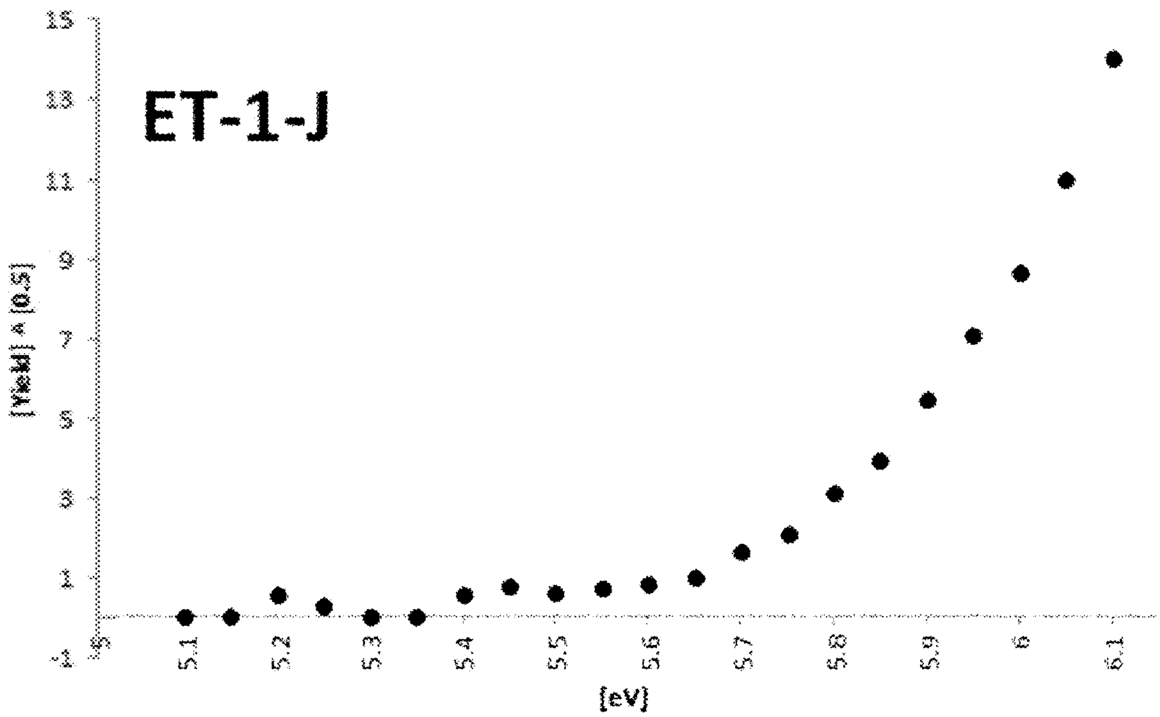
【FIG. 7】
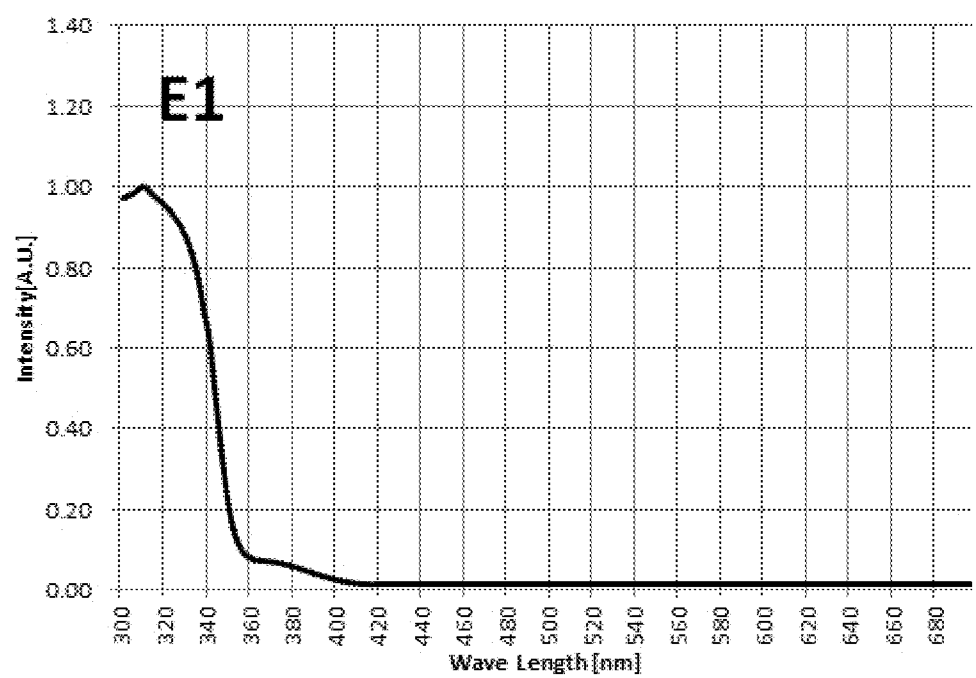

【FIG. 8】
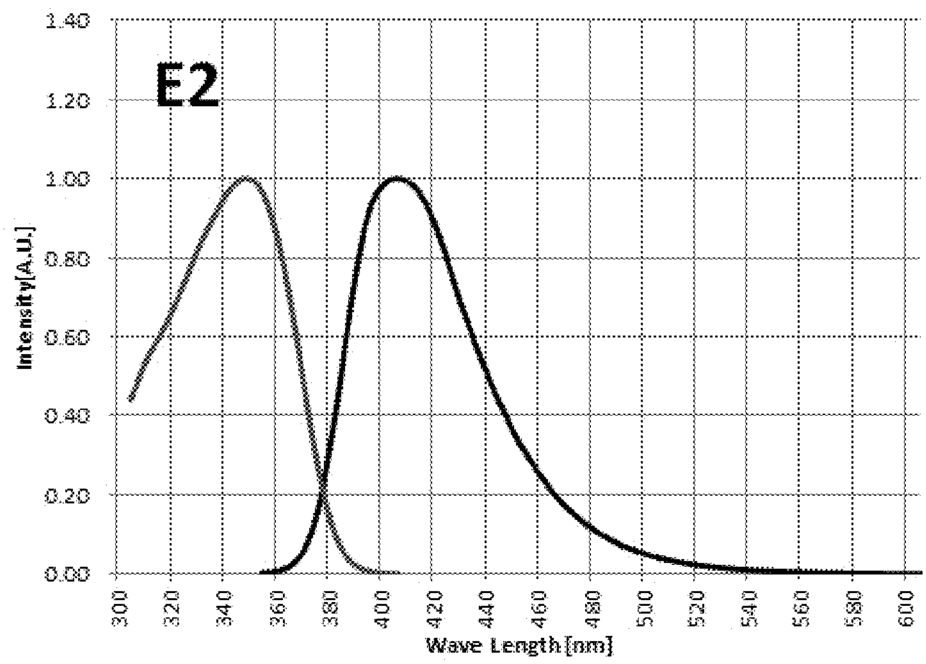
【FIG. 9】
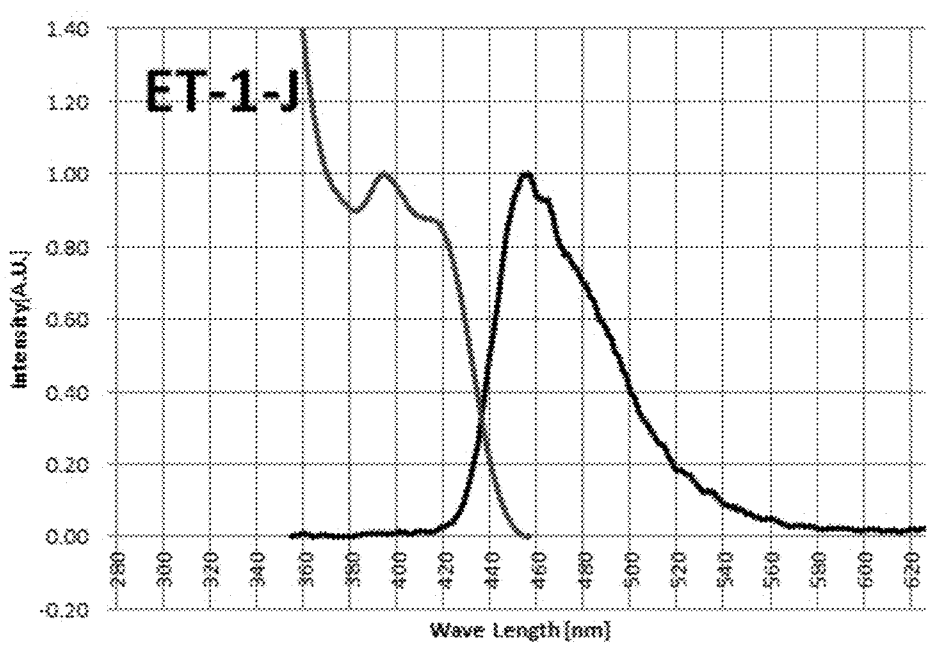

【FIG. 10】
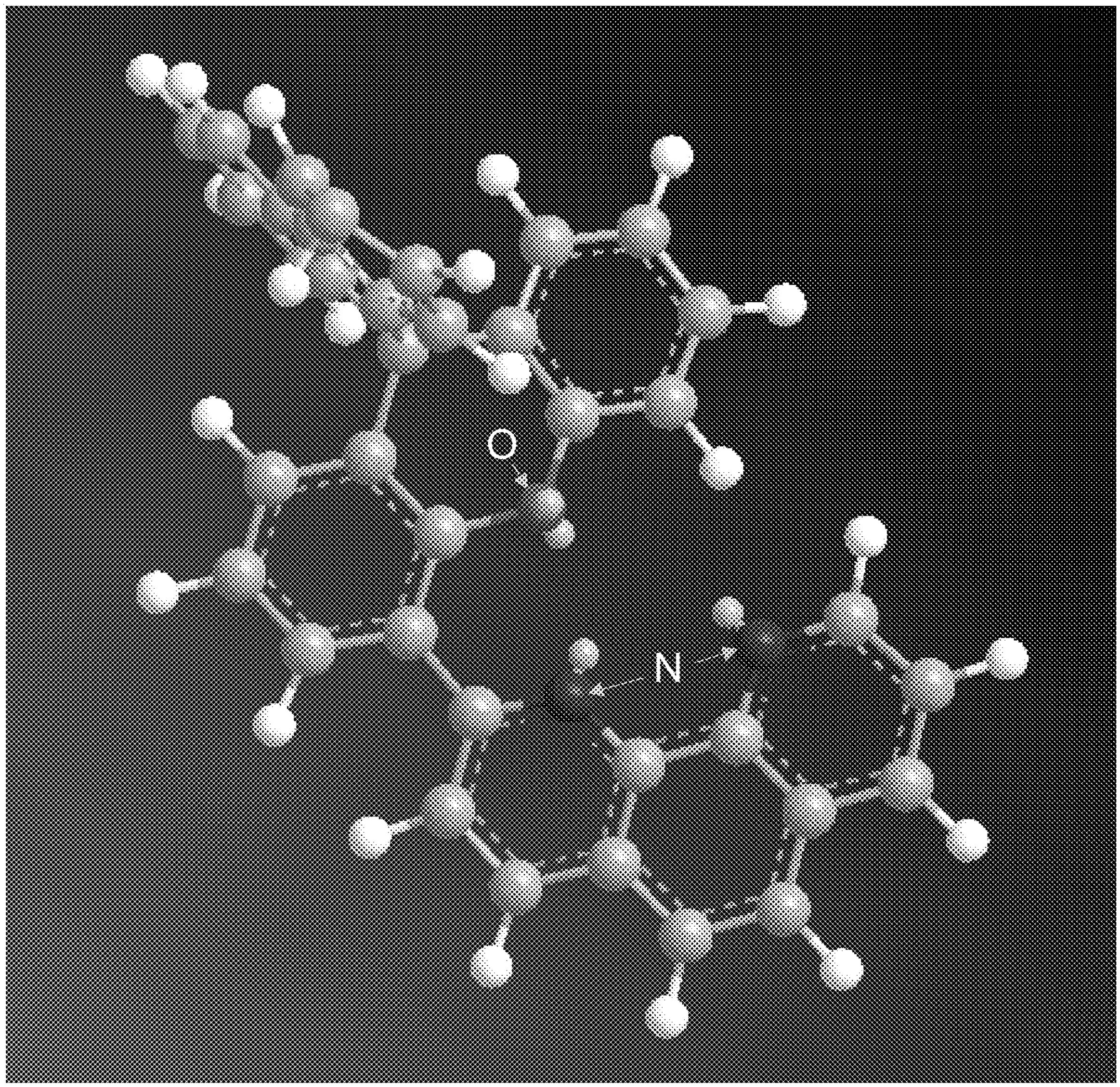

【FIG. 11】
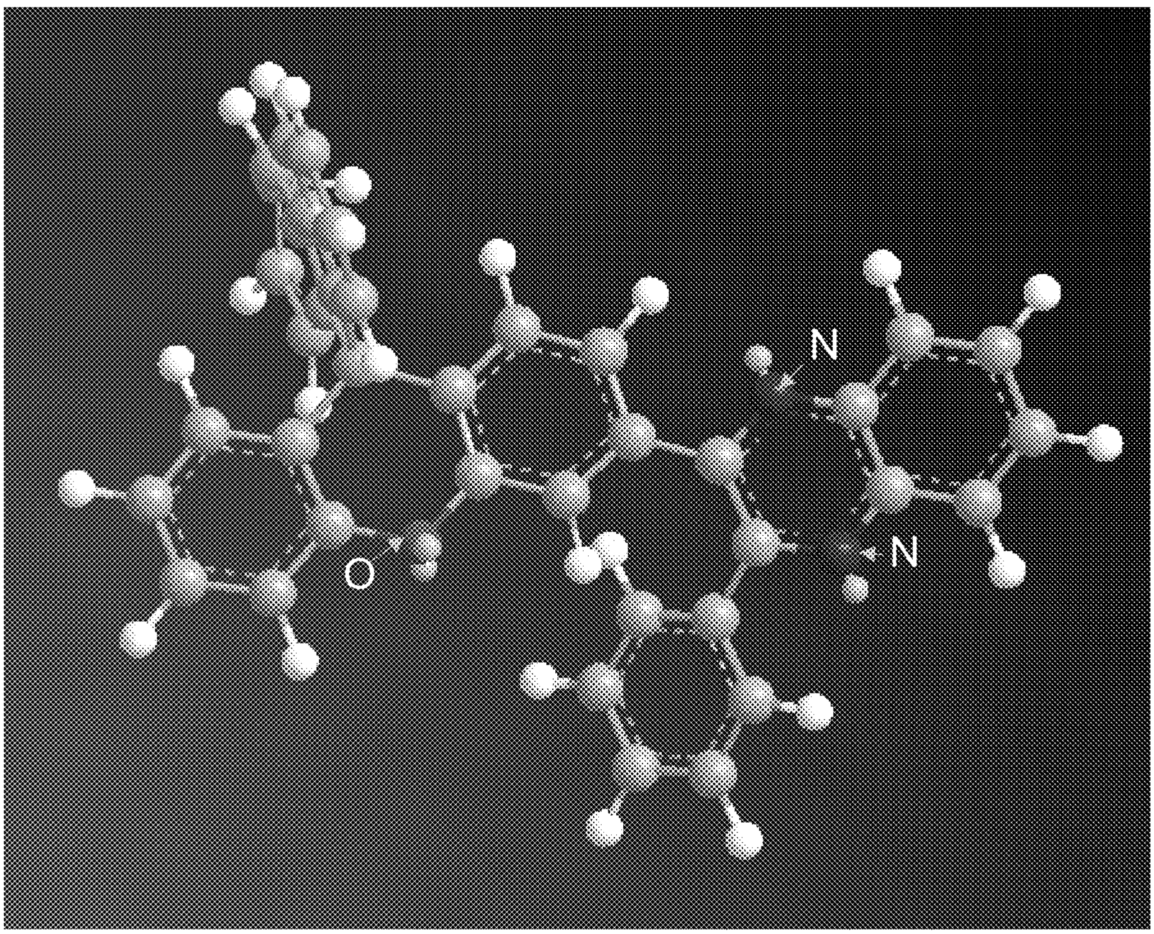

【FIG. 12】
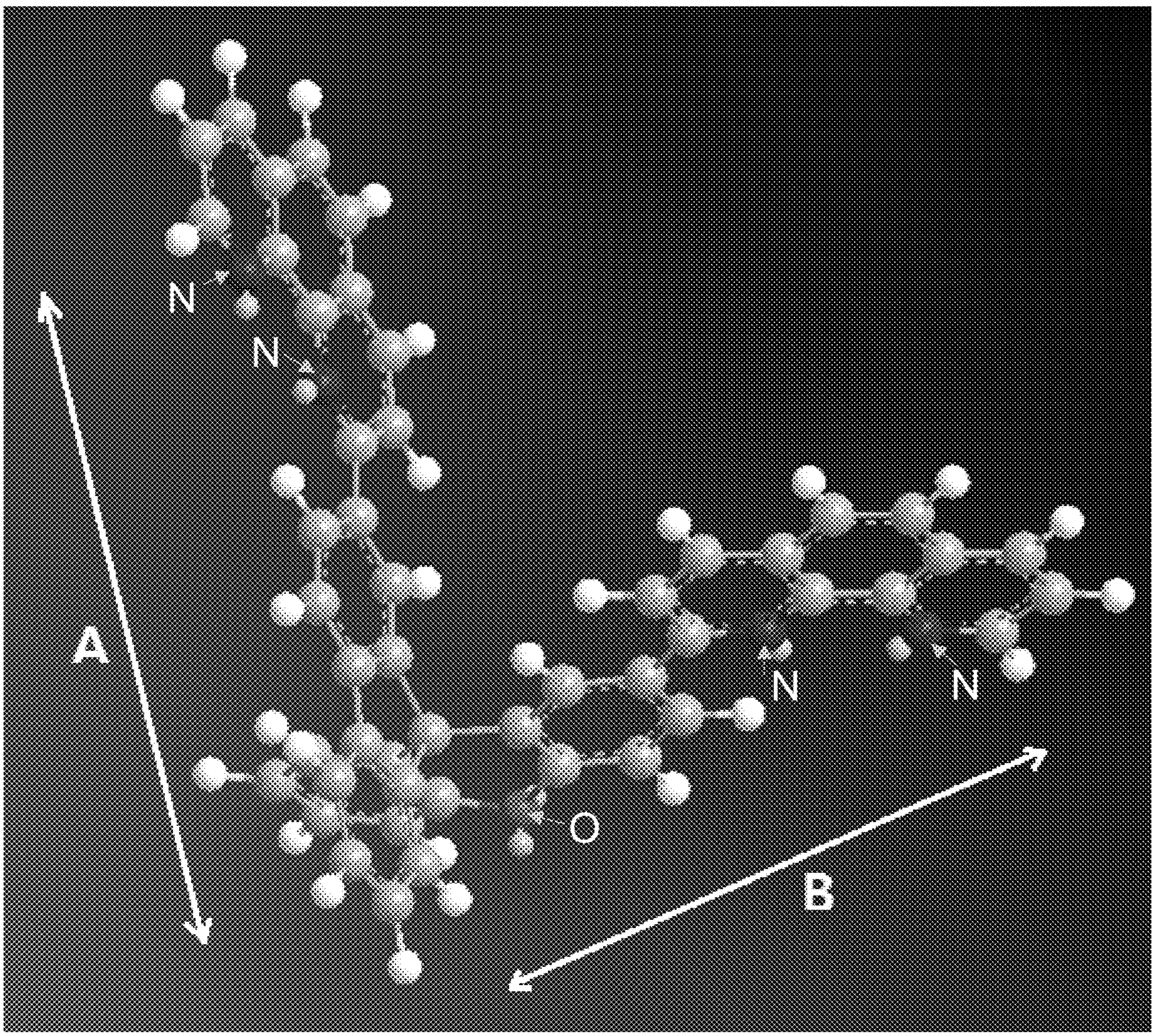

【FIG. 13】
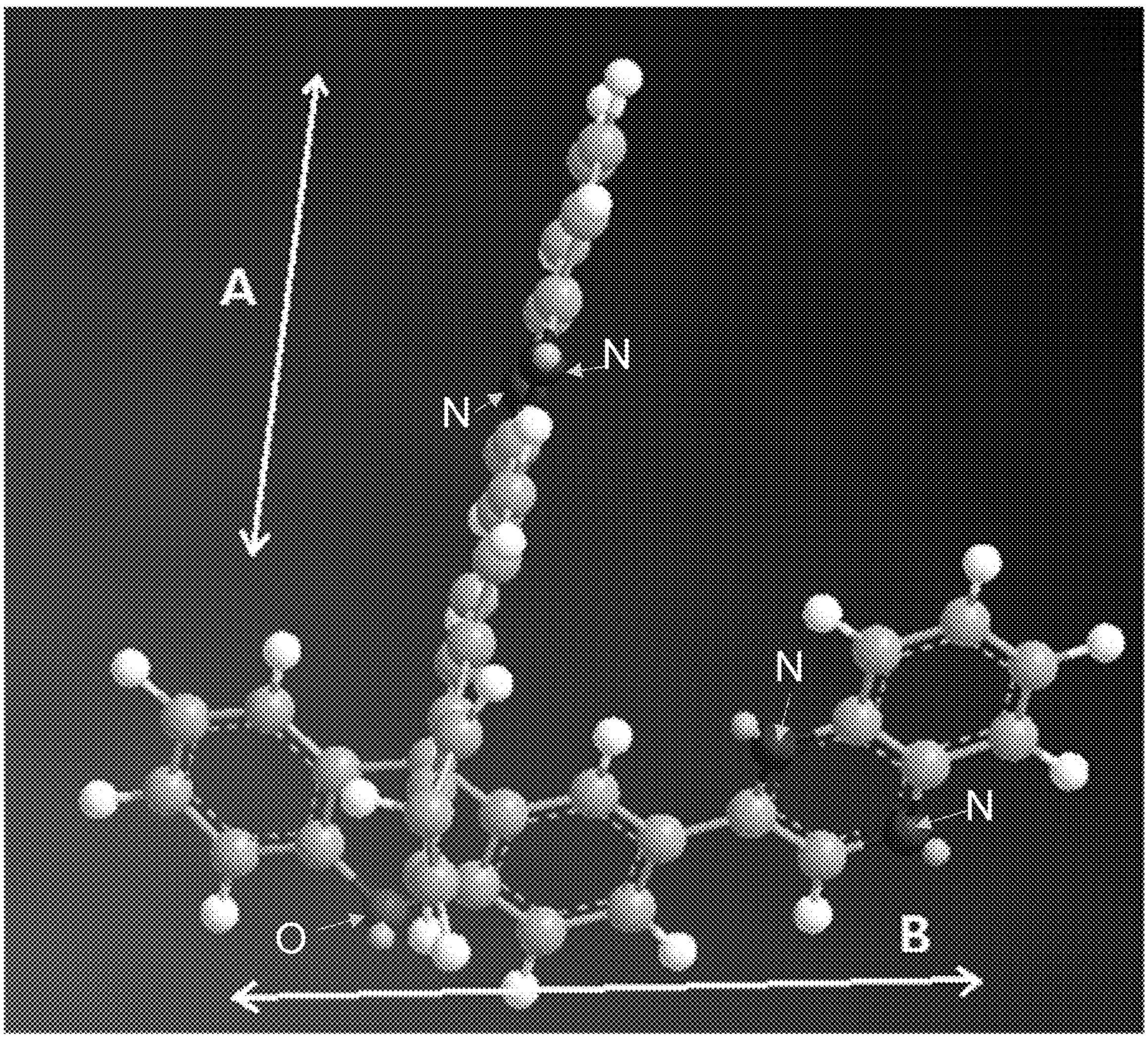

【FIG. 14】
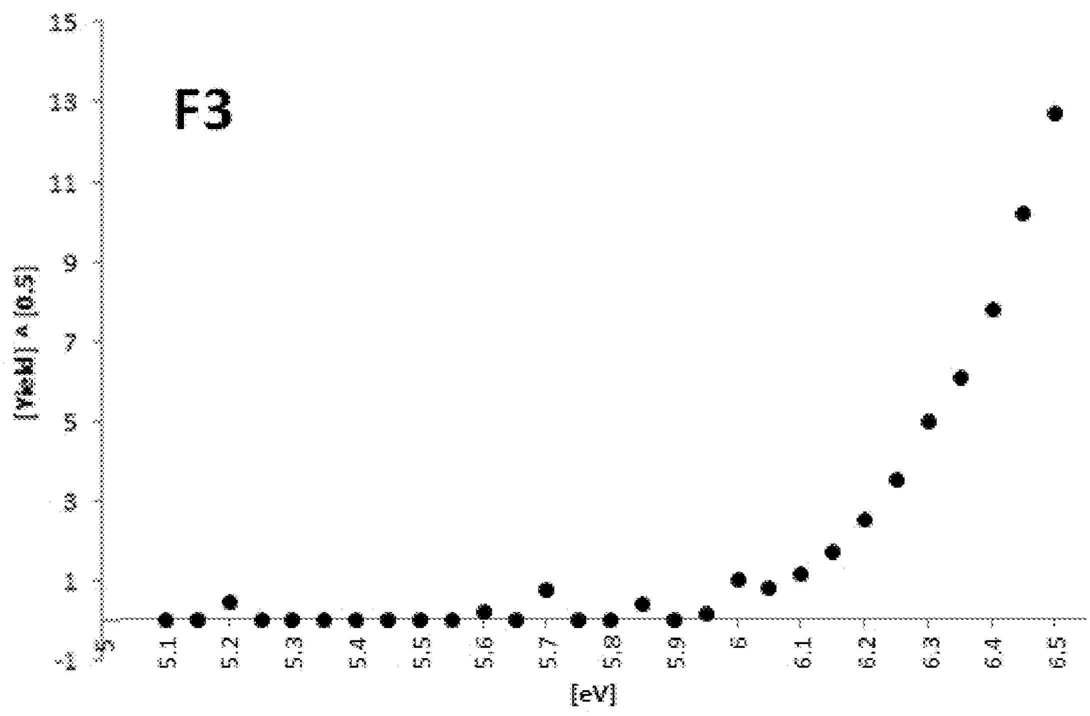
【FIG. 15】
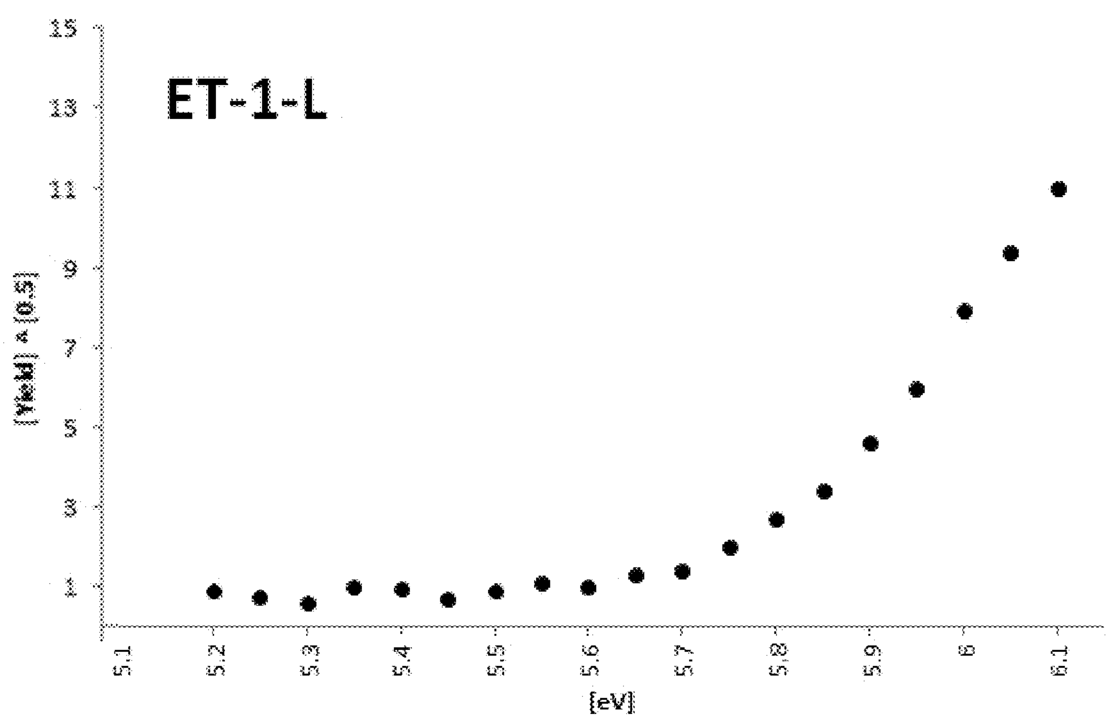

【FIG. 16】
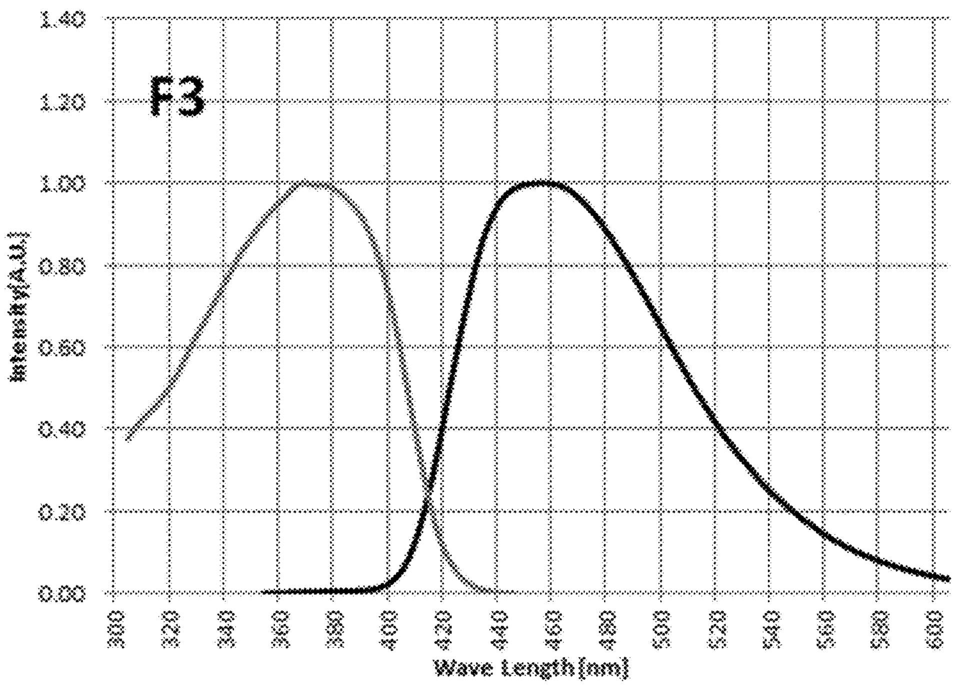
【FIG. 17】
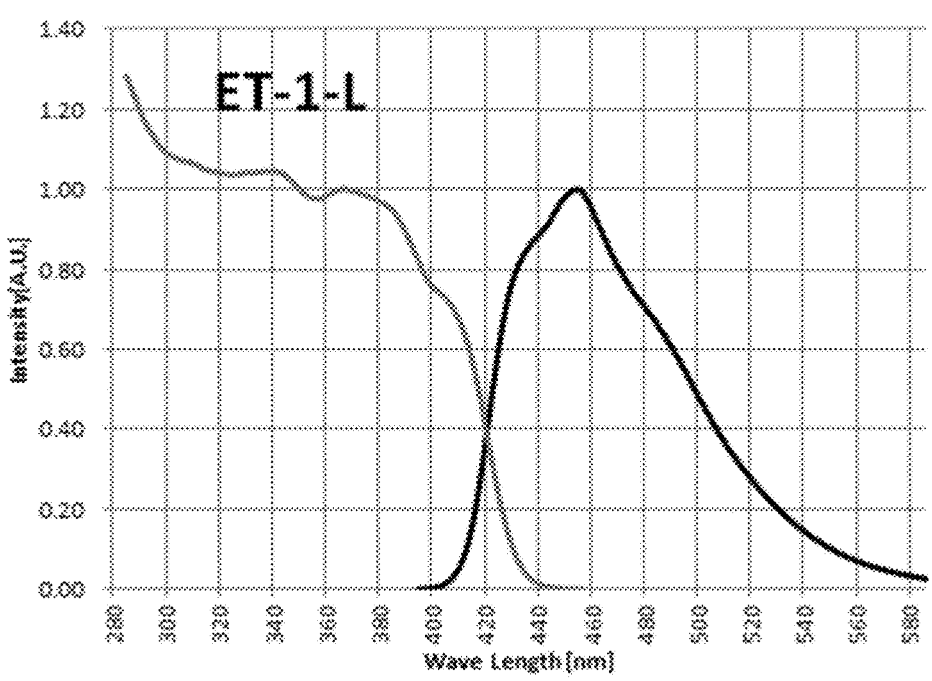

【FIG. 18】
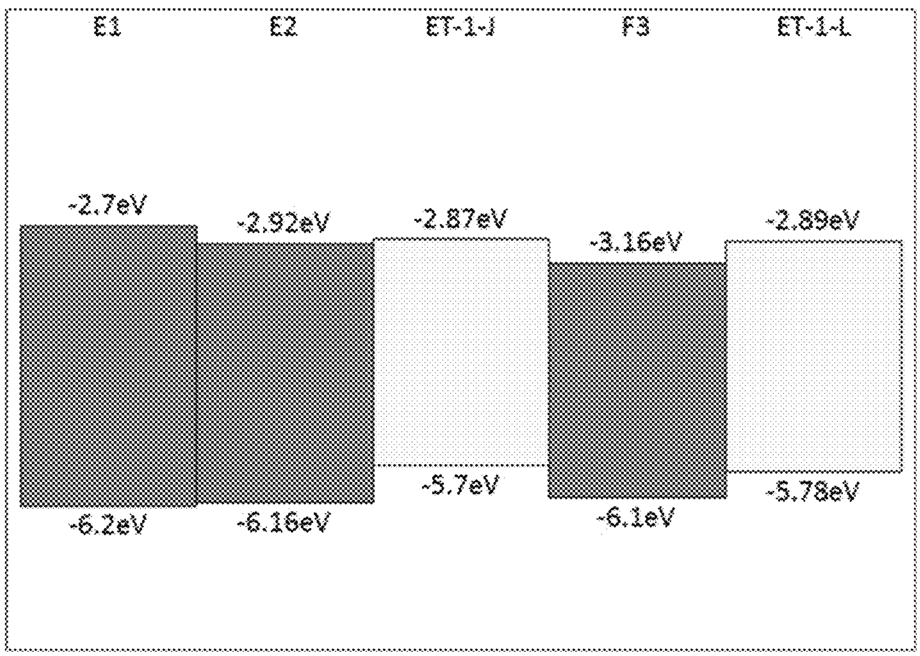

ORGANIC LIGHT EMITTING DEVICE

RELATED APPLICATION

This application is a National Stage Application of International Application No. PCT/KR2018/006078 filed on May 29, 2018, which claims priority to and the benefit of the filing date of Korean Patent Application No. 10-2017-0066305, filed with the Korean Intellectual Property Office on May 29, 2017, the entire contents of which are incorporated herein by reference.

Technical Field

The present specification relates to an organic light emitting device.

Background Art

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

PRIOR ART DOCUMENTS

Korean Patent Application Laid-Open Publication No. 10-2000-0051826

DISCLOSURE

Technical Problem

The present specification provides an organic light emitting device.

Technical Solution

One embodiment of the present specification provides an organic light emitting device including an anode; a cathode; and a light emitting layer provided between the anode and the cathode, the device further including an electron control layer provided between the light emitting layer and the cathode and including a compound of the following Chemical Formula 1; and an electron transfer layer provided between the electron control layer and the cathode and including a compound of the following Chemical Formula 3:

[Chemical Formula 1]

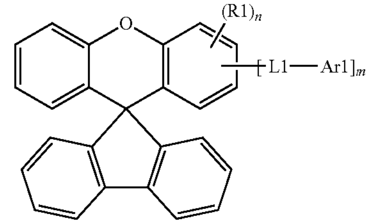

in Chemical Formula 1,

R1 is hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, L1 is a direct bond; a substituted or unsubstituted arylene group; or a substituted or unsubstituted heteroarylene group, Ar1 is hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted monocyclic heterocyclic group; a substituted or unsubstituted tricyclic or higher heterocyclic group; a substituted or unsubstituted dicyclic heterocyclic group including two or more Ns; a substituted or unsubstituted isoquinolyl group; or a structure represented by the following Chemical Formula 2, m is an integer of 1 to 4, n is an integer of 0 to 3, and $1 \leq n+m \leq 4$, and when m and n are each an integer of 2 or greater, two or more structures in the parentheses are the same as or different from each other,

[Chemical Formula 2]

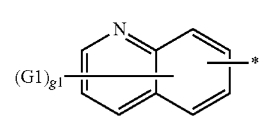

in Chemical Formula 2,

G1 is hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, g1 is an integer of 1 to 6, and when g1 is 2 or greater, G1s are the same as or different from each other, and

* is a site bonding to L1 of Chemical Formula 1,

[Chemical Formula 3]

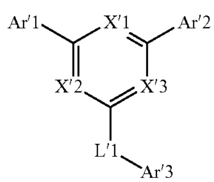

in Chemical Formula 3,

Ar'1 and Ar'2 are the same as or different from each other, and each independently a substituted or unsubstituted aryl group or a substituted or unsubstituted heteroaryl group, X'1 is N or CR'1, X'2 is N or CR'2, and X'3 is N or CR'3, at least two of X'1 to X'3 are N, L'1 is a direct bond; a substituted or unsubstituted arylene group; or a substituted or unsubstituted heteroarylene group, R'1 to R'3 are the same as or different from each other, and each independently hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, and Ar'3 is represented by the following Chemical Formula 4a, 4b or 4c,

[Chemical Formula 4a]

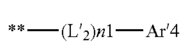

[Chemical Formula 4b]

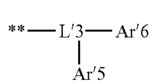

-continued

[Chemical Formula 4c]

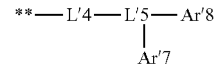

in Chemical Formulae 4a to 4c,

** is a site bonding to L'1 of Chemical Formula 3, n1 is an integer of 1 to 3,

L'2 and L'4 are the same as or different from each other, and each independently a direct bond; a substituted or unsubstituted alkylene group; a substituted or unsubstituted arylene group; or a substituted or unsubstituted heteroarylene group, L'3 and L'5 are the same as or different from each other, and each independently a substituted or unsubstituted trivalent aryl group; or a substituted or unsubstituted trivalent heteroaryl group, and Ar'4 to Ar'8 are the same as or different from each other, and each independently a nitrile group; an aryl group unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group; or a substituted or unsubstituted heteroaryl group.

Advantageous Effects

An organic light emitting device according to one embodiment of the present specification is capable of enhancing efficiency, obtaining a low driving voltage and/or enhancing lifetime properties.

DESCRIPTION OF DRAWINGS

FIG. 1 is a diagram illustrating an organic light emitting device (10) according to one embodiment of the present specification.

FIG. 2 is a diagram illustrating an organic light emitting device (11) according to another embodiment of the present specification.

FIG. 3 is a diagram illustrating an organic light emitting device (12) according to another embodiment of the present specification.

FIG. 4 is a diagram showing a HOMO energy level measured for Compound E1 of Preparation Example 1-1 according to one embodiment of the present specification using an optoelectronic spectrometer.

FIG. 5 is a diagram showing a HOMO energy level measured for Compound E2 of Preparation Example 1-2 according to one embodiment of the present specification using an optoelectronic spectrometer.

FIG. 6 is a diagram showing a HOMO energy level measured for Compound [ET-1-J] using an optoelectronic spectrometer.

FIG. 7 is a diagram showing a LUMO energy level calculated as a wavelength value measured for Compound E1 of Preparation Example 1-1 according to one embodiment of the present specification through photoluminescence (PL).

FIG. 8 is a diagram showing a LUMO energy level calculated as a wavelength value measured for Compound E2 of Preparation Example 1-2 according to one embodiment of the present specification through photoluminescence (PL).

FIG. 9 is a diagram showing a LUMO energy level calculated as a wavelength value measured for Compound [ET-1-J] through photoluminescence (PL).

FIG. 10 is a diagram showing a molecular 3D structure for Compound E9 of Preparation Example 1-9 according to one embodiment of the present specification using Chem 3D Pro.

FIG. 11 is a diagram showing a molecular 3D structure for Compound E18 of Preparation Example 1-18 according to one embodiment of the present specification using Chem 3D Pro.

FIG. 12 is a diagram showing a molecular 3D structure for Compound [ET-1-E] using Chem 3D Pro.

FIG. 13 is a diagram showing a molecular 3D structure for Compound [ET-1-I] using Chem 3D Pro.

FIG. 14 is a diagram showing a HOMO energy level measured for Compound F3 of Preparation Example 2-3 according to one embodiment of the present specification using an optoelectronic spectrometer.

FIG. 15 is a diagram showing a HOMO energy level measured for Compound [ET-1-L] using an optoelectronic spectrometer.

FIG. 16 is a diagram showing a LUMO energy level calculated as a wavelength value measured for Compound F3 of Preparation Example 2-3 according to one embodiment of the present specification through photoluminescence (PL).

FIG. 17 is a diagram showing a LUMO energy level calculated as a wavelength value measured for Compound [ET-1-L] through photoluminescence (PL).

FIG. 18 is a diagram showing HOMO energy and LUMO energy values for compounds measured in Example 2 of the present specification.

MODE FOR DISCLOSURE

Hereinafter, the present specification will be described in more detail.

One embodiment of the present specification provides an organic light emitting device including an anode; a cathode; and a light emitting layer provided between the anode and the cathode, the device further including an electron control layer provided between the light emitting layer and the cathode and including a compound of Chemical Formula 1; and an electron transfer layer provided between the electron control layer and the cathode and including a compound of Chemical Formula 3.

When using the compound of Chemical Formula 3 alone as an electron transfer layer without an electron control layer, a barrier can occur in electron injection to a light emitting layer although an electron injection ability from a cathode is smooth (refer to Example 1 and Example 2). However, when using the compound of Chemical Formula 1 as an electron control layer, and using the compound of Chemical Formula 3 as an electron transfer layer at the same time, efficiency and lifetime properties of an organic light emitting device may be enhanced by excellent hole blocking and effectively moving electron injection.

An organic light emitting device according to one embodiment of the present specification can enhance driving voltage, efficiency and/or lifetime properties by controlling materials included in an electron control layer and an electron transfer layer, and thereby adjusting an energy level between each layer.

According to one embodiment of the present specification, the compound of Chemical Formula 1 is capable of enhancing efficiency, obtaining a low driving voltage and enhancing lifetime properties in an organic light emitting device by being included in an electron control layer as a non-linear structure. In addition, in the structure of the compound of Chemical Formula 1, molecular dipole moment can be designed close to nonpolar by a substituent Ar1 having an electron deficient-structured substituent, and therefore, an amorphous layer can be formed when manufacturing an organic light emitting device including the compound of Chemical Formula 1 in an electron control layer. Accordingly, the organic light emitting device according to one embodiment of the present specification is capable of enhancing efficiency, obtaining a low driving voltage and enhancing lifetime properties.

Particularly, the compound represented by Chemical Formula 1 has substituents in just one benzene in the spiro fluorene xanthene (core structure), and, particularly when n=0 and m=1, has a three-dimensionally horizontal structure as well as having the above-described electronic properties, and therefore, electron mobility is strengthened when forming an organic material layer using such a material. On the other hand, when two or more benzene rings are substituted in the core structure of Chemical Formula 1, the horizontal structure as above may not be obtained, and therefore, electron mobility is low compared to the compound of the present disclosure.

In the present specification, the "energy level" means a size of energy. Accordingly, the energy level is interpreted to mean an absolute value of the corresponding energy value. For example, the energy level being low or deep means an absolute value increasing in a negative direction from a vacuum level.

In the present specification, a highest occupied molecular orbital (HOMO) means a molecular orbital present in a region with highest energy in a region where electrons are capable of participating in bonding, a lowest unoccupied molecular orbital (LUMO) means a molecular orbital present in a region with lowest energy in an electron anti-bonding region, and a HOMO energy level means a distance from a vacuum level to the HOMO. In addition, a LUMO energy level means a distance from a vacuum level to the LUMO. In the present specification, a bandgap means a difference between HOMO and LUMO energy levels, that is, a HOMO-LUMO gap.

According to one embodiment of the present specification, the compound represented by Chemical Formula 1 can have a HOMO energy level of 6.0 eV or greater, a triplet energy level of 2.5 eV or greater, and a bandgap of 3.0 eV or greater.

As triplet energy increases, efficiency of an organic light emitting device can be enhanced since triplet energy of a light emitting layer is not transferred to adjacent layers. In addition, having a HOMO energy level of 6.0 eV or greater in an electron control layer prevents hole transfer of a light emitting layer, and a device with high efficiency and long lifetime can be manufactured.

Accordingly, when using the compound of Chemical Formula 1 satisfying the above-mentioned range in an electron control layer, electron mobility is high, and therefore, properties of low driving voltage, high efficiency and long lifetime are obtained when used in an organic light emitting device. In addition, by the LUMO energy level having a value of 3.0 eV to 2.6 eV, an energy barrier with a light emitting layer is not high making electron injection smooth. The LUMO energy level means an energy level in a region having a low energy barrier with a light emitting layer.

In the present specification, the HOMO energy level can be measured using an optoelectronic spectrometer (manufactured by RIKEN KEIKI Co., Ltd.: AC3) under the atmosphere, and the LUMO energy level can be calculated as a wavelength value measured through photoluminescence (PL).

In the present specification, a description of a certain part “including” certain constituents means capable of further including other constituents, and does not exclude other constituents unless particularly stated on the contrary.

In the present specification, a description of one member being placed “on” another member includes not only a case of the one member adjoining the another member but a case of still another member being present between the two members.

Examples of substituents in the present specification are described below, however, the substituents are not limited thereto.

The team “substitution” means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents can be the same as or different from each other.

In the present specification, the term “substituted or unsubstituted” means being substituted with one, two or more substituents selected from the group consisting of deuterium; a halogen group; a nitrile group; a nitro group; an imide group; an amide group; a carbonyl group; an ester group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; and a substituted or unsubstituted heterocyclic group, or being substituted with a substituent linking two or more substituents among the substituents illustrated above, or having no substituents. For example, “a substituent linking two or more substituents” can include a biphenyl group. In other words, a biphenyl group can be an aryl group, or interpreted as a substituent linking two phenyl groups.

In the present specification, the halogen group can include fluorine, chlorine, bromine or iodine.

In the present specification, the number of carbon atoms of the imide group is not particularly limited, but is preferably from 1 to 30. Specifically, compounds having structures as below can be included, however, the imide group is not limited thereto.

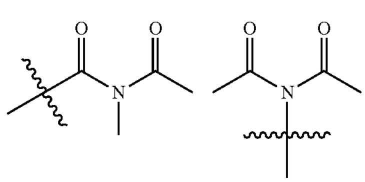

-continued

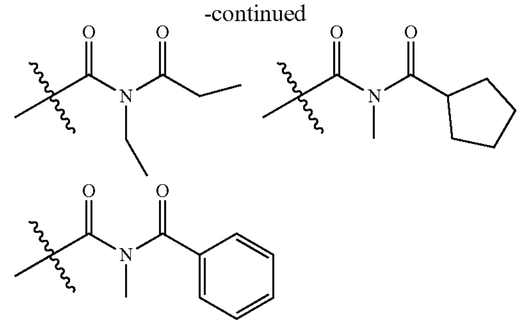

In the present specification, in the amide group, the nitrogen of the amide group can be substituted with a linear, branched or cyclic alkyl group having 1 to 30 carbon atoms or an aryl group having 6 to 30 carbon atoms. Specifically, compounds having the following structural formulae can be included, however, the amide group is not limited thereto.

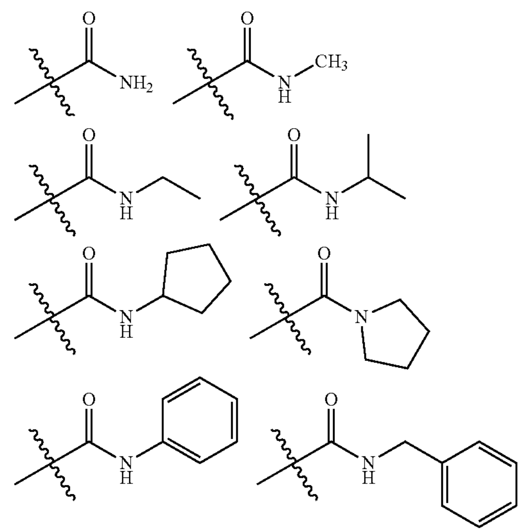

In the present specification, the number of carbon atoms of the carbonyl group is not particularly limited, but is preferably from 1 to 30. Specifically, compounds having structures as below can be included, however, the carbonyl group is not limited thereto.

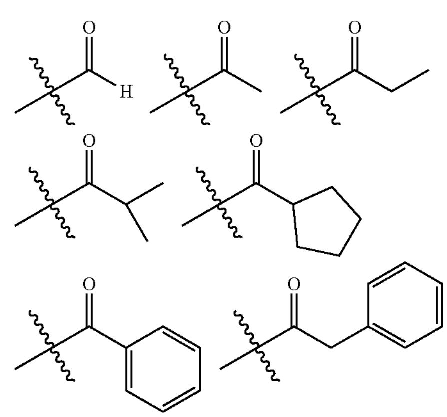

In the present specification, in the ester group, the oxygen of the ester group can be substituted with a linear, branched or cyclic alkyl group having 1 to 25 carbon atoms or an aryl group having 6 to 30 carbon atoms. Specifically, compounds having the following structural formulae can be included, however, the ester group is not limited thereto.

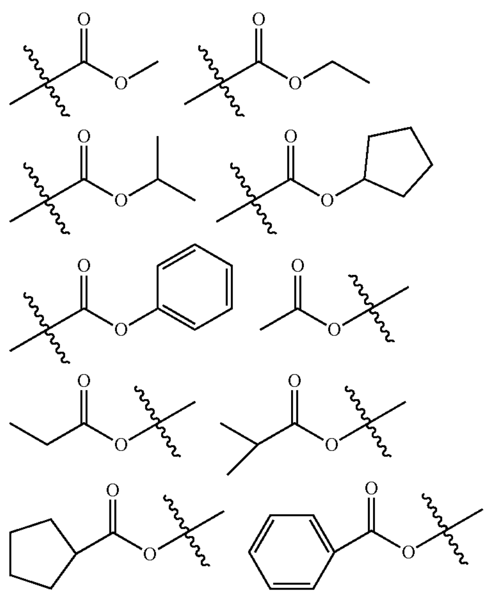

In the present specification, the alkyl group can be linear or branched, and although not particularly limited thereto, the number of carbon atoms is preferably from 1 to 30. Specifically, the number of carbon atoms is preferably from 1 to 20. More specifically, the number of carbon atoms is preferably from 1 to 10. Specific examples thereof can include a methyl group; an ethyl group; a propyl group; an n-propyl group; an isopropyl group; a butyl group; an n-butyl group; an isobutyl group; a tert-butyl group; a sec-butyl group; a 1-methylbutyl group; a 1-ethylbutyl group; a pentyl group; an n-pentyl group; an isopentyl group; a neopentyl group; a tert-pentyl group; a hexyl group; an n-hexyl group; a 1-methylpentyl group; a 2-methylpentyl group; a 4-methyl-2-pentyl group; a 3,3-dimethylbutyl group; a 2-ethylbutyl group; a heptyl group; an n-heptyl group; a 1-methylhexyl group; a cyclopentylmethyl group; a cyclohexylmethyl group; an octyl group; an n-octyl group; a tert-octyl group; a 1-methylheptyl group; a 2-ethylhexyl group; a 2-propylpentyl group; an n-nonyl group; a 2,2-dimethylheptyl group; a 1-ethylpropyl group; a 1,1-dimethylpropyl group; an isohexyl group; a 2-methylpentyl group; a 4-methylhexyl group; a 5-methylhexyl group and the like, but are not limited thereto.

In the present specification, the cycloalkyl group is not particularly limited, but preferably has 3 to 30 carbon atoms and more preferably has 3 to 20 carbon atoms. Specific examples thereof can include a cyclopropyl group; a cyclobutyl group; a cyclopentyl group; a 3-methylcyclopentyl group; a 2,3-dimethylcyclopentyl group; a cyclohexyl group; a 3-methylcyclohexyl group; a 4-methylcyclohexyl group; a 2,3-dimethylcyclohexyl group; a 3,4,5-trimethylcyclohexyl group; a 4-tert-butylcyclohexyl group; a cycloheptyl group; a cyclooctyl group and the like, but are not limited thereto.

In the present specification, the alkoxy group can be linear, branched or cyclic. The number of carbon atoms of the alkoxy group is not particularly limited, but is preferably from 1 to 30. Specifically, the number of carbon atoms is preferably 1 to 20. More specifically, the number of carbon atoms is preferably 1 to 10. Specific examples thereof can include a methoxy group; an ethoxy group; an n-propoxy group; an isopropoxy group; an i-propyloxy group; an n-butoxy group; an isobutoxy group; a tert-butoxy group; a sec-butoxy group; an n-pentyloxy group; a neopentyloxy group; an isopentyloxy group; an n-hexyloxy group; a 3,3-dimethylbutyloxy group; an 2-ethylbutyloxy group; an n-octyloxy group; an n-nonyloxy group; an n-decyloxy group; a benzyloxy group; a p-methylbenzyloxy group and the like, but are not limited thereto.

In the present specification, the amine group can be selected from the group consisting of —$NH_2$; an alkylamine group; an N-alkylarylamine group; an arylamine group; an N-arylheteroarylamine group; an N-alkylheteroarylamine group and a heteroarylamine group, and although not particularly limited thereto, the number of carbon atoms is preferably from 1 to 30. Specific examples of the amine group can include a methylamine group; a dimethylamine group; an ethylamine group; a diethylamine group; a phenylamine group; a naphthylamine group; a biphenylamine group; an anthracenylamine group; a 9-methylanthracenylamine group; a diphenylamine group; an N-phenylnaphthylamine group; a ditolylamine group; an N-phenyltolylamine group; a triphenylamine group; an N-phenylbiphenylamine group; an N-biphenylnaphthylamine group; an N-naphthylfluorenylamine group; an N-phenylphenanthrenylamine group; an N-biphenylphenanthrenylamine group; an N-phenylfluorenylamine group; an N-phenylterphenylamine group; an N-phenanthrenylfluorenylamine group; an N-biphenylfluorenylamine group and the like, but are not limited thereto.

In the present specification, the N-alkylarylamine group means an amine group in which N of the amine group is substituted with an alkyl group and an aryl group.

In the present specification, the N-arylheteroarylamine group means an amine group in which N of the amine group is substituted with an aryl group and a heteroaryl group.

In the present specification, the N-alkylheteroarylamine group means an amine group in which N of the amine group is substituted with an alkyl group and a heteroaryl group.

In the present specification, the alkyl group in the alkylamine group, the N-arylalkylamine group, the alkylthioxy group, the alkylsulfoxy group and the N-alkylheteroarylamine group is the same as the examples of the alkyl group described above. Specifically, the alkylthioxy group can include a methylthioxy group; an ethylthioxy group; a tert-butylthioxy group; a hexylthioxy group; an octylthioxy group and the like, and the alkylsulfoxy group can include mesyl; an ethylsulfoxy group; a propylsulfoxy group; a butylsulfoxy group and the like, however, the alkylthoixy group and the alkylsulfoxy group are not limited thereto.

In the present specification, the alkenyl group can be linear or branched, and although not particularly limited thereto, the number of carbon atoms is preferably from 2 to 30. Specific examples thereof can include a vinyl group; a 1-propenyl group; an isopropenyl group; a 1-butenyl group; a 2-butenyl group; a 3-butenyl group; a 1-pentenyl group; a 2-pentenyl group; a 3-pentenyl group; a 3-methyl-1-butenyl group; a 1,3-butadienyl group; an allyl group; a 1-phenylvinyl-1-yl group; a 2-phenylvinyl-1-yl group; a 2,2-diphenylvinyl-1-yl group; a 2-phenyl-2-(naphthyl-1-yl)vinyl-1-yl group; a 2,2-bis(diphenyl-1-yl)vinyl-1-yl group; a stilbenyl group; a styrenyl group and the like, but are not limited thereto.

In the present specification, the silyl group can be represented by a chemical formula of —SiRaRbRc, and Ra, Rb and Rc can each be hydrogen; a substituted or unsubstituted alkyl group; or a substituted or unsubstituted aryl group. Specific examples of the silyl group can include a trimethylsilyl group; a triethylsilyl group; a t-butyldimethylsilyl group; a vinyldimethylsilyl group; a propyldimethylsilyl group; a triphenylsilyl group; a diphenylsilyl group; a phenylsilyl group and the like, but are not limited thereto.

In the present specification, the boron group can be —$BR_{100}R_{101}$, and $R_{100}$ and $R_{101}$ are the same as or different from each other, and can be each independently selected from the group consisting of hydrogen; deuterium; a halogen group; a nitrile group; a substituted or unsubstituted monocyclic or polycyclic cycloalkyl group having 3 to 30 carbon atoms; a substituted or unsubstituted linear or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of the phosphine oxide group can include a diphenylphosphine oxide group; a dinaphthylphosphine oxide group and the like, but are not limited thereto.

In the present specification, the aryl group is not particularly limited, but preferably has 6 to 30 carbon atoms, and more preferably has 6 to 20 carbon atoms. The aryl group can be monocyclic or polycyclic.

When the aryl group is a monocyclic aryl group, the number of carbon atoms is not particularly limited, but is preferably from 6 to 30. Specific examples of the monocyclic aryl group can include a phenyl group; a biphenyl group; a terphenyl group and the like, but are not limited thereto.

When the aryl group is a polycyclic aryl group, the number of carbon atoms is not particularly limited, but is preferably from 10 to 30. Specific examples of the polycyclic aryl group can include a naphthyl group; an anthracenyl group; a phenanthryl group; a triphenyl group; a pyrenyl group; a phenalenyl group; a perylenyl group; a chrysenyl group; a fluorenyl group and the like, but are not limited thereto.

In the present specification, the fluorenyl group can be substituted, and adjacent groups can bond to each other to form a ring.

When the fluorenyl group is substituted,

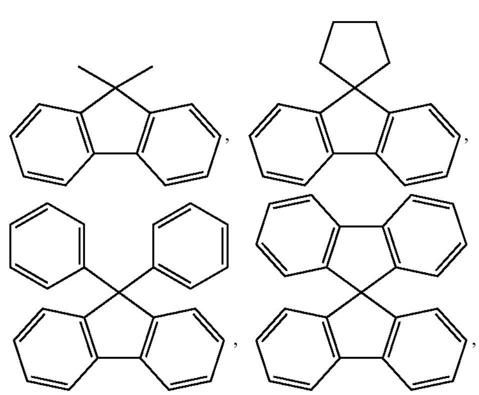

-continued

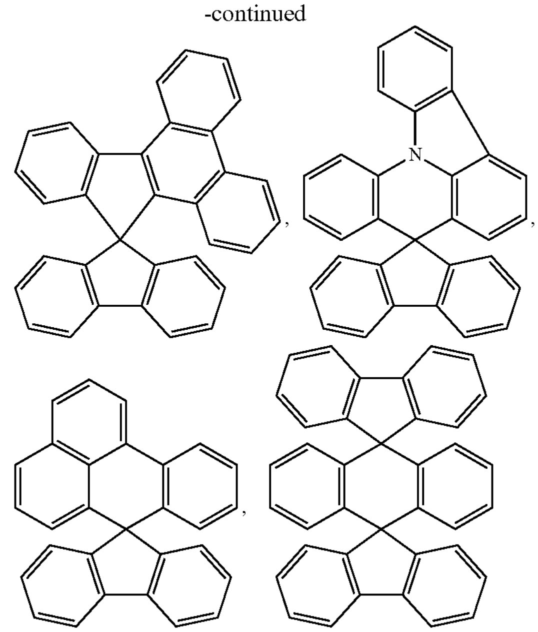

and the like can be included. However, the compound is not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, the aryl group in the aryloxy group, the arylthioxy group, the arylsulfoxy group, the N-arylalkylamine group, the N-arylheteroarylamine group and the arylphosphine group is the same as the examples of the aryl group described above. Specific examples of the aryloxy group can include a phenoxy group; a p-tolyloxy group; an m-tolyloxy group; a 3,5-dimethylphenoxy group; a 2,4,6-trimethylphenoxy group; a p-tert-butylphenoxy group; a 3-biphenyloxy group; a 4-biphenyloxy group; a 1-naphthyloxy group; a 2-naphthyloxy group; a 4-methyl-1-naphthyloxy group; a 5-methyl-2-naphthyloxy group; a 1-anthryloxy group; a 2-anthryloxy group; a 9-anthryloxy group; a 1-phenanthryloxy group; a 3-phenanthryloxy group; a 9-phenanthryloxy group and the like. Specific examples of the arylthioxy group can include a phenylthioxy group; a 2-methylphenylthioxy group; a 4-tert-butylphenylthioxy group and the like, and specific examples of the arylsulfoxy group can include a benzenesulfoxy group; a p-toluenesulfoxy group and the like. However, the aryloxy group, the arylthioxy group and the arylsulfoxy group are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including two or more aryl groups can include monocyclic aryl groups, polycyclic aryl groups, or both monocyclic aryl groups and polycyclic aryl groups. For example, the aryl group in the arylamine group can be selected from among the examples of the aryl group described above.

In the present specification, the heteroaryl group is a group including one or more atoms that are not carbon, that is, heteroatoms, and specifically, the heteroatom can include one or more atoms selected from the group consisting of O, N, Se, S and the like. The number of carbon atoms is not particularly limited, but is preferably from 2 to 30 and more preferably from 2 to 20, and the heteroaryl group can be monocyclic or polycyclic. Examples of the heteroaryl group can include a thiophene group; a furanyl group; a pyrrole group; an imidazolyl group; a triazolyl group; an oxazolyl group; an oxadiazolyl group; a pyridyl group; a bipyridyl group; a pyrimidyl group; a triazinyl group; a triazolyl group; an acridyl group; a pyridazinyl group; a pyrazinyl group; a quinolinyl group; a quinazolinyl group; a quinoxalinyl group; a phthalazinyl group; a pyridopyrimidyl group; a pyridopyrazinyl group; a pyrazinopyrazinyl group; an isoquinolinyl group; an indolyl group; a carbazolyl group; a benzoxazolyl group; a benzimidazolyl group; a benzothiazolyl group; a benzocarbazolyl group; a benzothiophene group; a dibenzothiophene group; a benzofuranyl group; a phenanthrolinyl group; an isoxazolyl group; a thiadiazolyl group; a phenothiazinyl group; a dibenzofuranyl group and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups can include monocyclic heteroaryl groups, polycyclic heteroaryl groups, or both monocyclic heteroaryl groups and polycyclic heteroaryl groups. For example, the heteroaryl group in the heteroarylamine group can be selected from among the examples of the heteroaryl group described above.

In the present specification, examples of the heteroaryl group in the N-arylheteroarylamine group and the N-alkylheteroarylamine group are the same as the examples of the heteroaryl group described above.

In the present specification, the arylene group means an aryl group having two bonding sites, that is, a divalent group. Descriptions on the aryl group provided above can be applied thereto except for each being a divalent group.

In the present specification, the heteroarylene group means a heteroaryl group having two bonding sites, that is, a divalent group. Descriptions on the heteroaryl group provided above can be applied thereto except for each being a divalent group.

In the present specification, the heterocyclic group can be monocyclic or polycyclic, can be aromatic, aliphatic or a fused ring of aromatic and aliphatic, and can be selected from among the examples of the heteroaryl group. Examples of the heterocyclic group in addition thereto can include a hydroacridyl group (for example,

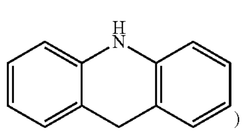 [SMILES: c1ccc2c(c1)Cc1ccccc1N2]

)

and a sulfonyl group-including heterocyclic structure such as

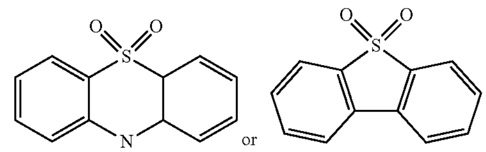

In the present specification, the "ring" in the substituted or unsubstituted ring formed by adjacent groups bonding to each other means a substituted or unsubstituted hydrocarbon ring; or a substituted or unsubstituted heteroring.

In the present specification, the hydrocarbon ring can be aromatic, aliphatic or a fused ring of aromatic and aliphatic, and can be selected from among the examples of the cycloalkyl group or the aryl group except for those that are not monovalent.

In the present specification, the aromatic ring can be monocyclic or polycyclic, and can be selected from among the examples of the aryl group except for those that are not monovalent.

In the present specification, the heteroring includes one or more atoms that are not carbon, that is, heteroatoms, and specifically, the heteroatom can include one or more atoms selected from the group consisting of O, N, Se, S and the like. The heteroring can be monocyclic or polycyclic, aromatic, aliphatic or a fused ring of aromatic and aliphatic, and can be selected from among the examples of the heteroaryl group or the heterocyclic group except for those that are not monovalent.

According to one embodiment of the present specification, in Chemical Formula 1, L1 is a direct bond; an arylene group; or a heteroarylene group.

According to one embodiment of the present specification, in Chemical Formula 1, L1 is a direct bond; a substituted or unsubstituted phenylene group; a substituted or unsubstituted biphenylene group; a substituted or unsubstituted naphthylene group; a substituted or unsubstituted terphenylene group; a substituted or unsubstituted quaterphenylene group; a substituted or unsubstituted anthracenylene group; a substituted or unsubstituted phenanthrenylene group; a substituted or unsubstituted triphenylenylene group; a substituted or unsubstituted pyrenylene group; a substituted or unsubstituted fluorenylene group; a substituted or unsubstituted spiro cyclopentane fluorenylene group; a substituted or unsubstituted dibenzofuranylene group; a substituted or unsubstituted divalent dibenzothiophene group; a substituted or unsubstituted carbazolene group; a substituted or unsubstituted pyridylene group; a substituted or unsubstituted divalent furan group; or a substituted or unsubstituted divalent thiophene group.

According to one embodiment of the present specification, in Chemical Formula 1, L1 is a direct bond; a phenylene group; a biphenylylene group; a naphthylene group; a terphenylylene group; a pyrimidylene group; a divalent furan group; or a divalent thiophene group.

According to one embodiment of the present specification, in Chemical Formula 1, L1 can be a direct bond; or represented by one of the following structural formulae.

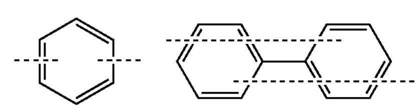

-continued

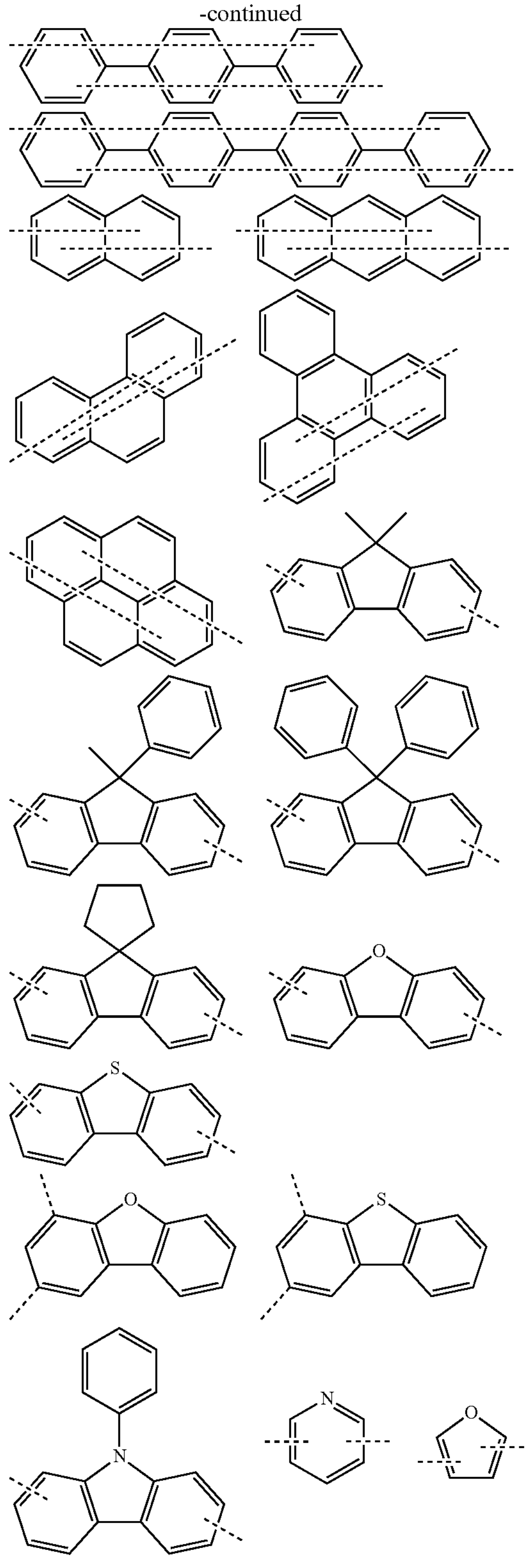

In the structures, ····· is a site bonding to a main chain.

According to one embodiment of the present specification, in Chemical Formula 1, Ar1 is a nitrile group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted amine group; a substituted or unsubstituted arylphosphine group; a substituted or unsubstituted phosphine oxide group; a substituted or unsubstituted aryl group; a substituted or unsubstituted monocyclic heterocyclic group; a substituted or unsubstituted tricyclic or higher heterocyclic group; a substituted or unsubstituted dicyclic heterocyclic group including two or more Ns; a substituted or unsubstituted isoquinolyl group; or a structure represented by any one selected from among Chemical Formula 2 and the following Chemical Formulae 6 to 15.

According to one embodiment of the present specification, in Chemical Formula 1, Ar1 is a nitrile group; a substituted or unsubstituted alkoxy group; a substituted or unsubstituted phosphine oxide group; a substituted or unsubstituted silyl group; a substituted or unsubstituted aryl group; a substituted or unsubstituted monocyclic heterocyclic group; a substituted or unsubstituted tricyclic or higher heterocyclic group; a substituted or unsubstituted dicyclic heterocyclic group including two or more Ns; a substituted or unsubstituted isoquinolyl group; or a structure represented by any one selected from among Chemical Formula 2 and the following Chemical Formulae 6 to 15.

According to one embodiment of the present specification, in Chemical Formula 1, Ar1 is a nitrile group; a substituted or unsubstituted alkoxy group; a substituted or unsubstituted phosphine oxide group; a substituted or unsubstituted aryl group; or a structure represented by any one selected from among Chemical Formula 2 and the following Chemical Formulae 6 to 15.

According to one embodiment of the present specification, in Chemical Formula 1, Ar1 is a nitrile group; an alkoxy group unsubstituted or substituted with a halogen group; a phosphine oxide group unsubstituted or substituted with an aryl group; an aryl group unsubstituted or substituted with a nitrile group; or a structure represented by any one selected from among Chemical Formula 2 and the following Chemical Formulae 6 to 15.

According to one embodiment of the present specification, in Chemical Formula 1, Ar1 is a nitrile group; a methoxy group substituted with a fluoro group; a phosphine oxide group unsubstituted or substituted with a phenyl group, a terphenyl group or a naphthyl group; a phenyl group unsubstituted or substituted with a nitrile group; a terphenyl group unsubstituted or substituted with a nitrile group; or a structure represented by any one selected from among Chemical Formula 2 and the following Chemical Formulae 6 to 15.

According to one embodiment of the present specification, in Chemical Formula 1, Ar1 can be represented by the following Chemical Formula 1a.

[Chemical Formula 1a]

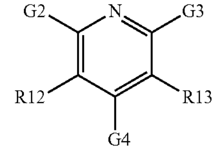

In Chemical Formula 1a, any one of G2 to G4, R12 and R13 is a site bonding to L1 of Chemical Formula 1, and the rest are the same as or different from each other, and each independently hydrogen;

deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group.

According to one embodiment of the present specification, in Chemical Formula 1, Ar1 is represented by any one selected from among Chemical Formula 2 and the following Chemical Formulae 6 to 15.

[Chemical Formula 6]

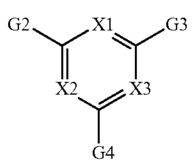

[Chemical Formula 7]

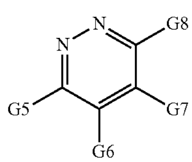

[Chemical Formula 8]

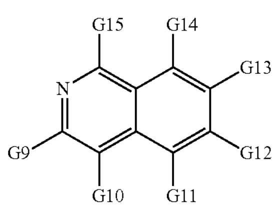

[Chemical Formula 9]

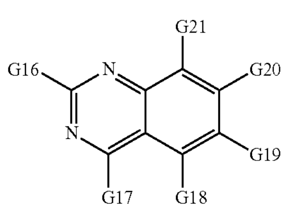

[Chemical Formula 10]

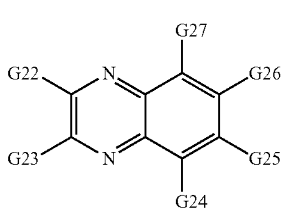

-continued

[Chemical Formula 11]

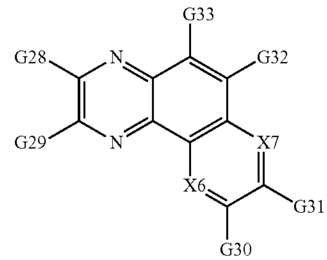

[Chemical Formula 12]

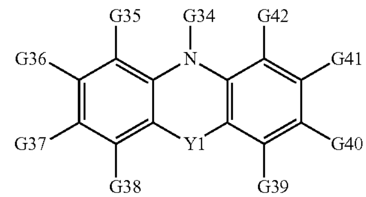

[Chemical Formula 13]

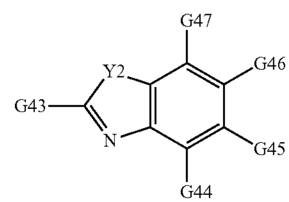

[Chemical Formula 14]

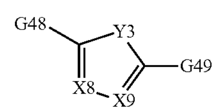

[Chemical Formula 15]

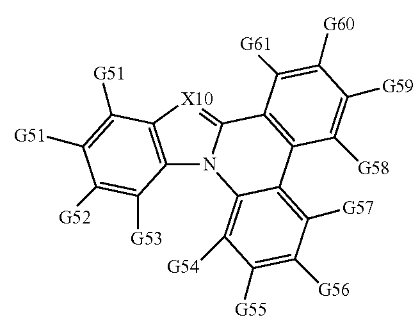

In Chemical Formulae 6 to 15,

X1 is N or CR11, X2 is N or CR12, X3 is N or CR13, X4 is N or CR14, X5 is N or CR15, X6 is N or CR16, X7 is N or CR17, X8 is N or CR18, X9 is N or CR19, and X10 is N or CR20, at least two of X1 to X3 are N, and at least one of X4 to X7 is N, Y1 is O; S; NQ1; or CQ2Q3, Y2 is O; S; NQ4; or CQ5Q6, and Y3 is O; S; or NQ7, any one of G2 to G4 and R11 to R13, any one of G5 to G8, any one of G9 to G15, any one of G16 to G21, any one of G22 to G27, any one of G28 to G33 and R14 to R17, any one of G34 to G42, any one of G43 to G47, any one of G48, G49, R18 and R19, and any one of G50 to G61 are a site bonding to L1 of Chemical Formula 1, and the rest of G2 to G61 and R11 to R19 other than the site bonding to L1 of Chemical Formula 1, R20 and Q1 to Q7 are the same as or different from each other, and each independently hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group.

According to another embodiment of the present specification, in Chemical Formula 2, G1 is hydrogen; or an aryl group.

According to another embodiment of the present specification, in Chemical Formula 2, G1 is hydrogen; or a phenyl group.

According to another embodiment of the present specification, Chemical Formula 2 is represented by any one selected from among the following Chemical Formulae 2-1 to 2-4.

[Chemical Formula 2-1]

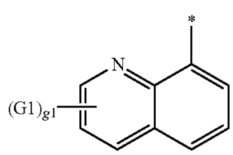

[Chemical Formula 2-2]

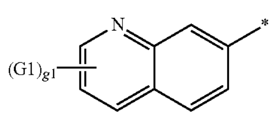

[Chemical Formula 2-3]

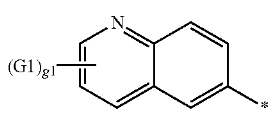

[Chemical Formula 2-4]

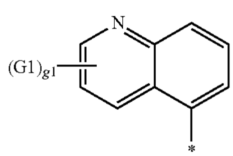

In Chemical Formulae 2-1 to 2-4, G1 and g1 have the same definitions as in Chemical Formula 2, and * is a site bonding to L1 of Chemical Formula 1.

According to another embodiment of the present specification, in Chemical Formula 6, any one of G2 to G4 and R11 to R13 is a site bonding to L1 of Chemical Formula 1, and the rest are the same as or different from each other, and each independently hydrogen; a substituted or unsubstituted aryl group; or a substituted or unsubstituted heteroaryl group.

According to another embodiment of the present specification, in Chemical Formula 6, any one of G2 to G4 and R11 to R13 is a site bonding to L1 of Chemical Formula 1, and the rest are the same as or different from each other, and each independently hydrogen; an aryl group unsubstituted or substituted with a nitrile group, an aryl group, a heterocyclic group substituted with an alkyl group, or a heterocyclic group unsubstituted or substituted with an aryl group; or a heteroaryl group.

According to another embodiment of the present specification, in Chemical Formula 6, any one of G2 to G4 and R11 to R13 is a site bonding to L1 of Chemical Formula 1, and the rest the same as or different from each other, and each independently hydrogen; a phenyl group unsubstituted or substituted with an aryl group, a heterocyclic group substituted with an alkyl group, or a heterocyclic group unsubstituted or substituted with an aryl group; a biphenyl group unsubstituted or substituted with a nitrile group or a heterocyclic group; a terphenyl group; a naphthyl group unsubstituted or substituted with an aryl group or a heteroaryl group; a fluorenyl group unsubstituted or substituted with an alkyl group; a triphenylenyl group; a phenanthrenyl group; a phenalenyl group; a pyridyl group; a dibenzofuranyl group; or a dibenzothiophene group.

According to another embodiment of the present specification, in Chemical Formula 6, any one of G2 to G4 and R11 to R13 is a site bonding to L1 of Chemical Formula 1, and the rest are the same as or different from each other, and each independently hydrogen; a phenyl group unsubstituted or substituted with a phenyl group, a terphenyl group, a carbazolyl group, a quinolyl group, a phenoxazinyl group, a phenothiazinyl group, a triphenylenyl group, a fluoranthenyl group, a pyridyl group, a dibenzothiophene group, a dibenzofuranyl group, a benzocarbazolyl group, a dihydrophenazinyl group substituted with a phenyl group, or a dihydroacridine group substituted with a methyl group; a nitrile group; a biphenyl group unsubstituted or substituted with a carbazolyl group; a terphenyl group; a naphthyl group unsubstituted or substituted with a phenyl group, a pyridyl group or a dibenzofuranyl group; a fluorenyl group unsubstituted or substituted with a methyl group; a triphenylenyl group; a phenanthrenyl group; a phenalenyl group; a pyridyl group; a dibenzofuranyl group; or a dibenzothiophene group.

According to another embodiment of the present specification, Chemical Formula 6 can be represented by the following Chemical Formula 6a or 6b.

[Chemical Formula 6a]

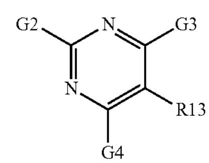

[Chemical Formula 6b]

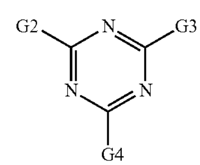

In Chemical Formulae 6a and 6b, G2 to G4 and R13 have the same definitions as in Chemical Formula 6.

According to one embodiment of the present specification, when at least two of X1 to X3 are N in Chemical Formula 6, a role of an electron control layer is smoothly performed with deep HOMO energy of 6.1 eV or greater, and since electron mobility is high, a device with low driving voltage, high efficiency and long lifetime can be obtained when used in an organic light emitting device. Specifically, when Ar1 is Chemical Formula 6a or Chemical Formula 6b, the above-mentioned effects are maximized.

Particularly, a triazine group where Ar1 is Chemical Formula 6b has deep HOMO energy of 6.1 eV or greater, and therefore, a role of an electron control layer is smoothly performed, and since electron mobility is high, properties of low driving voltage, high efficiency and long lifetime are obtained when used in an organic light emitting device.

According to another embodiment of the present specification, in Chemical Formula 7, any one of G5 to G8 is a site bonding to L1 of Chemical Formula 1, and the rest are the same as or different from each other, and each independently hydrogen; or a substituted or unsubstituted aryl group.

According to another embodiment of the present specification, in Chemical Formula 7, any one of G5 to G8 is a site bonding to L1 of Chemical Formula 1, and the rest are the same as or different from each other, and each independently hydrogen; or an aryl group.

According to another embodiment of the present specification, in Chemical Formula 7, any one of G5 to G8 is a site bonding to L1 of Chemical Formula 1, and the rest are the same as or different from each other, and each independently hydrogen; a phenyl group; or a naphthyl group.

According to another embodiment of the present specification, in Chemical Formula 8, any one of G9 to G15 is a site bonding to L1 of Chemical Formula 1, and the rest are the same as or different from each other, and each independently hydrogen; or a substituted or unsubstituted aryl group.

According to another embodiment of the present specification, in Chemical Formula 8, any one of G9 to G15 is a site bonding to L1 of Chemical Formula 1, and the rest are the same as or different from each other, and each independently hydrogen; or an aryl group.

According to another embodiment of the present specification, in Chemical Formula 8, any one of G9 to G15 is a site bonding to L1 of Chemical Formula 1, and the rest are the same as or different from each other, and each independently hydrogen; or a phenyl group.

According to another embodiment of the present specification, in Chemical Formula 9, any one of G16 to G21 is a site bonding to L1 of Chemical Formula 1, and the rest are the same as or different from each other, and each independently hydrogen; or a substituted or unsubstituted aryl group.

According to another embodiment of the present specification, in Chemical Formula 9, any one of G16 to G21 is a site bonding to L1 of Chemical Formula 1, and the rest are the same as or different from each other, and each independently hydrogen; or an aryl group.

According to another embodiment of the present specification, in Chemical Formula 9, any one of G16 to G21 is a site bonding to L1 of Chemical Formula 1, and the rest are the same as or different from each other, and each independently hydrogen; a phenyl group; a biphenyl group; or a naphthyl group.

According to another embodiment of the present specification, in Chemical Formula 10, any one of G22 to G27 is a site bonding to L1 of Chemical Formula 1, and the rest are the same as or different from each other, and each independently hydrogen; or an aryl group.

According to another embodiment of the present specification, in Chemical Formula 10, any one of G22 to G27 is a site bonding to L1 of Chemical Formula 1, and the rest are the same as or different from each other, and each independently hydrogen; or a phenyl group.

According to another embodiment of the present specification, in Chemical Formula 11, any one of G28 to G33 and R14 to R17 is a site bonding to L1 of Chemical Formula 1, and the rest are the same as or different from each other, and each independently hydrogen.

According to another embodiment of the present specification, Chemical Formula 11 is represented by any one selected from among the following Chemical Formulae 11-1 to 11-8.

[Chemical Formula 11-1]

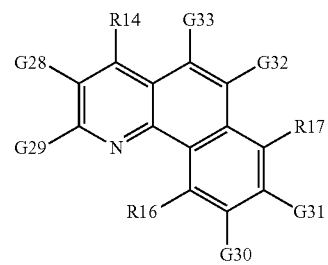

[Chemical Formula 11-2]

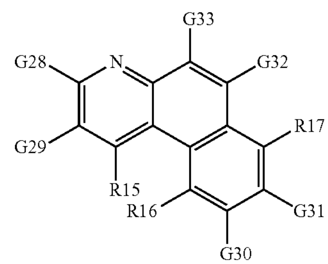

[Chemical Formula 11-3]

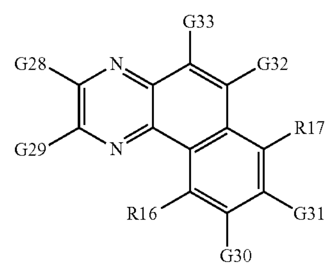

[Chemical Formula 11-4]

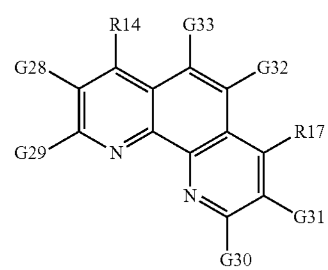

[Chemical Formula 11-5]

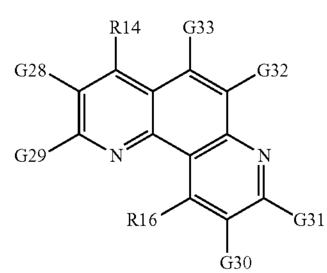

-continued

[Chemical Formula 11-6]

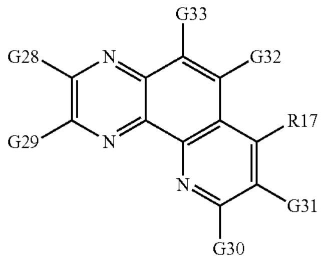

[Chemical Formula 11-7]

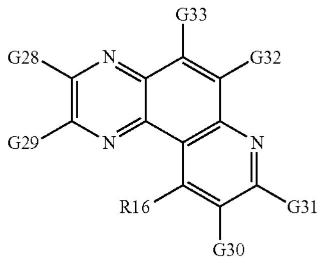

[Chemical Formula 11-8]

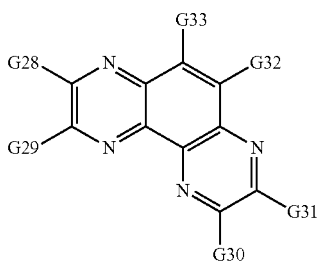

In Chemical Formulae 11-1 to 11-8, G28 to G33 and R14 to R17 have the same definitions as in Chemical Formula 11.

According to another embodiment of the present specification, in Chemical Formula 12, any one of G34 to G42 and R14 to R17 is a site bonding to L1 of Chemical Formula 1, and the rest and Q1 to Q3 are the same as or different from each other, and each independently hydrogen.

According to another embodiment of the present specification, in Chemical Formula 13, any one of G43 to G47 is a site bonding to L1 of Chemical Formula 1, and the rest and Q4 to Q6 are the same as or different from each other, and each independently hydrogen; a substituted or unsubstituted alkyl group; or a substituted or unsubstituted aryl group.

According to another embodiment of the present specification, in Chemical Formula 13, any one of G43 to G47 is a site bonding to L1 of Chemical Formula 1, and the rest and Q4 to Q6 are the same as or different from each other, and each independently hydrogen; an alkyl group; or an aryl group.

According to another embodiment of the present specification, in Chemical Formula 13, any one of G43 to G47 is a site bonding to L1 of Chemical Formula 1, and the rest and Q4 to Q6 are the same as or different from each other, and each independently hydrogen; a methyl group; or a phenyl group.

According to another embodiment of the present specification, when Y2 is NQ4 in Chemical Formula 13, G43 and Q4 bond to each other to form a substituted or unsubstituted ring.

According to another embodiment of the present specification, when Y2 is NQ4 in Chemical Formula 13, G43 and Q4 bond to each other to foil a substituted or unsubstituted heteroring.

According to another embodiment of the present specification, when Y2 is NQ4 in Chemical Formula 13, G43 and Q4 bond to each other to form a benzoisoquinol ring.

According to another embodiment of the present specification, Chemical Formula 13 is represented by any one selected from among the following Chemical Formulae 13-1 to 13-4.

[Chemical Formula 13-1]

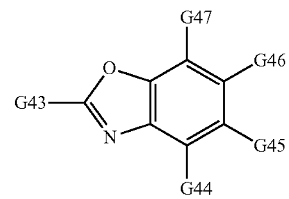

[Chemical Formula 13-2]

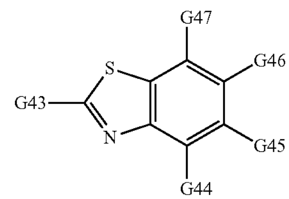

[Chemical Formula 13-3]

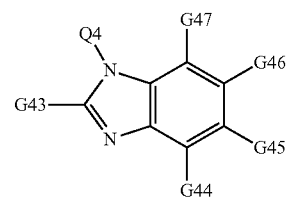

[Chemical Formula 13-4]

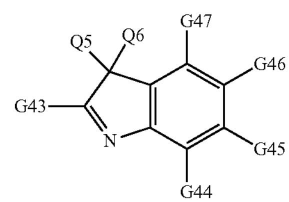

In Chemical Formulae 13-1 to 13-4, any one of G43 to G47 is a site bonding to L1 of Chemical Formula 1, and the rest and Q4 to Q6 are the same as or different from each other, and each independently hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group.

According to another embodiment of the present specification, in Chemical Formula 14, any one of G48, G49, R18 and R19 is a site bonding to L1 of Chemical Formula 1, and the rest and Q7 are the same as or different from each other, and each independently hydrogen; or a substituted or unsubstituted aryl group.

According to another embodiment of the present specification, in Chemical Formula 14, any one of G48, G49, R18 and R19 is a site bonding to L1 of Chemical Formula 1, and the rest and Q7 are the same as or different from each other, and each independently hydrogen; or an aryl group.

According to another embodiment of the present specification, in Chemical Formula 14, any one of G48, G49, R18 and R19 is a site bonding to L1 of Chemical Formula 1, and the rest and Q7 are the same as or different from each other, and each independently hydrogen; or a phenyl group.

According to another embodiment of the present specification, Chemical Formula 14 is represented by any one selected from among the following Chemical Formulae 14-1 to 14-9.

[Chemical Formula 14-1]

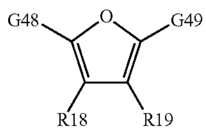

[Chemical Formula 14-2]

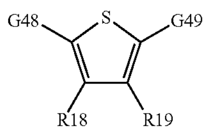

[Chemical Formula 14-3]

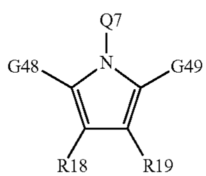

[Chemical Formula 14-4]

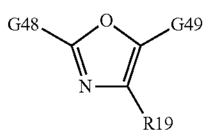

[Chemical Formula 14-5]

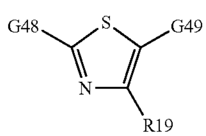

[Chemical Formula 14-6]

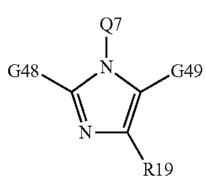

[Chemical Formula 14-7]

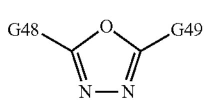

[Chemical Formula 14-8]

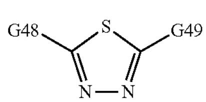

[Chemical Formula 14-9]

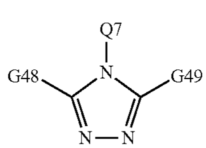

In Chemical Formulae 14-1 to 14-9,

G48, G49, R18, R19 and Q7 have the same definitions as in Chemical Formula 14.

According to one embodiment of the present specification, in Chemical Formula 15, the rest of G50 to G61 other than the site bonding to Chemical Formula 1, and R20 are the same as or different from each other, and each independently hydrogen; a substituted or unsubstituted aryl group; or a substituted or unsubstituted heteroaryl group.

According to one embodiment of the present specification, in Chemical Formula 15, the rest of G50 to G61 other than the site bonding to Chemical Formula 1, and R20 are the same as or different from each other, and each independently hydrogen; or a substituted or unsubstituted aryl group.

According to one embodiment of the present specification, in Chemical Formula 15, the rest of G50 to G61 other than the site bonding to Chemical Formula 1, and R20 are the same as or different from each other, and each independently hydrogen; or a phenyl group.

According to one embodiment of the present specification, in Chemical Formula 15, the rest of G50 to G61 other than the site bonding to Chemical Formula 1, and R20 are the same as or different from each other, and each independently hydrogen.

According to one embodiment of the present specification, m is 1.

According to one embodiment of the present specification, Chemical Formula 1 is represented by any one selected from among the following Chemical Formulae 1-1 to 1-4.

[Chemical Formula 1-1]

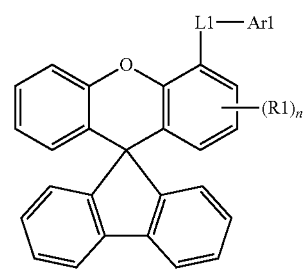

[Chemical Formula 1-2]

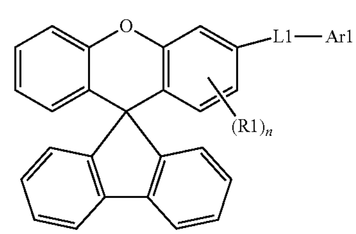

[Chemical Formula 1-3]

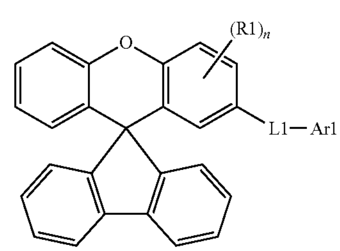

-continued

[Chemical Formula 1-4]

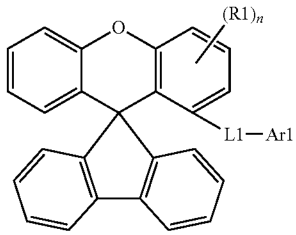

In Chemical Formulae 1-1 to 1-4,

L1, Ar1, R1 and n have the same definitions as in Chemical Formula 1.

According to one embodiment of the present specification, R1 is hydrogen.

Generally, electron mobility of a compound varies depending on orientation in a molecular 3D structure, and electron mobility is strengthened in a more horizontal structure. The compound represented by Chemical Formula 1 substituted with one -L1-Ar1 according to one embodiment of the present specification has an advantage of increasing electron mobility with a stronger tendency toward a horizontal structure of the molecule compared to the compound substituted with two -L1-Ar1s. Accordingly, when using the heterocyclic compound represented by Chemical Formula 1 in an organic light emitting device, effects of low driving voltage, high efficiency and long lifetime are obtained. (Refer to APPLIED PHYSICS LETTERS 95, 243303 (2009))

According to FIG. 10 and FIG. 11 presenting 3D structures of Compounds E9 and E18 according to one embodiment of the present specification, it can be identified that the molecules of the compounds have a horizontal structure, and according to FIG. 12 and FIG. 13 presenting 3D structures of Compounds ET-1-E and ET-1-I used as compounds of comparative examples of the present specification, it can be identified that the A axis and the B axis are almost perpendicular to each other in each compound, and the molecules are very out of a horizontal structure. As a result, it can be seen that Compounds E9 and E18 according to one embodiment of the present specification have a horizontal structure compared to Compounds ET-1-E and ET-1-I due to a difference in orientation in the molecular 3D structure, and as a result, excellent effects are obtained in tams of driving voltage, efficiency and lifetime when using the compound represented by Chemical Formula 1 in an organic light emitting device.

According to one embodiment of the present specification, Chemical Formula 1 can be represented by any one selected from among the following compounds.

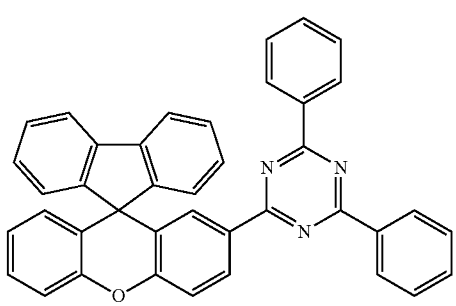

-continued

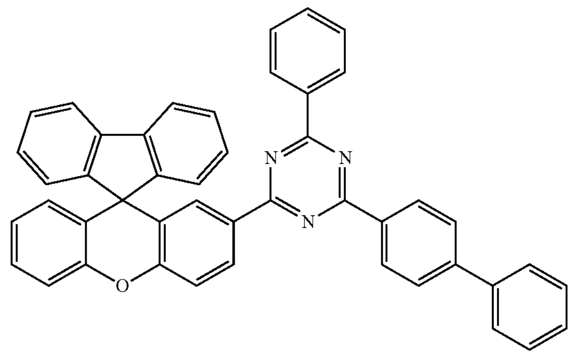

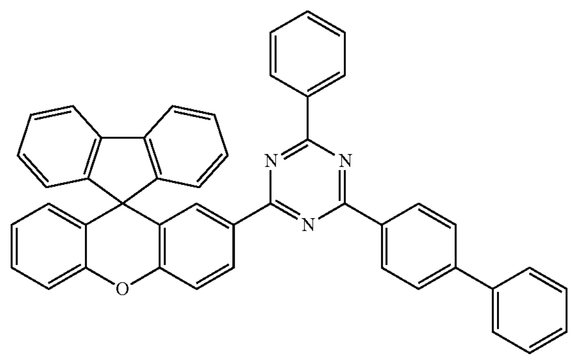

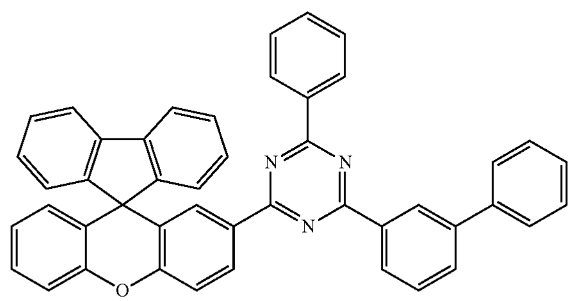

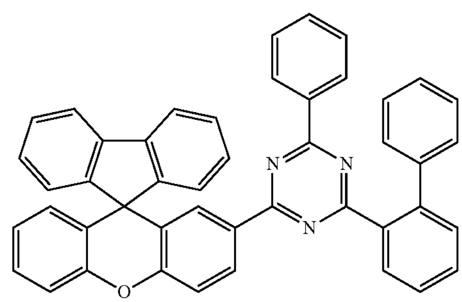

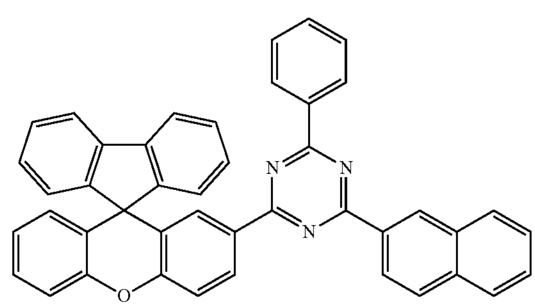

-continued
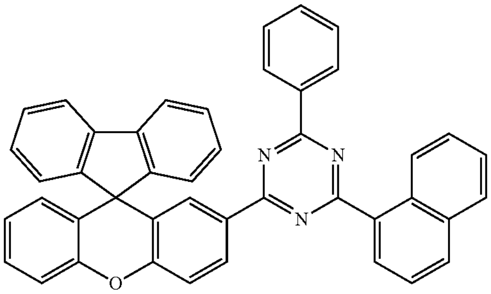
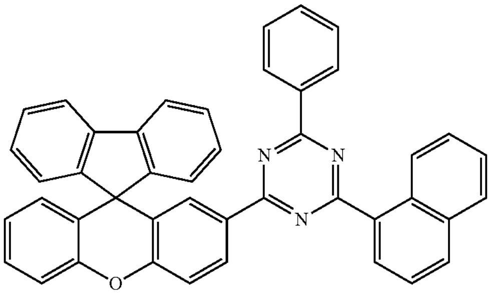
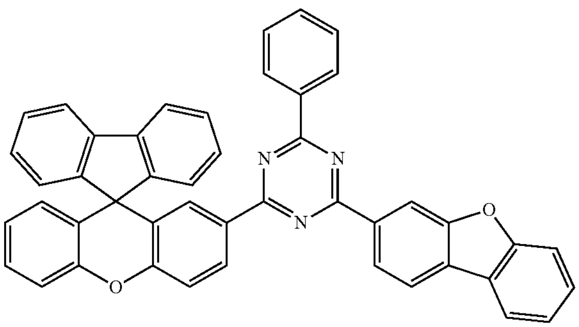
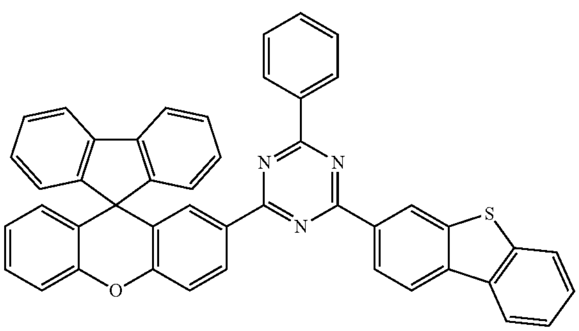
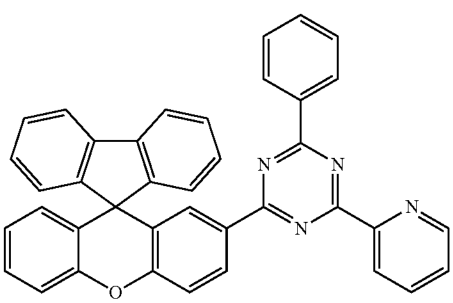
-continued
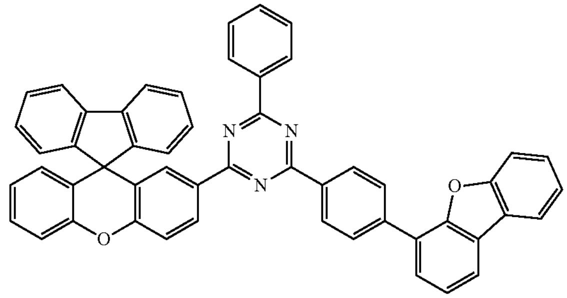
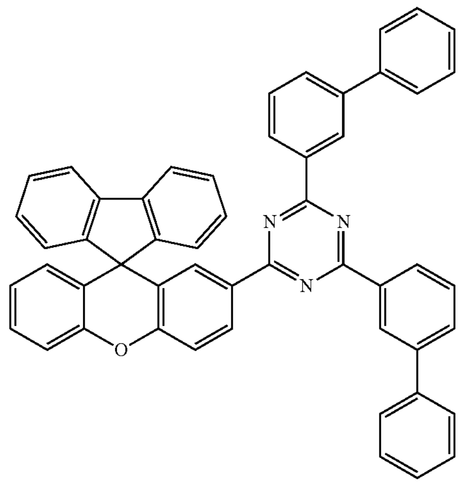
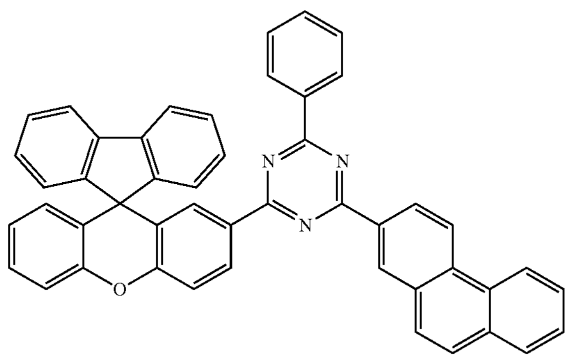
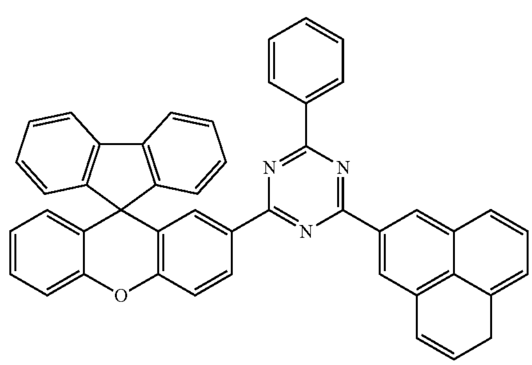

-continued
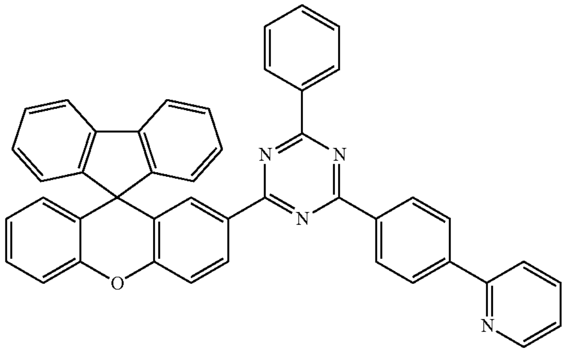
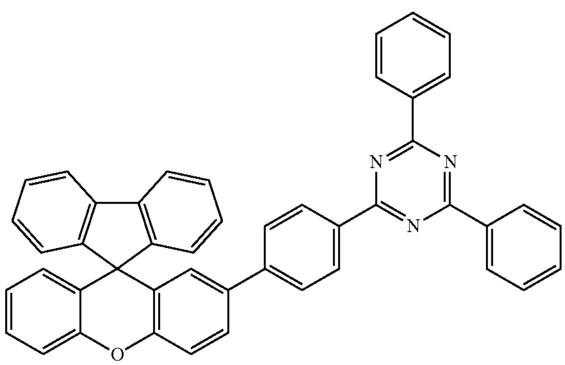
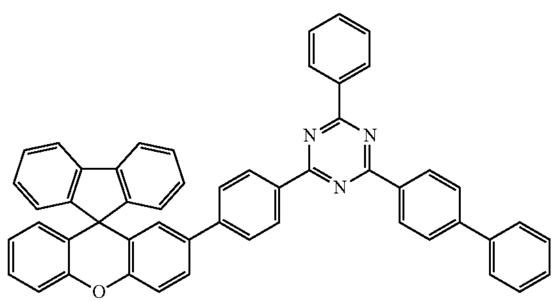
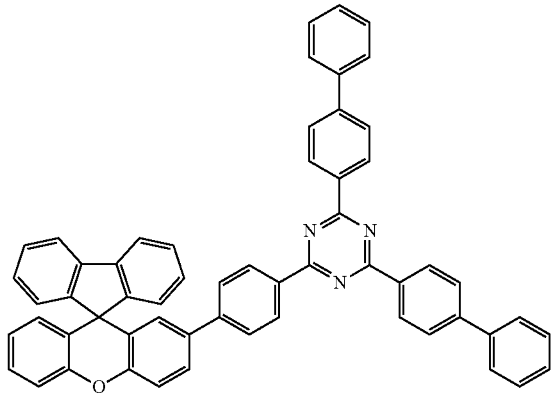
-continued
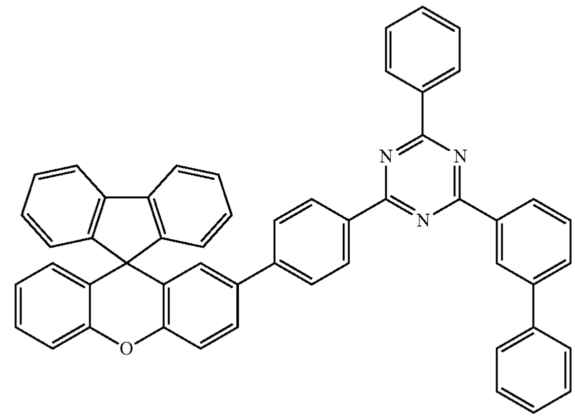
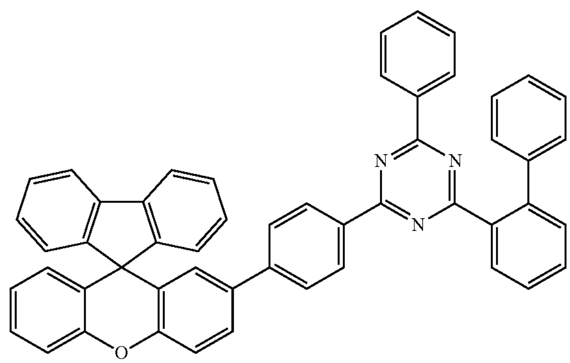
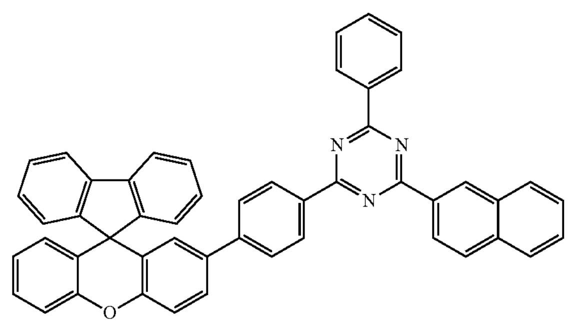
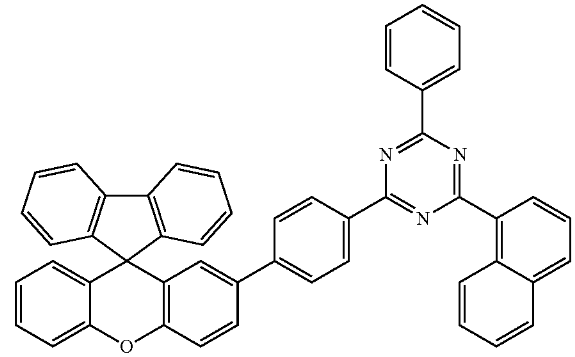

-continued
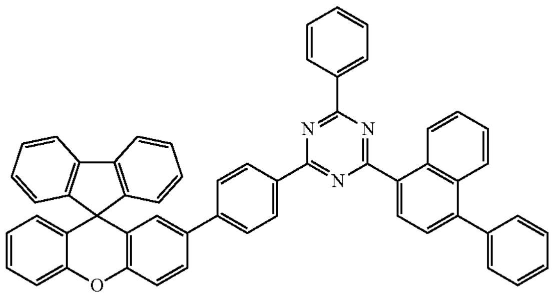
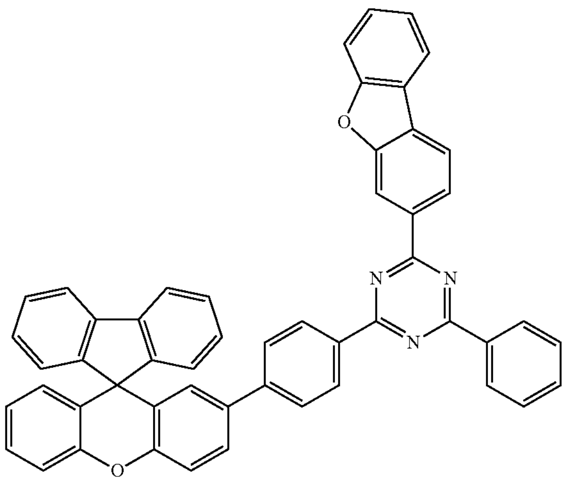
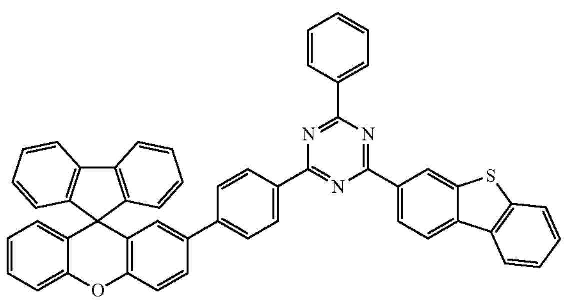
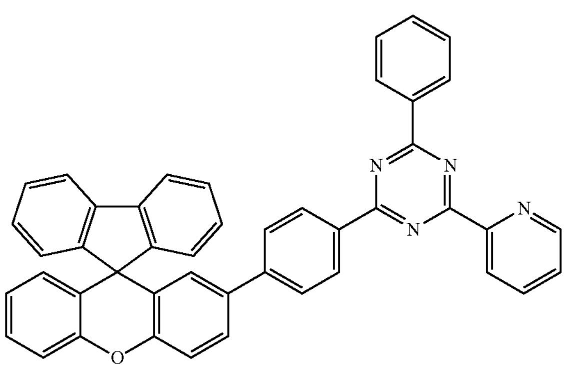
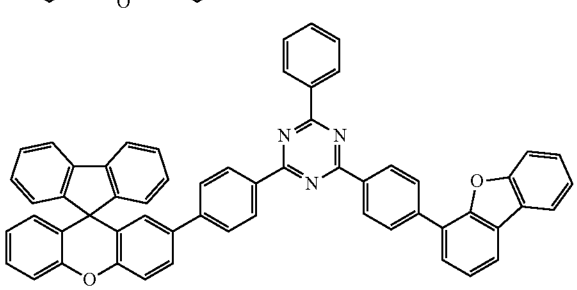
-continued
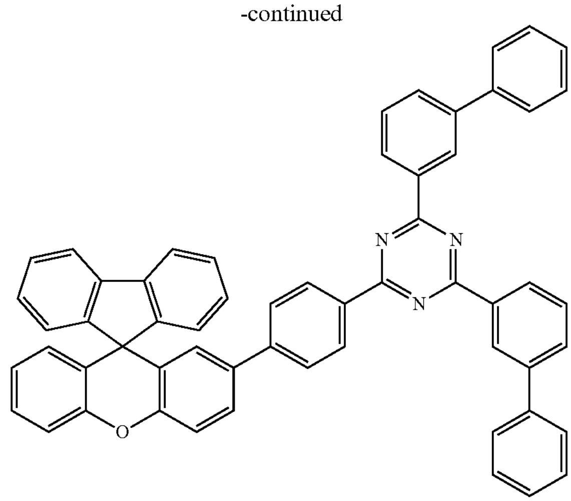
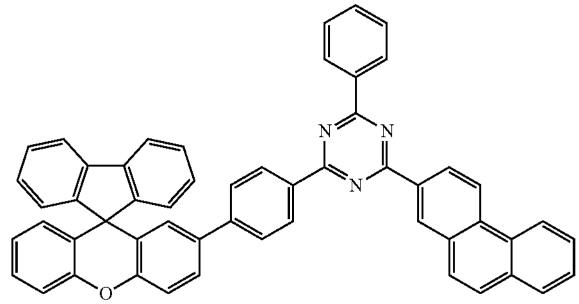
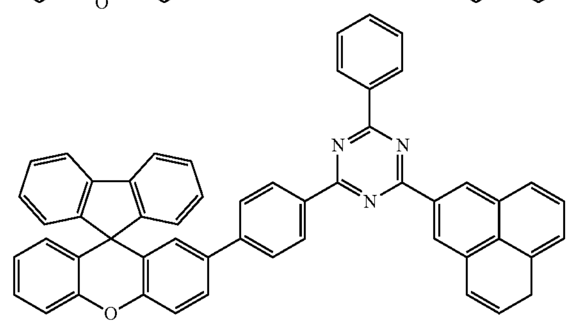
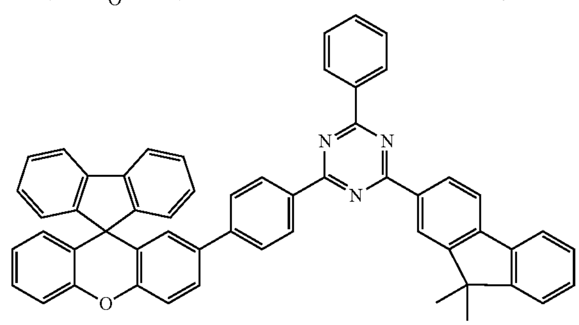
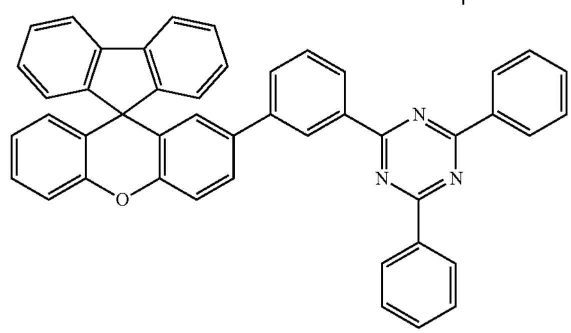

-continued
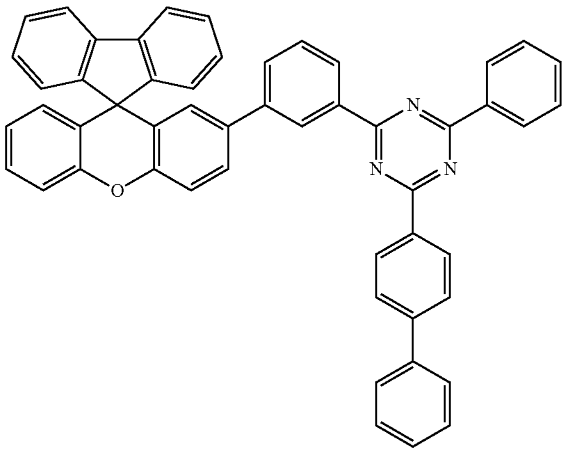
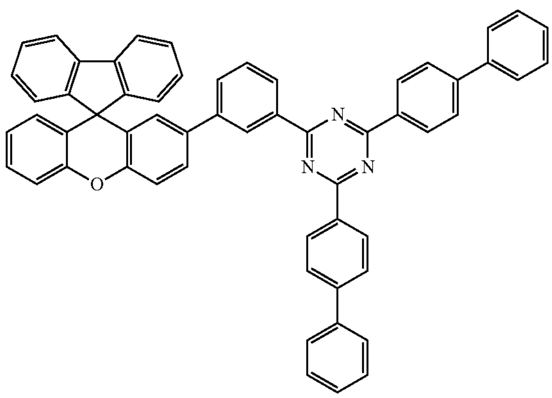
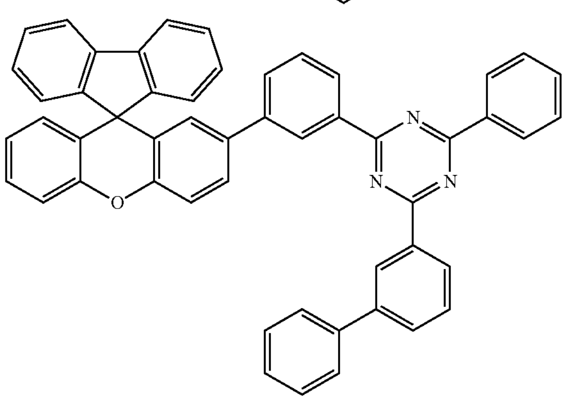
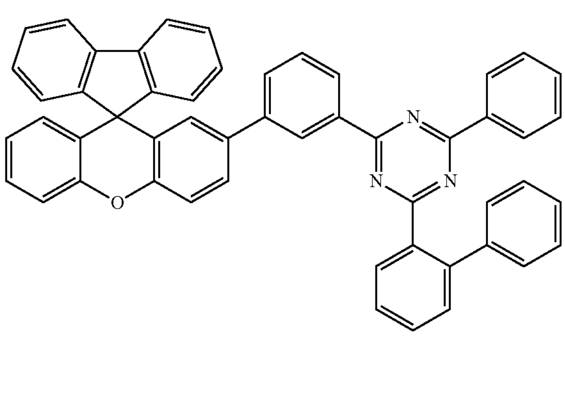
-continued
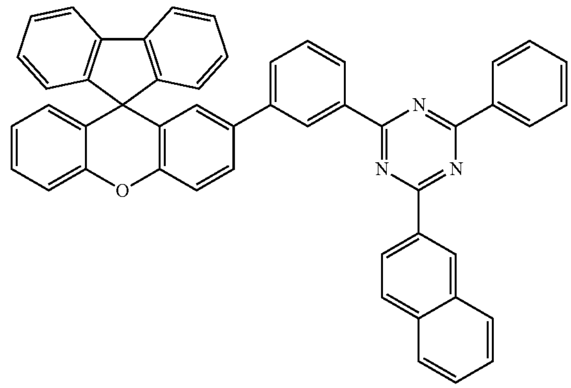
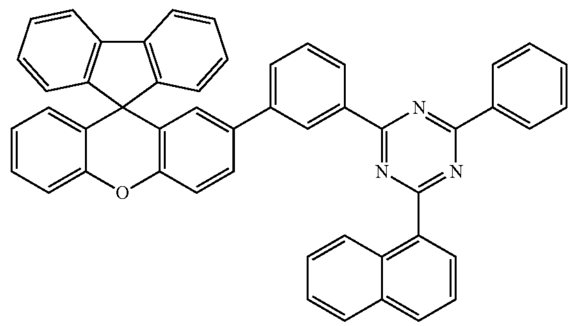
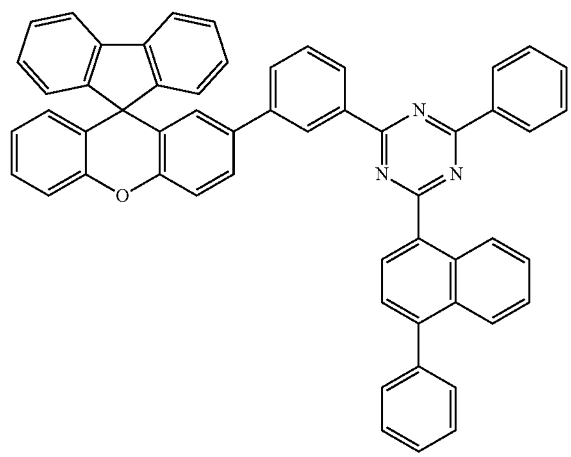
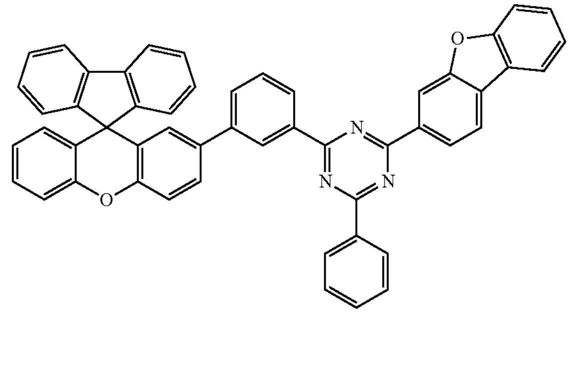

-continued
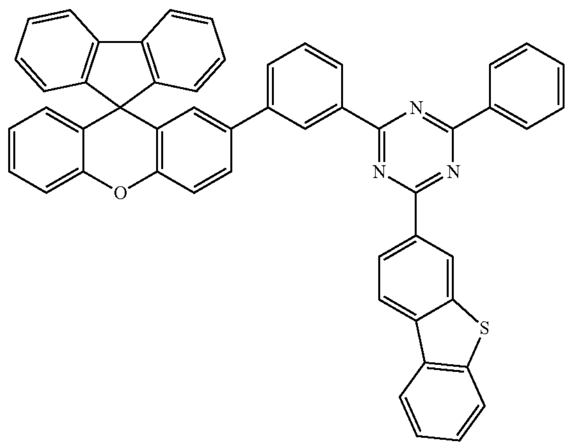
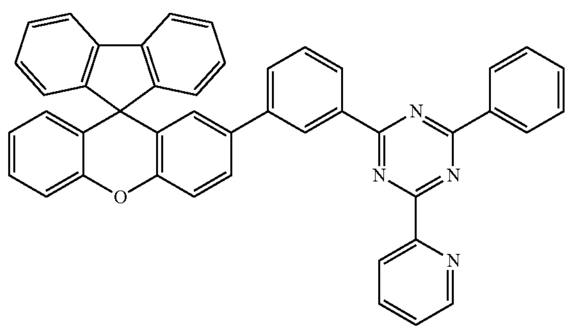
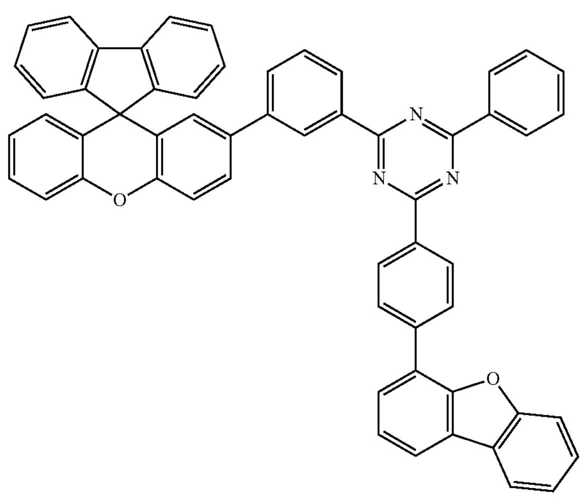
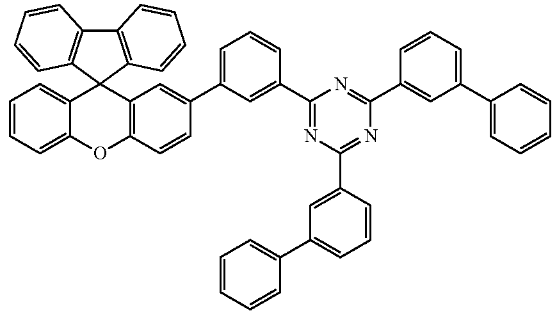
-continued
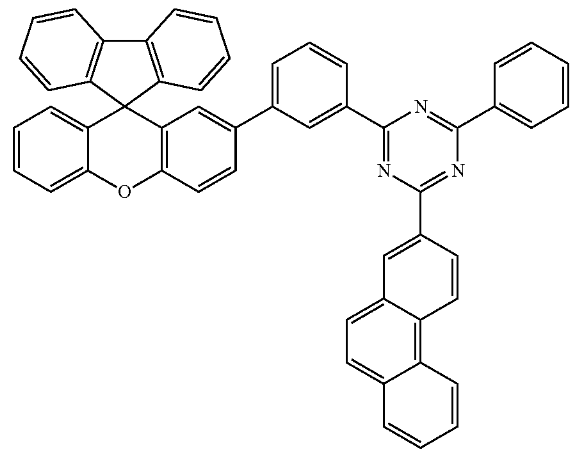
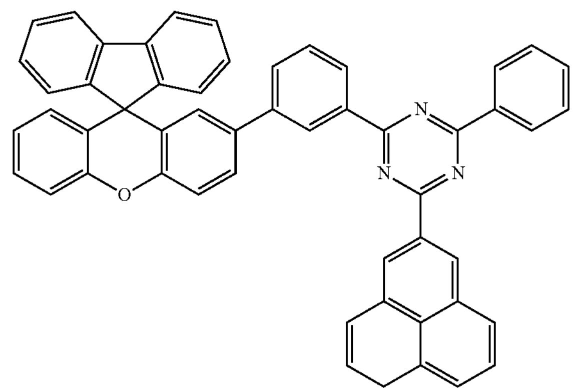
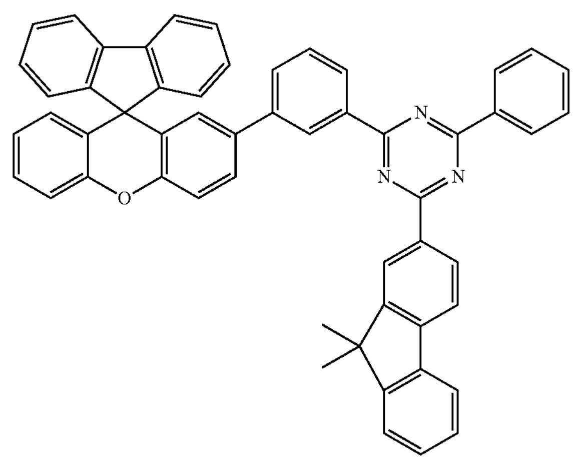
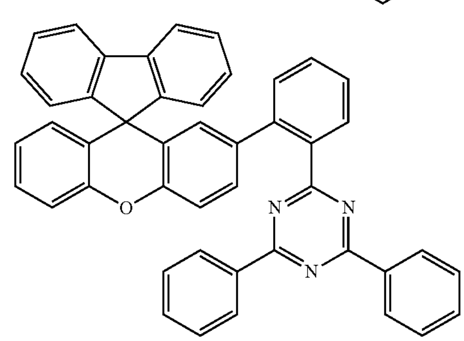

-continued
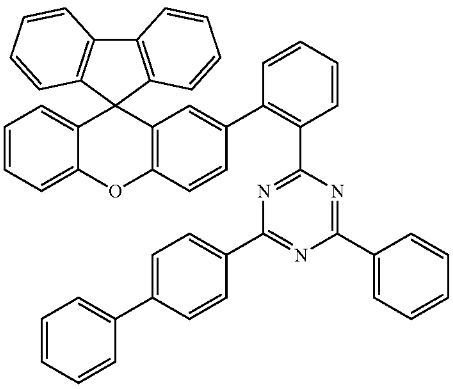
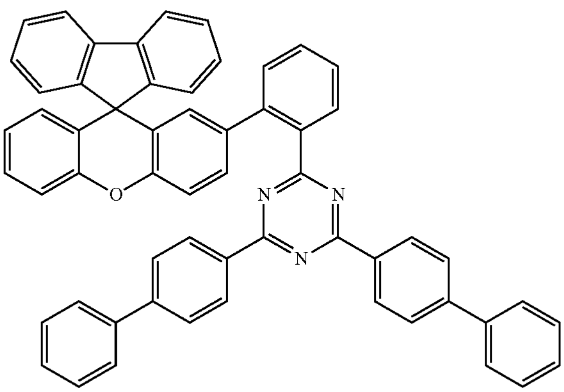
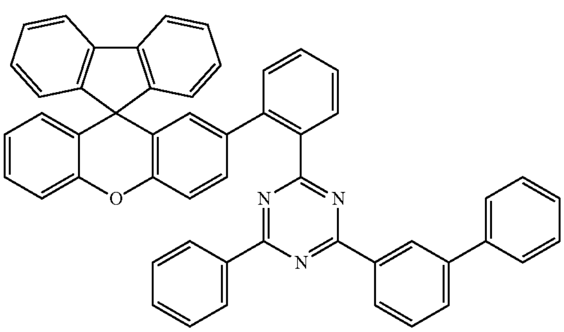
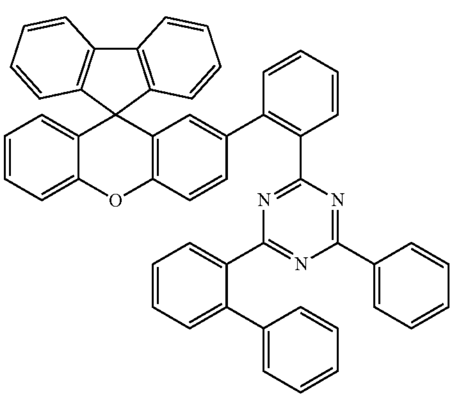
-continued
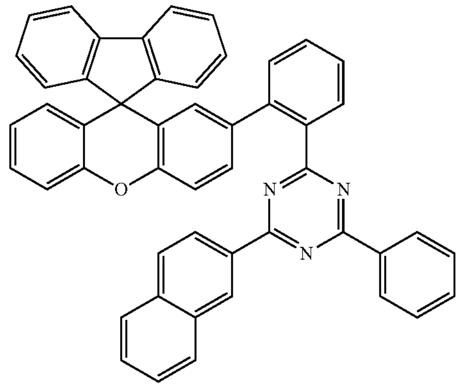
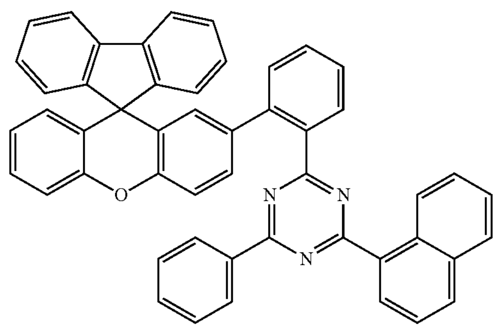
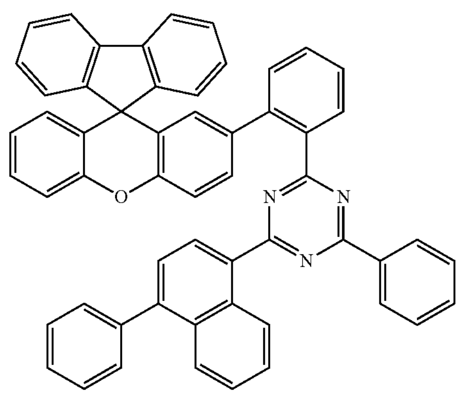
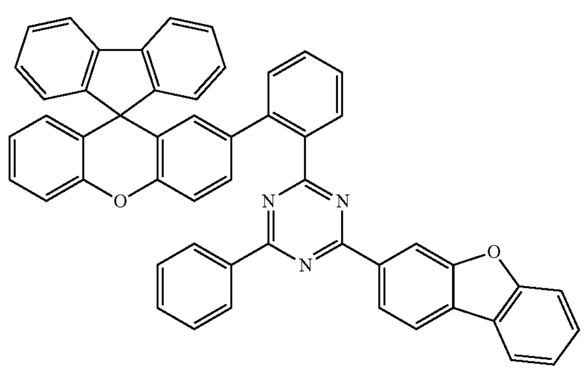

-continued
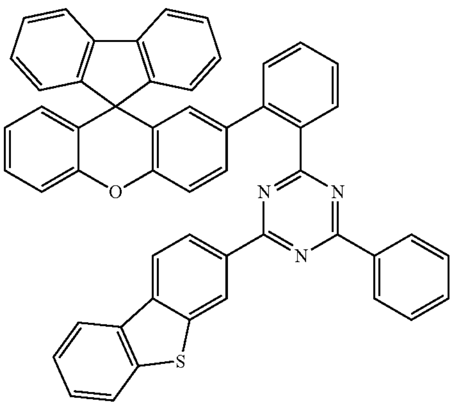
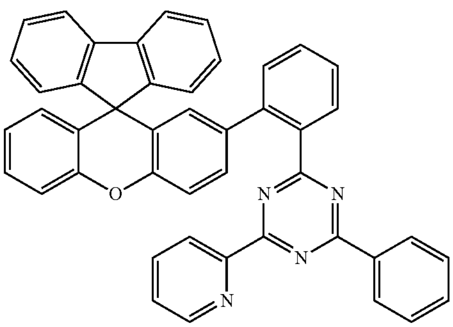
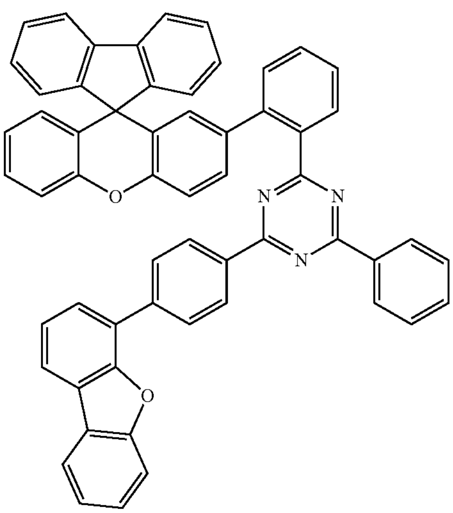
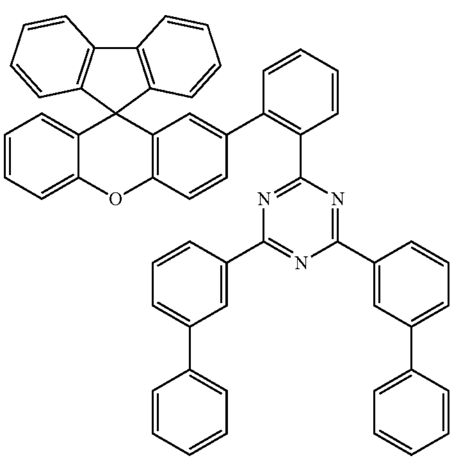
-continued
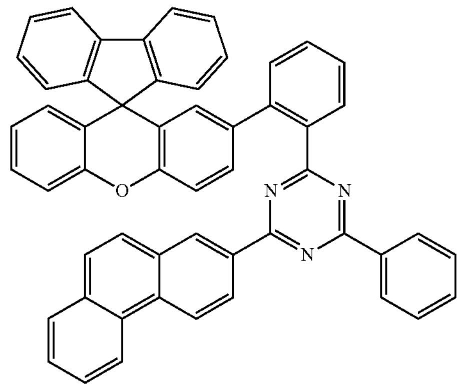
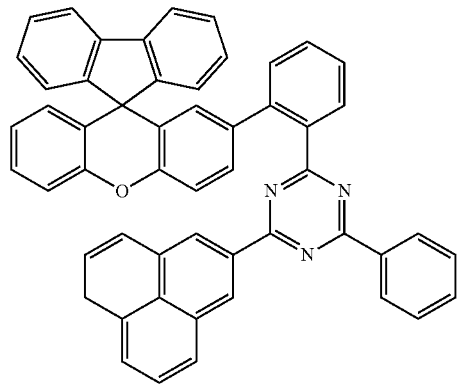
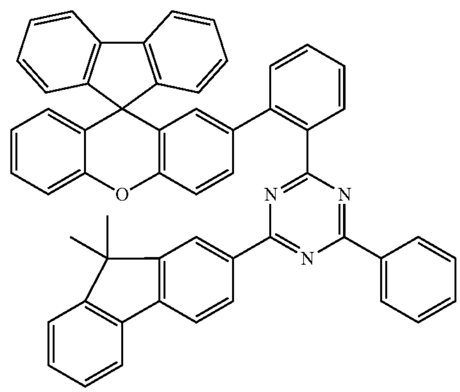
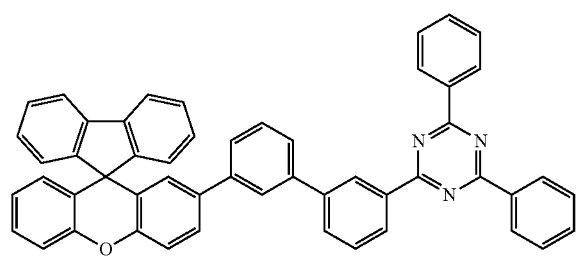
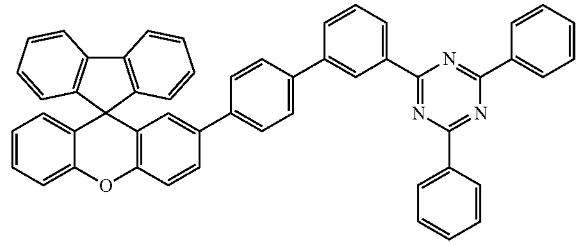

-continued
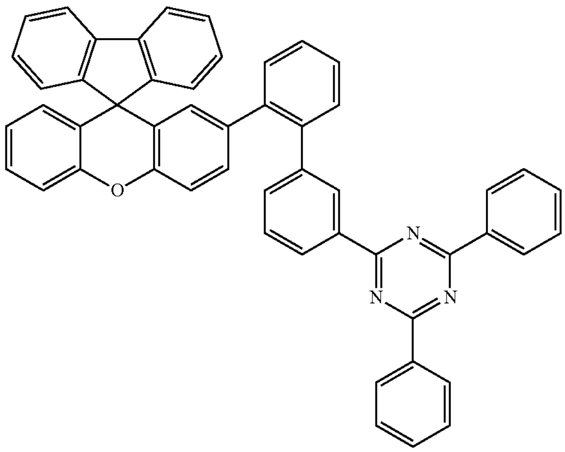
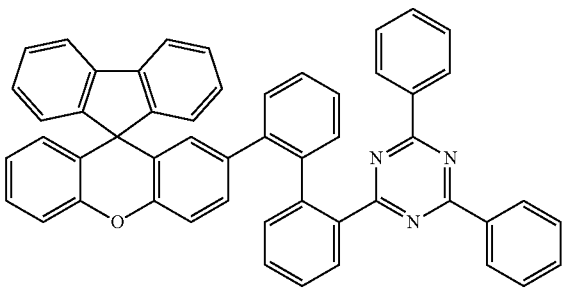
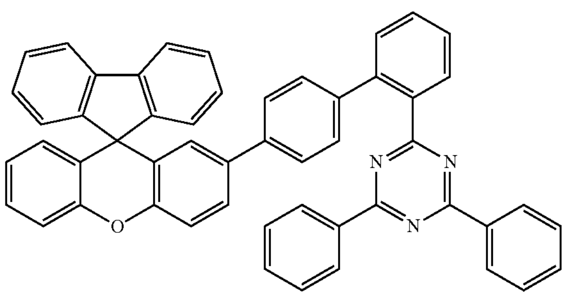
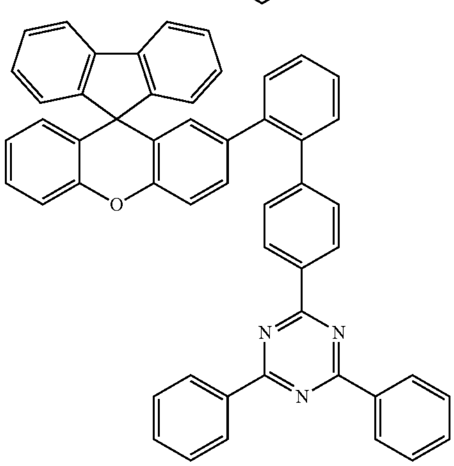
-continued
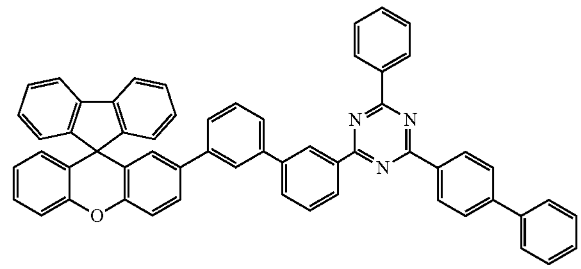
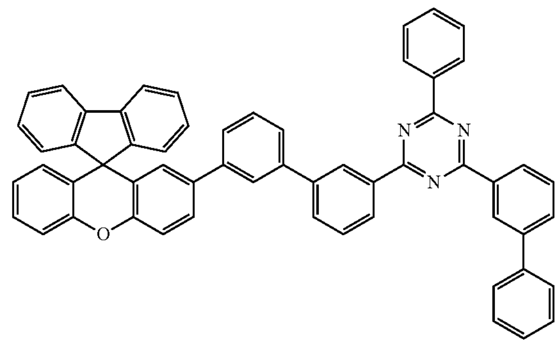
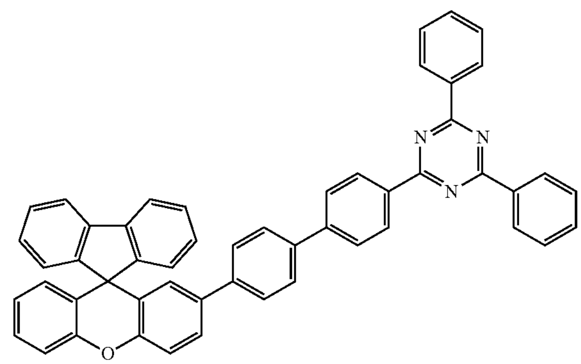
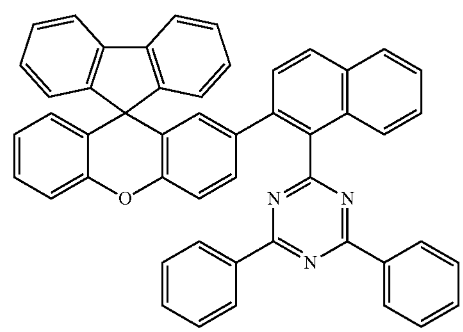
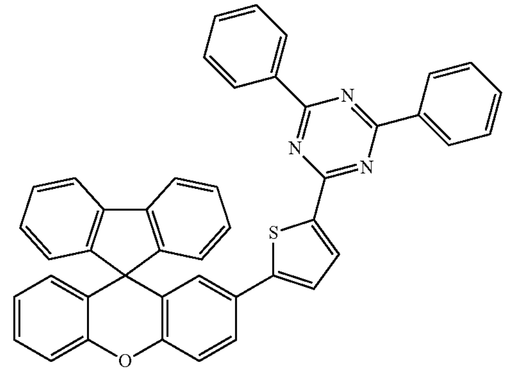

-continued
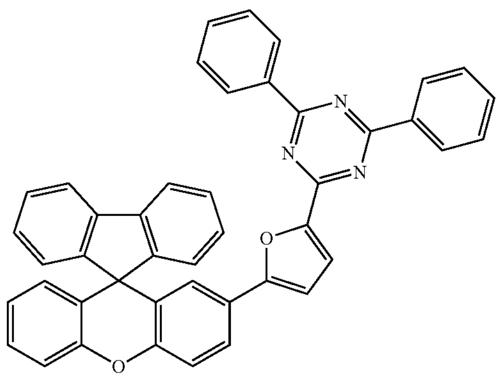
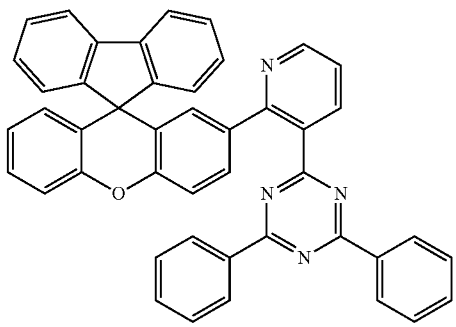
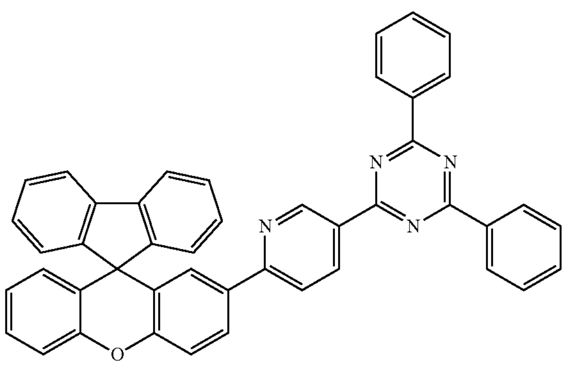
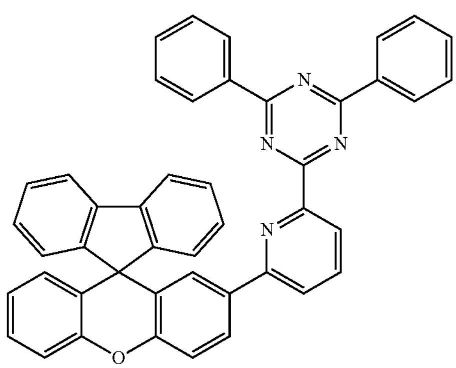
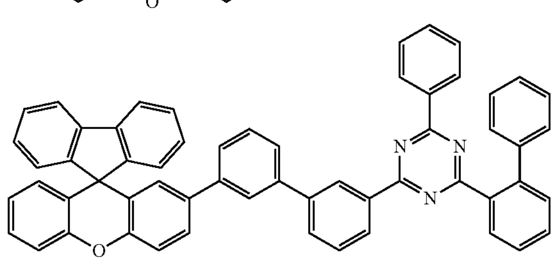
-continued
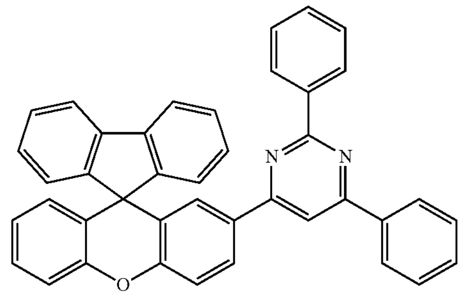
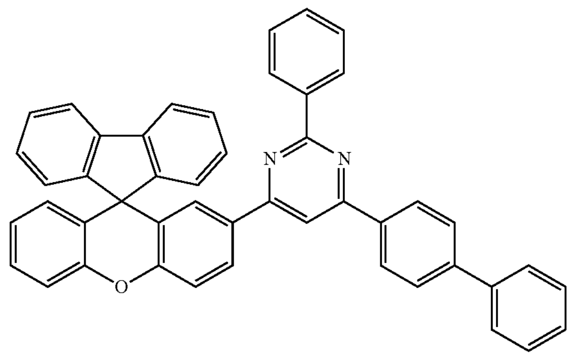
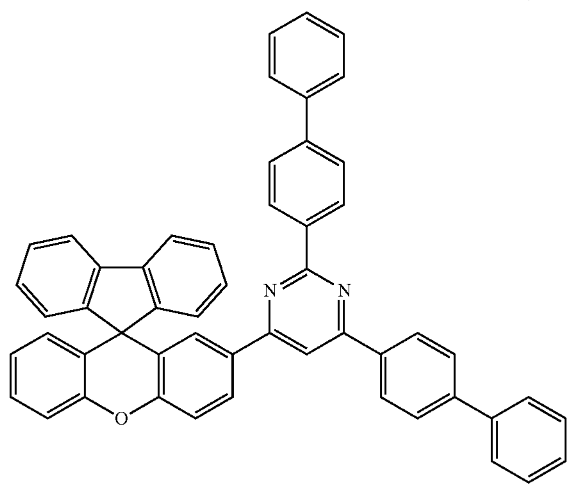
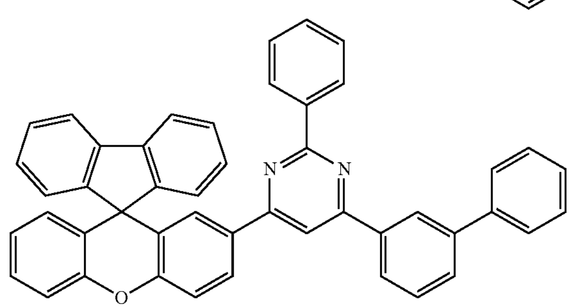
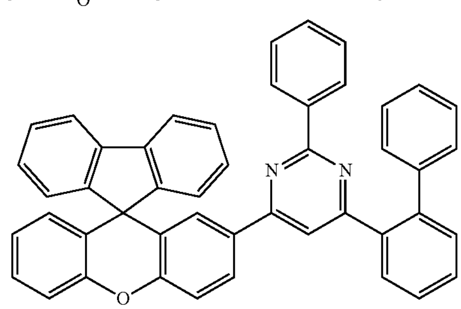

-continued
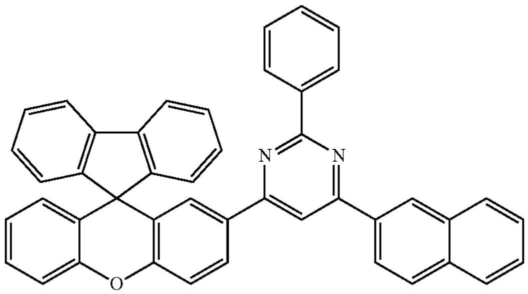
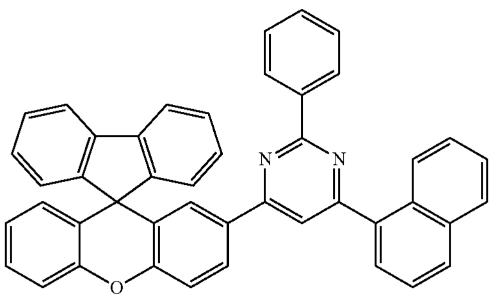
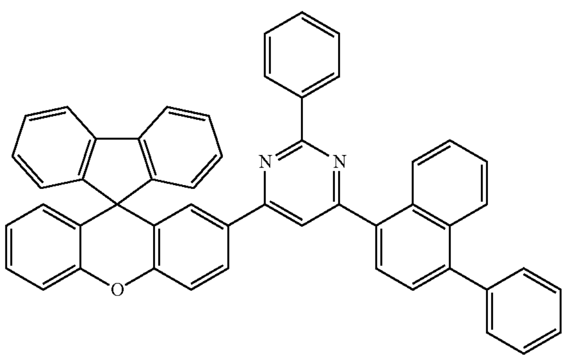
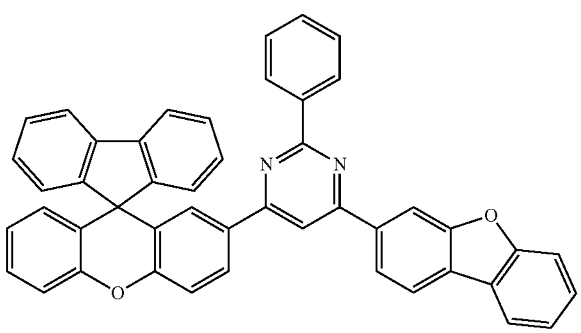
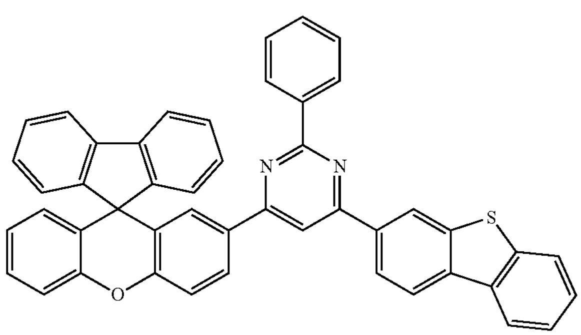
-continued
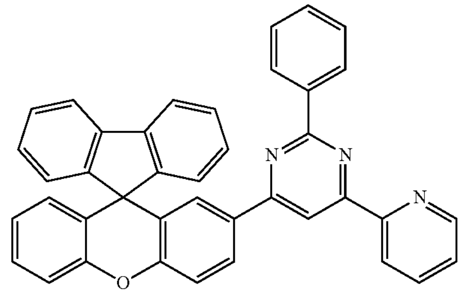
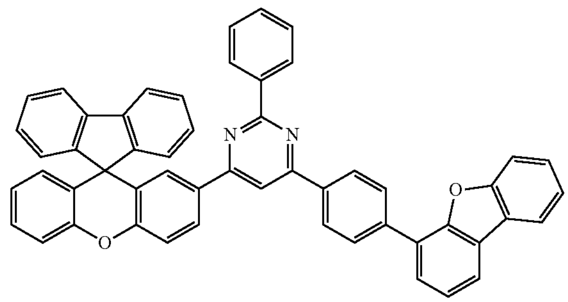
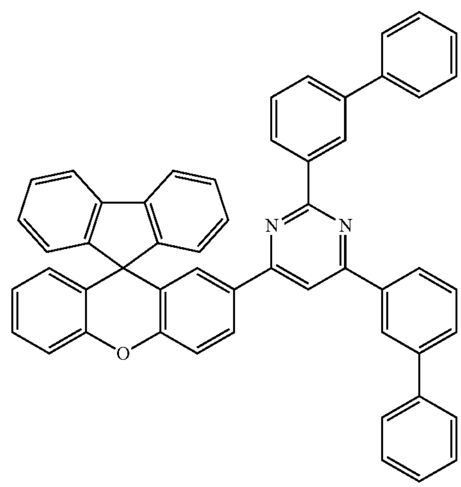
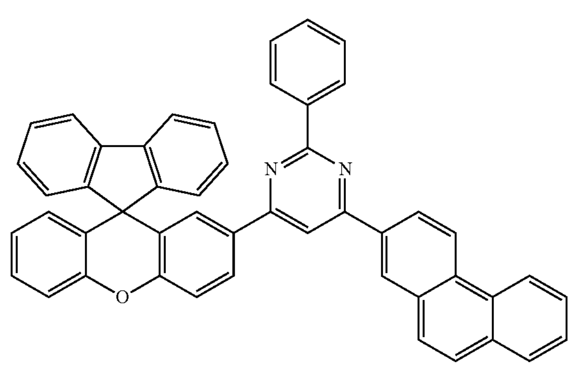

-continued
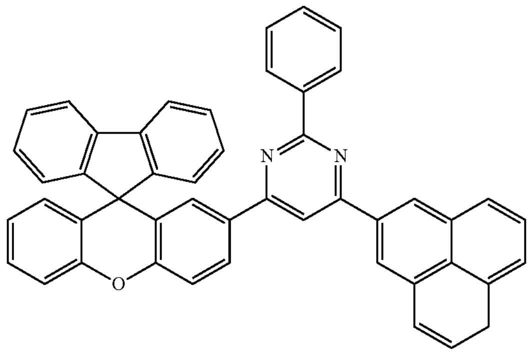
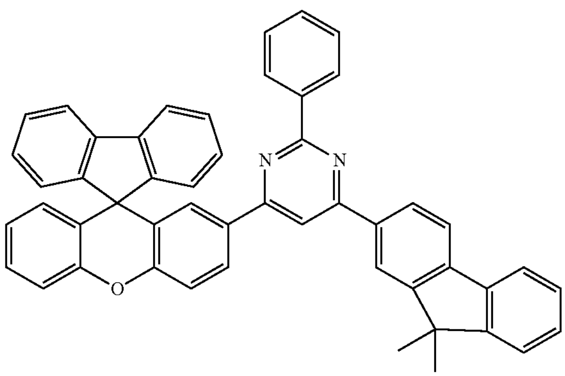
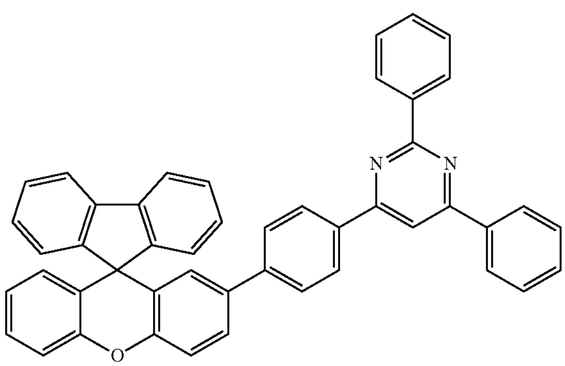
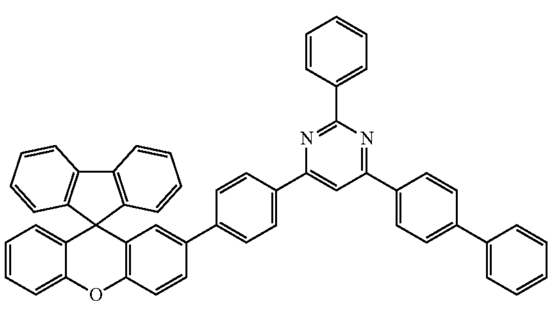
-continued
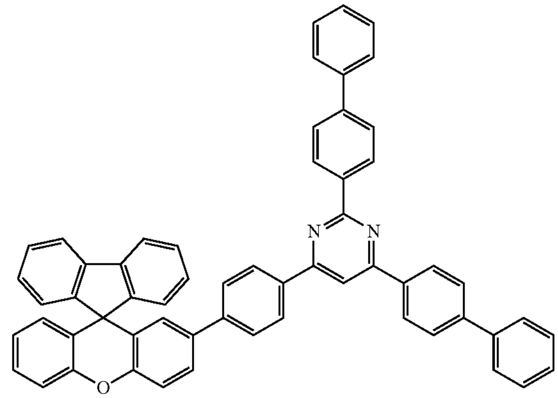
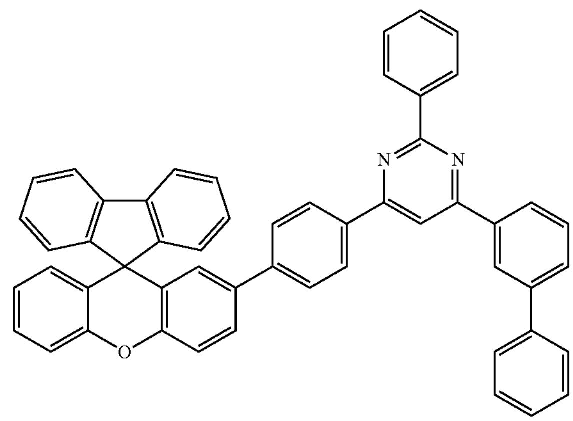
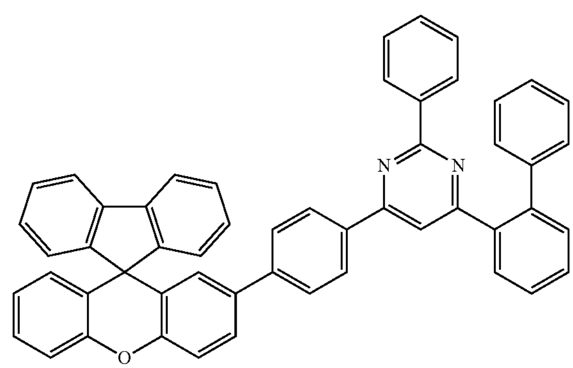
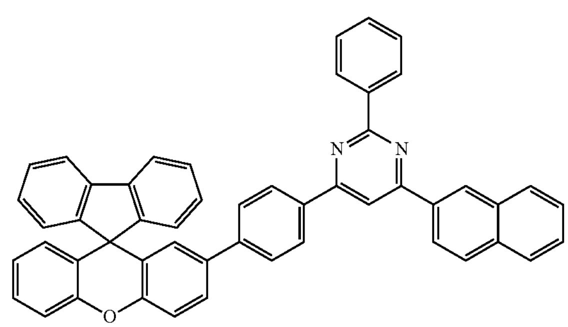

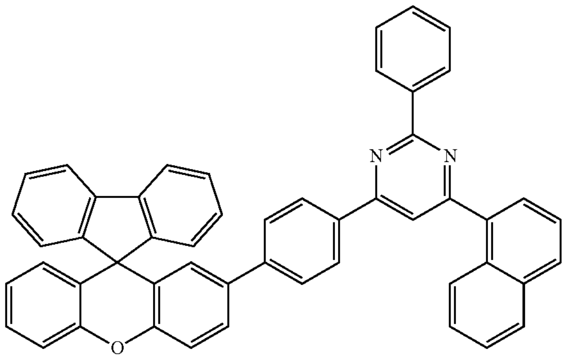
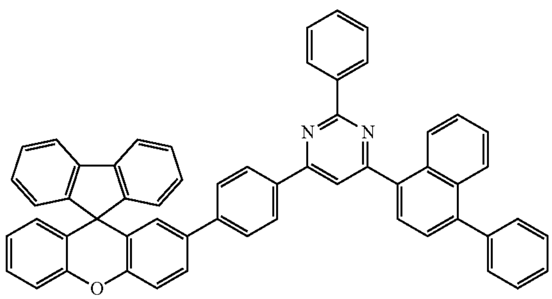
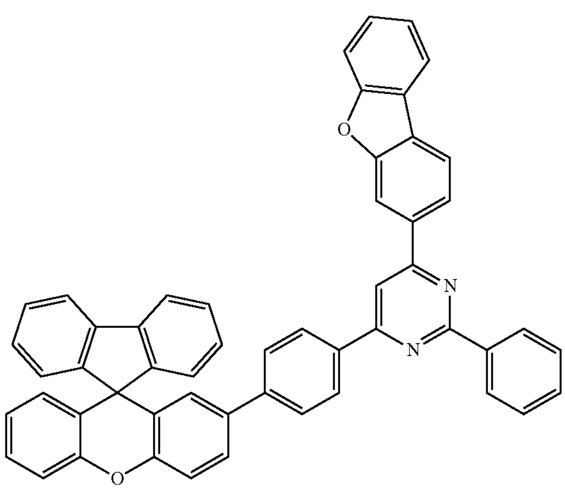
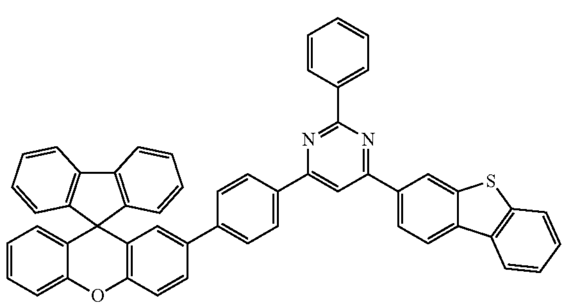
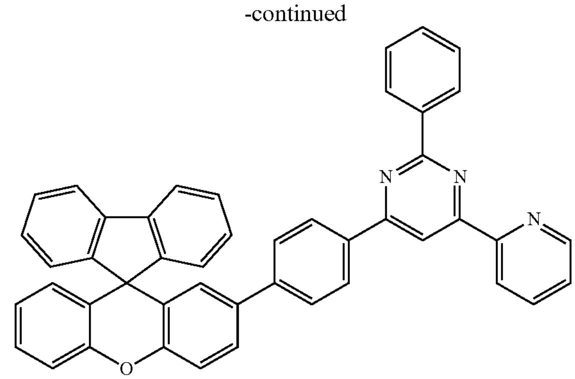
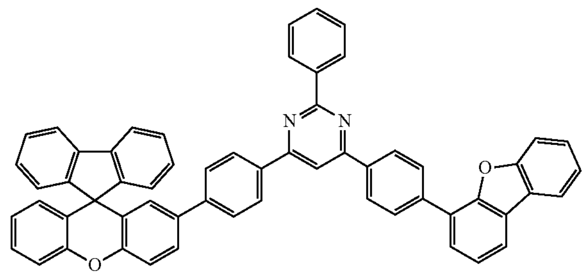
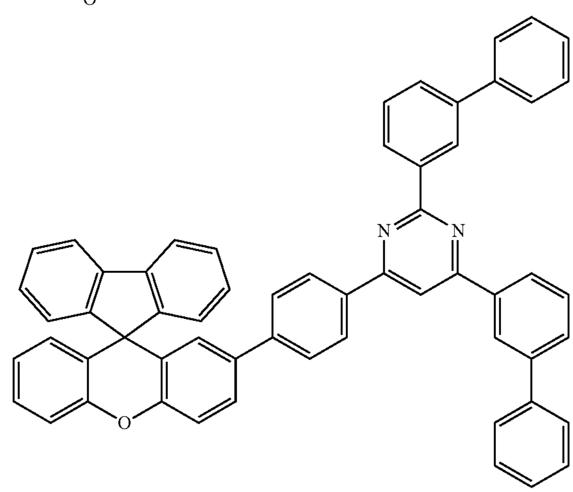
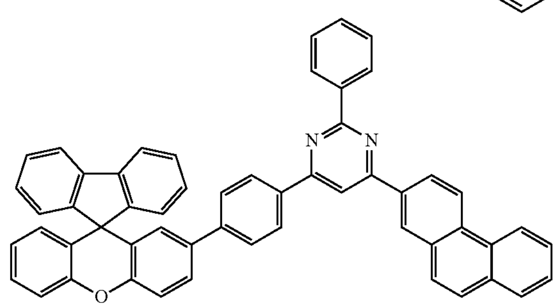
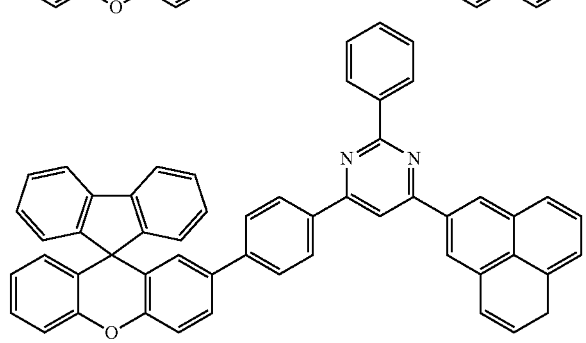

-continued
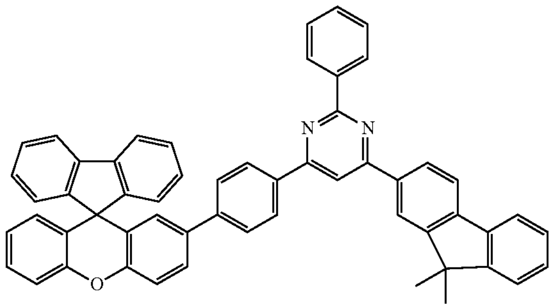
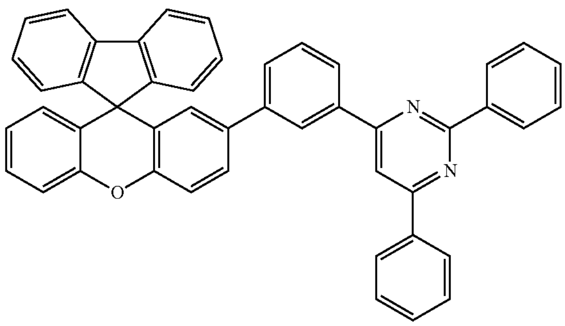
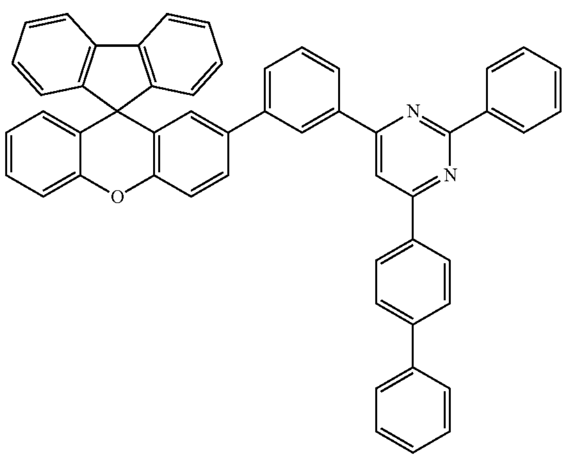
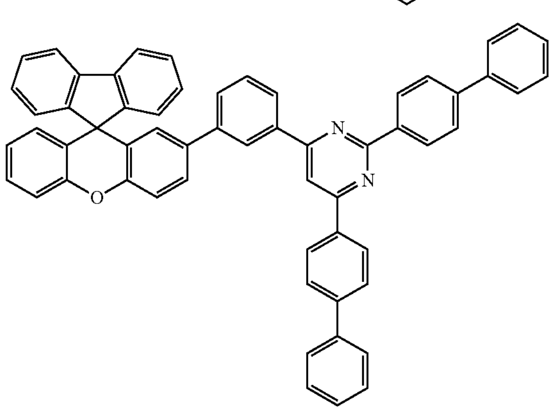
-continued
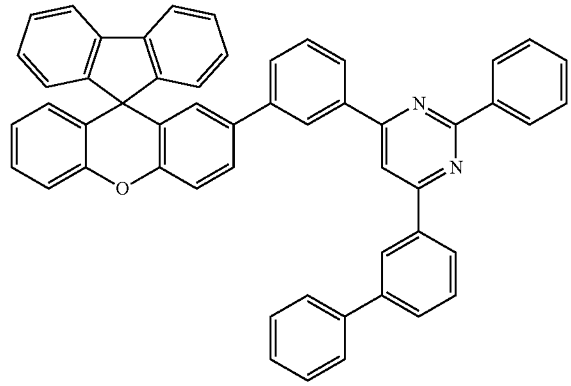
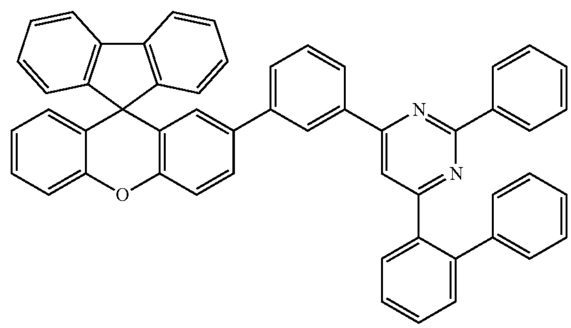
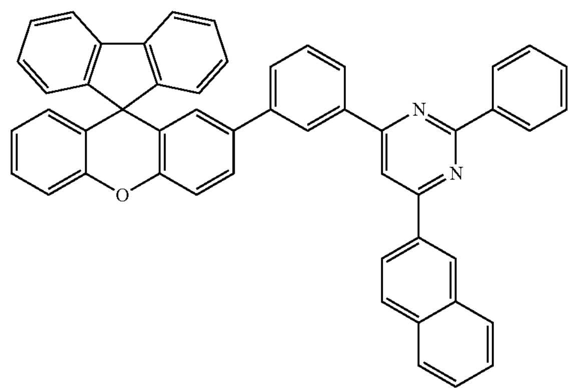
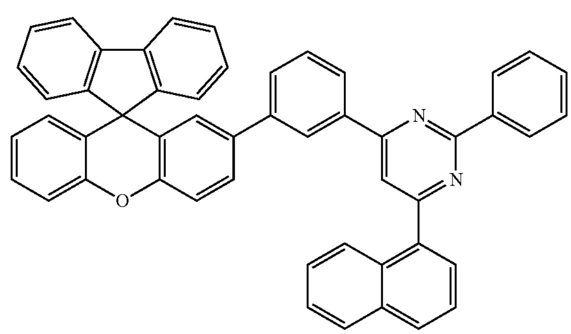

-continued
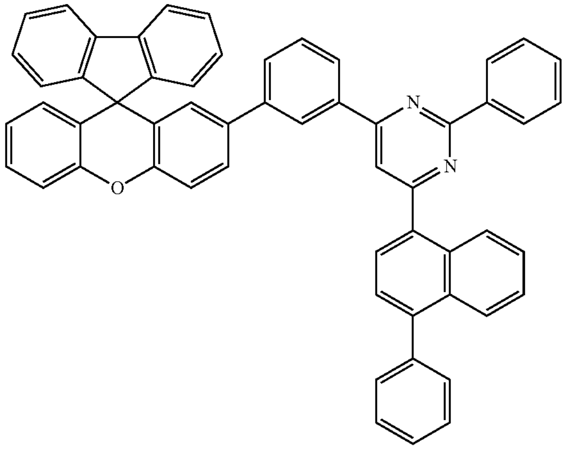
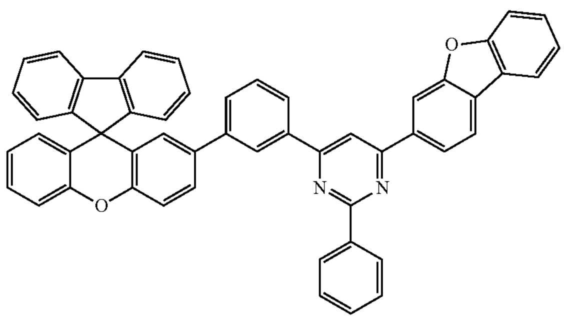
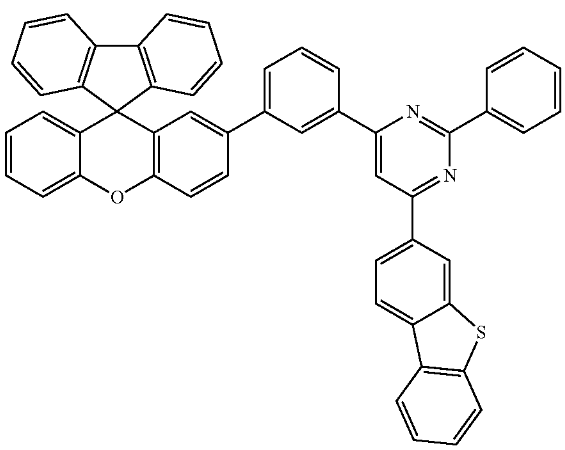
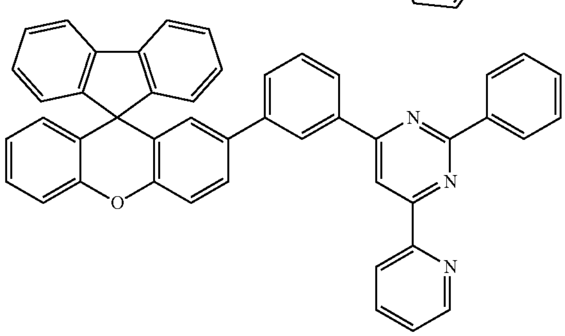
-continued
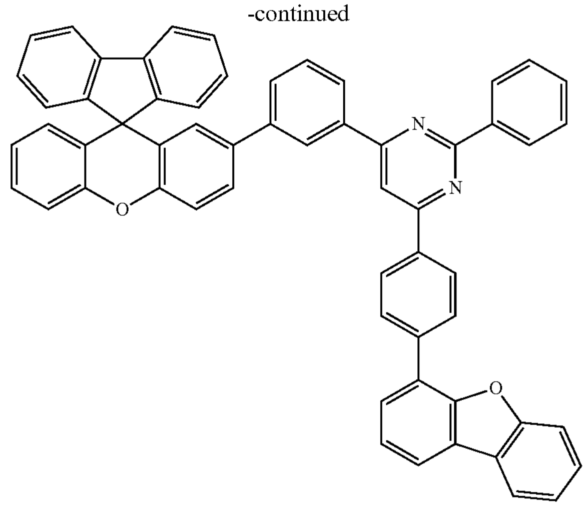
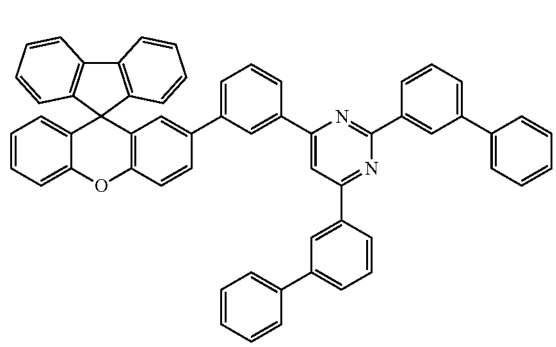
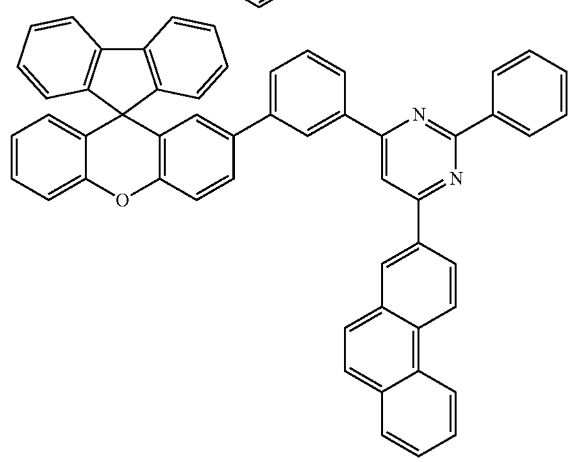
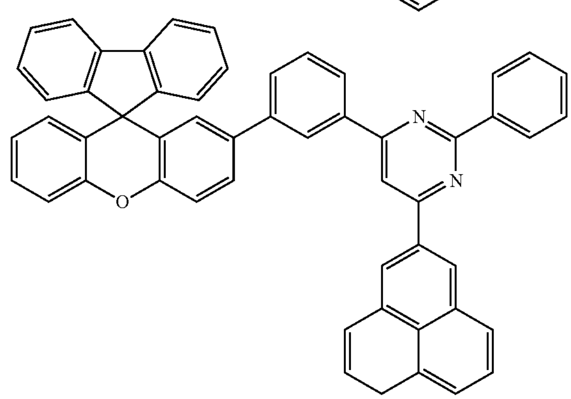

-continued
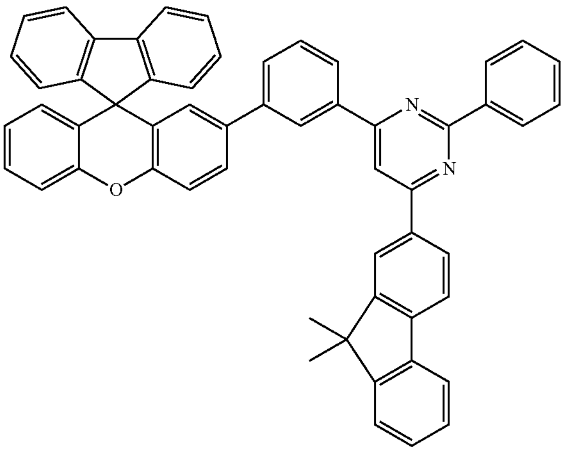
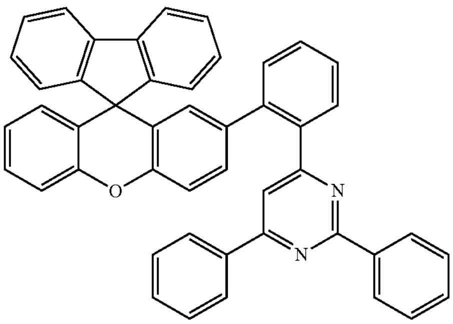
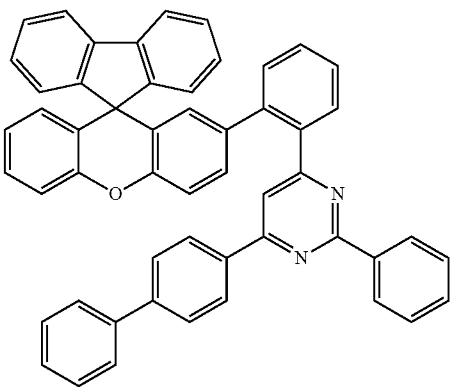
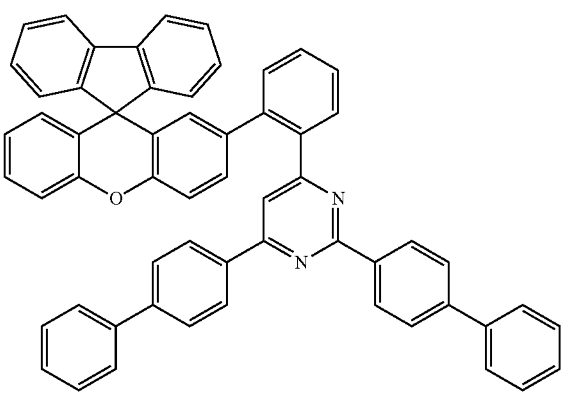
-continued
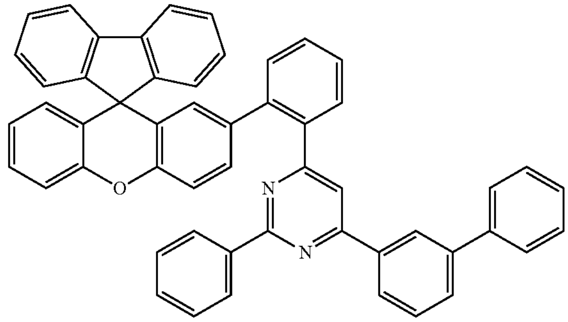
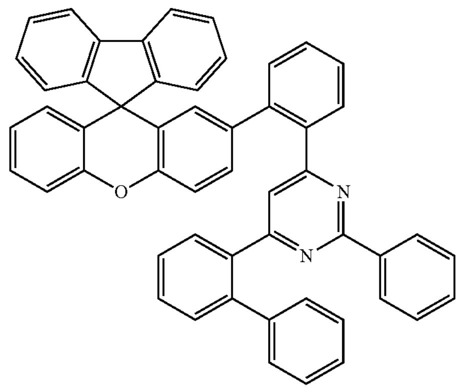
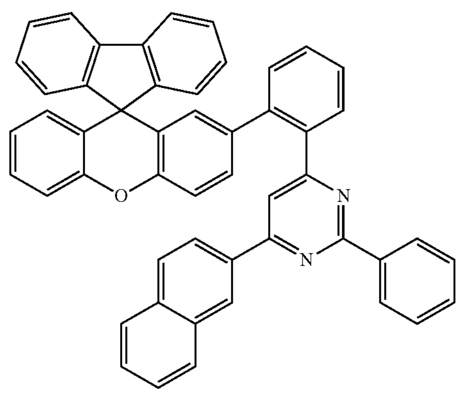
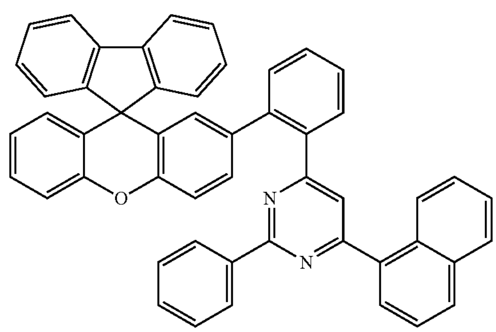

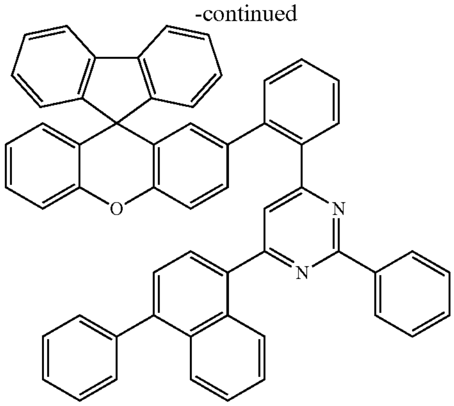
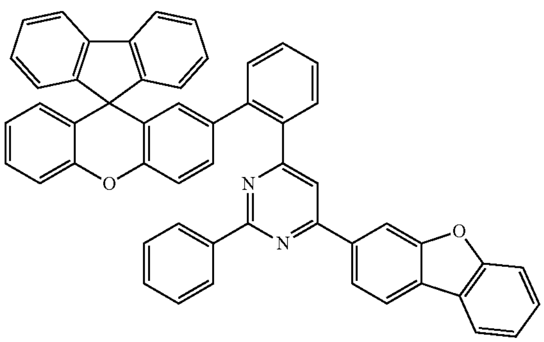
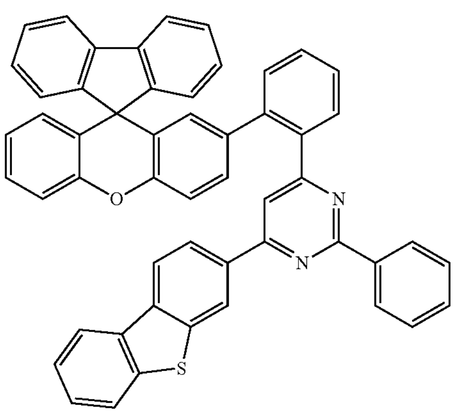
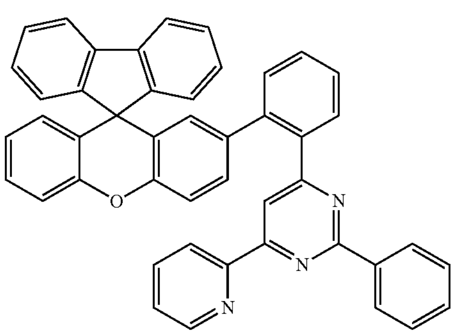
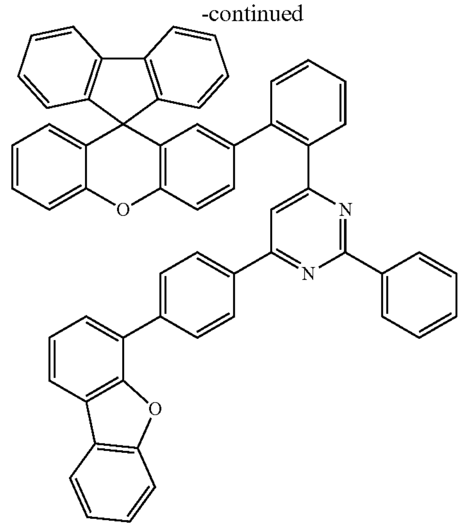
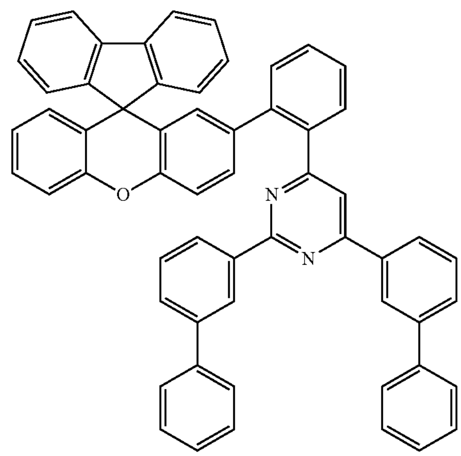
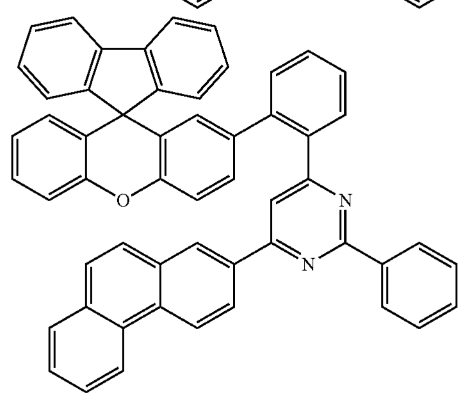
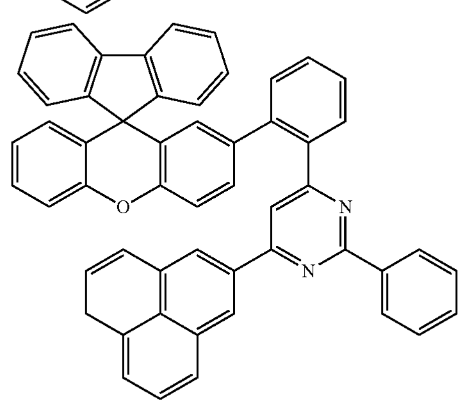

-continued
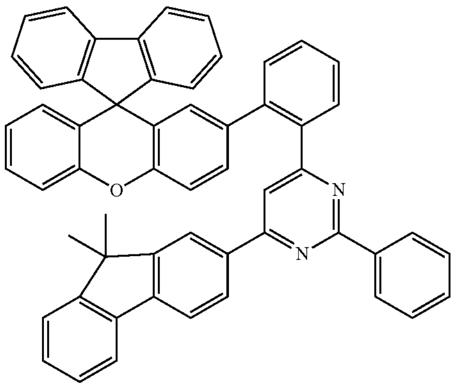
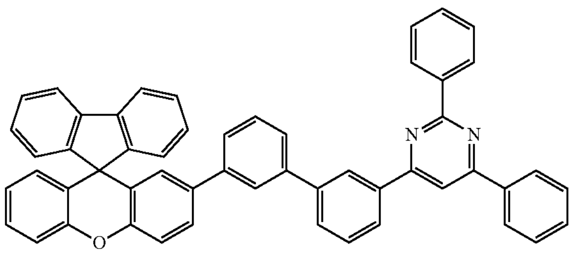
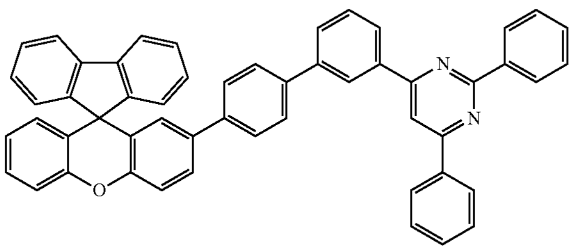
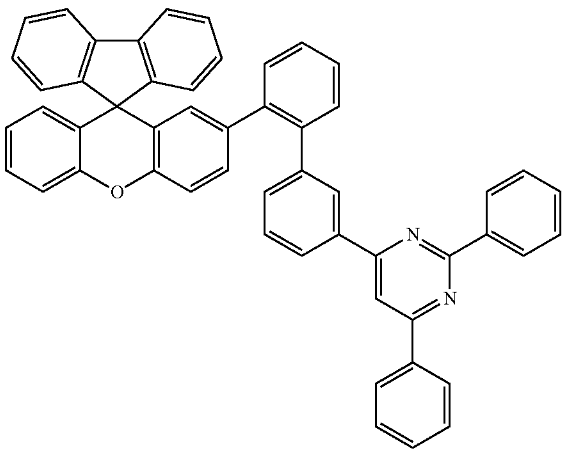
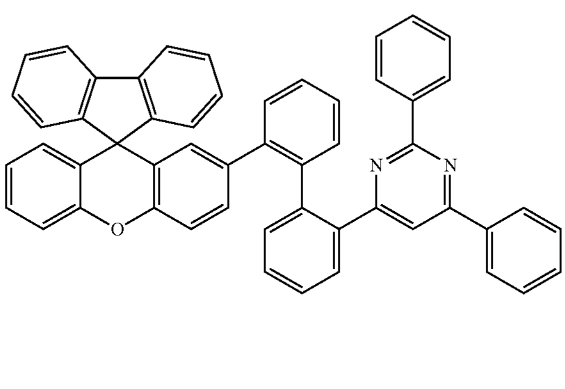
-continued
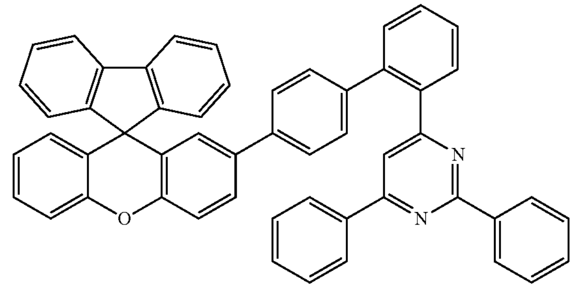
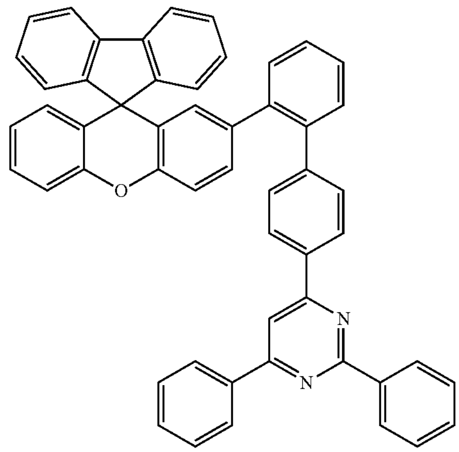
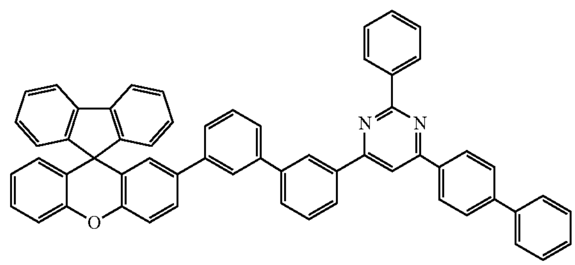
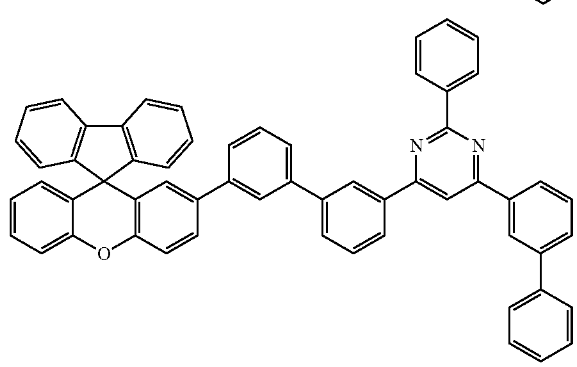
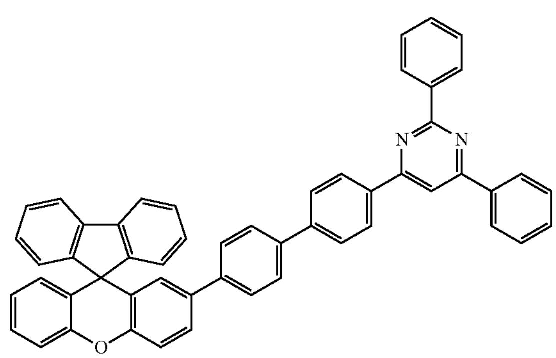

-continued
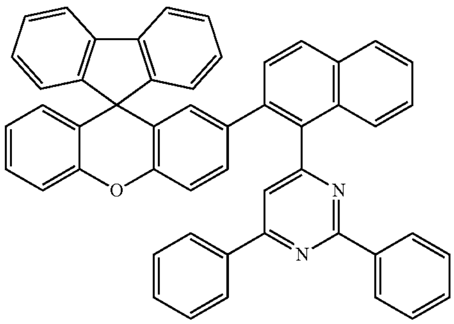
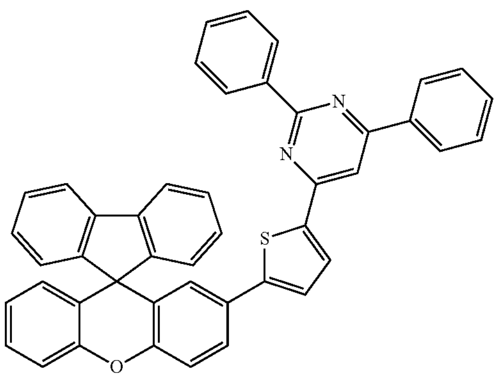
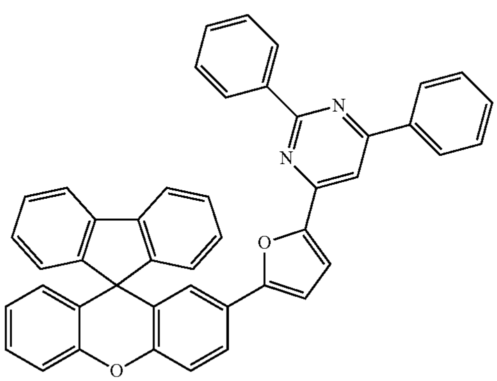
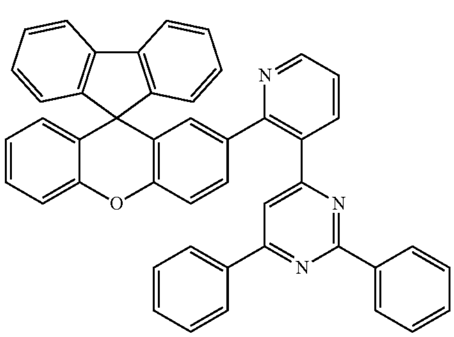
-continued
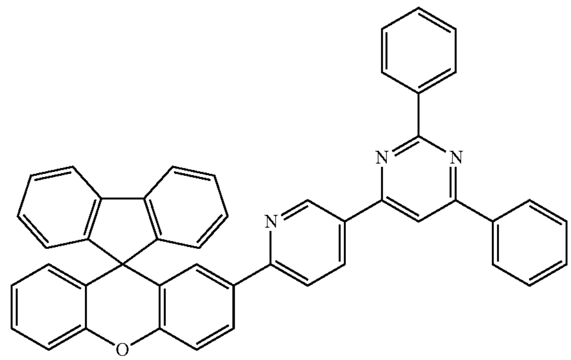
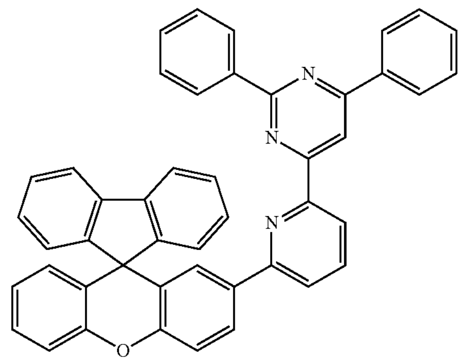
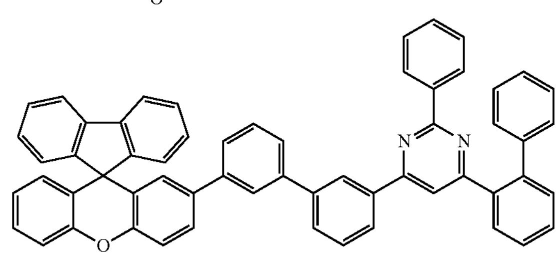
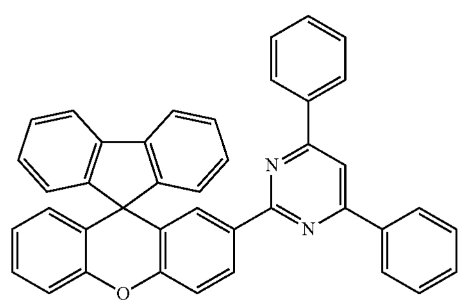
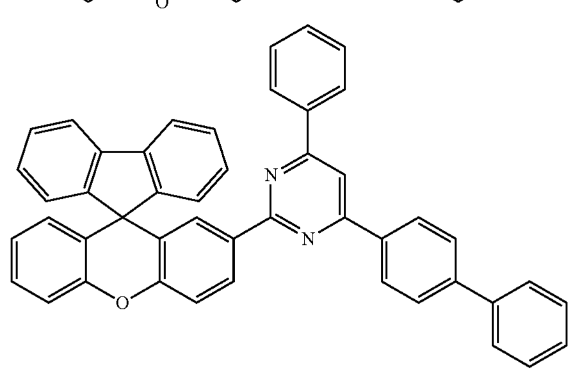

-continued
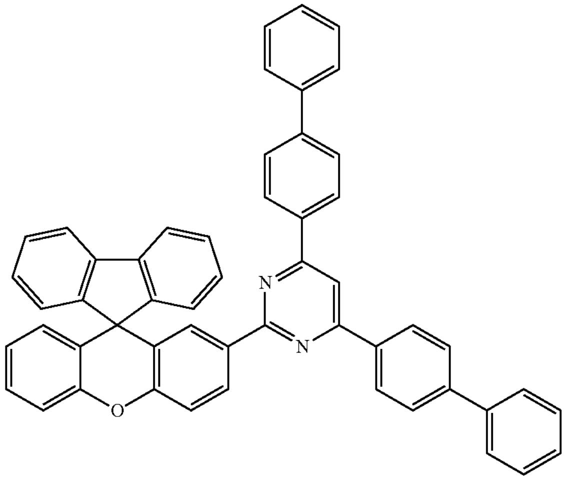
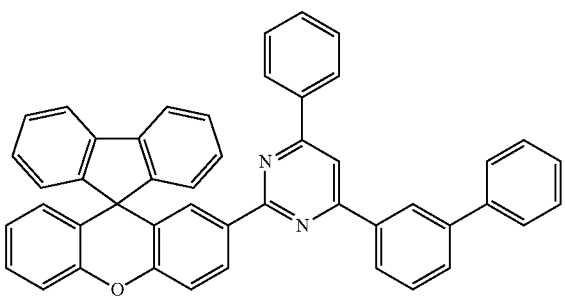
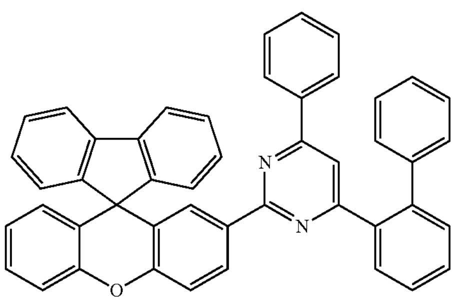
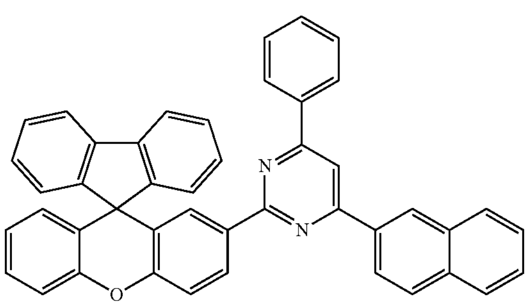
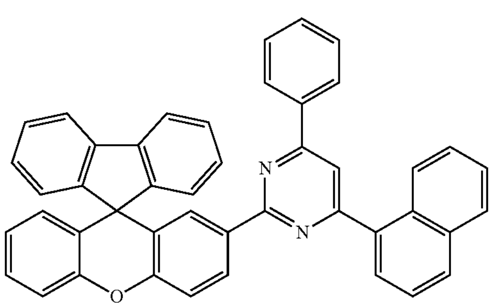
-continued
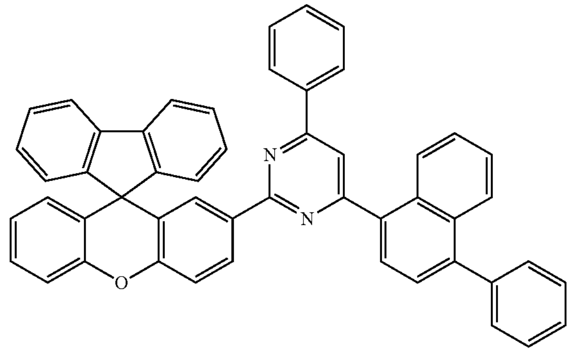
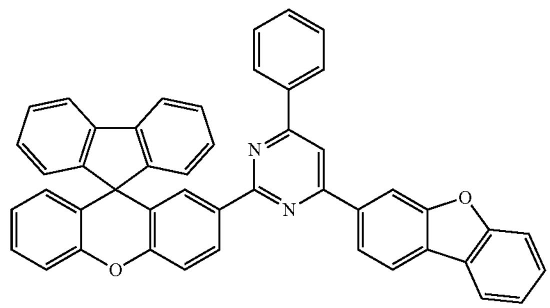
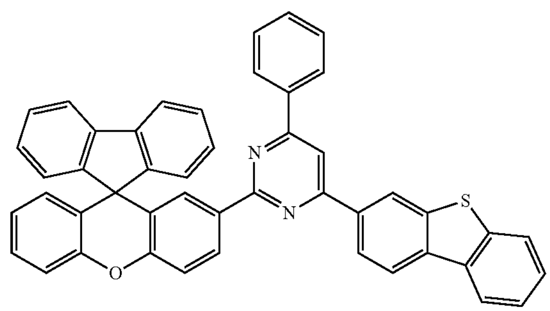
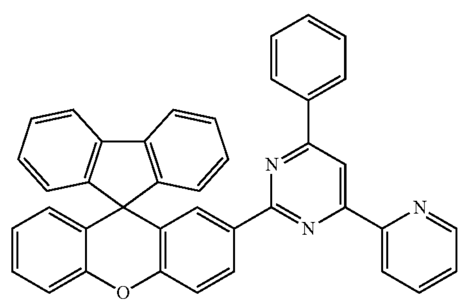
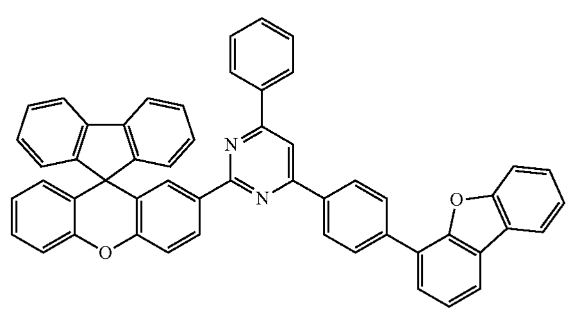

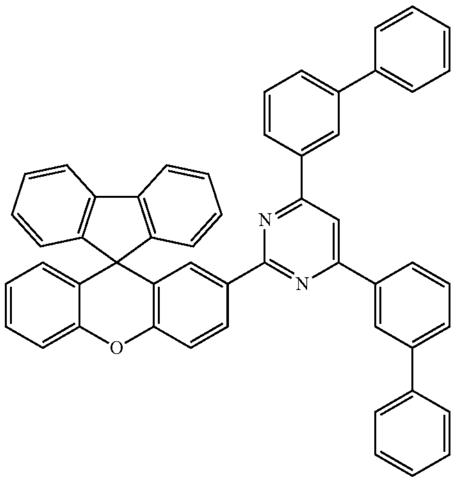
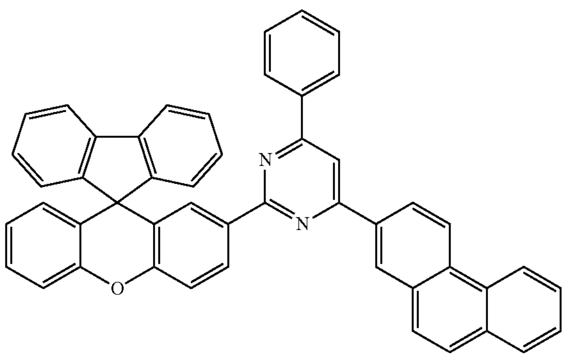
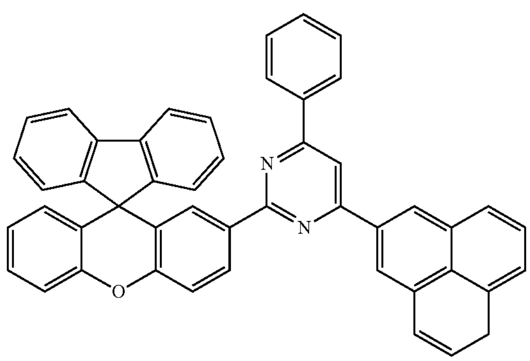
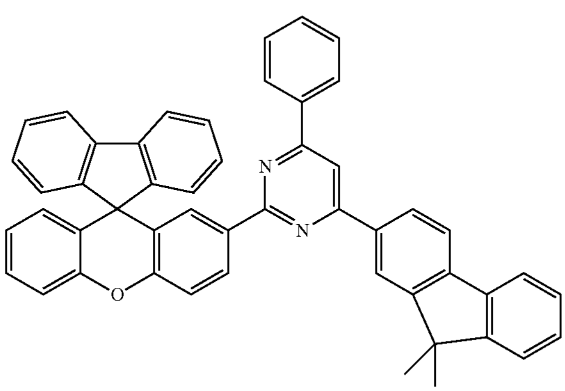
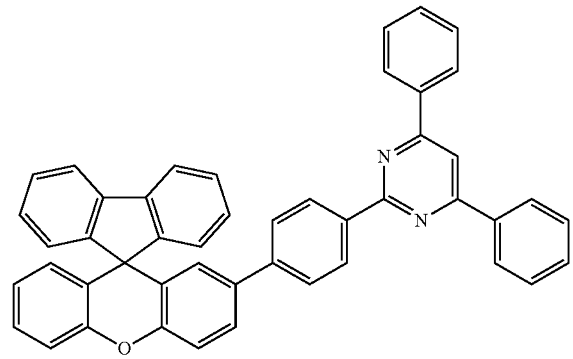
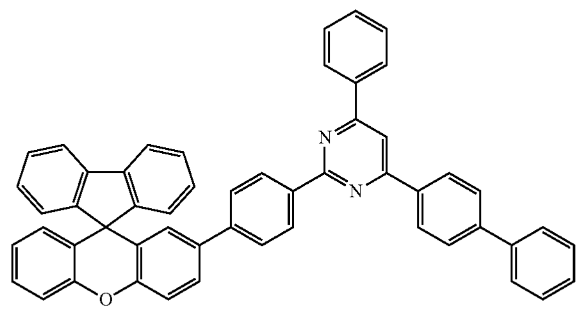
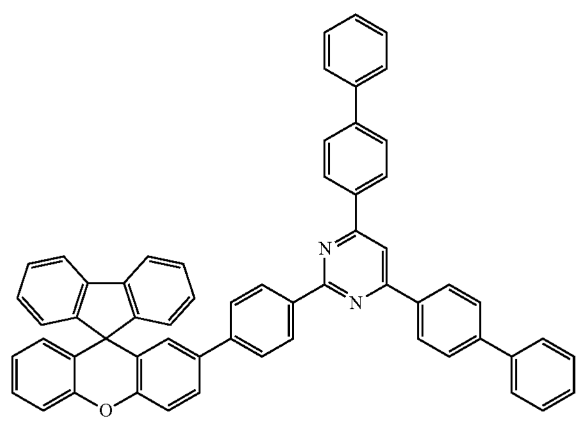
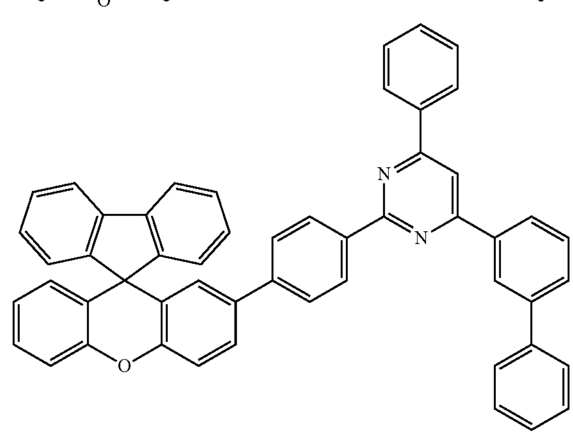

-continued
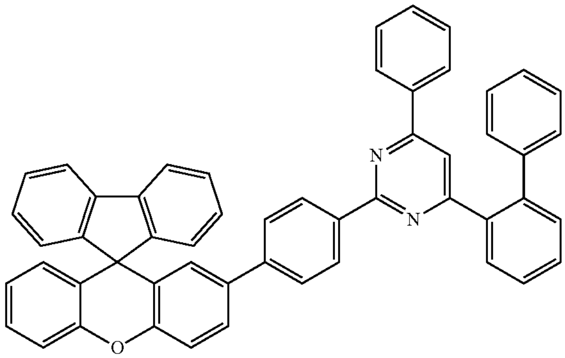
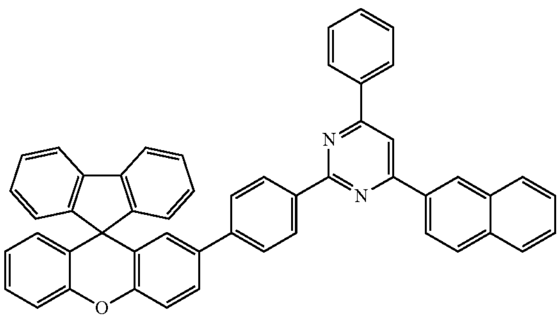
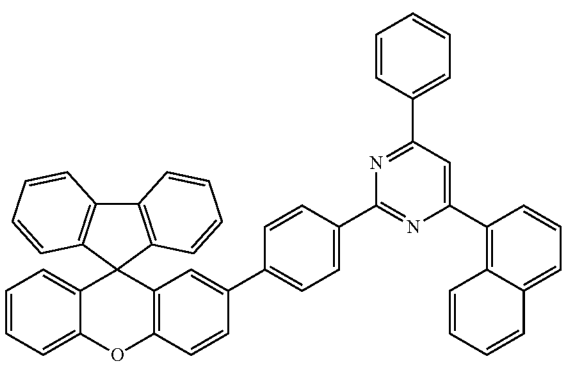
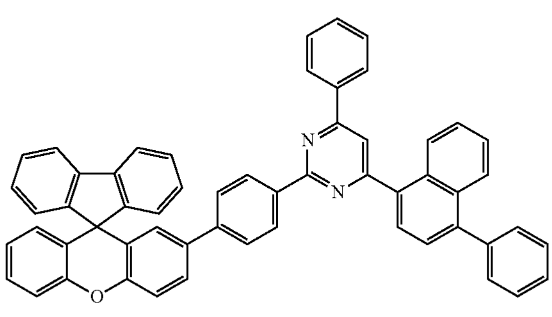
-continued
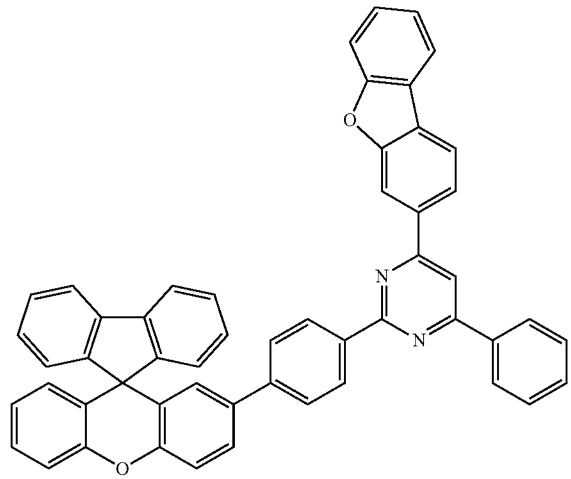
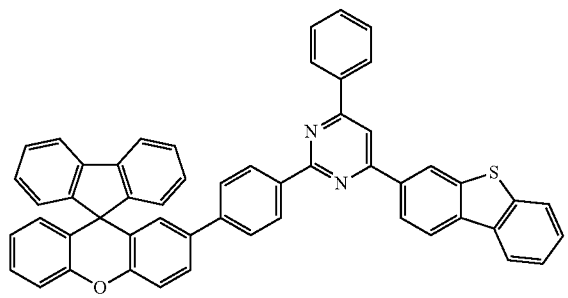
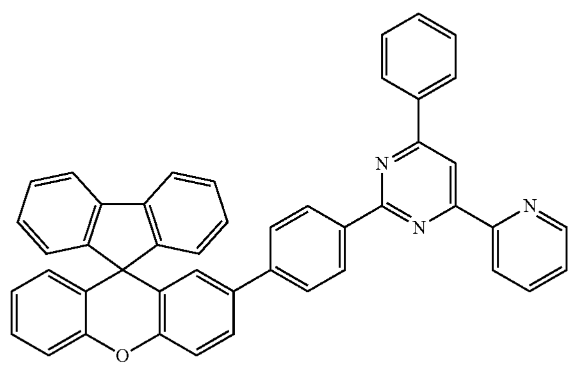
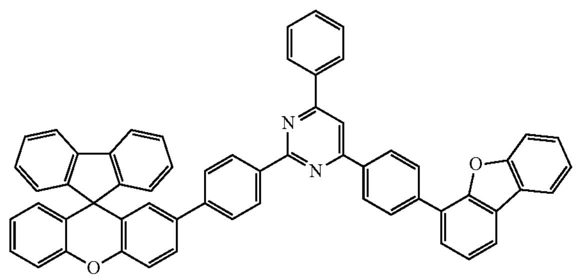

-continued
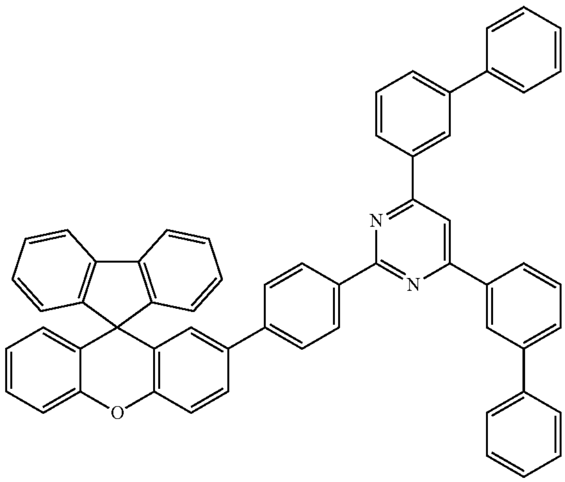
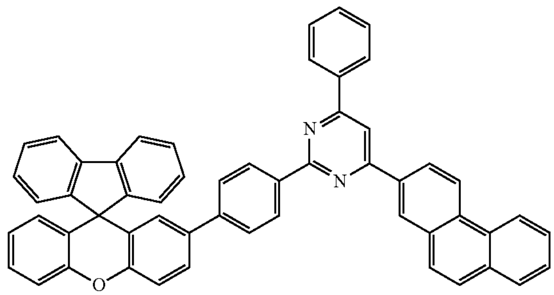
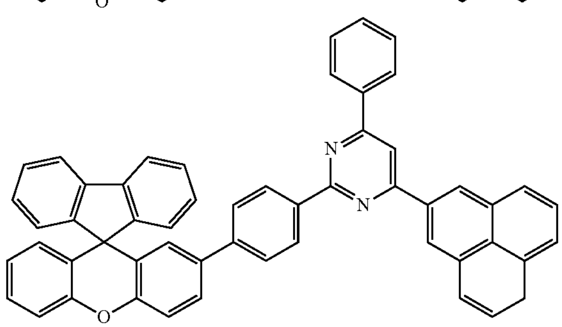
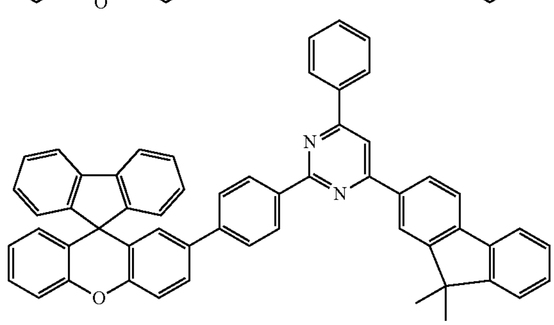
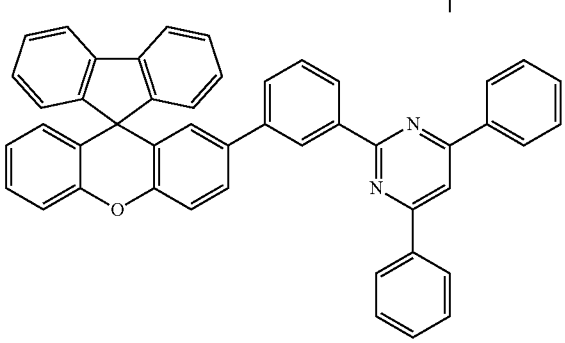
-continued
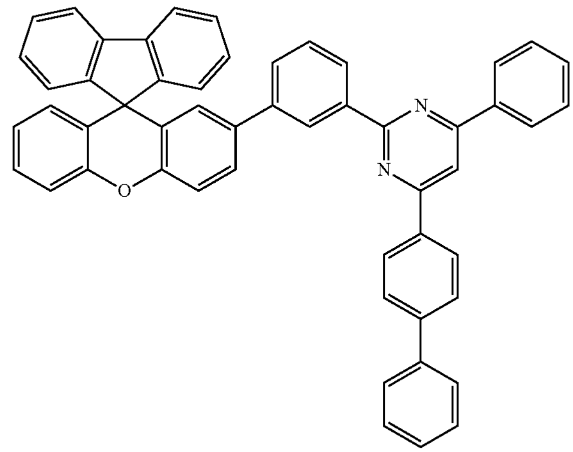
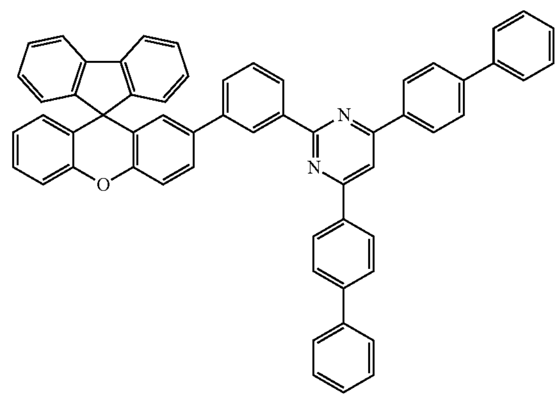
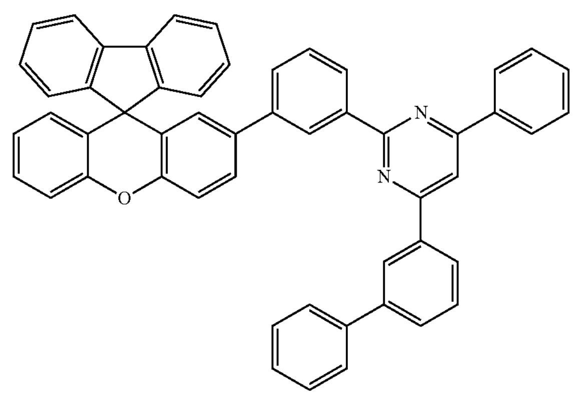
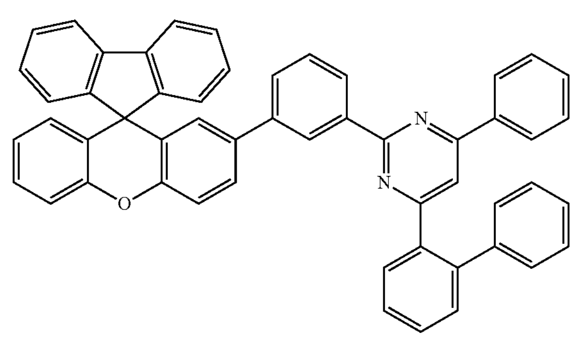

-continued
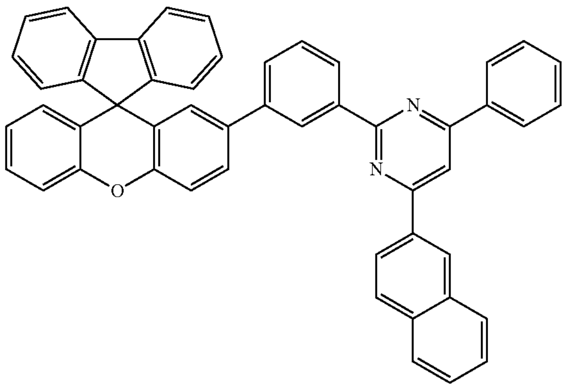
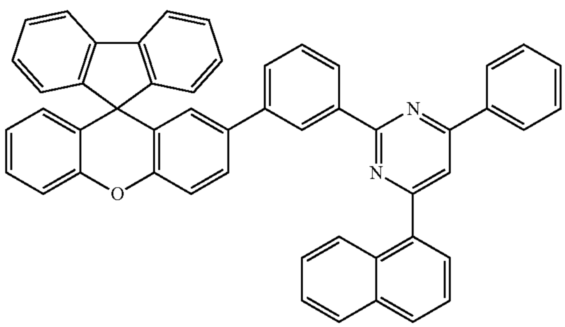
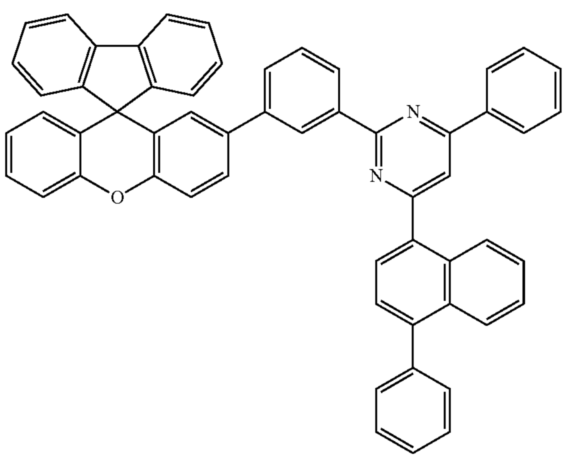
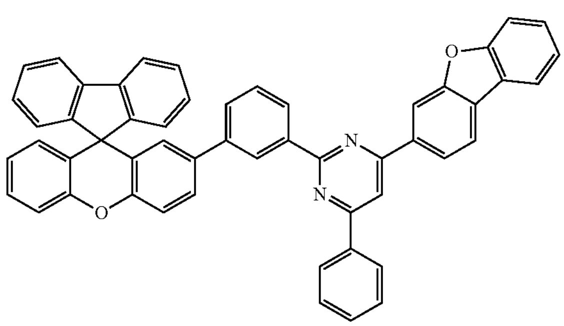
-continued
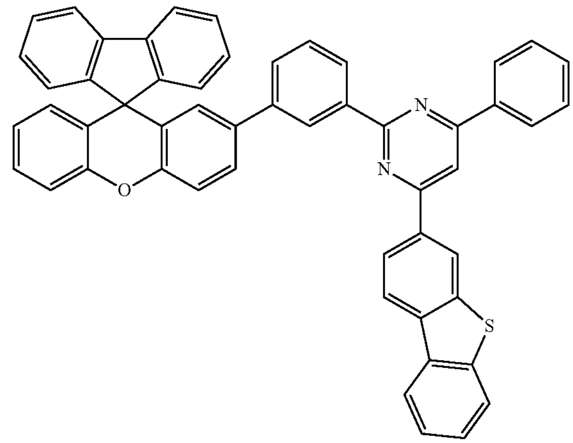
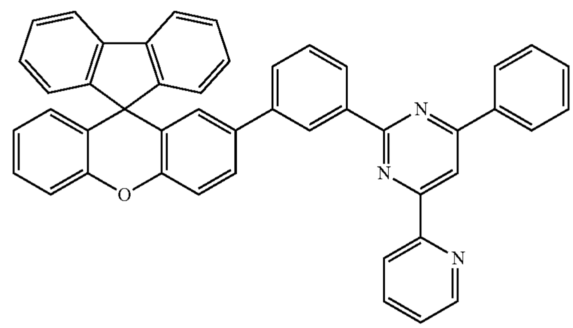
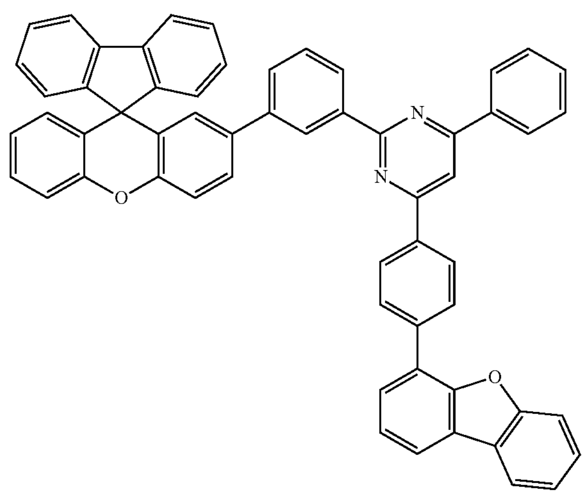
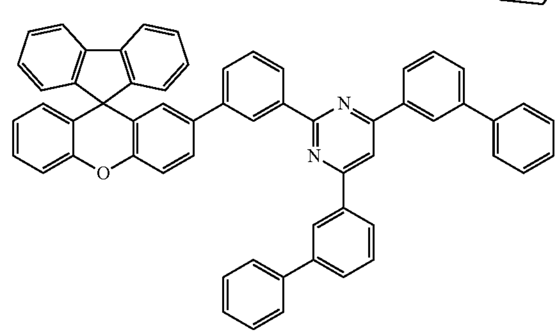

-continued
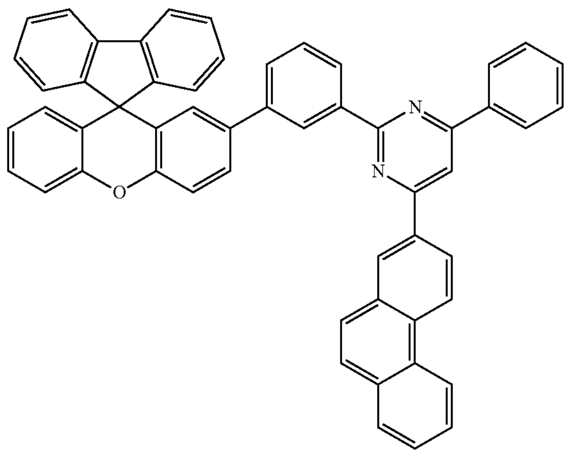
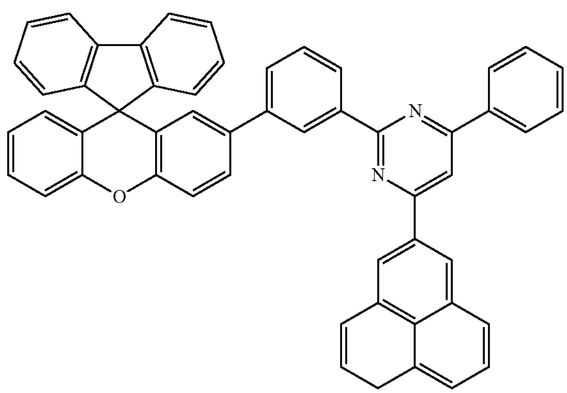
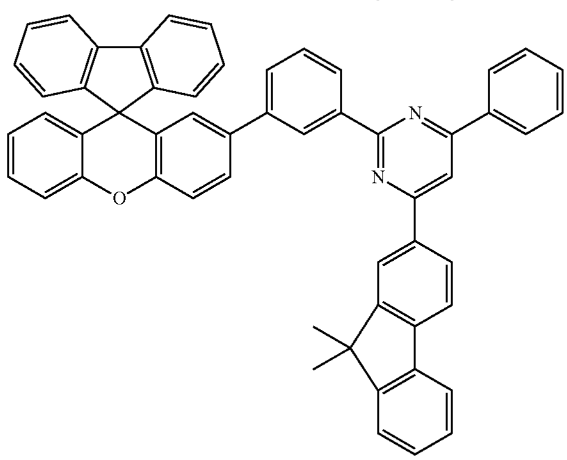
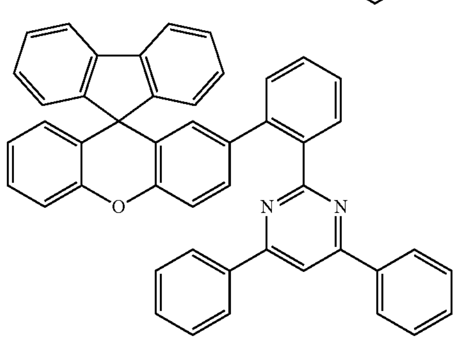
-continued
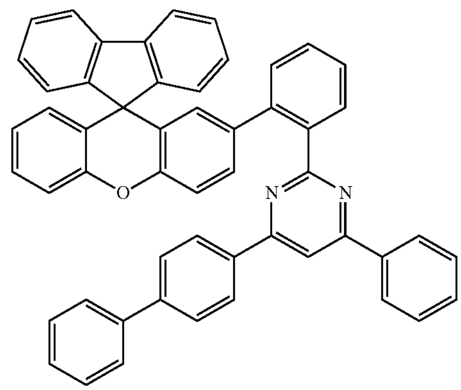
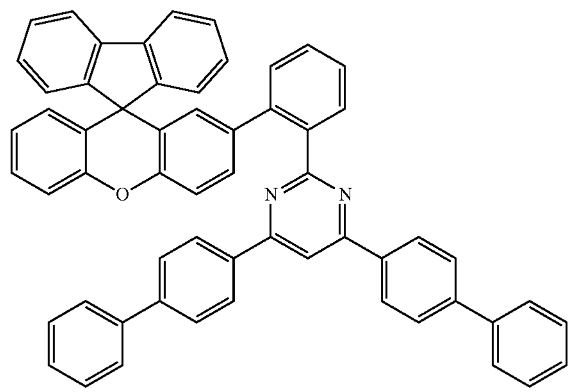
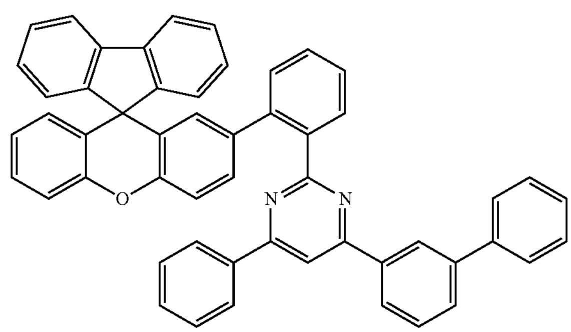
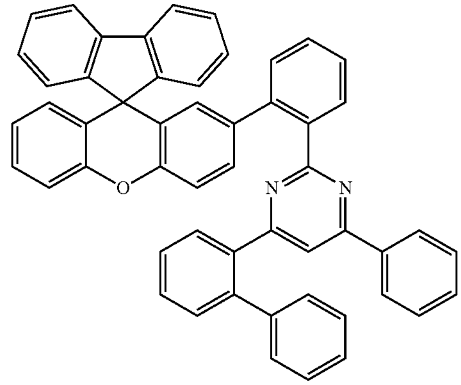

-continued
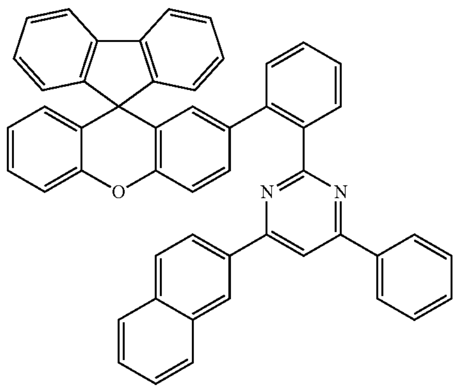
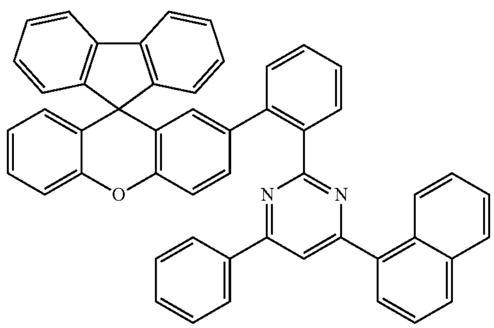
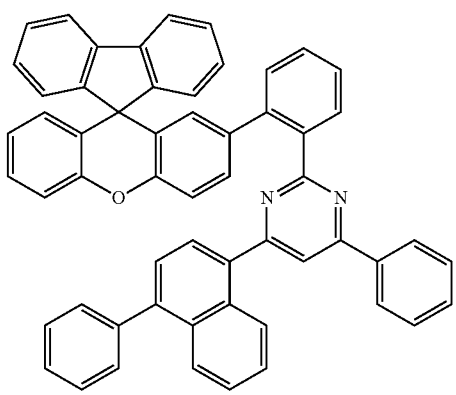
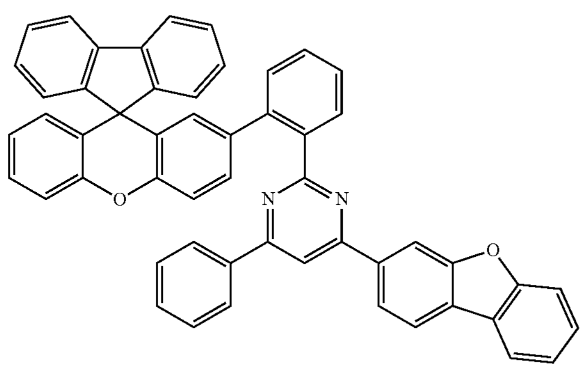
-continued
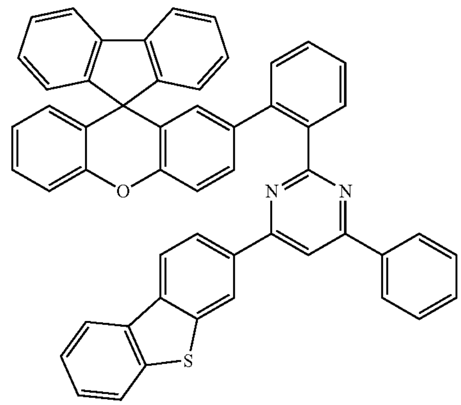
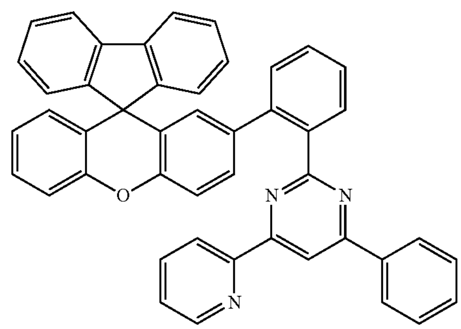
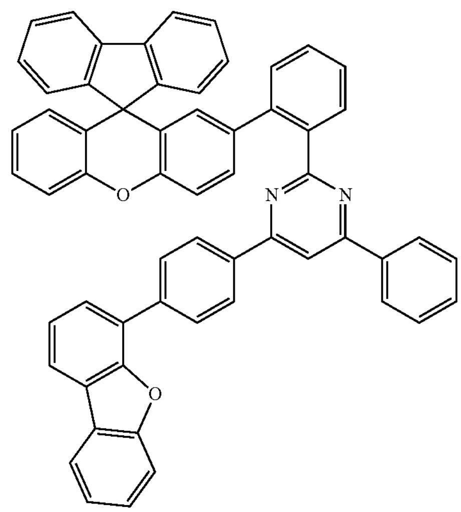
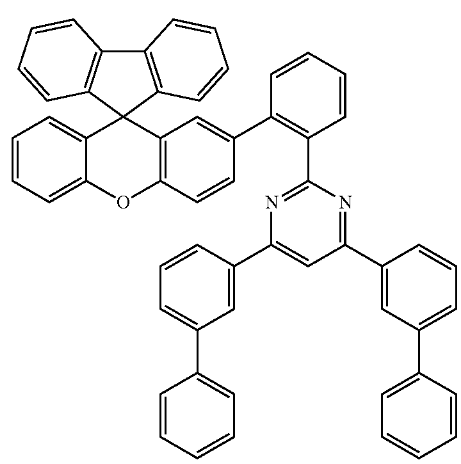

-continued
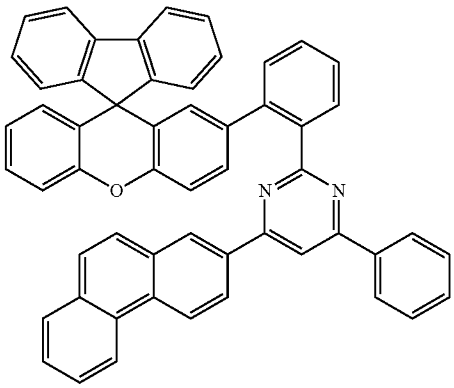
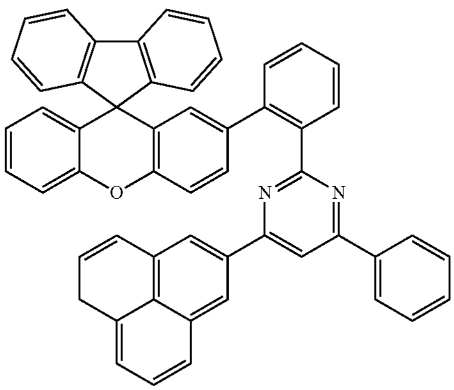
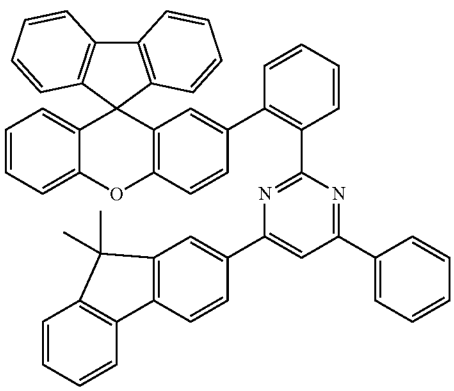
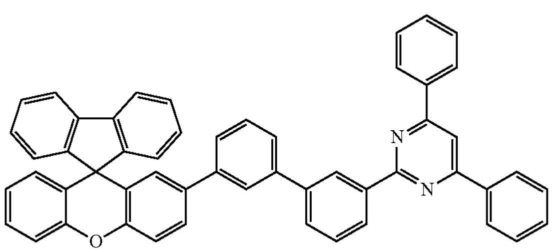
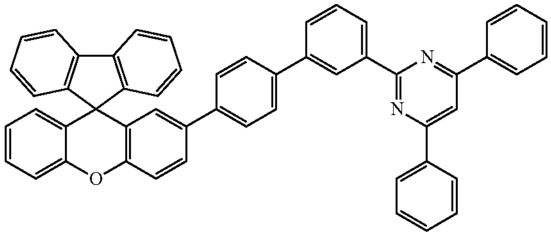
-continued
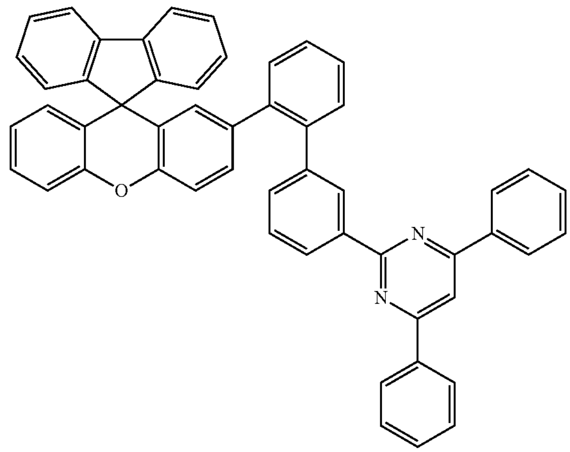
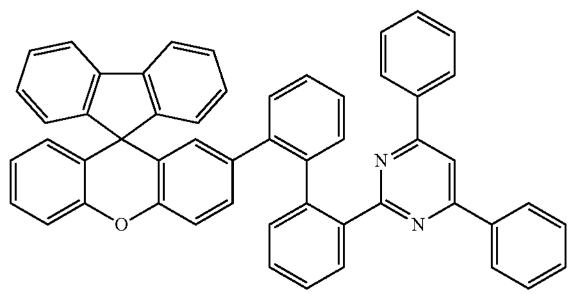
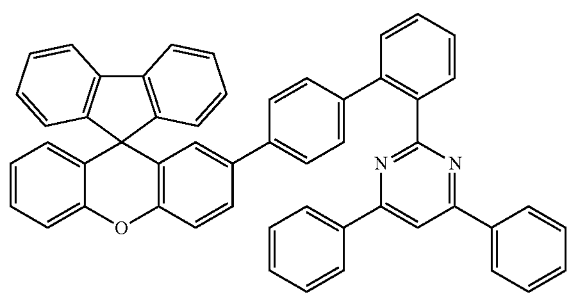
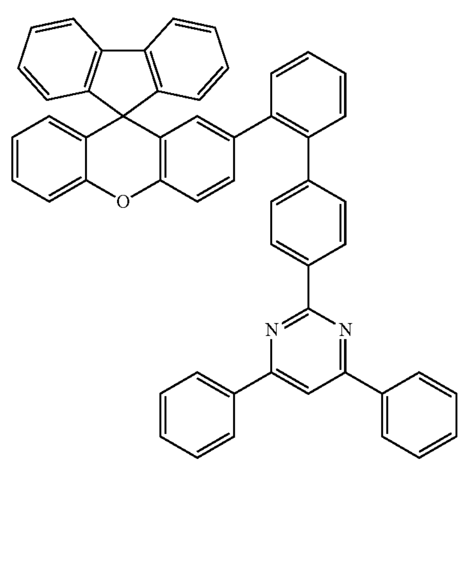

-continued
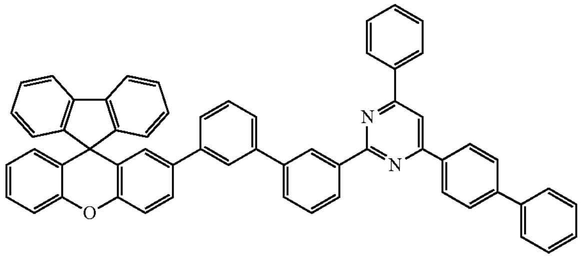
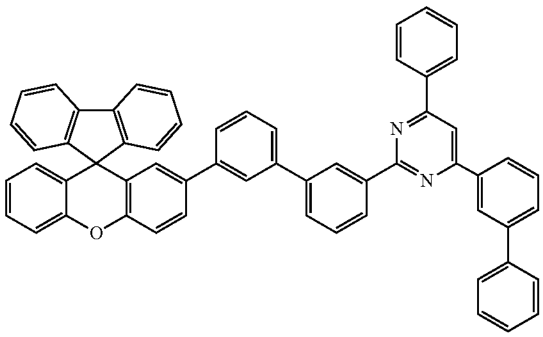
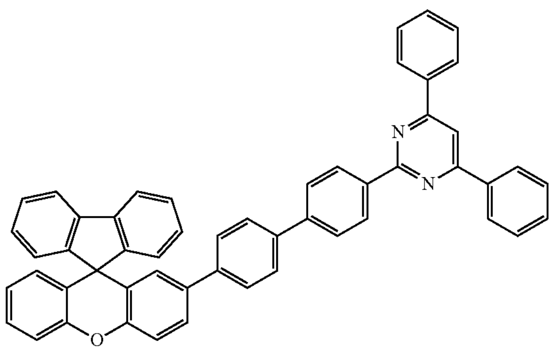
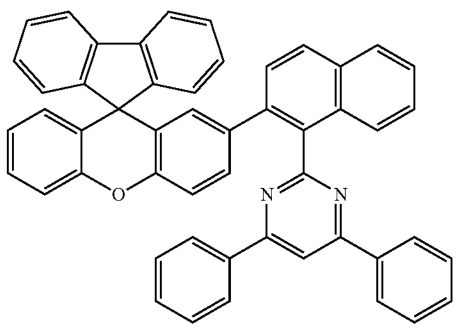
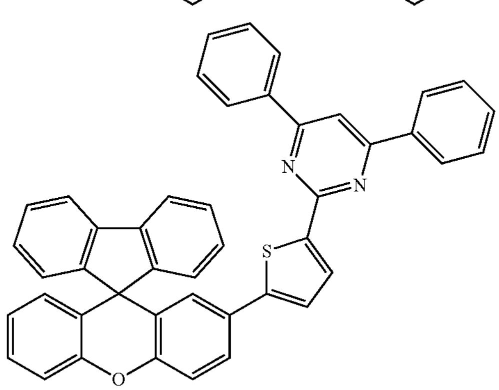
-continued
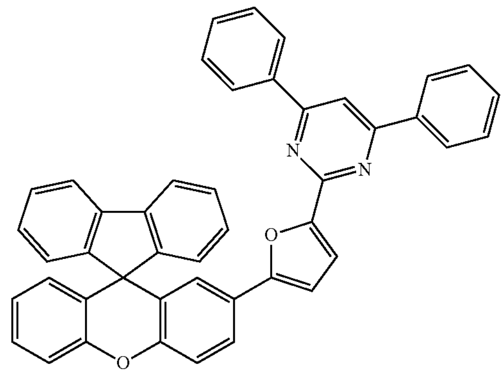
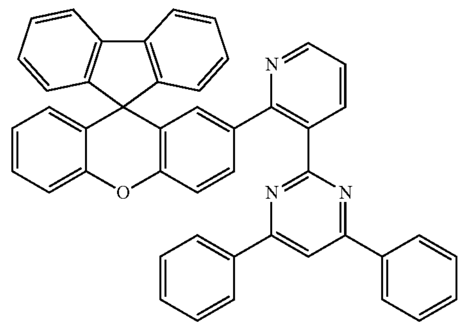
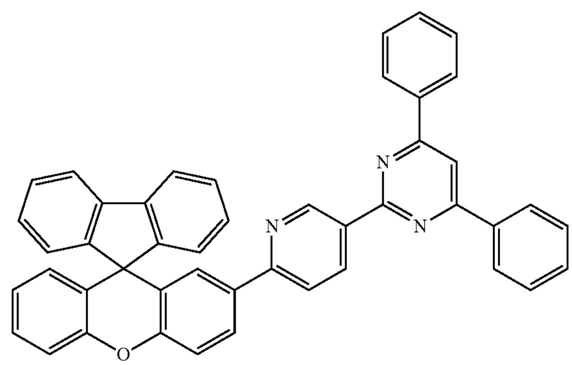
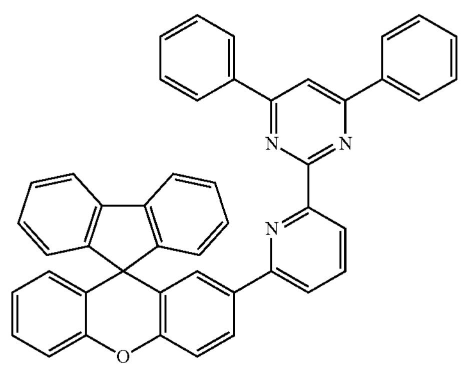
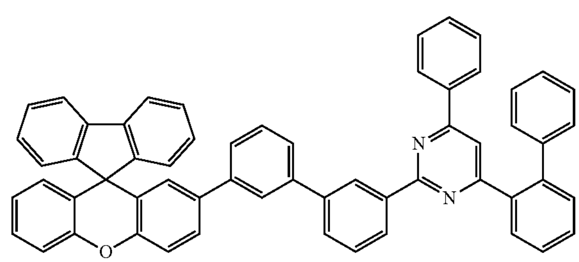

-continued
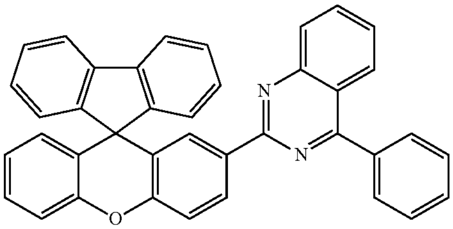
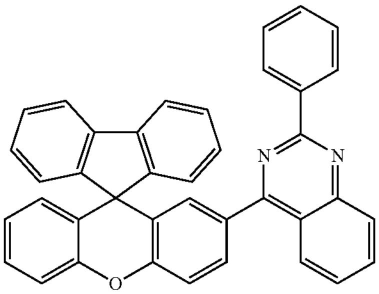
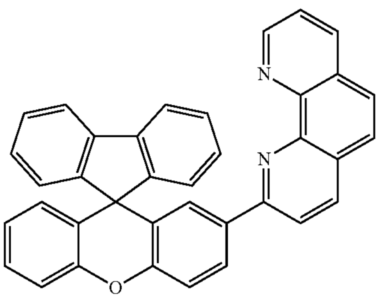
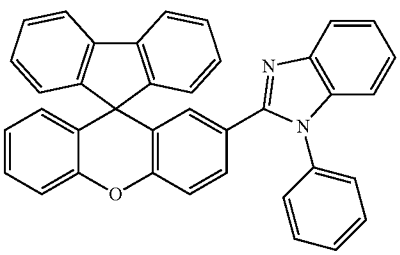
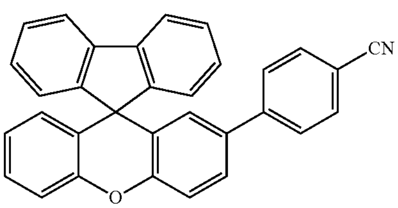
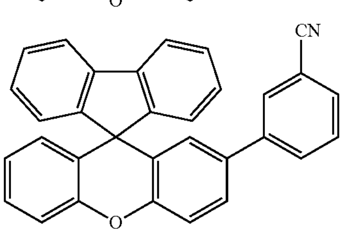
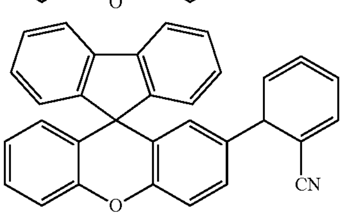
-continued
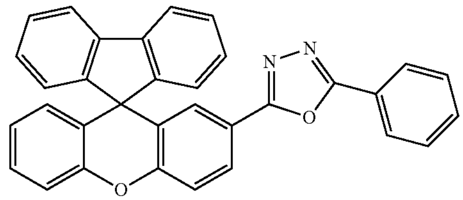
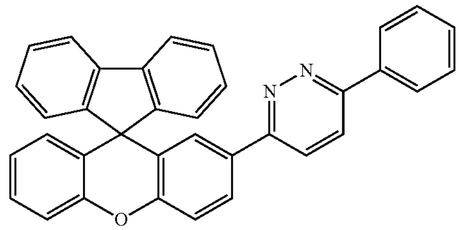
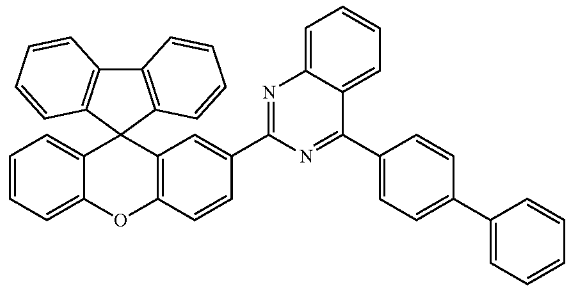
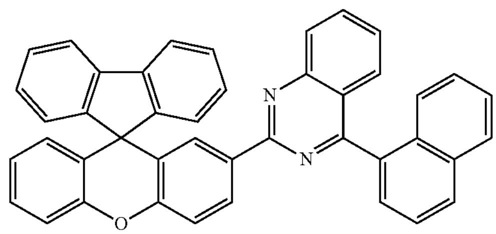
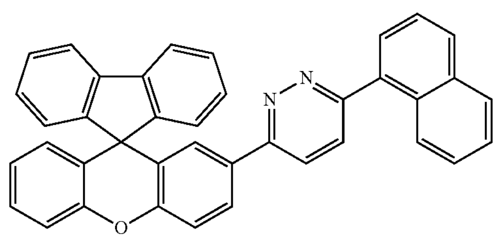
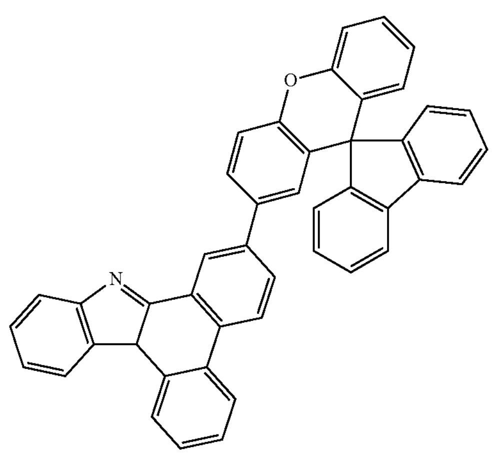

-continued
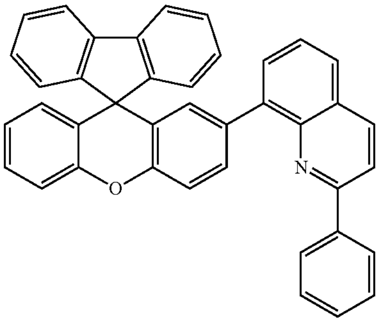
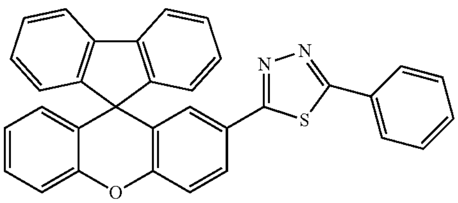
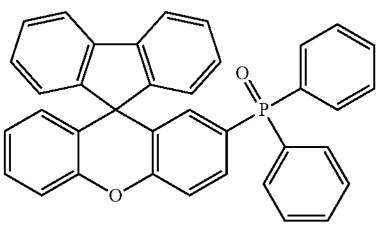
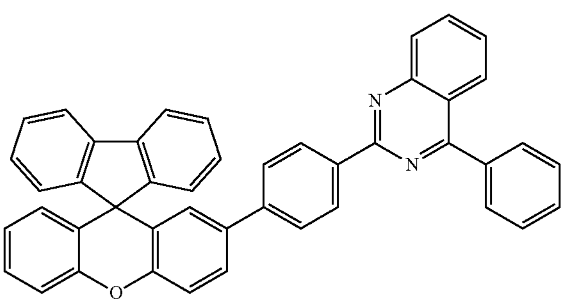
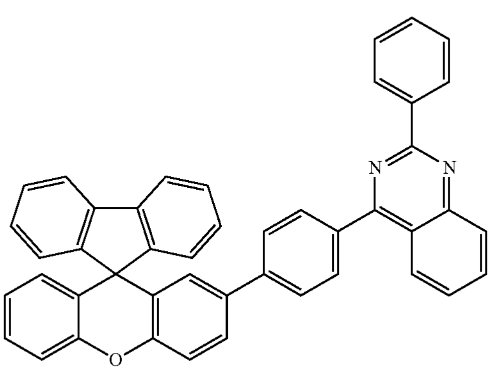
-continued
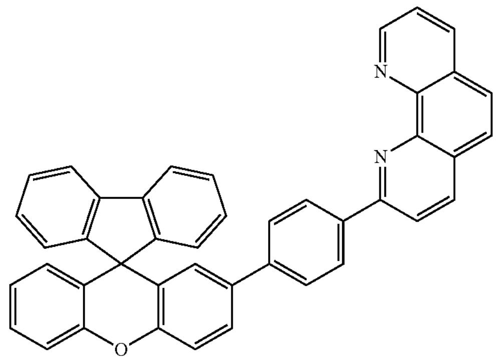
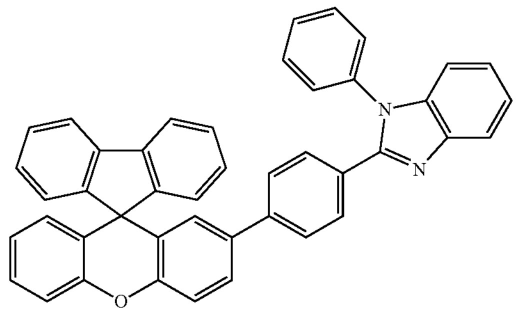
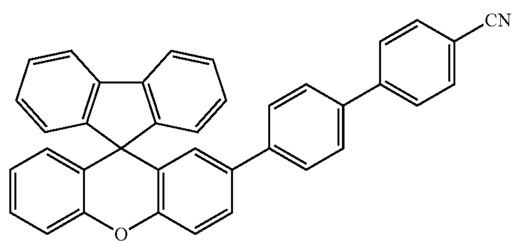
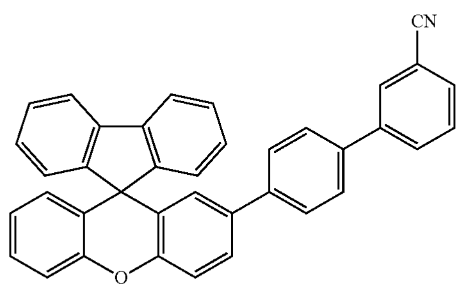
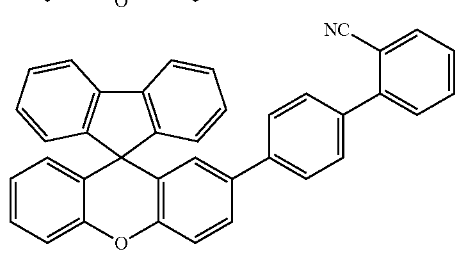
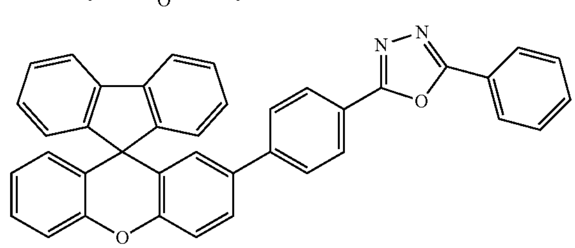

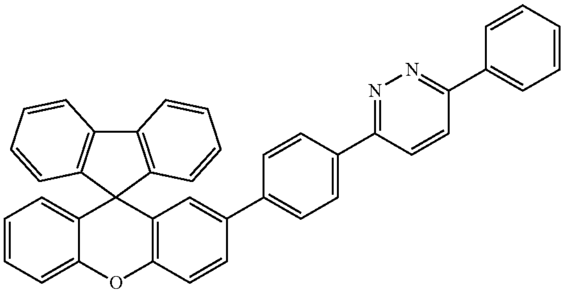
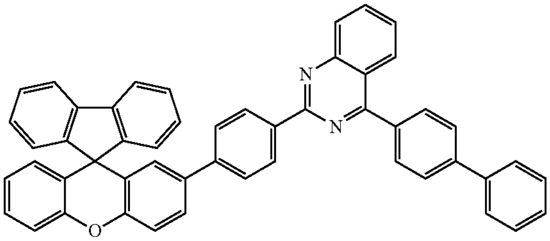
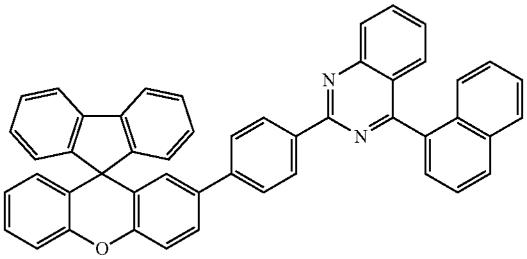
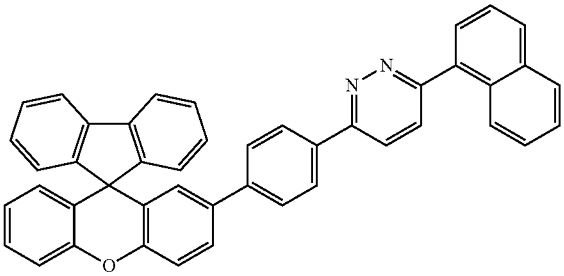
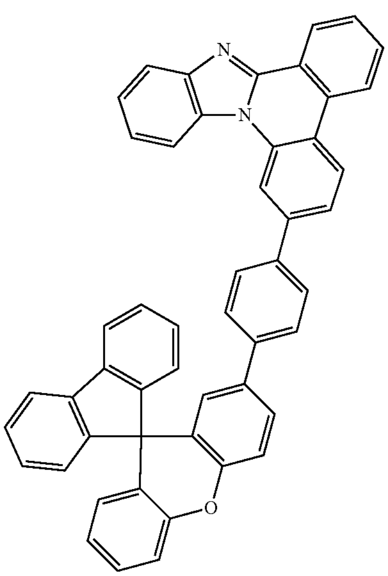
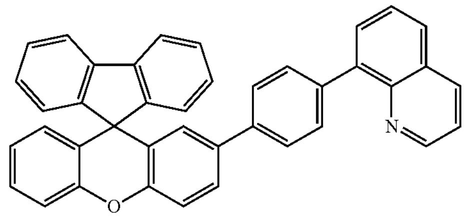
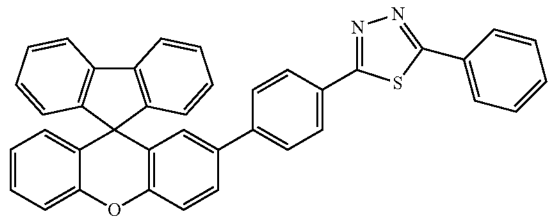
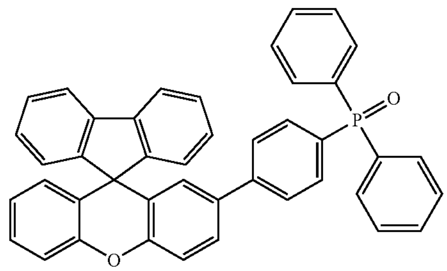
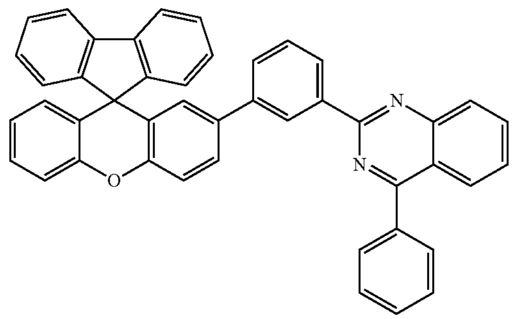
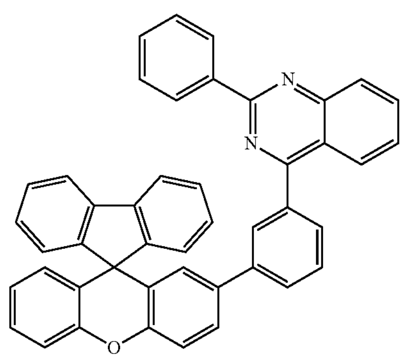
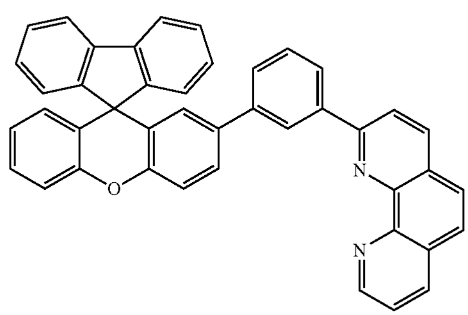

-continued
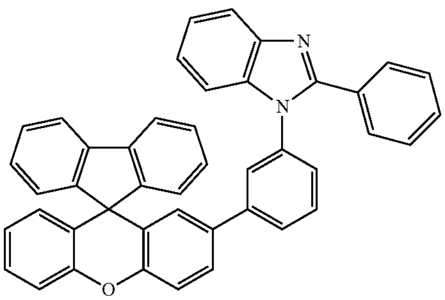
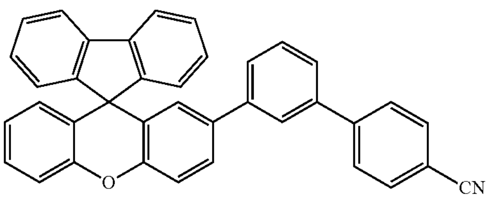
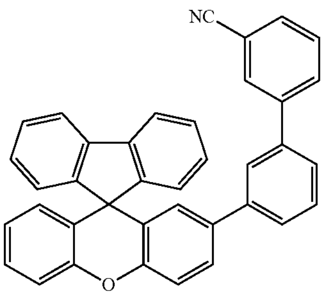
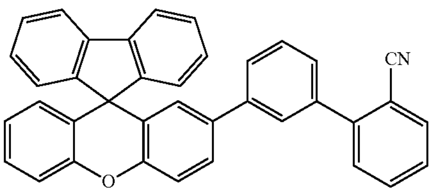
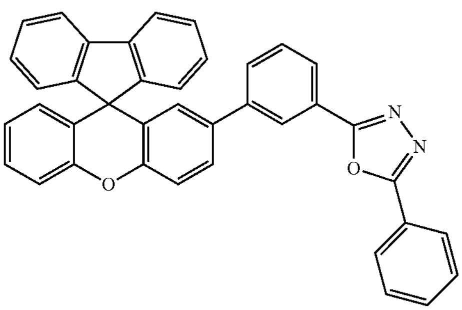
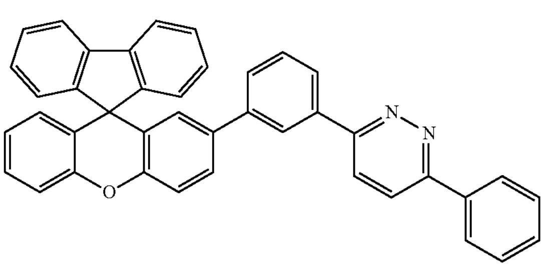
-continued
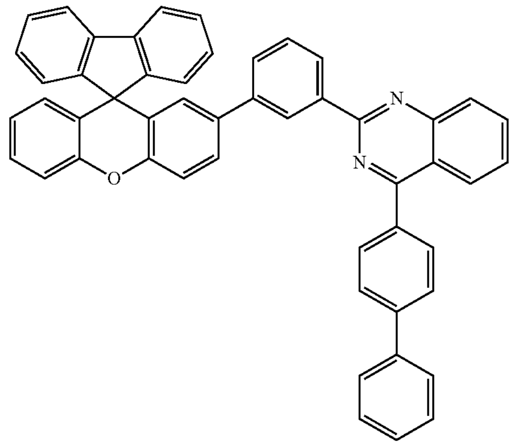
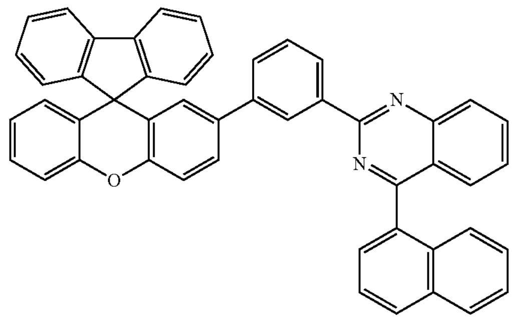
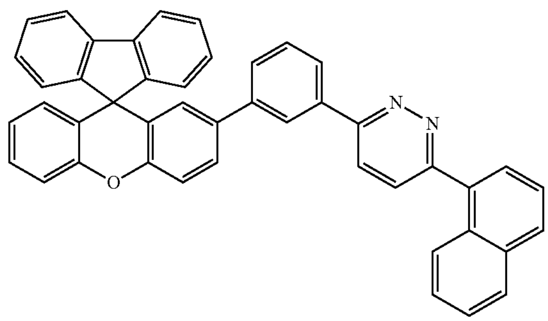
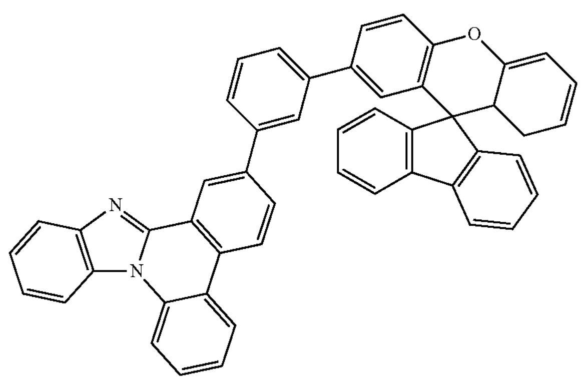
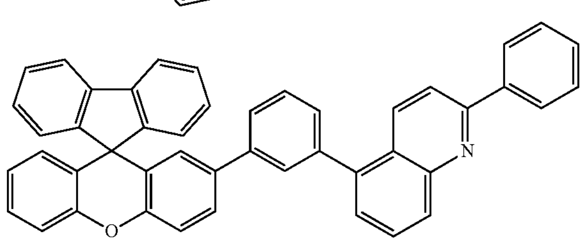

-continued
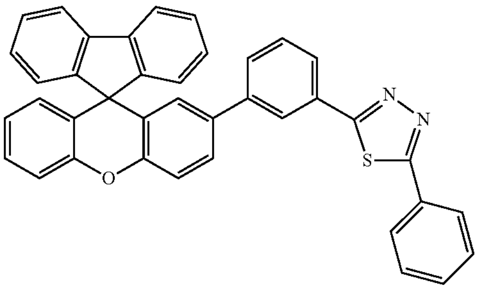
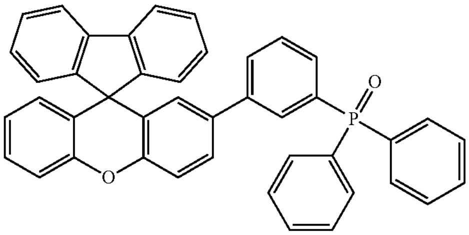
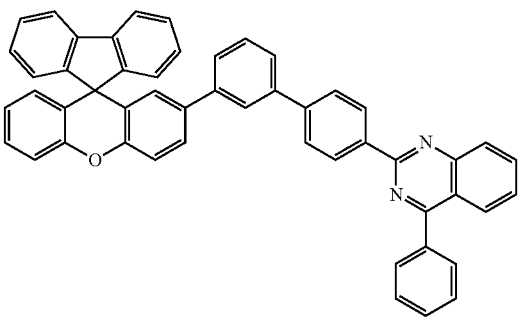
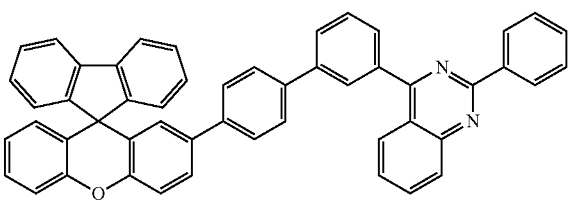
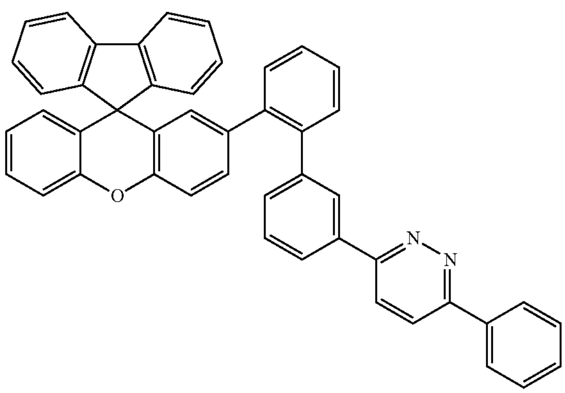
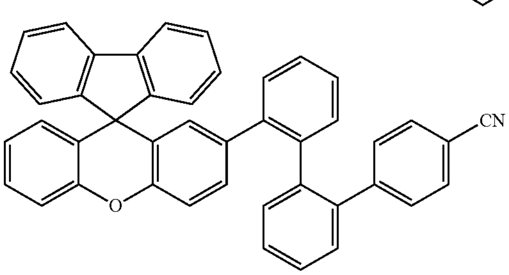
-continued
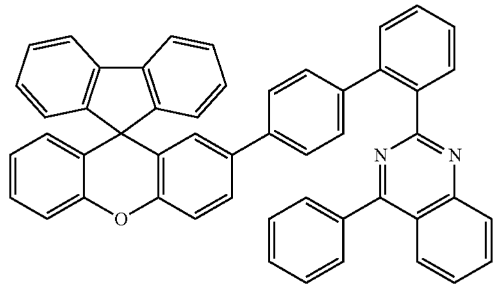
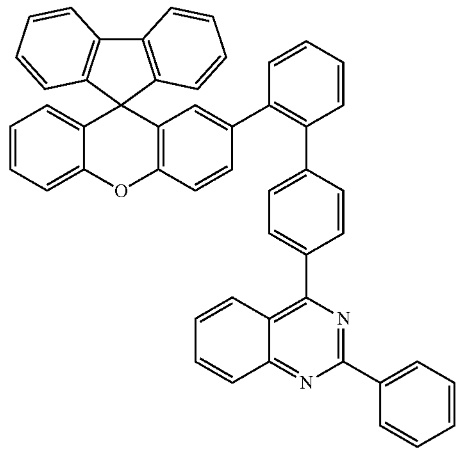
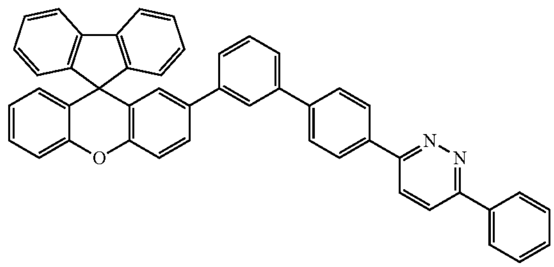
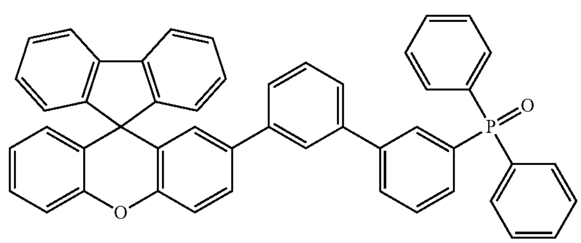
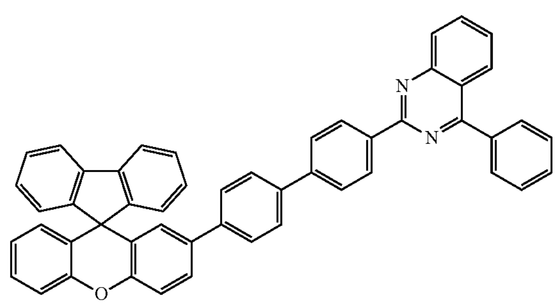

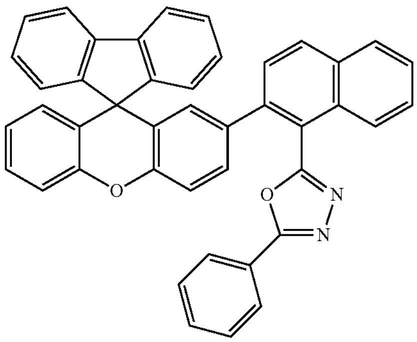
O
O
N
N
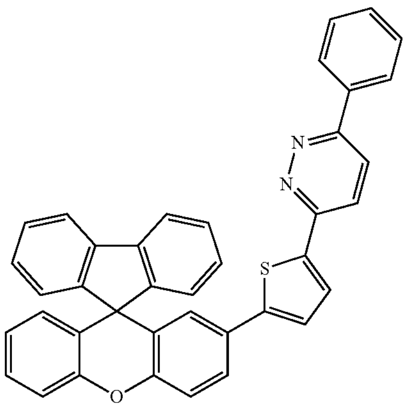
N
N
S
O
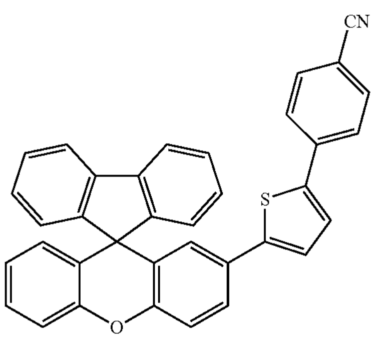
CN
S
O
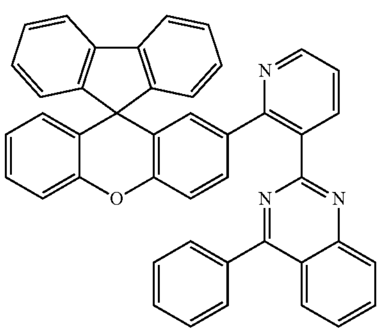
N
N
N
O
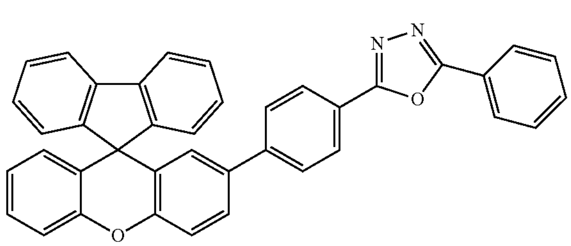
N
N
O
O
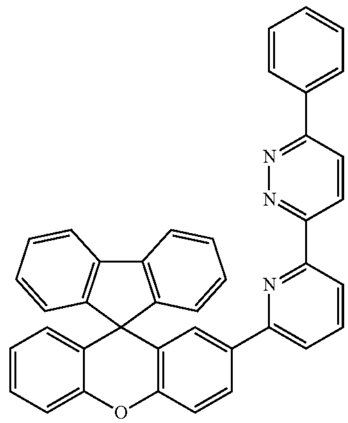
N
N
N
O
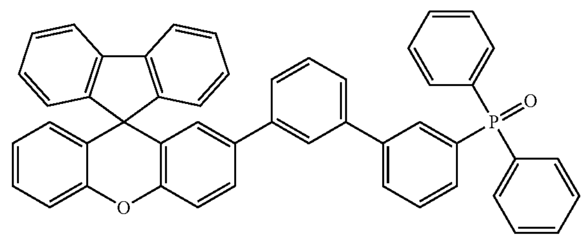
P
O
O
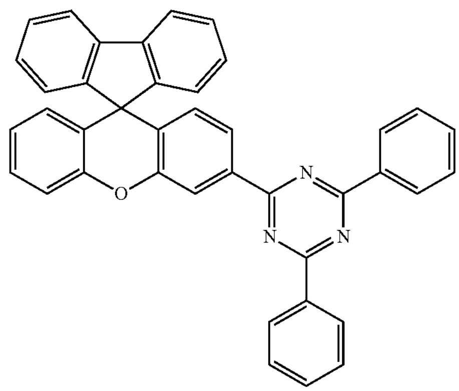
N
N
N
O
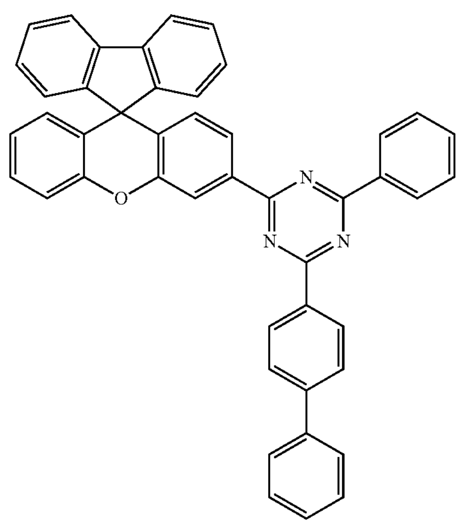
N
N
N
O

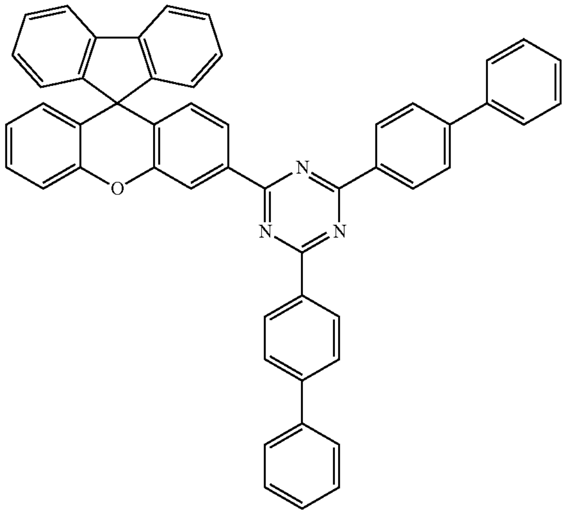
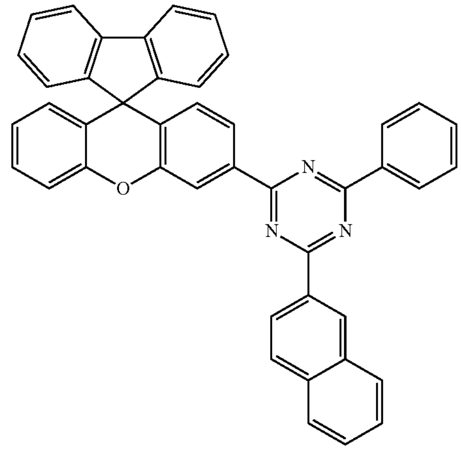
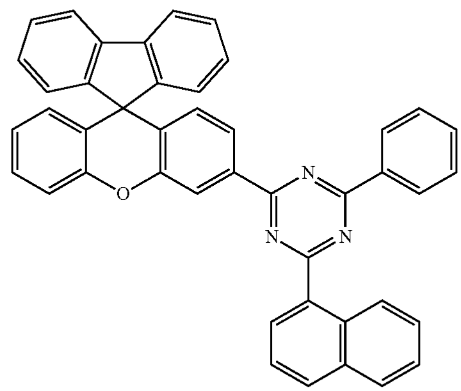
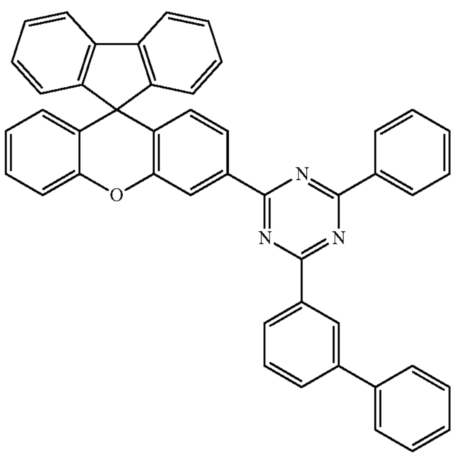
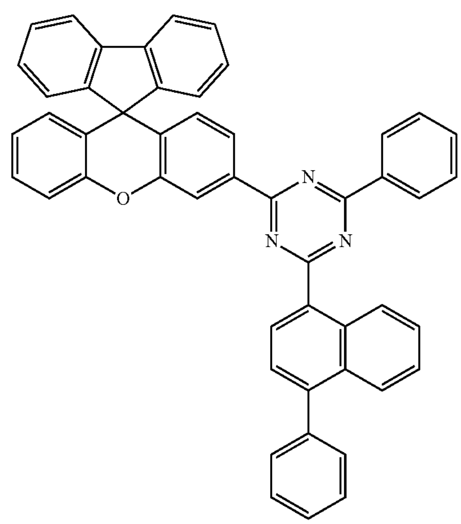
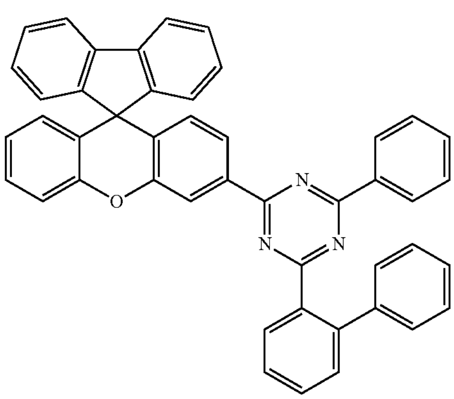

-continued
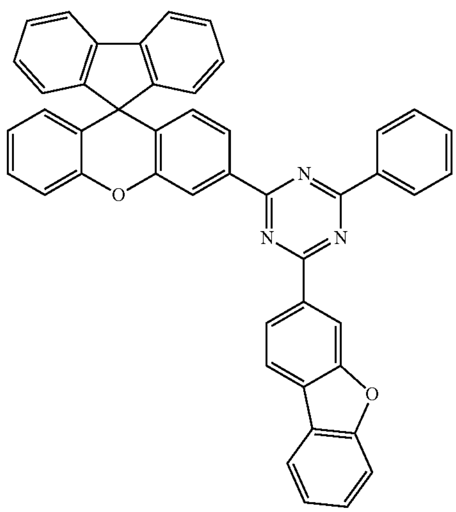
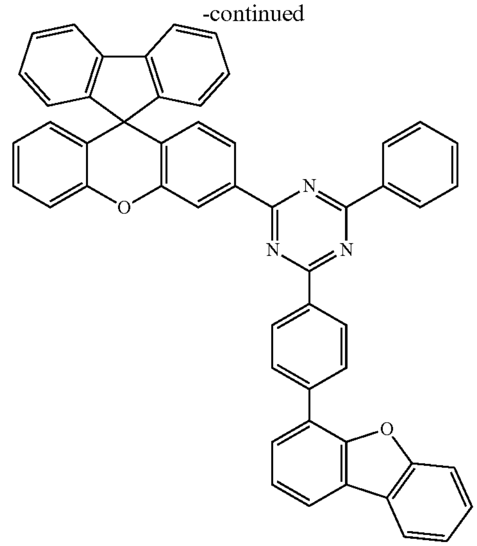
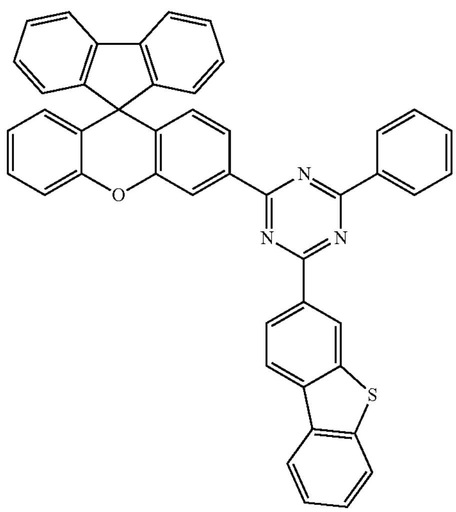
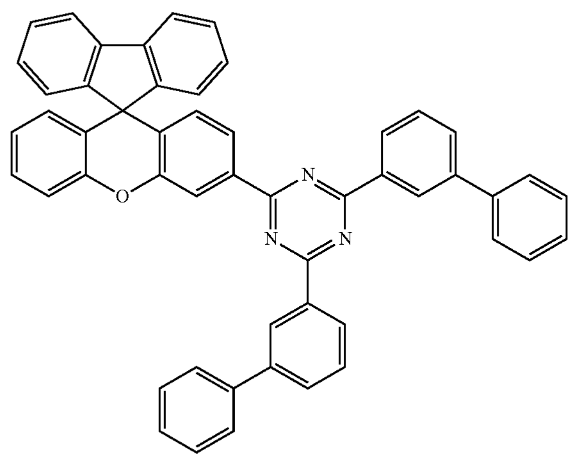
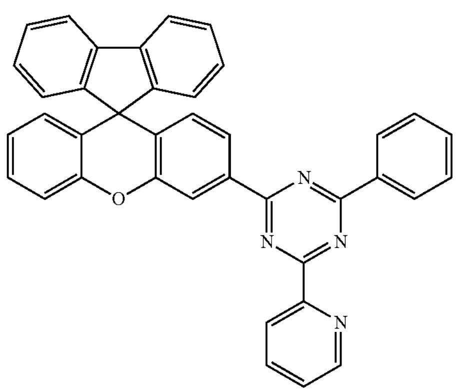
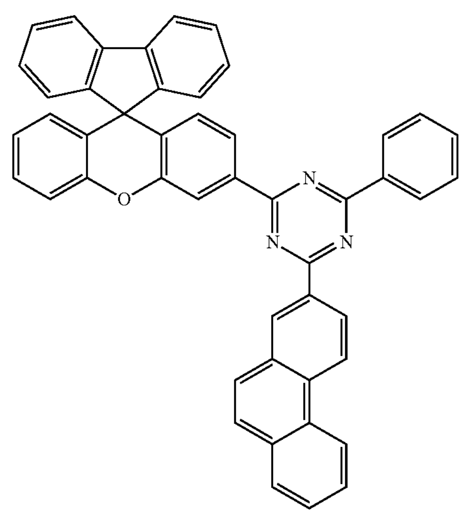

-continued
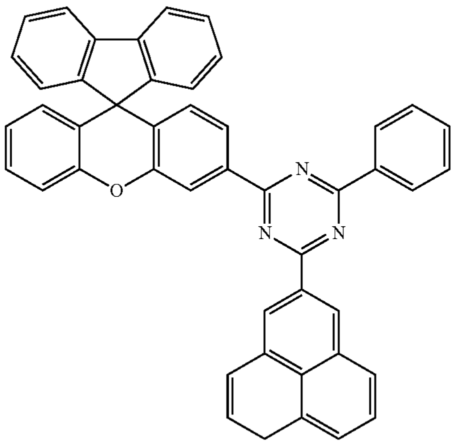
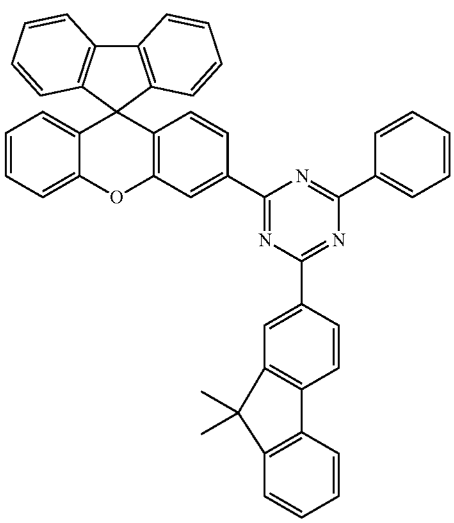
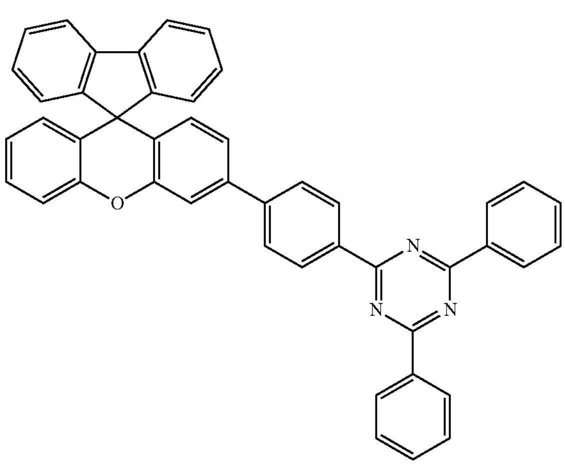
-continued
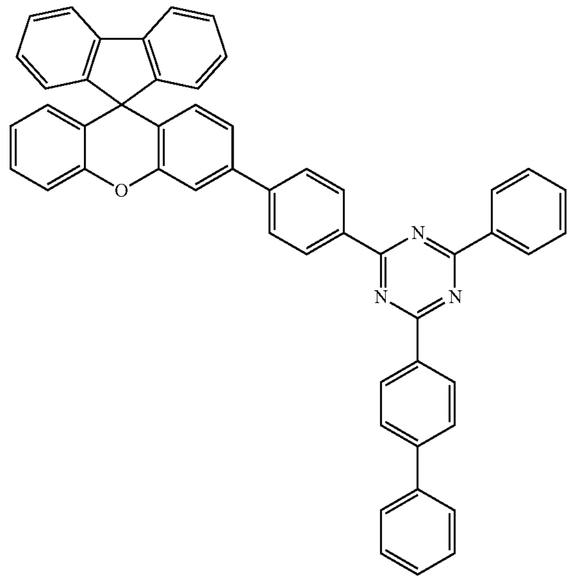
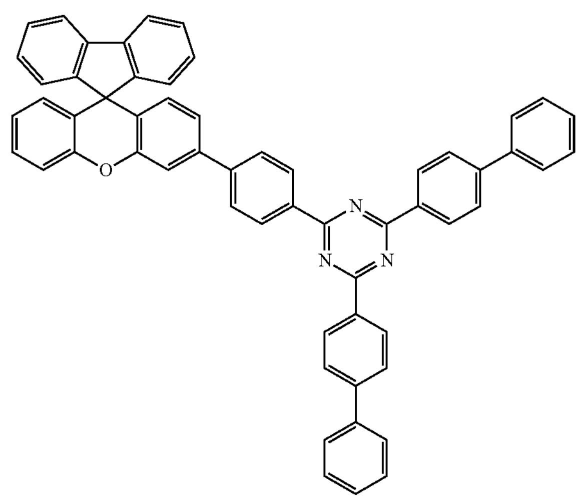
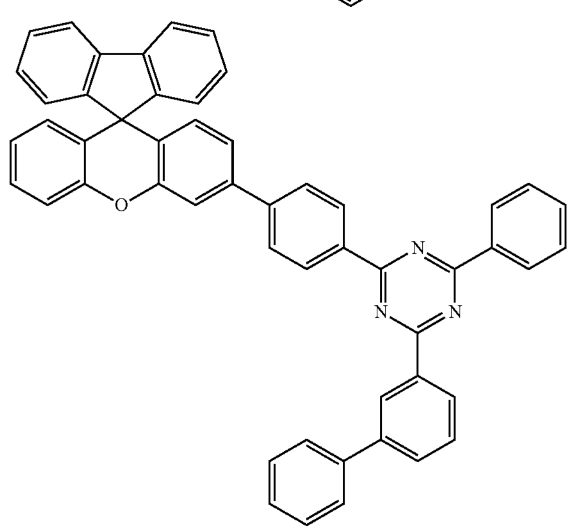

-continued
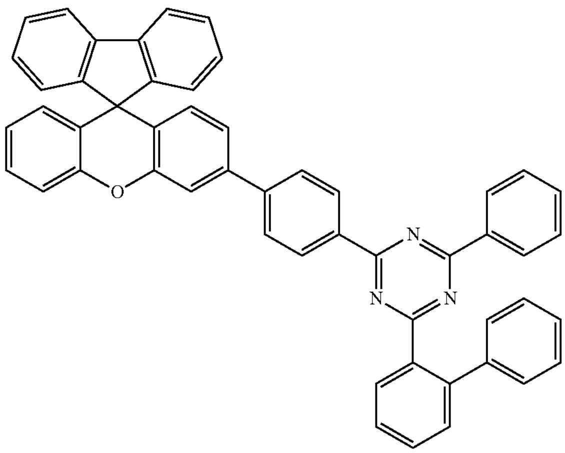
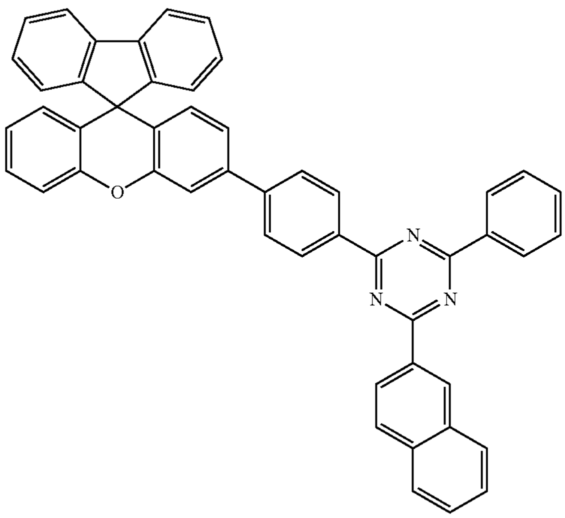
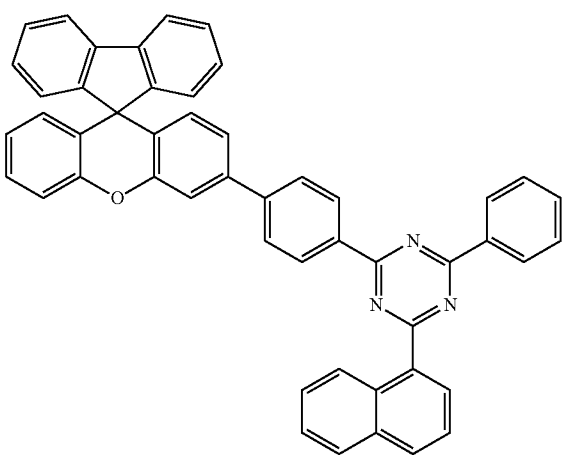
-continued
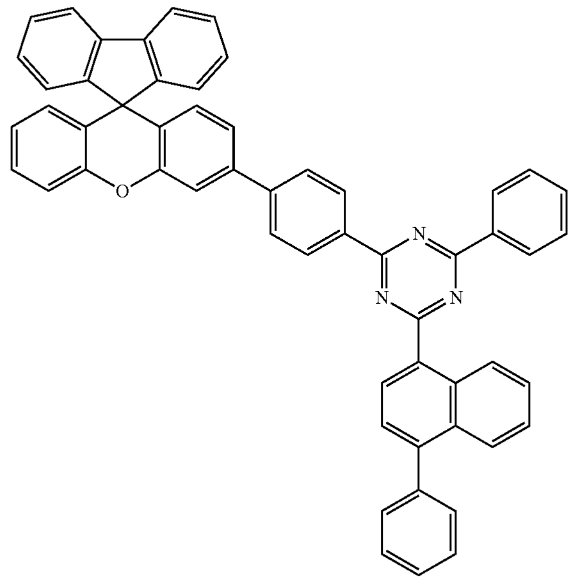
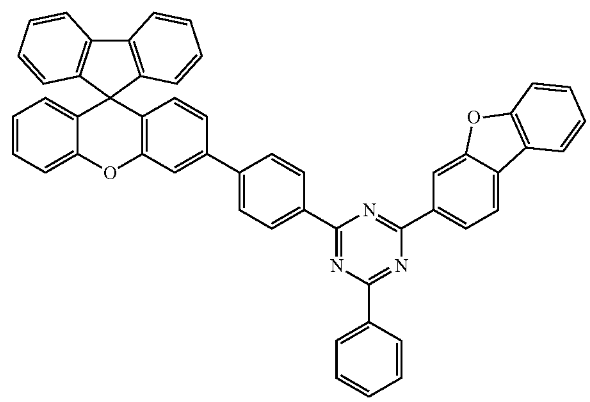
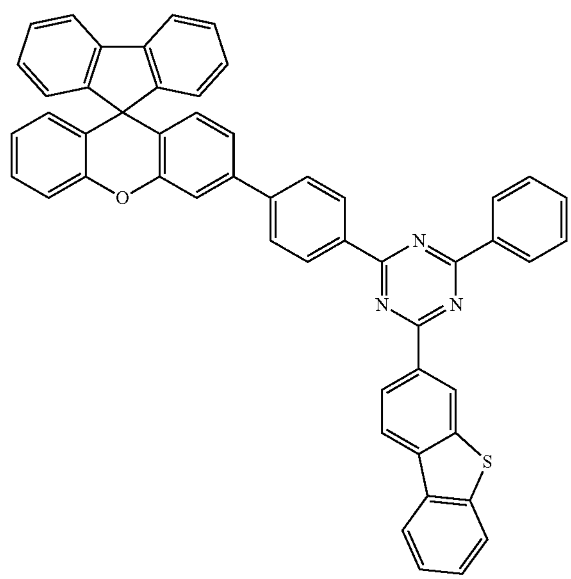

-continued
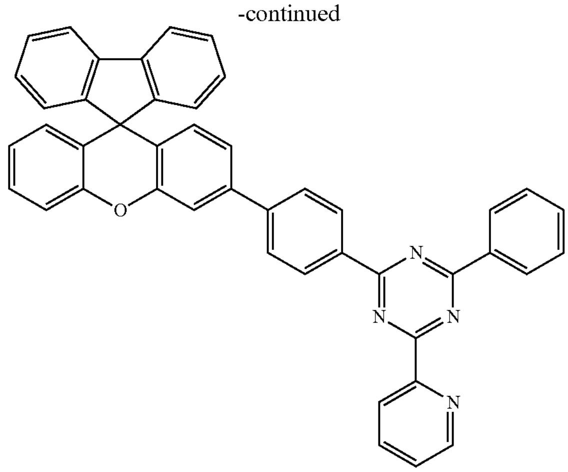
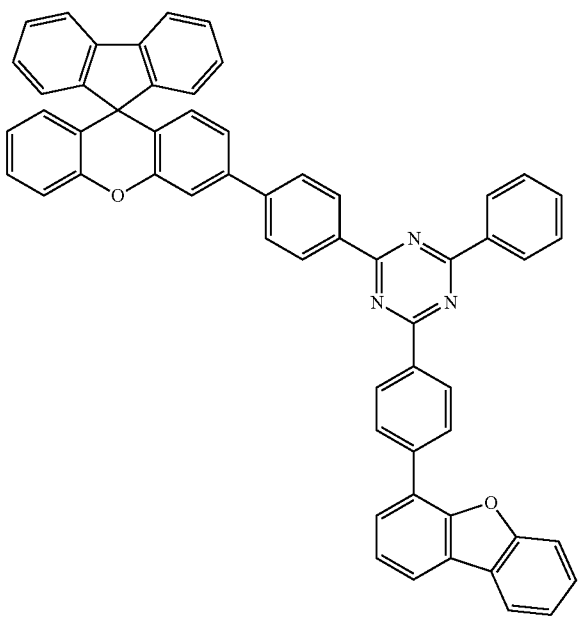
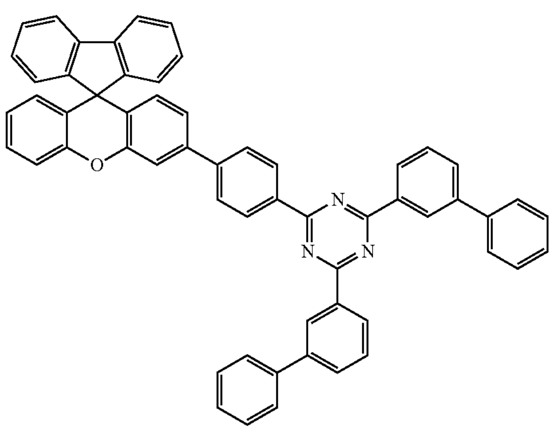
-continued
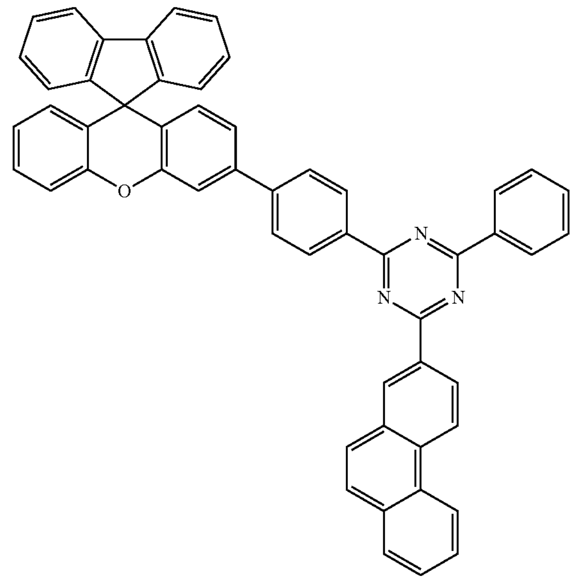
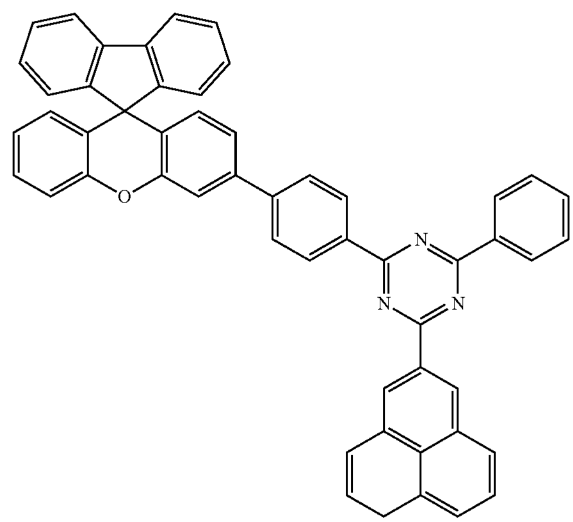
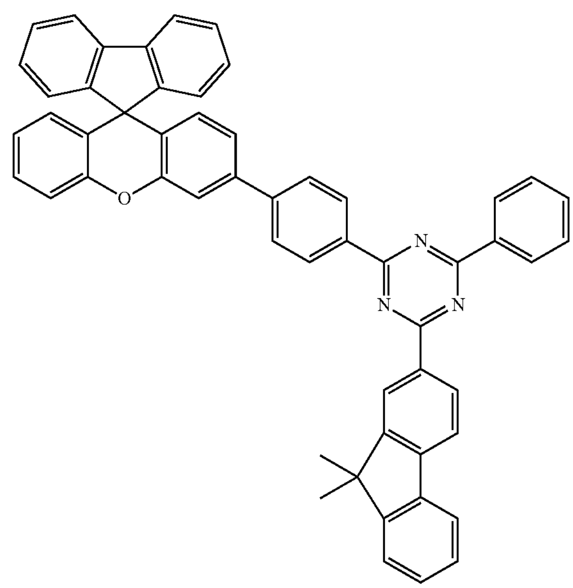

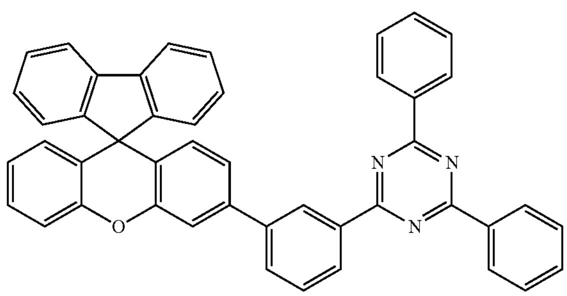
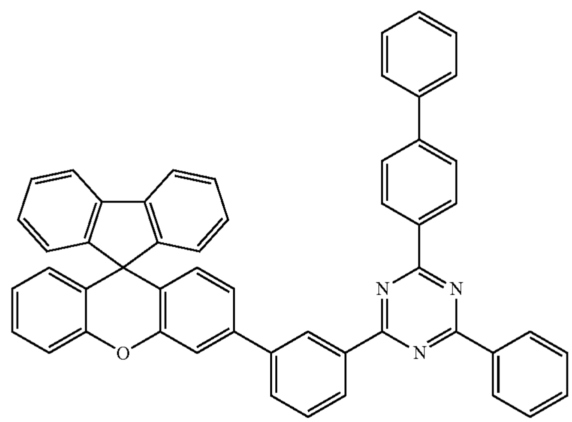
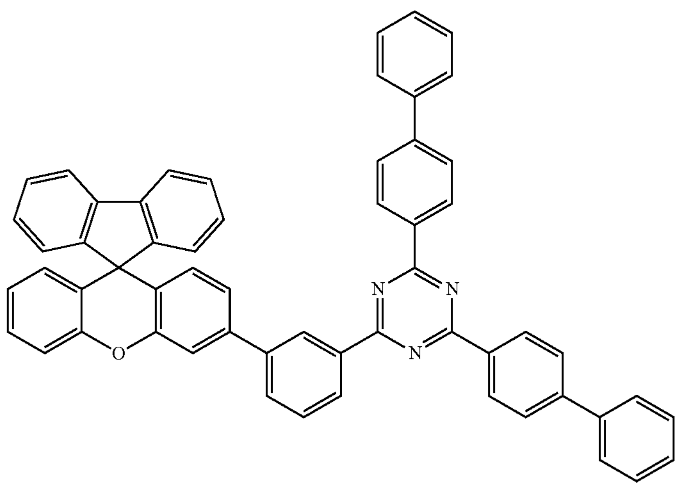
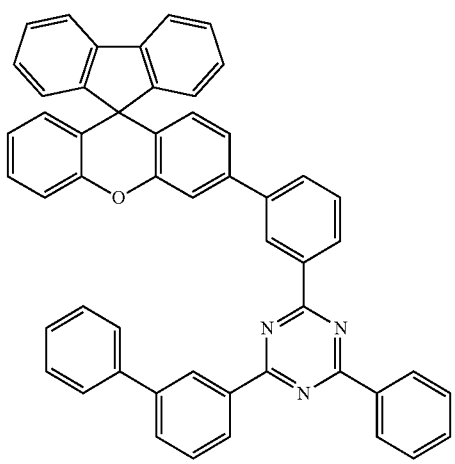
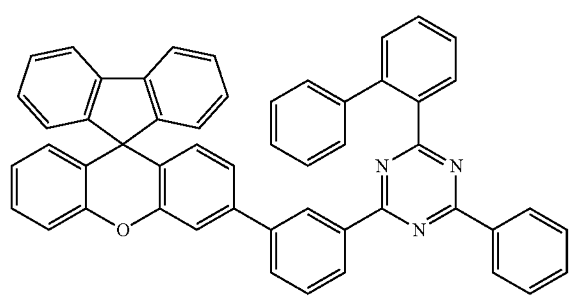
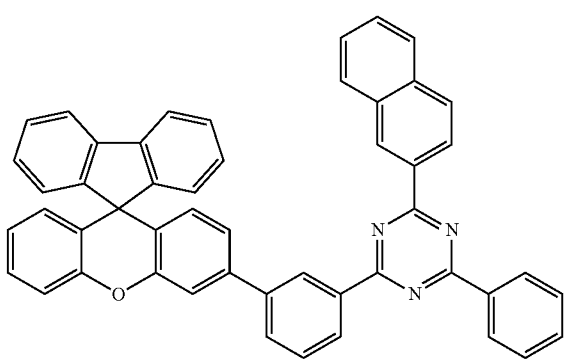
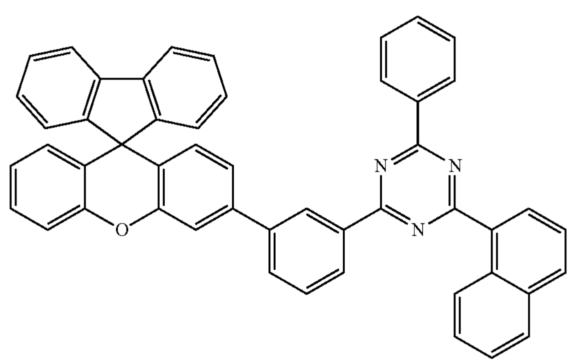

-continued
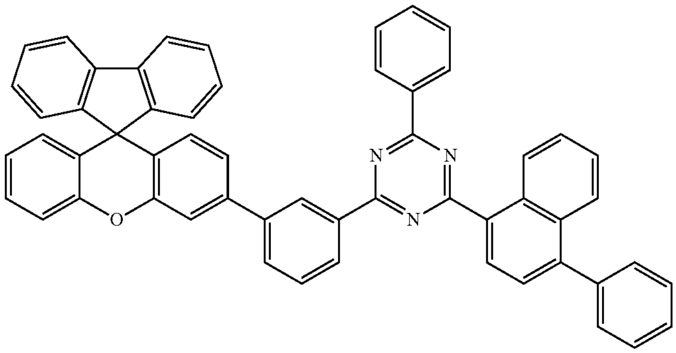
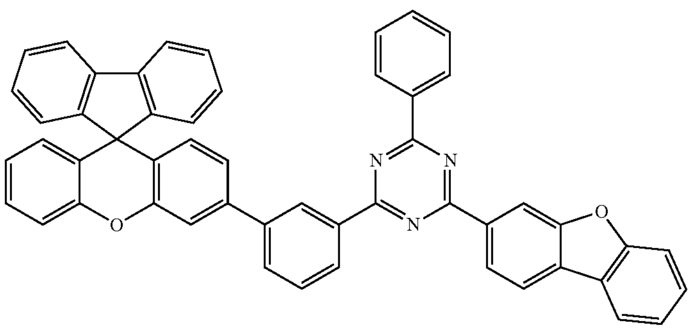
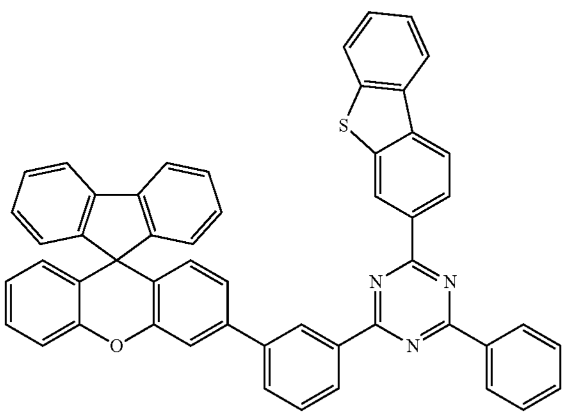
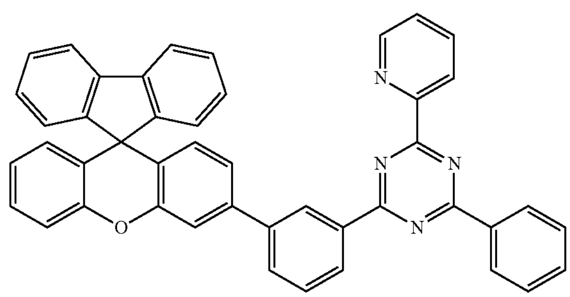
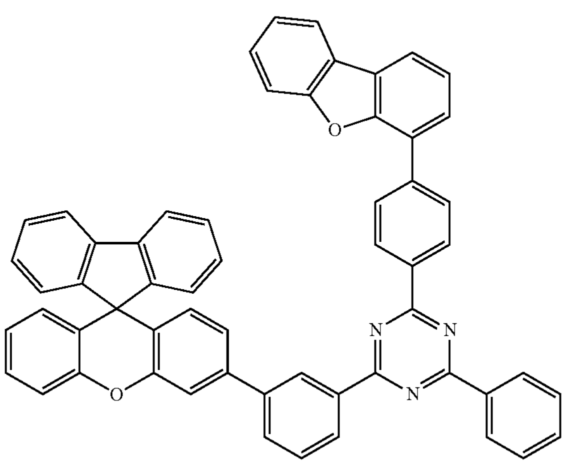

-continued
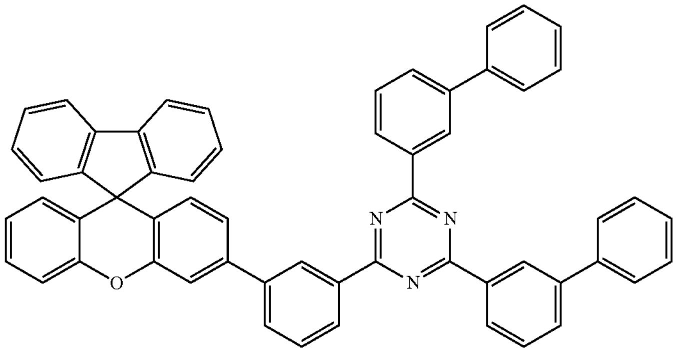
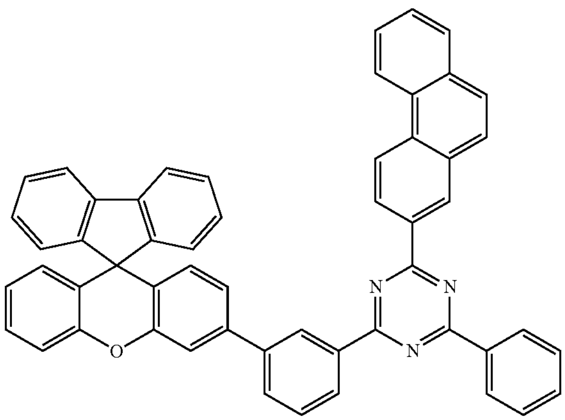
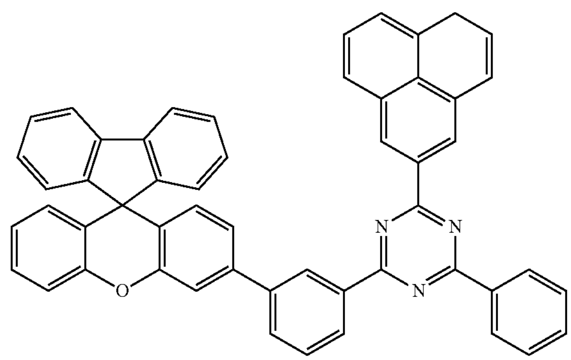
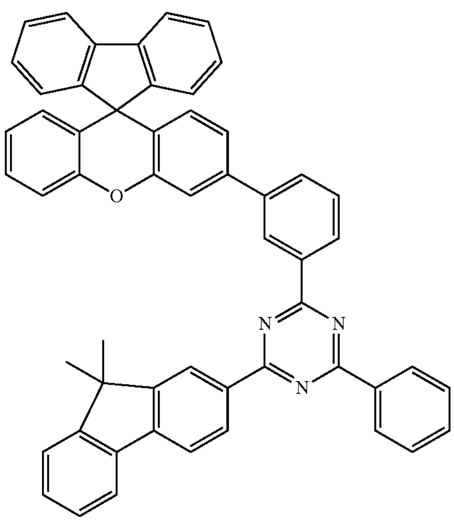
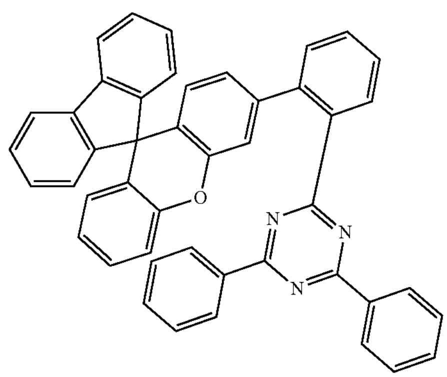
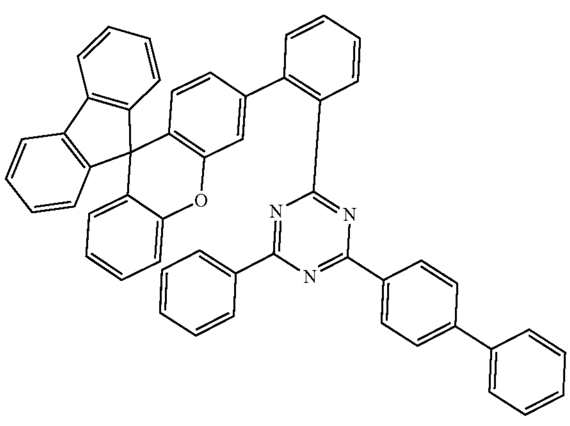

-continued
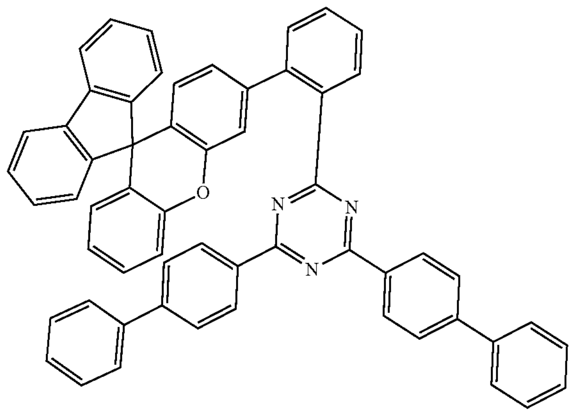
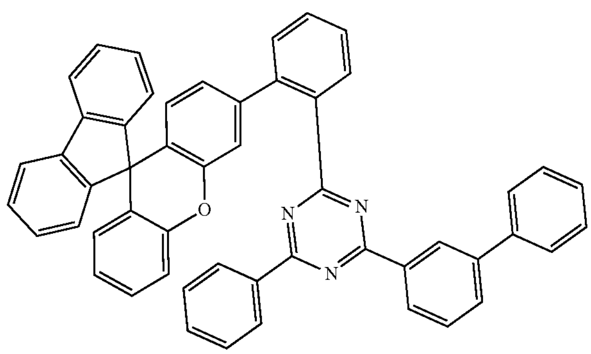
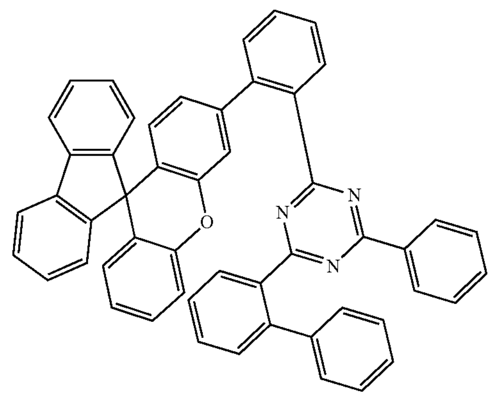
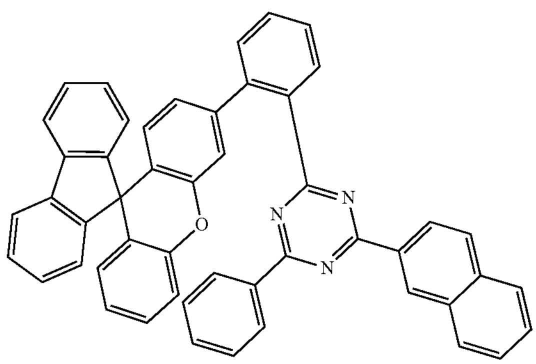
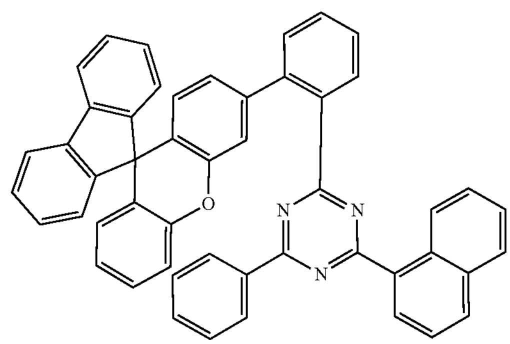
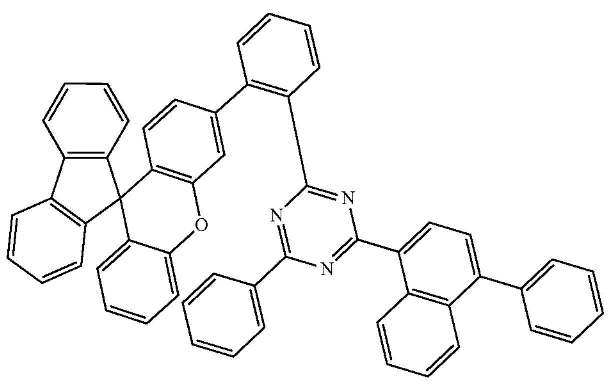

-continued
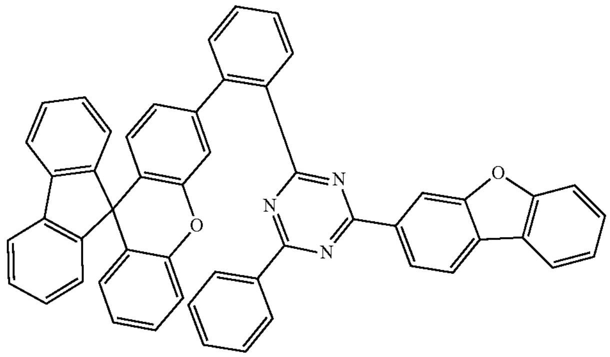
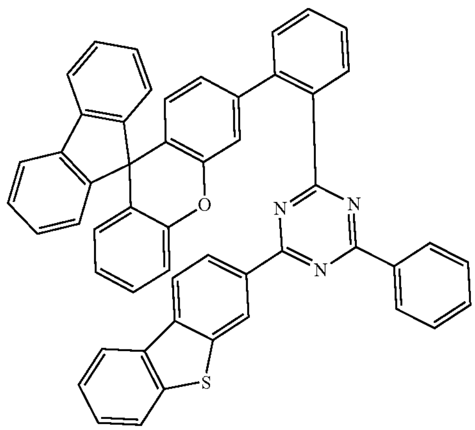
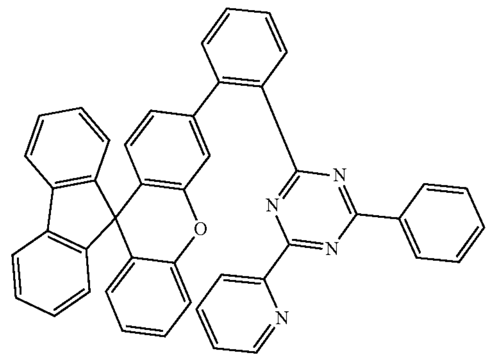
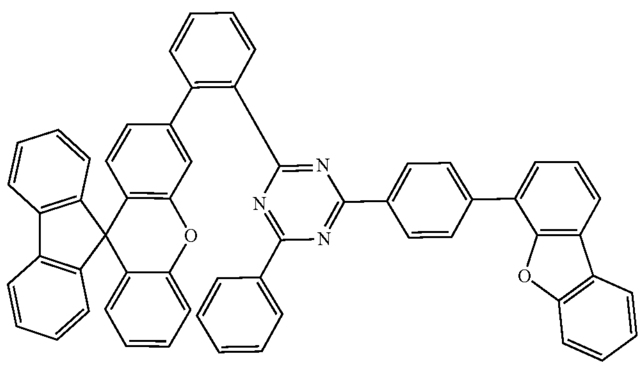
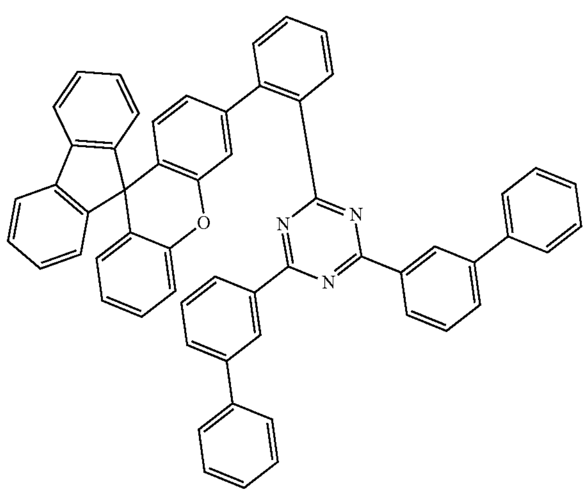

-continued
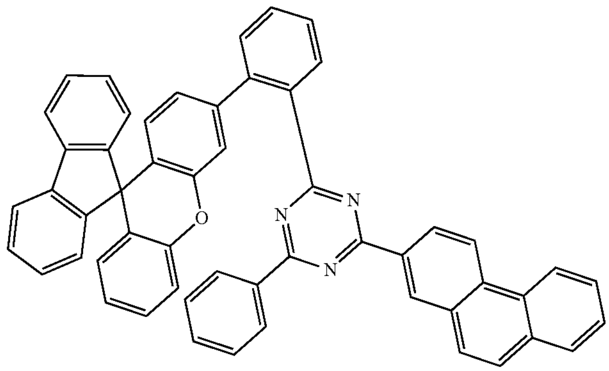
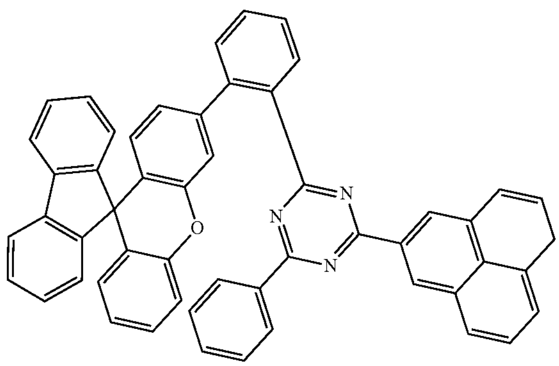
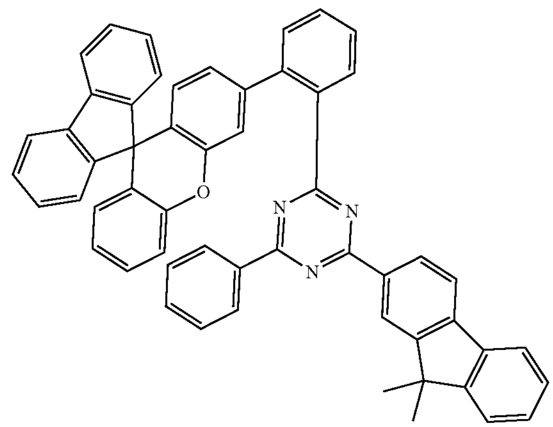
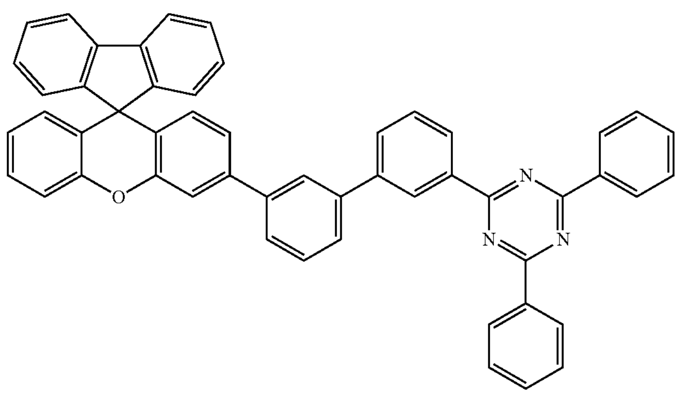
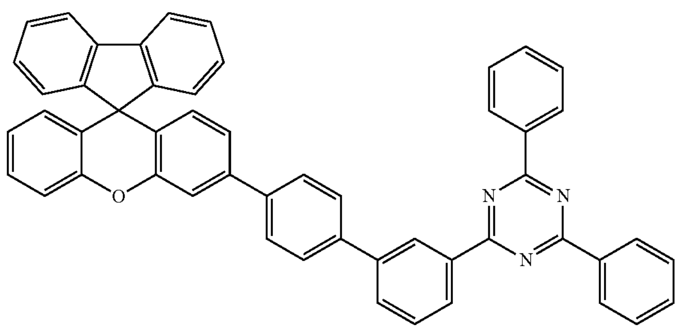

-continued
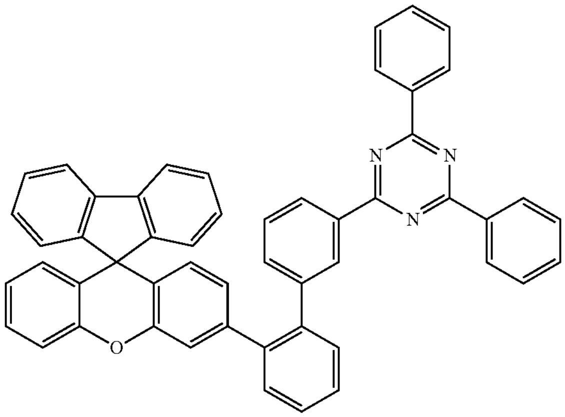
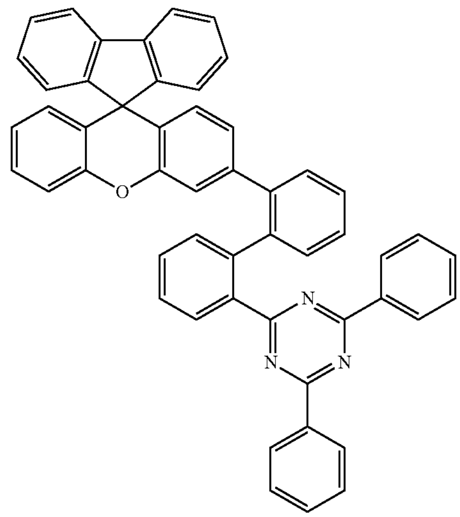
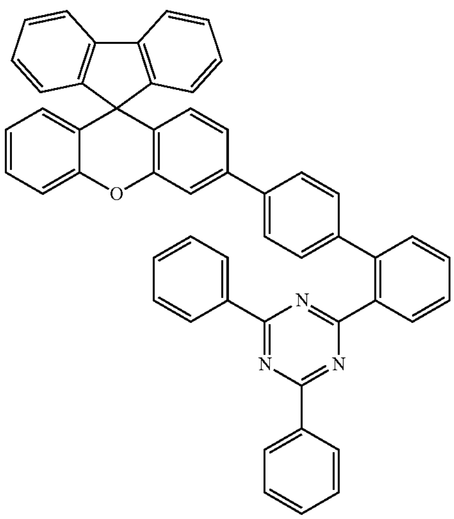
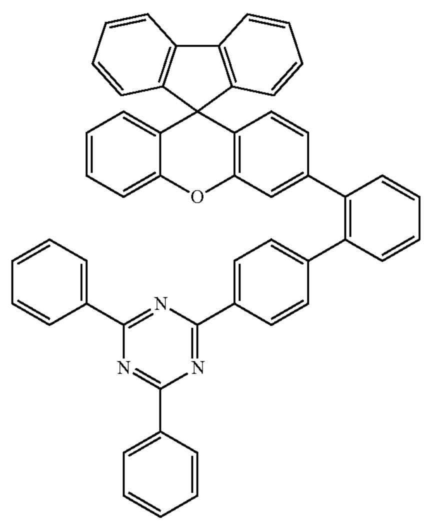
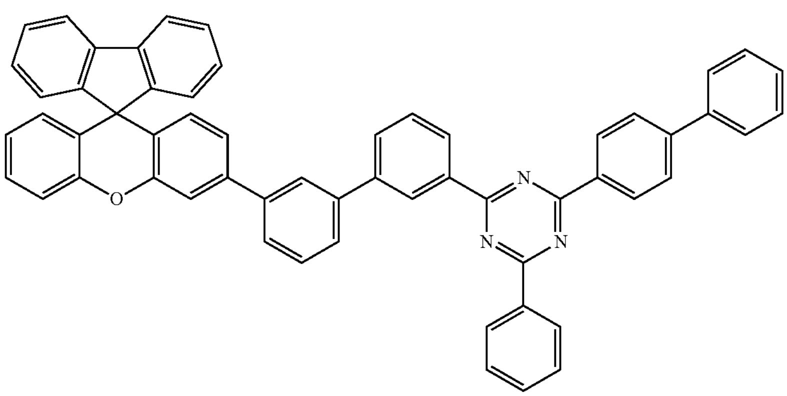

-continued
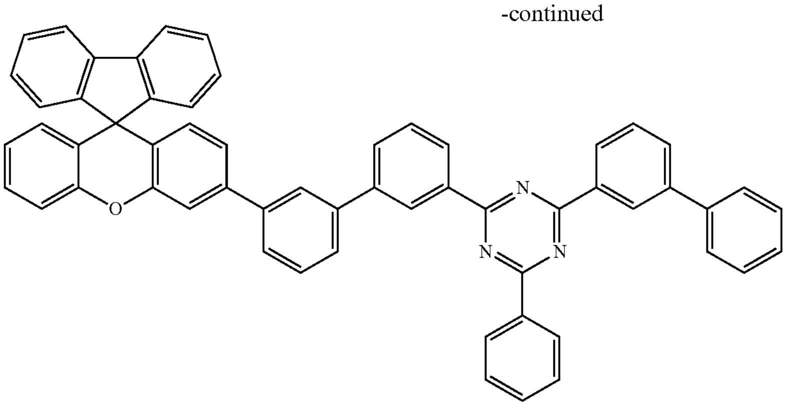
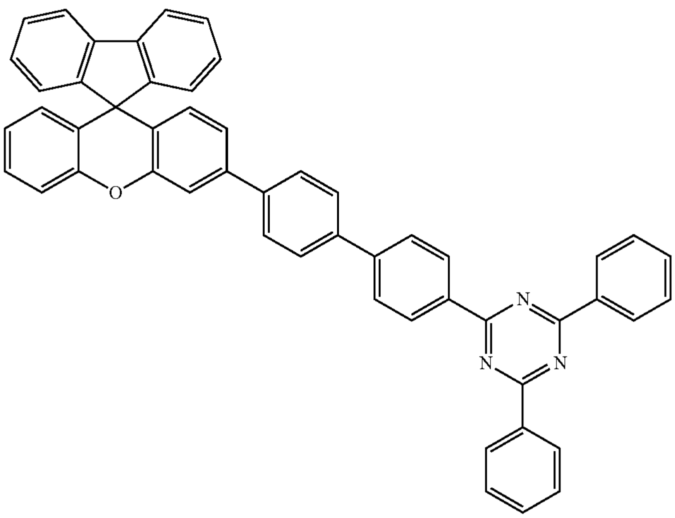
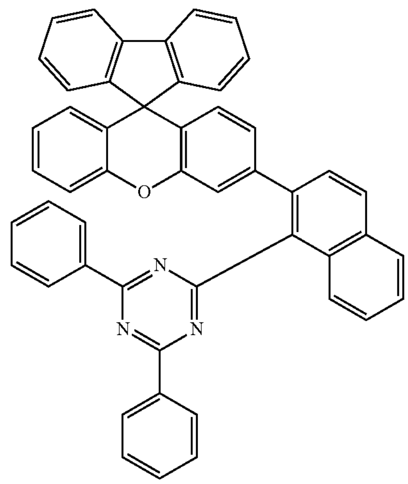
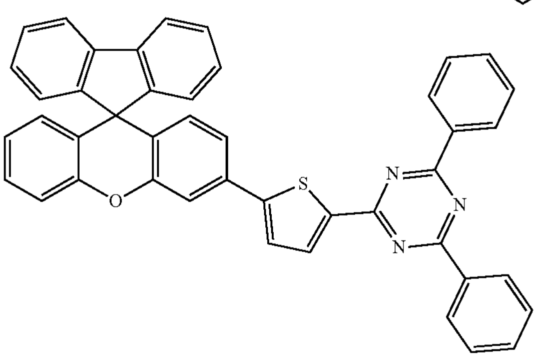
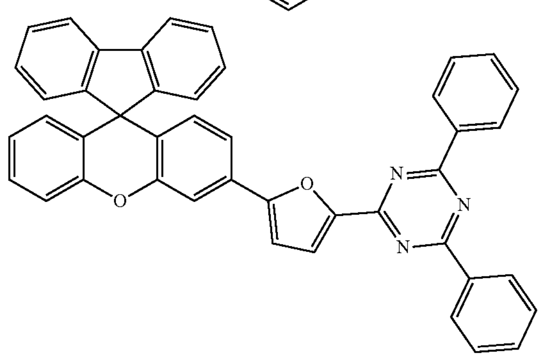
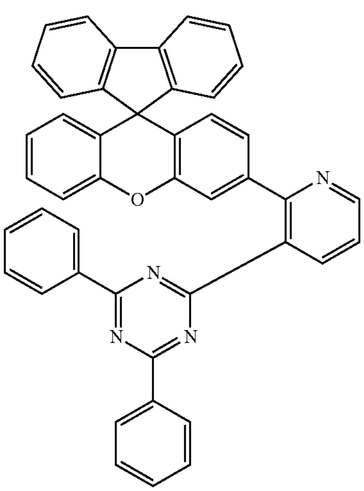
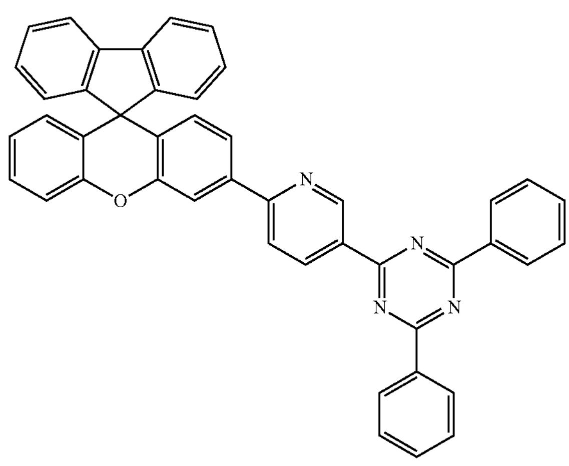

-continued
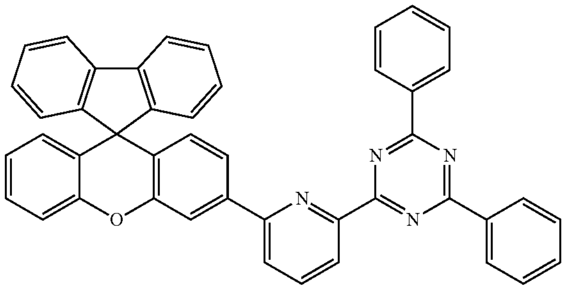
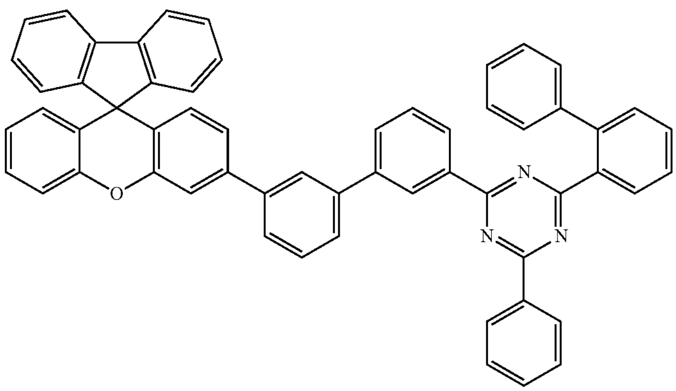
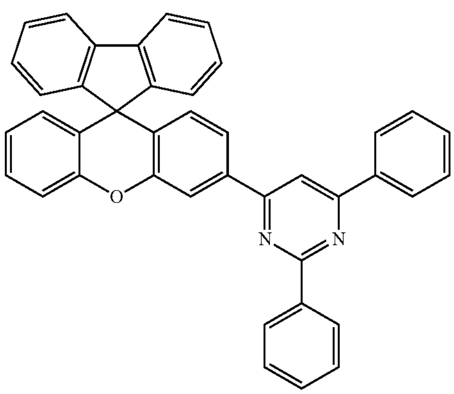
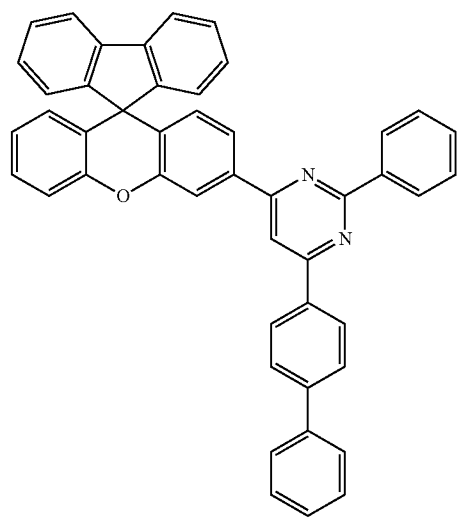
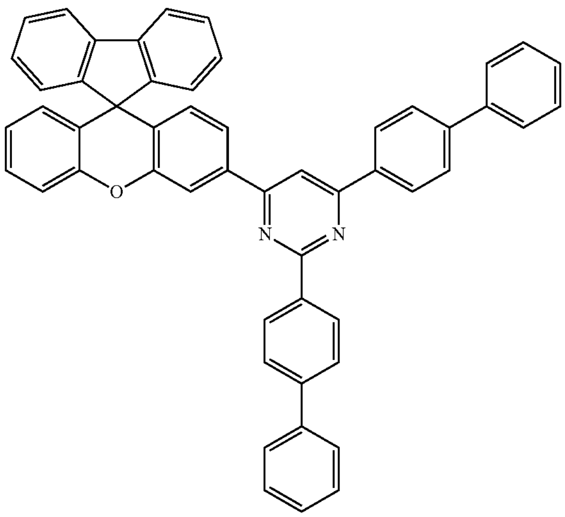
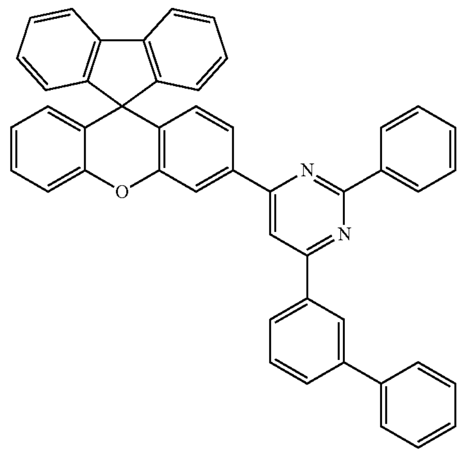

-continued
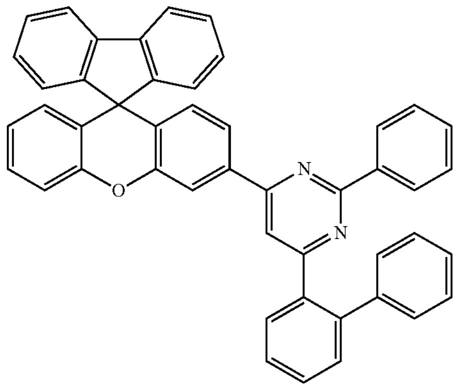
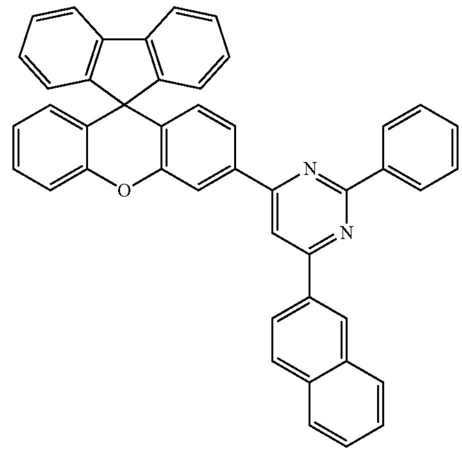
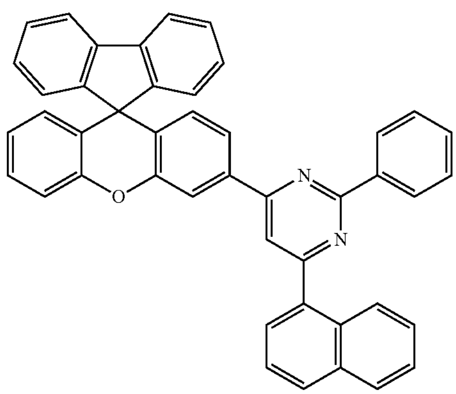
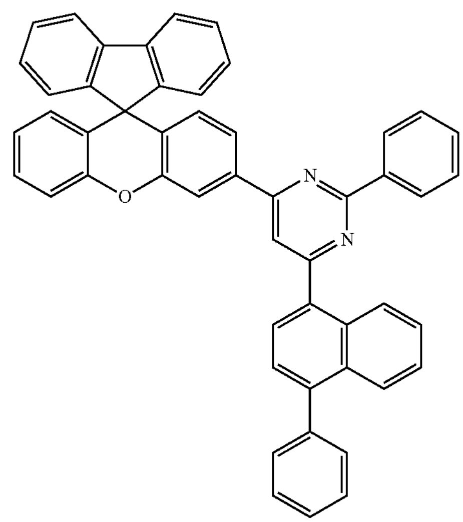
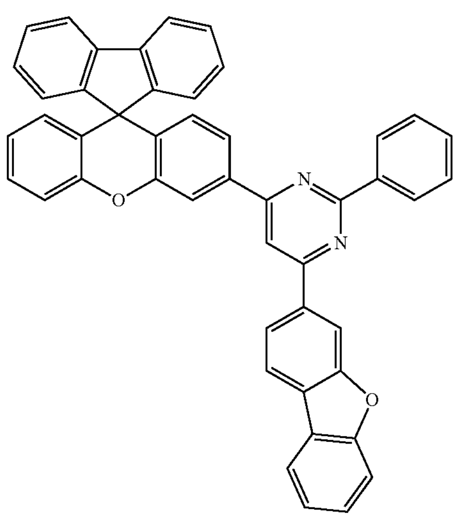
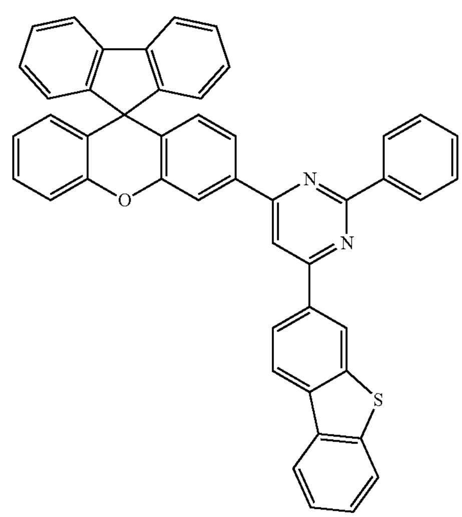

-continued
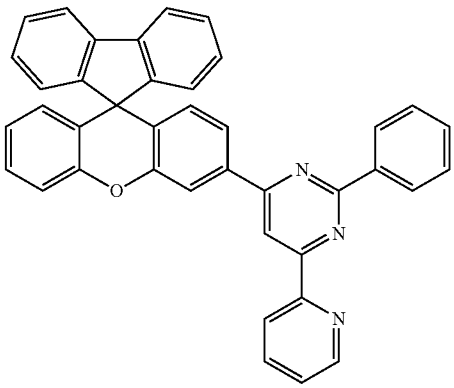
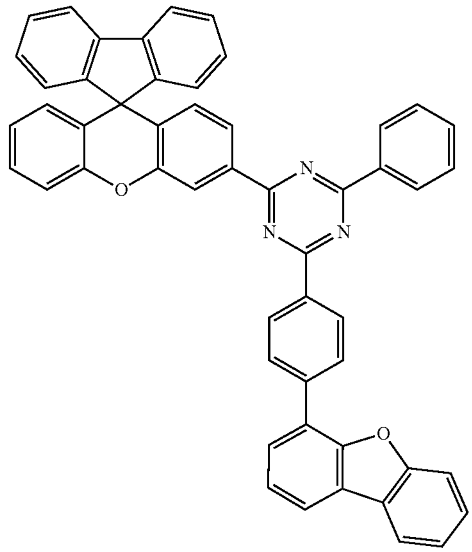
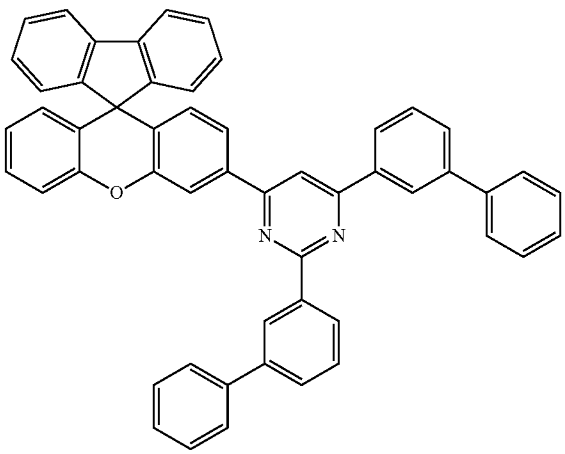
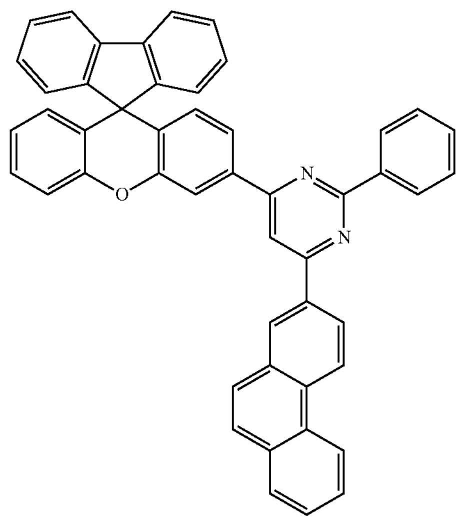
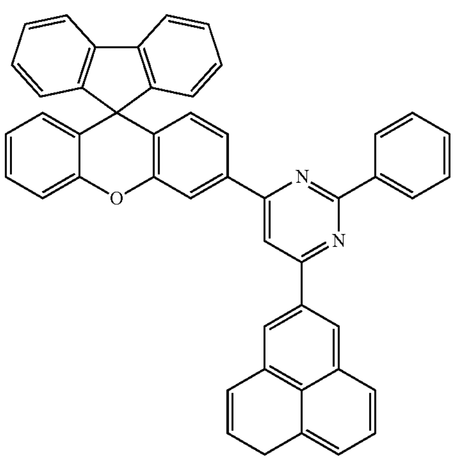
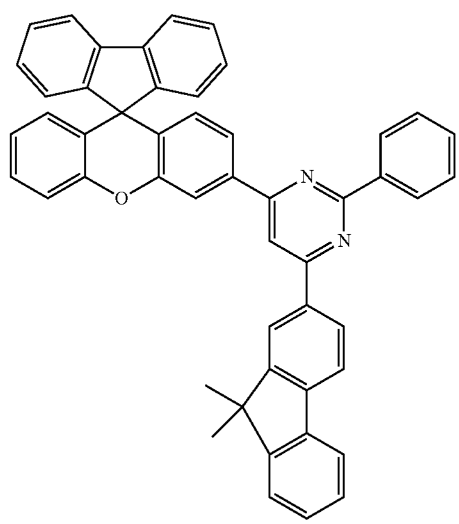

-continued
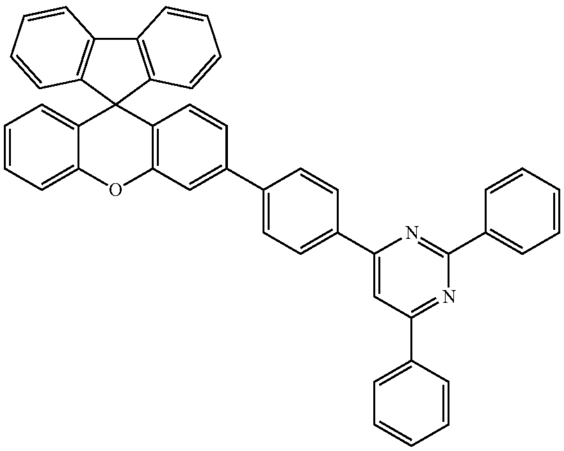
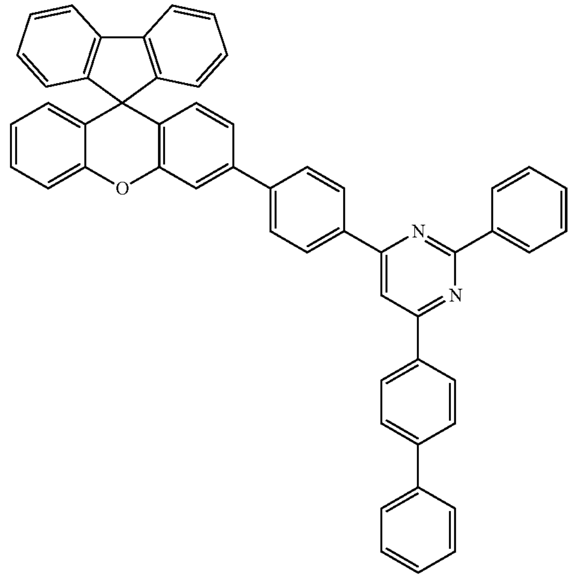
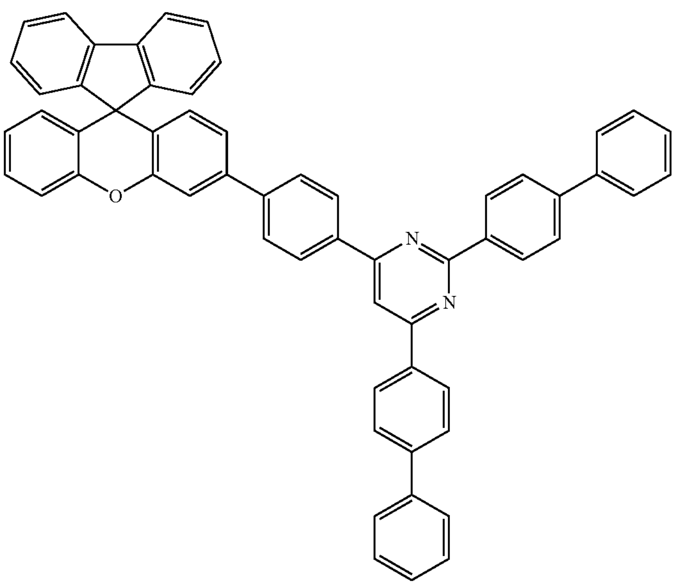
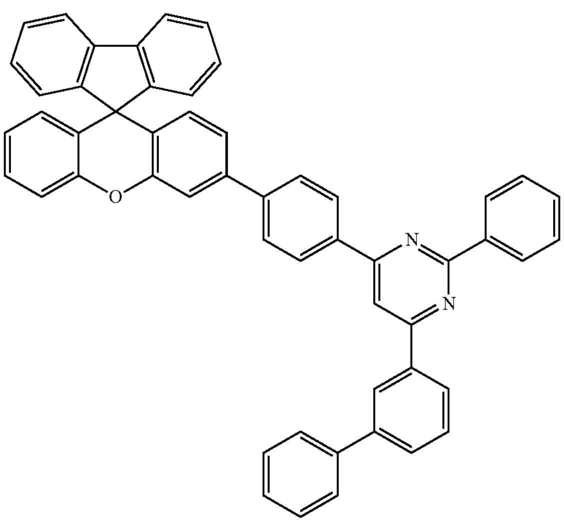

-continued
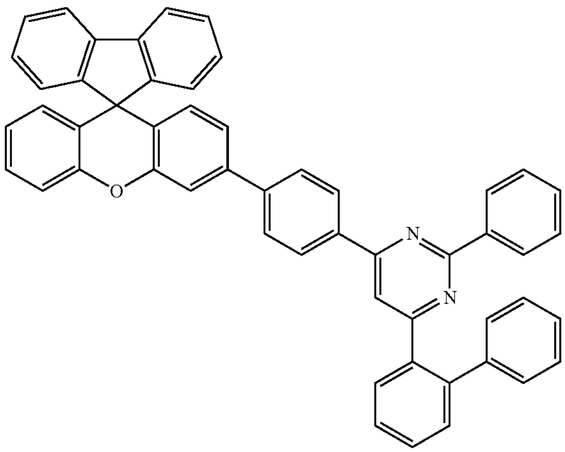
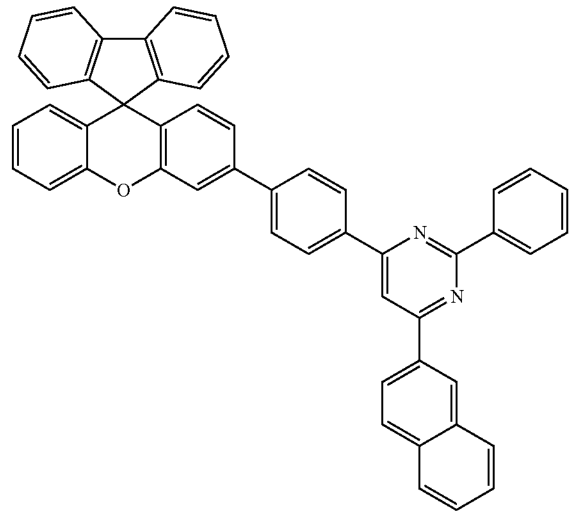
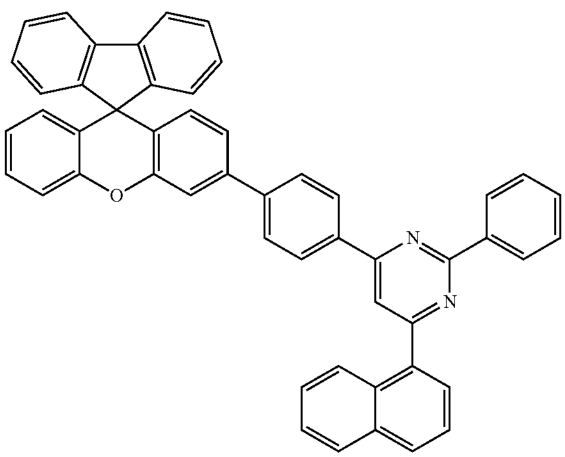
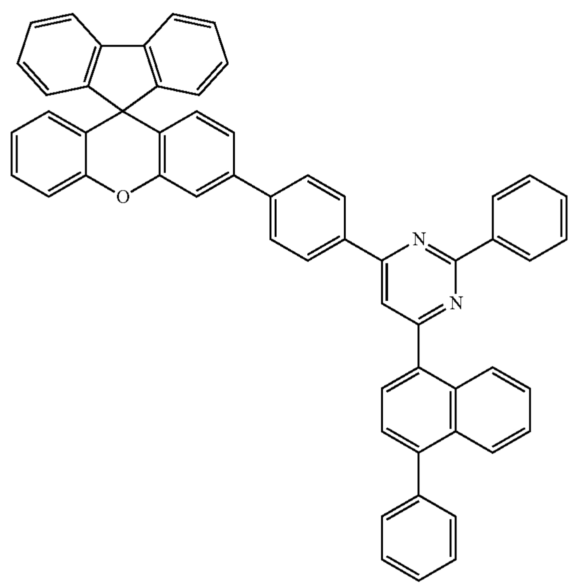
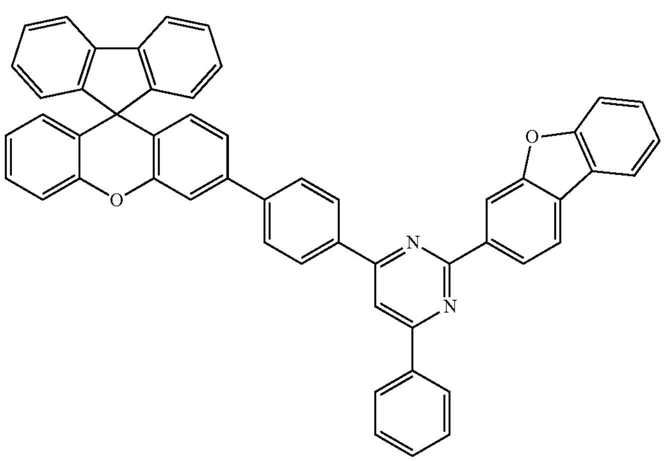

-continued
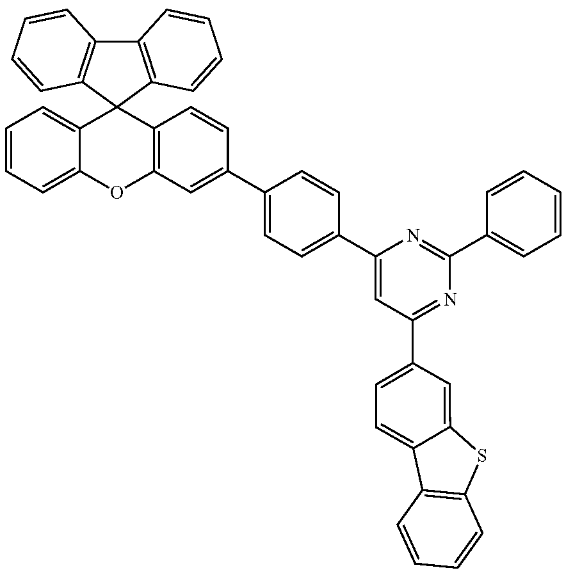
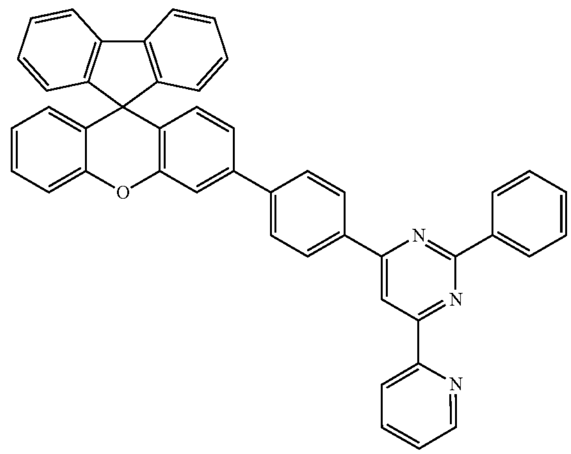
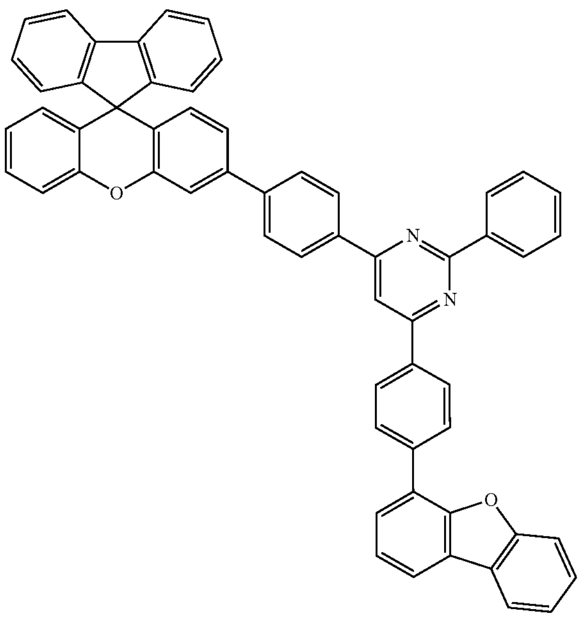
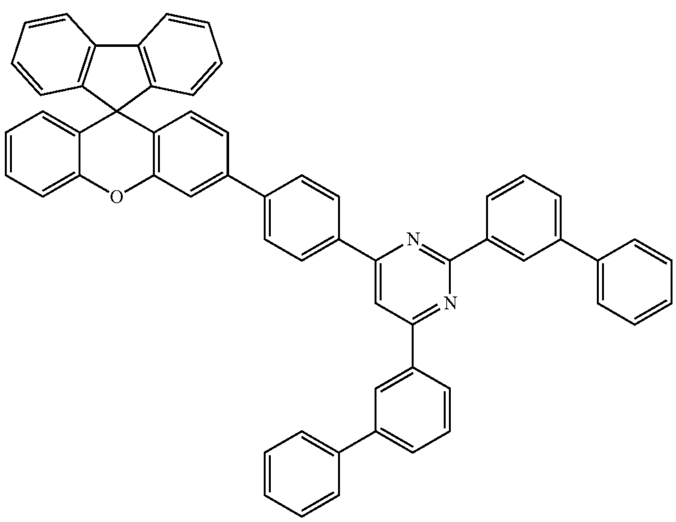

-continued
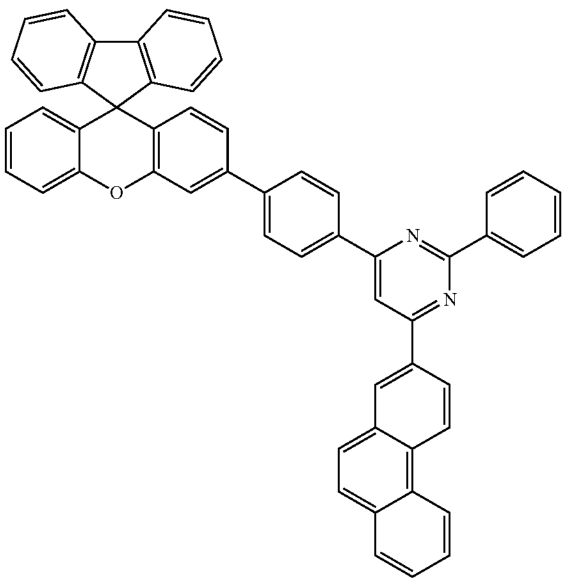
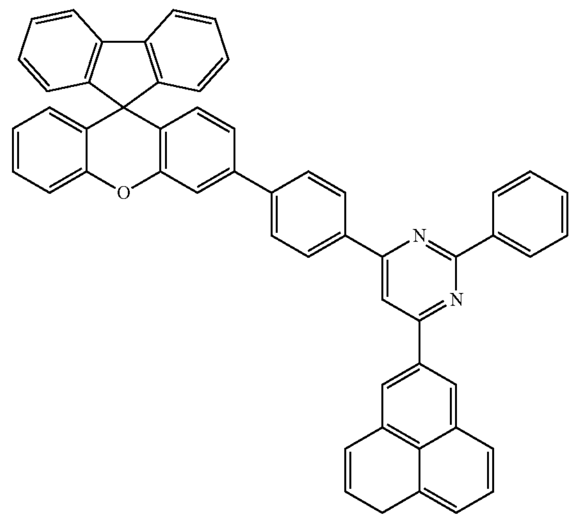
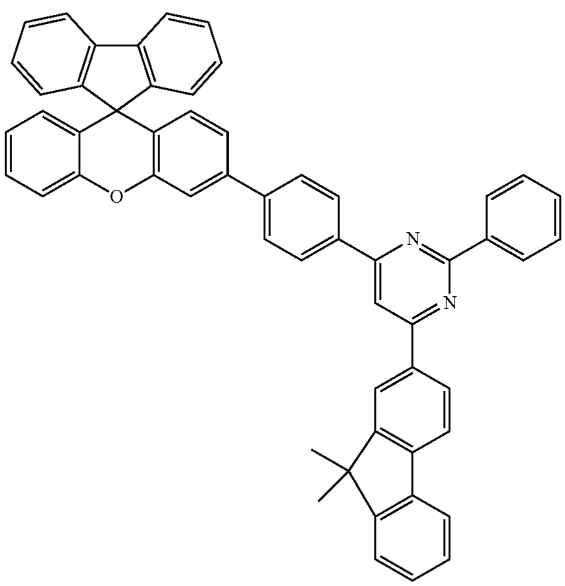 [SMILES: CC1(C)c2ccccc2-c2ccc(-c3nc(-c4ccccc4)nc(-c4ccc(-c5ccc6c(c5)Oc5ccccc5C65c6ccccc6-c6ccccc65)cc4)n3)cc21]
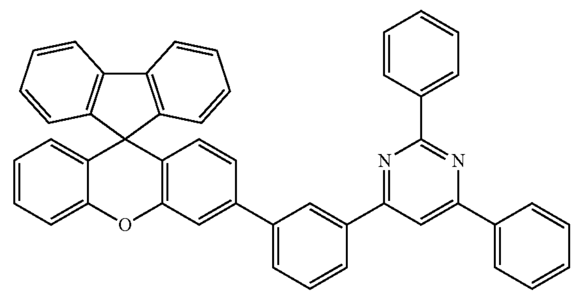
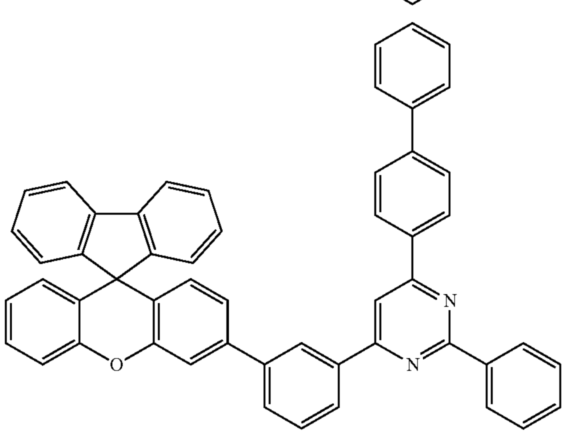

-continued
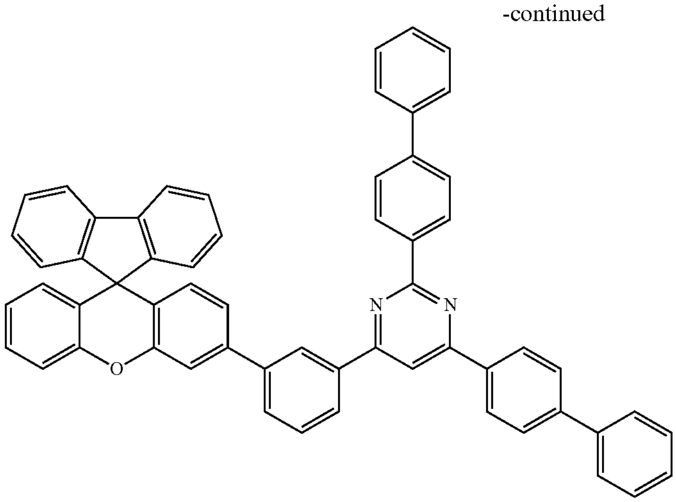
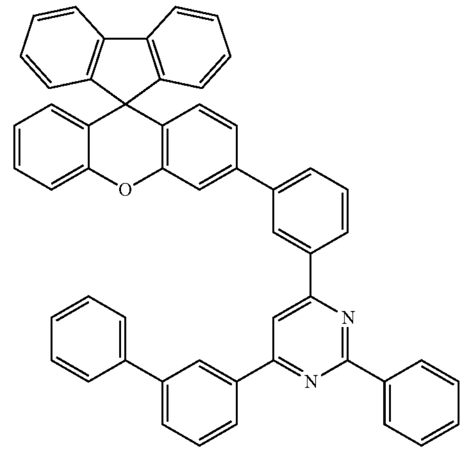
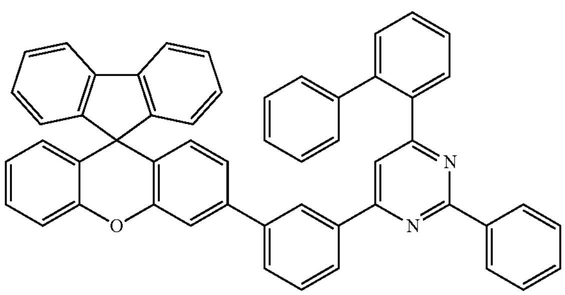
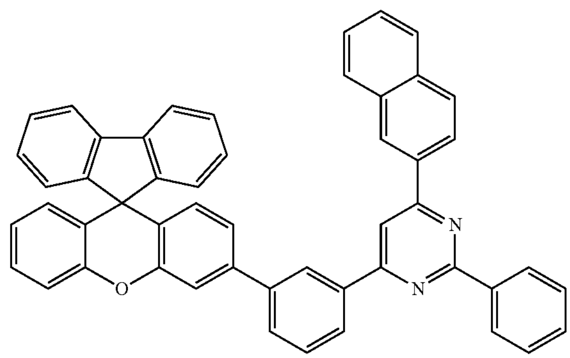
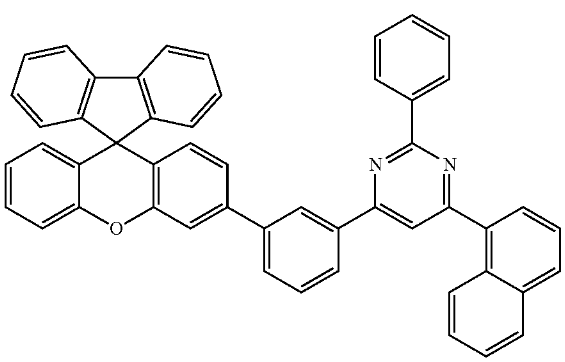
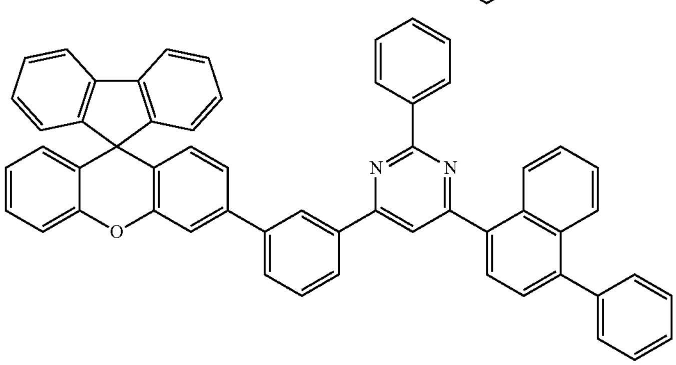

-continued
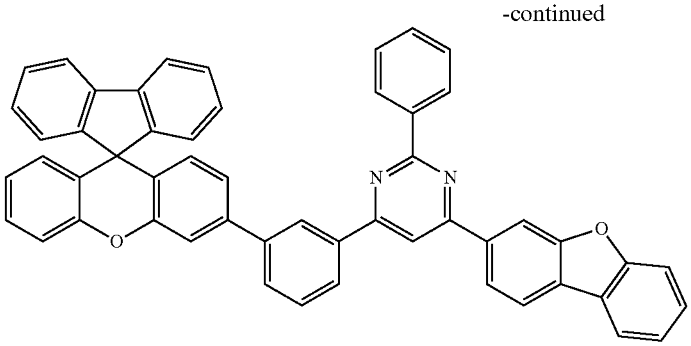
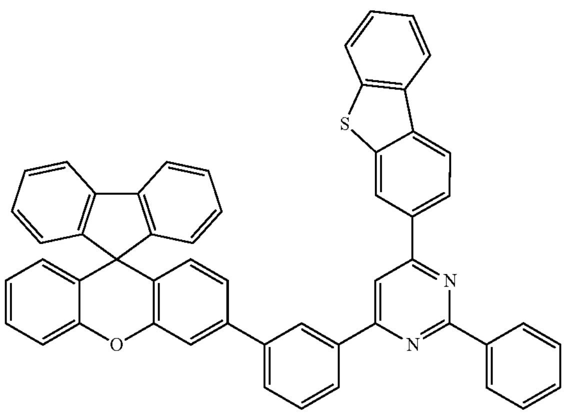
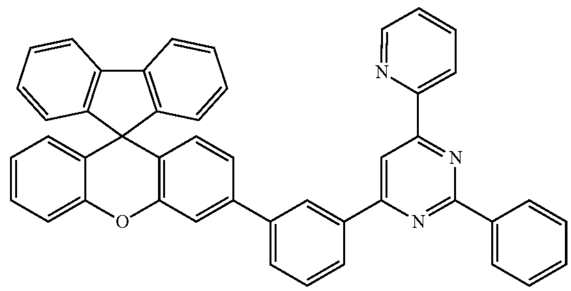
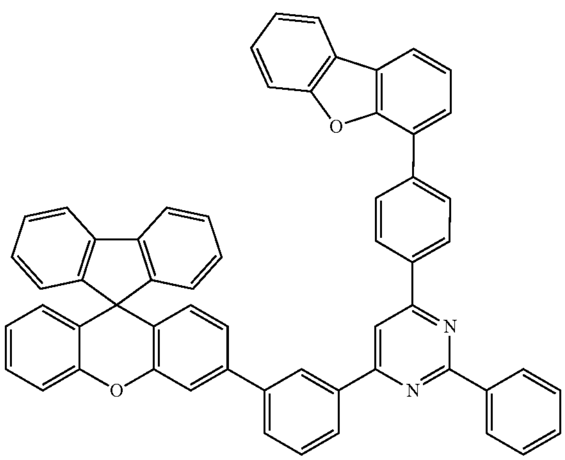
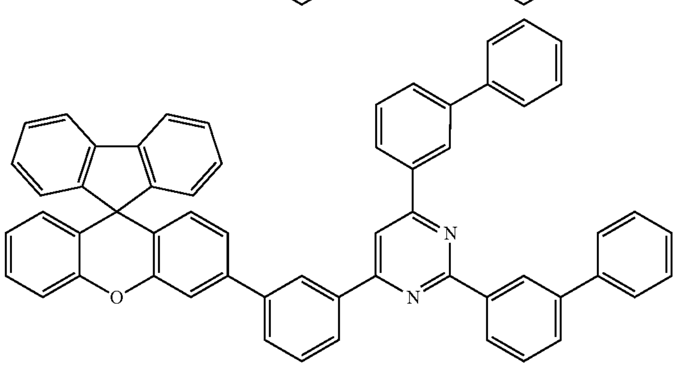

-continued
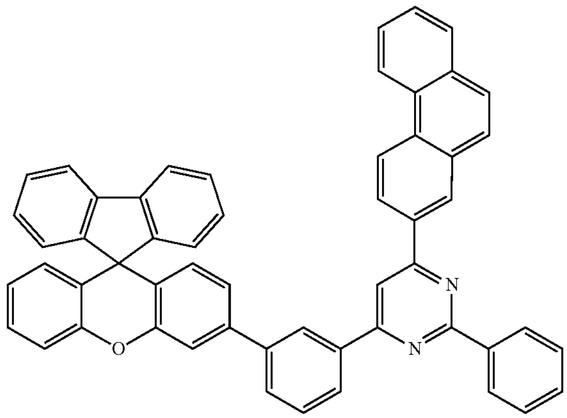
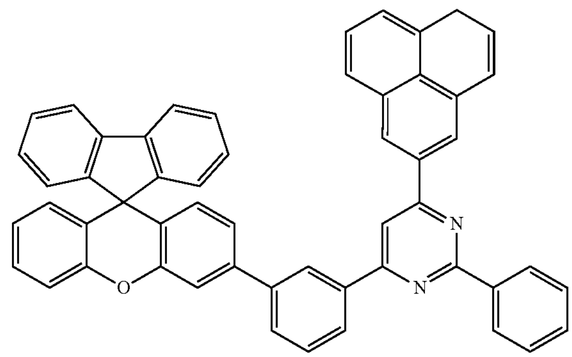
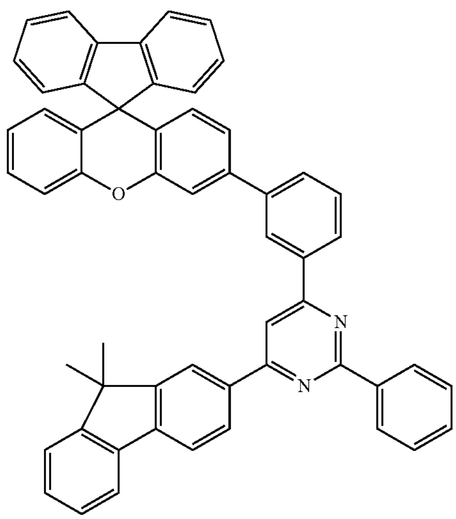
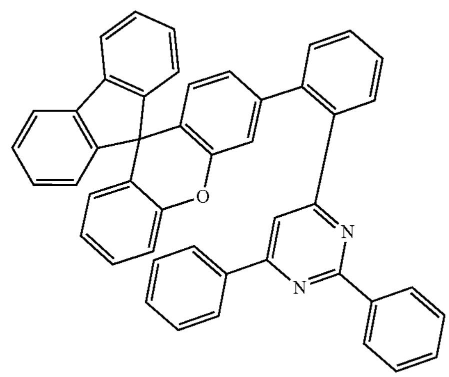
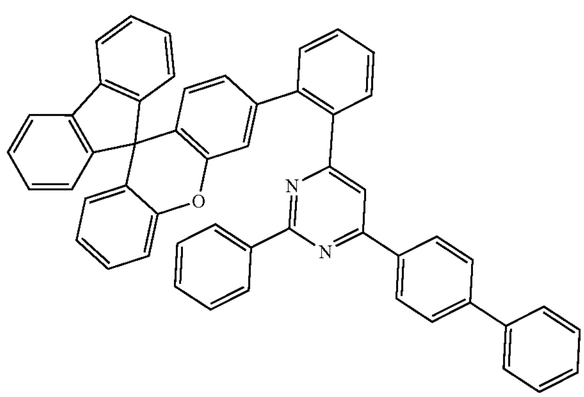
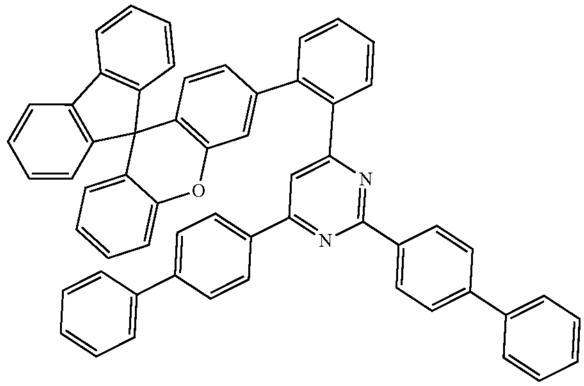

-continued
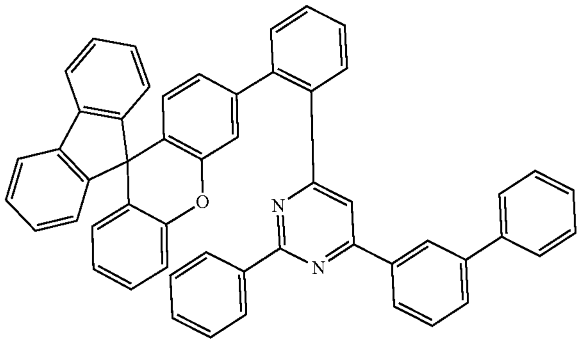
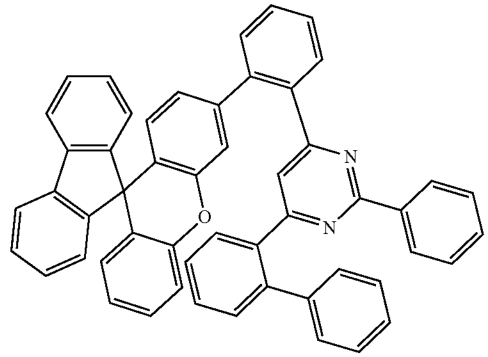
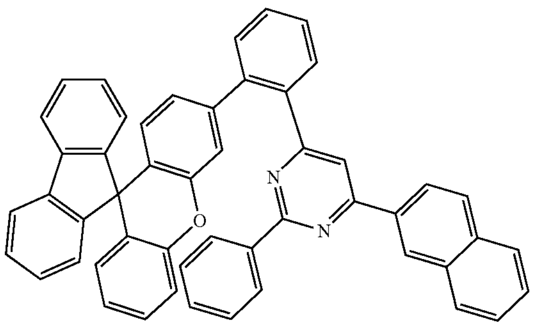
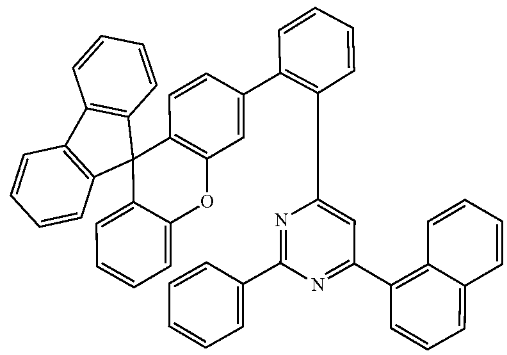
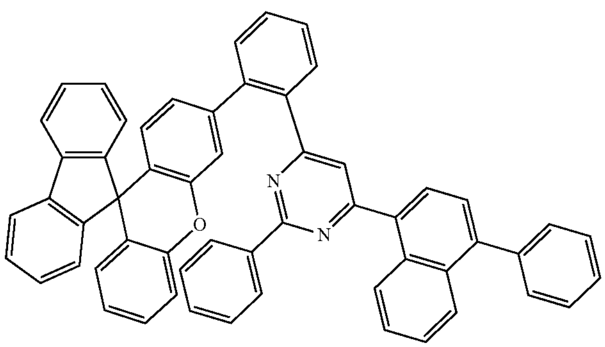
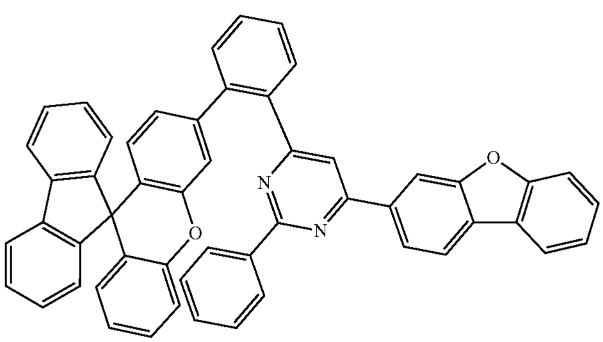
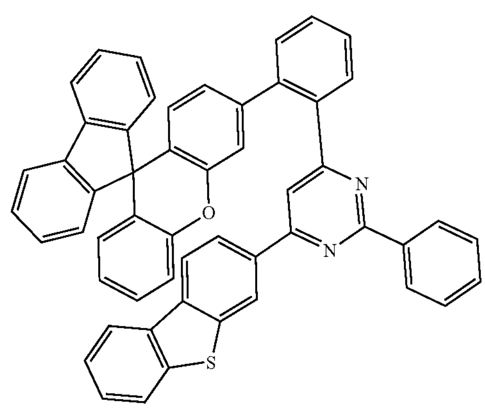

-continued
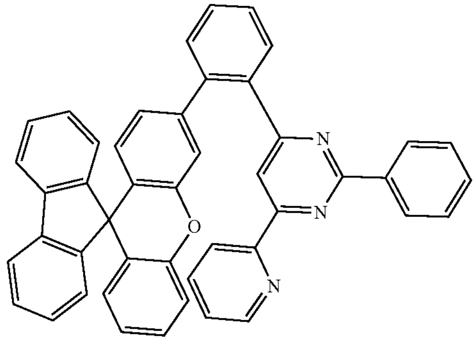
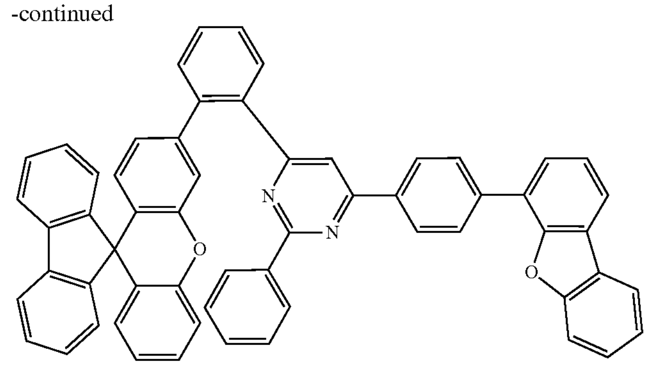
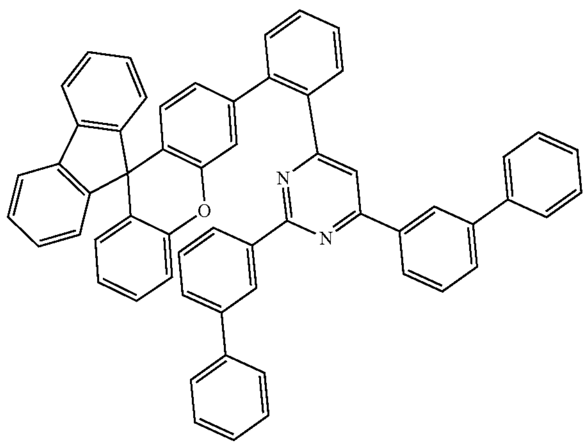
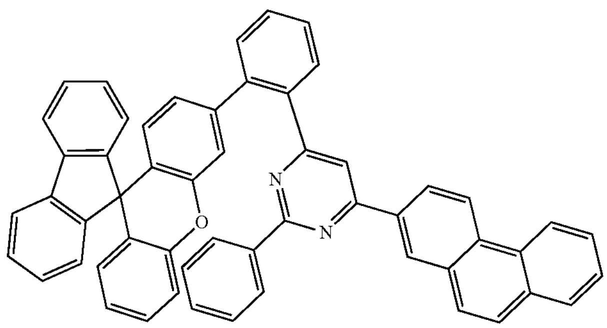
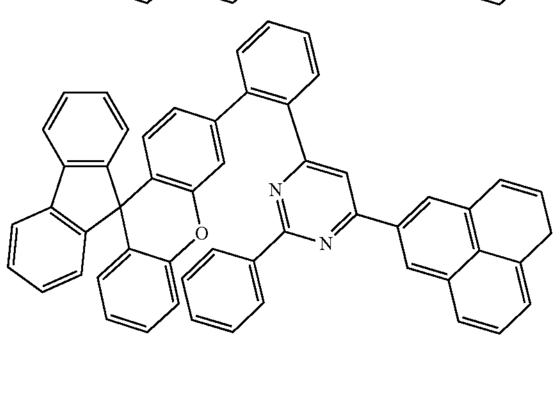
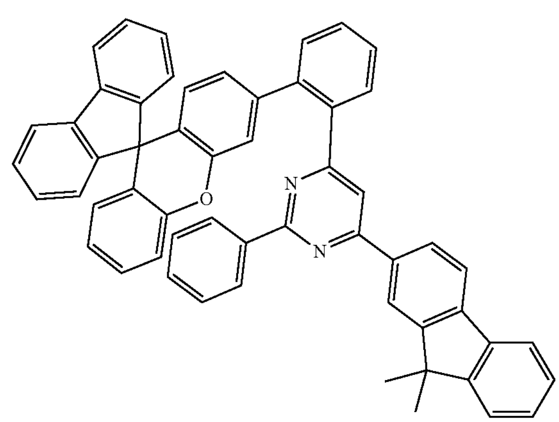

-continued
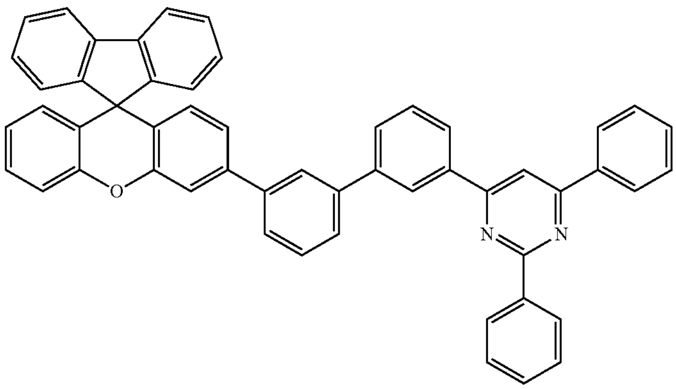
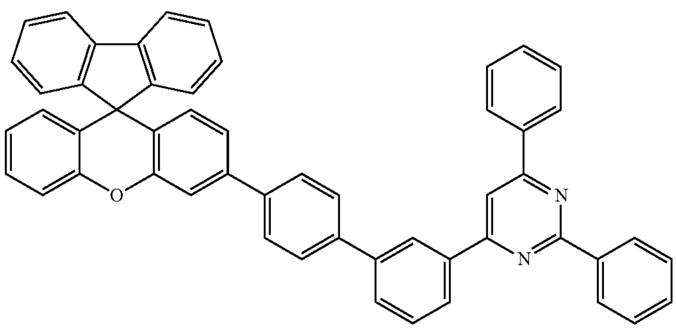
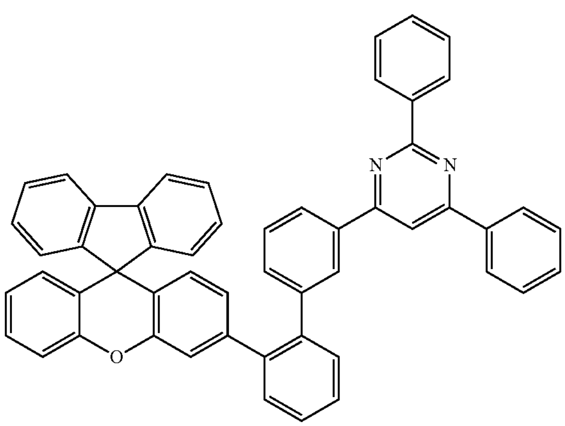
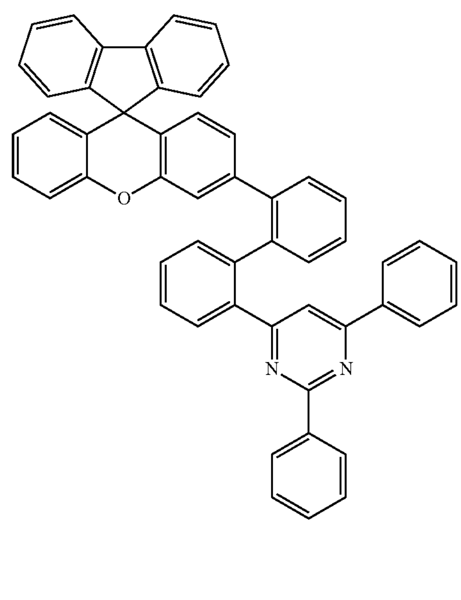

-continued
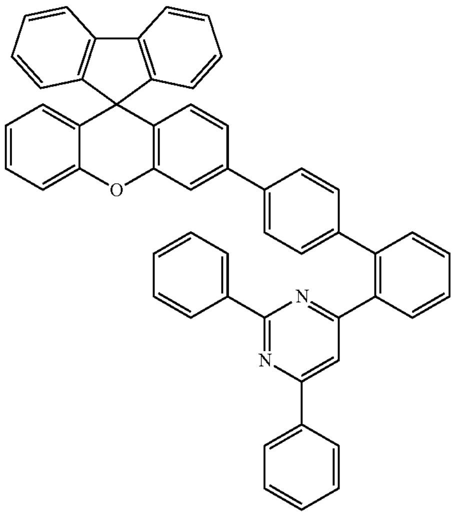
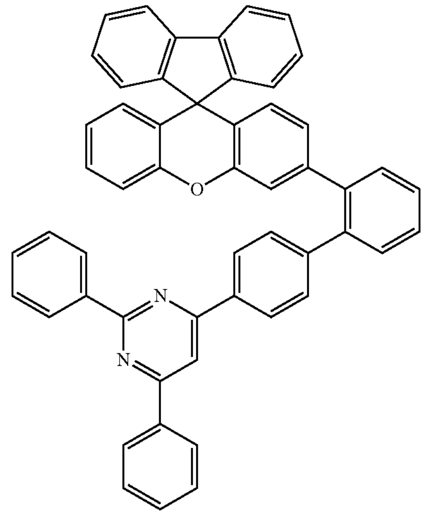
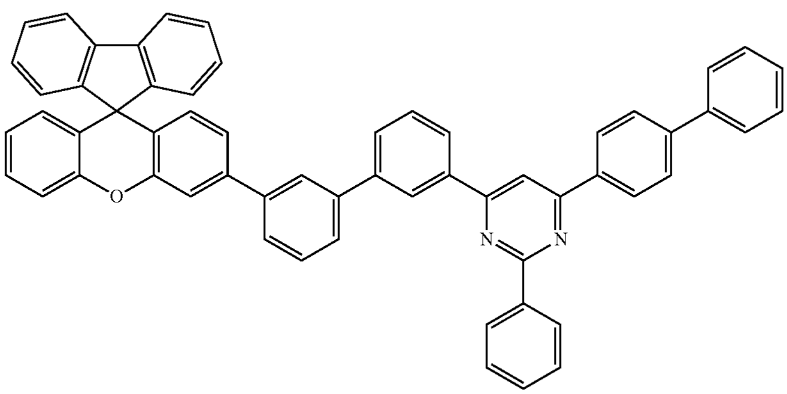
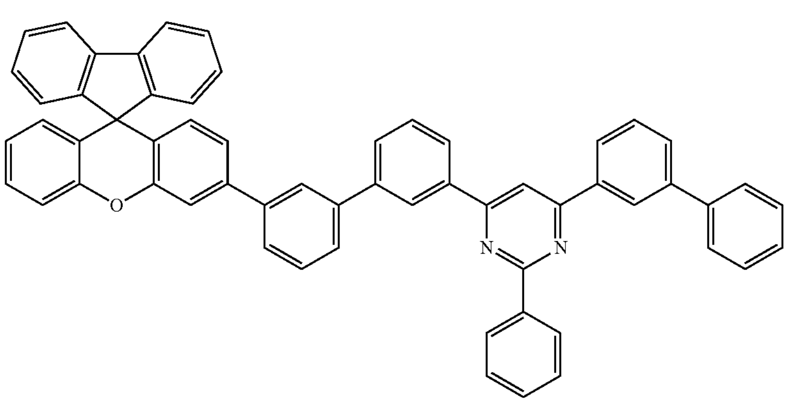

-continued
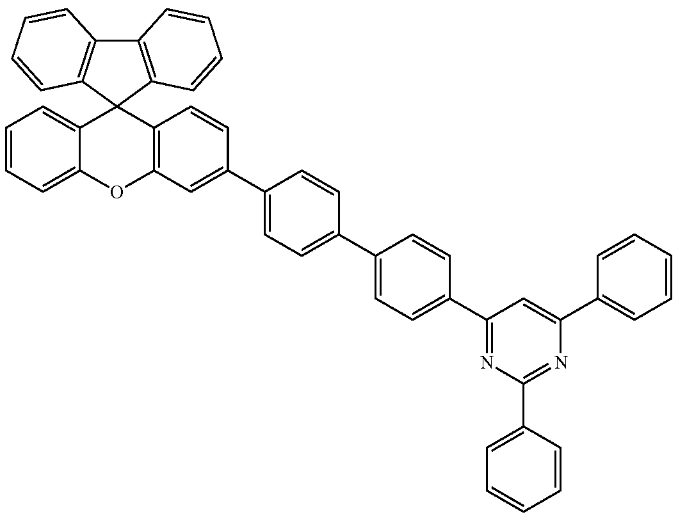
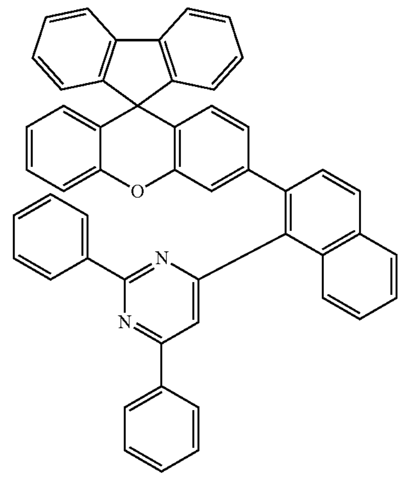
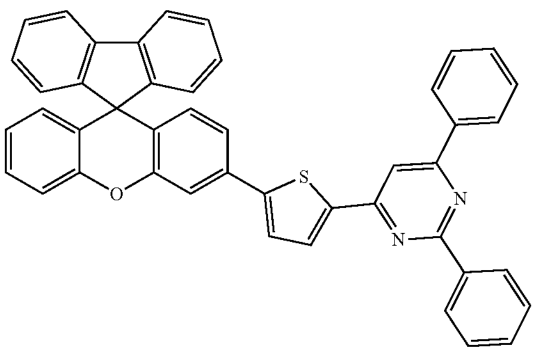
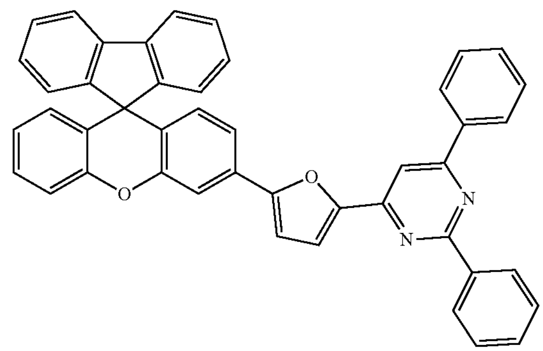
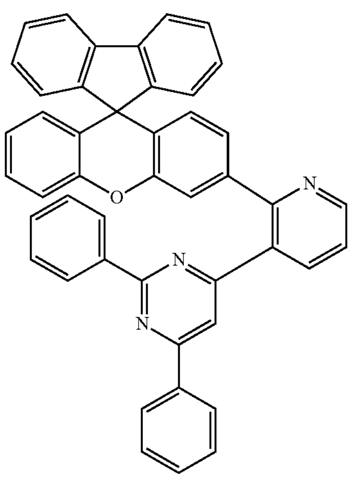
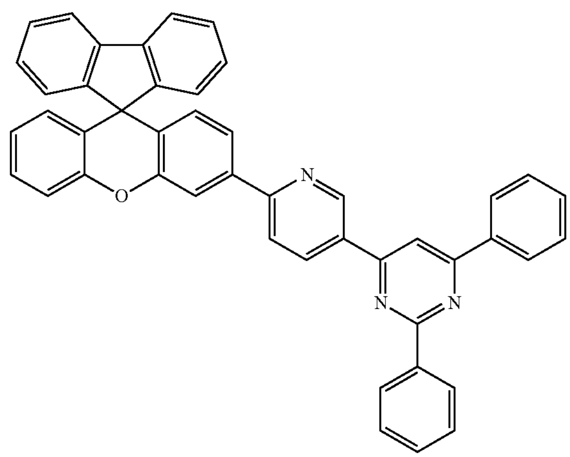
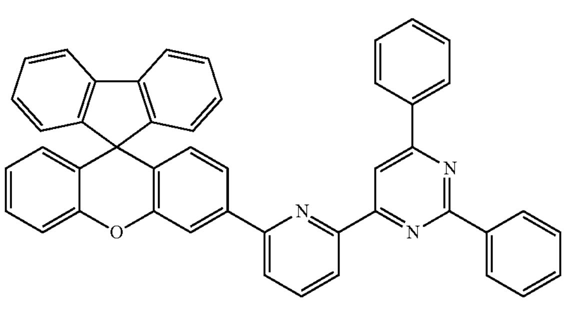

-continued
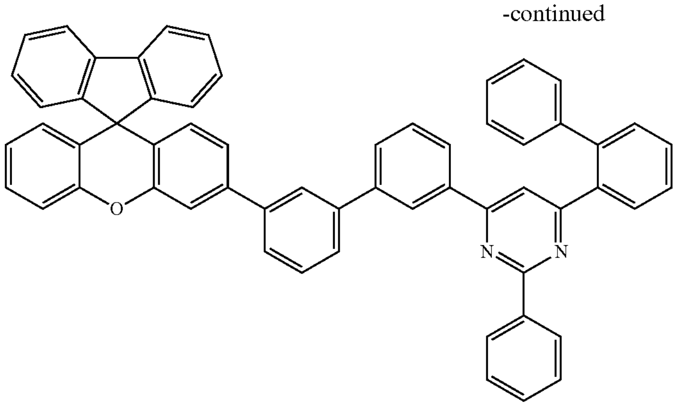
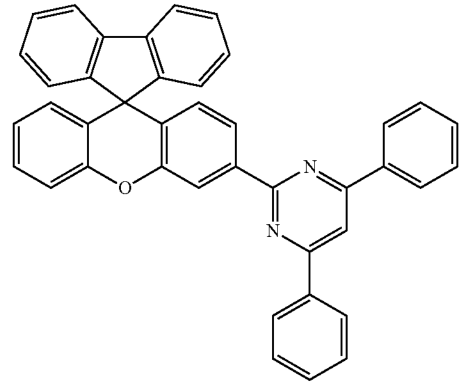
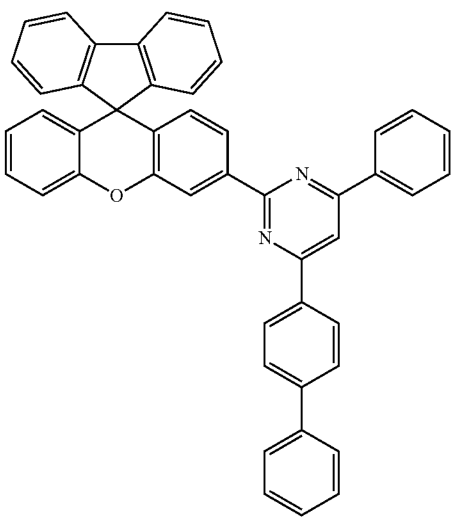
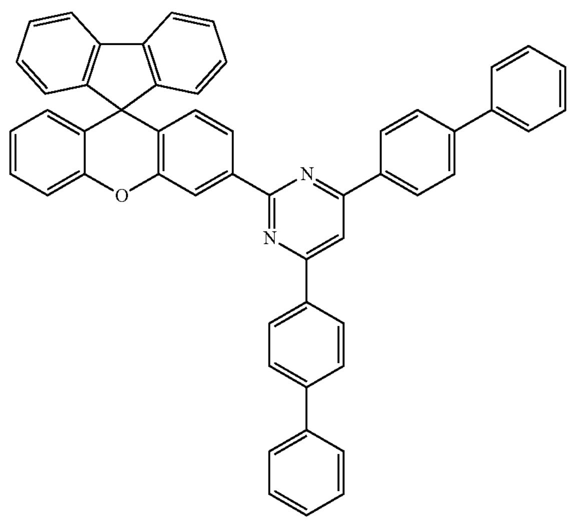
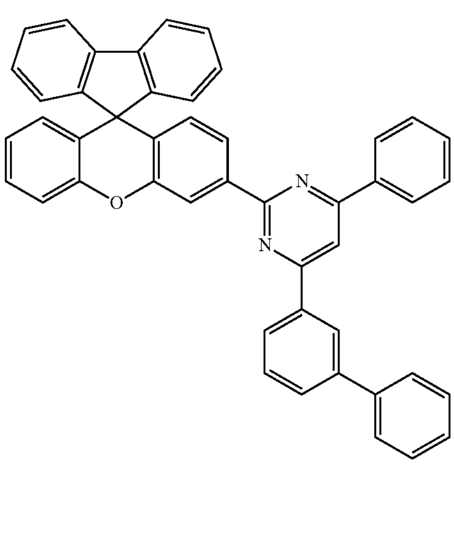
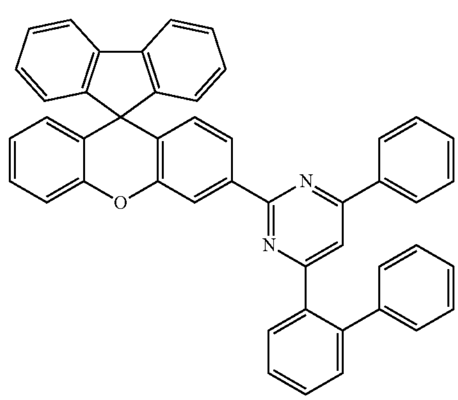

-continued
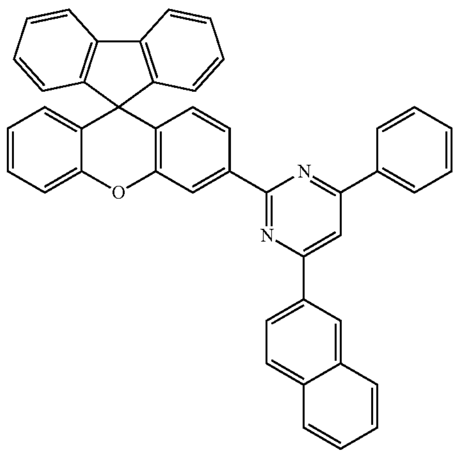
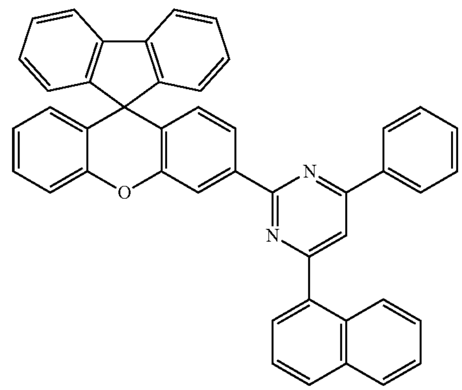
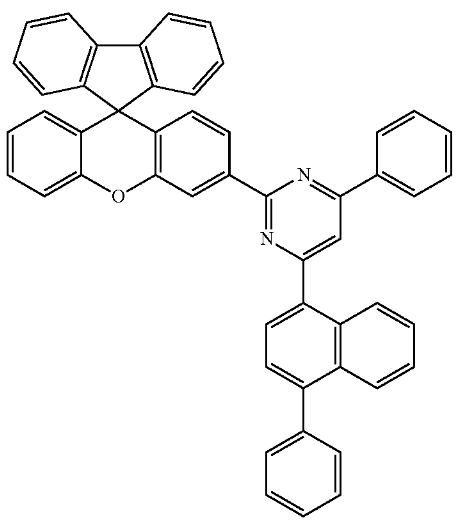
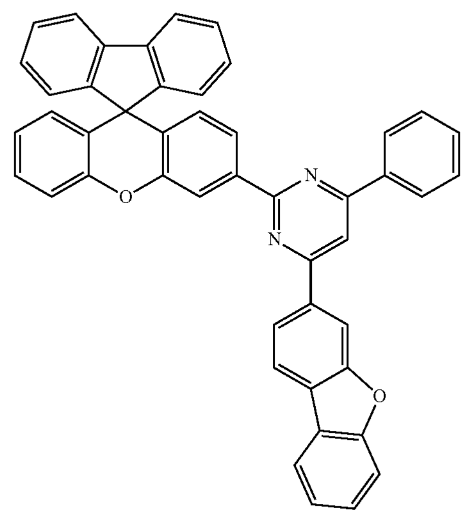
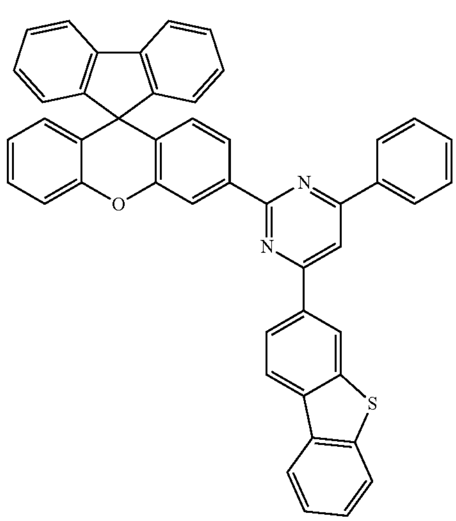
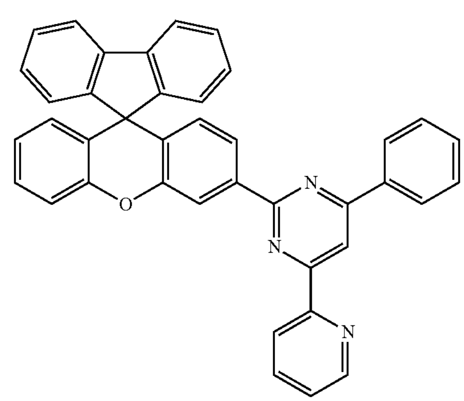

-continued
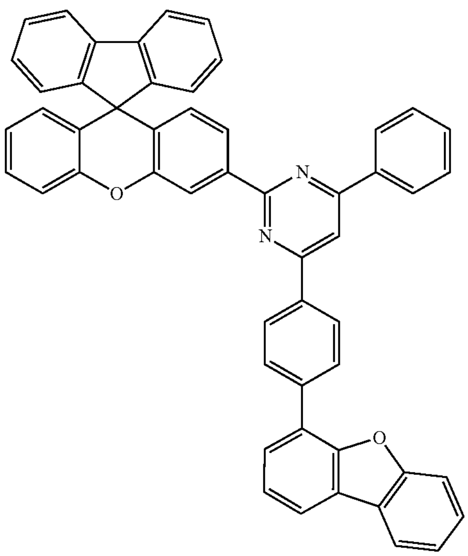
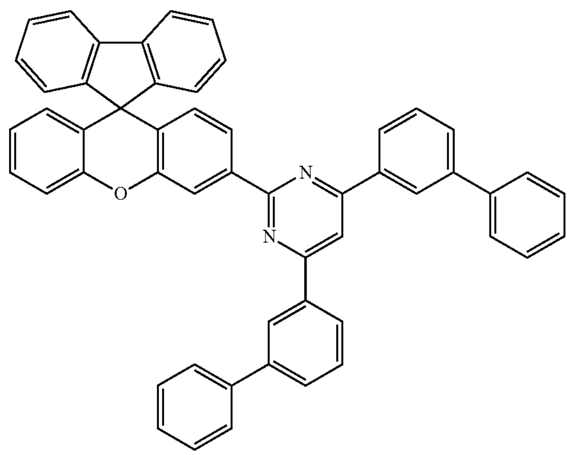
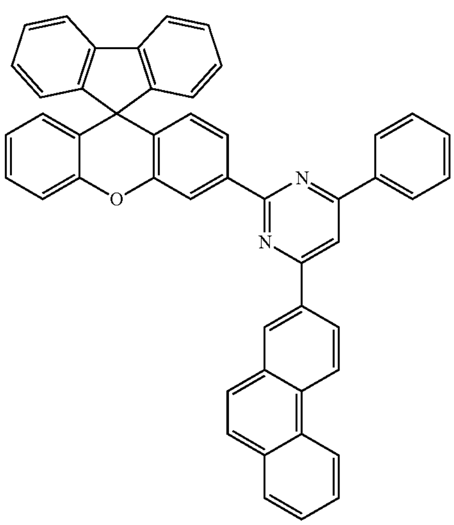
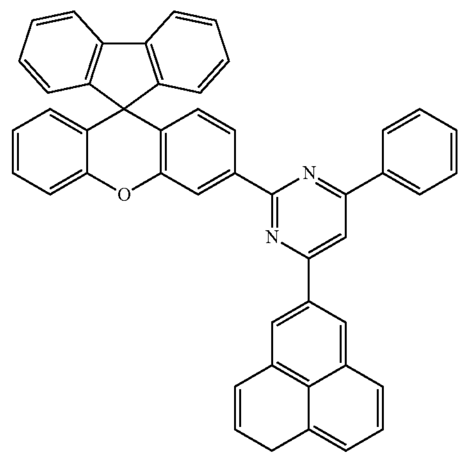
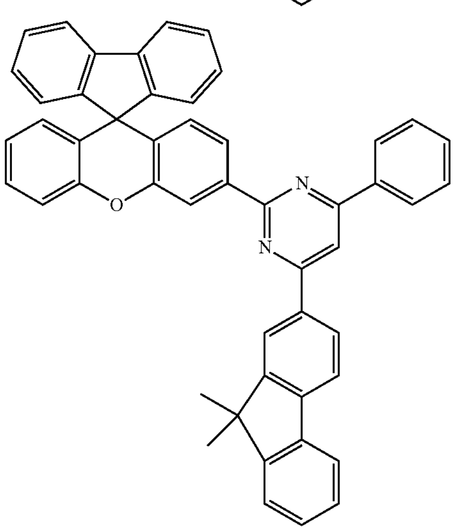
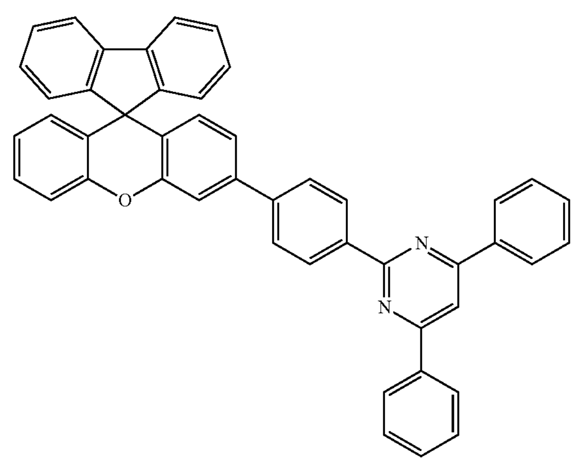

-continued
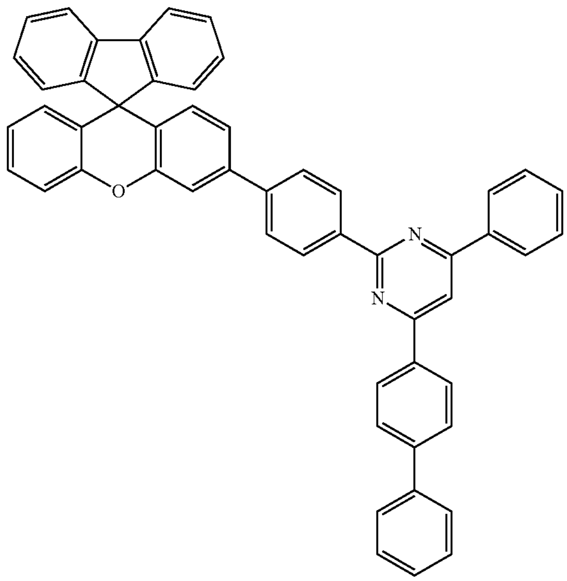
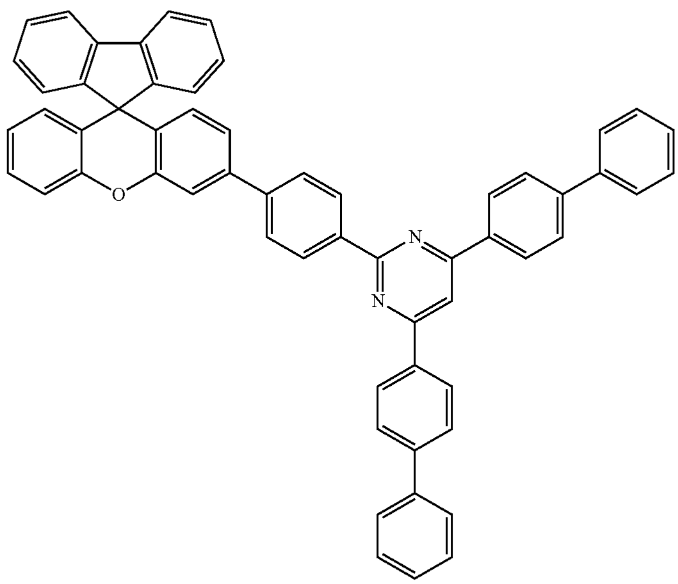
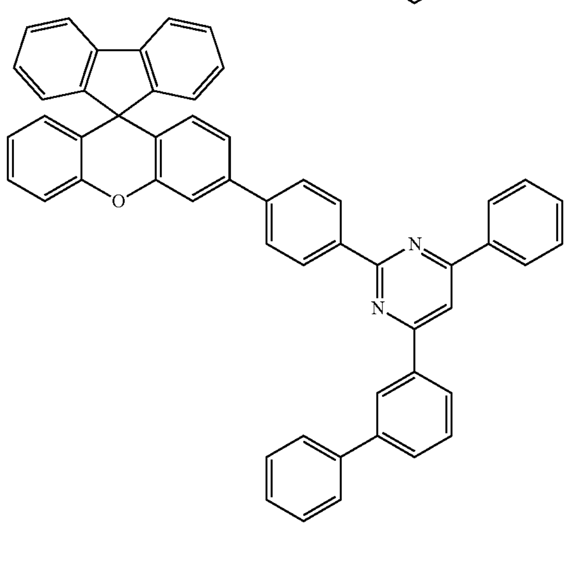

-continued
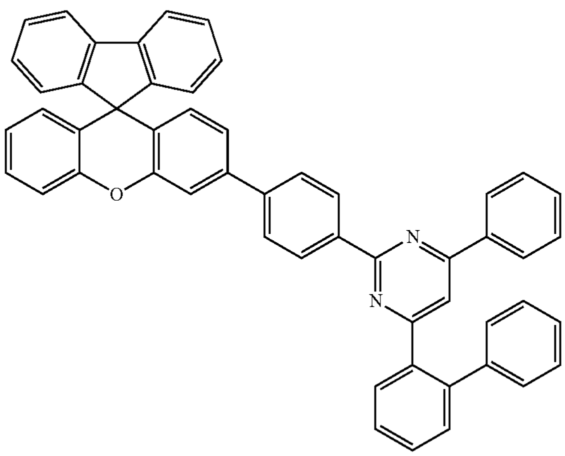
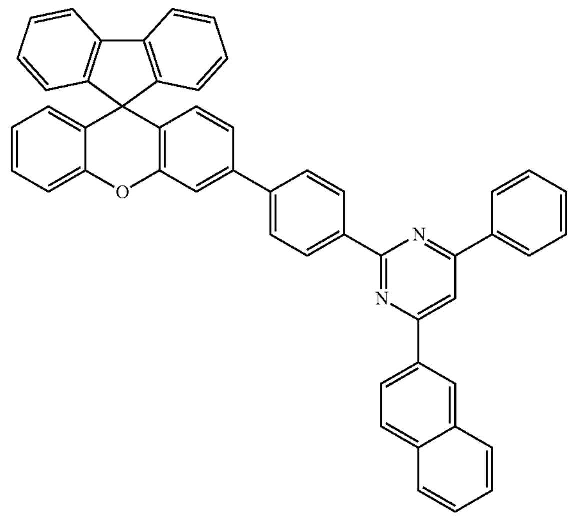
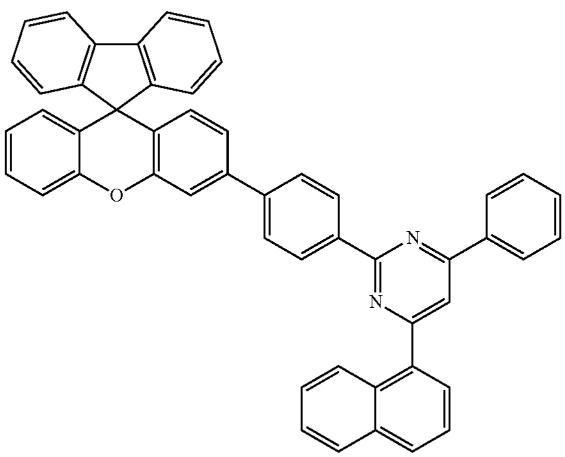
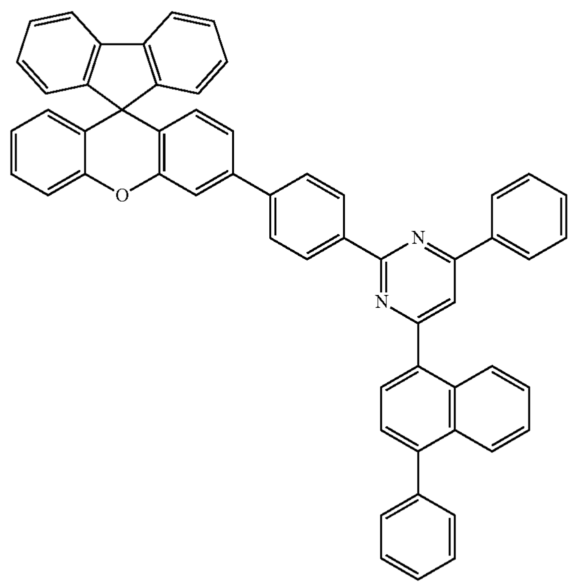
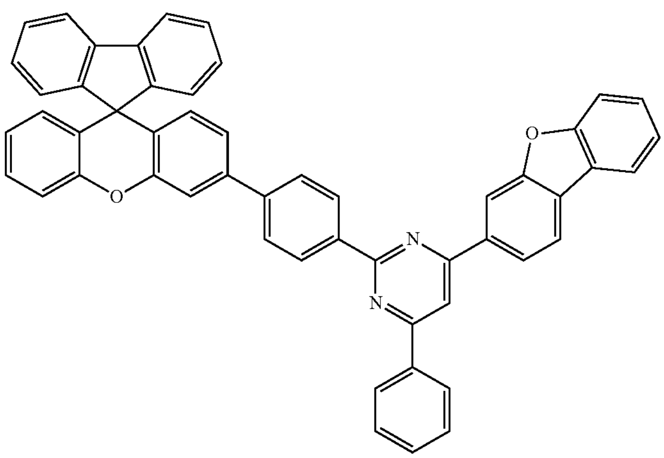

-continued
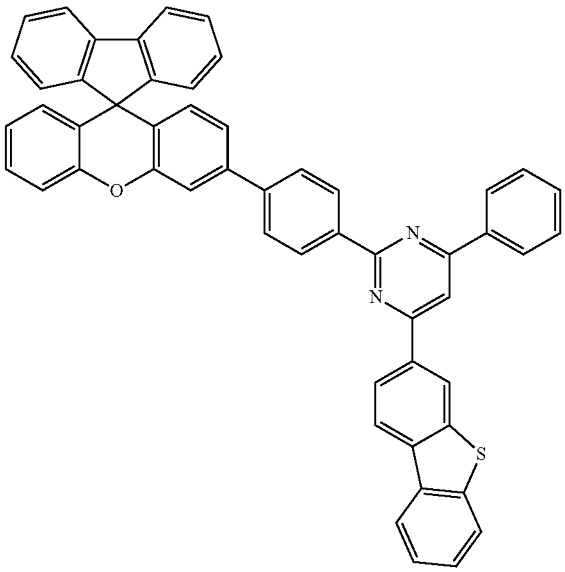
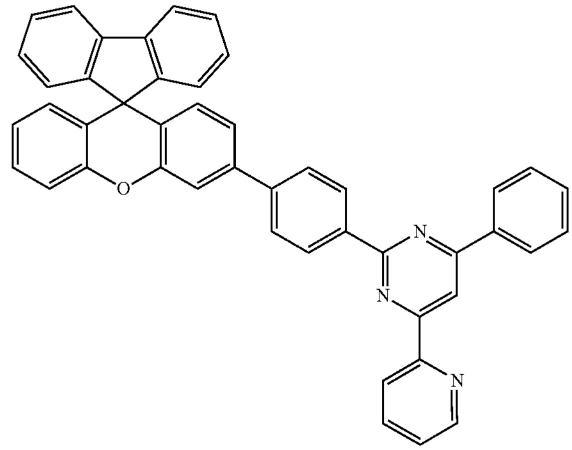
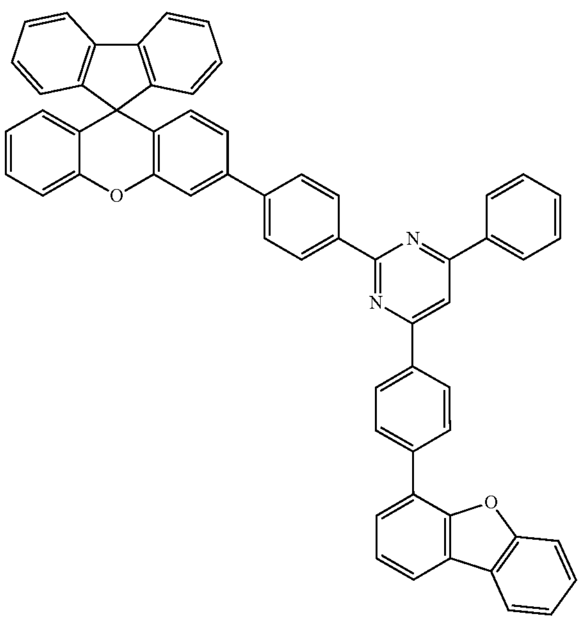
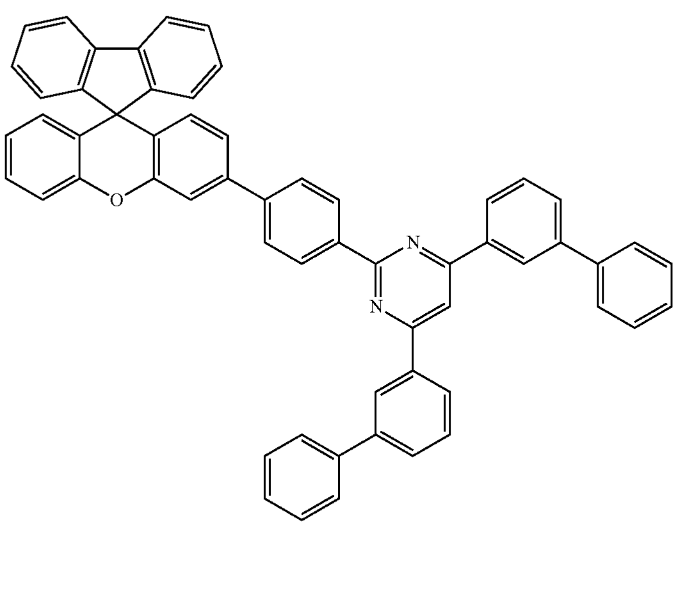

-continued
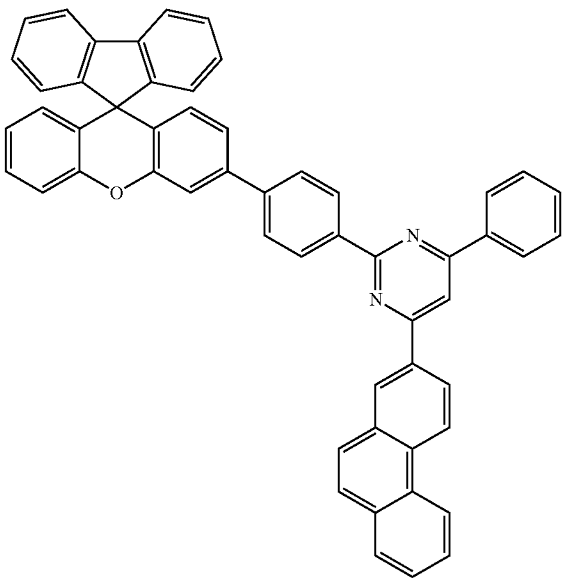
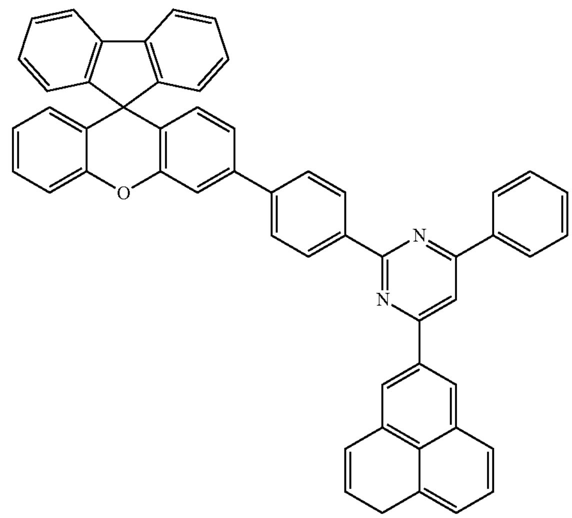
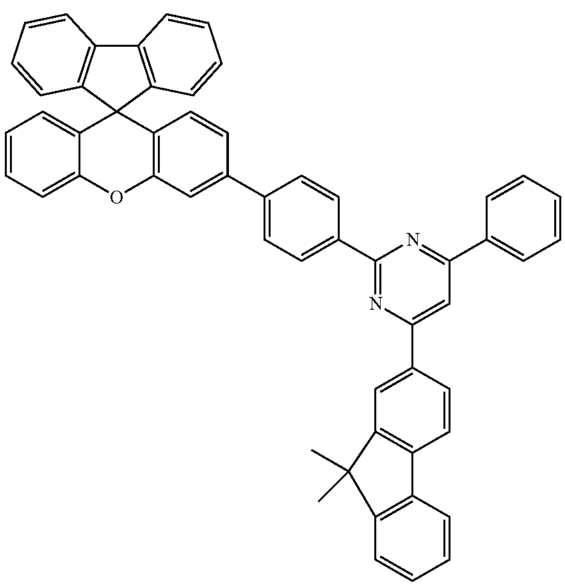
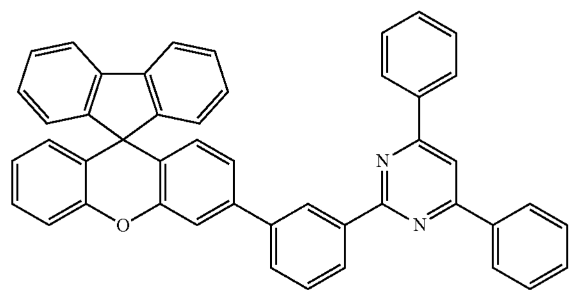
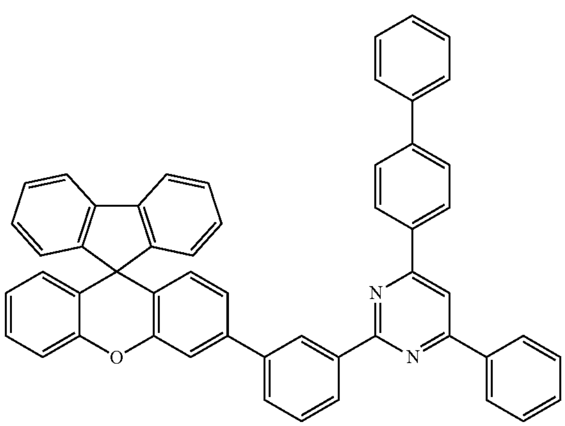

-continued
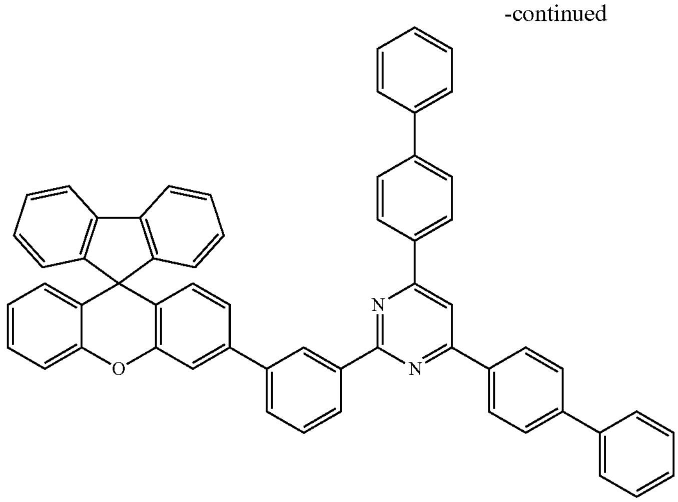
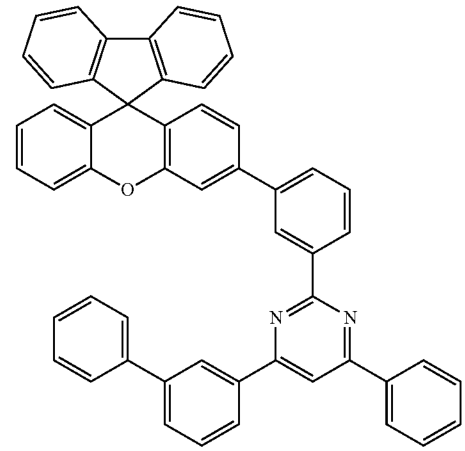
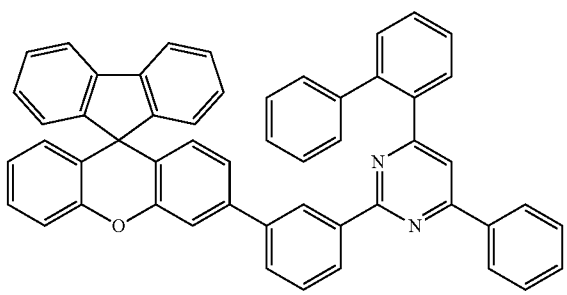
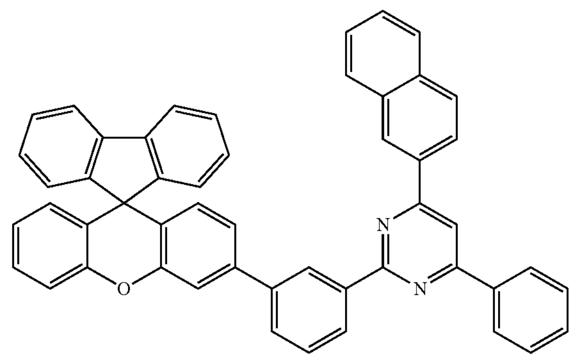
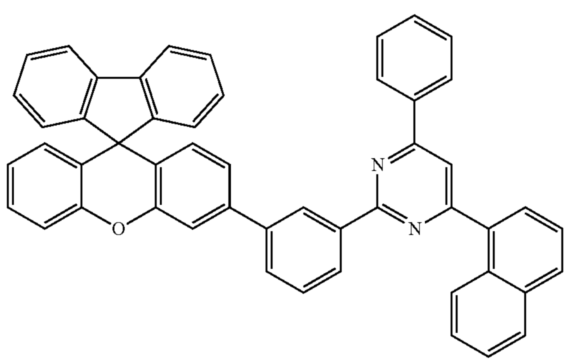
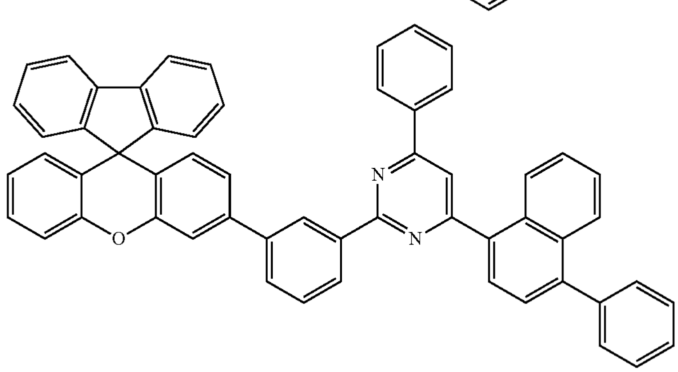

-continued
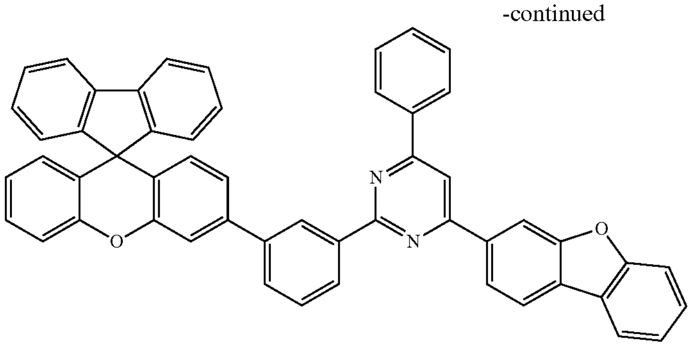
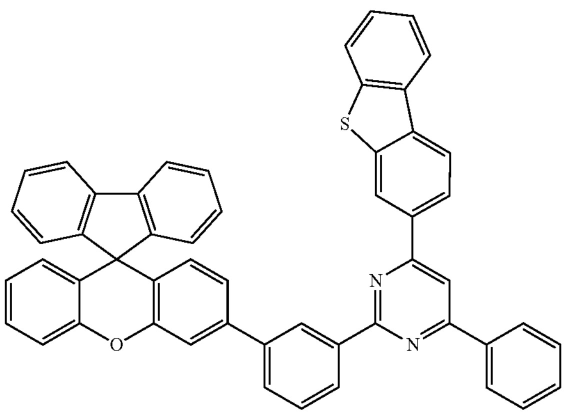
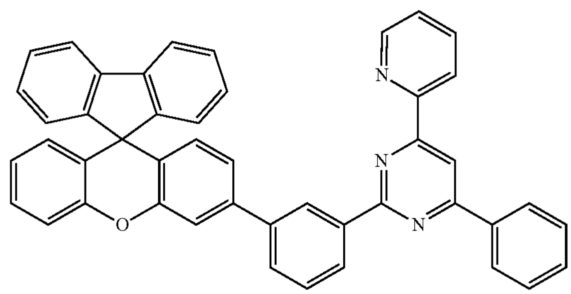
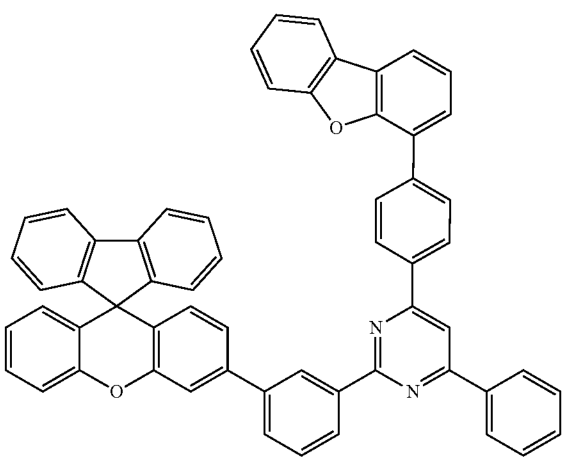
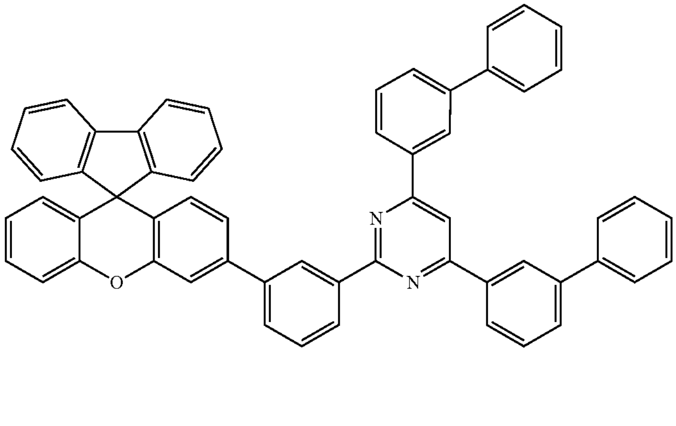

-continued
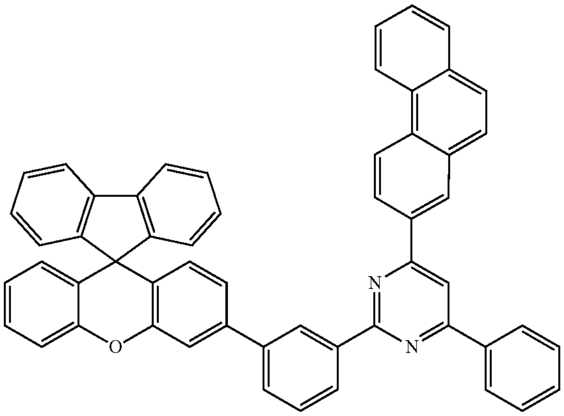
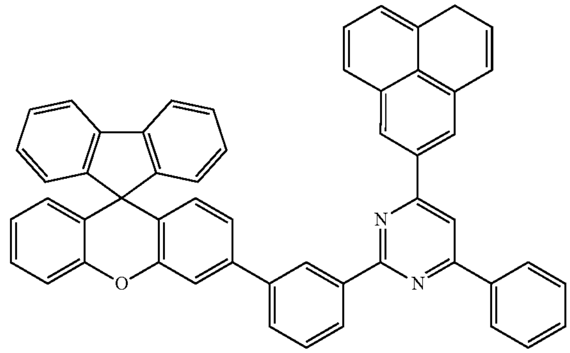
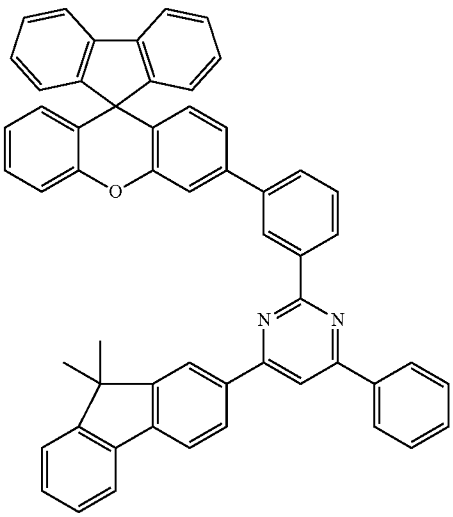
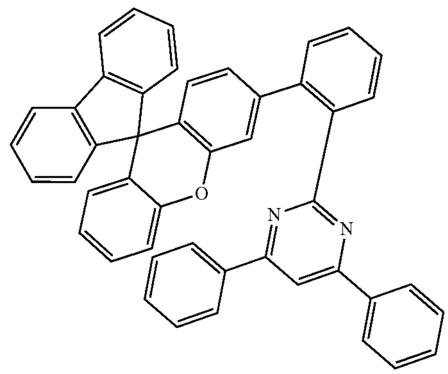
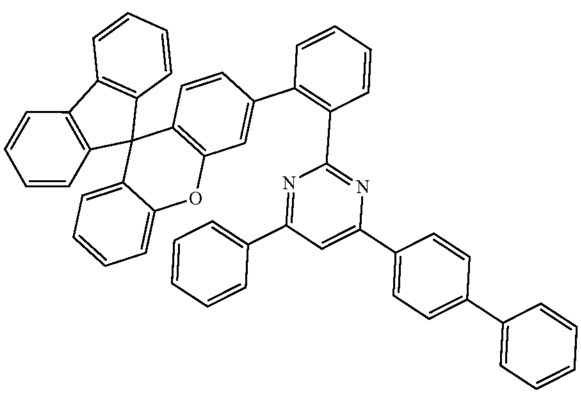
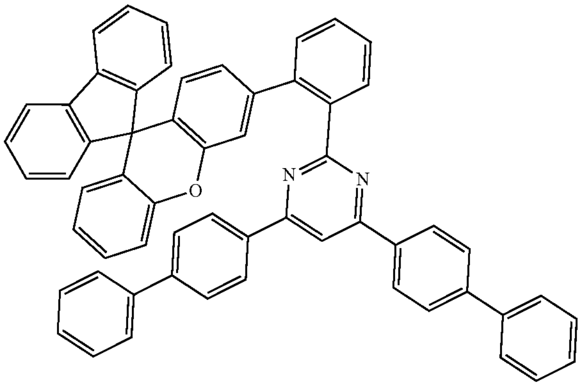

-continued
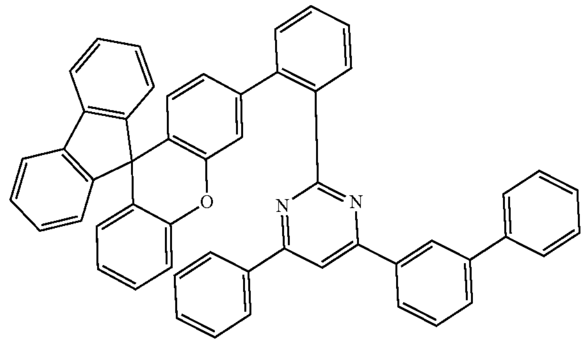
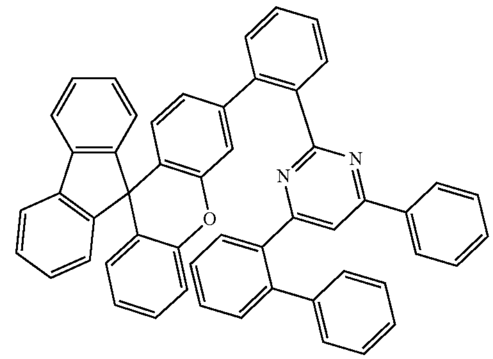
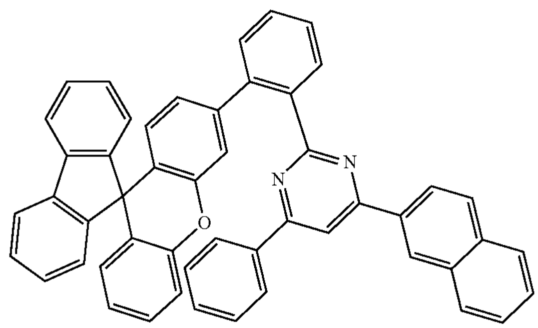
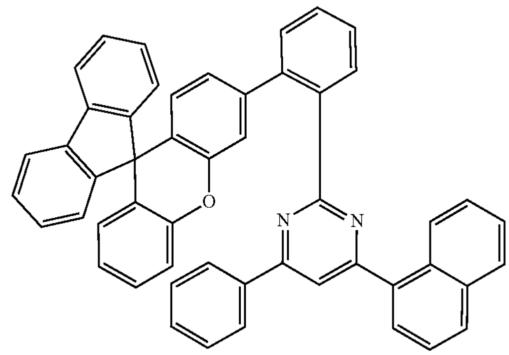
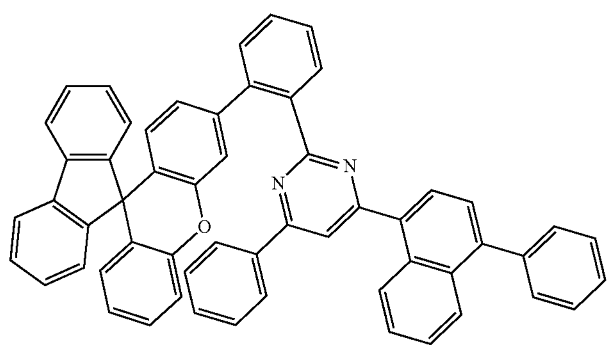
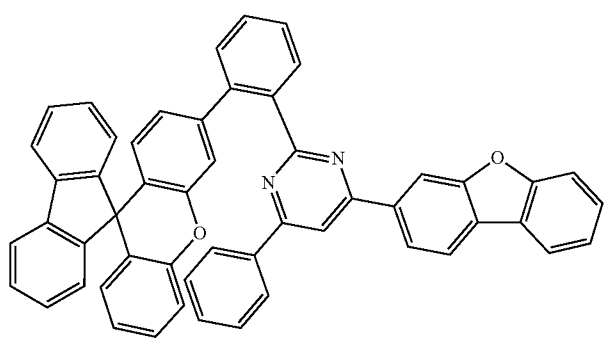
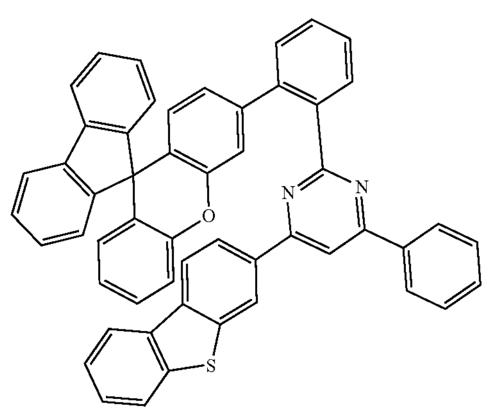

-continued
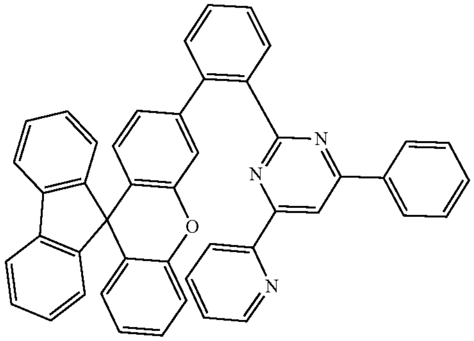
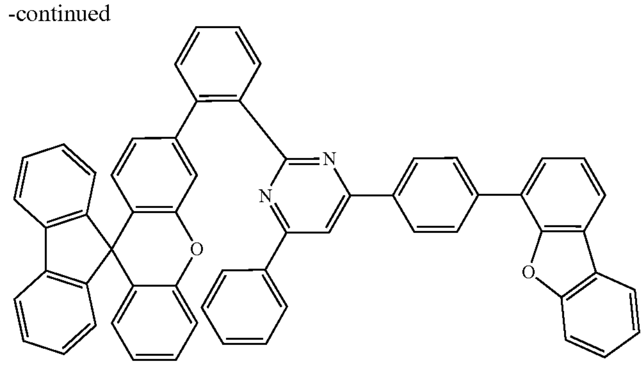
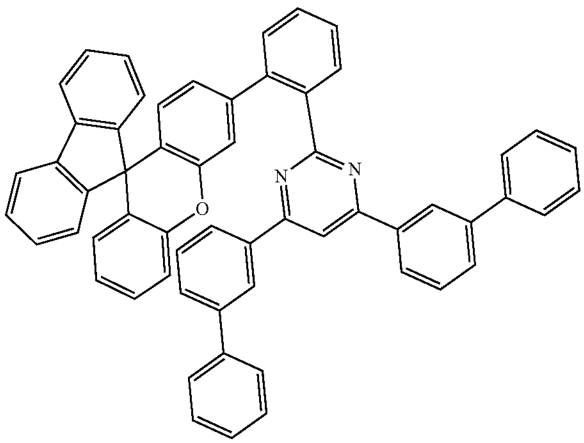
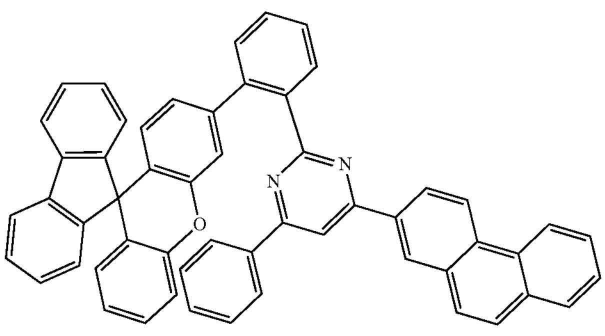
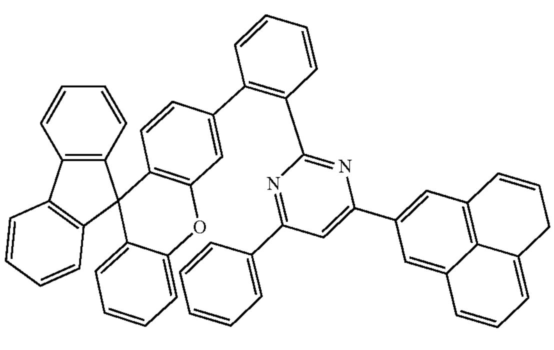
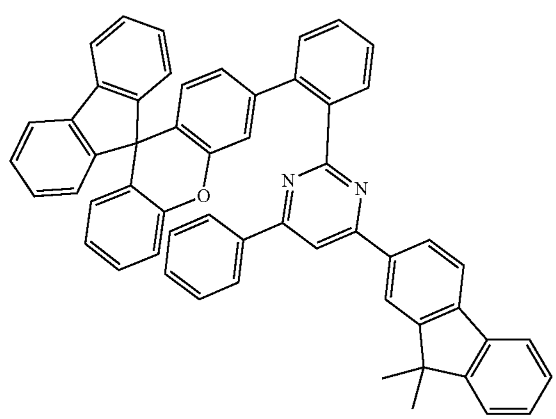

-continued
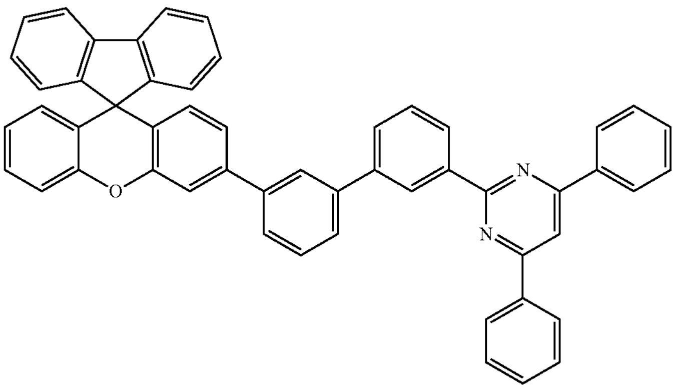
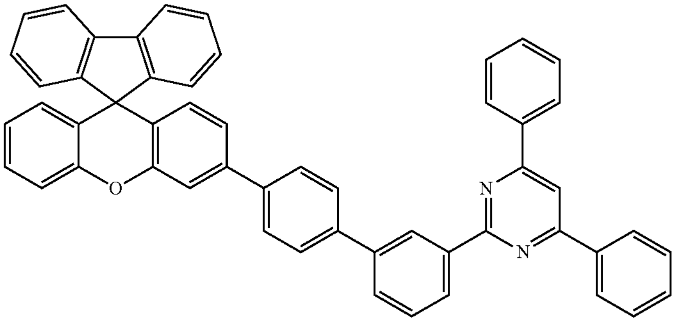
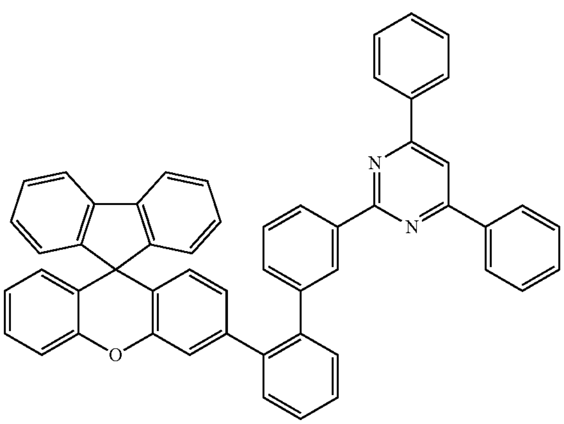
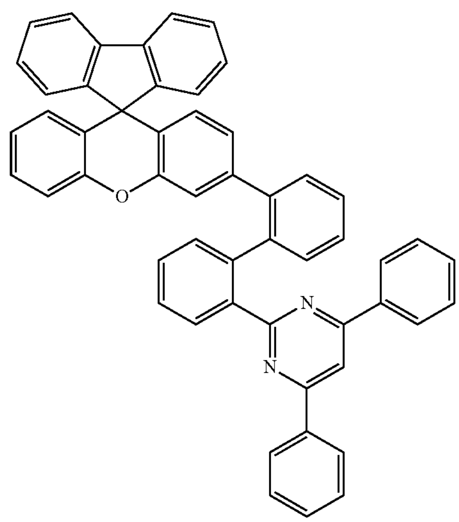

-continued
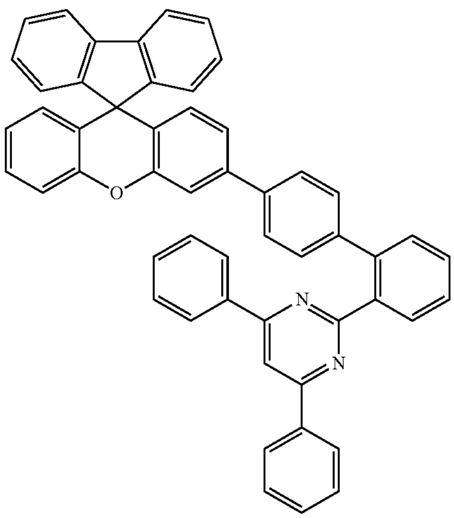
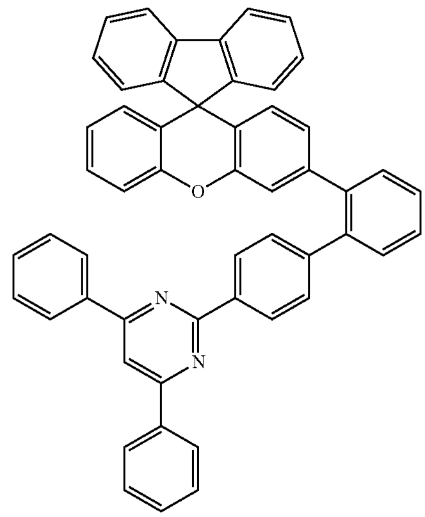
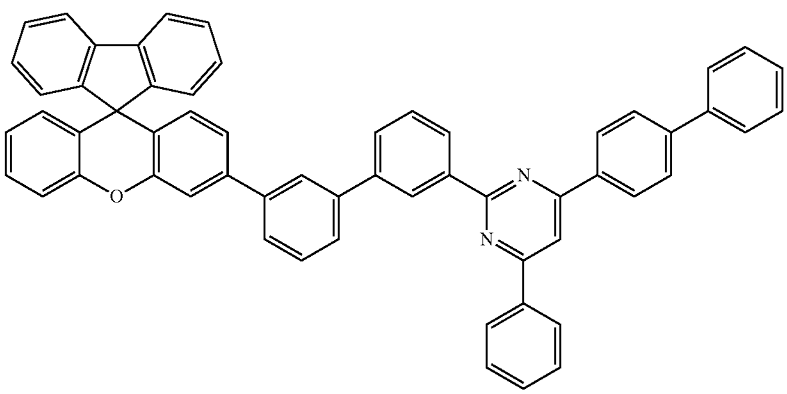
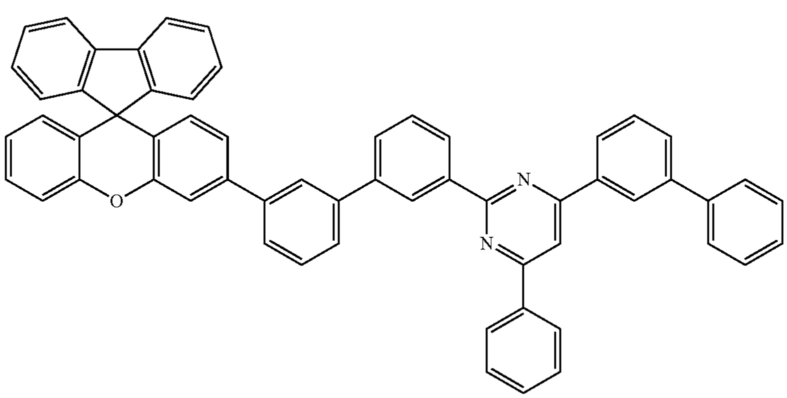

-continued
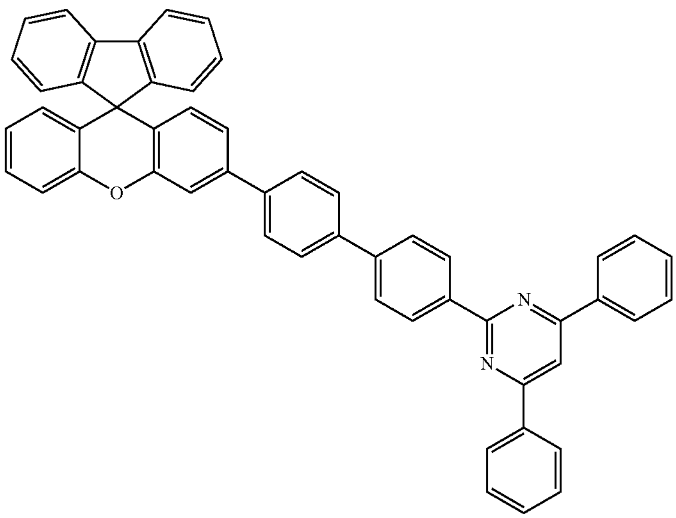
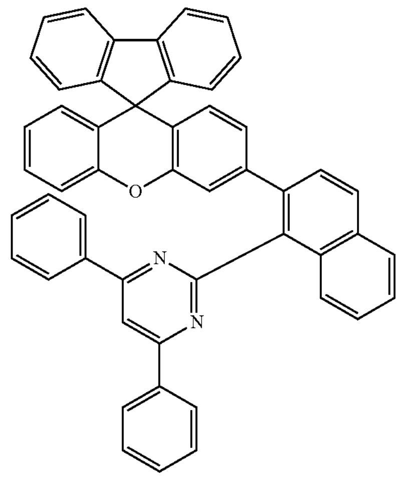
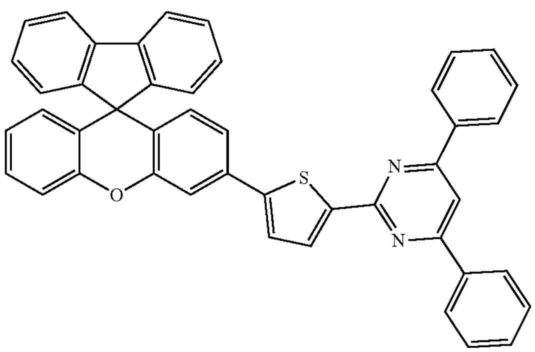
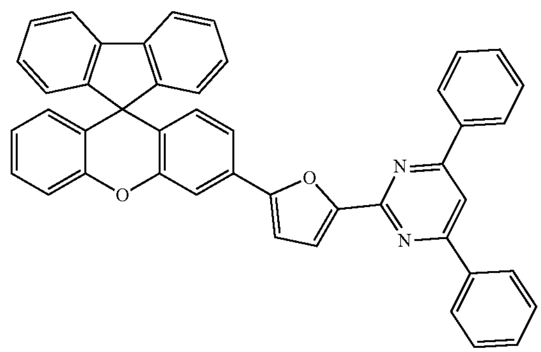
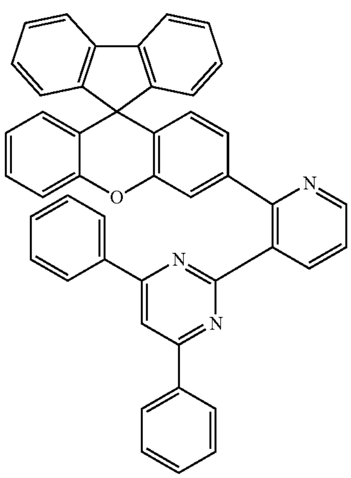
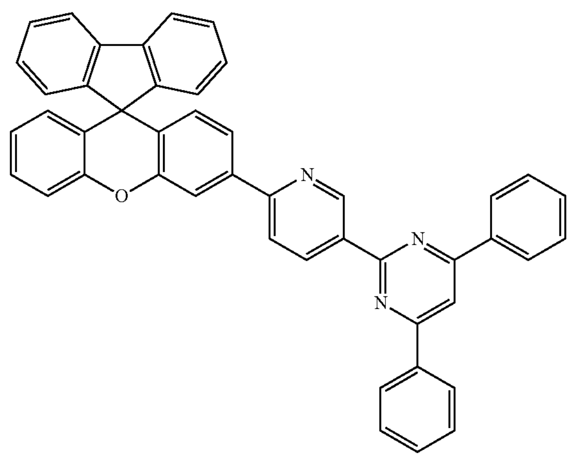
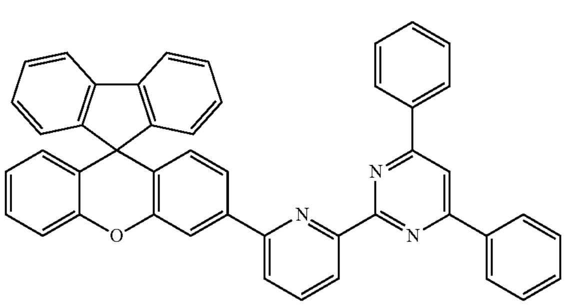

-continued
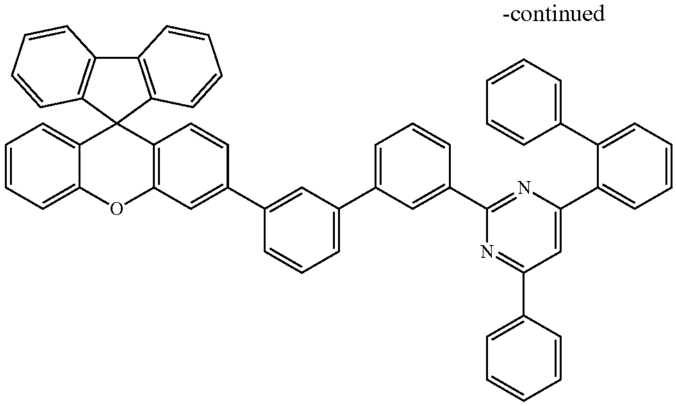
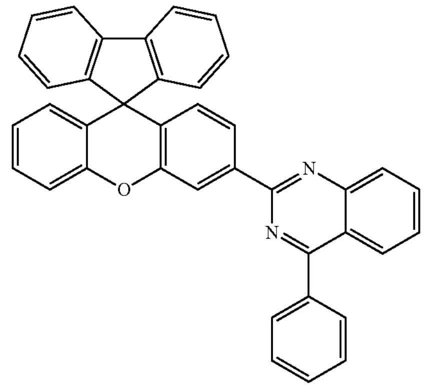
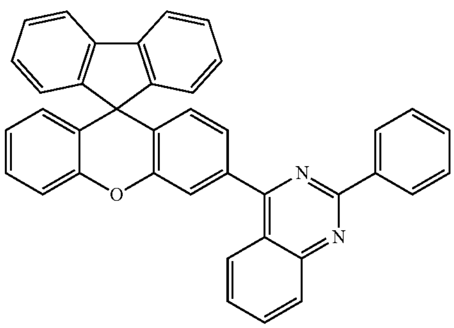
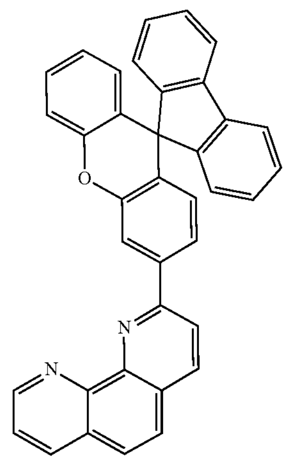
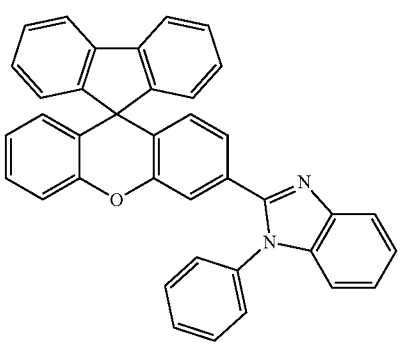
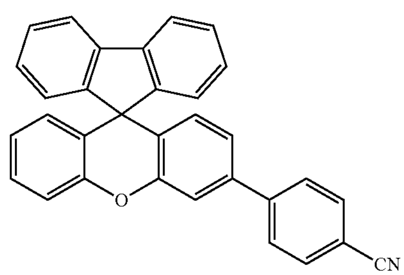
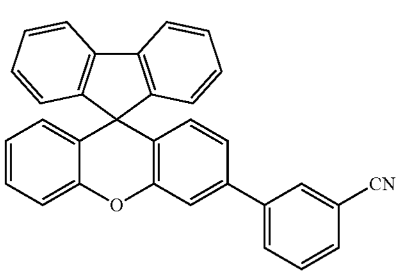
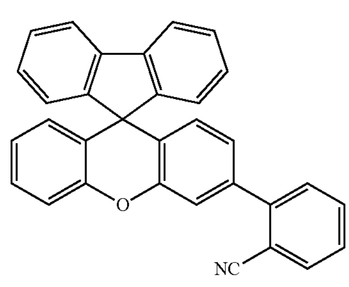

-continued
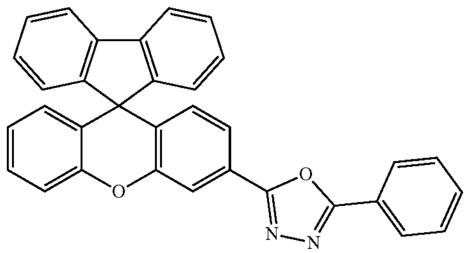
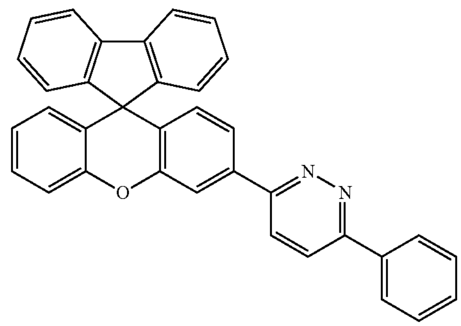
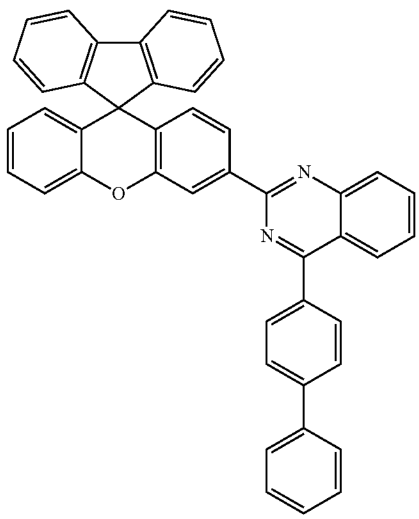
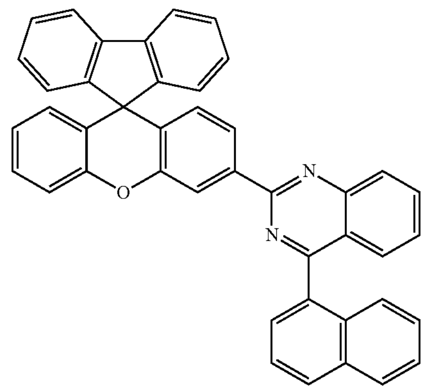
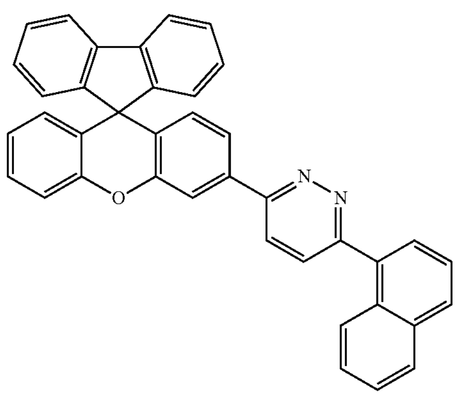
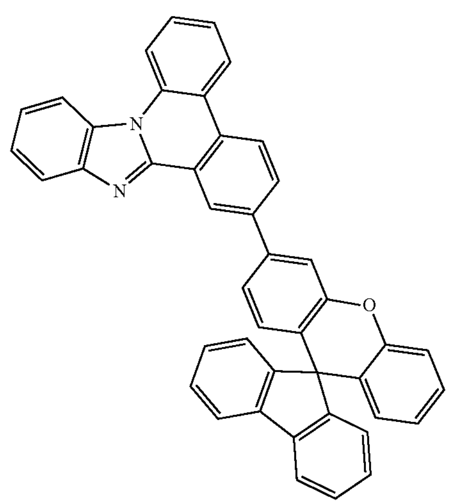

-continued
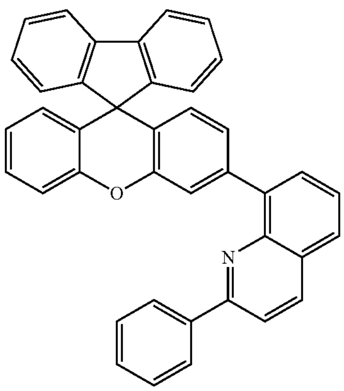
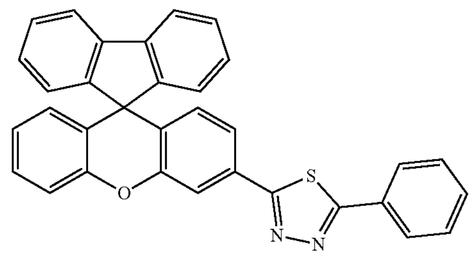
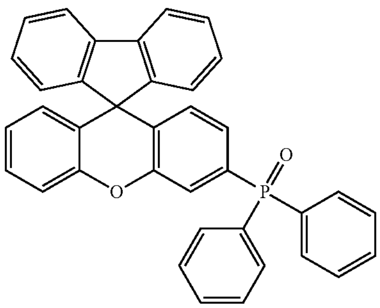
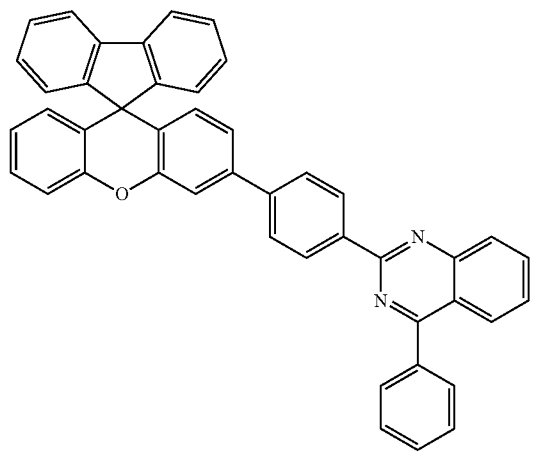
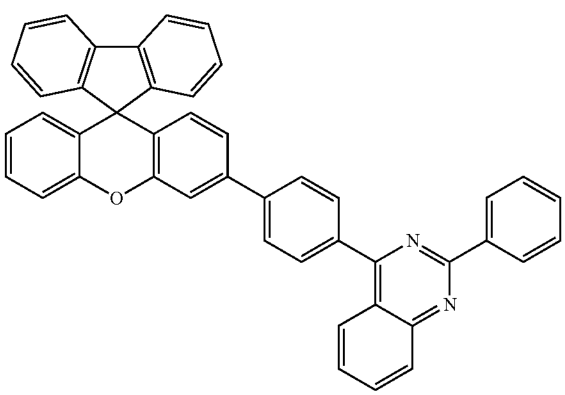
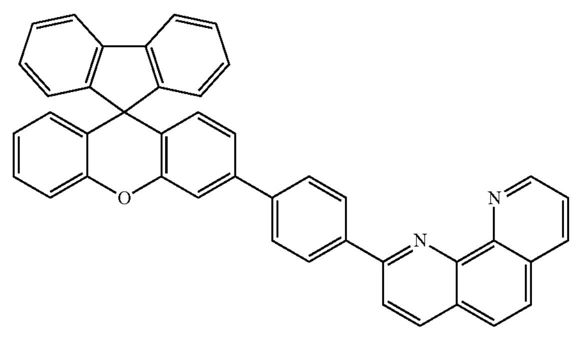
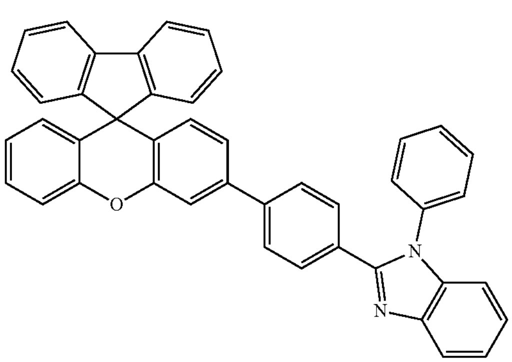
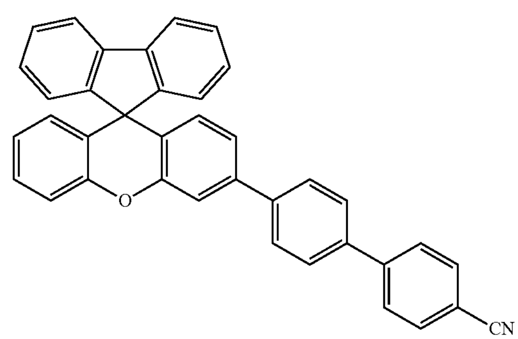

-continued
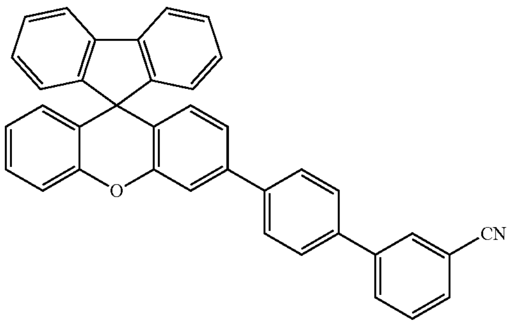
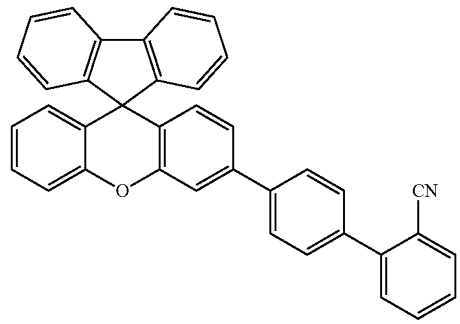
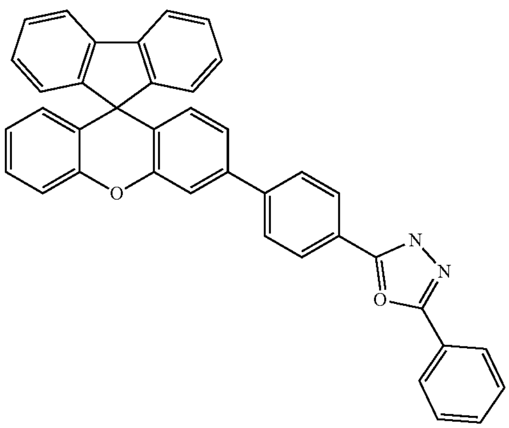
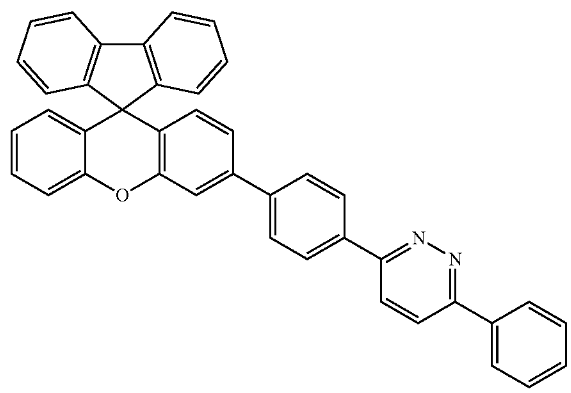
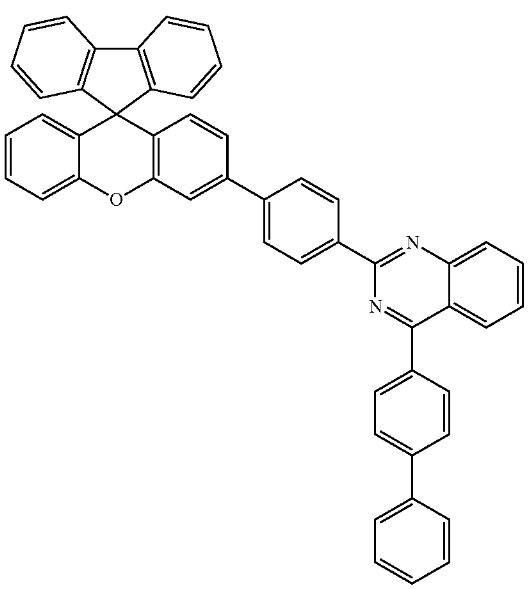
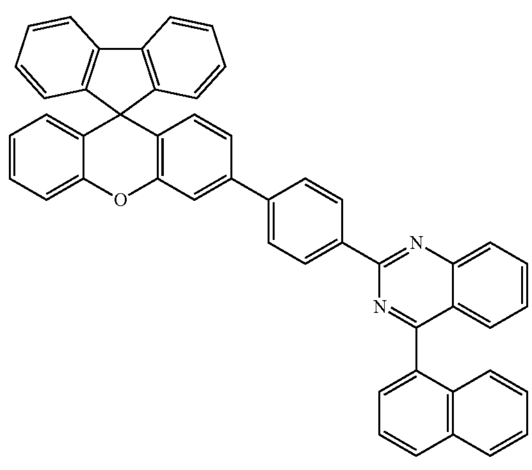

-continued
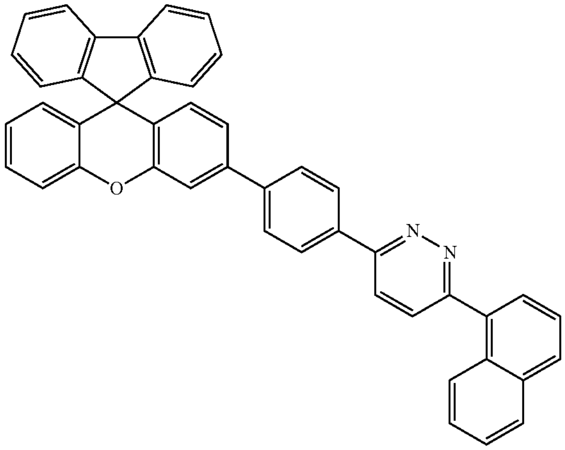
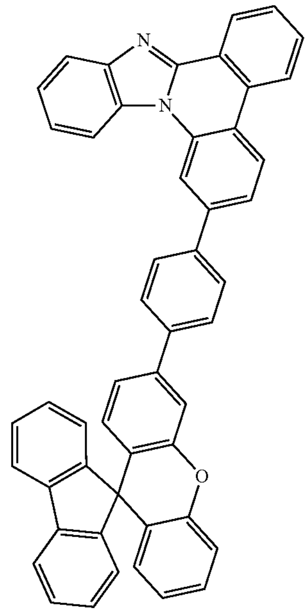
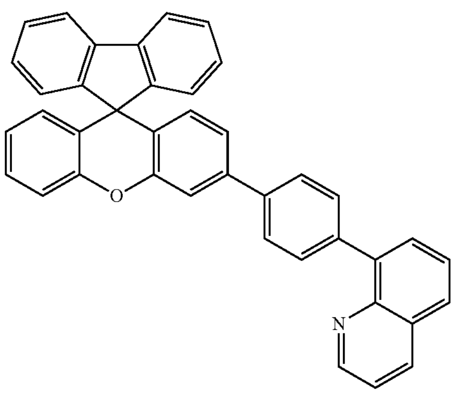
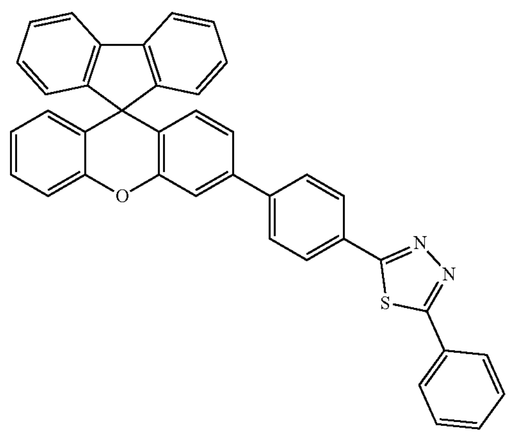
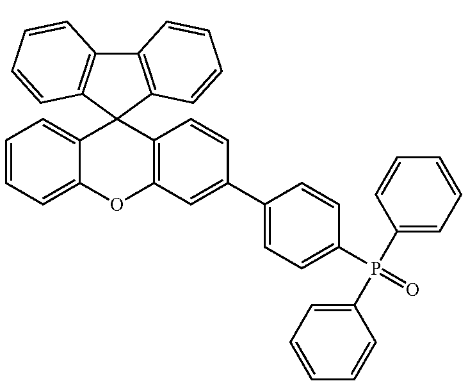
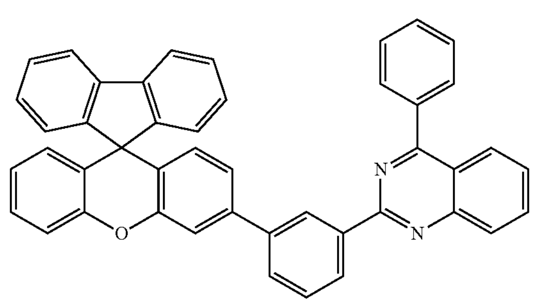

-continued
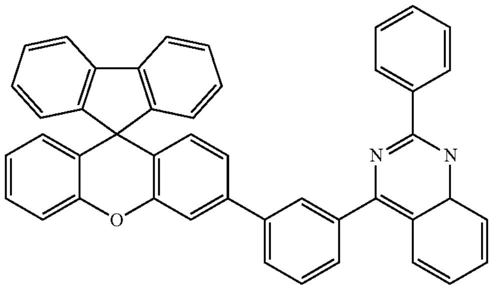
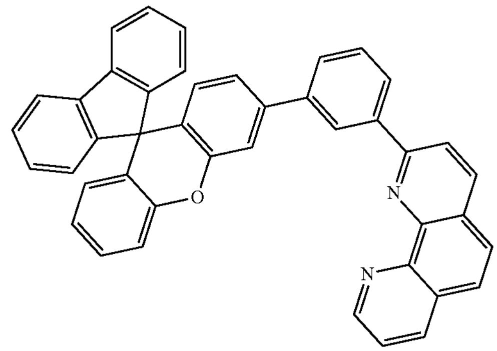
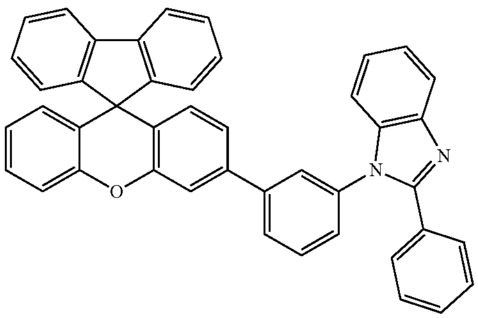
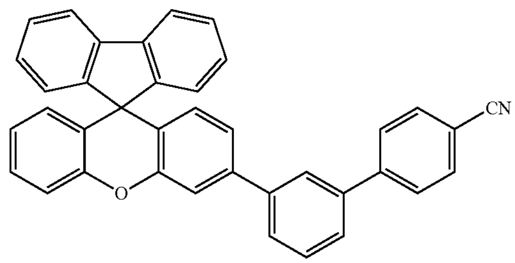
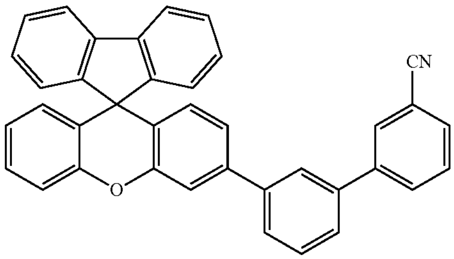
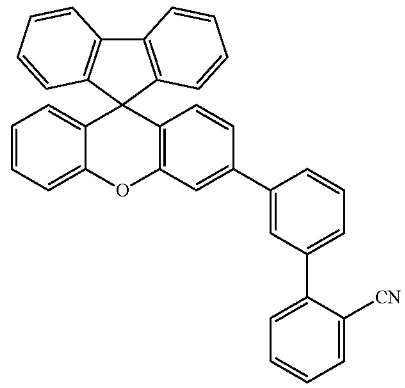
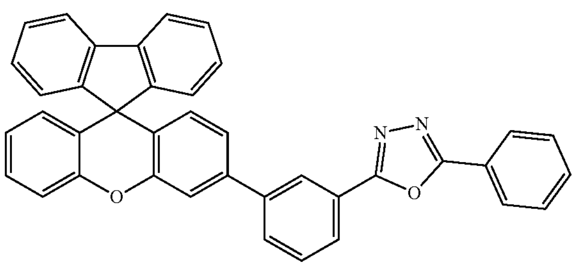
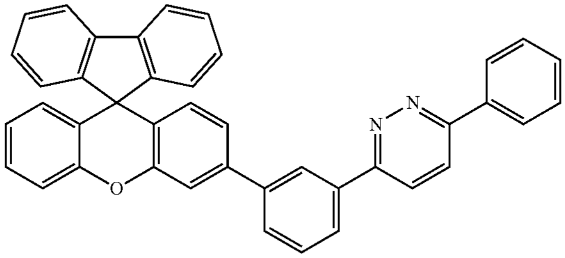
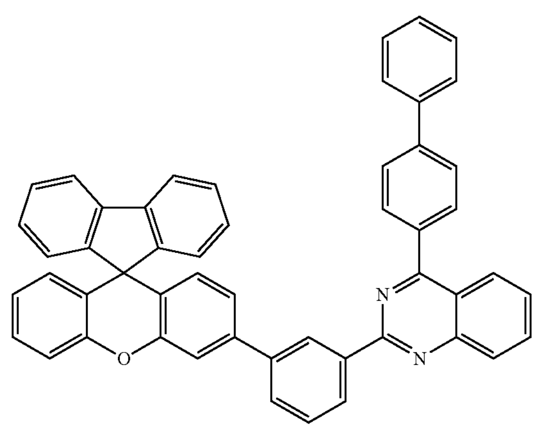

-continued
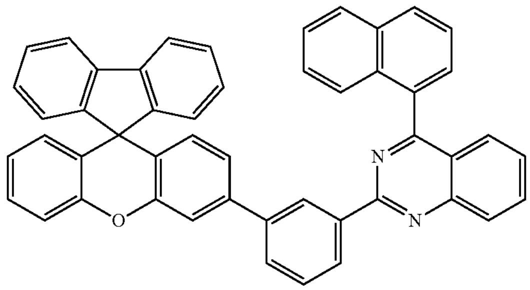
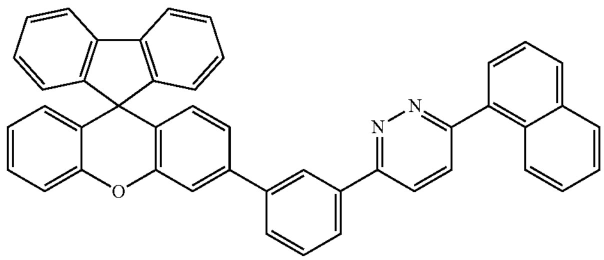
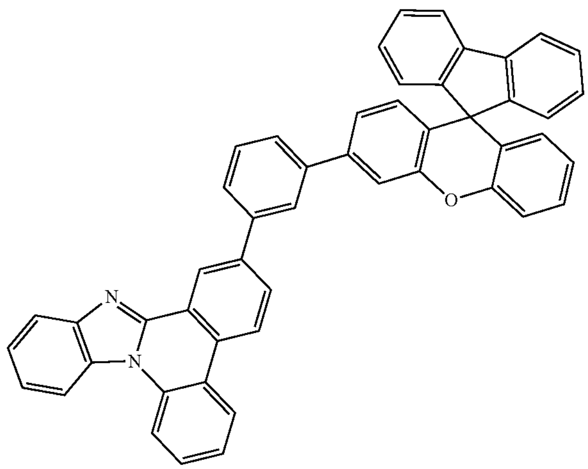
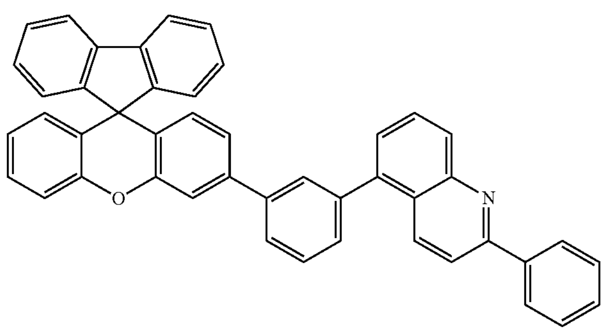
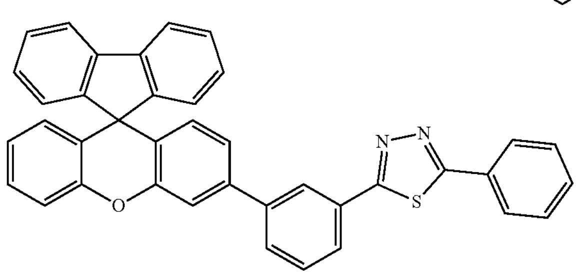
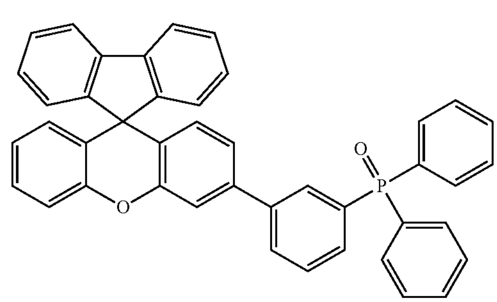

-continued
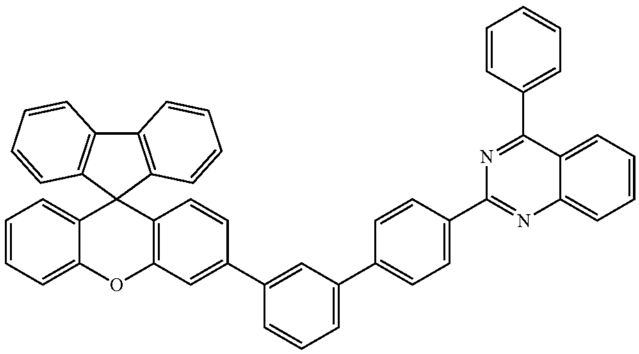
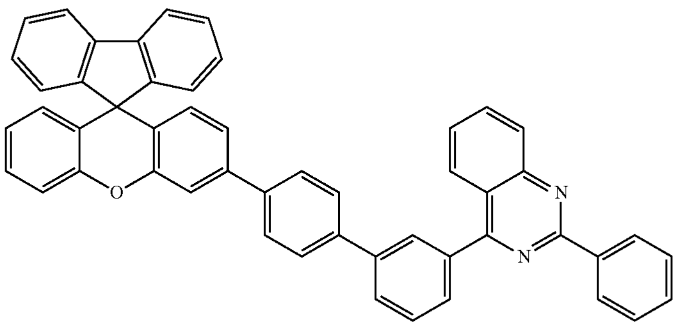
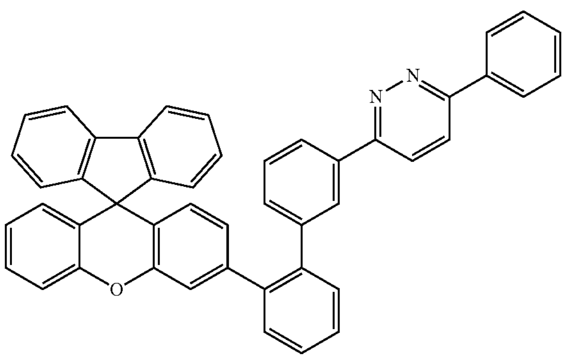
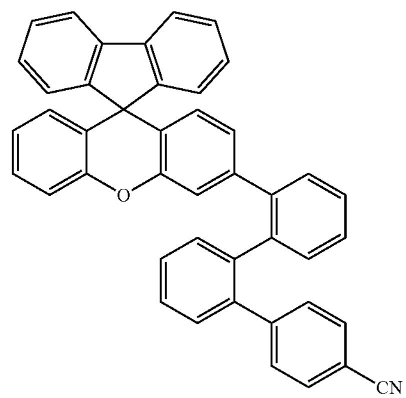
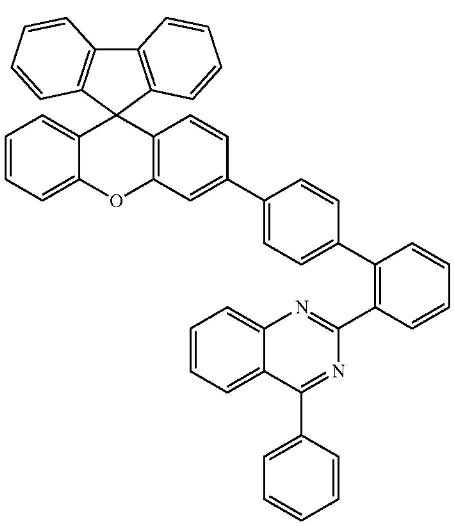
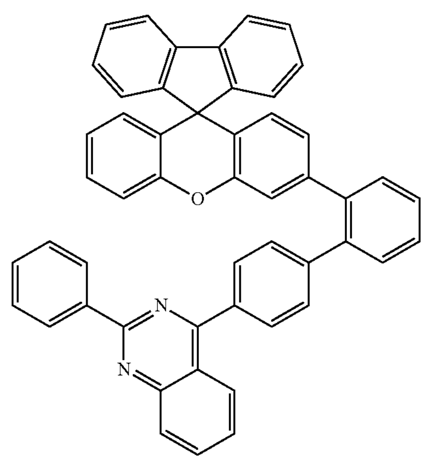

-continued
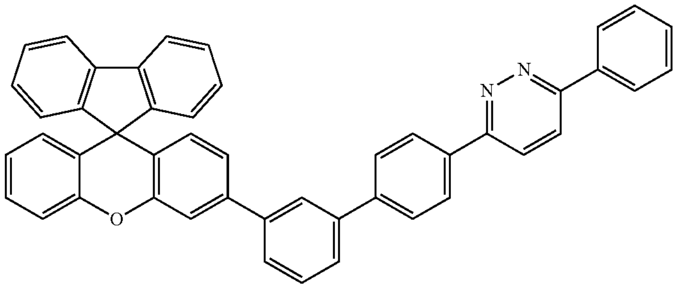
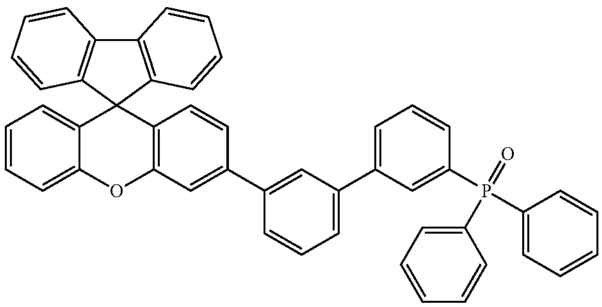
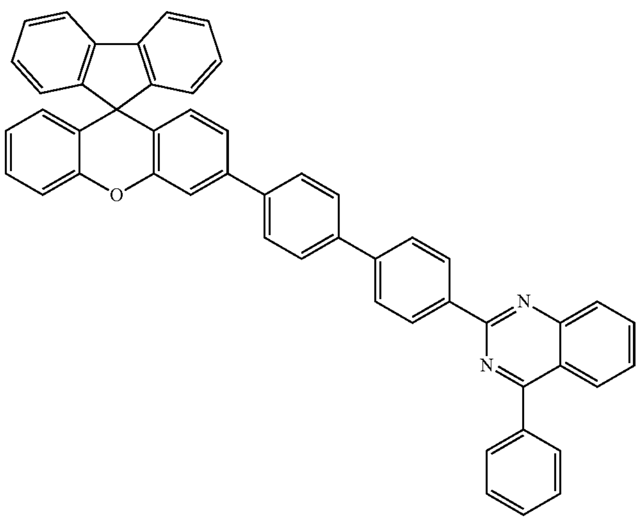
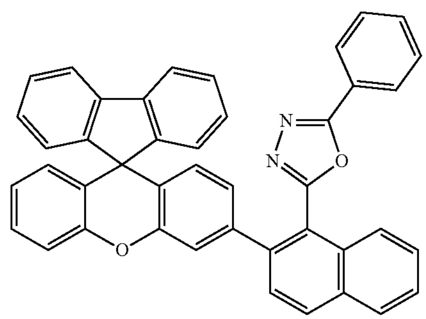
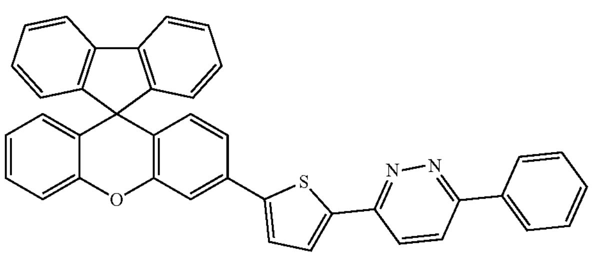
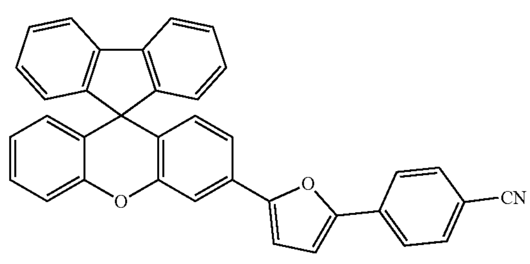

-continued
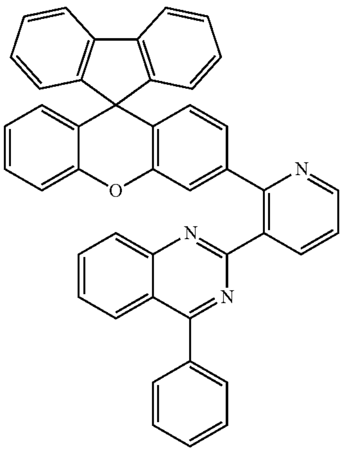
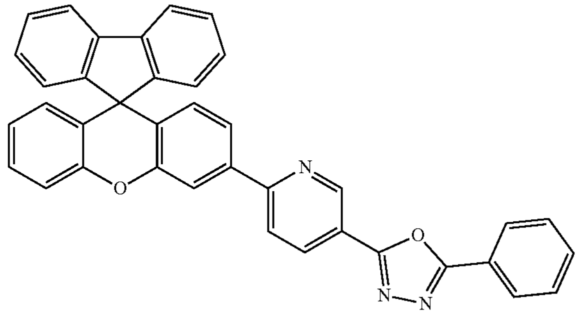
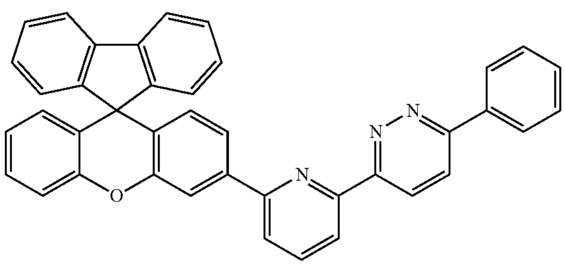
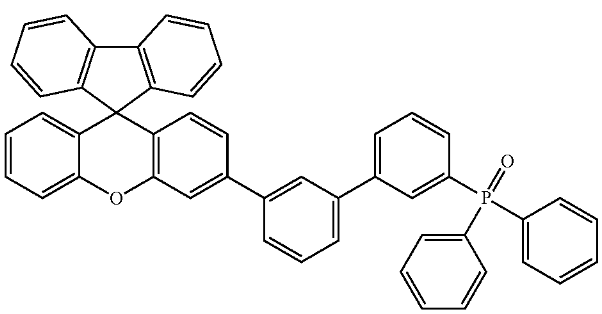
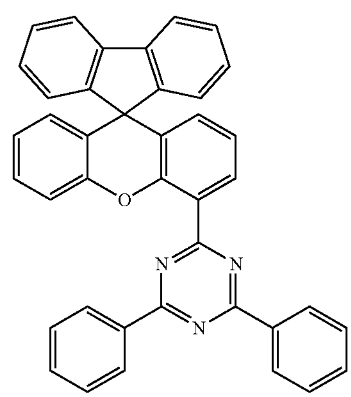
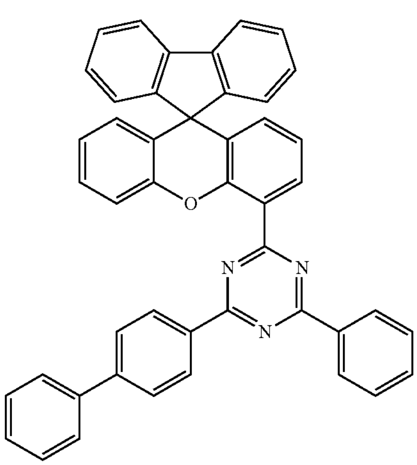
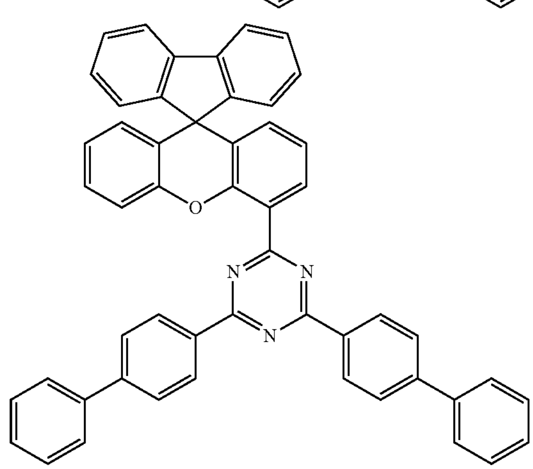

-continued
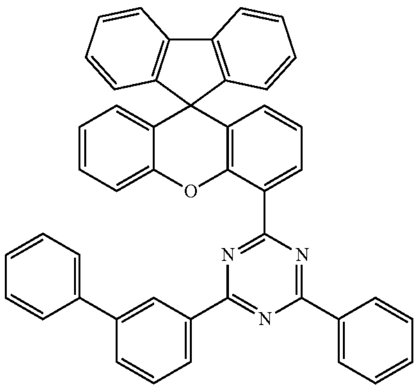
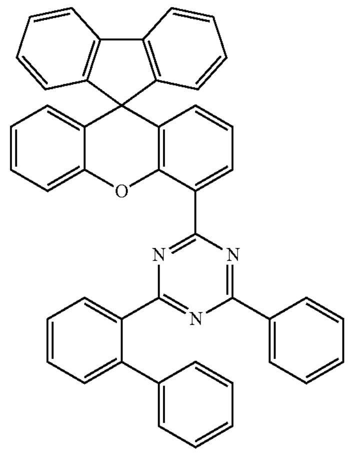
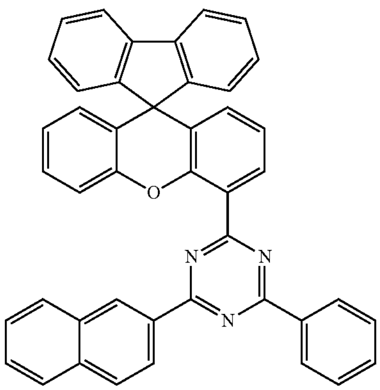
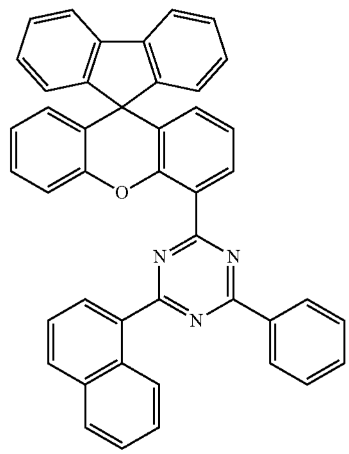
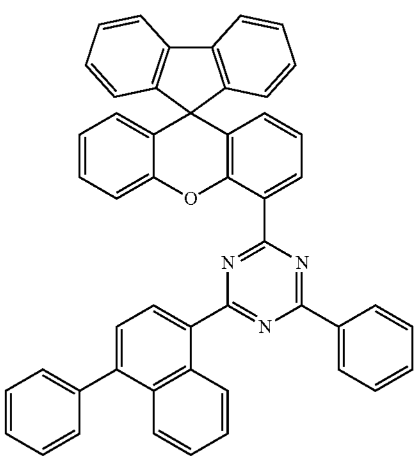
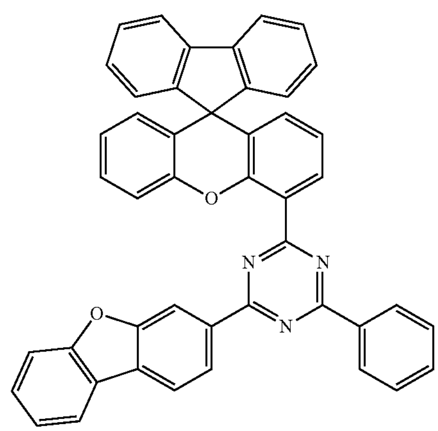

-continued
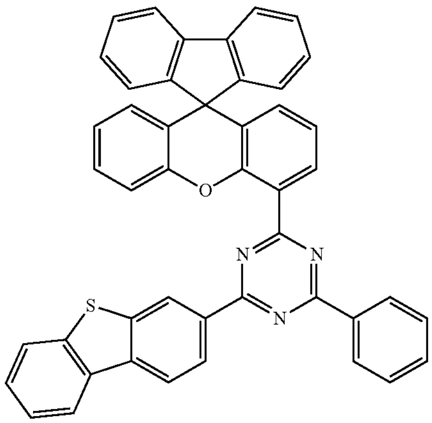
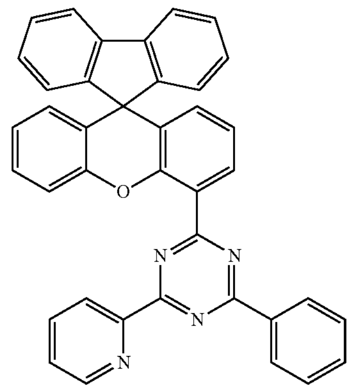
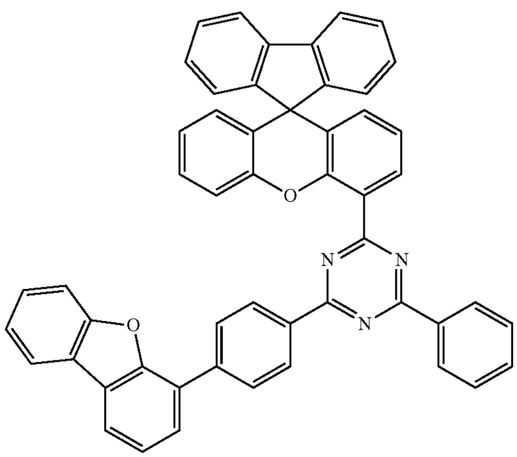
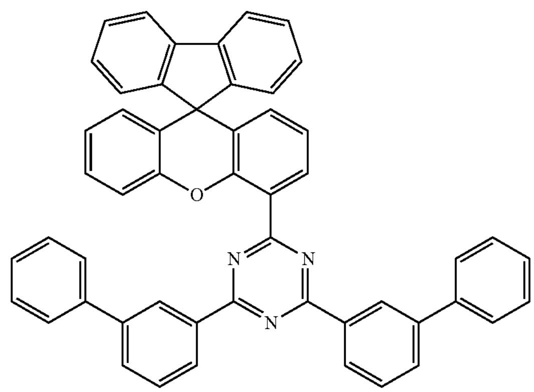
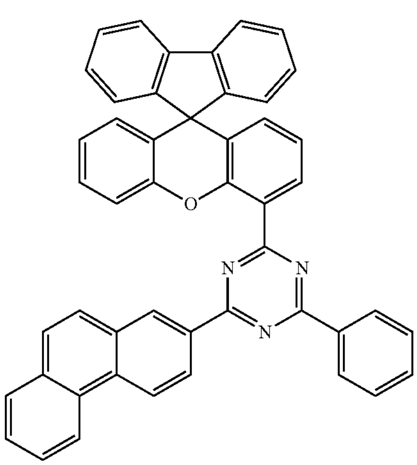
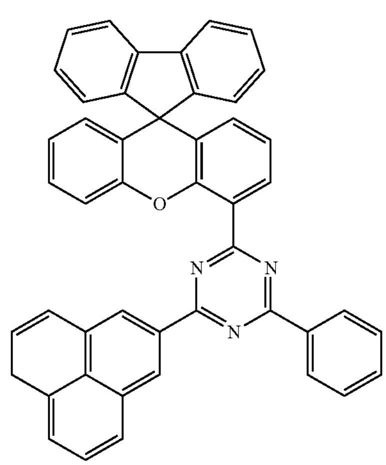

-continued
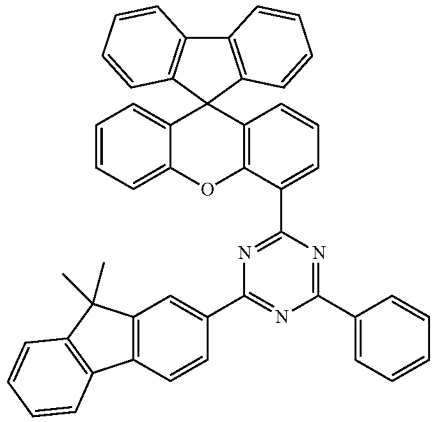
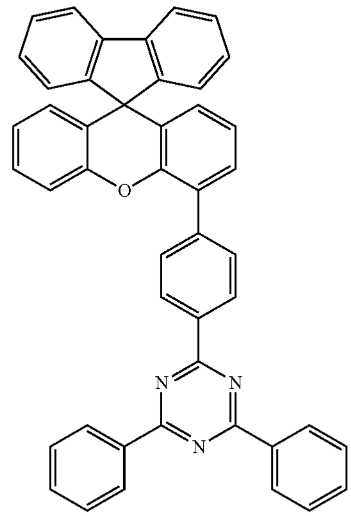
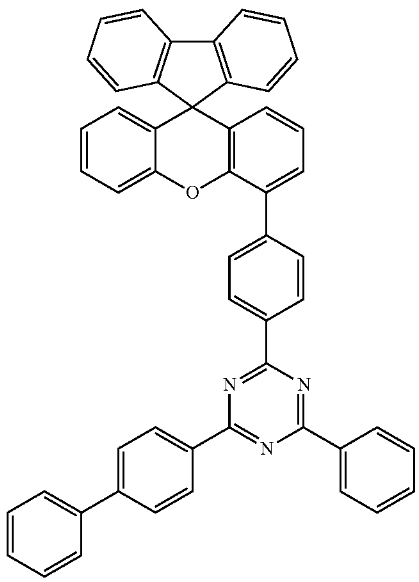
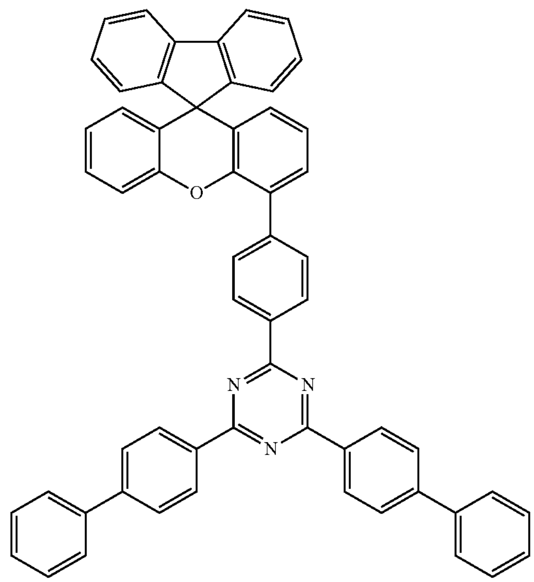
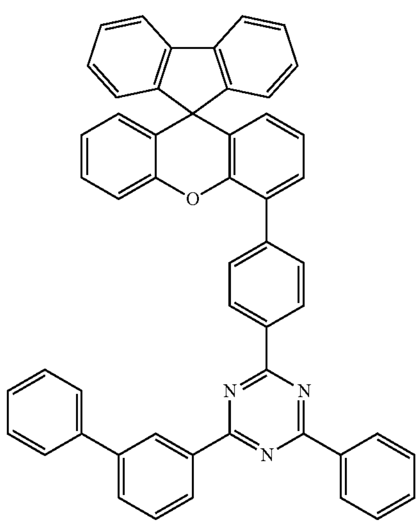
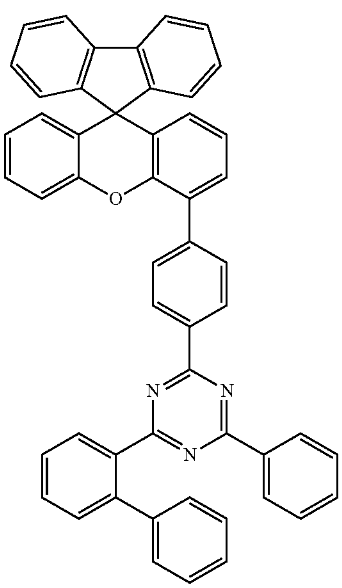

-continued
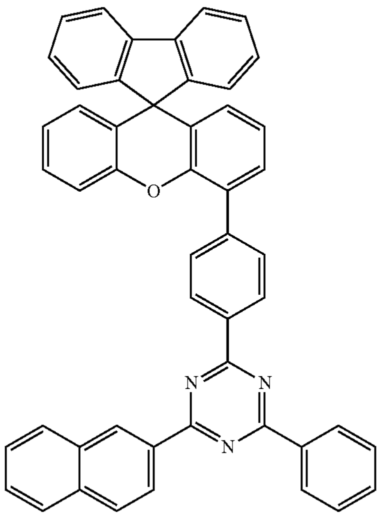
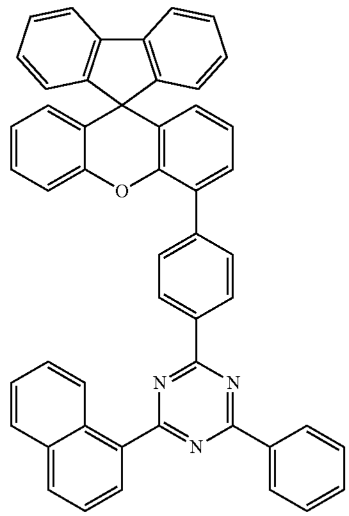
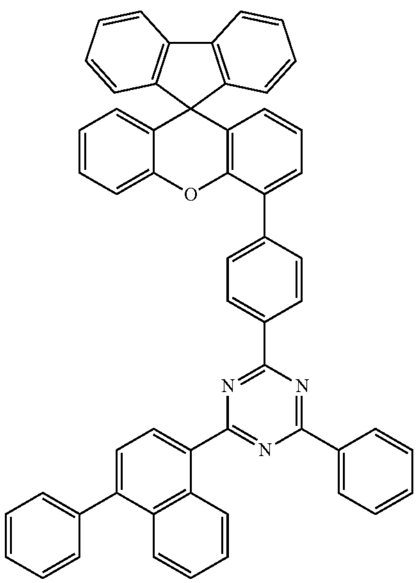
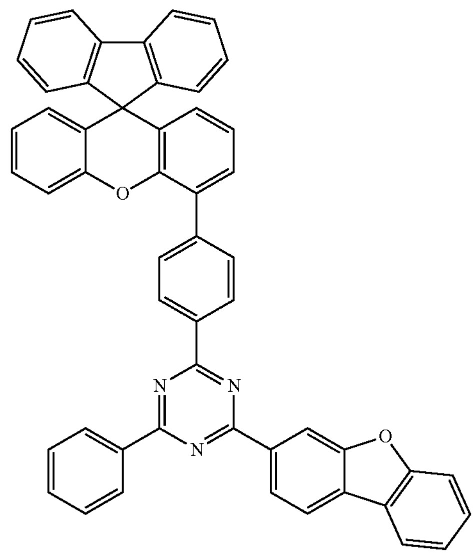
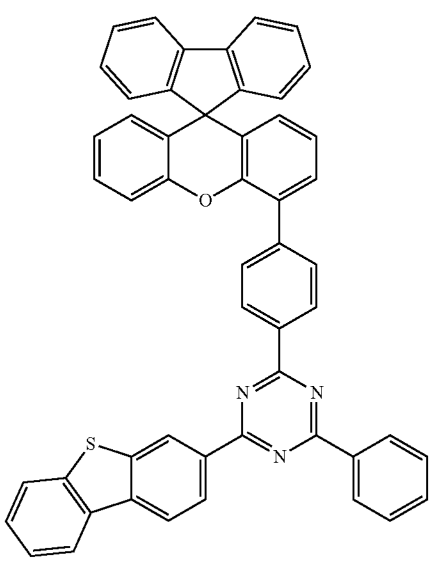
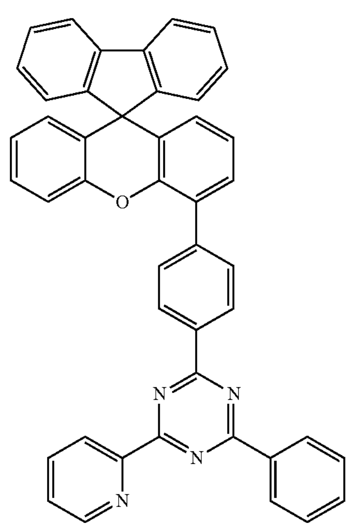

-continued
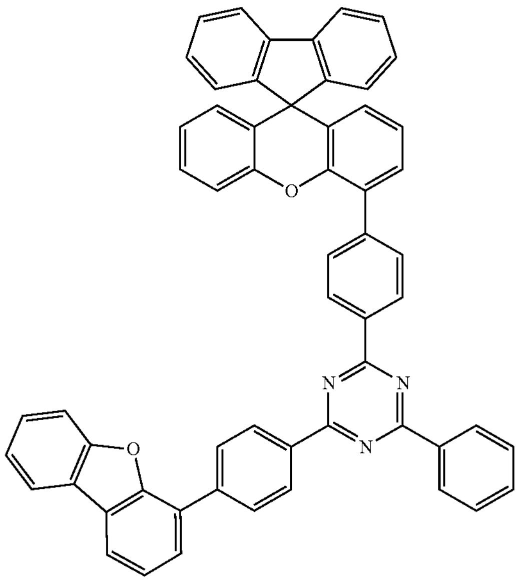
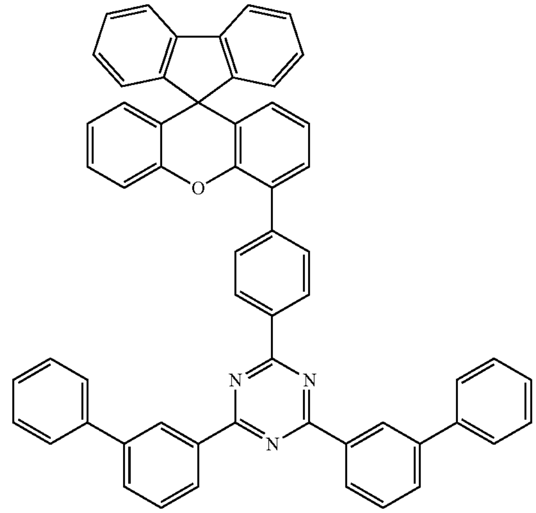
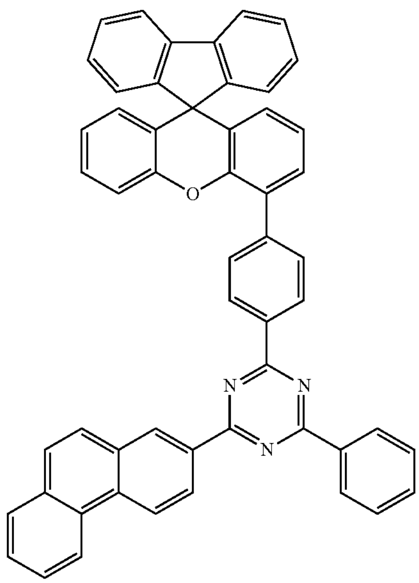
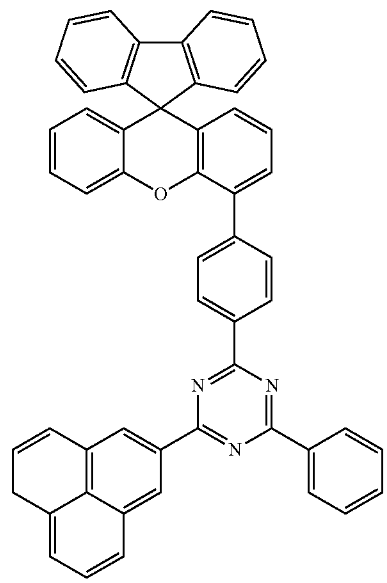
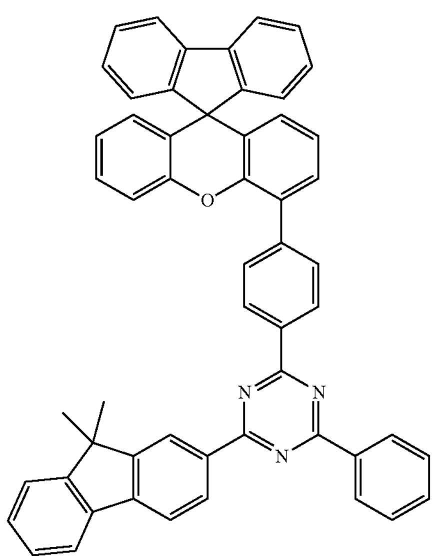
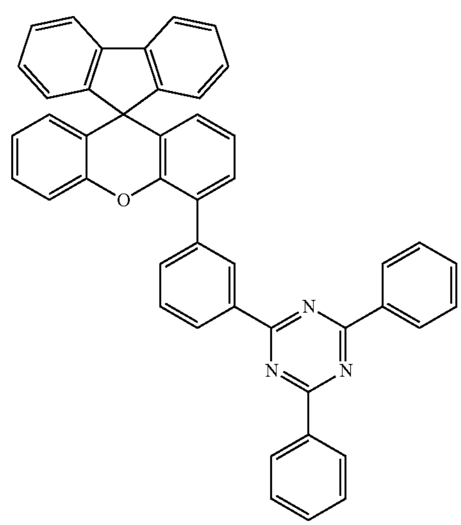

-continued
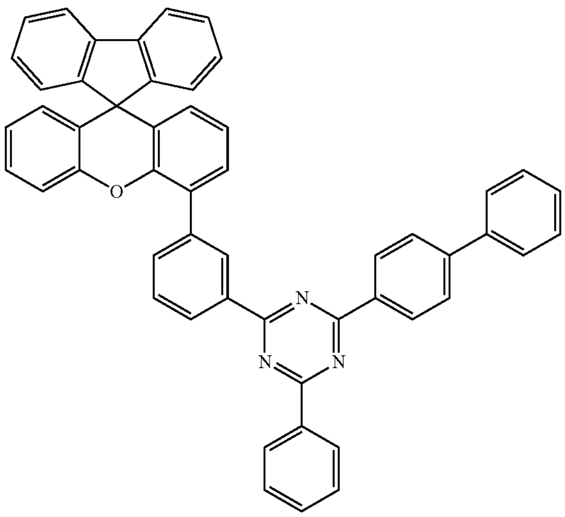
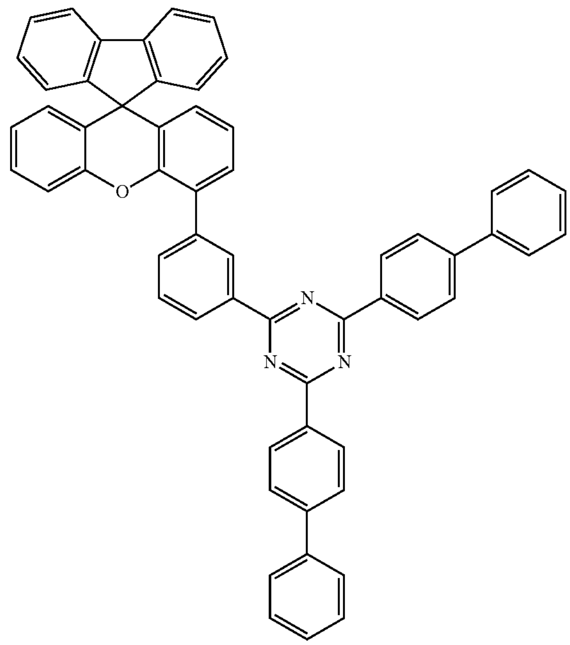
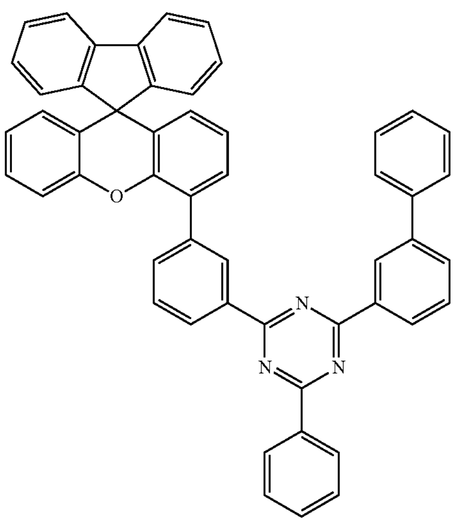
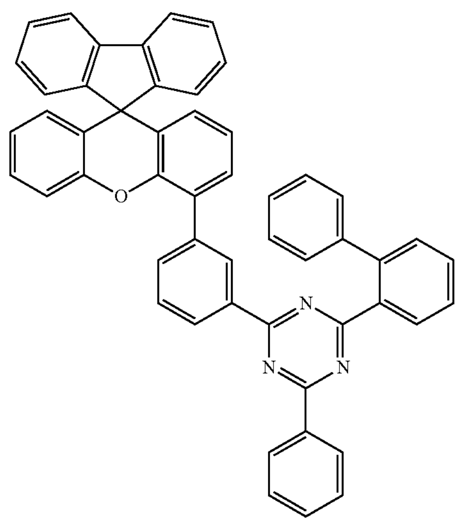
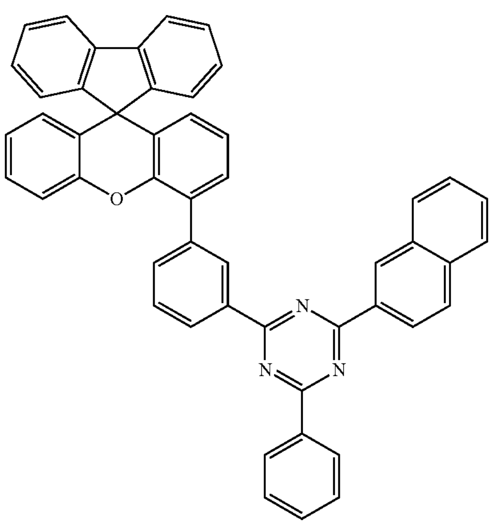
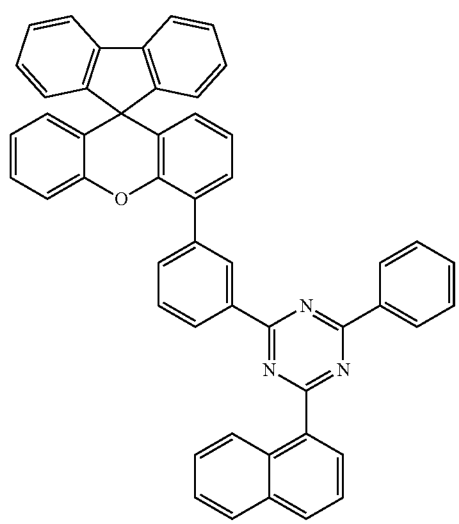

-continued
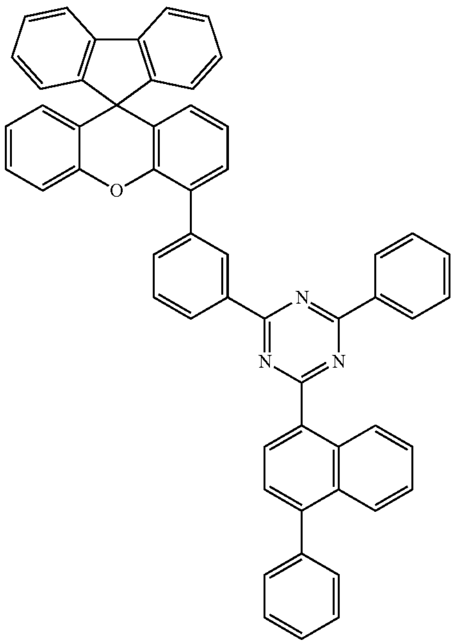
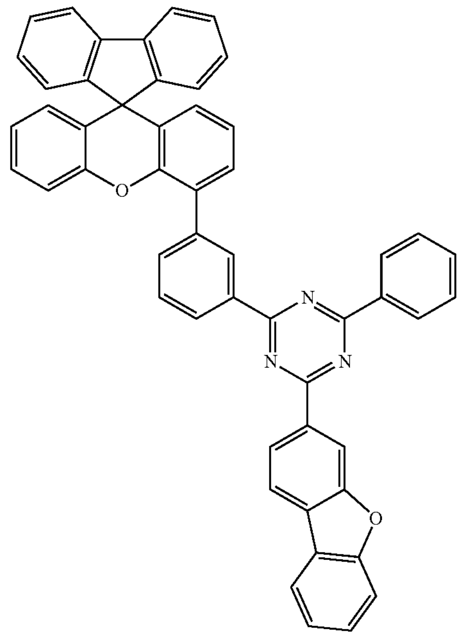
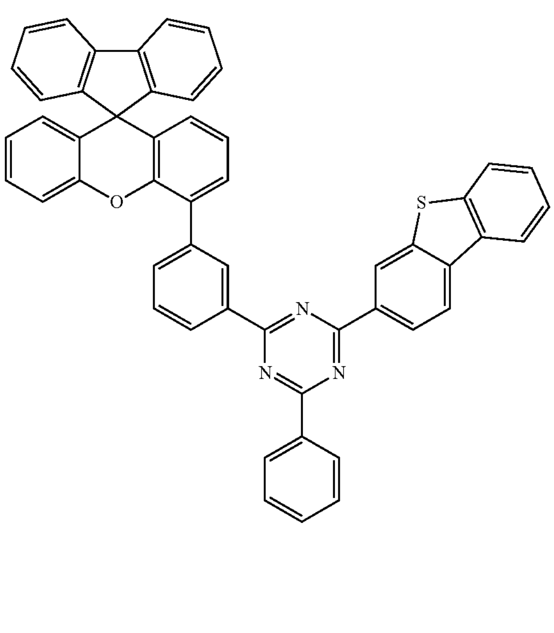
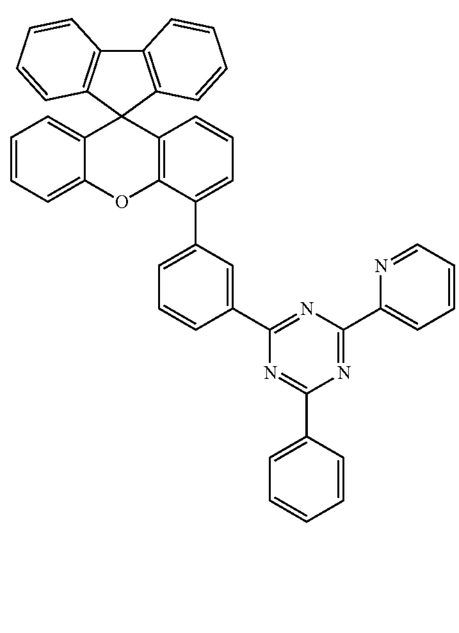

-continued
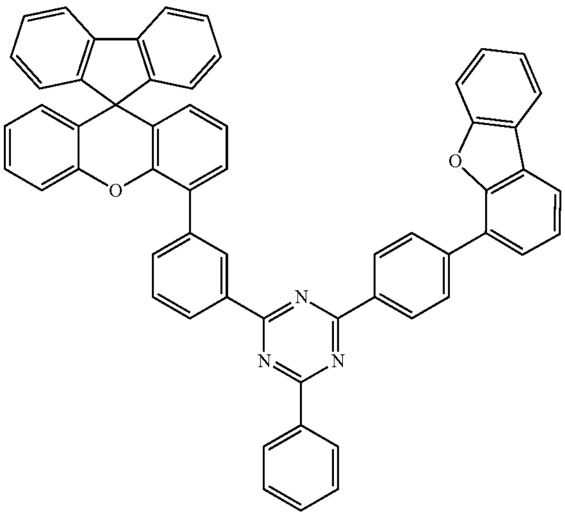
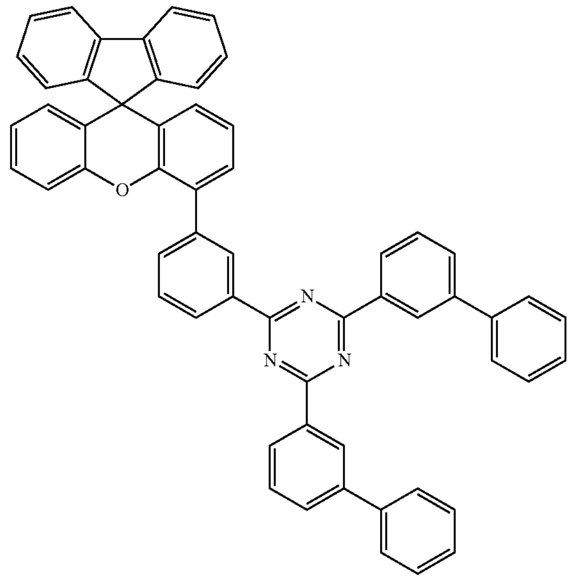
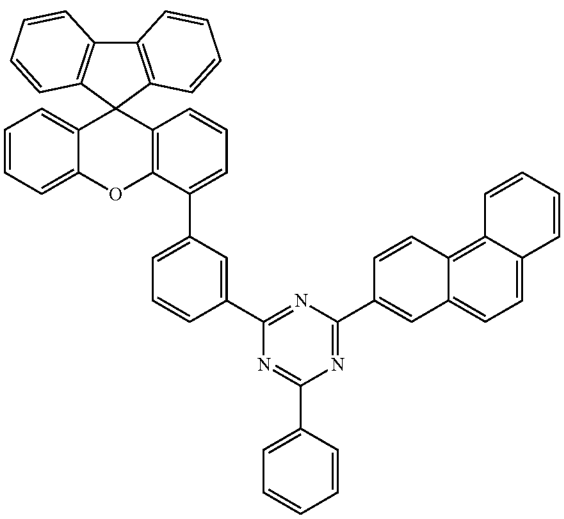
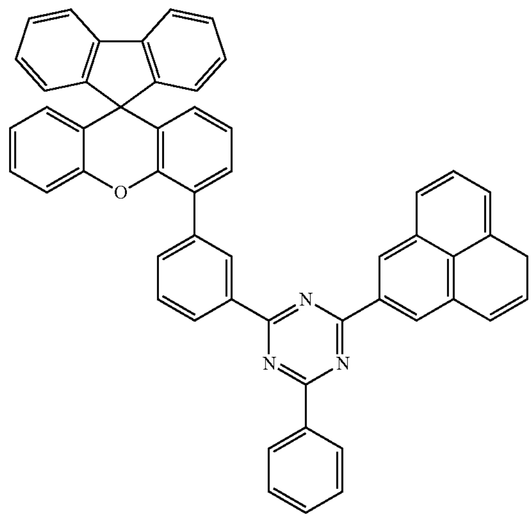
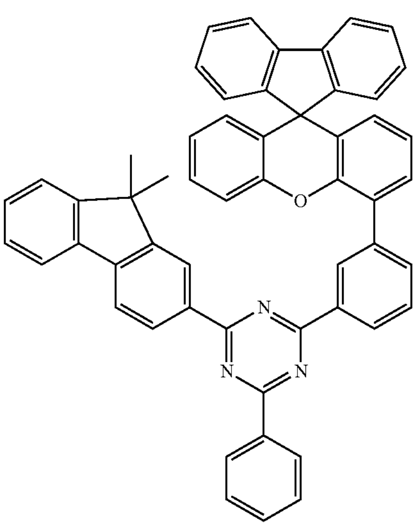
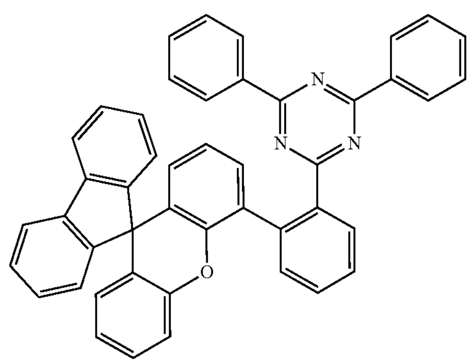

-continued
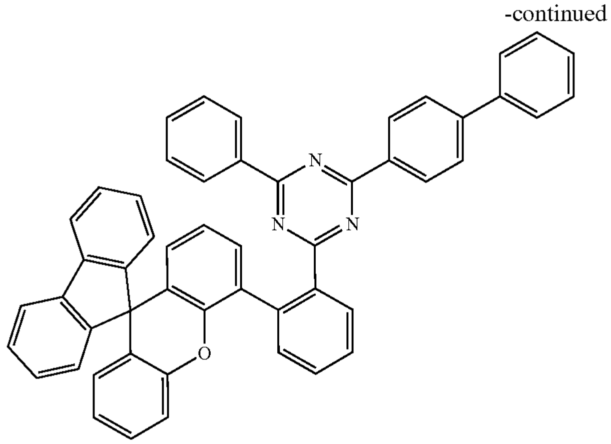
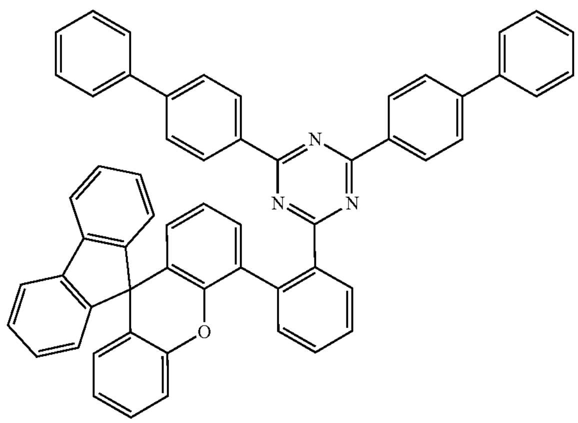
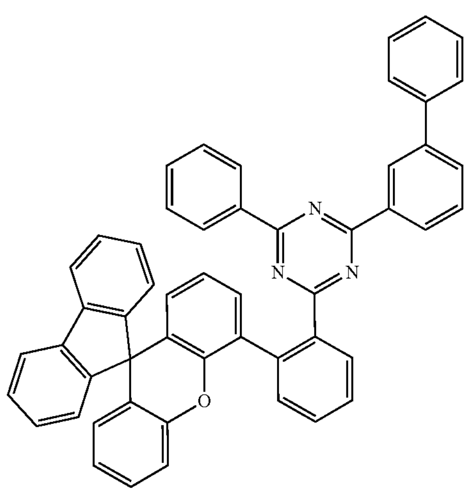
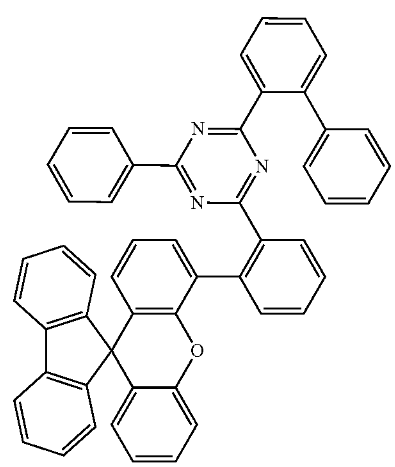

-continued
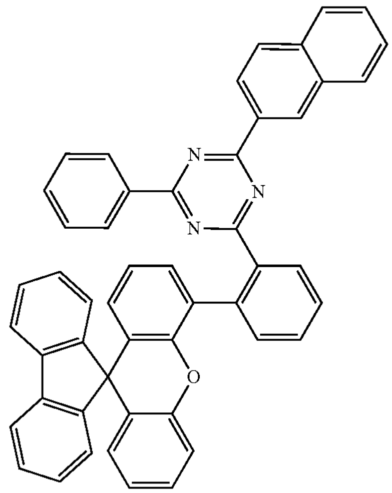
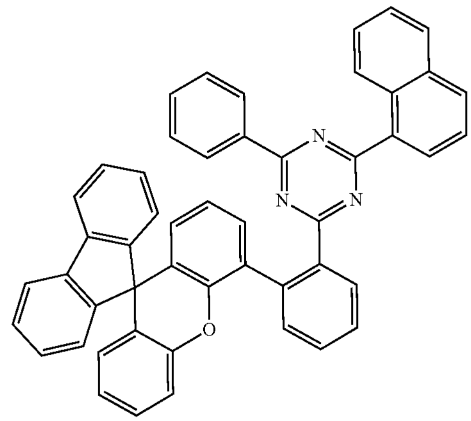
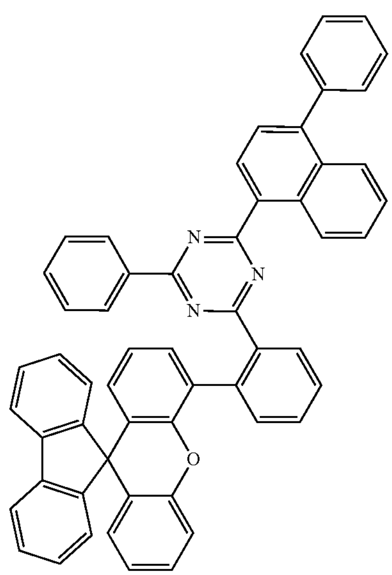
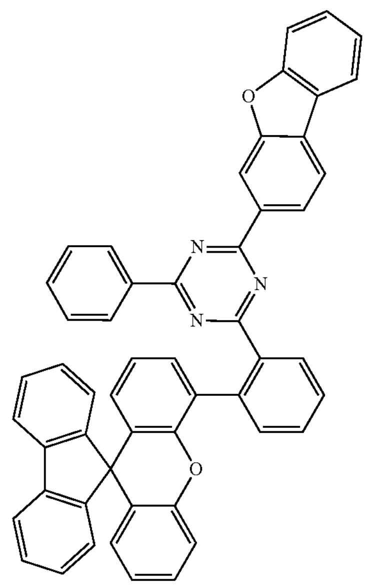
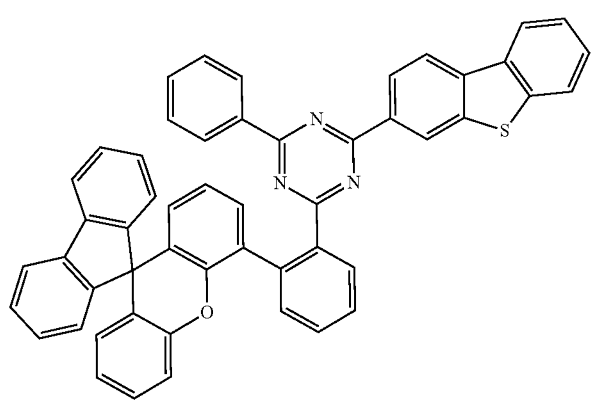
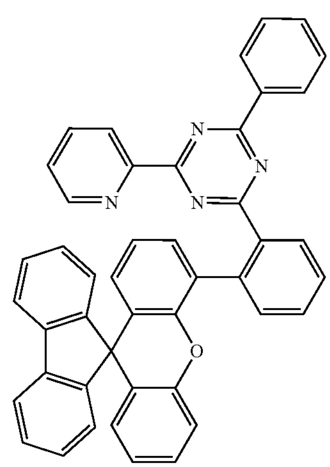

-continued
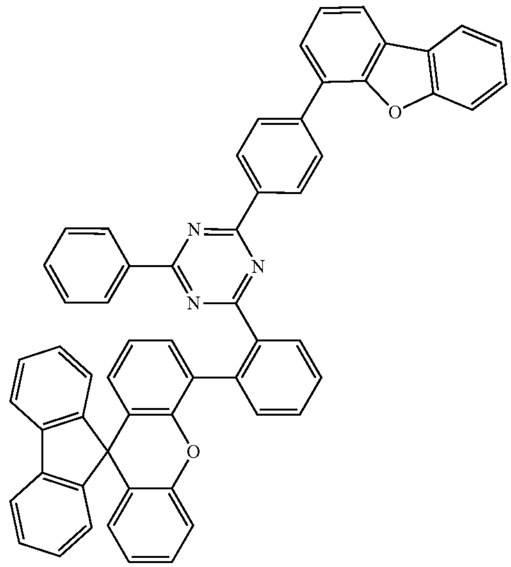
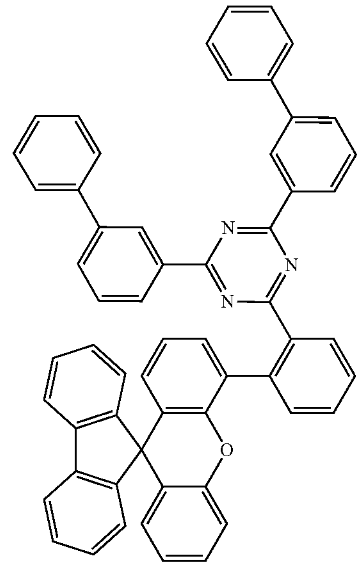
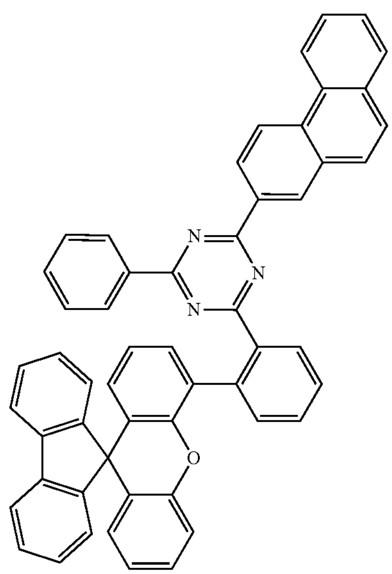
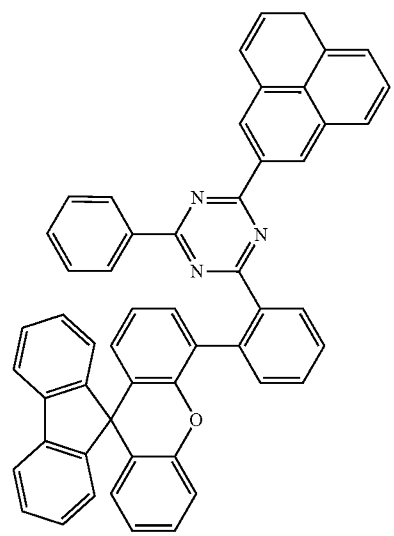
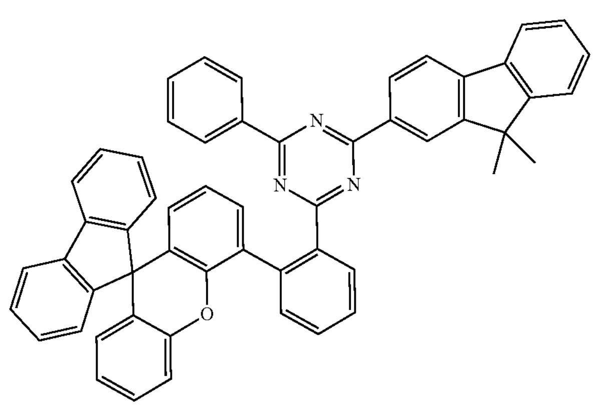

-continued
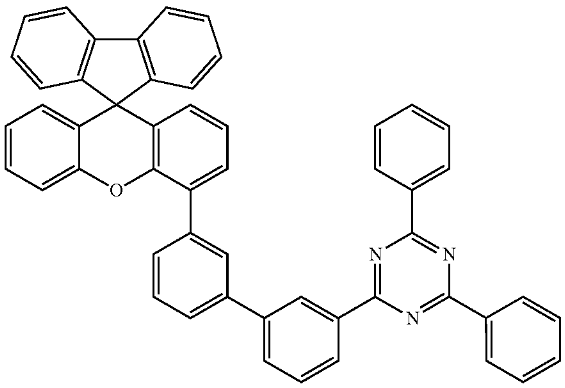
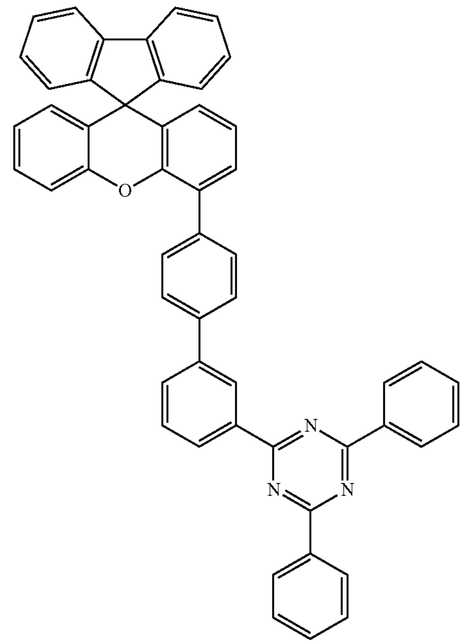
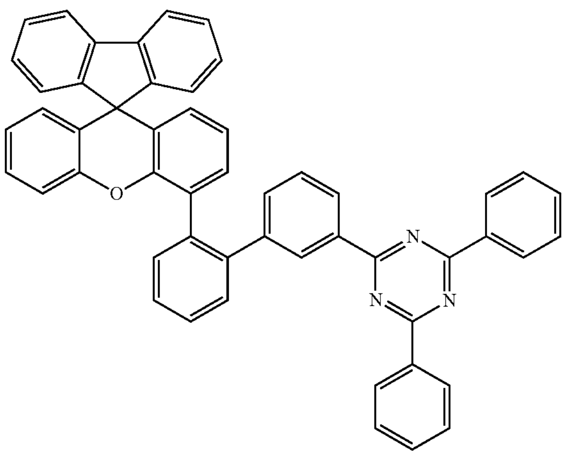
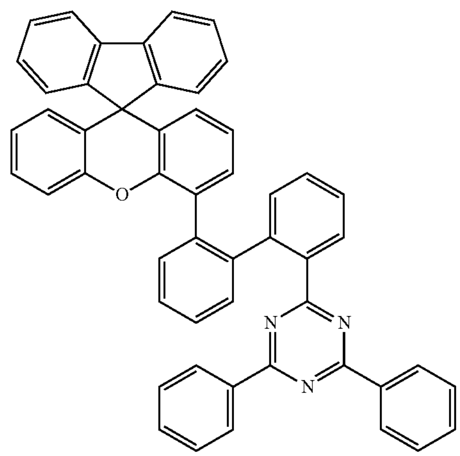
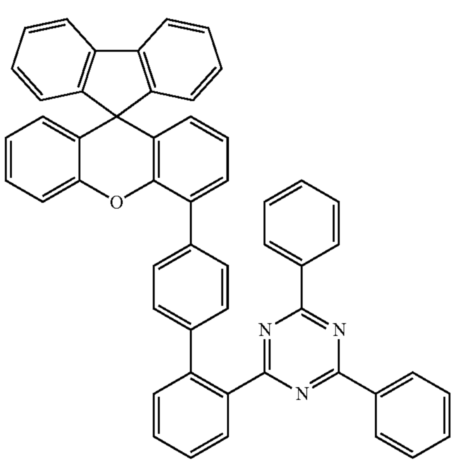
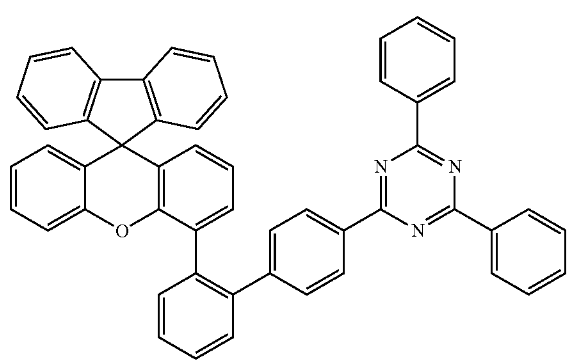

-continued
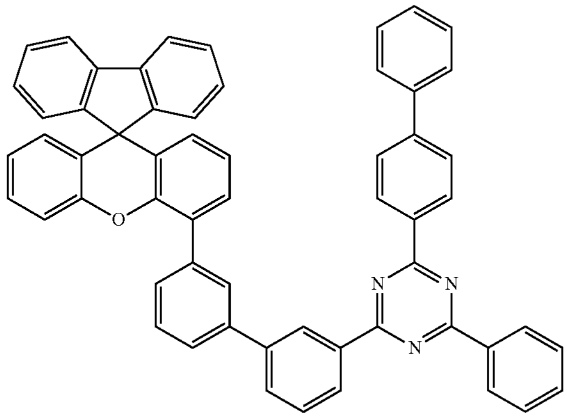
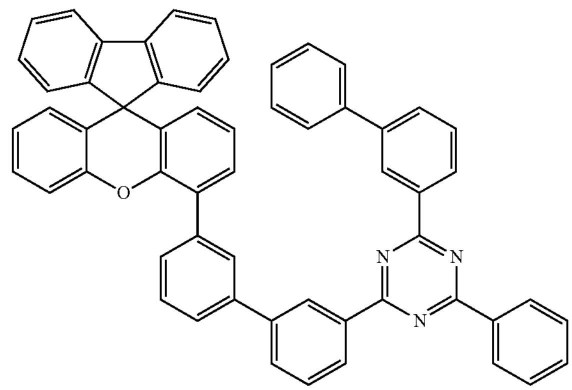
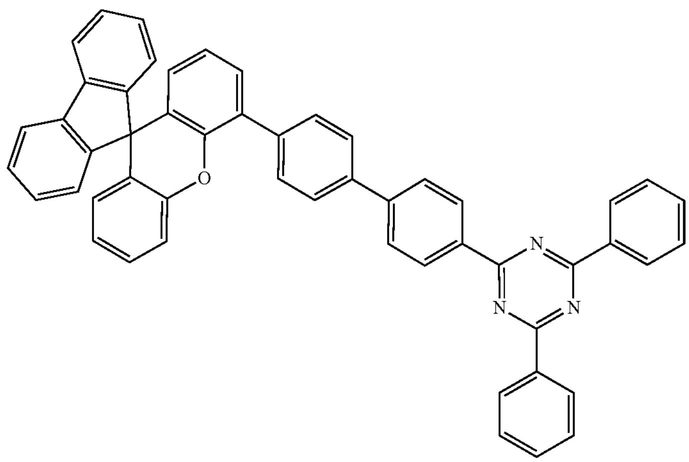
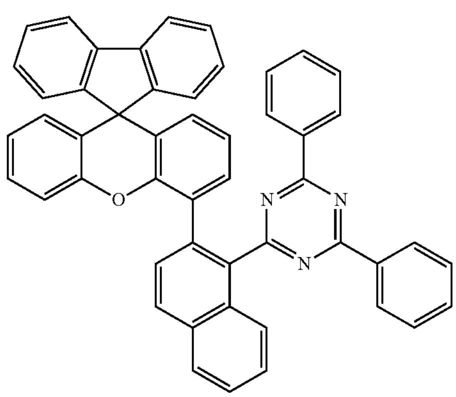
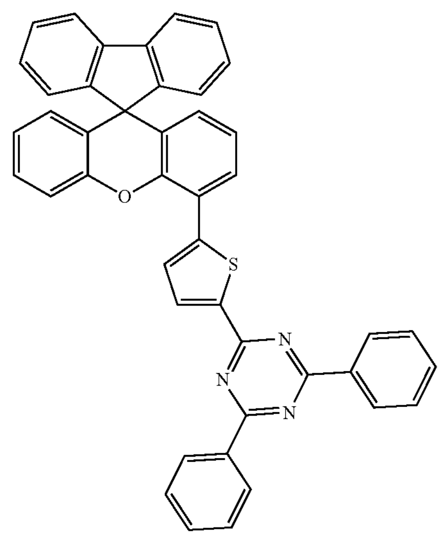

-continued
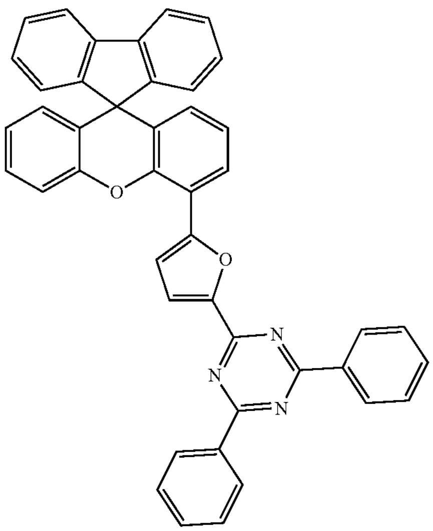
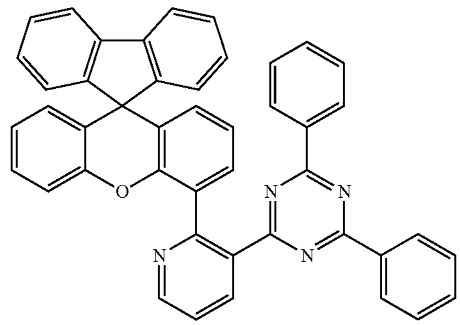
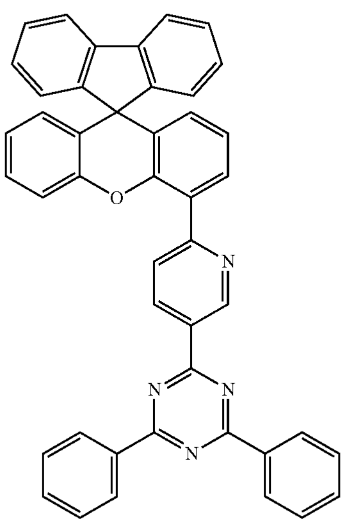
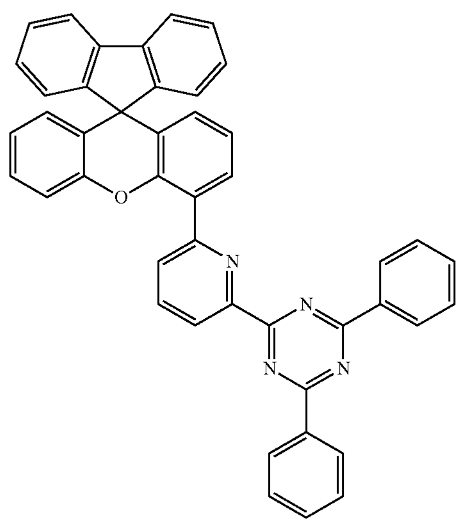
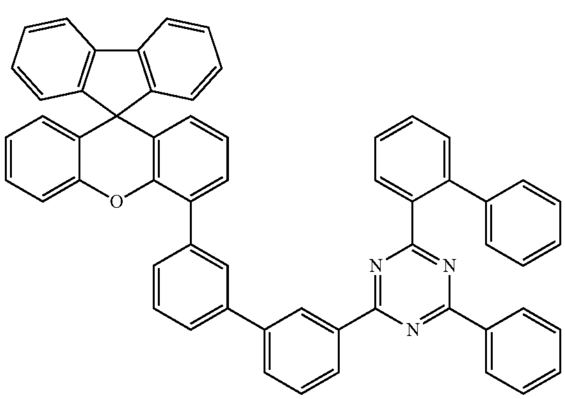 [SMILES: c1ccc(-c2nc(-c3cccc(-c4cccc(-c5cccc6c5Oc5ccccc5C65c6ccccc6-c6ccccc65)c4)c3)nc(-c3ccccc3-c3ccccc3)n2)cc1]

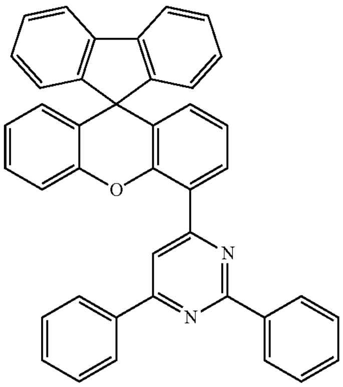
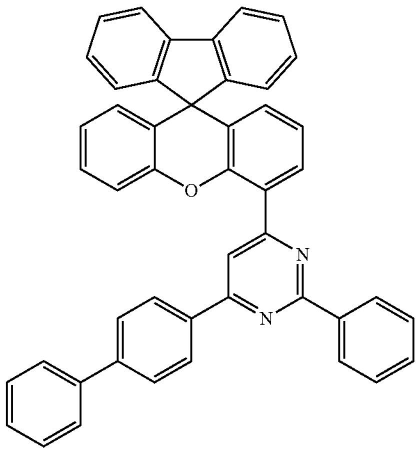
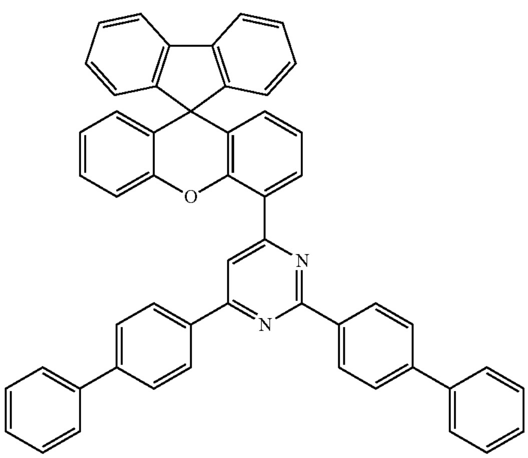
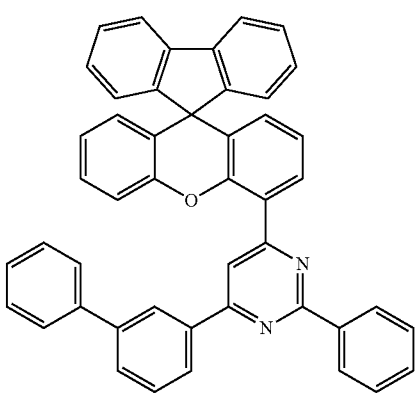
-continued
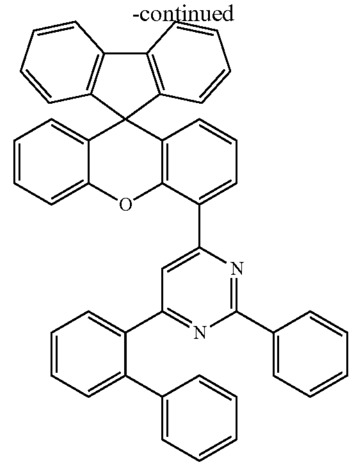
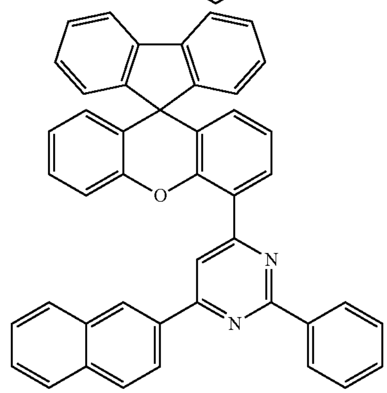
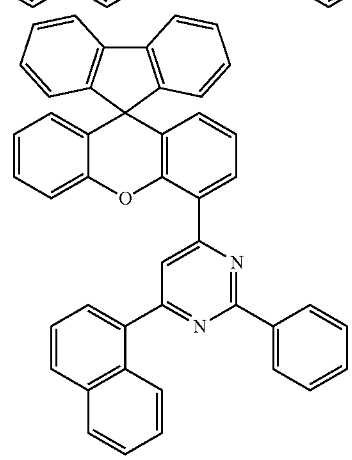
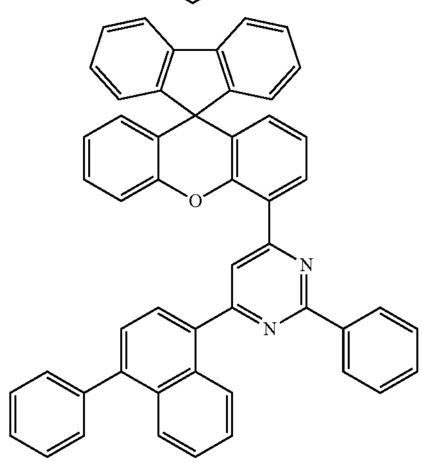

-continued
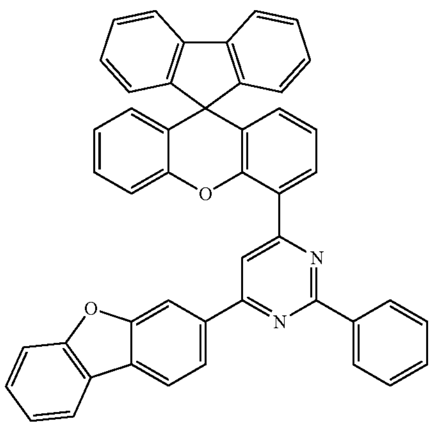
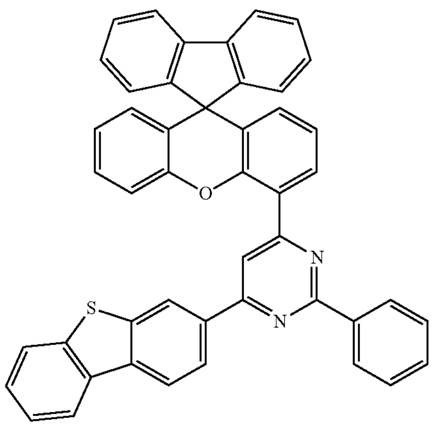
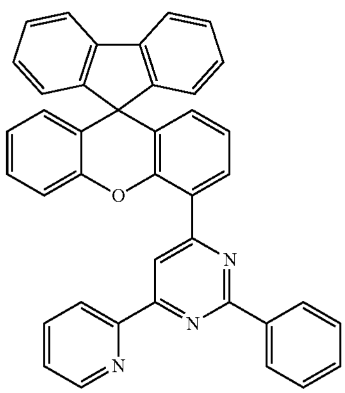
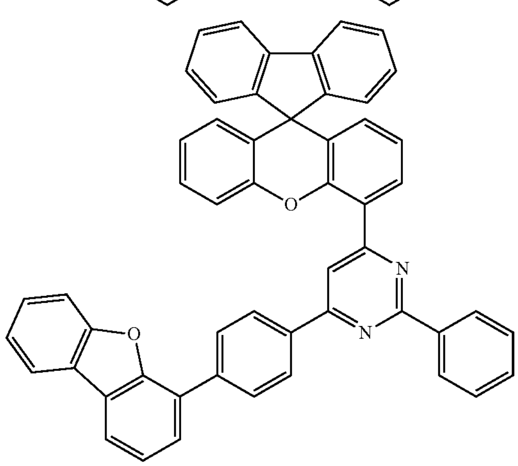
-continued
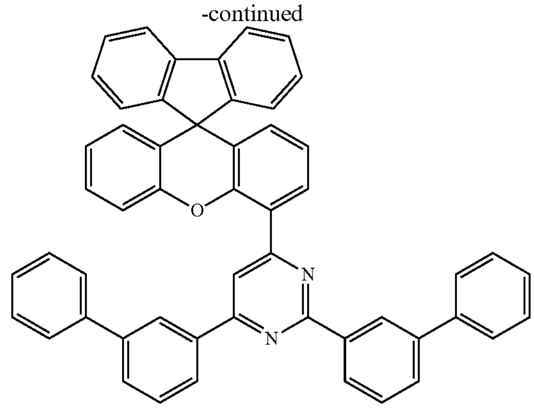
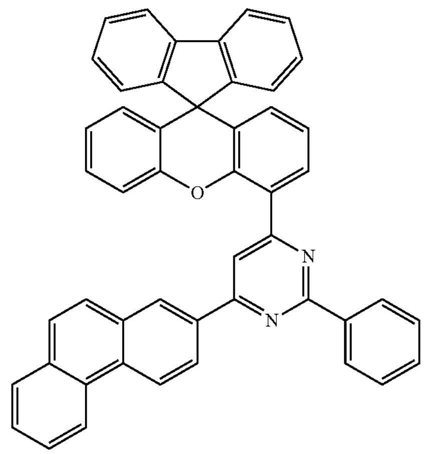
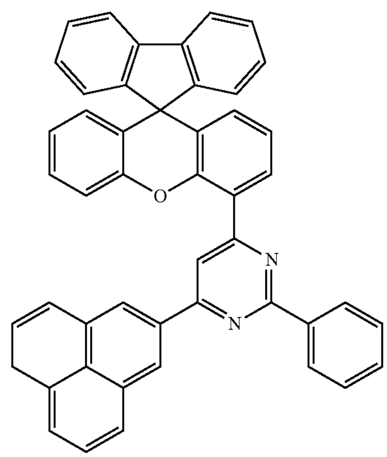
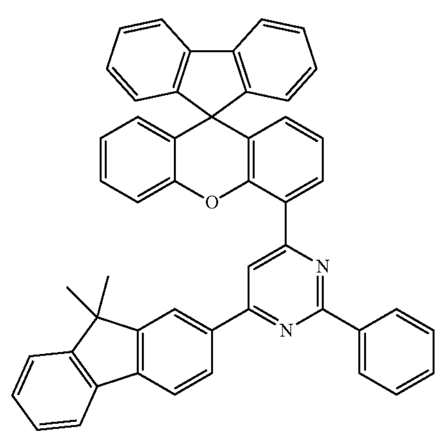

-continued
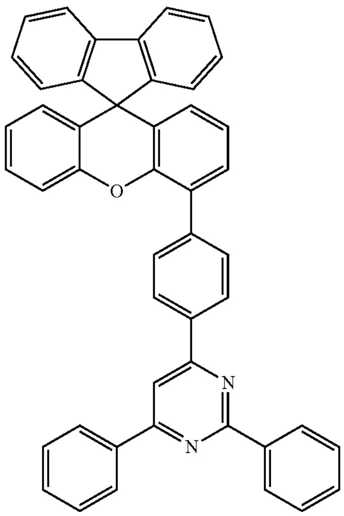
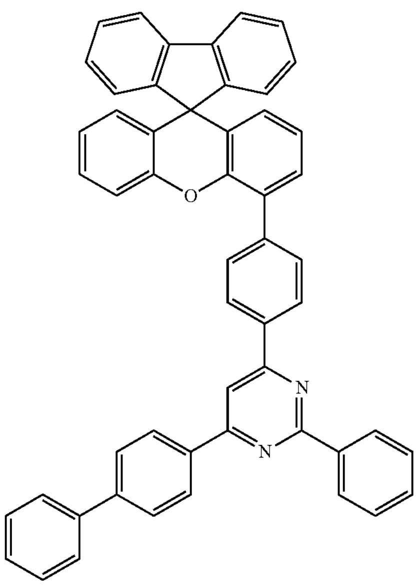
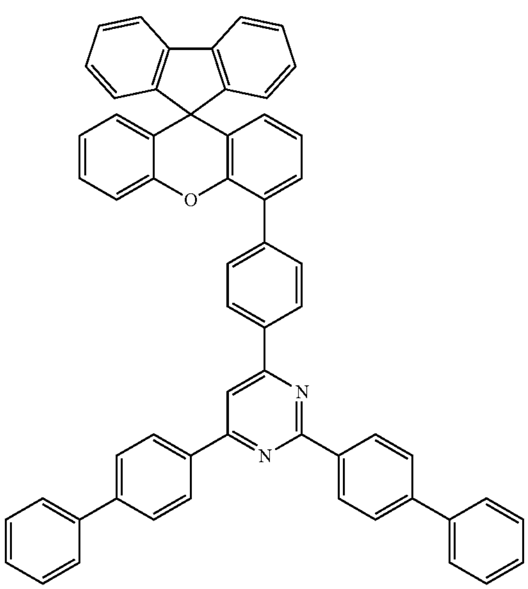
-continued
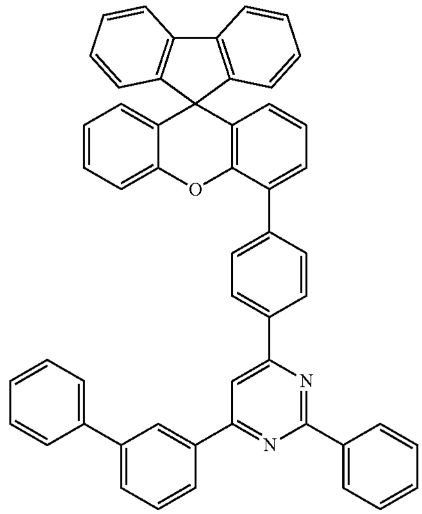
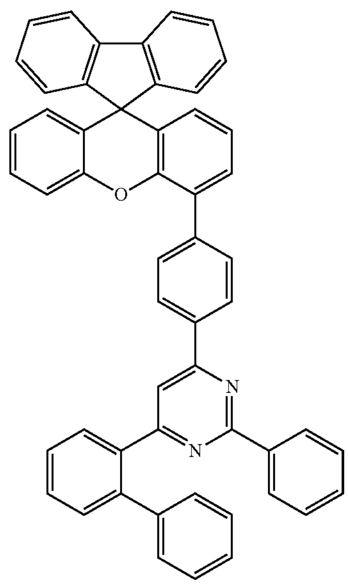
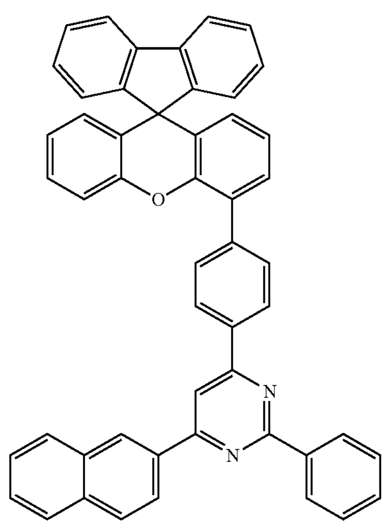

-continued
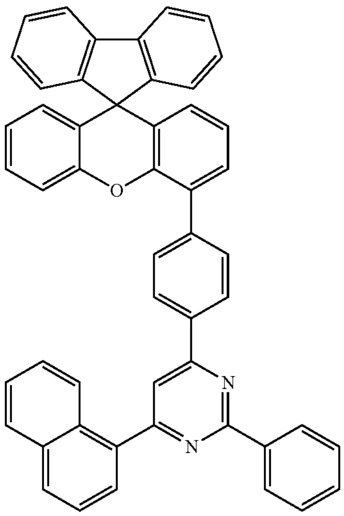
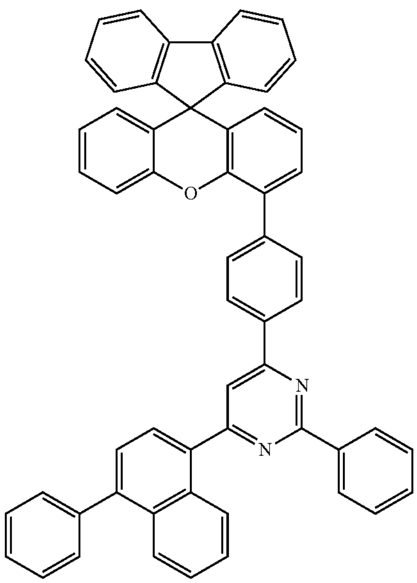
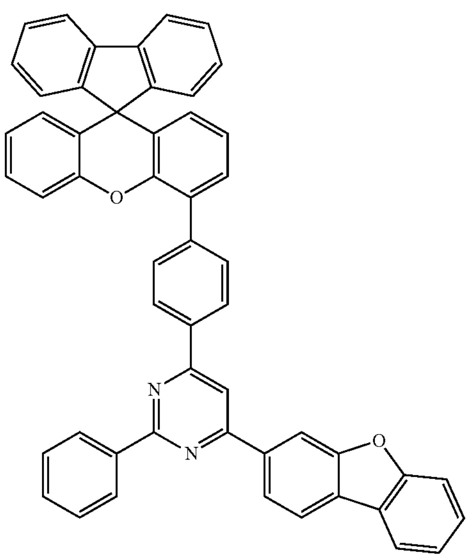
-continued
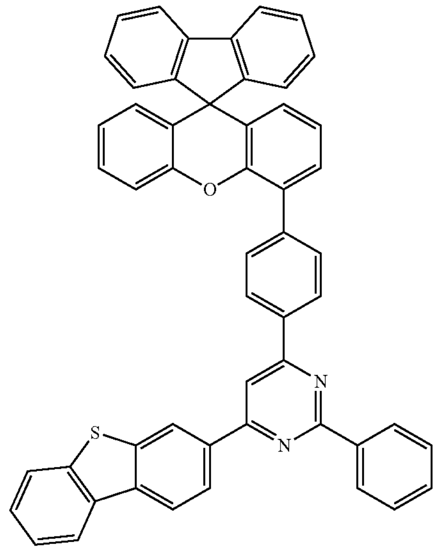
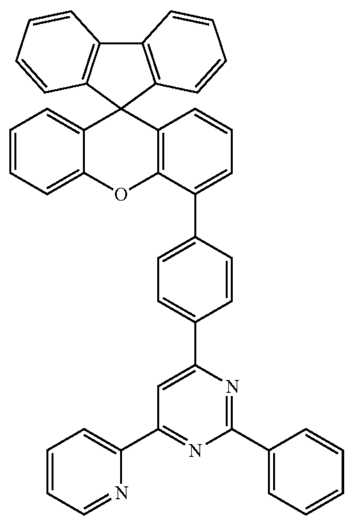
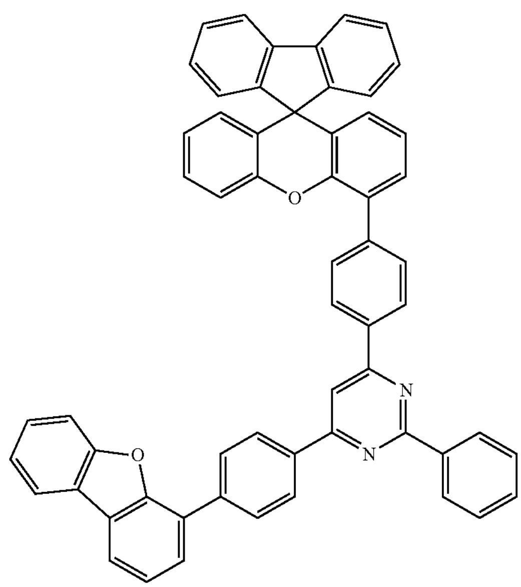

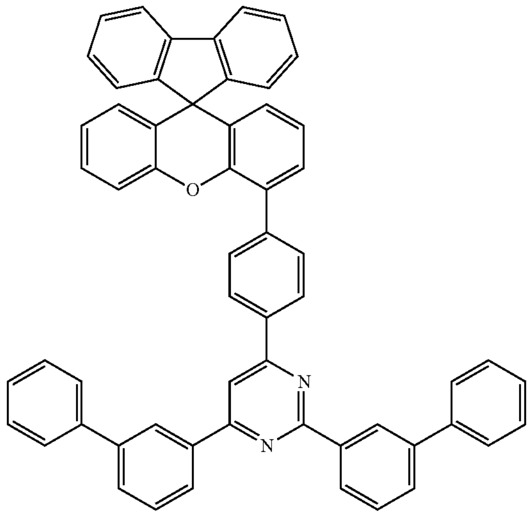
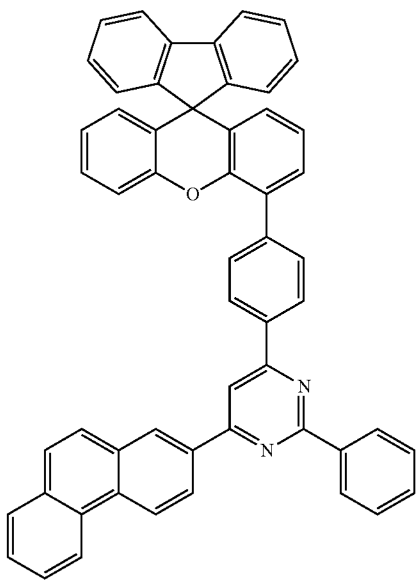
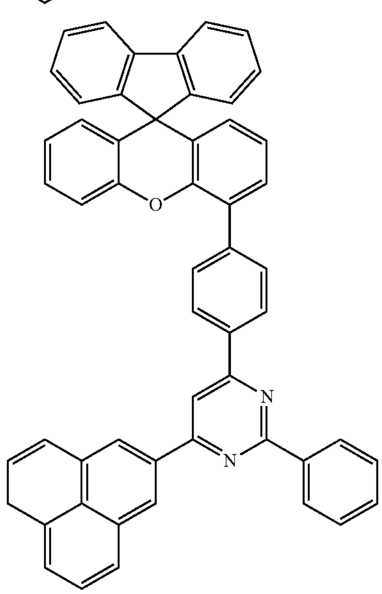
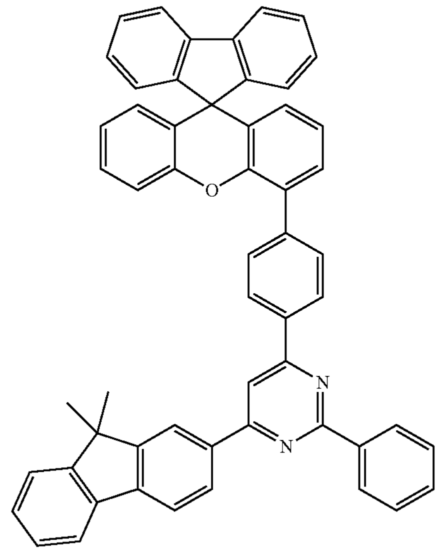
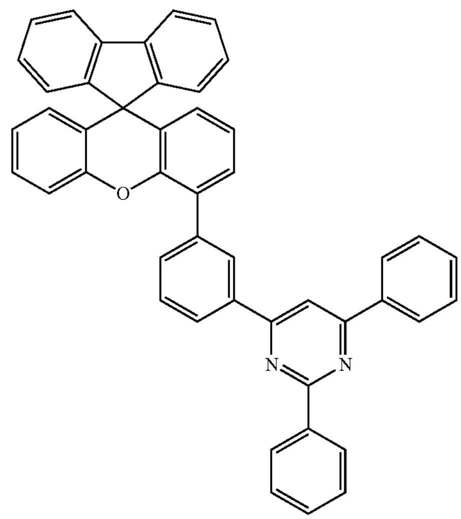
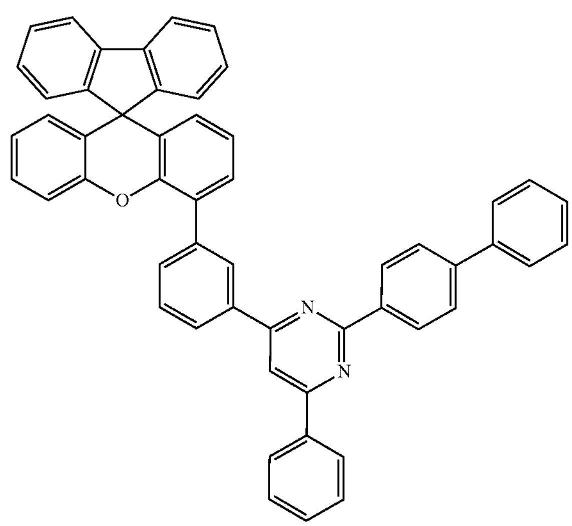

-continued
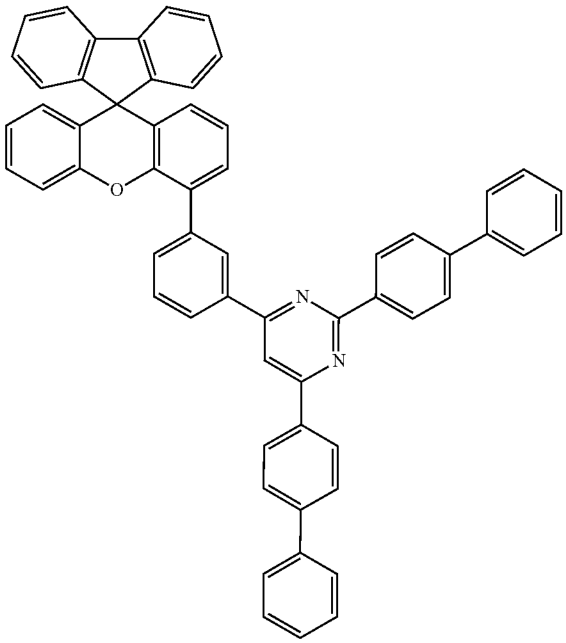
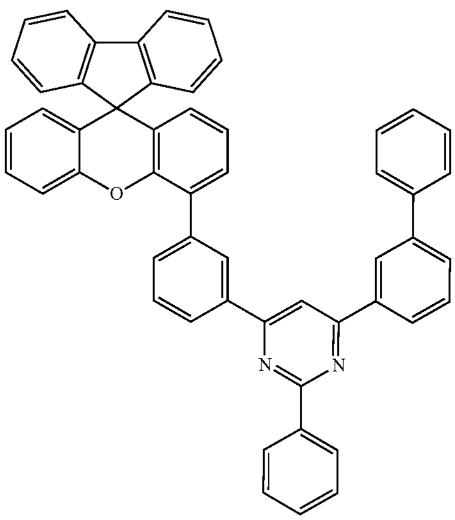
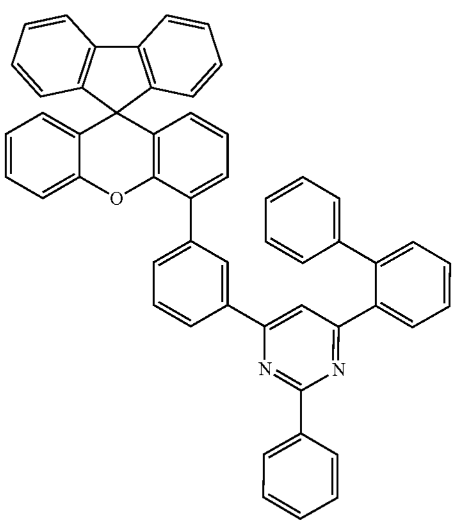
-continued
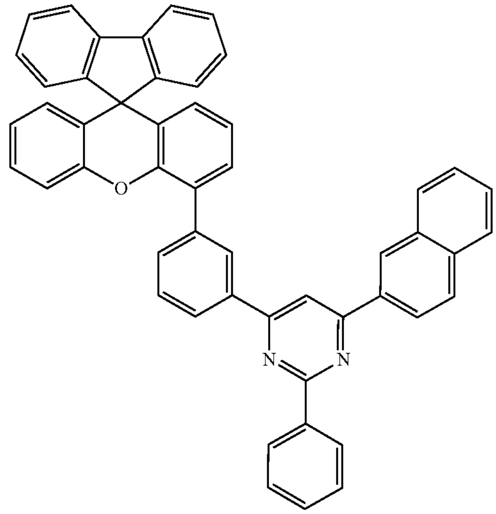
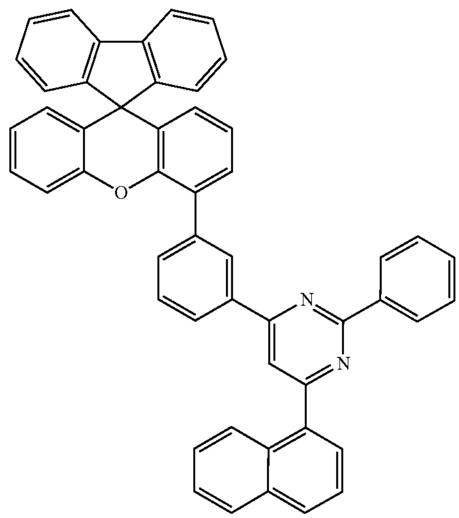
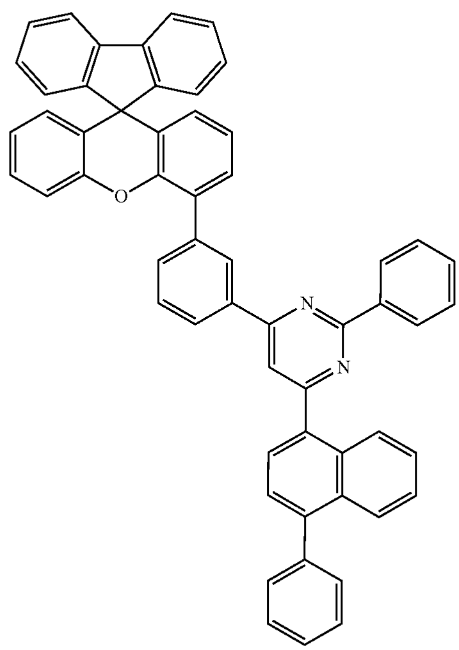

-continued
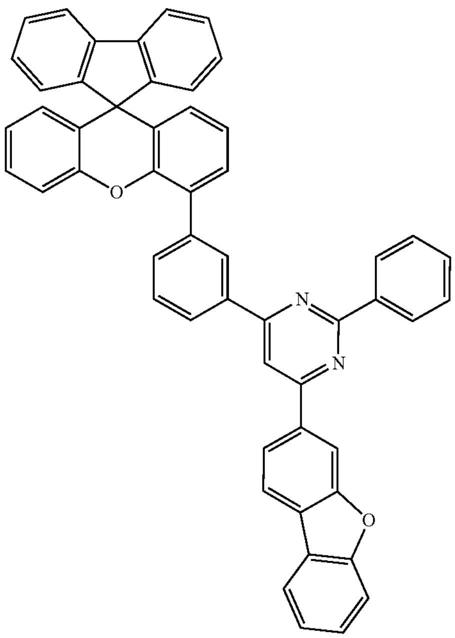
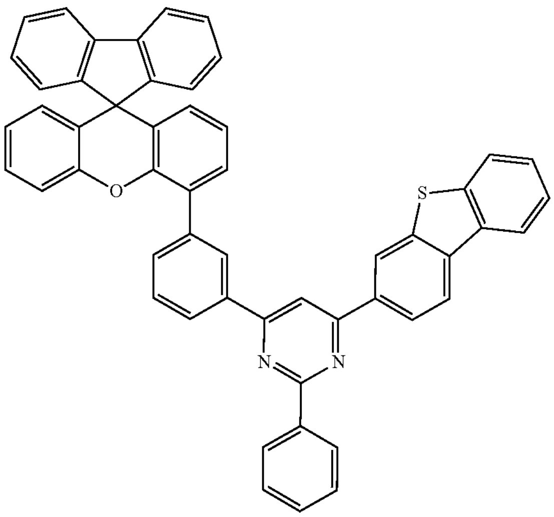
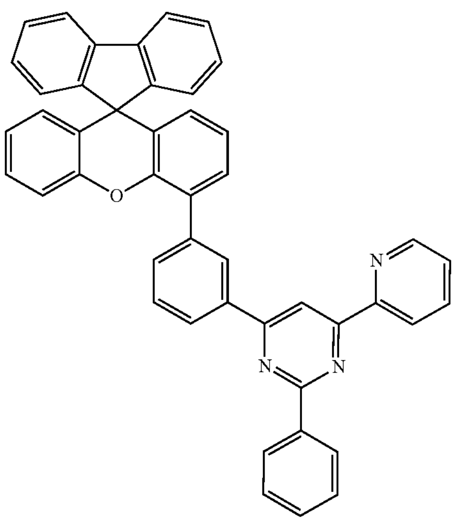
-continued
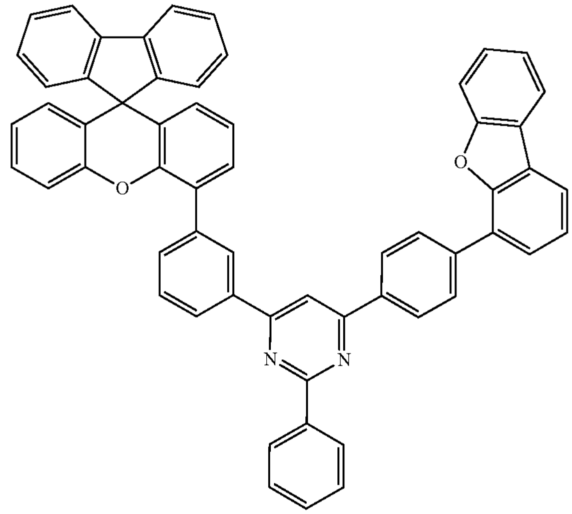
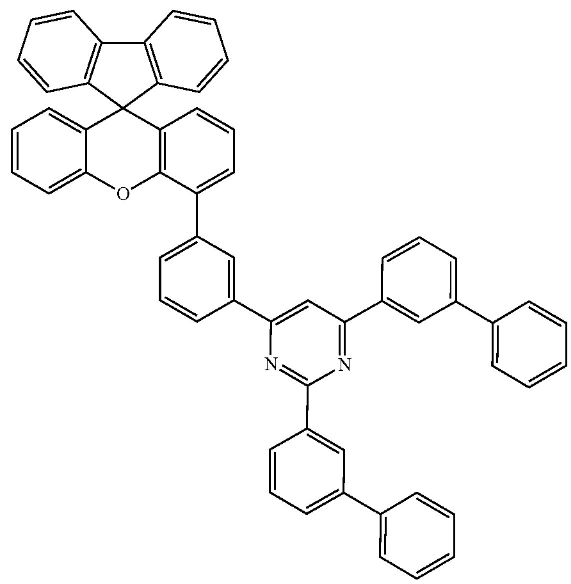
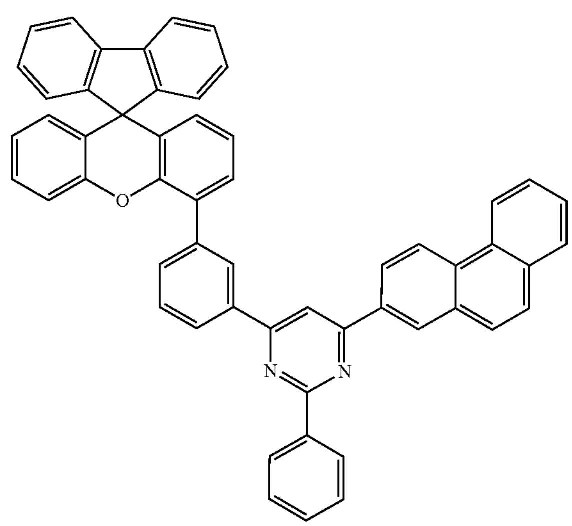

-continued
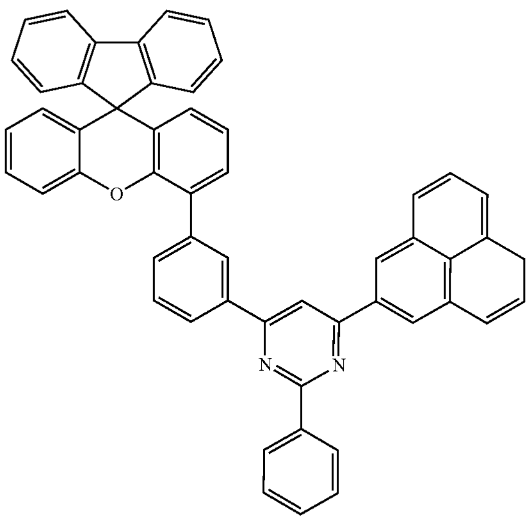
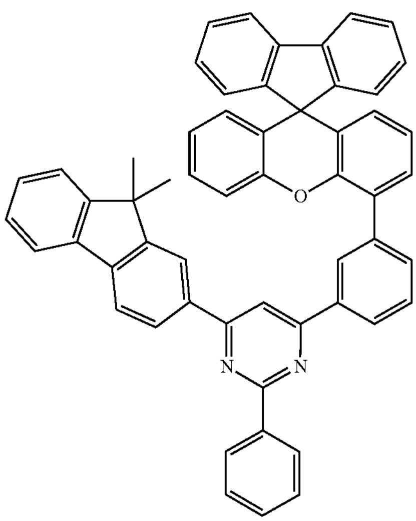
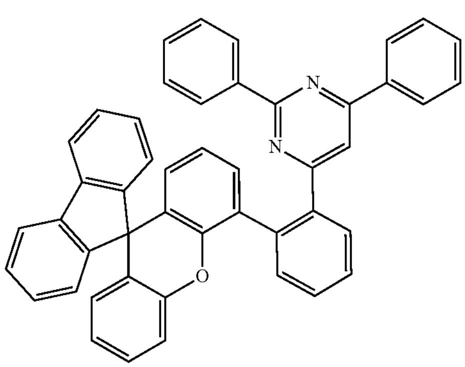
-continued
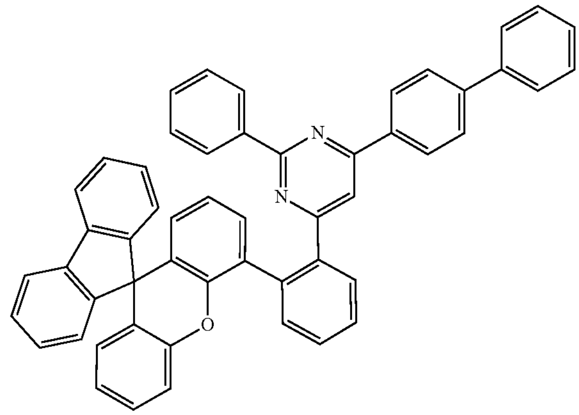
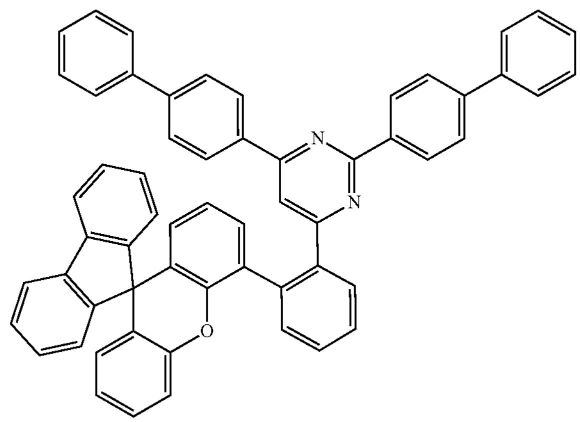
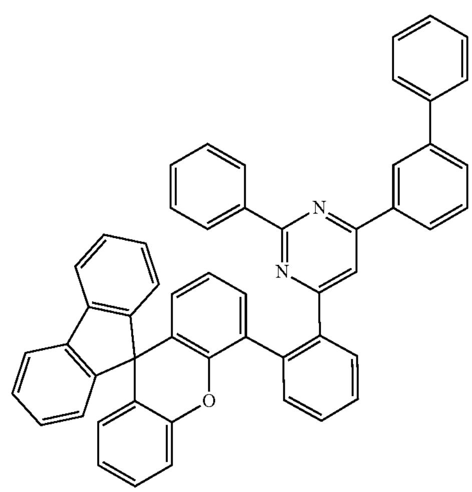

-continued
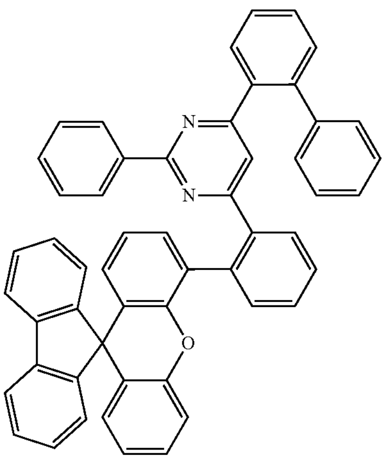
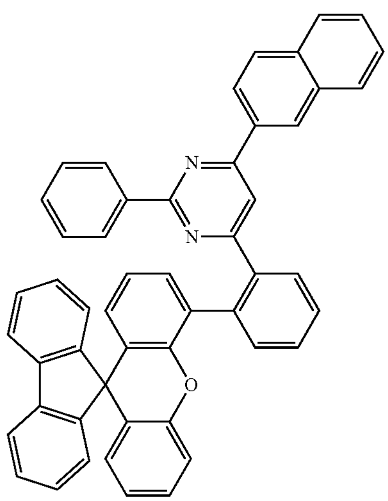
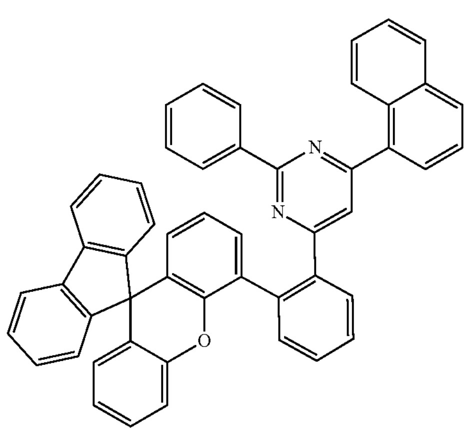
-continued
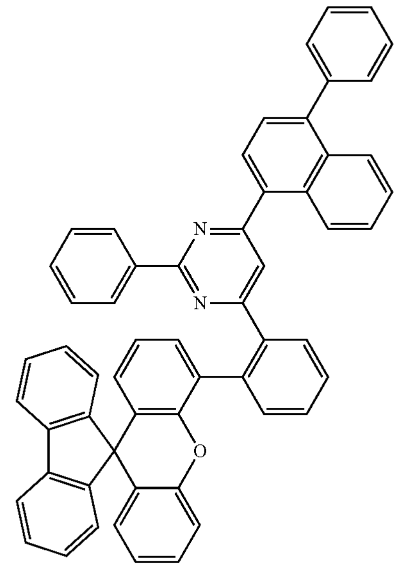
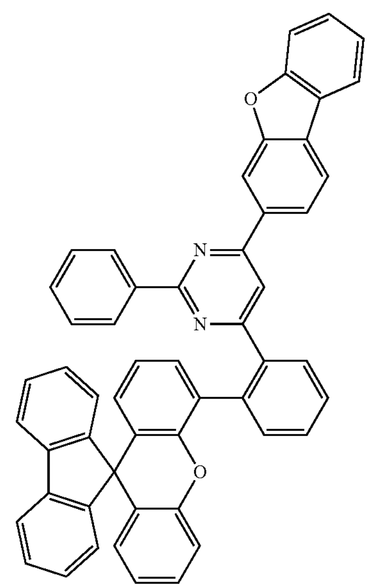
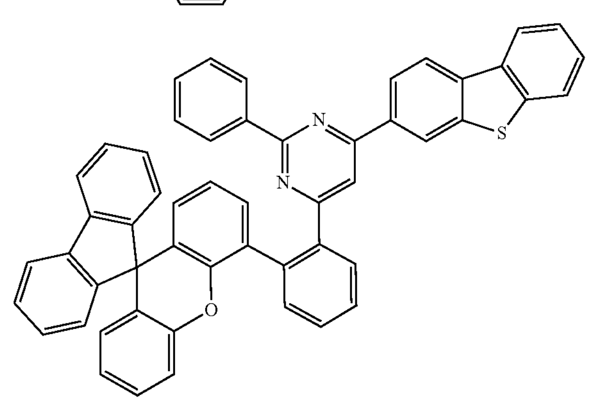

-continued
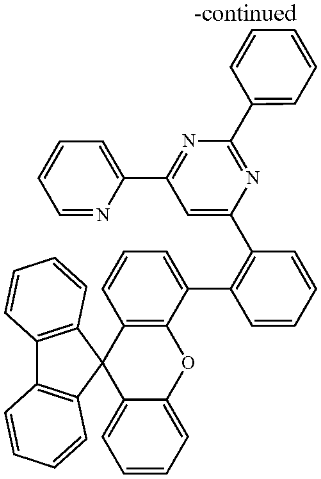
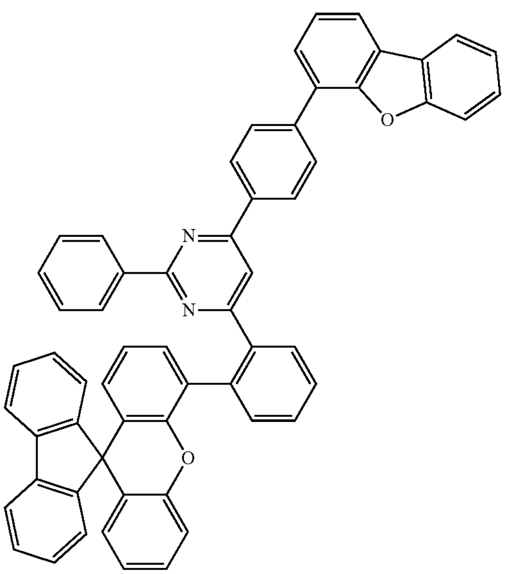
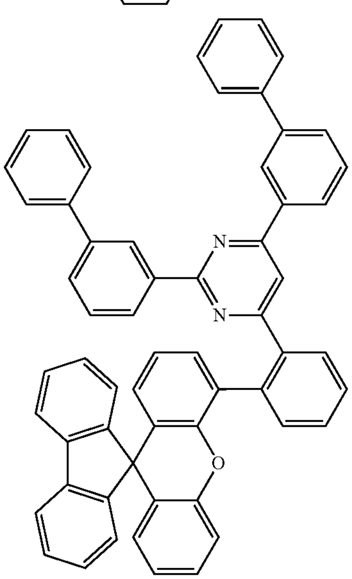
-continued
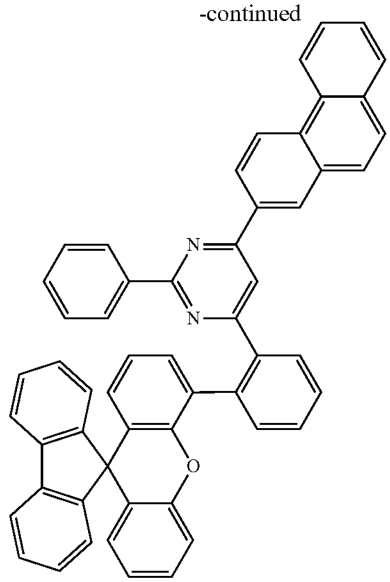
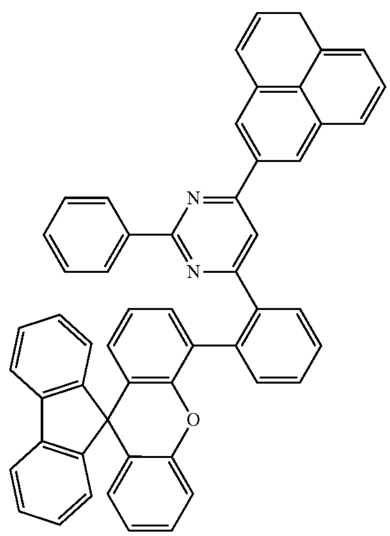
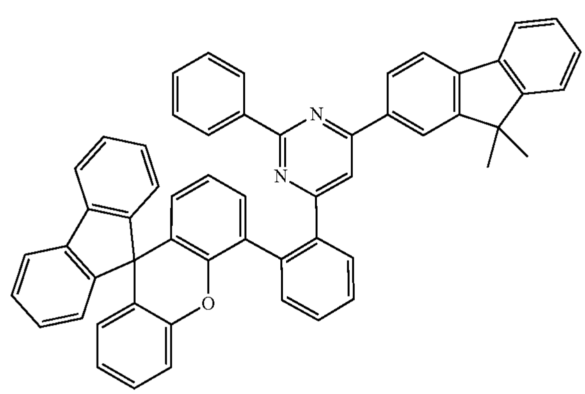

-continued
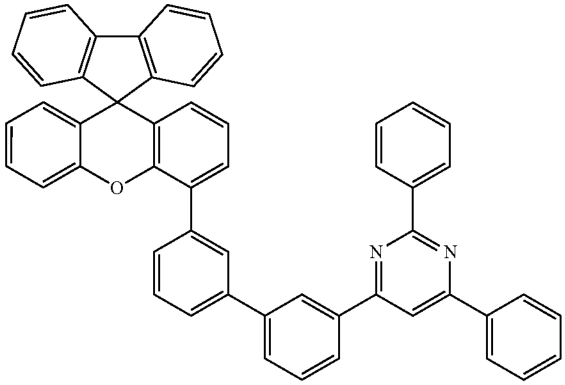
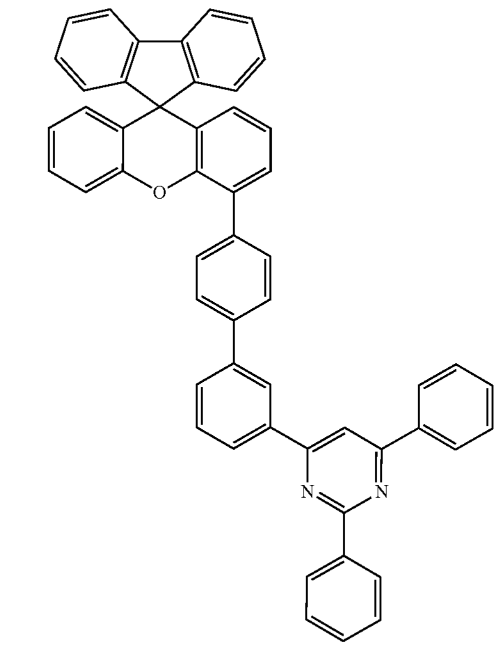
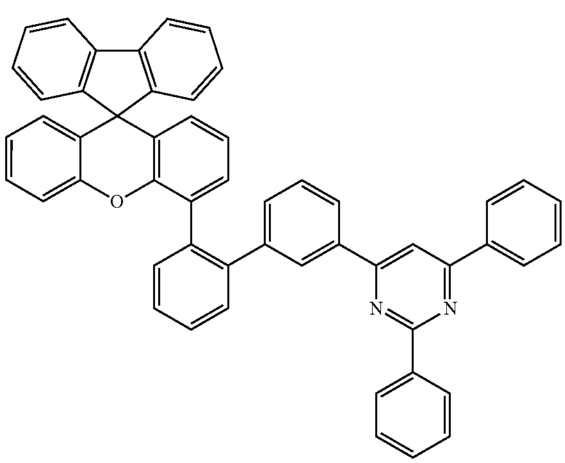
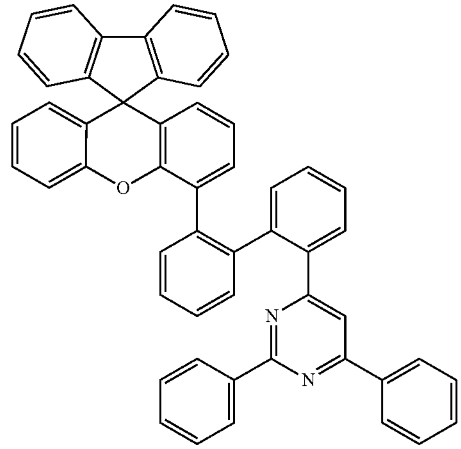
-continued
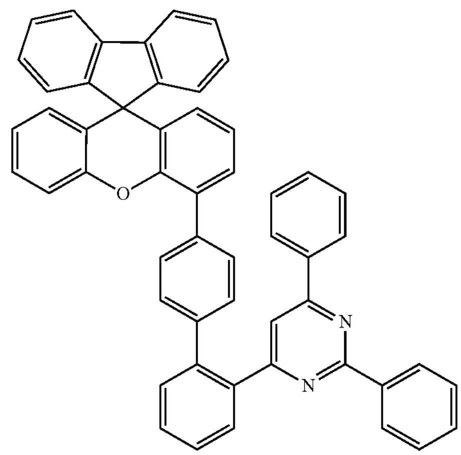
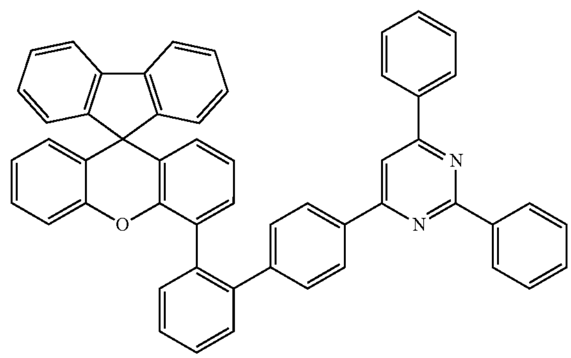
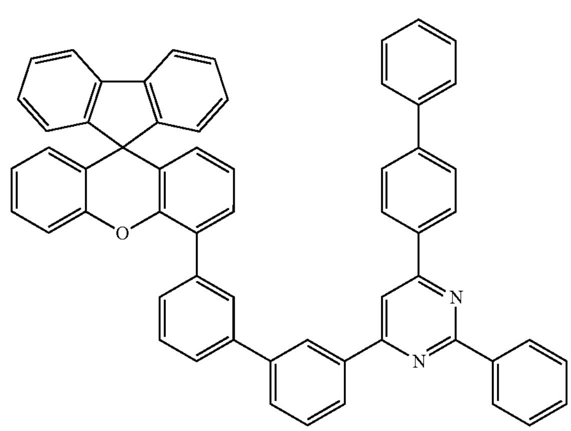

-continued
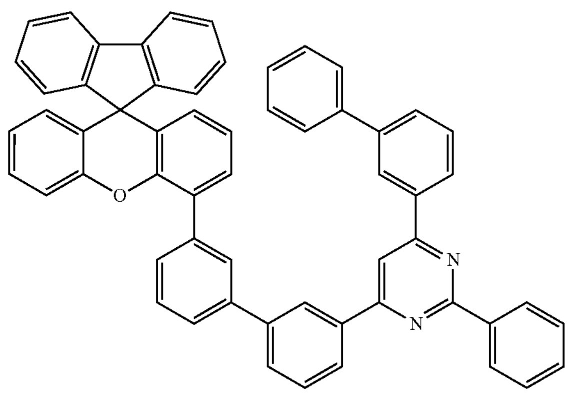
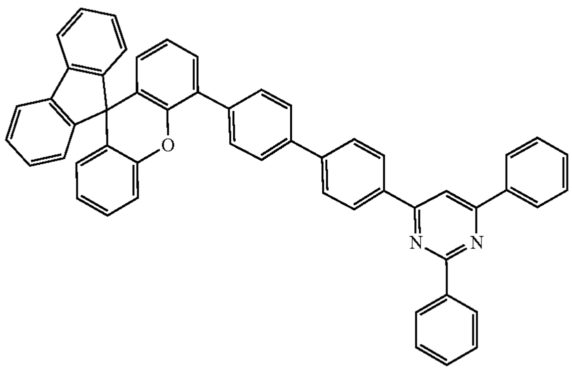
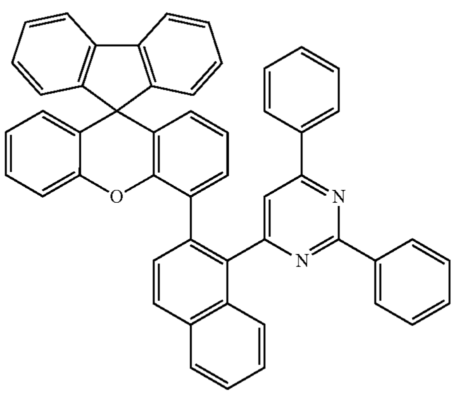
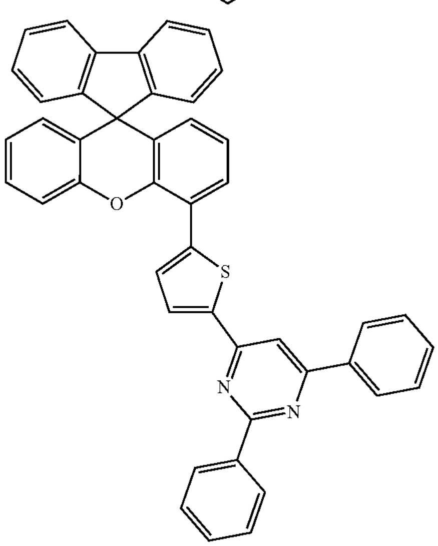
-continued
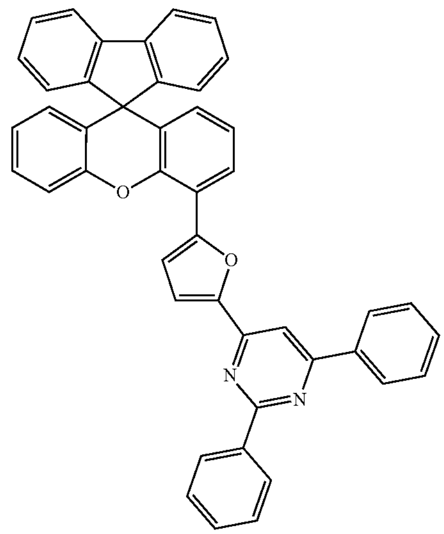
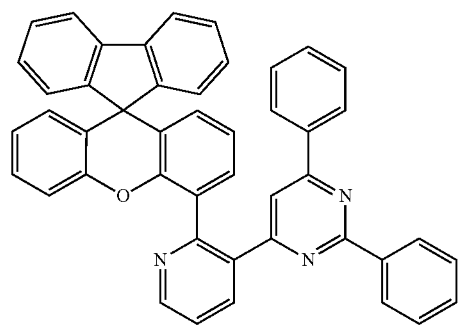
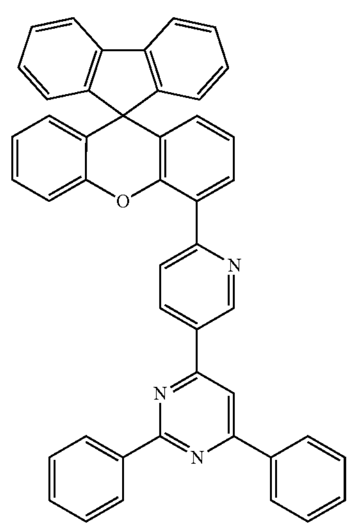

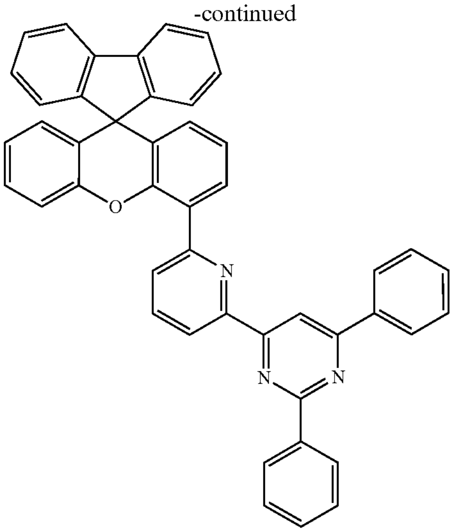
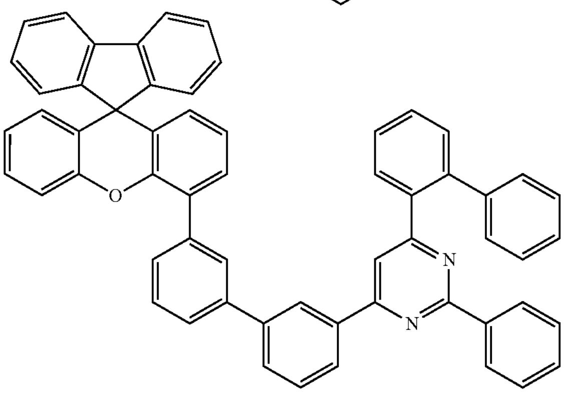
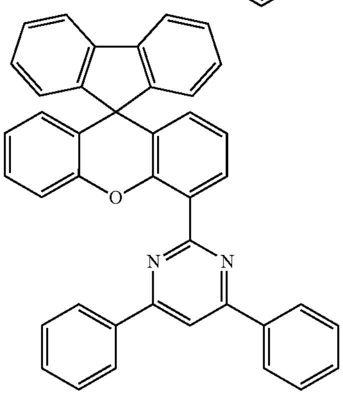
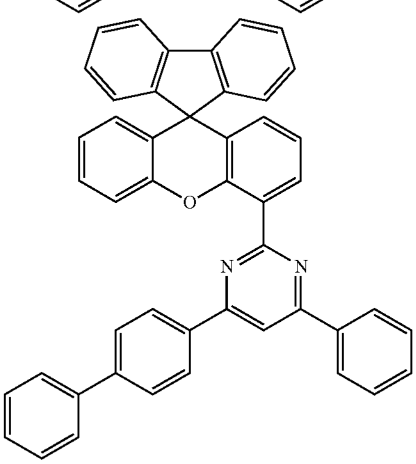
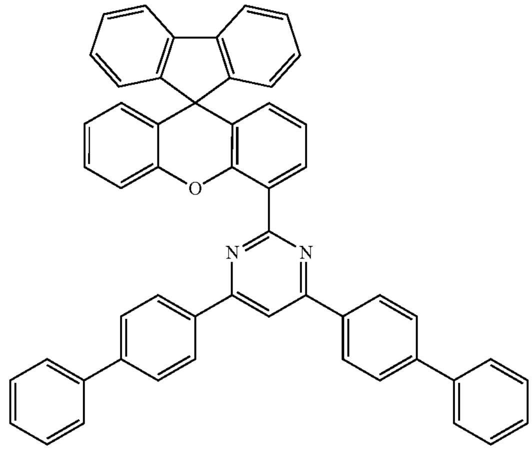
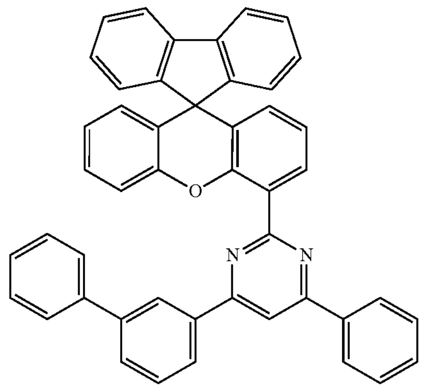
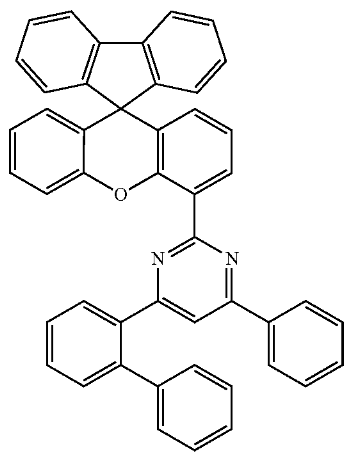
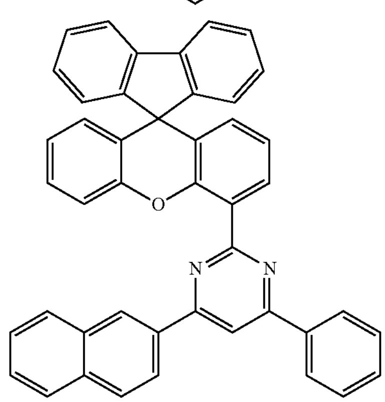

-continued
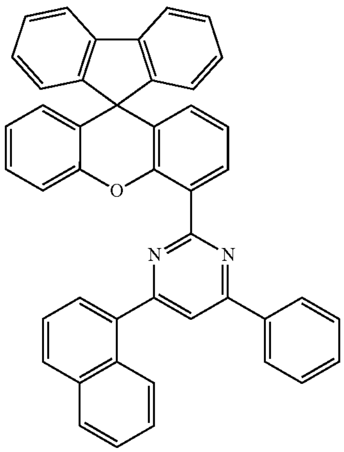
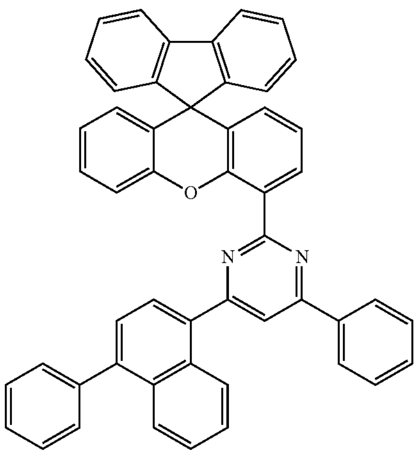
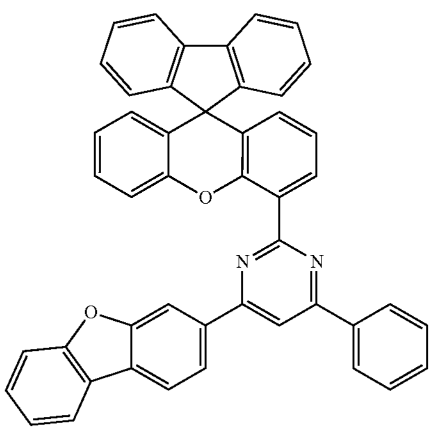
-continued
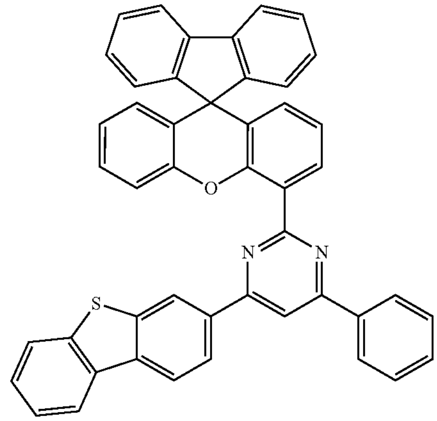
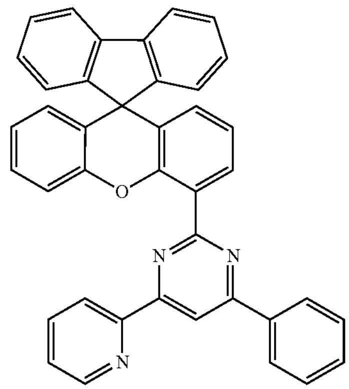
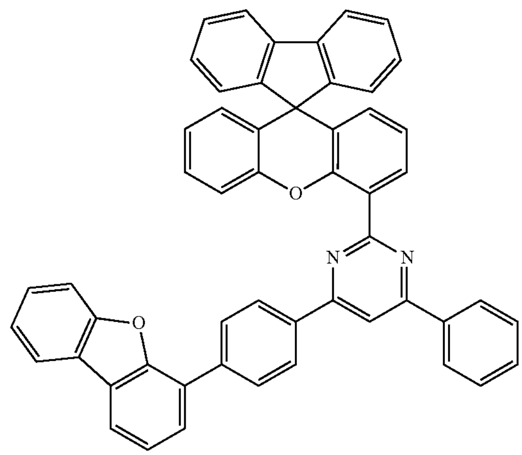
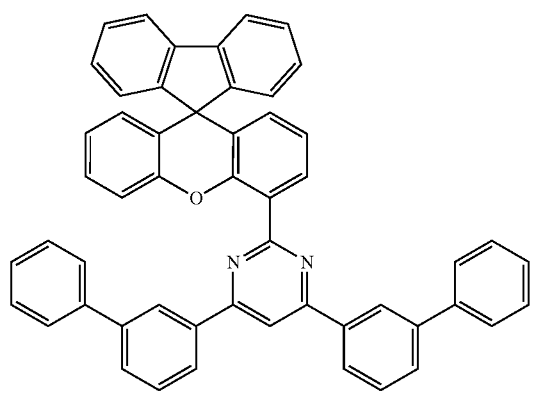

-continued
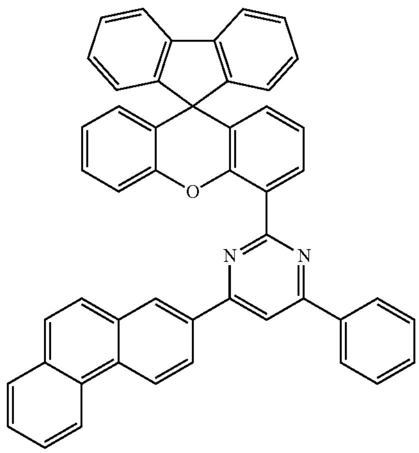
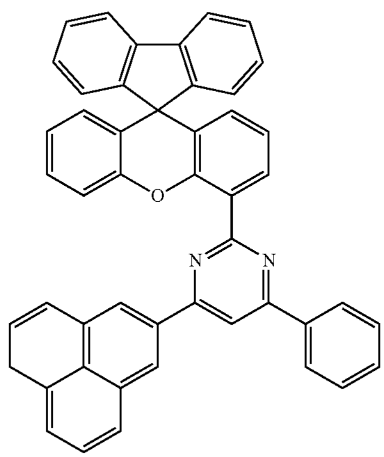
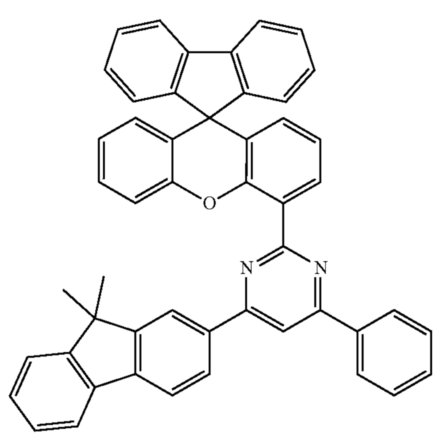
-continued
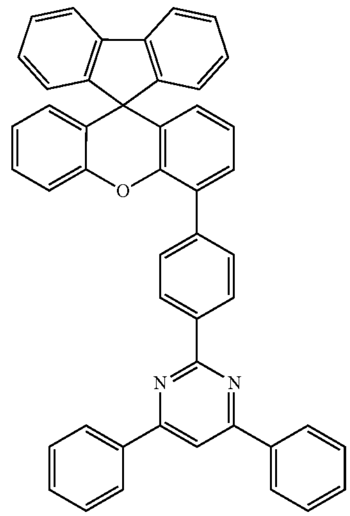
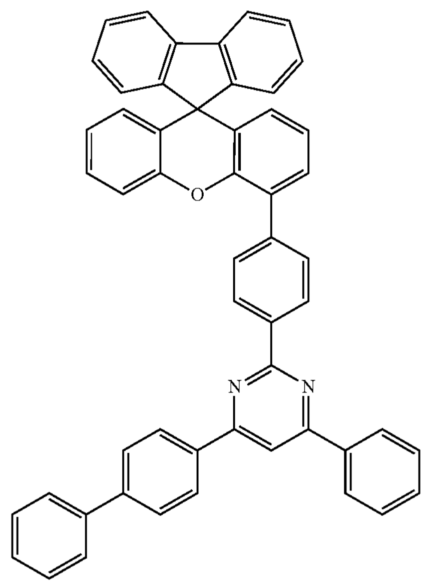
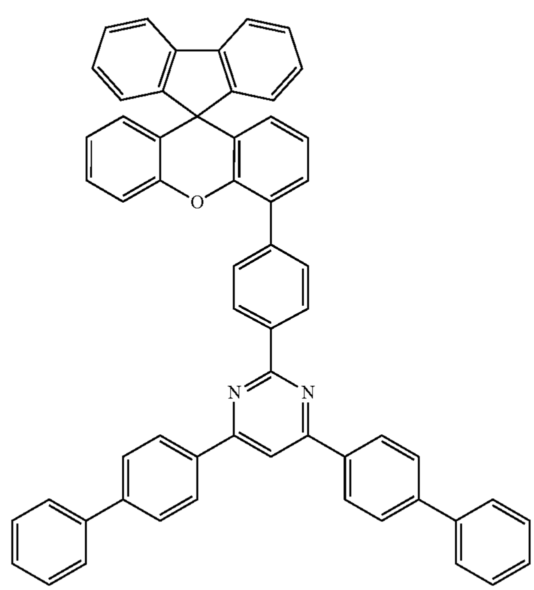

-continued
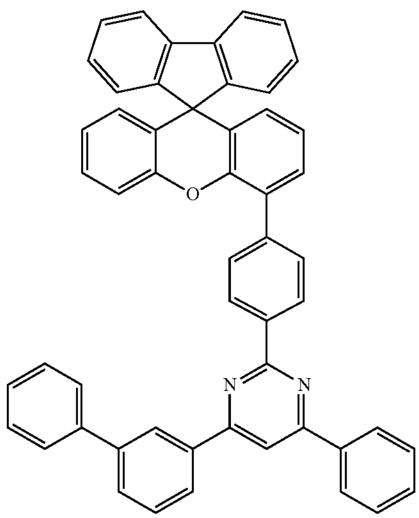
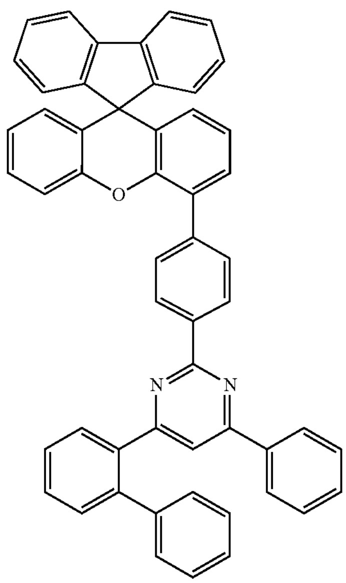
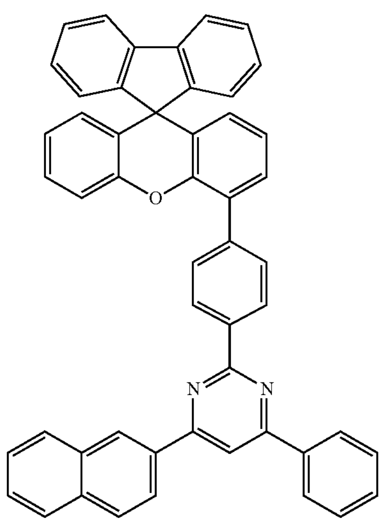
-continued
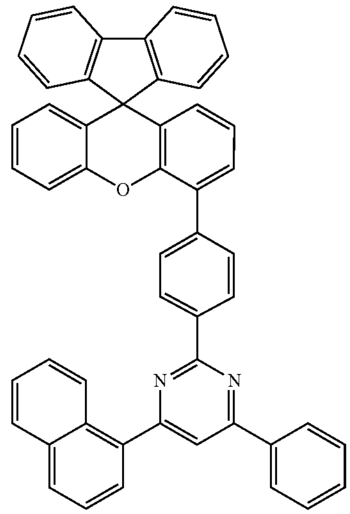
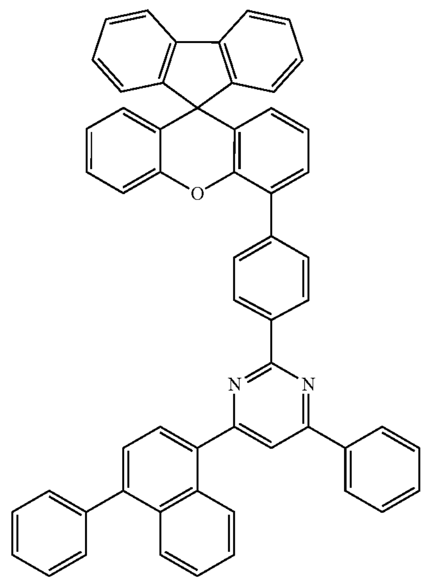
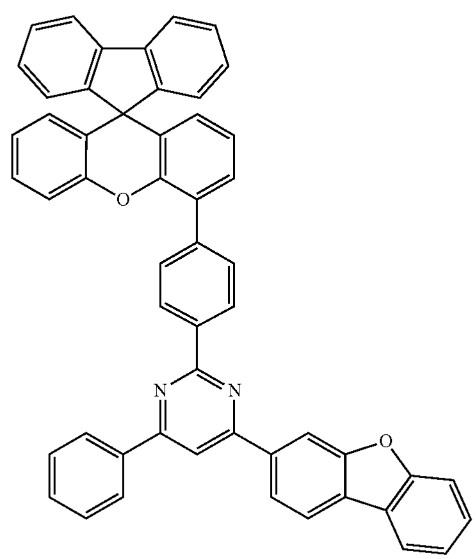

-continued
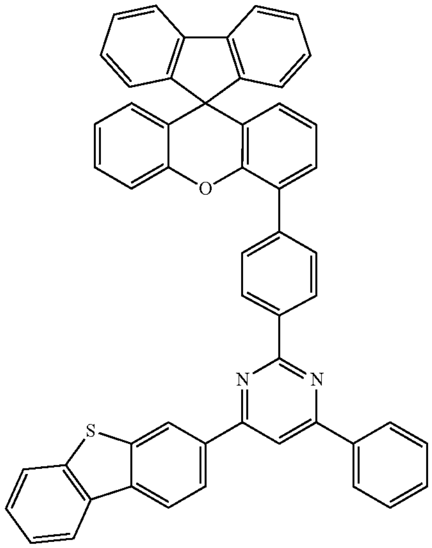
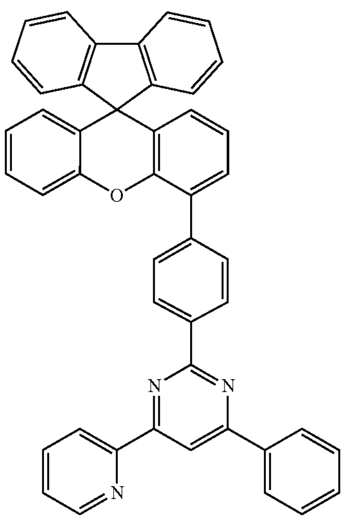
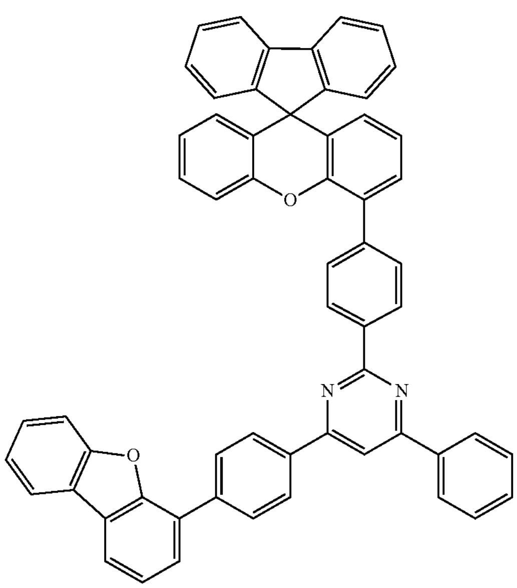
-continued
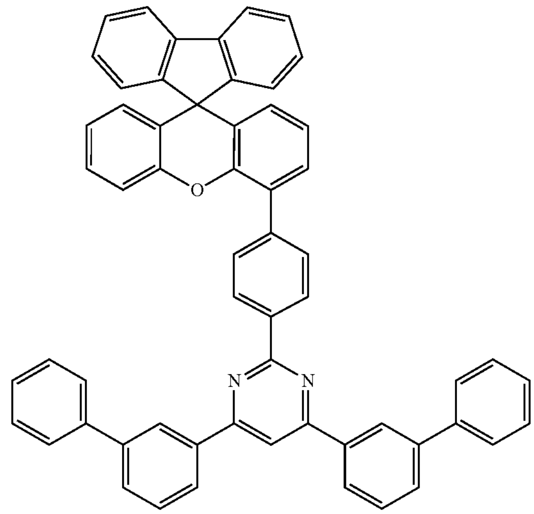
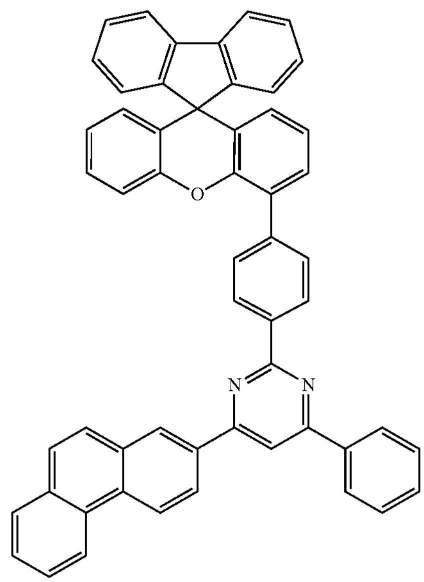
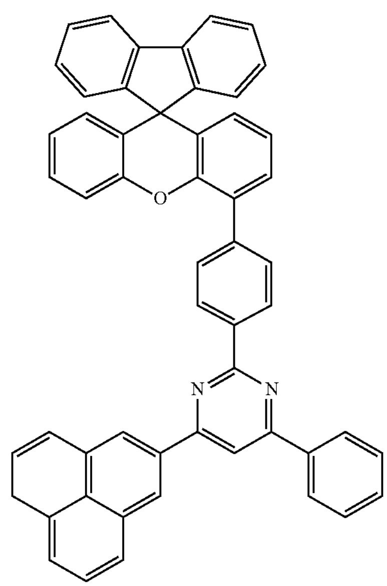

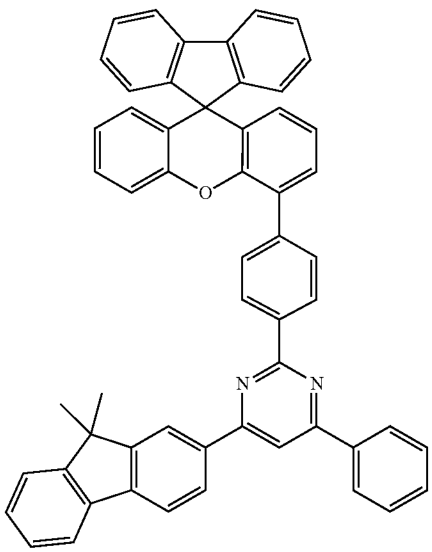
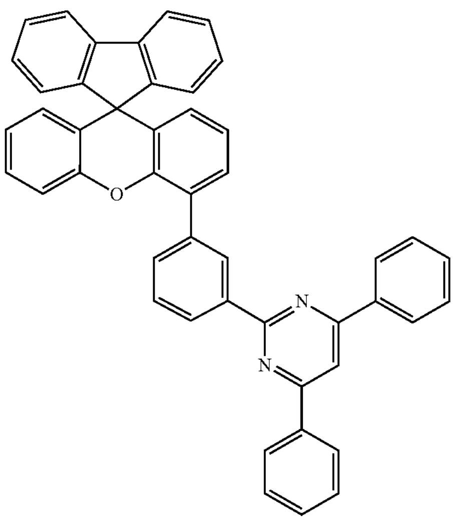
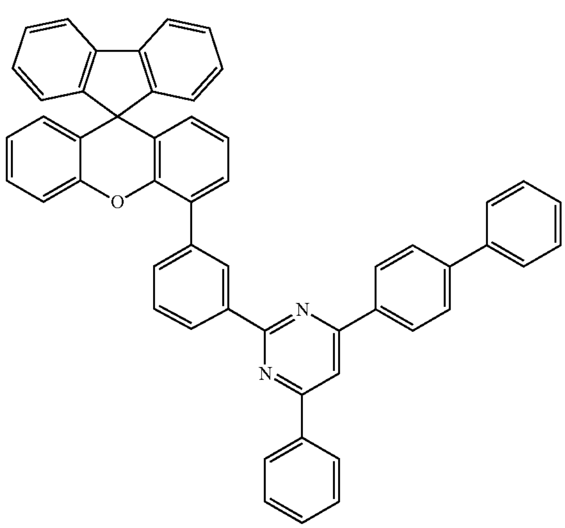
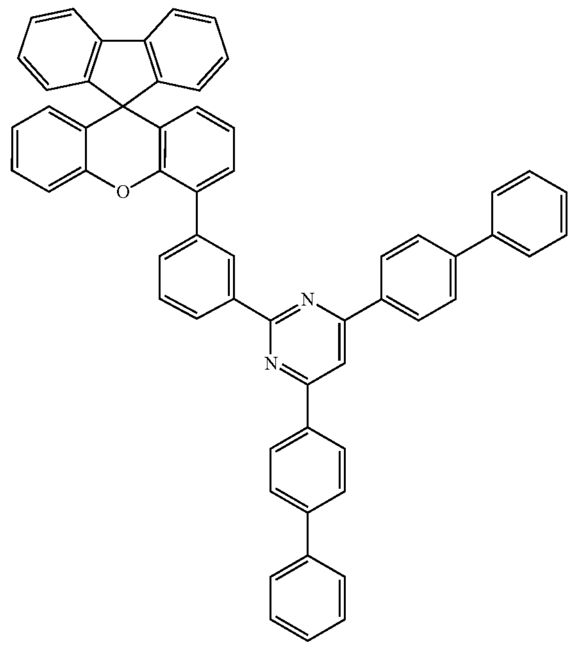
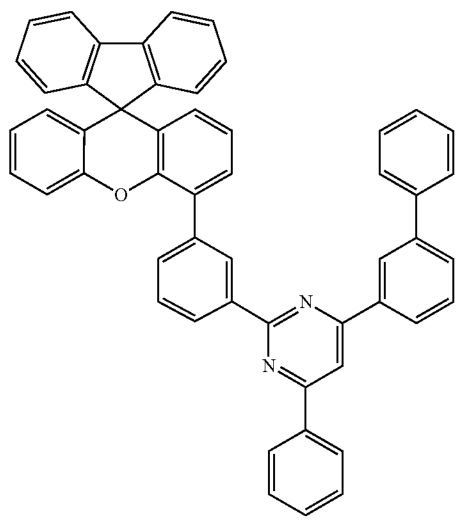
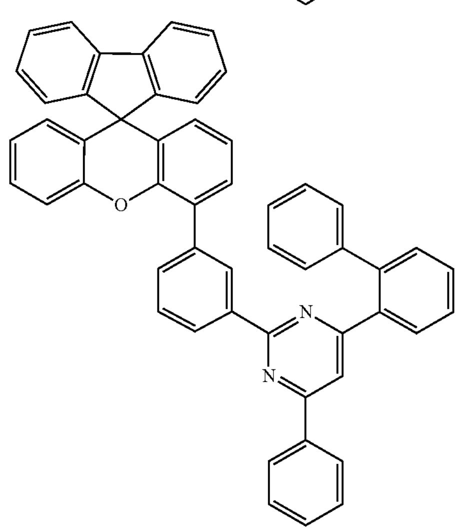

-continued
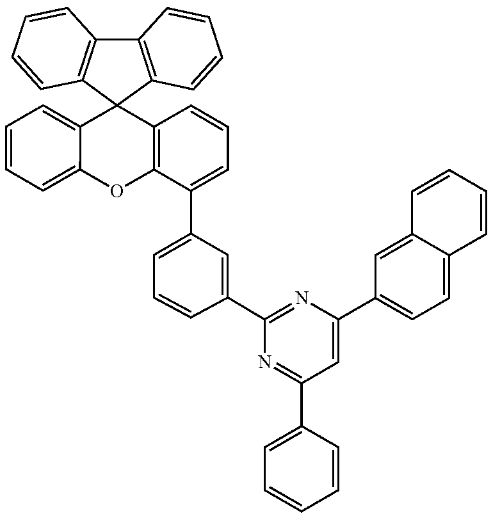
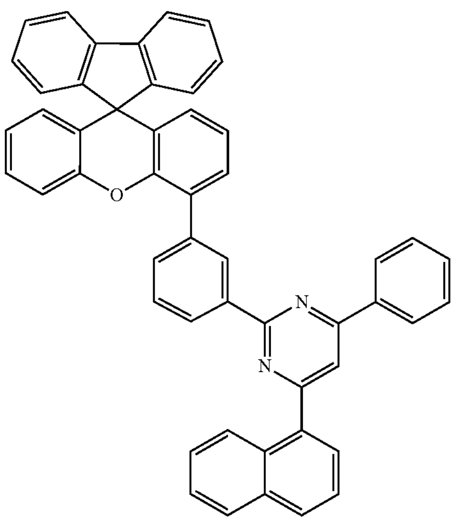
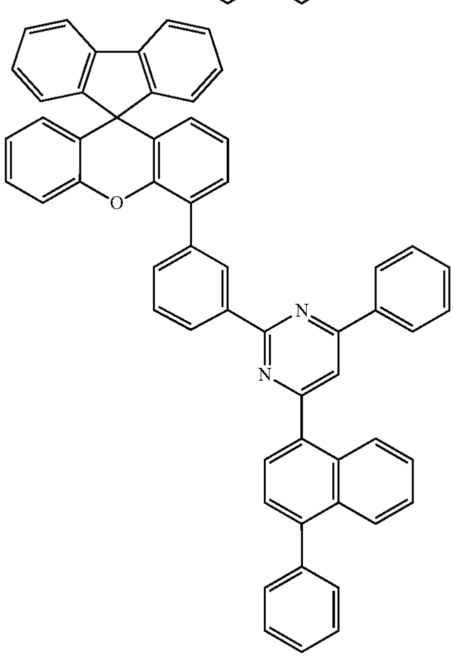
-continued
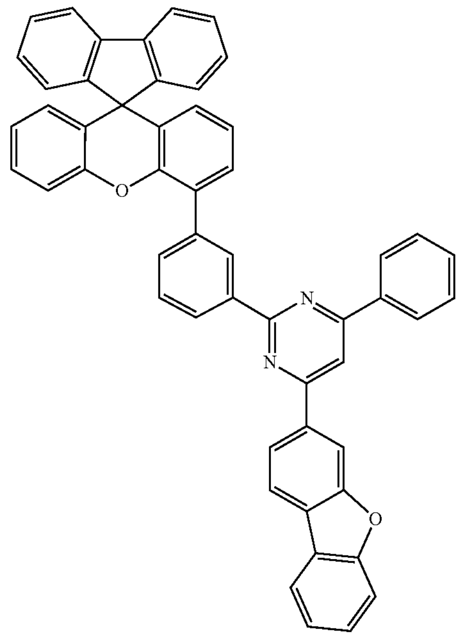
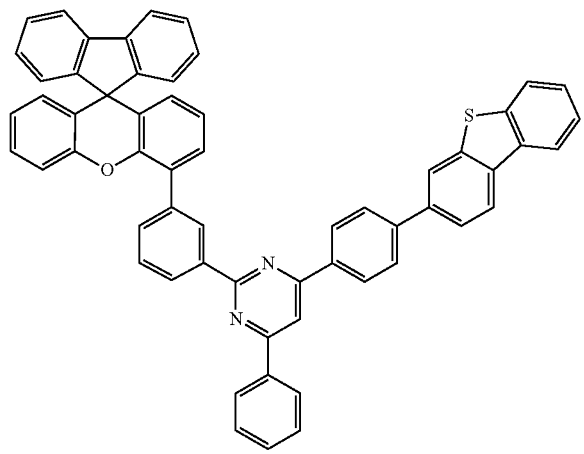
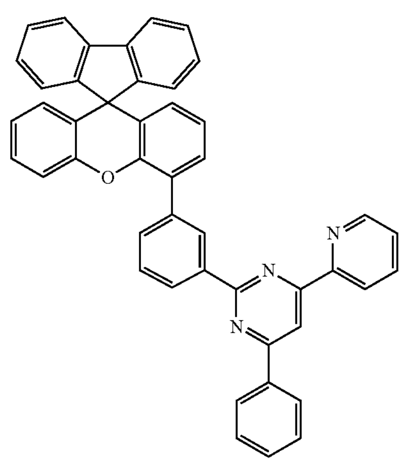

-continued
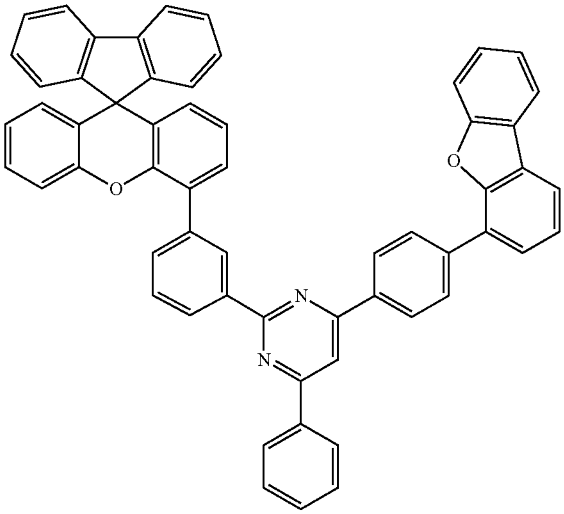
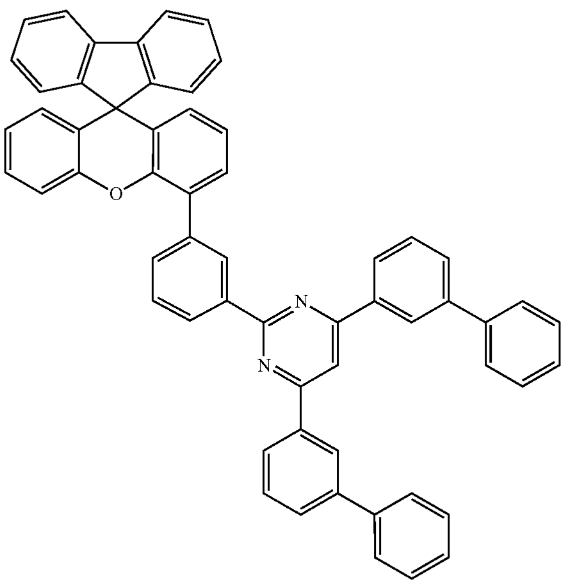
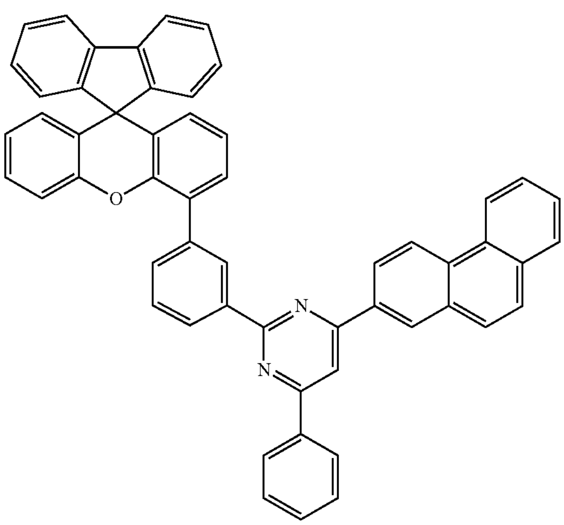
-continued
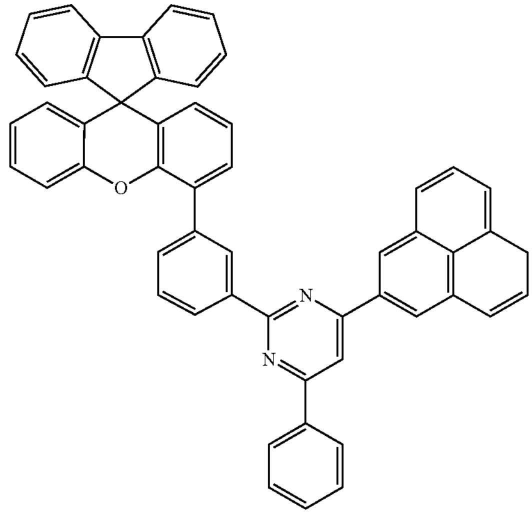
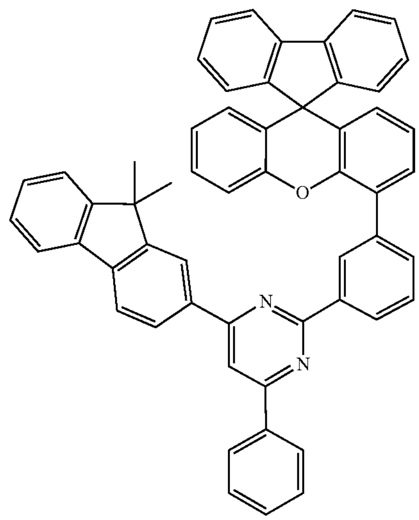
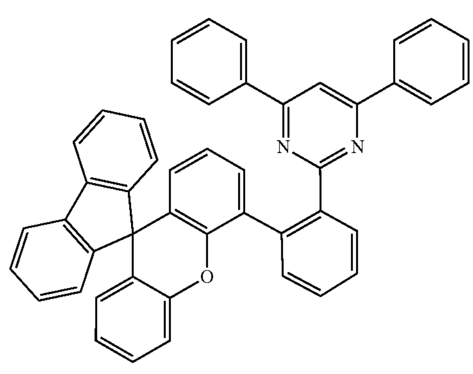

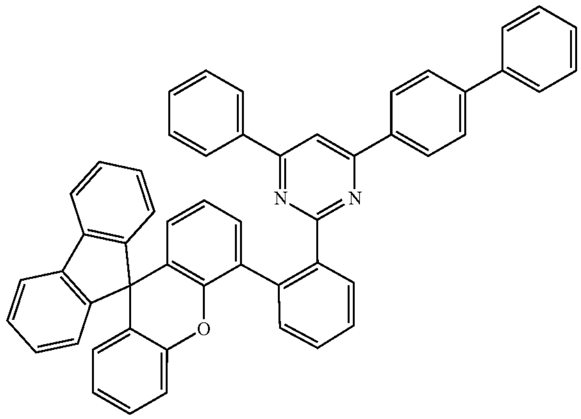
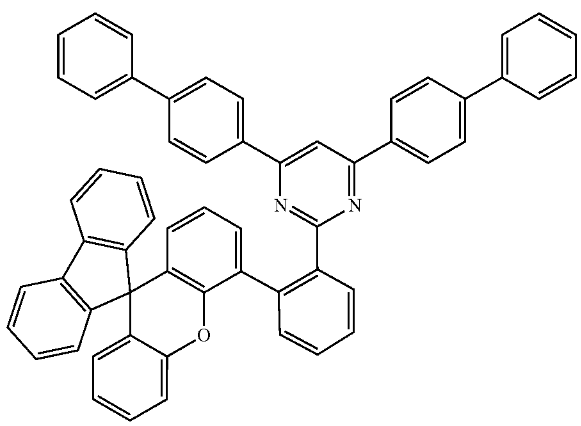
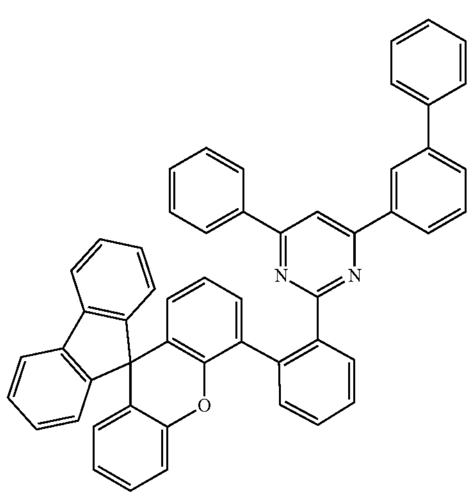
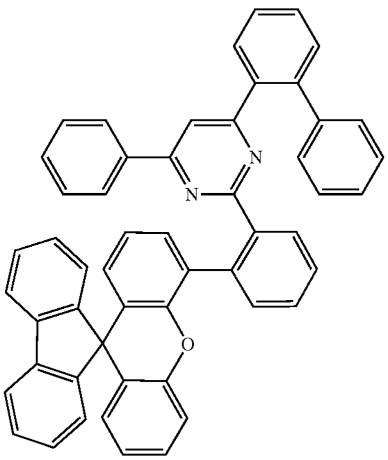
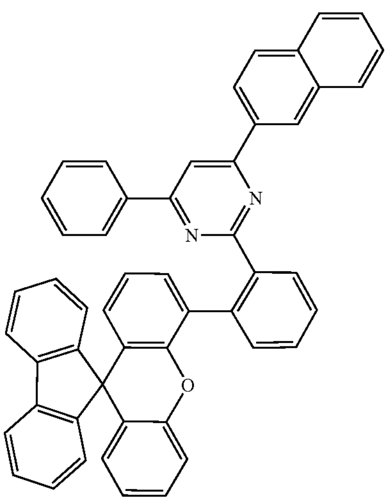
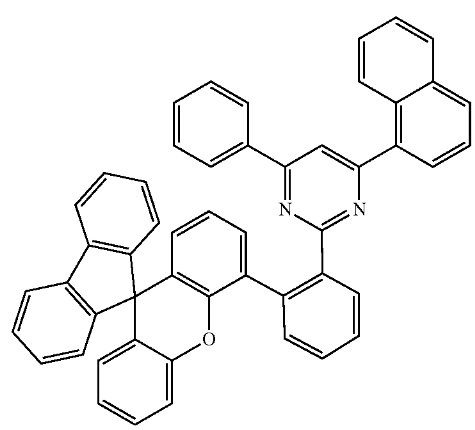

-continued
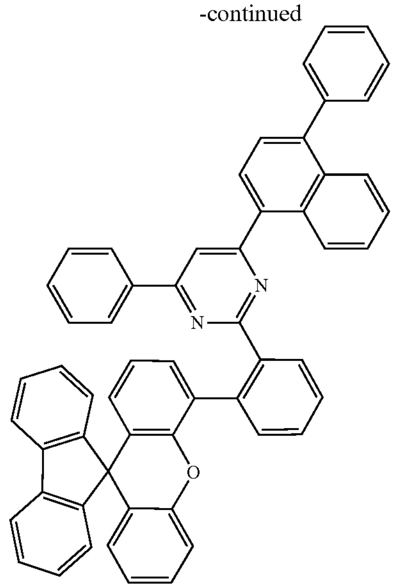
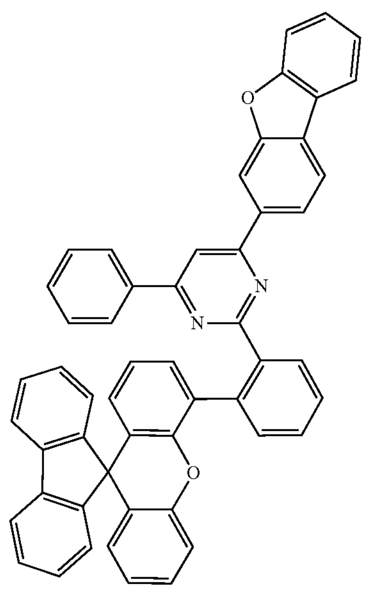
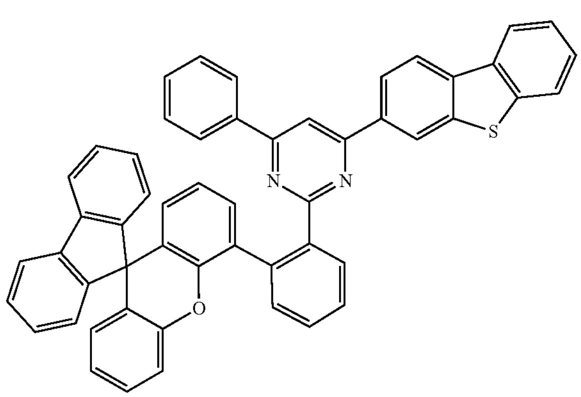
-continued
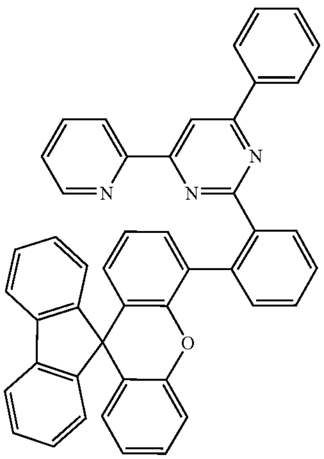
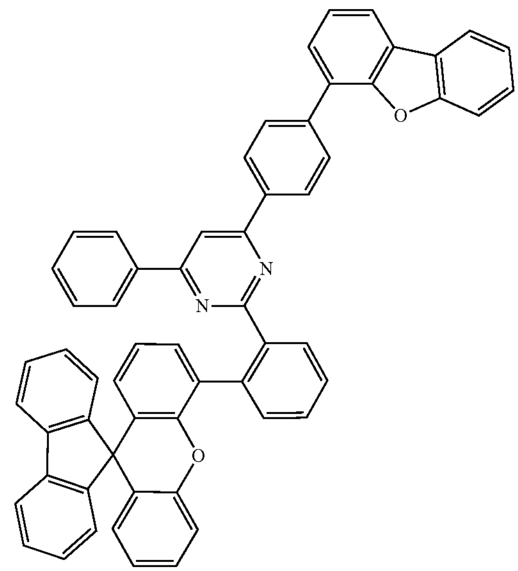
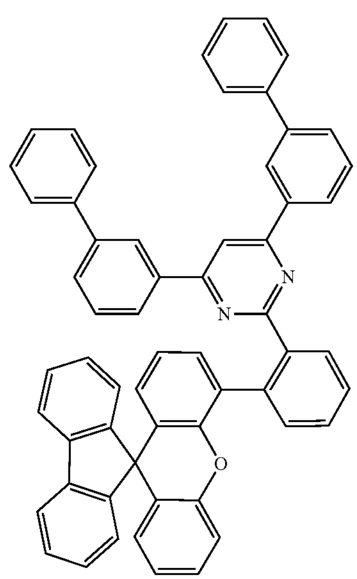

-continued
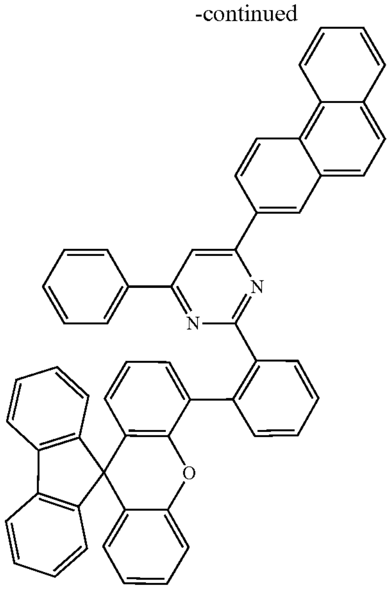
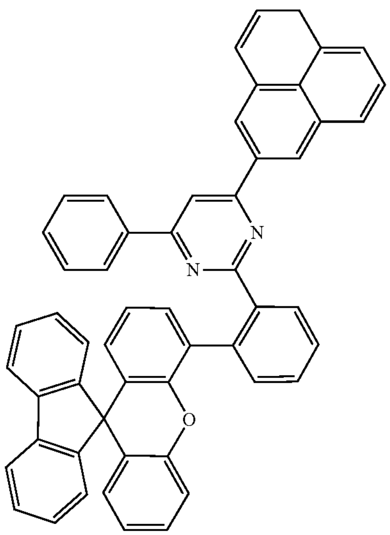
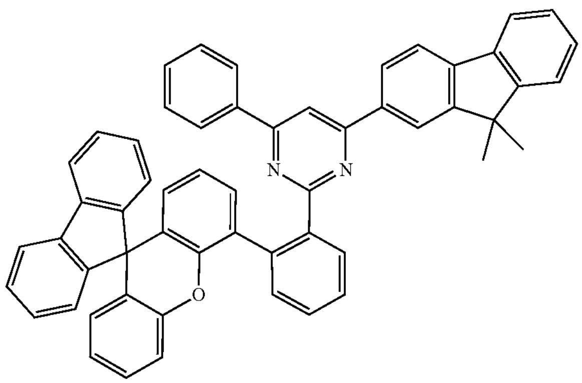
-continued
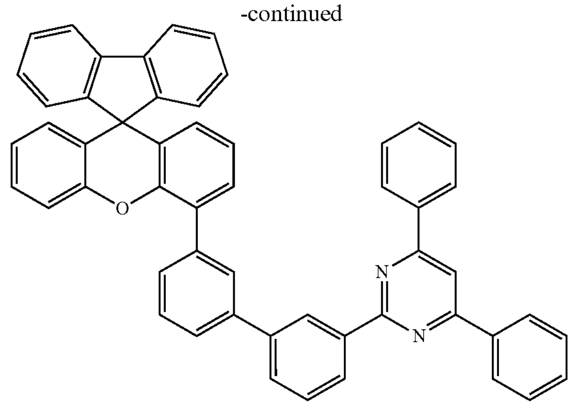
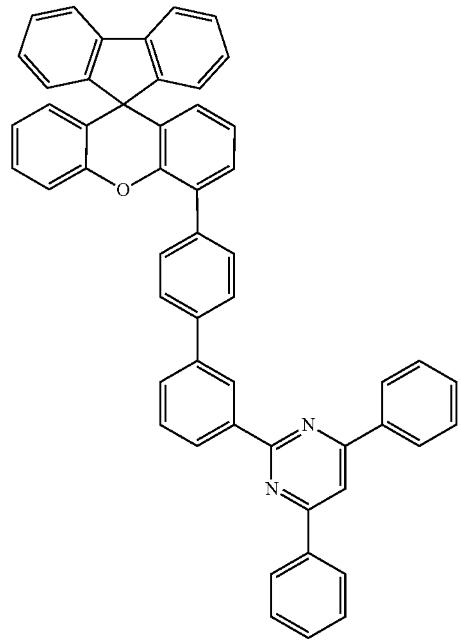
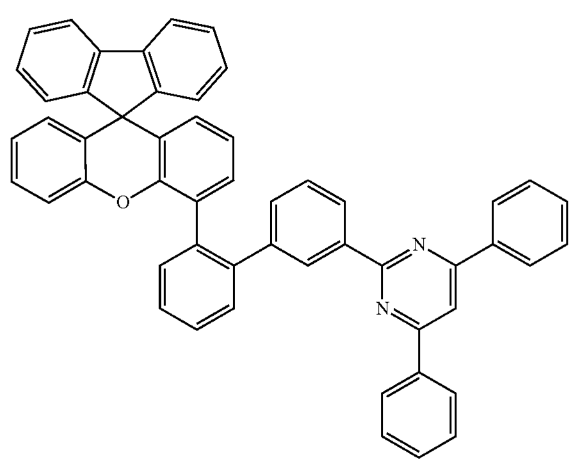

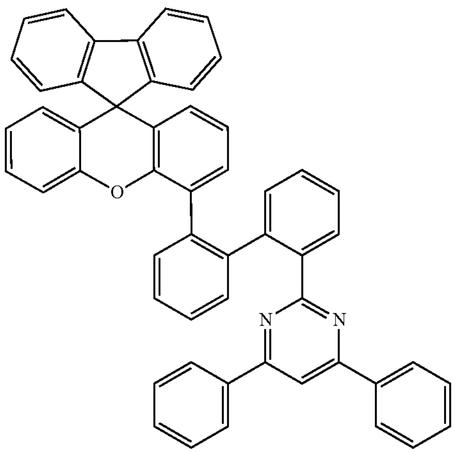
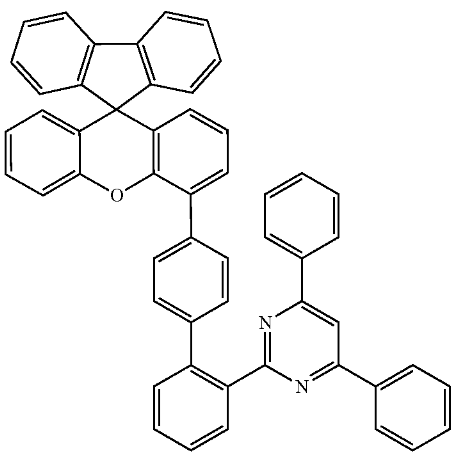
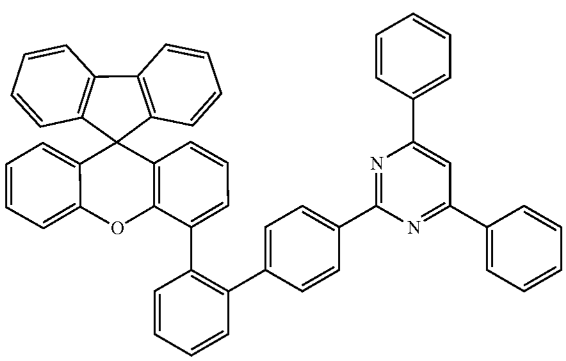
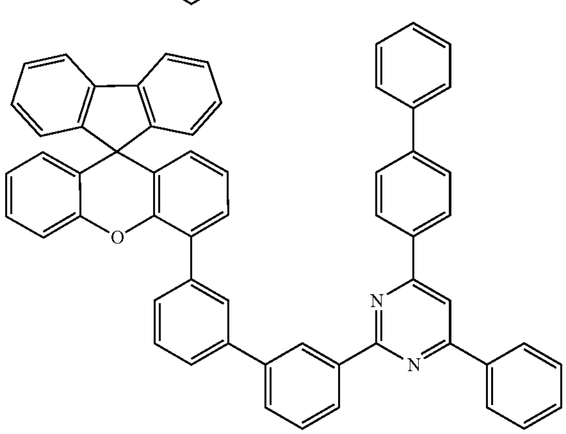
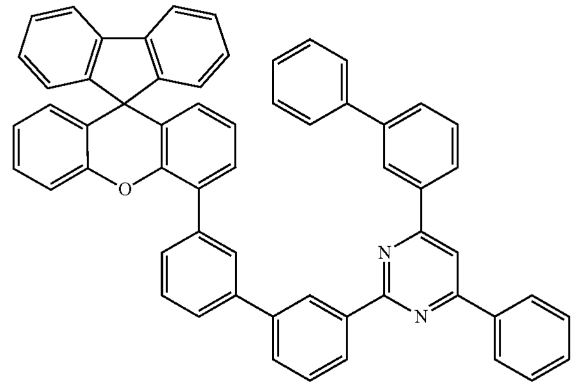
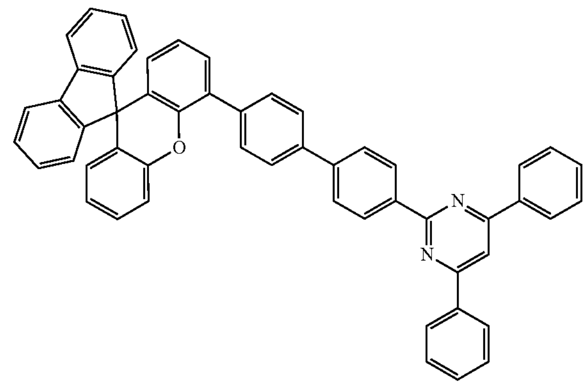
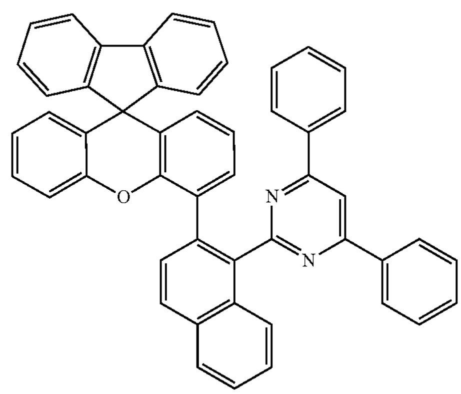
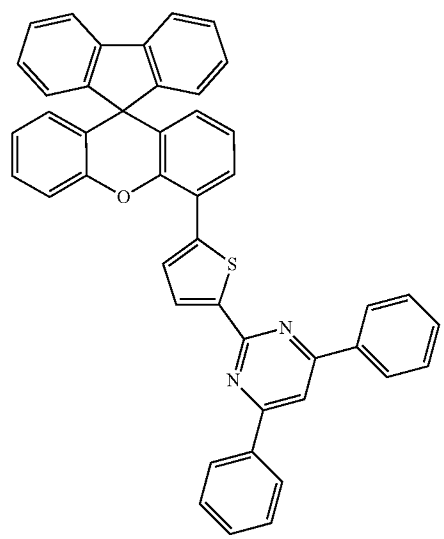

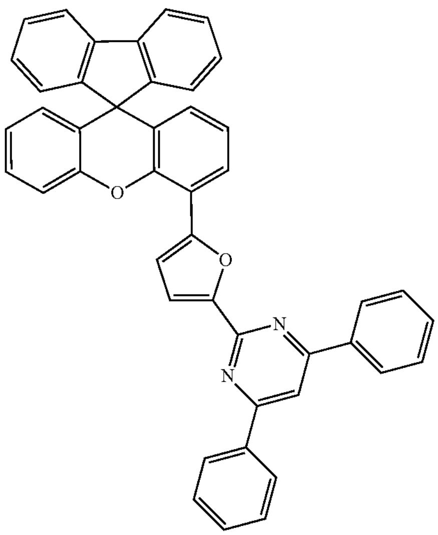
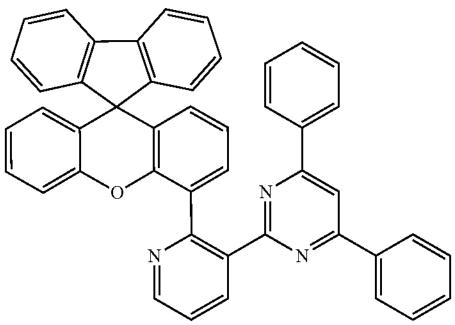
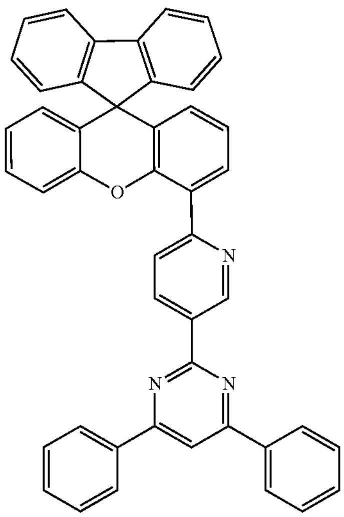
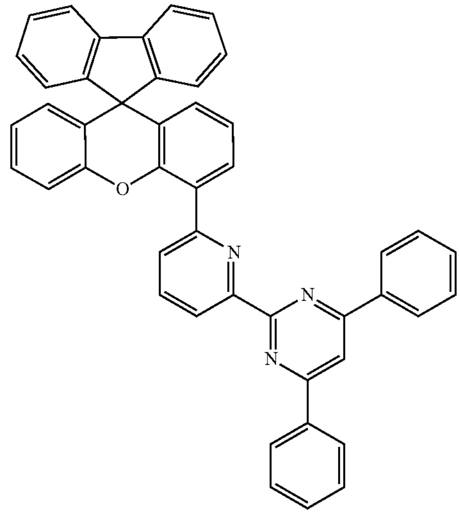
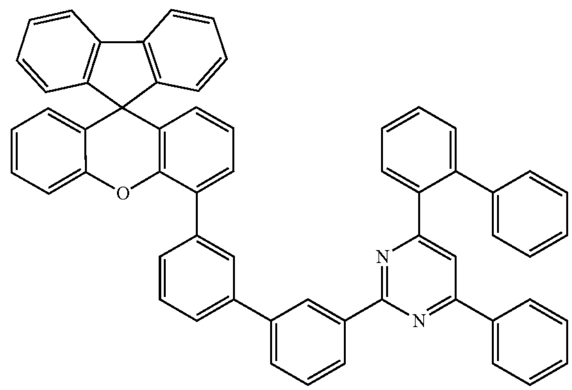
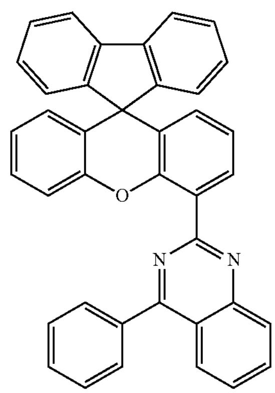
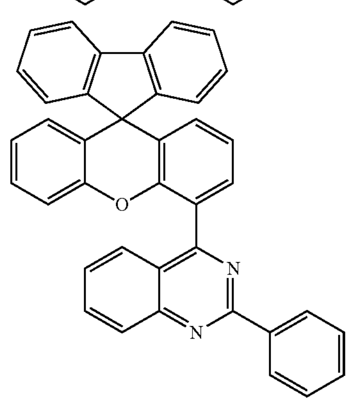

-continued
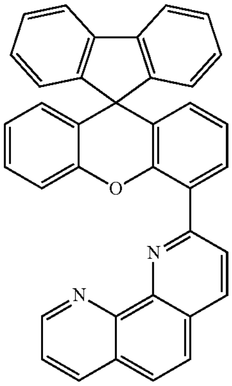
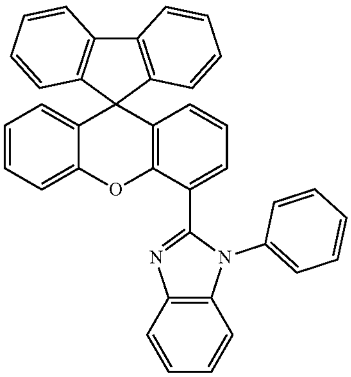
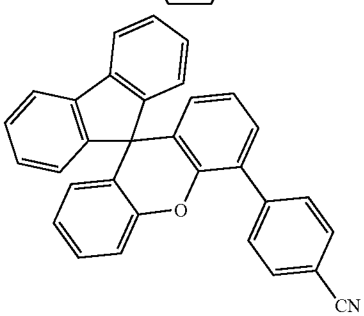
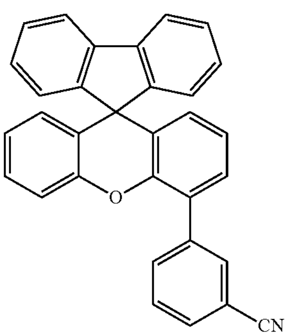
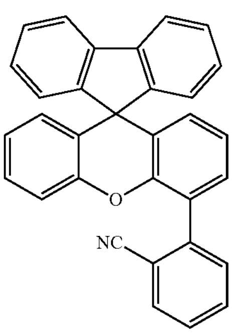
-continued
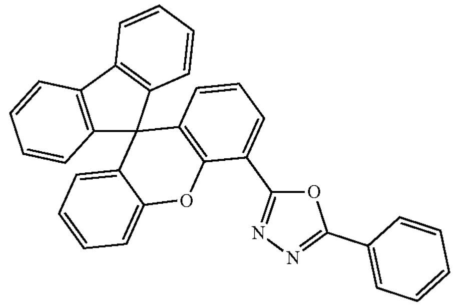
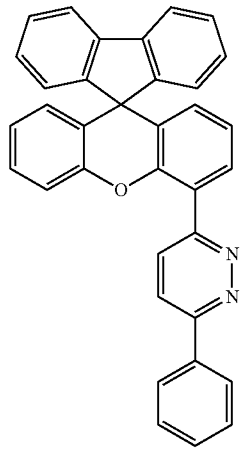
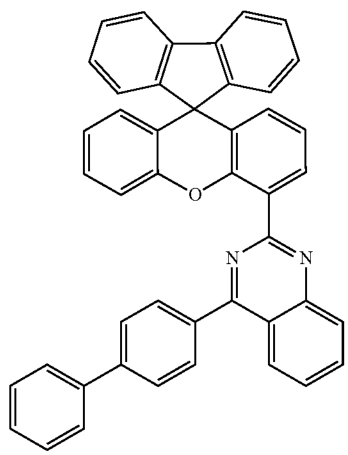
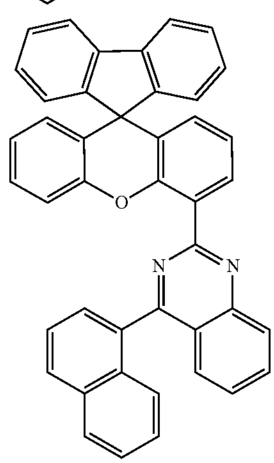

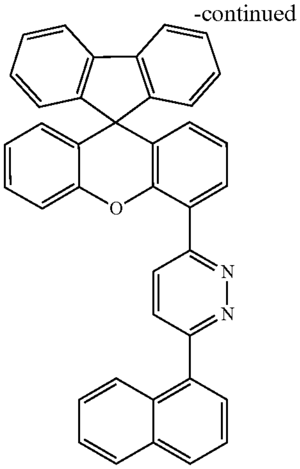
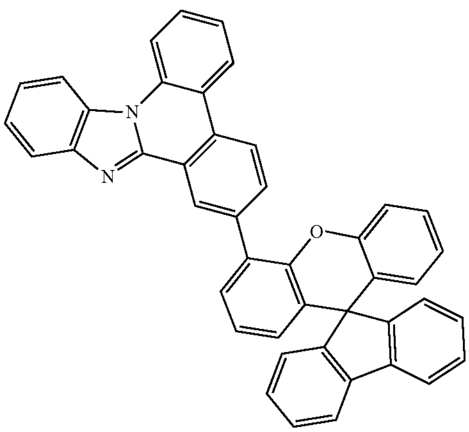
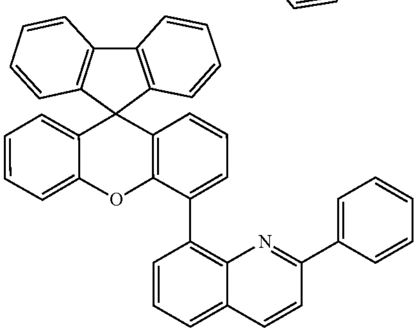
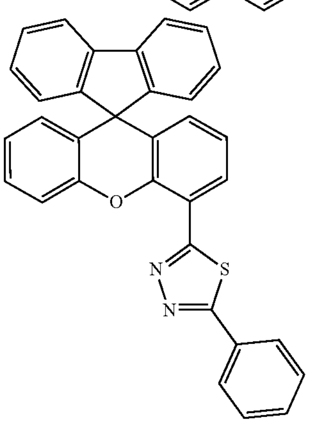
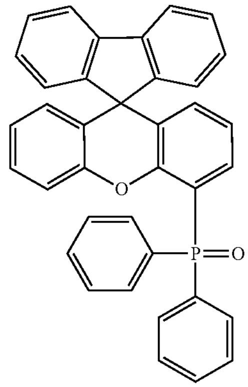
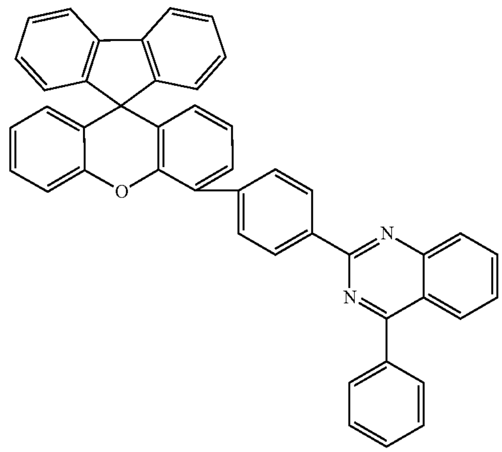
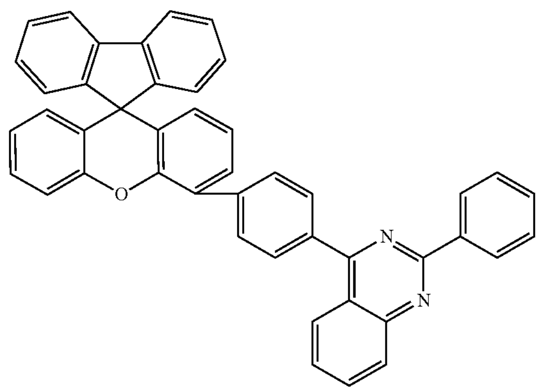
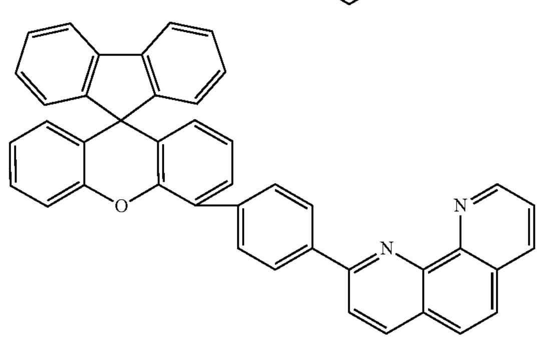

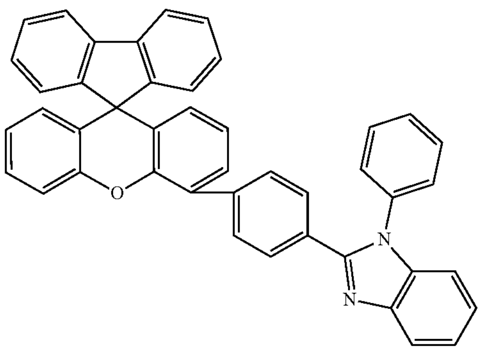
O
N
N
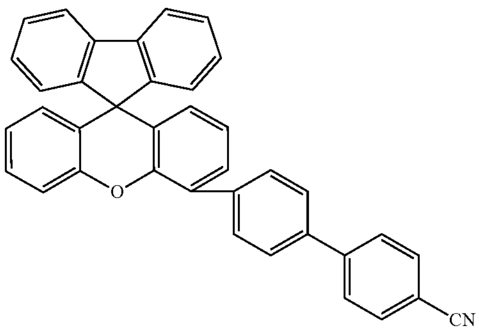
O
CN
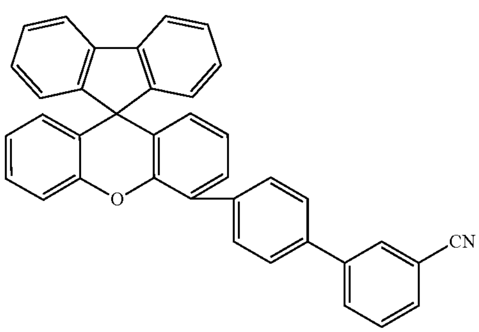
O
CN
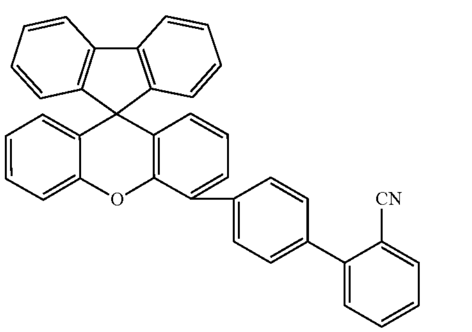
O
CN
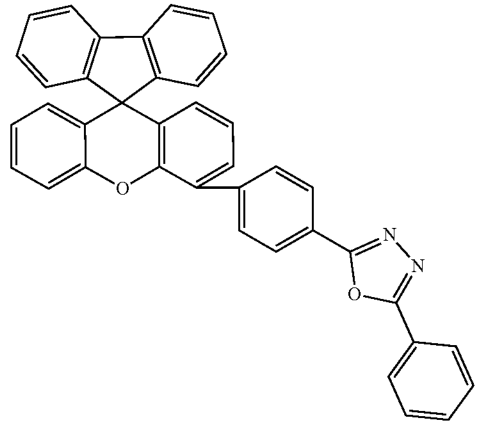
O
N
N
O
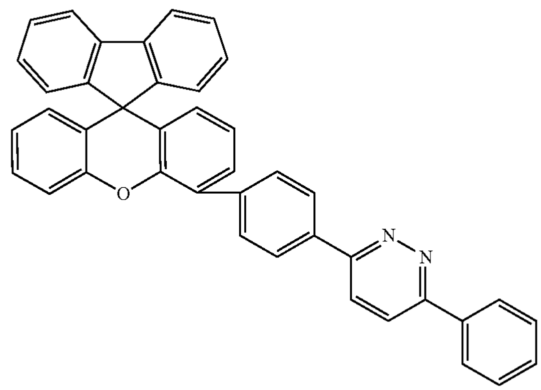
O
N
N
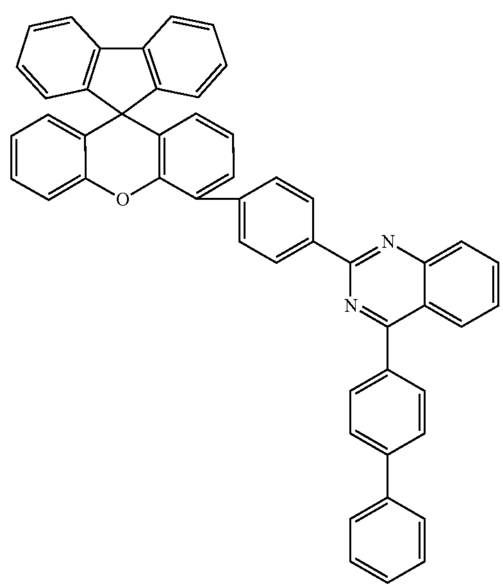
O
N
N -continued
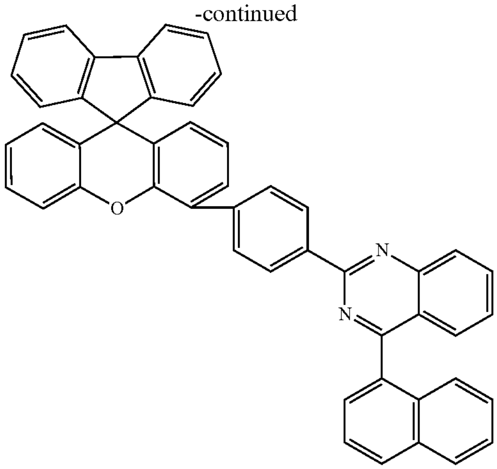
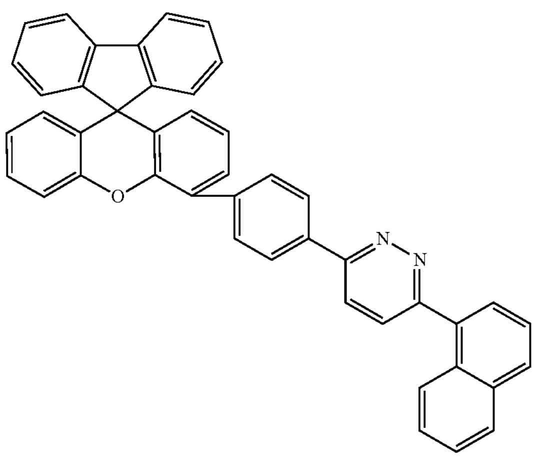
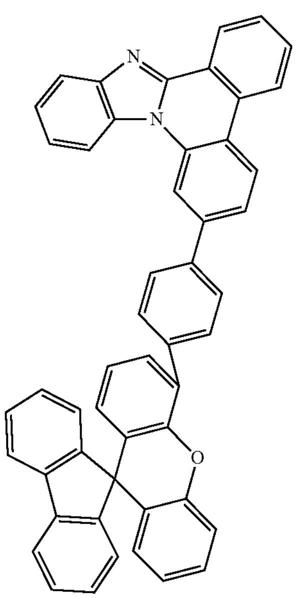
-continued
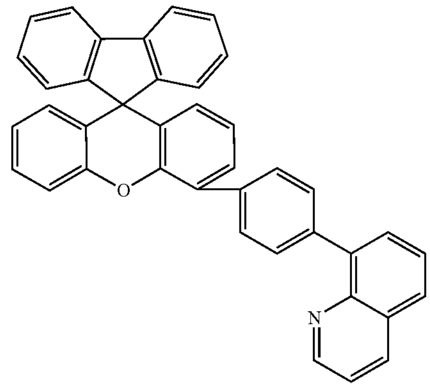
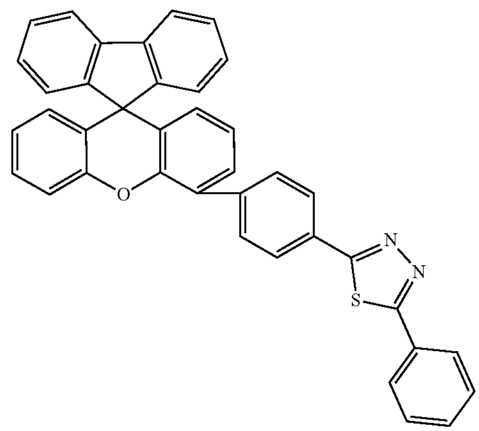
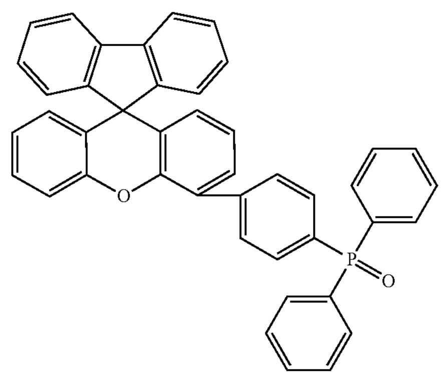
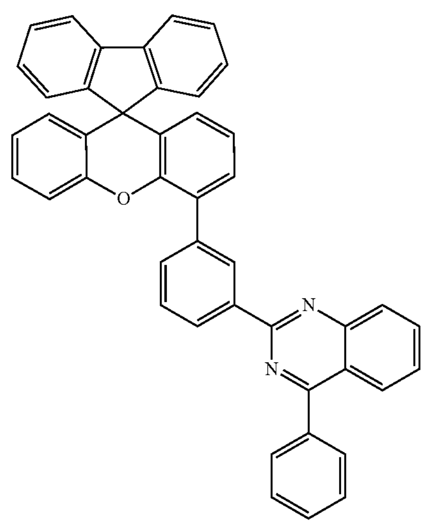

-continued
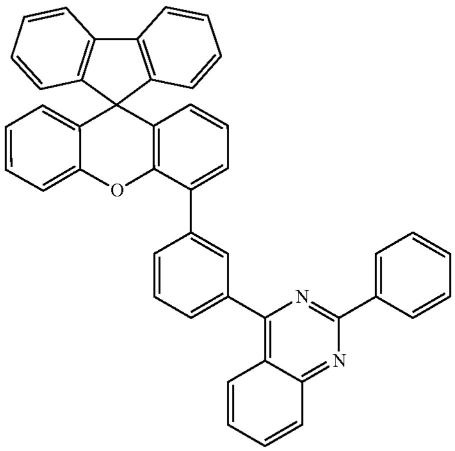
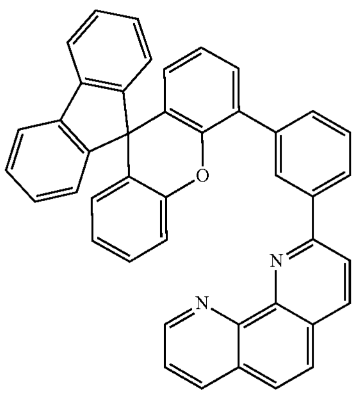
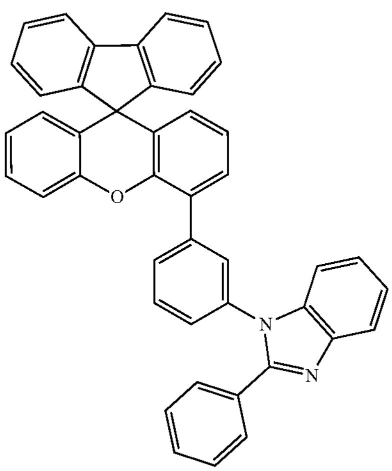
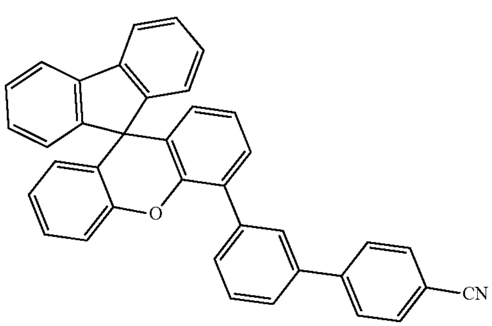
-continued
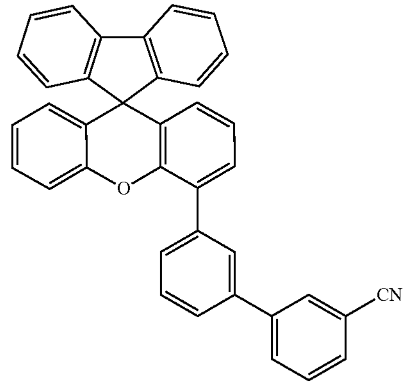
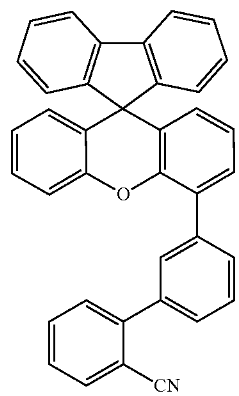
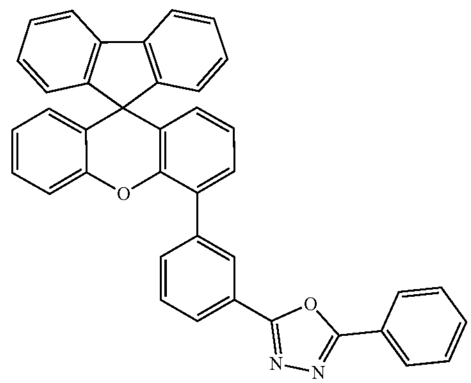
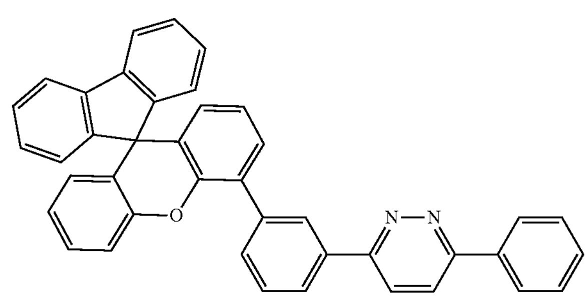

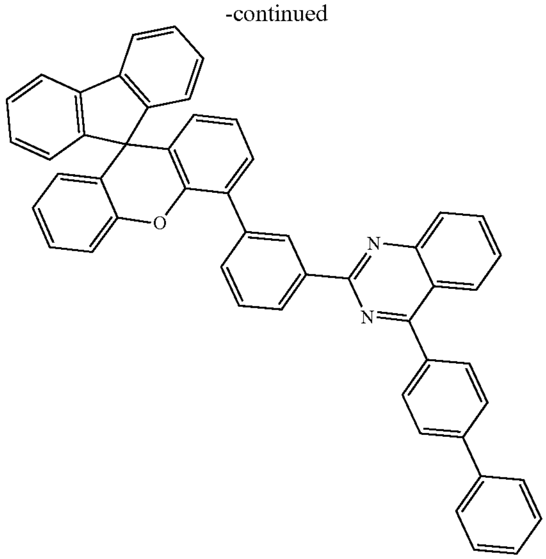
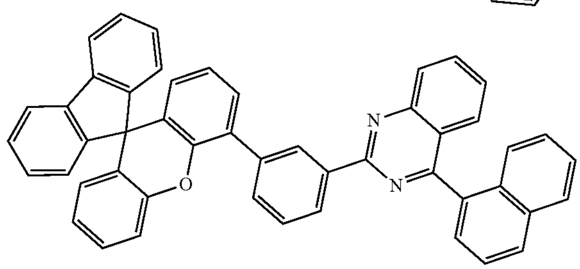
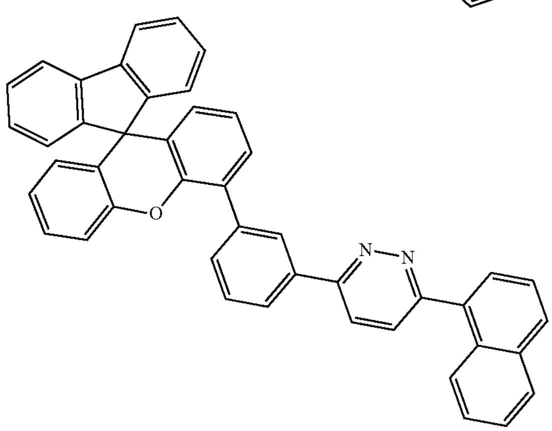
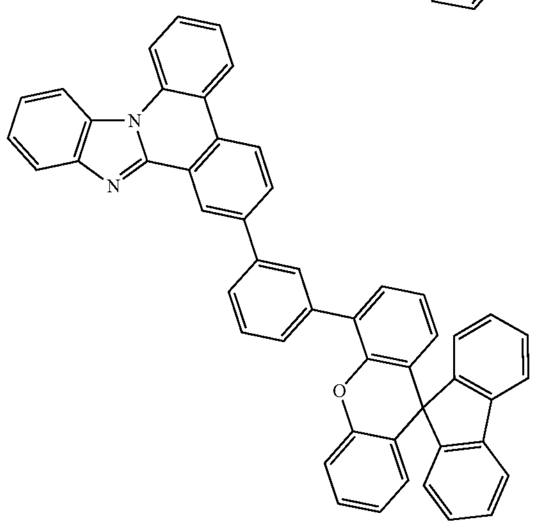
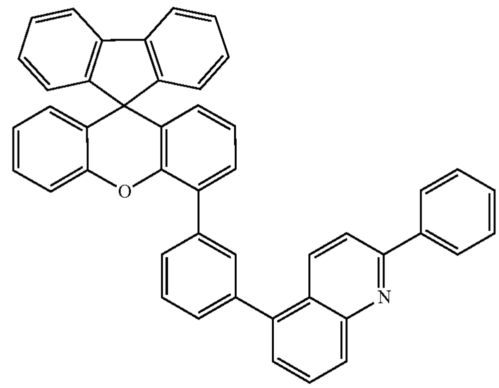
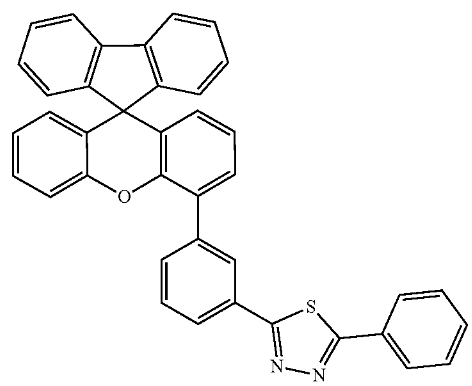
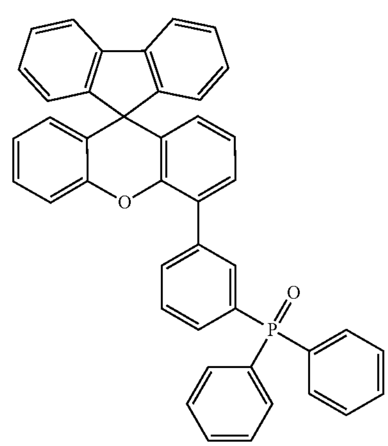

-continued
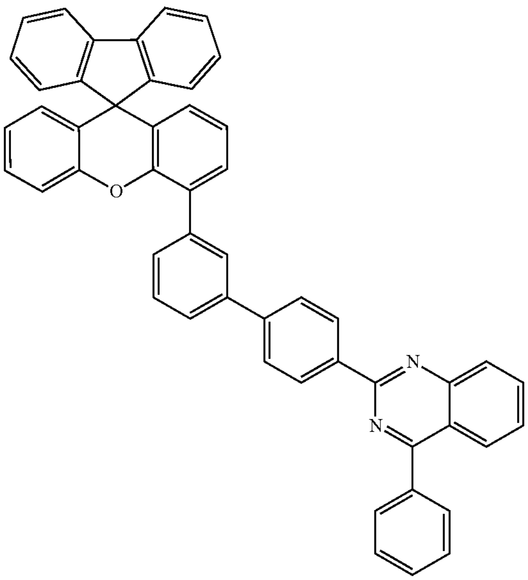
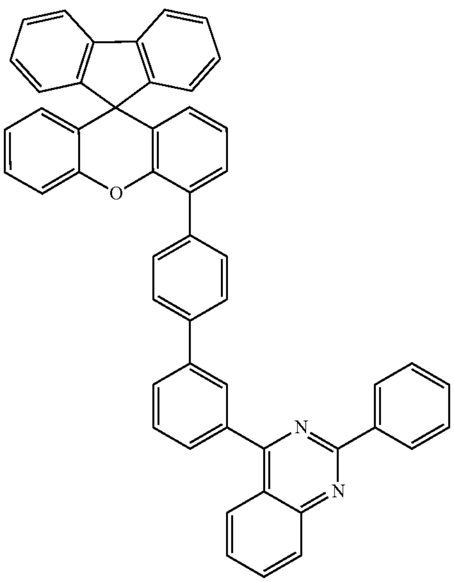
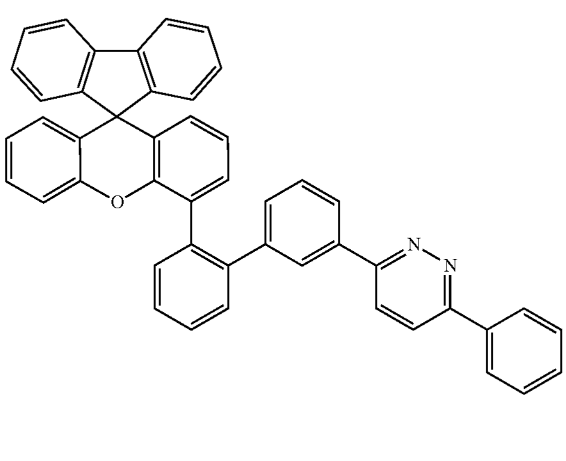
-continued
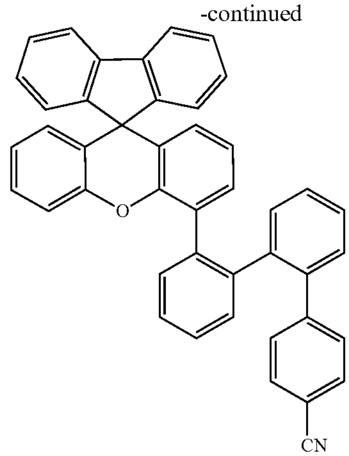
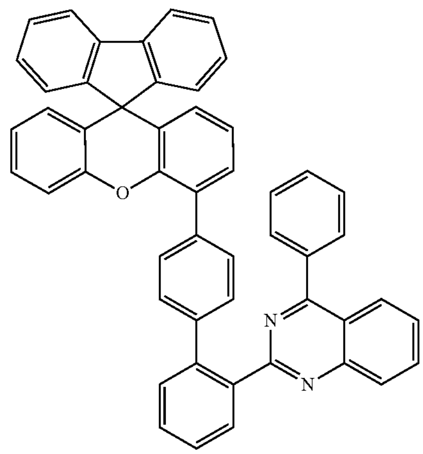
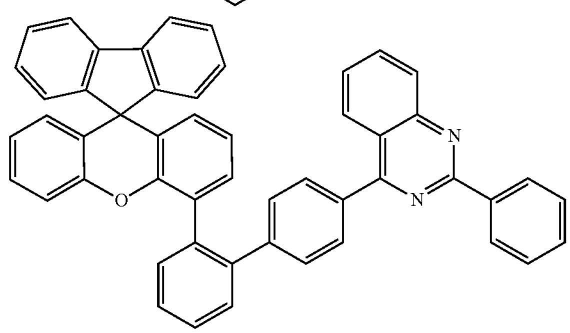
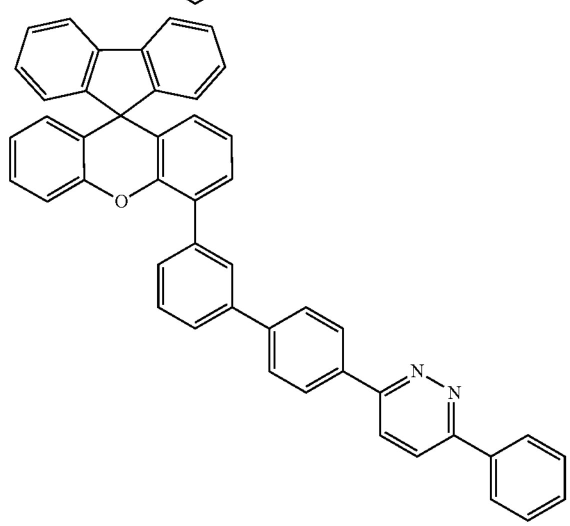

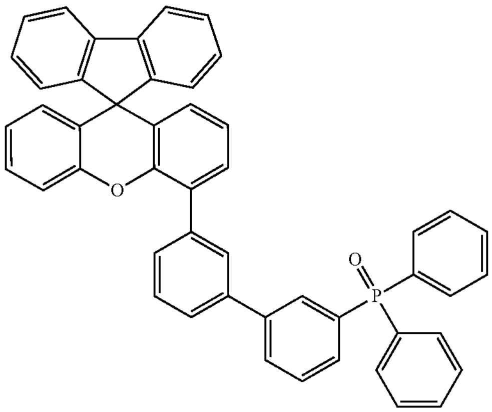
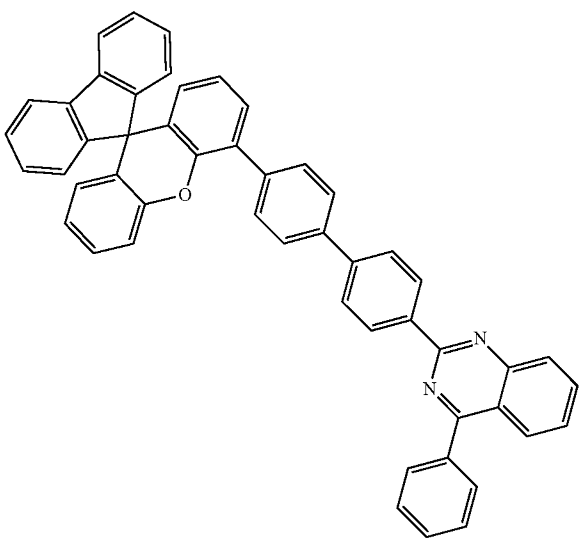
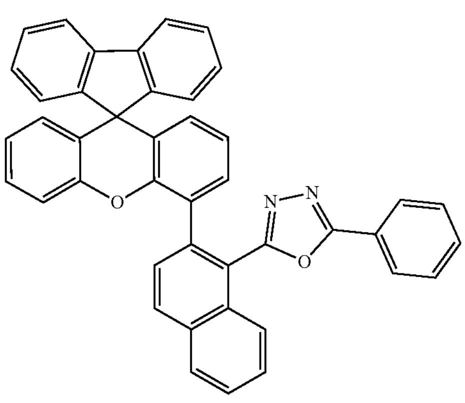
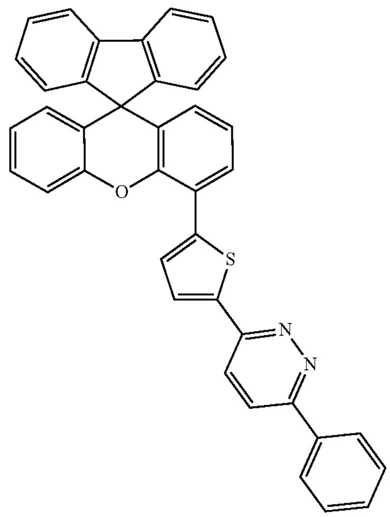
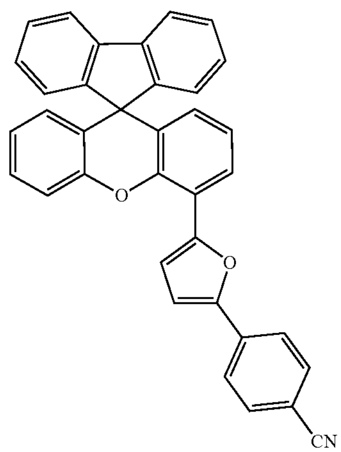
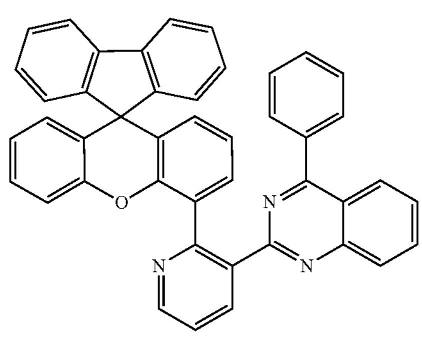

-continued
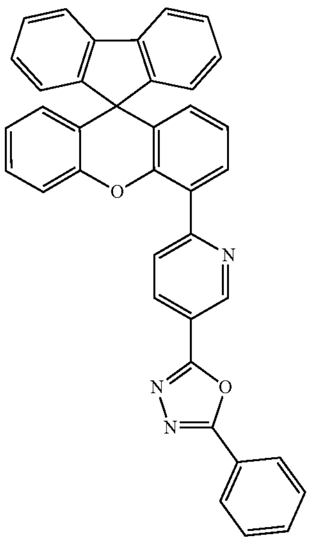
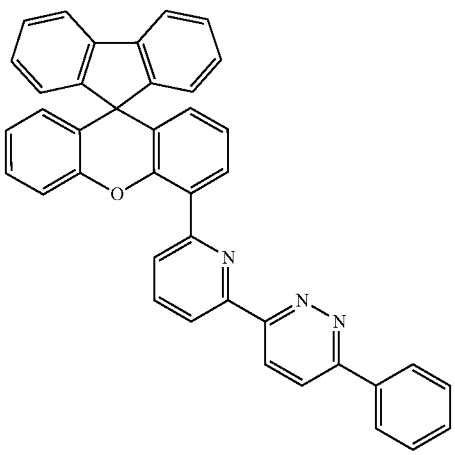
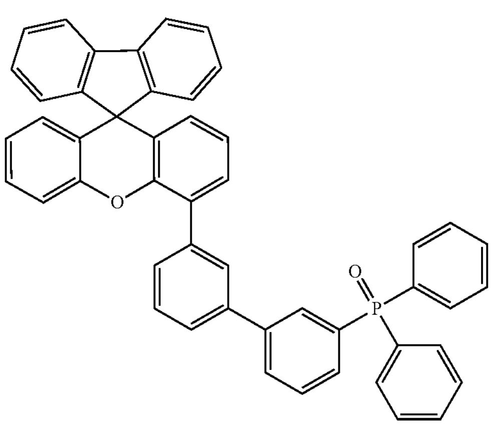
-continued
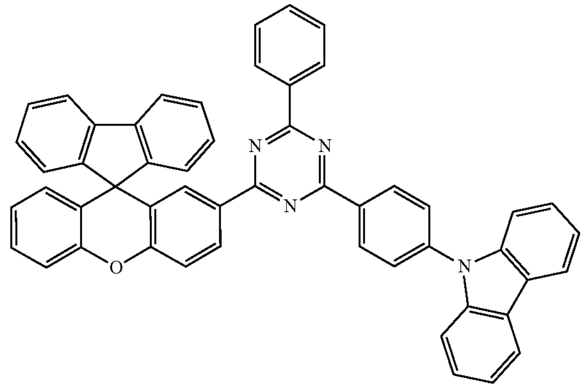
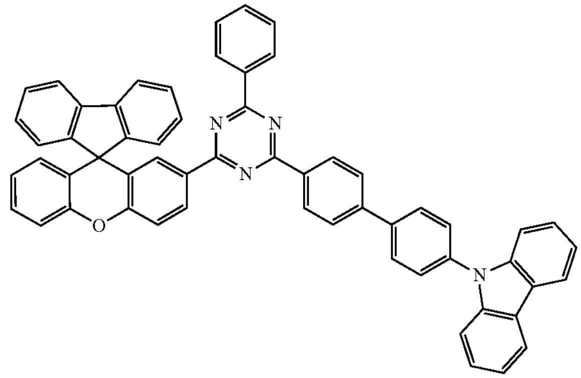
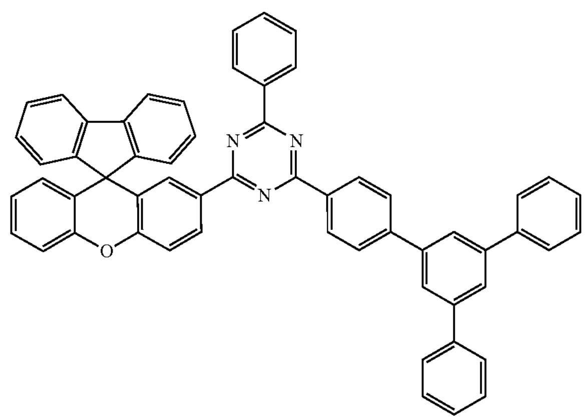
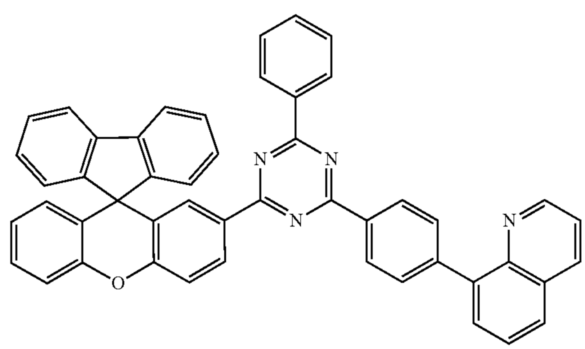

-continued
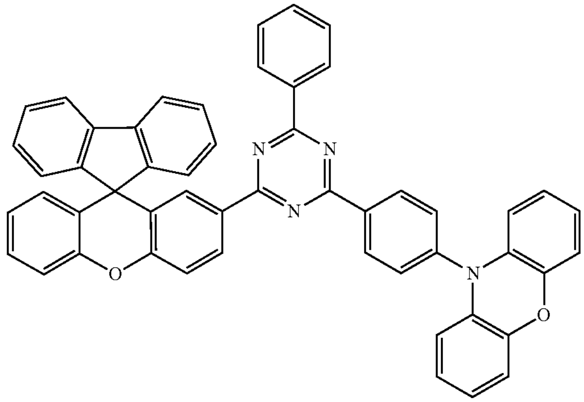
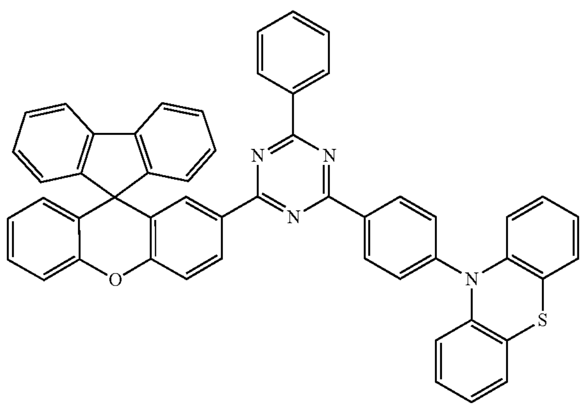
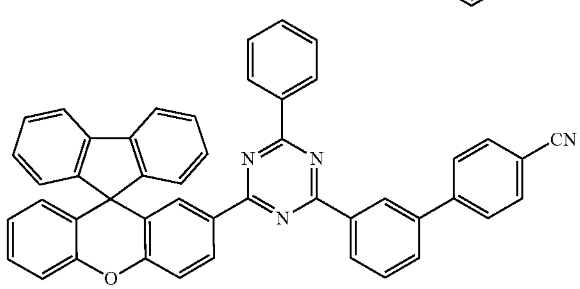
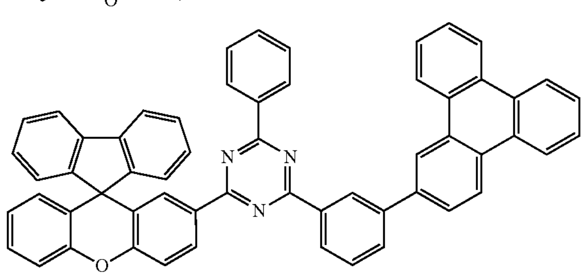
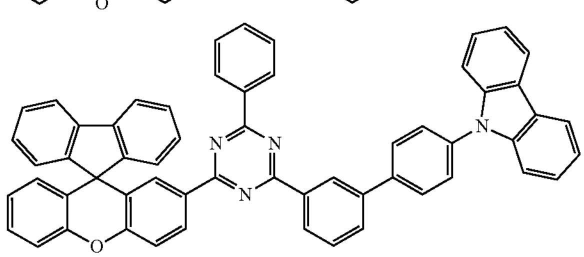
-continued
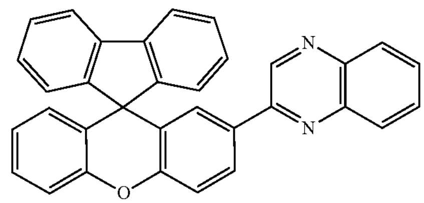
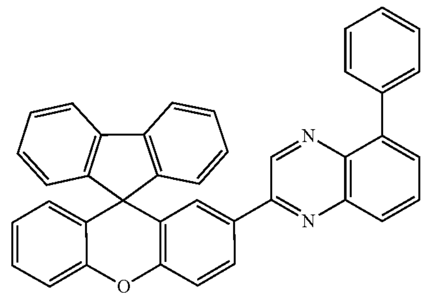
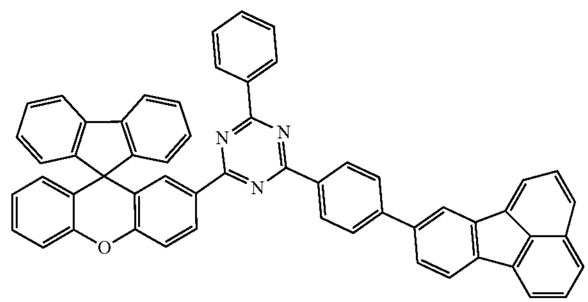
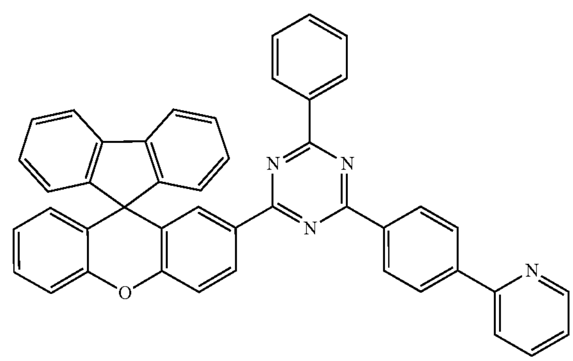
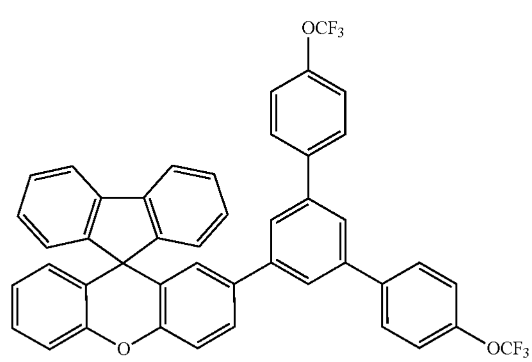

-continued
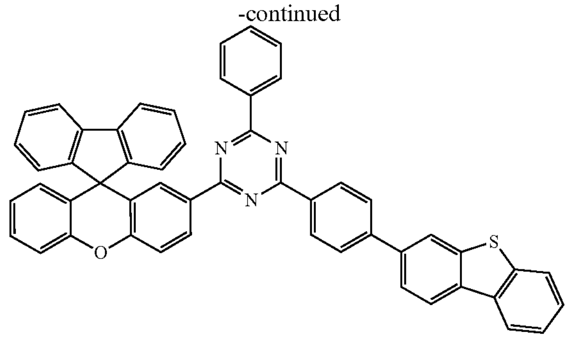
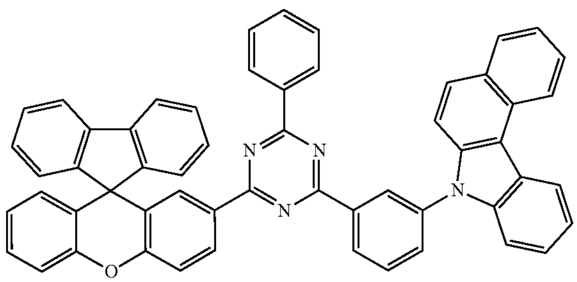
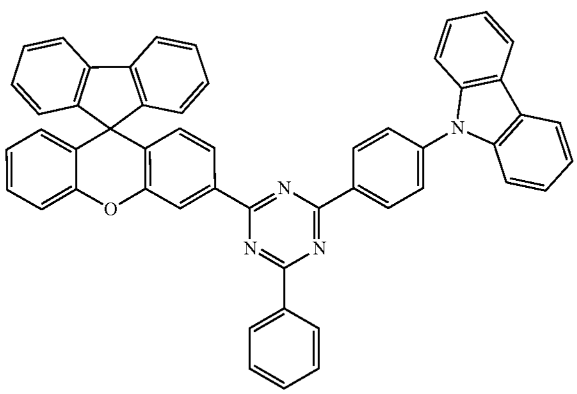
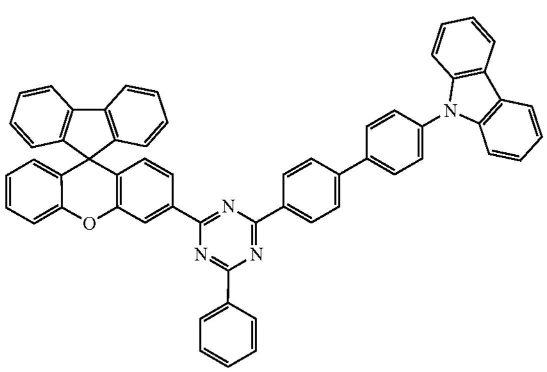
-continued
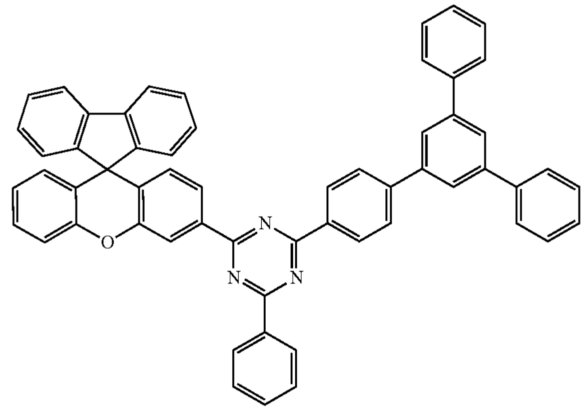
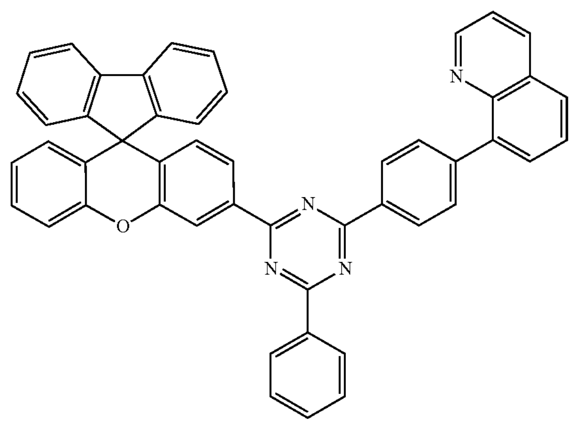
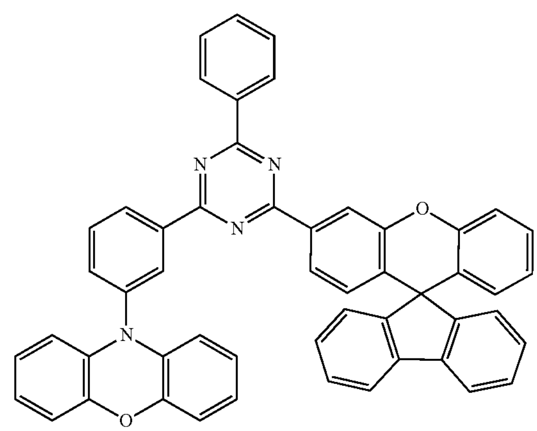
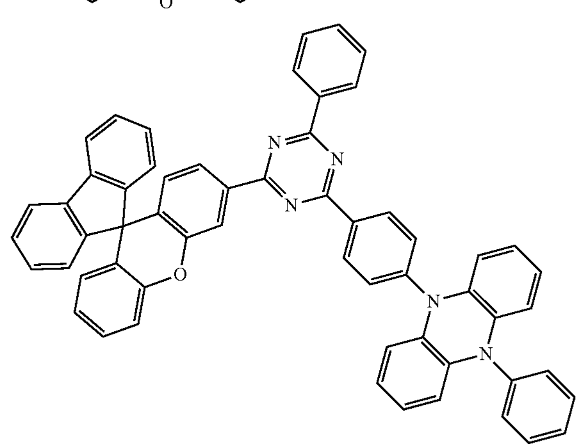

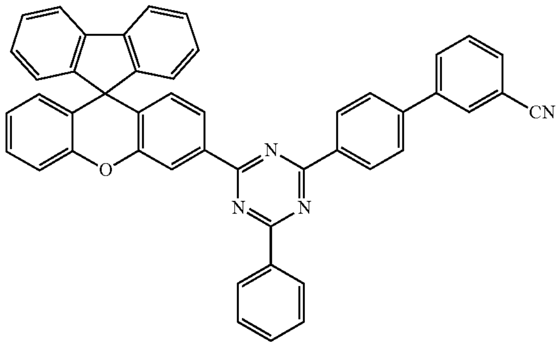
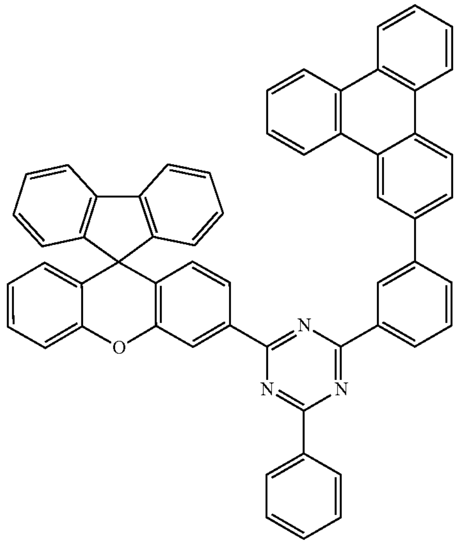
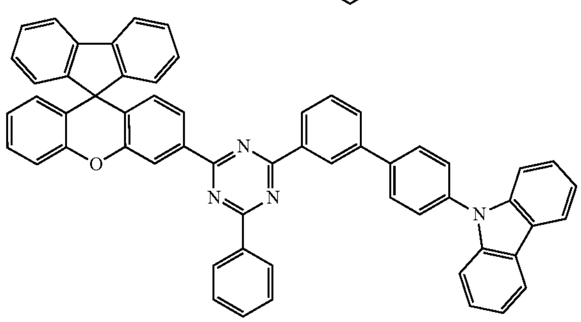
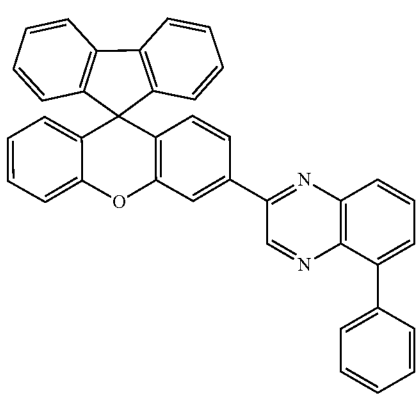
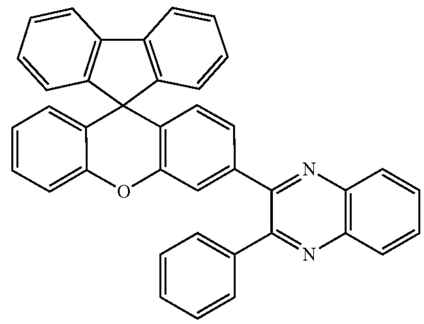
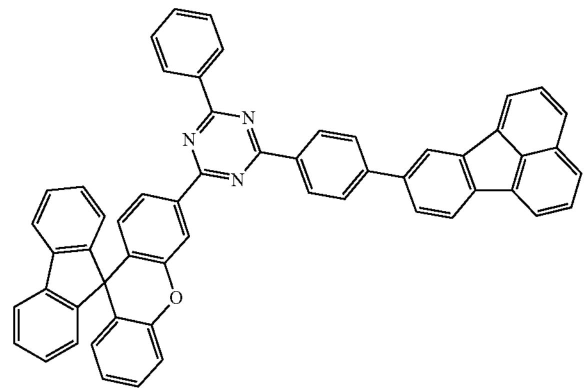
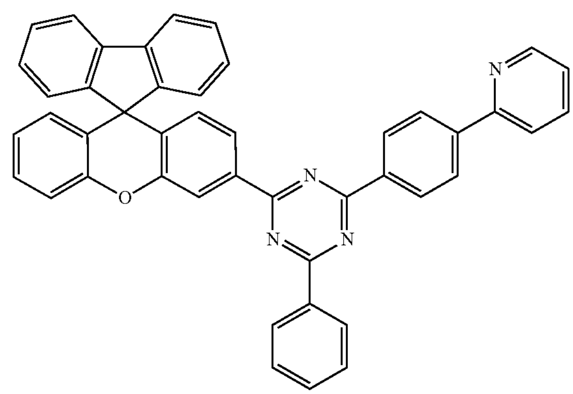
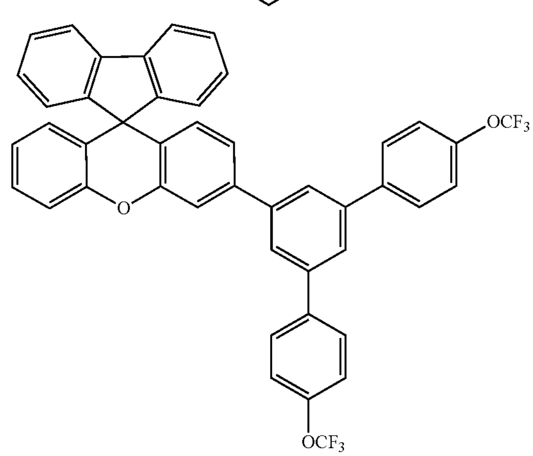

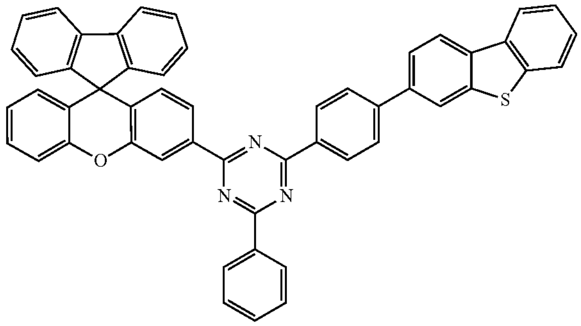
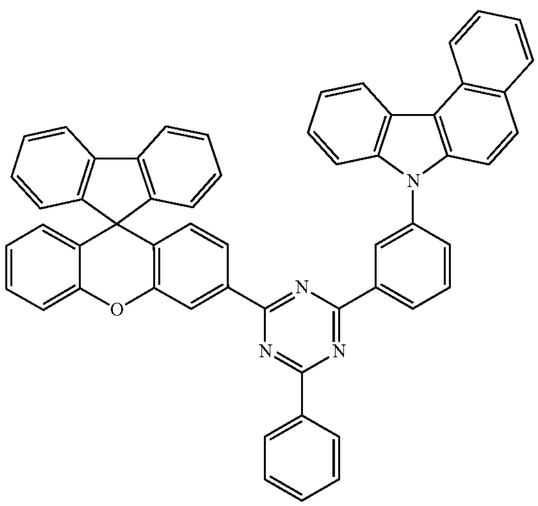
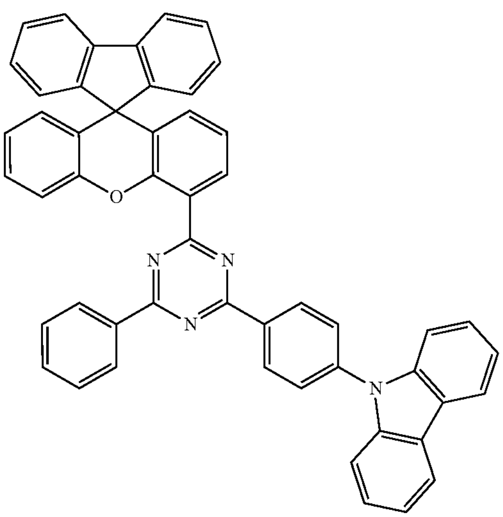
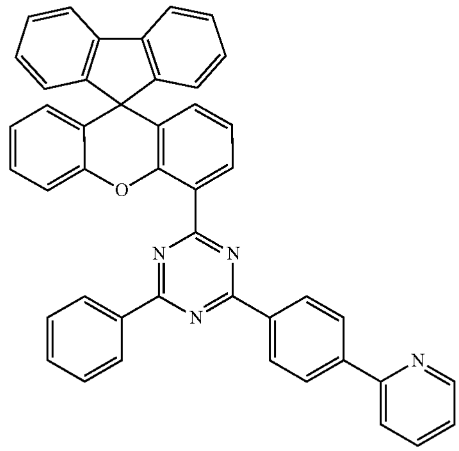
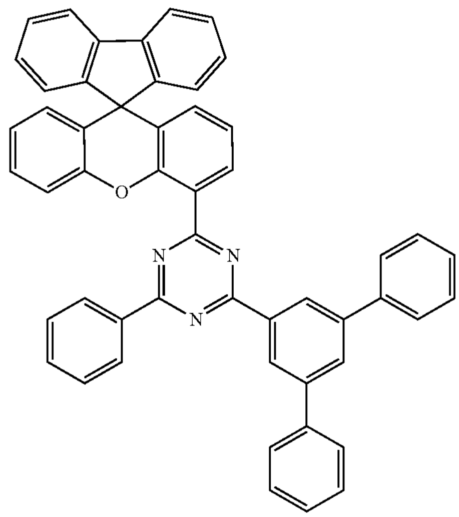
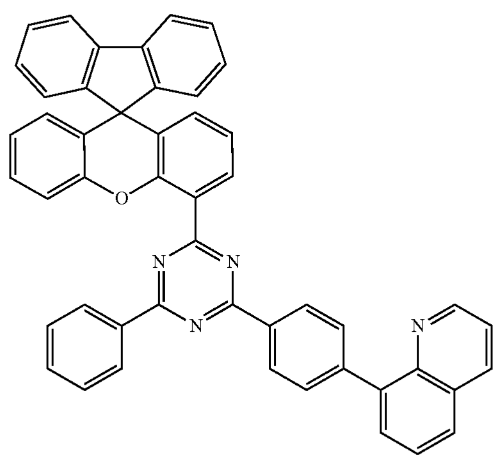

-continued
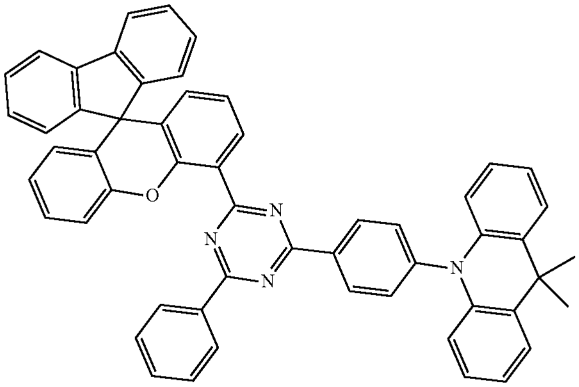
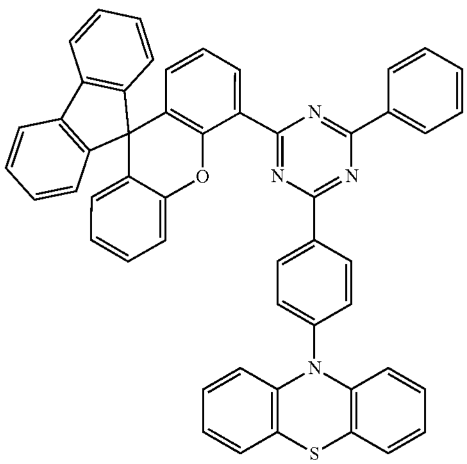
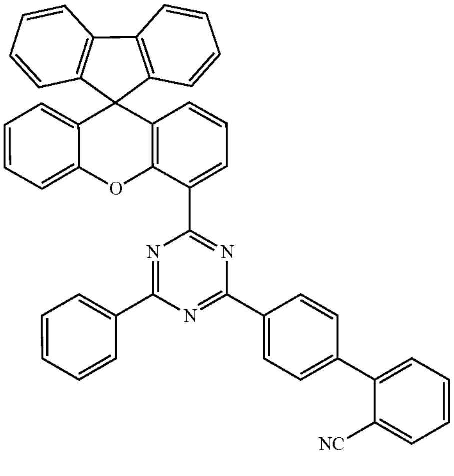
-continued
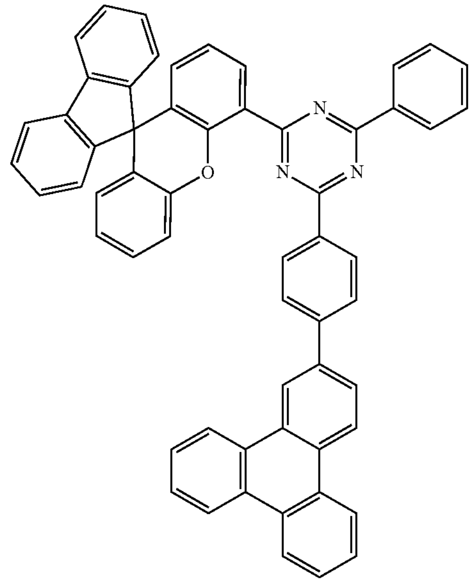
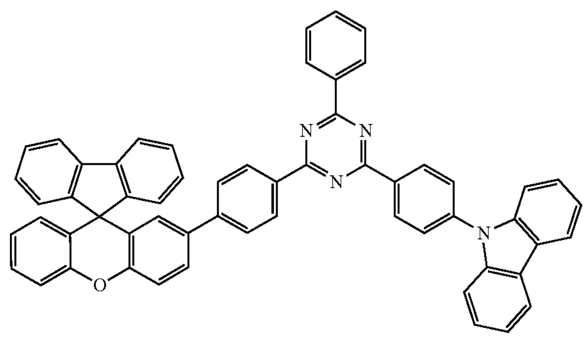
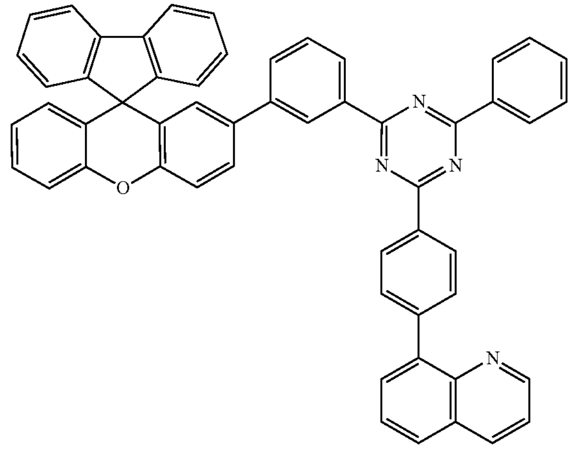

-continued
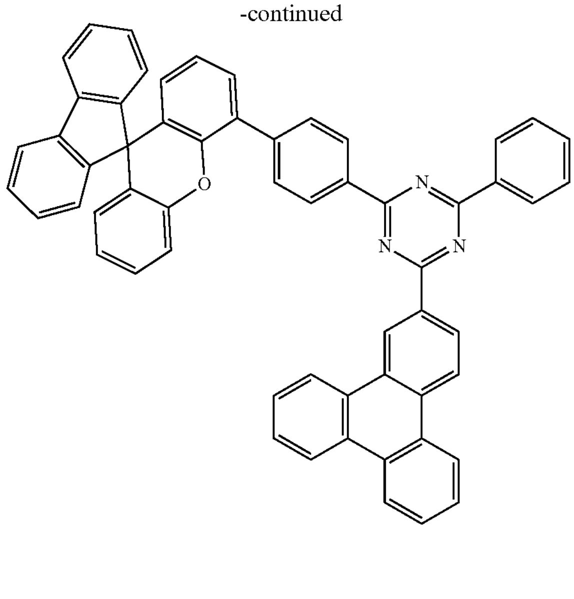
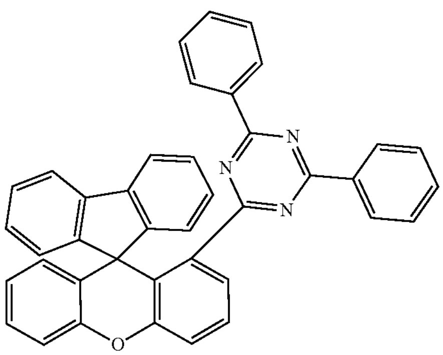
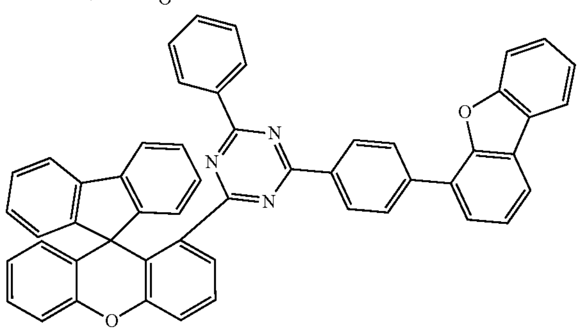
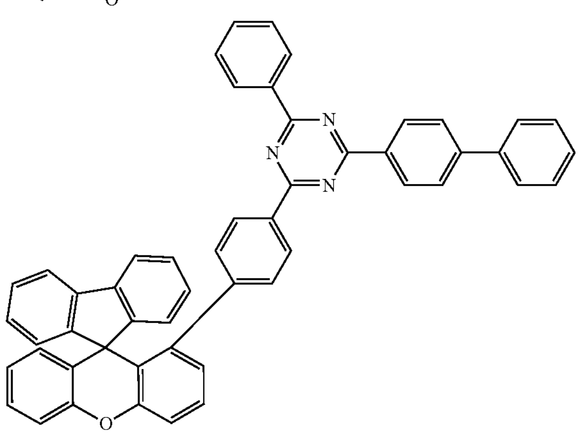
-continued
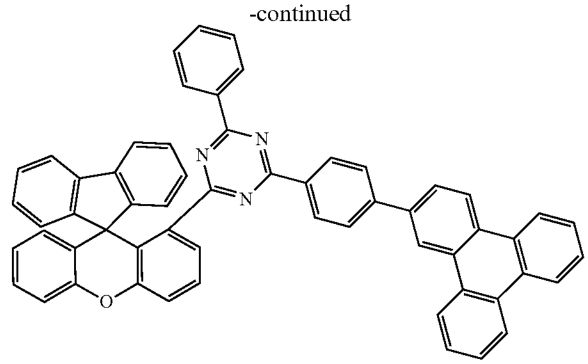
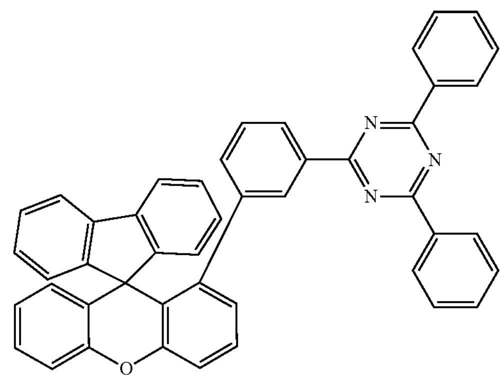
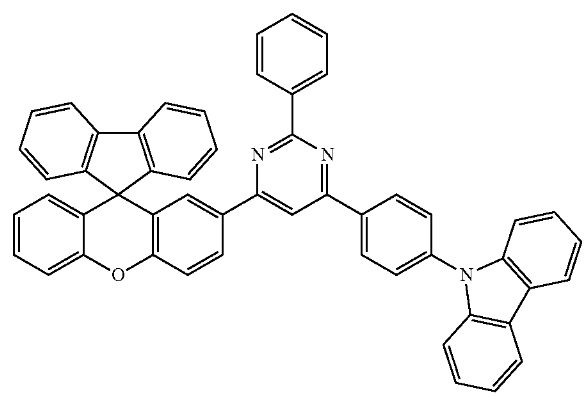
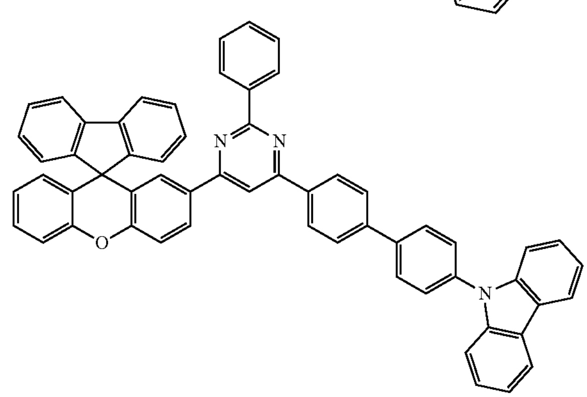

-continued
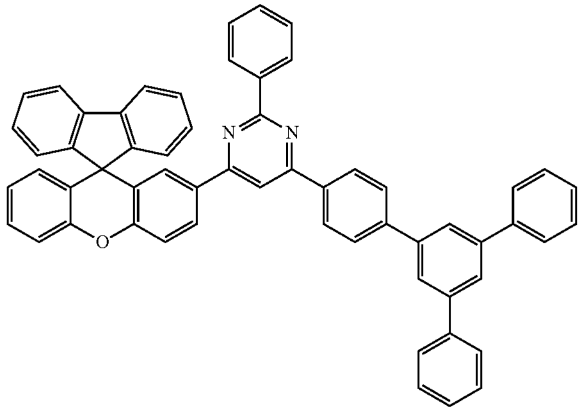
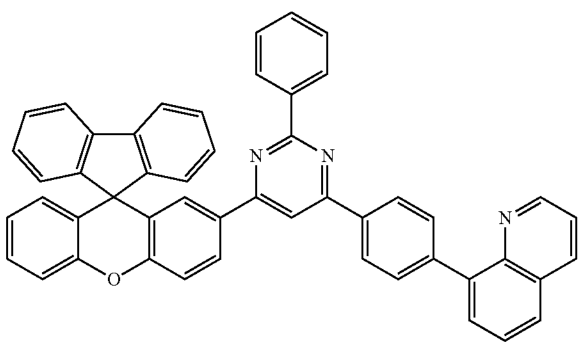
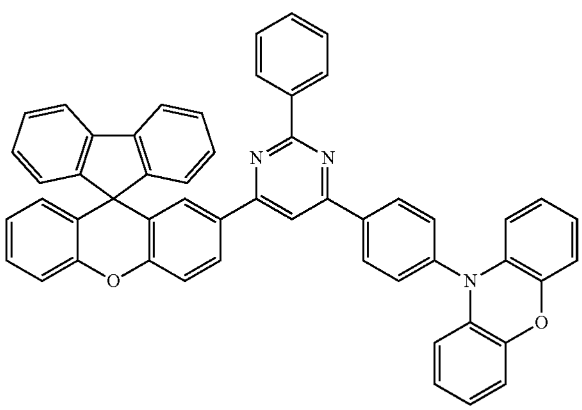
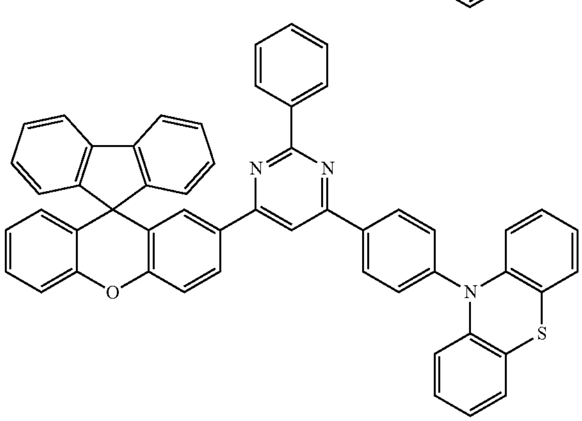
-continued
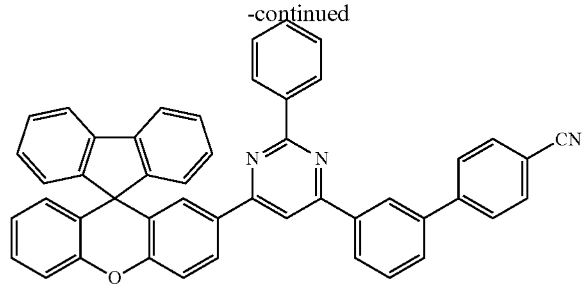
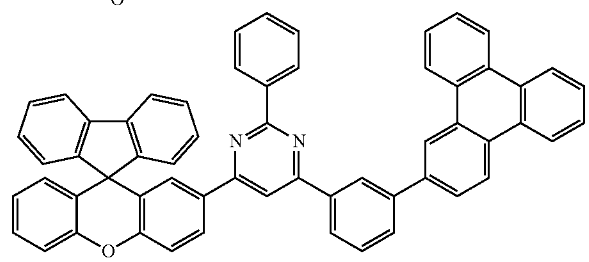
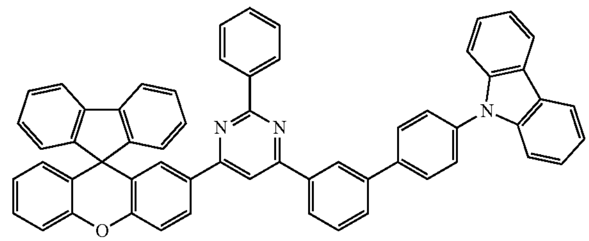
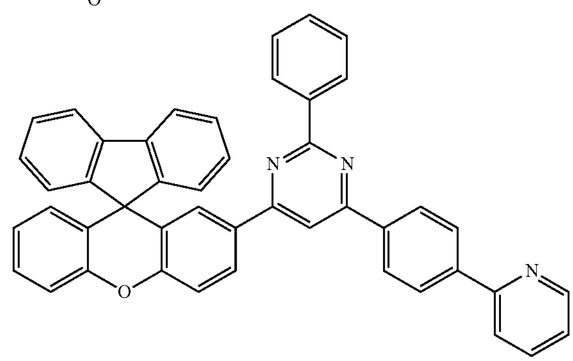
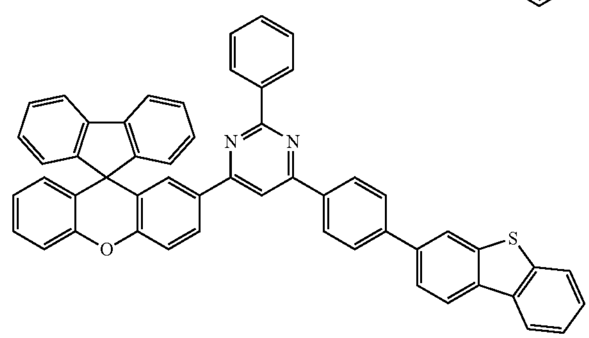
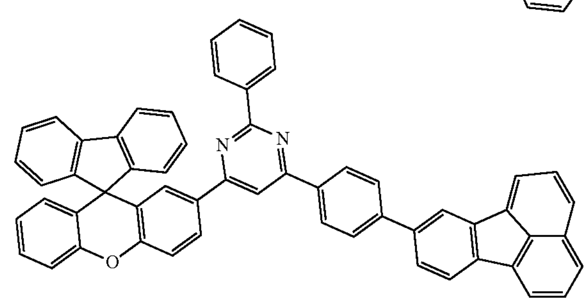

-continued
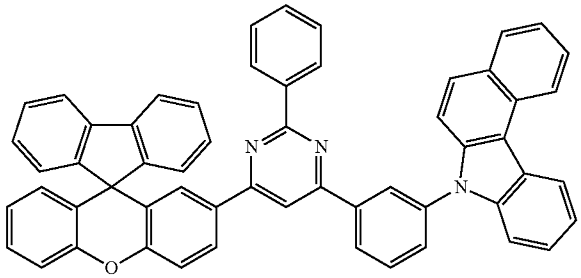
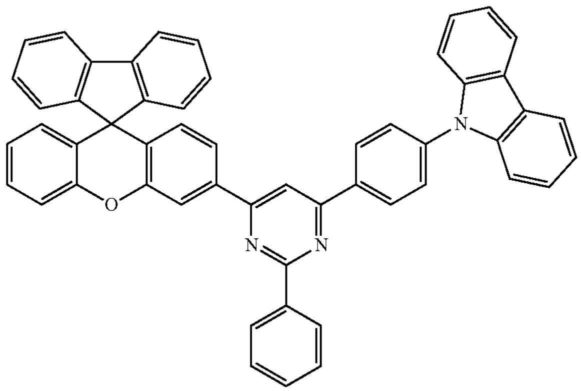
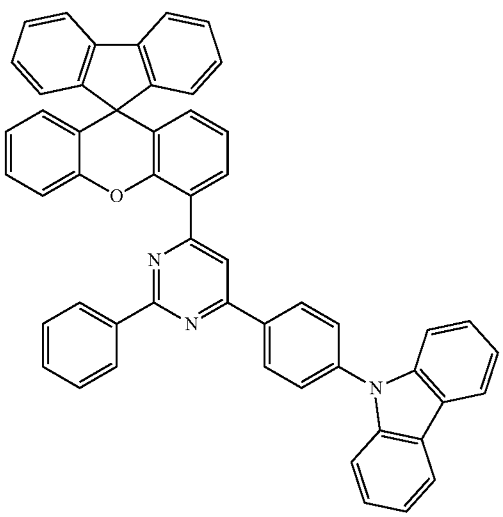
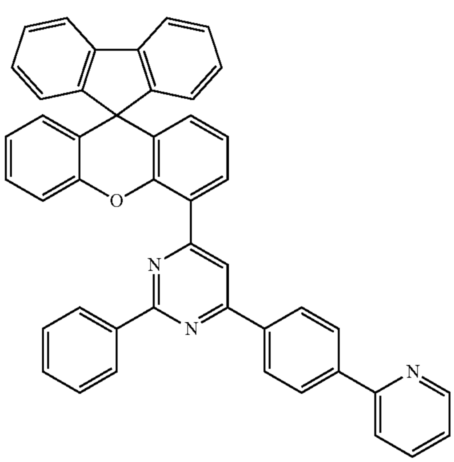
-continued
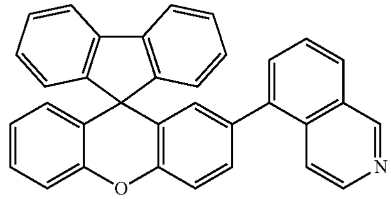
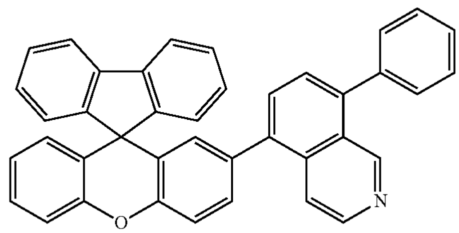
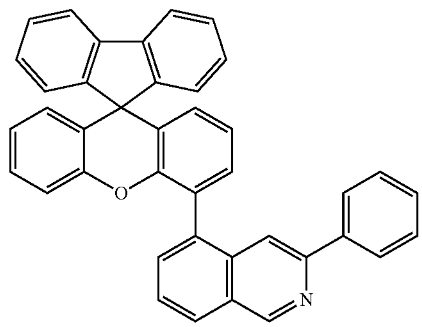
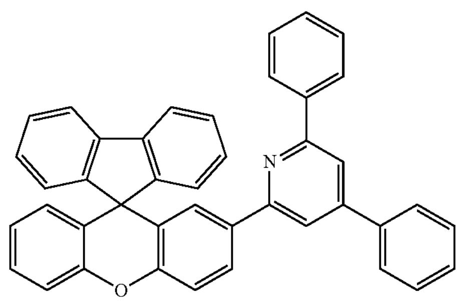
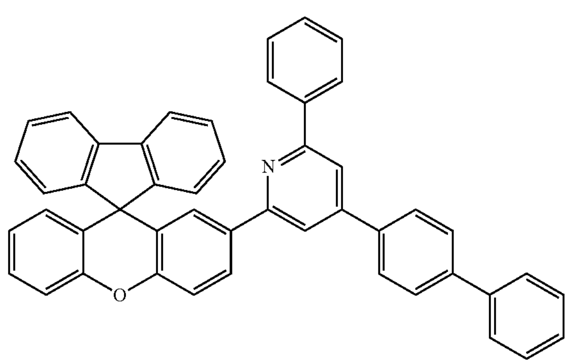

-continued

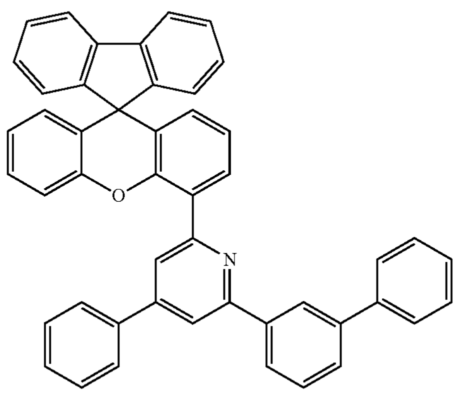

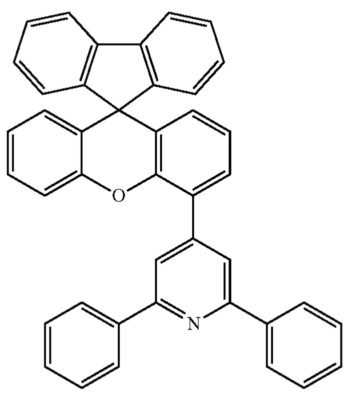

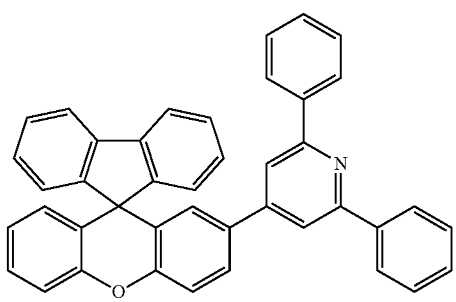

According to one embodiment of the present specification, Chemical Formula 3 is represented by any one selected from among the following Chemical Formulae 3-1 to 3-4.

[Chemical Formula 3-1]

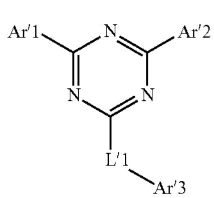

[Chemical Formula 3-2]

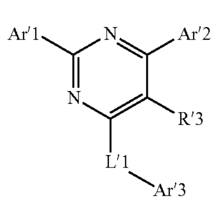

-continued

[Chemical Formula 3-3]

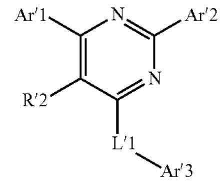

[Chemical Formula 3-4]

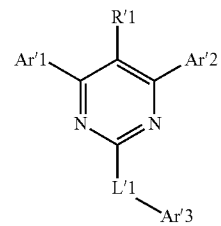

In Chemical Formulae 3-1 to 3-4, substituents have the same definitions as in Chemical Formula 3.

According to one embodiment of the present specification, in Chemical Formula 3, R'1 to R'3 are each hydrogen.

According to one embodiment of the present specification, Chemical Formula 3 can be represented by any one selected from among the following Chemical Formulae 3a to 3c.

[Chemical Formula 3a]

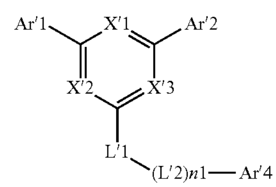

[Chemical Formula 3b]

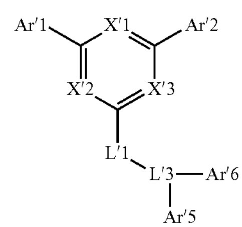

[Chemical Formula 3c]

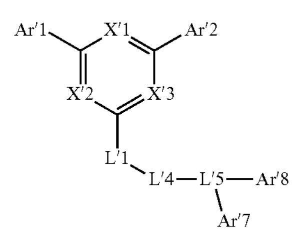

In Chemical Formulae 3a to 3c, substituents have the same definitions as in Chemical Formula 3 and Chemical Formulae 4a to 4c.

According to one embodiment of the present specification, in Chemical Formula 3, Ar'1 and Ar'2 are the same as or different from each other, and each independently a substituted or unsubstituted aryl group having 6 to 30 carbon atoms; or a substituted or unsubstituted heteroaryl group having 2 to 30 carbon atoms.

According to one embodiment of the present specification, in Chemical Formula 3, Ar'1 and Ar'2 are the same as or different from each other, and each independently a substituted or unsubstituted aryl group having 6 to 20 carbon atoms; or a substituted or unsubstituted heteroaryl group having 2 to 20 carbon atoms.

According to one embodiment of the present specification, in Chemical Formula 3, Ar'1 and Ar'2 are the same as or different from each other, and each independently a substituted or unsubstituted aryl group having 6 to 20 carbon atoms.

According to one embodiment of the present specification, in Chemical Formula 3, Ar'1 and Ar'2 are the same as or different from each other, and each independently a substituted or unsubstituted phenyl group; a substituted or unsubstituted biphenyl group; a substituted or unsubstituted naphthyl group; or a substituted or unsubstituted fluorenyl group.

According to one embodiment of the present specification, in Chemical Formula 3, Ar'1 and Ar'2 are the same as or different from each other, and each independently a phenyl group; a biphenyl group; a naphthyl group; or a fluorenyl group substituted with a phenyl group.

According to one embodiment of the present specification, L'1, L'2 and L'4 are the same as or different from each other, and each independently a direct bond; a substituted or unsubstituted alkylene group having 1 to 30 carbon atoms; a substituted or unsubstituted arylene group having 6 to 30 carbon atoms; or a substituted or unsubstituted heteroarylene group having 2 to 30 carbon atoms.

According to one embodiment of the present specification, L'1, L'2 and L'4 are the same as or different from each other, and each independently a direct bond; a substituted or unsubstituted alkylene group having 1 to 20 carbon atoms; a substituted or unsubstituted arylene group having 6 to 20 carbon atoms; or a substituted or unsubstituted heteroarylene group having 2 to 20 carbon atoms.

According to one embodiment of the present specification, L'1, L'2 and L'4 are the same as or different from each other, and each independently a direct bond; a substituted or unsubstituted methylene group; a substituted or unsubstituted ethylene group; a substituted or unsubstituted propylene group; a substituted or unsubstituted phenylene group; a substituted or unsubstituted biphenylene group; a substituted or unsubstituted terphenylene group; a substituted or unsubstituted naphthylene group; or a substituted or unsubstituted fluorenylene group.

According to one embodiment of the present specification, L'1, L'2 and L'4 are the same as or different from each other, and each independently a direct bond; a methylene group unsubstituted or substituted with a methyl group; a propylene group; a phenylene group; a biphenylene group; a terphenylene group; a naphthylene group; or a fluorenylene group unsubstituted or substituted with a methyl group.

According to one embodiment of the present specification, L'3 and L'5 are the same as or different from each other, and each independently a substituted or unsubstituted trivalent aryl group having 6 to 30 carbon atoms; or a substituted or unsubstituted trivalent heteroaryl group having 2 to 30 carbon atoms.

According to one embodiment of the present specification, L'3 and L'5 are the same as or different from each other, and each independently a substituted or unsubstituted trivalent aryl group having 6 to 20 carbon atoms; or a substituted or unsubstituted trivalent heteroaryl group having 2 to 20 carbon atoms.

According to one embodiment of the present specification, L'3 and L'5 are the same as or different from each other, and each independently a substituted or unsubstituted trivalent phenyl group; a substituted or unsubstituted trivalent biphenyl group; a substituted or unsubstituted trivalent terphenyl group; a substituted or unsubstituted trivalent naphthyl group; or a substituted or unsubstituted trivalent fluorenyl group.

According to one embodiment of the present specification, L'3 and L'5 are the same as or different from each other, and each independently a trivalent phenyl group; a trivalent biphenyl group; a trivalent terphenyl group; a trivalent naphthyl group; or a trivalent fluorenyl group.

According to one embodiment of the present specification, L'3 and L'5 are the same as or different from each other, and each independently a trivalent phenyl group.

According to one embodiment of the present specification, Ar'4 to Ar'8 are the same as or different from each other, and each independently a nitrile group; an aryl group having 6 to 30 carbon atoms unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group; or a substituted or unsubstituted heteroaryl group having 2 to 30 carbon atoms.

According to one embodiment of the present specification, Ar'4 to Ar'8 are the same as or different from each other, and each independently a nitrile group; an aryl group having 6 to 20 carbon atoms unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group; or a substituted or unsubstituted heteroaryl group having 2 to 20 carbon atoms.

According to one embodiment of the present specification, Ar'4 to Ar'8 are the same as or different from each other, and can be each independently represented by a nitrile group; an aryl group unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group; a triazine group unsubstituted or substituted with a substituted or unsubstituted aryl group; or any one selected from among the following Chemical Formulae 16 to 18.

[Chemical Formula 16]

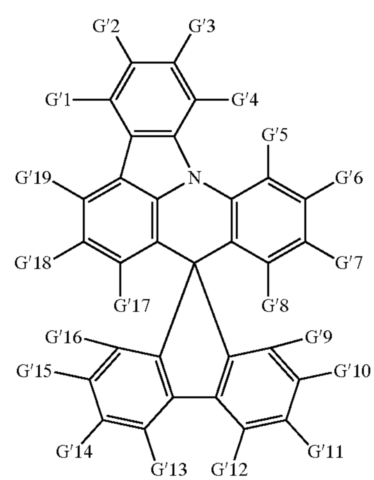

-continued

[Chemical Formula 17]

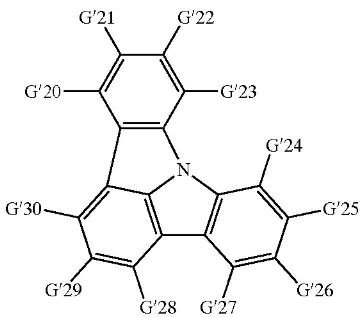

[Chemical Formula 18]

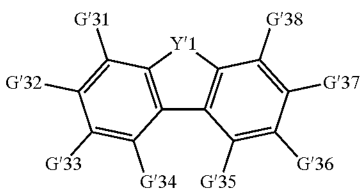

In Chemical Formulae 16 to 18,

Y'1 is O; S; or NR'4, any one of G'1 to G'19, any one of G'20 to G'30, and any one of G'31 to G'38 and R'4 are a site bonding to L'2 of Chemical Formula 4a, L'3 of Chemical Formula 4b or L'5 of Chemical Formula 4c, and the rest of G'1 to G'38 and R'4 other than the site bonding to L'2 of Chemical Formula 4a, L'3 of Chemical Formula 4b or L'5 of Chemical Formula 4c are the same as or different from each other, and each independently hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group.

According to one embodiment of the present specification, the rest of G'1 to G'38 and R'4 other than the site bonding to L'2 of Chemical Formula 4a, L'3 of Chemical Formula 4b or L'5 of Chemical Formula 4c are the same as or different from each other, and each independently hydrogen; or a substituted or unsubstituted aryl group.

According to one embodiment of the present specification, the rest of G'1 to G'38 and R'4 other than the site bonding to L'2 of Chemical Formula 4a, L'3 of Chemical Formula 4b or L'5 of Chemical Formula 4c are each independently hydrogen.

According to one embodiment of the present specification, Ar'4 to Ar'8 are the same as or different from each other, and can be each independently represented by a nitrile group; an aryl group having 6 to 30 carbon atoms unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group; a triazine group unsubstituted or substituted with a substituted or unsubstituted aryl group; or any one selected from among Chemical Formulae 16 to 18.

According to one embodiment of the present specification, Ar'4 to Ar'8 are the same as or different from each other, and can be each independently represented by a nitrile group; an aryl group unsubstituted or substituted with one, two or more substituents selected from the group consisting of an alkyl group, an aryl group, a pyridyl group, a carbazole group and a nitrile group; a triazine group unsubstituted or substituted with an aryl group; or any one selected from among Chemical Formulae 16 to 18.

According to one embodiment of the present specification, Ar'4 to Ar'8 are the same as or different from each other, and can be each independently represented by a nitrile group; an aryl group having 6 to 30 carbon atoms unsubstituted or substituted with one, two or more substituents selected from the group consisting of an alkyl group, an aryl group, a pyridyl group, a carbazole group and a nitrile group; a triazine group unsubstituted or substituted with an aryl group; or any one selected from among Chemical Formulae 16 to 18.

According to one embodiment of the present specification, Ar'4 to Ar'8 are the same as or different from each other, and can be each independently represented by a nitrile group; an aryl group unsubstituted or substituted with one, two or more substituents selected from the group consisting of a methyl group, a phenyl group, a pyridyl group, a carbazole group and a nitrile group; a triazine group unsubstituted or substituted with a phenyl group; or any one selected from among Chemical Formulae 16 to 18.

According to one embodiment of the present specification, Ar'4 to Ar'8 are the same as or different from each other, and can be each independently represented by a nitrile group; an aryl group having 6 to 30 carbon atoms unsubstituted or substituted with one, two or more substituents selected from the group consisting of a methyl group, a phenyl group, a pyridyl group, a carbazole group and a nitrile group; a triazine group unsubstituted or substituted with a phenyl group; or any one selected from among Chemical Formulae 16 to 18.

According to one embodiment of the present specification, Ar'4 to Ar'8 are the same as or different from each other, and can be each independently represented by a nitrile group; a phenyl group unsubstituted or substituted with one, two or more substituents selected from the group consisting of an alkyl group, an aryl group, a pyridyl group, a carbazole group and a nitrile group; a naphthyl group unsubstituted or substituted with one, two or more substituents selected from the group consisting of an alkyl group, an aryl group, a pyridyl group, a carbazole group and a nitrile group; a fluorenyl group unsubstituted or substituted with one, two or more substituents selected from the group consisting of an alkyl group, an aryl group, a pyridyl group, a carbazole group and a nitrile group; a triazine group unsubstituted or substituted with a phenyl group; or any one selected from among Chemical Formulae 16 to 18.

According to one embodiment of the present specification, Ar'4 to Ar'8 are the same as or different from each other, and can be each independently represented by a nitrile group; a phenyl group unsubstituted or substituted with one, two or more substituents selected from the group consisting of a methyl group, a phenyl group, a pyridyl group, a carbazole group and a nitrile group; a naphthyl group unsubstituted or substituted with one, two or more substituents selected from the group consisting of a methyl group, a phenyl group, a pyridyl group, a carbazole group and a nitrile group; a fluorenyl group unsubstituted or substituted with one, two or more substituents selected from the group consisting of a methyl group, a phenyl group, a pyridyl group, a carbazole group and a nitrile group; a triazine group unsubstituted or substituted with a phenyl group; or any one selected from among Chemical Formulae 16 to 18.

According to one embodiment of the present specification, Chemical Formula 3 can be represented by any one selected from among the following compounds.

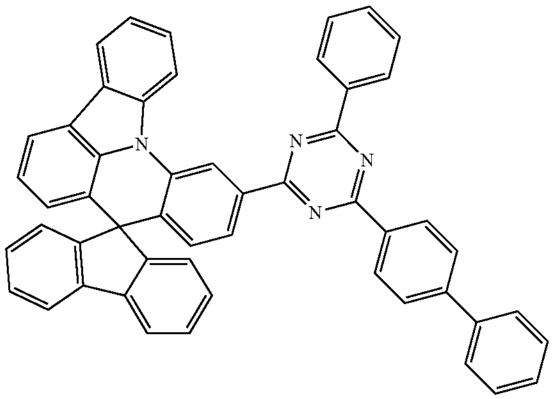

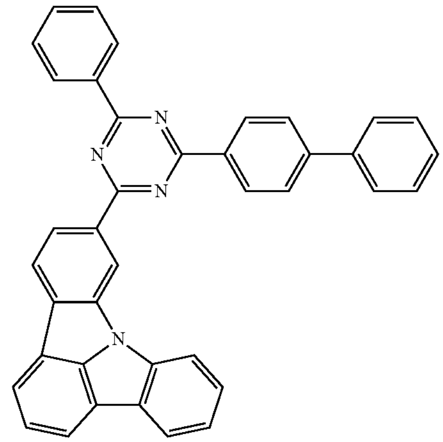

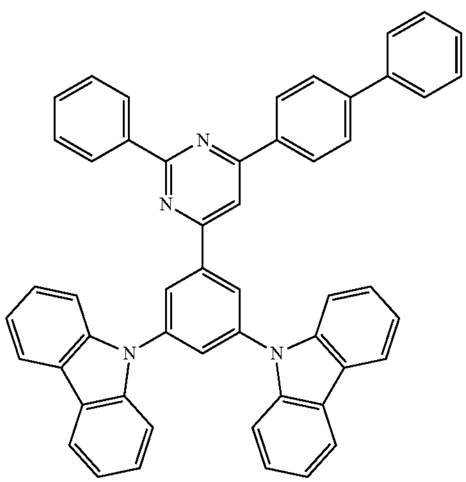

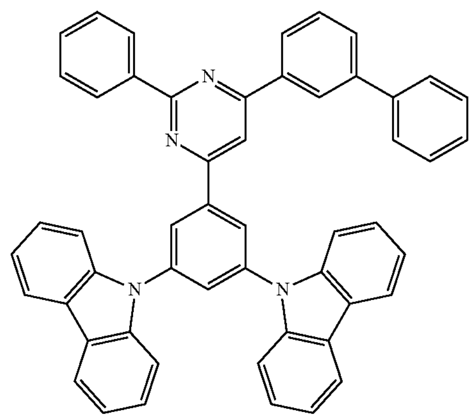

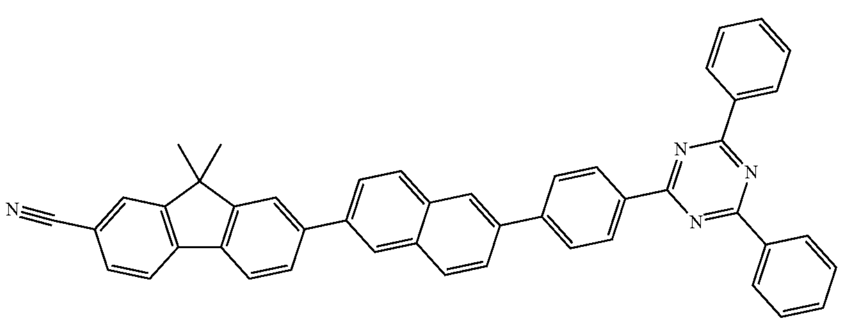

-continued
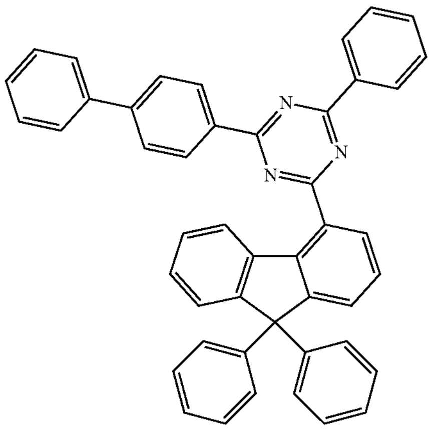
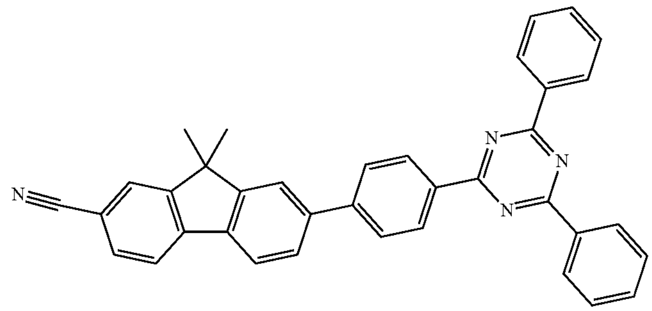
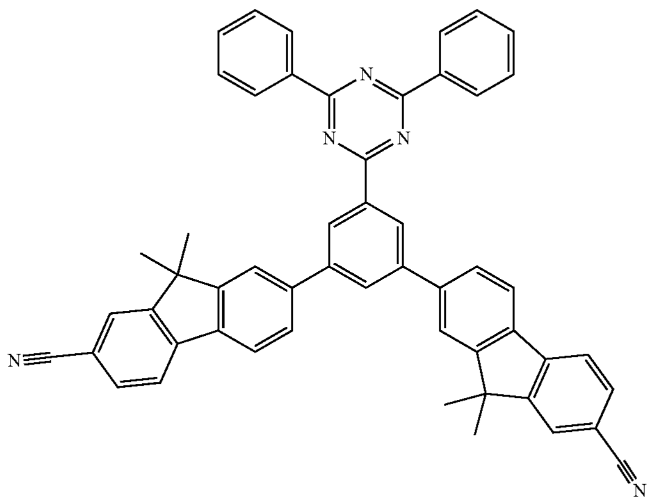
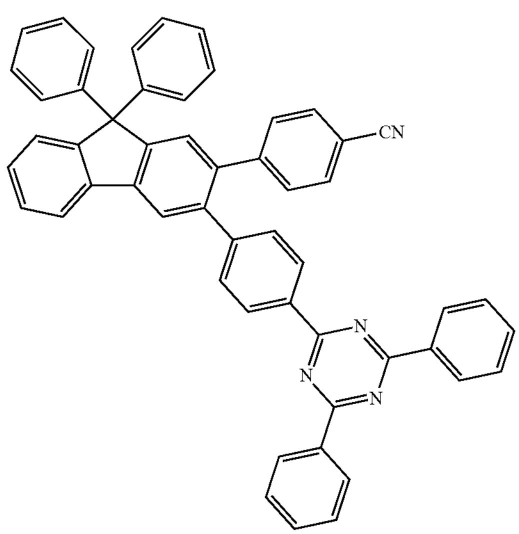
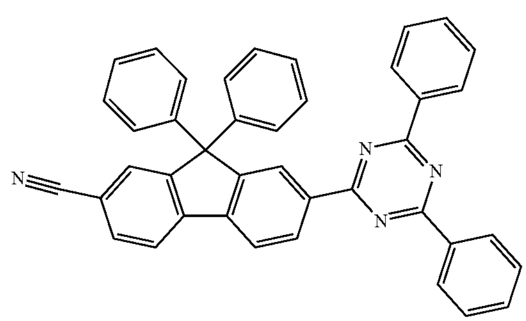

-continued
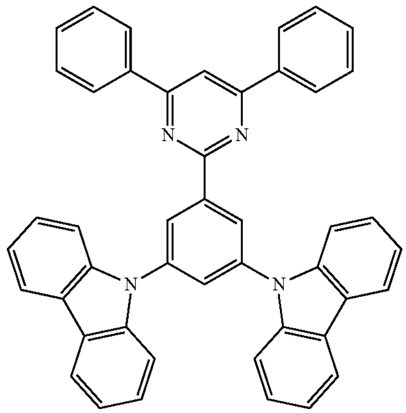
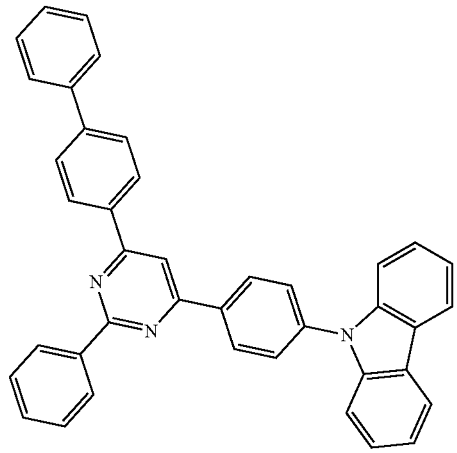
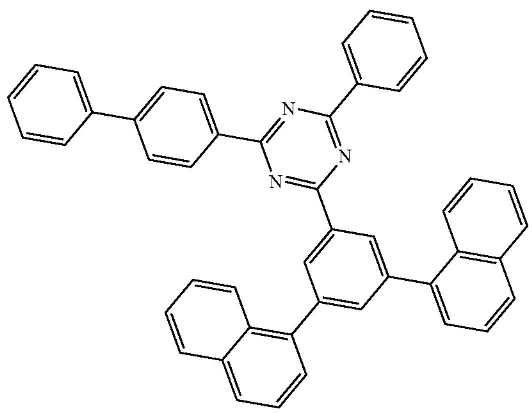
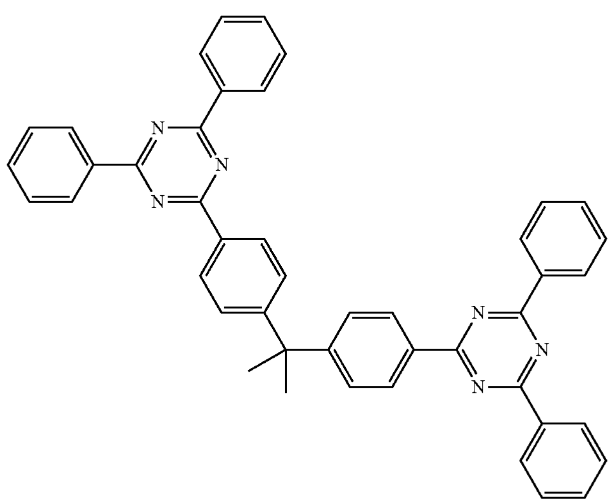
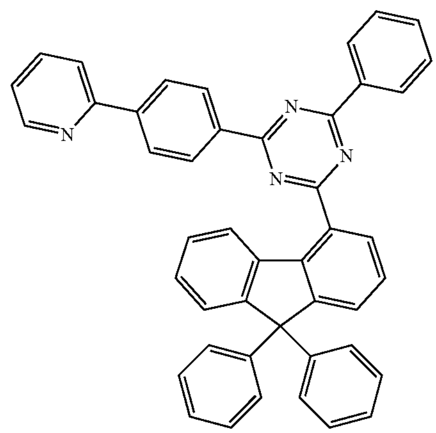
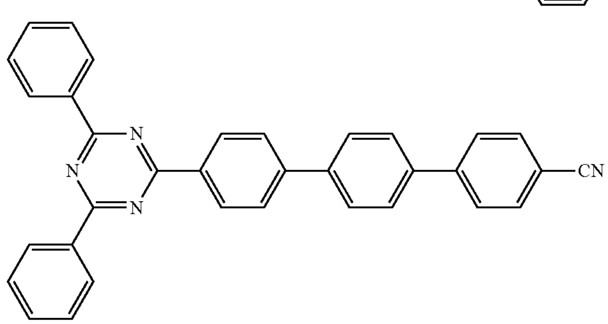

-continued
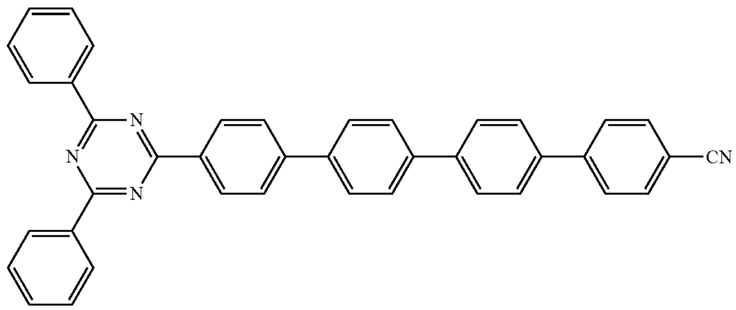
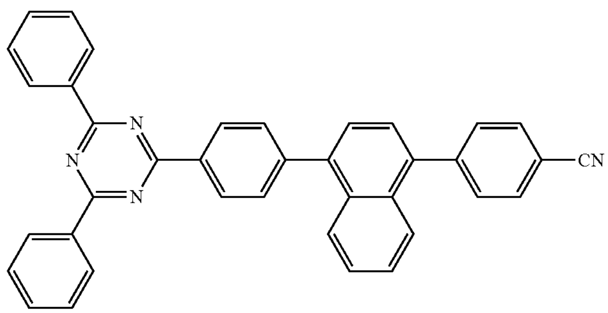
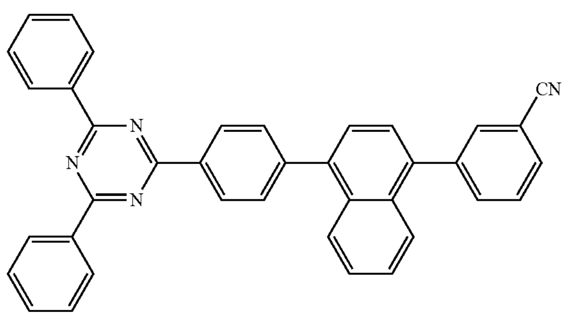
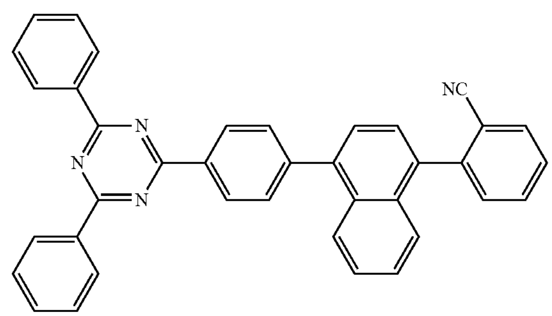
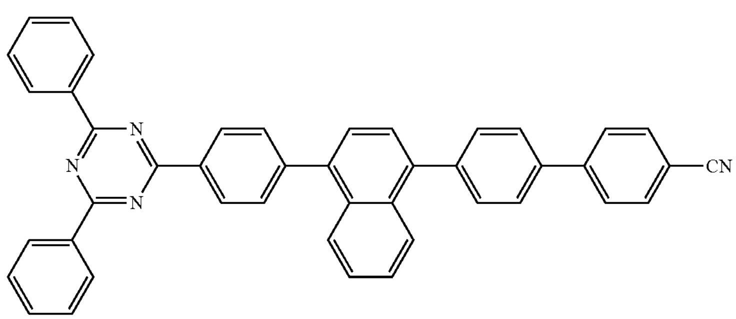
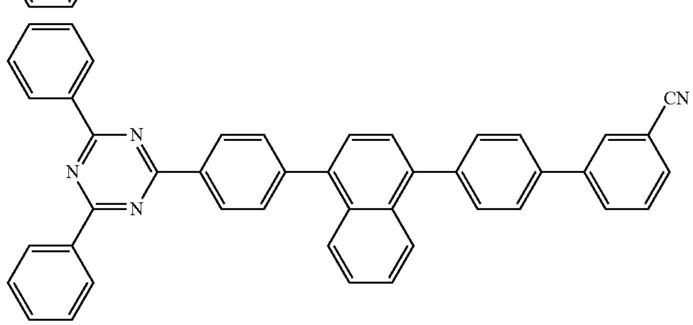

-continued
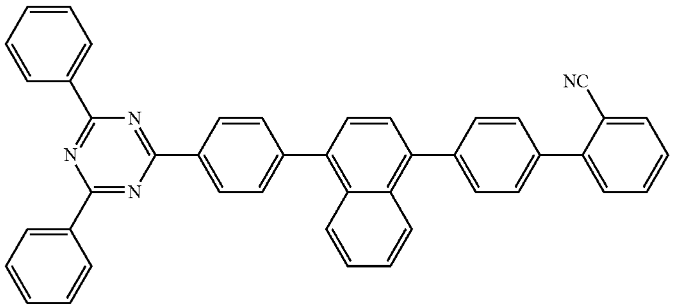
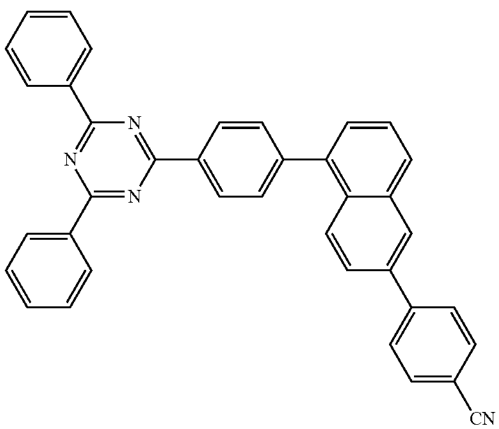
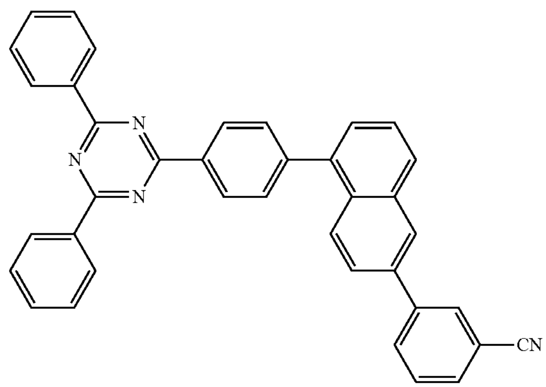
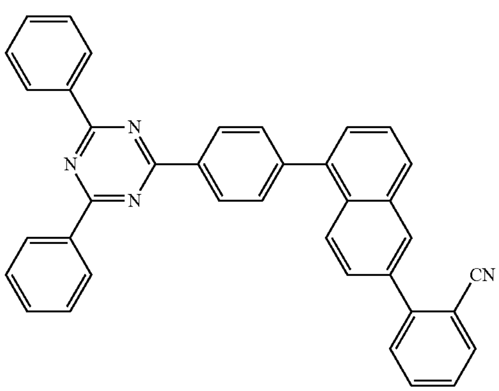
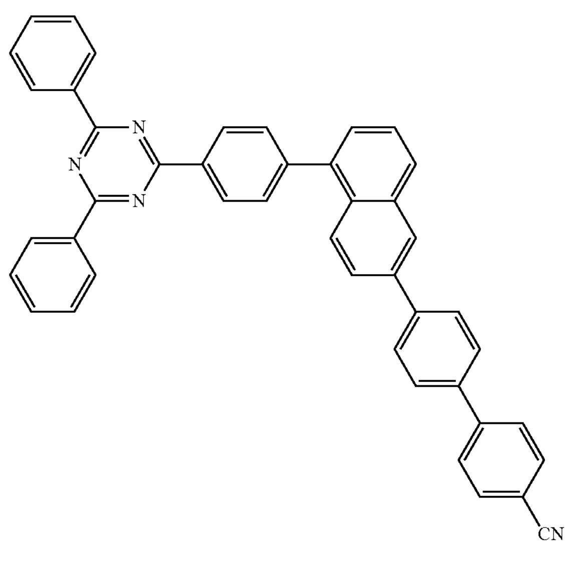

-continued
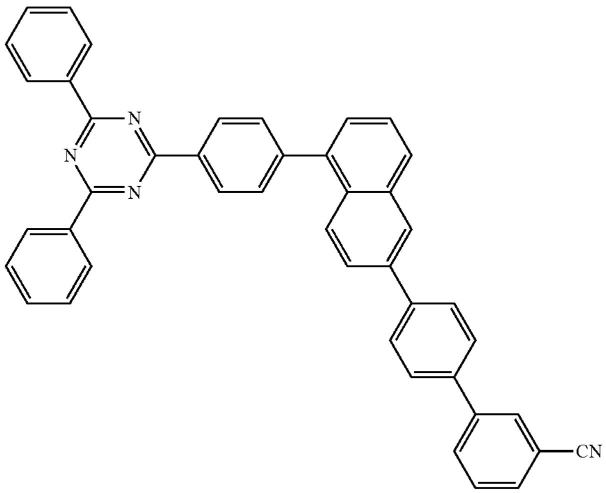
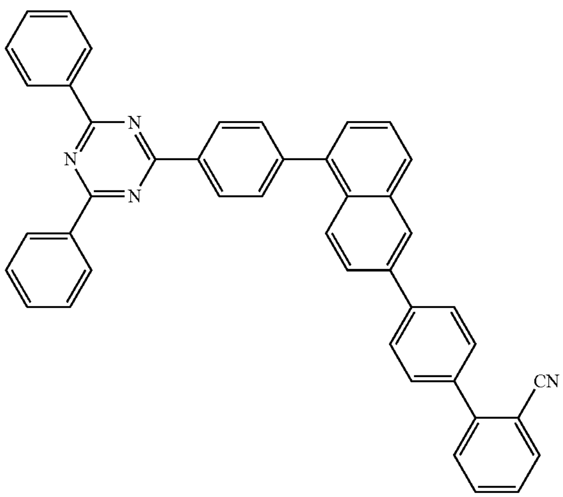
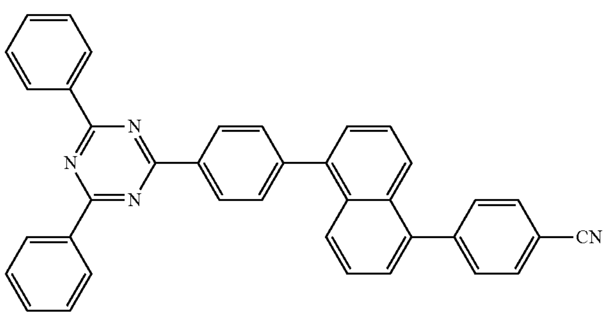
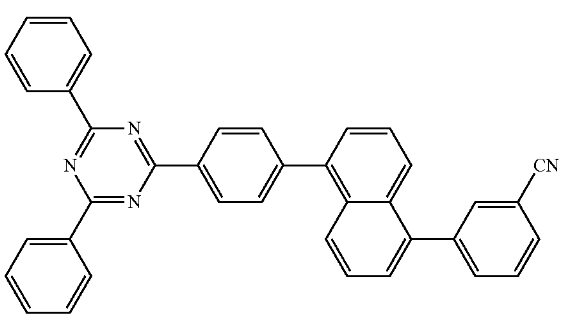
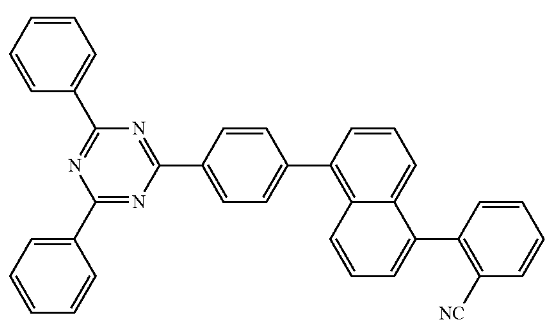

-continued
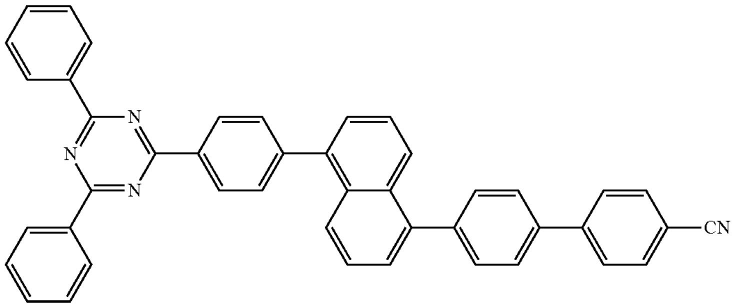
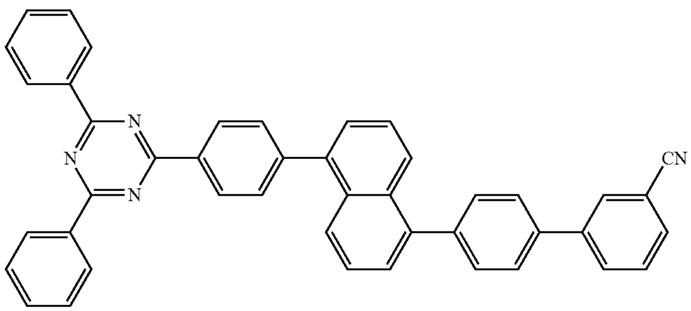
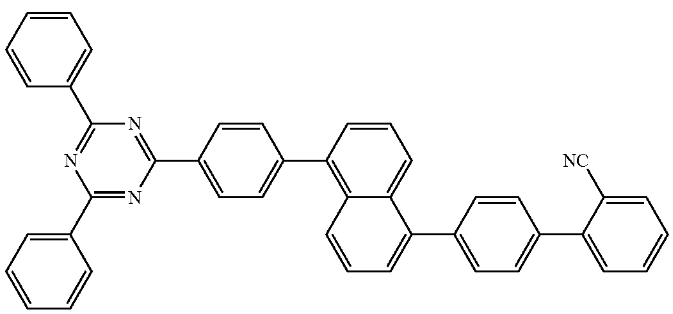
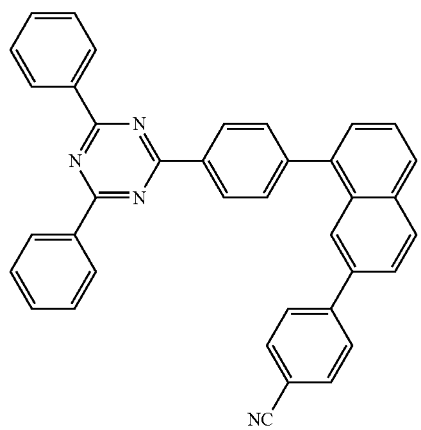
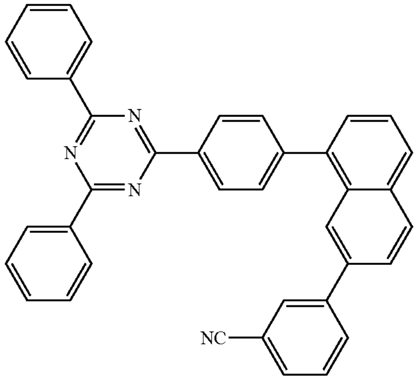
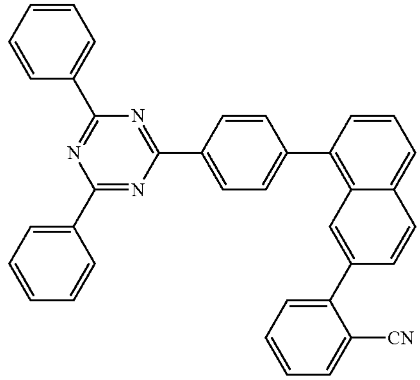

-continued
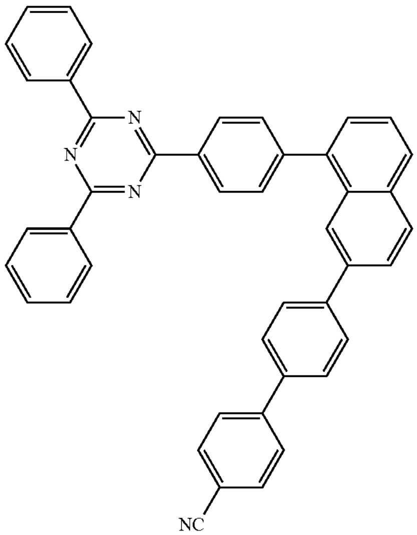
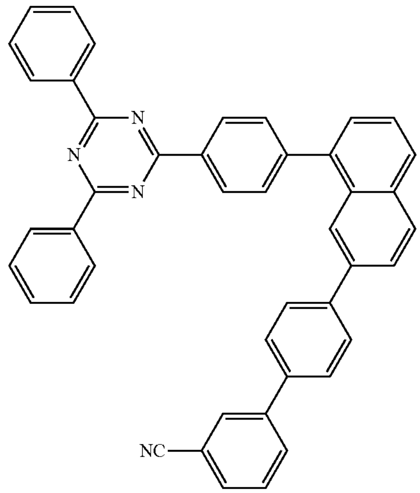
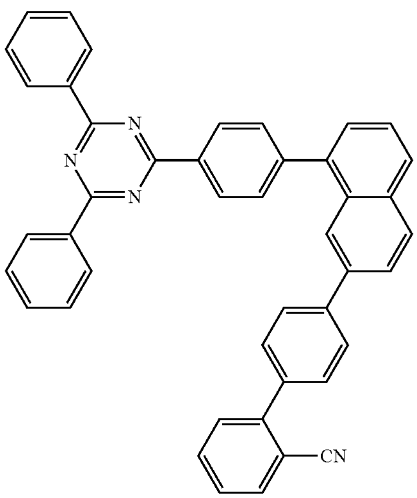
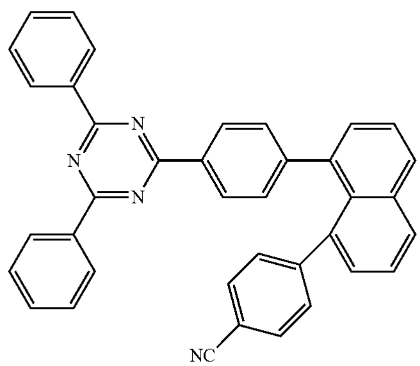
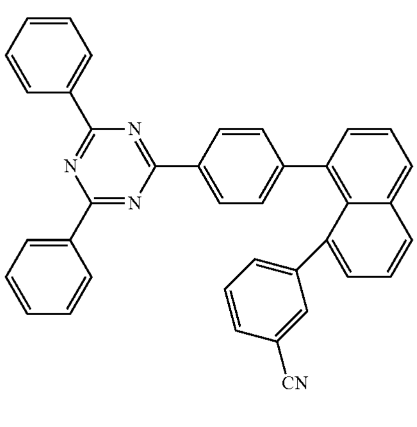
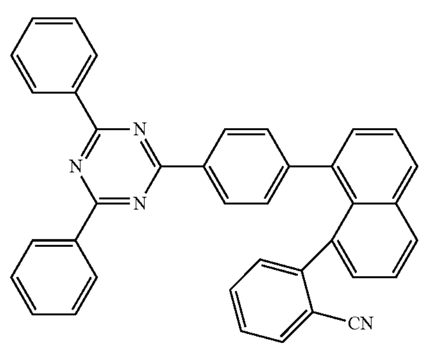

-continued
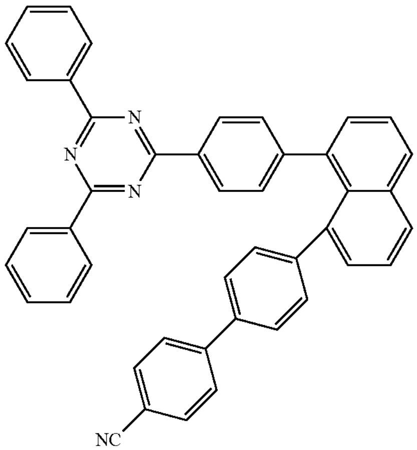
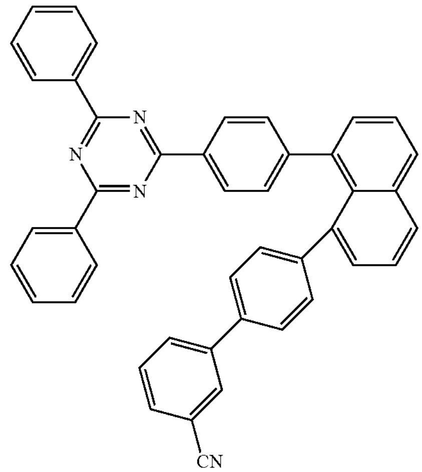
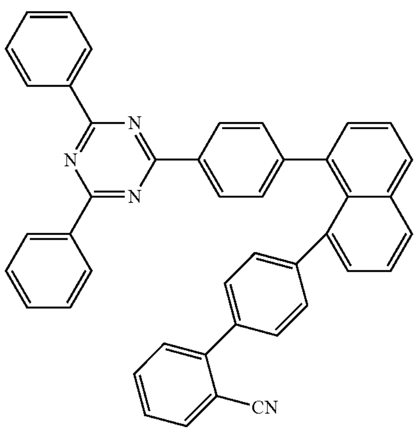
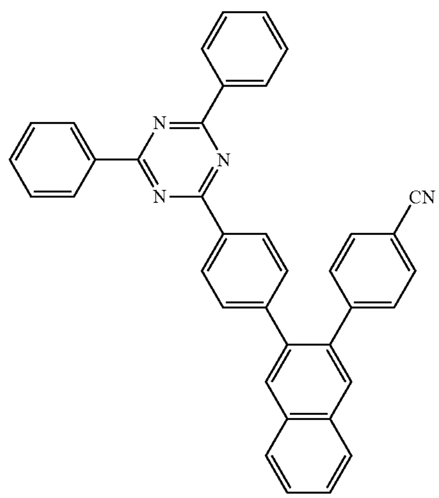
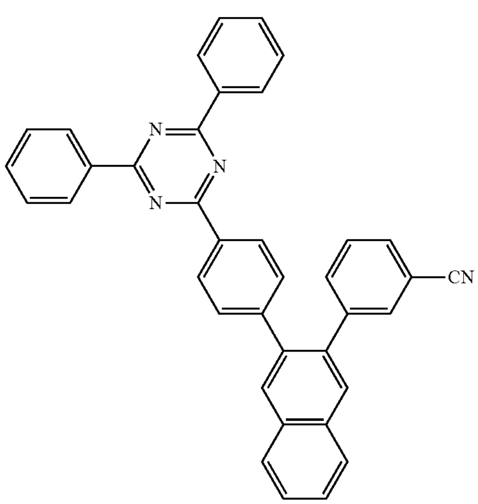
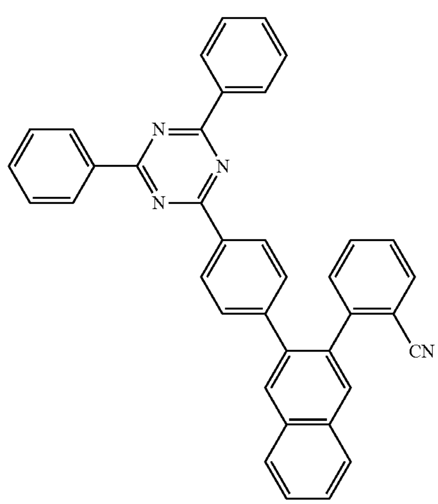

-continued
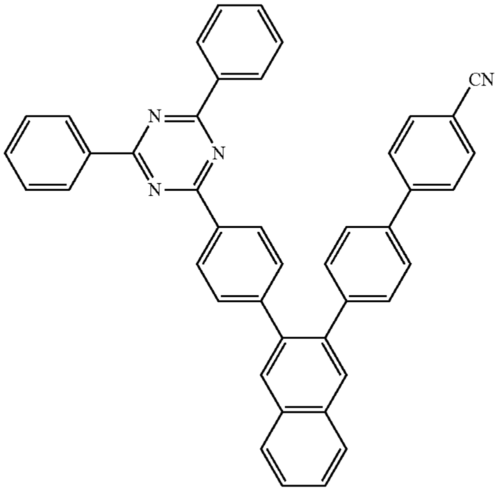
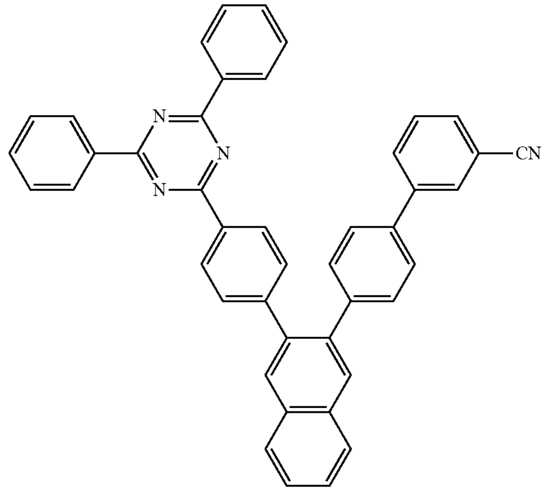
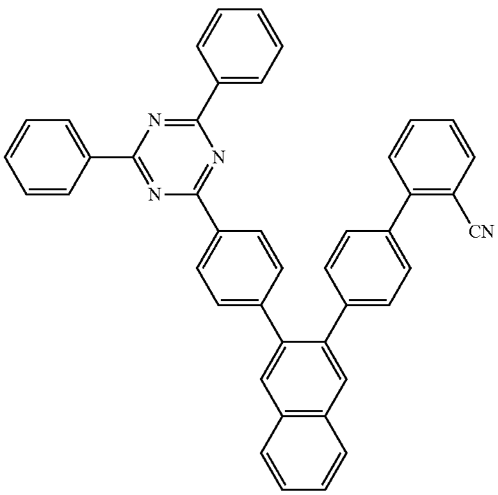
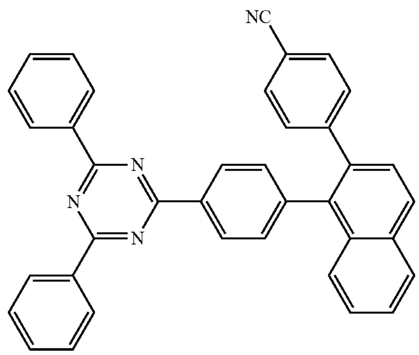
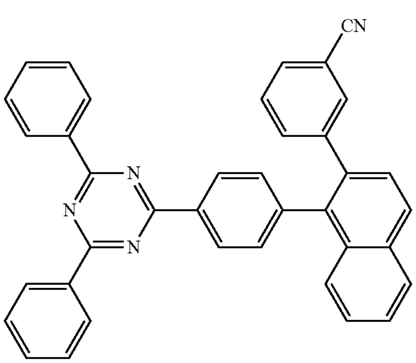
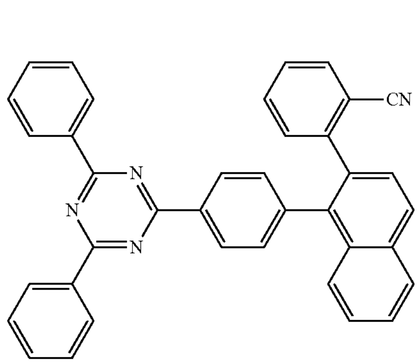

-continued
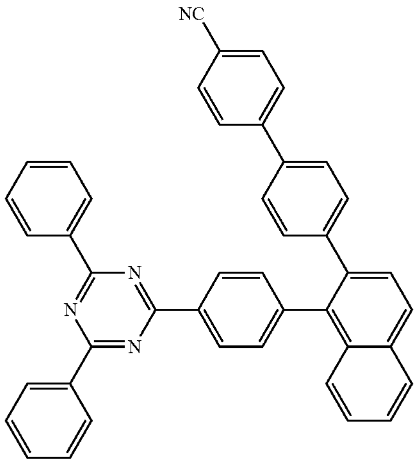
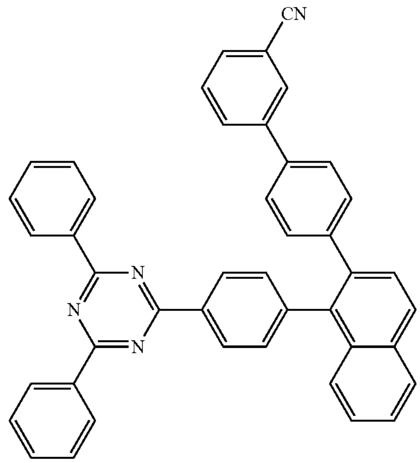
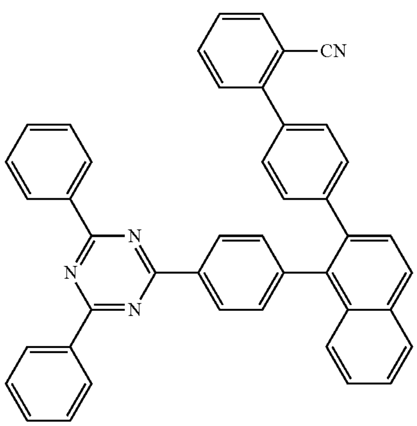
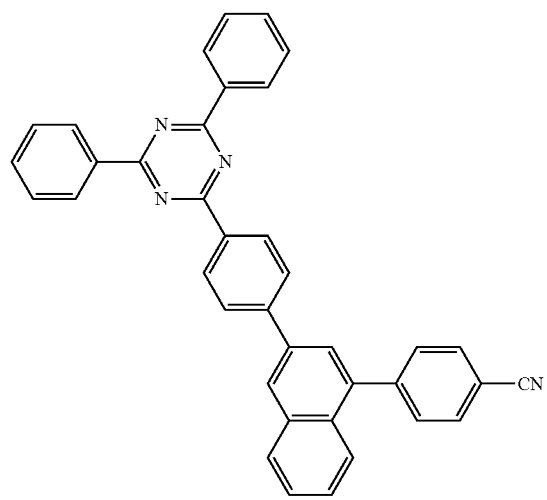
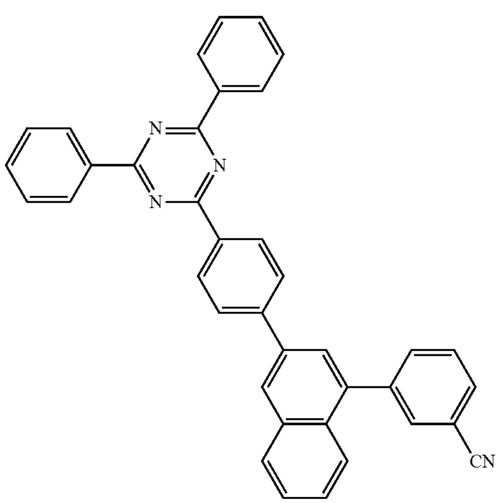
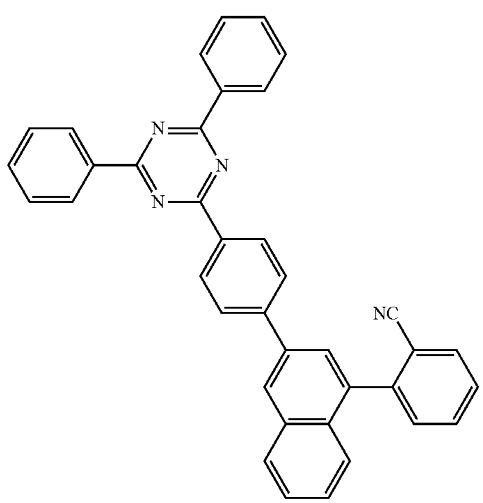

-continued
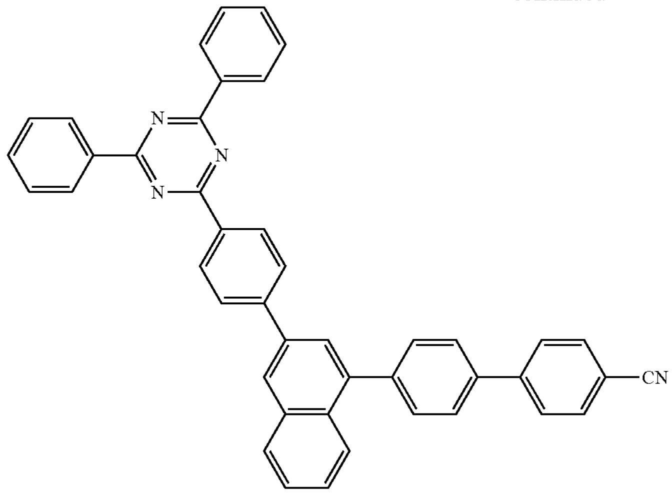
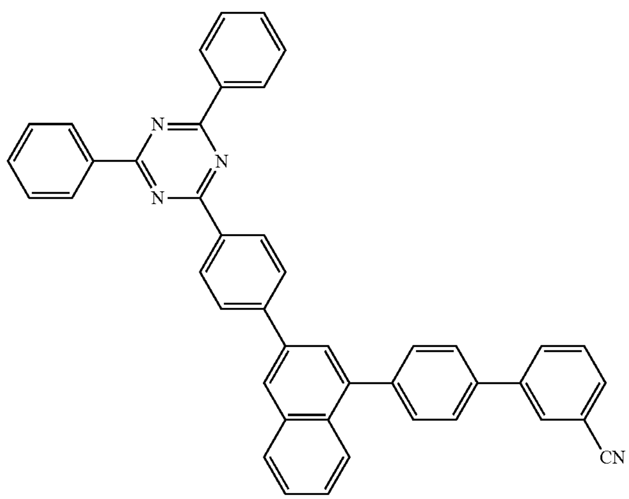
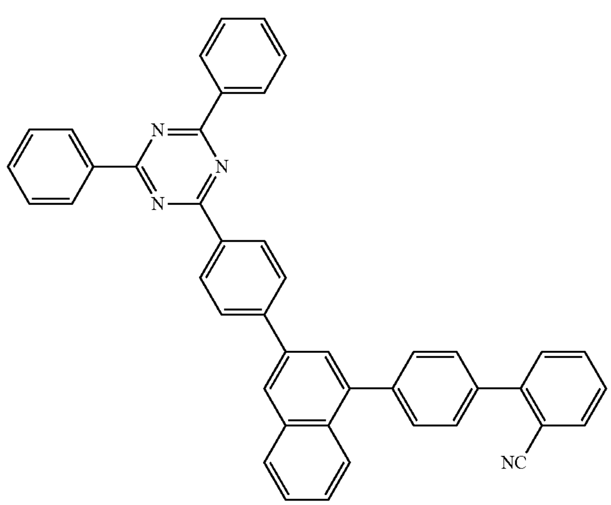

-continued
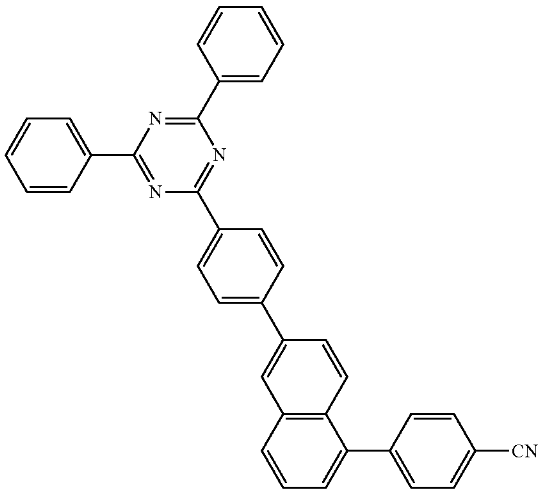
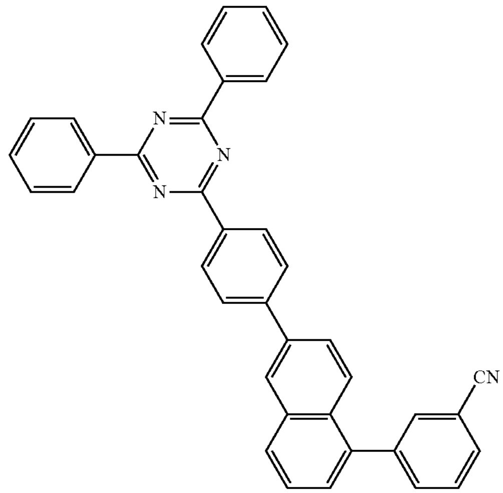
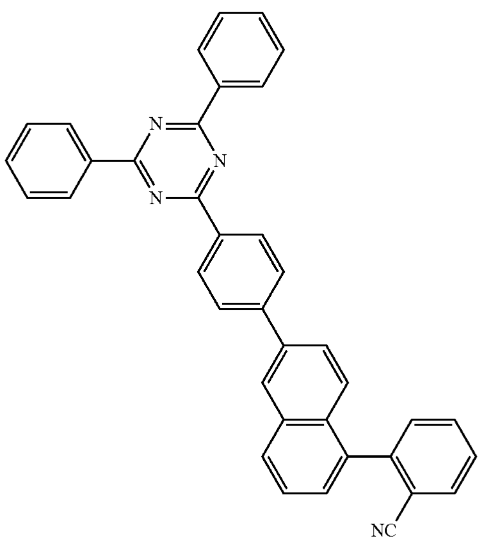
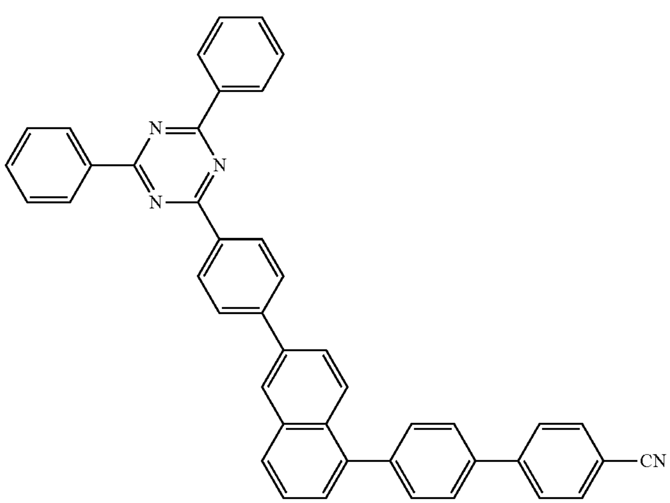

-continued
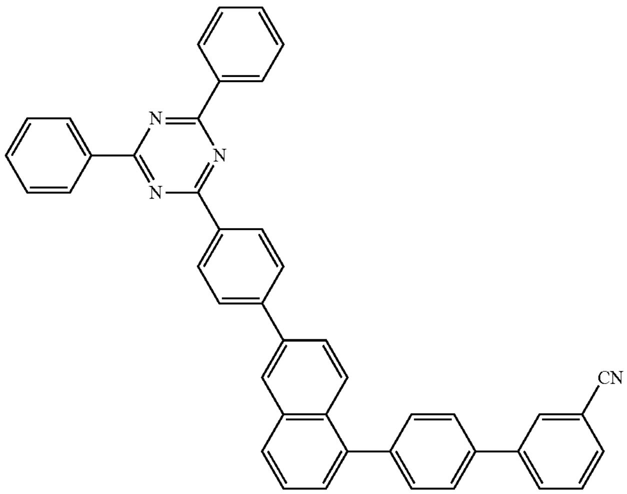
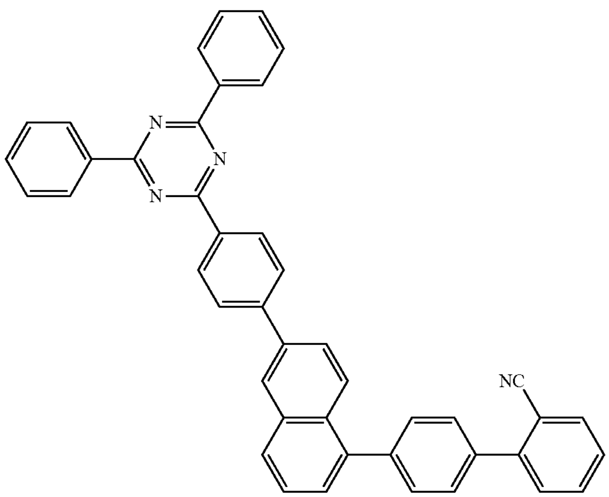
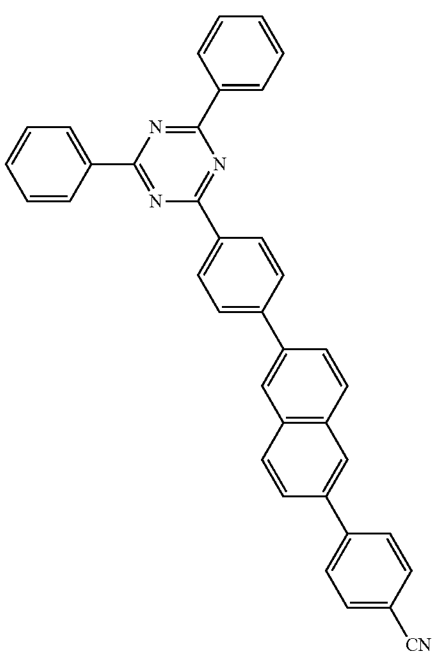
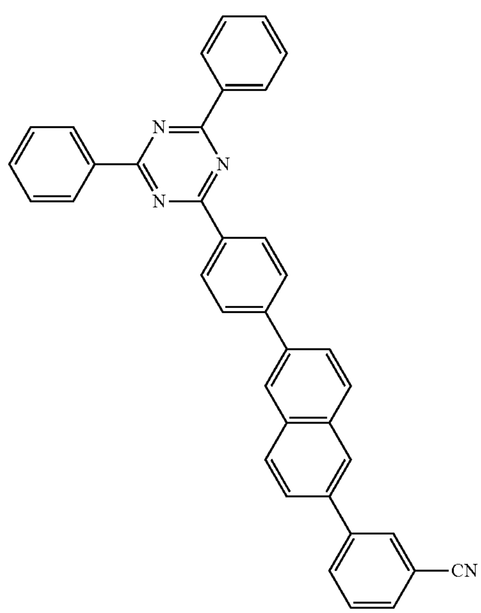

-continued
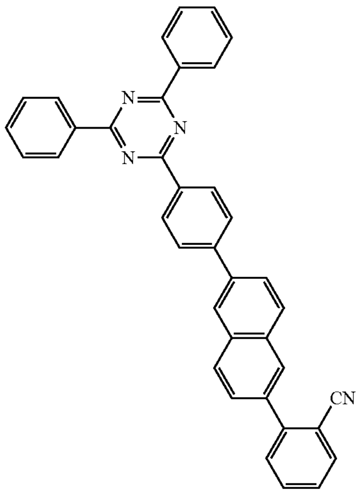
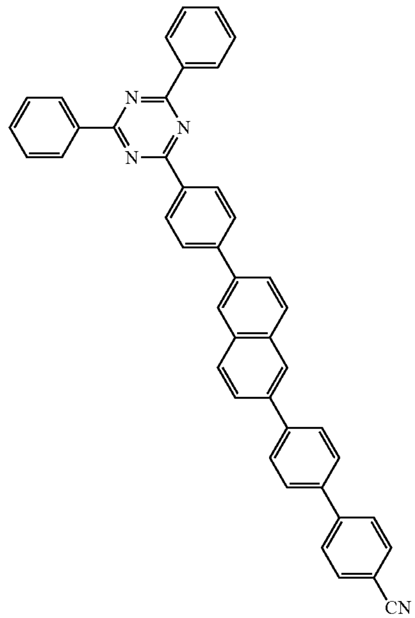
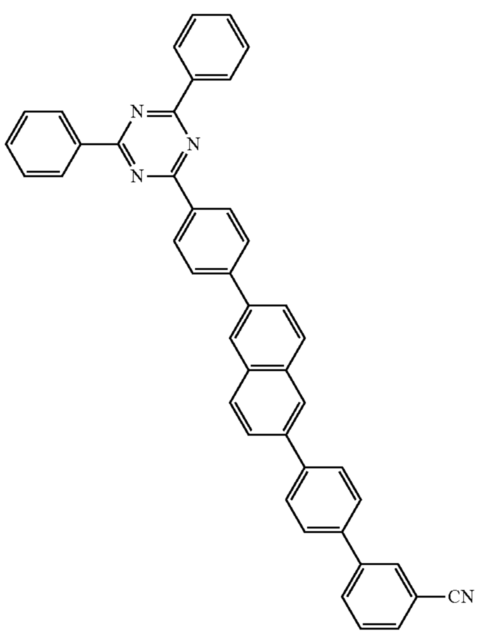
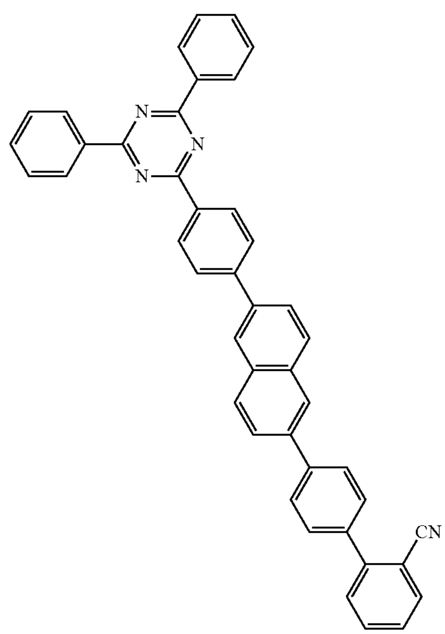

-continued
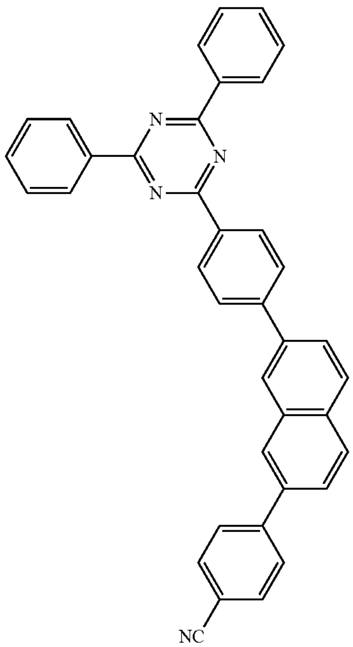
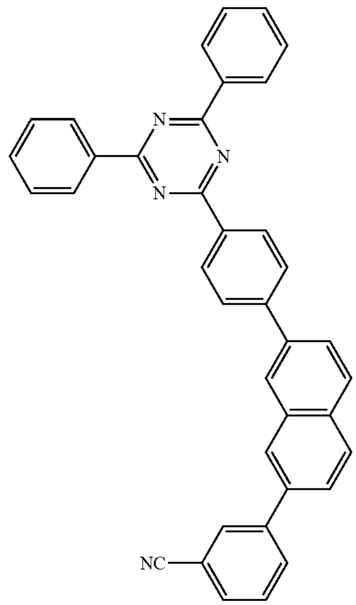
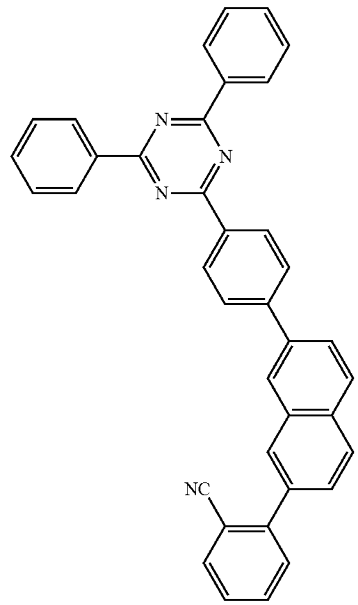
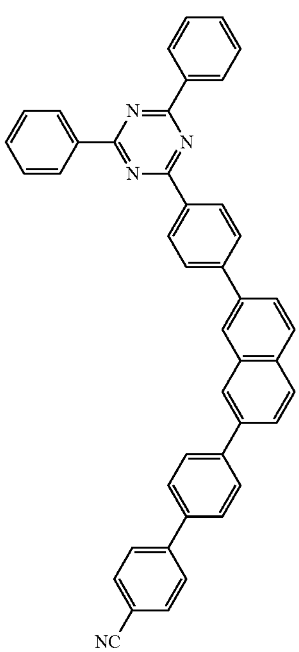
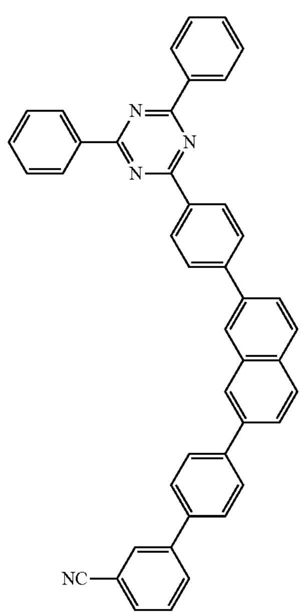
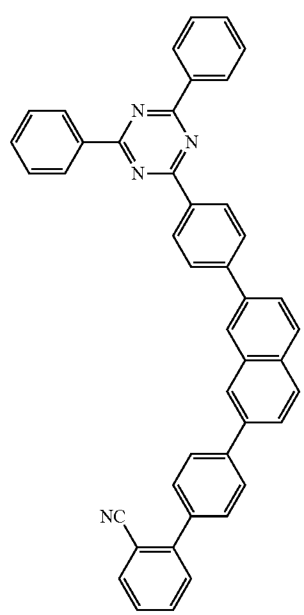

-continued
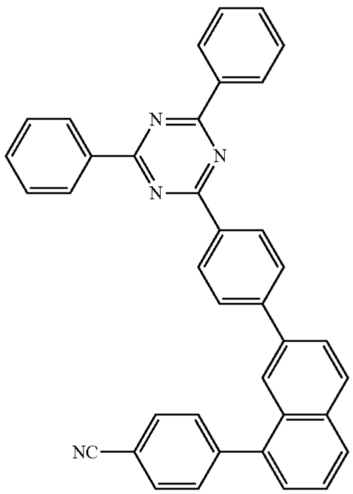
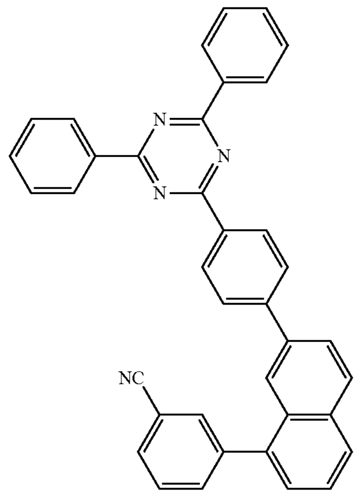
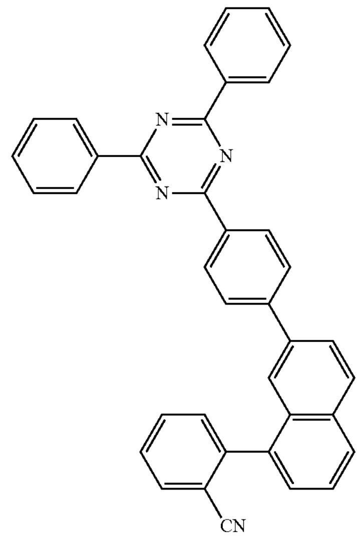
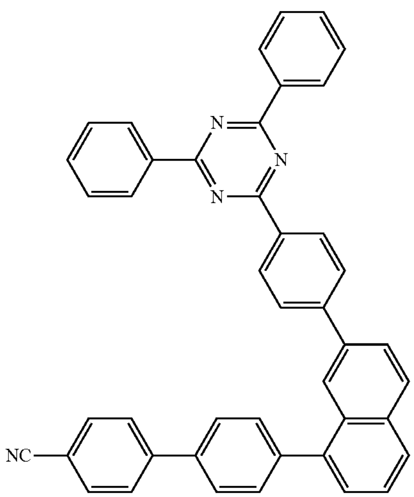
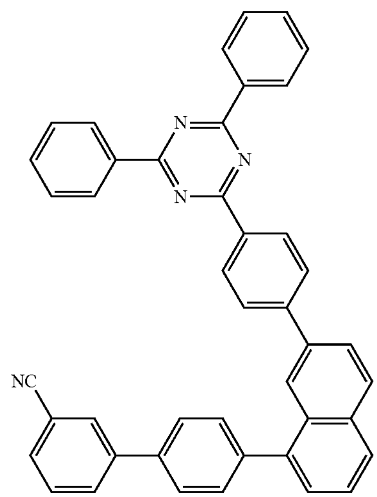
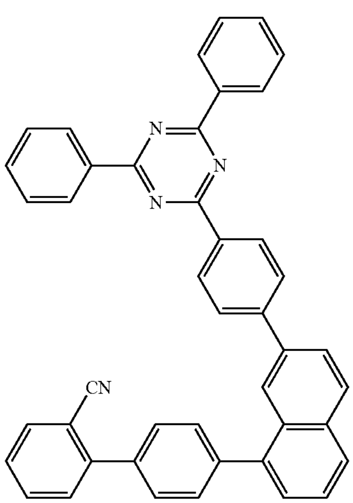
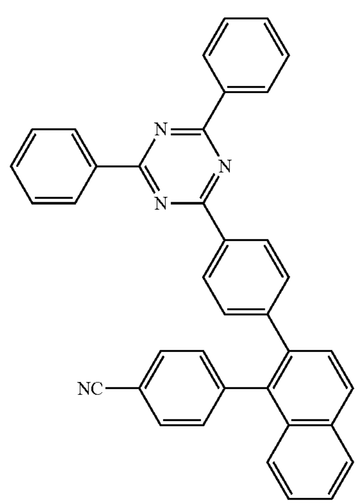
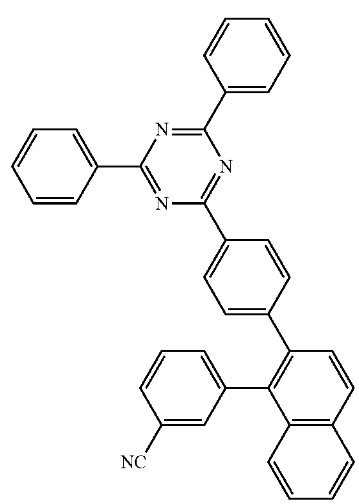

-continued
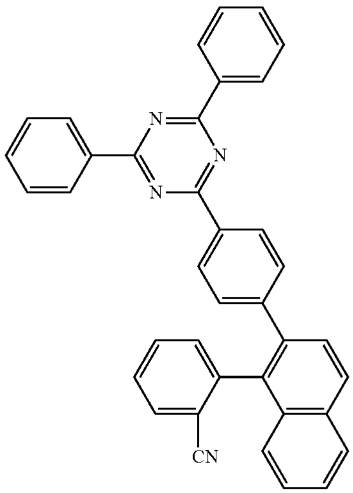
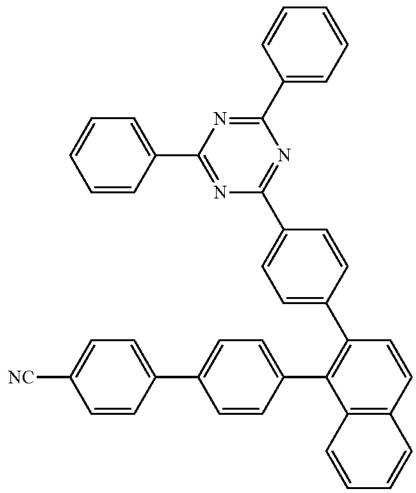
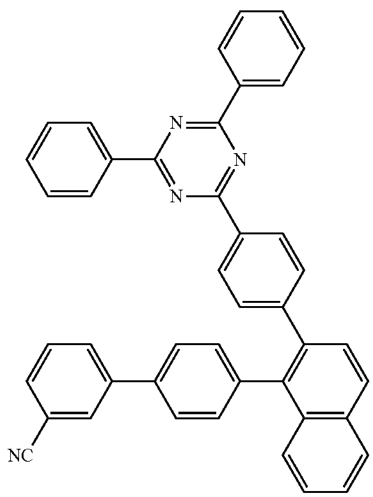
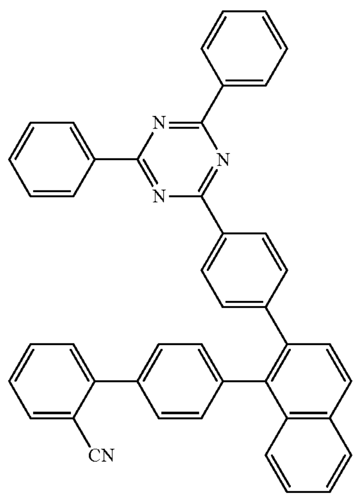
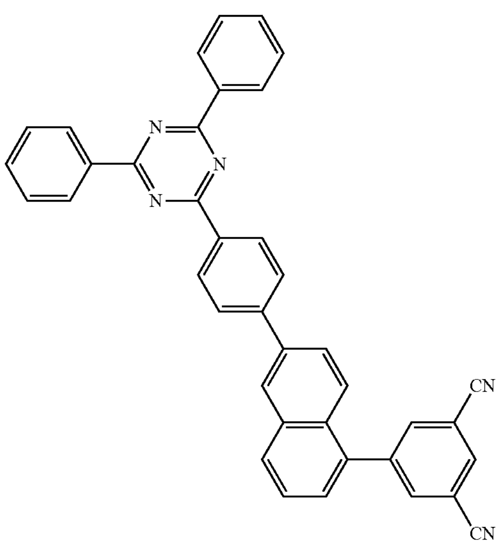
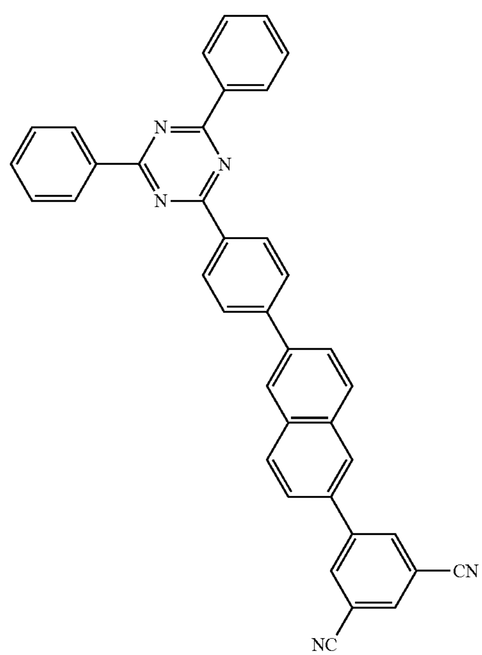

-continued
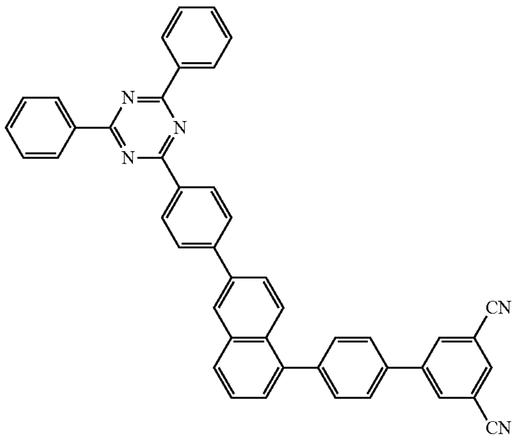
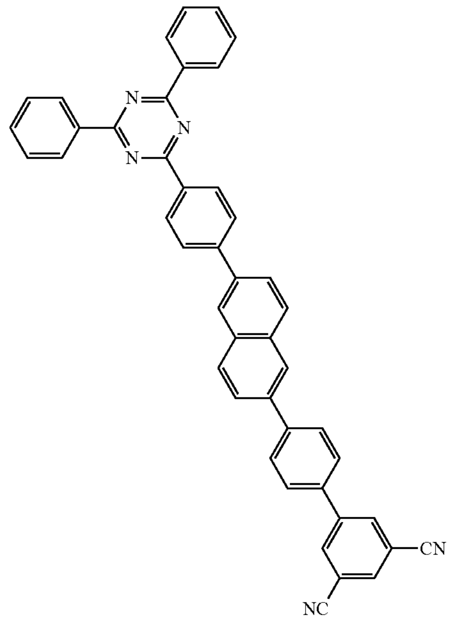
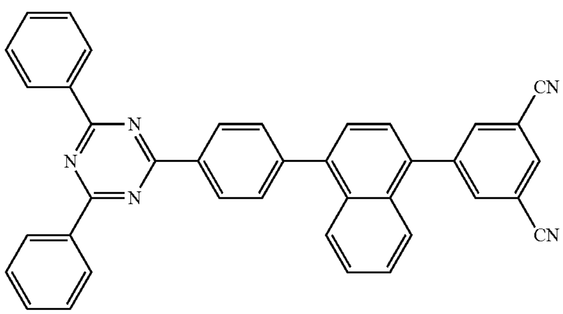
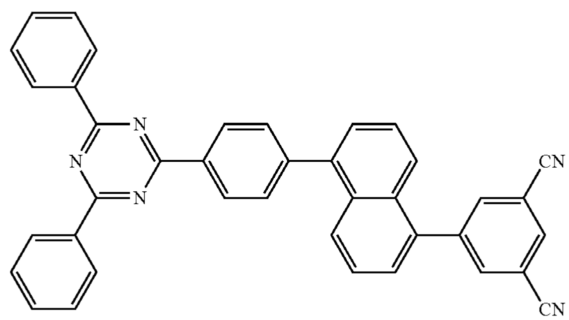
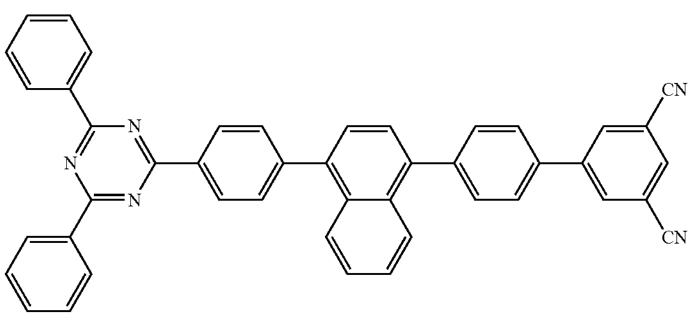
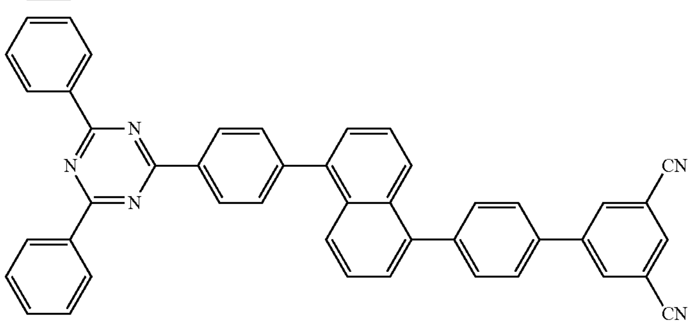

-continued
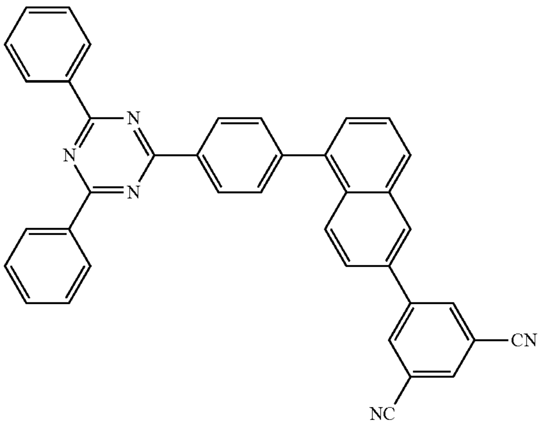
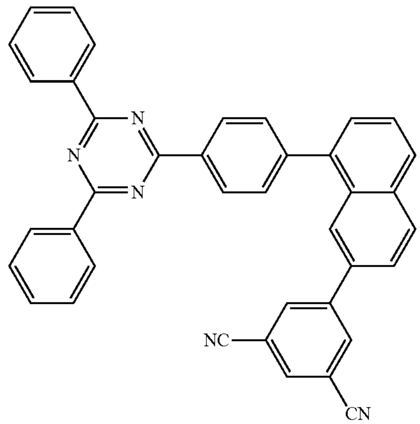
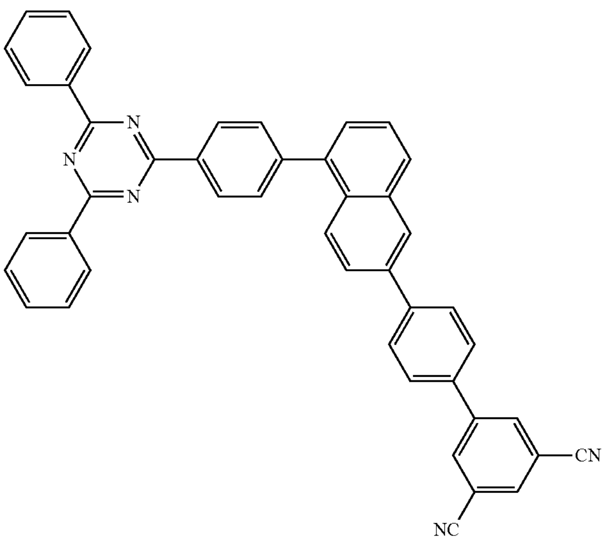
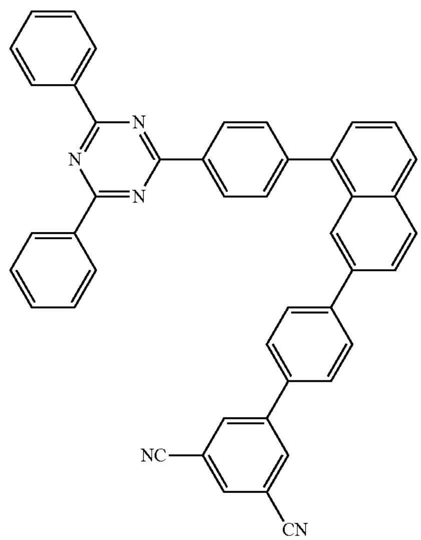
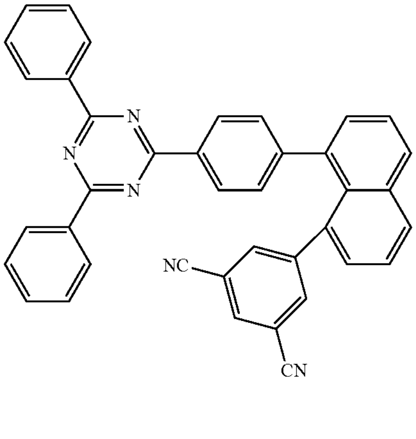
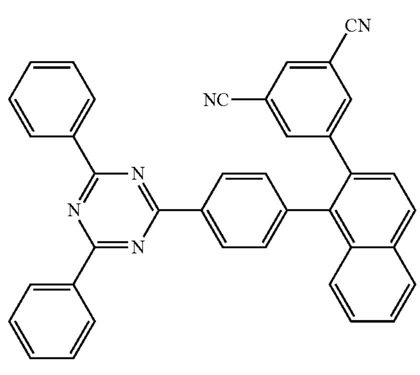

-continued
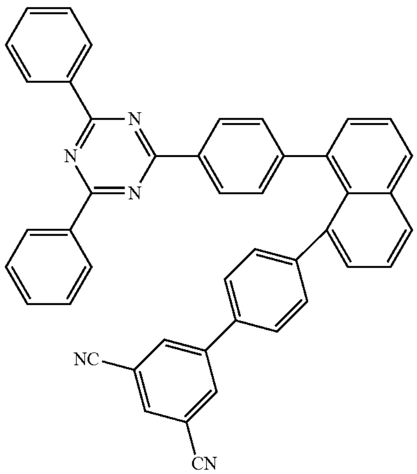
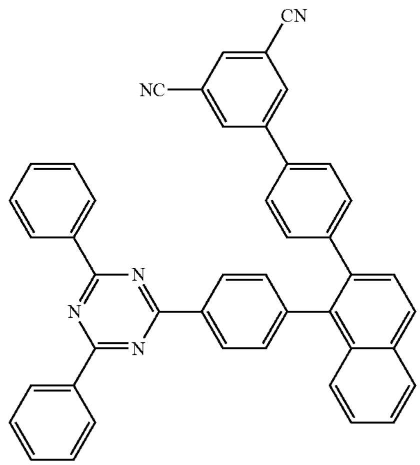
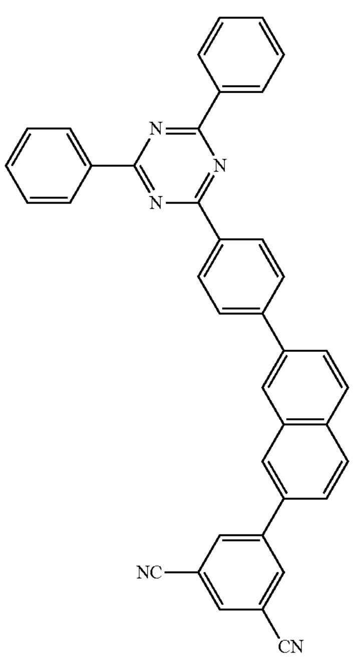
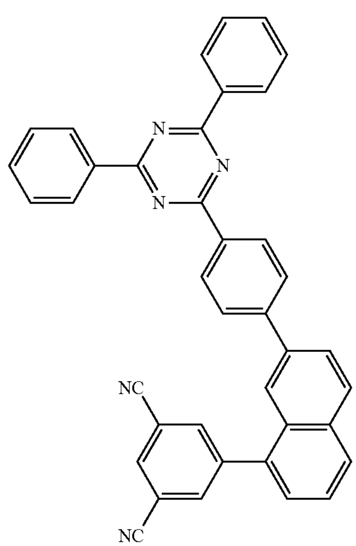

-continued
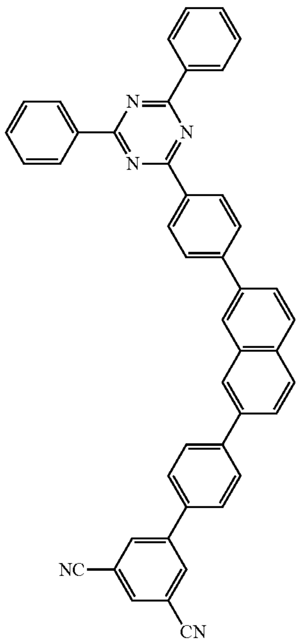
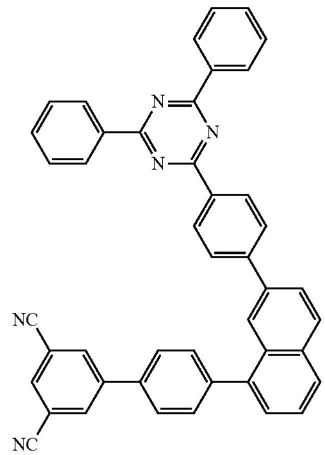
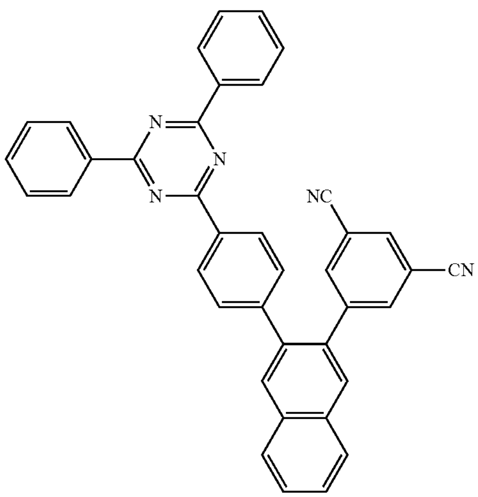
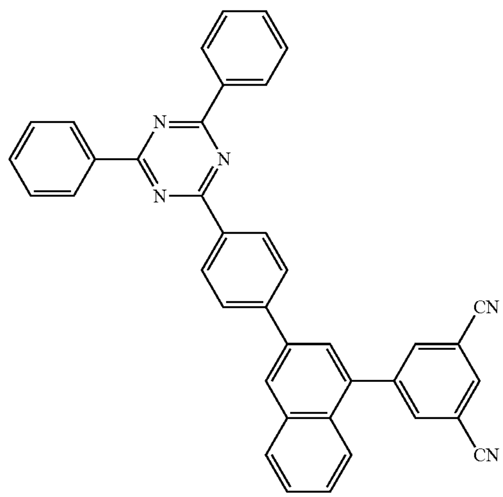
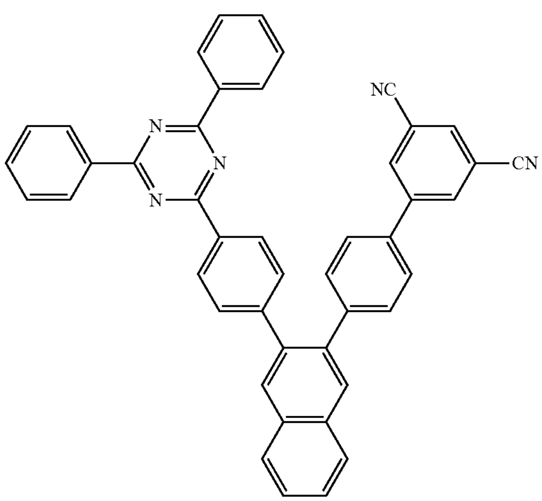

-continued

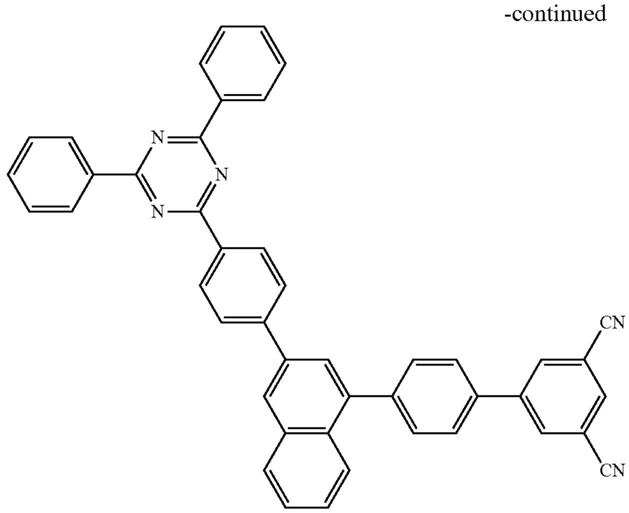

According to one embodiment of the present specification, the electron transfer layer can further include a compound represented by the following Chemical Formula 5.

[Chemical Formula 5]

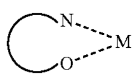

In Chemical Formula 5,

M is an alkali metal or an alkaline-earth metal, a curve connecting N and O represents bonds or atoms required to form a substituted or unsubstituted ring including N or O, and a dotted line means N and O forming a metal complex with M.

According to one embodiment of the present specification, the alkali metal can mean a group 1 element of the periodic table, that is, Li, Na, K, Rb or the like, and the alkaline-earth metal can mean a group 2 element of the periodic table, that is, Be, Mg, Ca, Sr or the like.

According to one embodiment of the present specification, Chemical Formula 5 can be represented by the following Chemical Formula 5-1.

[Chemical Formula 5-1]

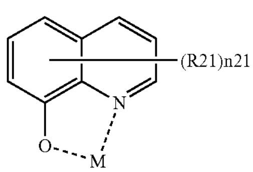

In Chemical Formula 5-1,

R21 is hydrogen; deuterium; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, n21 is an integer of 1 to 6, and when n21 is an integer of 2 or greater, substituents in the parentheses are the same as or different from each other, and the remaining substituents have the same definitions as in Chemical Formula 5.

According to one embodiment of the present specification, M can be Li.

According to one embodiment of the present specification, R21 can be hydrogen.

According to one embodiment of the present specification, when the electron transfer layer including the compound represented by Chemical Formula 3 is adjacent to a cathode, the electron transfer layer can further include the compound represented by Chemical Formula 5.

In one embodiment of the present specification, when using the compound represented by Chemical Formula 3 in an electron transfer layer, the compound represented by Chemical Formula 5 can be mixed and used as an n-type dopant. Herein, the compound represented by Chemical Formula 3 and the compound represented by Chemical Formula 5 can have a weight ratio of 1:100 to 100:1. Specifically, the weight ratio can be from 1:10 to 10:1. More specifically, the weight ratio can be 1:1.

According to one embodiment of the present specification, the organic material layer can further include one or more organic material layers selected from among a hole injection layer, a hole transfer layer and an electron injection layer.

An organic light emitting device according to one embodiment of the present specification includes an anode; a cathode; and a light emitting layer provided between the anode and the cathode, further includes an electron control layer provided between the light emitting layer and the cathode and including the compound of Chemical Formula 1, and an electron transfer layer provided between the electron control layer and the cathode and including the compound of Chemical Formula 3, can further include the compound of Chemical Formula 5 in the electron transfer layer, and in addition thereto, can further include one or more organic material layers selected from among a hole transfer layer, a hole injection layer and an electron injection layer. However, the structure of the organic light emitting device is not limited thereto, and can include less or more numbers of organic material layers.

The organic light emitting device according to one embodiment of the present specification includes an anode; a cathode; and a light emitting layer provided between the anode and the cathode, further includes an electron control layer provided between the light emitting layer and the cathode and including the compound of Chemical Formula 1, and an electron transfer layer provided between the electron control layer and the cathode and including the compound of Chemical Formula 3, and has a hole transfer layer provided between the anode and the light emitting layer, and has a hole injection layer provided between the anode and the hole transfer layer.

The organic light emitting device according to one embodiment of the present specification includes an anode; a cathode; and a light emitting layer provided between the anode and the cathode, further includes an electron control layer provided between the light emitting layer and the cathode and including the compound of Chemical Formula 1, and an electron transfer layer provided between the electron layer and the cathode and including the compound of Chemical Formula 3, can further include the compound of Chemical Formula 5 in the electron transfer layer, has a hole transfer layer provided between the anode and the light emitting layer, and has a hole injection layer provided between the anode and the hole transfer layer.

According to one embodiment of the present specification, the organic material layer of the organic light emitting device of the present specification can be foiled in a single layer structure, but can be formed in a multilayer structure in which two or more organic material layers are laminated. For example, the organic light emitting device in the present specification can have structures as illustrated in FIG. 1 to FIG. 3, however, the structure is not limited thereto.

FIG. 1 illustrates a structure of an organic light emitting device (10) in which an anode (30), a light emitting layer (40), an electron transfer layer (80) and a cathode (50) are consecutively laminated on a substrate (20). FIG. 1 is an exemplary structure of an organic light emitting device according to one embodiment of the present specification, and other organic material layers can be further included.

FIG. 2 illustrates a structure of an organic light emitting device (11) in which an anode (30), a hole injection layer (60), a hole transfer layer (70), a light emitting layer (40), an electron transfer layer (80), an electron injection layer (90) and a cathode (50) are consecutively laminated on a substrate (20). FIG. 2 is an exemplary structure of an organic light emitting device according to an embodiment of the present specification, and other organic material layers can be further included.

FIG. 3 illustrates a structure of an organic light emitting device (12) in which an anode (30), a hole injection layer (60), a hole transfer layer (70), a light emitting layer (40), an electron control layer (100), an electron transfer layer (80), an electron injection layer (90) and a cathode (50) are consecutively laminated on a substrate (20). FIG. 3 is an exemplary structure of an organic light emitting device according to an embodiment of the present specification, and other organic material layers can be further included.

In one embodiment of the present specification, the n-type dopant can be a metal complex and the like, and an alkali metal such as Li, Na, K, Rb, Cs or Fr; an alkaline-earth metal such as Be, Mg, Ca, Sr, Ba or Ra; a rare-earth metal such as La, Ce, Pr, Nd, Sm, Eu, Tb, Th, Dy, Ho, Er, Em, Gd, Yb, Lu, Y or Mn; or a metal compound including one or more metals of the above-mentioned metals can be used, however, the n-type dopant is not limited thereto, and those known in the art can be used. According to one embodiment, the electron transfer layer or the layer carrying out electron injection and electron transfer at the same time including the compound of Chemical Formula 3 can further include LiQ.

The organic light emitting device of the present specification can be manufactured using materials and methods known in the art, except that one or more layers of the organic material layers include the compound represented by Chemical Formula 1 or the compound represented by Chemical Formula 3 of the present specification.

When the organic light emitting device includes a plurality of organic material layers, the organic material layers can be formed with materials the same as or different from each other.

For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer, an electron control layer and an electron transfer layer thereon, and then depositing a material capable of being used as a cathode thereon. In addition to such a method, the organic light emitting device can also be manufactured by consecutively depositing a cathode material, an organic material layer and an anode material on a substrate. In addition, the compound of Chemical Formula 1 or Chemical Formula 3 can be formed into an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al, $LiO_2$/Al or Mg/Ag, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material of the light emitting layer is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole series compounds; dimerized styryl compounds; BAlq; 10-hydroxybenzoquinoline-metal compounds; benzoxazole, benzothiazole and benzimidazole series compounds; poly(p-phenylenevinylene) (PPV) series polymers; spiro compounds; polyfluorene; rubrene, and the like, but are not limited thereto.

The light emitting layer can include a host material and a dopant material. The host material can include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

The dopant material can include aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group, and arylamino group-including pyrene, anthracene, chrysene, peryflanthene and the like can be included. The styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group can be substituted or unsubstituted. Specifically, styrylamine, styryldiamine, styryltriamine, styryltetramine and the like can be included, however, the styrylamine compound is not limited thereto. As the metal complex, iridium complexes, platinum complexes and the like can be used, however, the metal complex is not limited thereto.

The electron transfer layer is a layer receiving electrons from an electron injection layer and transferring the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer can be used together with any desired cathode material as used in the art. Particularly, examples of the suitable cathode material can include common materials having low work function and having an aluminum layer or a silver layer following. Specifically, cesium, barium, calcium, ytterbium and samarium are included, and in each case, an aluminum layer or a silver layer follows.

The electron injection layer is a layer injecting electrons from an electrode, and compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The hole blocking layer is layer blocking holes from reaching a cathode, and can be generally formed under the same condition as the hole injection layer. Specific examples thereof can include oxadiazole derivatives, triazole derivatives, phenanthroline derivatives, BCP, aluminum complexes and the like, but are not limited thereto.

The metal complex compound includes 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxyquinolinato)-aluminum, tris(8-hydroxyquinolinato)gallium, bis(10-hydroxybenzo-[h]quinolinato)berylium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)-gallium and the like, but is not limited thereto.

The organic light emitting device according to the present specification can be a top-emission type, a bottom-emission type or a dual-emission type depending on the materials used.

According to one embodiment of the present specification, the compound represented by Chemical Formula 1 or Chemical Formula 3 can be included in an organic solar cell or an organic transistor in addition to the organic light emitting device.

Hereinafter, the present specification will be described in detail with reference to examples. However, the examples according to the present specification can be modified to various other forms, and the scope of the present specification is not to be construed as being limited to the examples described below. Examples of the present specification are provided in order to more fully describe the present specification to those having average knowledge in the art.

Synthesis Example

<Preparation Example 1-1> Synthesis of Compound E1

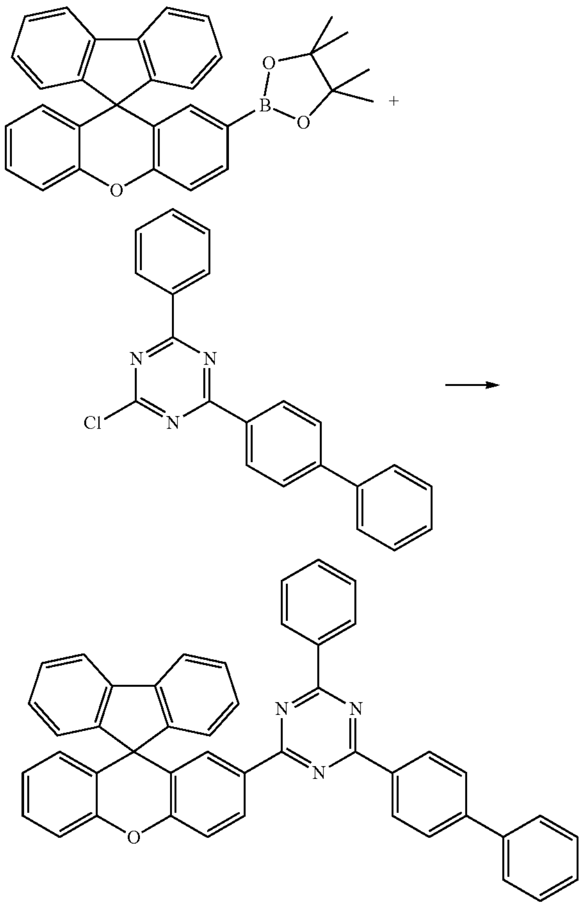

E1

After completely dissolving compounds of 4,4,5,5-tetramethyl-2-(spiro[fluorene-9,9'-xanthen]-2'-yl)-1,3,2-dioxaborolane (10.0 g, 21.8 mmol) and 2-([1,1'-biphenyl]-4-yl)-4-chloro-6-phenyl-1,3,5-triazine (7.5 g, 21.8 mmol) in tetrahydrofuran (100 ml), potassium carbonate (9.0 g, 65.4 mmol) dissolved in water (50 ml) was added thereto, and after introducing tetrakis-(triphenylphosphine) palladium (756 mg, 0.65 mmol) thereto, the result was heated and stirred for 8 hours. After lowering the temperature to room temperature and terminating the reaction, the potassium carbonate solution was removed to filter white solids. The filtered white solids were washed twice each with tetrahydrofuran and ethyl acetate to prepare Compound E1 (12.6 g, yield 90%).

MS$[M+H]^+$=640

<Preparation Example 1-2> Synthesis of Compound E2

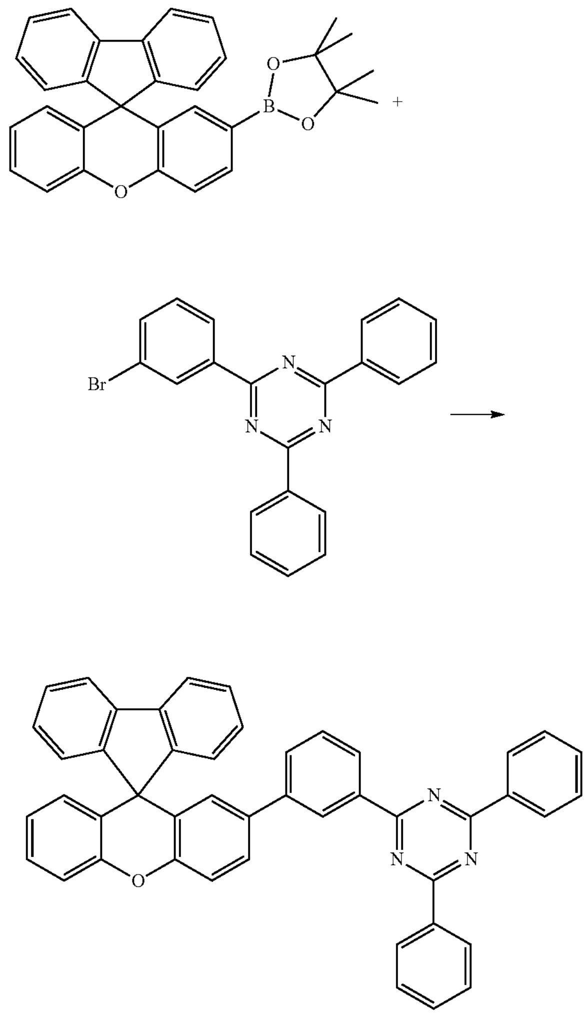

E2

Compound E2 was prepared in the same manner as in Preparation Example 1-1 except that 2-(3-bromophenyl)-4,6-diphenyl-1,3,5-triazine was used instead of the compound 2-([1,1'-biphenyl]-4-yl)-4-chloro-6-phenyl-1,3,5-triazine.

MS$[M+H]^+$=640

<Preparation Example 1-3> Synthesis of Compound E3

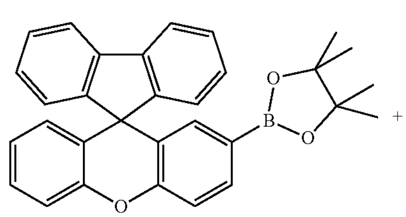

-continued

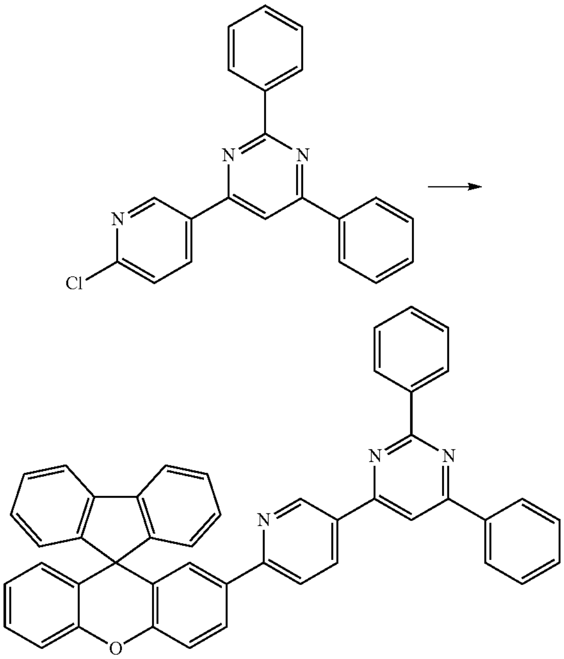

E3

Compound E3 was prepared in the same manner as in Preparation Example 1-1 except that 4-(6-chloropyridin-3-yl)-2,6-diphenylpyrimidine was used instead of the compound 2-([1,1'-biphenyl]-4-yl)-4-chloro-6-phenyl-1,3,5-triazine.

MS[M+H]$^+$=640

<Preparation Example 1-4> Synthesis of Compound E4

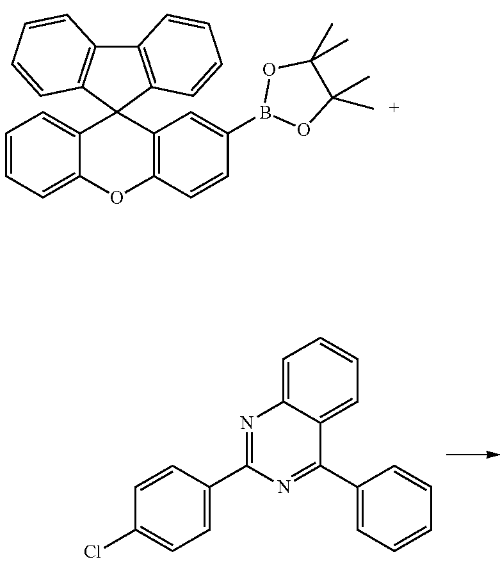

-continued

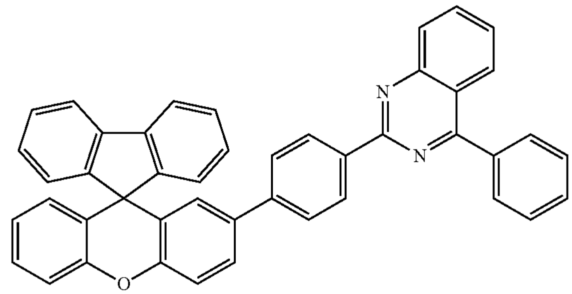

E4

Compound E4 was prepared in the same manner as in Preparation Example 1-1 except that 2-(4-chlorophenyl)-4-phenylquinazoline was used instead of the compound 2-([1,1'-biphenyl]-4-yl)-4-chloro-6-phenyl-1,3,5-triazine.

MS[M+H]$^+$=613

<Preparation Example 1-5> Synthesis of Compound E5

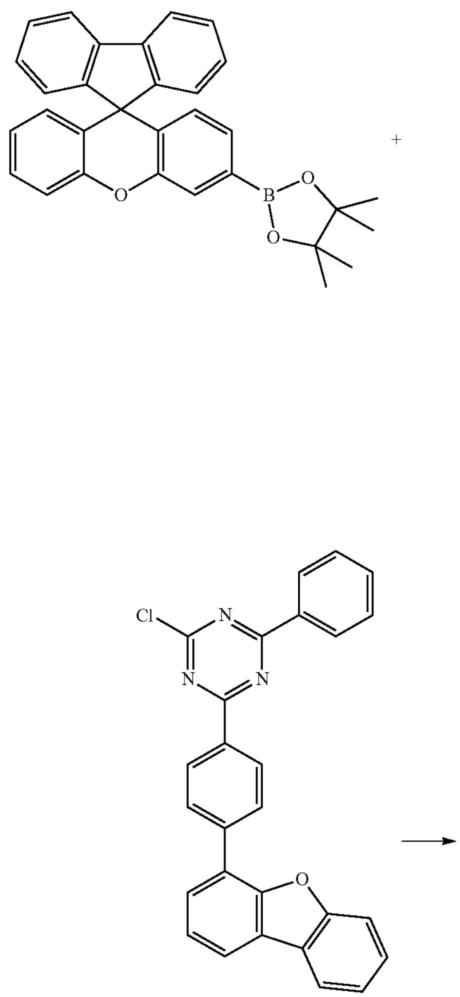

-continued

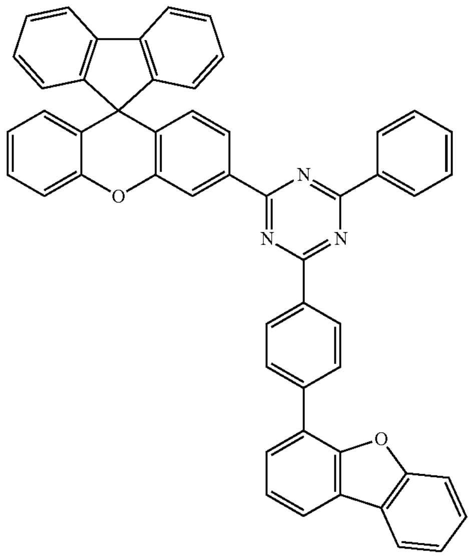

E5

Compound E5 was prepared in the same manner as in Preparation Example 1-1 except that 4,4,5,5-tetramethyl-2-(spiro[fluorene-9,9'-xanthene]-3'-yl)-1,3,2-dioxaborolane was used instead of the compound 4,4,5,5-tetramethyl-2-(spiro[fluorene-9,9'-xanthen]-2'-yl)-1,3,2-dioxaborolane, and 2-chloro-4-(4-(dibenzo[b,d]furan-4-yl)phenyl)-6-phenyl-1,3,5-triazine was used instead of the compound 2-([1,1'-biphenyl]-4-yl)-4-chloro-6-phenyl-1,3,5-triazine.

$MS[M+H]^+=730$

<Preparation Example 1-6> Synthesis of Compound E6

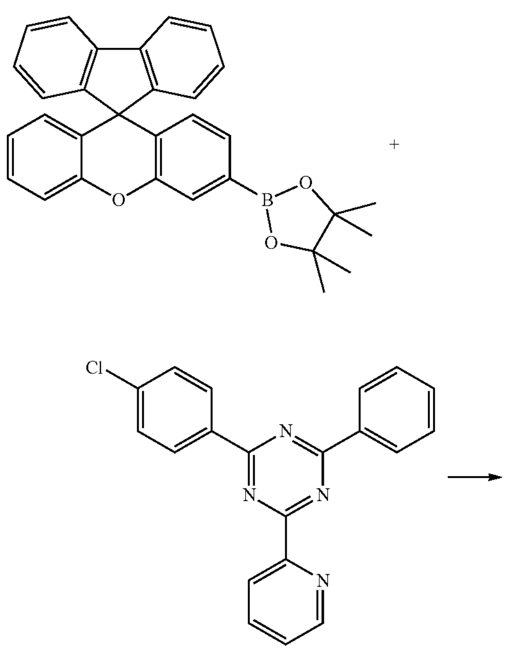

-continued

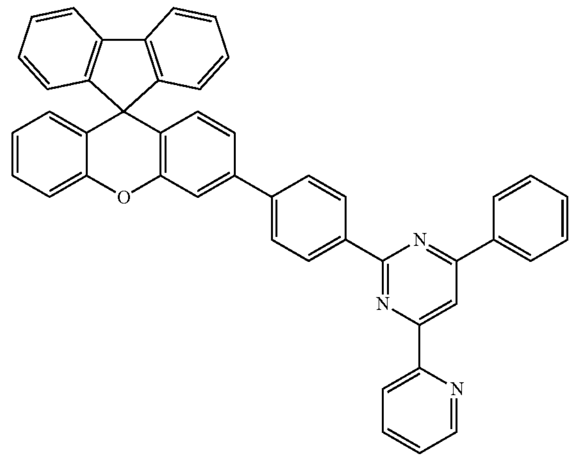

E6

Compound E6 was prepared in the same manner as in Preparation Example 1-5 except that 2-(4-chlorophenyl)-4-phenyl-6-(pyridin-2-yl)pyrimidine was used instead of the compound 2-chloro-4-(4-(dibenzo[b,d]furan-4-yl)phenyl)-6-phenyl-1,3,5-triazine.

$MS[M+H]^+=640$

<Preparation Example 1-7> Synthesis of Compound E7

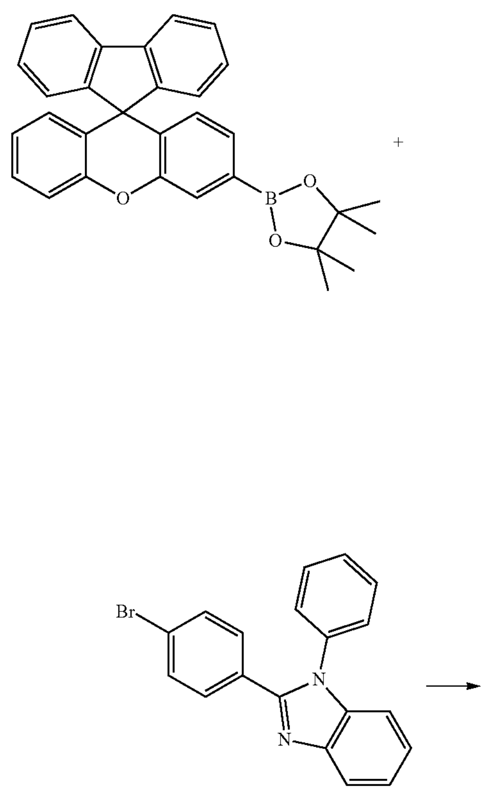

-continued

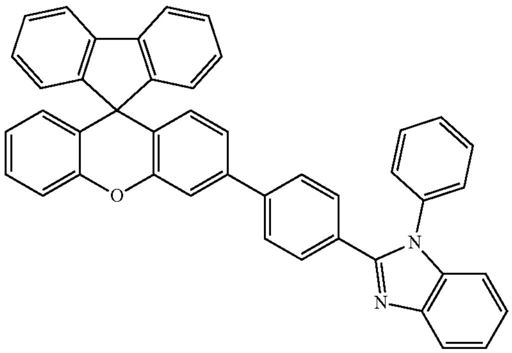

E7

Compound E7 was prepared in the same manner as in Preparation Example 1-5 except that 2-(4-bromophenyl)-1-phenyl-1H-benzo[d]imidazole was used instead of the compound 2-chloro-4-(4-(dibenzo[b,d]furan-4-yl)phenyl)-6-phenyl-1,3,5-triazine.

MS[M+H]$^+$=601

<Preparation Example 1-8> Synthesis of Compound E8

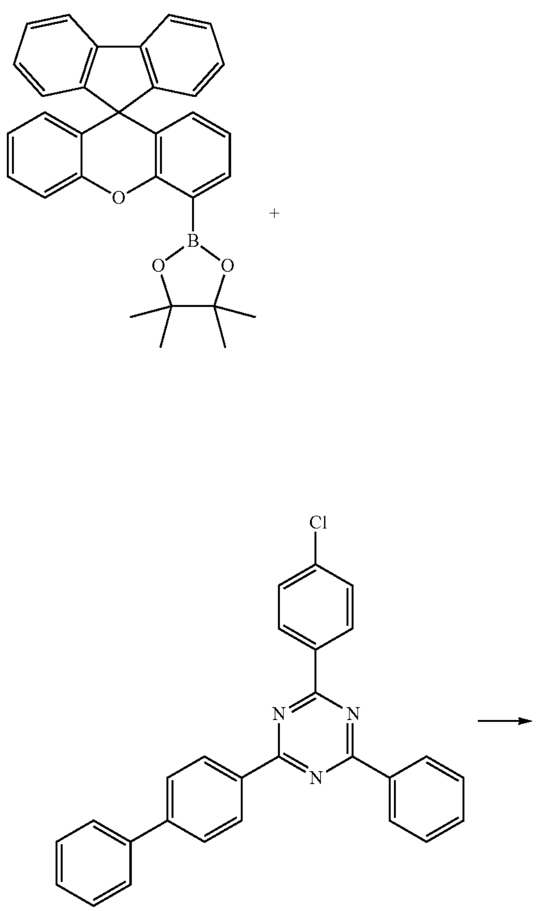

-continued

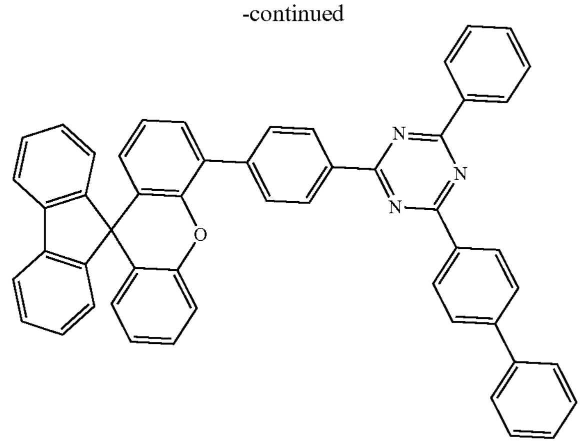

E8

Compound E8 was prepared in the same manner as in Preparation Example 1-1 except that 4,4,5,5-tetramethyl-2-(spiro[fluorene-9,9'-xanthene]-4'-yl)-1,3,2-dioxaborolane was used instead of the compound 4,4,5,5-tetramethyl-2-(spiro[fluorene-9,9'-xanthen]-2'-yl)-1,3,2-dioxaborolane, and 2-([1,1'-biphenyl]-4-yl)-4-(4-chlorophenyl)-6-phenyl-1,3,5-triazine was used instead of the compound 2-([1,1'-biphenyl]-4-yl)-4-chloro-6-phenyl-1,3,5-triazine.

MS[M+H]$^+$=716

<Preparation Example 1-9> Synthesis of Compound E9

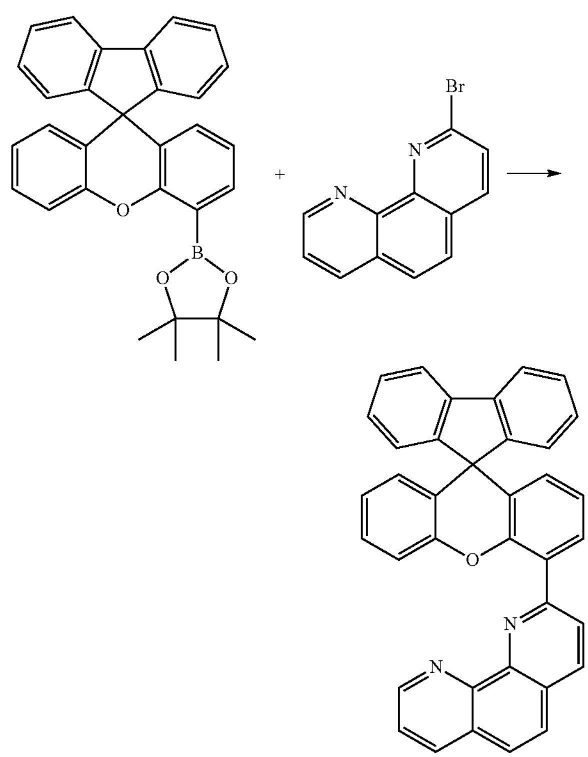

E9

Compound E9 was prepared in the same manner as in Preparation Example 1-8 except that 2-bromo-1,10- phenanthroline was used instead of the compound 2-([1,1'-biphenyl]-4-yl)-4-(4-chlorophenyl)-6-phenyl-1,3,5-triazine.

MS[M+H]$^{+}$=511

<Preparation Example 1-10> Synthesis of Compound E10

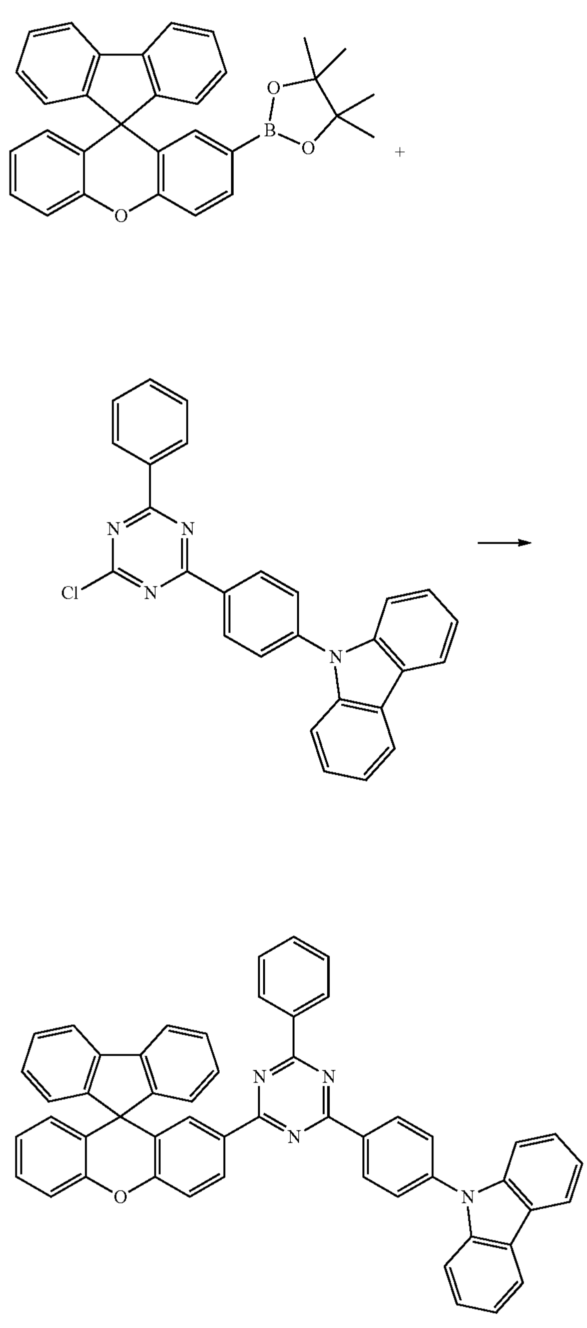

E10

Compound E10 was prepared in the same manner as in Preparation Example 1-1 except that 9-(4-(4-chloro-6-phenyl-1,3,5-triazin-2-yl)phenyl)-9H-carbazole was used instead of the compound 2-([1,1'-biphenyl]-4-yl)-4-chloro-6-phenyl-1,3,5-triazine.

MS[M+H]$^{+}$=729

<Preparation Example 1-11> Synthesis of Compound E11

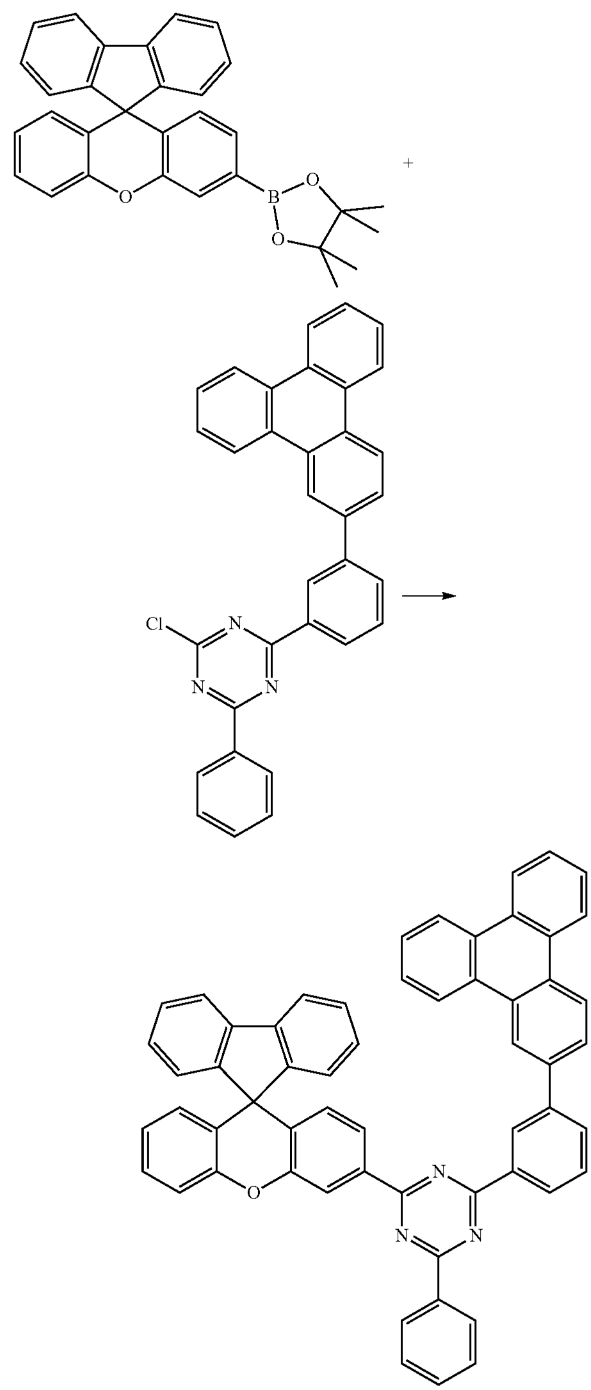

E11

Compound E11 was prepared in the same manner as in Preparation Example 1-5 except that 2-chloro-4-phenyl-6-(3-(triphenylen-2-yl)phenyl)-1,3,5-triazine was used instead of the compound 2-chloro-4-(4-(dibenzo[b,d]furan-4-yl)phenyl)-6-phenyl-1,3,5-triazine.

MS [M+H]$^{+}$=790

<Preparation Example 1-12> Synthesis of Compound E12

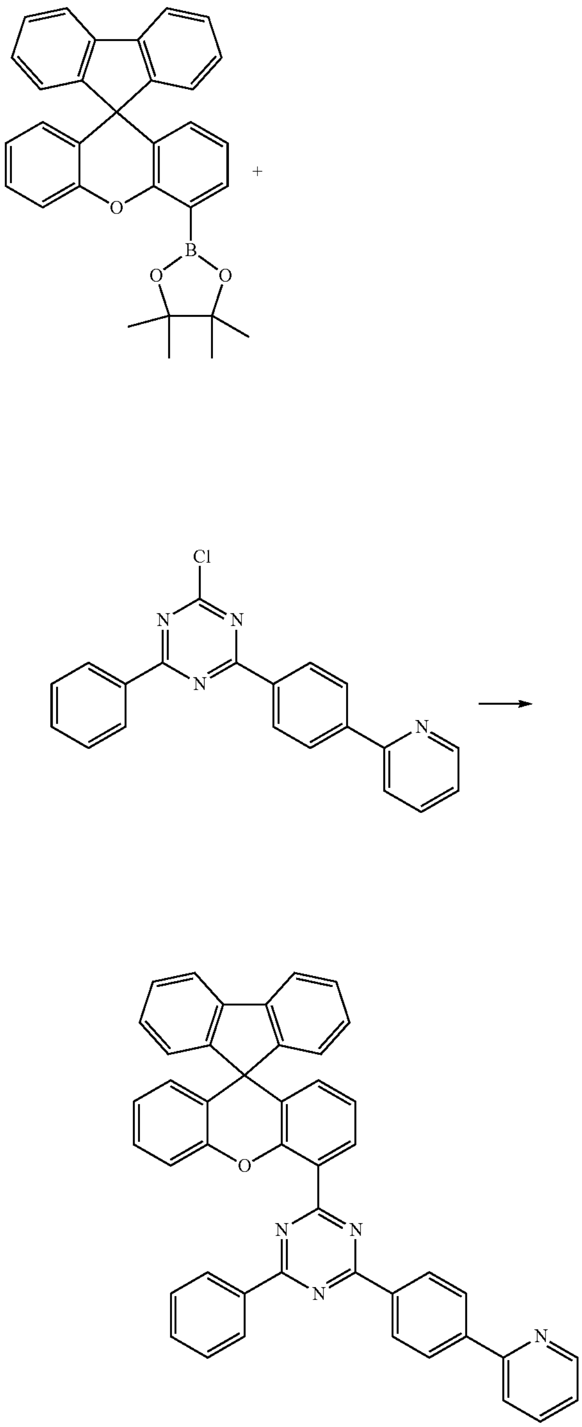

E12

Compound E12 was prepared in the same manner as in Preparation Example 1-8 except that 2-chloro-4-phenyl-6-(4-(pyridin-2-yl)phenyl)-1,3,5-triazine was used instead of the compound 2-([1,1'-biphenyl]-4-yl)-4-(4-chlorophenyl)-6-phenyl-MS[M+H]$^+$=641

<Preparation Example 1-13> Synthesis of Compound E13

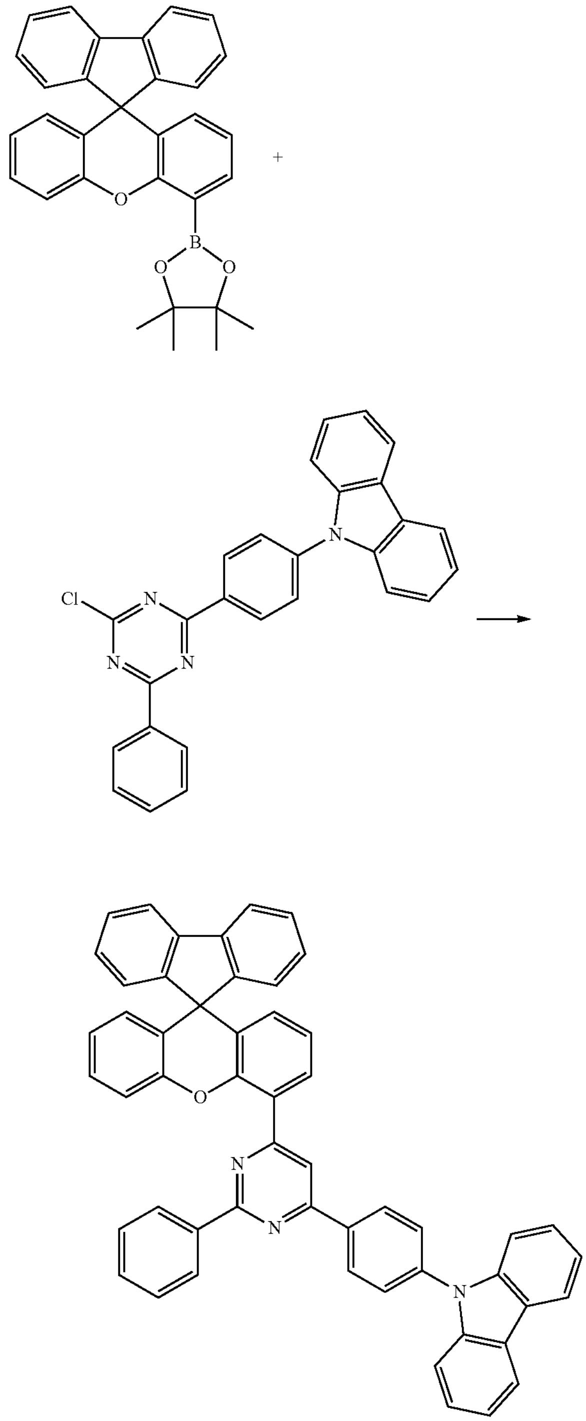

E13

Compound E13 was prepared in the same manner as in Preparation Example 1-8 except that 9-(4-(6-chloro-2-phenylpyridin-4-yl)phenyl)-9H-carbazole was used instead of the compound 2-([1,1'-biphenyl]-4-yl)-4-(4-chlorophenyl)-6-phenyl-1,3,5-triazine.

MS [M+H]$^+$=728

<Preparation Example 1-14> Synthesis of Compound E14

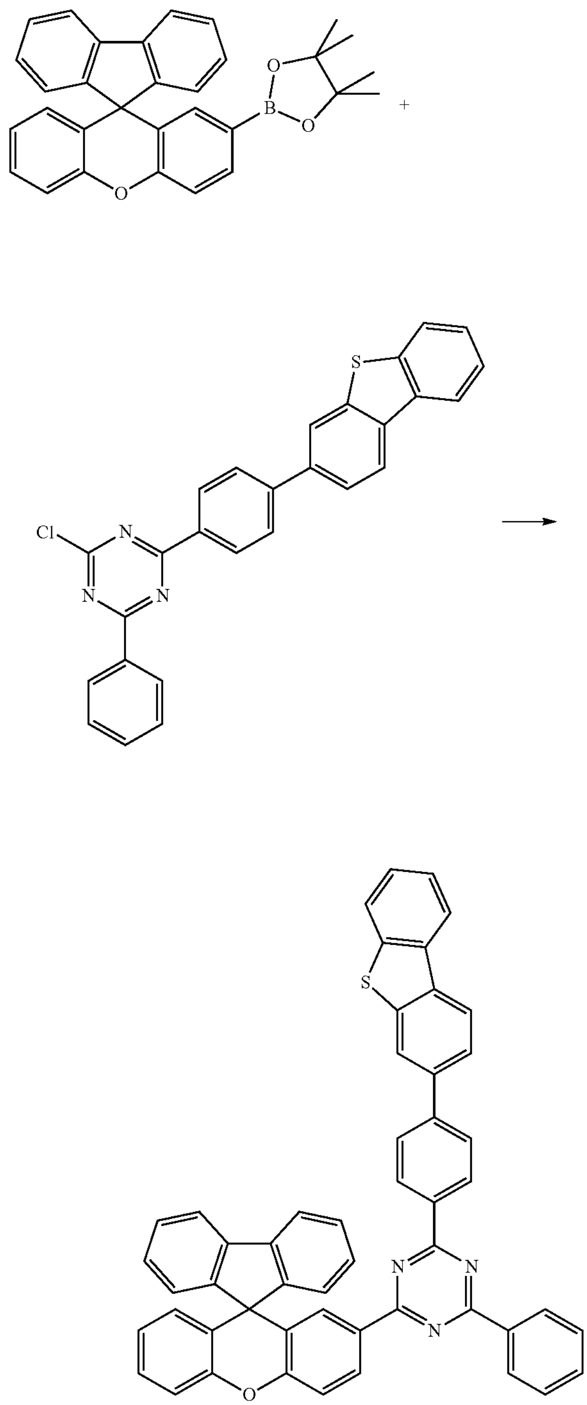

E14

Compound E14 was prepared in the same manner as in Preparation Example 1-1 except that 2-chloro-4-(4-(dibenzo[b,d]thiophen-3-yl)phenyl)-6-phenyl-1,3,5-triazine was used instead of the compound 2-([1,1'-biphenyl]-4-yl)-4-chloro-6-phenyl-1,3,5-triazine.

MS $[M+H]^+$=746

<Preparation Example 1-15> Synthesis of Compound E15

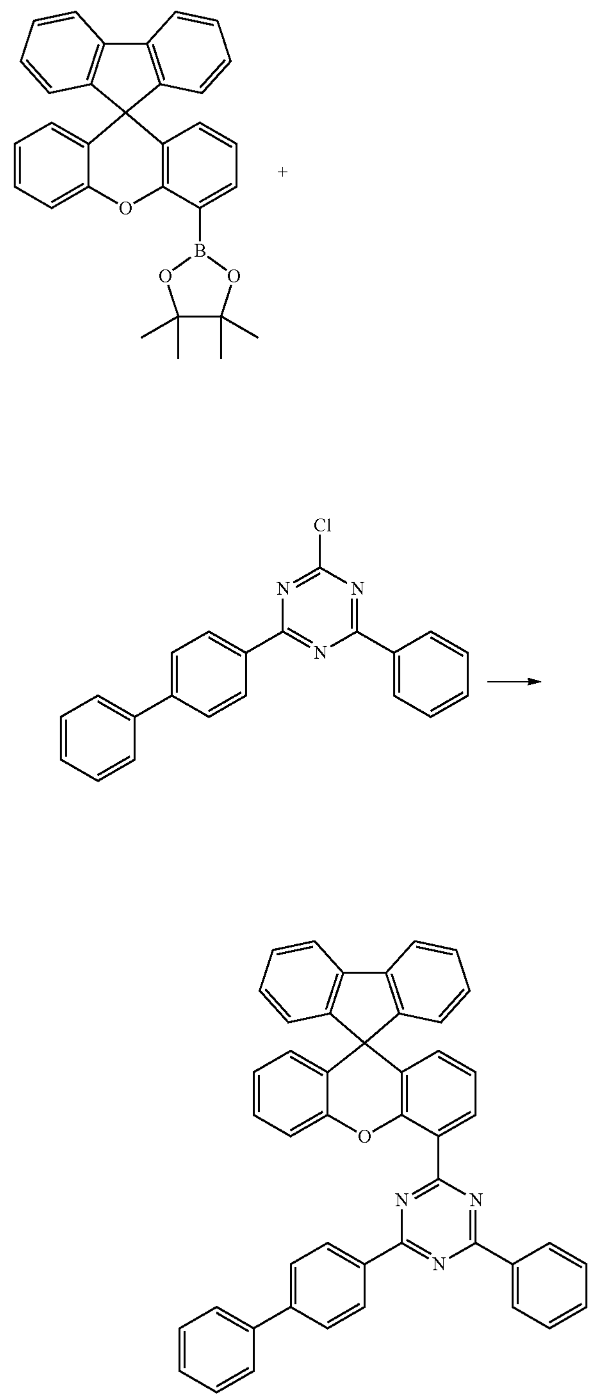

E15

Compound E15 was prepared in the same manner as in Preparation Example 1-8 except that 2-([1,1'-biphenyl]-4-yl)-4-chloro-6-phenyl-1,3,5-triazine was used instead of the compound 2-([1,1'-biphenyl]-4-yl)-4-(4-chlorophenyl)-6-phenyl-1,3,5-triazine.

MS$[M+H]^+$=640

<Preparation Example 1-16> Synthesis of Compound E16

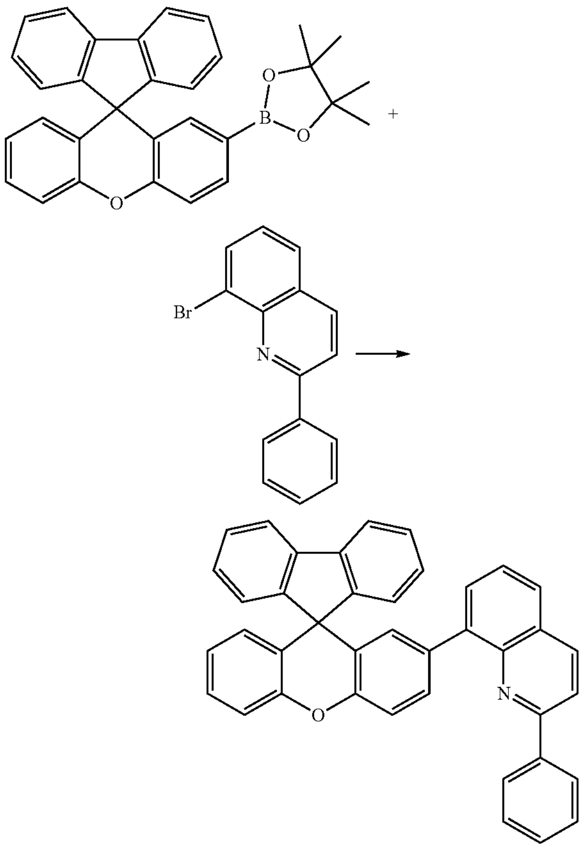

E16

Compound E16 was prepared in the same manner as in Preparation Example 1-1 except that each starting material was as in the above-described reaction formula.

MS $[M+H]^+$=536

<Preparation Example 1-17> Synthesis of Compound E17

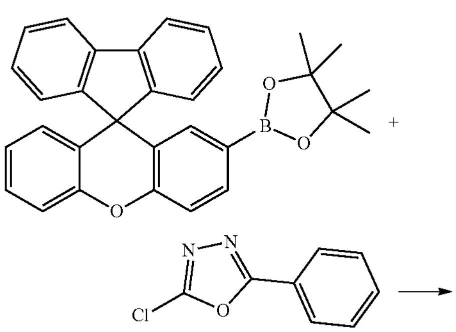

-continued

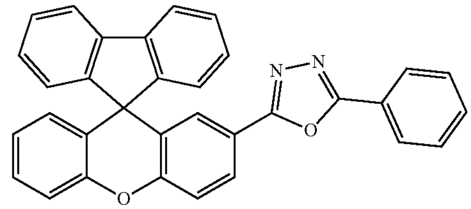

E17

Compound E17 was prepared in the same manner as in Preparation Example 1-1 except that each starting material was as in the above-described reaction formula.

MS $[M+H]^+$=477

<Preparation Example 1-18> Synthesis of Compound E18

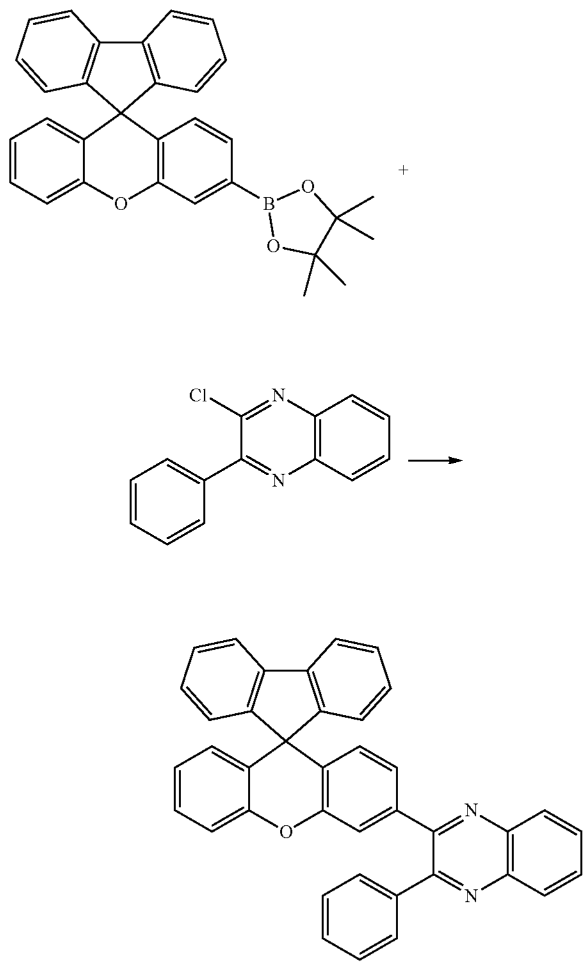

E18

Compound E18 was prepared in the same manner as in Preparation Example 1-1 except that each starting material was as in the above-described reaction formula.

MS $[M+H]^+$=537

<Preparation Example 1-19> Synthesis of Compound E19

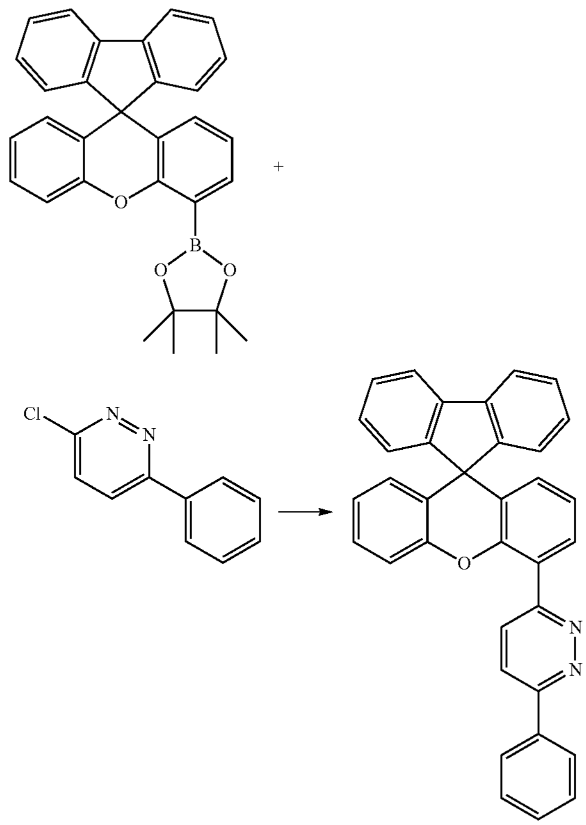

E19

Compound E19 was prepared in the same manner as in Preparation Example 1-1 except that each starting material was as in the above-described reaction formula.

MS $[M+H]^+$=487

<Preparation Example 1-20> Synthesis of Compound E20

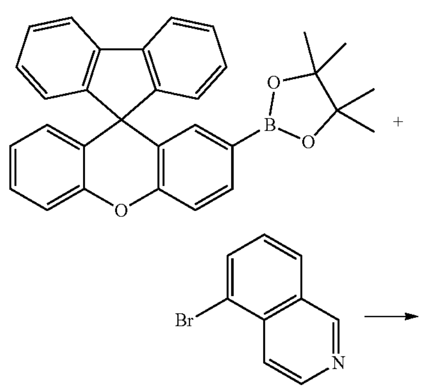

-continued

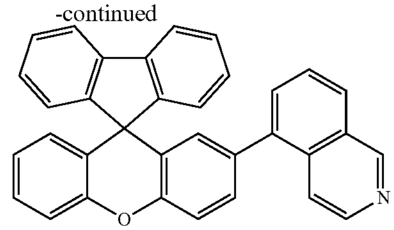

E20

Compound E20 was prepared in the same manner as in Preparation Example 1-1 except that each starting material was as in the above-described reaction formula.

MS$[M+H]^+$=460

<Preparation Example 1-21> Synthesis of Compound E21

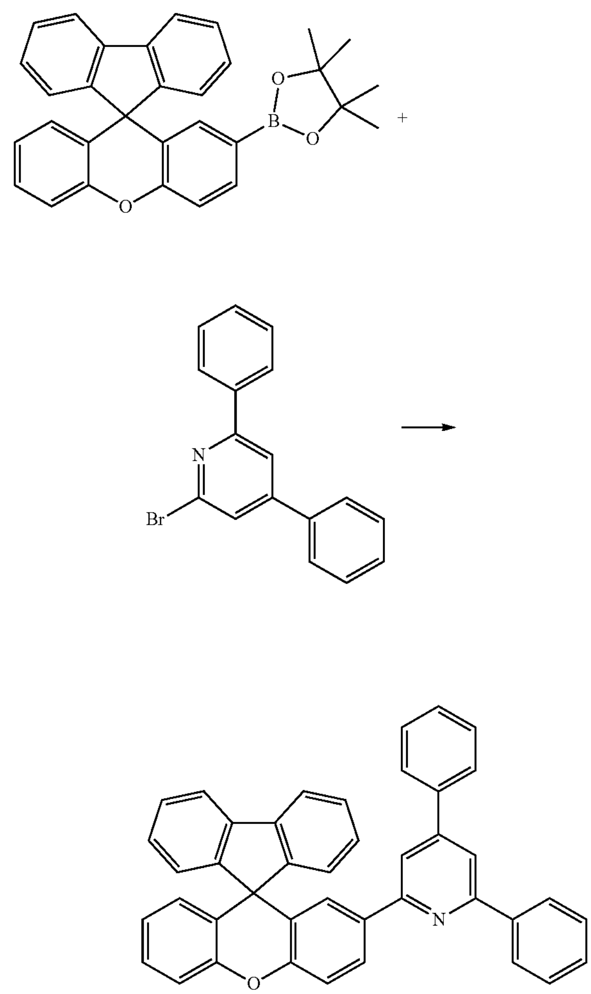

E21

Compound E21 was prepared in the same manner as in Preparation Example 1-1 except that each starting material was as in the above-described reaction formula.

MS $[M+H]^+$=562

<Preparation Example 1-22> Synthesis of Compound E22

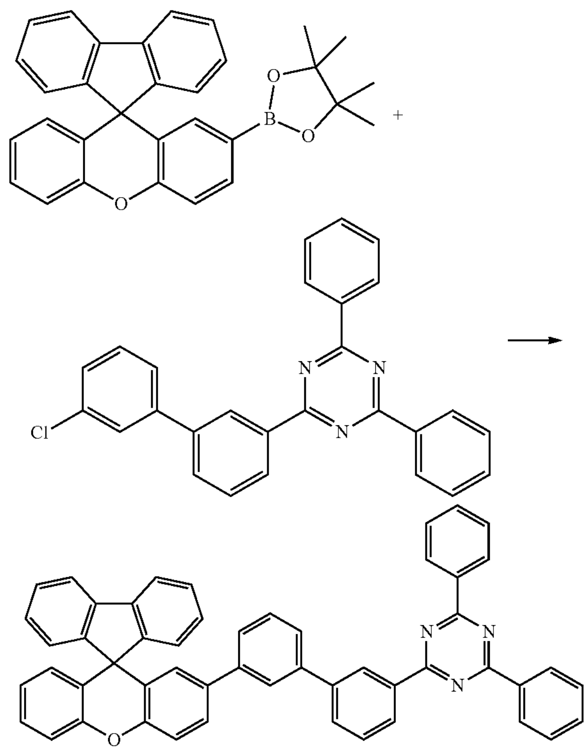

E22

Compound E22 was prepared in the same manner as in Preparation Example 1-1 except that each starting material was as in the above-described reaction formula.

MS $[M+H]^{+}$=716

<Preparation Example 1-23> Synthesis of Compound E23

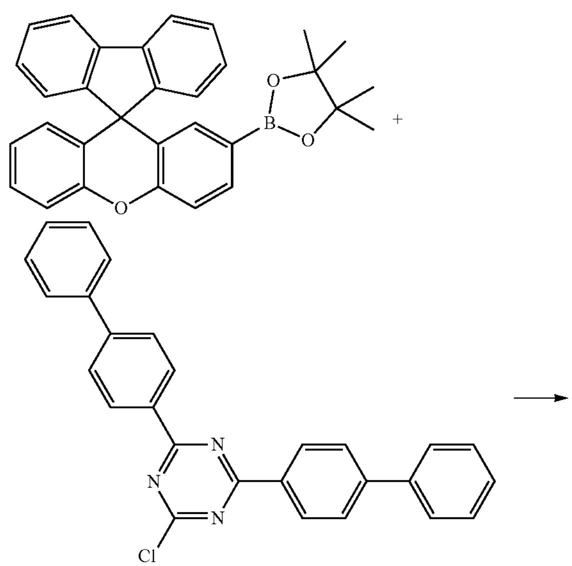

-continued

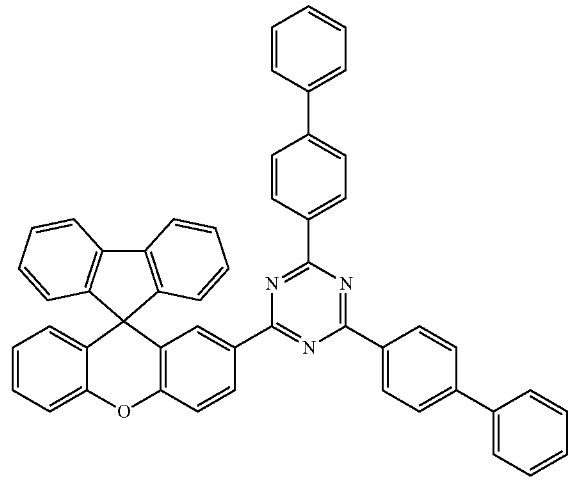

E23

Compound E23 was prepared in the same manner as in Preparation Example 1-1 except that each starting material was as in the above-described reaction formula.

MS$[M+H]^{+}$=716

<Preparation Example 2-1> Synthesis of Compound F1

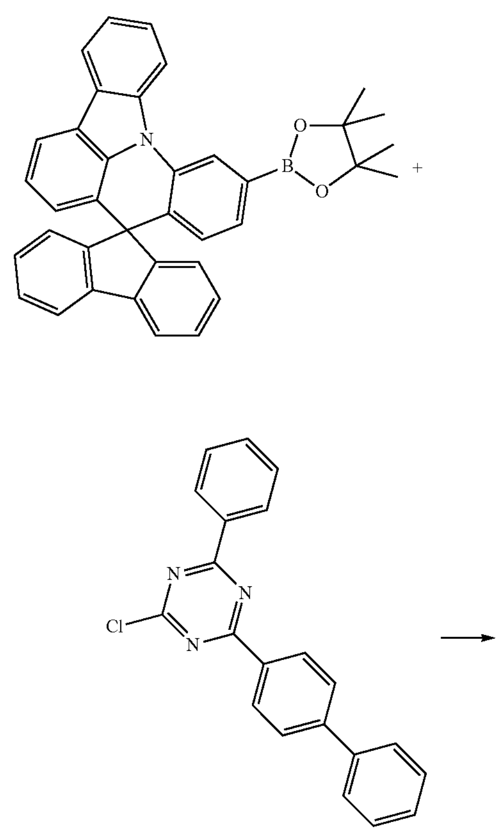

-continued

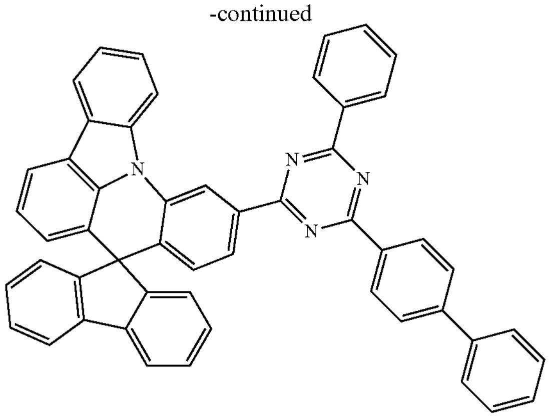

F1

Compound F1 was prepared in the same manner as in Preparation Example 1-1 except that each starting material was as in the above-described reaction formula.

MS[M+H]+=713

<Preparation Example 2-2> Synthesis of Compound F2

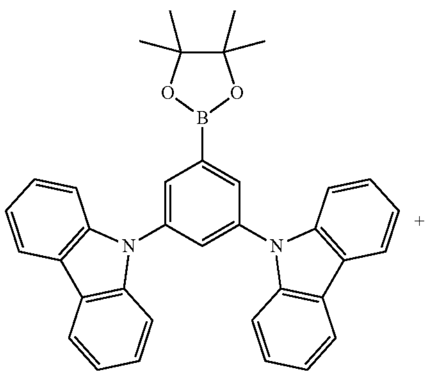

-continued

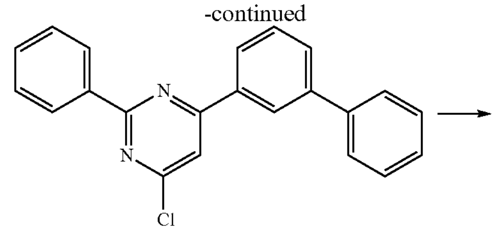

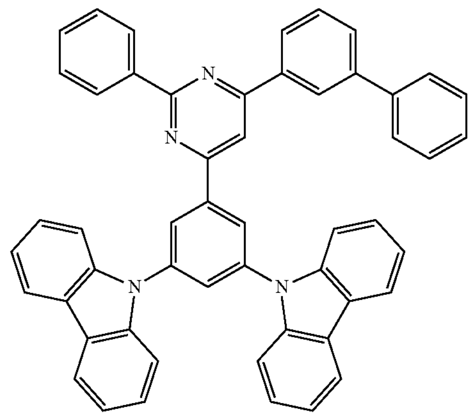

F2

Compound F2 was prepared in the same manner as in Preparation Example 1-1 except that each starting material was as in the above-described reaction formula.

MS[M+H]+=715

<Preparation Example 2-3> Synthesis of Compound F3

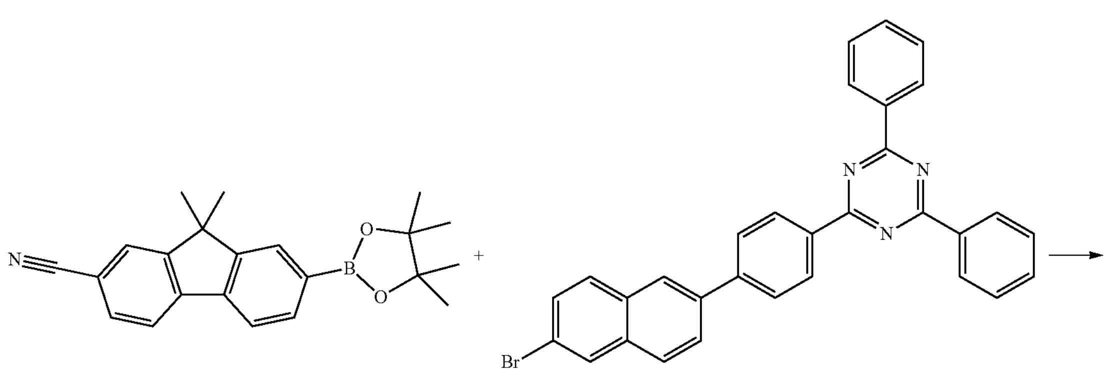

-continued

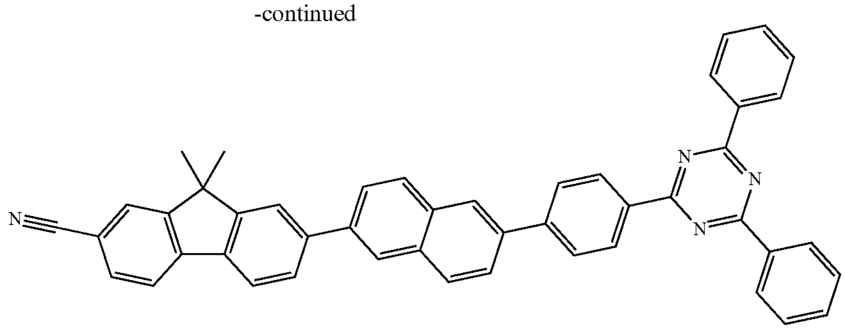

F3

Compound F3 was prepared in the same manner as in Preparation Example 1-1 except that each starting material was as in the above-described reaction formula.

MS[M+H]+=653

<Preparation Example 2-4> Synthesis of Compound F4

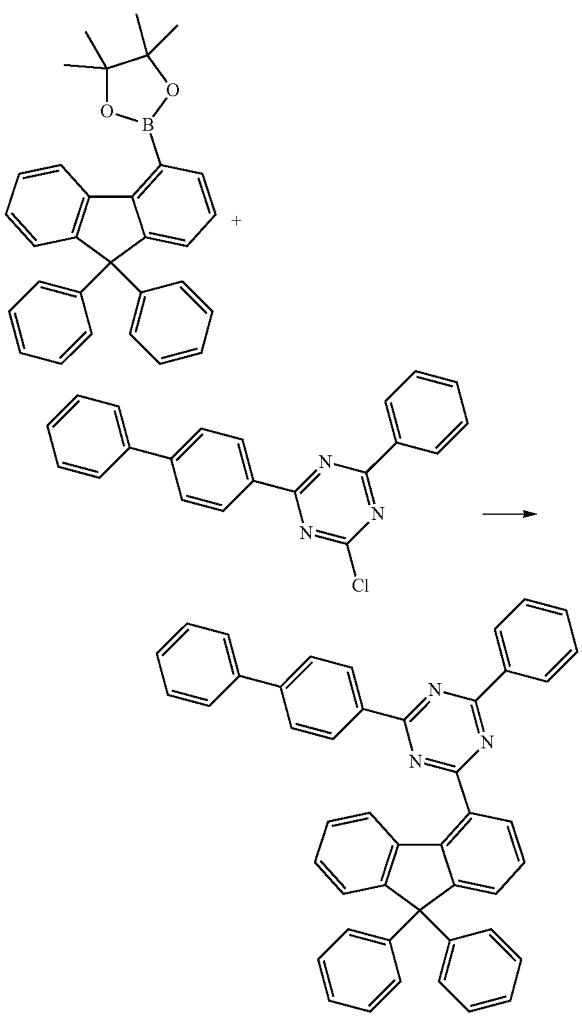

F4

Compound F4 was prepared in the same manner as in Preparation Example 1-1 except that each starting material was as in the above-described reaction formula.

MS[M+H]+=626

<Preparation Example 2-5> Synthesis of Compound F5

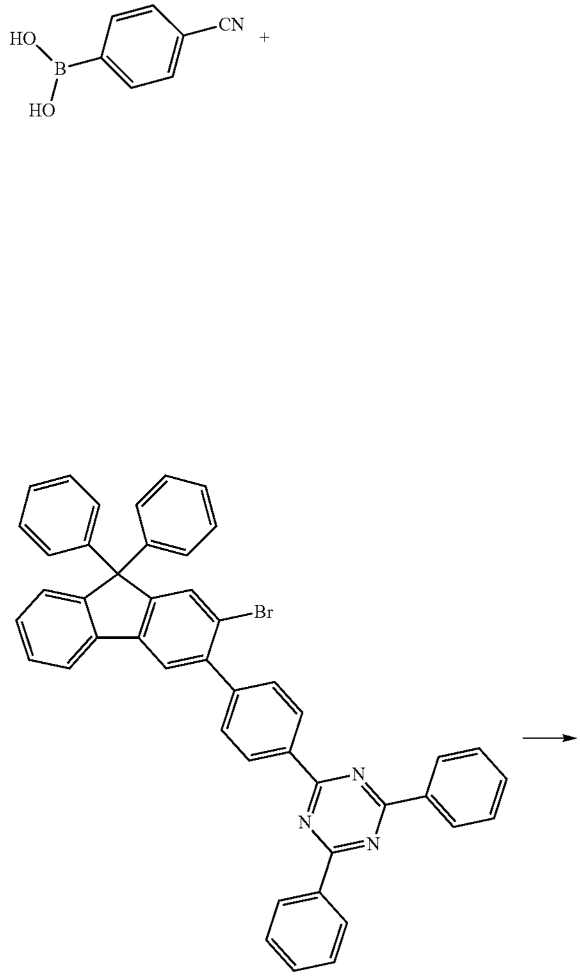

-continued

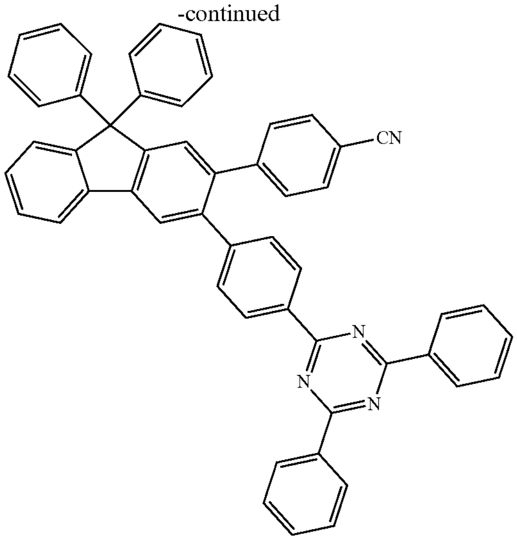

F5

Compound F5 was prepared in the same manner as in Preparation Example 1-1 except that each starting material was as in the above-described reaction formula.

MS[M+H]$^+$=727

Example 1-1

A glass substrate on which indium tin oxide (ITO) was coated as a thin film to a thickness of 1,000 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was formed by thermal vacuum depositing the following compound [HI-A] to a thickness of 600 Å. A hole transfer layer was formed on the hole injection layer by vacuum depositing hexaazatriphenylene (HAT) of the following chemical formula to 50 Å and the following compound [HT-A] (600 Å) in consecutive order.

Subsequently, a light emitting layer was formed on the hole transfer layer to a film thickness of 200 Å by vacuum depositing the following compounds [BH] and [BD] in a weight ratio of 25:1.

An electron control layer was formed on the light emitting layer to a thickness of 50 Å by vacuum depositing [Compound E1]. On the electron control layer, an electron transfer layer was formed to a thickness of 300 Å by vacuum depositing [Compound F1] and the following lithium quinolate [LiQ] compound in a weight ratio of 1:1. A cathode was formed on the electron transfer layer by depositing lithium fluoride (LiF) to a thickness of 10 Å and aluminum to a thickness of 1,000 Å in consecutive order.

An organic light emitting device was manufactured by maintaining, in the above-mentioned processes, the deposition rates of the organic materials at 0.4 Å/sec to 0.9 Å/sec, the deposition rates of the lithium fluoride and the aluminum of the cathode at 0.3 Å/sec and 2 Å/sec, respectively, and the degree of vacuum during the deposition at $2\times10^{-7}$ torr to $5\times10^{-8}$ torr.

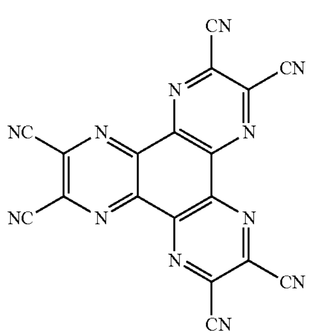

[HAT]

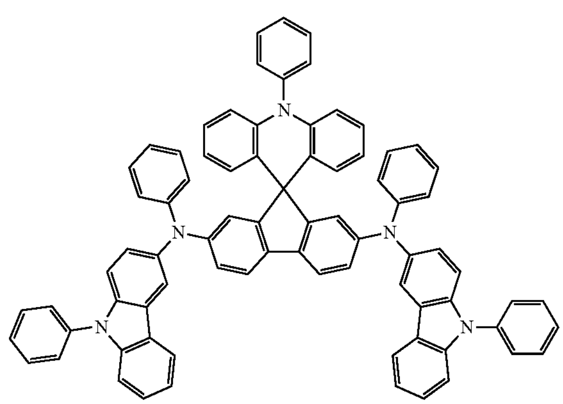

[HI-A]

-continued
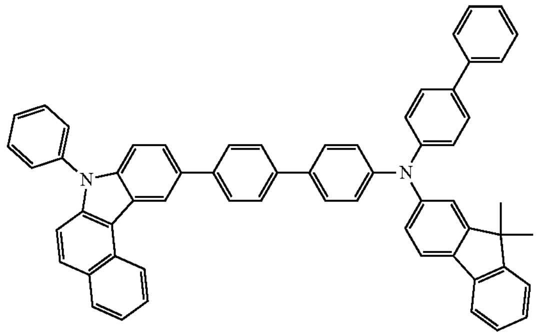
[HT-A]
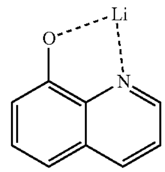
[LiQ]
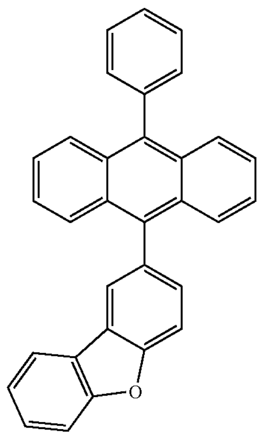
[BH]
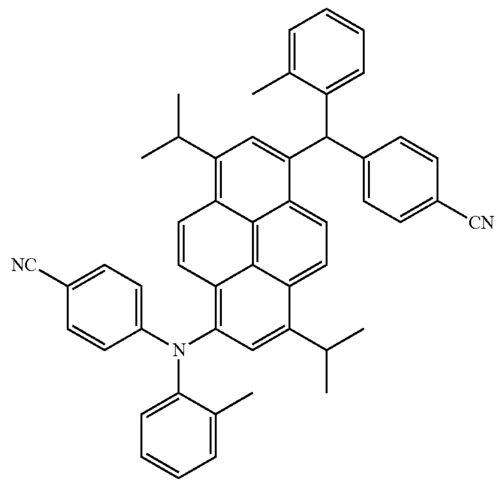
[BD]
E1
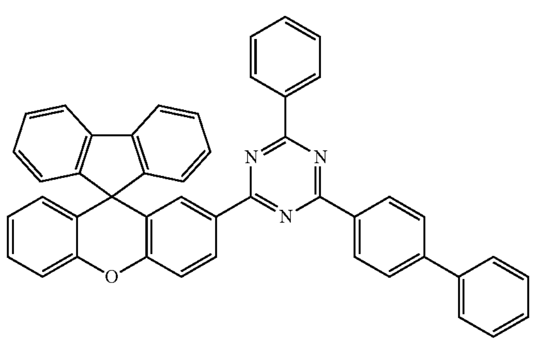
E2
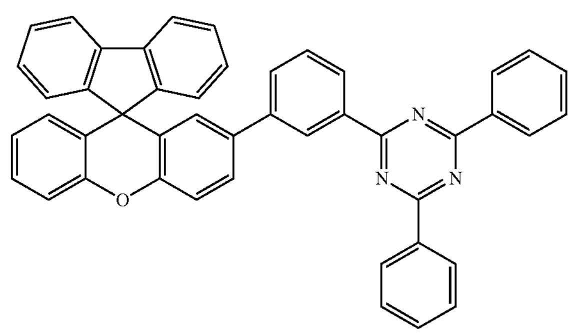
E3
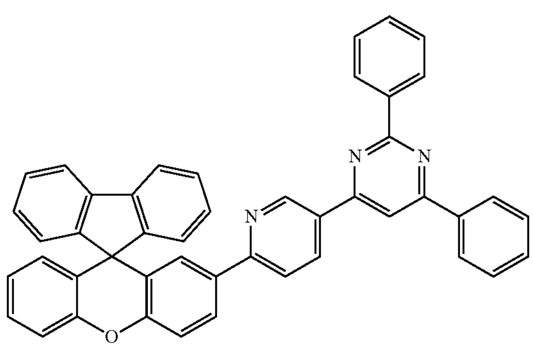
E4
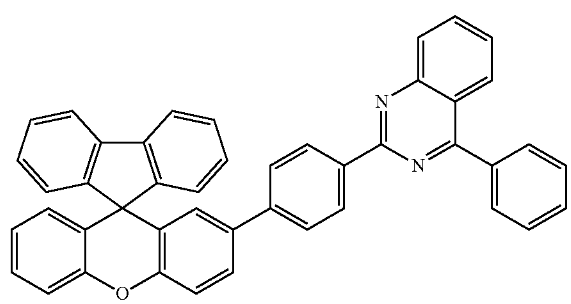

-continued
E5
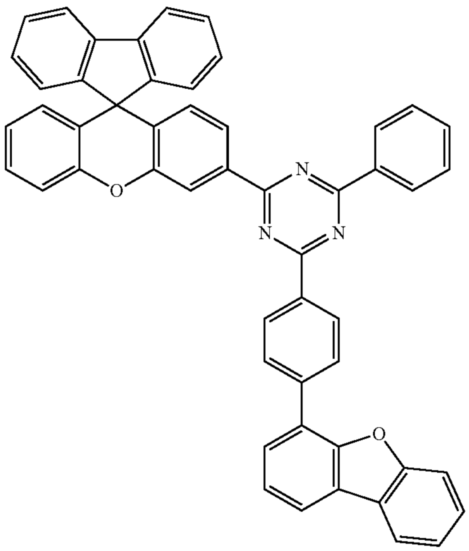
E6
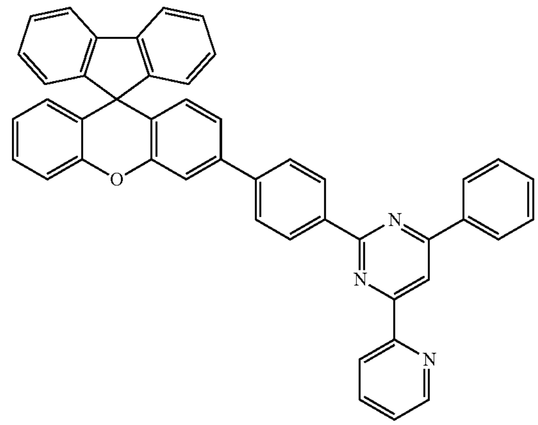
E7
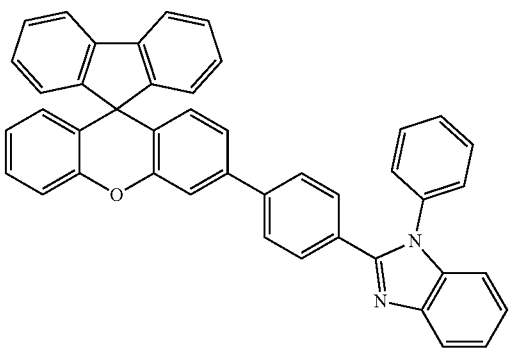
E8
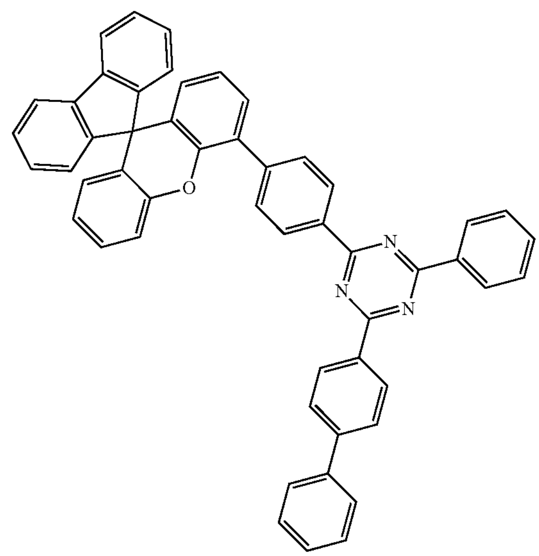
E9
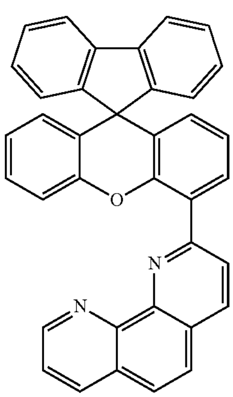
E10
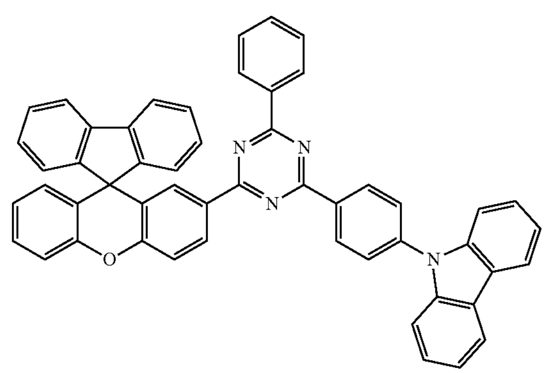

-continued
E11
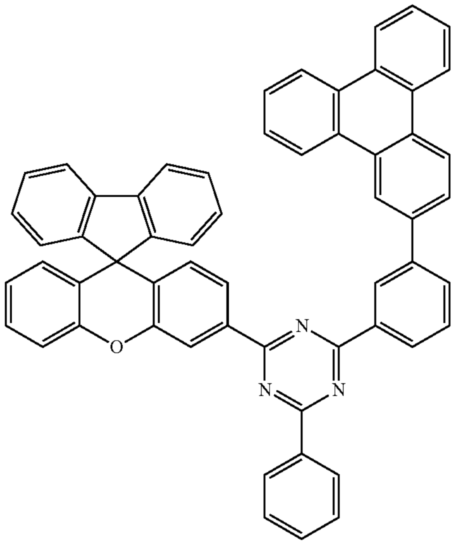
E12
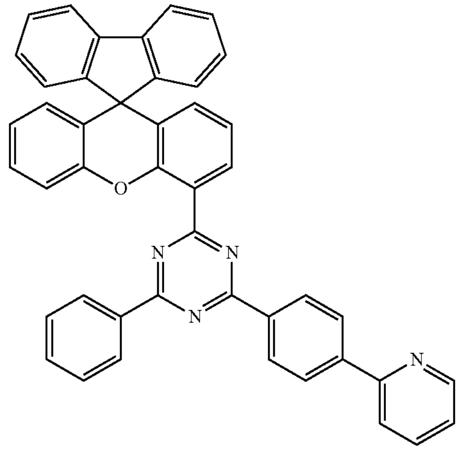
E13
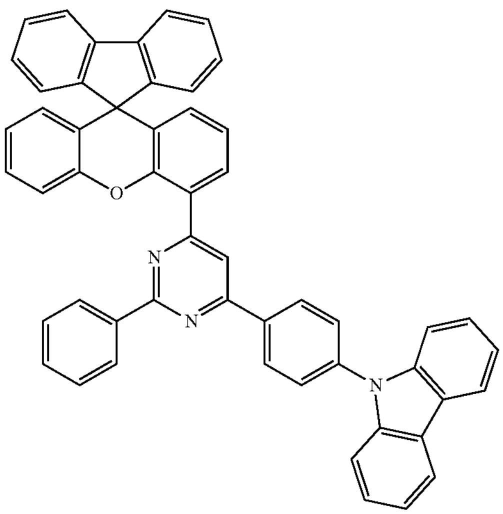
E14
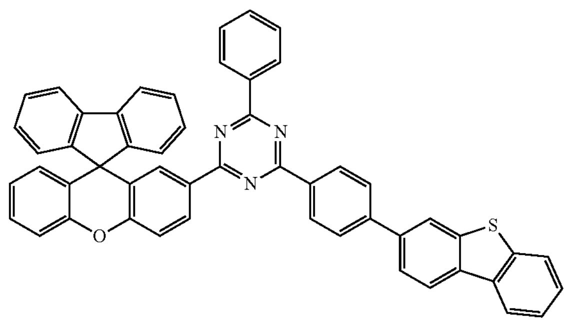
E15
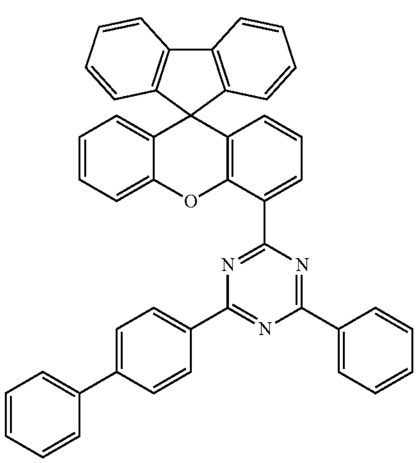
E16
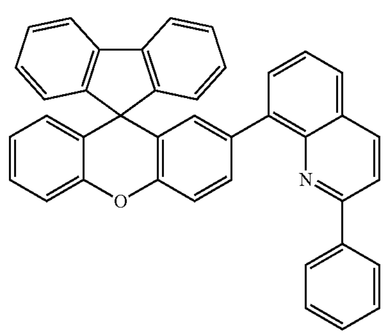

-continued
E17
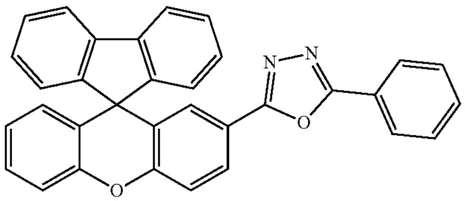
E18
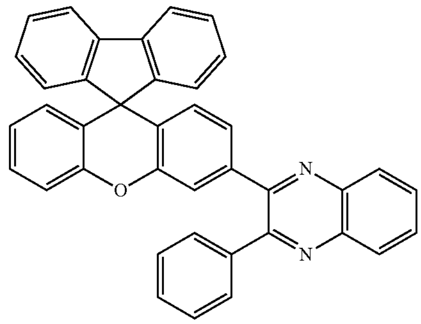
E19
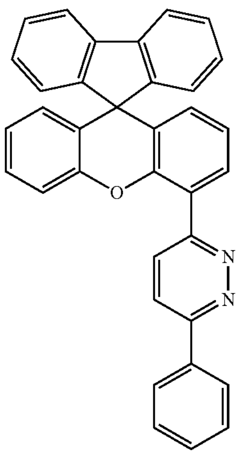
E20
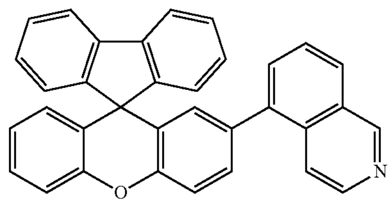
E21
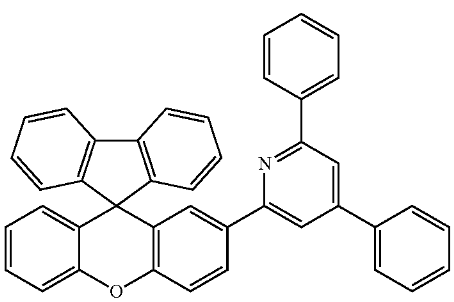
E22
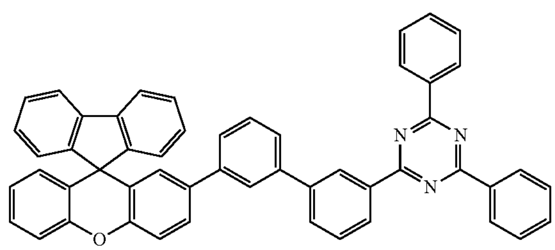
E23
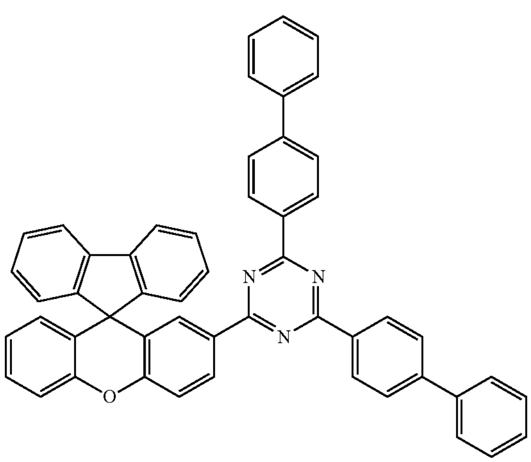
F1
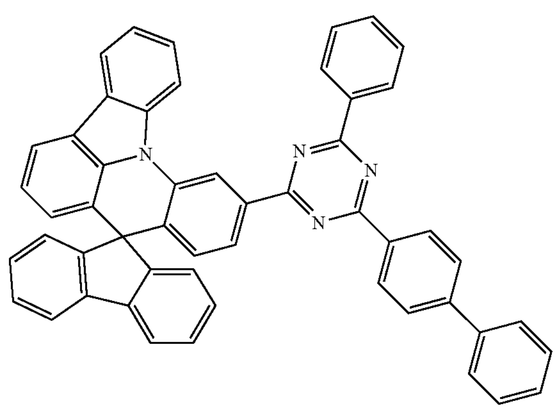

-continued
F2
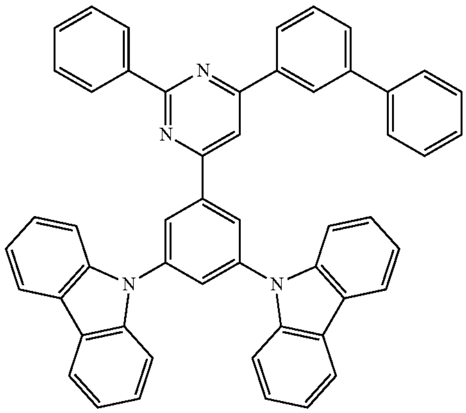
F3
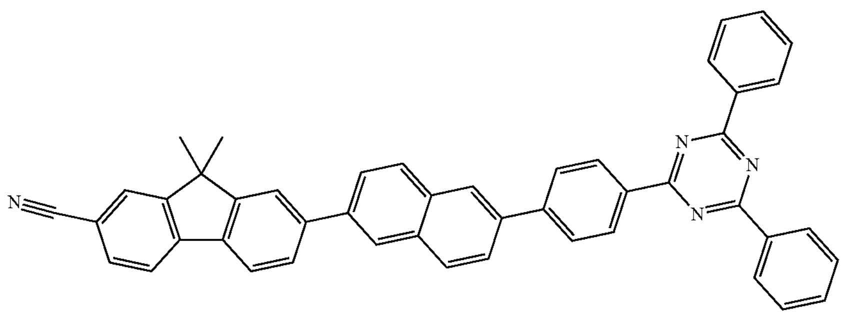
F4
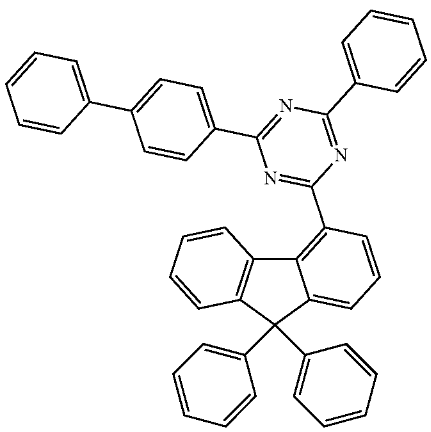
F5
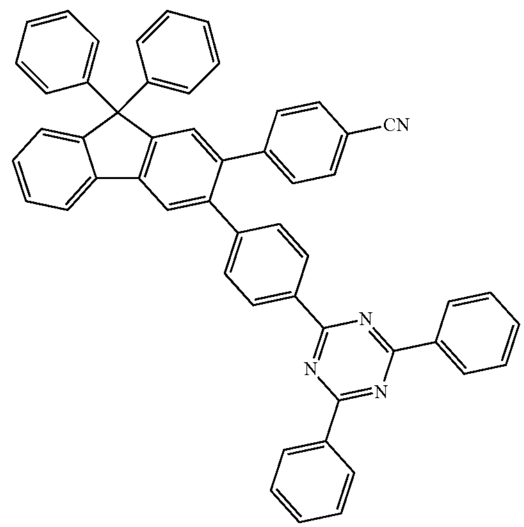
[ET-1-A]
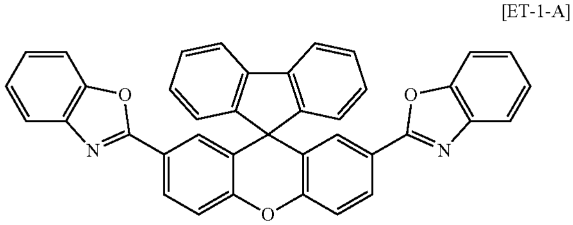
[ET-1-B]
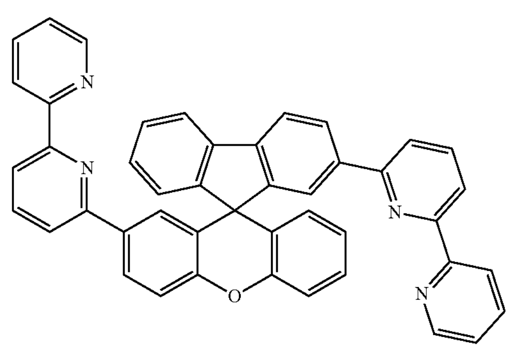

-continued
[ET-1-C]
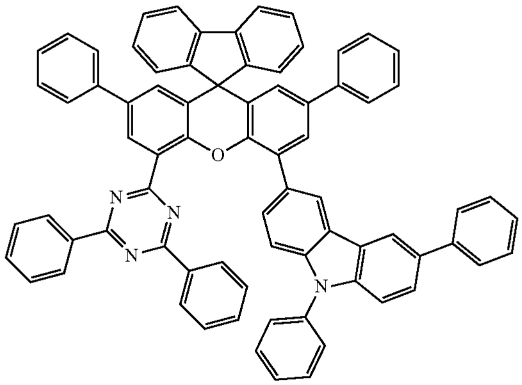
[ET-1-D]
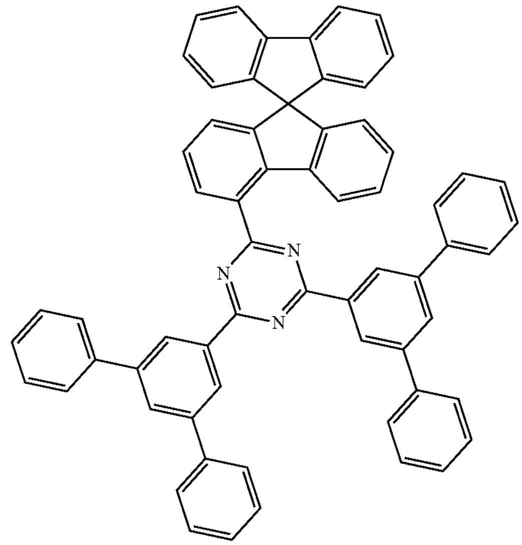
[ET-1-E]
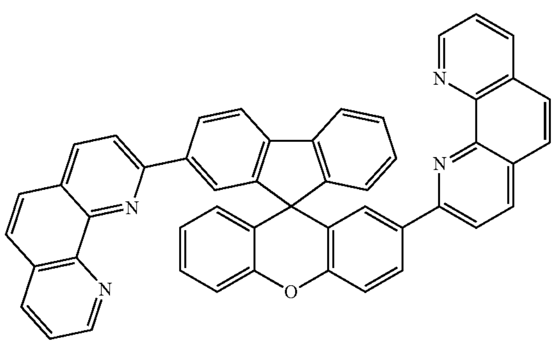
[ET-1-F]
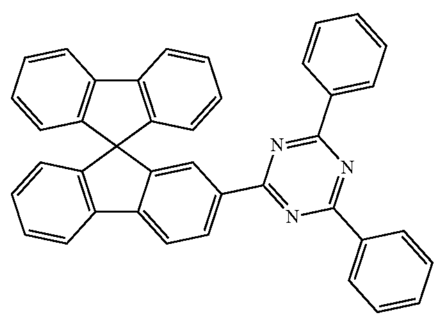
[ET-1-G]
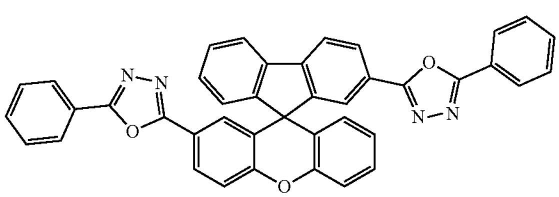
[ET-1-H]
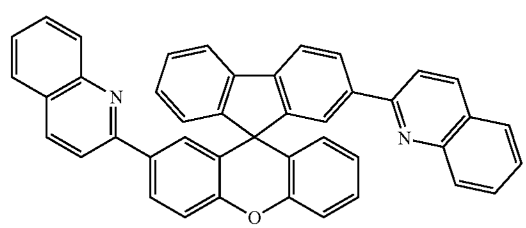

-continued

[ET-1-I]

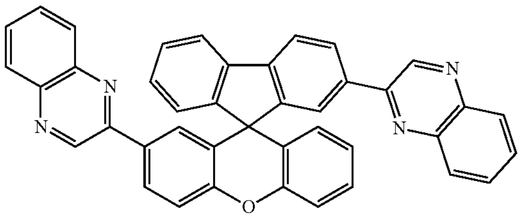

[ET-1-J]

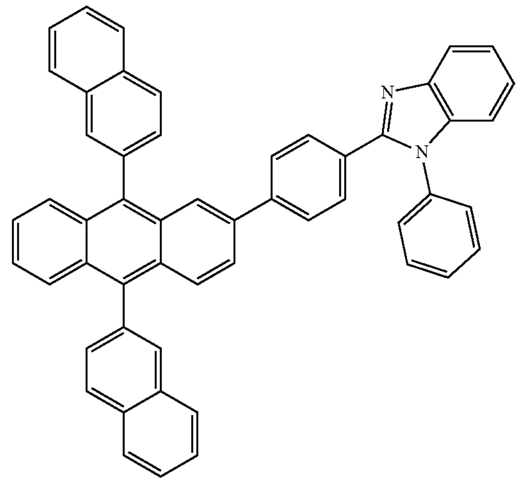

[ET-1-K]

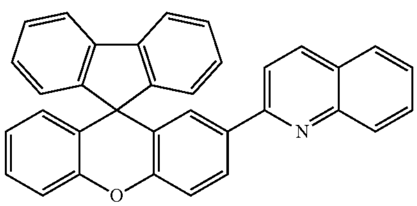

[ET-1-L]

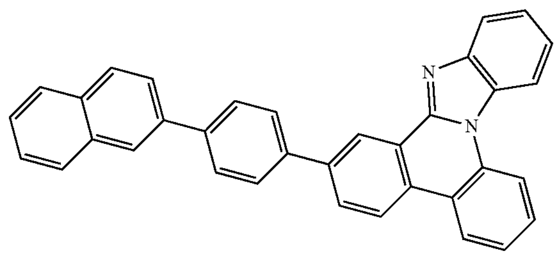

Example 1-2

An organic light emitting device was manufactured in the same manner as in Example 1-1 except that Compound E2 was used instead of Compound E1.

Example 1-3

An organic light emitting device was manufactured in the same manner as in Example 1-1 except that Compound E3 was used instead of Compound E1.

Example 1-4

An organic light emitting device was manufactured in the same manner as in Example 1-1 except that Compound E4 was used instead of Compound E1.

Example 1-5

An organic light emitting device was manufactured in the same manner as in Example 1-1 except that Compound F2 was used instead of Compound F1.

Example 1-6

An organic light emitting device was manufactured in the same manner as in Example 1-2 except that Compound F2 was used instead of Compound F1.

Example 1-7

An organic light emitting device was manufactured in the same manner as in Example 1-3 except that Compound F2 was used instead of Compound F1.

Example 1-8

An organic light emitting device was manufactured in the same manner as in Example 1-4 except that Compound F2 was used instead of Compound F1.

Example 1-9

An organic light emitting device was manufactured in the same manner as in Example 1-1 except that Compound F3 was used instead of Compound F1.

Example 1-10

An organic light emitting device was manufactured in the same manner as in Example 1-2 except that Compound F3 was used instead of Compound F1.

Example 1-11

An organic light emitting device was manufactured in the same manner as in Example 1-3 except that Compound F3 was used instead of Compound F1.

Example 1-12

An organic light emitting device was manufactured in the same manner as in Example 1-4 except that Compound F3 was used instead of Compound F1.

Example 1-13

An organic light emitting device was manufactured in the same manner as in Example 1-1 except that Compound F4 was used instead of Compound F1.

Example 1-14

An organic light emitting device was manufactured in the same manner as in Example 1-2 except that Compound F4 was used instead of Compound F1.

Example 1-15

An organic light emitting device was manufactured in the same manner as in Example 1-3 except that Compound F4 was used instead of Compound F1.

Example 1-16

An organic light emitting device was manufactured in the same manner as in Example 1-4 except that Compound F4 was used instead of Compound F1.

Example 1-17

An organic light emitting device was manufactured in the same manner as in Example 1-1 except that Compound F5 was used instead of Compound F1.

Example 1-18

An organic light emitting device was manufactured in the same manner as in Example 1-2 except that Compound F5 was used instead of Compound F1.

Example 1-19

An organic light emitting device was manufactured in the same manner as in Example 1-3 except that Compound F5 was used instead of Compound F1.

Example 1-20

An organic light emitting device was manufactured in the same manner as in Example 1-4 except that Compound F5 was used instead of Compound F1.

Example 1-21

An organic light emitting device was manufactured in the same manner as in Example 1-1 except that Compound E5 was used instead of Compound E1.

Example 1-22

An organic light emitting device was manufactured in the same manner as in Example 1-1 except that Compound E6 was used instead of Compound E1.

Example 1-23

An organic light emitting device was manufactured in the same manner as in Example 1-1 except that Compound E7 was used instead of Compound E1.

Example 1-24

An organic light emitting device was manufactured in the same manner as in Example 1-1 except that Compound E8 was used instead of Compound E1.

Example 1-25

An organic light emitting device was manufactured in the same manner as in Example 1-5 except that Compound E9 was used instead of Compound E1.

Example 1-26

An organic light emitting device was manufactured in the same manner as in Example 1-5 except that Compound E10 was used instead of Compound E1.

Example 1-27

An organic light emitting device was manufactured in the same manner as in Example 1-5 except that Compound E11 was used instead of Compound E1.

Example 1-28

An organic light emitting device was manufactured in the same manner as in Example 1-5 except that Compound E12 was used instead of Compound E1.

Example 1-29

An organic light emitting device was manufactured in the same manner as in Example 1-9 except that Compound E13 was used instead of Compound E1.

Example 1-30

An organic light emitting device was manufactured in the same manner as in Example 1-9 except that Compound E14 was used instead of Compound E1.

Example 1-31

An organic light emitting device was manufactured in the same manner as in Example 1-9 except that Compound Ely was used instead of Compound E1.

Example 1-32

An organic light emitting device was manufactured in the same manner as in Example 1-9 except that Compound E16 was used instead of Compound E1.

Example 1-33

An organic light emitting device was manufactured in the same manner as in Example 1-13 except that Compound E11 was used instead of Compound E1.

Example 1-34

An organic light emitting device was manufactured in the same manner as in Example 1-13 except that Compound E18 was used instead of Compound E1.

Example 1-35

An organic light emitting device was manufactured in the same manner as in Example 1-13 except that Compound E19 was used instead of Compound E1.

Example 1-36

An organic light emitting device was manufactured in the same manner as in Example 1-13 except that Compound E20 was used instead of Compound E1.

Example 1-37

An organic light emitting device was manufactured in the same manner as in Example 1-17 except that Compound E21 was used instead of Compound E1.

Example 1-38

An organic light emitting device was manufactured in the same manner as in Example 1-17 except that Compound E22 was used instead of Compound E1.

Example 1-39

An organic light emitting device was manufactured in the same manner as in Example 1-17 except that Compound E23 was used instead of Compound E1.

Comparative Example 1-1

An organic light emitting device was manufactured in the same manner as in Example 1-1 except that Compound ET-1-A was used instead of Compound E1.

Comparative Example 1-2

An organic light emitting device was manufactured in the same manner as in Example 1-1 except that Compound ET-1-B was used instead of Compound E1.

Comparative Example 1-3

An organic light emitting device was manufactured in the same manner as in Example 1-1 except that Compound ET-1-C was used instead of Compound E1.

Comparative Example 1-4

An organic light emitting device was manufactured in the same manner as in Example 1-5 except that Compound ET-1-D was used instead of Compound E1.

Comparative Example 1-5

An organic light emitting device was manufactured in the same manner as in Example 1-5 except that Compound ET-1-E was used instead of Compound E1.

Comparative Example 1-6

An organic light emitting device was manufactured in the same manner as in Example 1-9 except that Compound ET-1-F was used instead of Compound E1.

Comparative Example 1-7

An organic light emitting device was manufactured in the same manner as in Example 1-13 except that Compound ET-1-G was used instead of Compound E1.

Comparative Example 1-8

An organic light emitting device was manufactured in the same manner as in Example 1-13 except that Compound ET-1-H was used instead of Compound E1.

Comparative Example 1-9

An organic light emitting device was manufactured in the same manner as in Example 1-13 except that Compound ET-1-I was used instead of Compound E1.

Comparative Example 1-10

An organic light emitting device was manufactured in the same manner as in Example 1-17 except that Compound ET-1-J was used instead of Compound E1.

Comparative Example 1-11

An organic light emitting device was manufactured in the same manner as in Example 1-13 except that Compound ET-1-K was used instead of Compound E1.

Comparative Example 1-12

An organic light emitting device was manufactured in the same manner as in Example 1-1 except that Compound ET-1-L was used instead of Compound F1.

Comparative Example 1-13

An organic light emitting device was manufactured in the same manner as in Example 1-2 except that Compound ET-1-L was used instead of Compound F1.

Comparative Example 1-14

An organic light emitting device was manufactured in the same manner as in Example 1-3 except that Compound ET-1-L was used instead of Compound F1.

Comparative Example 1-15

An organic light emitting device was manufactured in the same manner as in Example 1-4 except that Compound ET-1-L was used instead of Compound F1.

Comparative Example 1-16

An organic light emitting device was manufactured in the same manner as in Example 1-1 except that the electron transfer layer was formed to a thickness of 360 Å by vacuum depositing Compound F1 and LiQ in a weight ratio of 1:1 without the electron control layer.

Comparative Example 1-17

An organic light emitting device was manufactured in the same manner as in Comparative Example 1-16 except that Compound F2 was used instead of Compound F1.

Comparative Example 1-18

An organic light emitting device was manufactured in the same manner as in Comparative Example 1-16 except that Compound F3 was used instead of Compound F1.

Comparative Example 1-19

An organic light emitting device was manufactured in the same manner as in Comparative Example 1-16 except that Compound F4 was used instead of Compound F1.

Comparative Example 1-20

An organic light emitting device was manufactured in the same manner as in Comparative Example 1-16 except that Compound F5 was used instead of Compound F1.

For the organic light emitting devices manufactured using the methods of Examples 1-1 to 1-39 and Comparative Examples 1-1 to 1-20 described above, a driving voltage and light emission efficiency were measured at current density of 10 mA/cm$^2$, and time taken for the luminance decreasing to 90% compared to its initial luminance ($T_{90}$) was measured at current density of 20 mA/cm$^2$. The results are shown in the following Table 1.

TABLE 1

| | Compound (Electron control layer) | Compound (Electron Transfer Layer) | Voltage (V@10 mA/cm$^2$) | Efficiency (cd/A@10 mA/cm$^2$) | Color Coordinate (x, y) | Lifetime (h) $T_{90}$ at 20 mA/Cm$^2$ |
|---|---|---|---|---|---|---|
| Example 1-1 | E1 | F1 | 3.8 | 5.8 | (0.142, 0.097) | 300 |
| Example 1-2 | E2 | F1 | 3.75 | 5.82 | (0.142, 0.096) | 295 |
| Example 1-3 | E3 | F1 | 3.70 | 5.90 | (0.142, 0.096) | 280 |
| Example 1-4 | E4 | F1 | 3.91 | 5.66 | (0.142, 0.096) | 275 |
| Example 1-5 | E1 | F2 | 3.76 | 5.83 | (0.142, 0.096) | 299 |
| Example 1-6 | E2 | F2 | 3.74 | 5.84 | (0.142, 0.097) | 290 |
| Example 1-7 | E3 | F2 | 3.69 | 5.92 | (0.142, 0.096) | 277 |
| Example 1-8 | E4 | F2 | 3.90 | 5.68 | (0.142, 0.099) | 269 |
| Example 1-9 | E1 | F3 | 3.76 | 5.80 | (0.142, 0.096) | 323 |
| Example 1-10 | E2 | F3 | 3.76 | 5.80 | (0.142, 0.098) | 314 |
| Example 1-11 | E3 | F3 | 3.75 | 5.91 | (0.142, 0.097) | 299 |
| Example 1-12 | E4 | F3 | 3.90 | 5.69 | (0.142, 0.096) | 277 |
| Example 1-13 | E1 | F4 | 3.75 | 5.81 | (0.142, 0.097) | 300 |
| Example 1-14 | E2 | F4 | 3.7 | 5.82 | (0.142, 0.097) | 291 |
| Example 1-15 | E3 | F4 | 3.76 | 5.89 | (0.142, 0.097) | 282 |
| Example 1-16 | E4 | F4 | 3.89 | 5.68 | (0.142, 0.097) | 268 |
| Example 1-17 | E1 | F5 | 3.75 | 5.82 | (0.142, 0.097) | 319 |
| Example 1-18 | E2 | F5 | 3.72 | 5.84 | (0.142, 0.096) | 311 |
| Example 1-19 | E3 | F5 | 3.75 | 5.90 | (0.142, 0.096) | 302 |
| Example 1-20 | E4 | F5 | 3.91 | 5.65 | (0.142, 0.096) | 278 |
| Example 1-21 | E5 | F1 | 3.80 | 5.75 | (0.142, 0.096) | 330 |
| Example 1-22 | E6 | F1 | 3.82 | 5.77 | (0.142, 0.098) | 312 |
| Example 1-23 | E7 | F1 | 3.92 | 5.62 | (0.142, 0.102) | 270 |
| Example 1-24 | E8 | F1 | 3.75 | 3.86 | (0.142, 0.096) | 320 |
| Example 1-25 | E9 | F2 | 3.89 | 5.63 | (0.142, 0.096) | 260 |
| Example 1-26 | E10 | F2 | 3.85 | 5.74 | (0.142, 0.096) | 327 |
| Example 1-27 | E11 | F2 | 3.76 | 3.75 | (0.142, 0.096) | 308 |
| Example 1-28 | E12 | F2 | 3.74 | 5.74 | (0.142, 0.096) | 319 |
| Example 1-29 | E13 | F3 | 3.77 | 5.88 | (0.142, 0.096) | 311 |
| Example 1-30 | E14 | F3 | 3.80 | 5.70 | (0.142, 0.096) | 340 |
| Example 1-31 | E15 | F3 | 3.75 | 5.83 | (0.142, 0.096) | 326 |
| Example 1-32 | E16 | F3 | 3.79 | 5.76 | (0.142, 0.097) | 331 |
| Example 1-33 | E17 | F4 | 3.82 | 5.62 | (0.142, 0.096) | 265 |
| Example 1-34 | E18 | F4 | 3.81 | 5.63 | (0.142, 0.096) | 266 |
| Example 1-35 | E19 | F4 | 3.76 | 5.78 | (0.142, 0.096) | 300 |
| Example 1-36 | E20 | F4 | 3.83 | 5.60 | (0.142, 0.096) | 261 |
| Example 1-37 | E21 | F5 | 3.84 | 5.66 | (0.142, 0.097) | 277 |
| Example 1-38 | E22 | F5 | 3.69 | 5.92 | (0.142, 0.096) | 299 |
| Example 1-39 | E23 | F5 | 3.71 | 5.80 | (0.142, 0.097) | 307 |
| Comparative Example 1-1 | ET-1-A | F1 | 4.81 | 3.78 | (0.142, 0.096) | 75 |
| Comparative Example 1-2 | ET-1-B | F1 | 4.88 | 3.99 | (0.142, 0.098) | 79 |
| Comparative Example 1-3 | ET-1-C | F1 | 4.99 | 3.80 | (0.142, 0.097) | 83 |
| Comparative Example 1-4 | ET-1-D | F2 | 4.75 | 4.00 | (0.142, 0.096) | 55 |
| Comparative Example 1-5 | ET-1-E | F2 | 5.02 | 3.50 | (0.142, 0.097) | 65 |
| Comparative Example 1-6 | ET-1-F | F3 | 4.70 | 4.22 | (0.142, 0.097) | 41 |
| Comparative Example 1-7 | ET-1-G | F4 | 5.44 | 3.00 | (0.142, 0.097) | 60 |
| Comparative Example 1-8 | ET-1-H | F4 | 5.48 | 3.01 | (0.142, 0.097) | 52 |
| Comparative Example 1-9 | ET-1-I | F4 | 5.58 | 3.02 | (0.142, 0.097) | 50 |
| Comparative Example 1-10 | ET-1-J | F5 | 5.50 | 3.89 | (0.142, 0.096) | 70 |
| Comparative Example 1-11 | ET-1-K | F4 | 5.01 | 4.10 | (0.142, 0.096) | 88 |

TABLE 1-continued

| | Compound (Electron control layer) | Compound (Electron Transfer Layer) | Voltage (V@10 mA/cm$^2$) | Efficiency (cd/A@10 mA/cm$^2$) | Color Coordinate (x, y) | Lifetime (h) $T_{90}$ at 20 mA/Cm$^2$ |
|---|---|---|---|---|---|---|
| Comparative Example 1-12 | E1 | ET-1-L | 4.00 | 4.94 | (0.142, 0.096) | 77 |
| Comparative Example 1-13 | E2 | ET-1-L | 4.01 | 4.87 | (0.142, 0.096) | 68 |
| Comparative Example 1-14 | E3 | ET-1-L | 4.21 | 4.61 | (0.142, 0.096) | 89 |
| Comparative Example 1-15 | E4 | ET-1-L | 4.55 | 4.00 | (0.142, 0.096) | 57 |
| Comparative Example 1-16 | — | F1 | 4.00 | 4.01 | (0.142, 0.096) | 200 |
| Comparative Example 1-17 | — | F2 | 4.03 | 4.00 | (0.142, 0.096) | 204 |
| Comparative Example 1-18 | — | F3 | 4.00 | 4.10 | (0.142, 0.096) | 224 |
| Comparative Example 1-19 | — | F4 | 4.01 | 4.22 | (0.142, 0.096) | 180 |
| Comparative Example 1-20 | — | F5 | 4.01 | 4.15 | (0.142, 0.096) | 217 |

Based on the results of Table 1, it was identified that, when comparing Examples 1-1 to 1-39 with Comparative Examples 1-1, 1-2, 1-3, 1-5, 1-7, 1-8 and 1-9, the compound in which only one heteroaryl group substitutes in the Spiro fluorene xanthene skeleton as in Chemical Formula 1 had excellent properties in terms of driving voltage, efficiency and lifetime in an organic light emitting device compared to the compound having two or more substituents in the Spiro fluorene xanthene skeleton.

When referring to FIG. 10 and FIG. 11 presenting 3D structures of Compounds E9 and E18 according to one embodiment of the present specification, it was identified that the molecules of the compounds had a horizontal structure, and when referring to FIG. 12 and FIG. 13 presenting 3D structures of Compounds ET-1-E and ET-1-I, it was identified that the A axis and the B axis were almost perpendicular to each other in each compound, and the molecule was very out of a horizontal structure.

As a result, when comparing FIG. 10 and FIG. 11 presenting 3D structures of Compounds E9 and E18 according to one embodiment of the present specification and FIG. 12 and FIG. 13 presenting 3D structures of Compounds ET-1-E and ET-1-I, it was seen that the heterocyclic compound represented by Chemical Formula 1 according to one embodiment of the present specification had a more horizontal structure due to a difference in orientation in the molecular 3D structure. Accordingly, the compound in which only one heteroaryl group substitutes in the spiro fluorene xanthene skeleton as in Chemical Formula 1 of Examples 1-1 to 1-39 had a strong tendency toward a horizontal structure of the molecule compared to the compound having two or more substituents in the spiro fluorene xanthene skeleton resulting in an increase in the electron mobility, and effects of low driving voltage, high efficiency and long lifetime are obtained in an organic light emitting device.

In addition, when comparing Examples 1-1 to 1-39 with Comparative Examples 1-4 and 1-6, it was identified that the structure of Chemical Formula 1 including spiro fluorene xanthene exhibited excellent properties in an organic light emitting device compared to the structure including a spiro fluorene group.

In addition, when comparing Example 1-32 with Comparative Example 1-11, it was identified that, depending on the bonding position of quinoline in spiro fluorene xanthene of the structure of Chemical Formula 1 including the spiro fluorene xanthene, the structure of Chemical Formula 1 in which a benzene ring that does not include N bonds to the spiro fluorene xanthene exhibited more superior properties in the organic light emitting device compared to the compound in which a benzene ring that includes N bonds to spiro fluorene xanthene.

The heterocyclic compound represented by Chemical Formula 1 according to one embodiment of the present specification is capable of having excellent properties by having excellent thermal stability, a deep HOMO level of 6.0 eV or higher, high triplet energy (ET) and hole stability.

In addition, in Examples 1-1 to 1-3, 1-5 to 1-7, 1-9 to 1-11, 1-13 to 1-15, 1-17 to 1-19, 1-21, 1-22, 1-24, 1-26 to 1-31, 1-38 and 1-39, that is, when Ar1 is a triazine group or a pyrimidine group in Chemical Formula 1, the HOMO energy was deep of 6.1 eV or greater, and particularly, a role as the electron control layer was smoothly performed, and excellent properties were obtained in terms of driving voltage, efficiency and lifetime when used in the organic light emitting device due to high electron mobility. Specifically, it was identified that, Examples 1-1 to 1-3, 1-5 to 1-7, 1-9 to 1-11, 1-13 to 1-15, 1-17 to 1-19, 1-21, 1-22, 1-24, 1-26 to 1-31, 1-38 and 1-39 exhibited significantly superior properties in terms of driving voltage, efficiency and lifetime compared to Example 1-21 in which Ar1 is a pyridine group (one N).

Particularly, when comparing Examples 1-1 to 1-39 with Comparative Examples 1-16 to 1-20, it was identified that excellent properties were obtained in the organic light emitting device when using the compound group formed with Chemical Formula 1 as the electron control layer (hole blocking layer) and using the compound formed with Chemical Formula 3 as the electron transfer layer, compared to when using the compound formed with Chemical Formula 3 alone as the electron transfer layer.

Accordingly, the heterocyclic compound represented by Chemical Formula 1 and/or Chemical Formula 3 according to one embodiment of the present specification has low driving voltage and high efficiency, and is capable of enhancing device stability by hole stability of the compound.

Example 2

HOMO energy and LUMO energy values of the following Compound E1 and Compound E2 corresponding to the compound represented by Chemical Formula 1 according to one embodiment of the present specification, Compound F3 corresponding to the compound represented by Chemical Formula 3, and Compounds ET-1-J and ET-1-L of comparative example are shown in the following Table 2.

[E1]

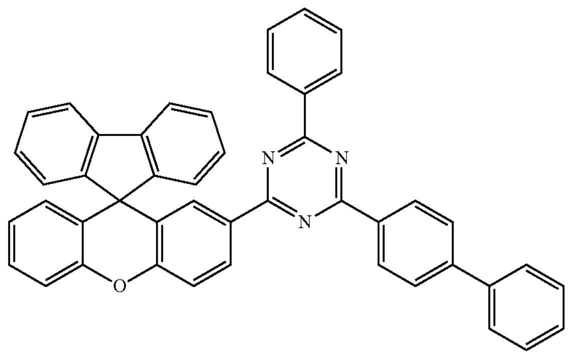

[E2]

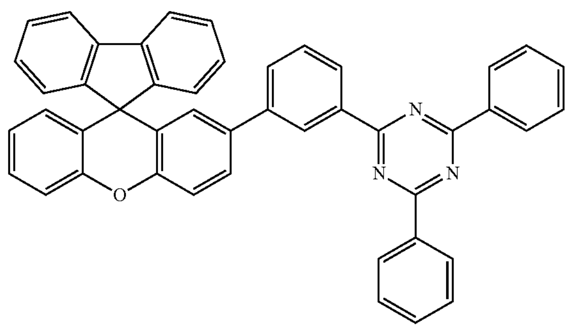

[ET-1-J]

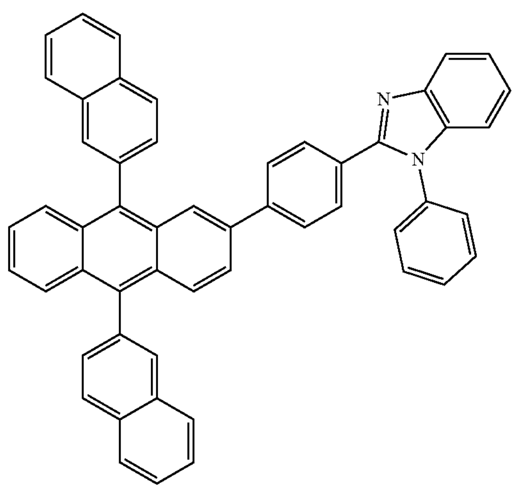

[F3]

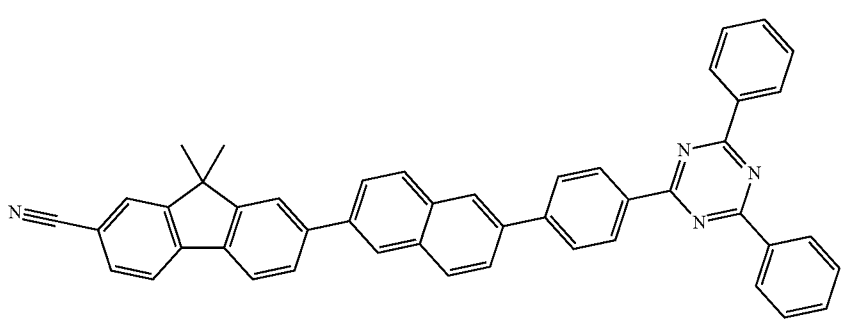

-continued

[ET-1-L]

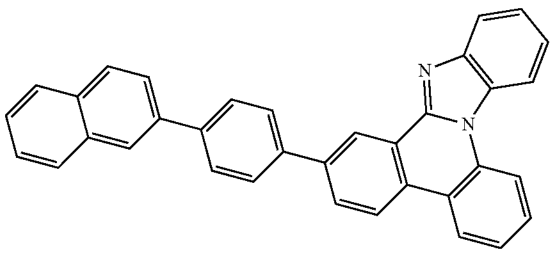

In the Examples of the present specification, the HOMO level was measured using an optoelectronic spectrometer (manufactured by RIKEN KEIKI Co., Ltd.: AC3) under the atmosphere.

In the Examples of the present specification, the LUMO energy level was calculated as a wavelength value measured through photoluminescence (PL).

TABLE 2

| Compound | HOMO (eV) | LUMO (eV) |
|---|---|---|
| E1 | 6.20 | 2.70 |
| E2 | 6.16 | 2.92 |
| ET-1-J | 5.70 | 2.87 |
| F3 | 6.10 | 3.16 |
| ET-1-L | 5.78 | 2.89 |

The graph presenting the HOMO energy and the LUMO energy values measured in Example 2 are shown in FIG. 18.

Compounds E1 and E2 had a deep HOMO energy level of 6.0 eV or greater, and specifically, the HOMO energy level was deep of 6.1 eV or greater. It was identified that Compounds E1 and E2 also had a bandgap of 3.0 eV or greater. Accordingly, it was seen that, when using the compound of Chemical Formula 1 in the electron control layer (hole block layer) in the organic light emitting device, excellent properties were obtained in terms of driving voltage, efficiency and lifetime due to high electron mobility.

Hereinbefore, preferred embodiments of the present disclosure have been described, however, the present disclosure is not limited thereto, and various modifications can be made within the scope of the claims and detailed descriptions of the disclosure, and these also fall within the category of the disclosure.

REFERENCE NUMERAL

10, 11, 12: Organic Light Emitting Device
20: Substrate
30: Anode
40: Light Emitting Layer
50: Cathode
60: Hole Injection Layer
70: Hole Transfer Layer
80: Electron Transfer Layer
90: Electron Injection Layer
100: Electron control layer

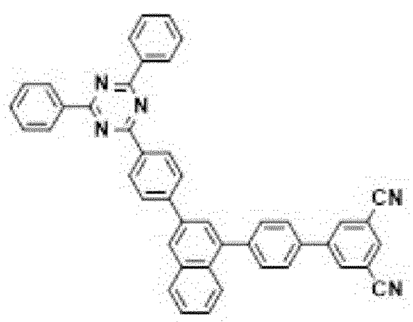

The invention claimed is:

1. An organic light emitting device, comprising:

an anode;

a cathode; and a light emitting layer provided between the anode and the cathode, the device further comprising:

an electron control layer provided between the light emitting layer and the cathode and including a compound of the following Chemical Formula 1; and an electron transfer layer provided between the electron control layer and the cathode and including a compound of the following Chemical Formula 3:

[Chemical Formula 1]

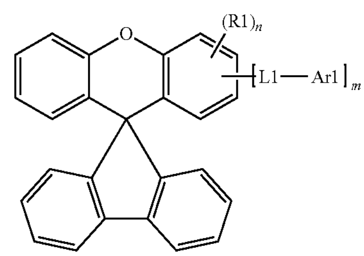

wherein in Chemical Formula 1;

R1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted aryl sulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

L1 is a direct bond, a substituted or unsubstituted arylene group, or a substituted or unsubstituted heteroarylene group;

Ar1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, a substituted or unsubstituted monocyclic heterocyclic group, a substituted or unsubstituted tricyclic or higher heterocyclic group, a substituted or unsubstituted dicyclic heterocyclic group including two or more Ns, a substituted or unsubstituted isoquinolyl group, or a structure of the following Chemical Formula 2;

m is an integer of 1 to 4, n is an integer of 0 to 3, and $1 \leq n+m \leq 4$; and when m and n are each an integer of 2 or greater, structures in the two or more parentheses are the same as or different from each other,

[Chemical Formula 2]

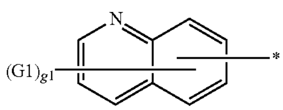

wherein in Chemical Formula 2;

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, G1s are the same as or different from each other; and

* is a site bonding to L1 of Chemical Formula 1,

[Chemical Formula 3]

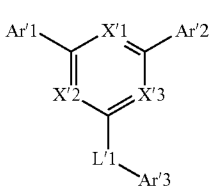

wherein in Chemical Formula 3:

Ar'1 and Ar'2 are the same as or different from each other, and each independently is a substituted or unsubstituted aryl group or a substituted or unsubstituted heteroaryl group;

X'1 is N or CR'1, X'2 is N or CR'2, and X'3 is N or CR'3;

at least two of X'1 to X'3 are N;

L'1 is a direct bond, a substituted or unsubstituted arylene group, or a substituted or unsubstituted heteroarylene group;

R'1 to R'3 are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group; and Ar'3 is one of the following Chemical Formula 4a, 4b or 4c:

[Chemical Formula 4a]

[Chemical Formula 4b]

[Chemical Formula 4c]

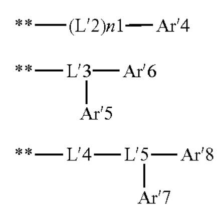

wherein in in Chemical Formulae 4a to 4c:

** is a site bonding to L'1 of Chemical Formula 3;

n1 is an integer of 1 to 3;

L'2 and L'4 are the same as or different from each other, and each independently is a direct bond, a substituted or unsubstituted alkylene group, a substituted or unsubstituted arylene group, or a substituted or unsubstituted heteroarylene group;

L'3 and L'5 are the same as or different from each other, and each independently is a substituted or unsubstituted trivalent aryl group or a substituted or unsubstituted trivalent heteroaryl group;

Ar'4 to Ar'8 are the same as or different from each other, and each independently is a nitrile group, an aryl group unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group, or a substituted or unsubstituted heteroaryl group.

2. The organic light emitting device of claim 1, wherein the electron transfer layer further includes a compound of Chemical Formula 5:

[Chemical Formula 5]

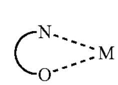

wherein in Chemical Formula 5:

M is an alkali metal or an alkaline-earth metal;

a curve connecting N and O represents bonds or atoms required to form a substituted or unsubstituted ring including N or O; and a dotted line means N and O forming a metal complex with M.

3. The organic light emitting device of claim 1, wherein Ar1 is a nitrile group, a substituted or unsubstituted alkoxy group, a substituted or unsubstituted phosphine oxide group, a substituted or unsubstituted silyl group, a substituted or unsubstituted aryl group, a substituted or unsubstituted monocyclic heterocyclic group, a substituted or unsubstituted tricyclic or higher heterocyclic group, a substituted or unsubstituted dicyclic heterocyclic group including two or more Ns, a substituted or unsubstituted isoquinolyl group, or a compound of Chemical Formula 2:

[Chemical Formula 2]

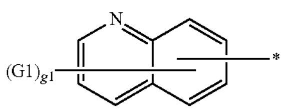

wherein in Chemical Formula 2:

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, G1s are the same as or different from each other; and

* is a site bonding to L1 of Chemical Formula 1.

4. The organic light emitting device of claim 1, wherein Ar1 is any one of the following Chemical Formulae 2 and 6 to 15:

[Chemical Formula 2]

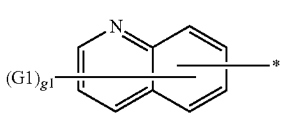

wherein Chemical Formula 2:

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, G1s are the same as or different from each other; and

* is a site bonding to L1 of Chemical Formula 1;

[Chemical Formula 6]

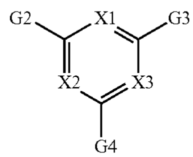

[Chemical Formula 7]

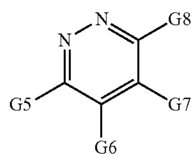

[Chemical Formula 8]

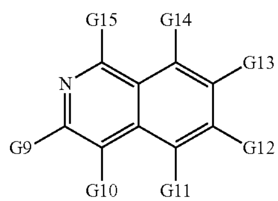

[Chemical Formula 9]

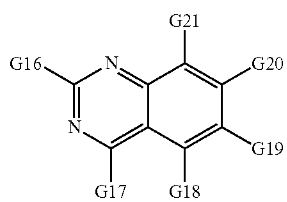

[Chemical Formula 10]

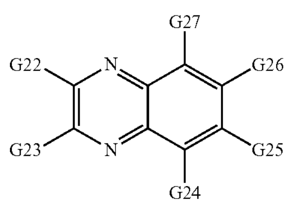

[Chemical Formula 11]

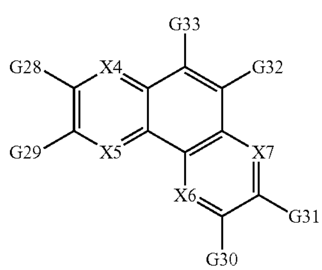

-continued

[Chemical Formula 12]

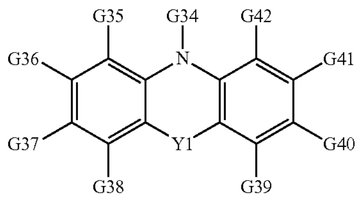

[Chemical Formula 13]

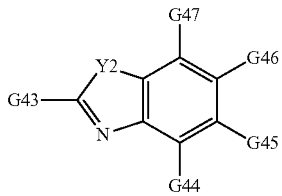

[Chemical Formula 14]

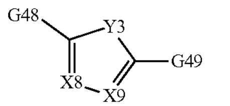

[Chemical Formula 15]

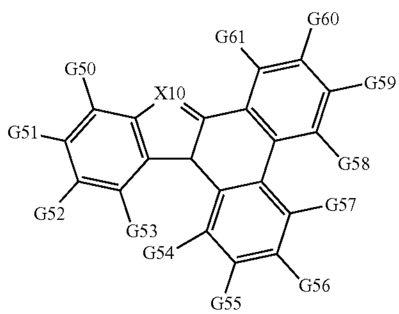

wherein in Chemical Formulae 6 to 15:

X1 is N or CR11; X2 is N or CR12; X3 is N or CR13; X4 is N or CR14; X5 is N or CR15; X6 is N or CR16; X7 is N or CR17; X8 is N or CR18; X9 is N or CR19; and X10 is N or CR20;

at least two of X1 to X3 are N, and at least one of X4 to X7 is N;

Y1 is O, S, NQ1, or CQ2Q3; Y2 is O, S, NQ4, or CQ5Q6; and Y3 is O, S, or NQ7;

any one of G2 to G4 and R11 to R13, any one of G5 to G8, any one of G9 to G15, any one of G16 to G21, any one of G22 to G27, any one of G28 to G33 and R14 to R17, any one of G34 to G42, any one of G43 to G47, any one of G48, G49, R18 and R19, and any one of G50 to G61 are a site bonding to L1 of Chemical Formula 1; and the rest of G2 to G61 and R11 to R19 other than the site bonding to L1 of Chemical Formula 1, R20 and Q1 to Q7 are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

5. The organic light emitting device of claim 1, wherein Chemical Formula 1 is any one of the following Chemical Formulae 1-1 to 1-4:

[Chemical Formula 1-1]

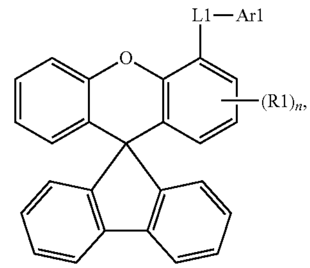

[Chemical Formula 1-2]

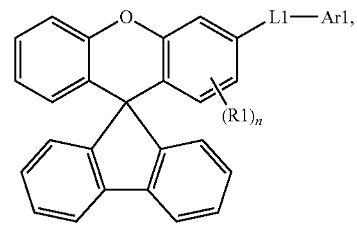

[Chemical Formula 1-3]

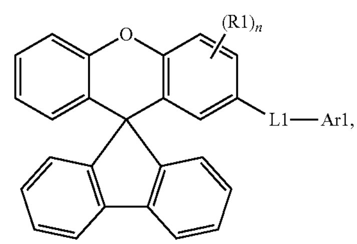

[Chemical Formula 1-4]

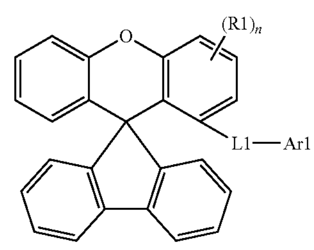

wherein in Chemical Formulae 1-1 to 1-4:

L1 is a direct bond, a substituted or unsubstituted arylene group, or a substituted or unsubstituted heteroarylene group;

R1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Ar1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, a substituted or unsubstituted monocyclic heterocyclic group, a substituted or unsubstituted tricyclic or higher heterocyclic group, a substituted or unsubstituted dicyclic heterocyclic group including two or more Ns, a substituted or unsubstituted isoquinolyl group, or a structure of Chemical Formula 2:

[Chemical Formula 2]

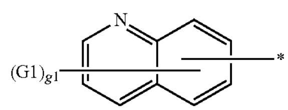

wherein in Chemical Formula 2:

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, G1s are the same as or different from each other; and

* is a site bonding to L1 of Chemical Formula 1; and n is an integer of 0 to 3, and when n is an integer of 2 or greater, structures in the parentheses are the same as or different from each other.

6. The organic light emitting device of claim 1, wherein L1 is a direct bond, a substituted or unsubstituted phenylene group, a substituted or unsubstituted biphenylene group, a substituted or unsubstituted naphthylene group, a substituted or unsubstituted terphenylene group, a substituted or unsubstituted quaterphenylene group, a substituted or unsubstituted anthracenylene group, a substituted or unsubstituted phenanthrenylene group, a substituted or unsubstituted triphenylenylene group, a substituted or unsubstituted pyrenylene group, a substituted or unsubstituted fluorenylene group, a substituted or unsubstituted spiro cyclopentane fluorenylene group, a substituted or unsubstituted dibenzofuranylene group, a substituted or unsubstituted divalent dibenzothiophene group, a substituted or unsubstituted carbazolene group, a substituted or unsubstituted pyridylene group, a substituted or unsubstituted divalent furan group, or a substituted or unsubstituted divalent thiophene group.

7. The organic light emitting device of claim 1, wherein:

L'1 is a direct bond, a substituted or unsubstituted phenylene group, a substituted or unsubstituted biphenylene group, a substituted or unsubstituted terphenylene group, a substituted or unsubstituted naphthylene group, or a substituted or unsubstituted fluorenylene group;

L'2 and L'4 are the same as or different from each other, and each independently is a direct bond, a substituted or unsubstituted methylene group, a substituted or unsubstituted ethylene group, a substituted or unsubstituted propylene group, a substituted or unsubstituted phenylene group, a substituted or unsubstituted biphenylene group, a substituted or unsubstituted terphenylene group, a substituted or unsubstituted naphthylene group, or a substituted or unsubstituted fluorenylene group; and L'3 and L'5 are the same as or different from each other, and each independently is a substituted or unsubstituted trivalent phenyl group, a substituted or unsubstituted trivalent biphenyl group, a substituted or unsubstituted trivalent terphenyl group, a substituted or unsubstituted trivalent naphthyl group, or a substituted or unsubstituted trivalent fluorenyl group.

8. The organic light emitting device of claim 1, wherein Ar'1 and Ar'2 are the same as or different from each other, and each independently is a substituted or unsubstituted phenyl group, a substituted or unsubstituted biphenyl group, a substituted or unsubstituted naphthyl group, or a substituted or unsubstituted fluorenyl group.

9. The organic light emitting device of claim 1, wherein Ar'4 to Ar'8 are the same as or different from each other, and each independently is a nitrile group, an aryl group unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group, a triazine group unsubstituted or substituted with a substituted or unsubstituted aryl group, or any one selected from among the following Chemical Formulae 16 to 18:

[Chemical Formula 16]

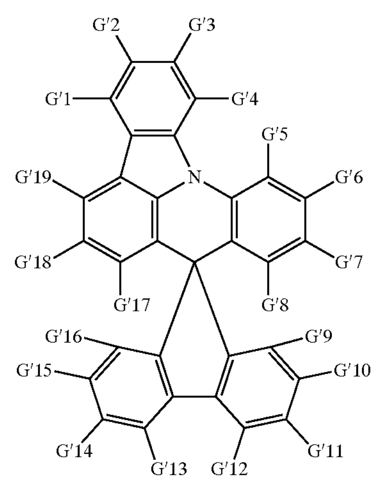

-continued

[Chemical Formula 17]

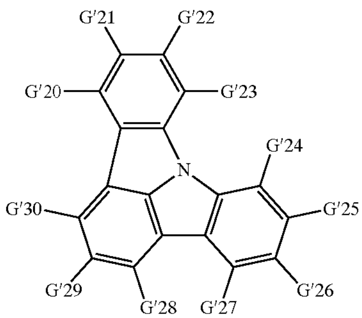

[Chemical Formula 18]

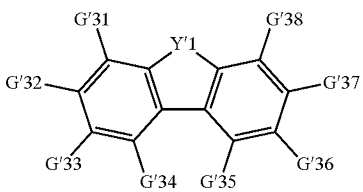

wherein in Chemical Formulae 16 to 18:

Y'1 is O, S, or NR'4;

any one of G'1 to G'19, any one of G'20 to G'30, and any one of G'31 to G'38 and R'4 is a site bonding to L'2 of Chemical Formula 4a, L'3 of Chemical Formula 4b or L'5 of Chemical Formula 4c; and the rest of G'1 to G'38 and R'4 other than the site bonding to L'2 of Chemical Formula 4a, L'3 of Chemical Formula 4b or L'5 of Chemical Formula 4c are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

10. The organic light emitting device of claim 2, wherein Chemical Formula 5 is Chemical Formula 5-1:

[Chemical Formula 5-1]

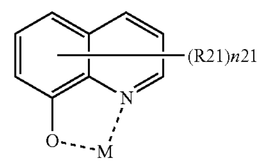

wherein in Chemical Formula 5-1:

R21 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

n21 is an integer of 1 to 6, and when n21 is an integer of 2 or greater, substituents in the parentheses are the same as or different from each other; and M is an alkali metal or an alkaline-earth metal.

11. The organic light emitting device of claim 1, wherein Chemical Formula 1 is any one compound selected from among the following compounds:

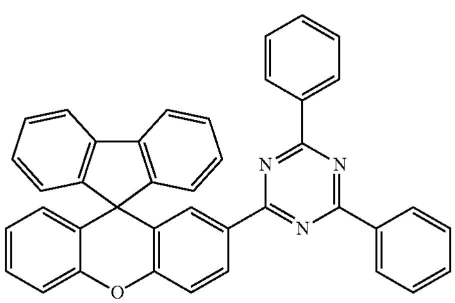

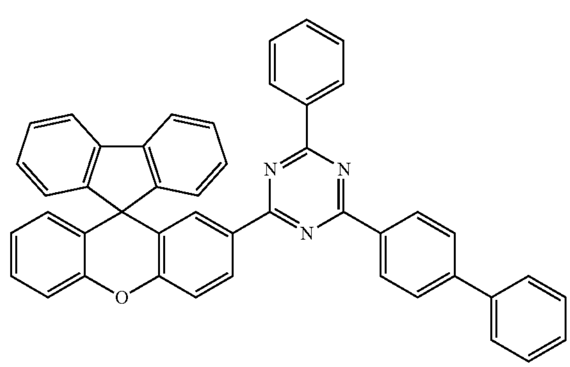

-continued
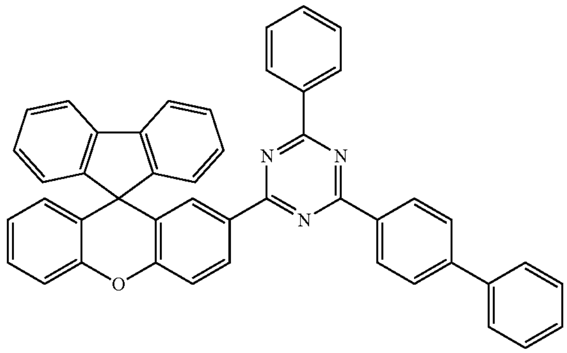
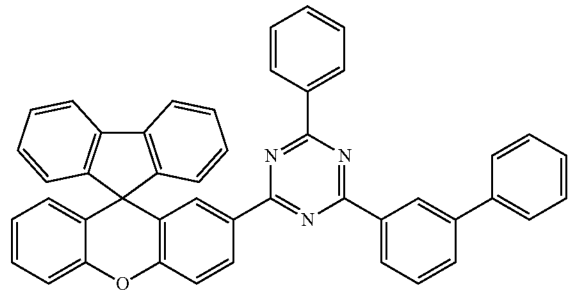
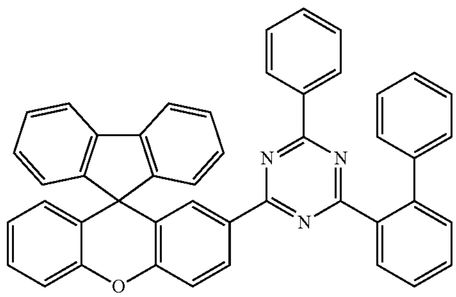
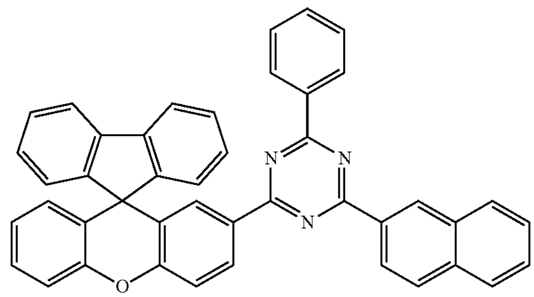
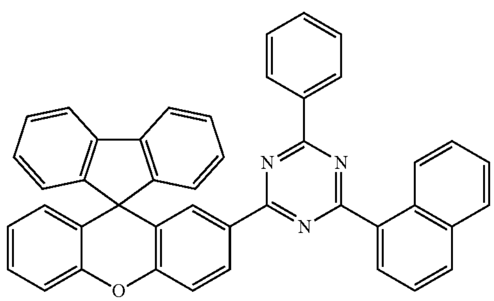
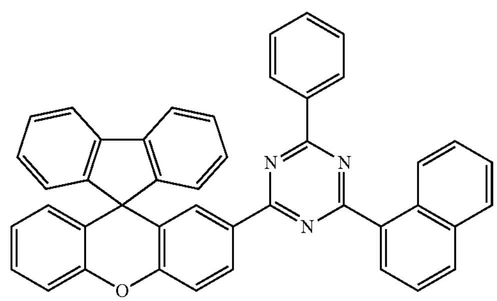
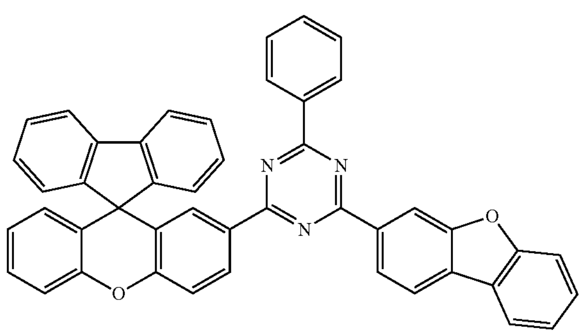
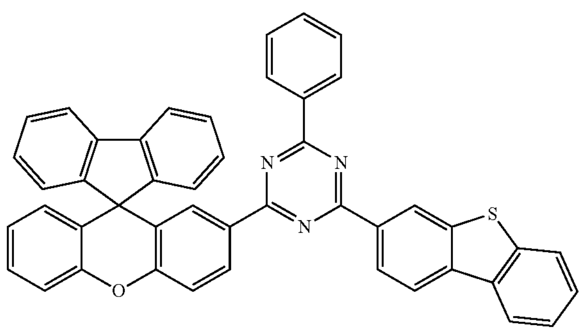
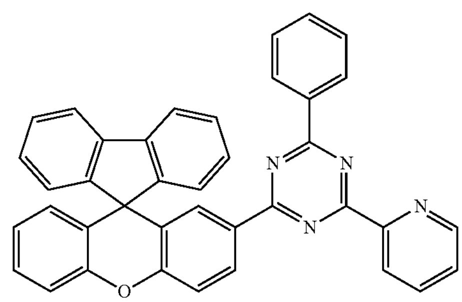

-continued
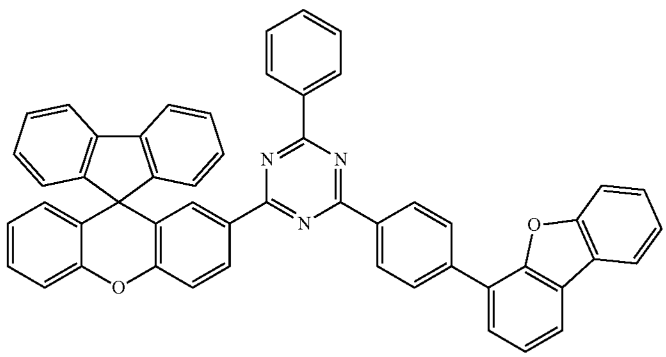
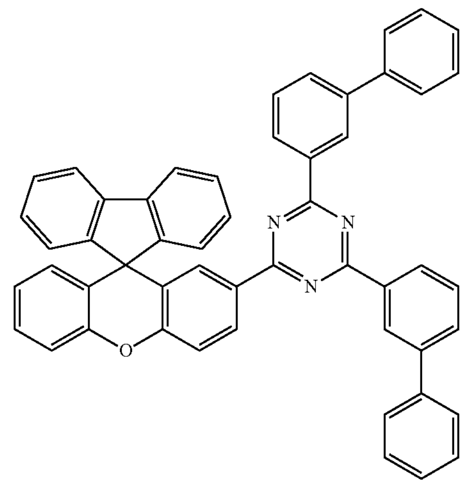
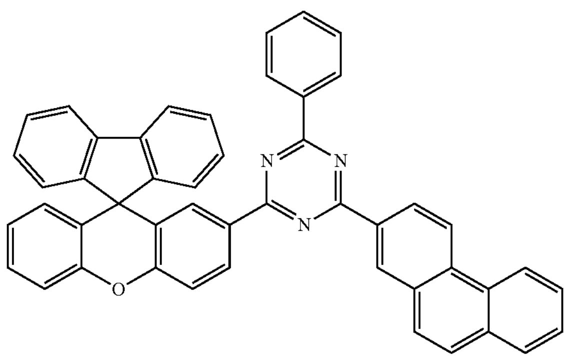
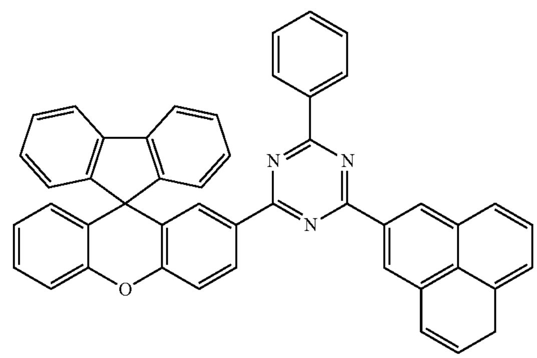
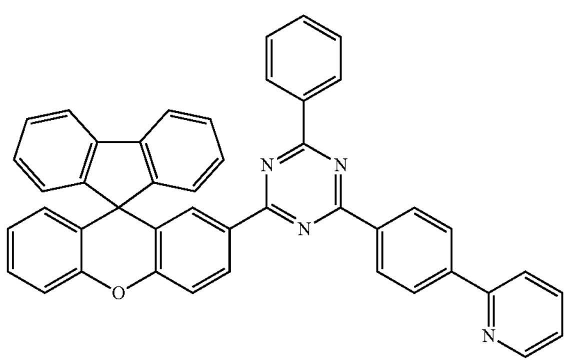
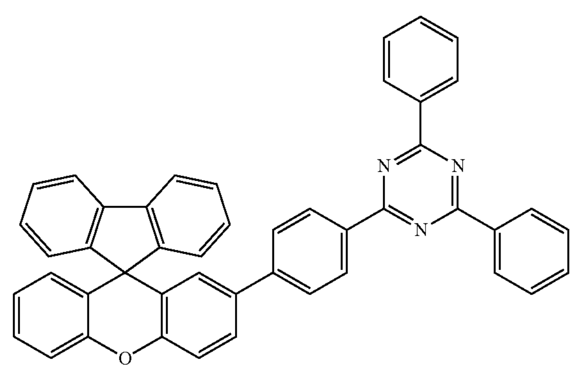
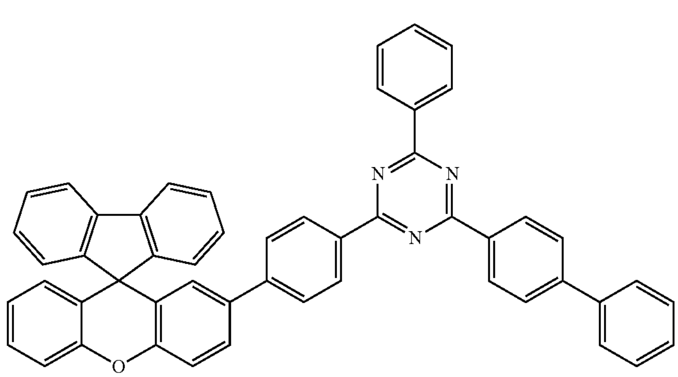

-continued
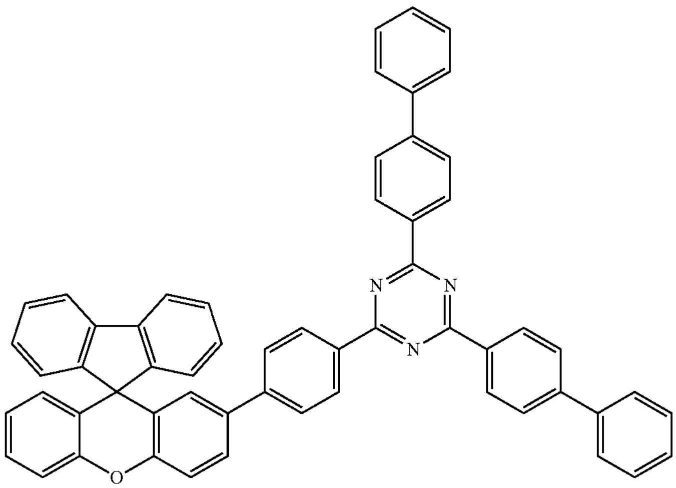
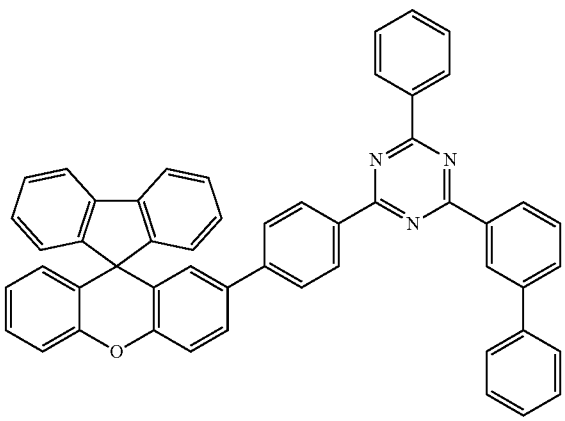
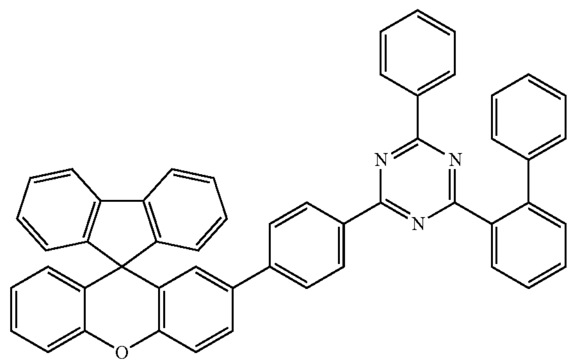
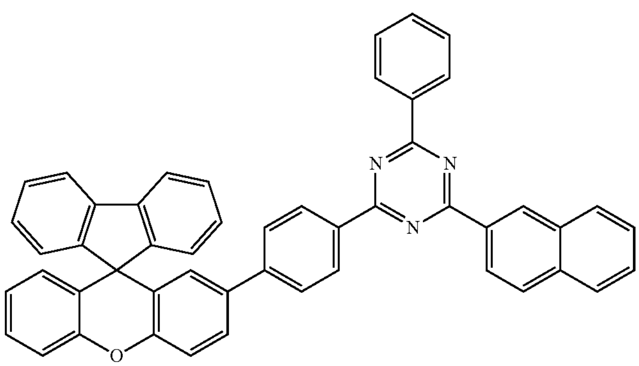
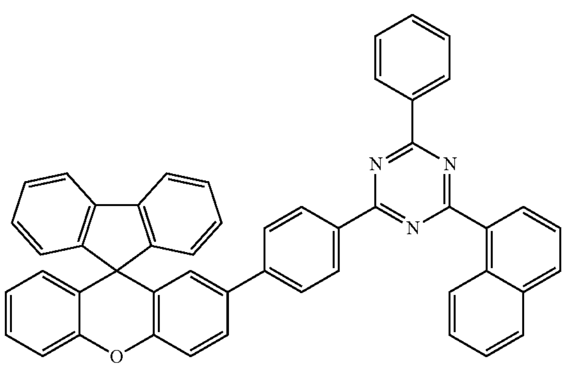

-continued
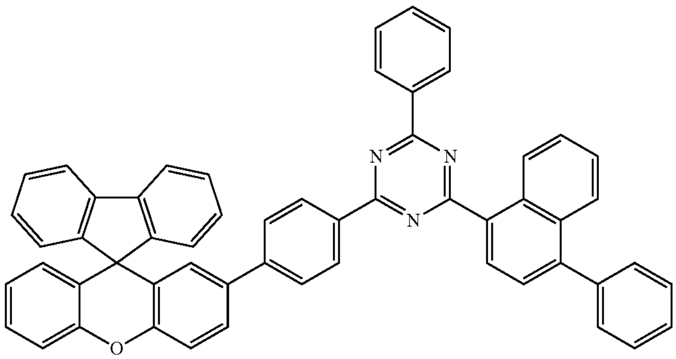
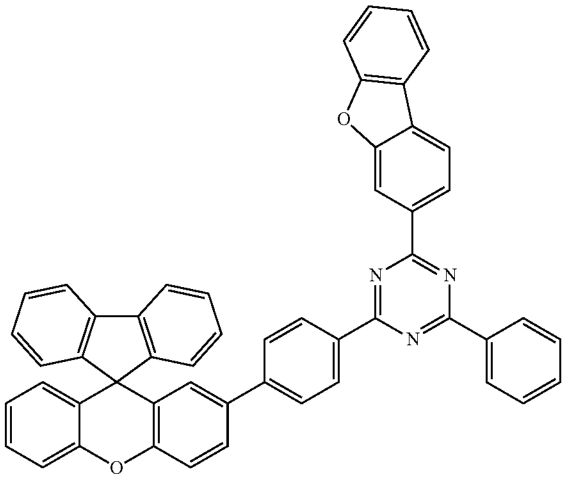
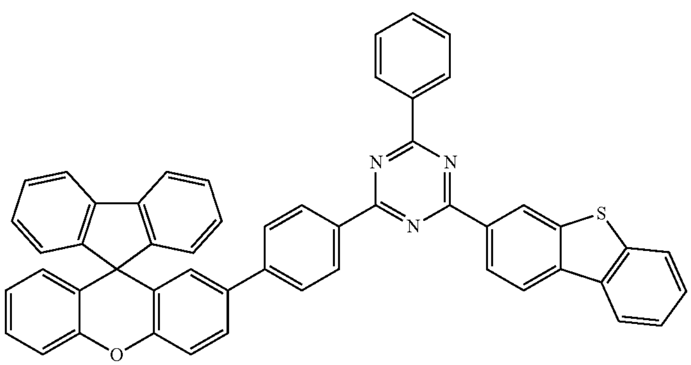
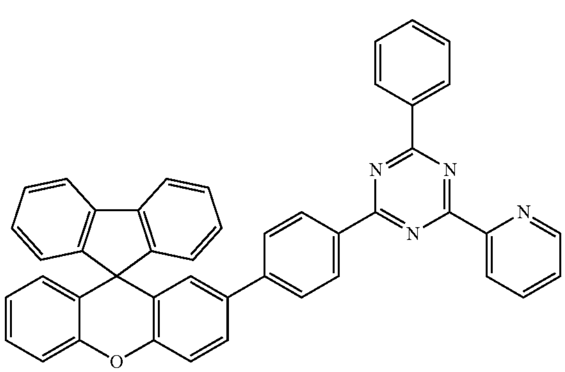

-continued
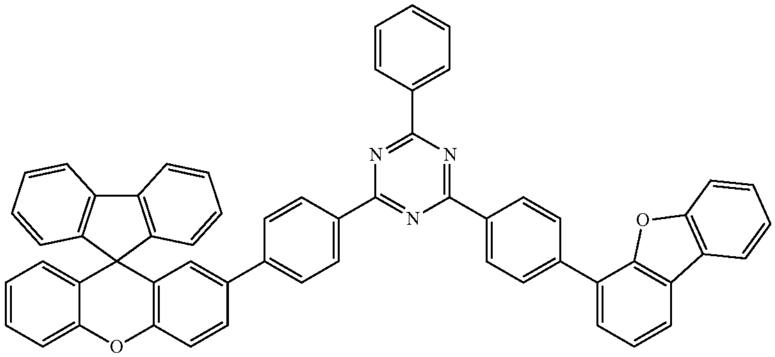
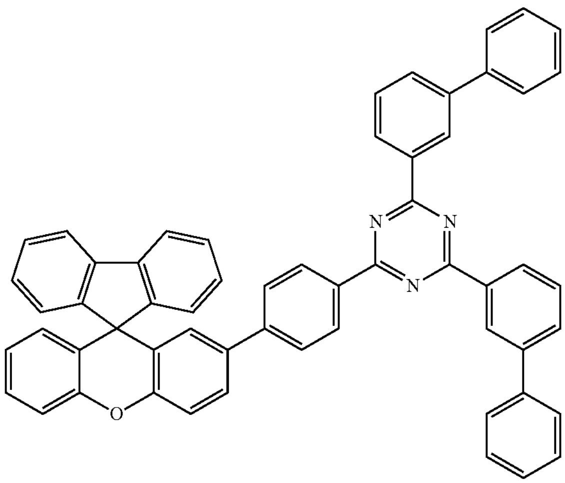
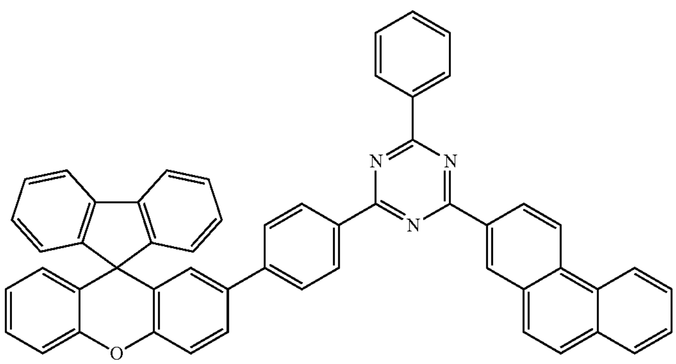
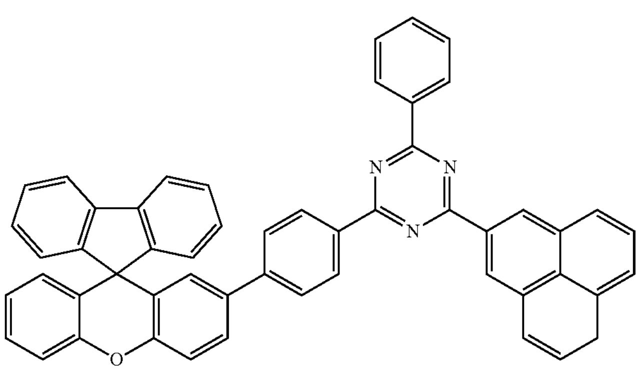

-continued
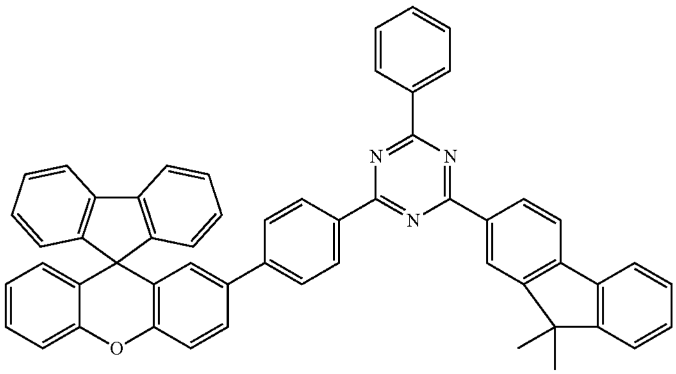
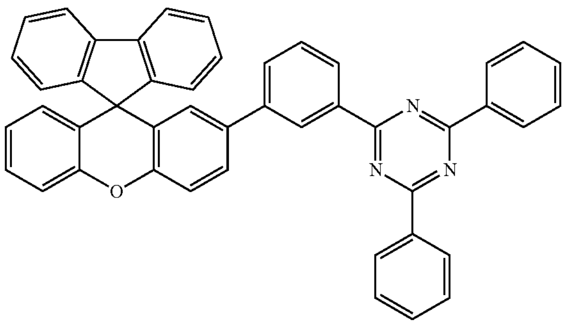
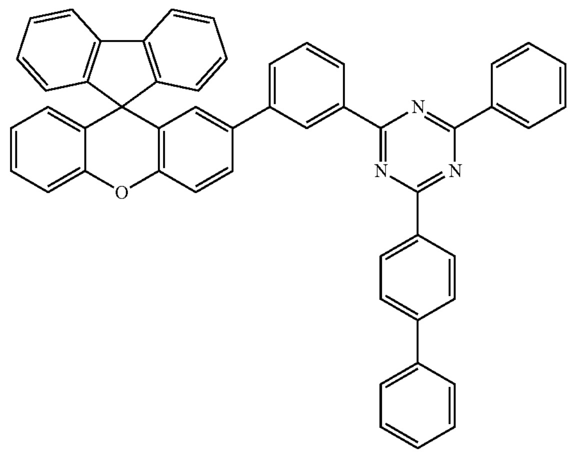
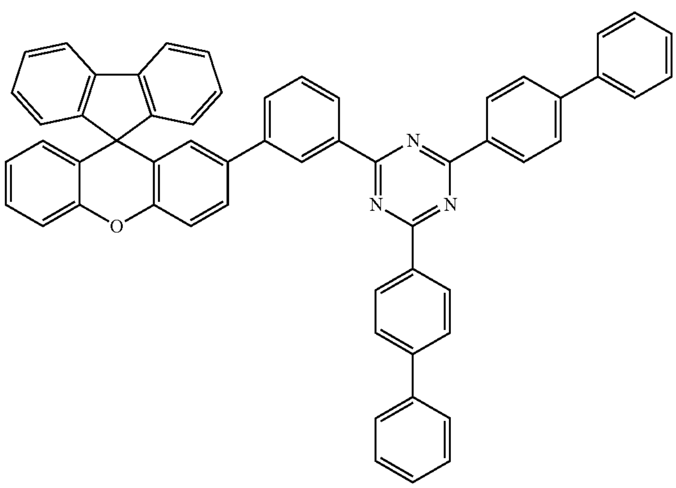
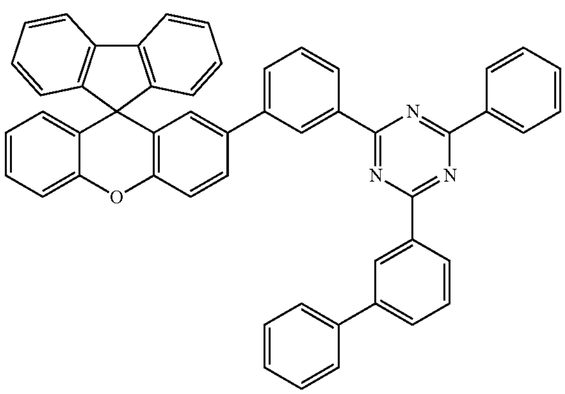
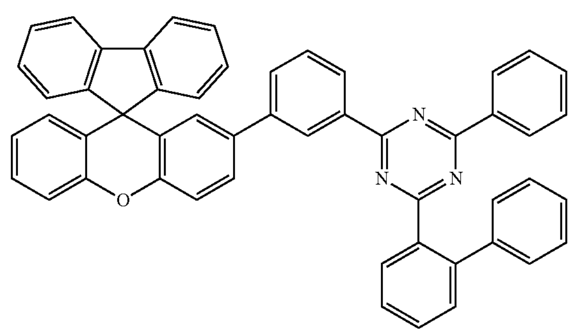

-continued
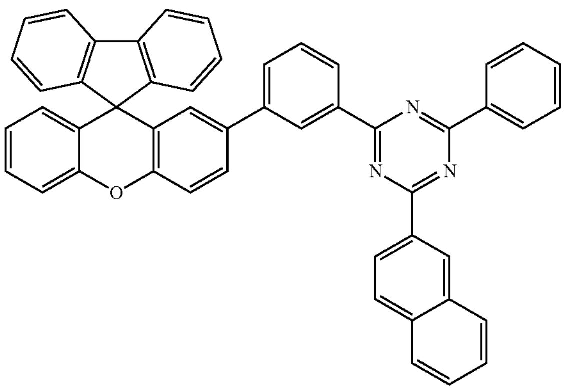
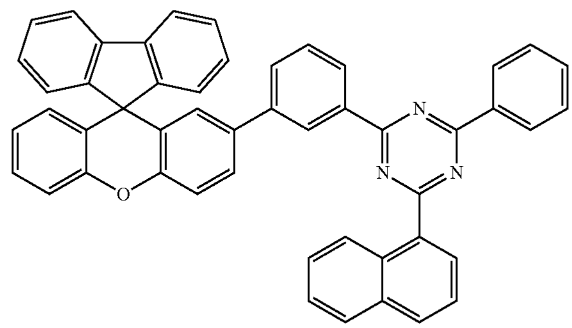
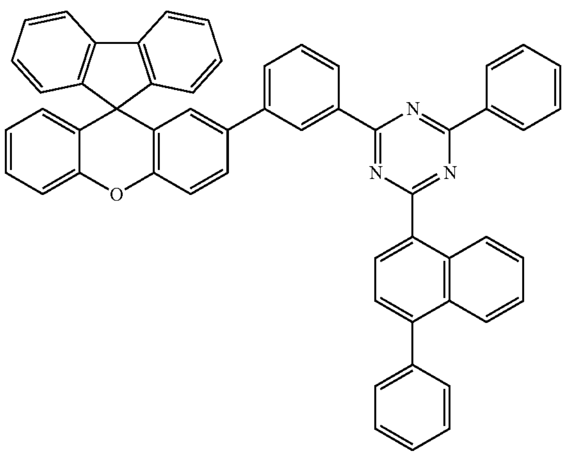
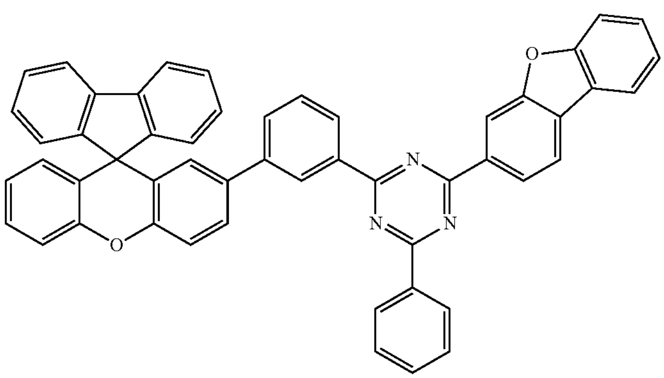
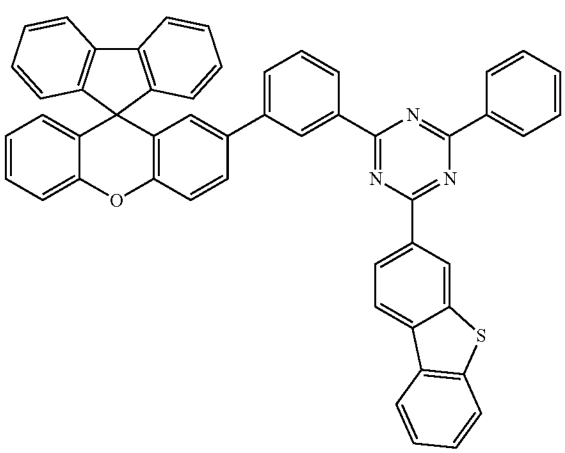
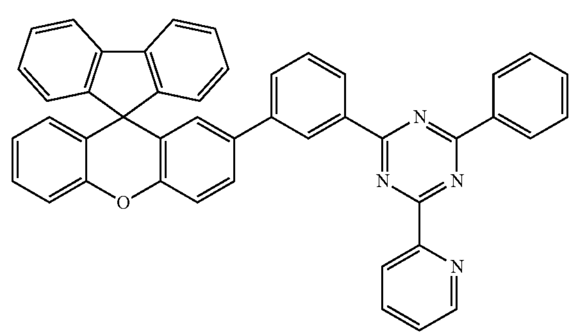

-continued
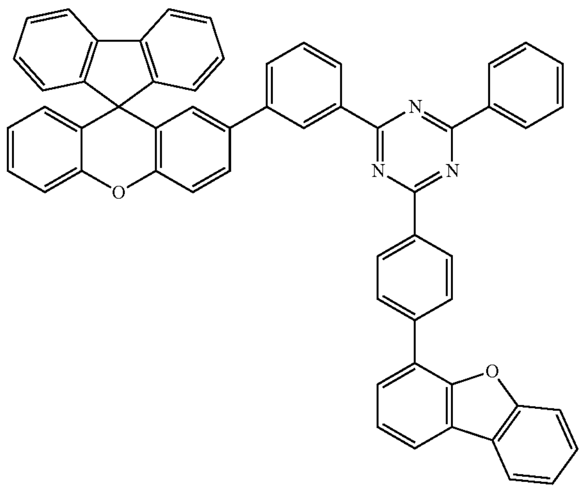
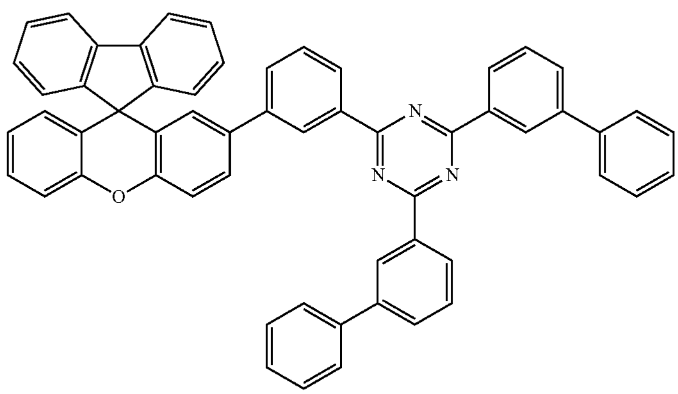
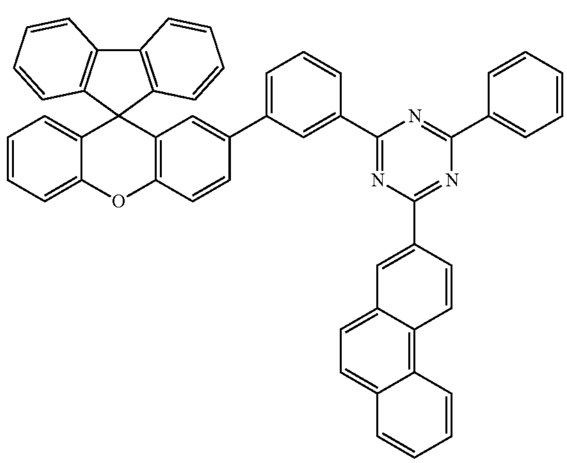
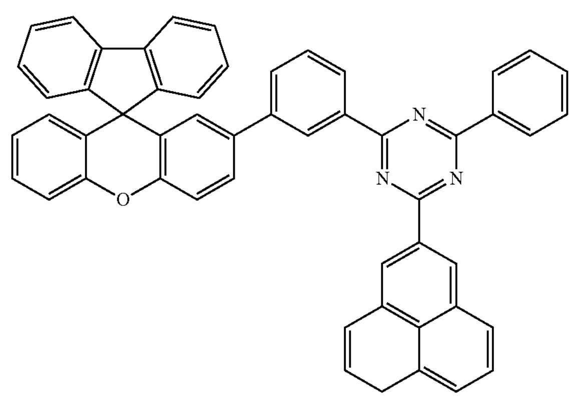

-continued
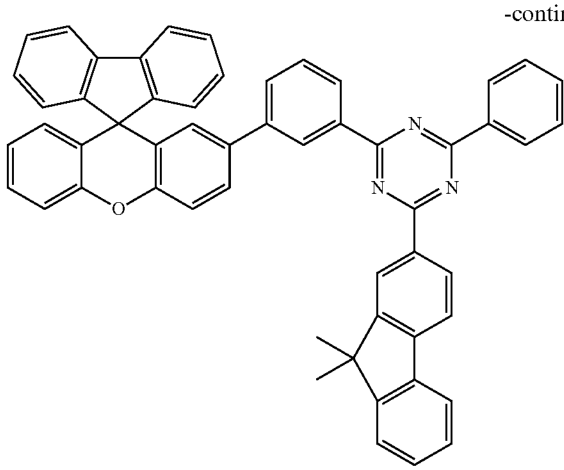
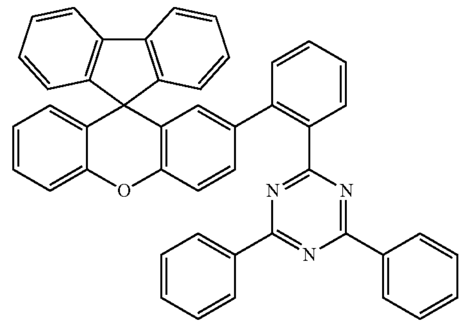
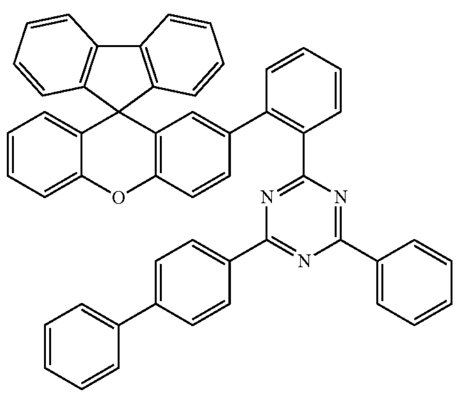
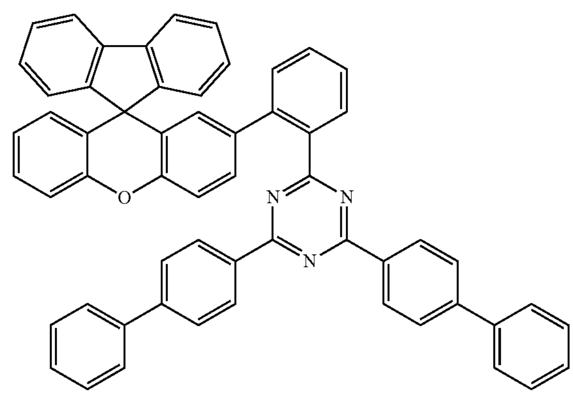
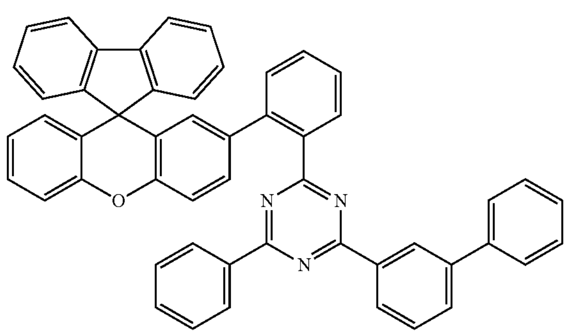
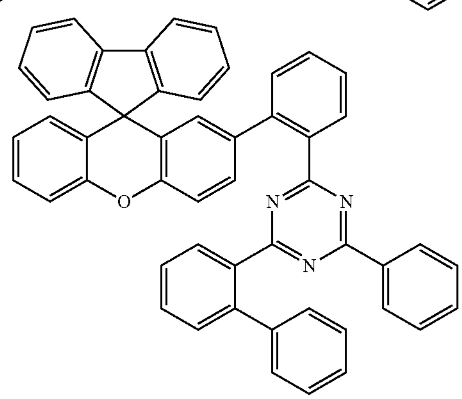
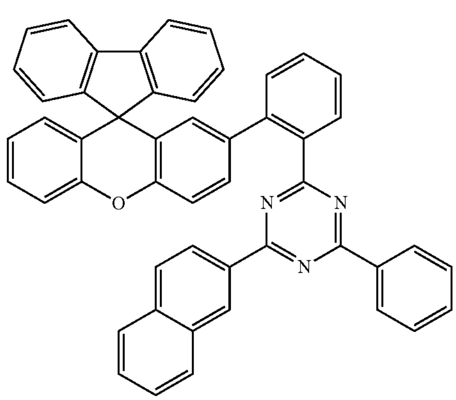
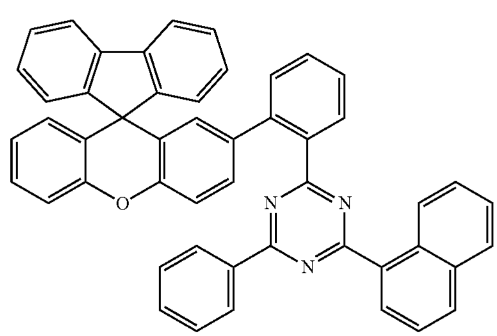

-continued
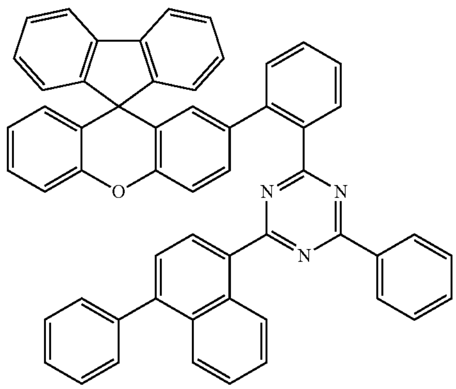
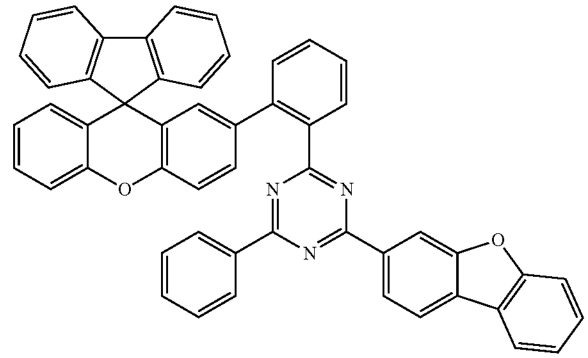
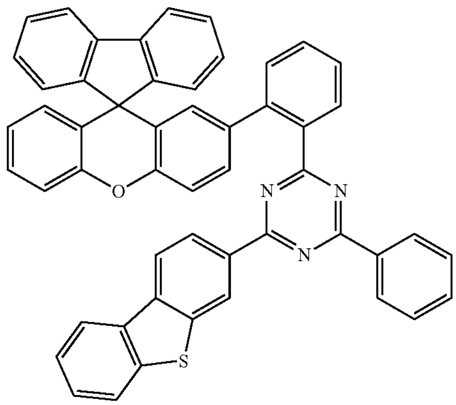
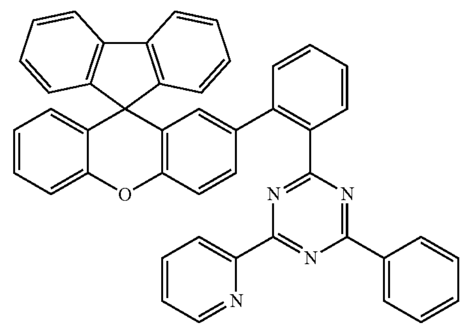
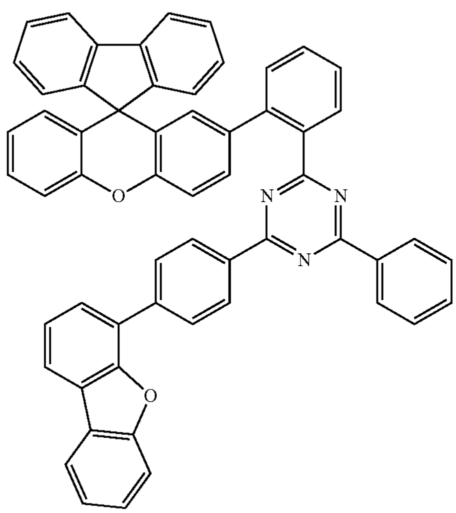
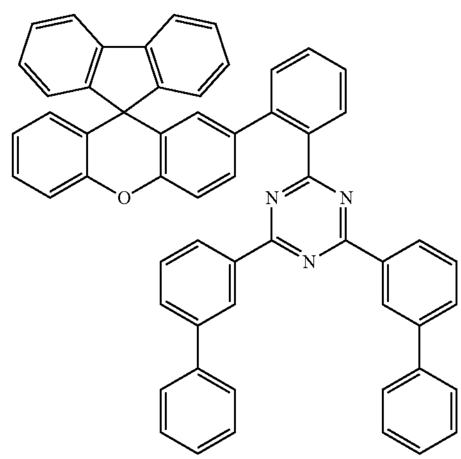
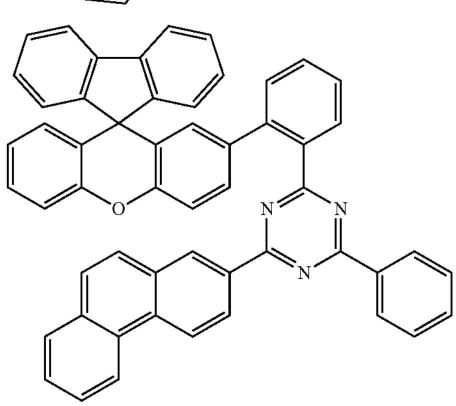
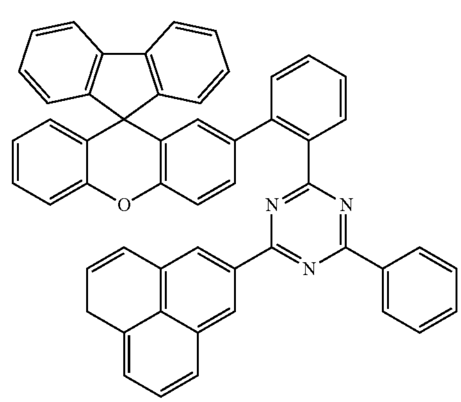

-continued
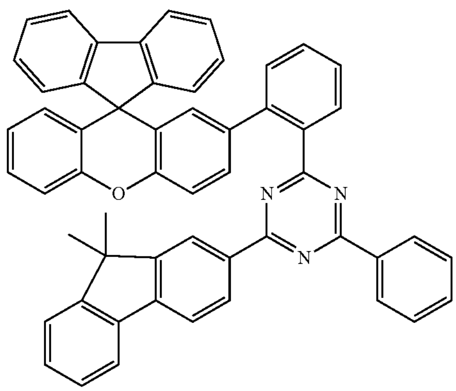
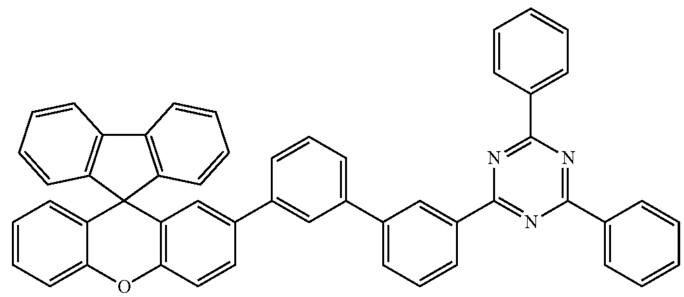
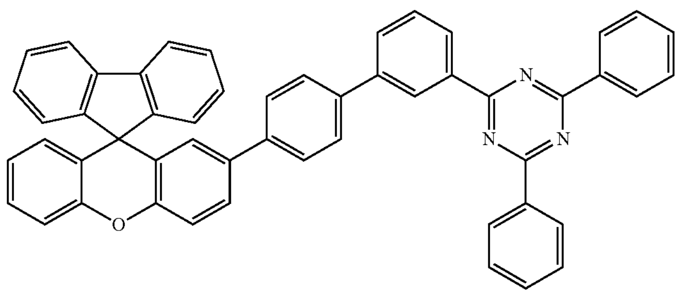
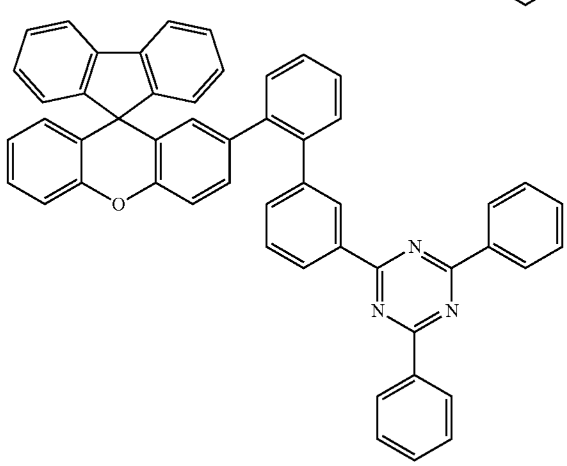
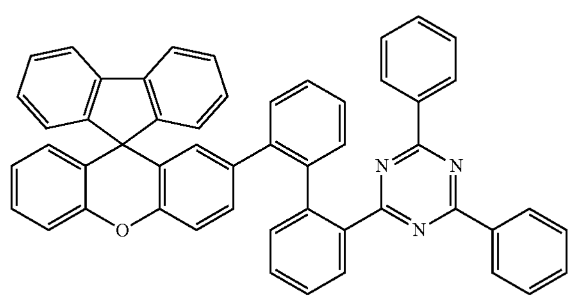
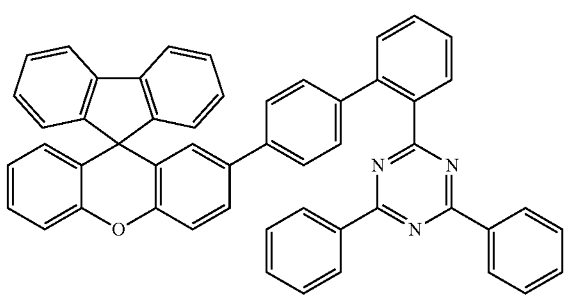
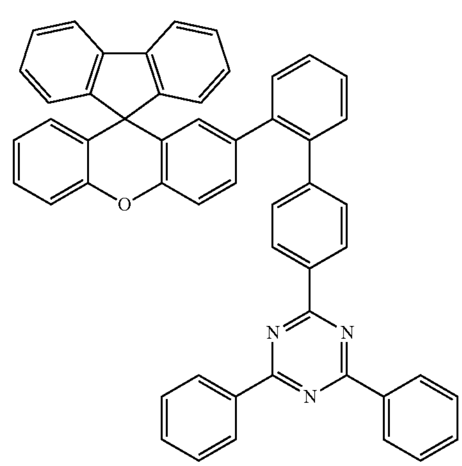

-continued
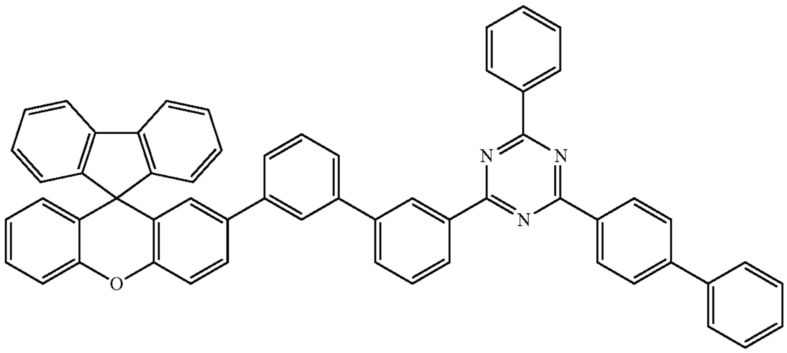
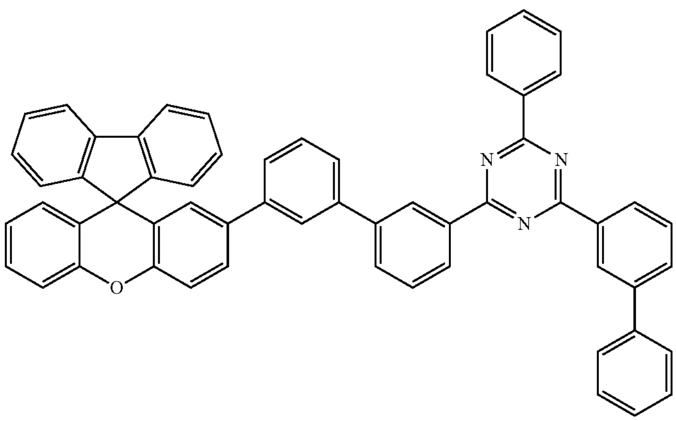
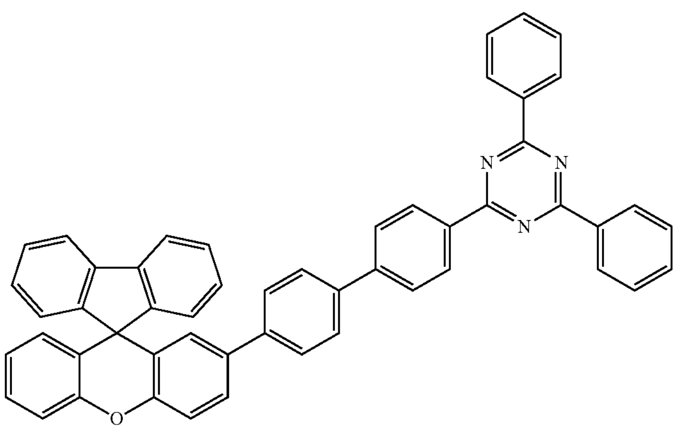
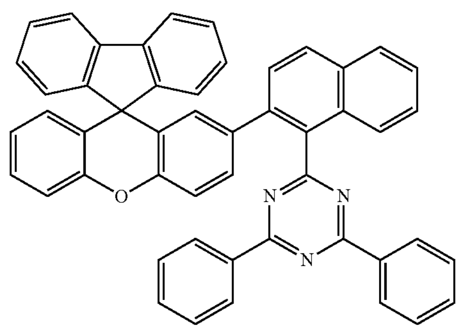
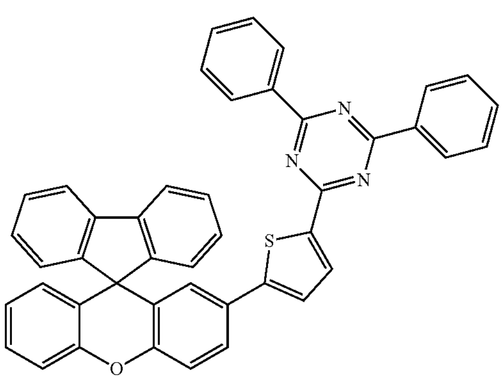
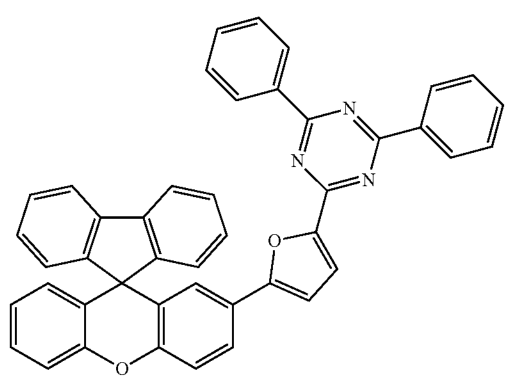

-continued
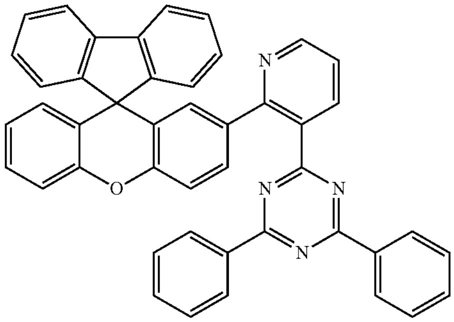
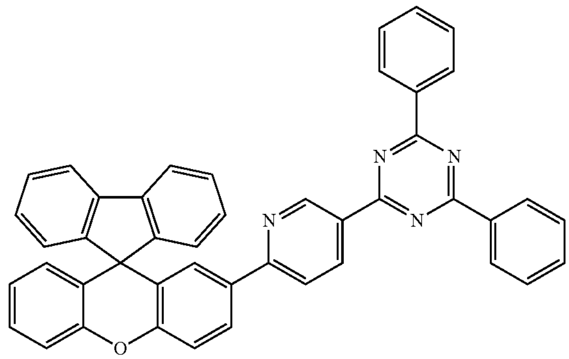
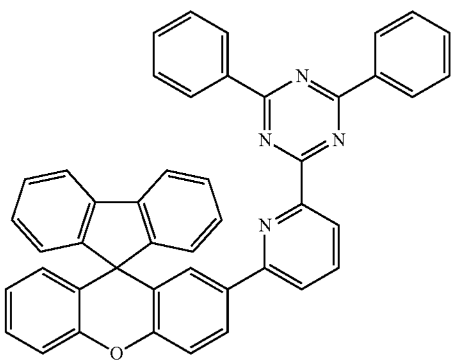
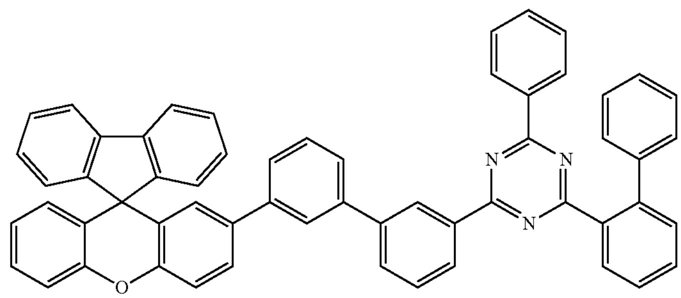
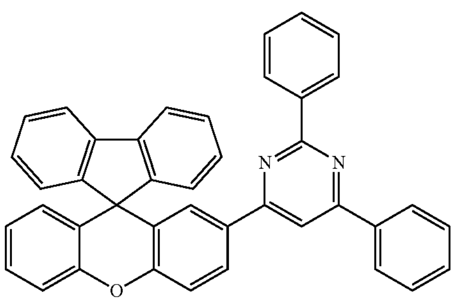
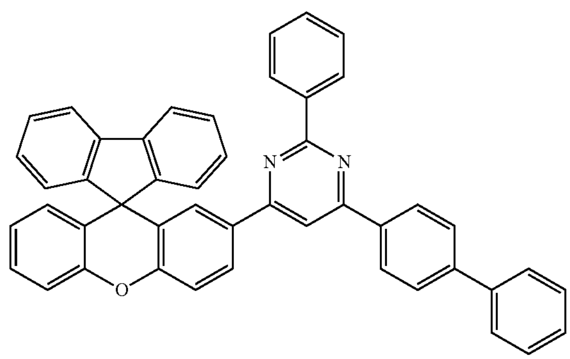
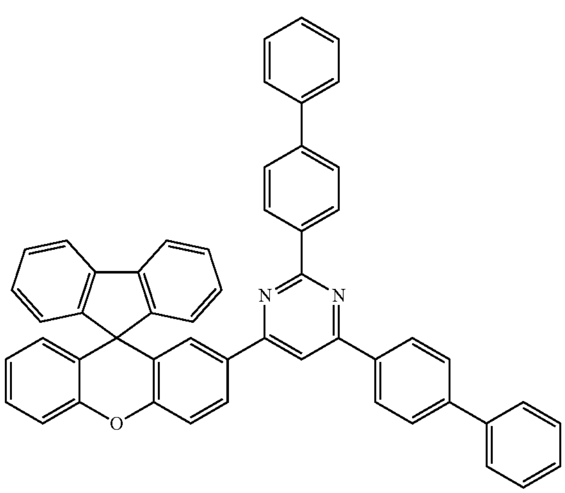
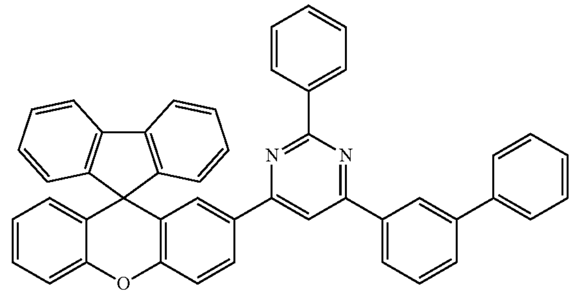

-continued
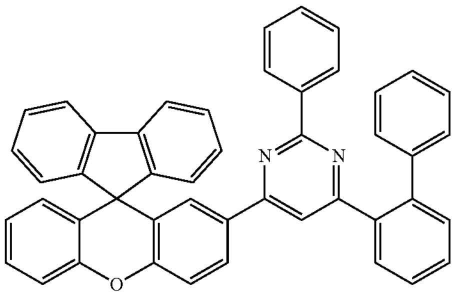
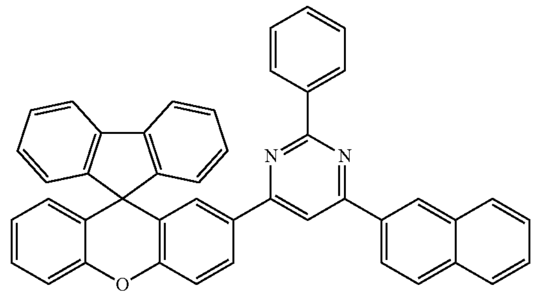
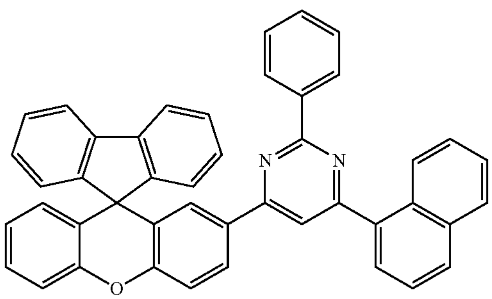
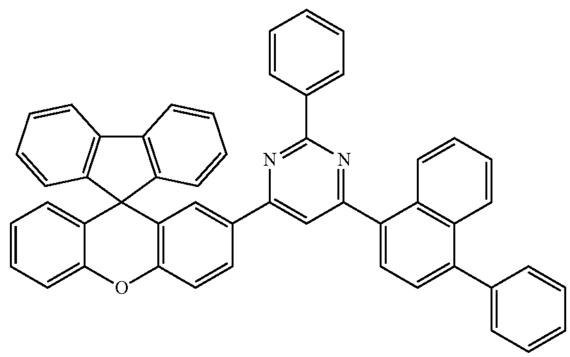
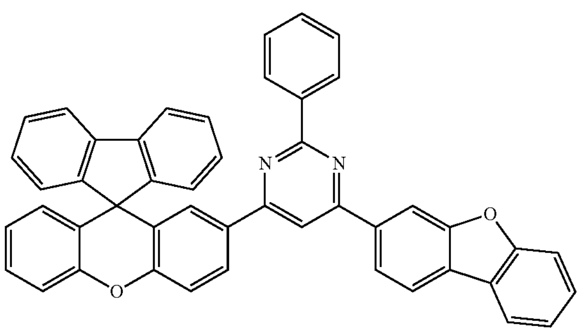
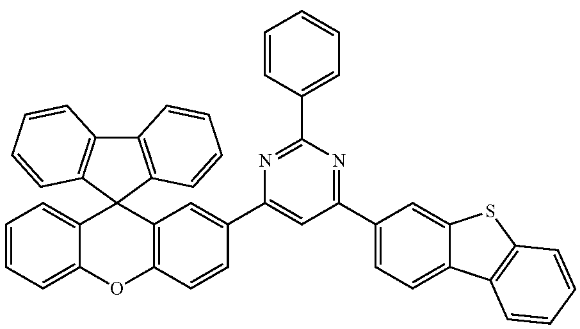
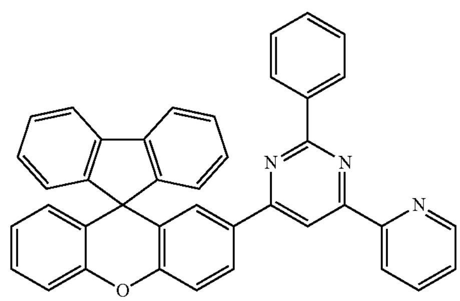

-continued
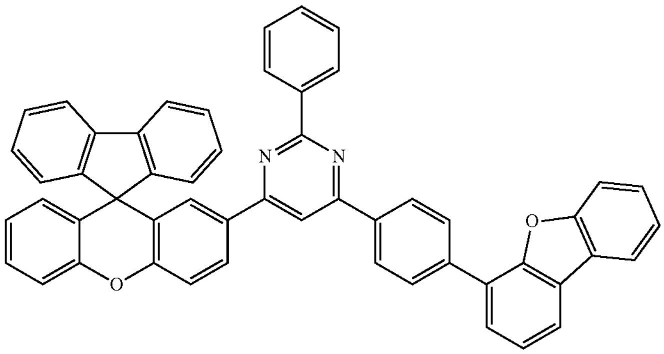
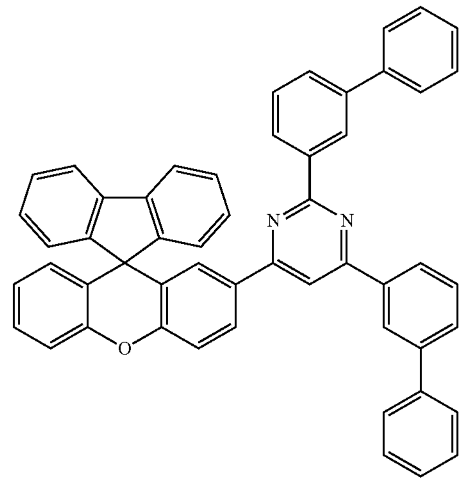
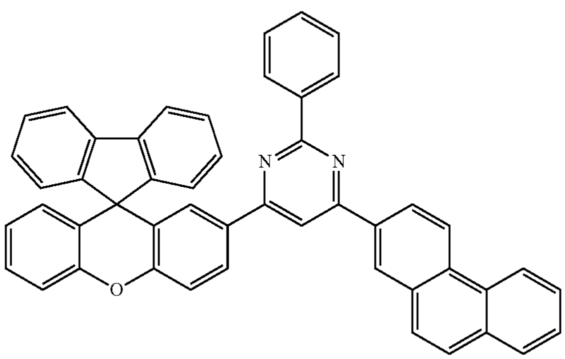
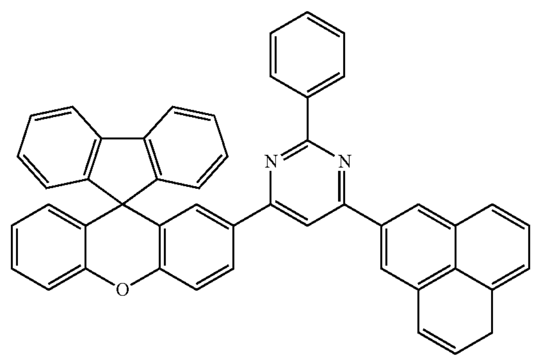
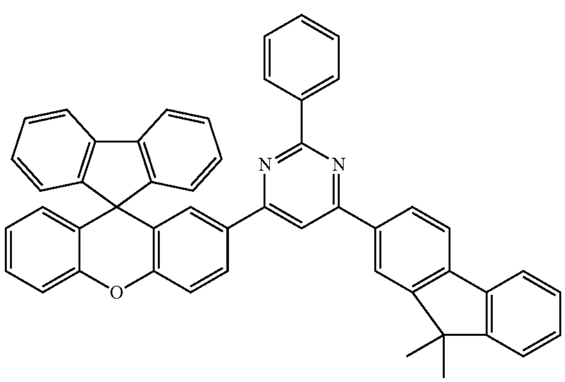
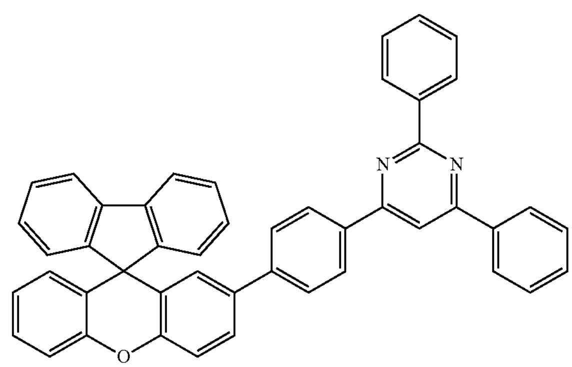
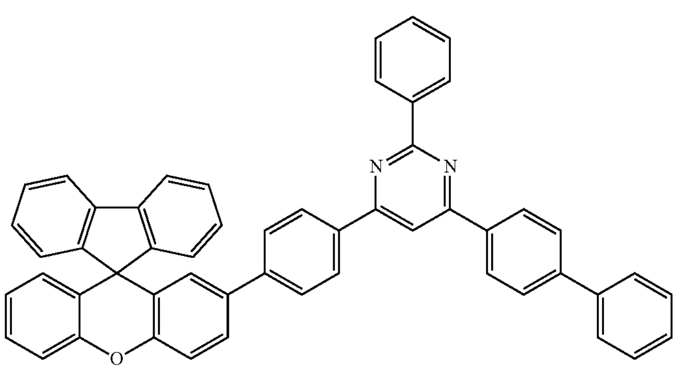

-continued
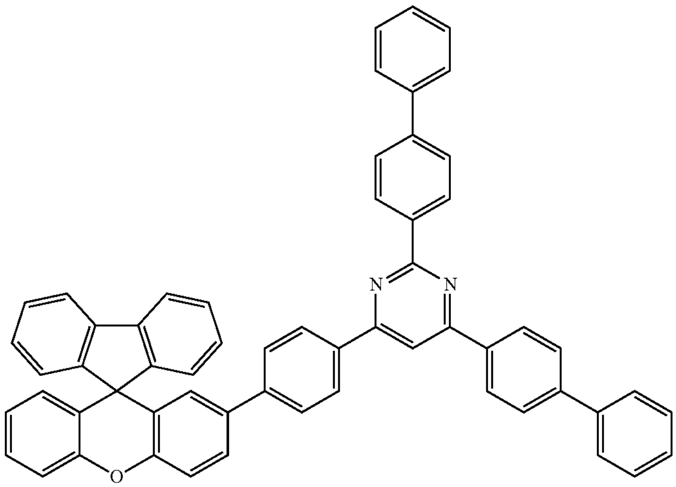
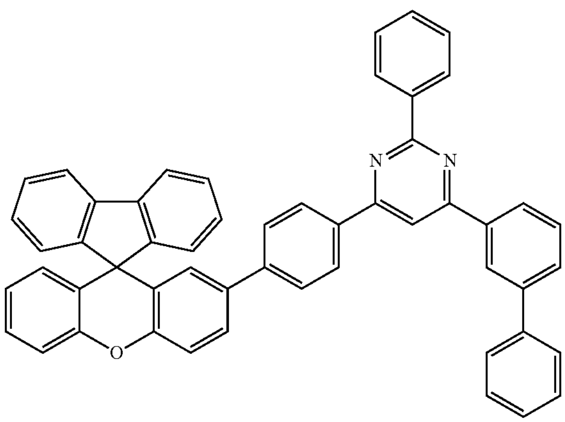
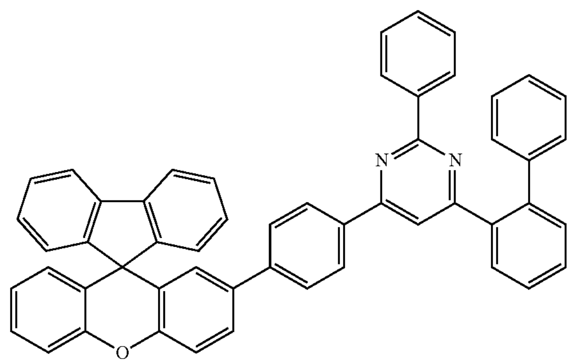
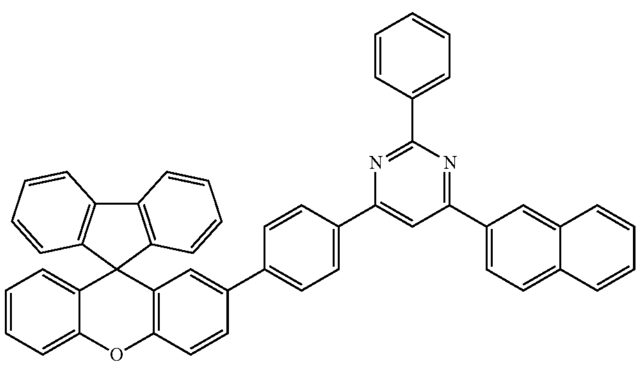
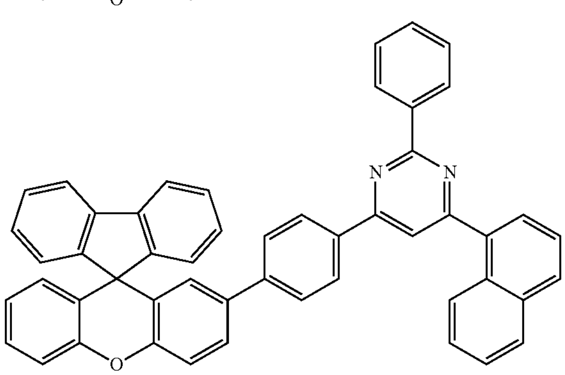

-continued
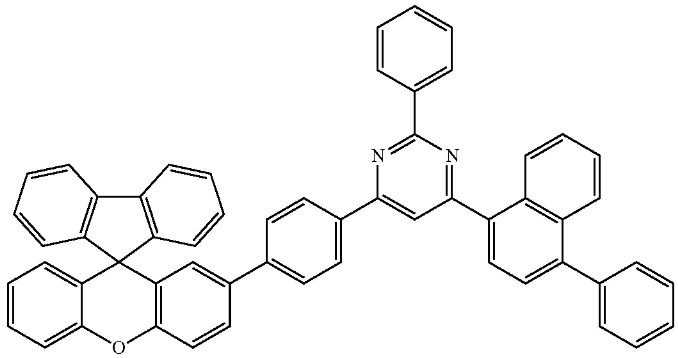
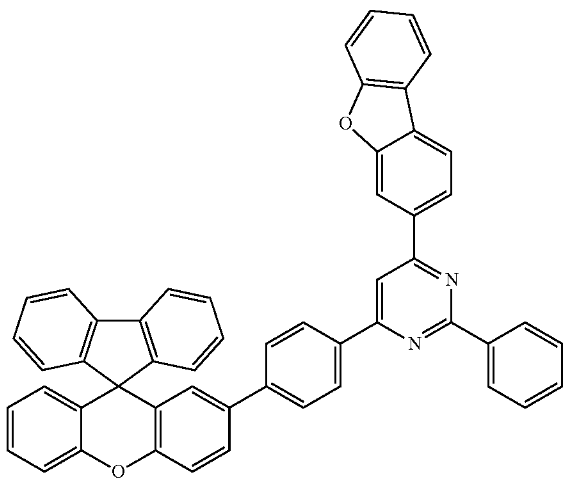
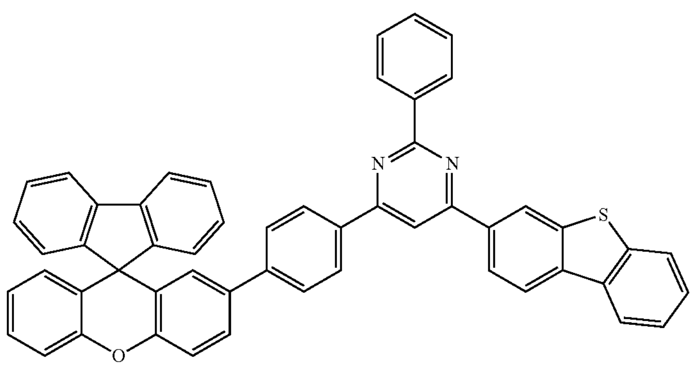
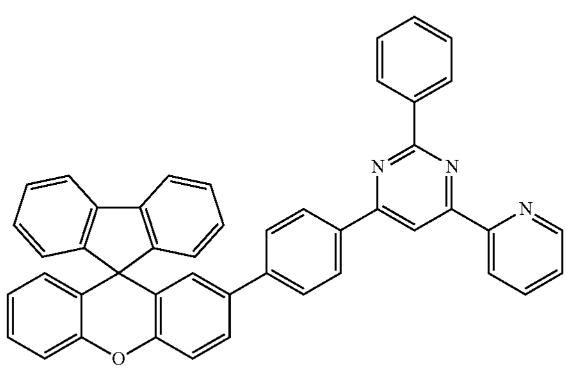

-continued
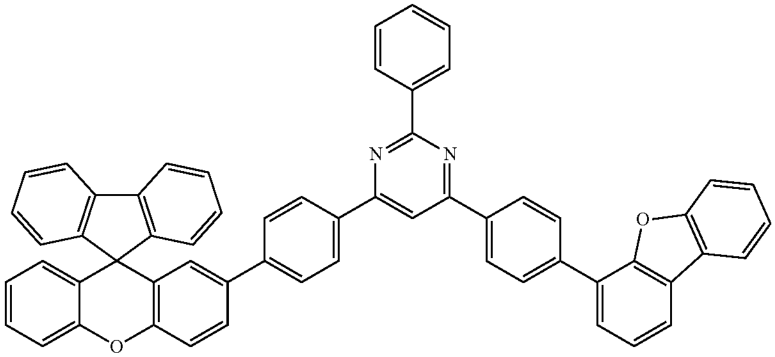
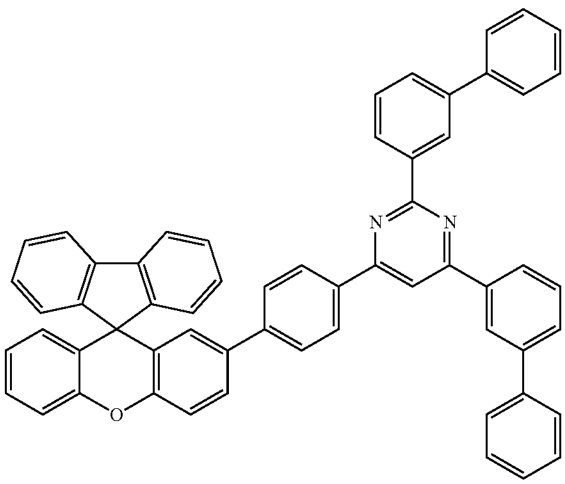
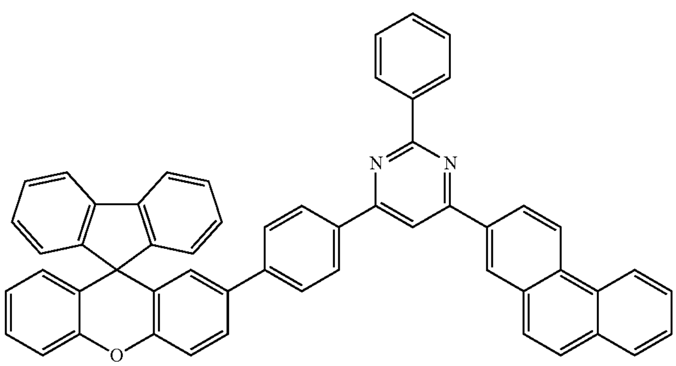
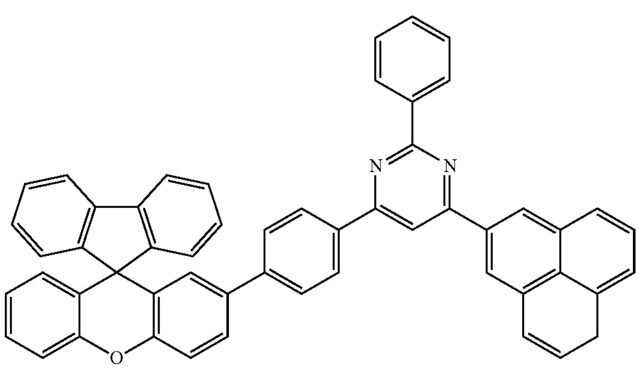

-continued
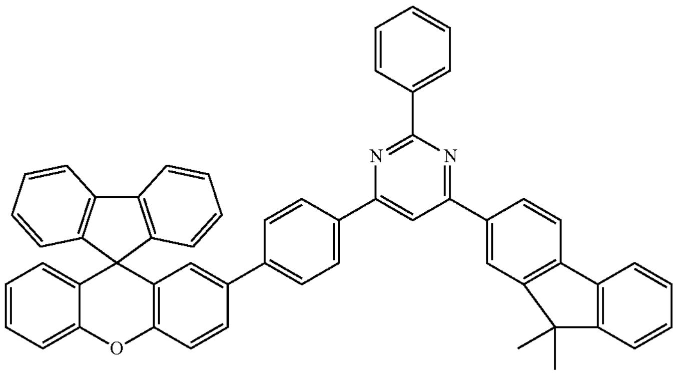
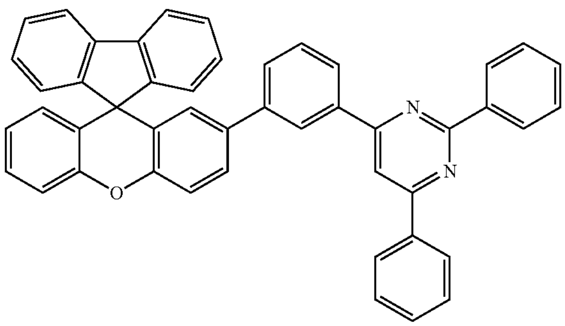
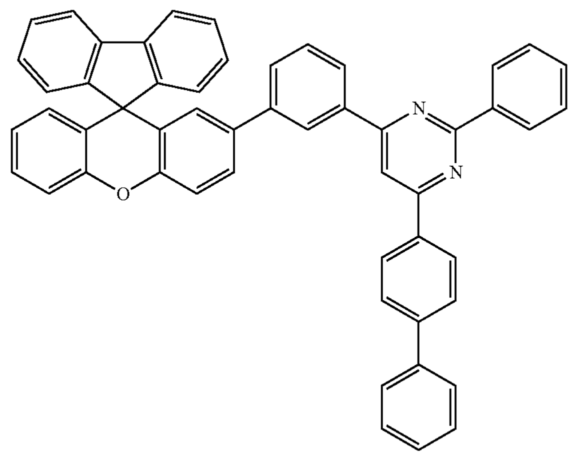
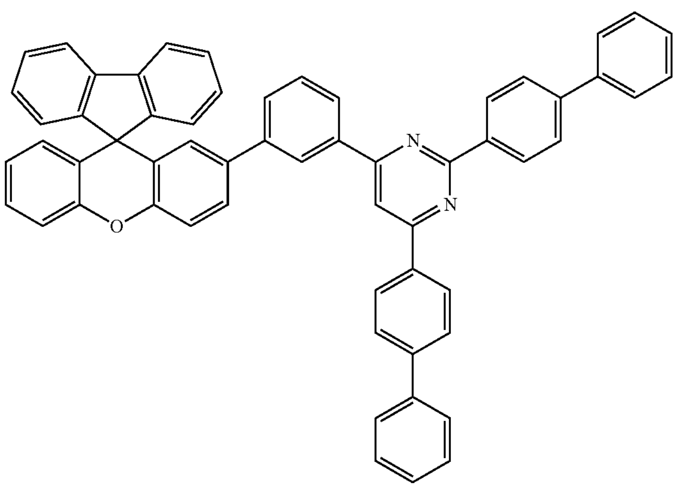
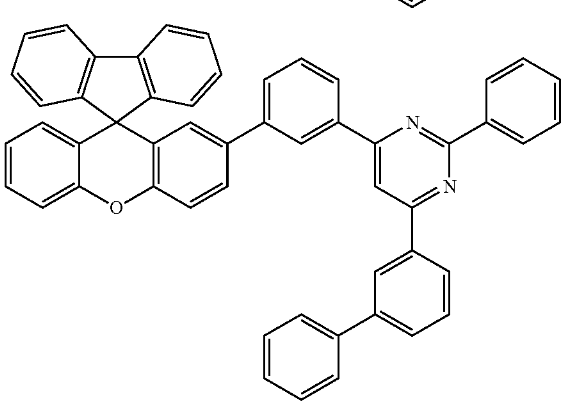
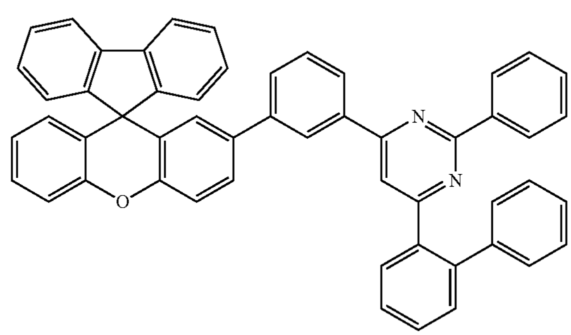

-continued
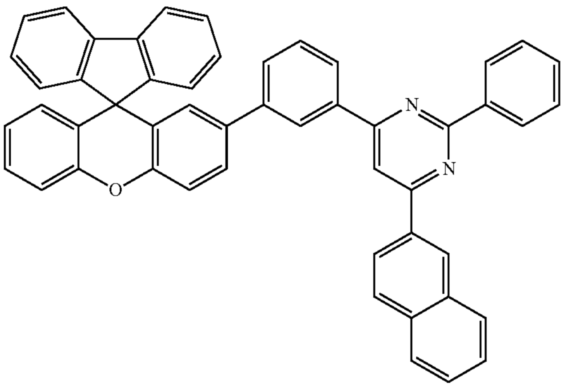
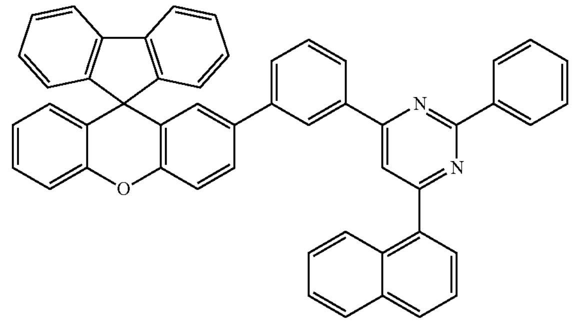
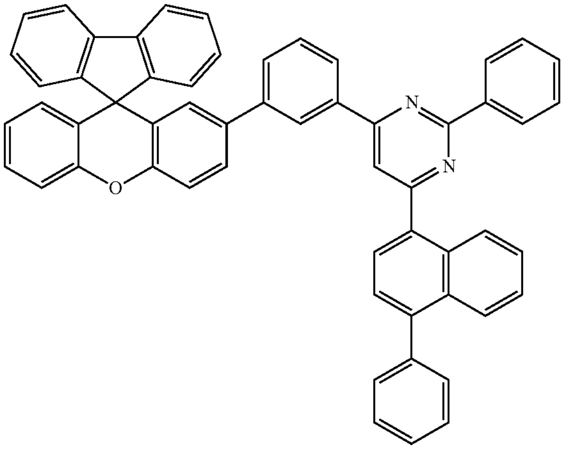
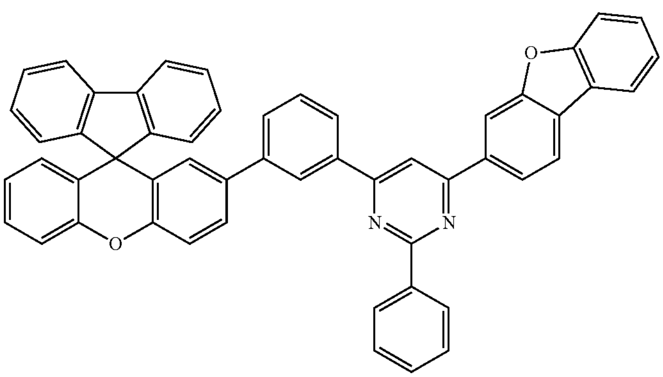
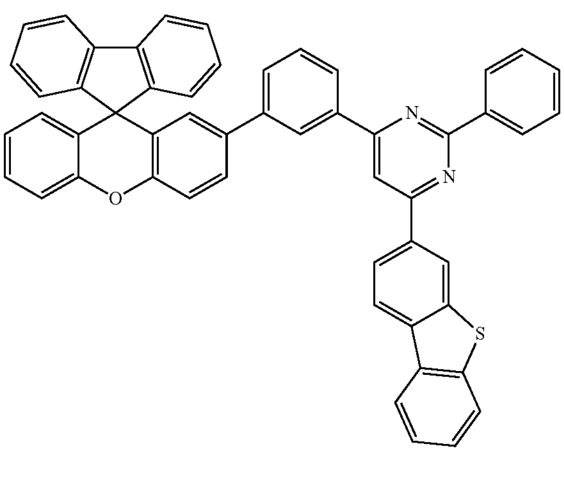
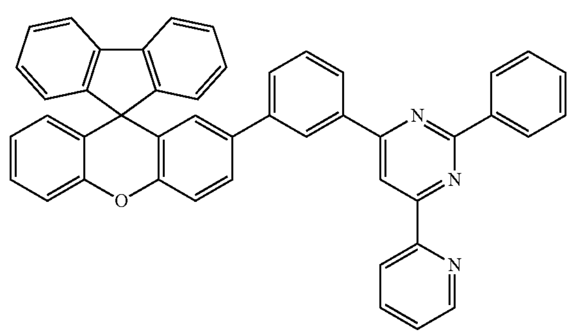

-continued
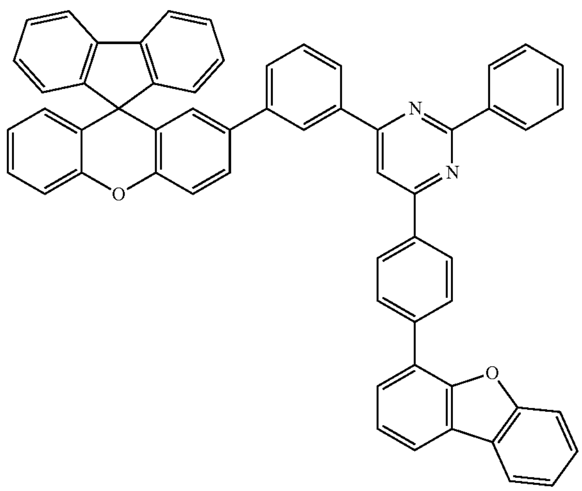
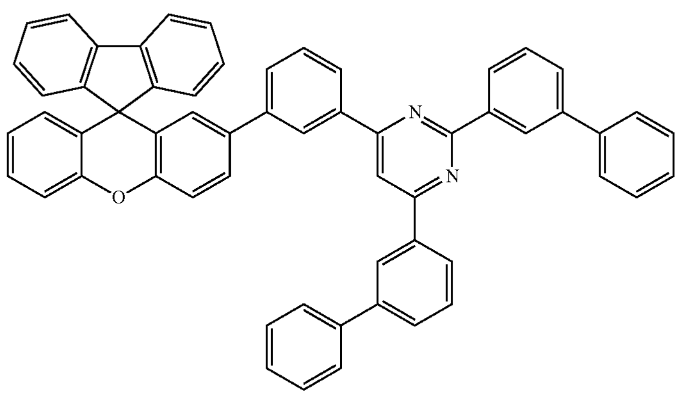
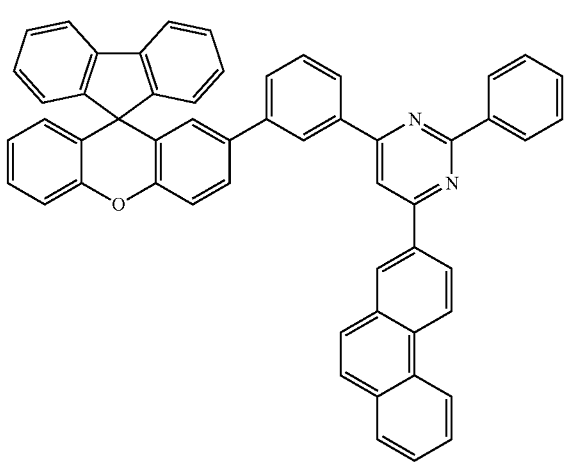
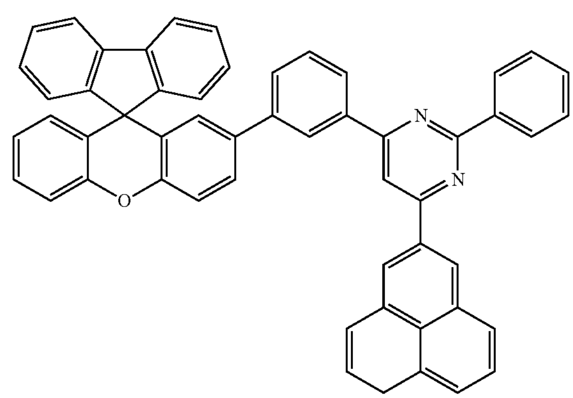

-continued
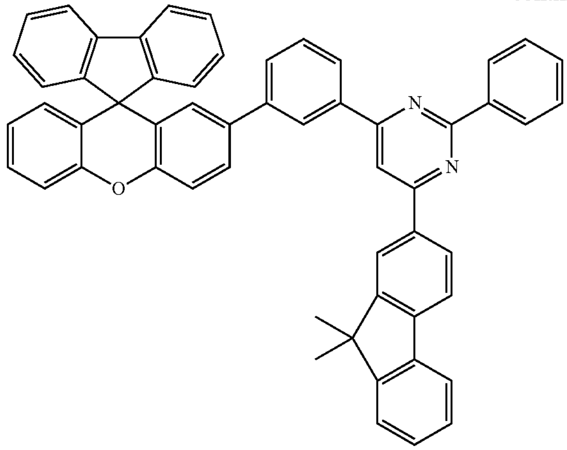
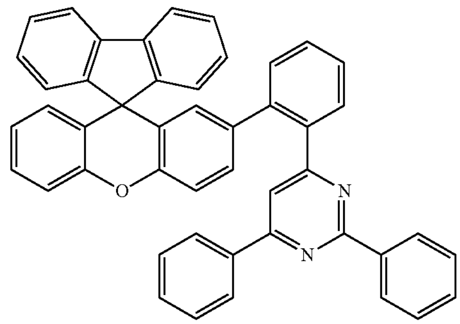
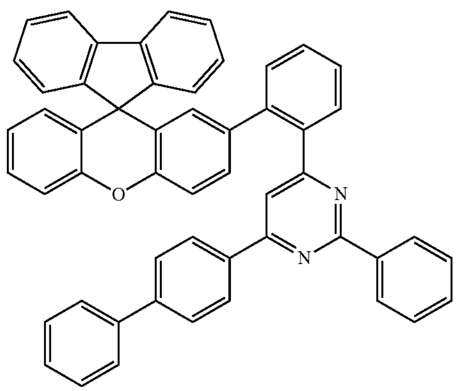
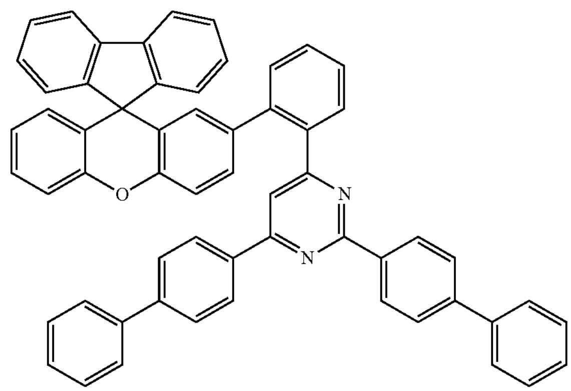
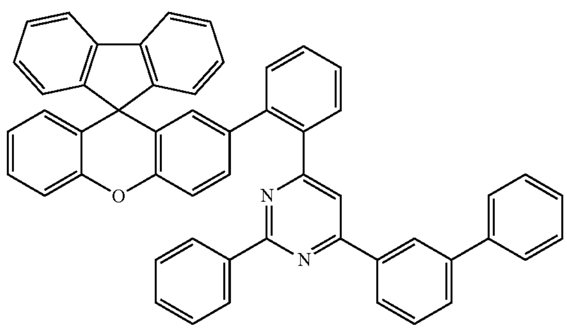
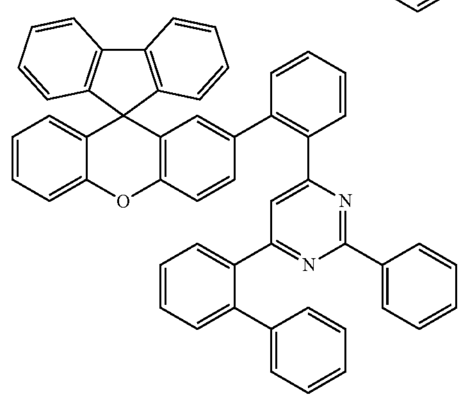
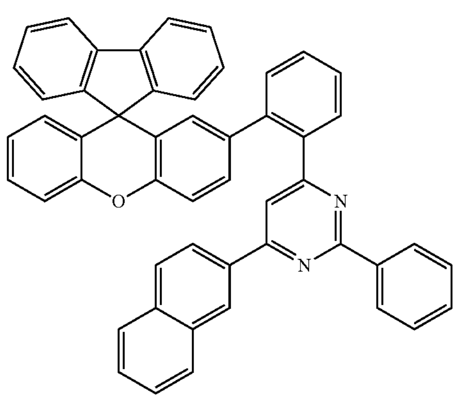
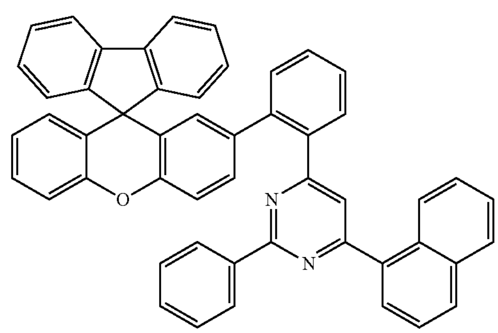

-continued
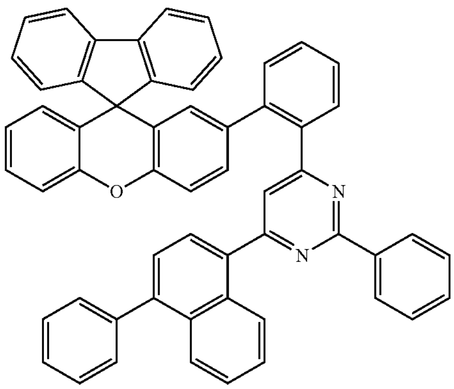
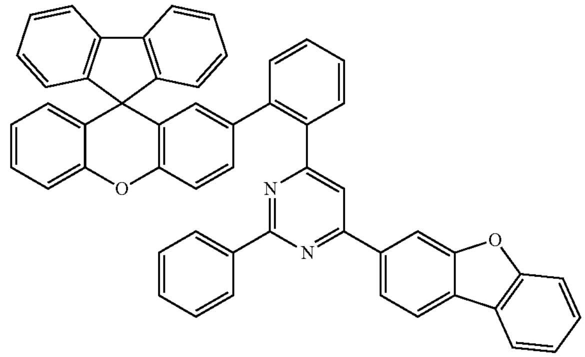
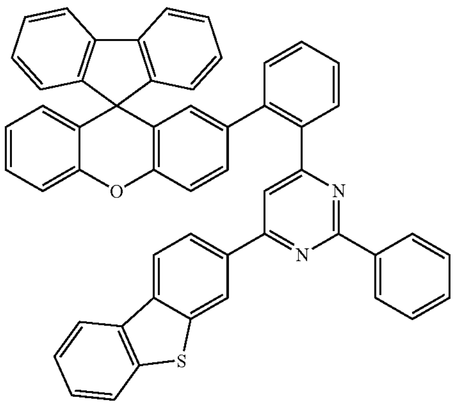
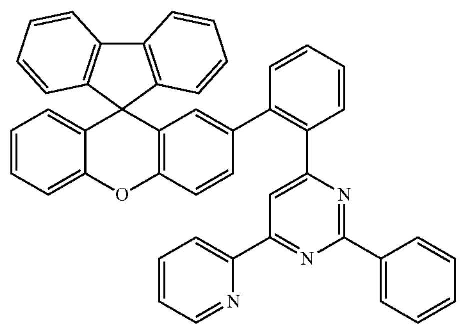
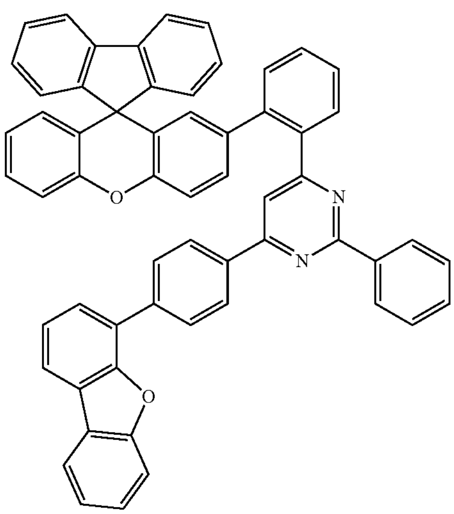
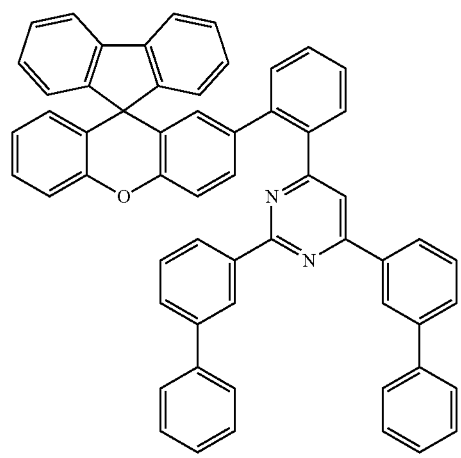
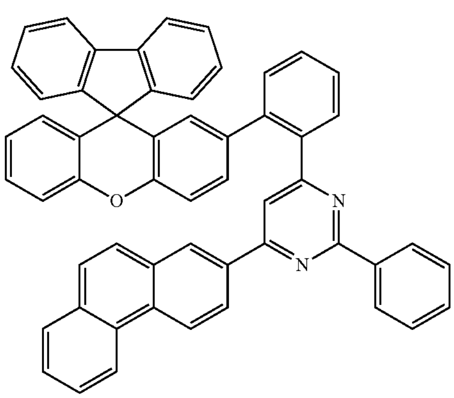
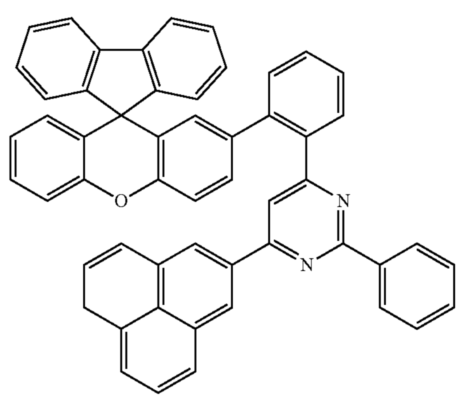

-continued
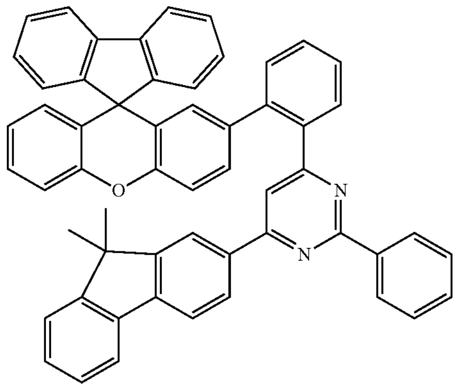
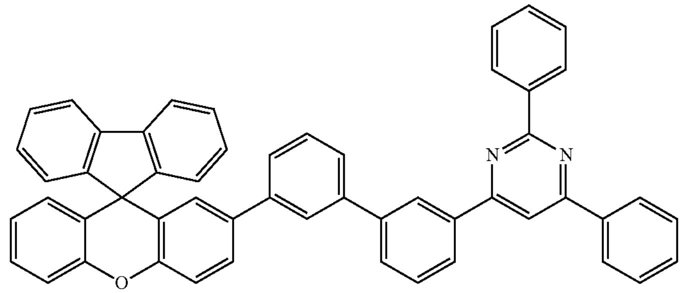
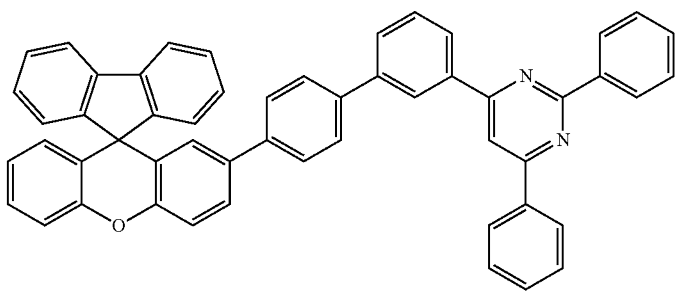
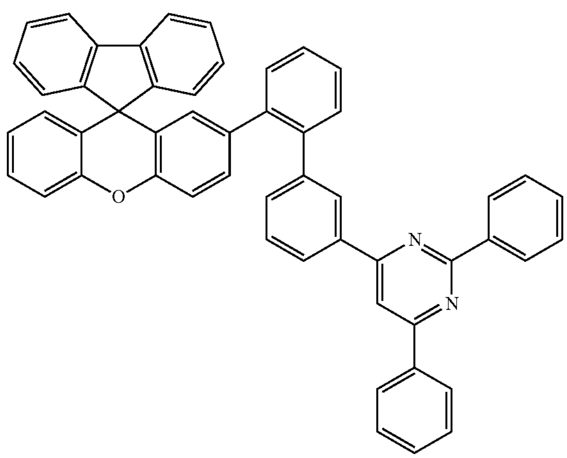
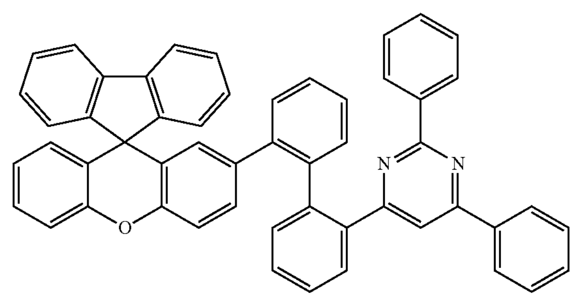
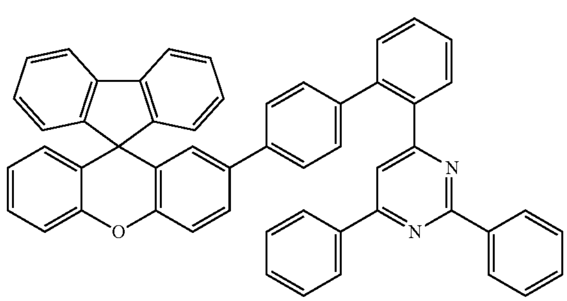
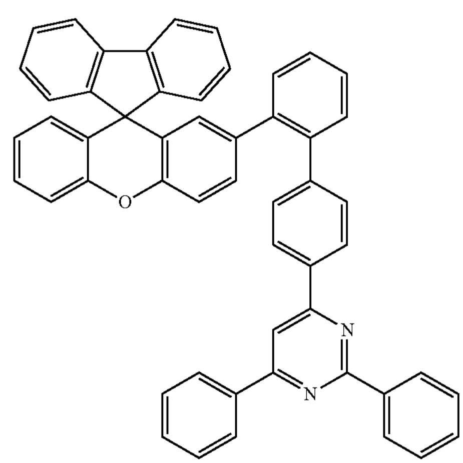

-continued
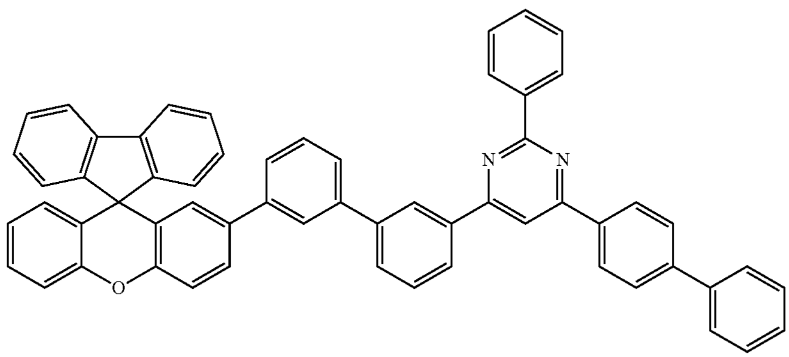
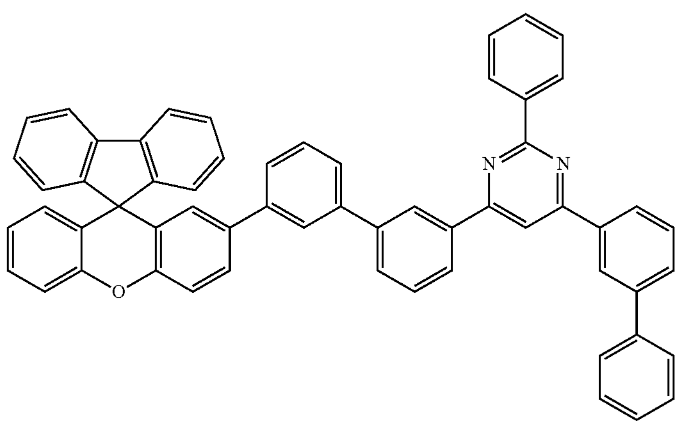
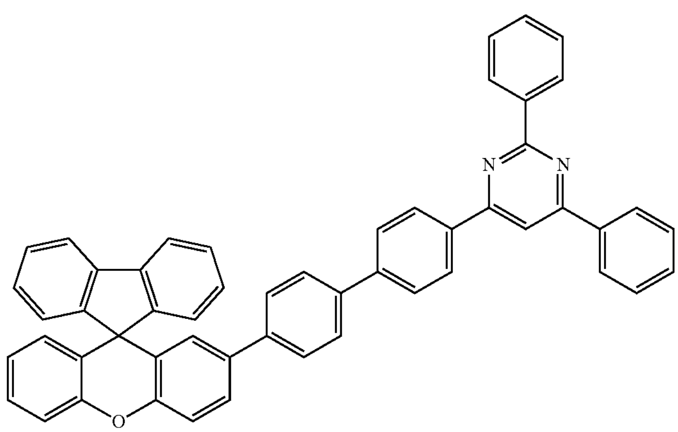
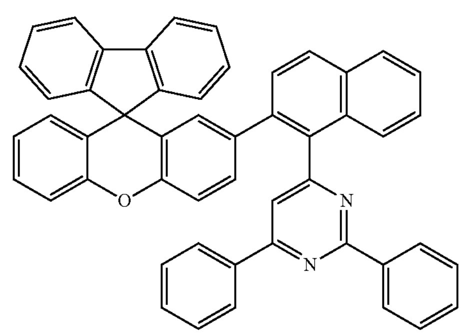
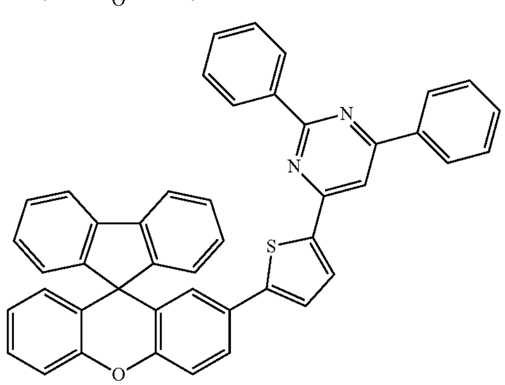
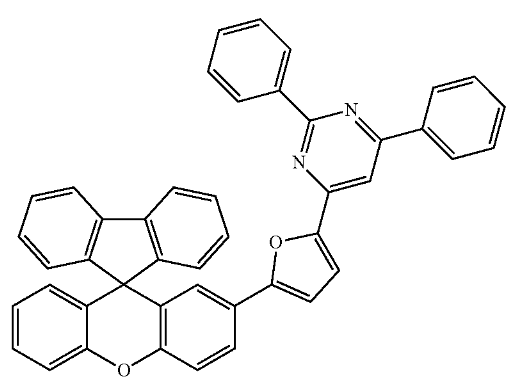

-continued
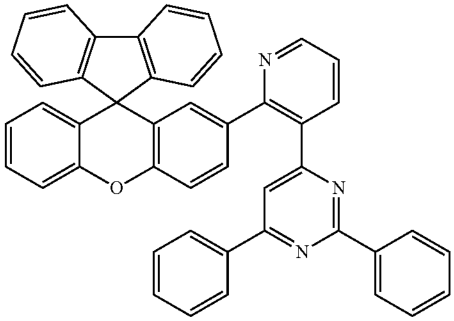
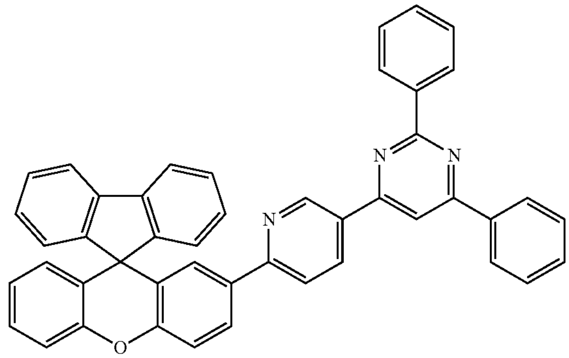
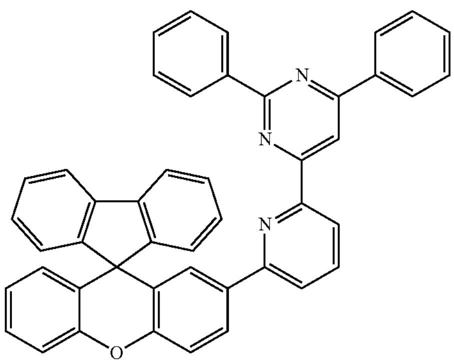
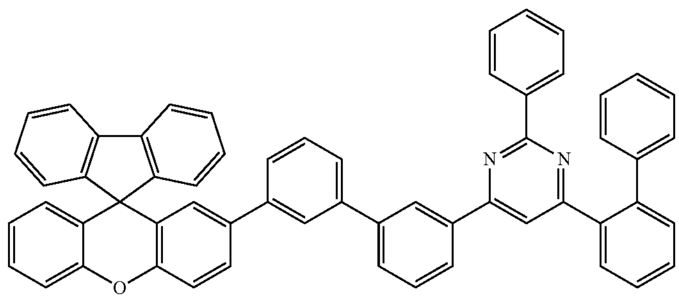
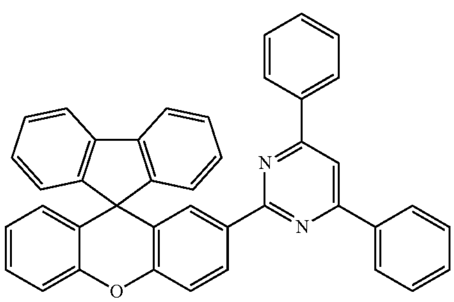
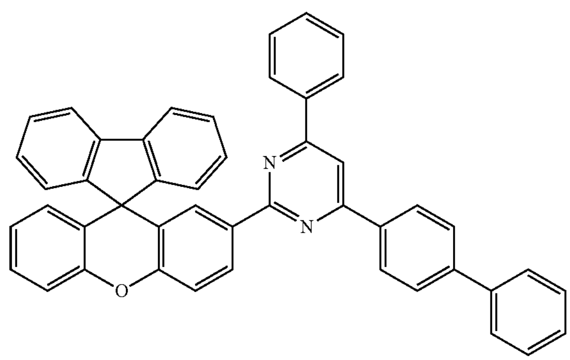
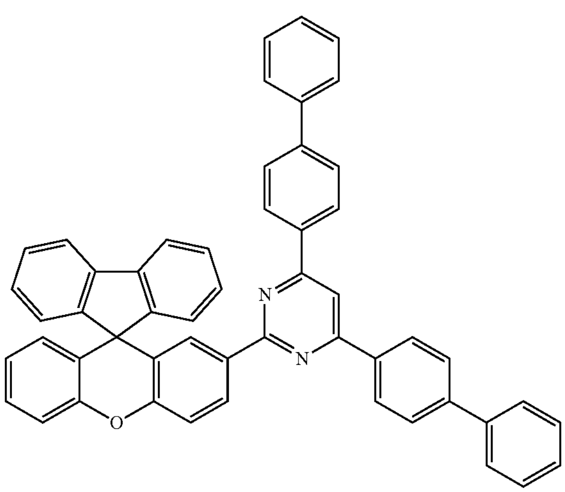
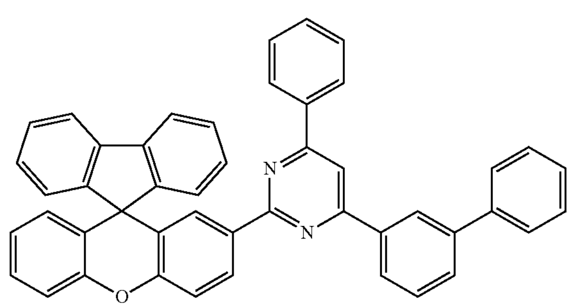

-continued
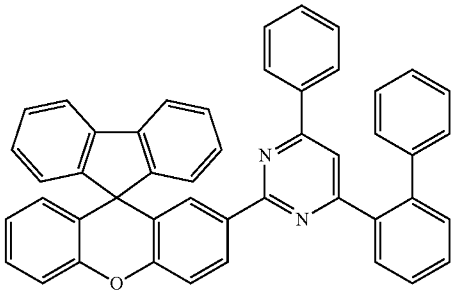
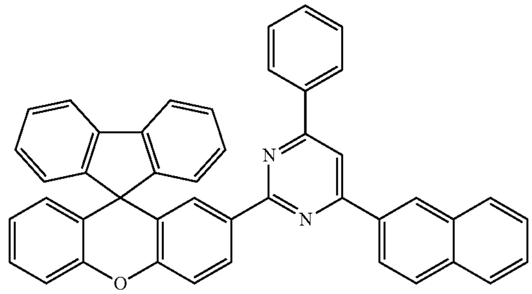
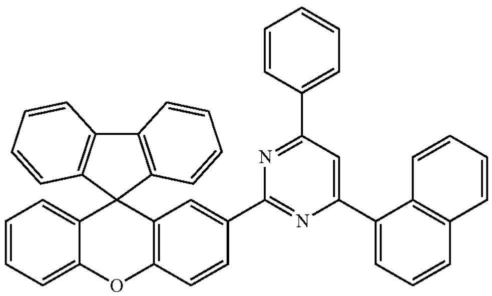
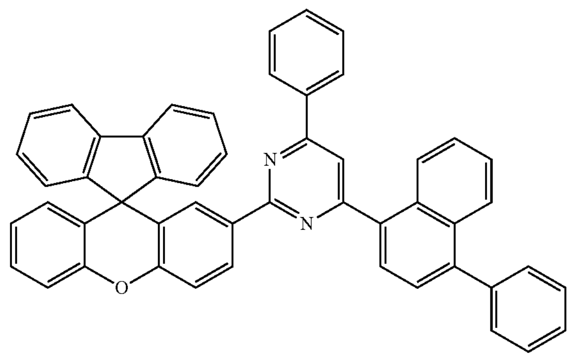
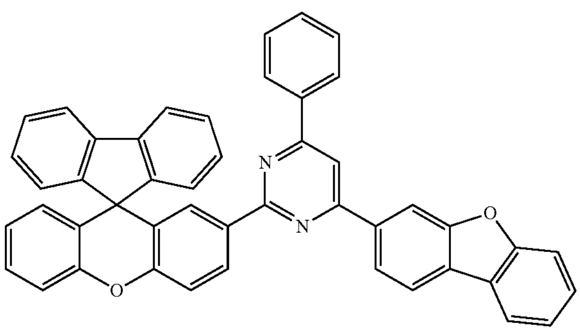
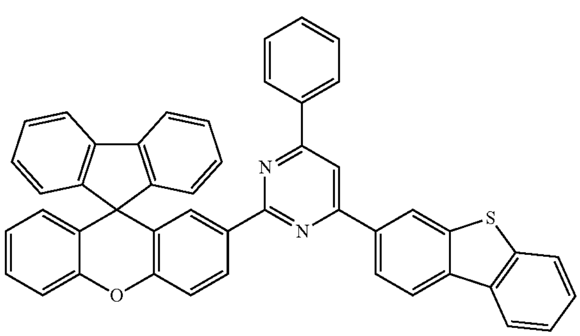
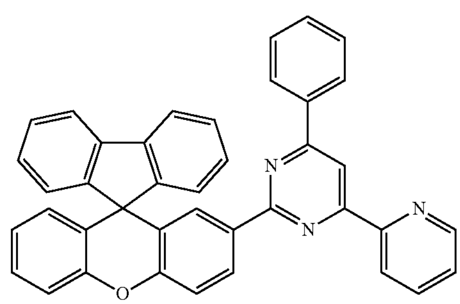

-continued
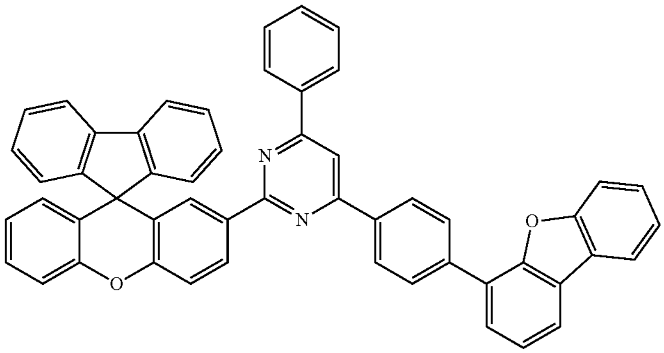
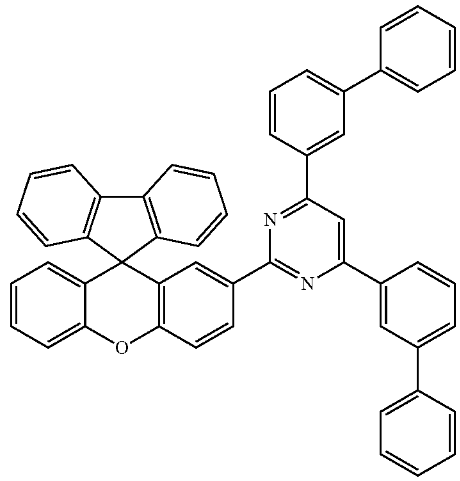
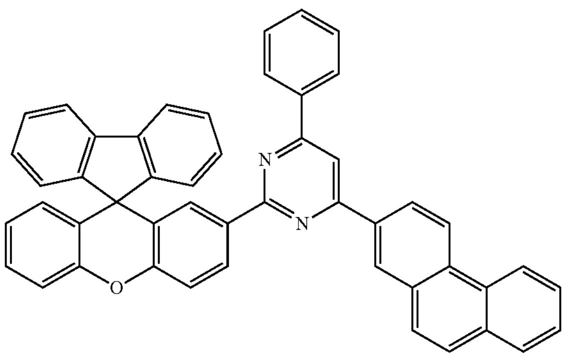
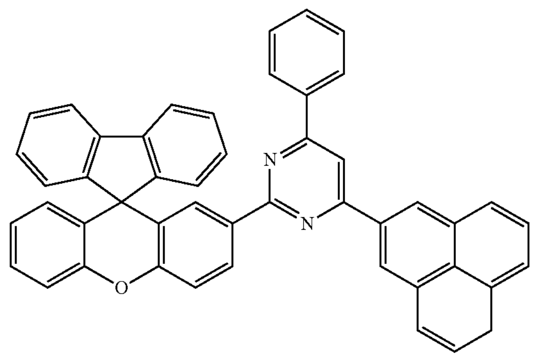
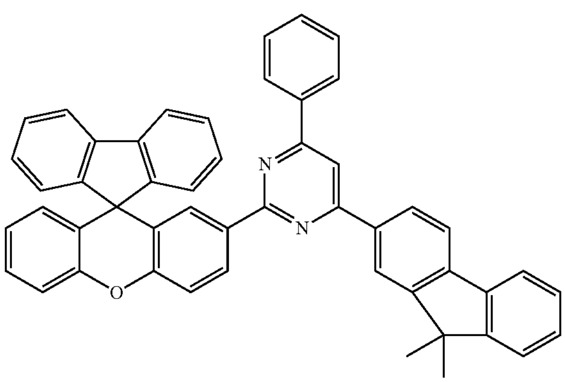
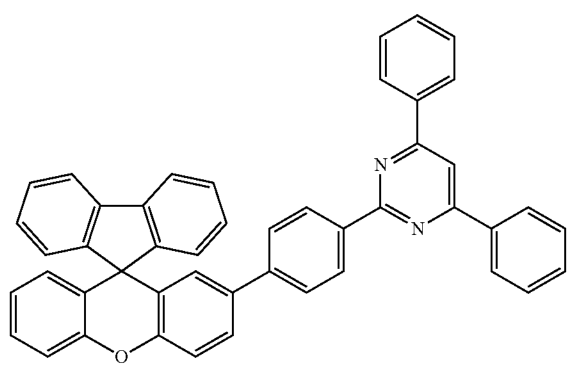
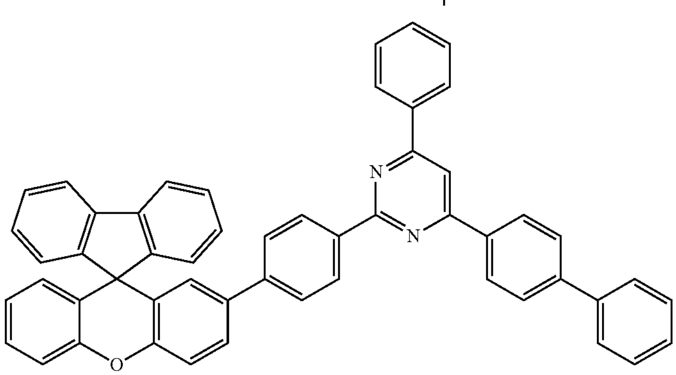

-continued
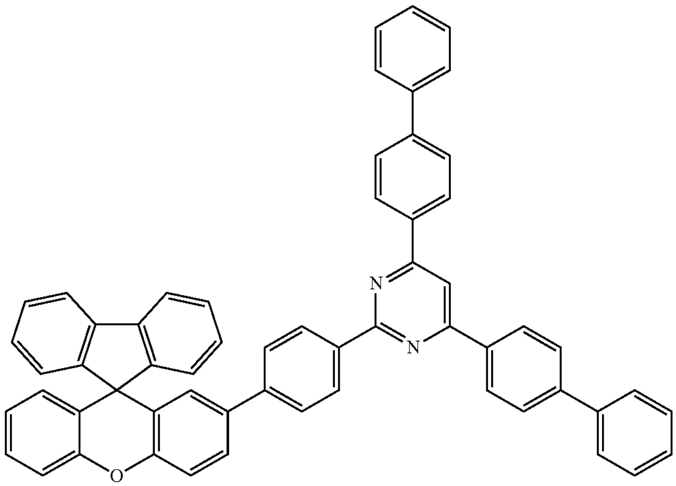
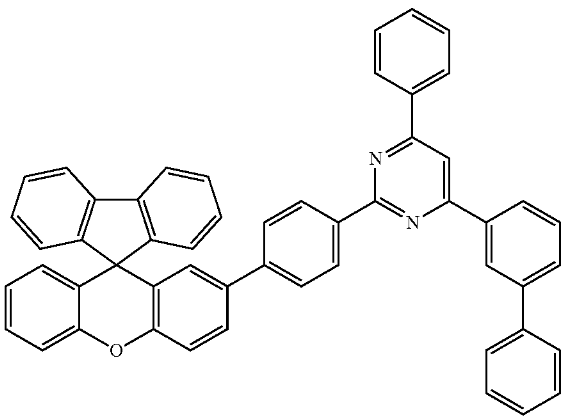
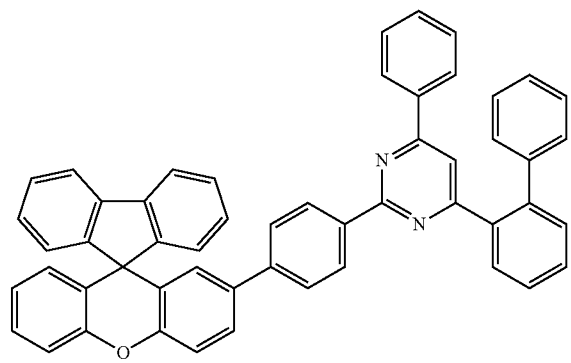
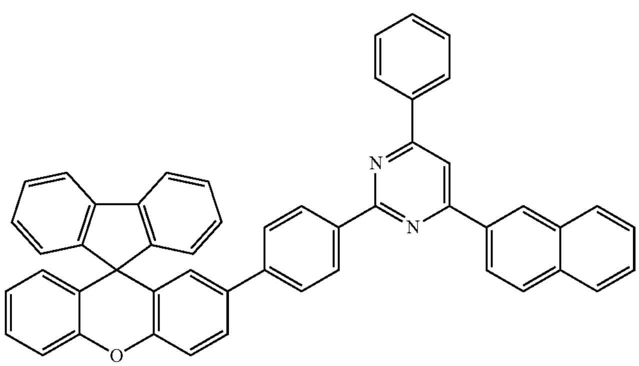
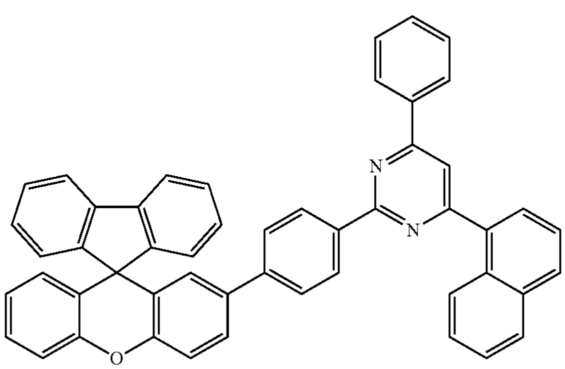

-continued
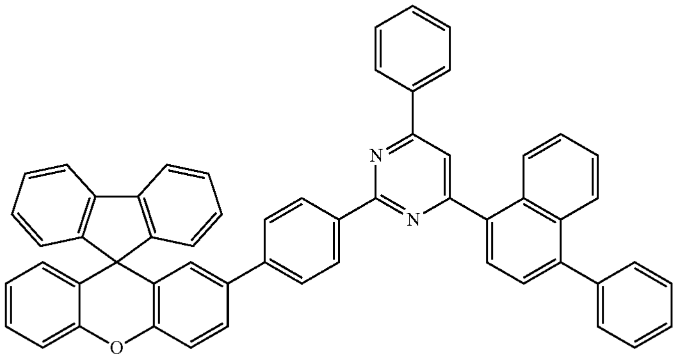
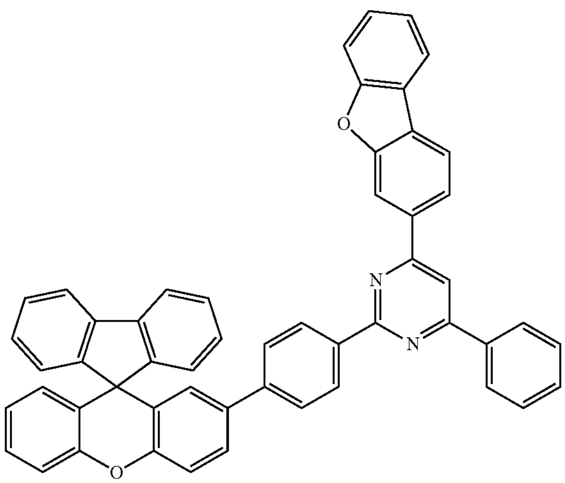
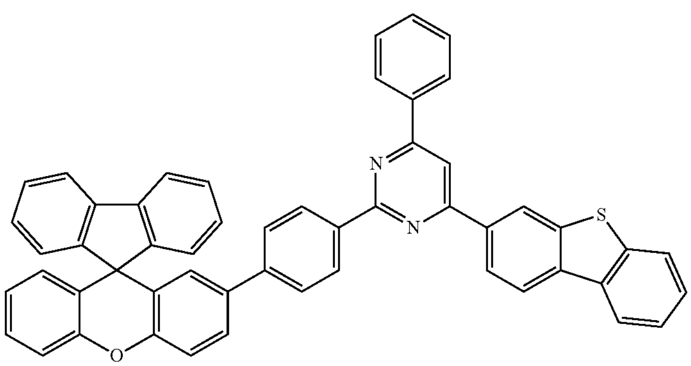
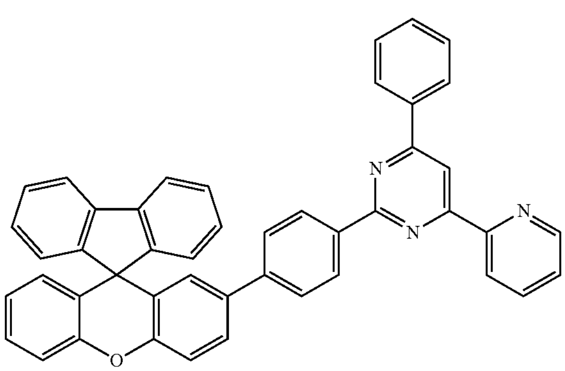

-continued
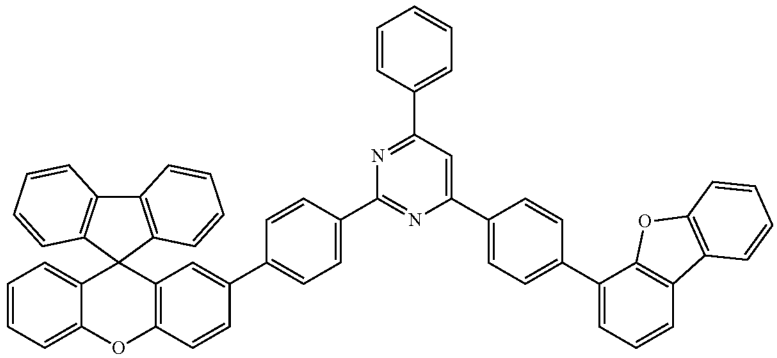
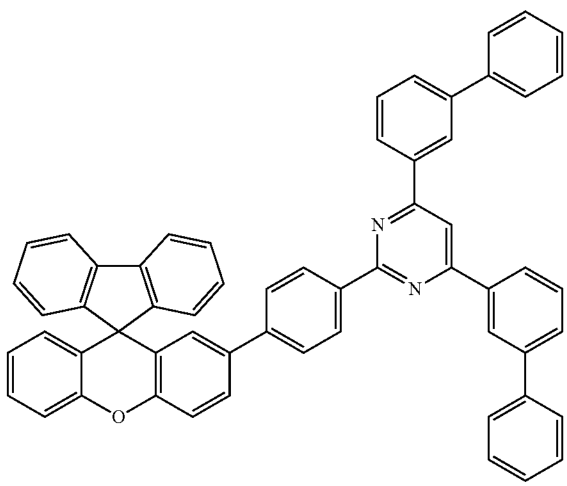
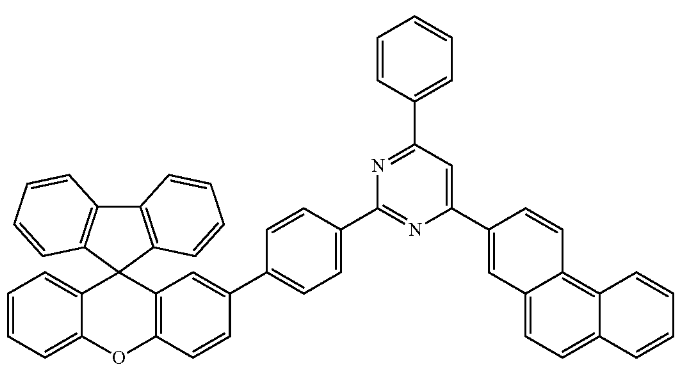
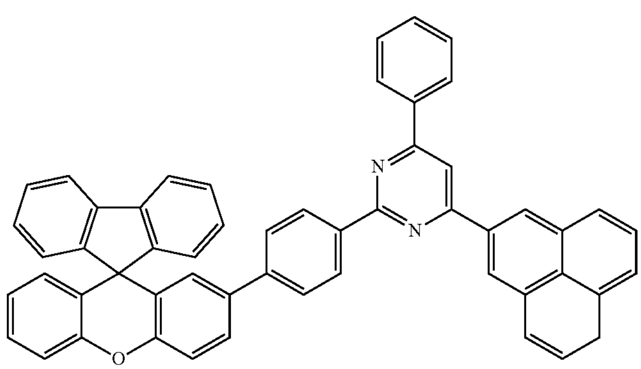

-continued
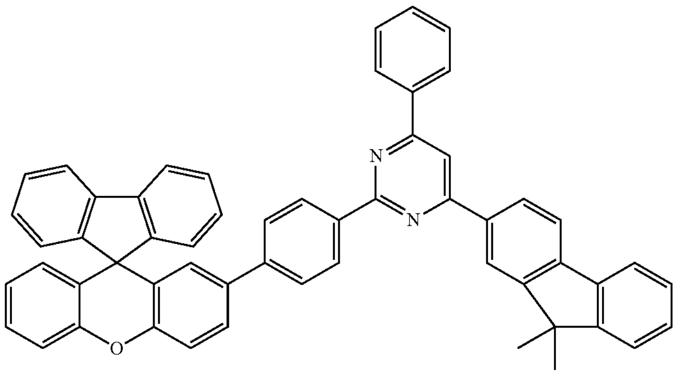
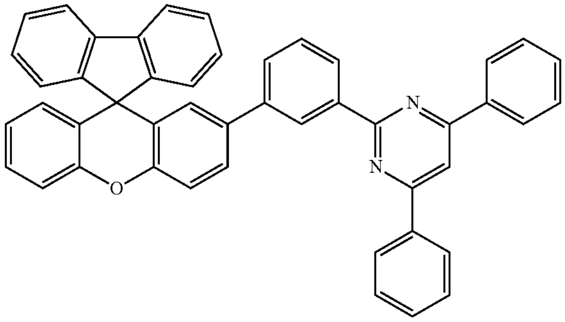
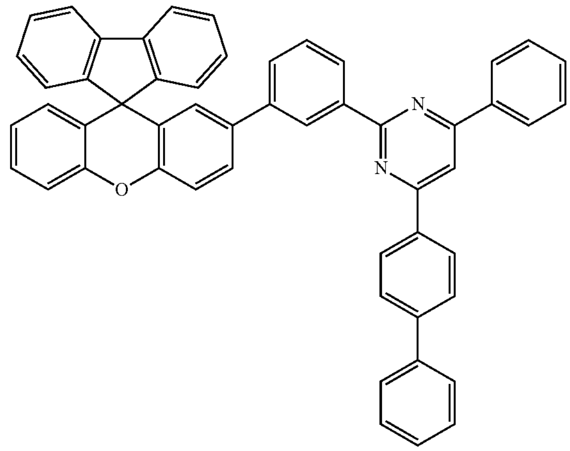
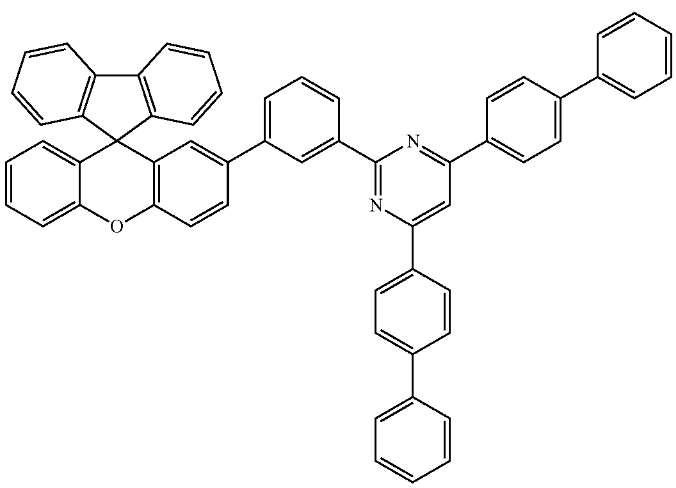
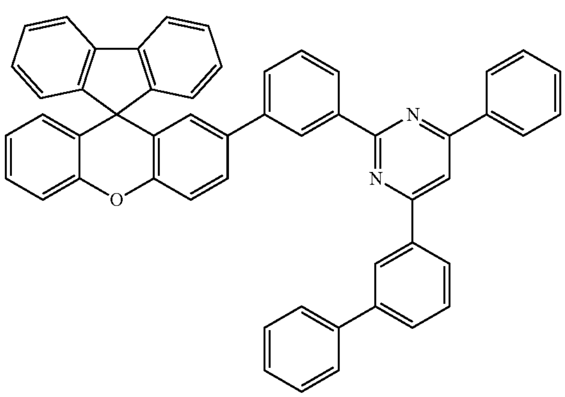
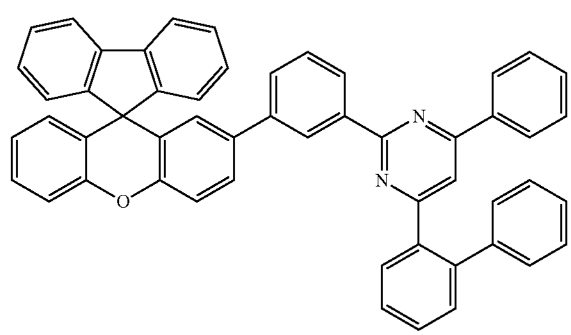

-continued
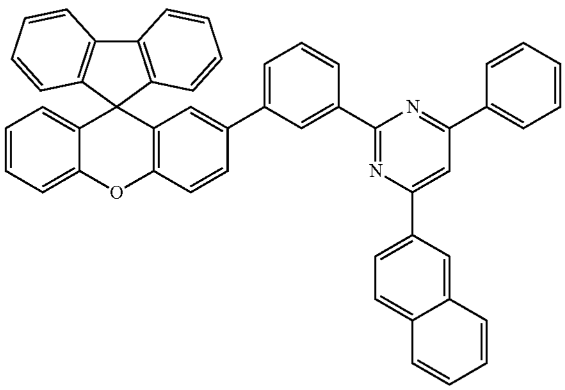
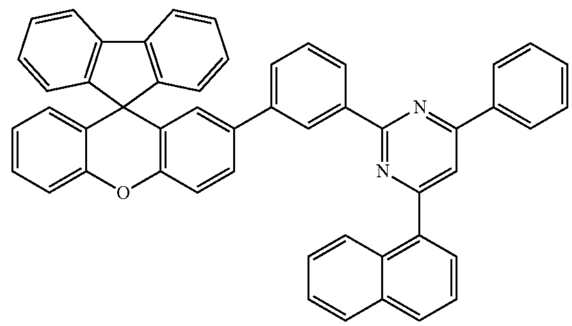
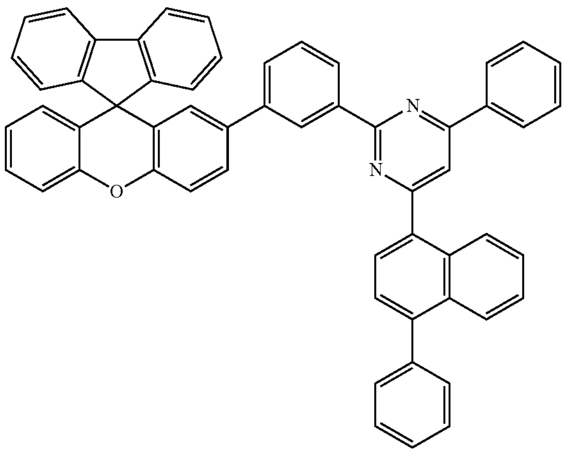
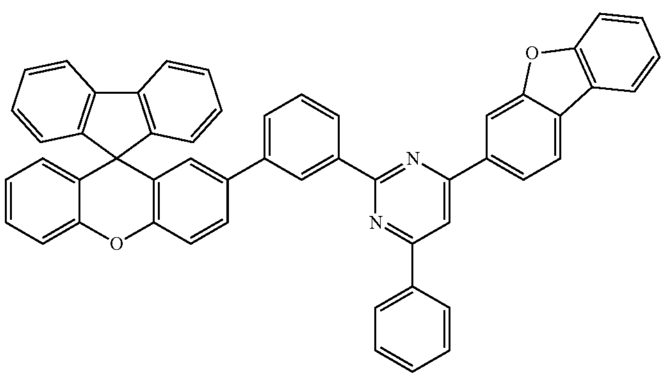
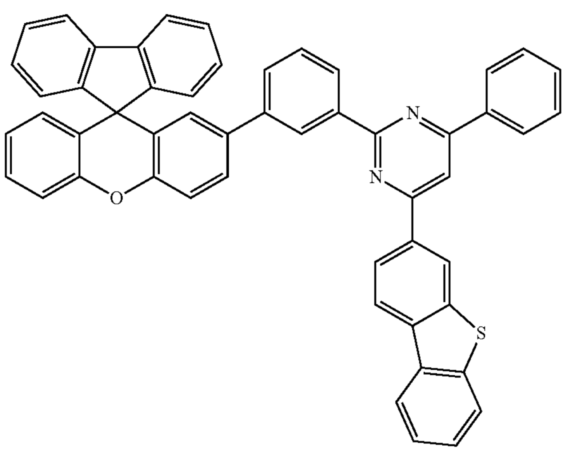
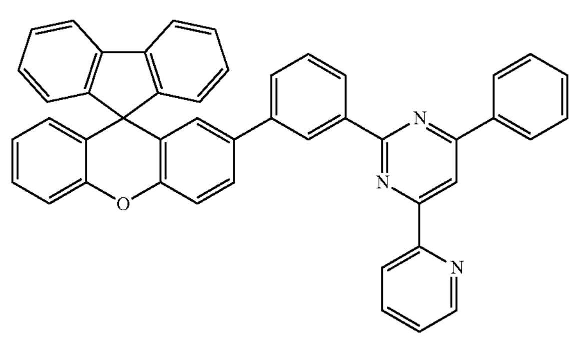

-continued
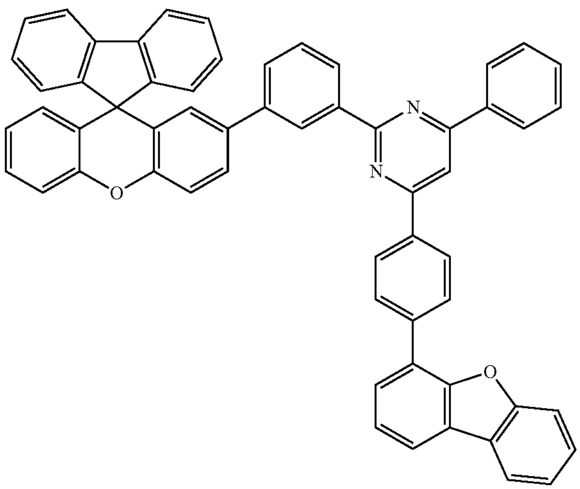
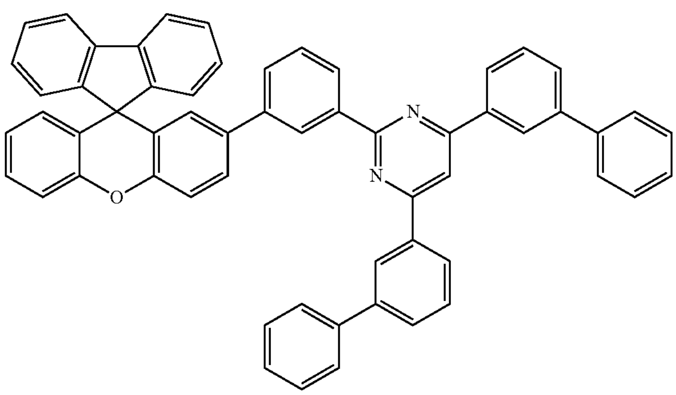
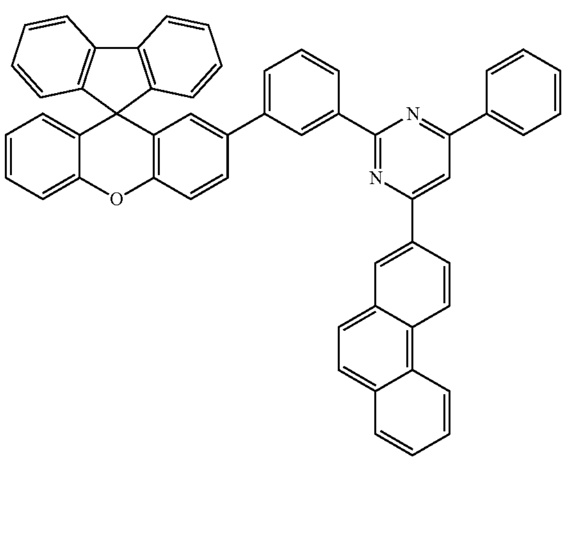
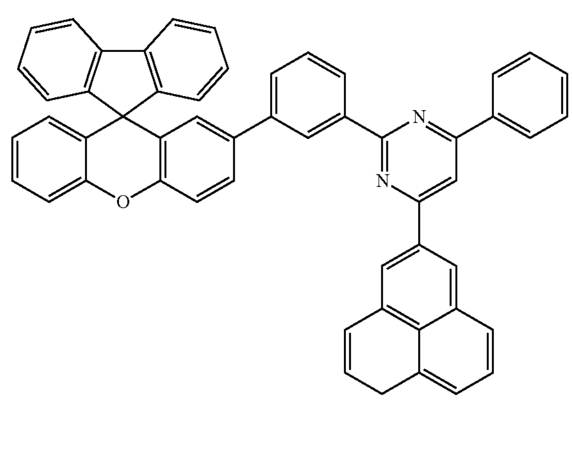

-continued
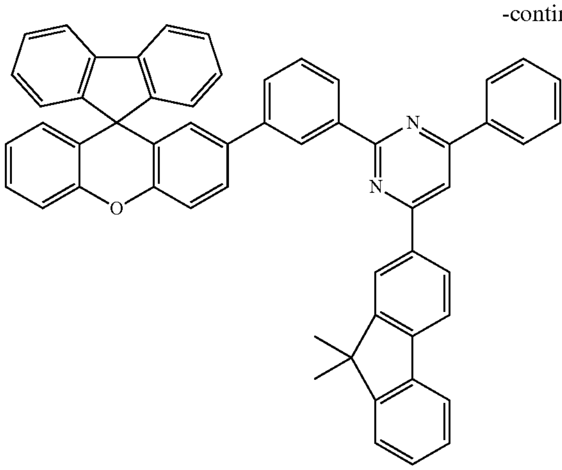
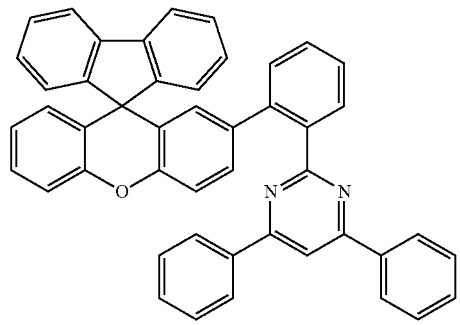
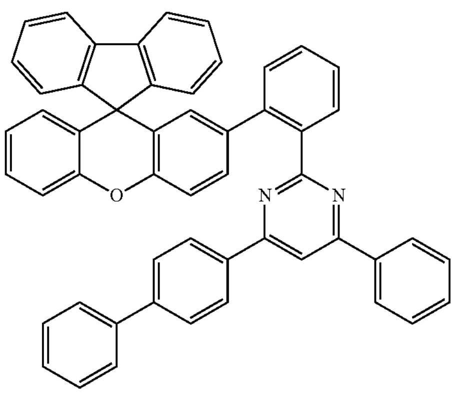
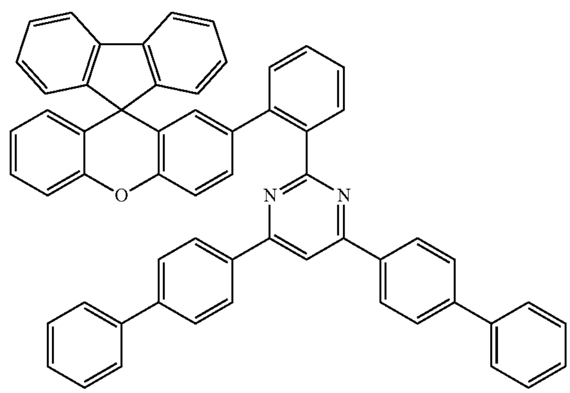
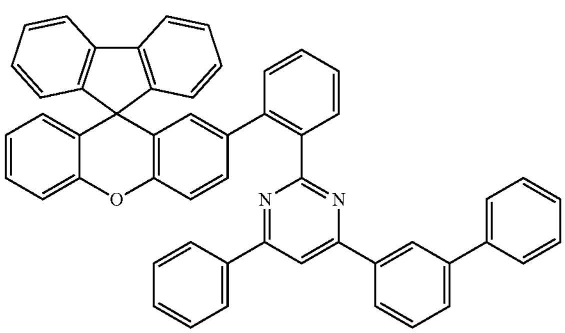
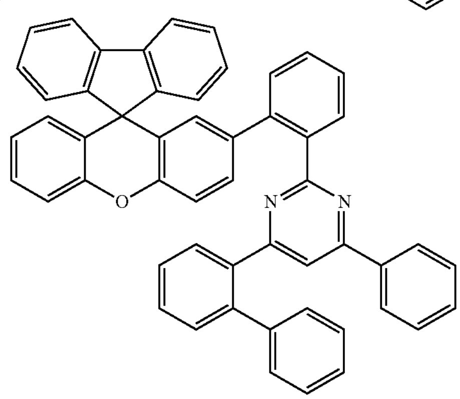
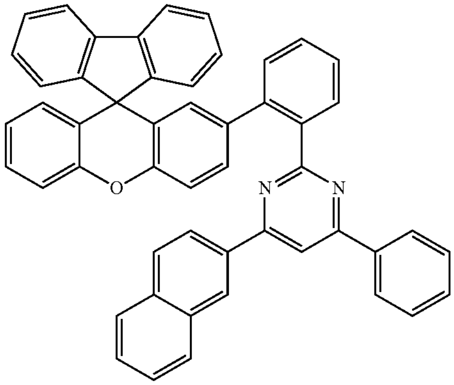
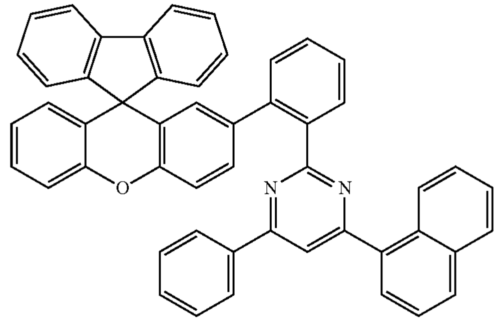

-continued
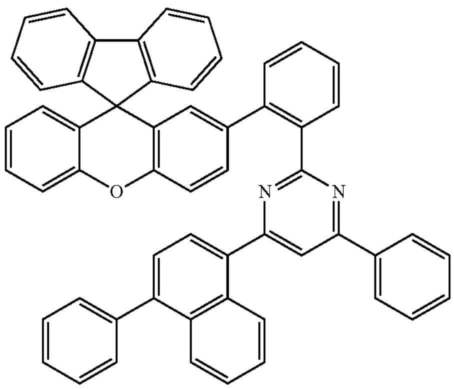
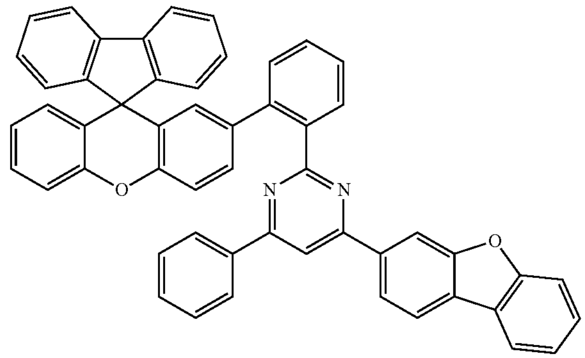
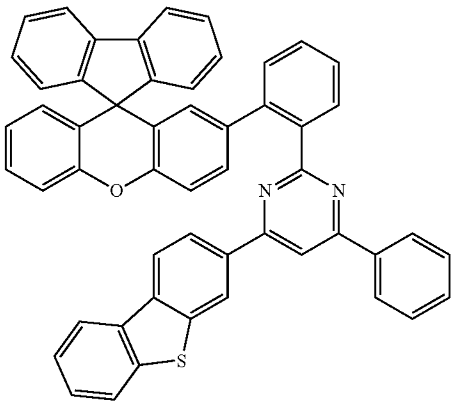
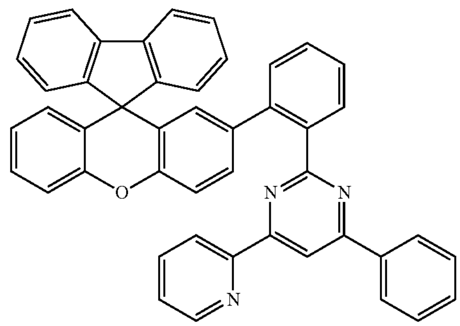
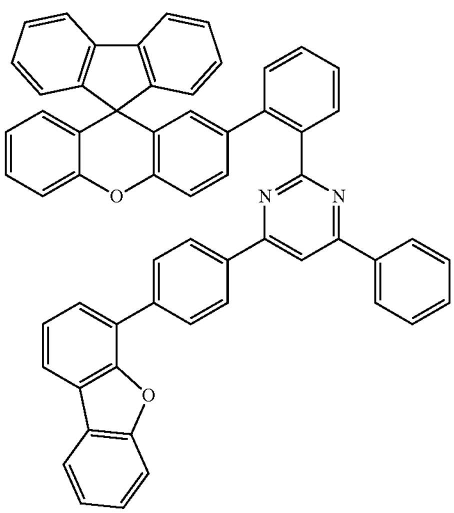
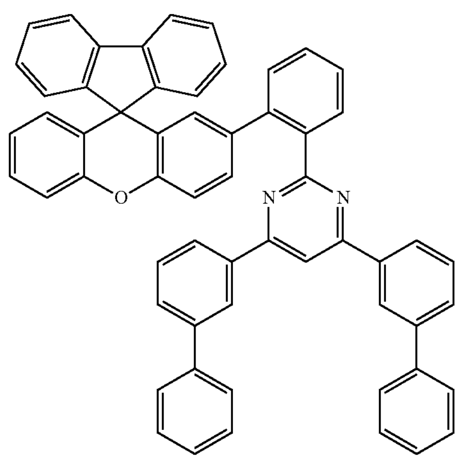
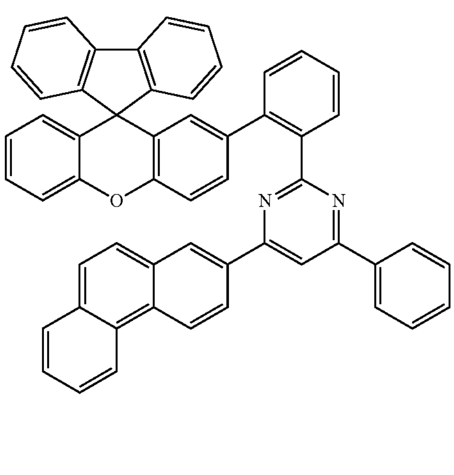
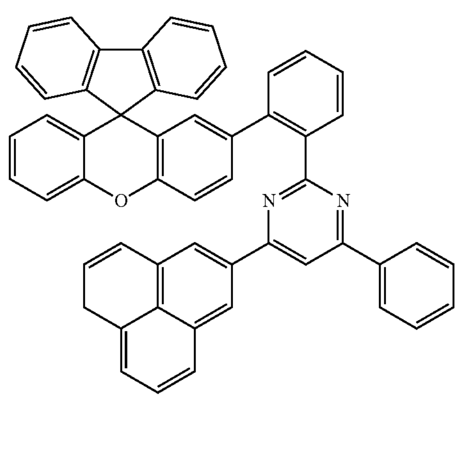

-continued
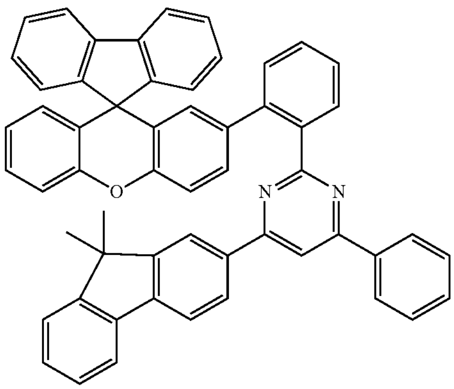
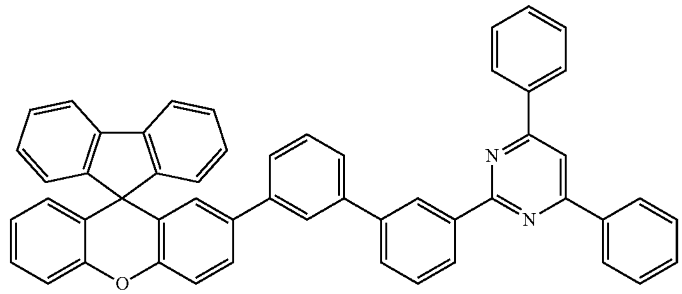
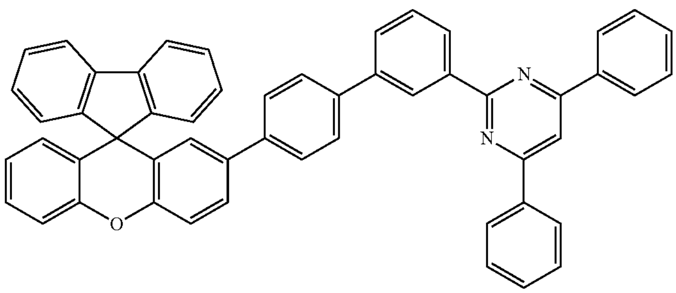
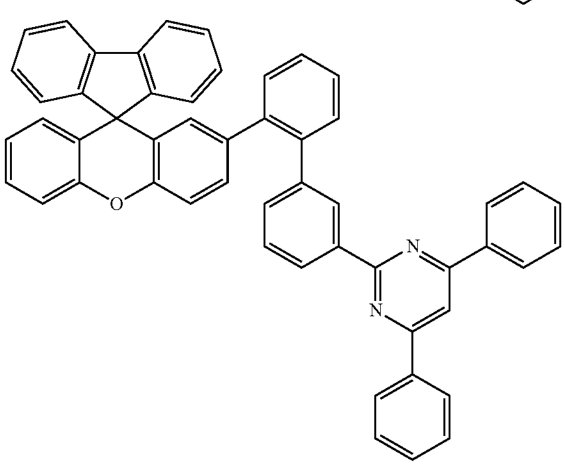
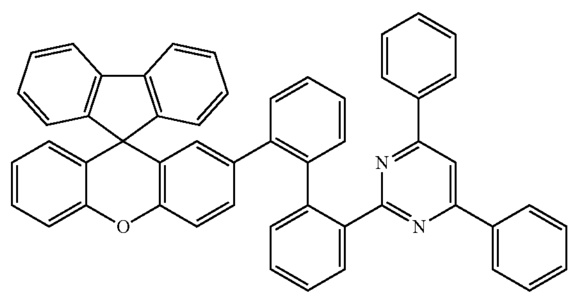
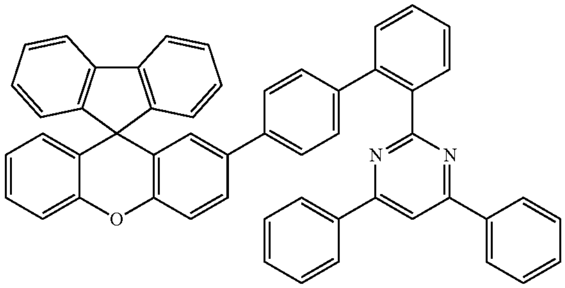
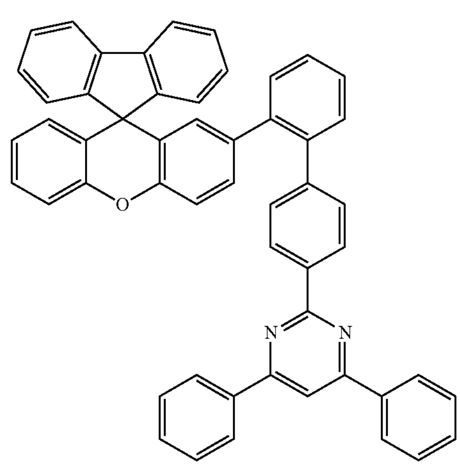

-continued
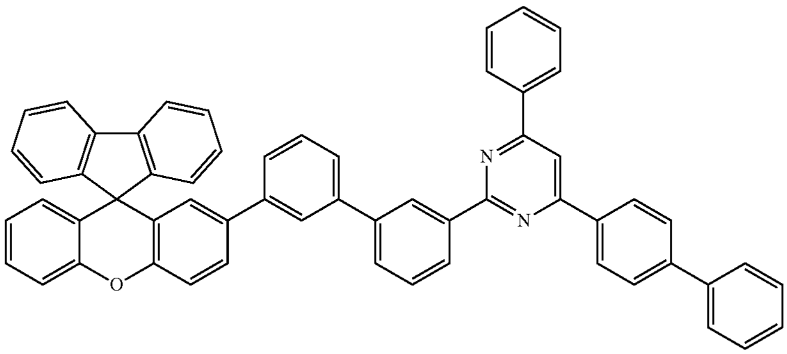
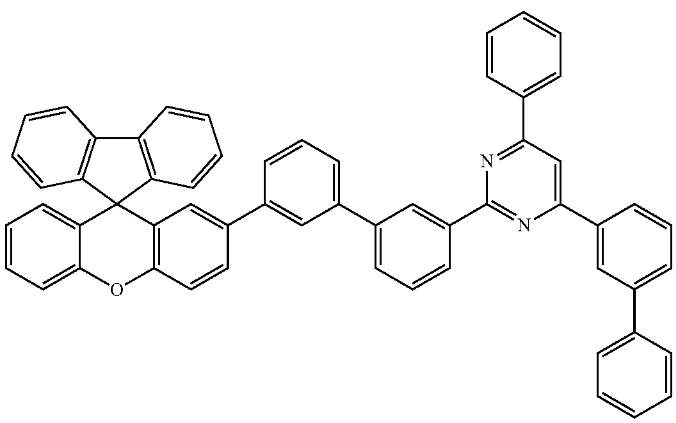
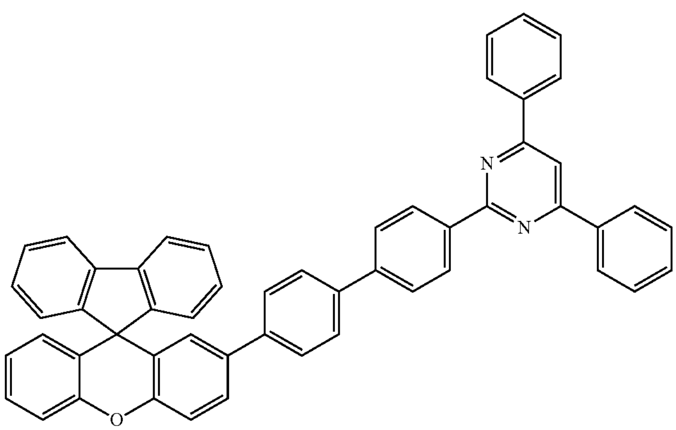
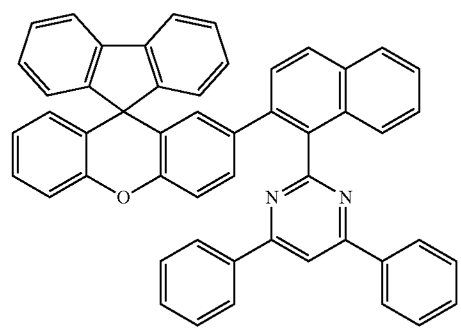
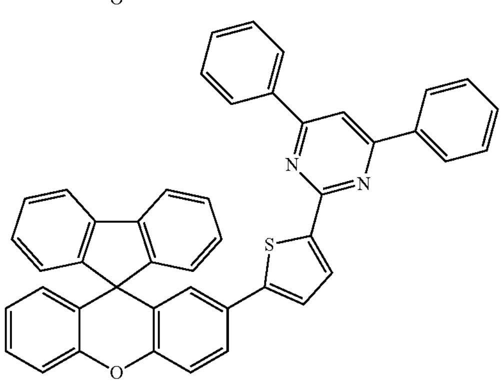
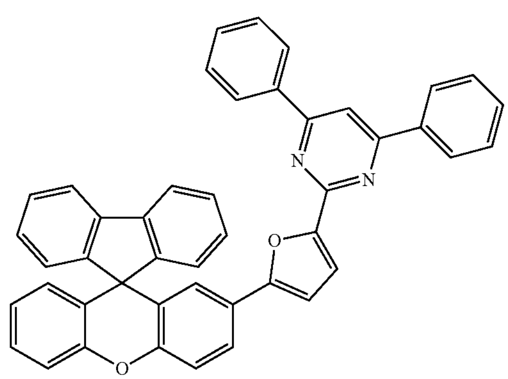

-continued
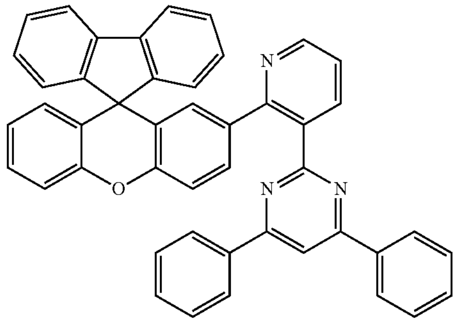
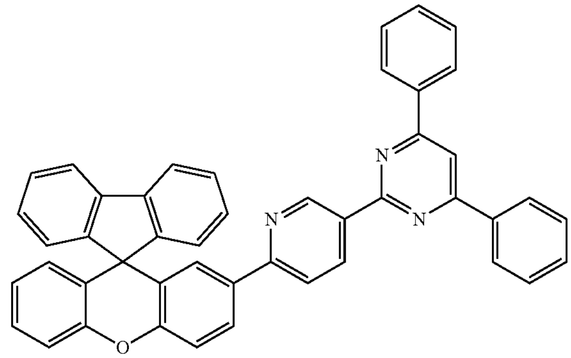
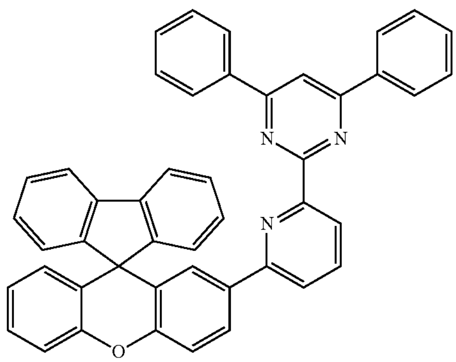
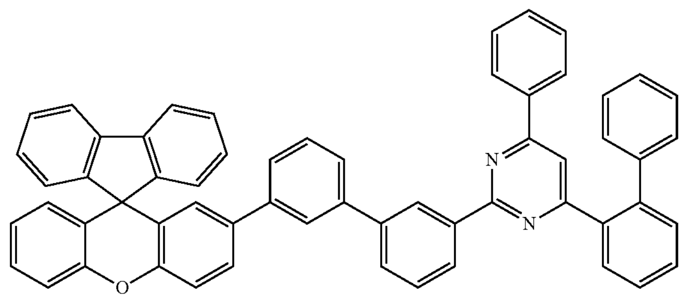
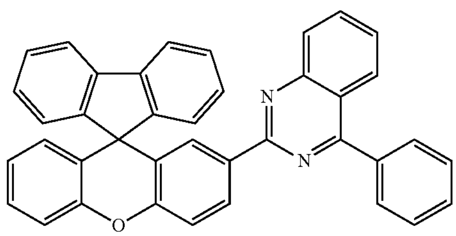
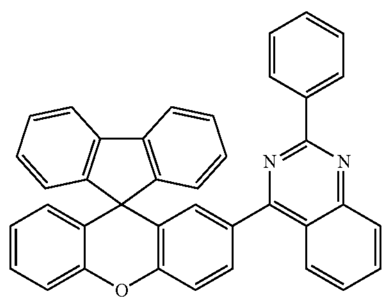
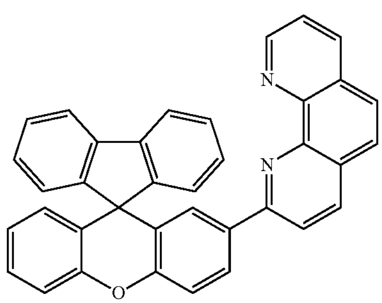
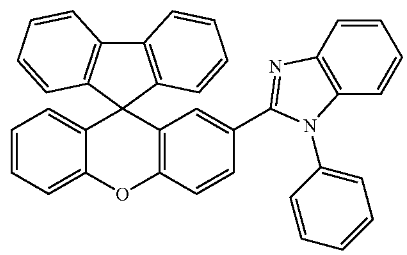
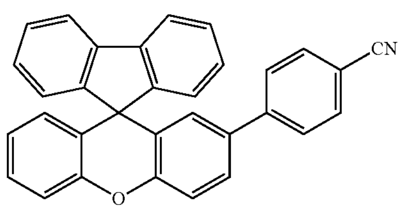
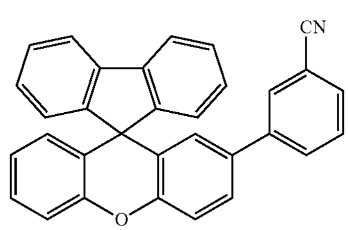
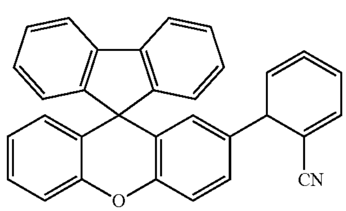
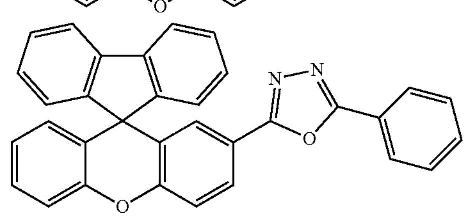

-continued
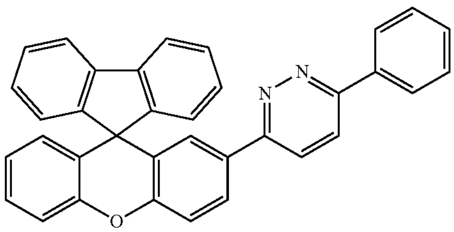
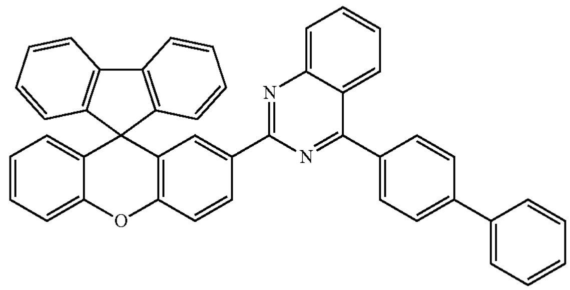
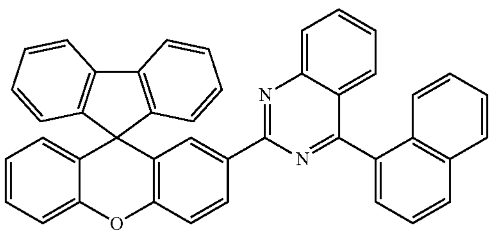
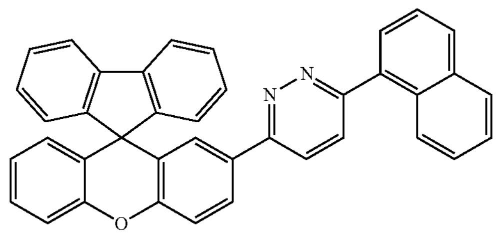
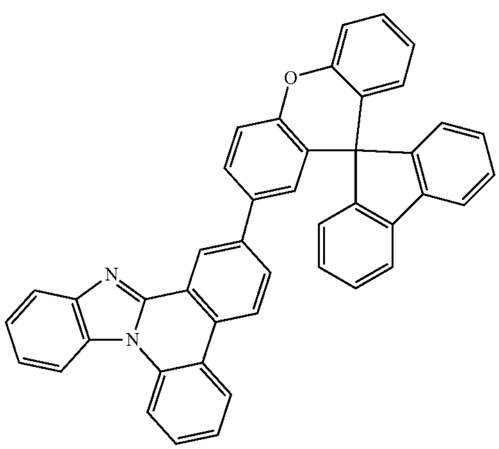
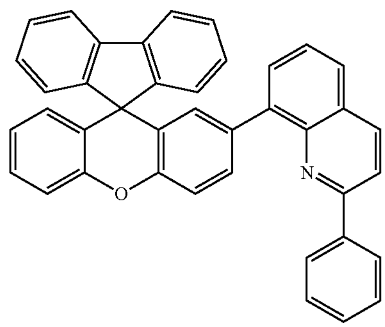
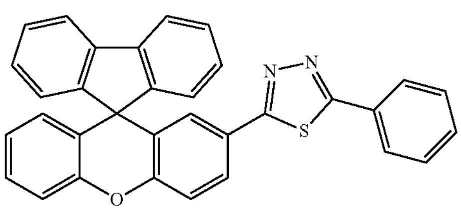
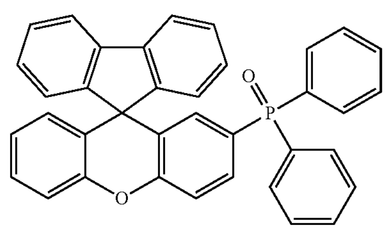
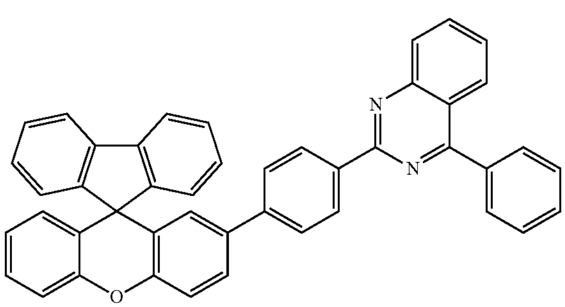
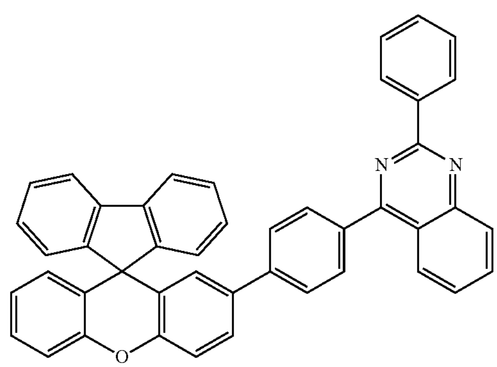

-continued
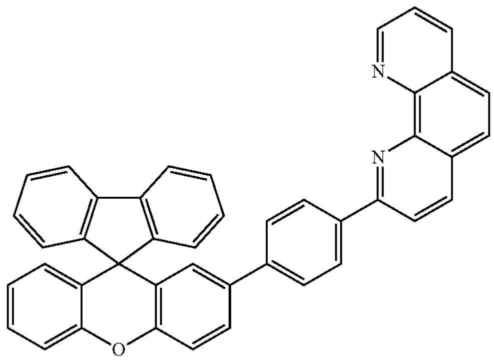
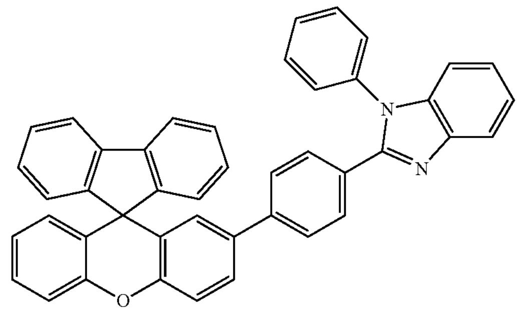
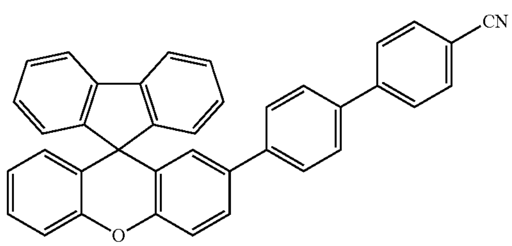
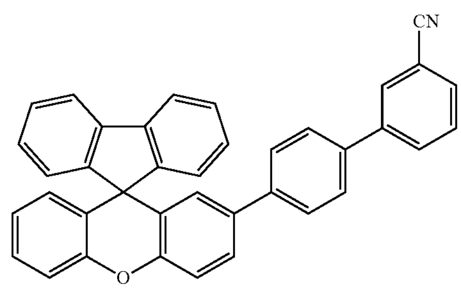
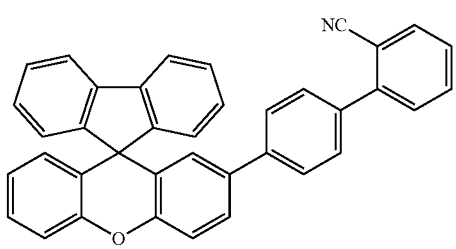
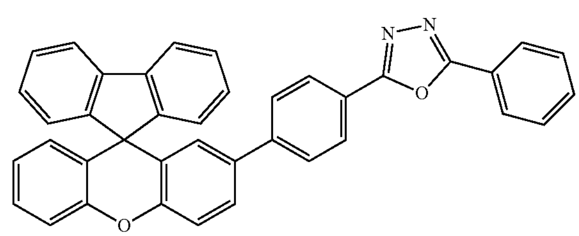
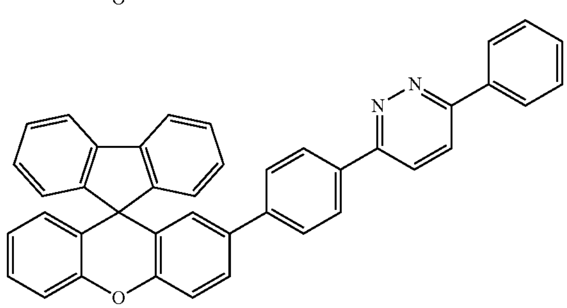
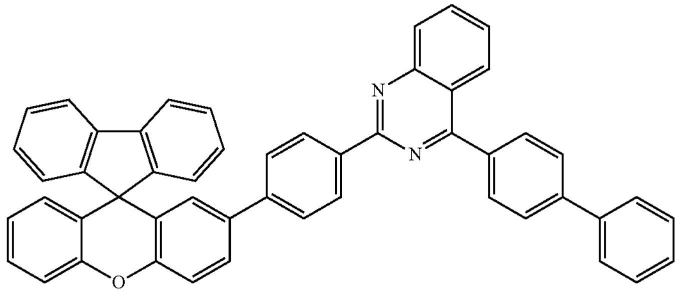

-continued
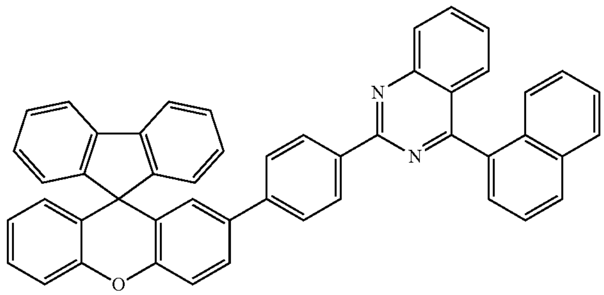
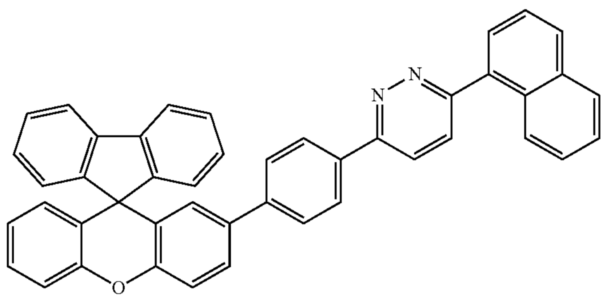
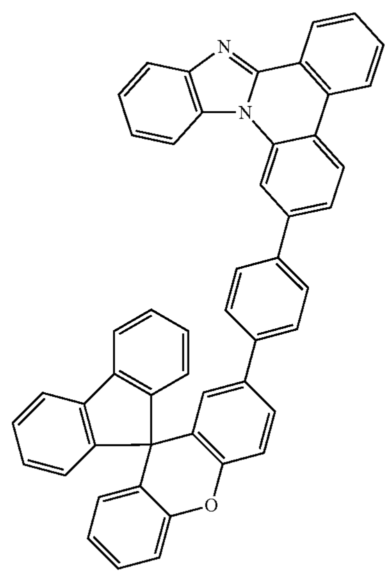
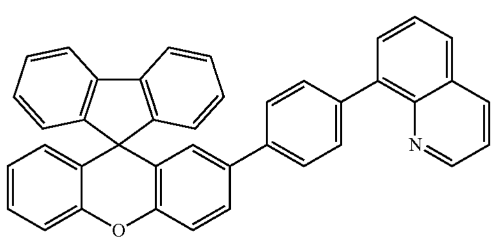
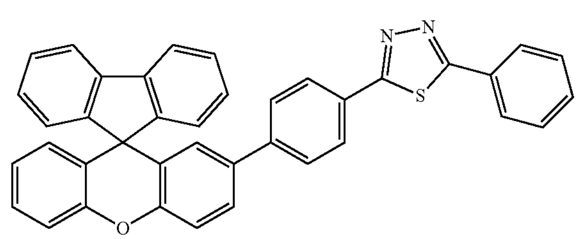
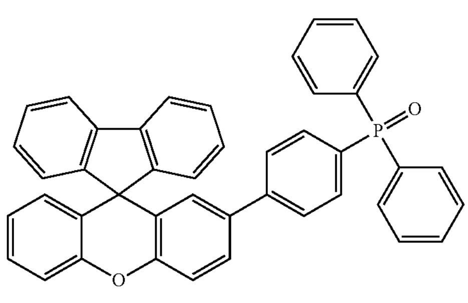
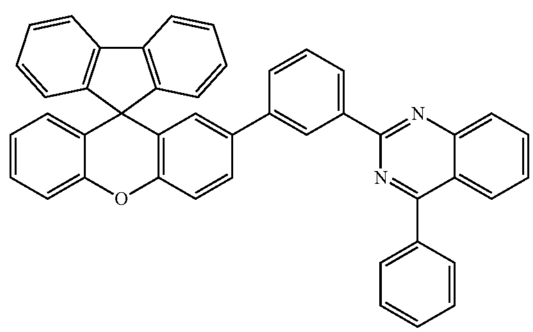

-continued
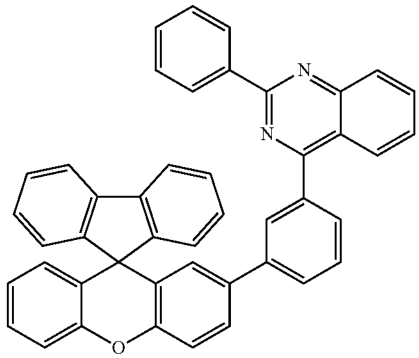
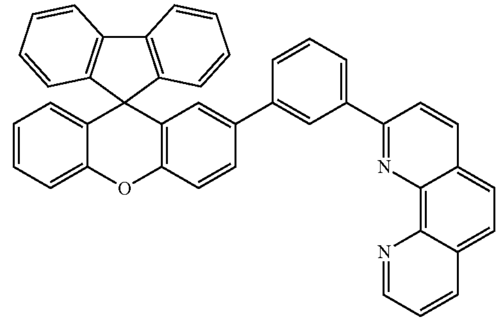
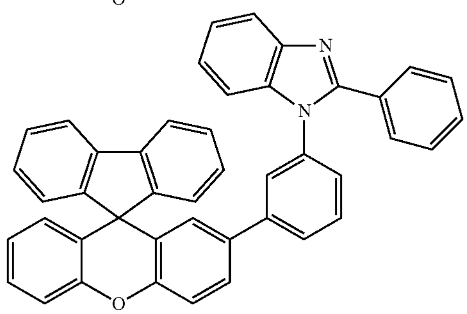
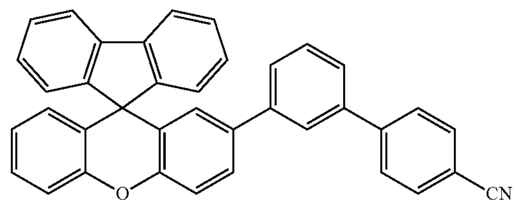
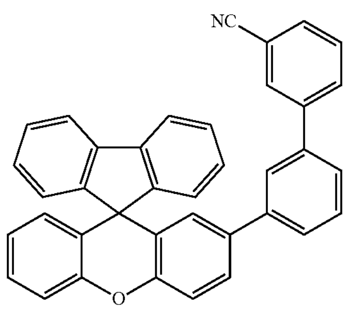
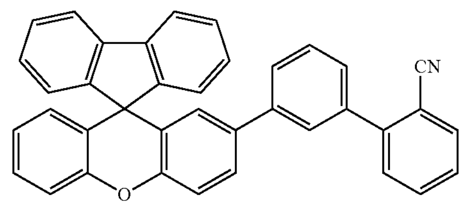
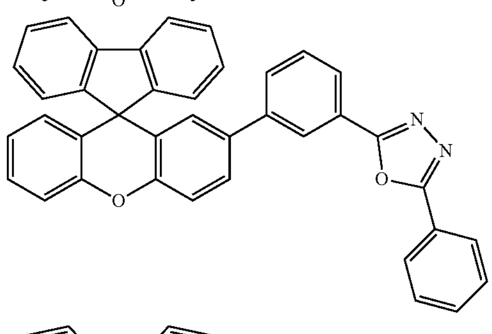
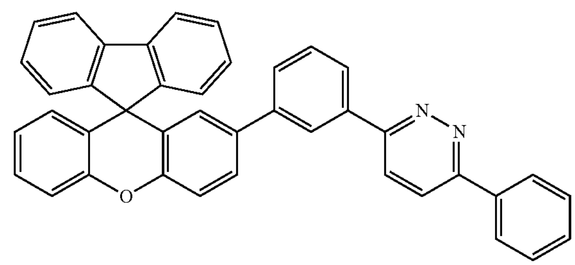
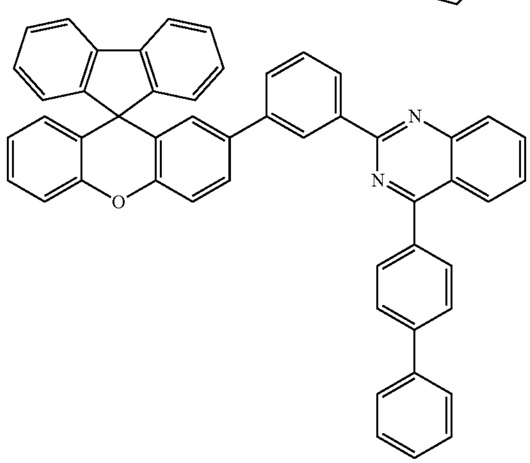
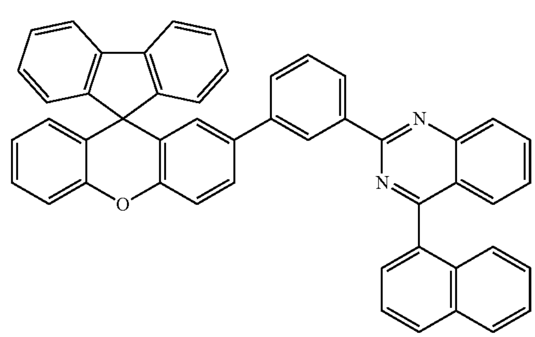

-continued
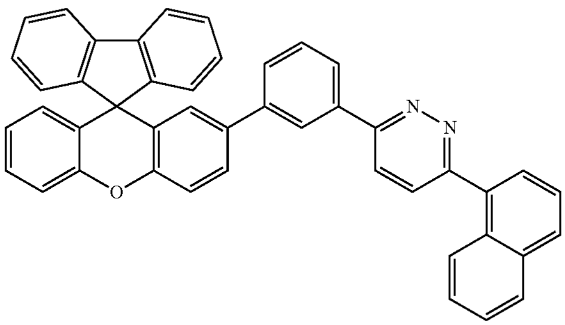
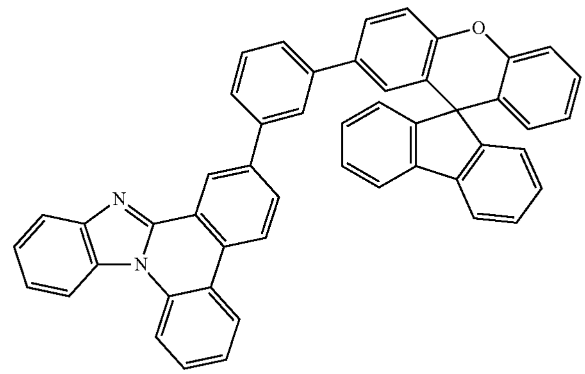
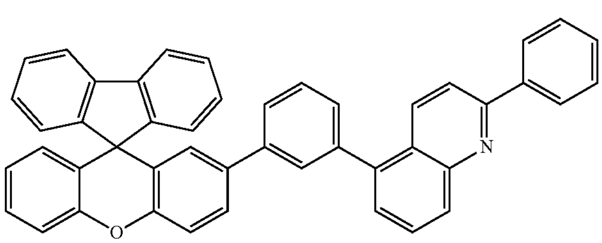
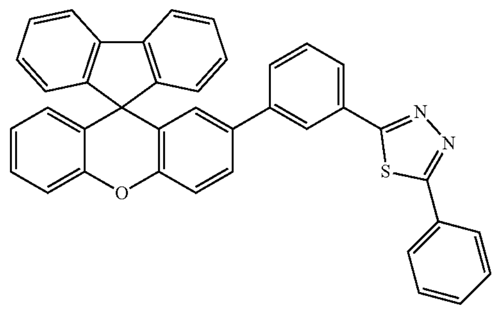
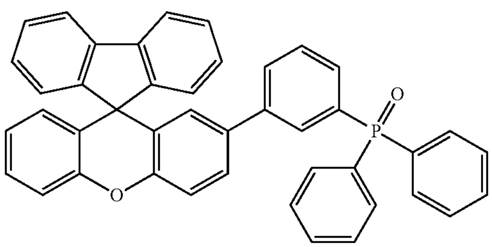
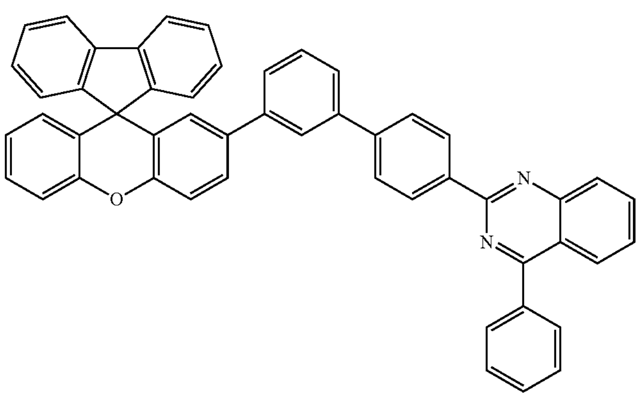
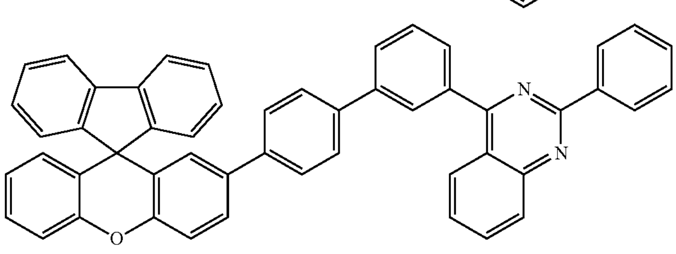

-continued
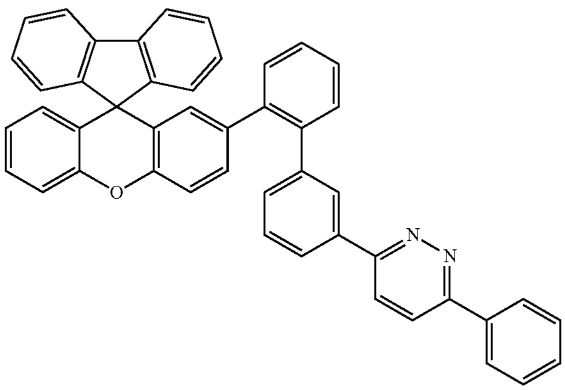
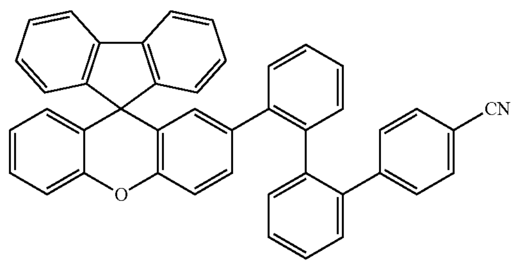
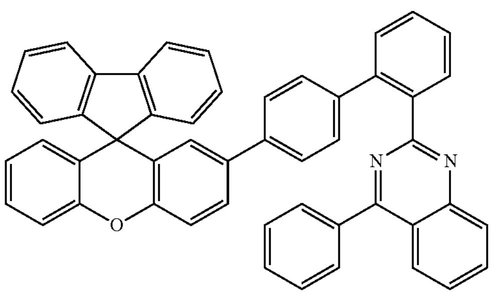
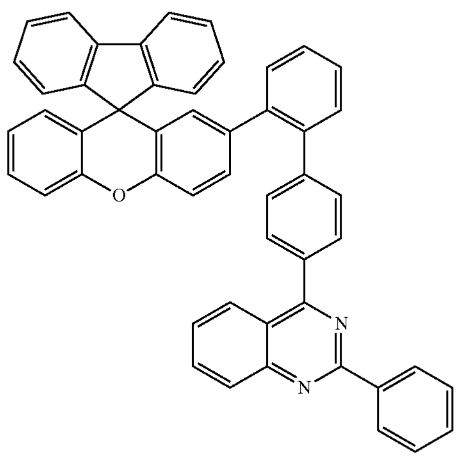
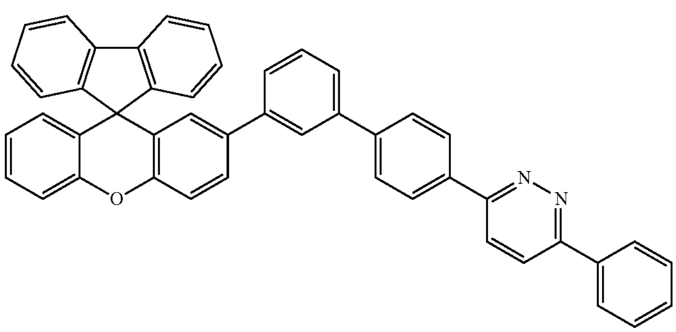
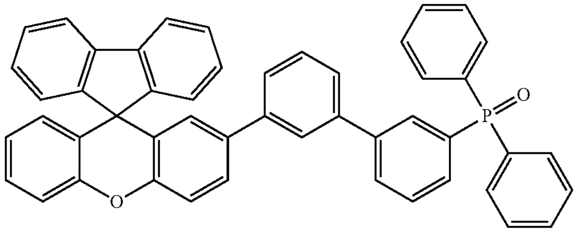

-continued
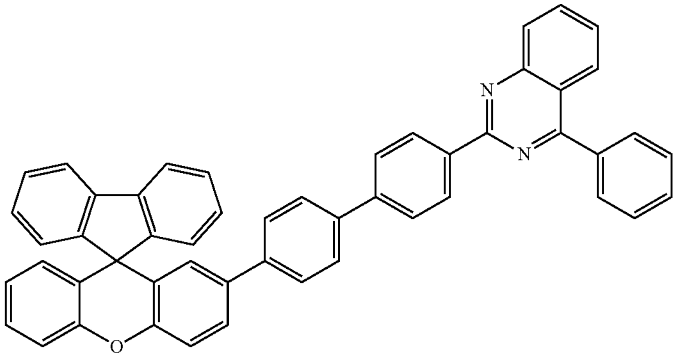
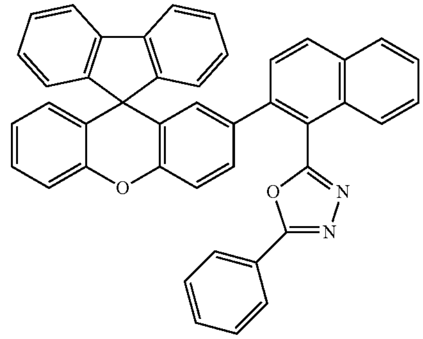
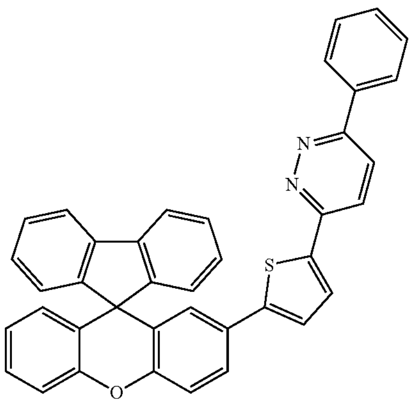
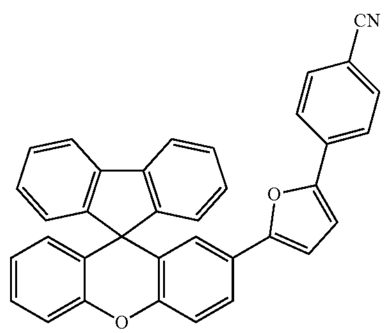
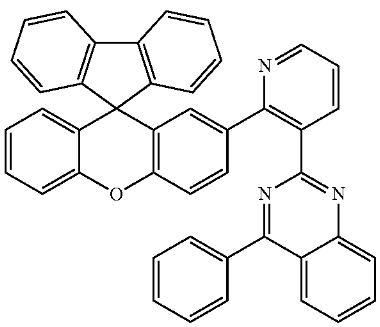
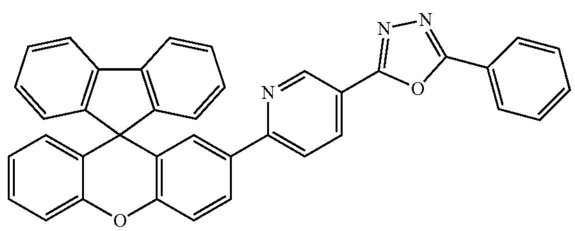
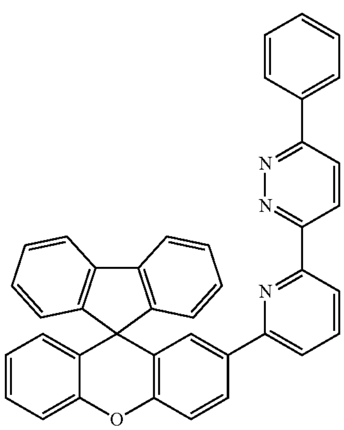
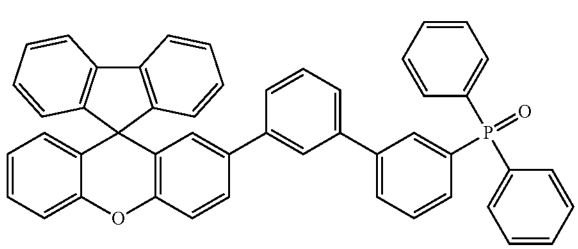

-continued
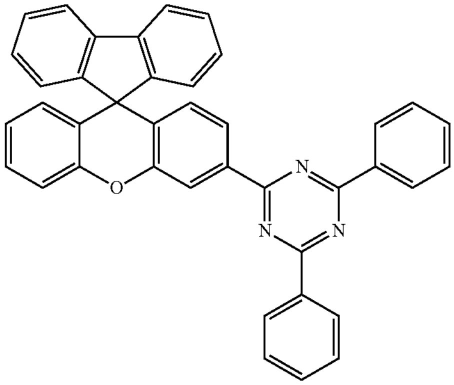
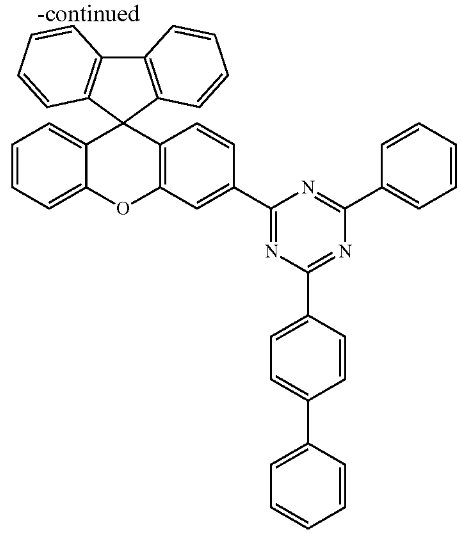
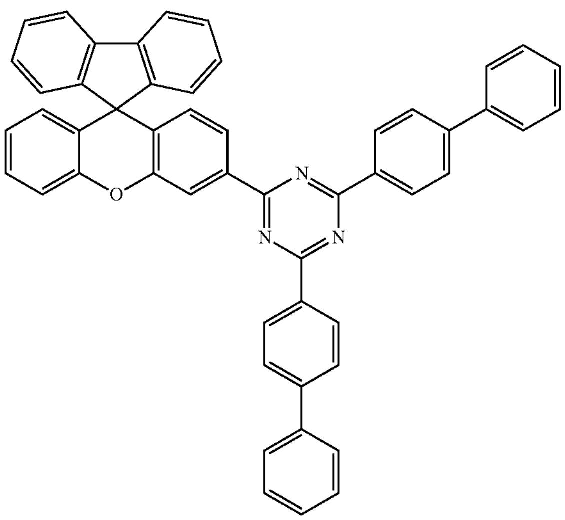
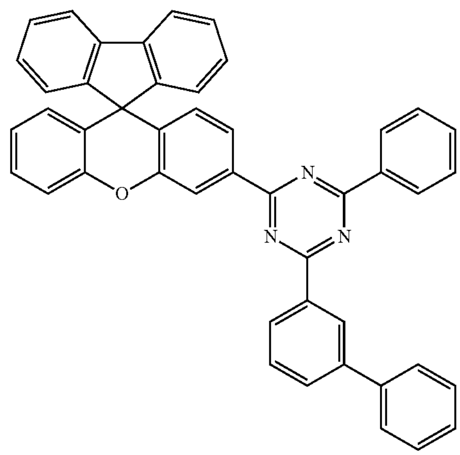
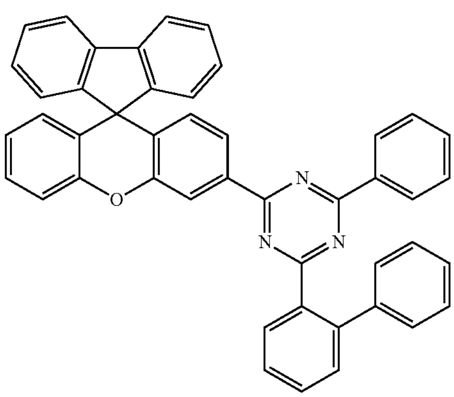
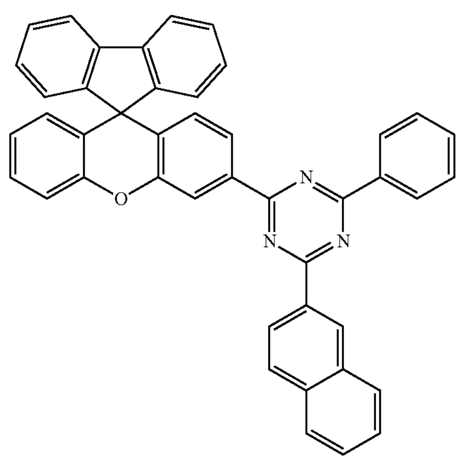

-continued
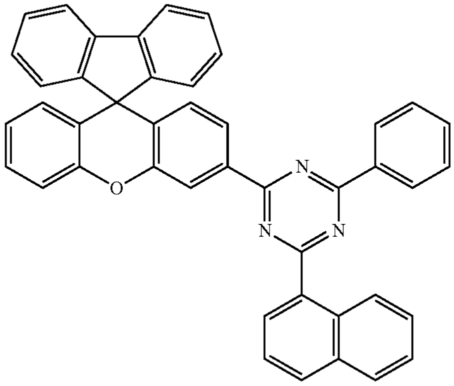
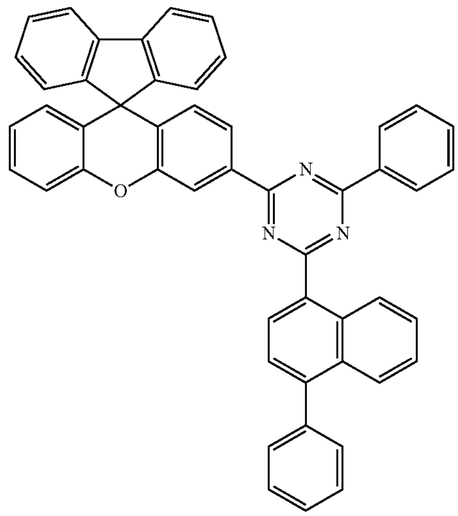
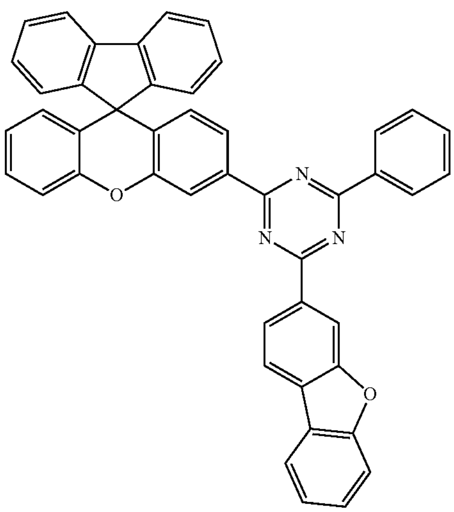
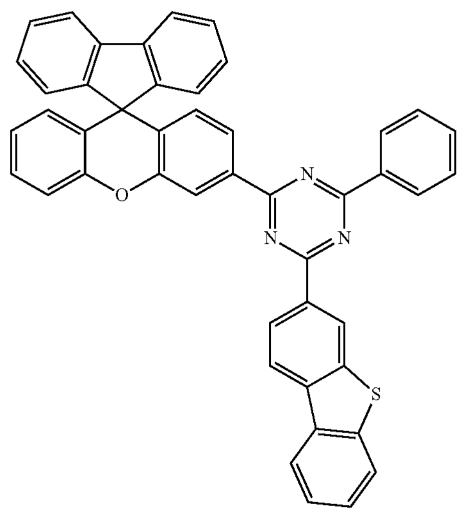
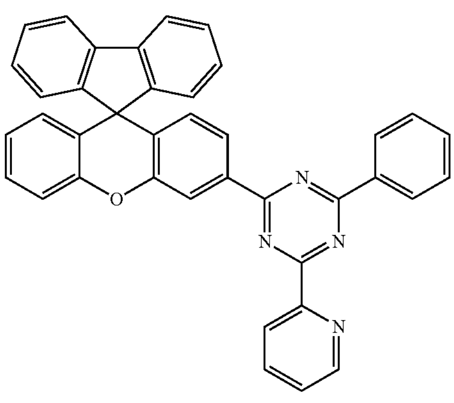
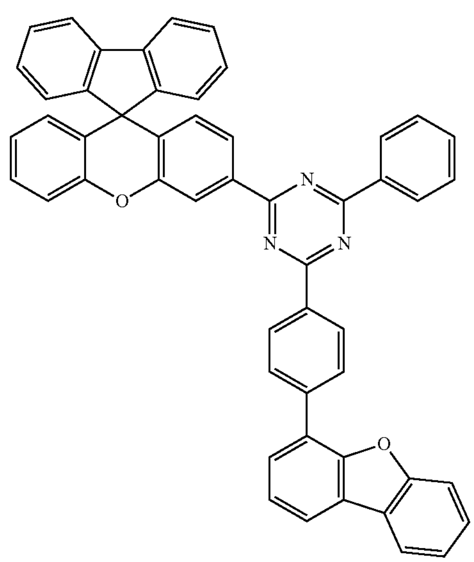

-continued
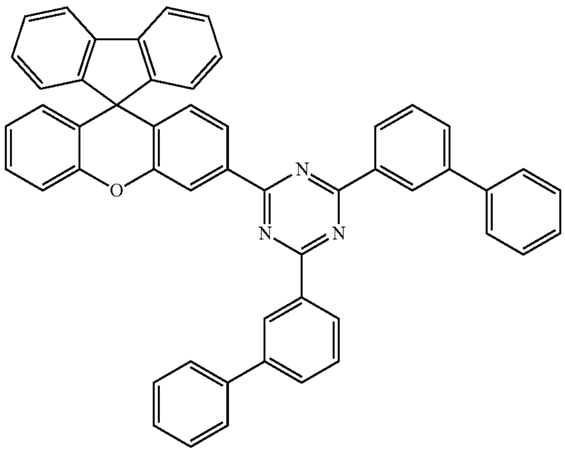
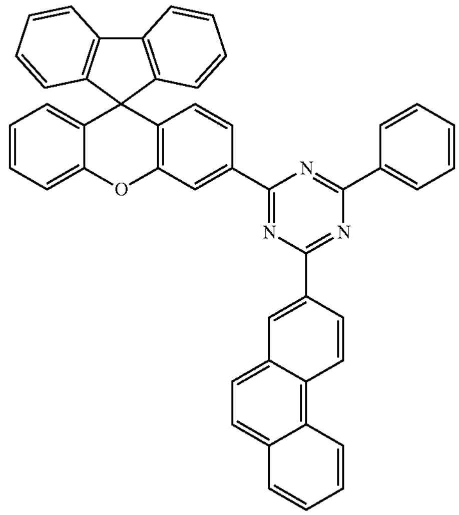
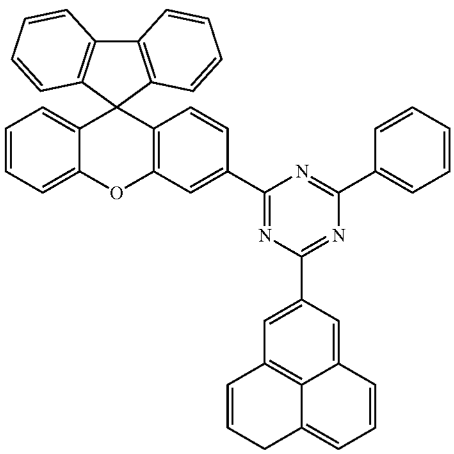
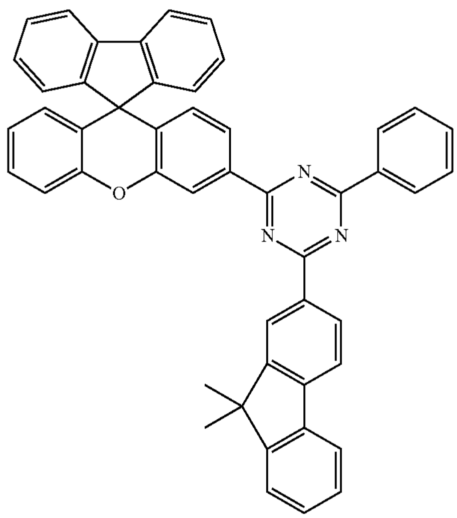
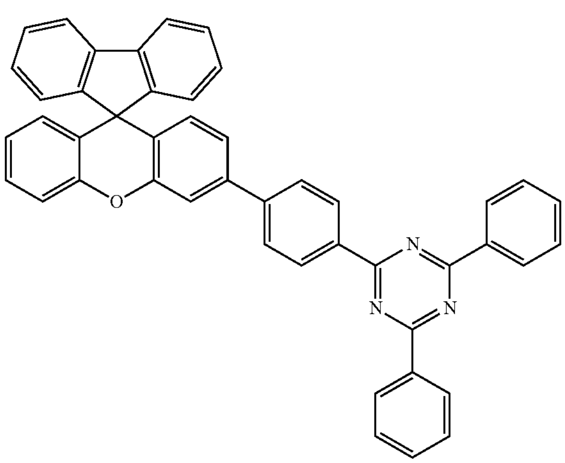
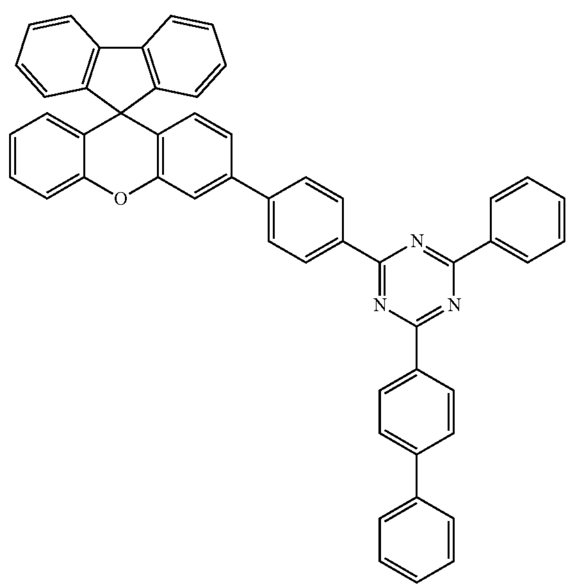

-continued
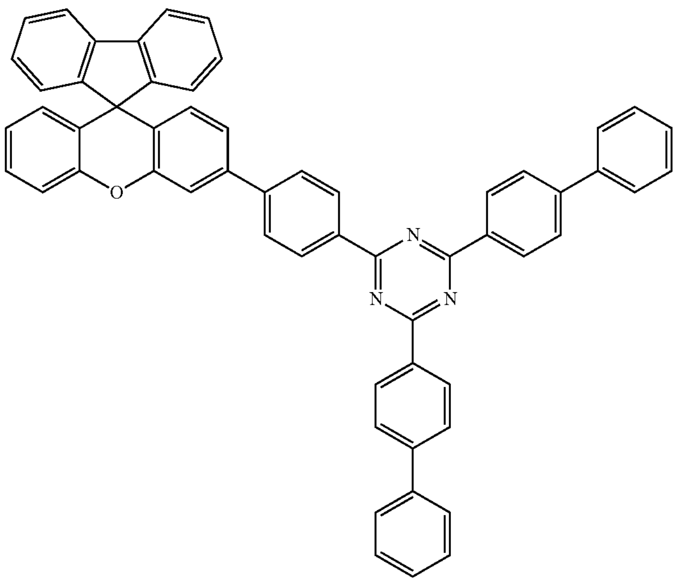
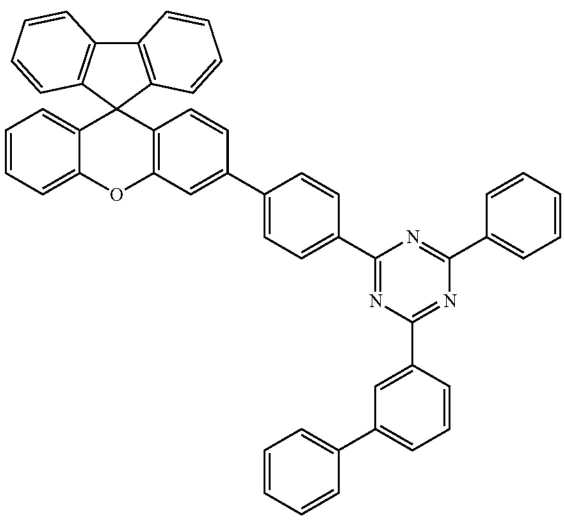
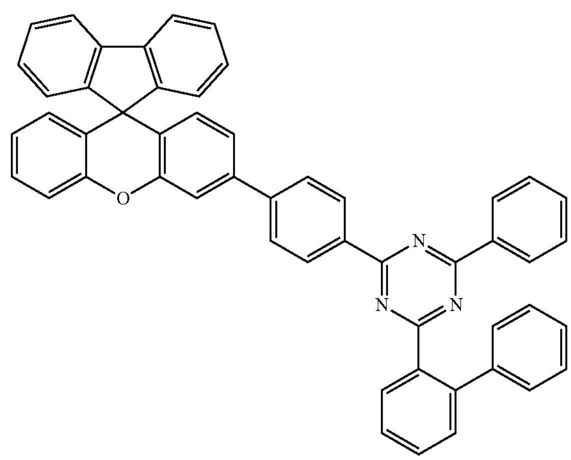
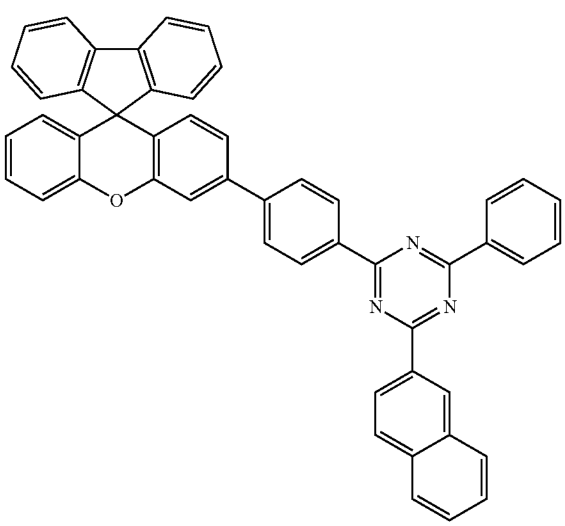
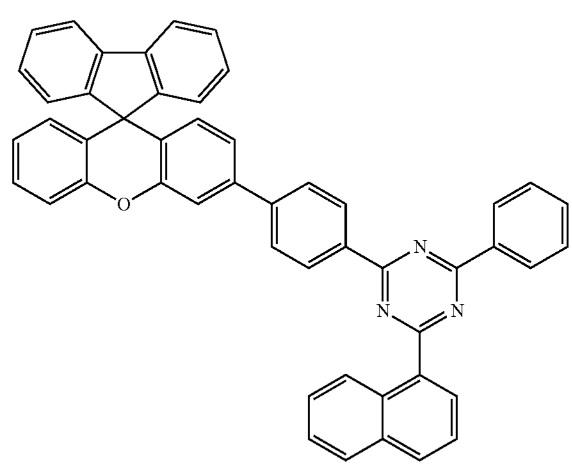

-continued
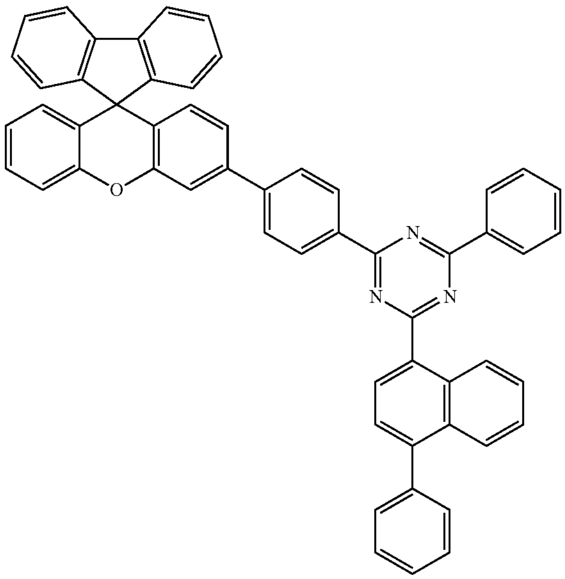
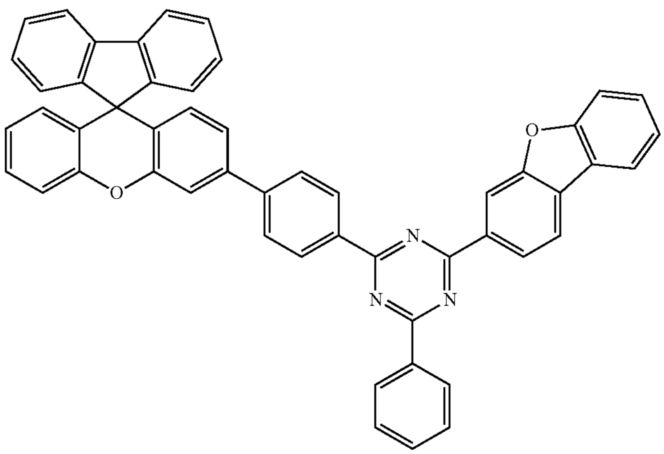
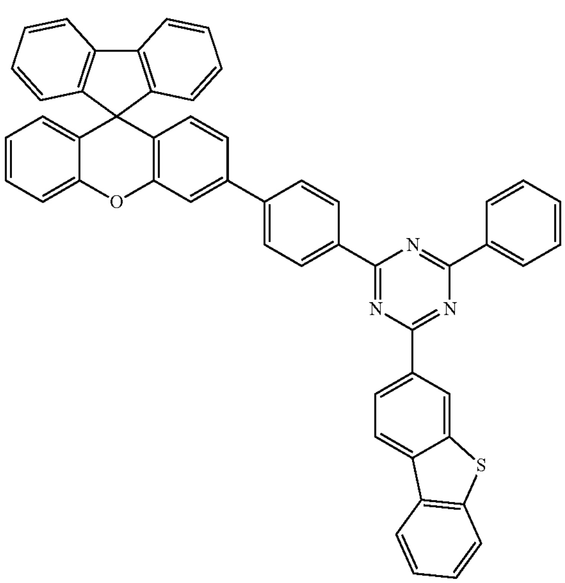
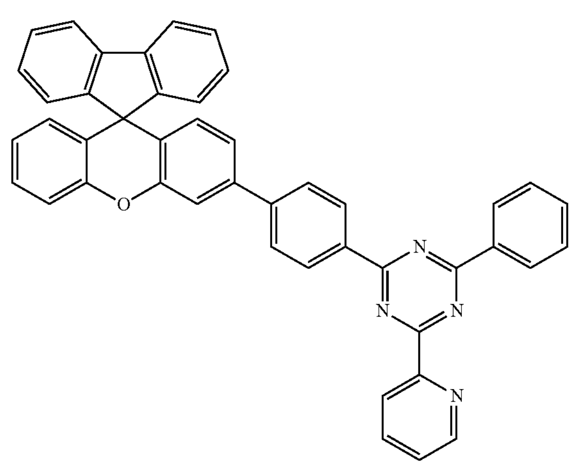

-continued
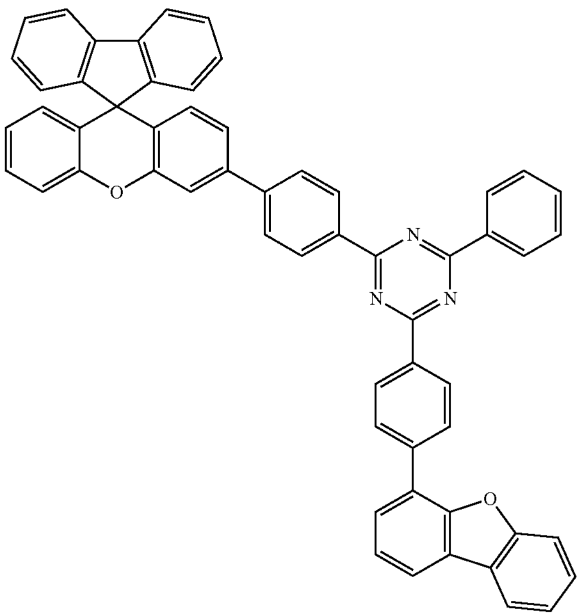
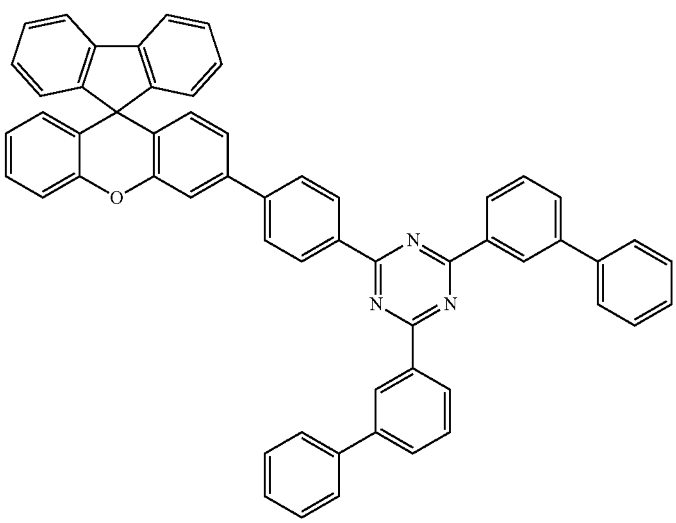
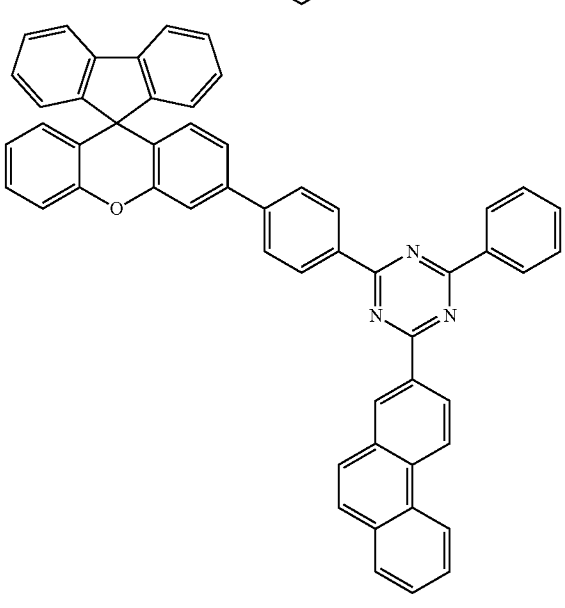
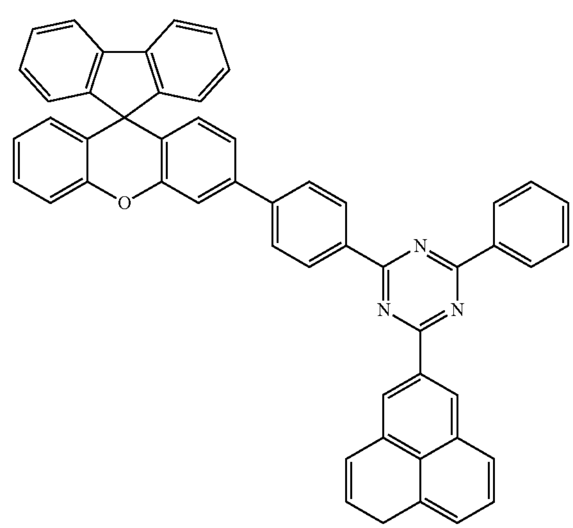

-continued
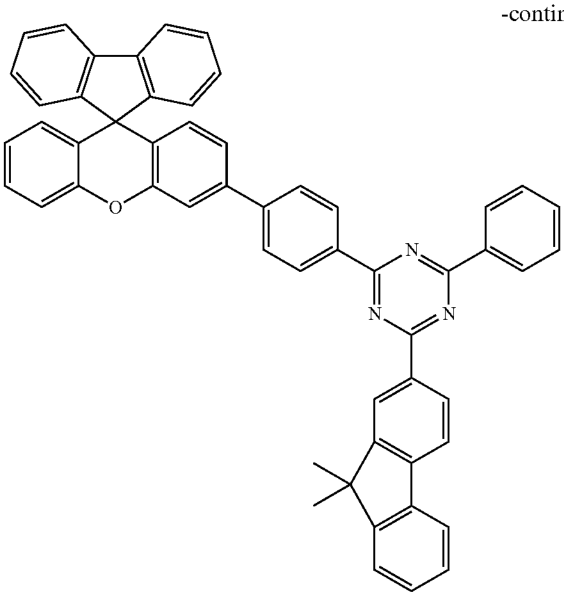
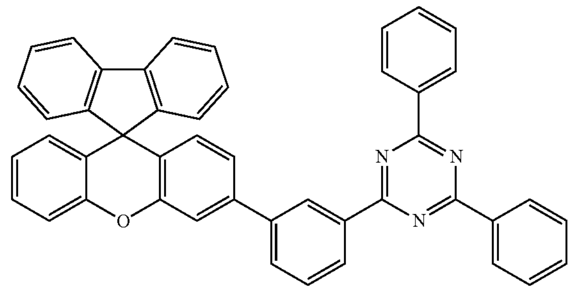
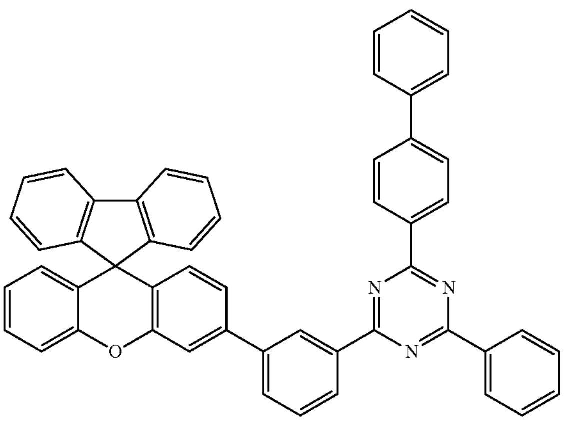
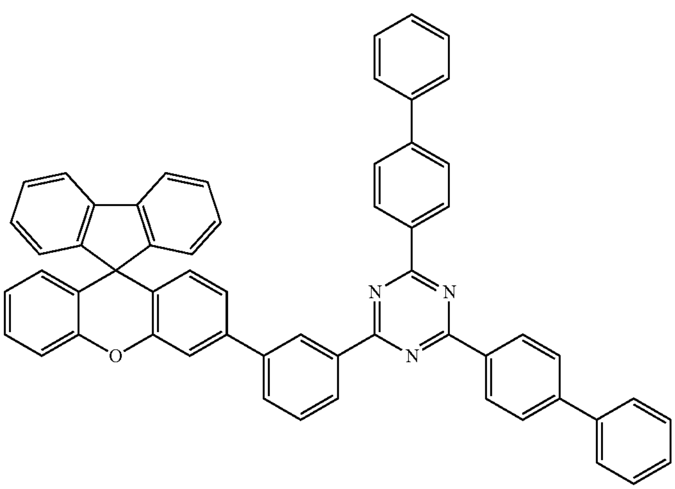
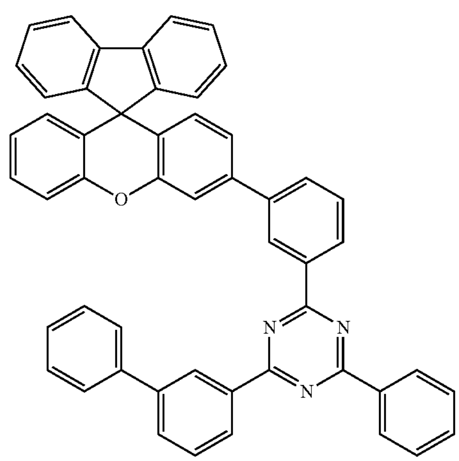

-continued
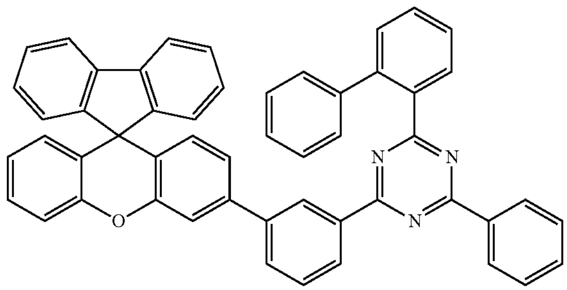
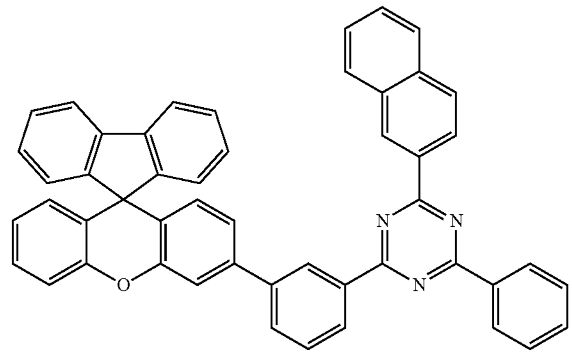
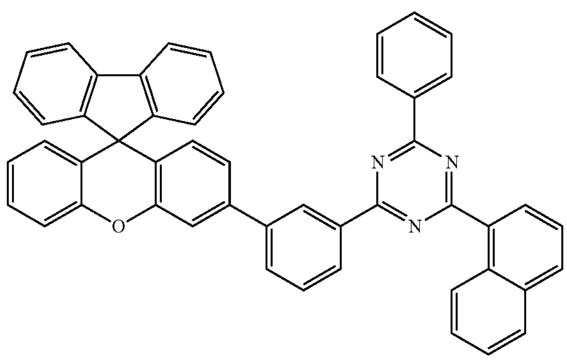
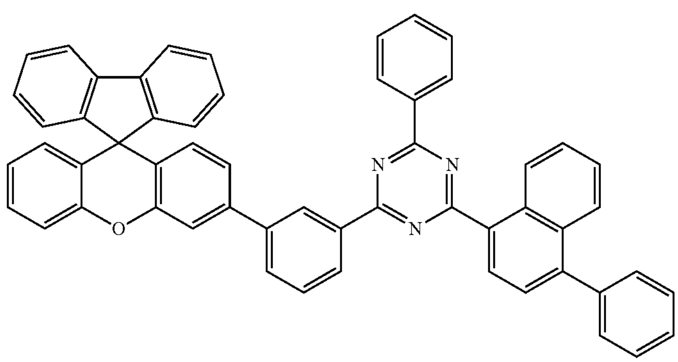
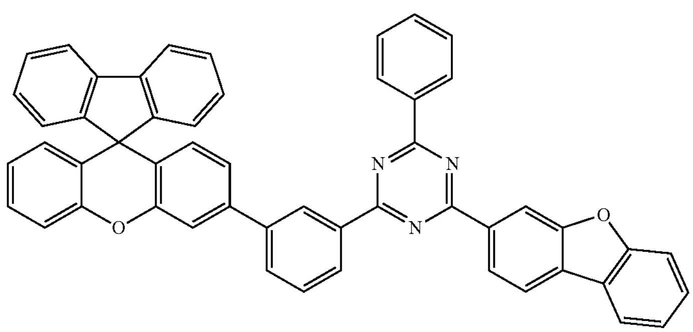

-continued
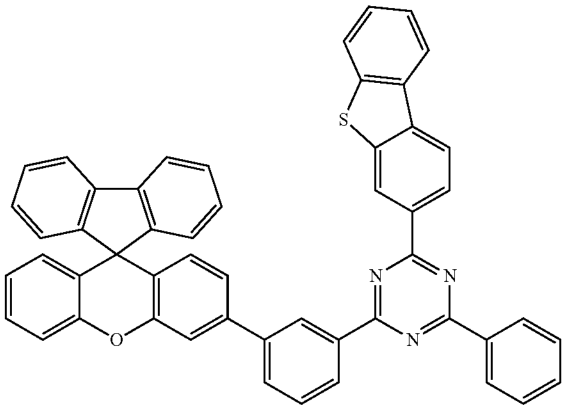
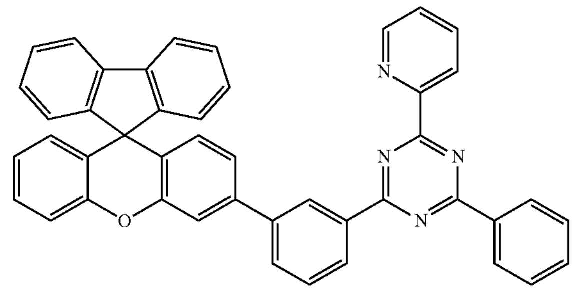
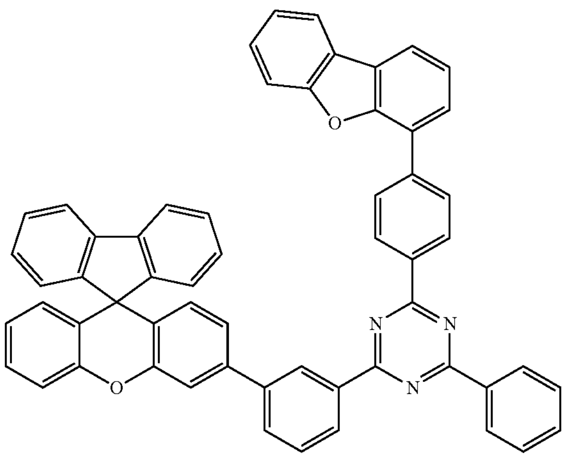
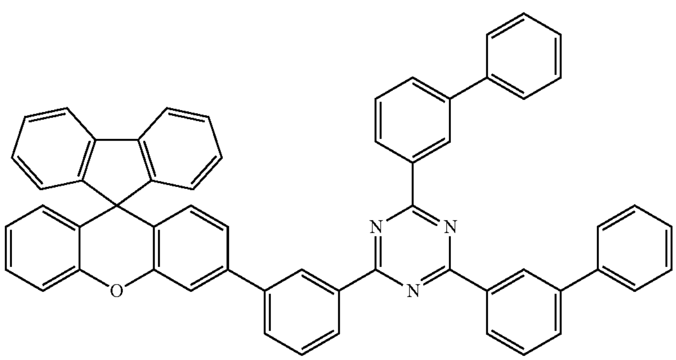
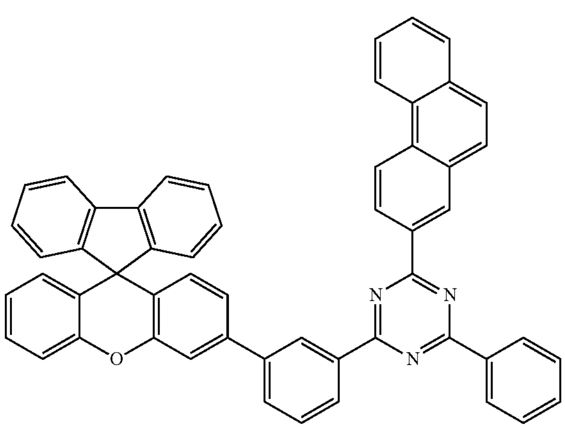
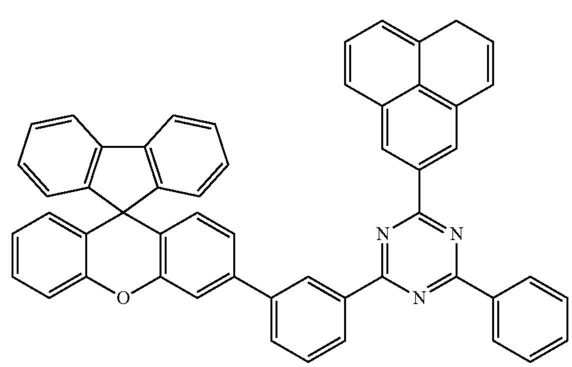

-continued
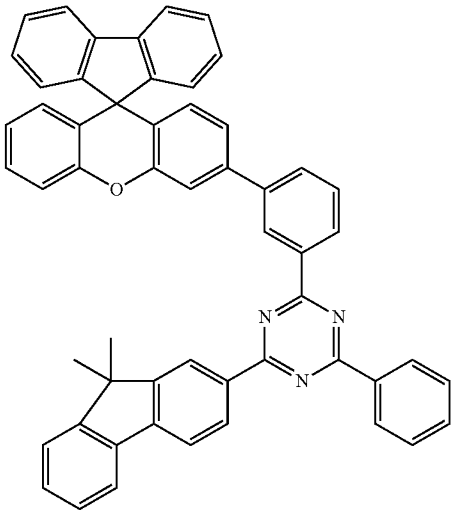
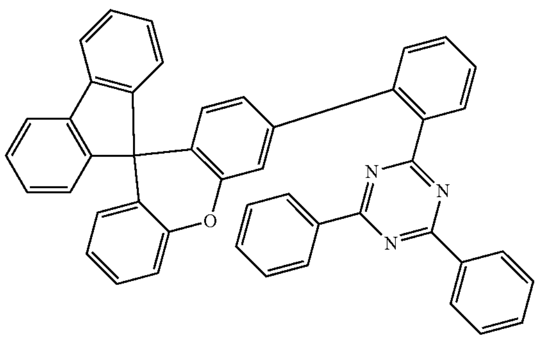
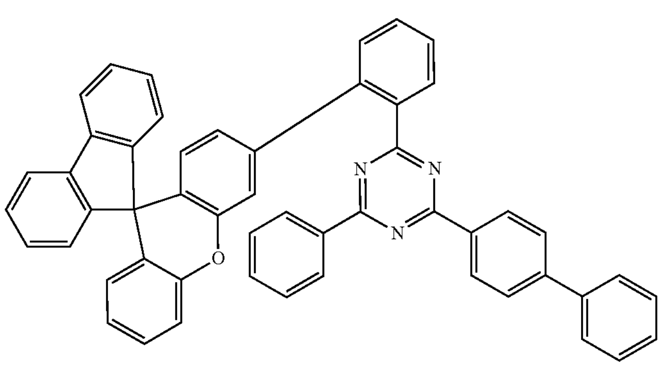

-continued
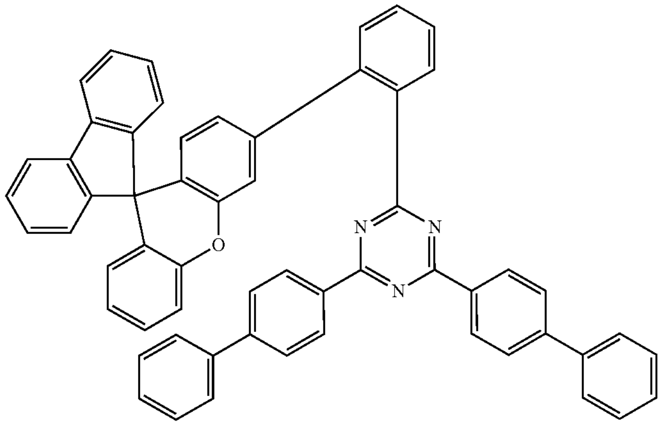
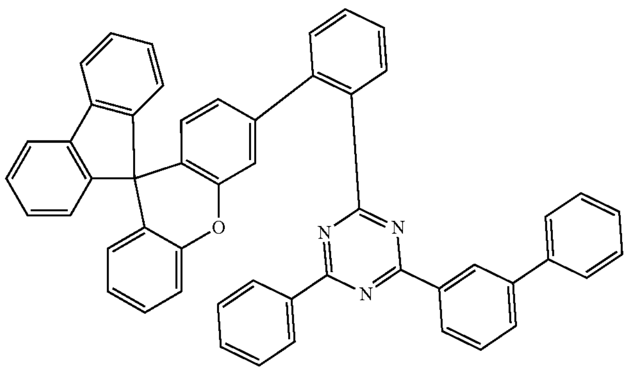
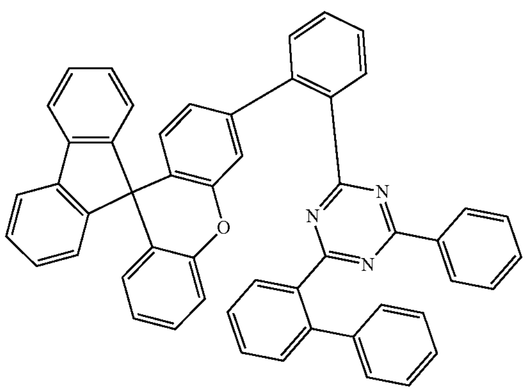
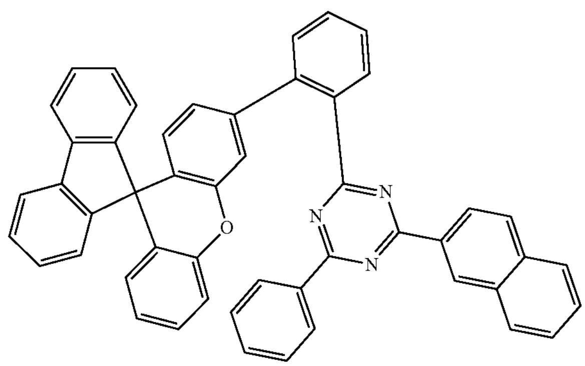
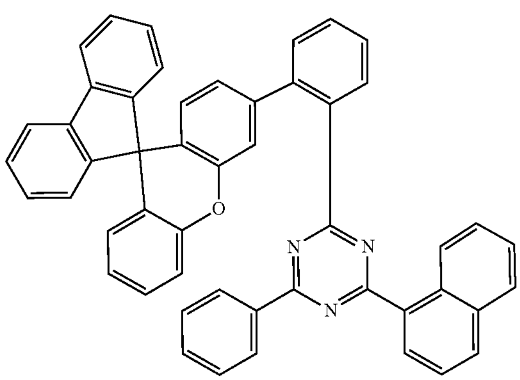

-continued
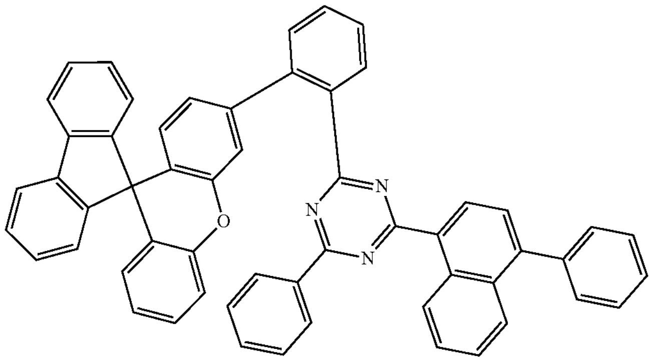
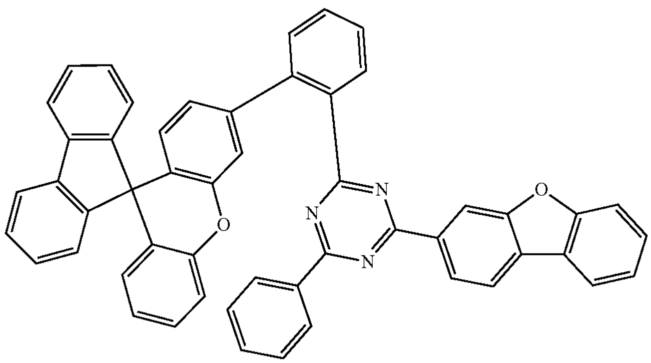
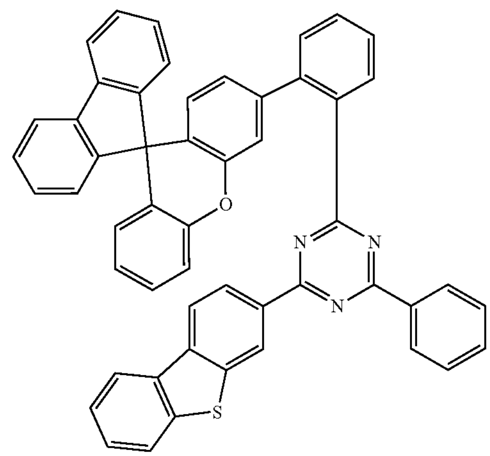
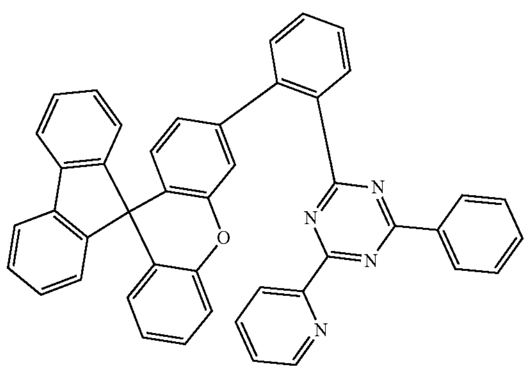
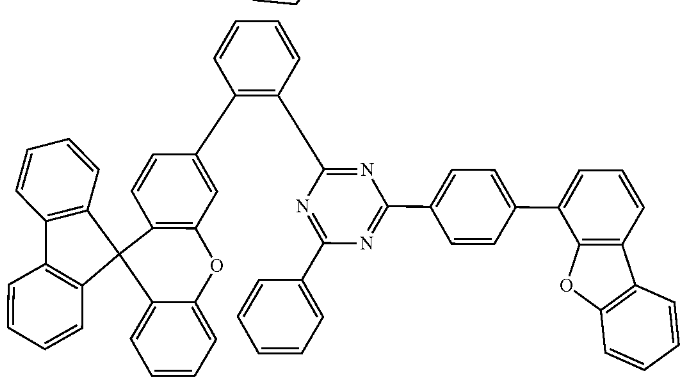

-continued
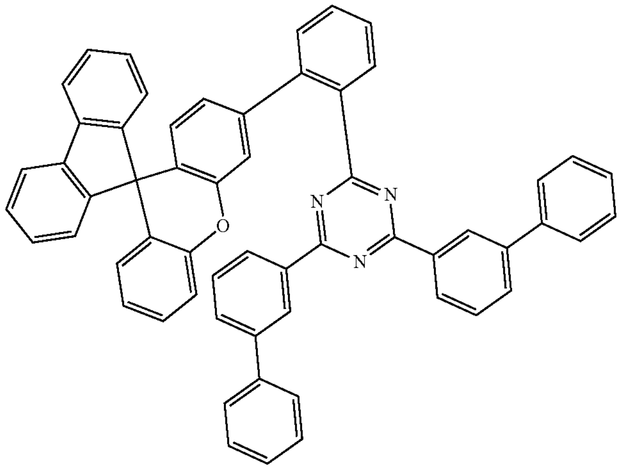
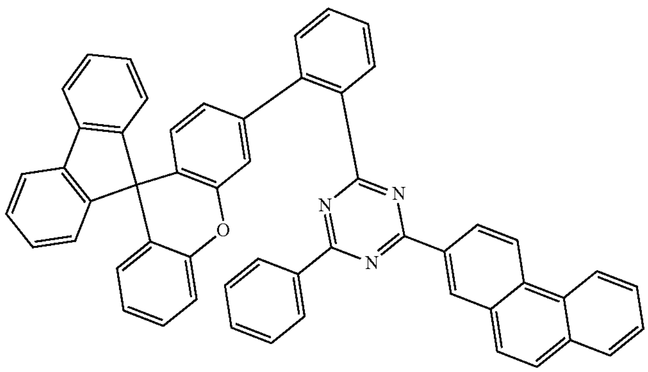
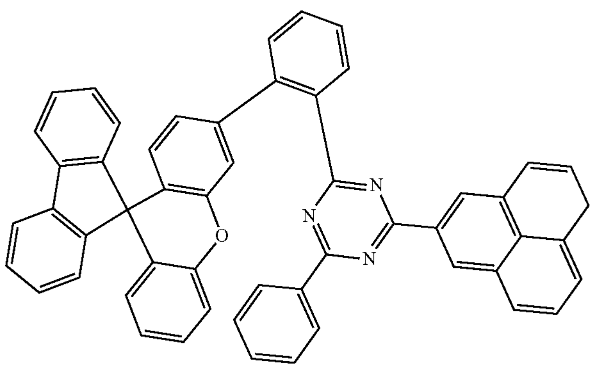
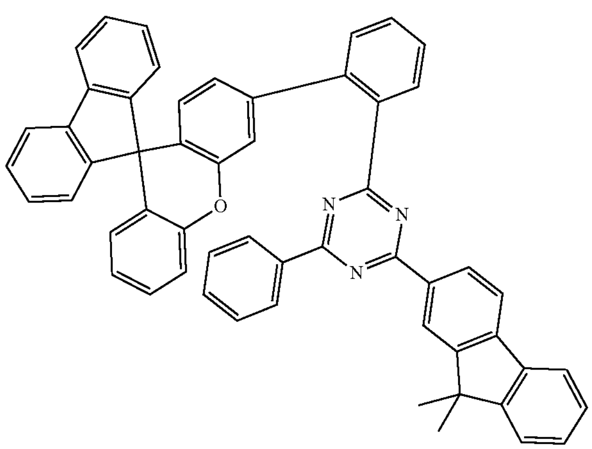

-continued
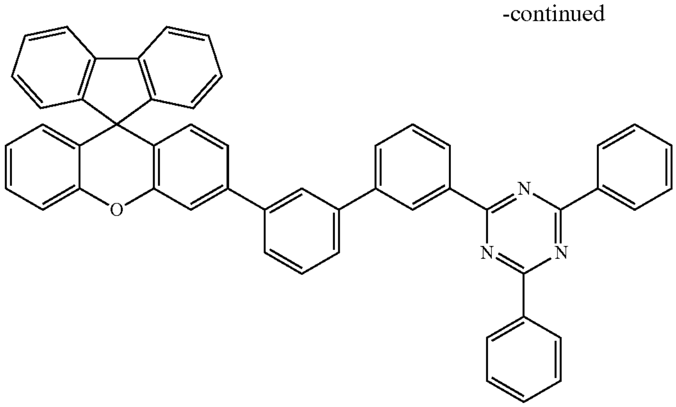
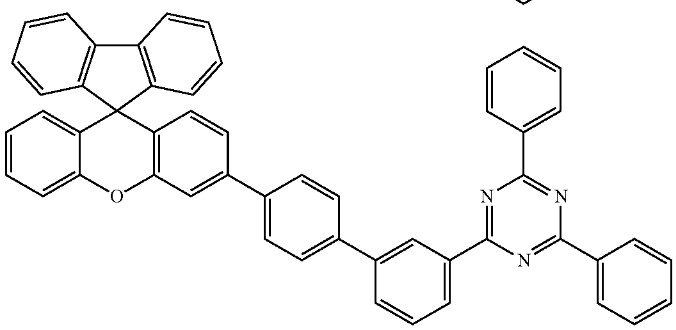
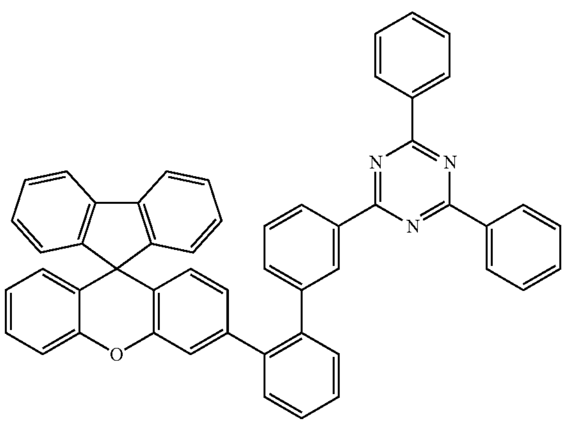
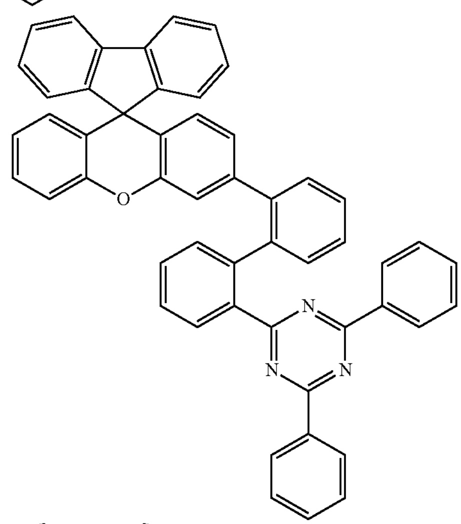
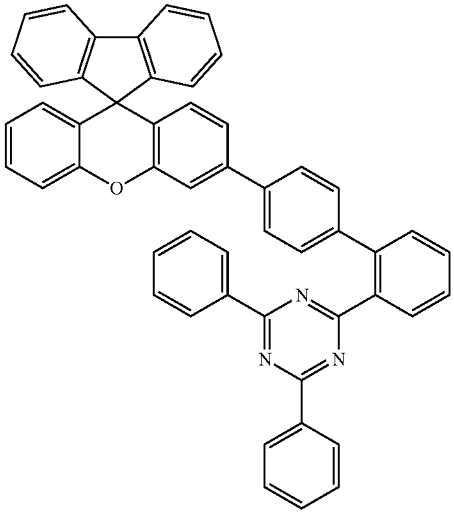
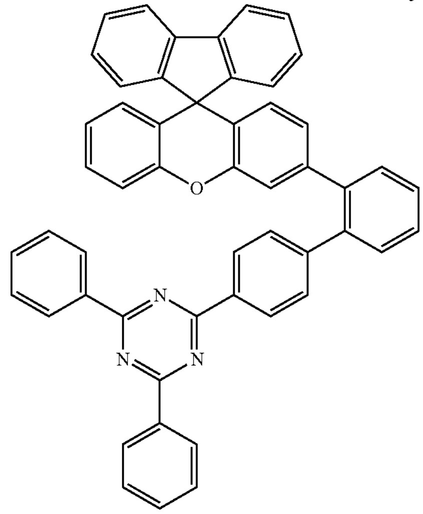

-continued
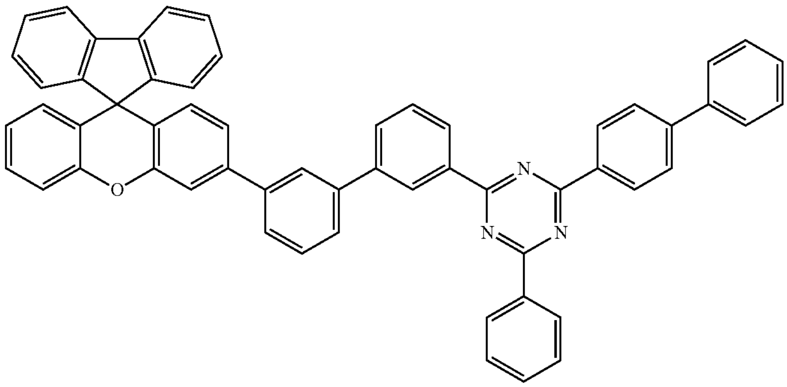
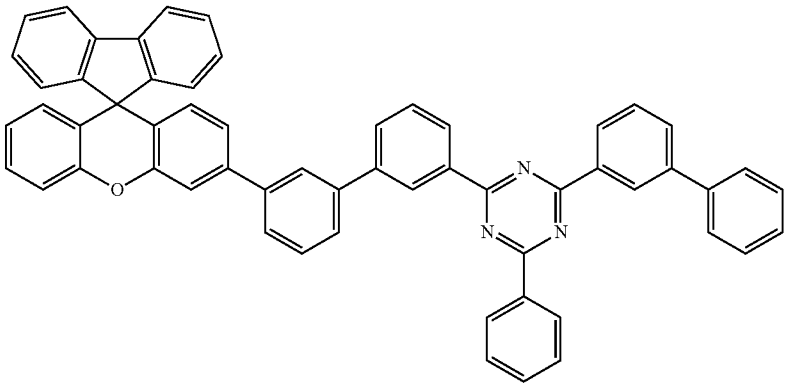
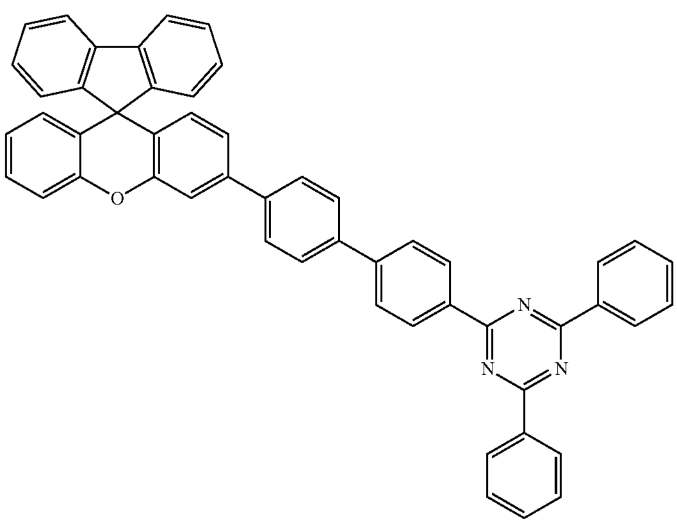
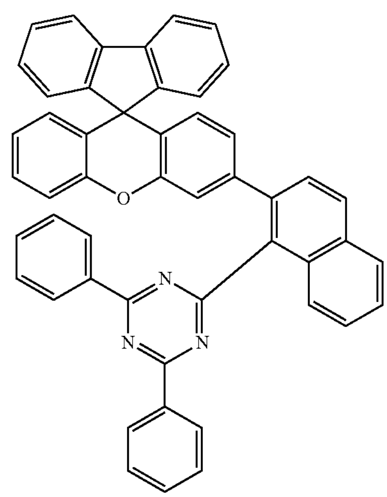
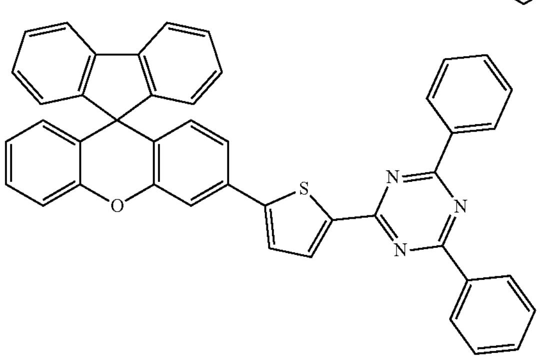
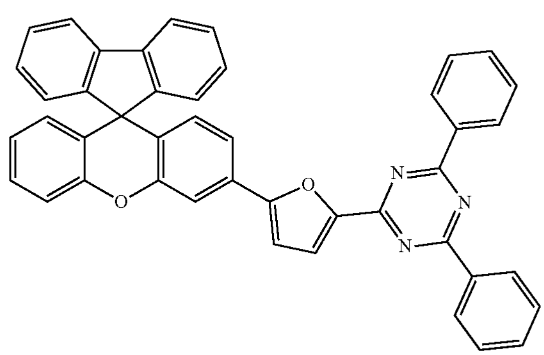

-continued
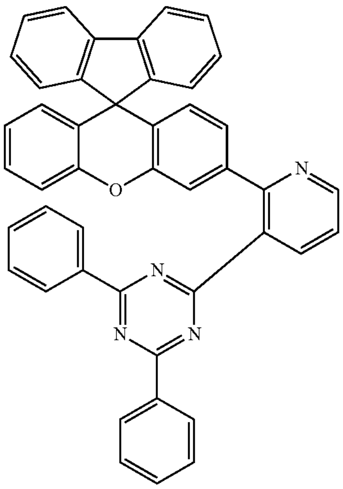
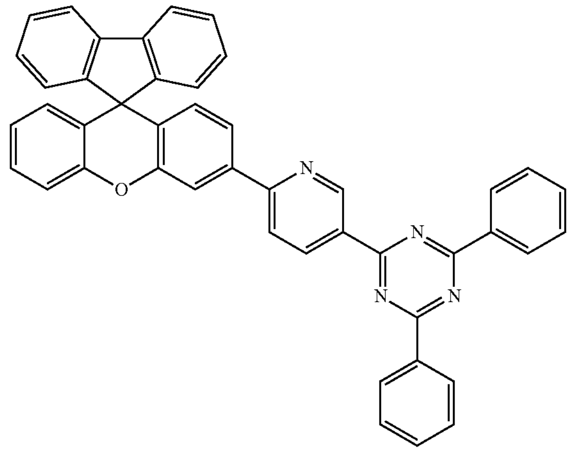
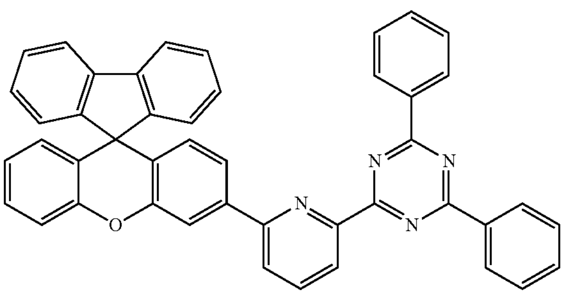
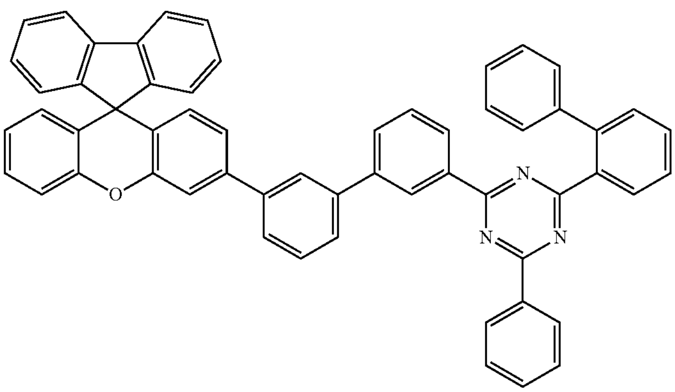
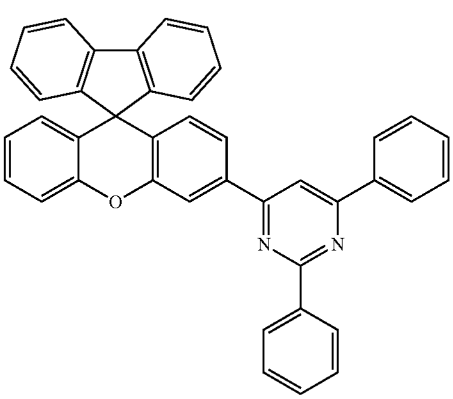
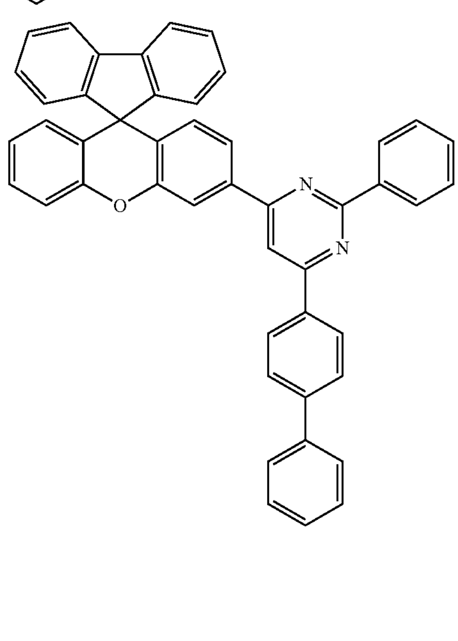

-continued
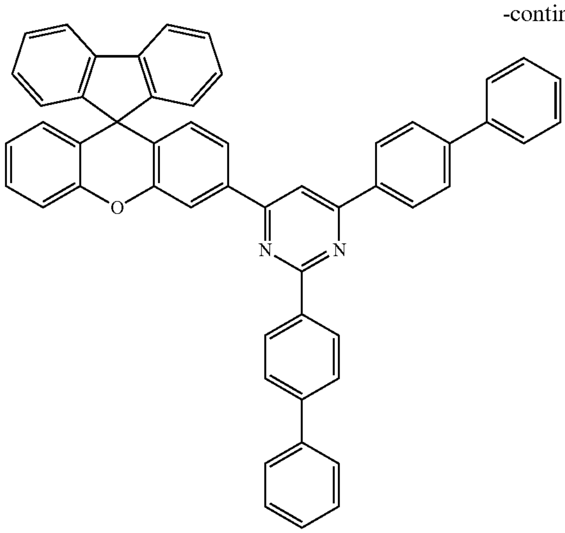
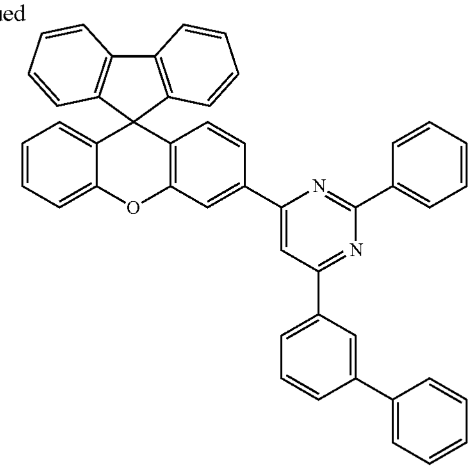
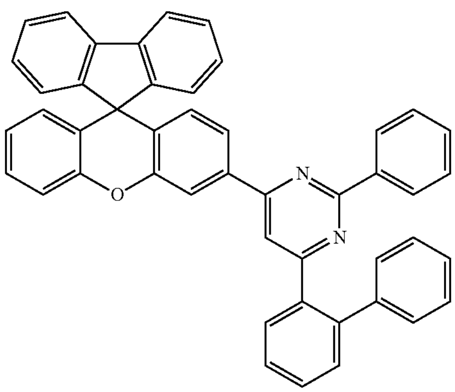
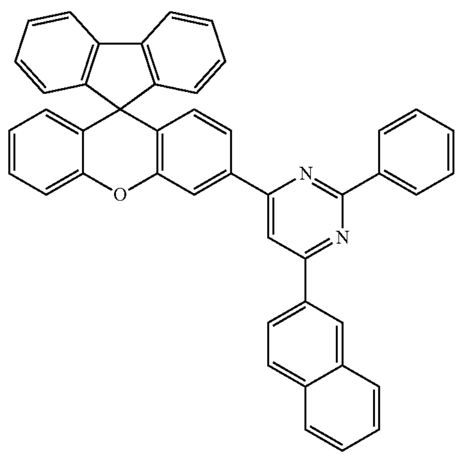
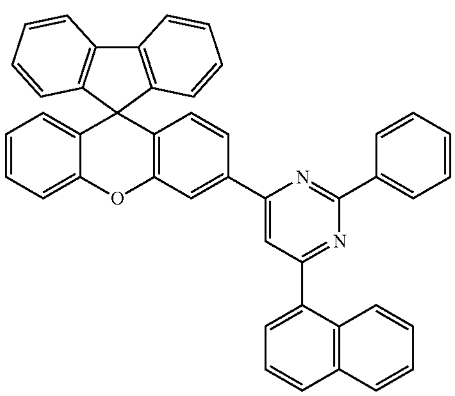
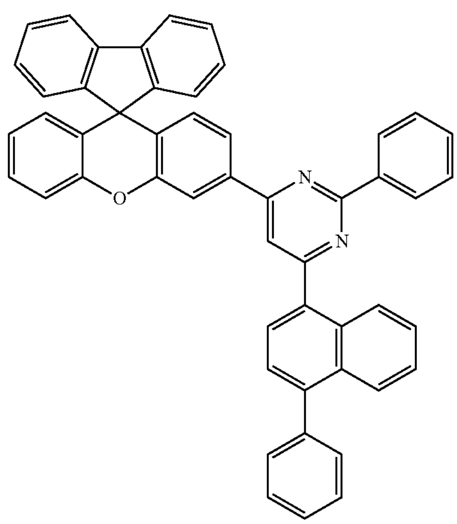

-continued
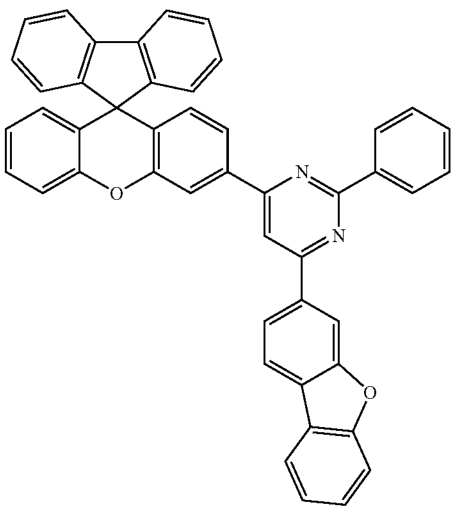
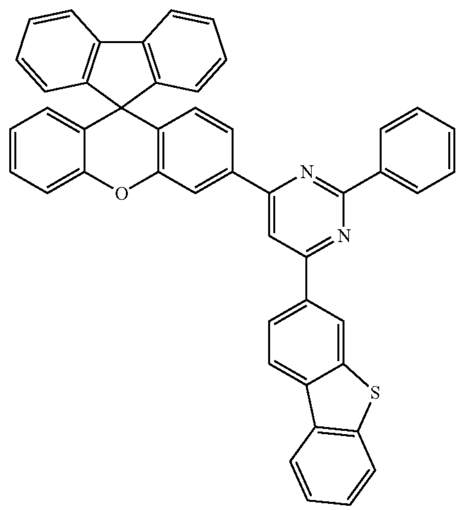
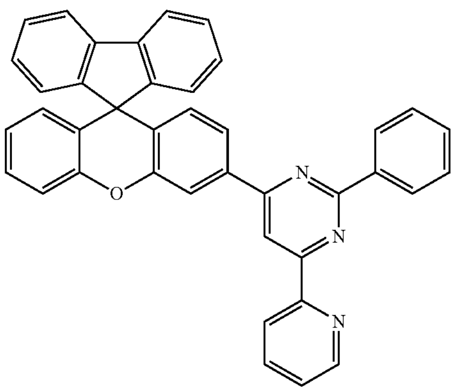
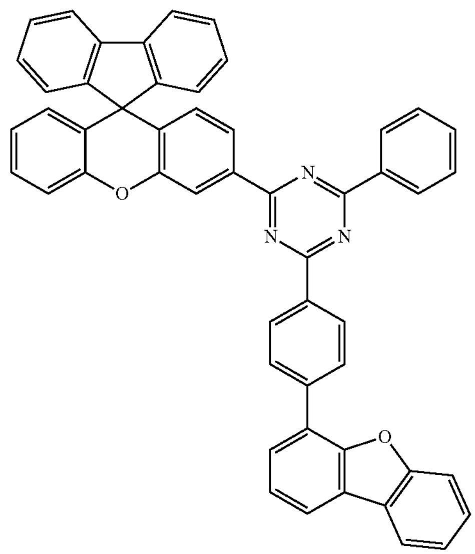
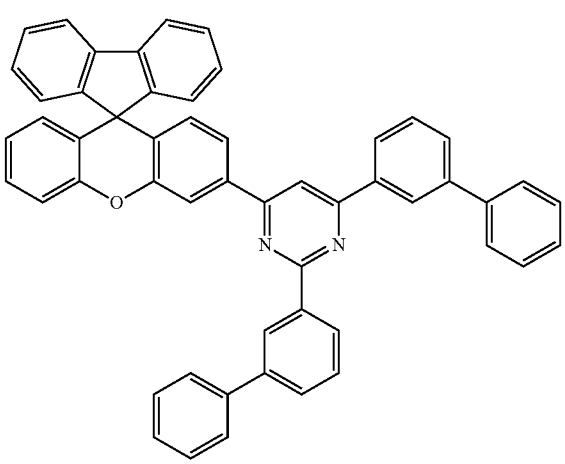
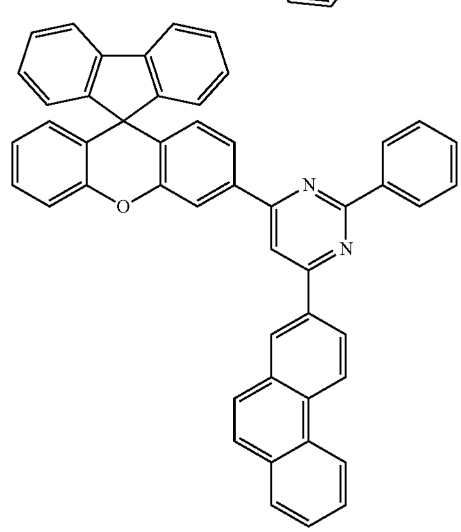

-continued
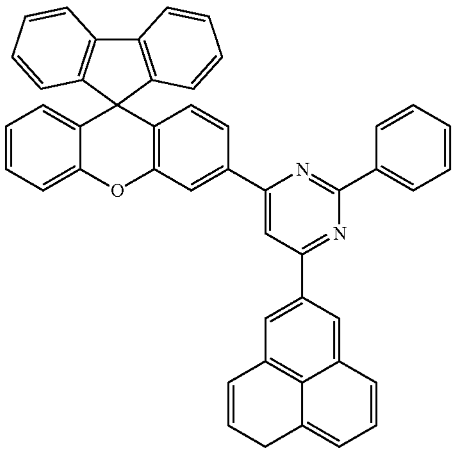
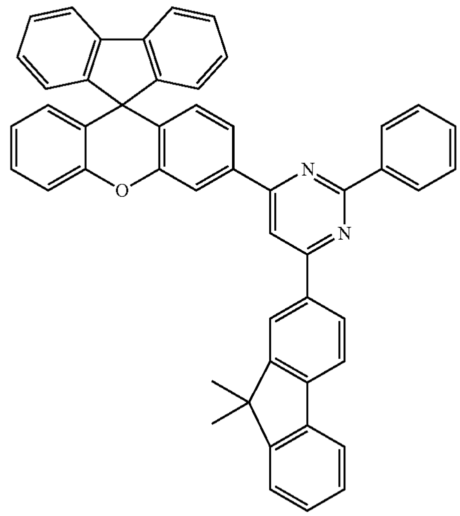
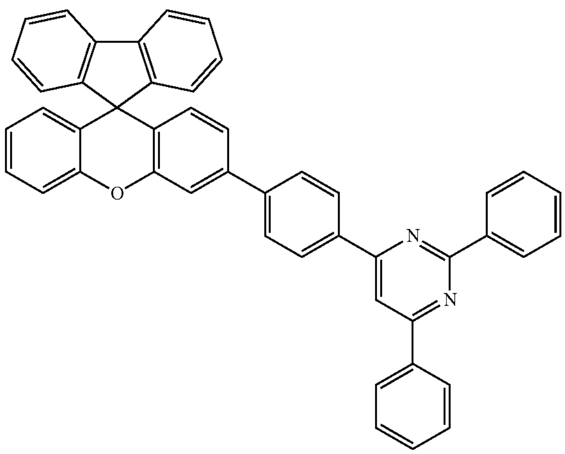
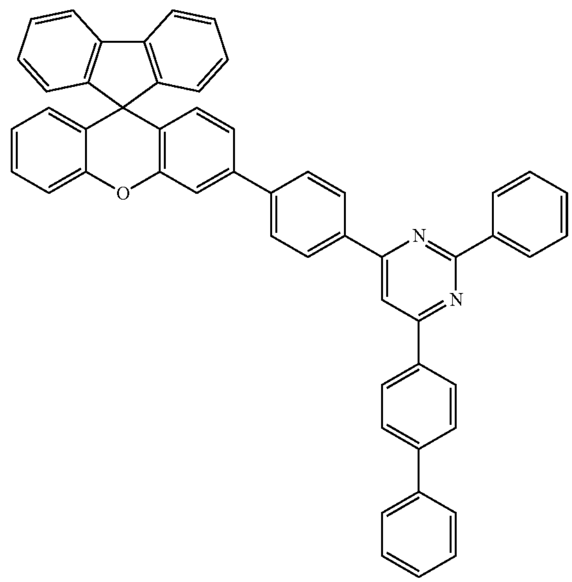
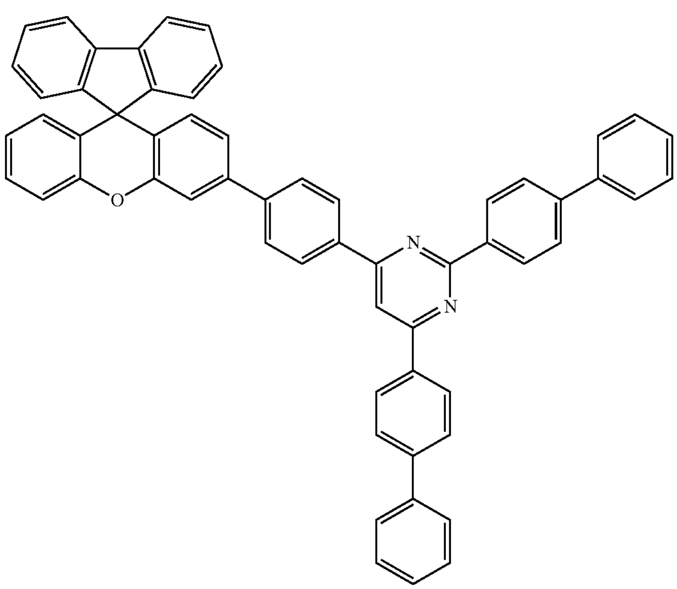

-continued
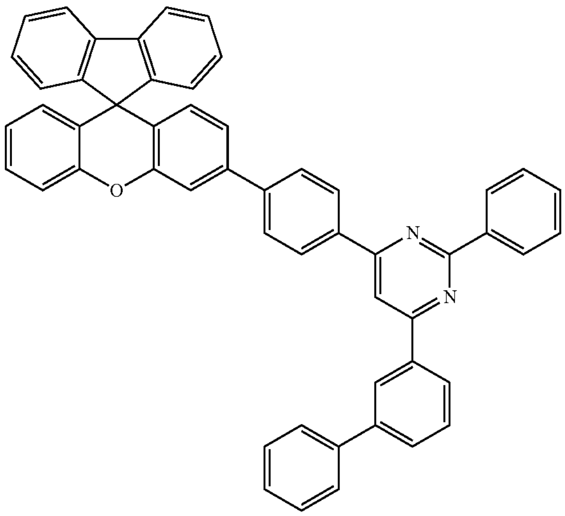
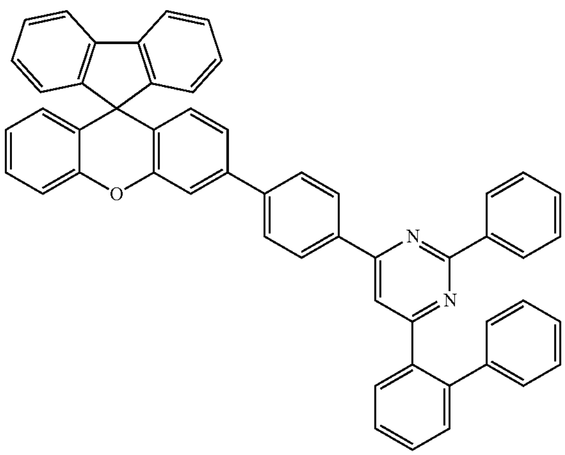
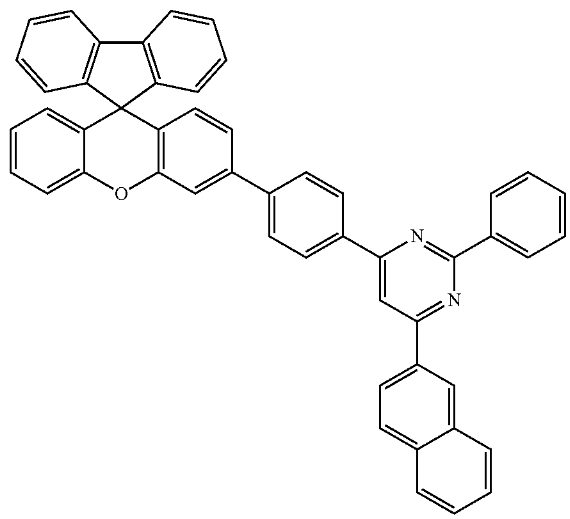
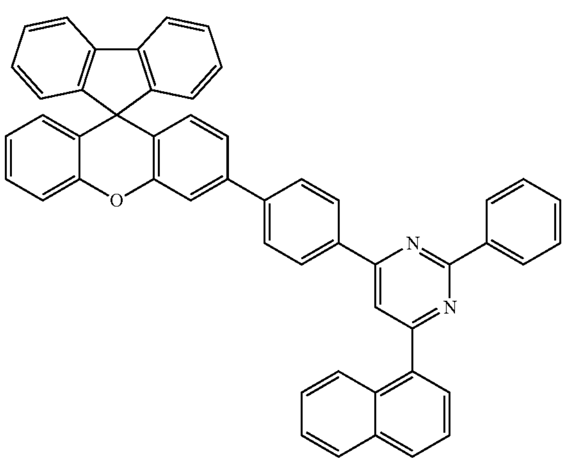
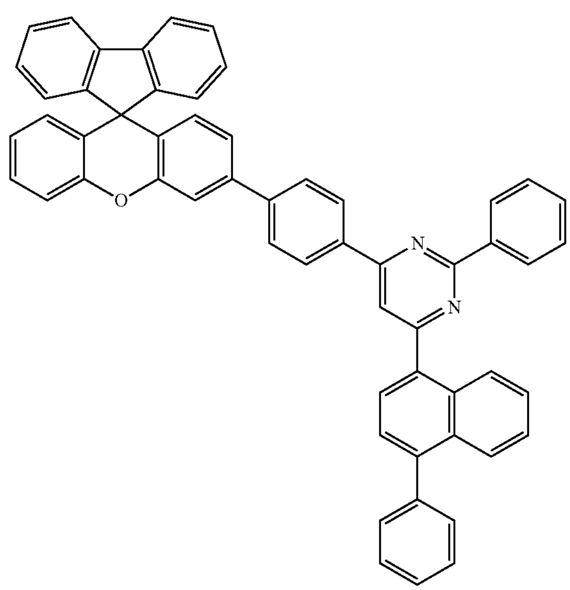

-continued
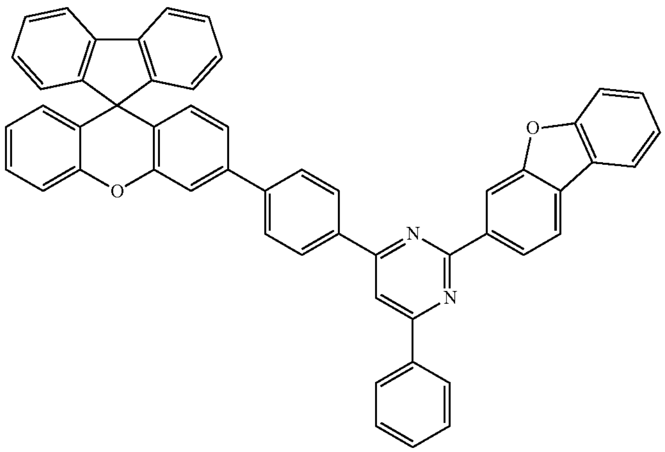
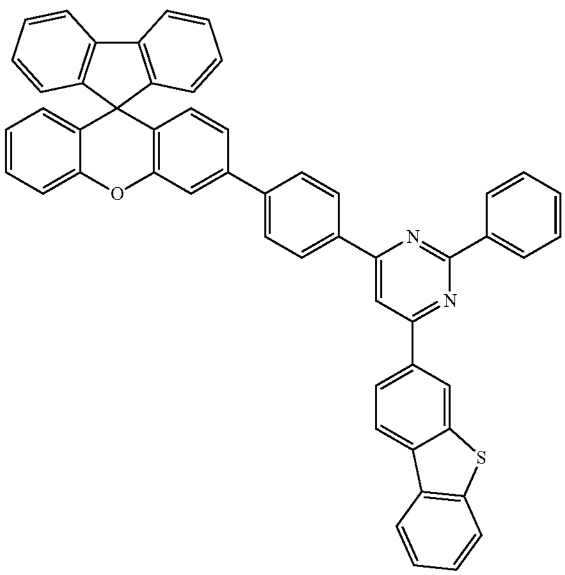
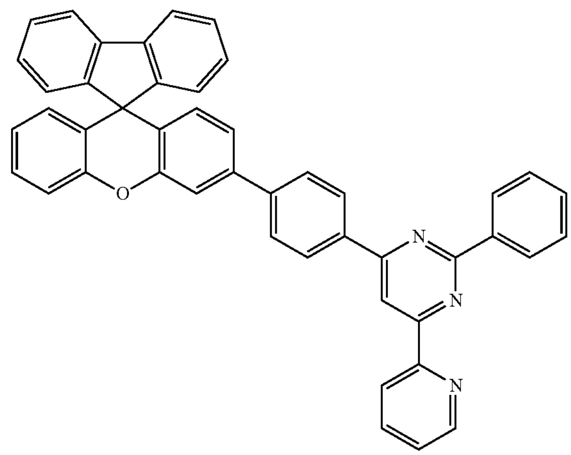
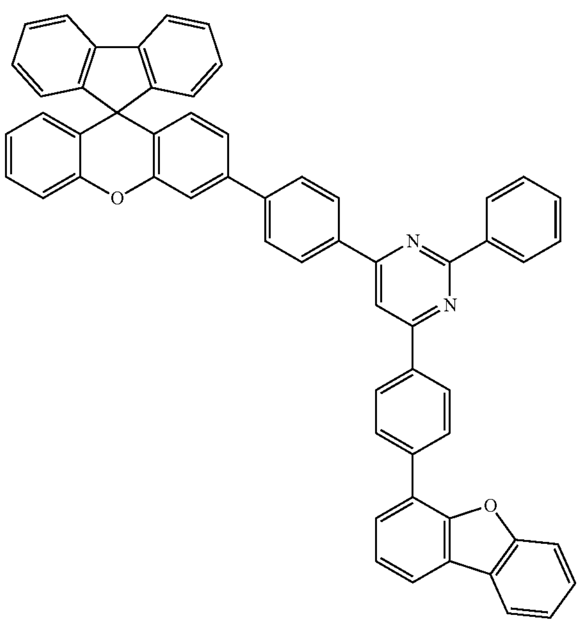

-continued
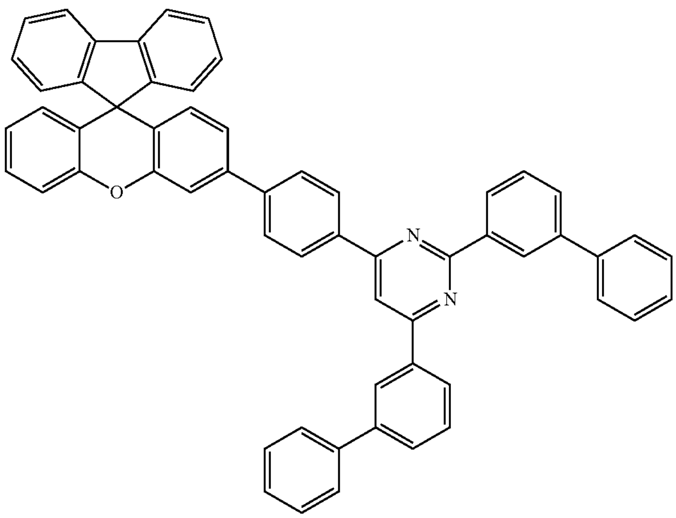
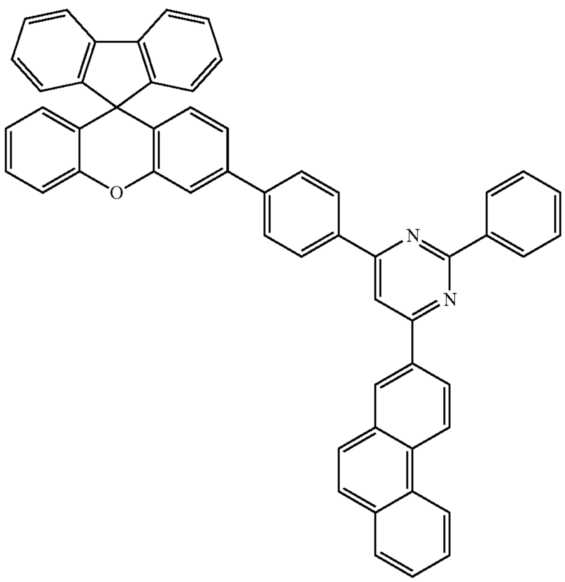
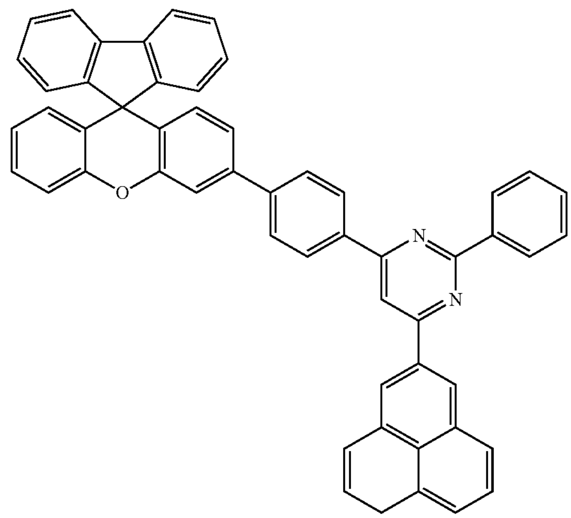
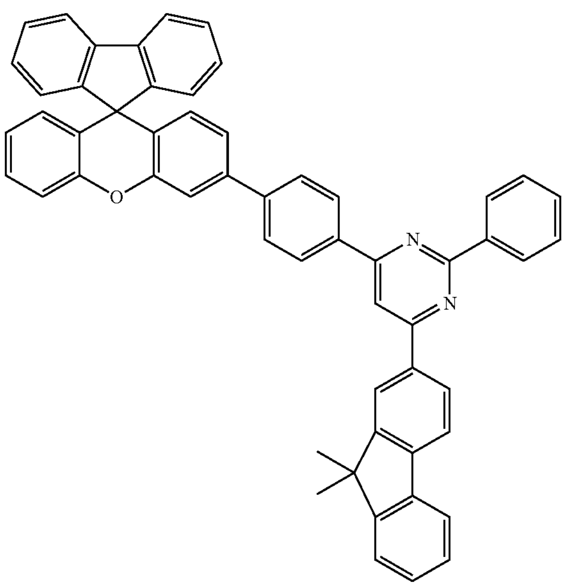
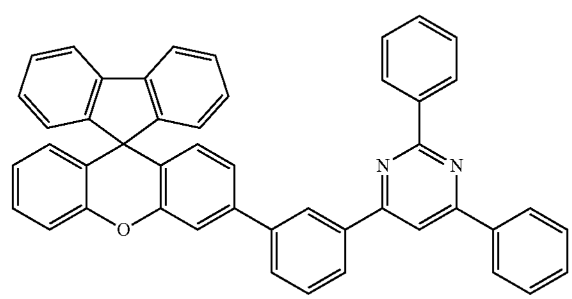

-continued
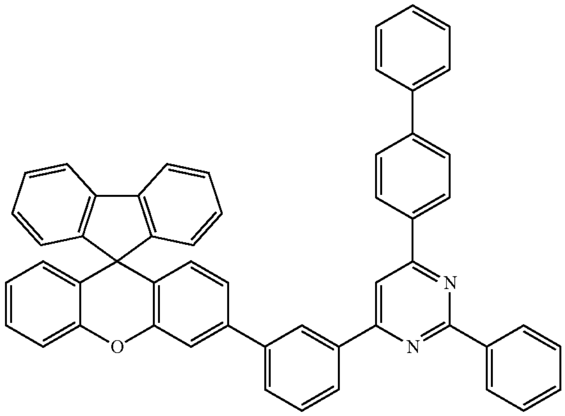
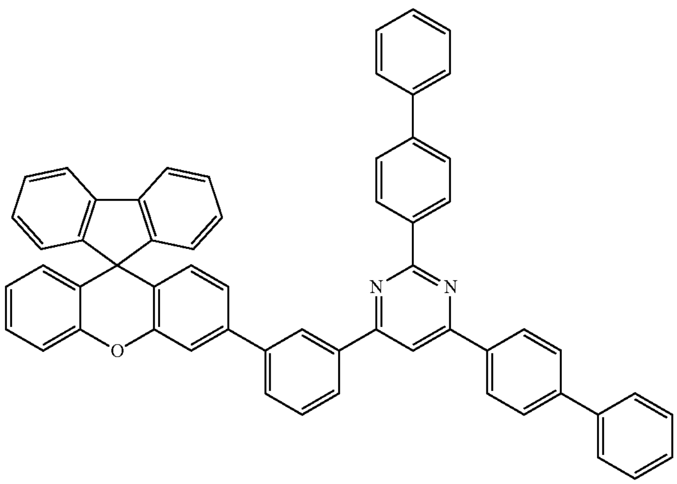
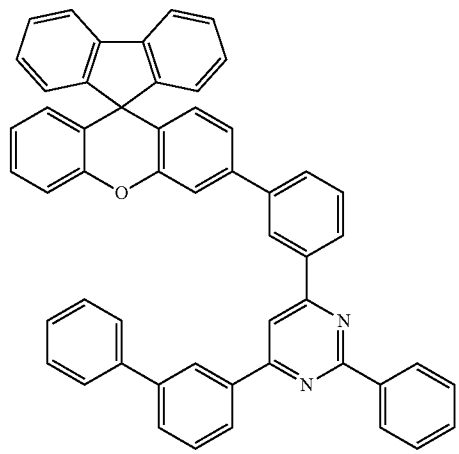
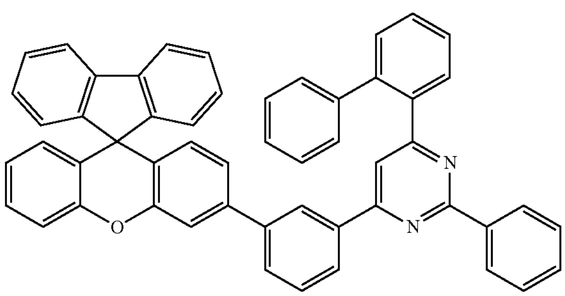
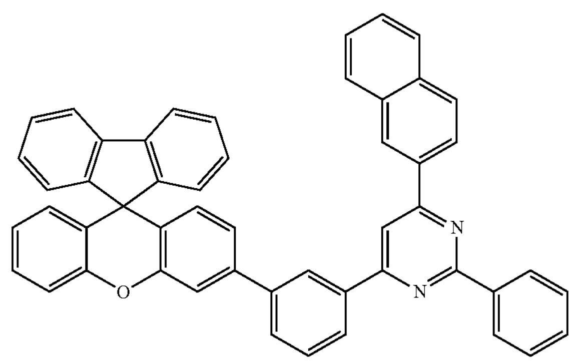
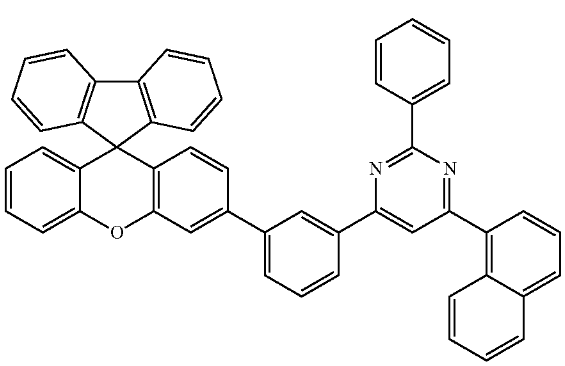

-continued
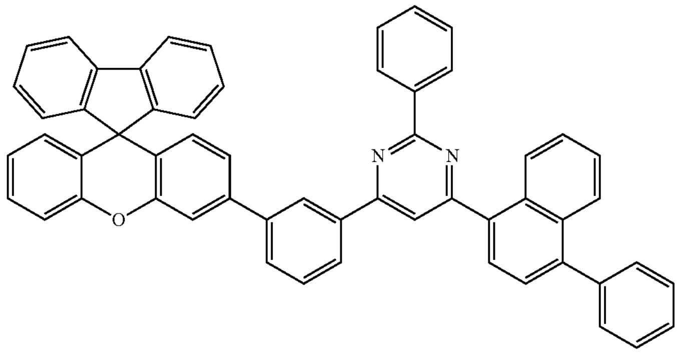
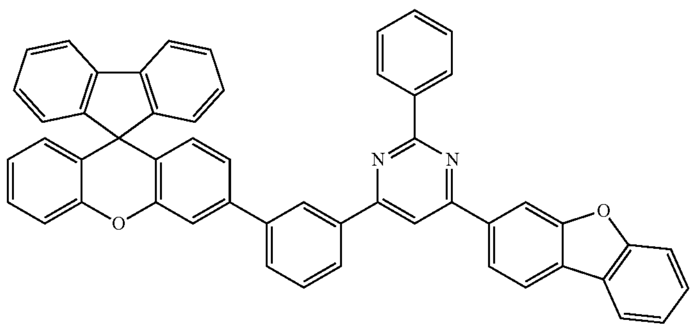
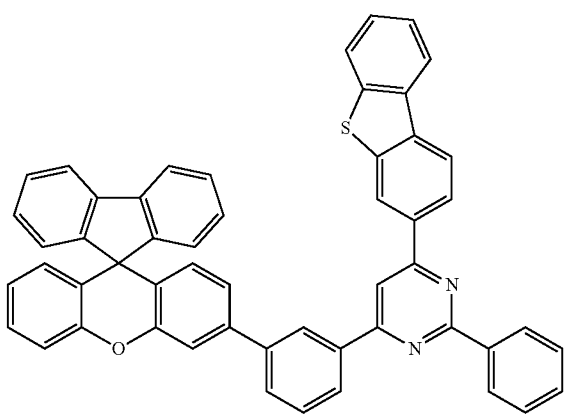
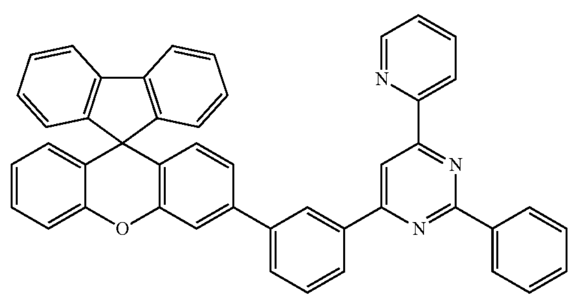
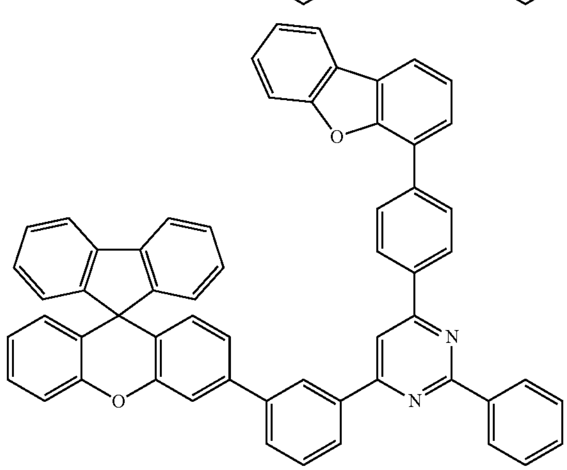

-continued
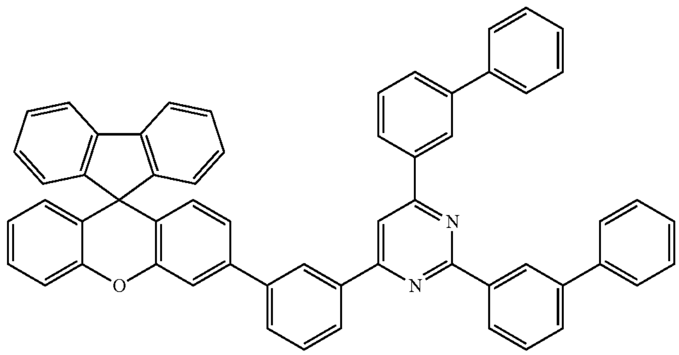
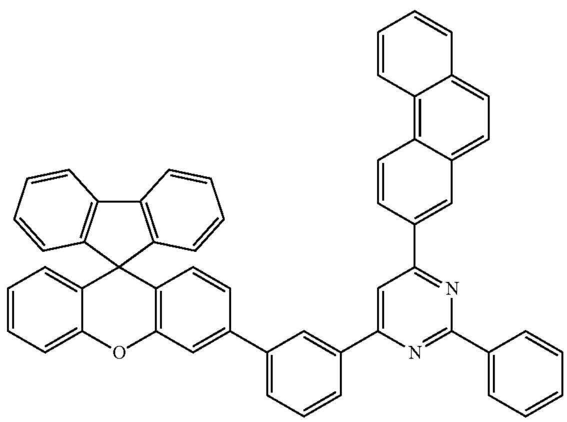
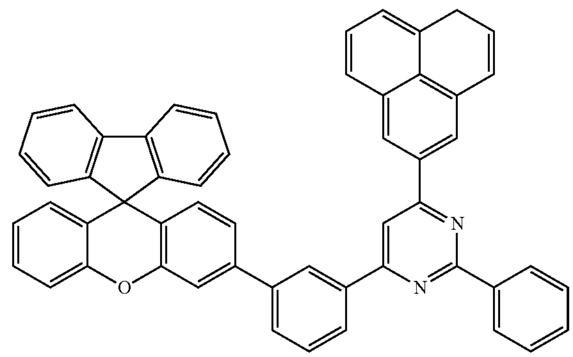
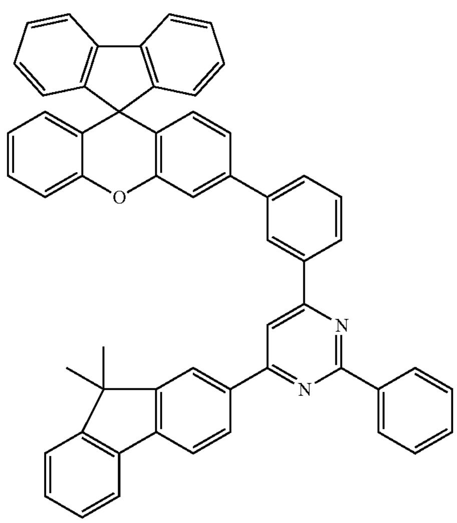
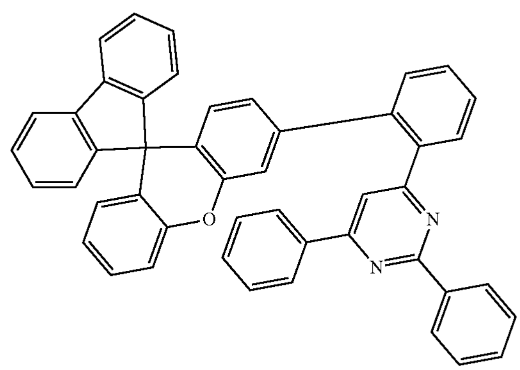
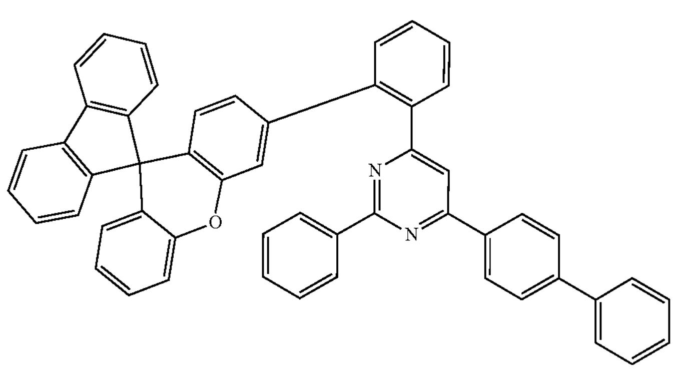

-continued
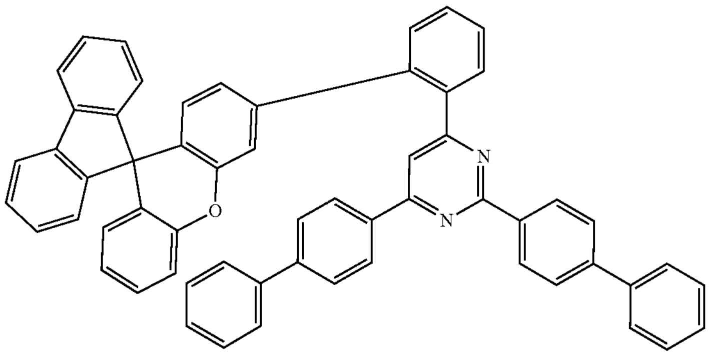
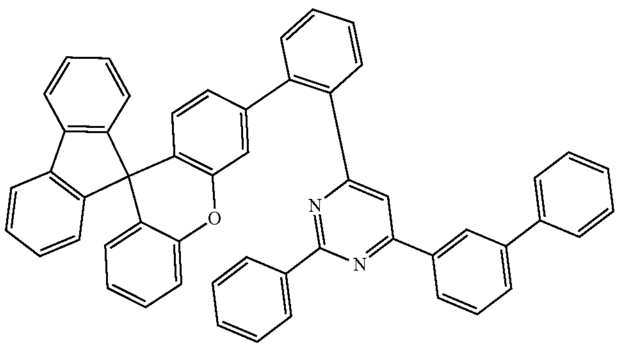
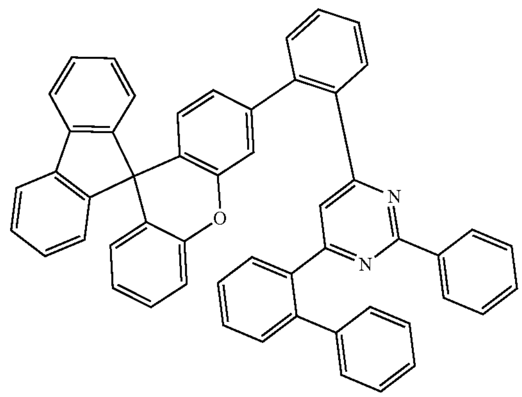
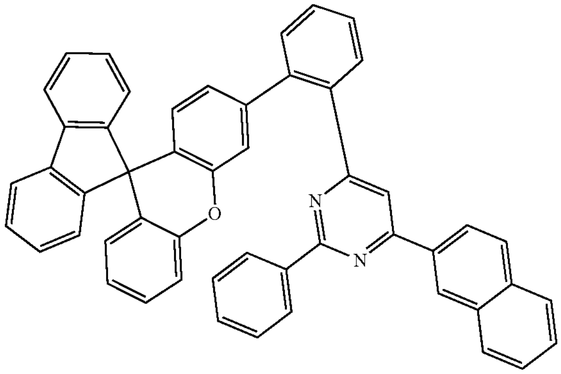
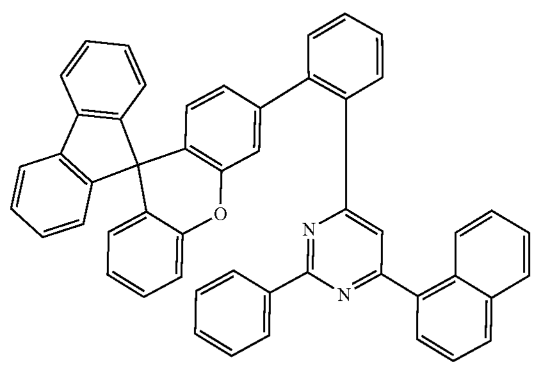
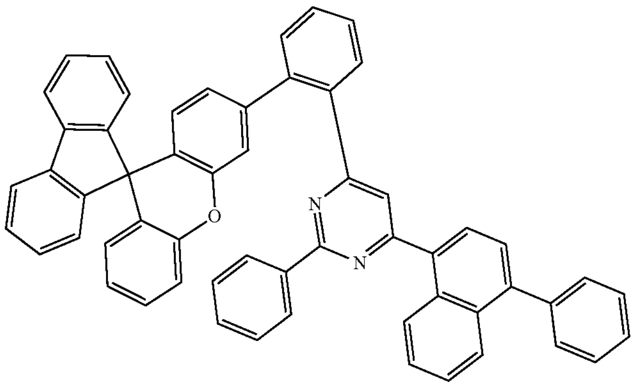

-continued
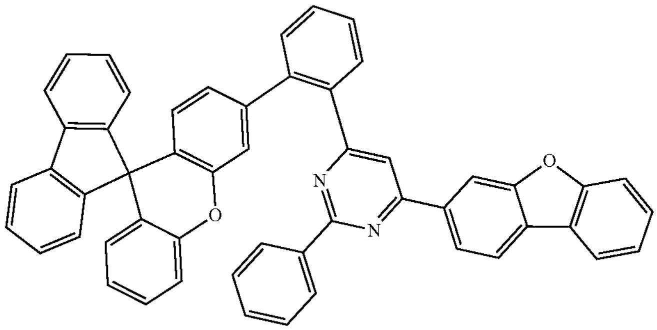
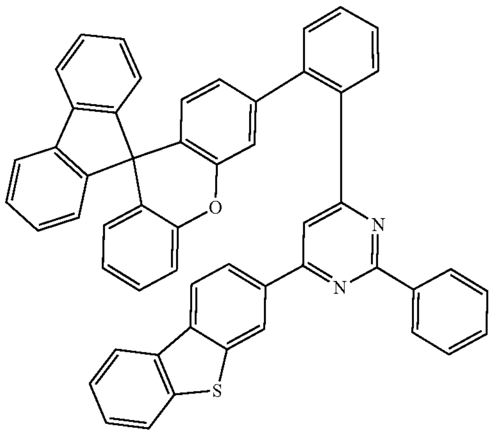
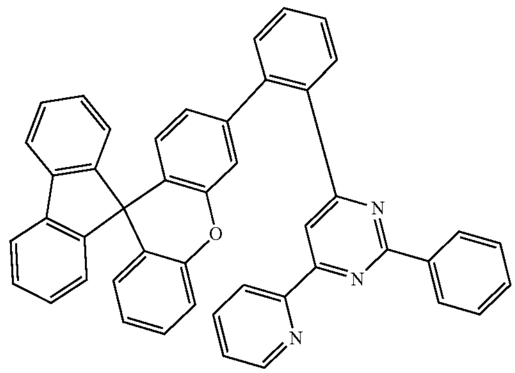
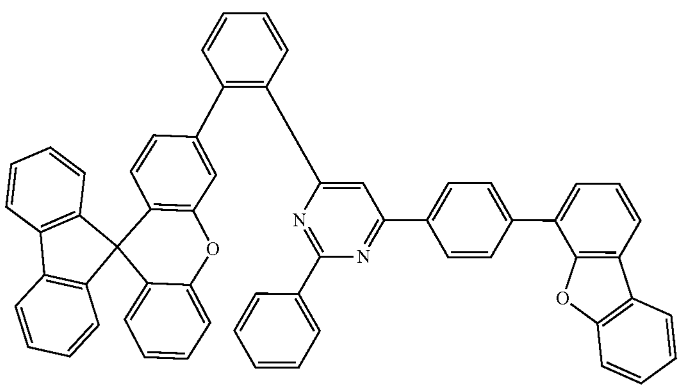
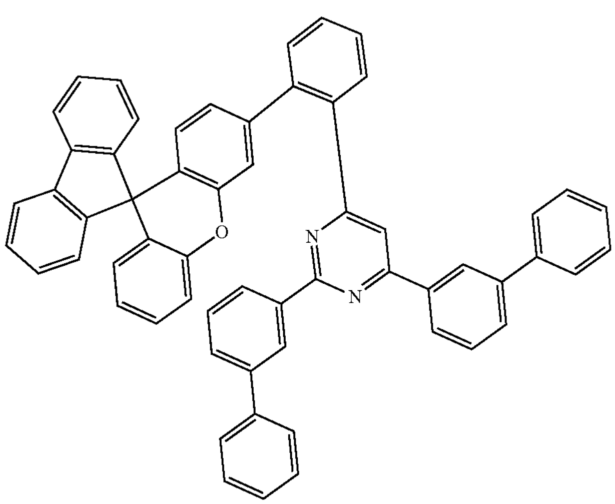

-continued
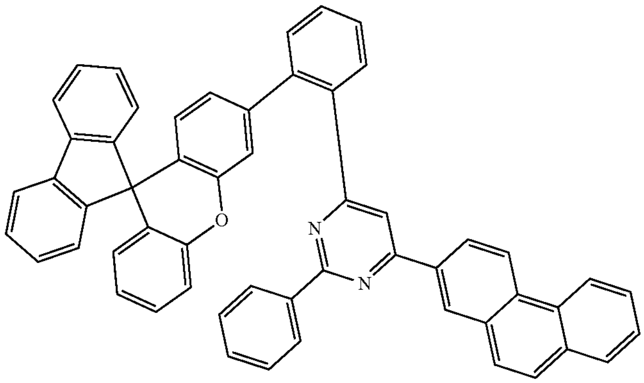
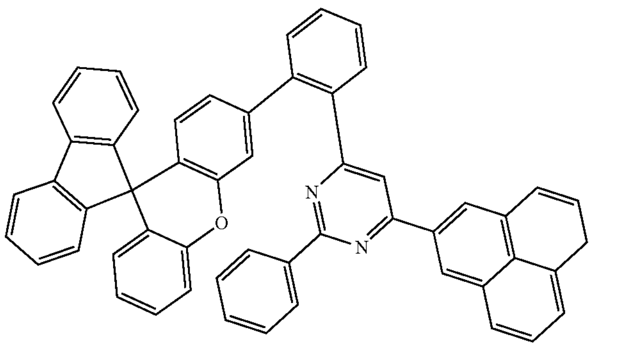
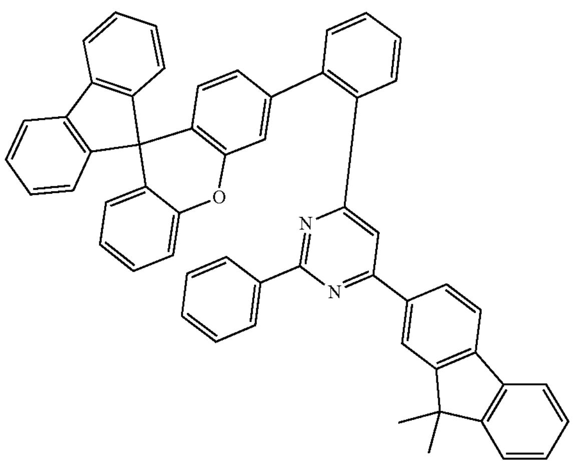
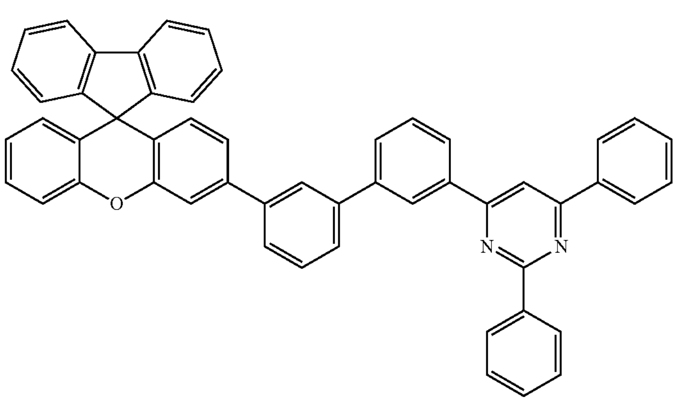

-continued
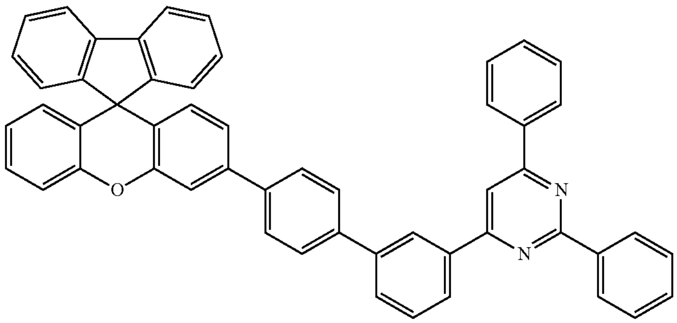
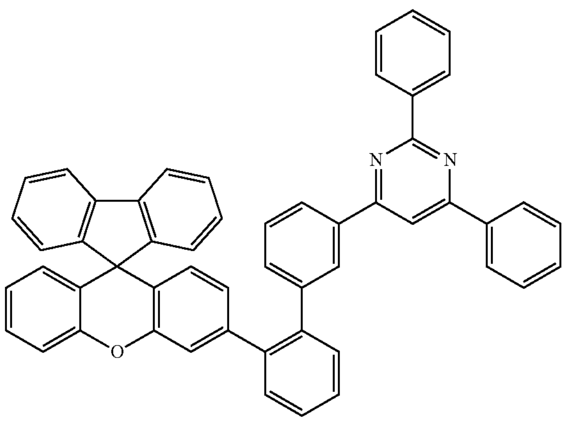
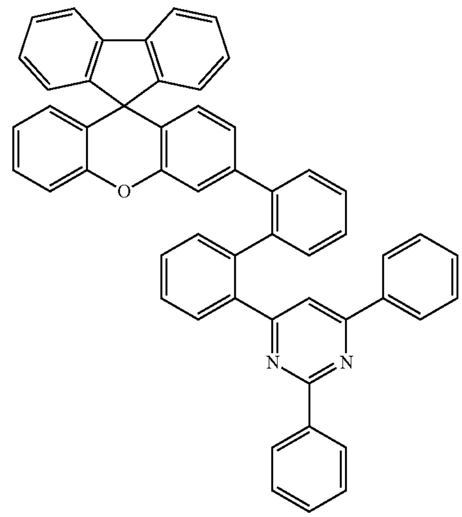
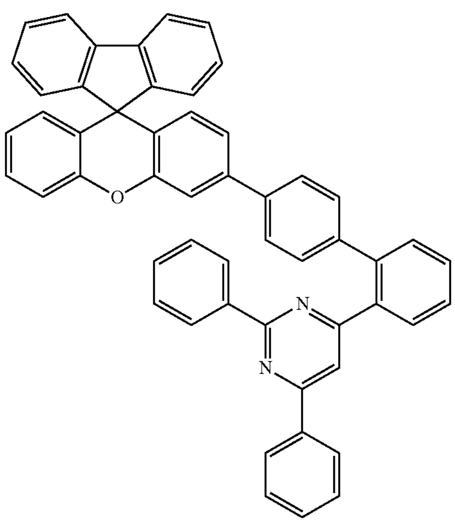
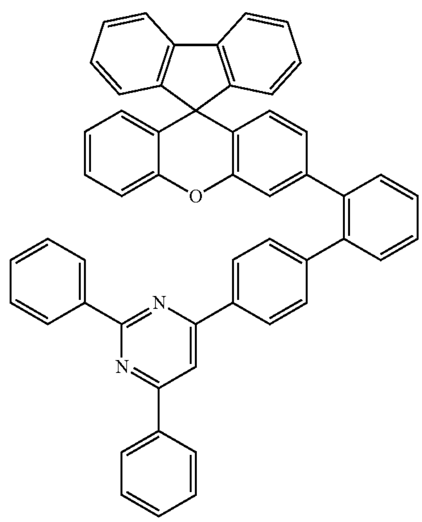

-continued
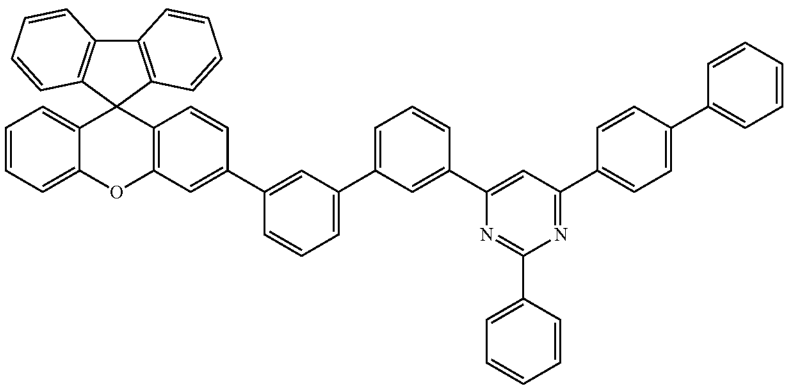
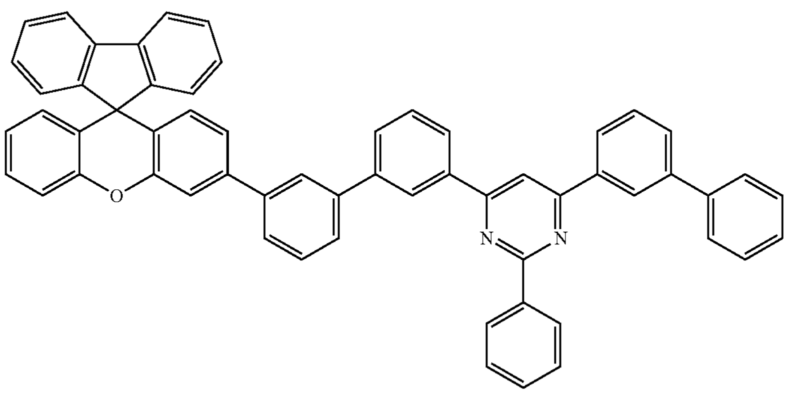
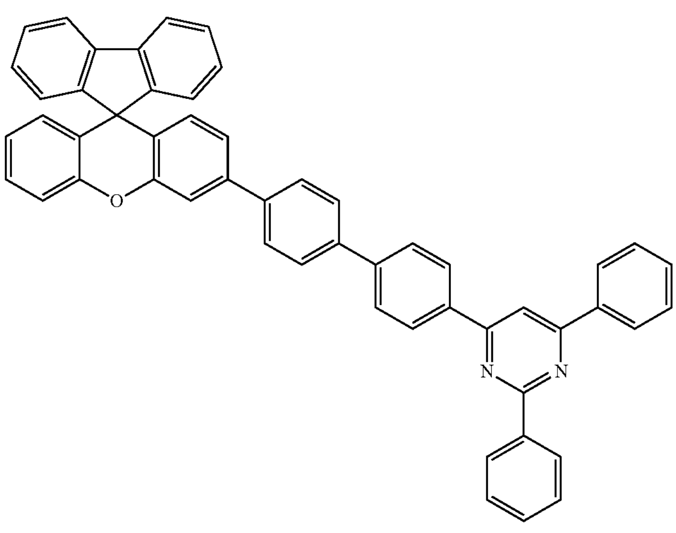

-continued
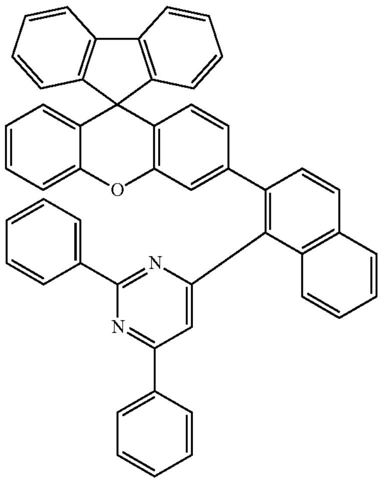
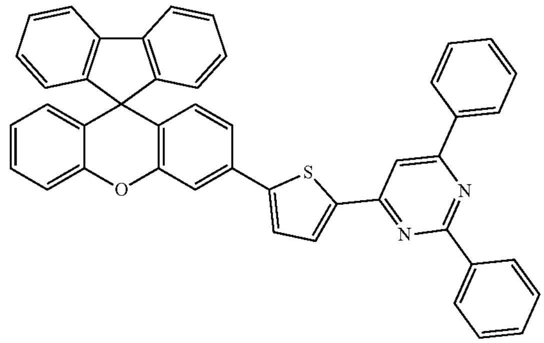
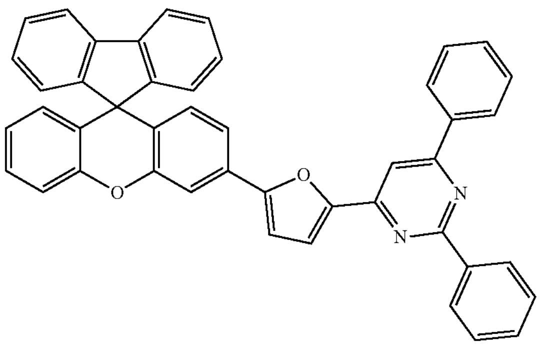
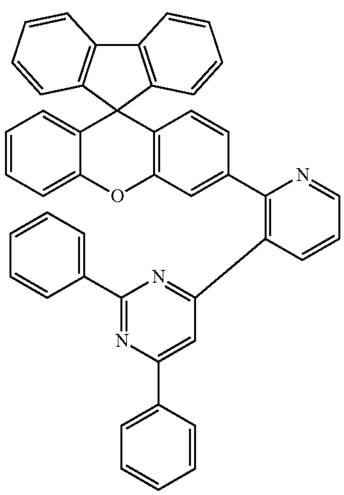
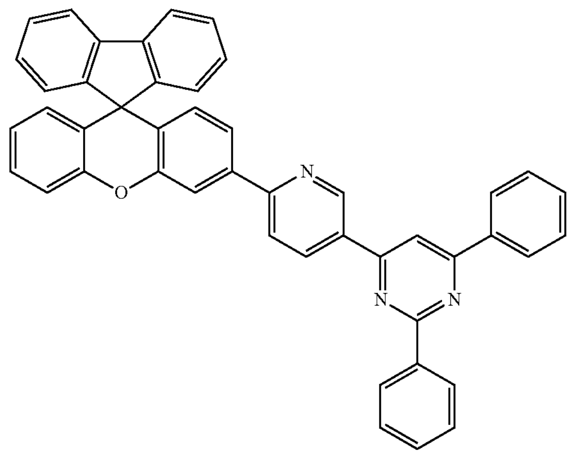
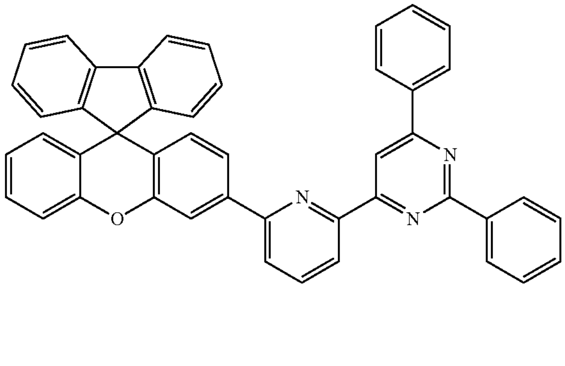

-continued
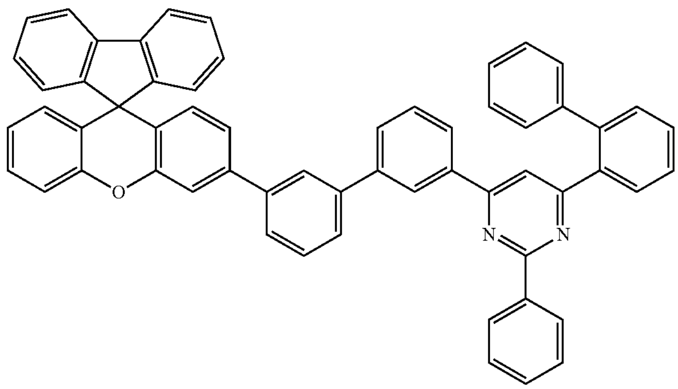
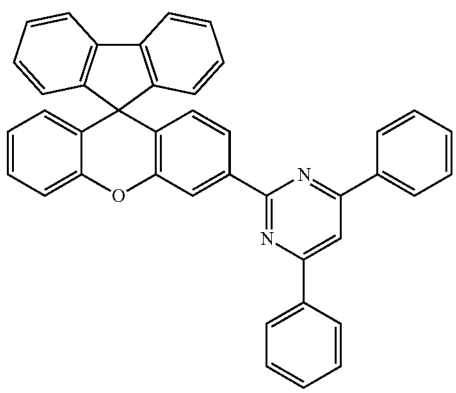
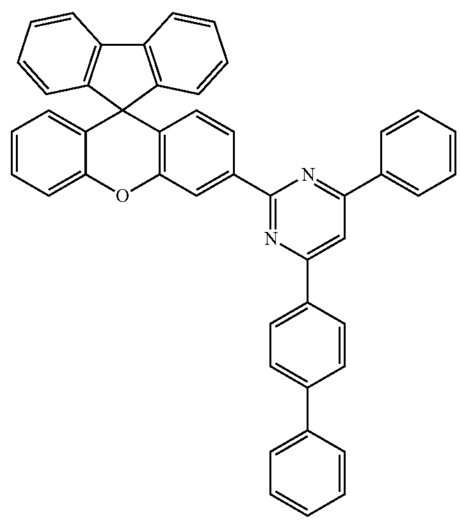
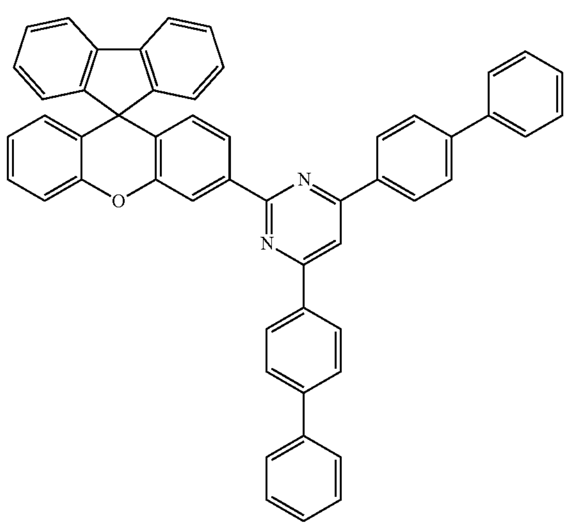
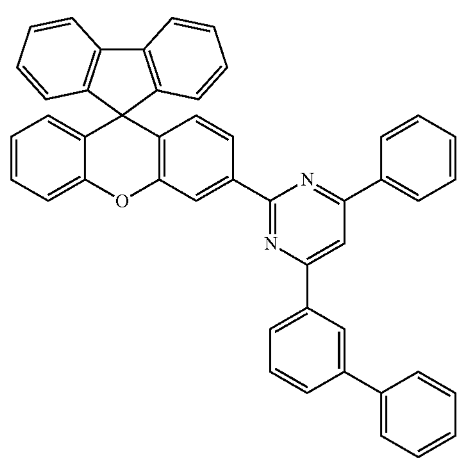

-continued
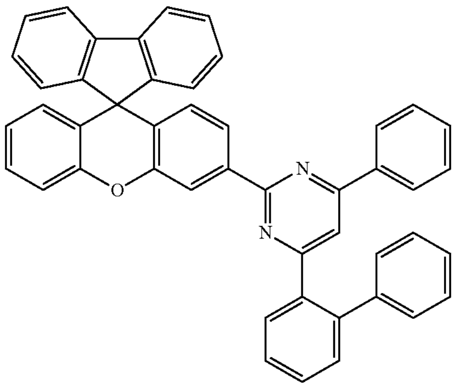
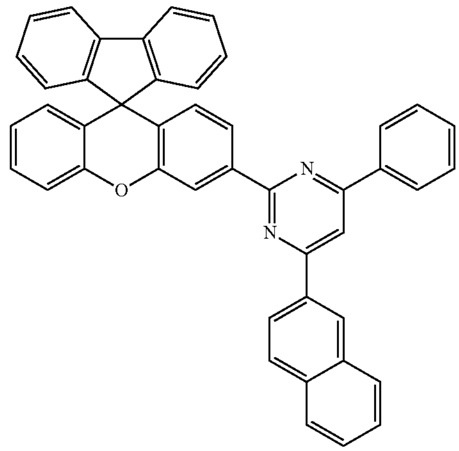
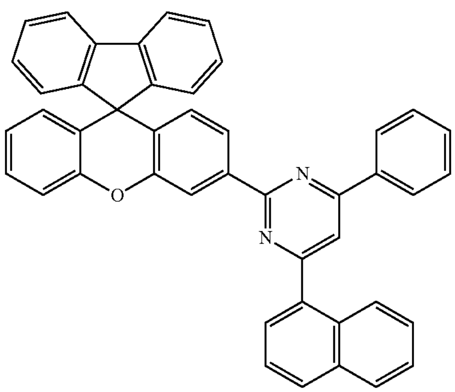
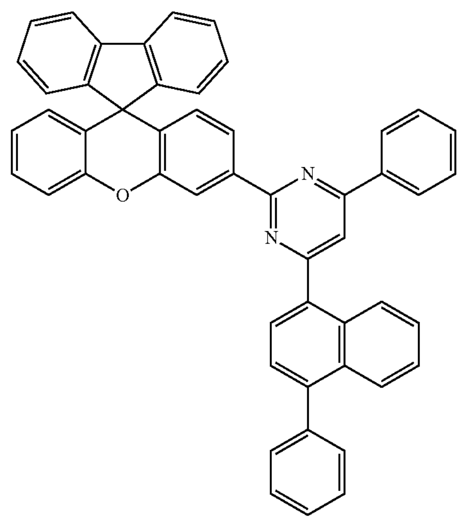
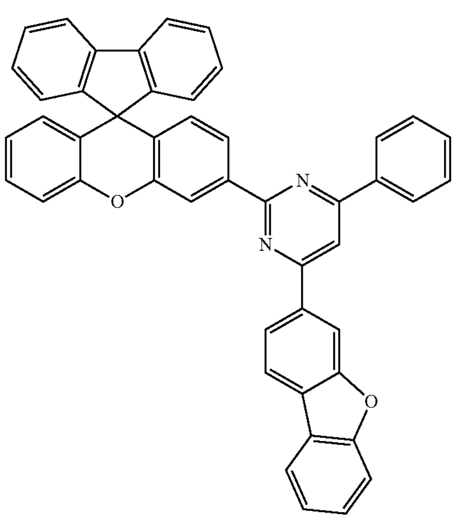
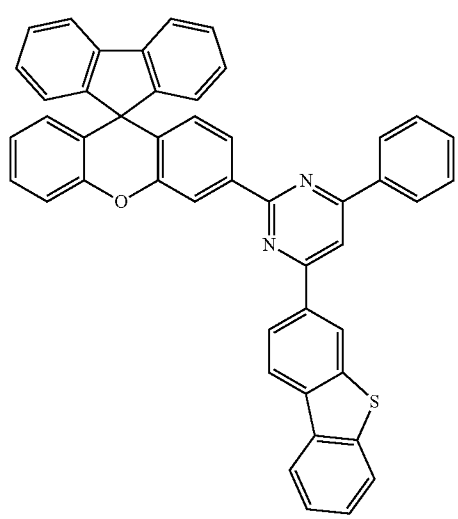

-continued
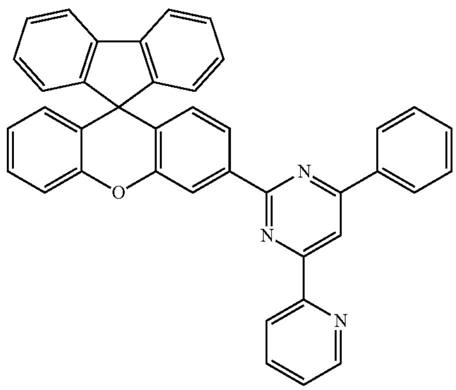
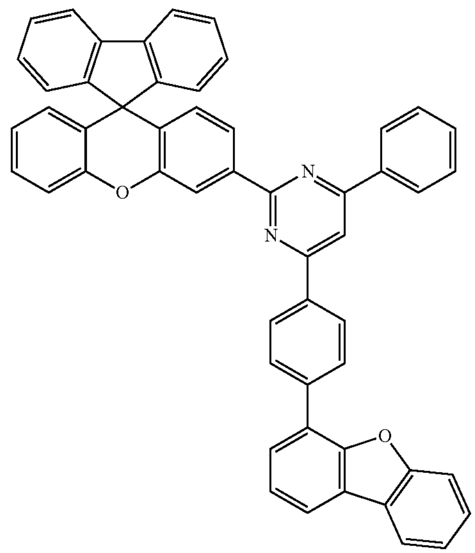
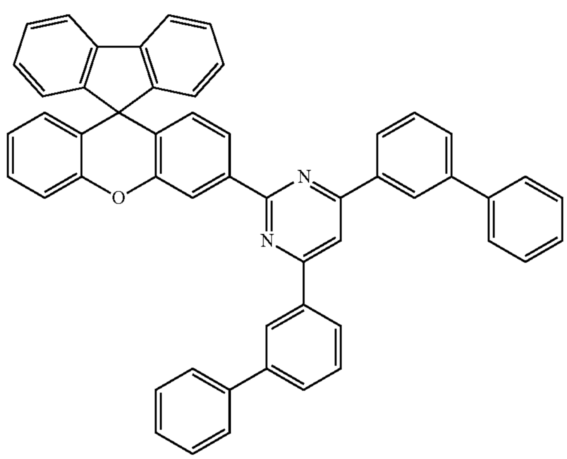
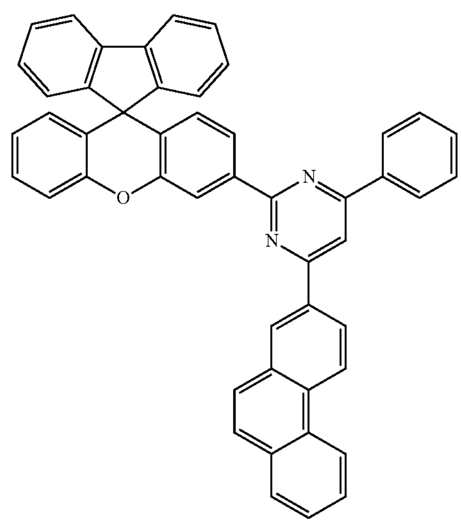
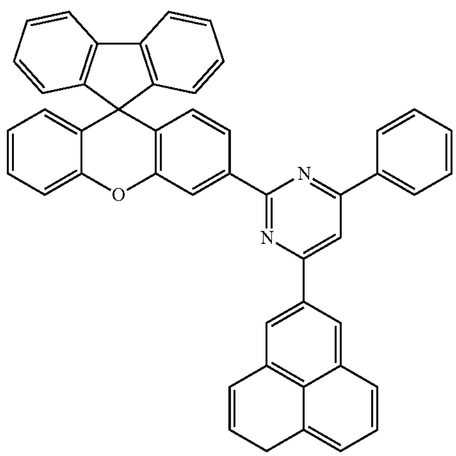
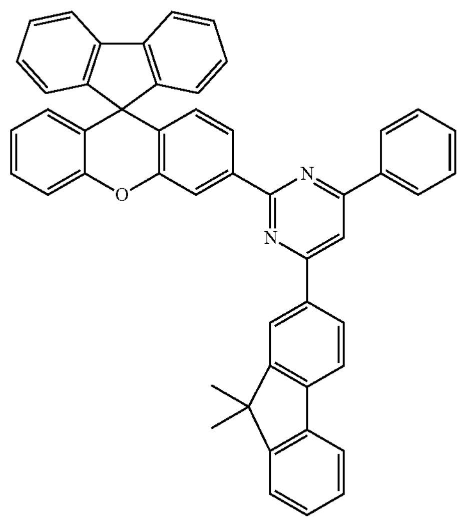

-continued
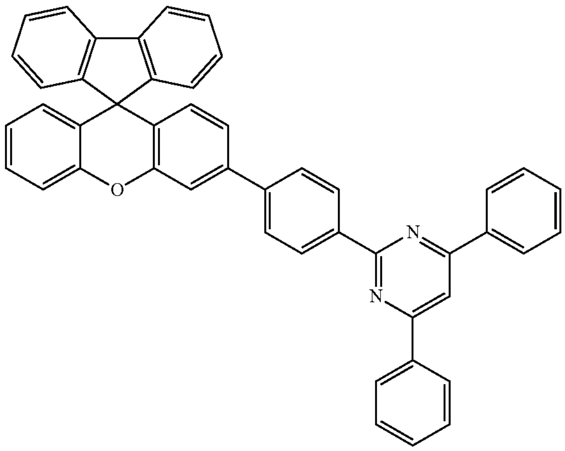
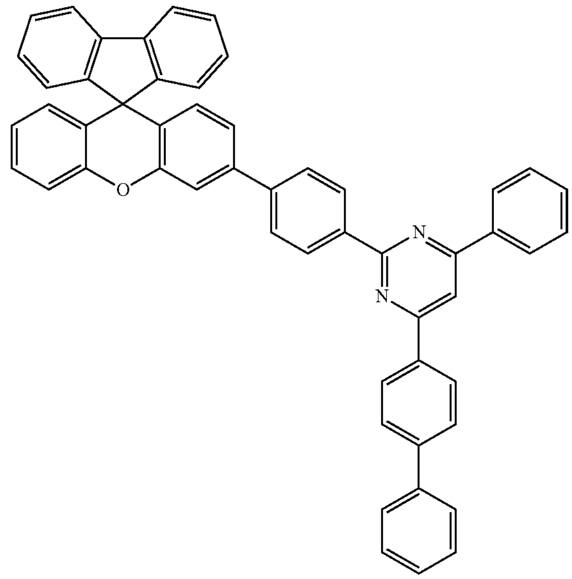
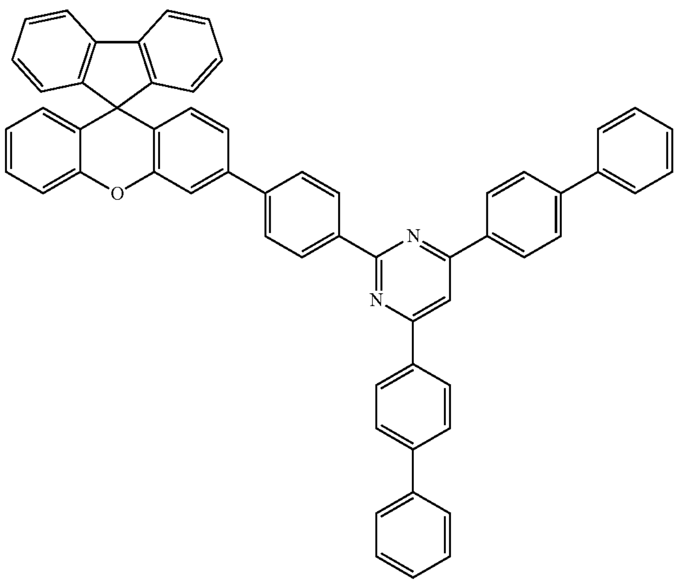
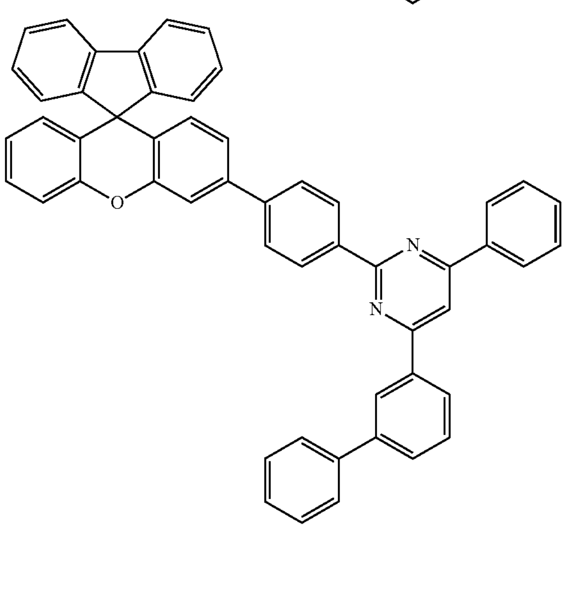

-continued
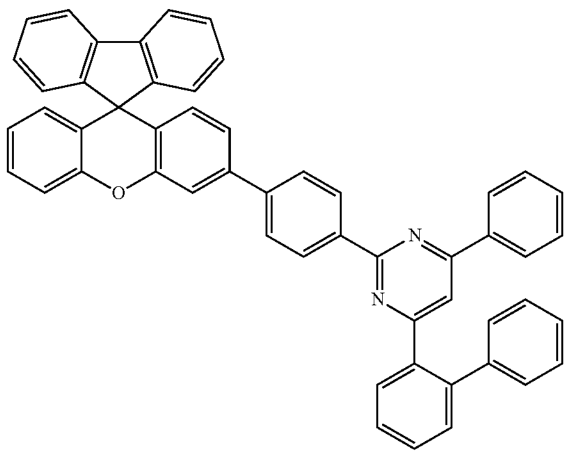
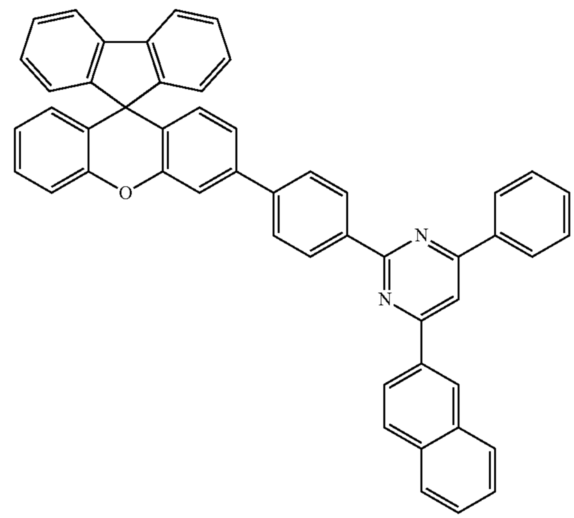
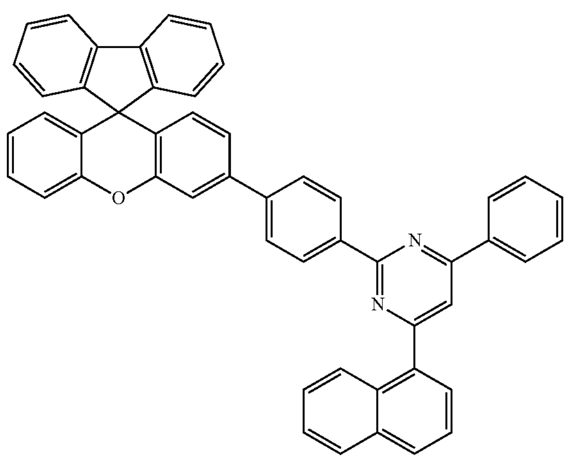
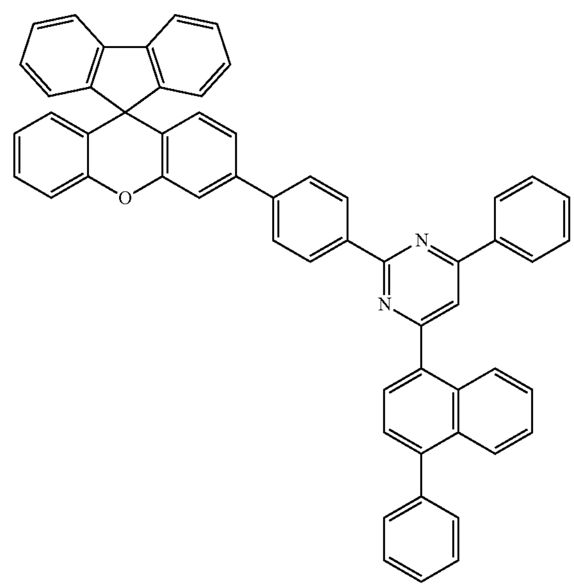
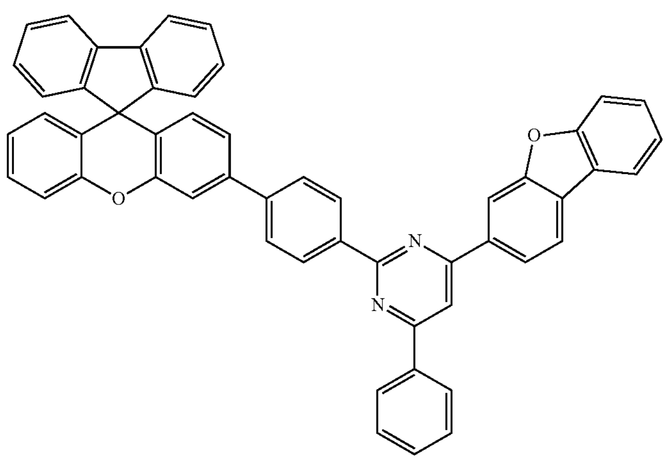

-continued
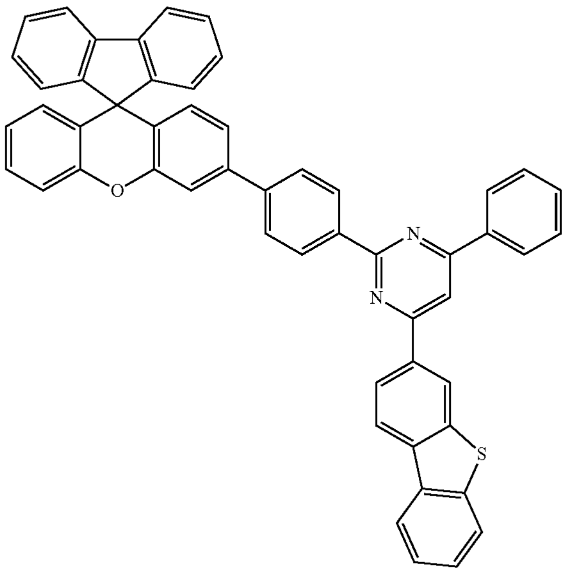
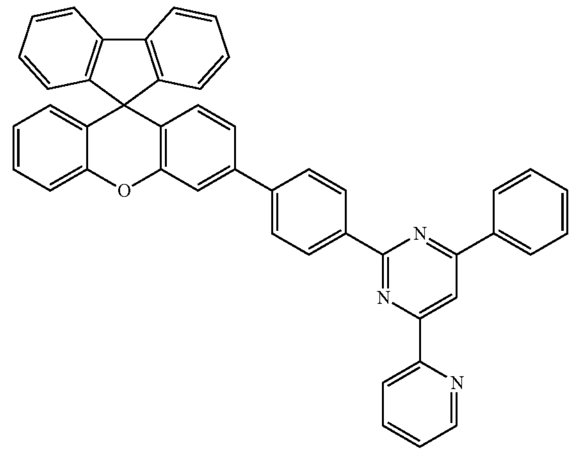
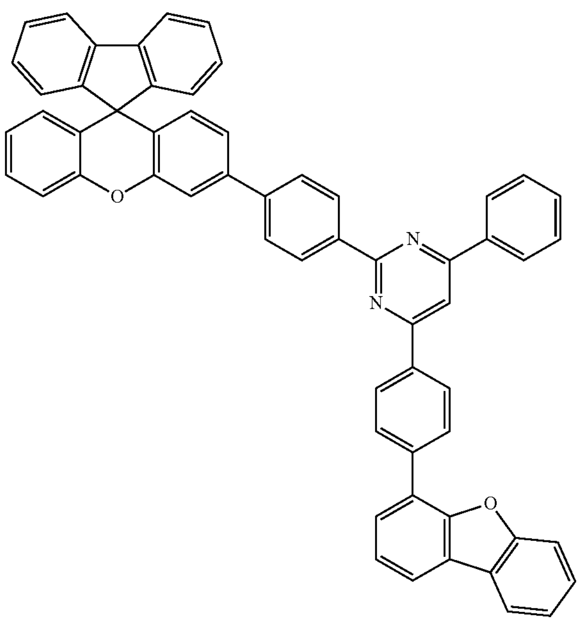
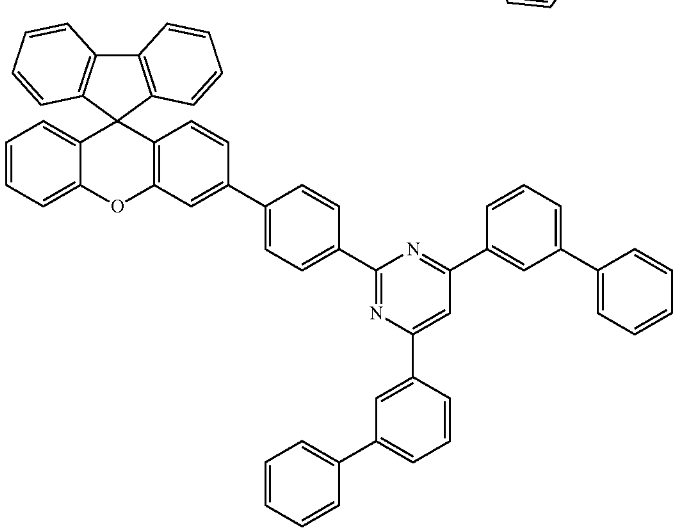

-continued
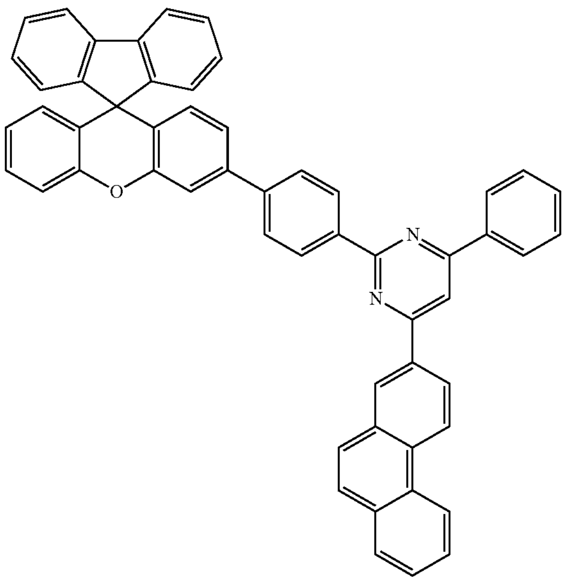
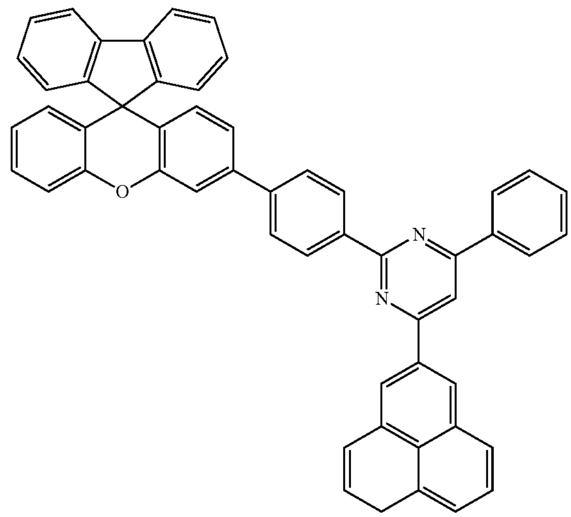
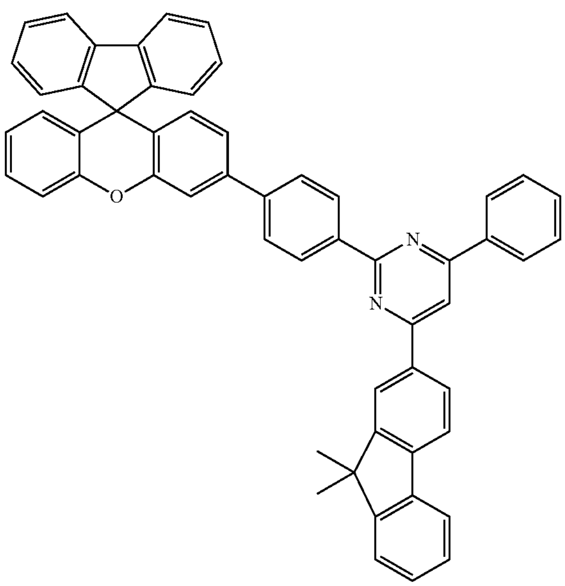
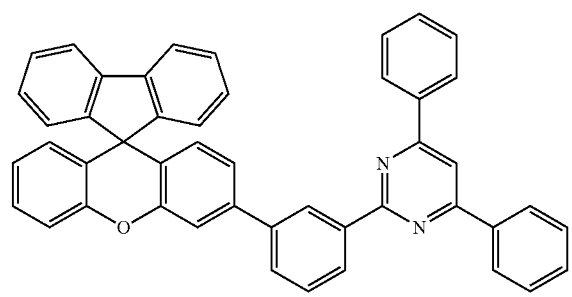
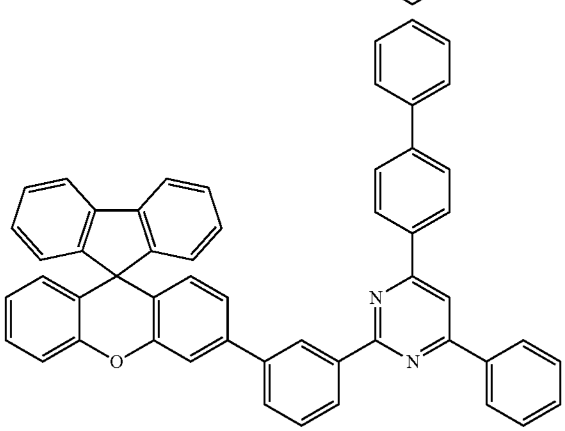

-continued
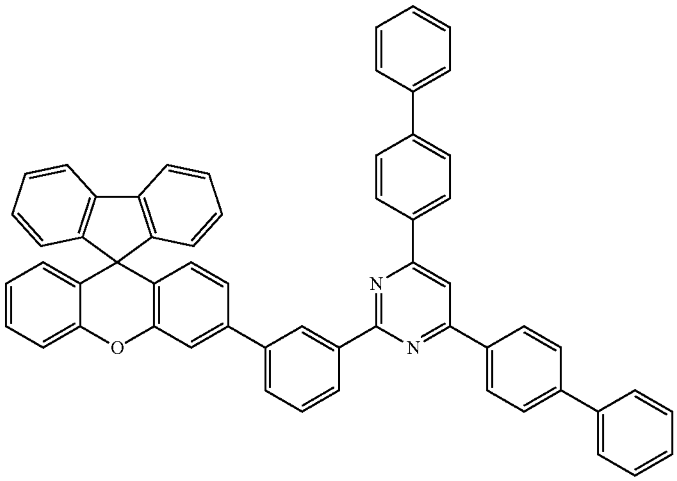
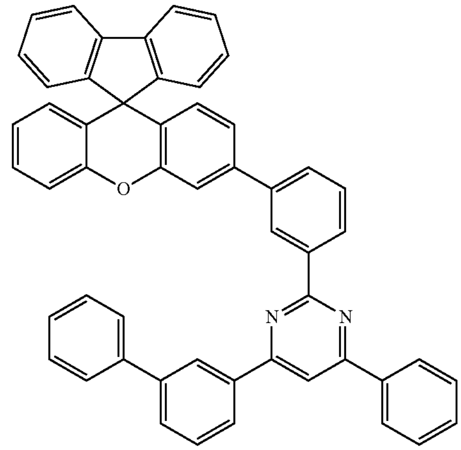
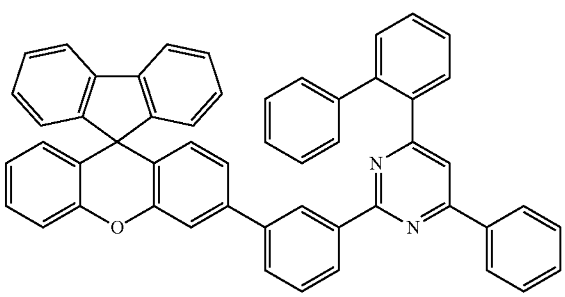
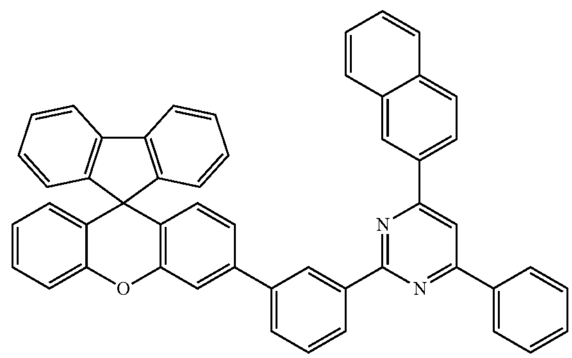
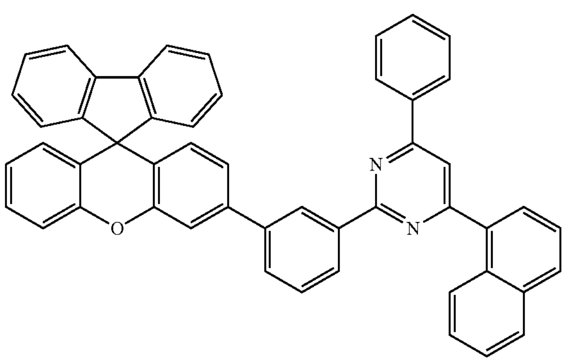
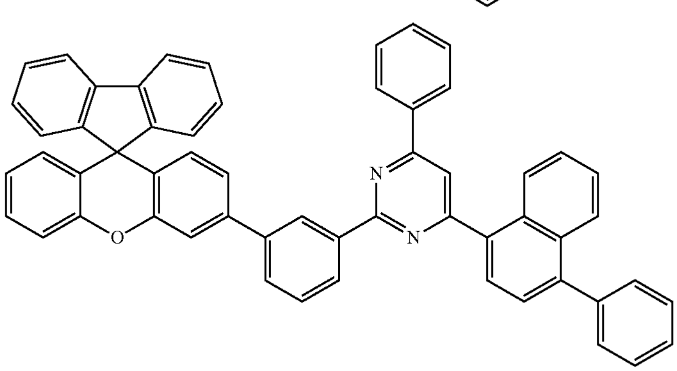

-continued
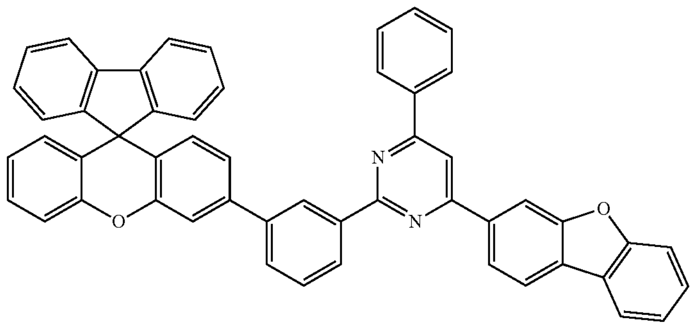
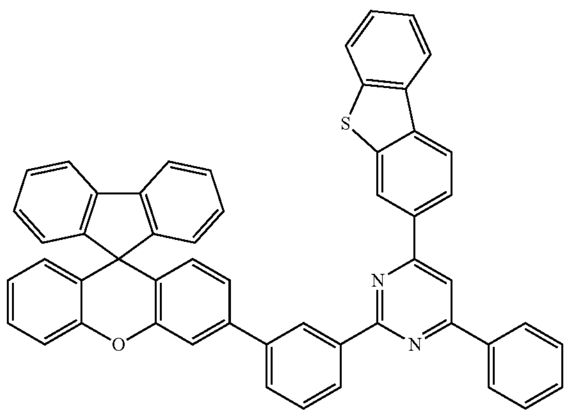
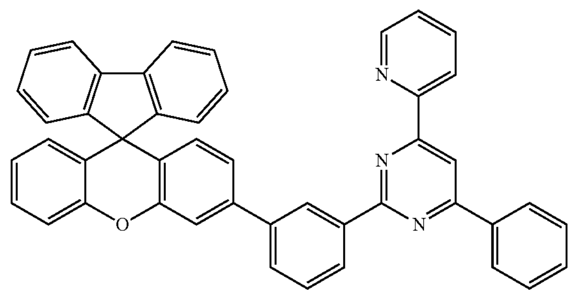
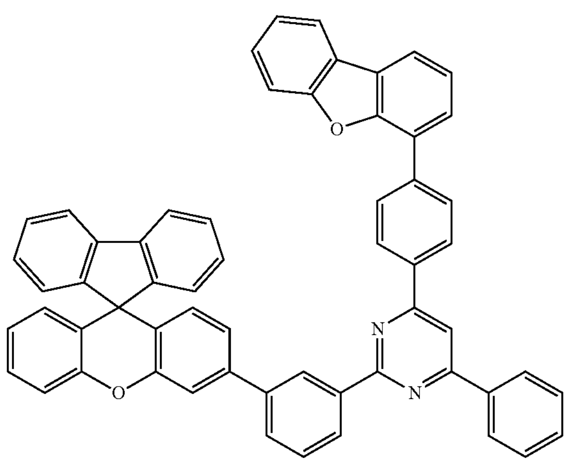
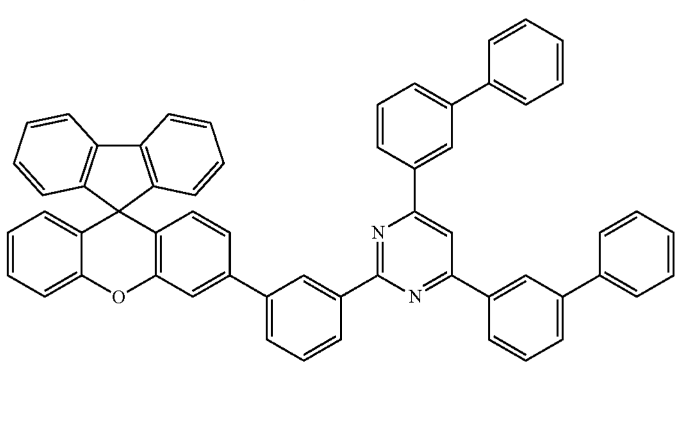

-continued
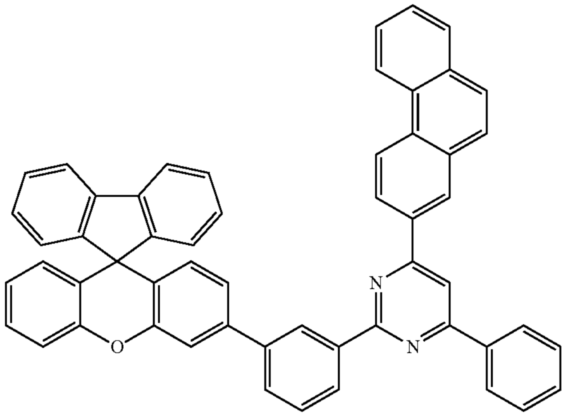
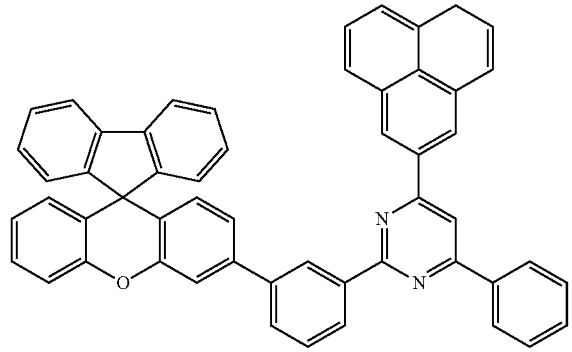
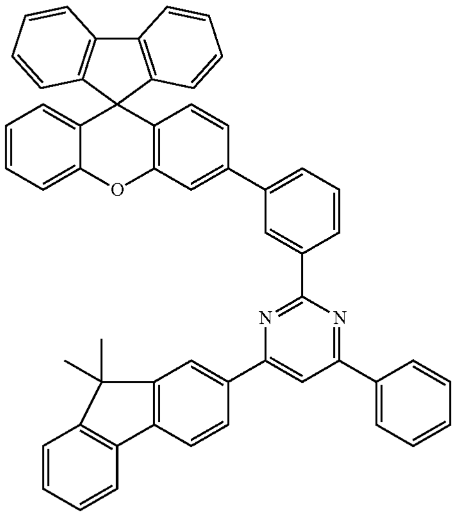
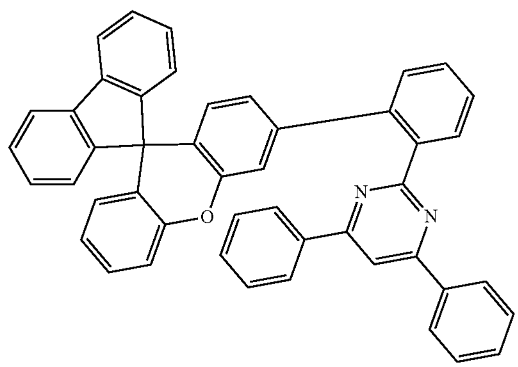
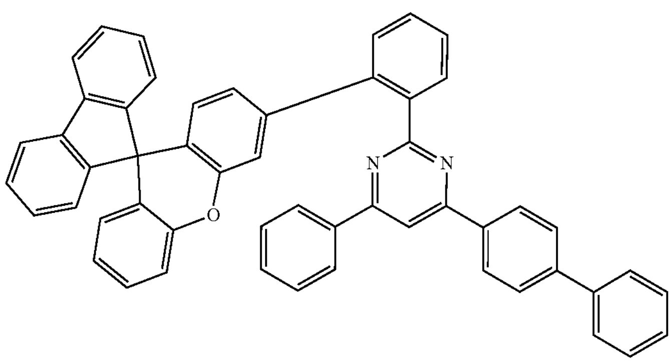
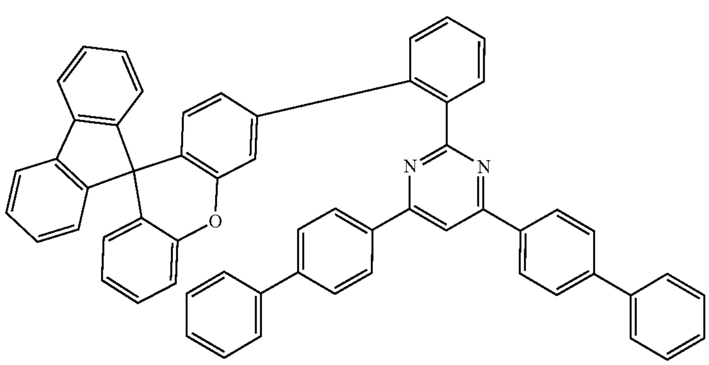

-continued
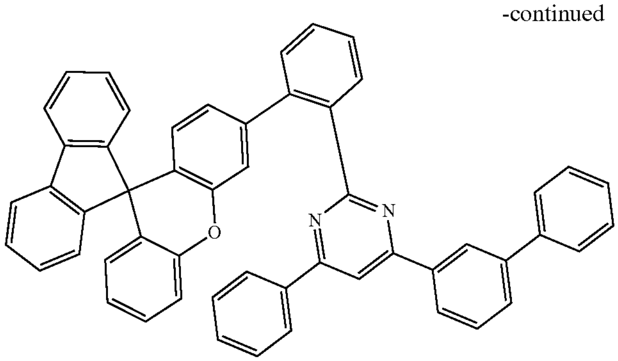
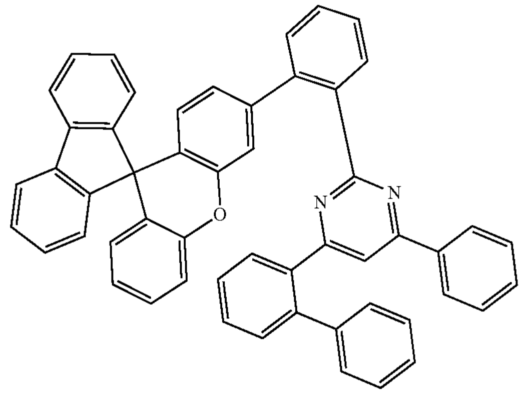
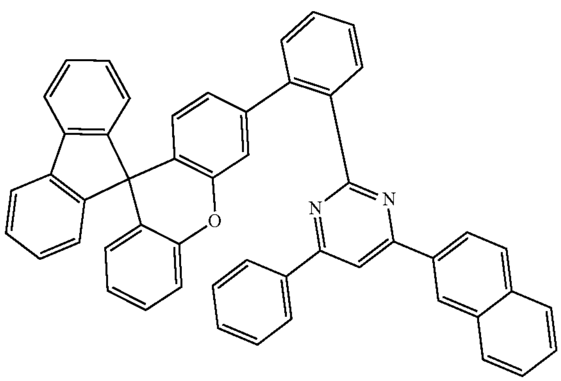
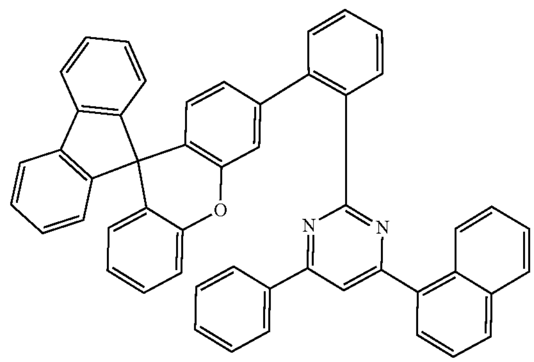
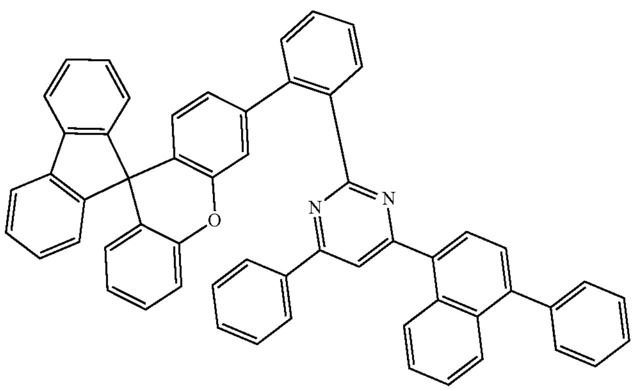
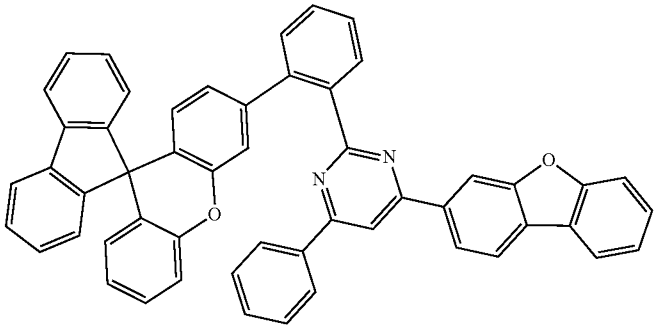

-continued
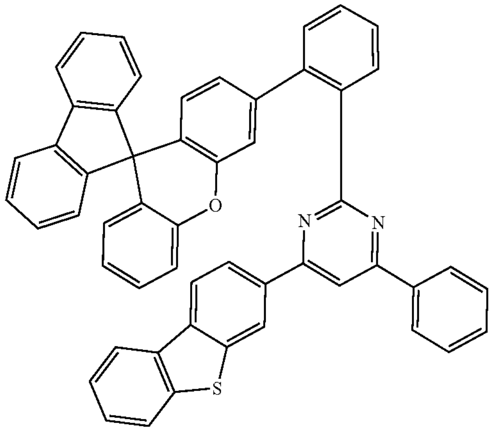
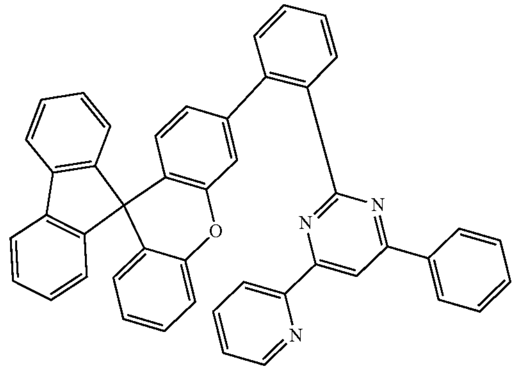
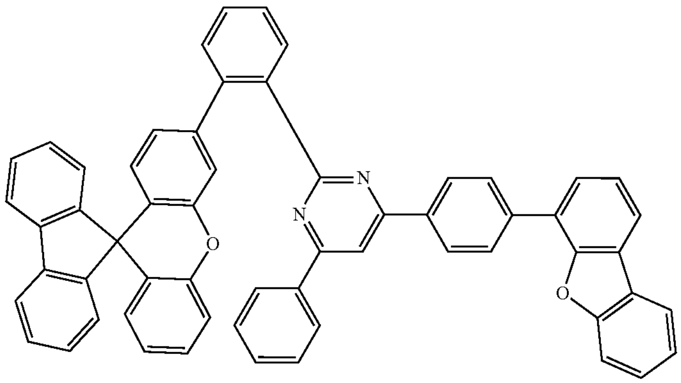
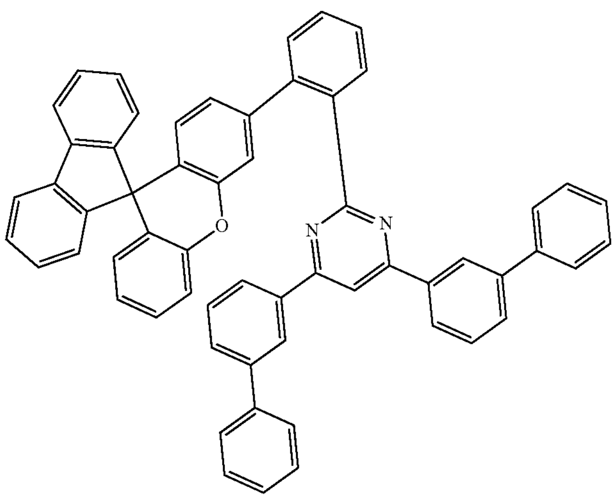
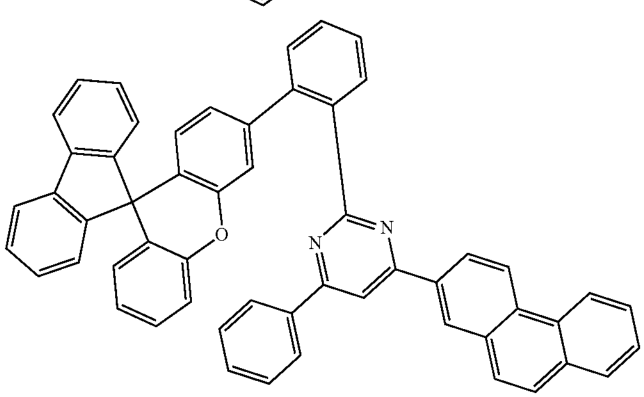

-continued
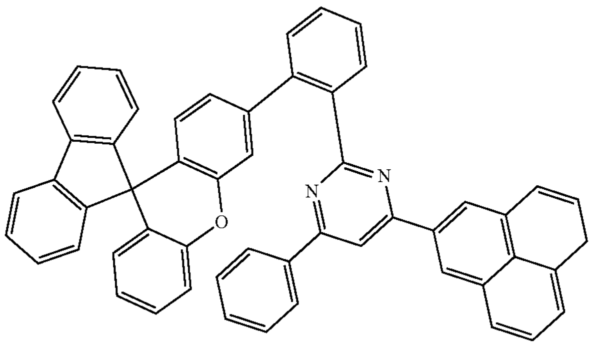
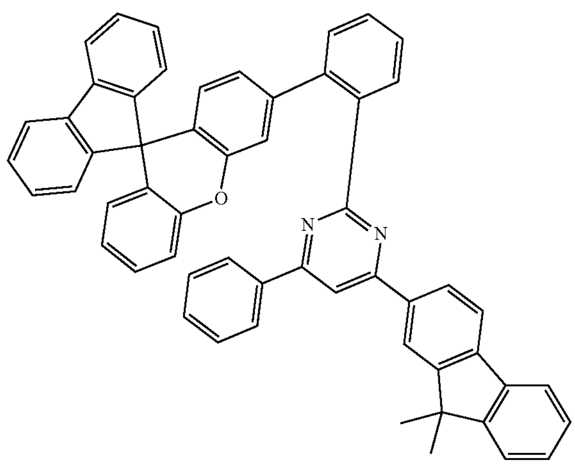
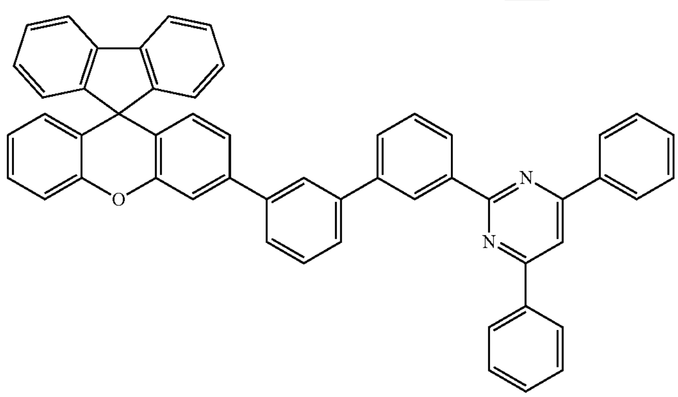
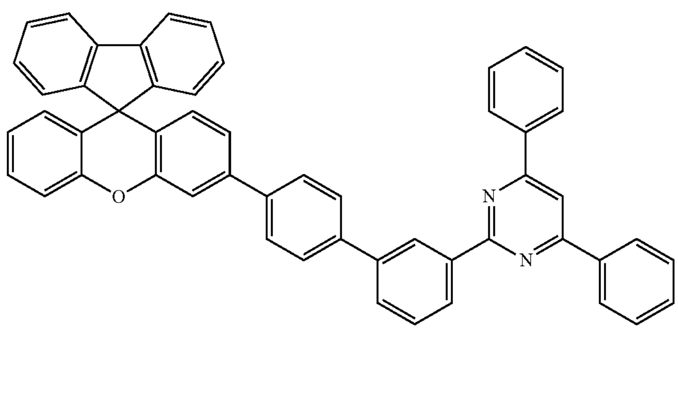

-continued
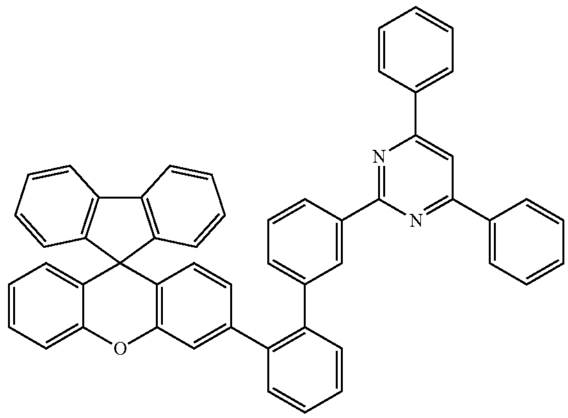
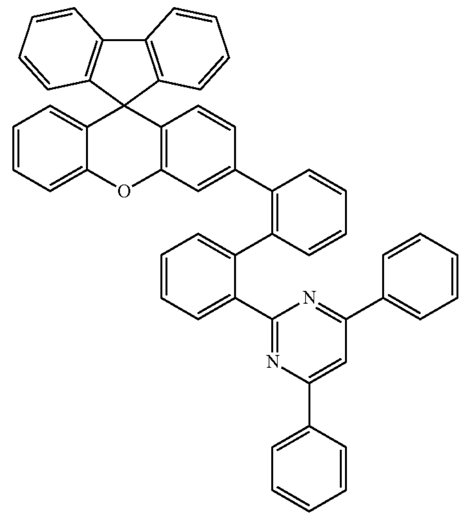
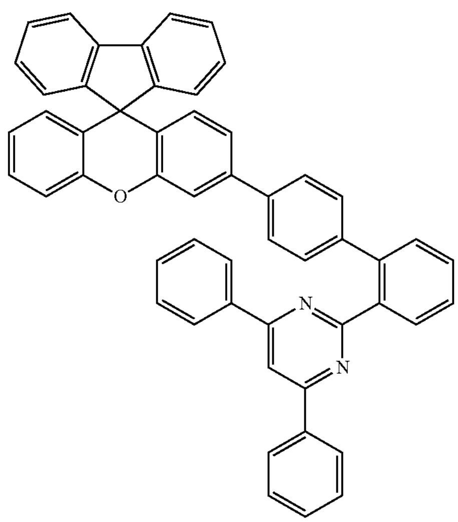
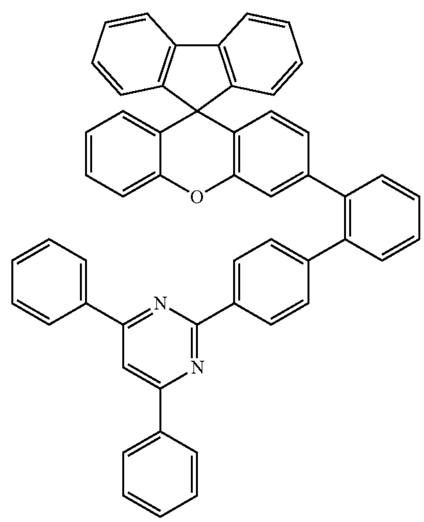
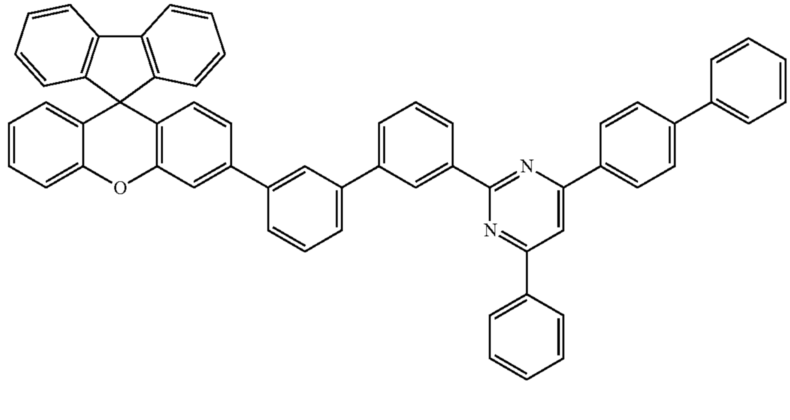

-continued
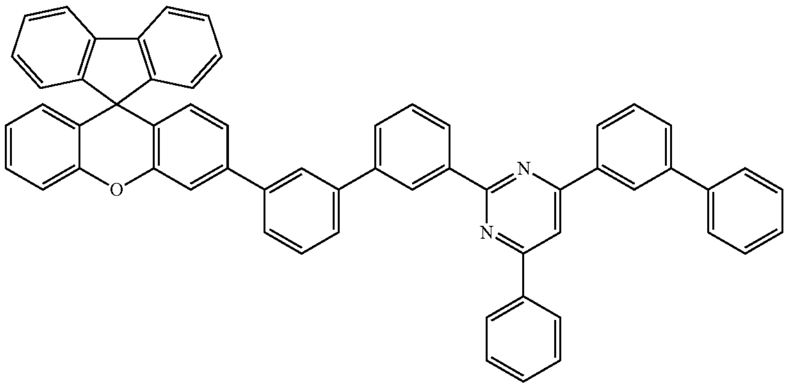
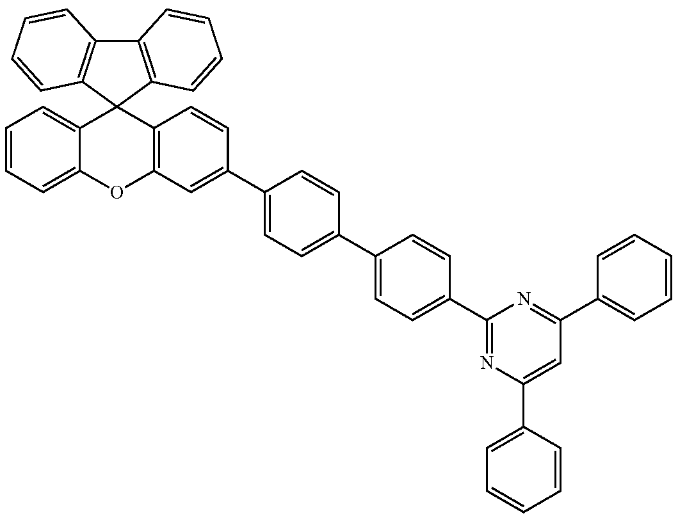
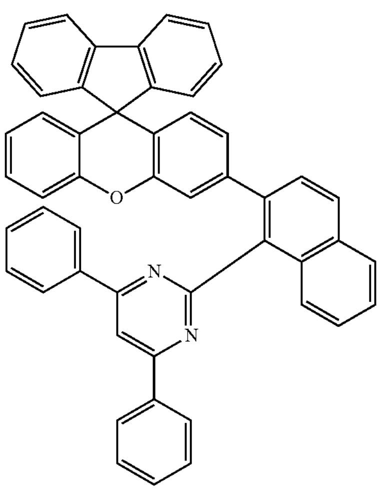
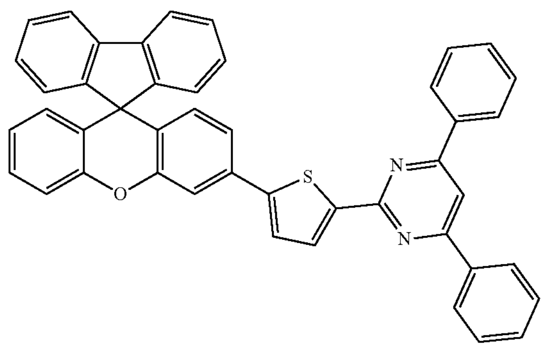
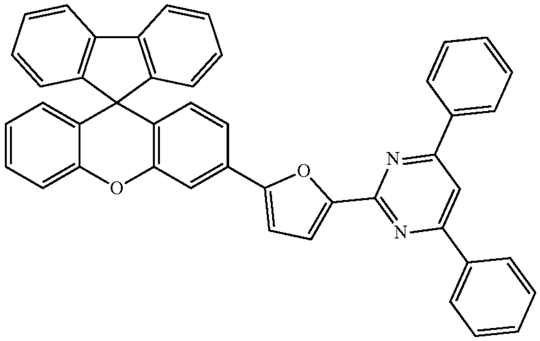

-continued
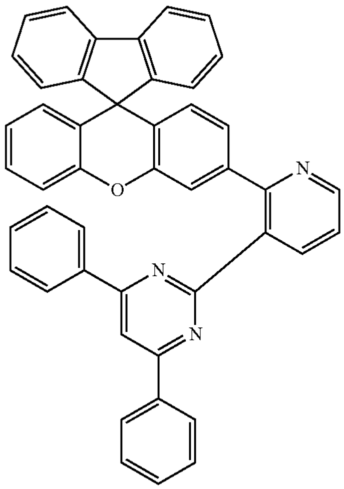
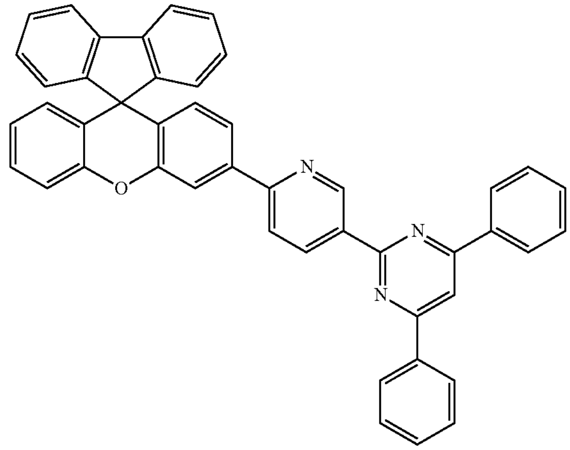
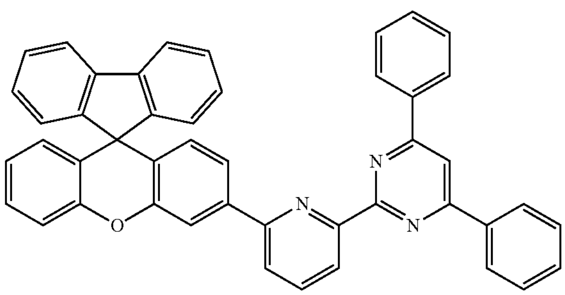
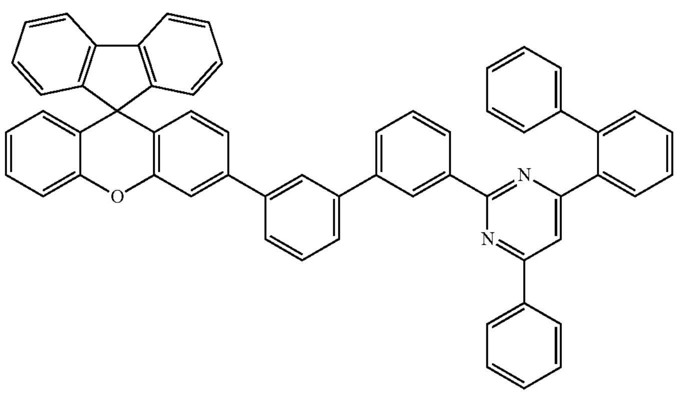
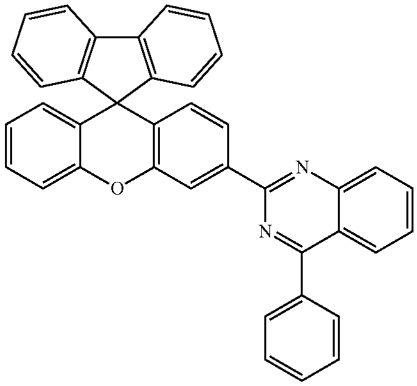
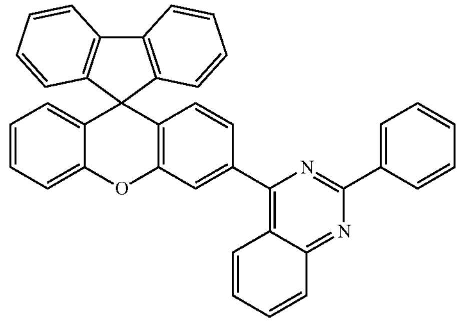

-continued
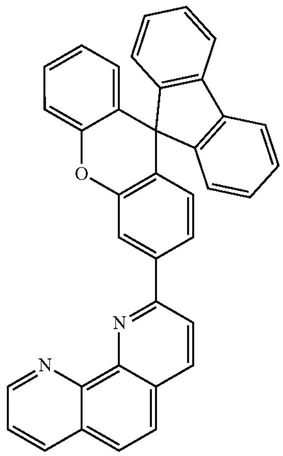
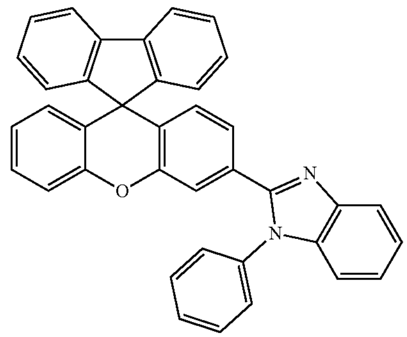
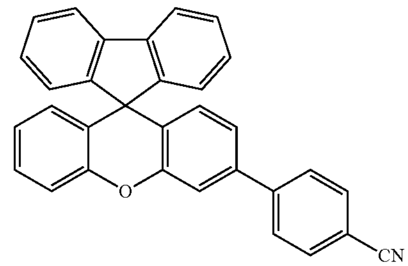
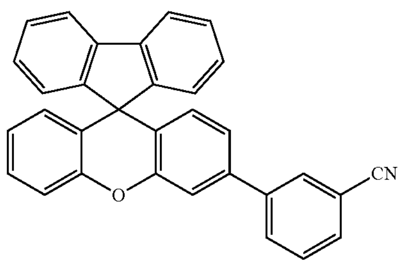
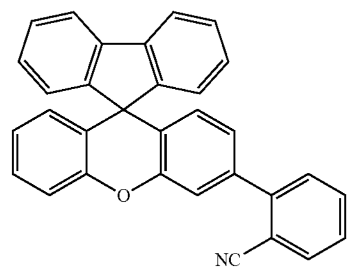
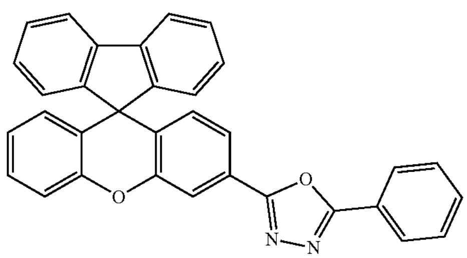
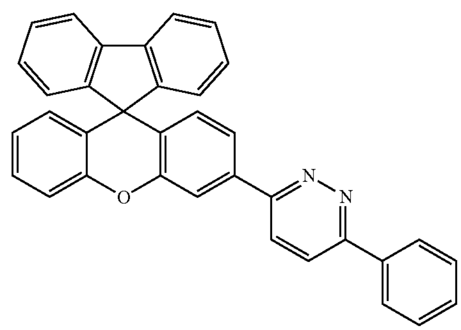
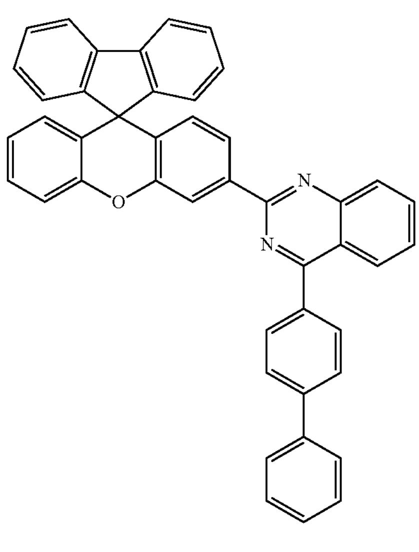
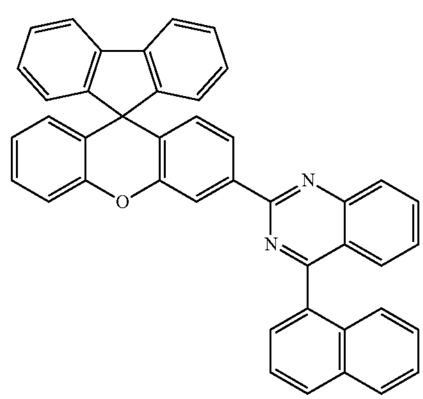

-continued
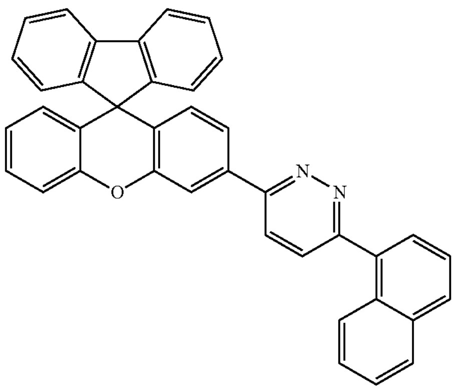
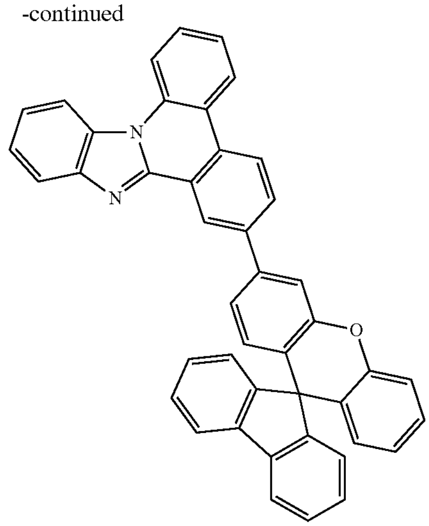
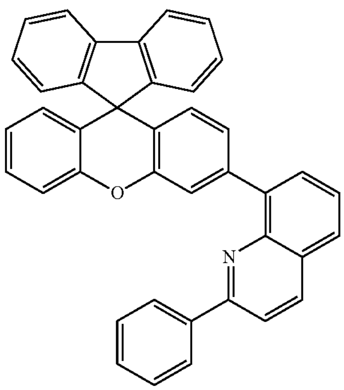
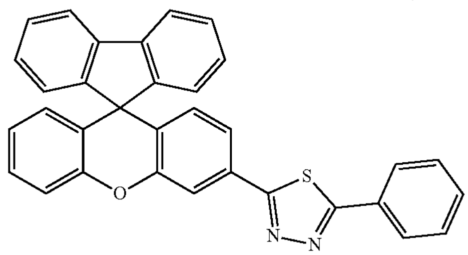
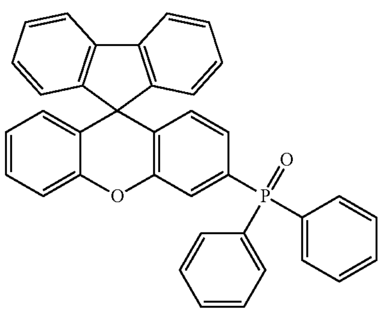
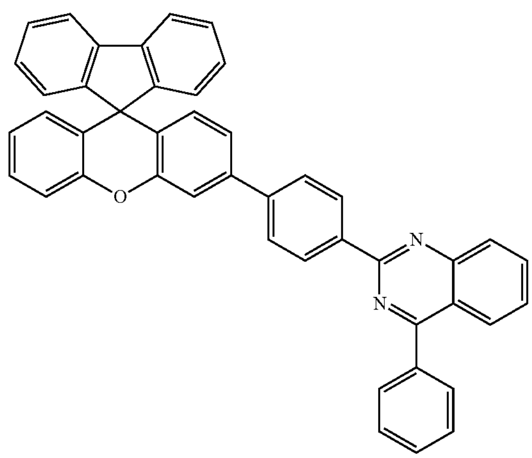
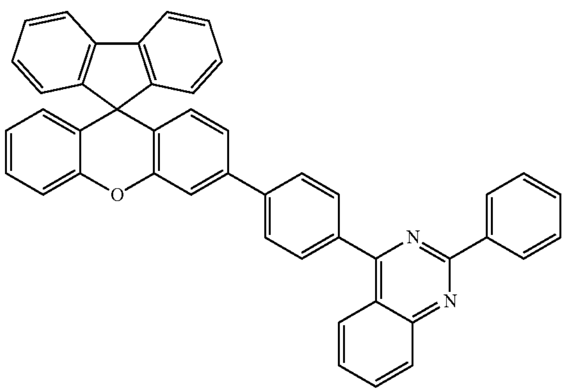

-continued
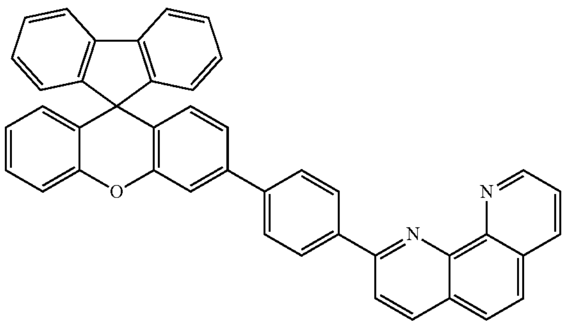
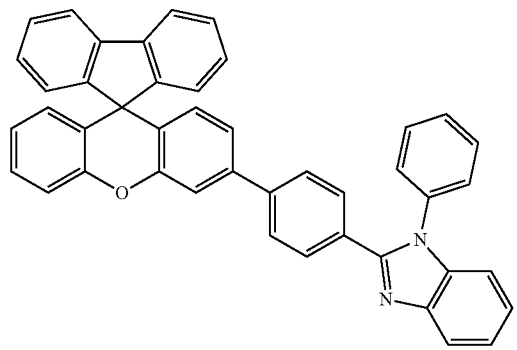
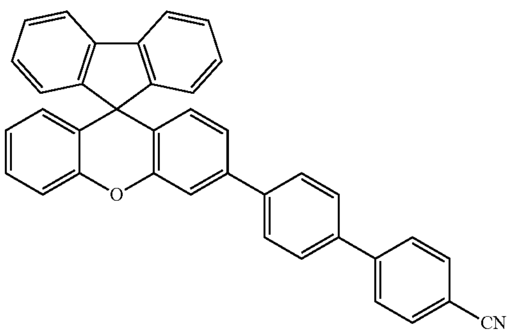
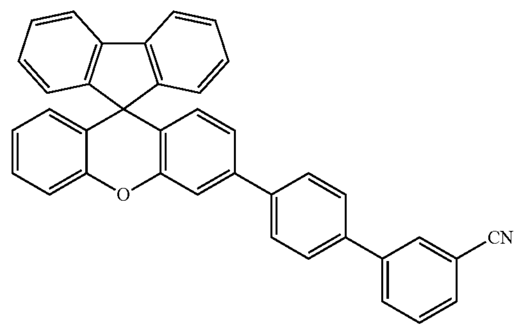
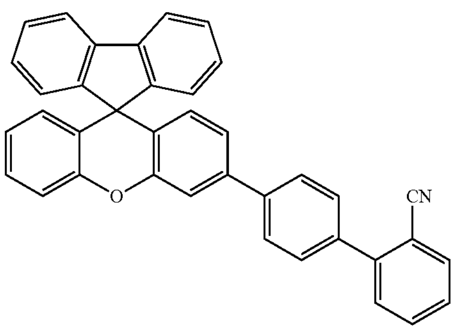
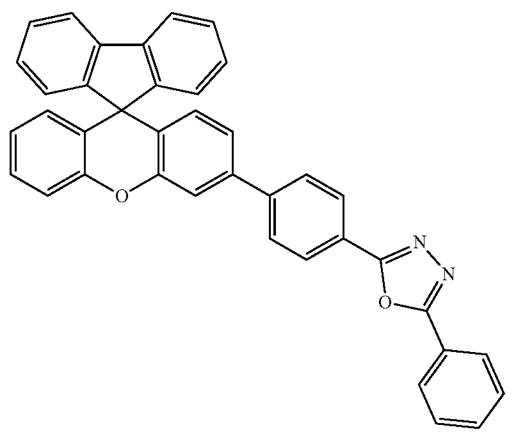
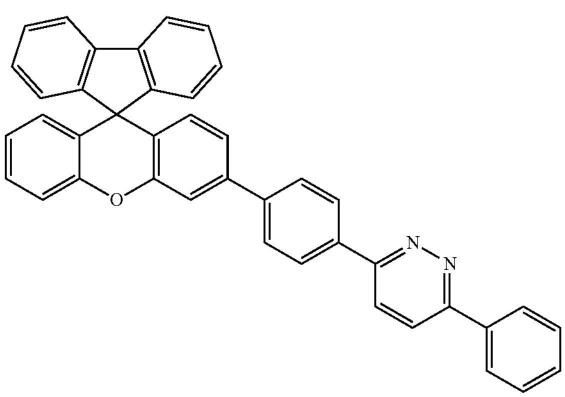
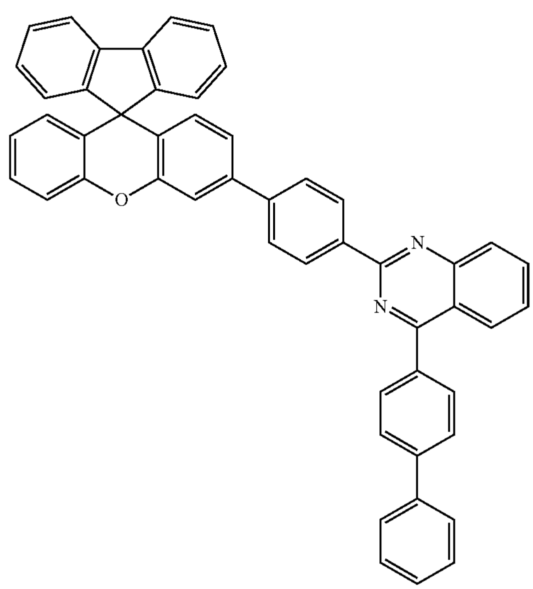

-continued
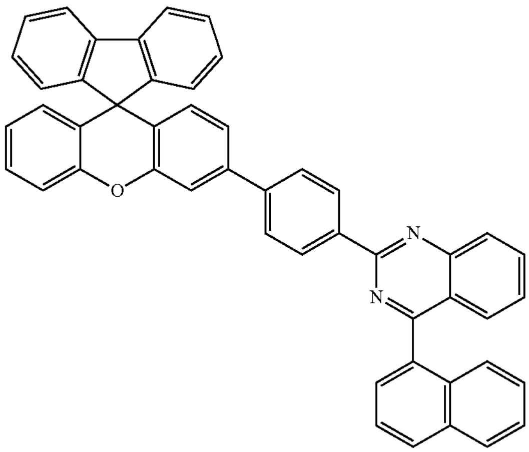
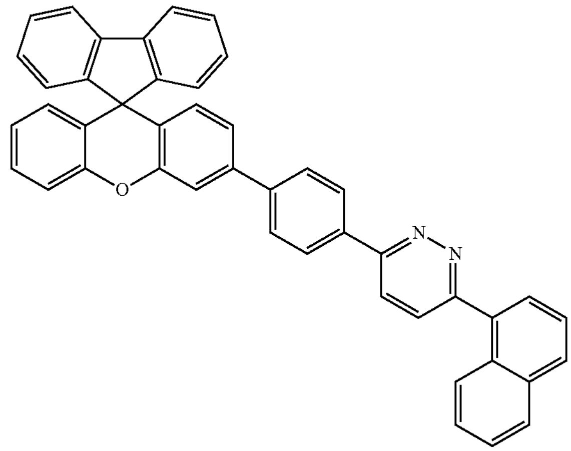
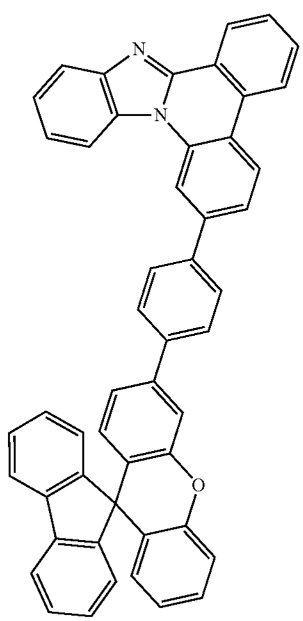
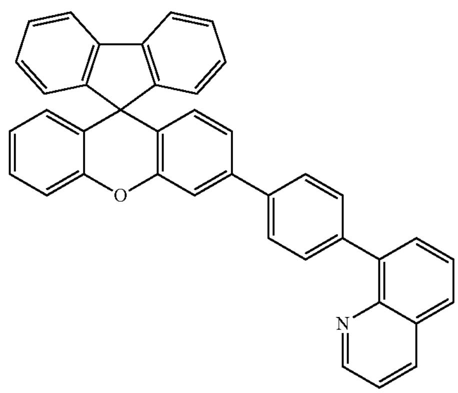
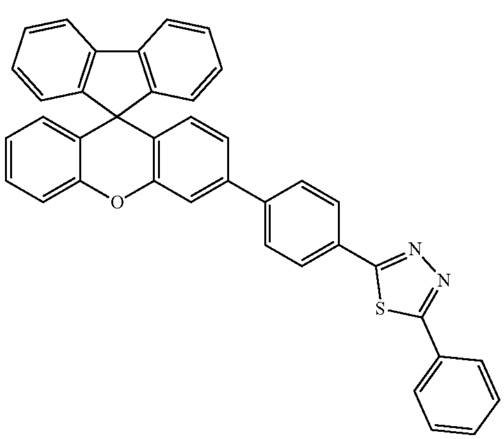
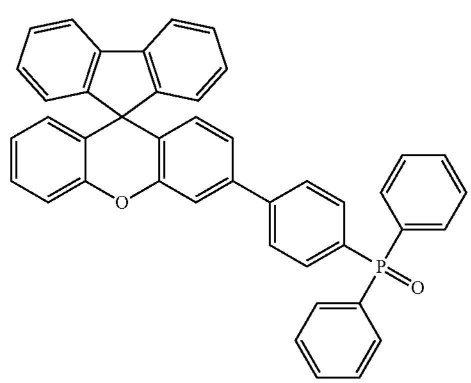

-continued
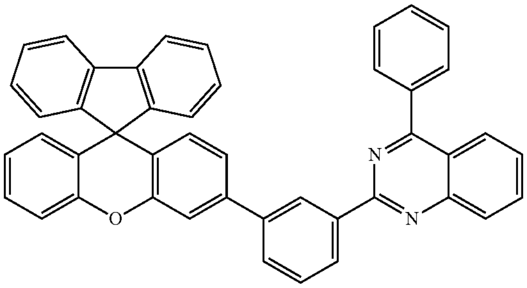
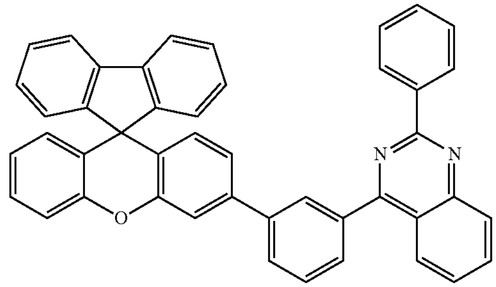
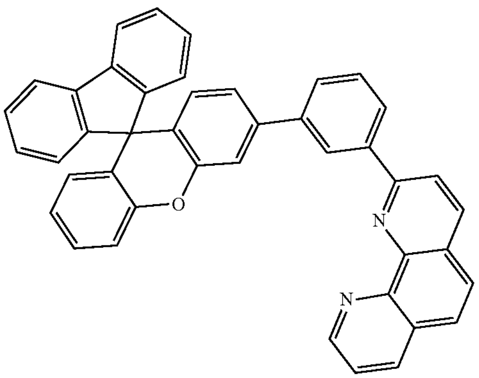
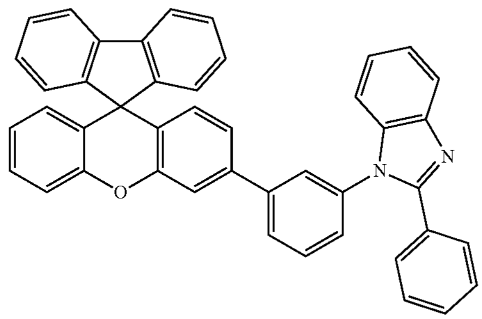
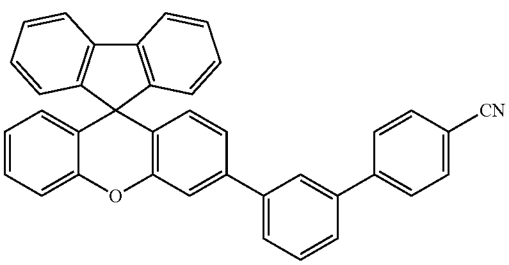
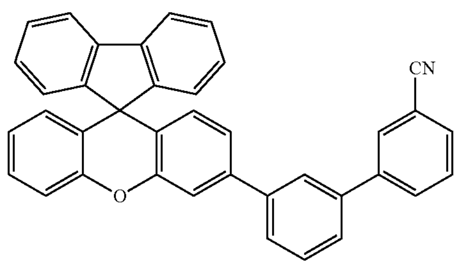
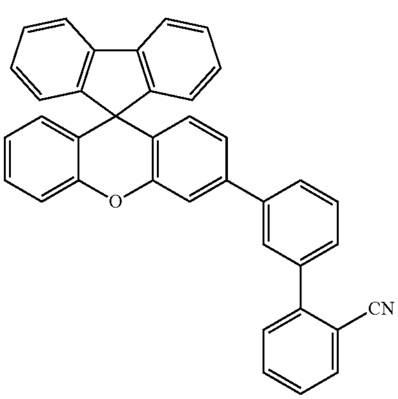
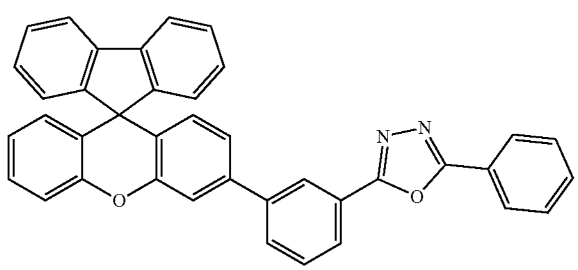

-continued
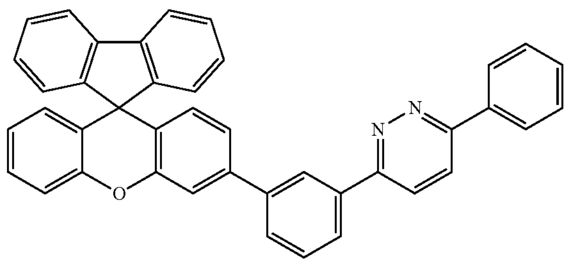
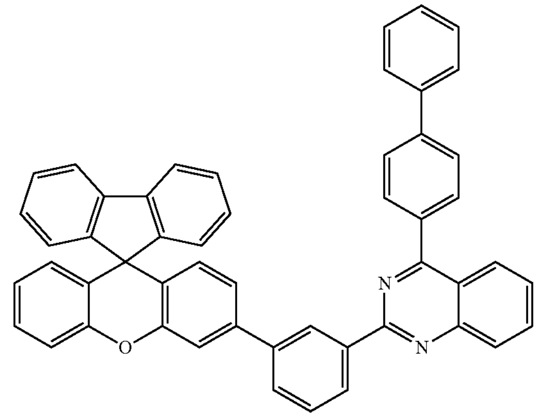
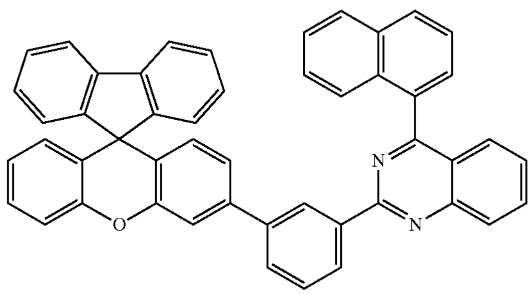
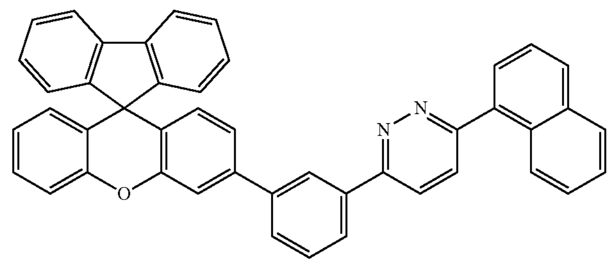
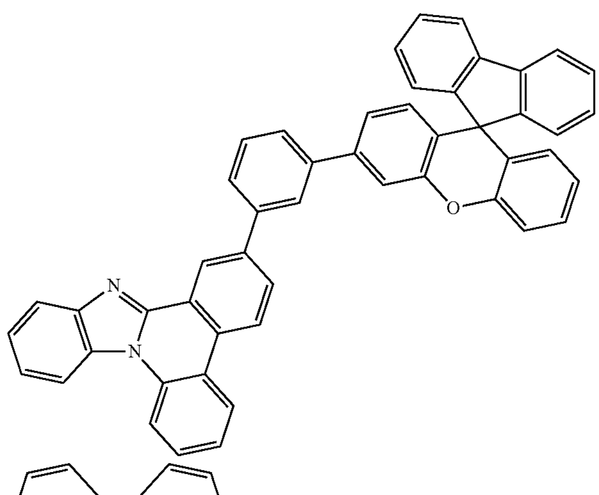
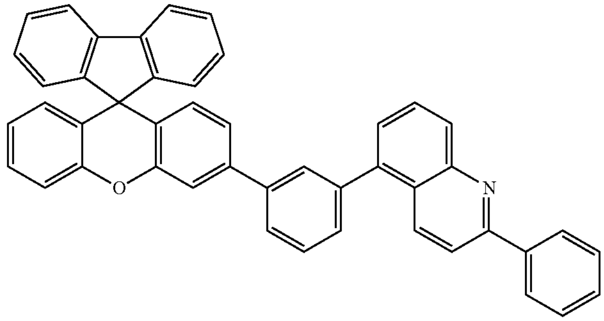

-continued
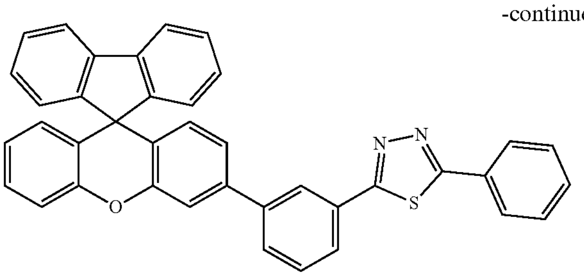
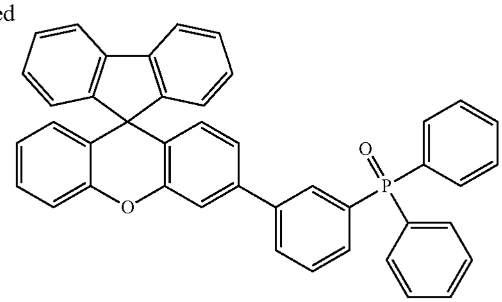
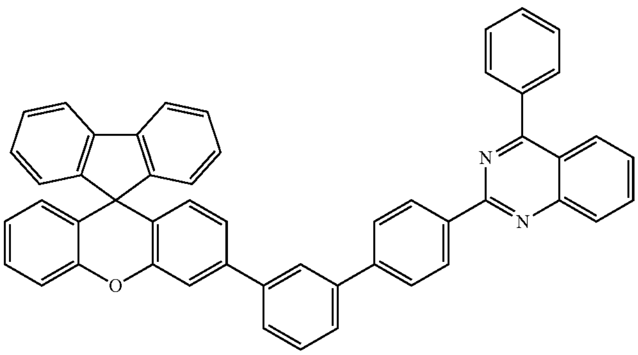
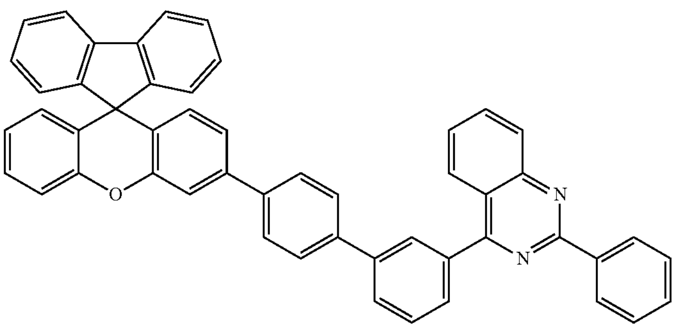
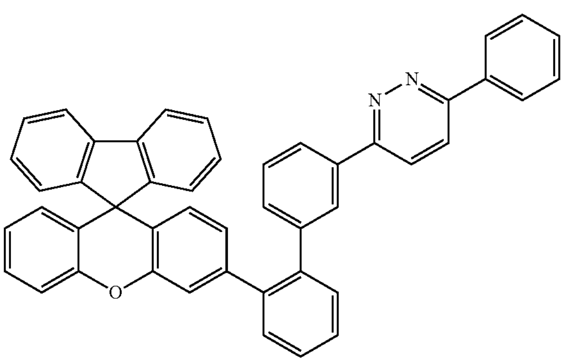
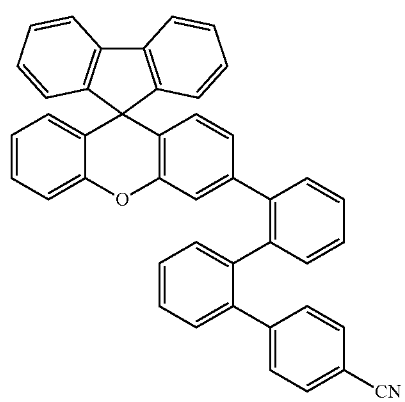

-continued
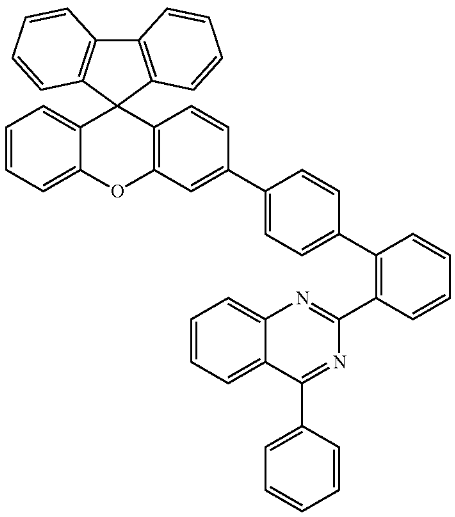
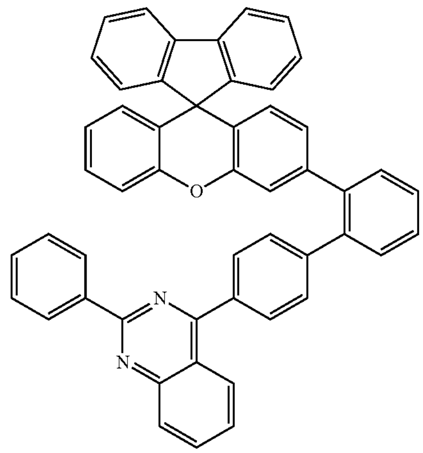
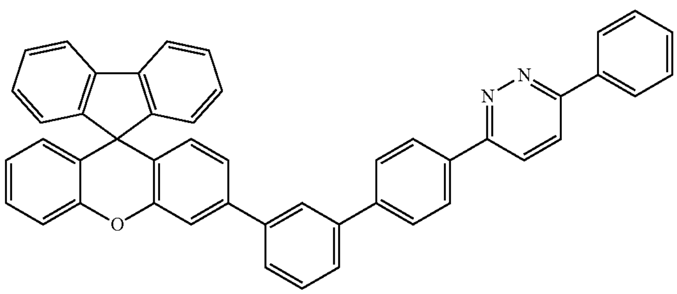
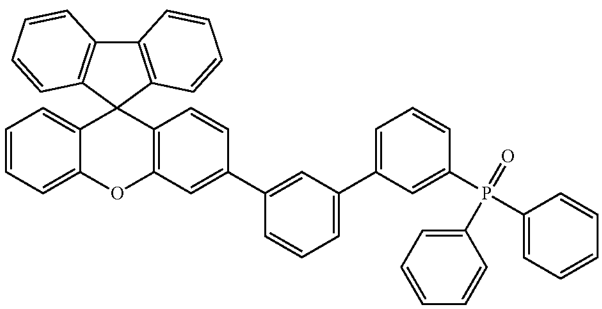
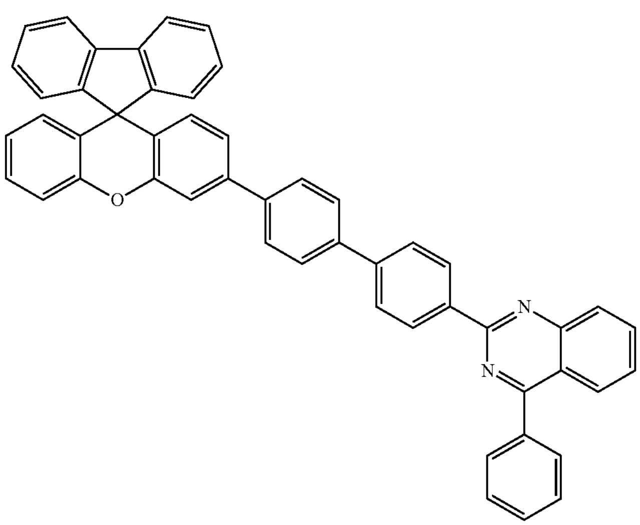
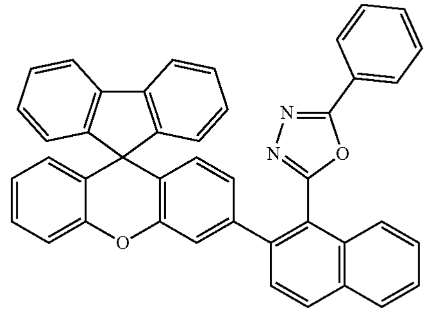

-continued
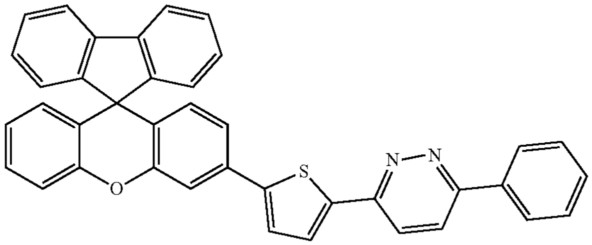
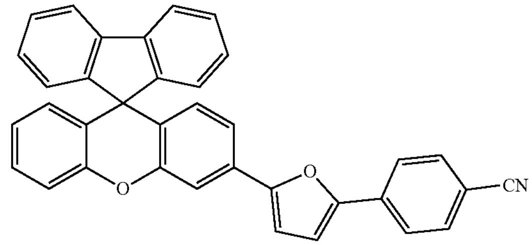
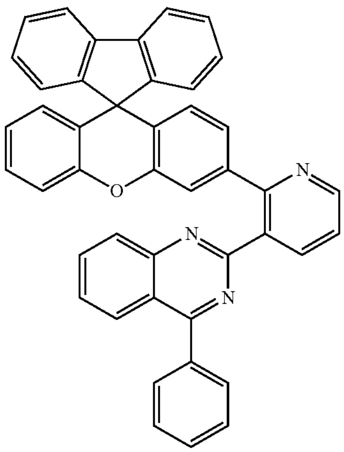
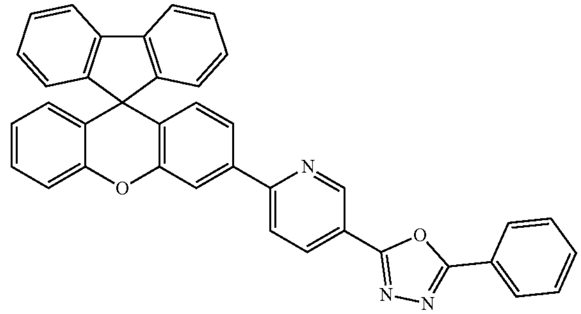
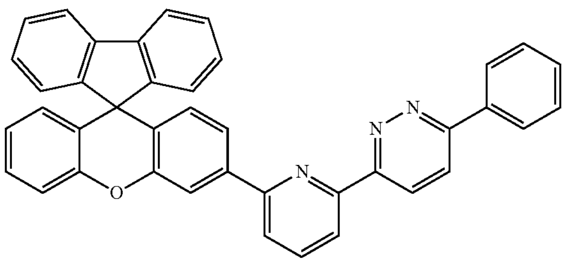
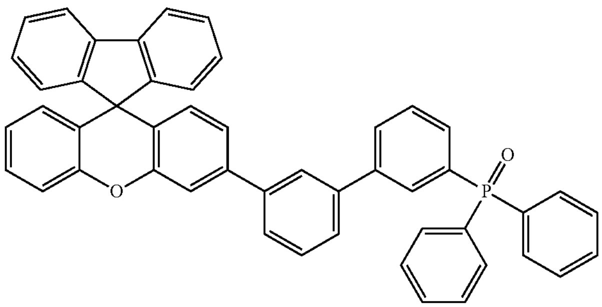
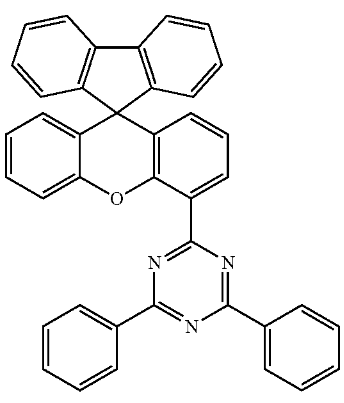
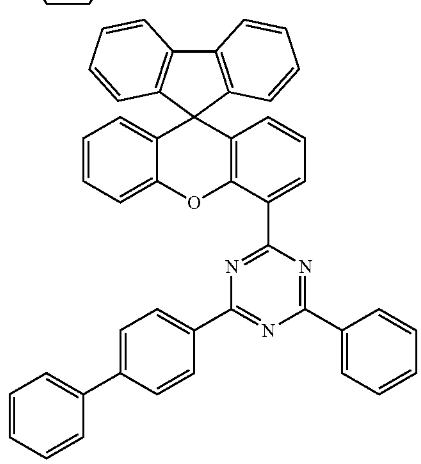

-continued
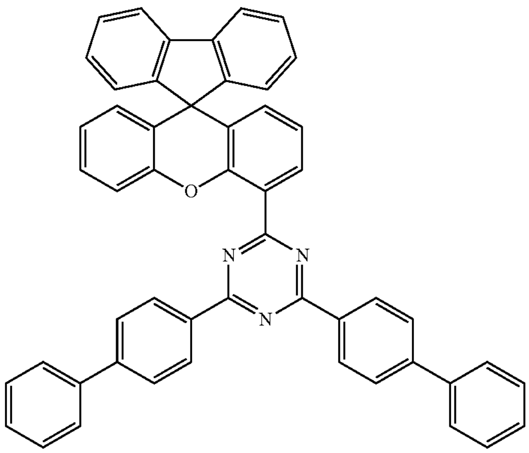
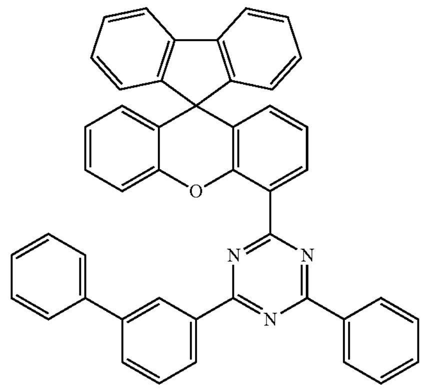
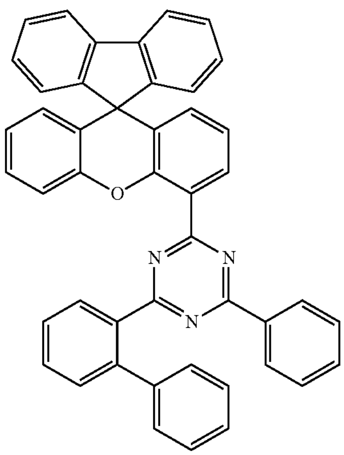
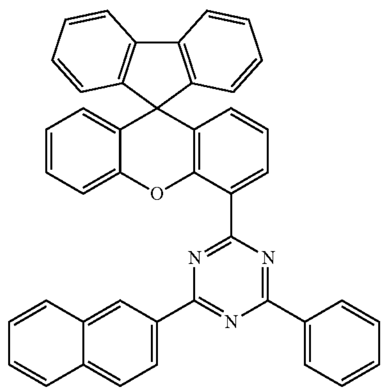
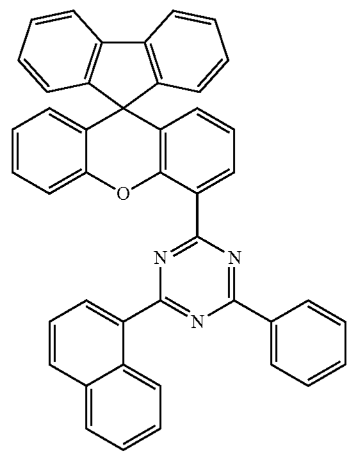
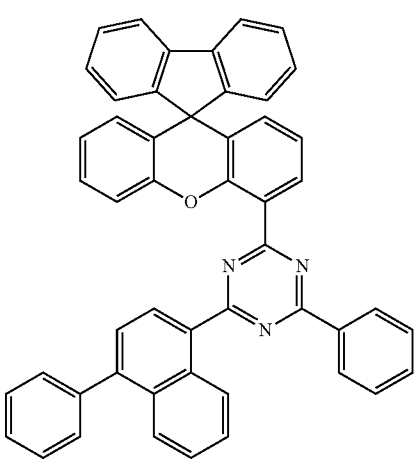
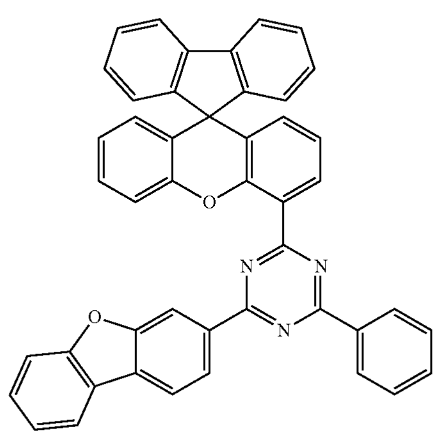

-continued
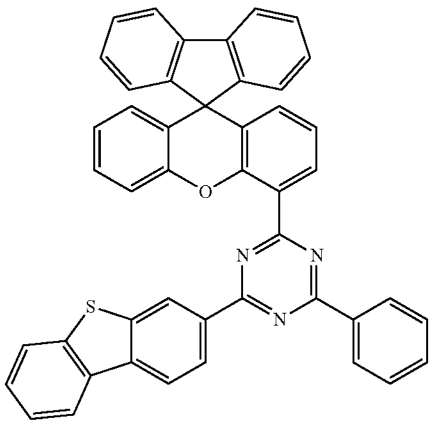
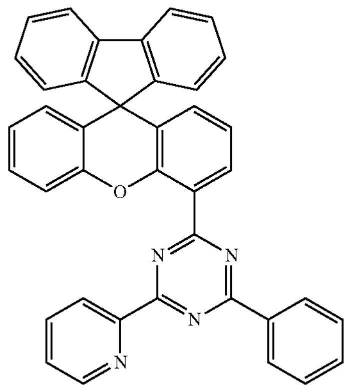
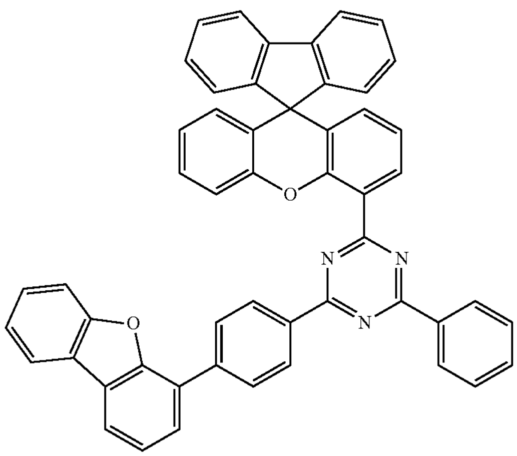
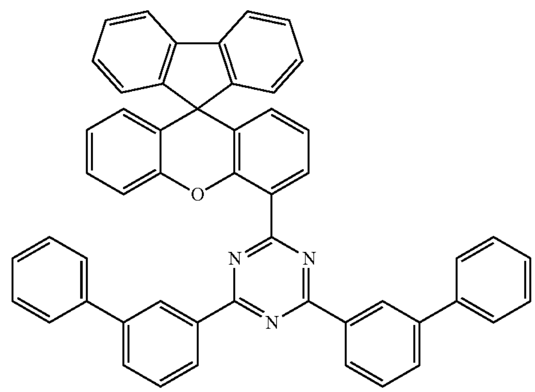
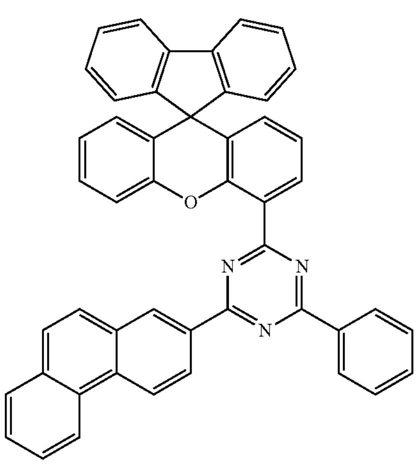
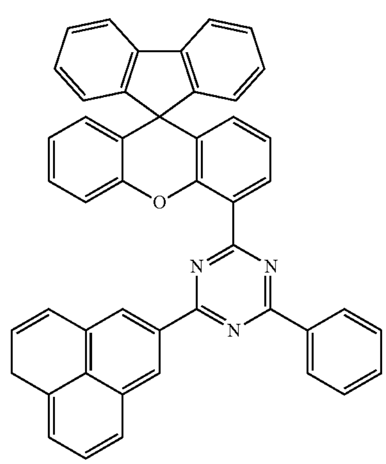

-continued
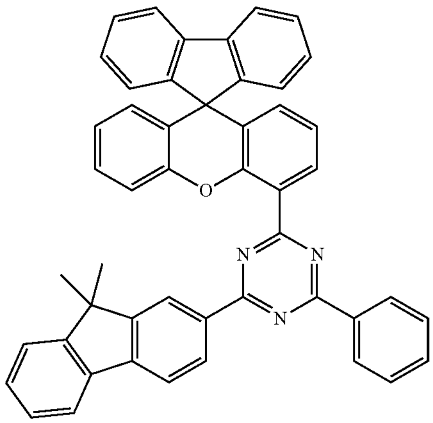
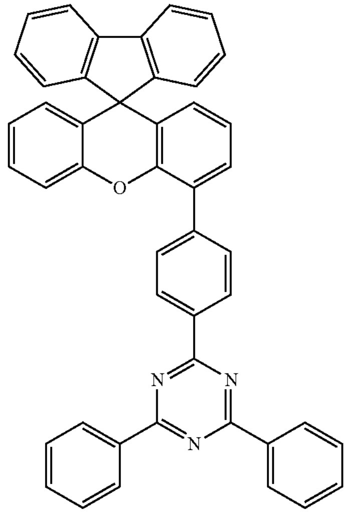
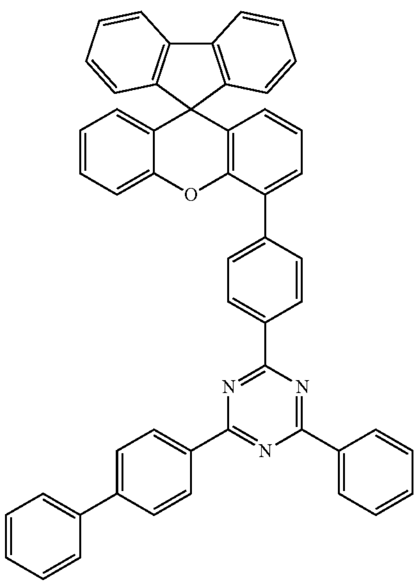
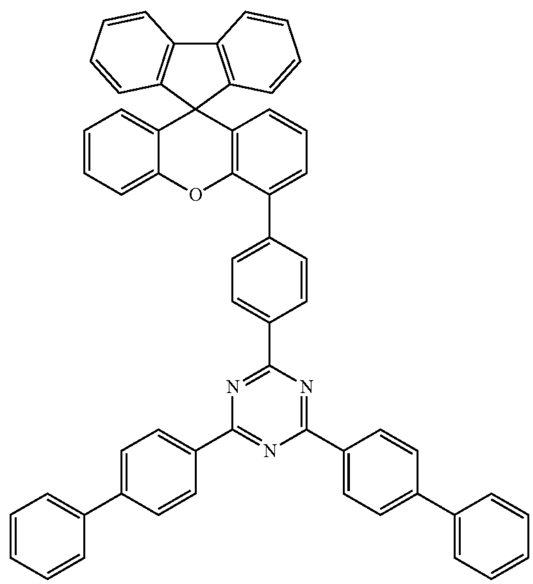
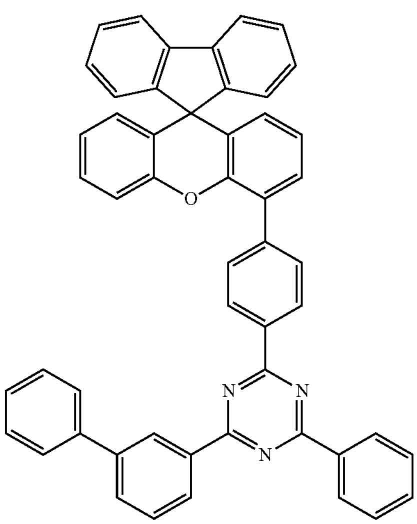
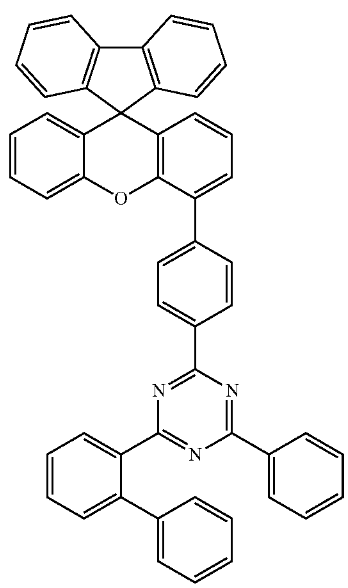

-continued
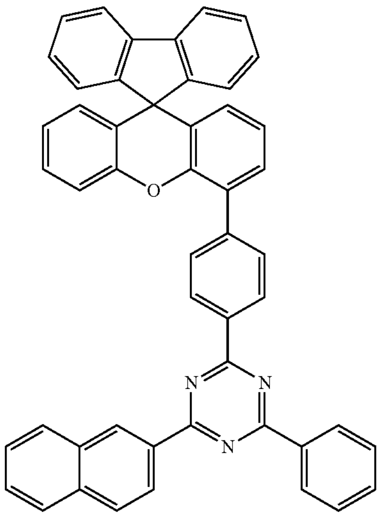
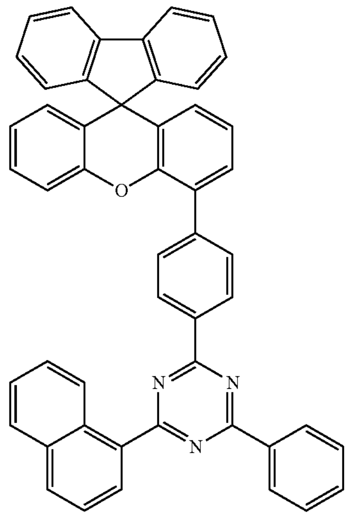
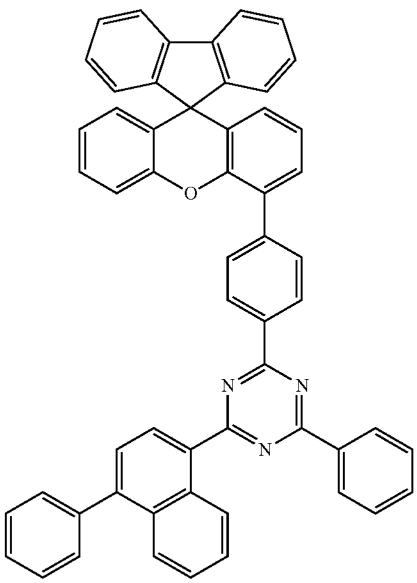
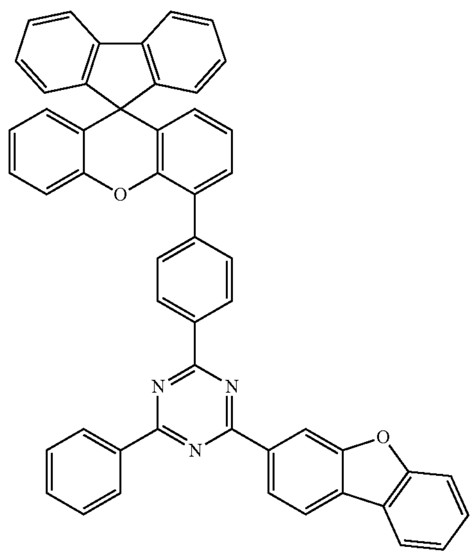
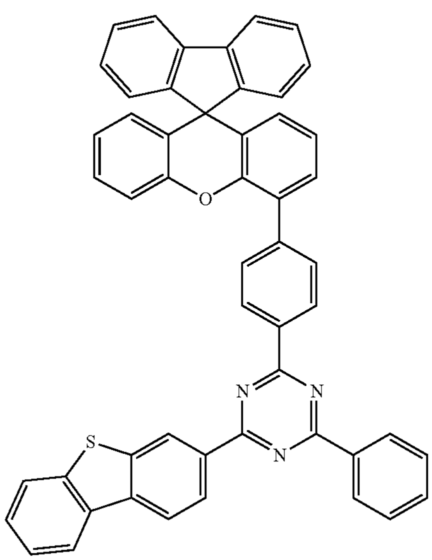
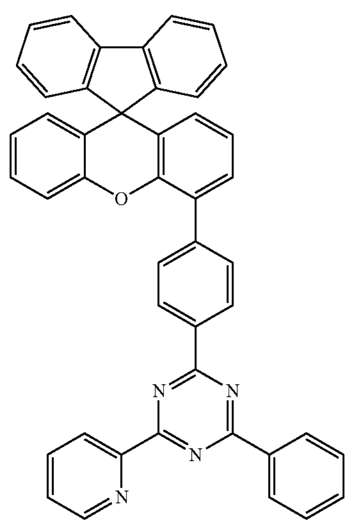

-continued
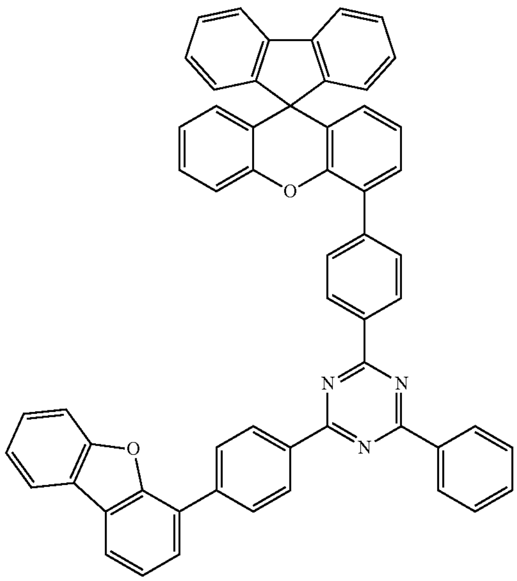
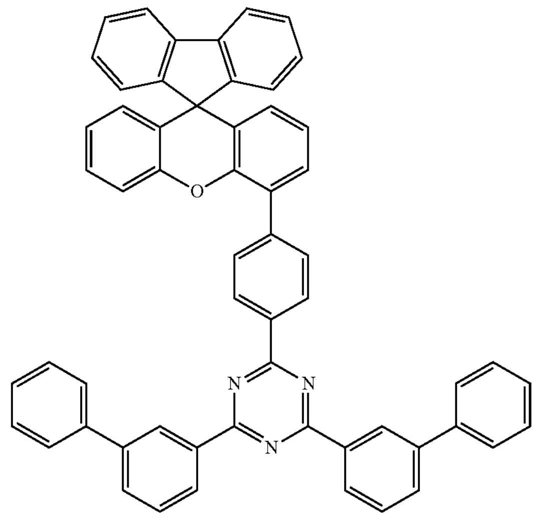
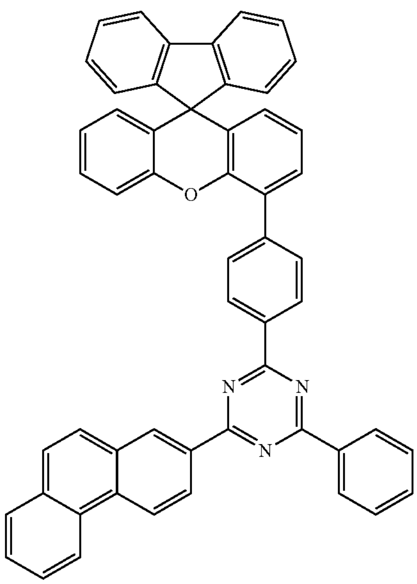
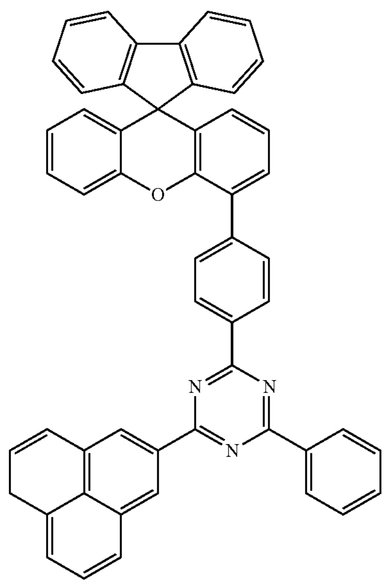
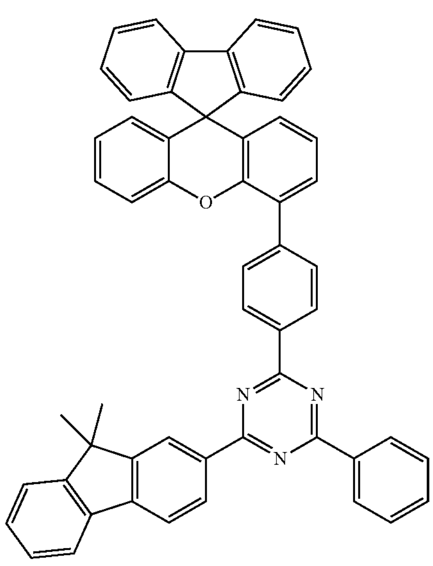
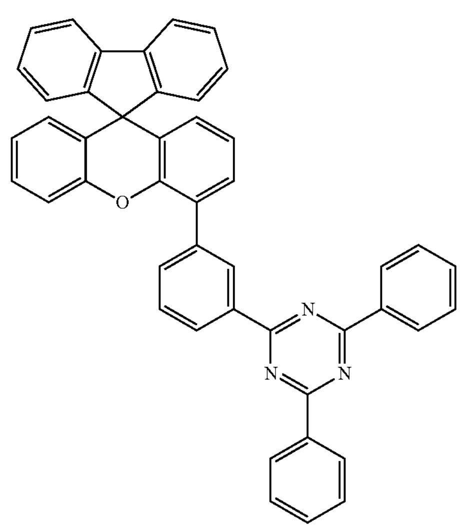

-continued
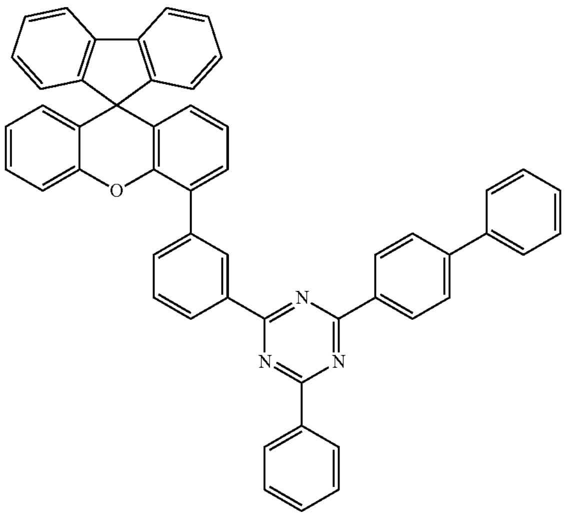
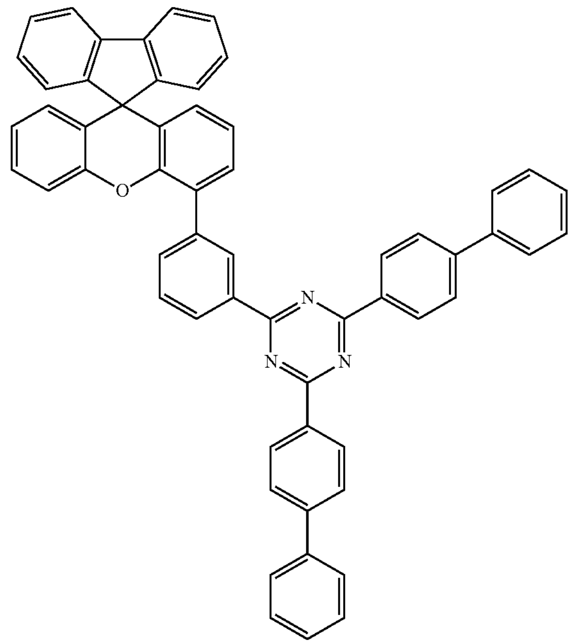
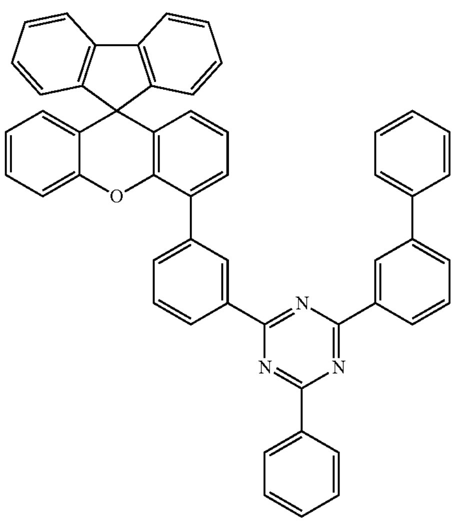
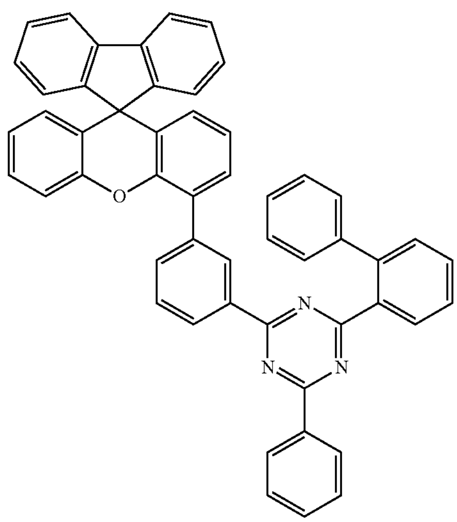
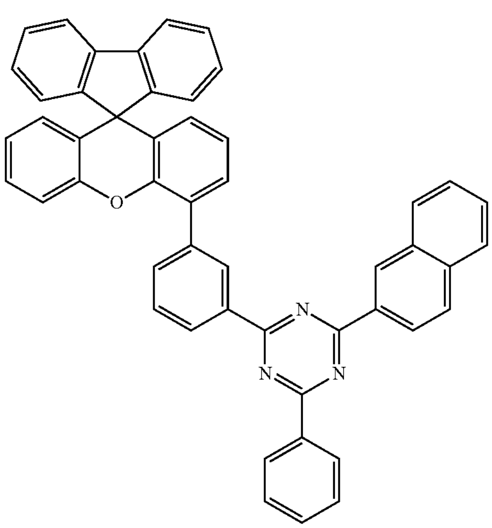
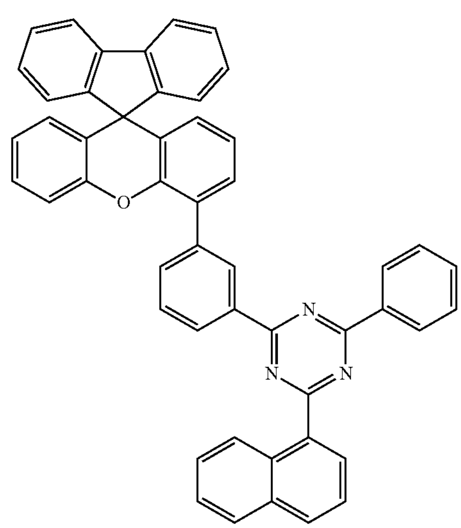

-continued
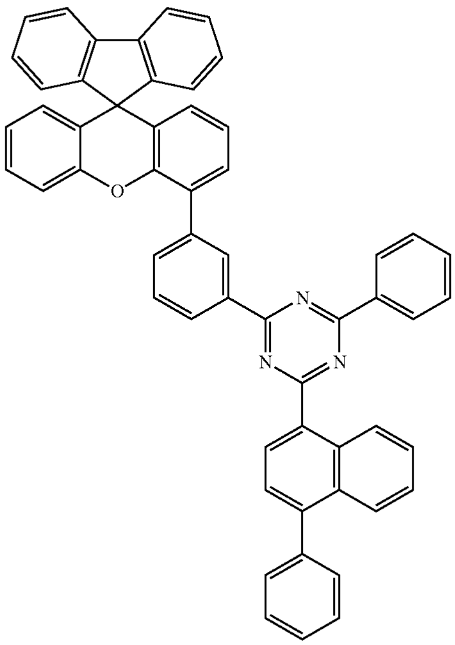
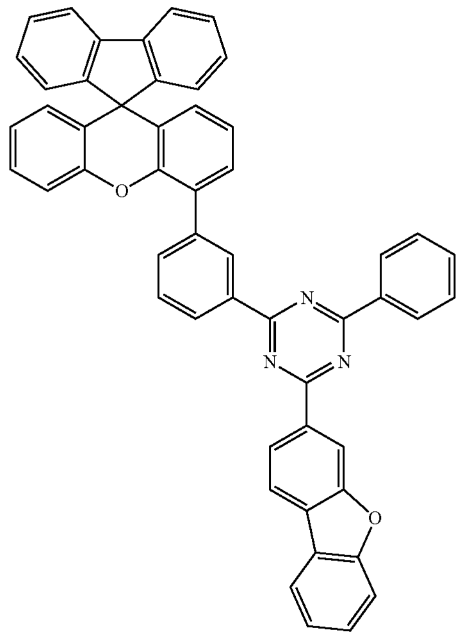
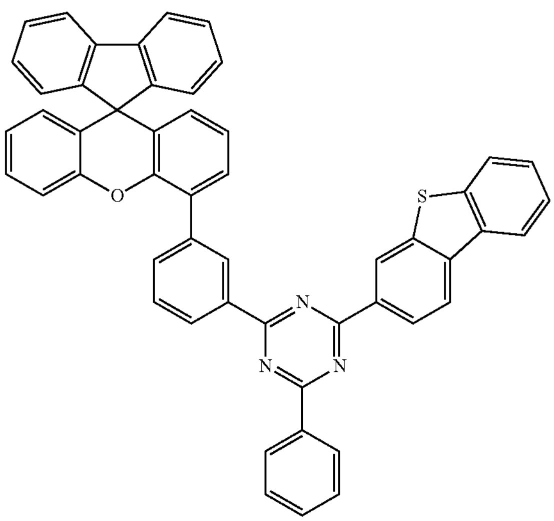
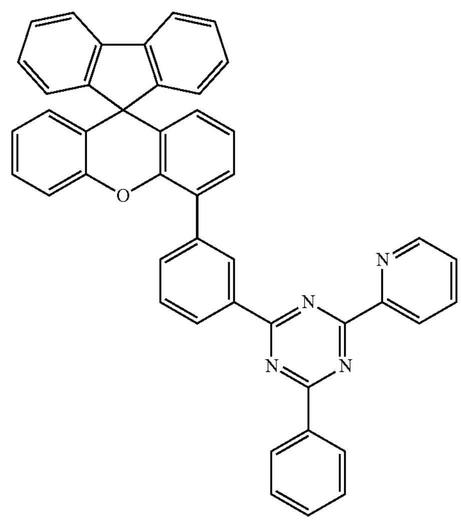
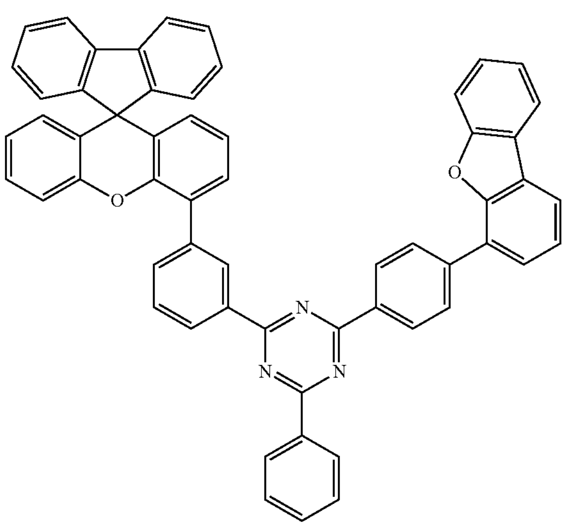

-continued
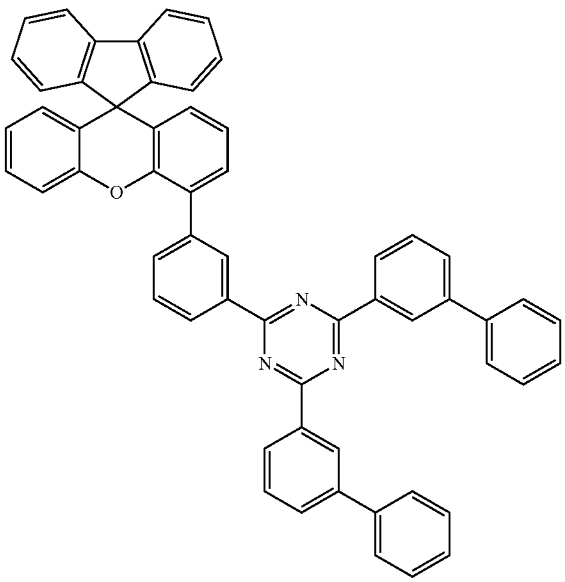
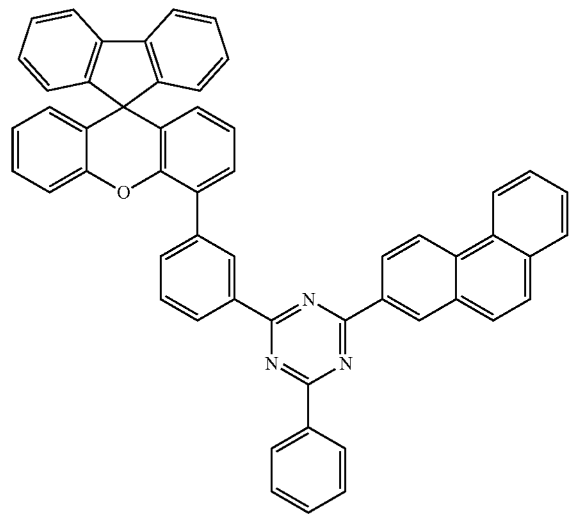
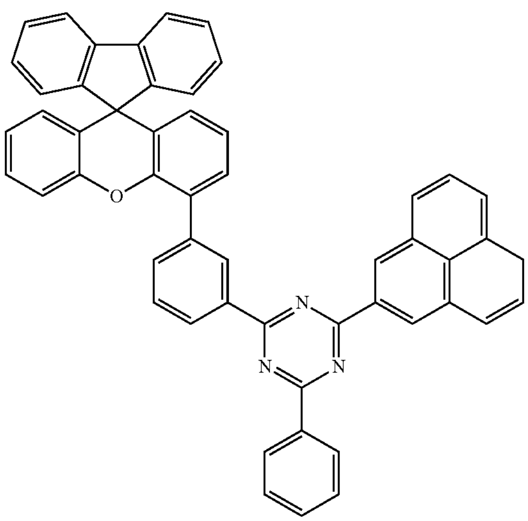
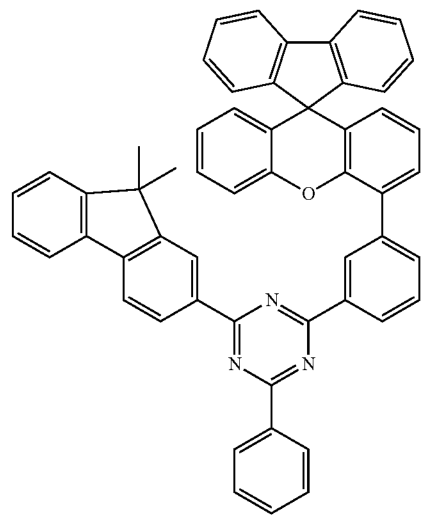
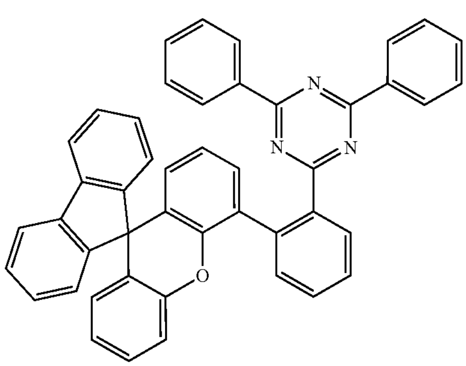
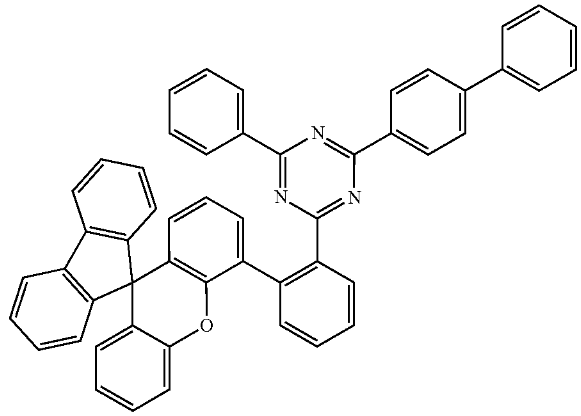

-continued
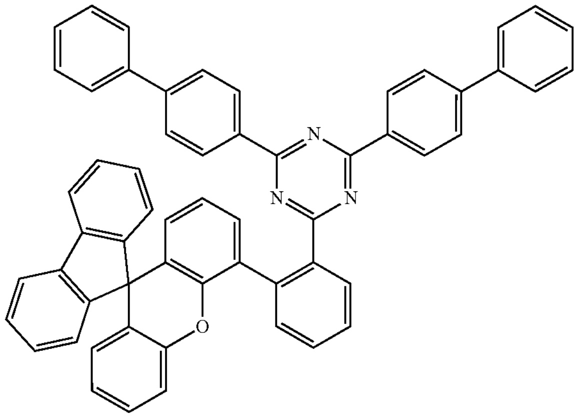
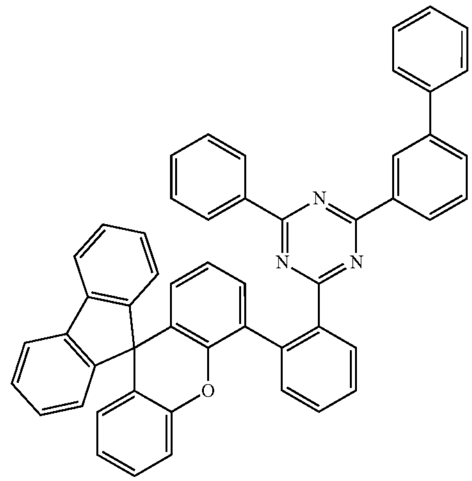
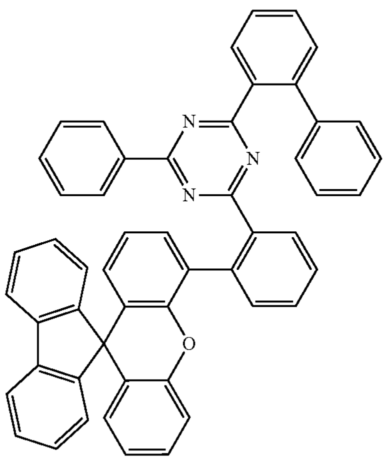
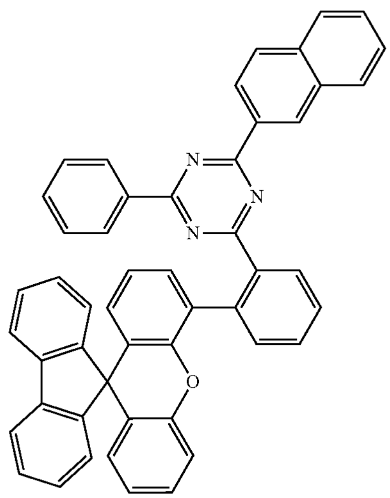
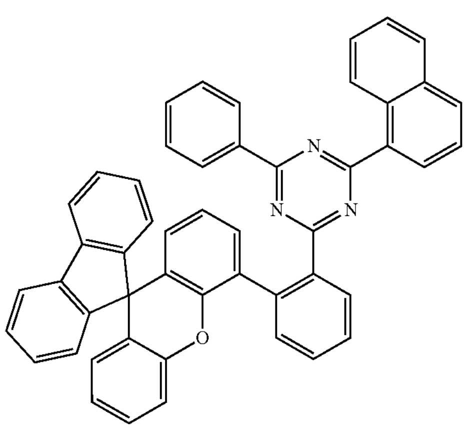
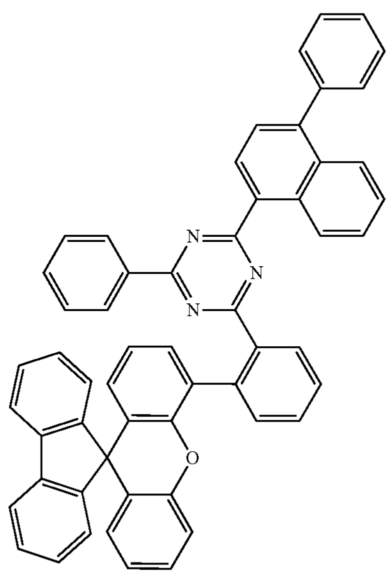

-continued
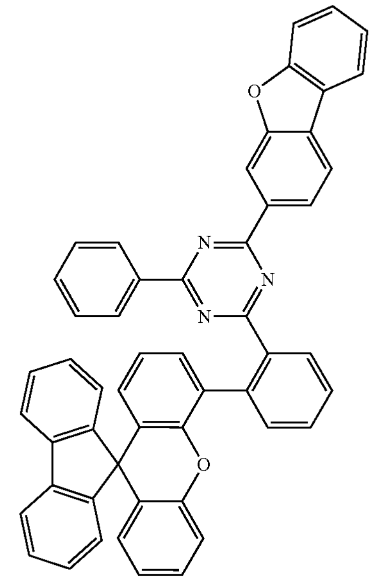
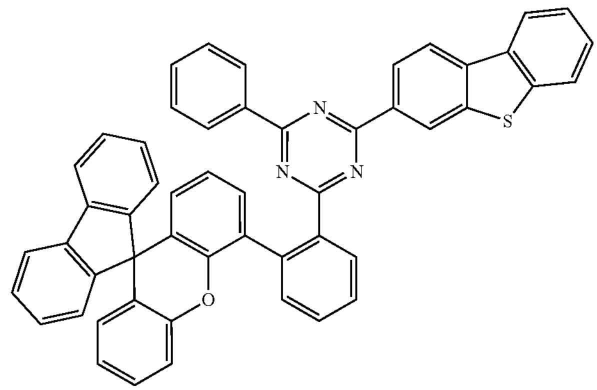
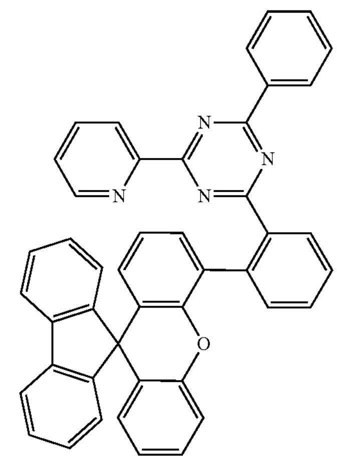
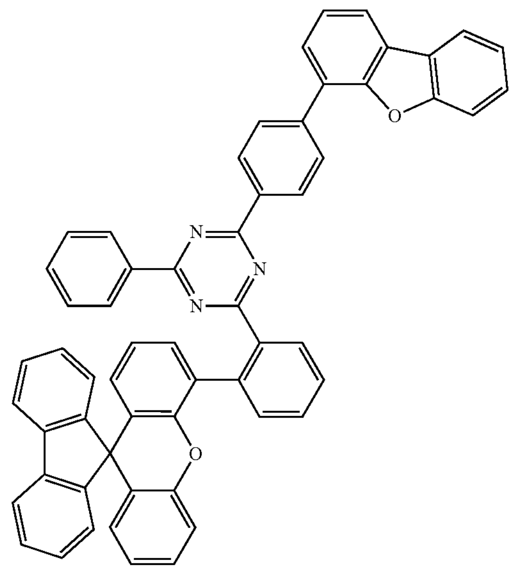
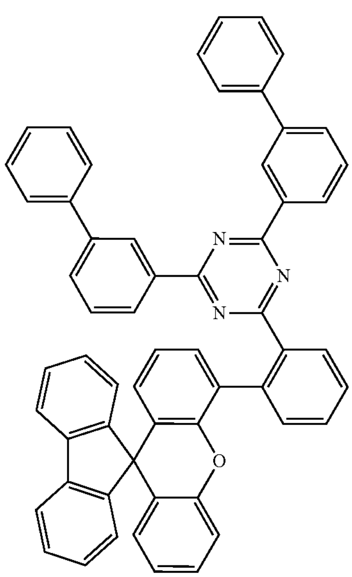
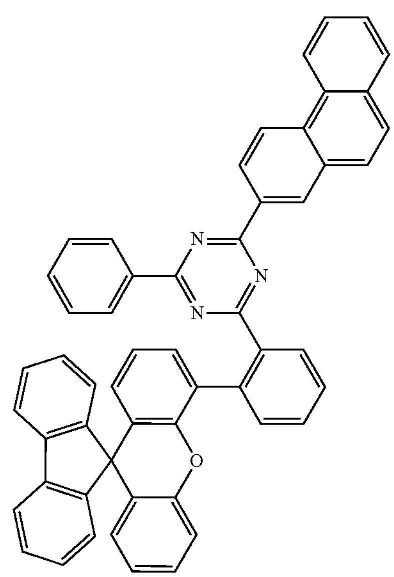

-continued
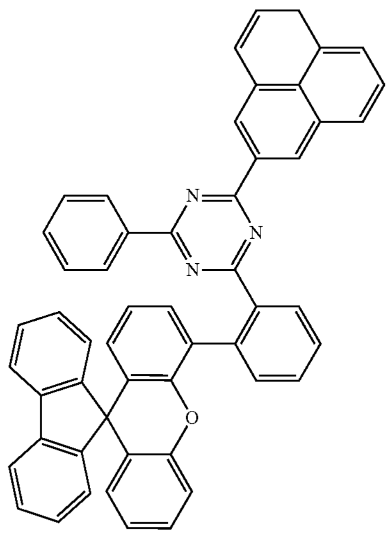
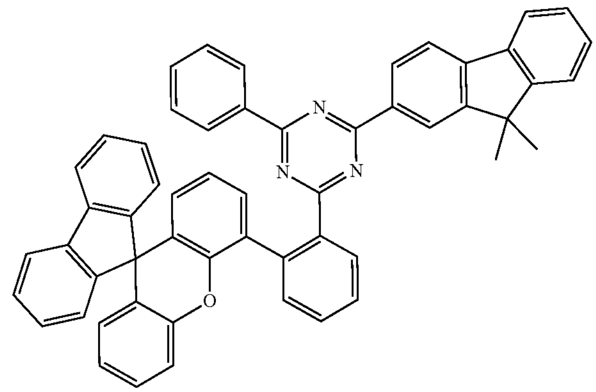
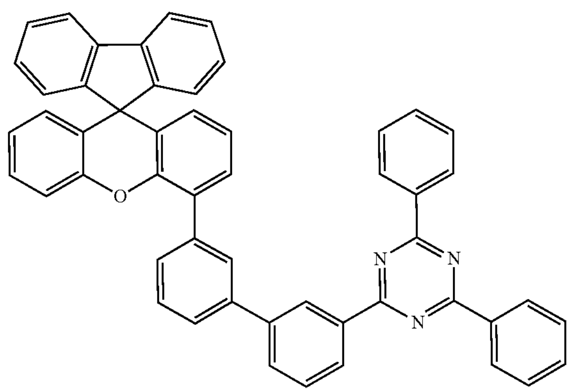
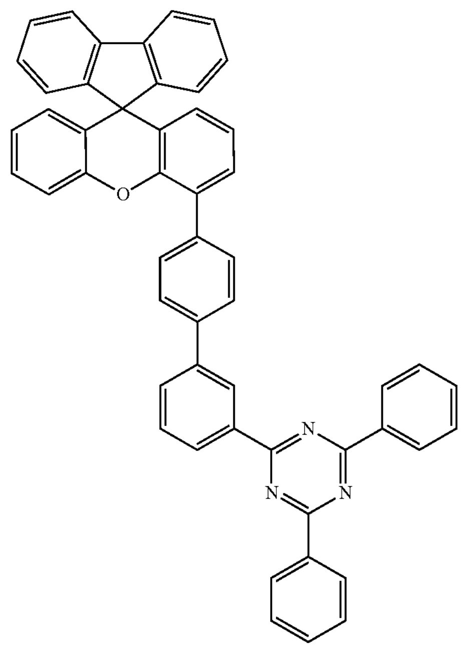
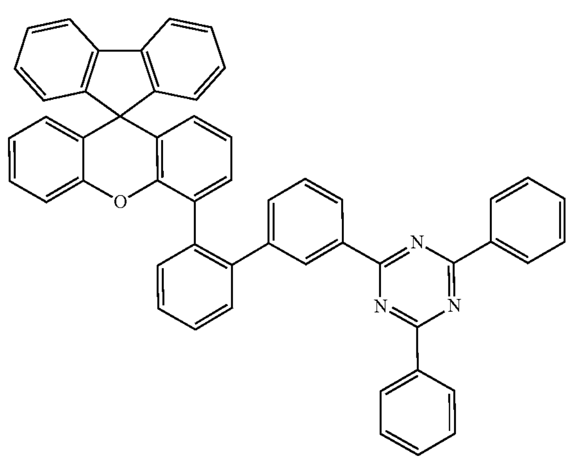
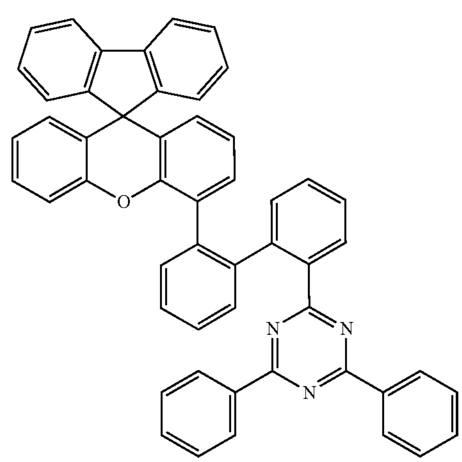

-continued
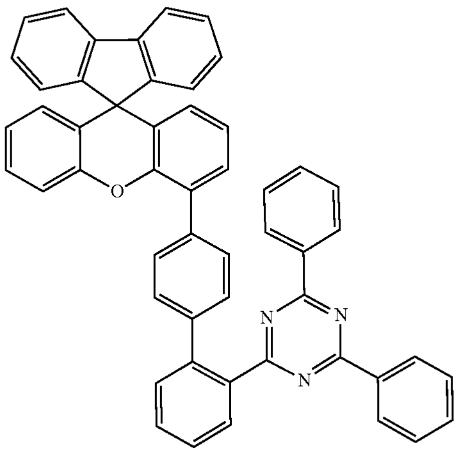
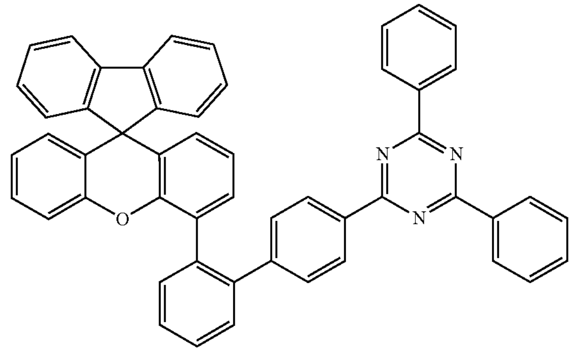
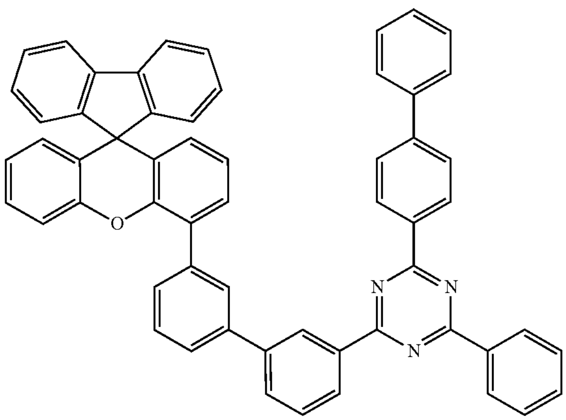
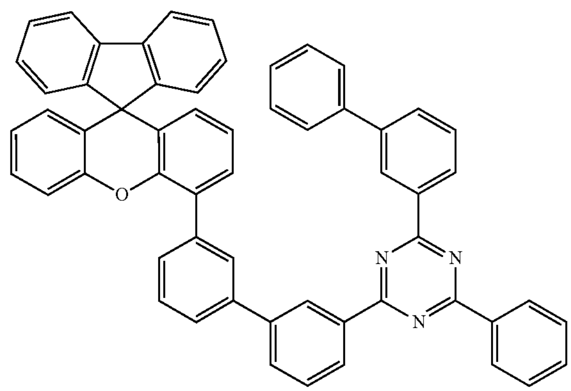
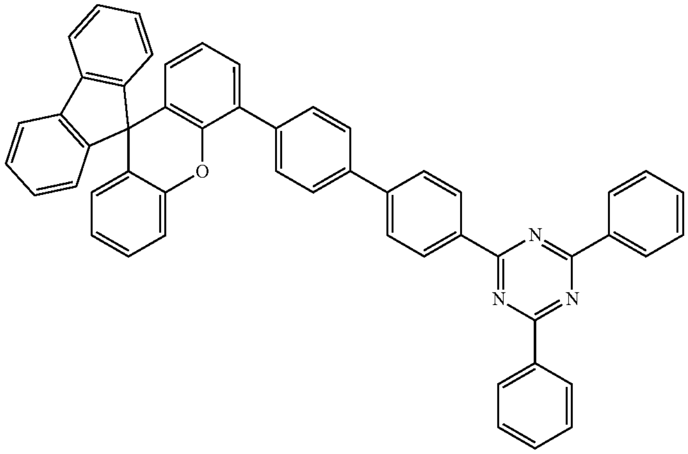

-continued
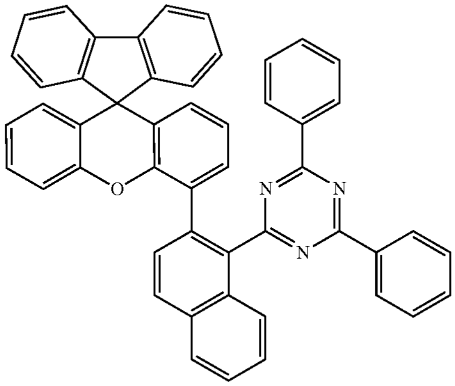
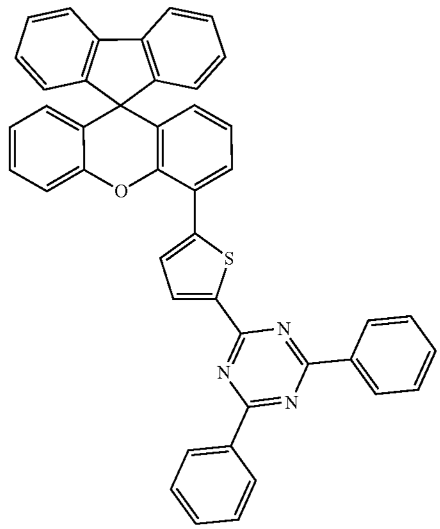
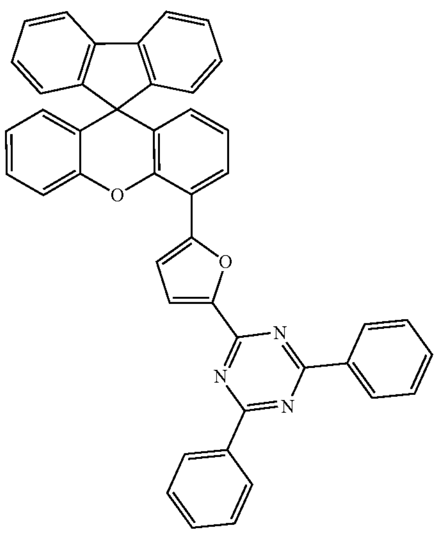
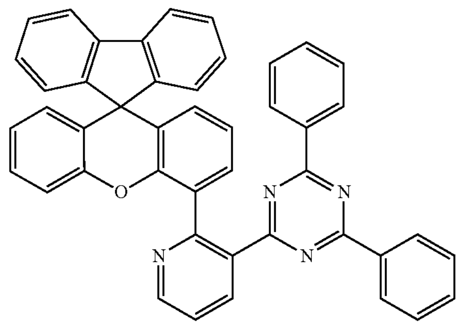
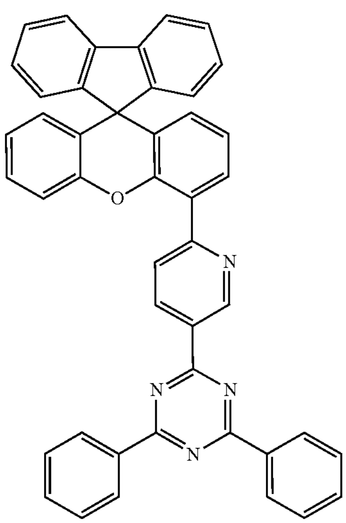
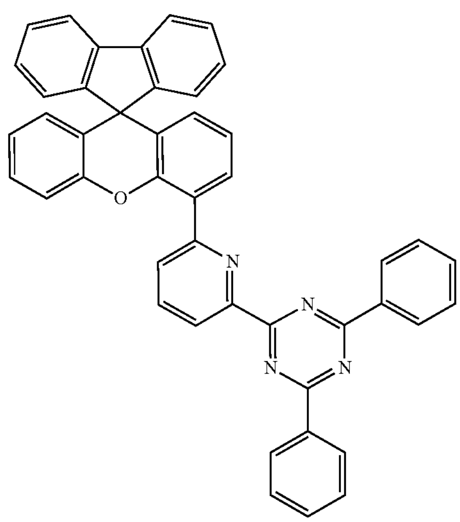

-continued
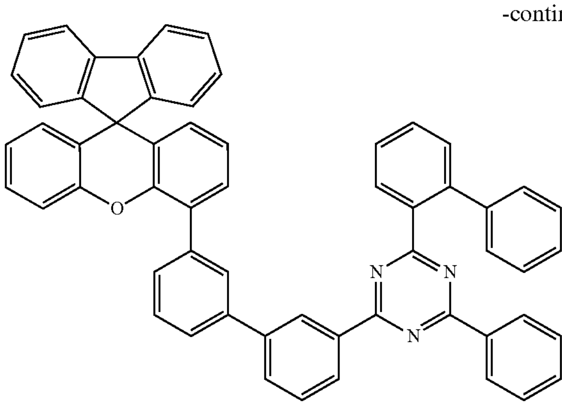
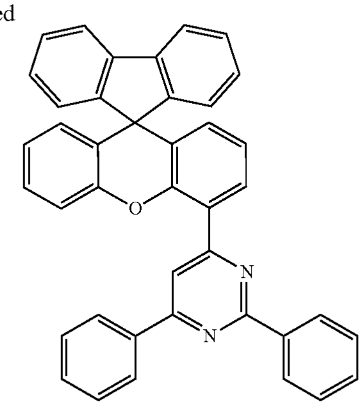
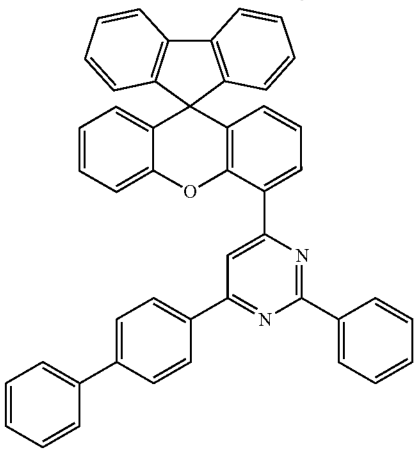
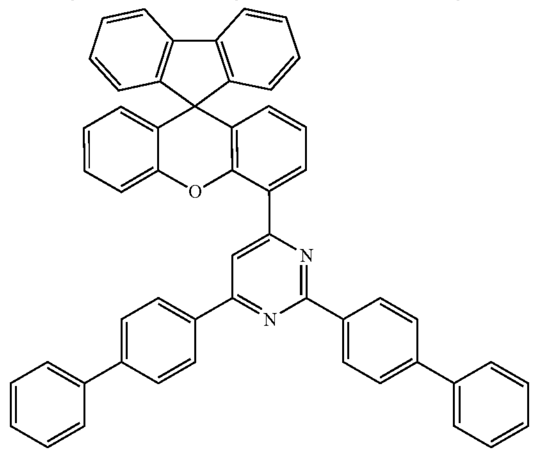
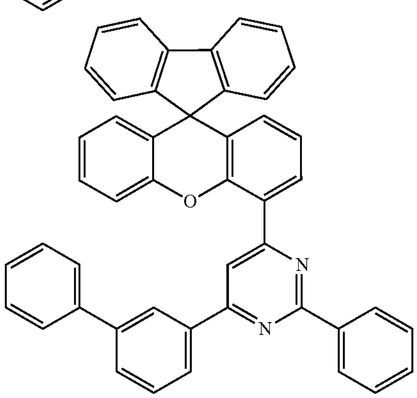
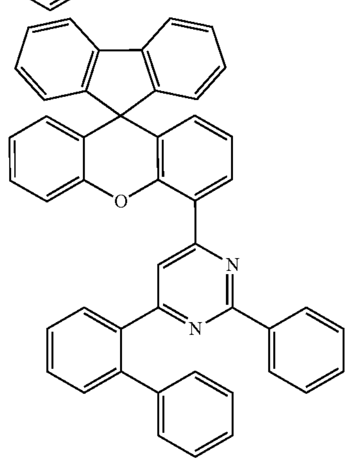
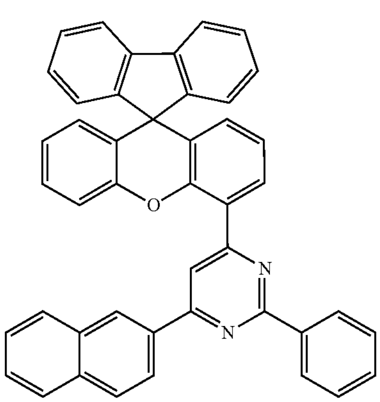
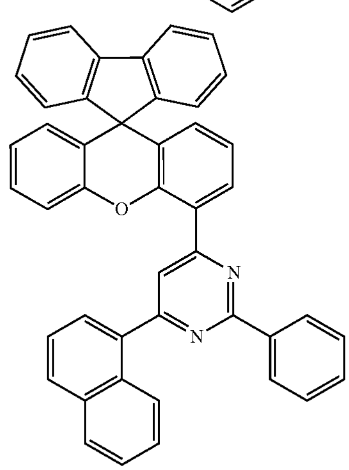

-continued
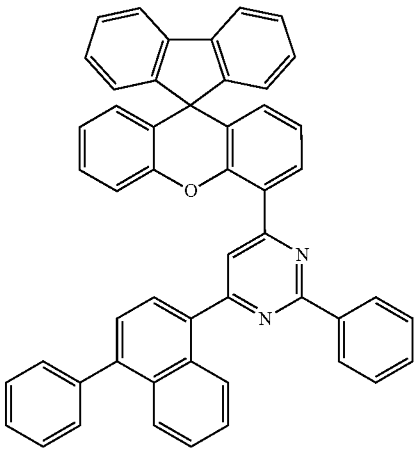
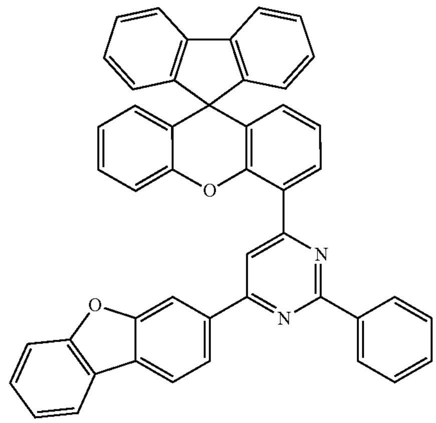
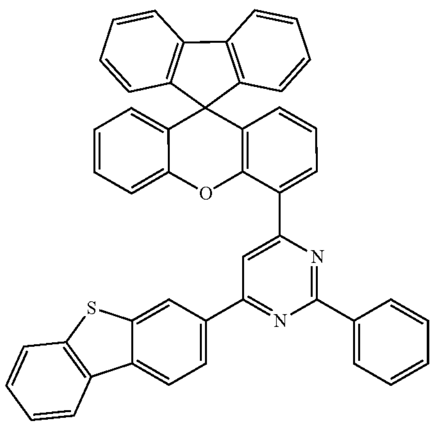
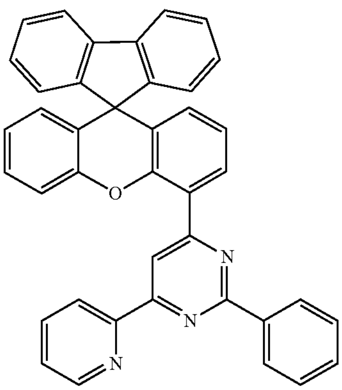
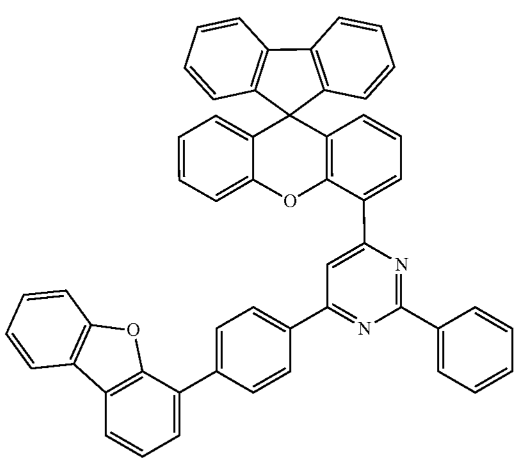
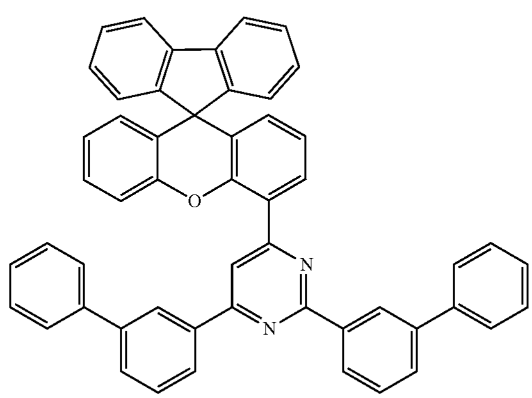

-continued
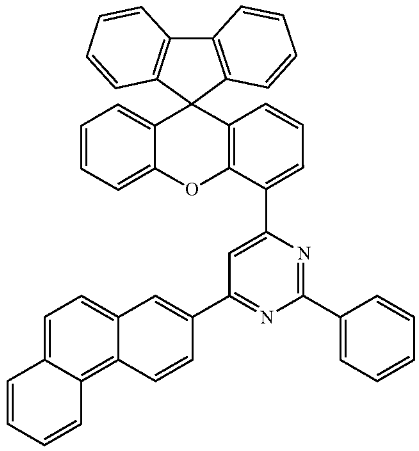
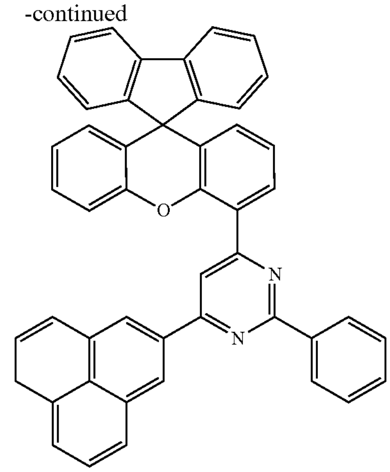
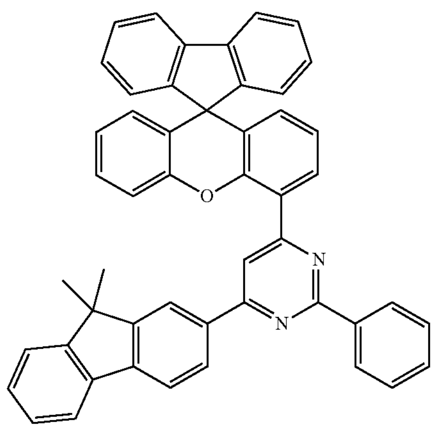
-continued
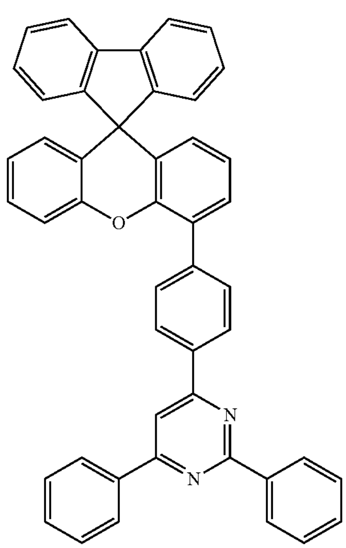
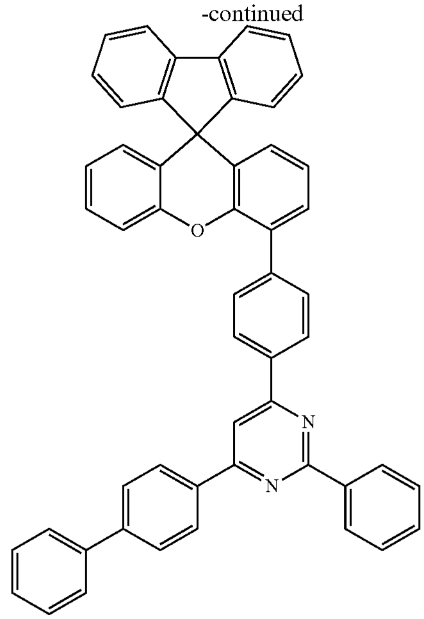

-continued
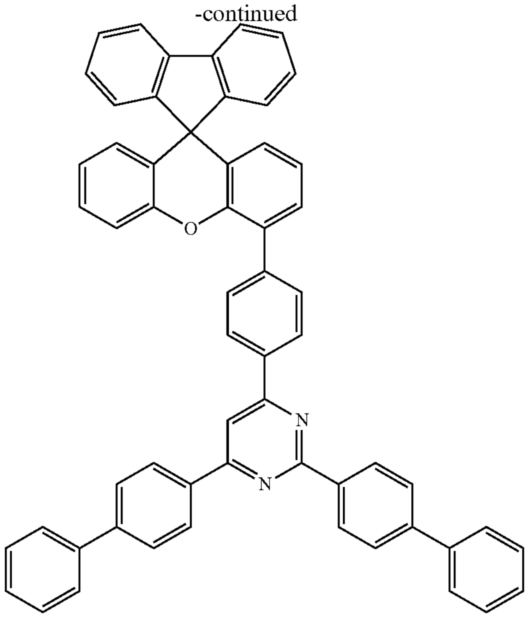
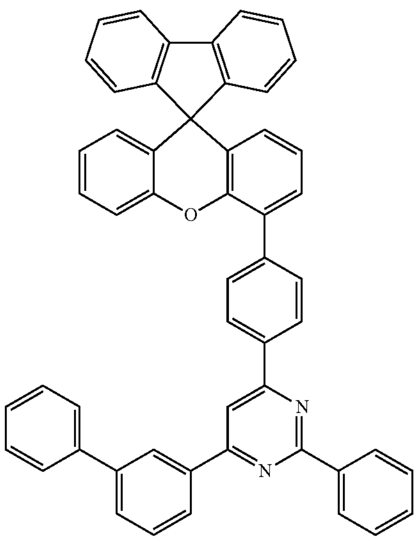
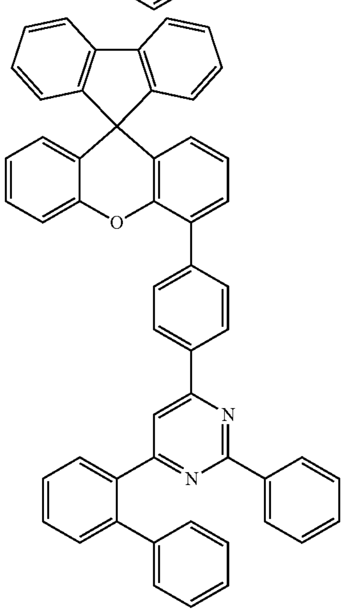
-continued
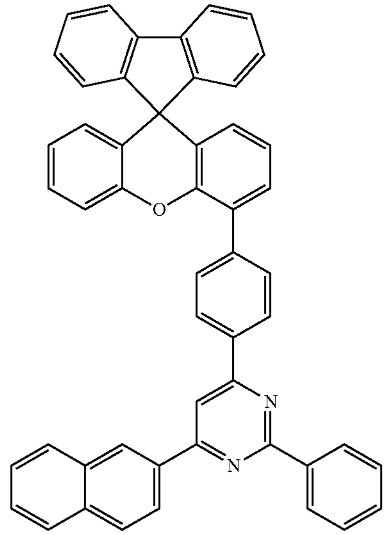
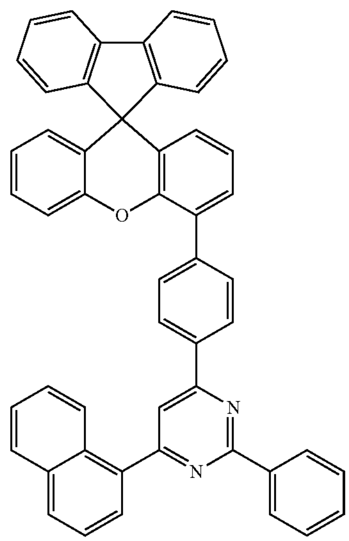
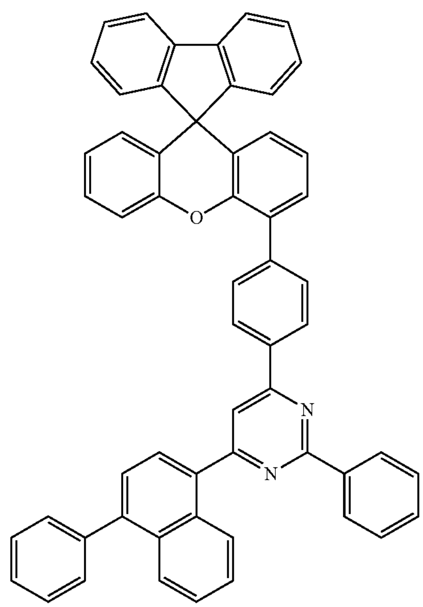

-continued
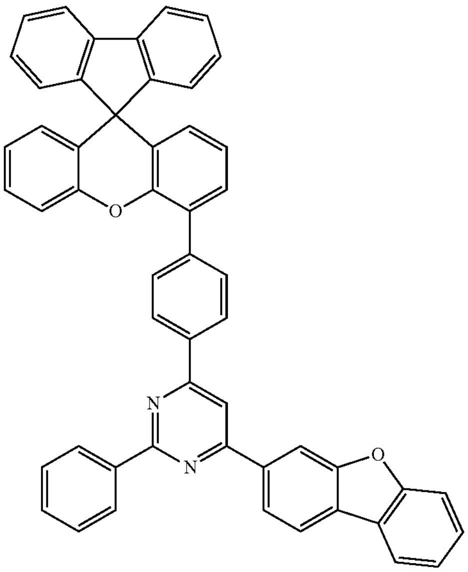
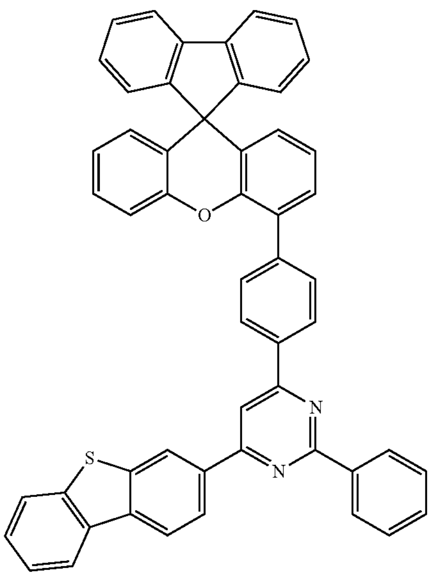
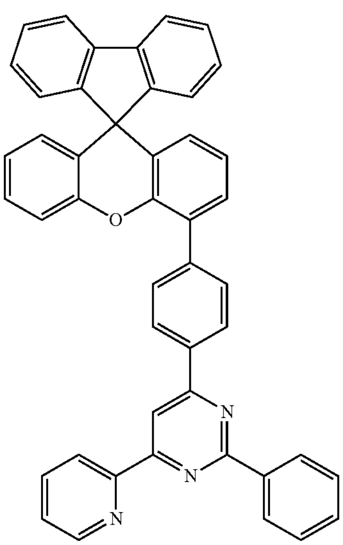
-continued
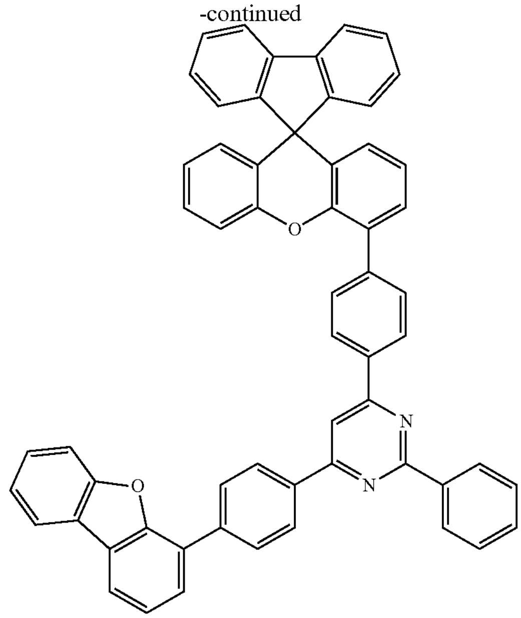
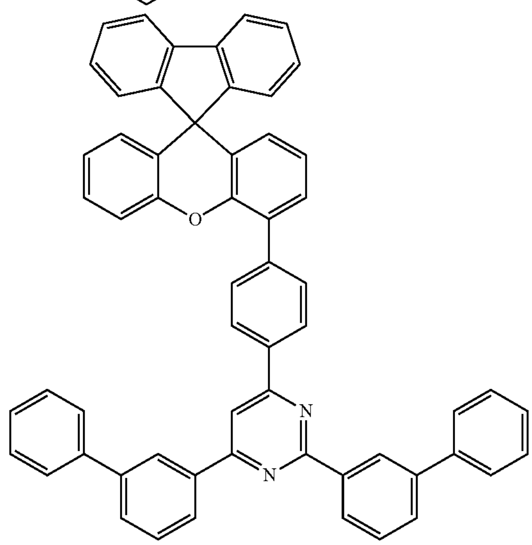
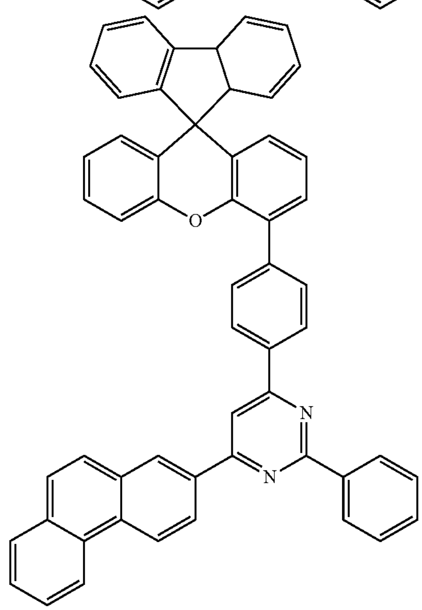

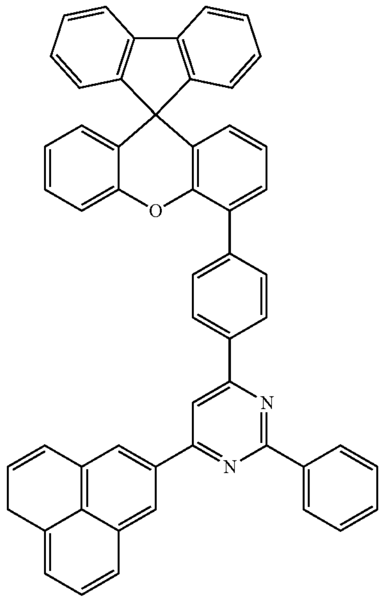
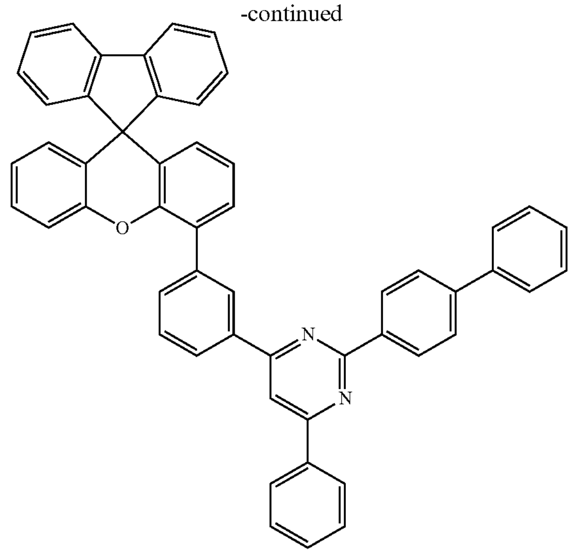
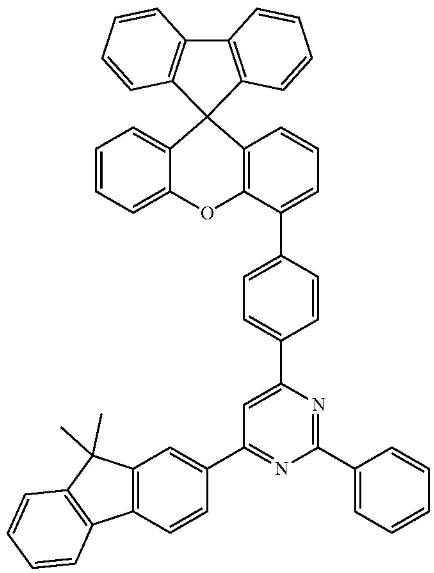
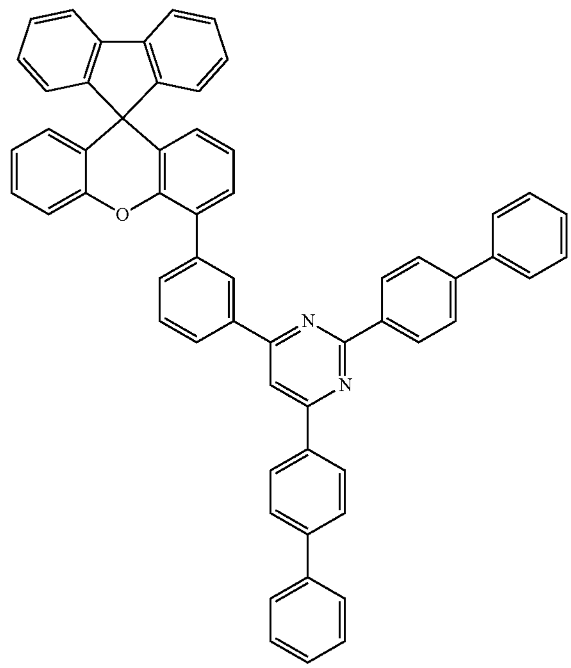
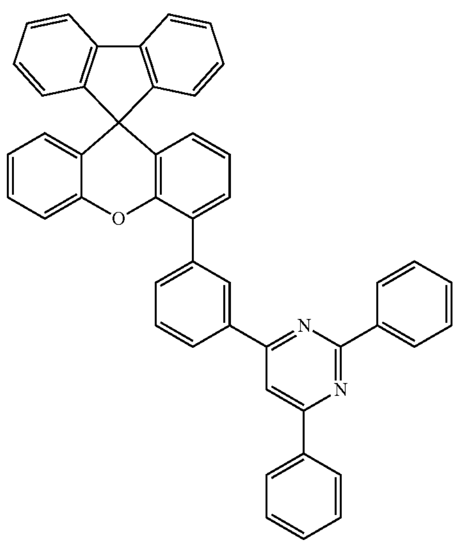
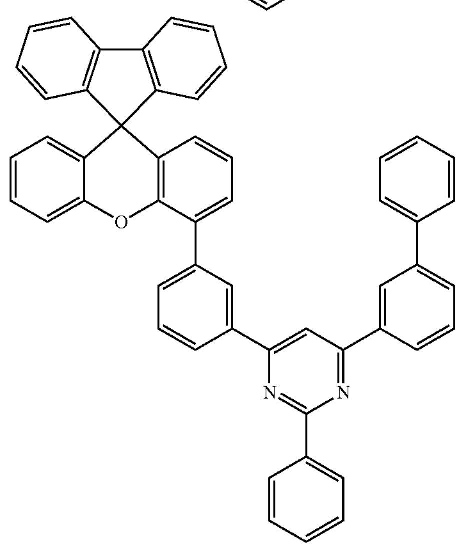

-continued
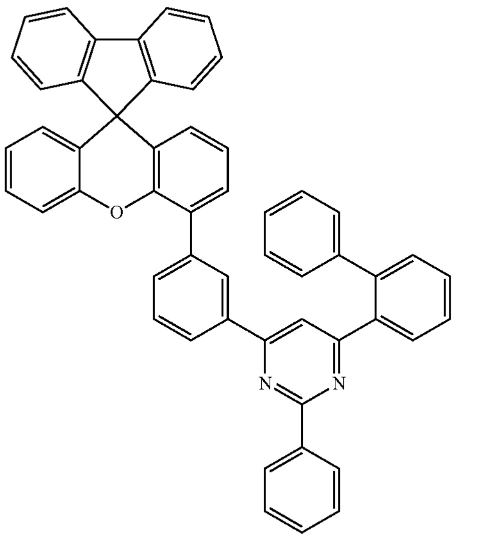
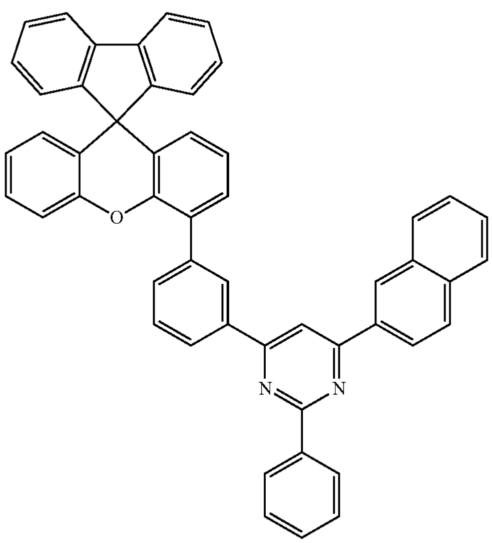
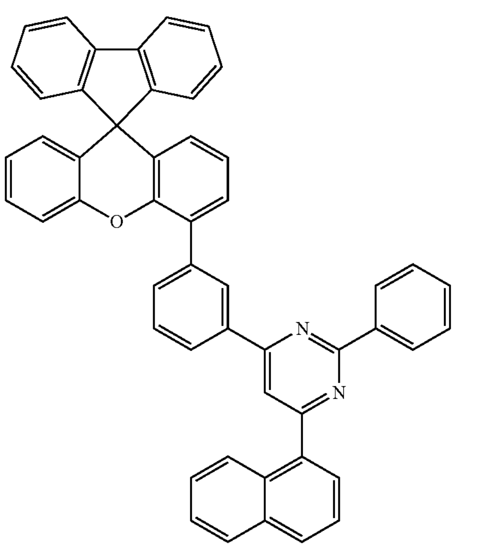
-continued
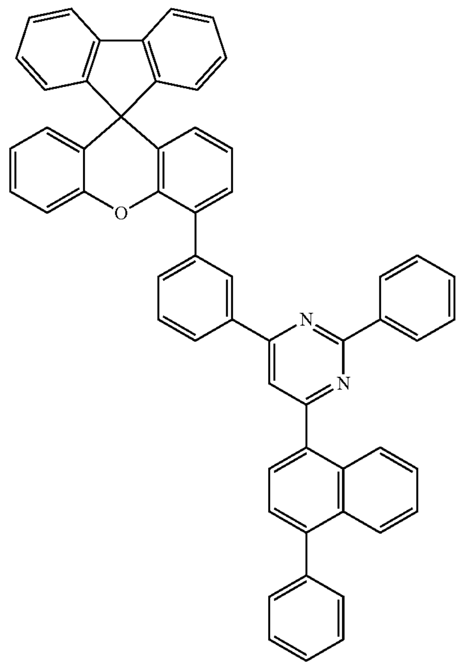
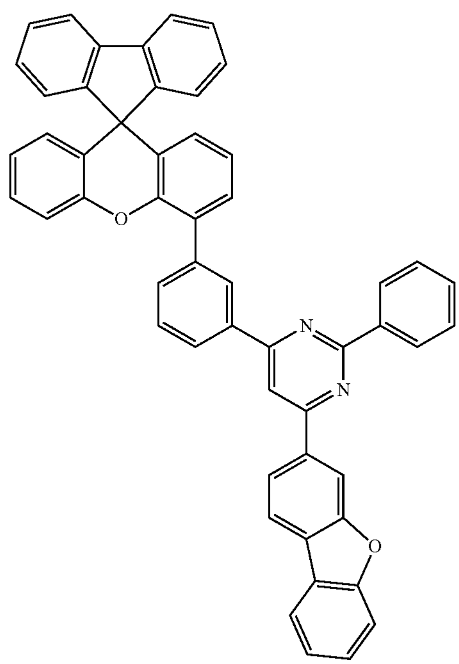

-continued
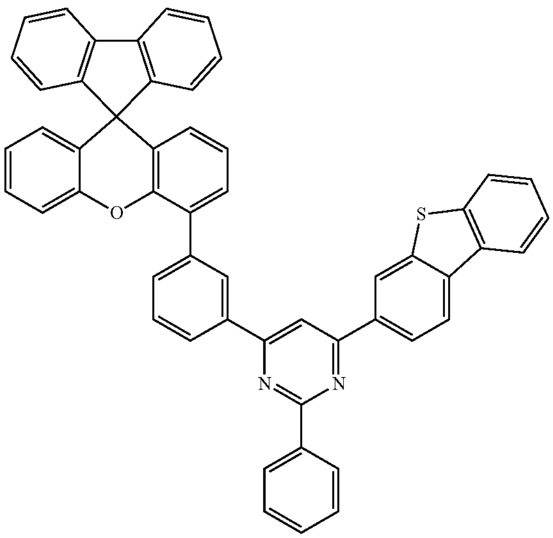
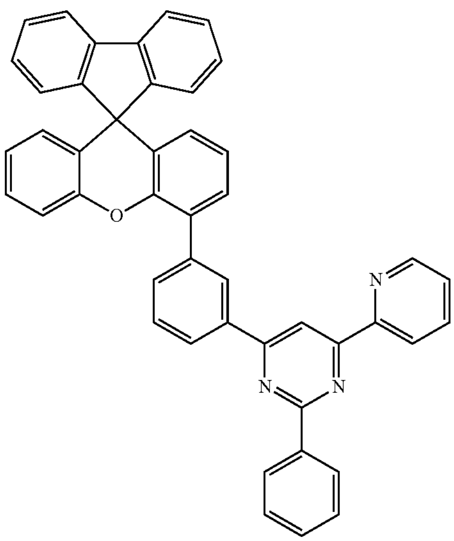
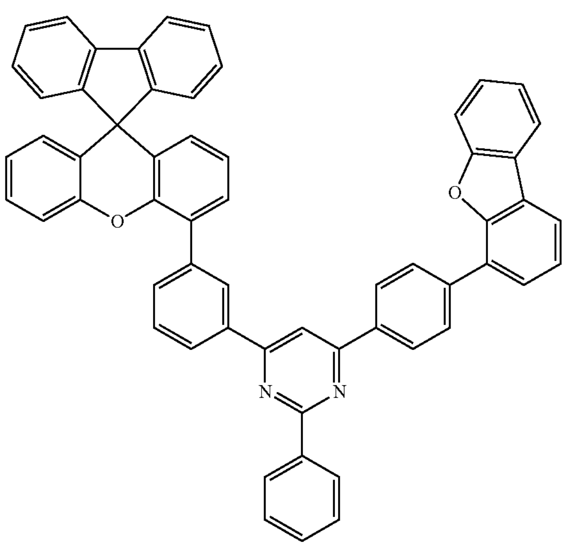
-continued
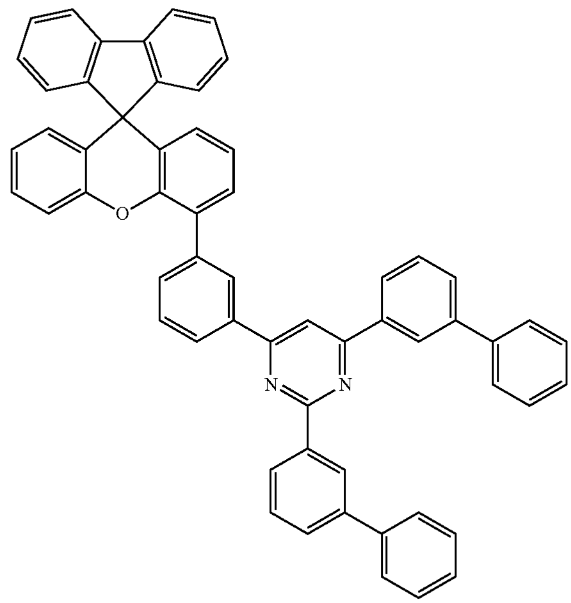
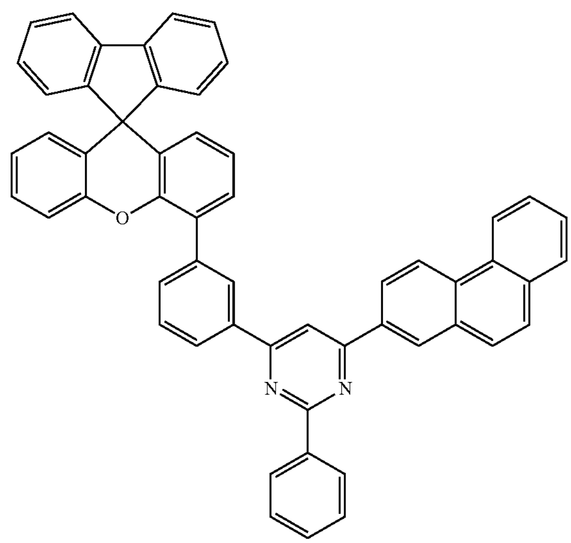
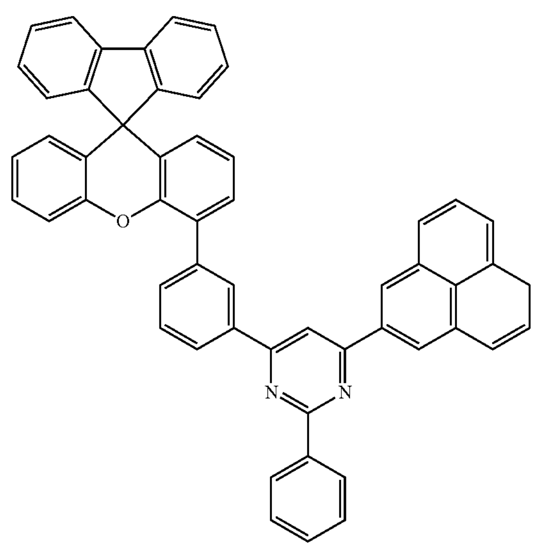

-continued
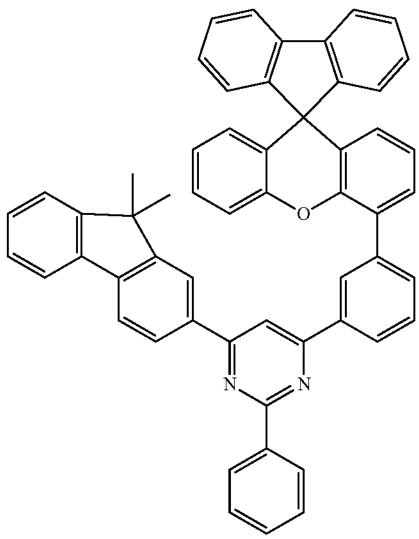
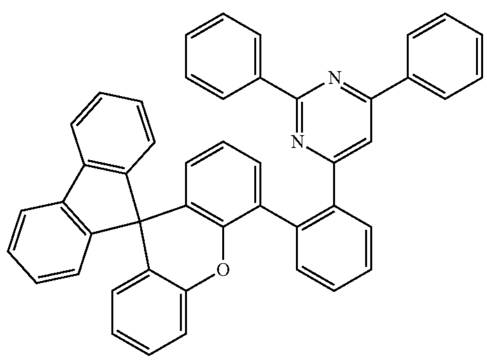
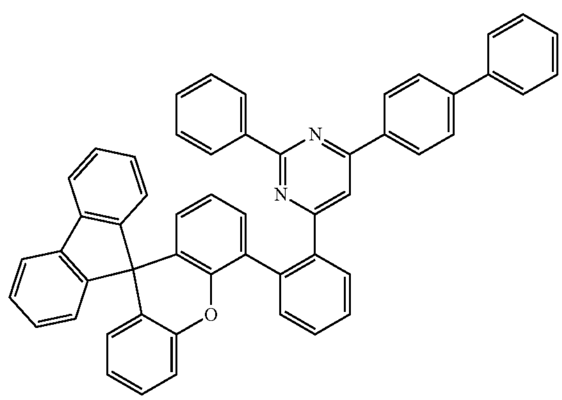
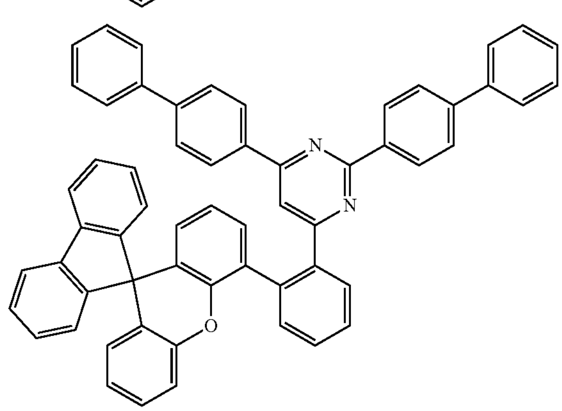
-continued
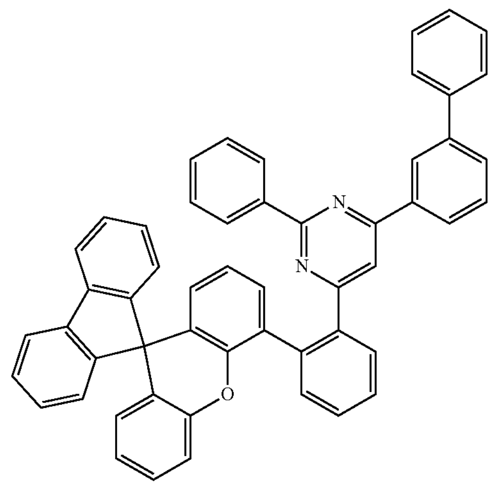
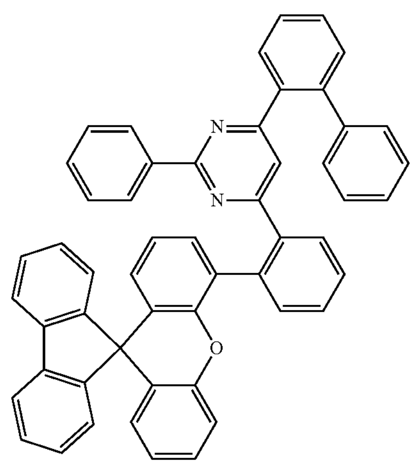
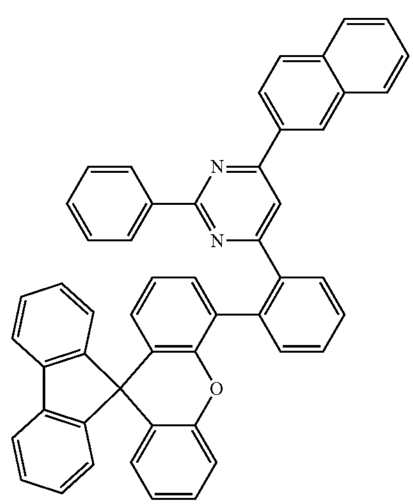

-continued
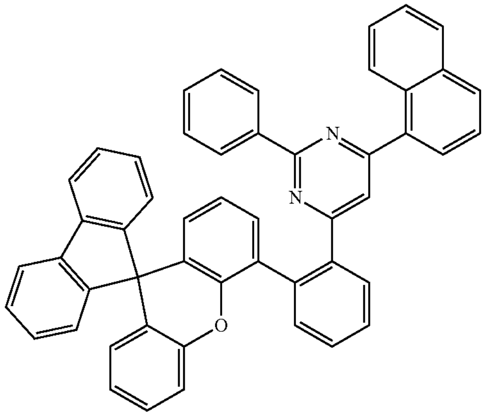
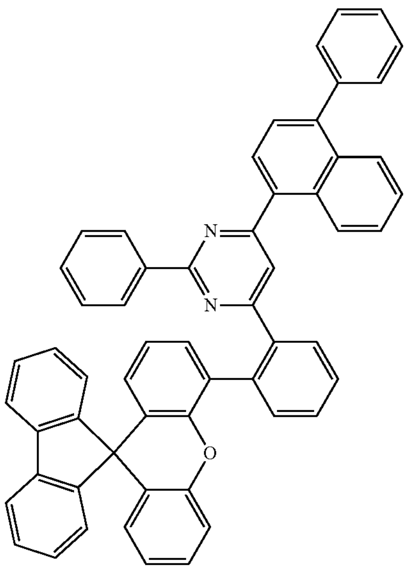
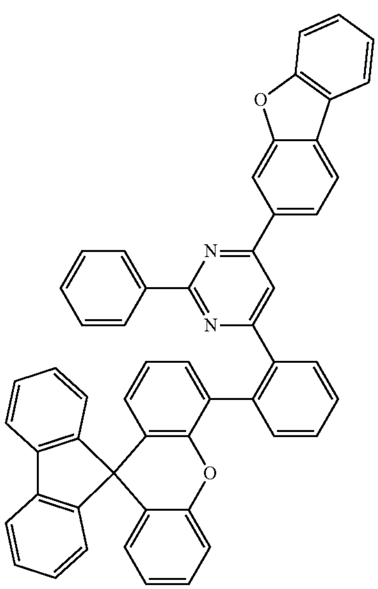
-continued
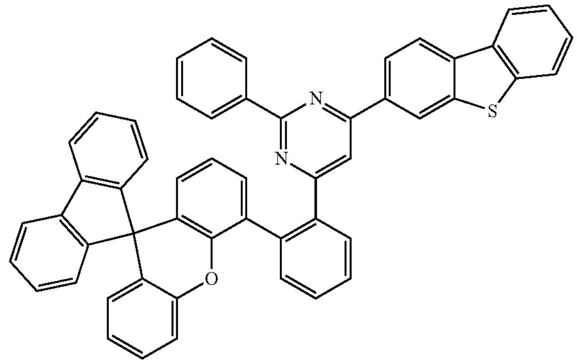
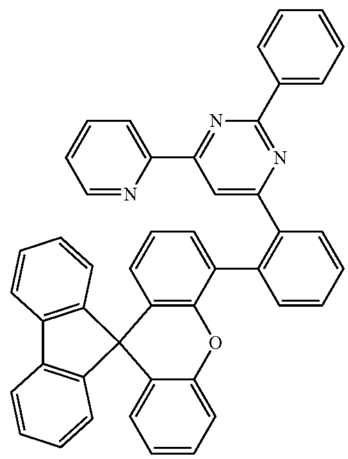
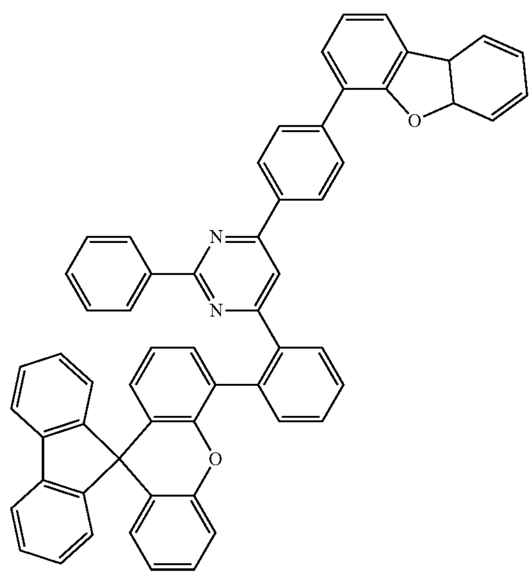

-continued
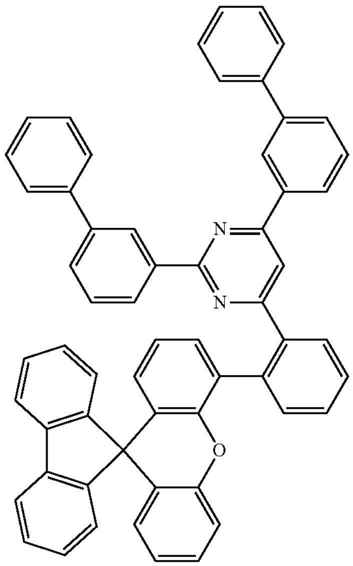
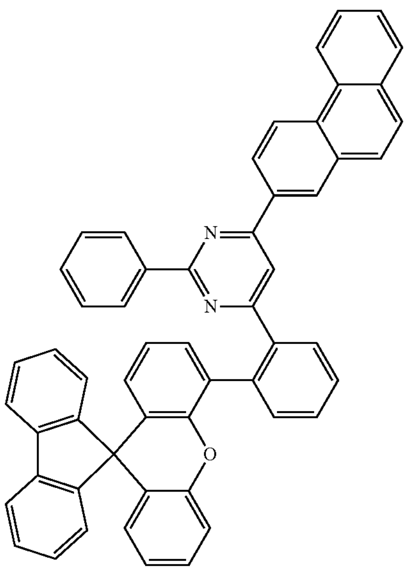
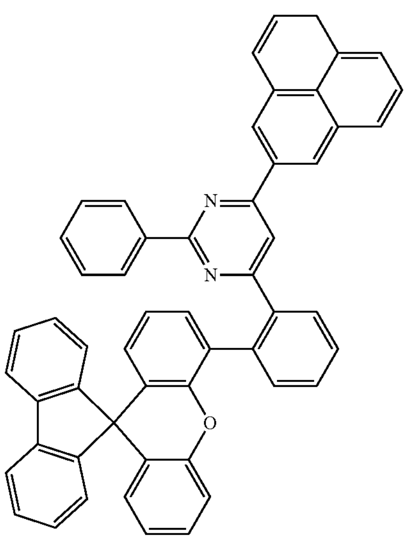
-continued
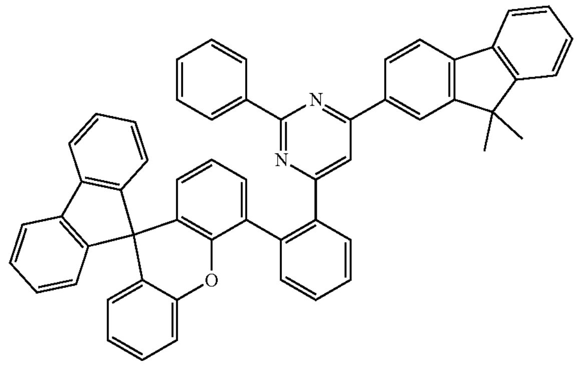
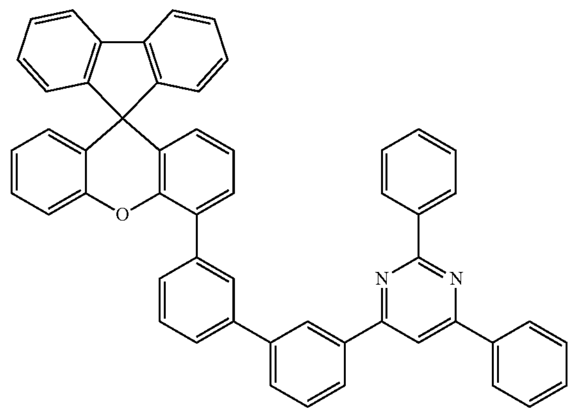
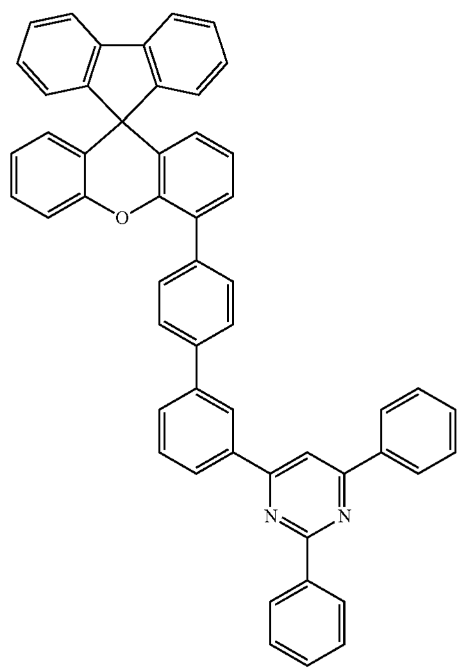

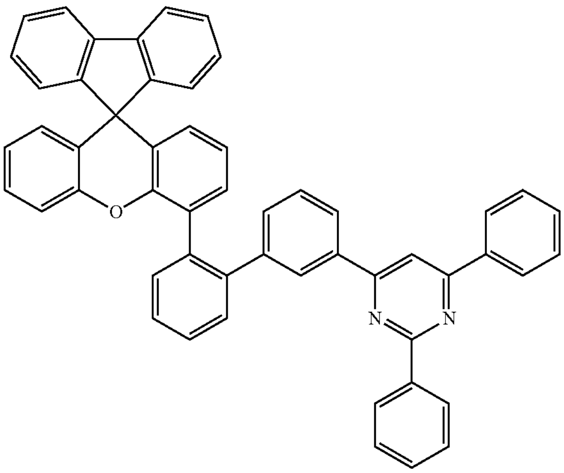
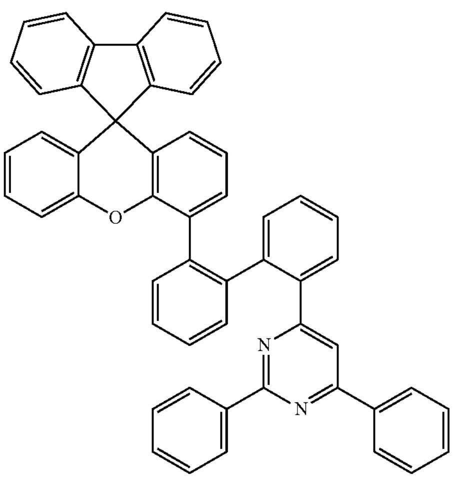
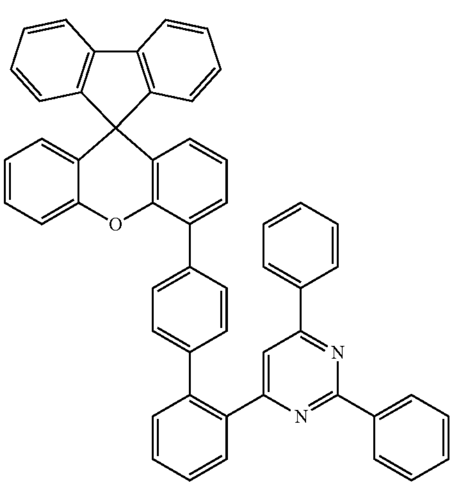
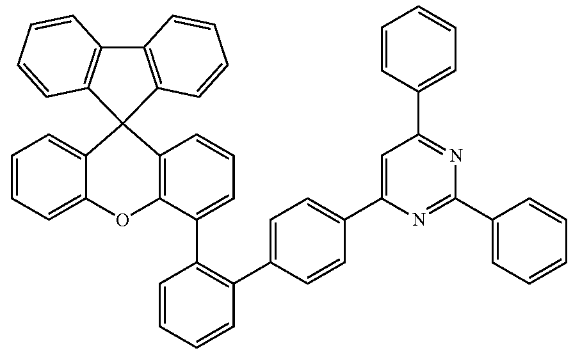
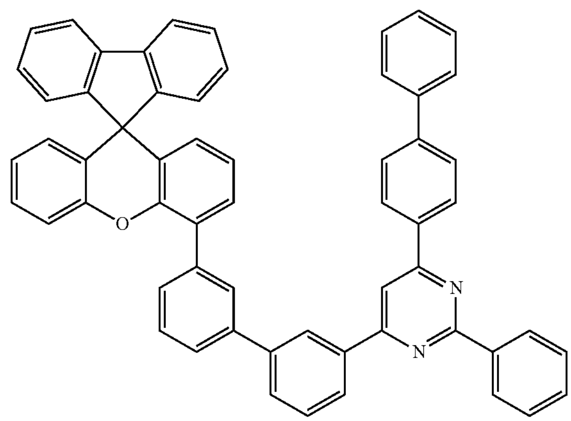
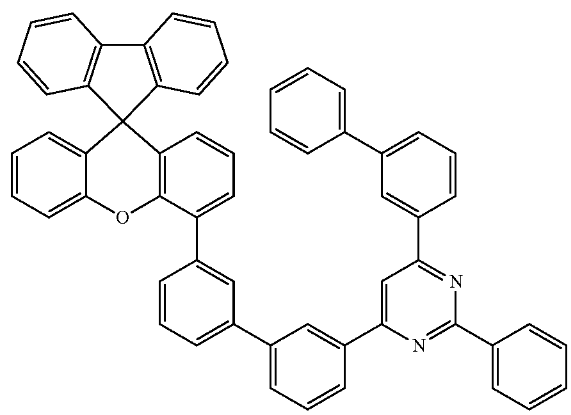
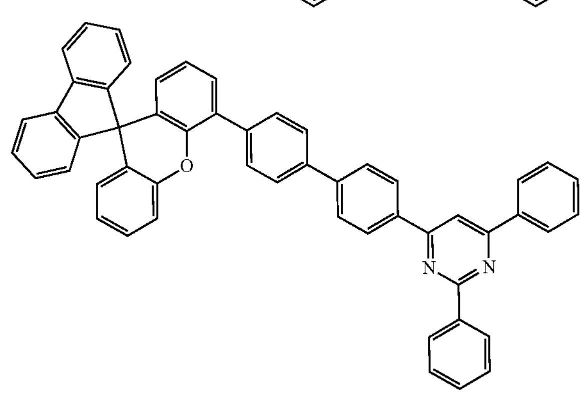

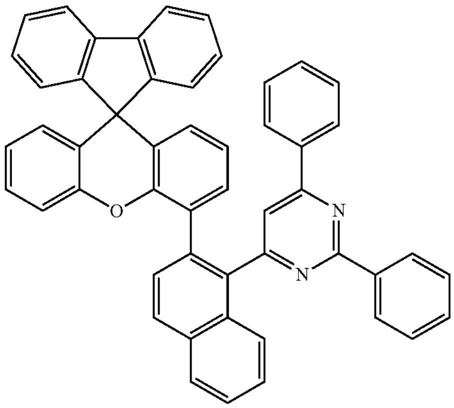
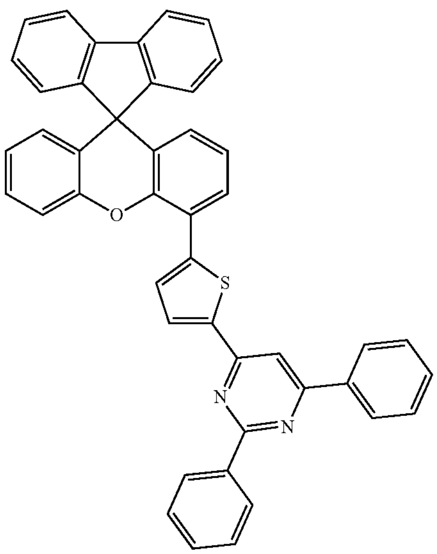
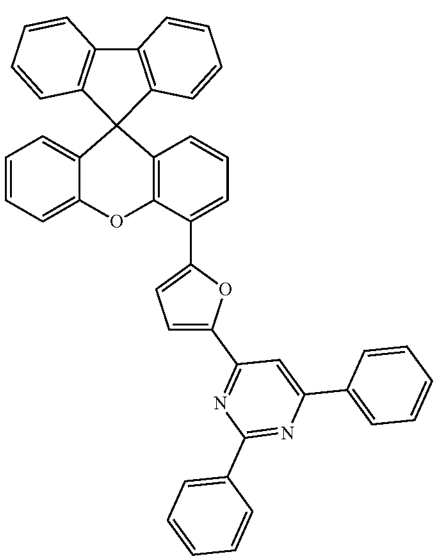
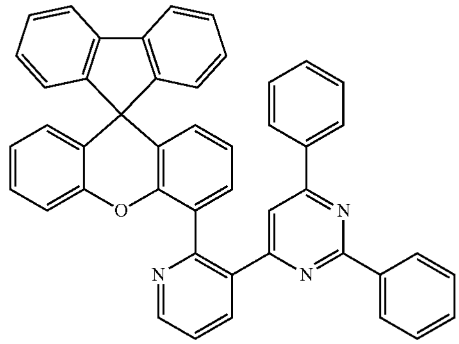
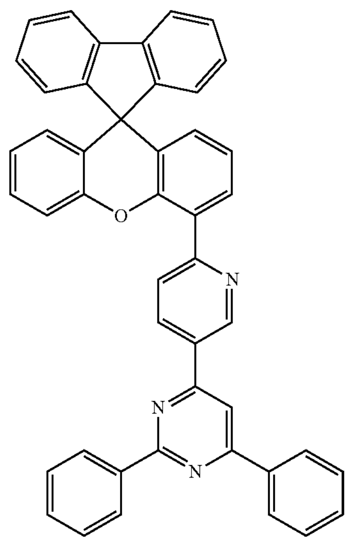
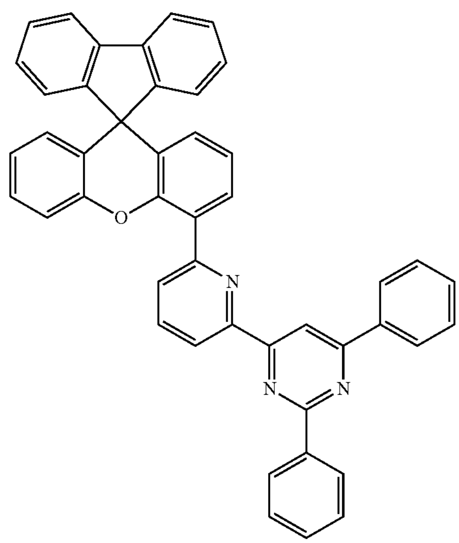

-continued
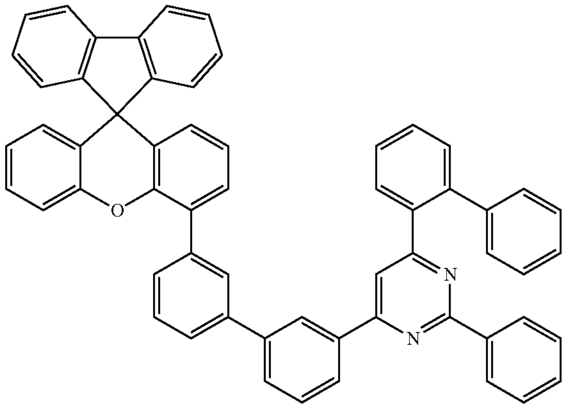
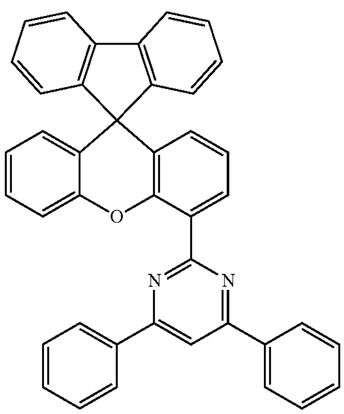
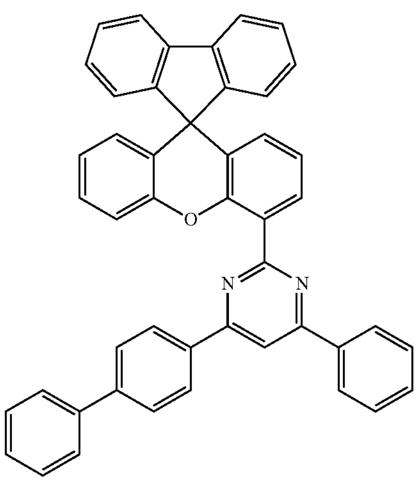
-continued
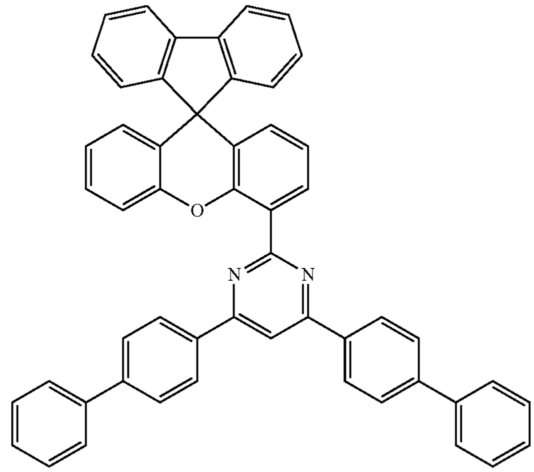
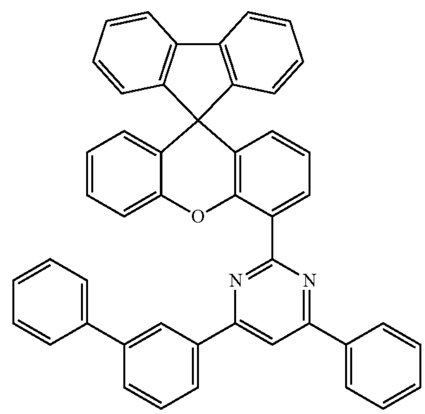
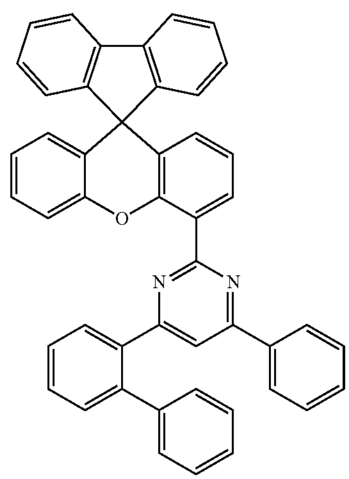

-continued
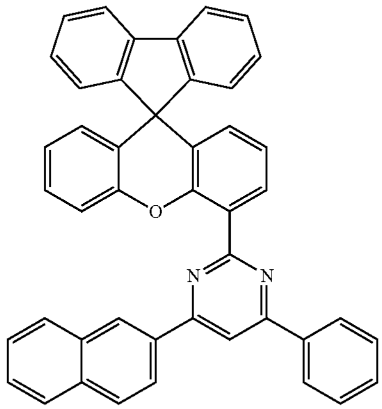
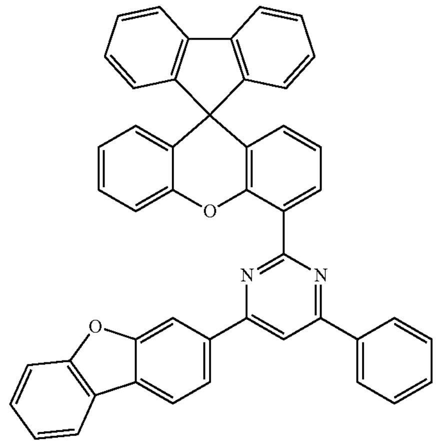
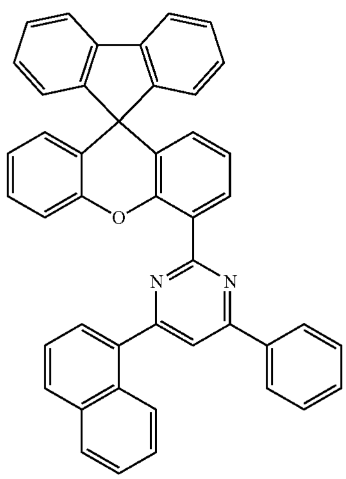
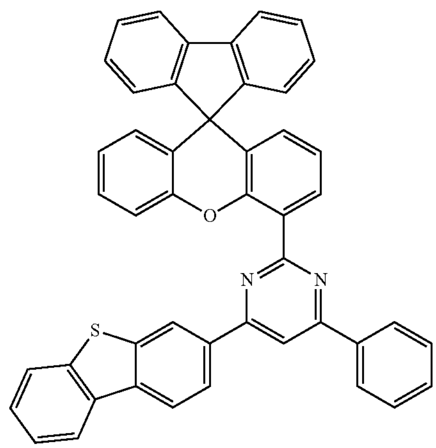
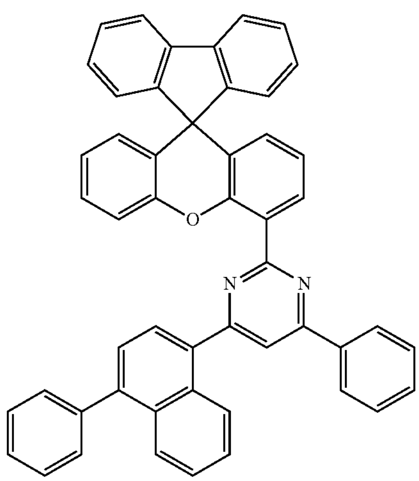
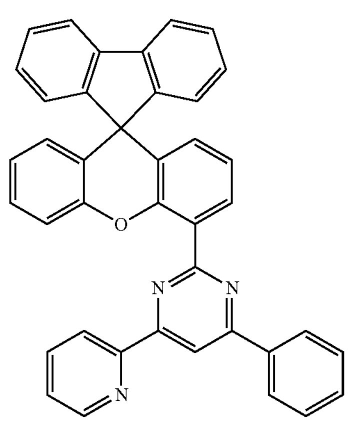
-continued -continued
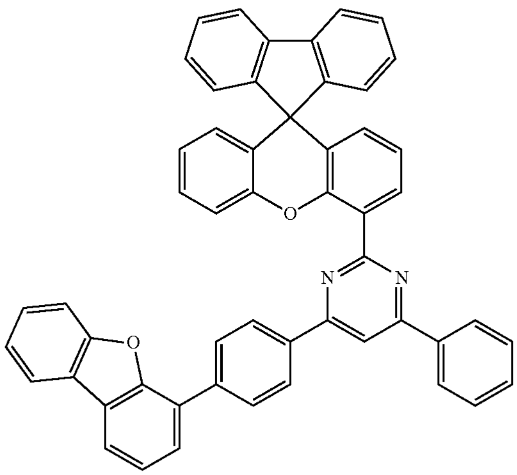
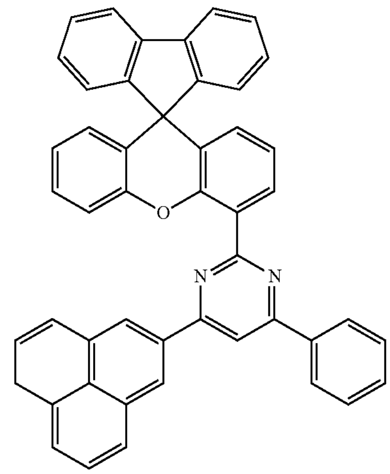
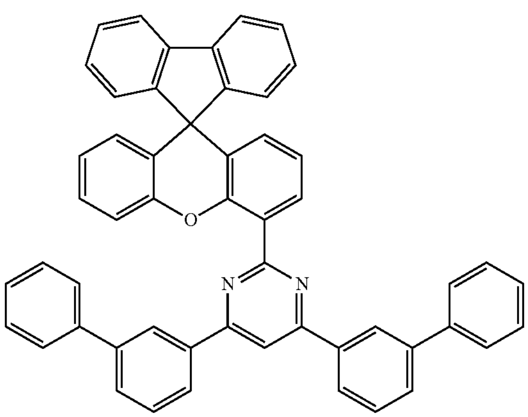
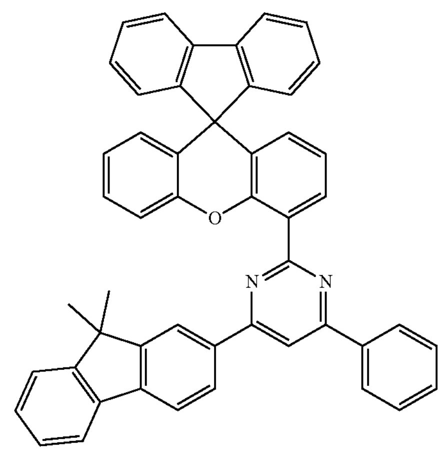
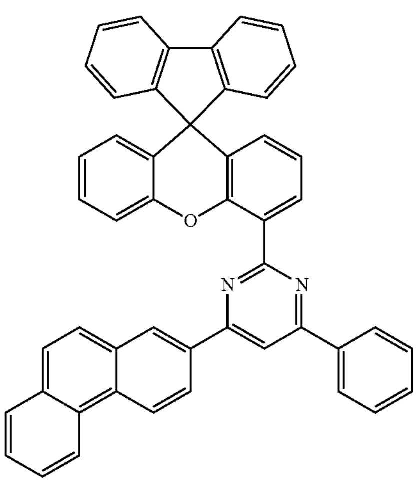
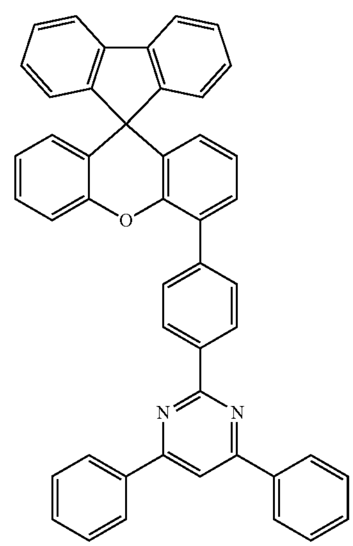
-continued -continued
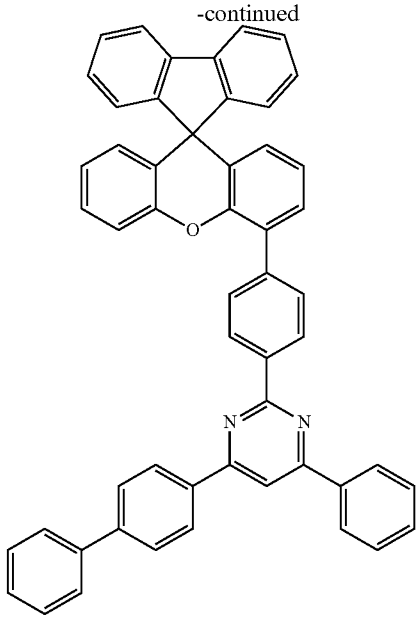
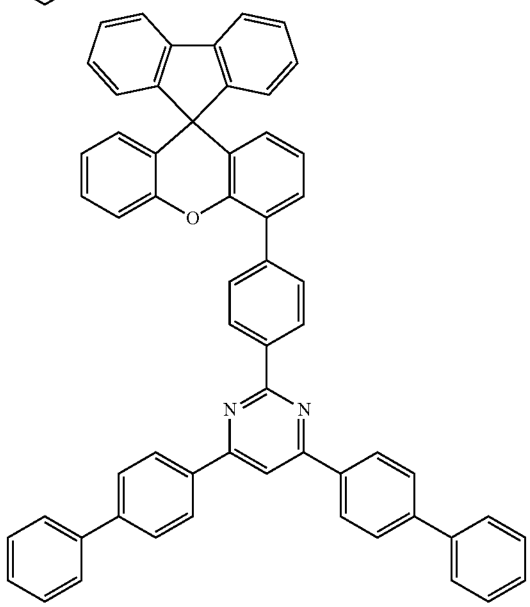
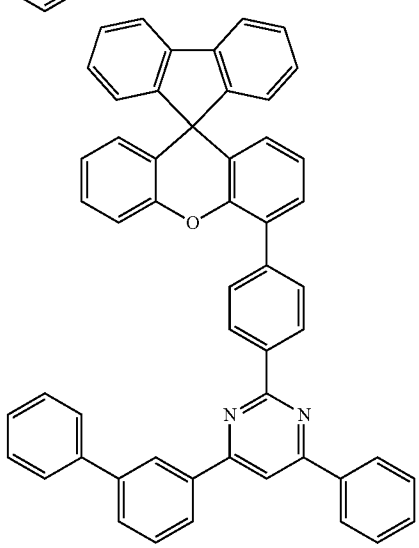
-continued
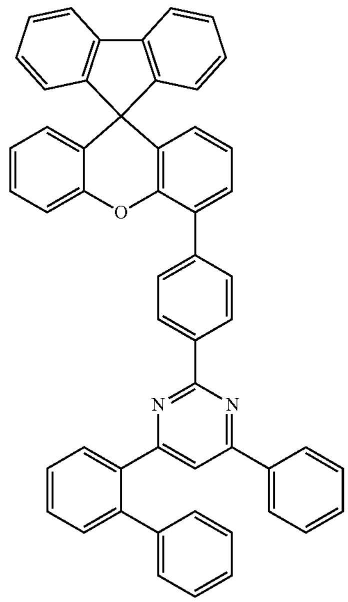
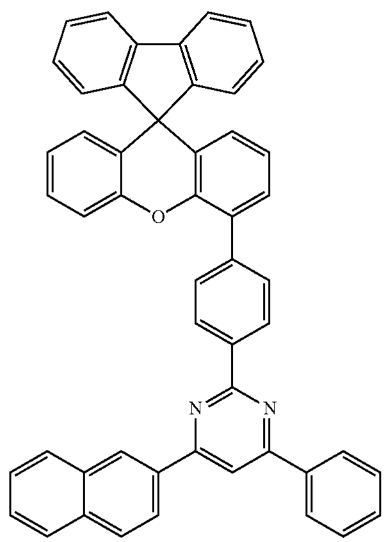
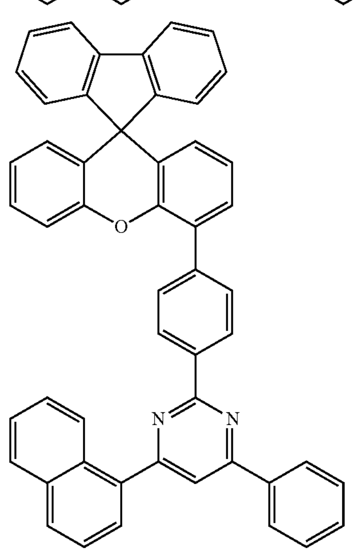

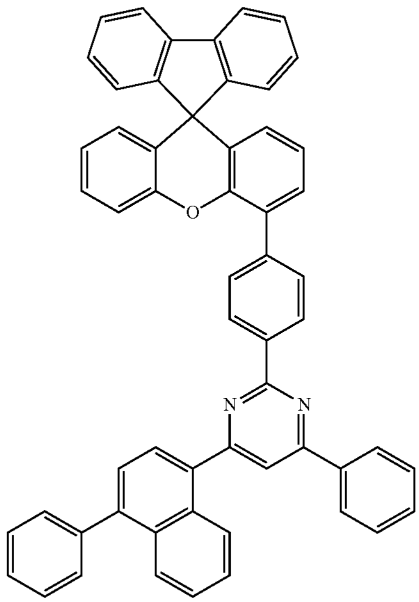
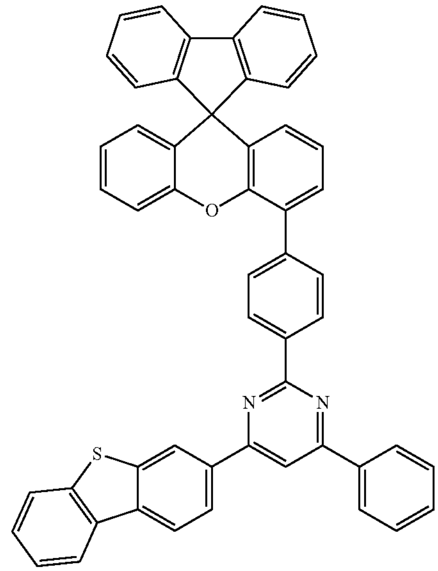
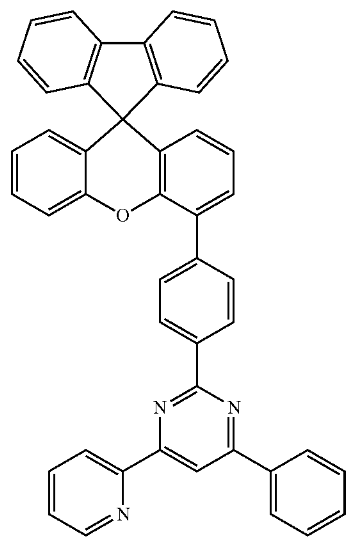
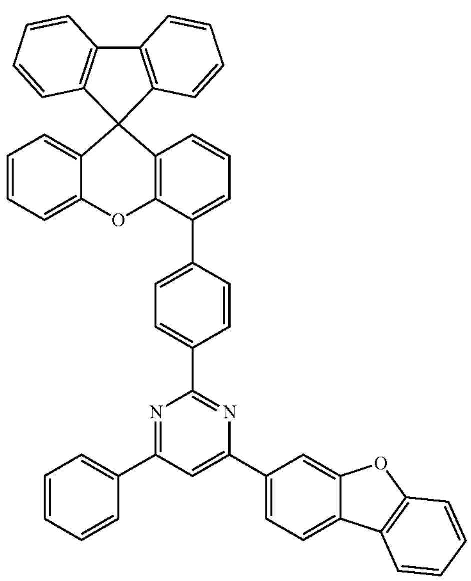
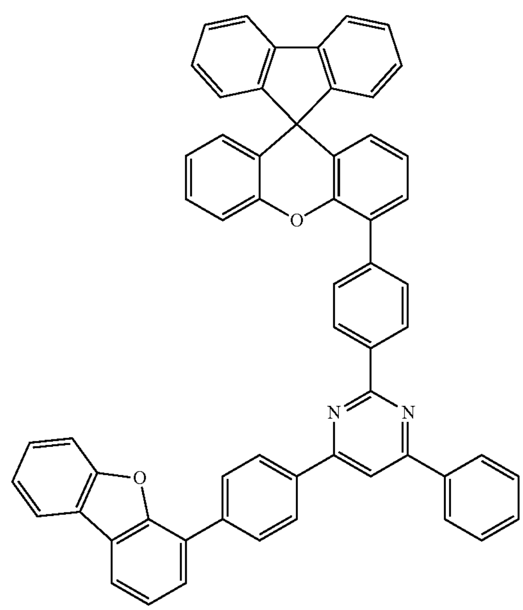

-continued
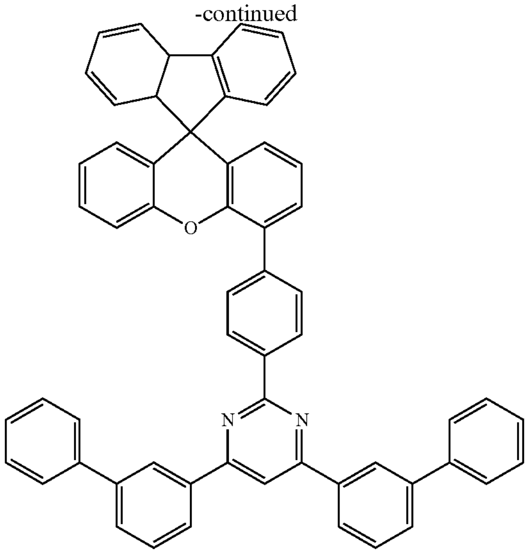
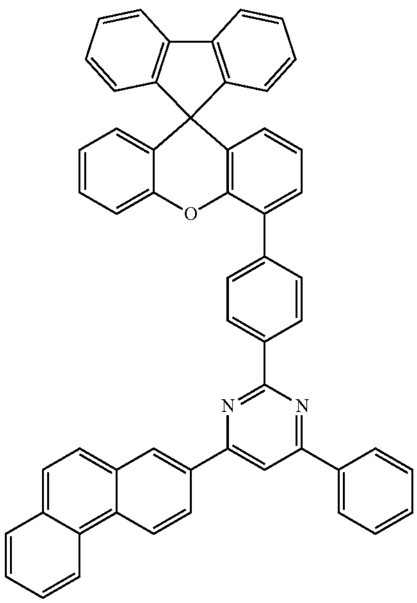
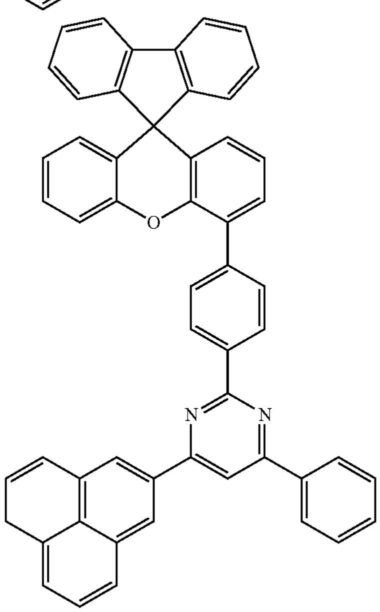
-continued
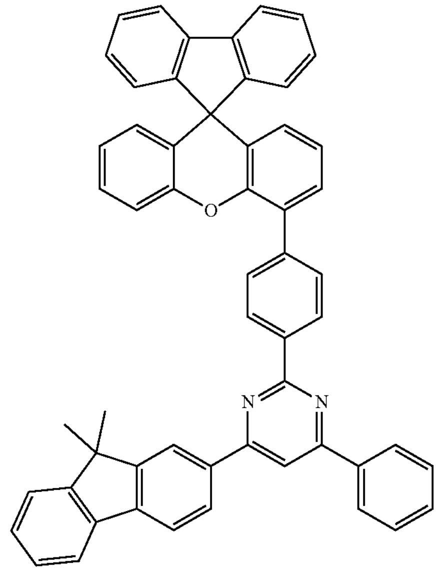
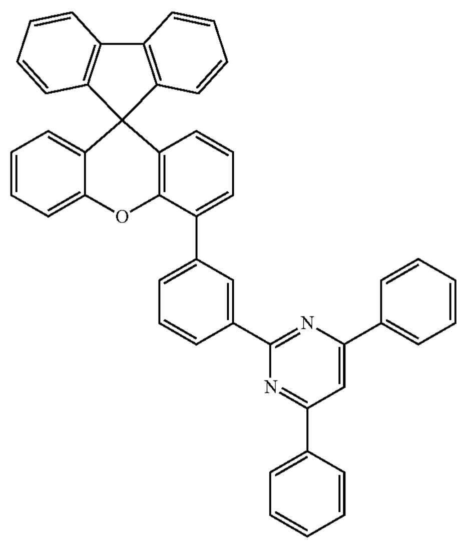
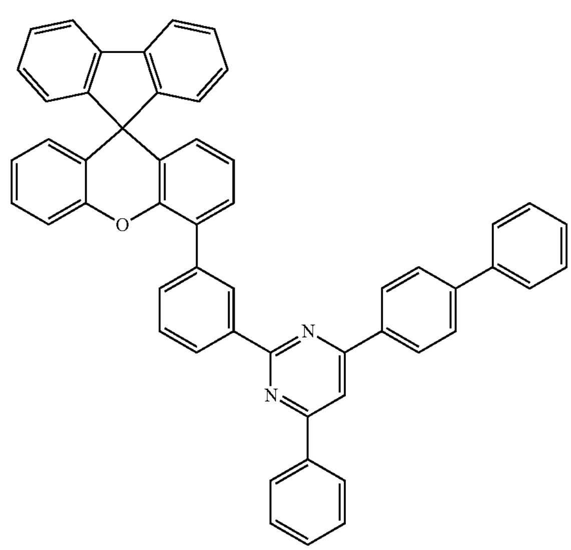

-continued
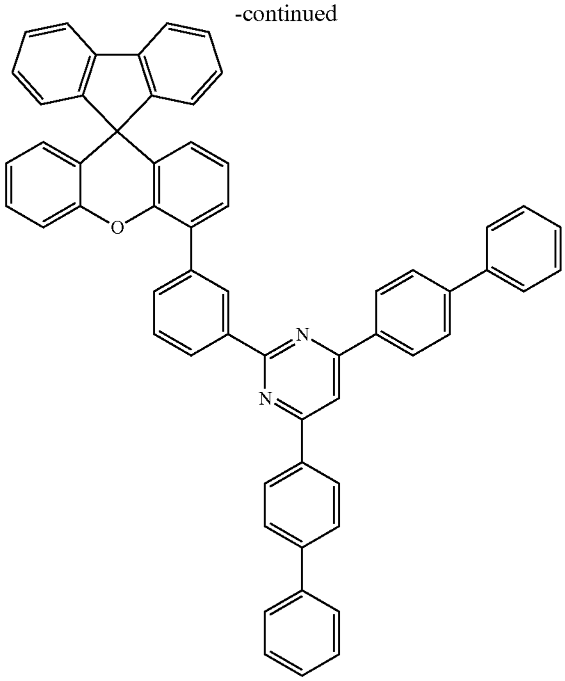
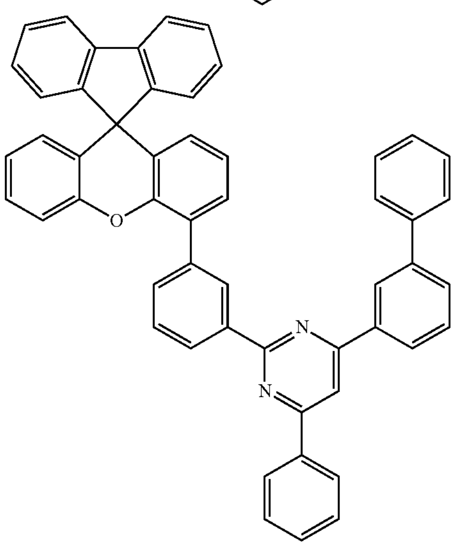
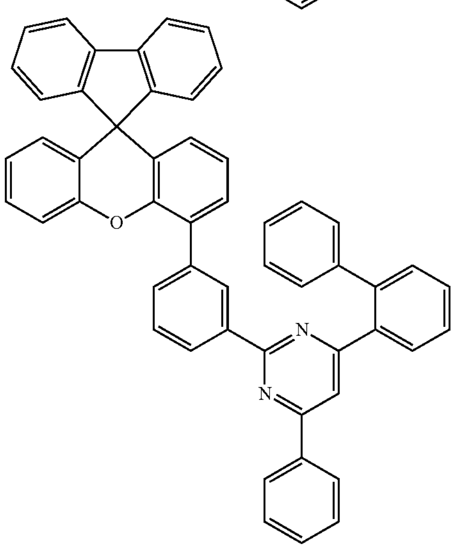
-continued
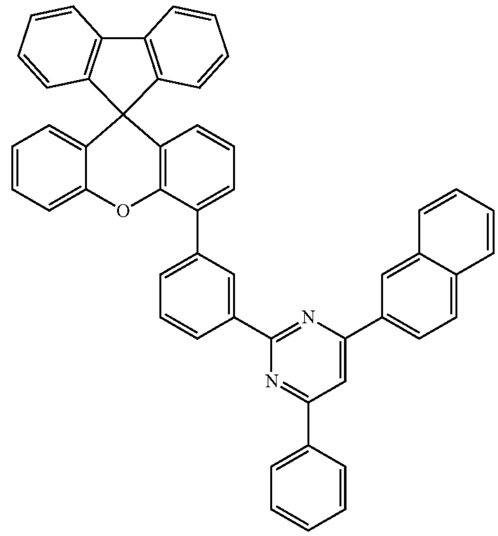
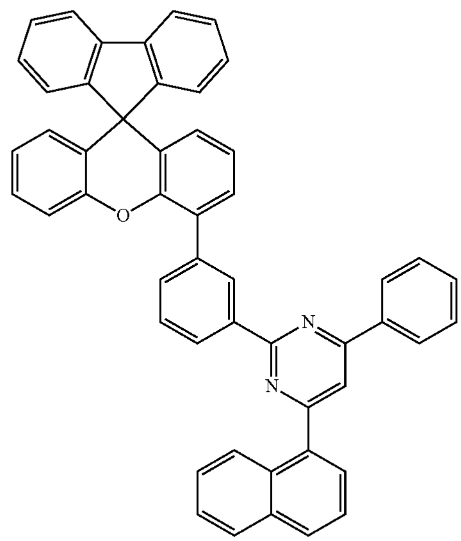
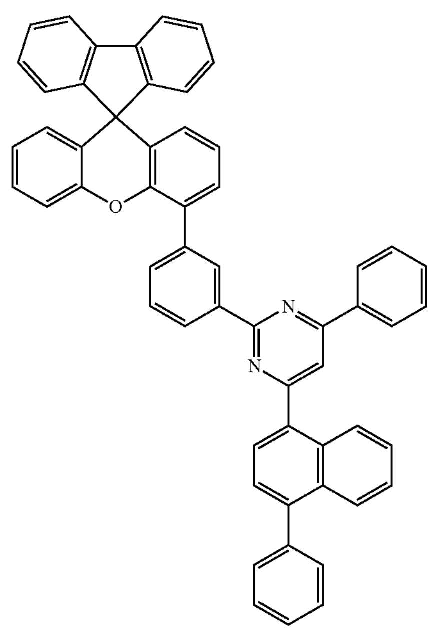

-continued
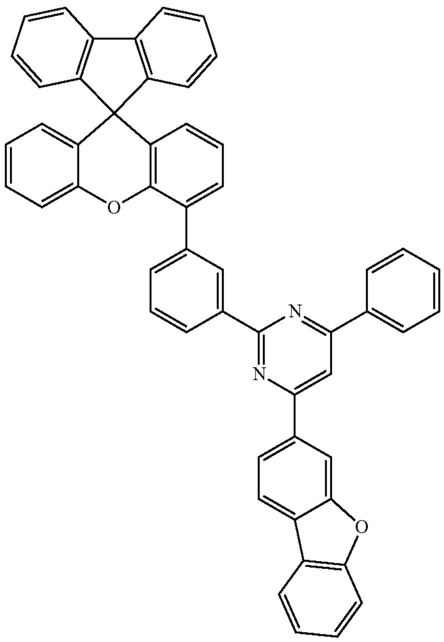
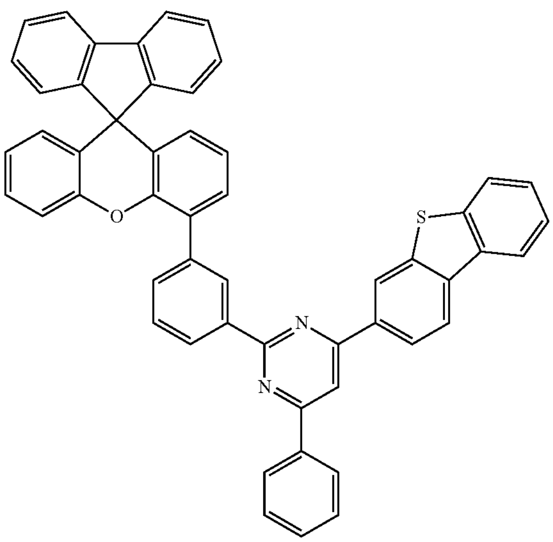
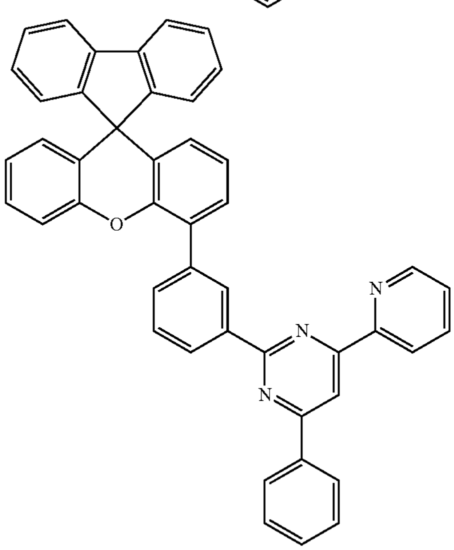
-continued
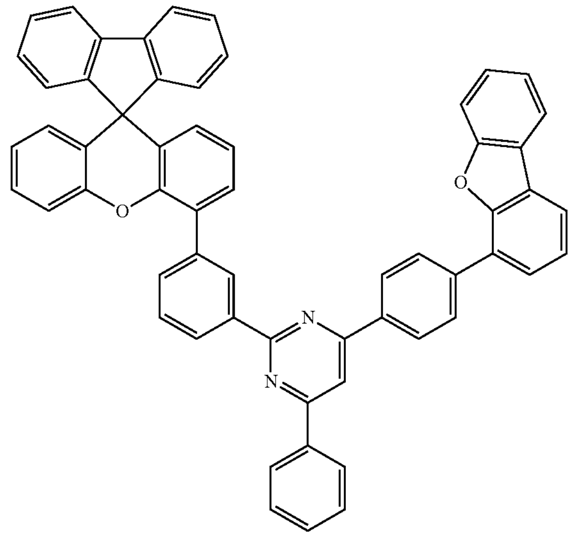
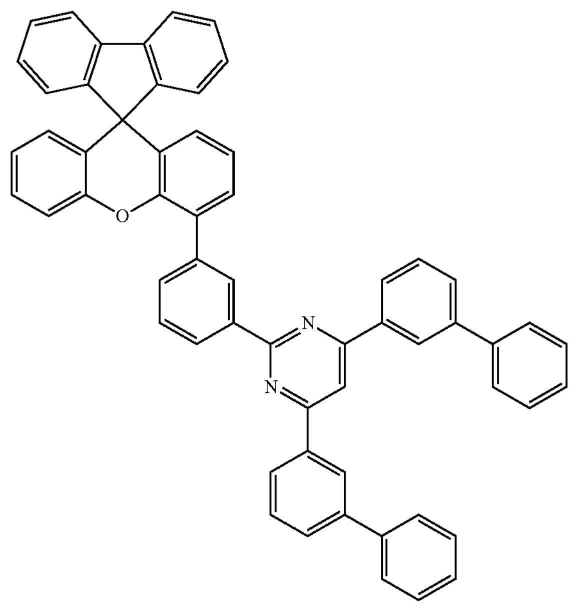
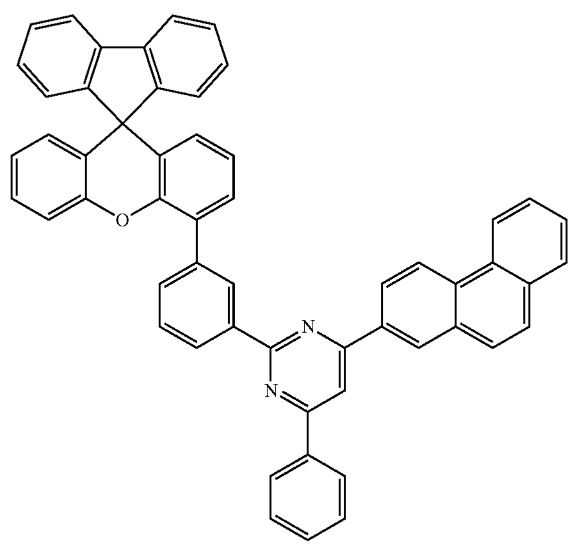

-continued
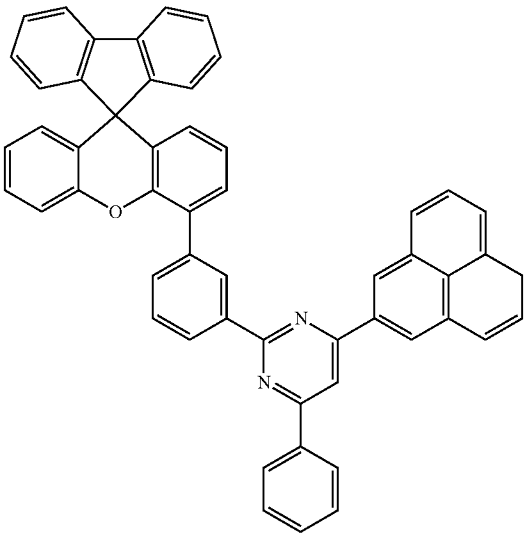
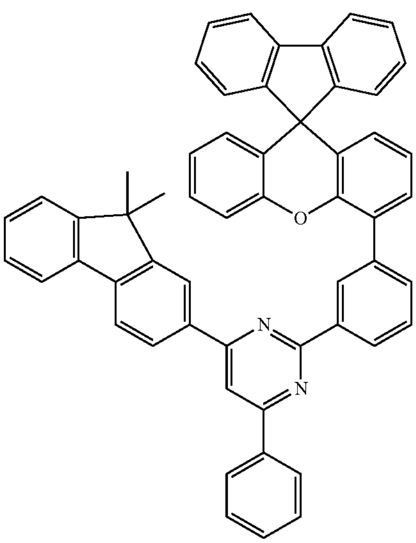
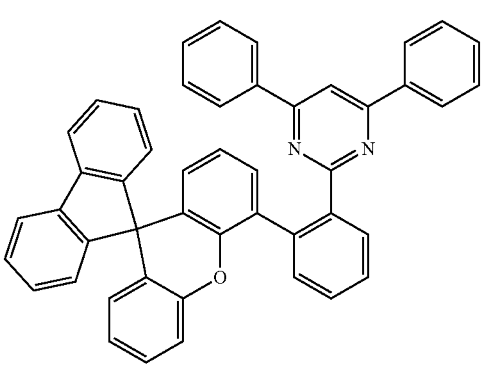
-continued
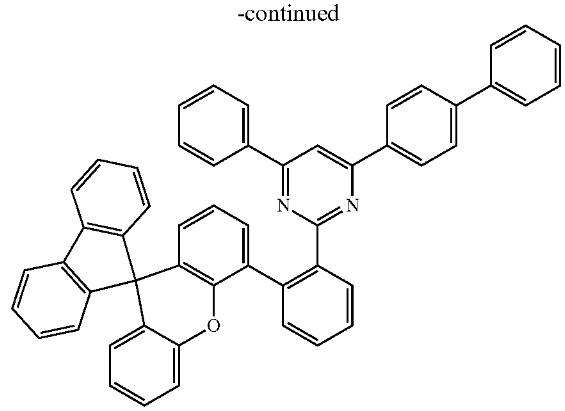
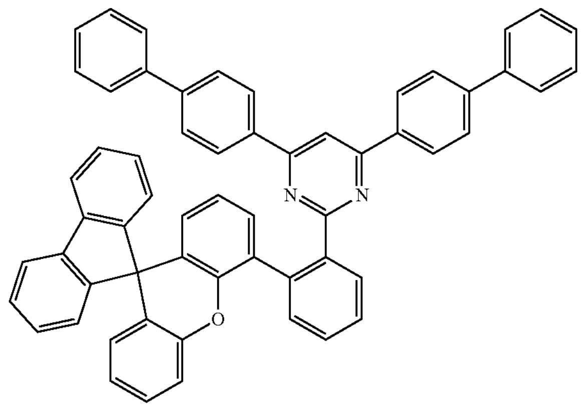
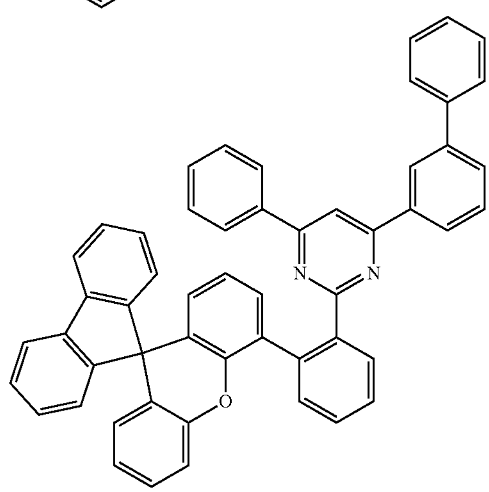
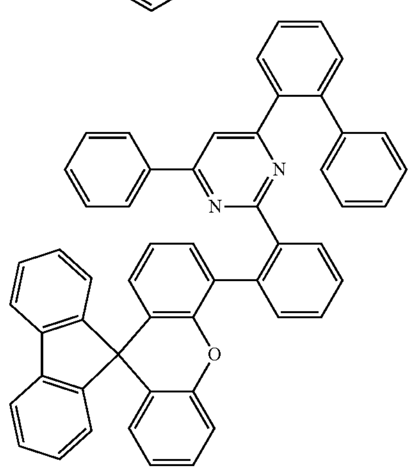

-continued
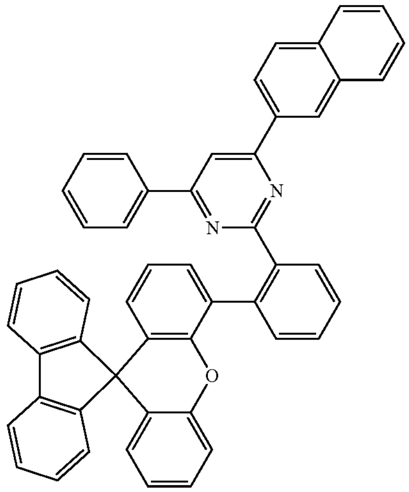
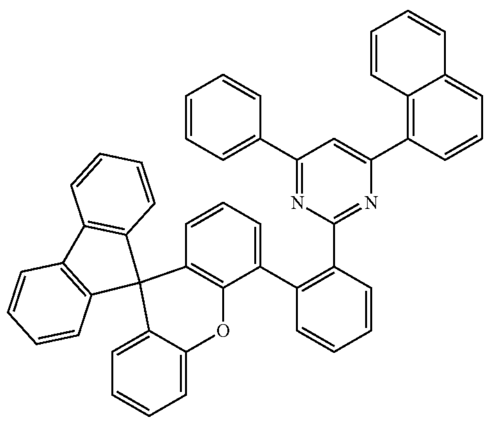
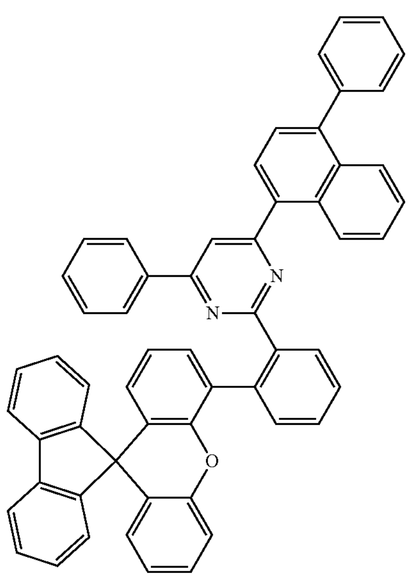
-continued
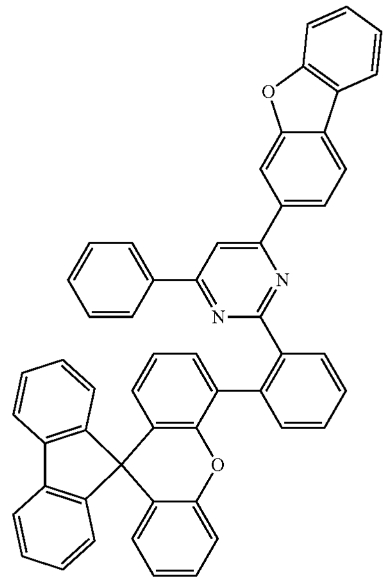
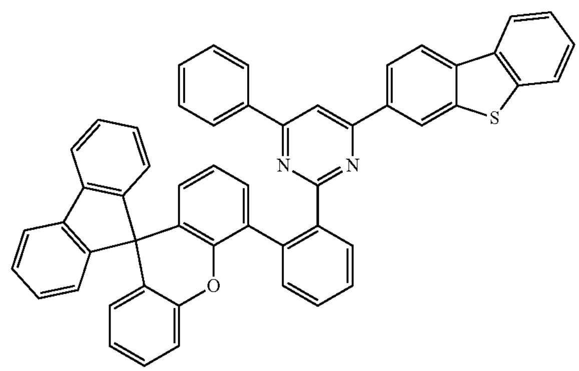
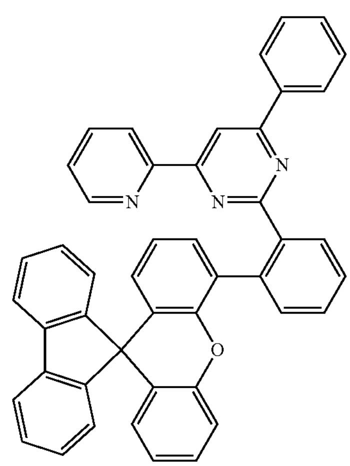

-continued
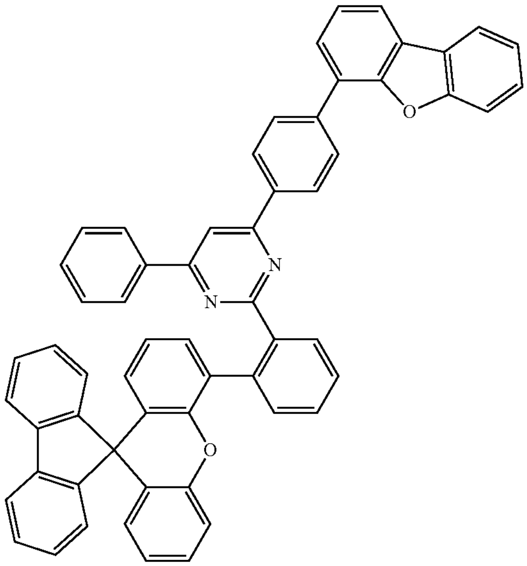
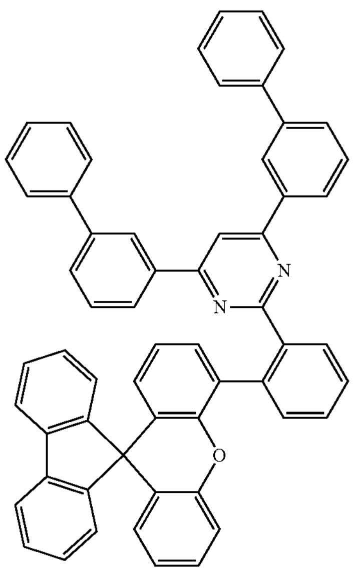
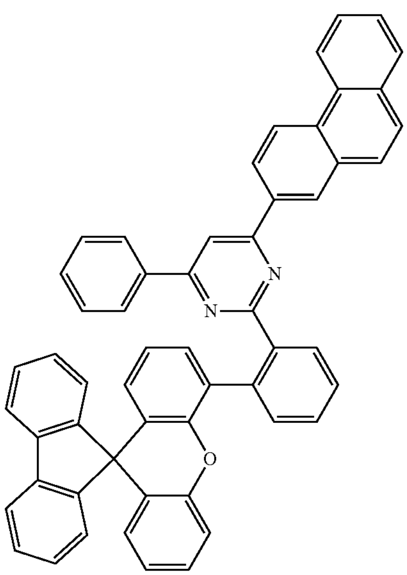
-continued
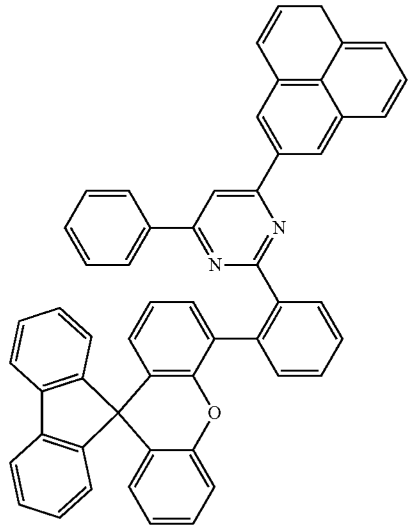
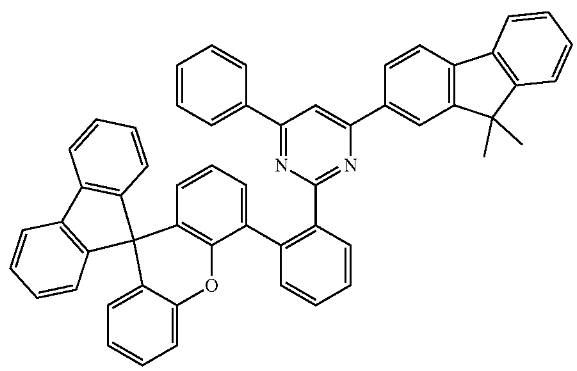
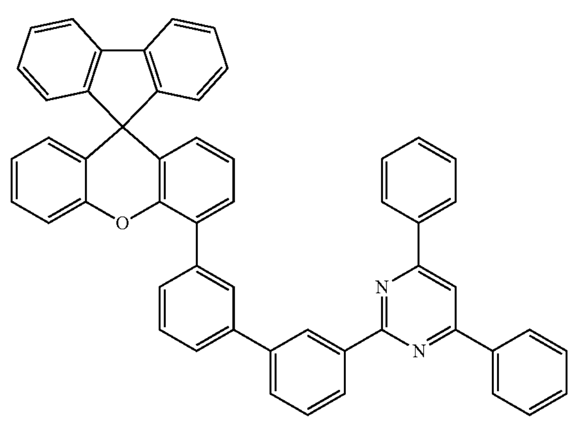

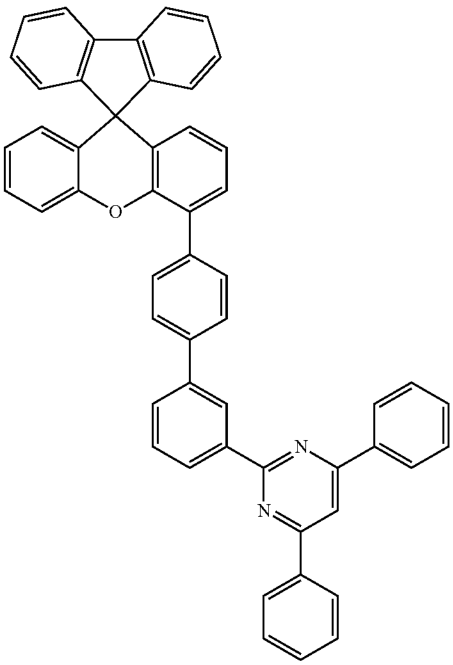
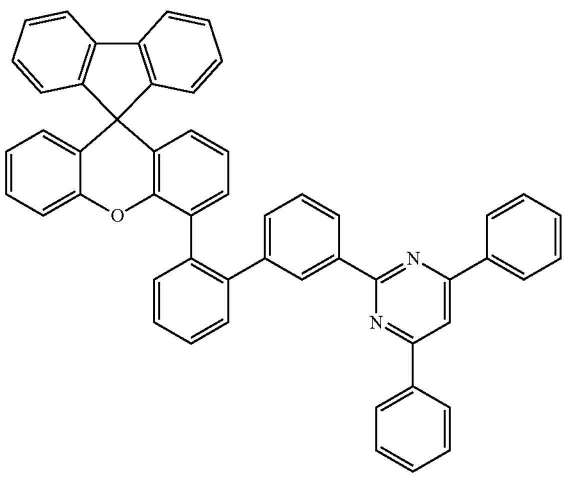
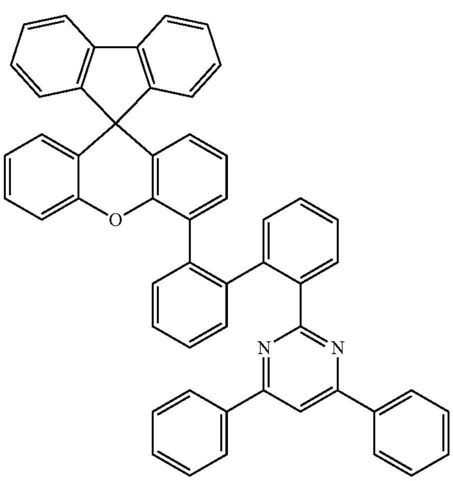
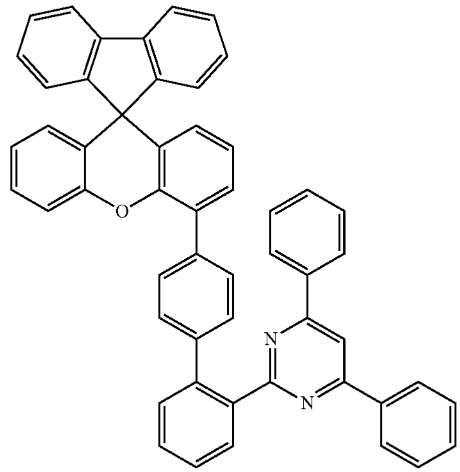
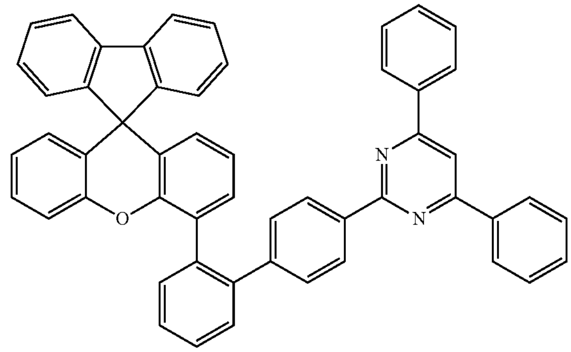
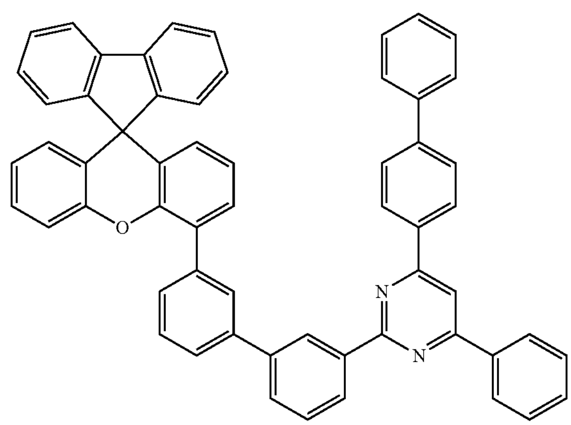
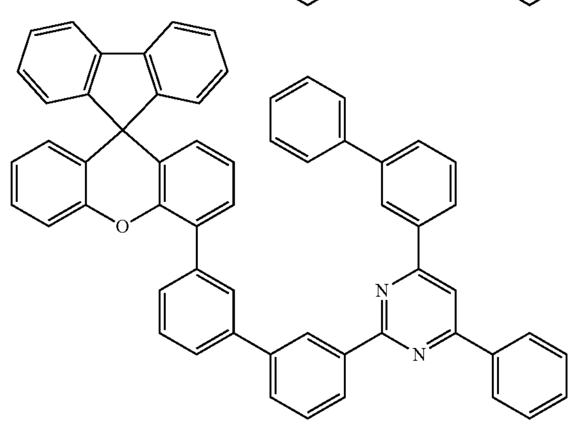

-continued
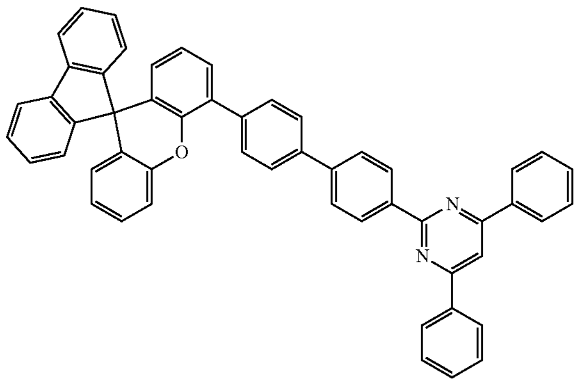
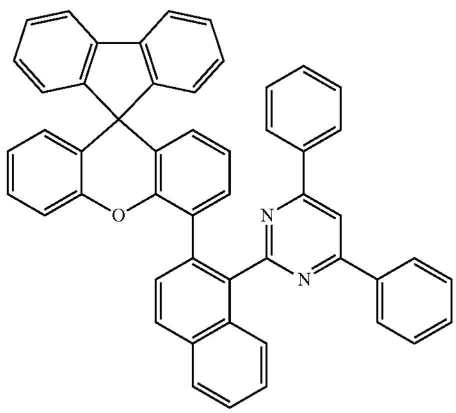
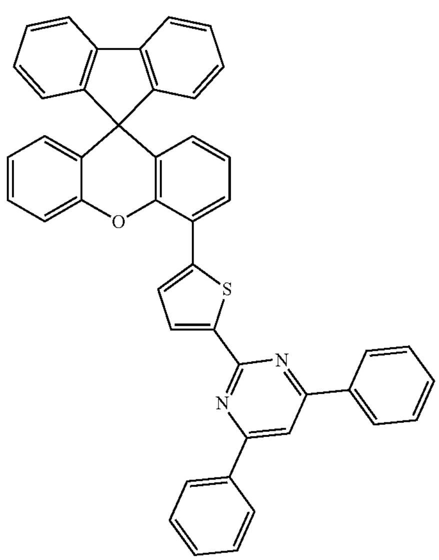
-continued
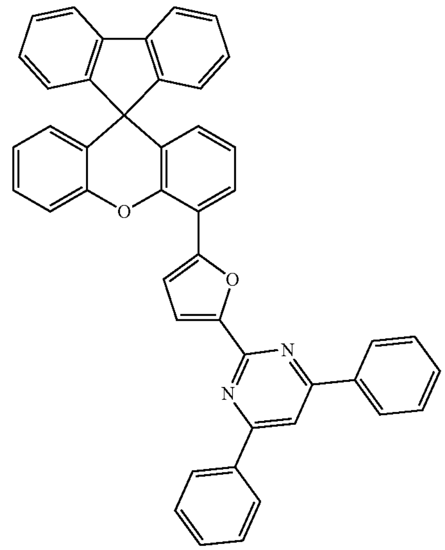
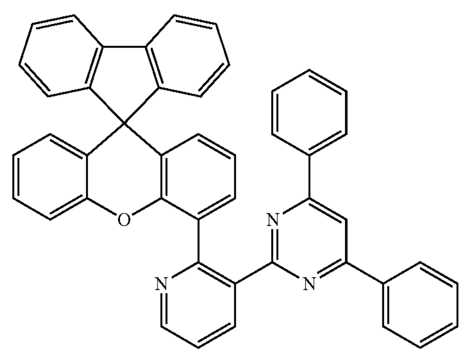
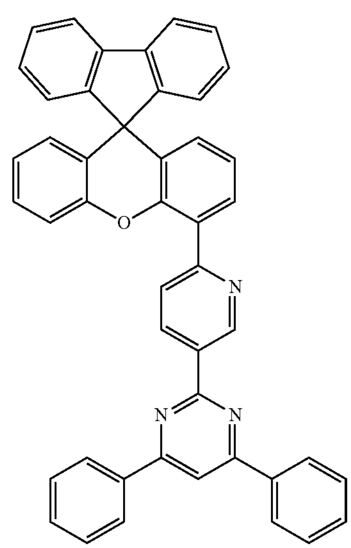

-continued
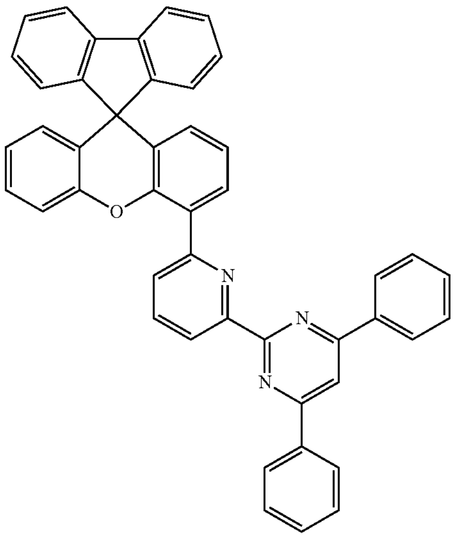
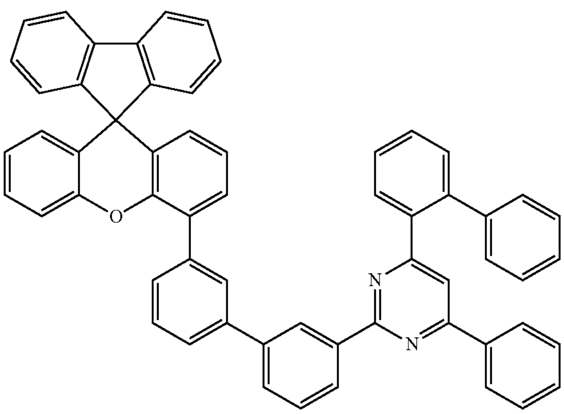
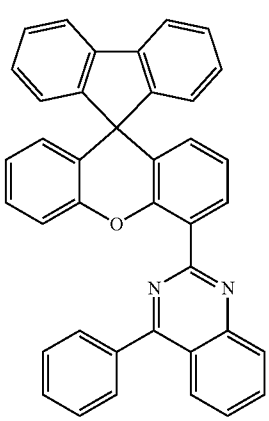
-continued
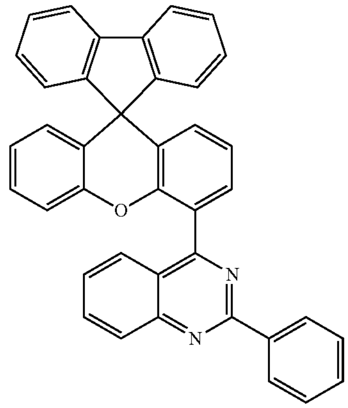
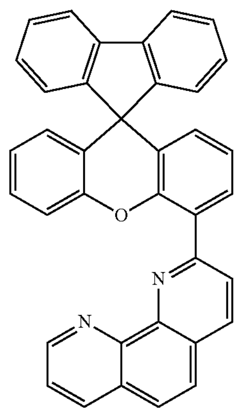
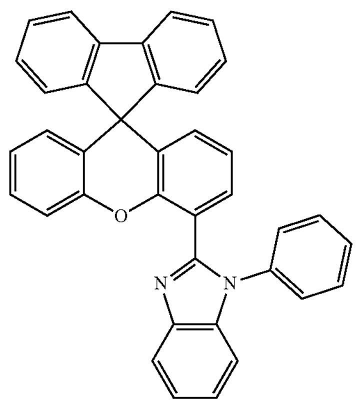
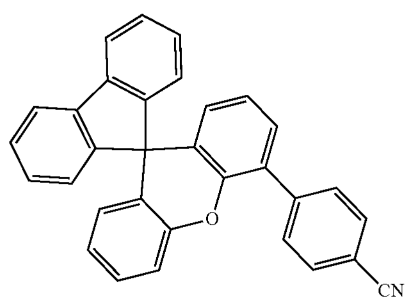

-continued
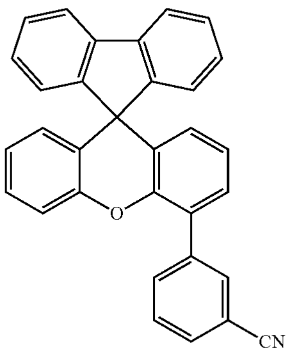
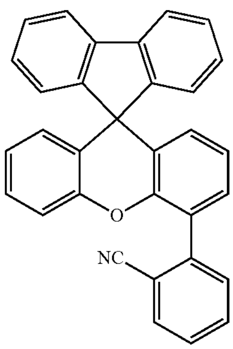
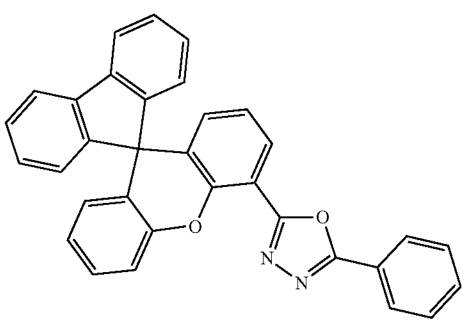
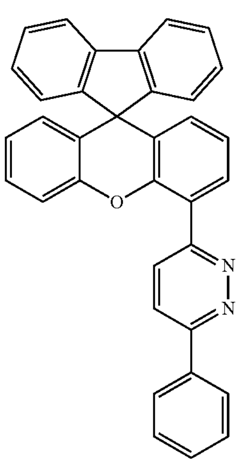
-continued
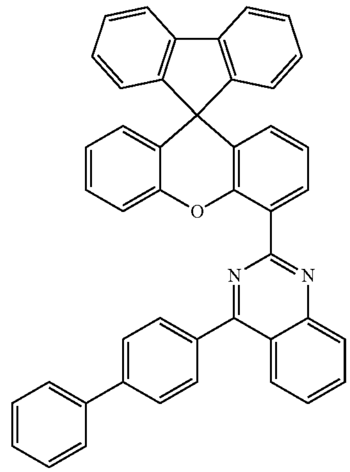
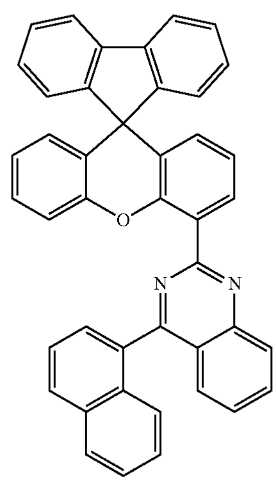
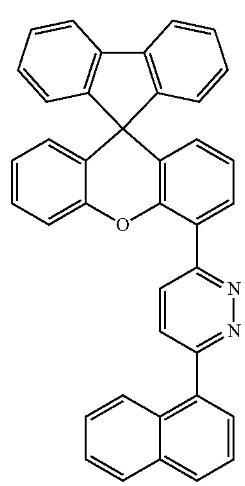

-continued
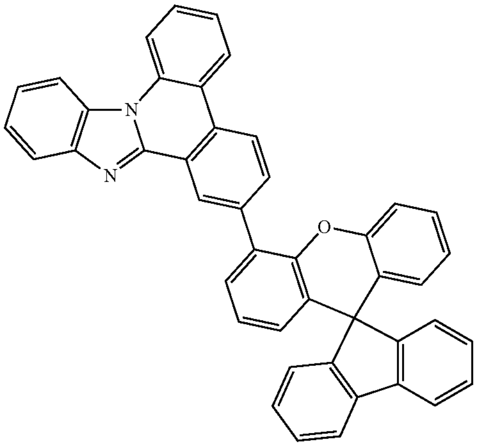
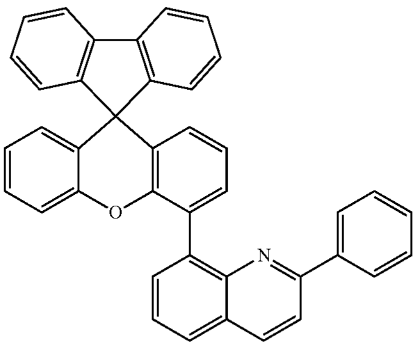
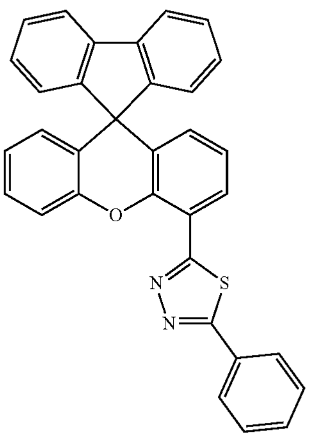
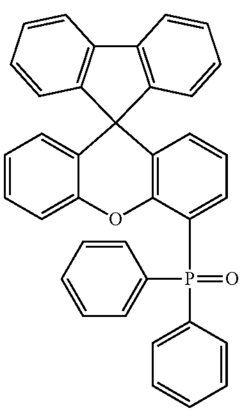
-continued
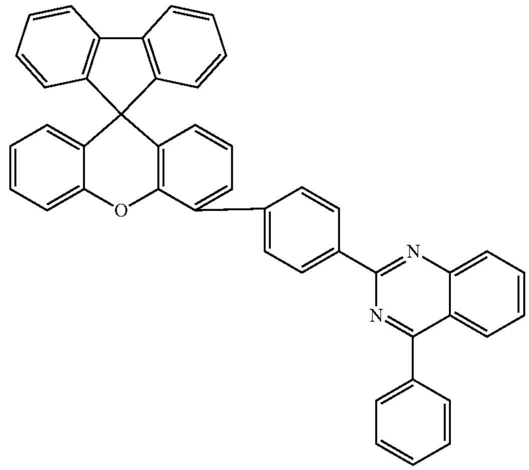
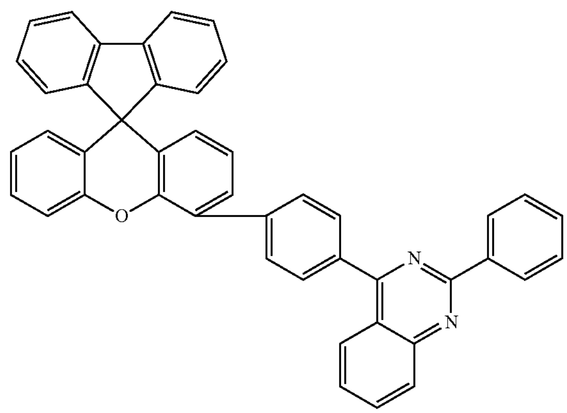
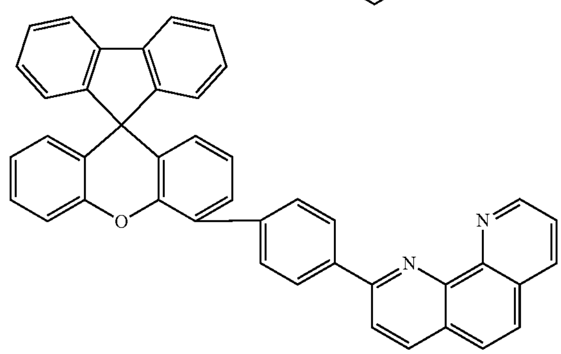
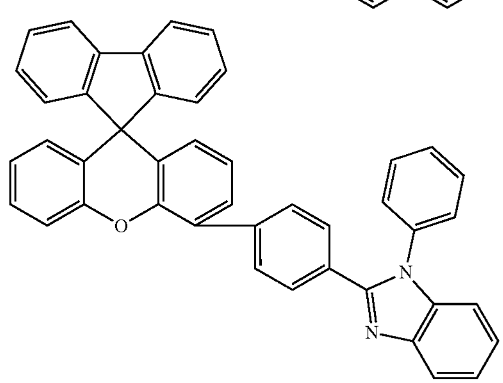

-continued
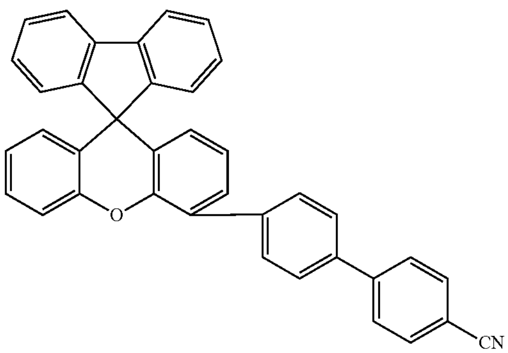
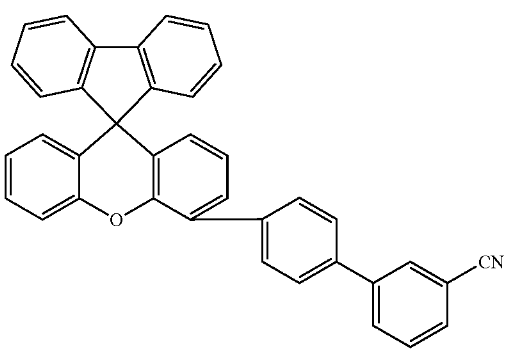
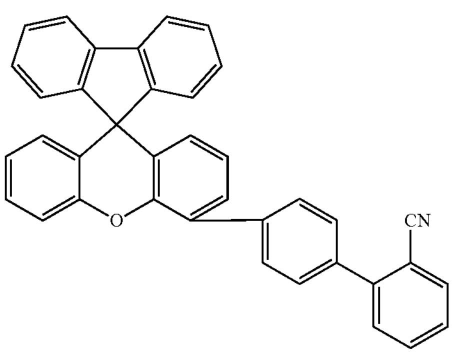
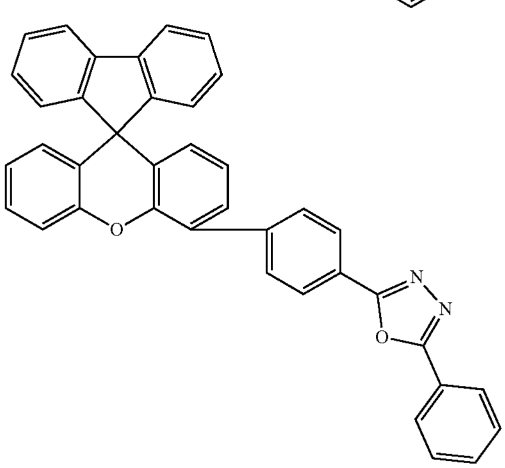
-continued
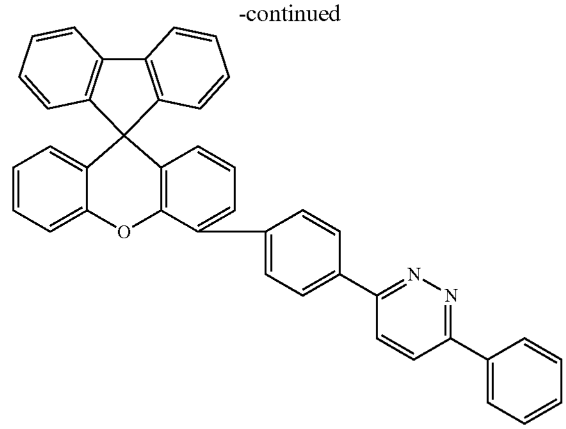
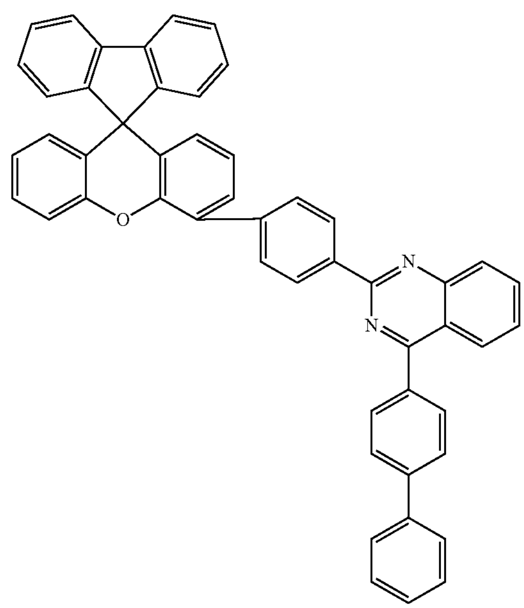
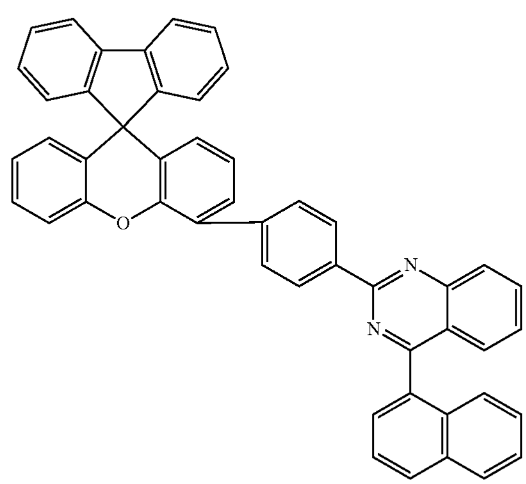

-continued
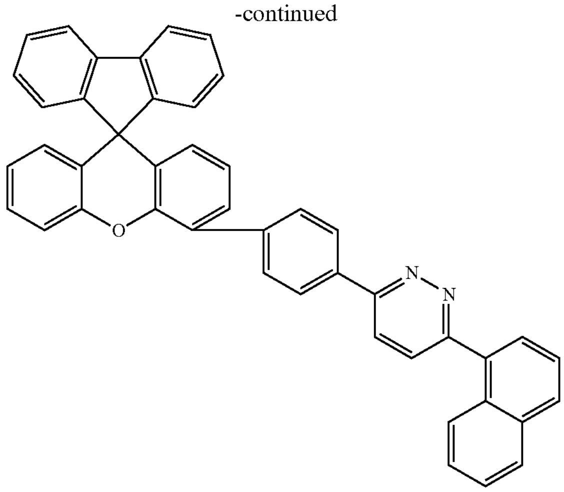
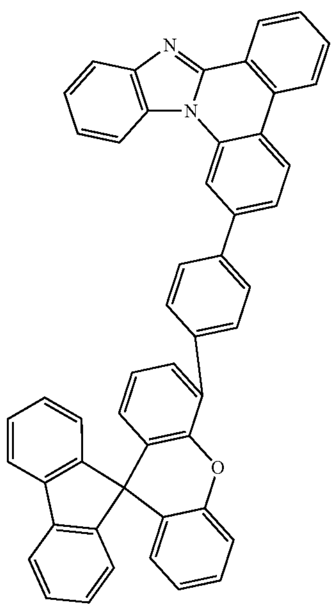
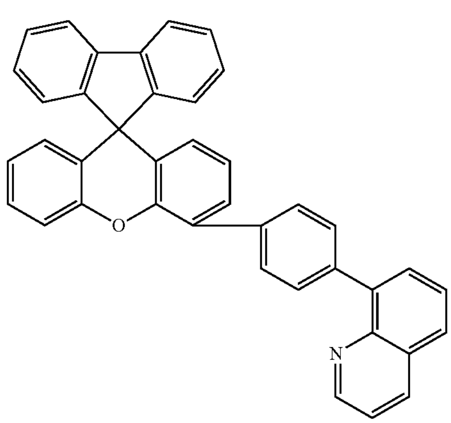
-continued
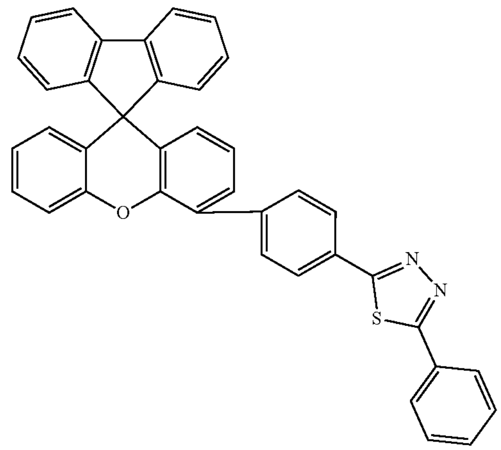
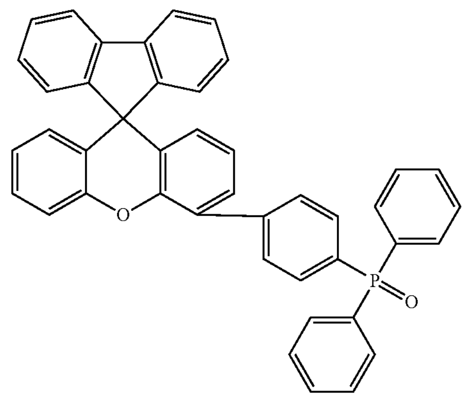
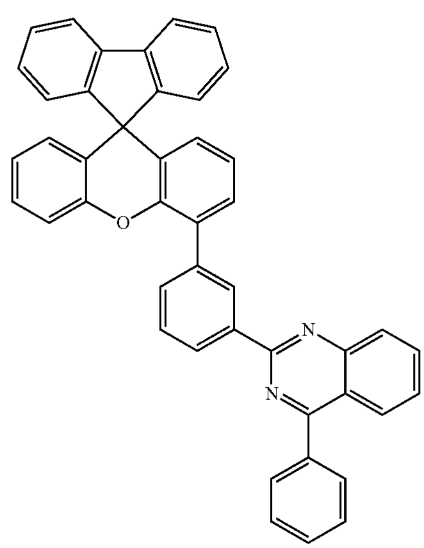

-continued
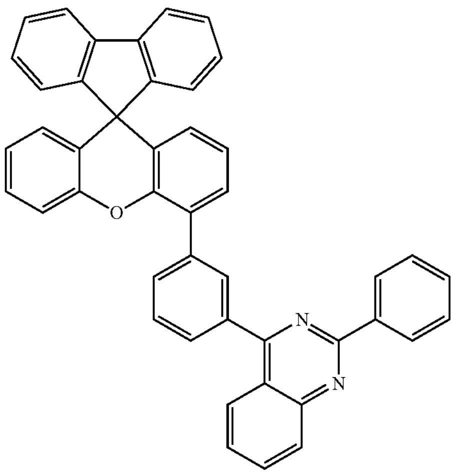
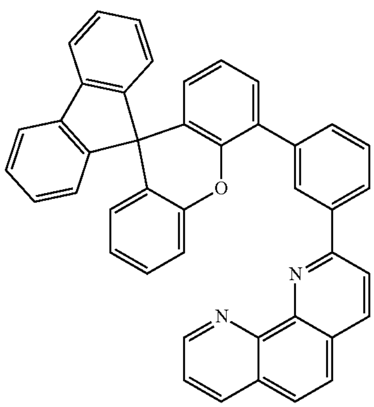
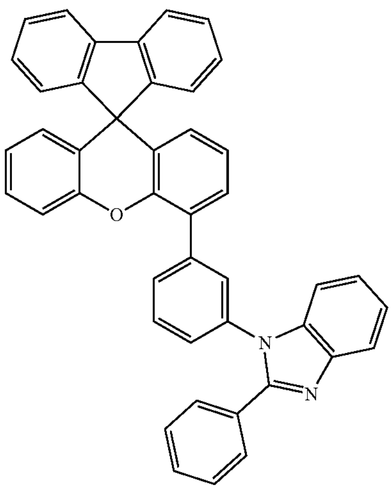
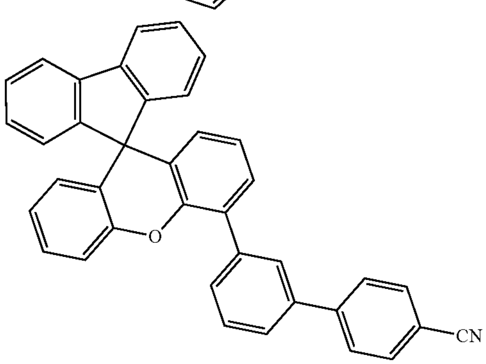
-continued
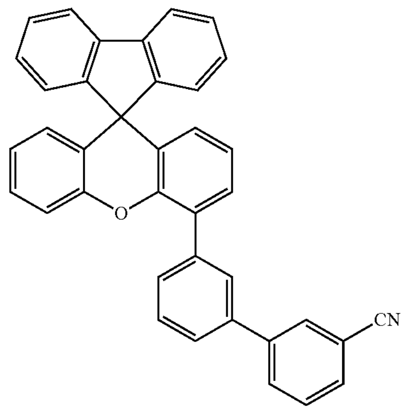
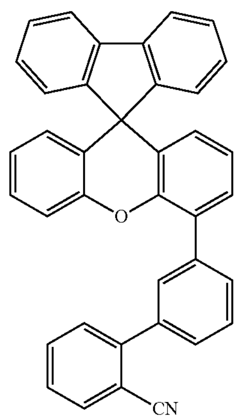
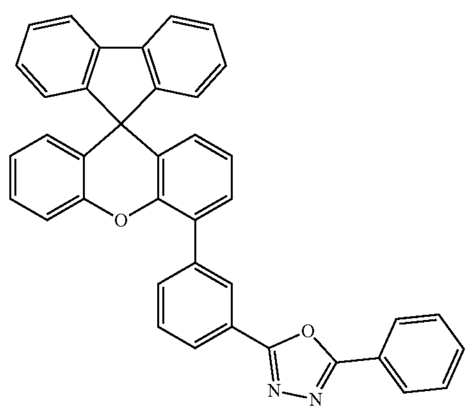
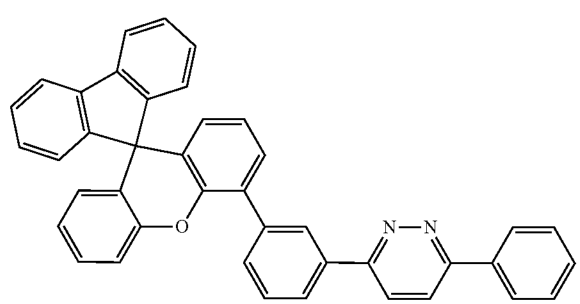

-continued
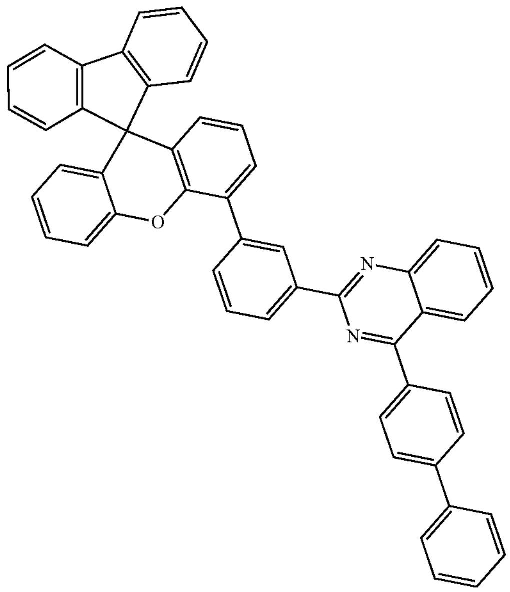
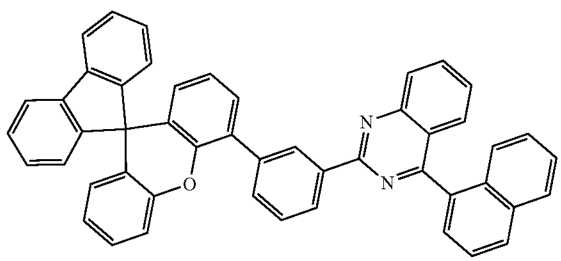
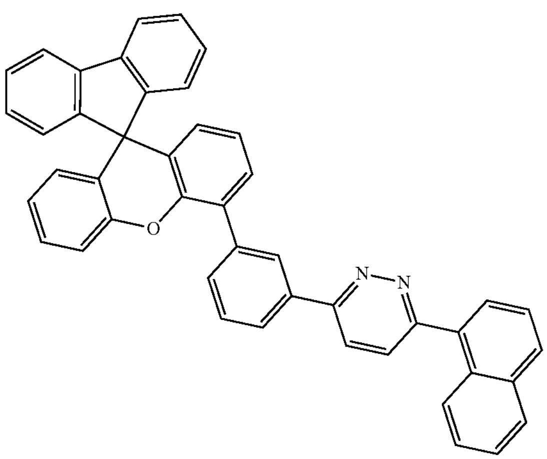
-continued
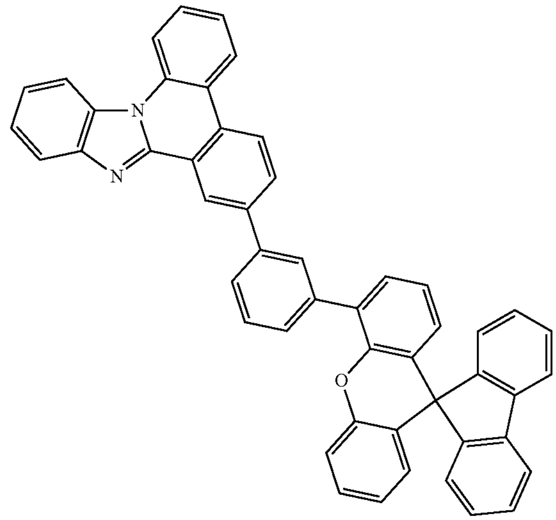
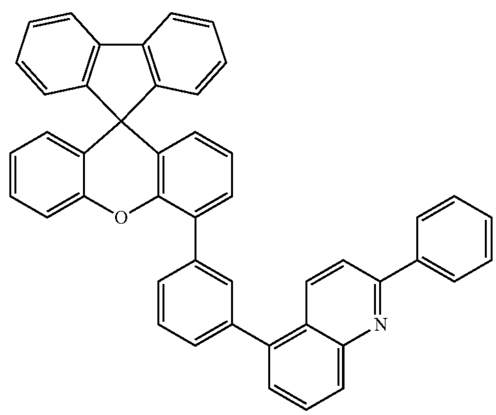
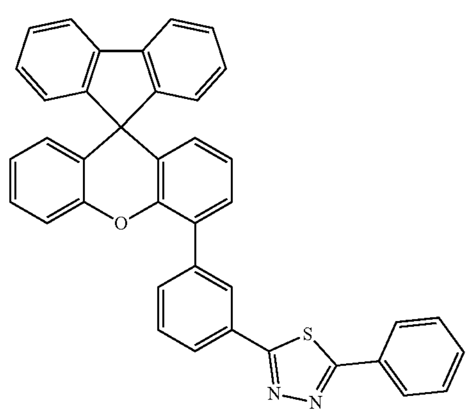

-continued
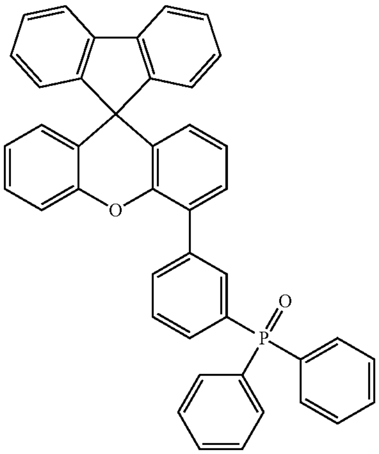
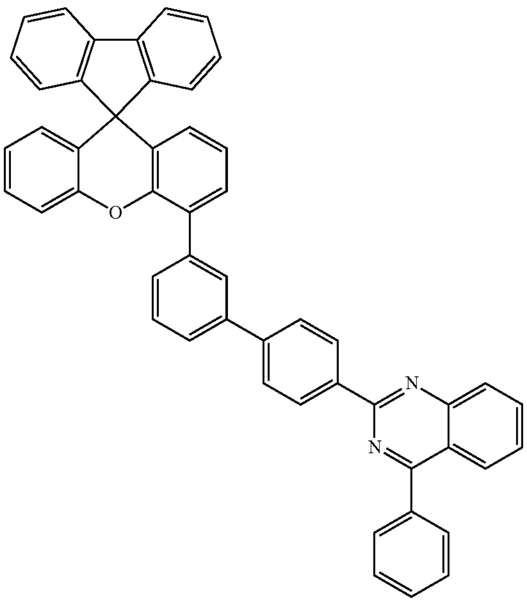
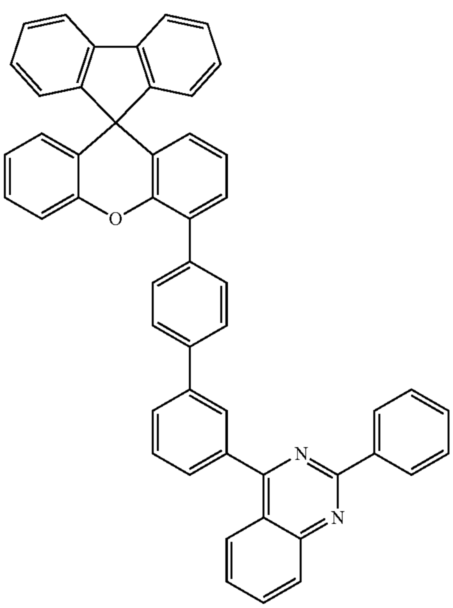
-continued
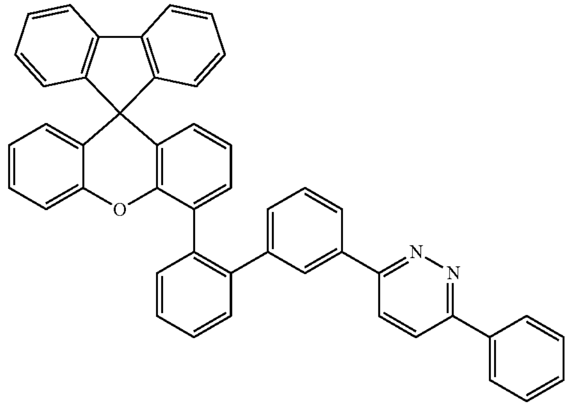
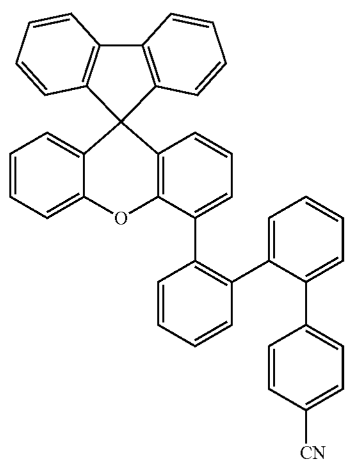
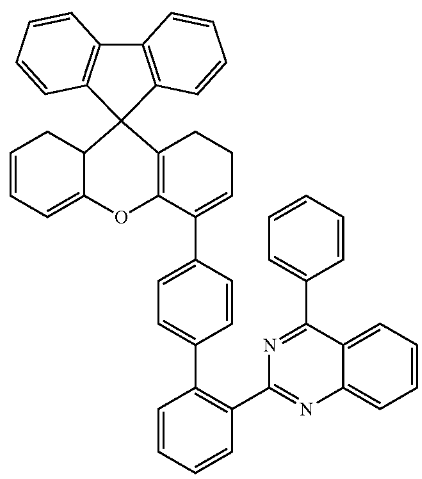
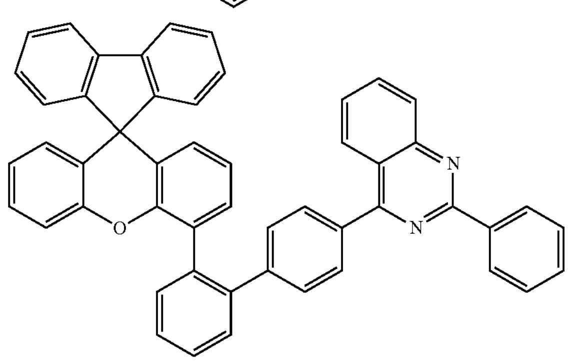

-continued
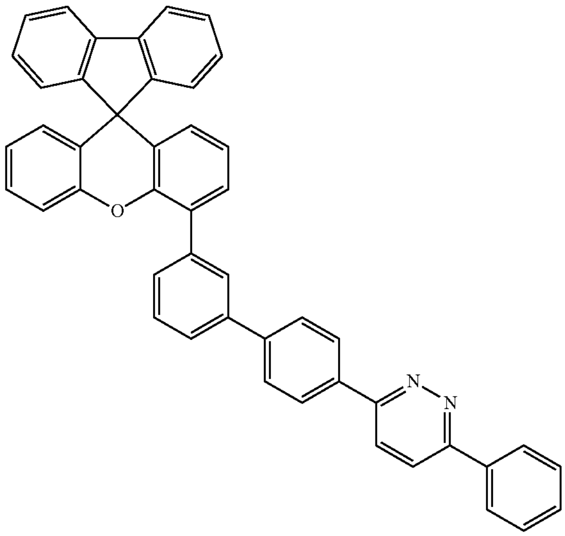
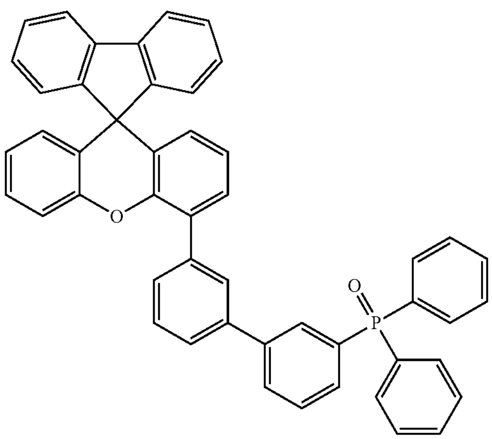
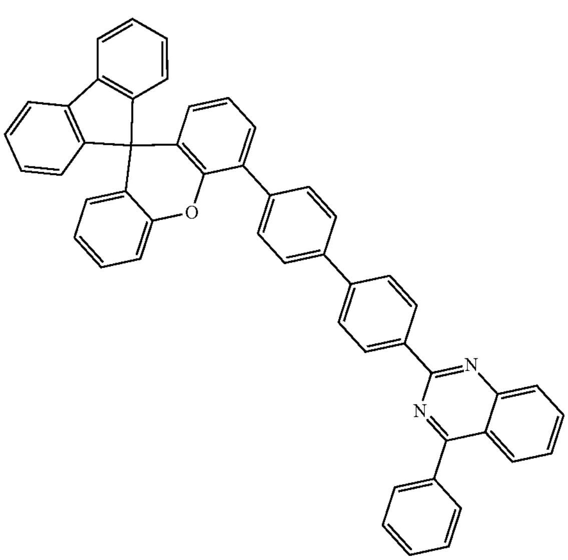
-continued
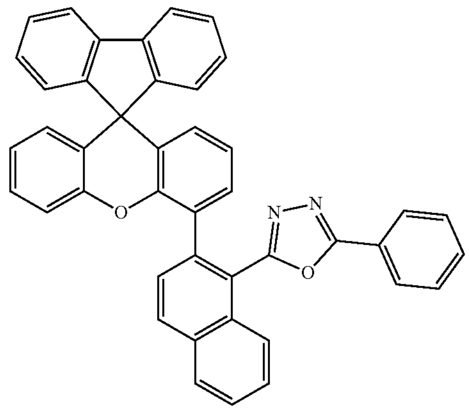
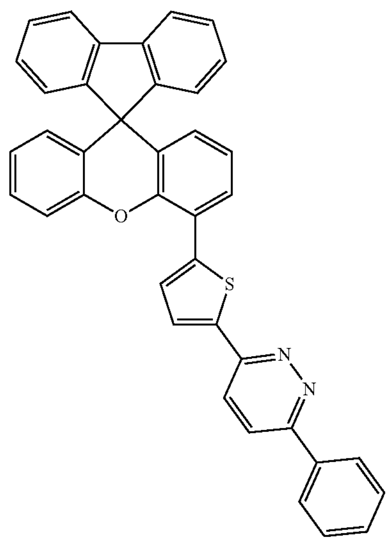
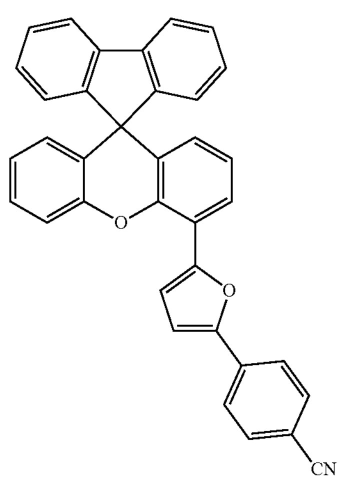

-continued
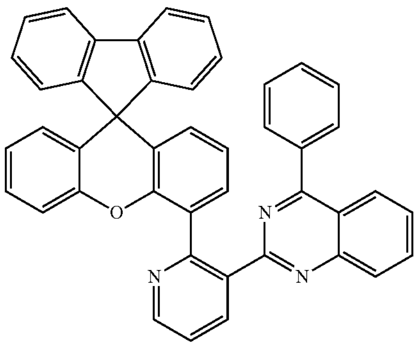
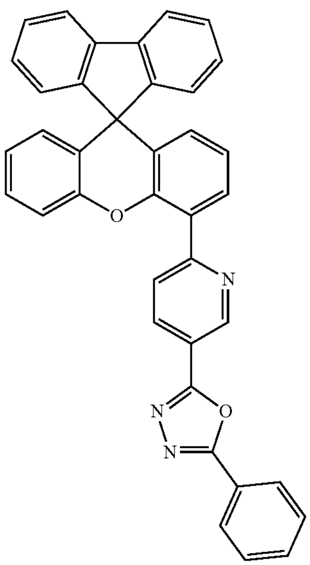
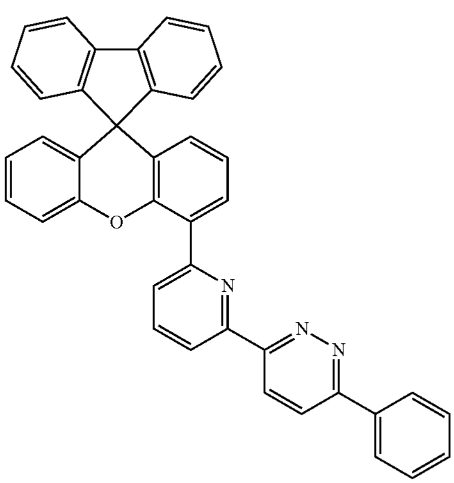
-continued
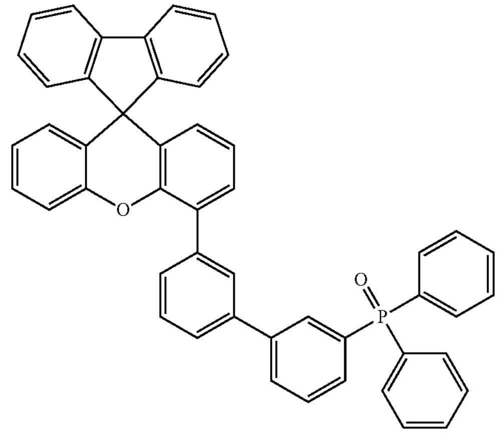
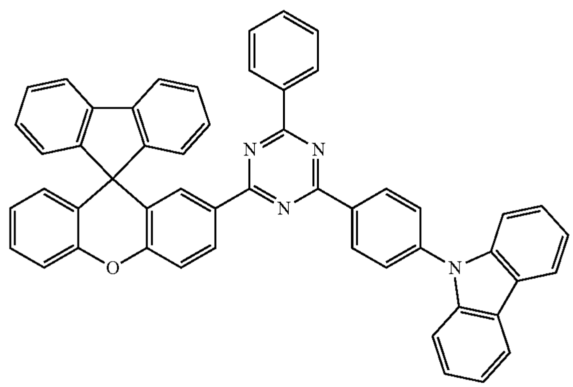
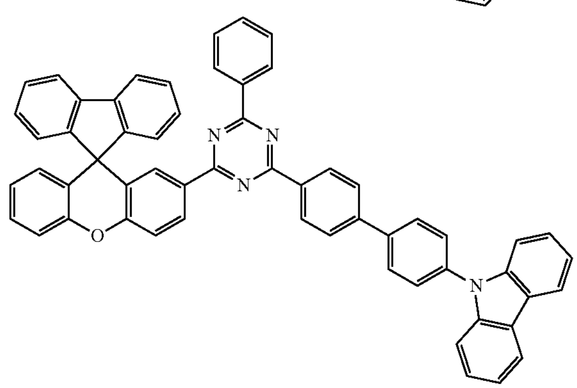
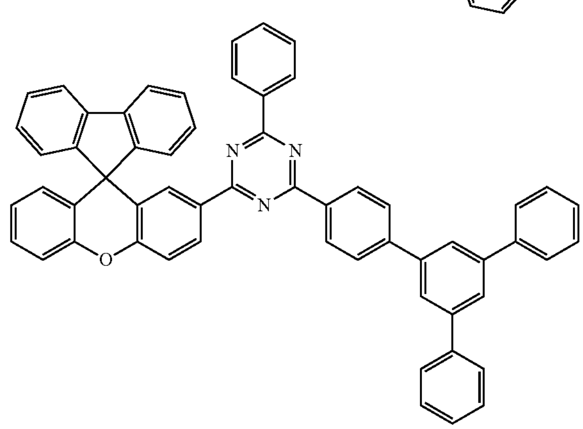

-continued
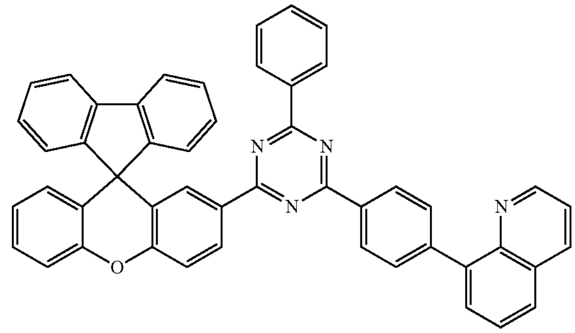
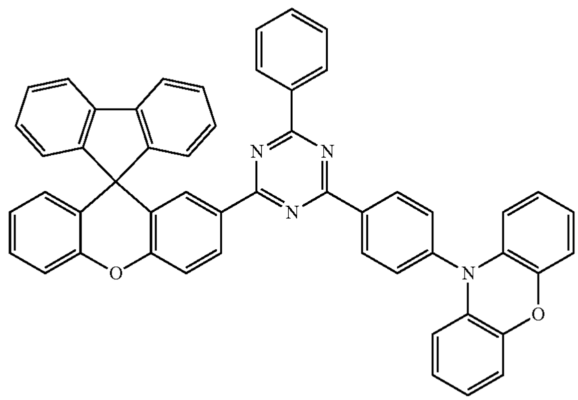
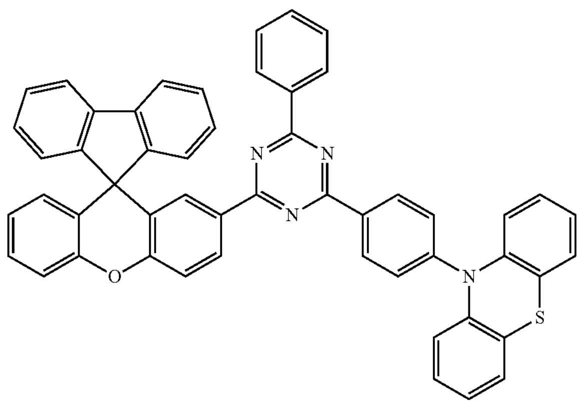
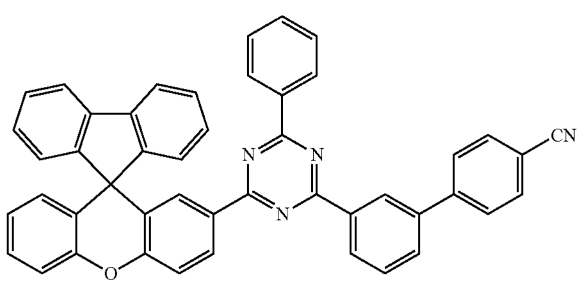
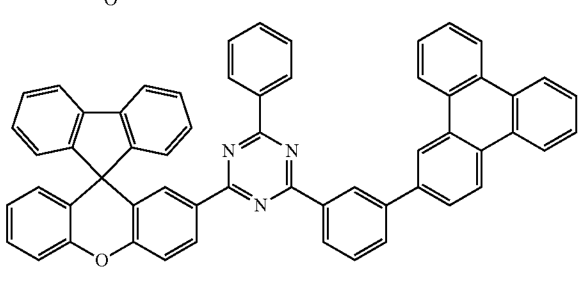
-continued
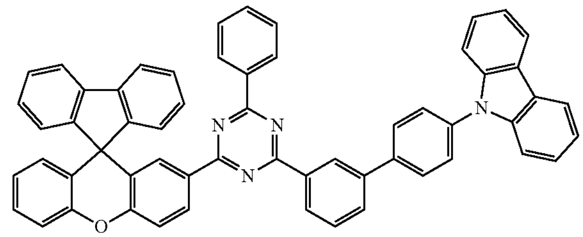
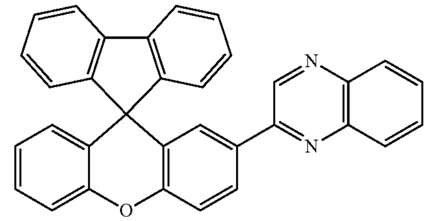
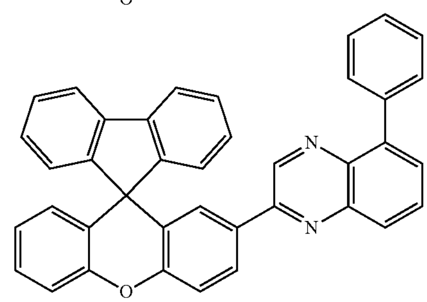
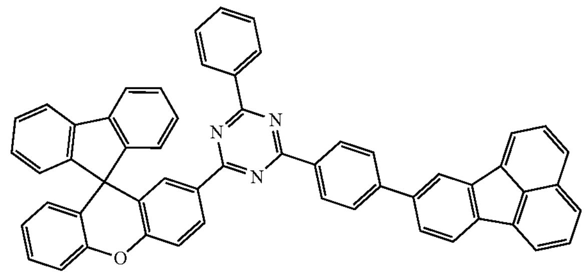
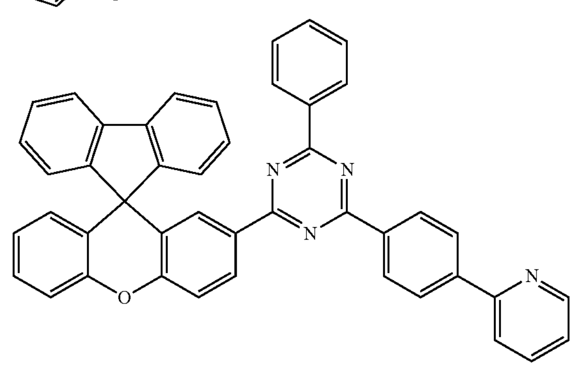
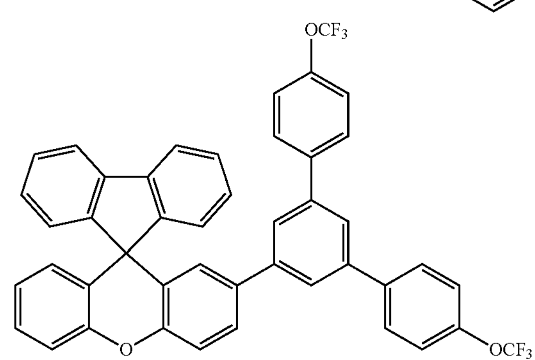

-continued
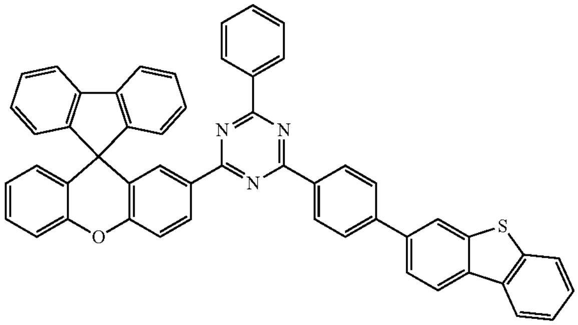
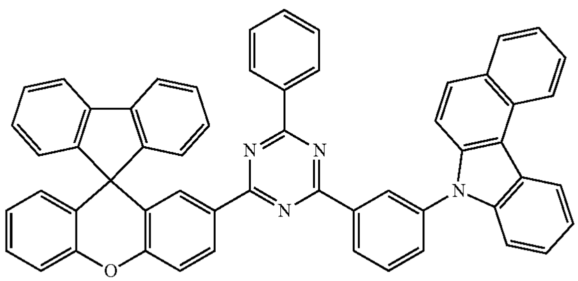
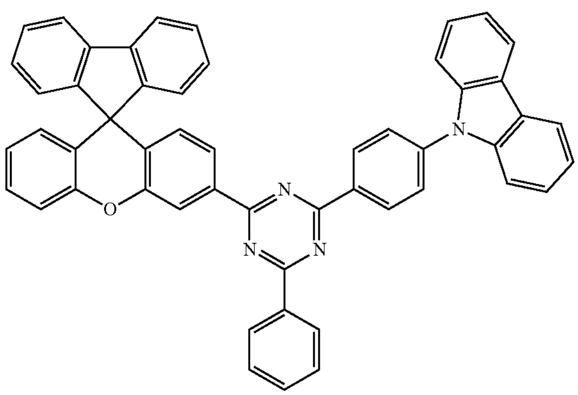
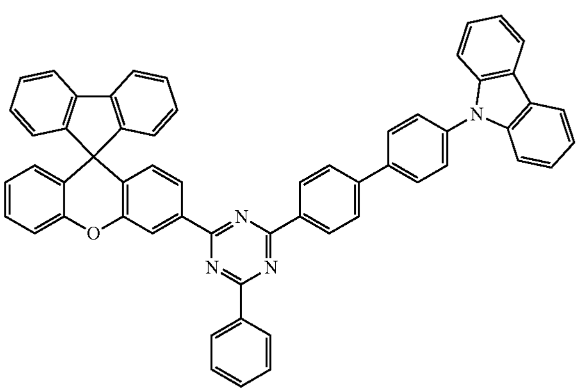
-continued
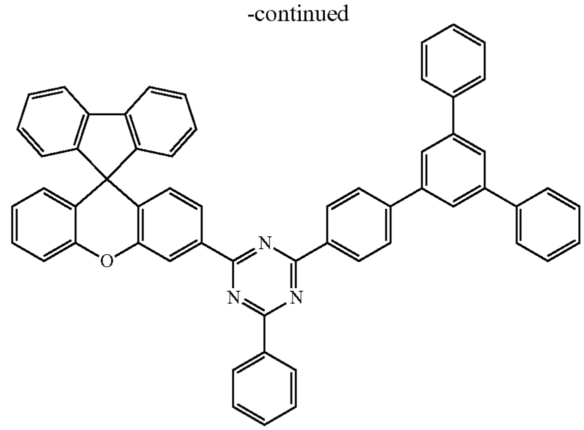
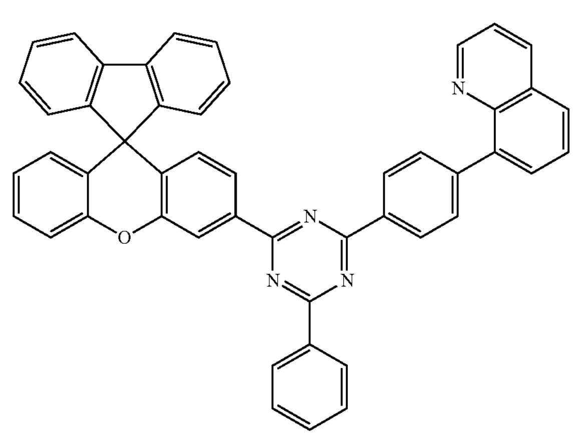
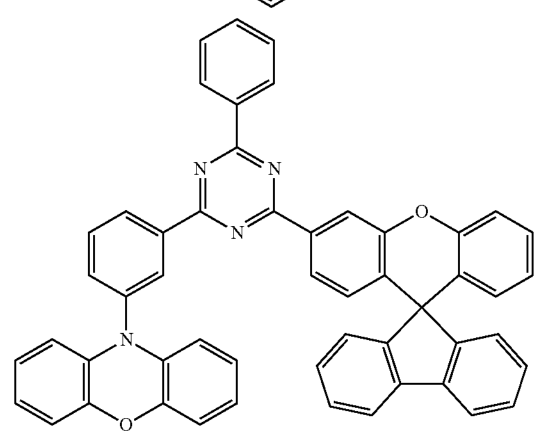
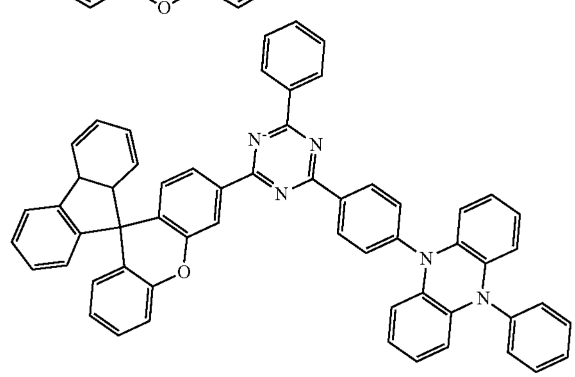

-continued
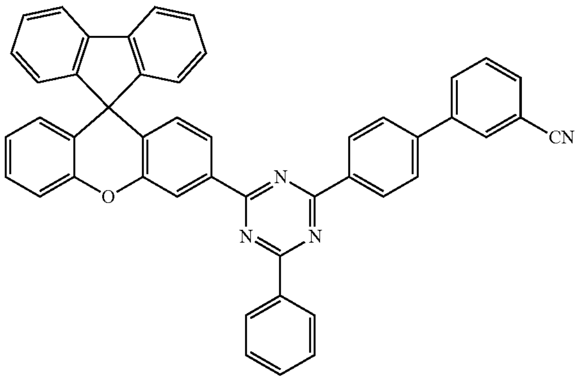
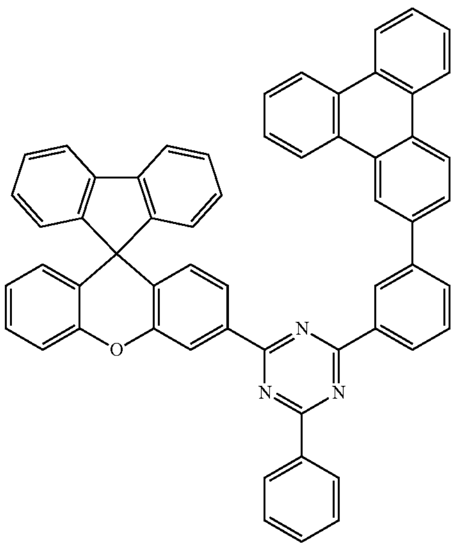
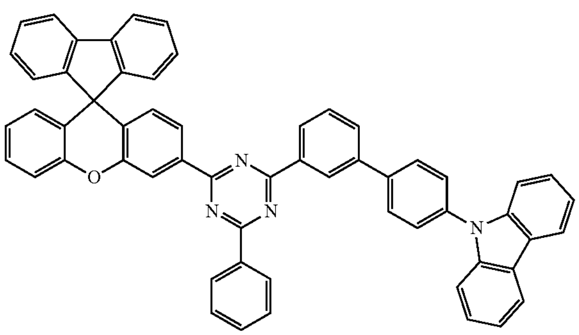
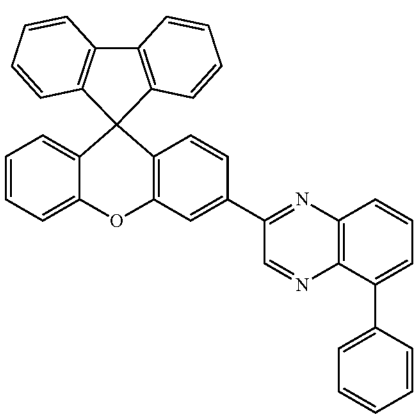
-continued
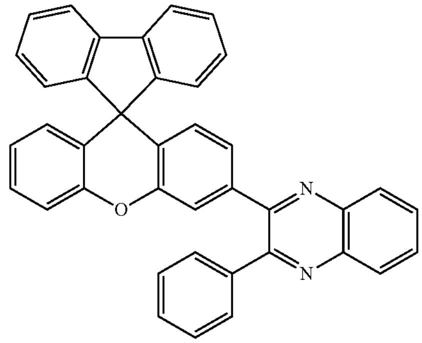
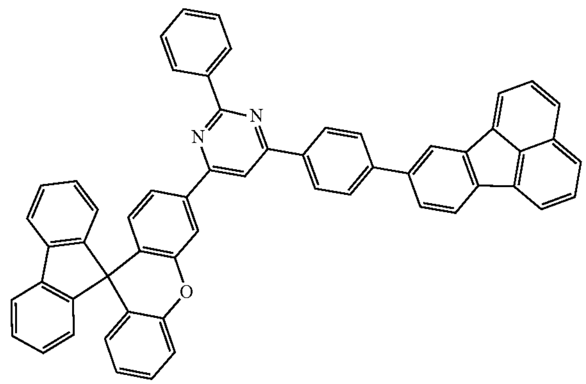
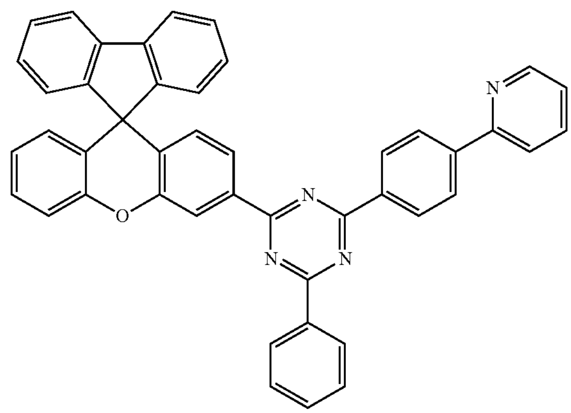
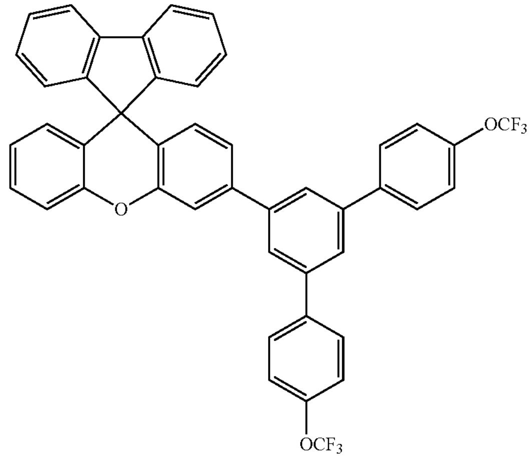

-continued
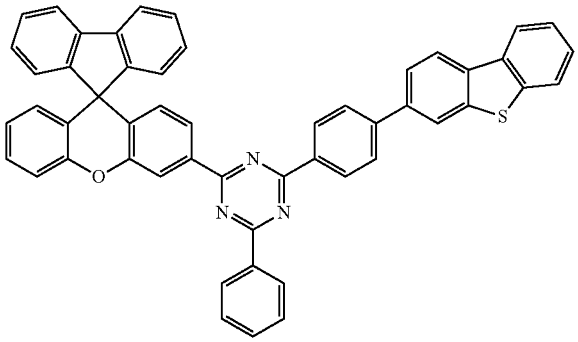
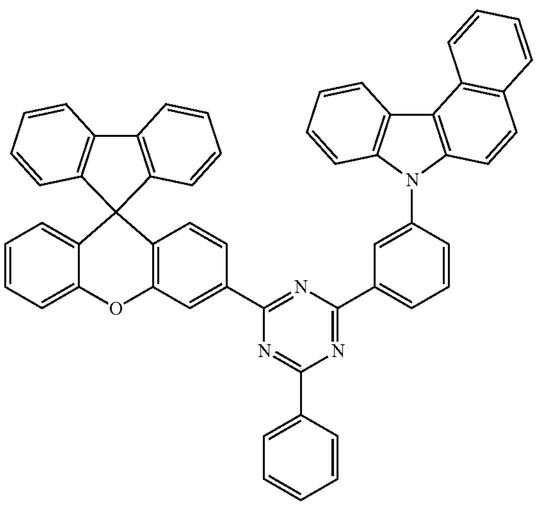
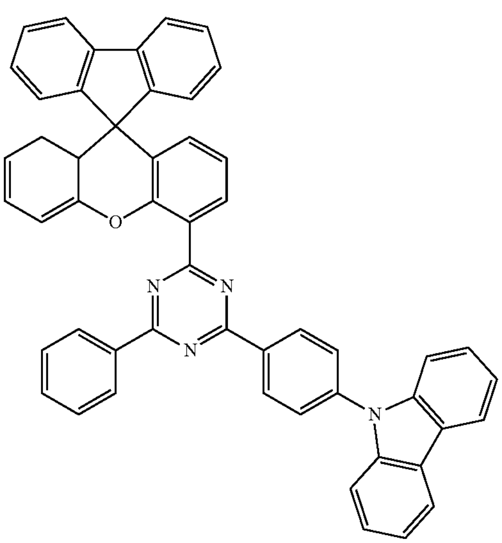
-continued
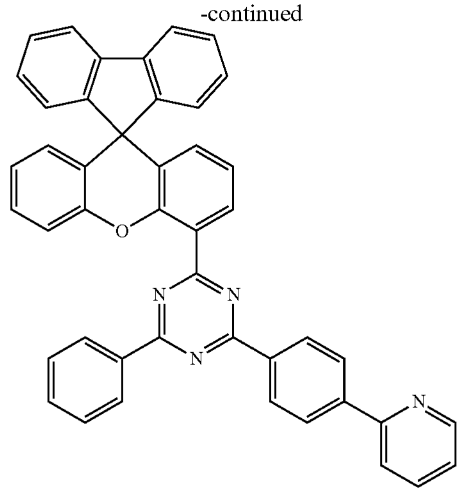
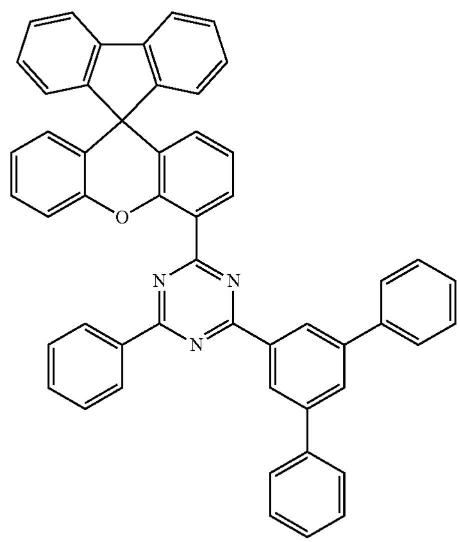
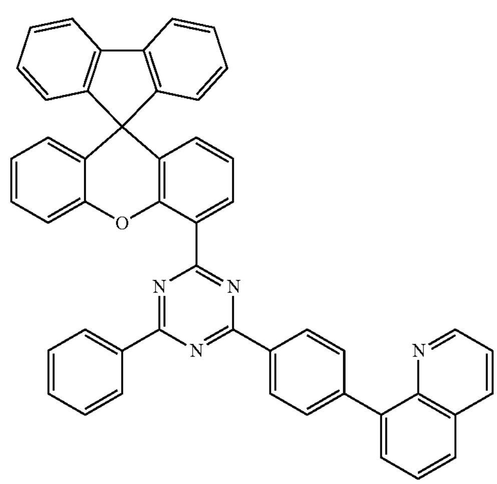

-continued
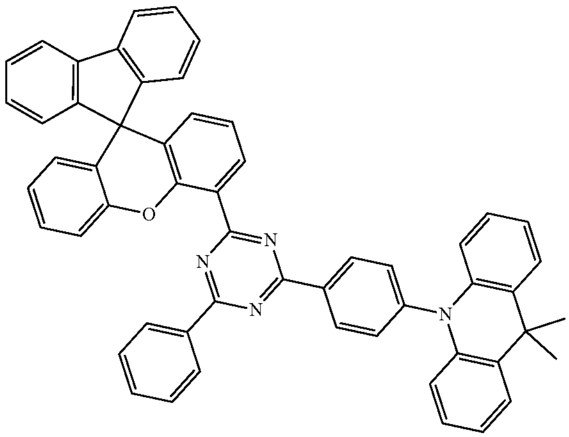
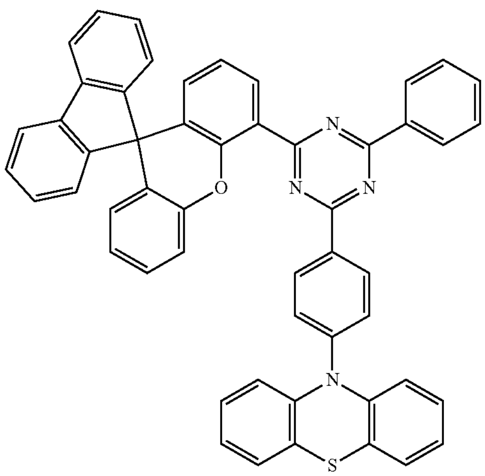
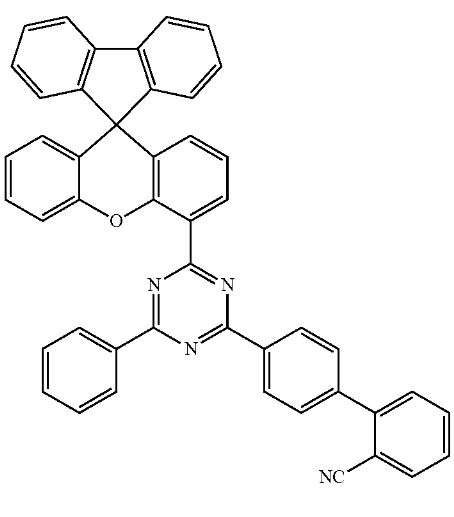
-continued
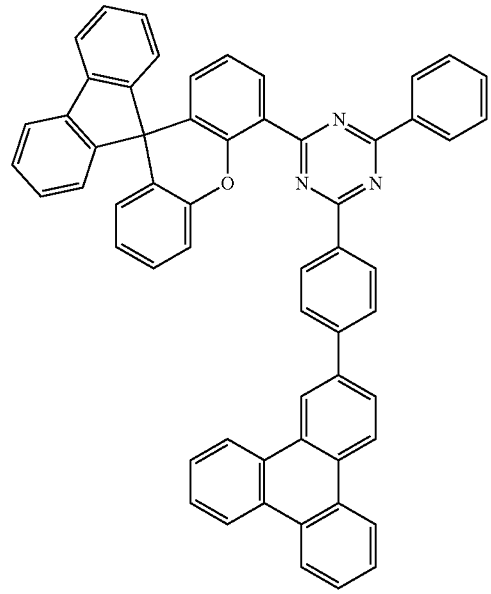
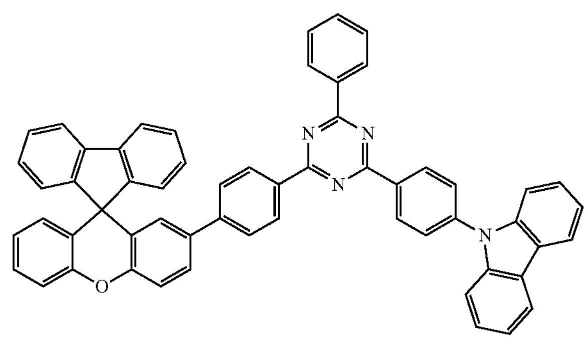
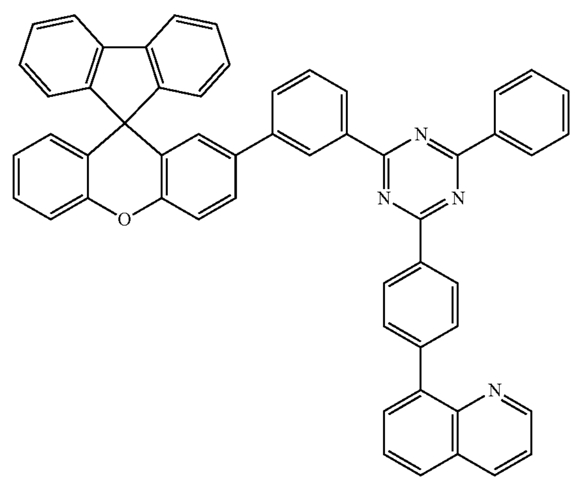

-continued
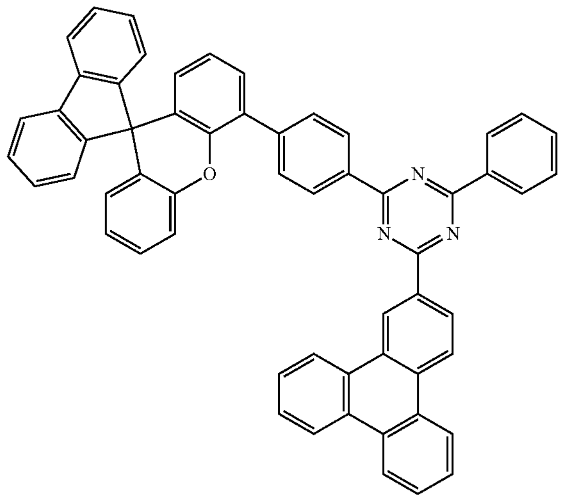
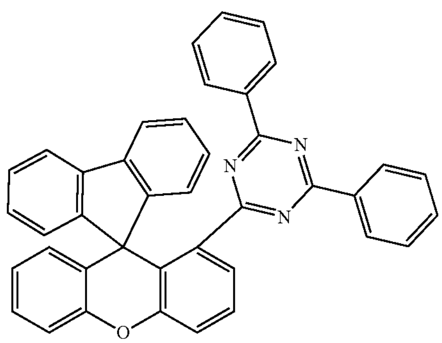
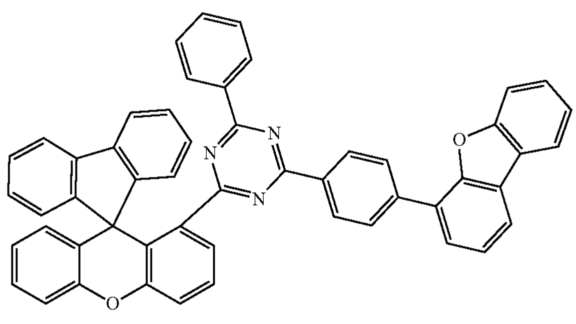
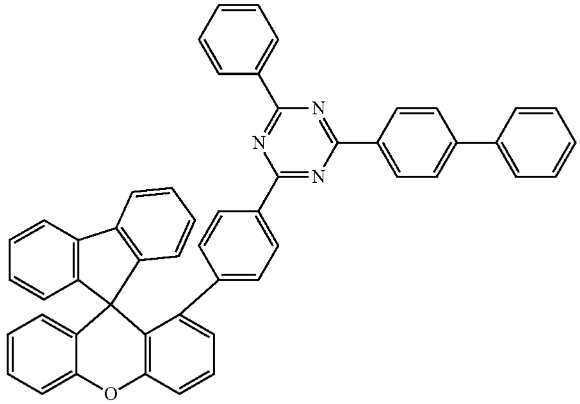
-continued
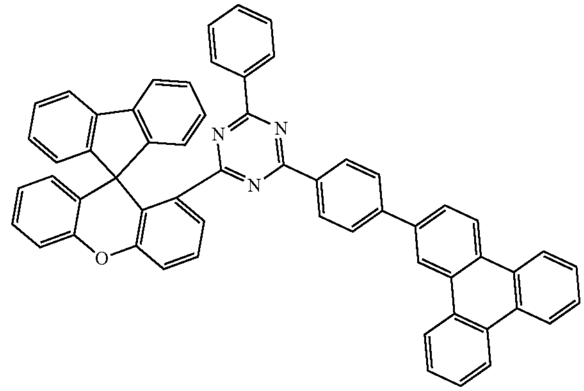
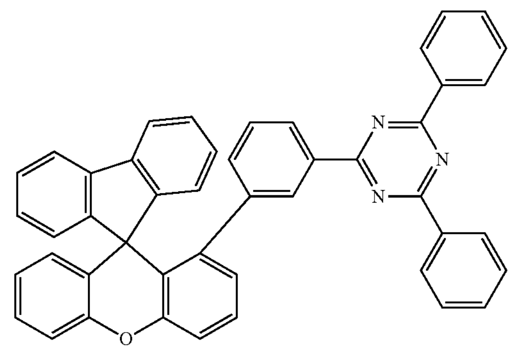
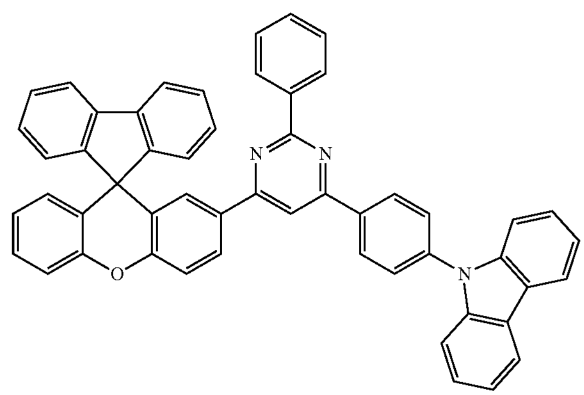
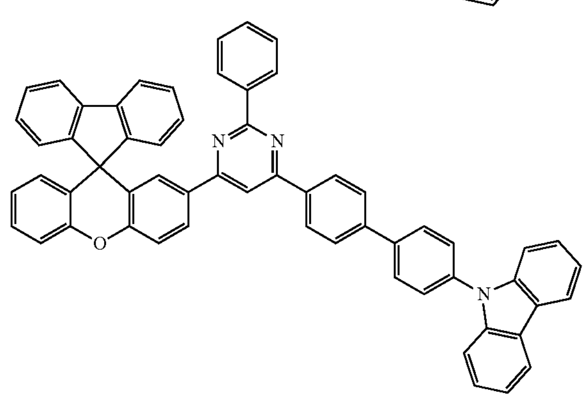

-continued
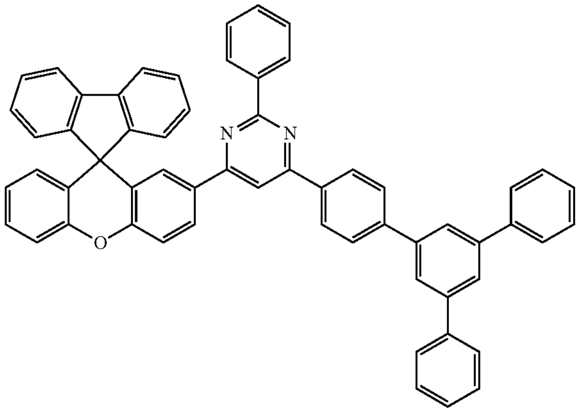
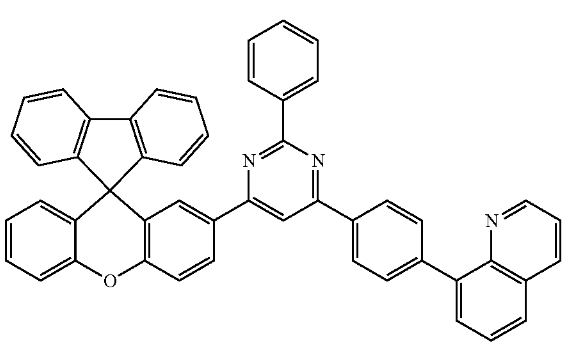
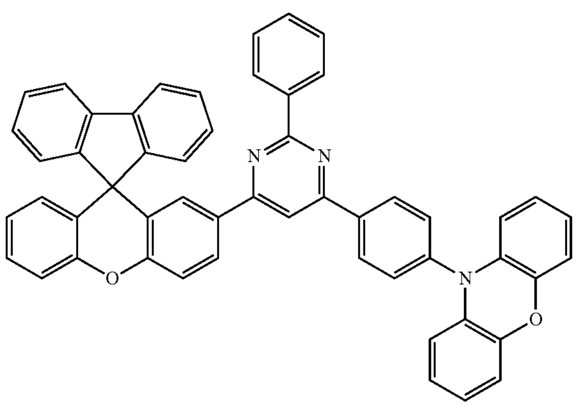
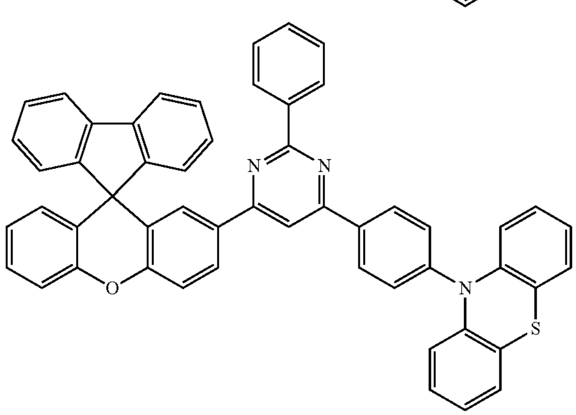
-continued
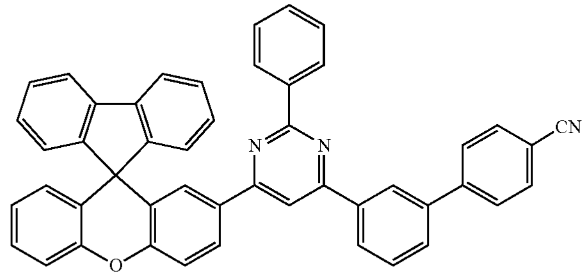
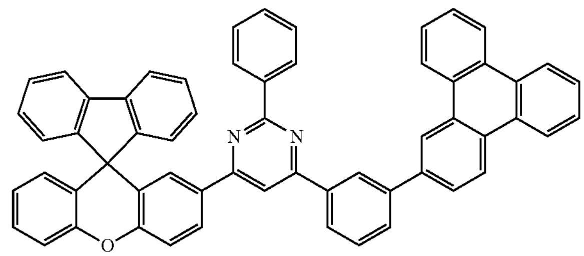
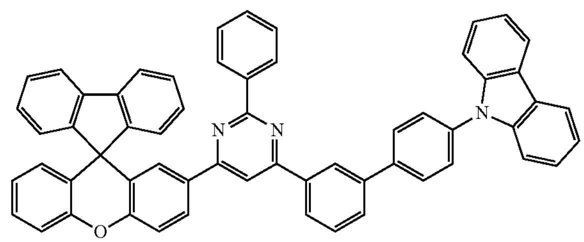
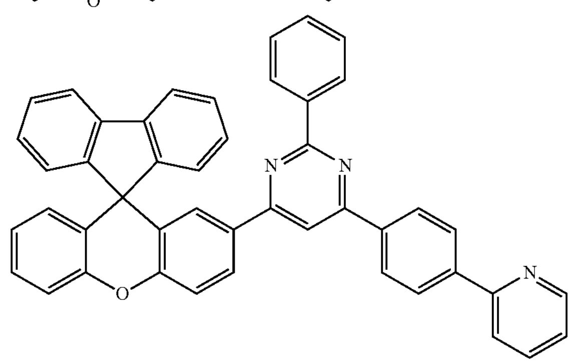
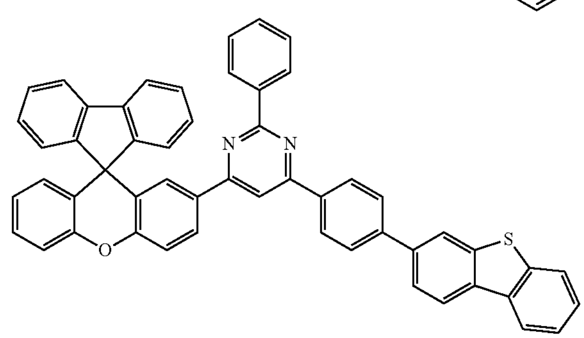
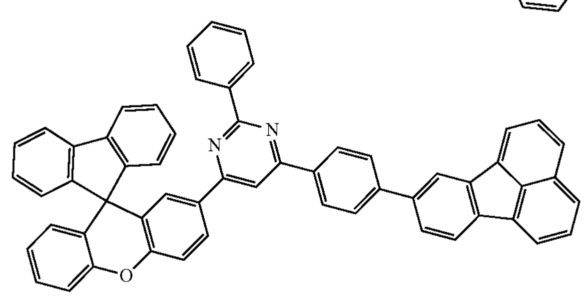

-continued
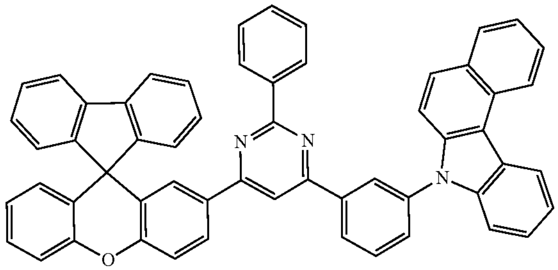
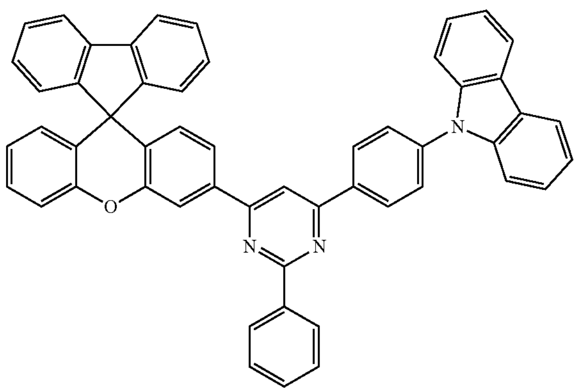
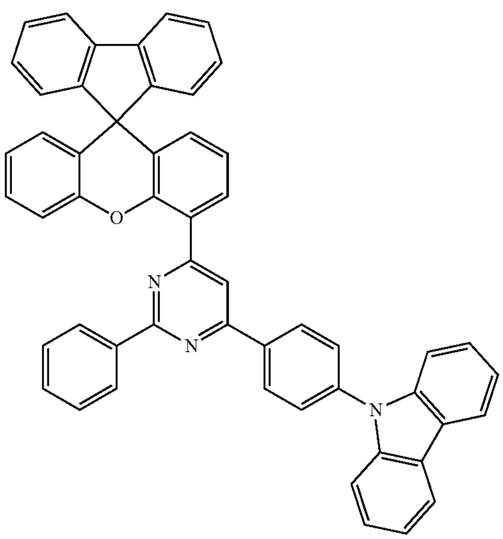
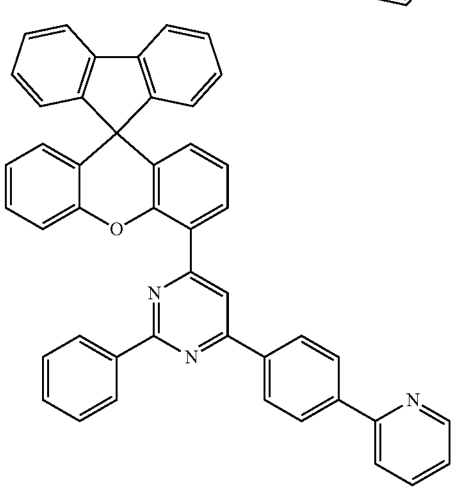
-continued
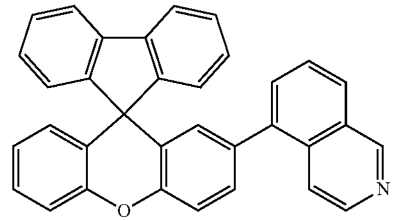
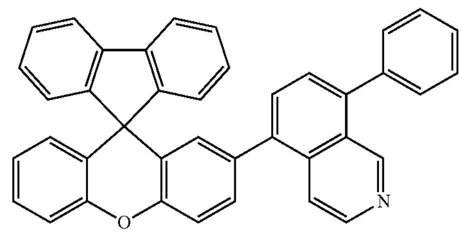
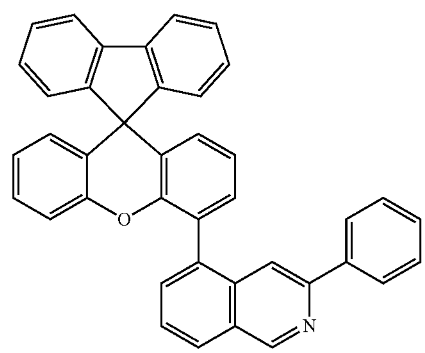
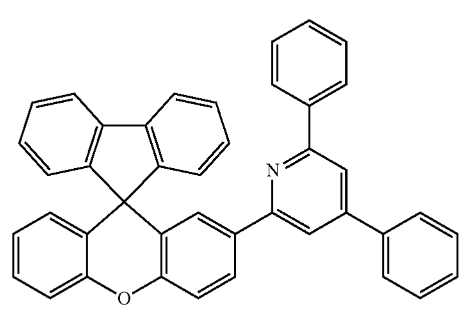

-continued
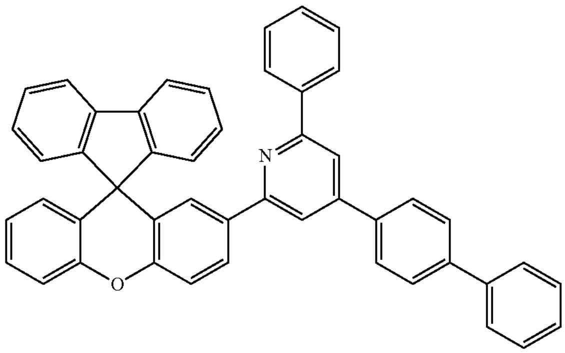
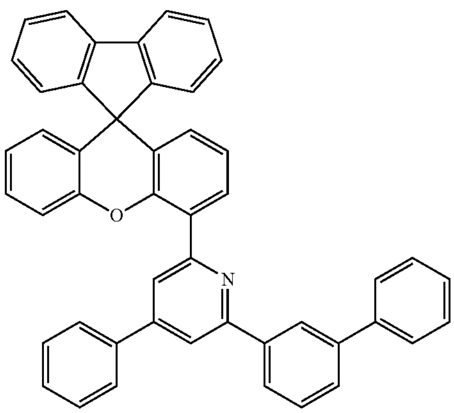
-continued
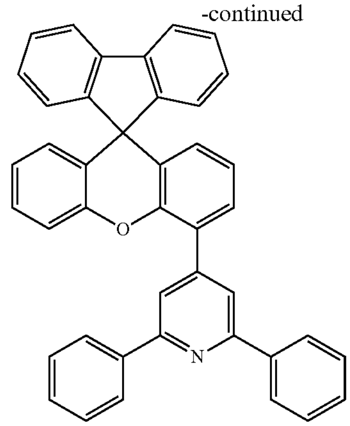
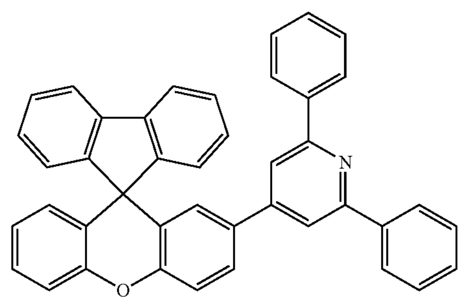
.
12. The organic light emitting device of claim 1, wherein Chemical Formula 3 is any one compound selected from among the following compounds:
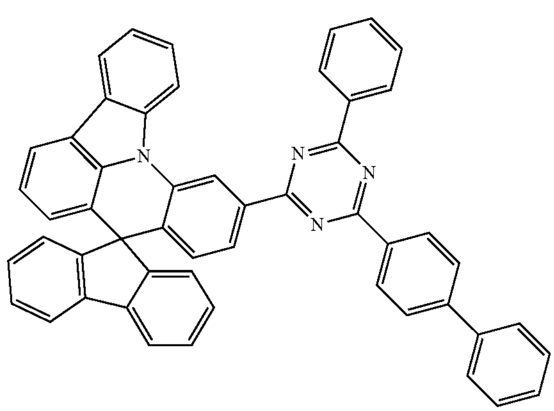
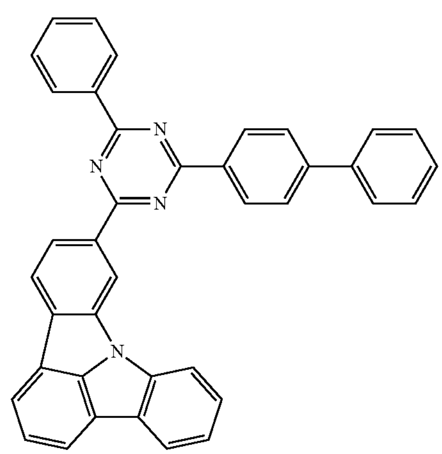

-continued
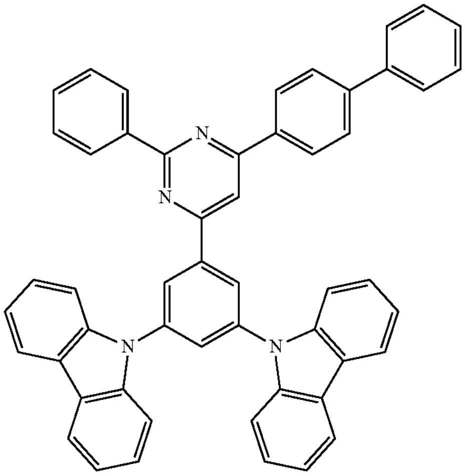
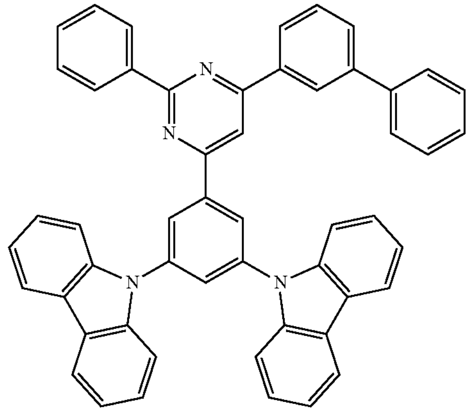
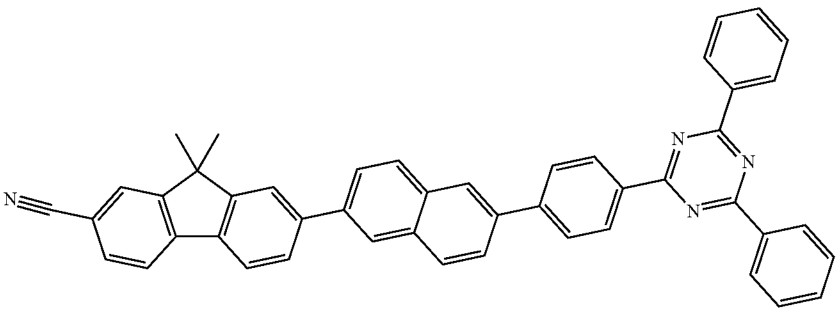
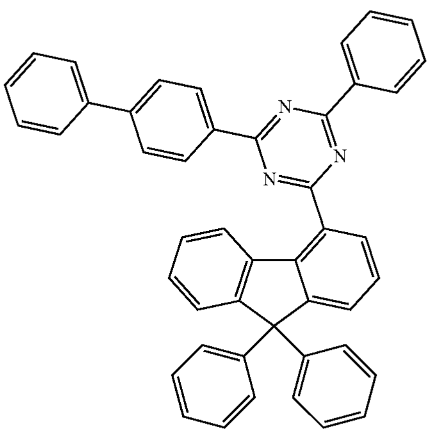
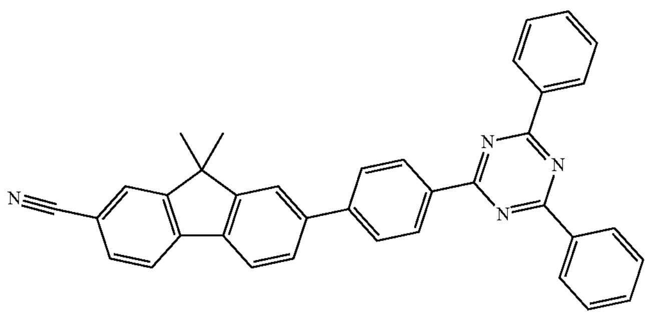
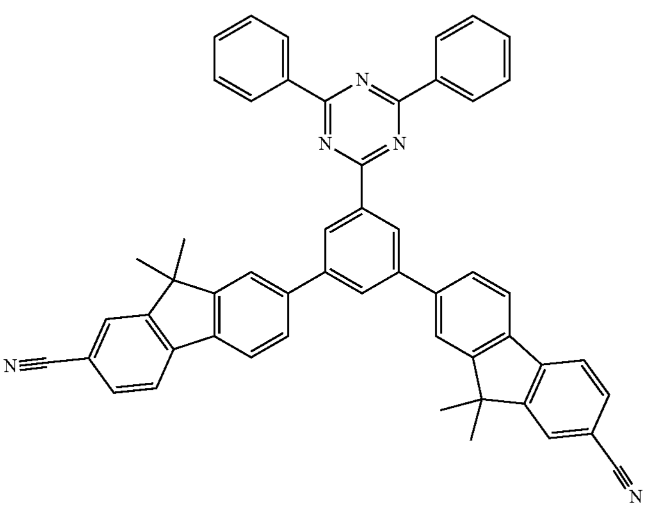

-continued
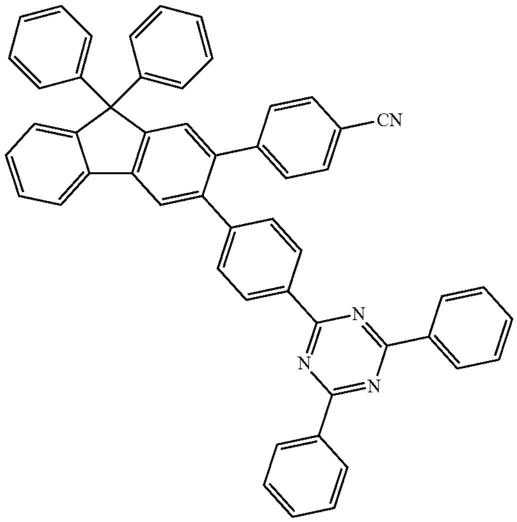
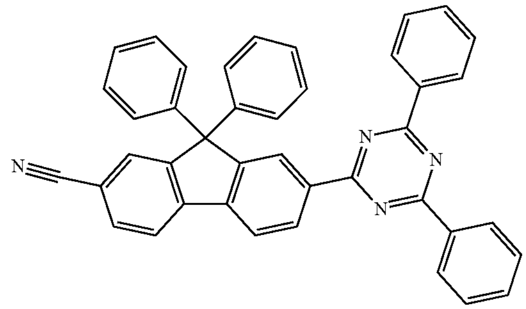
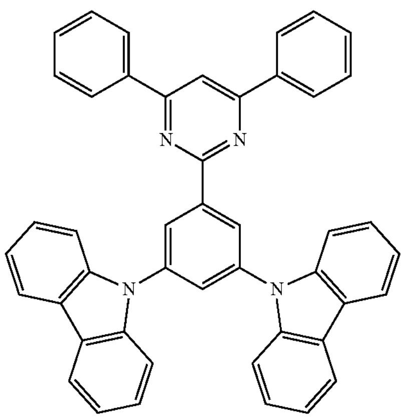
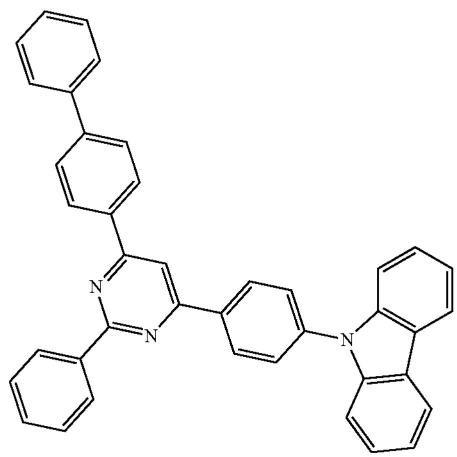
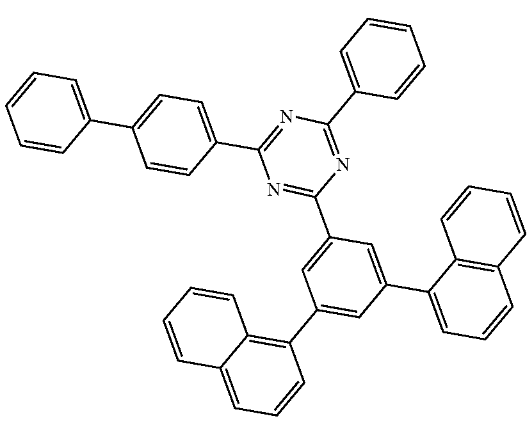

-continued
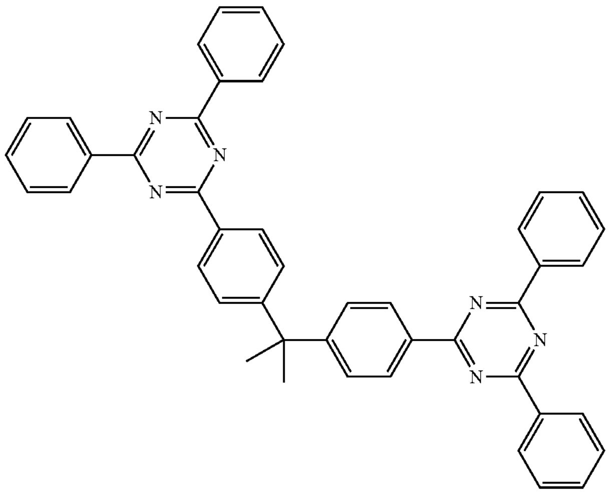
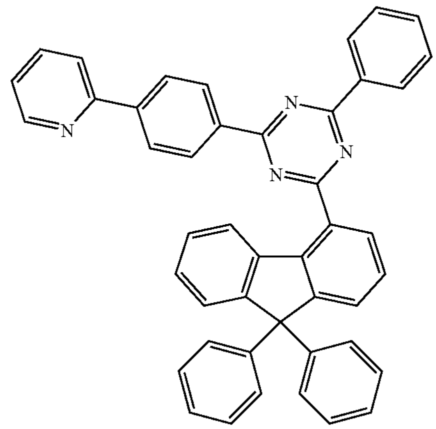
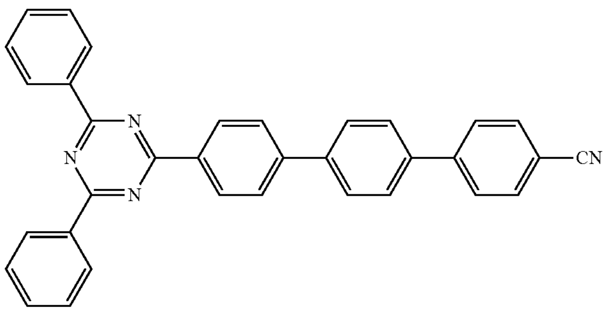
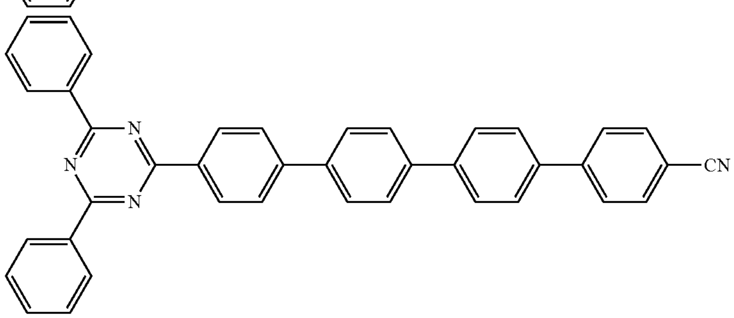
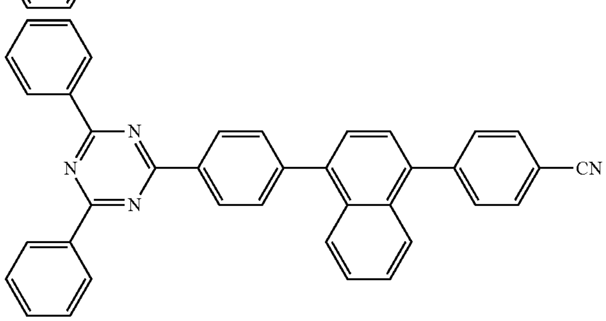
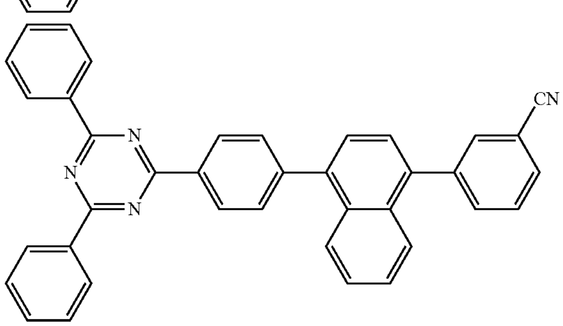
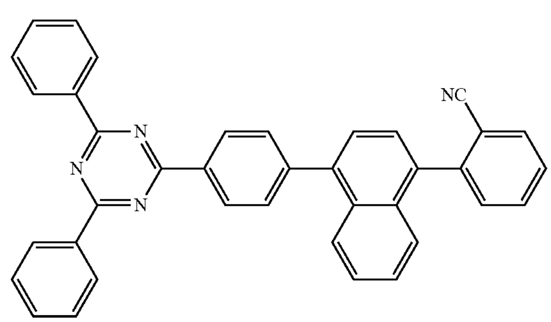

-continued
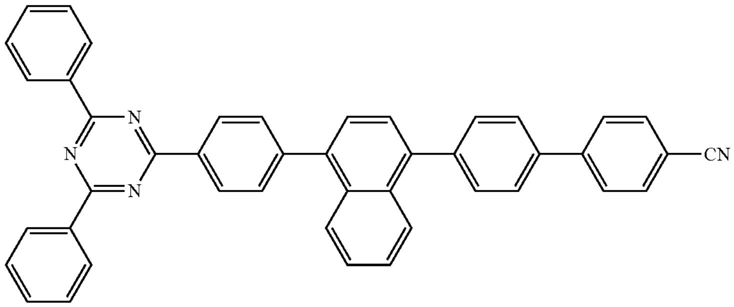
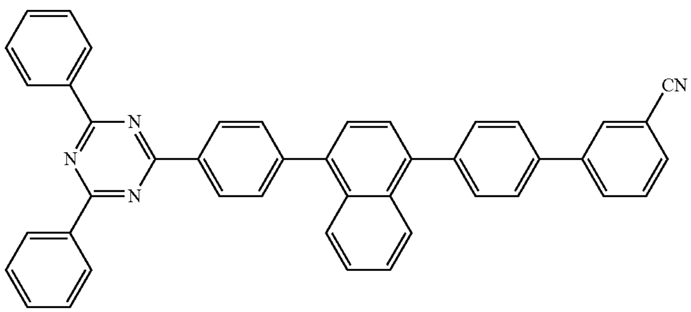
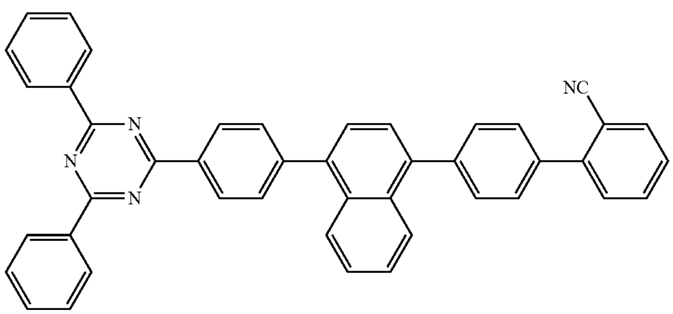
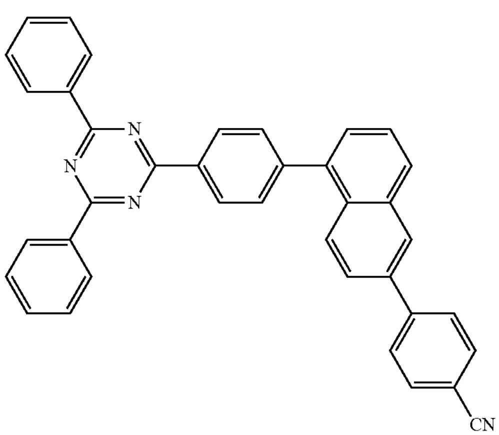
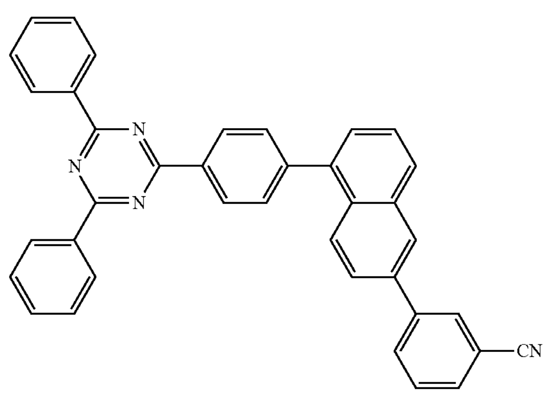

-continued
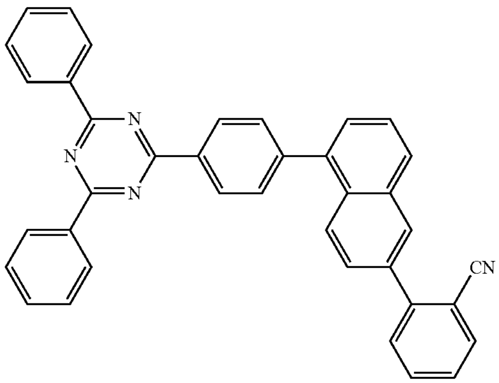
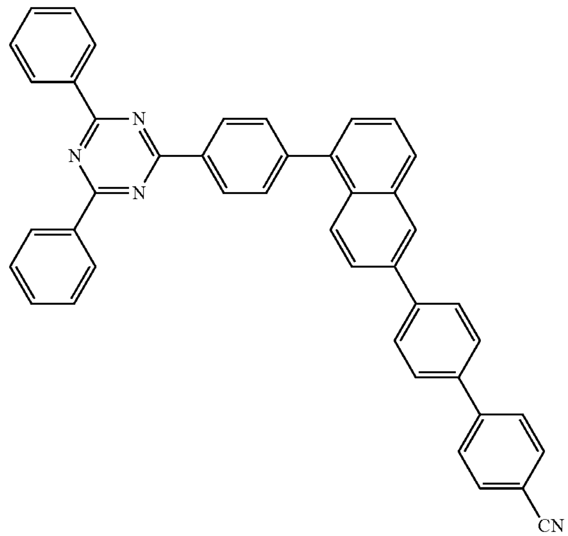
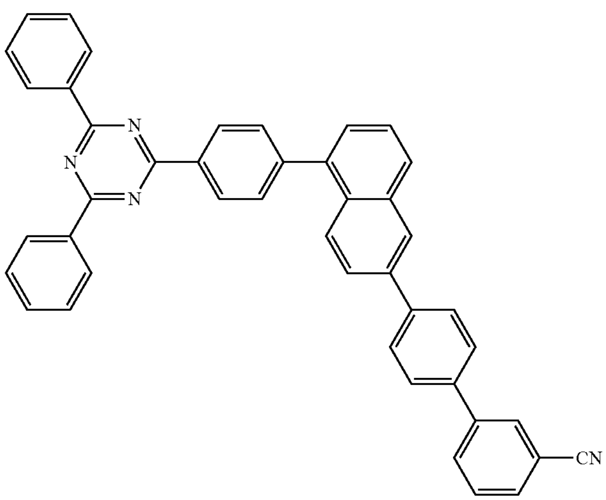
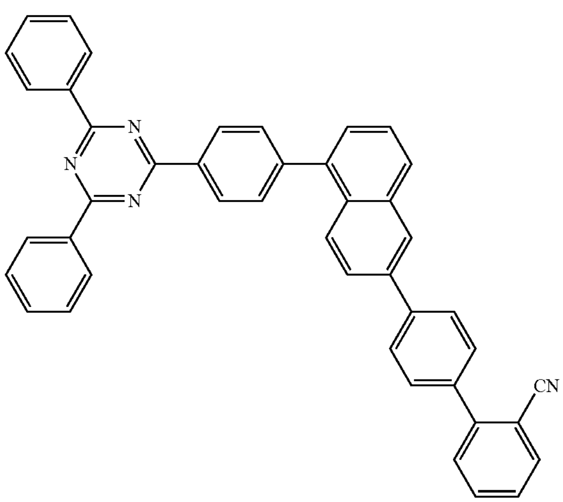

-continued
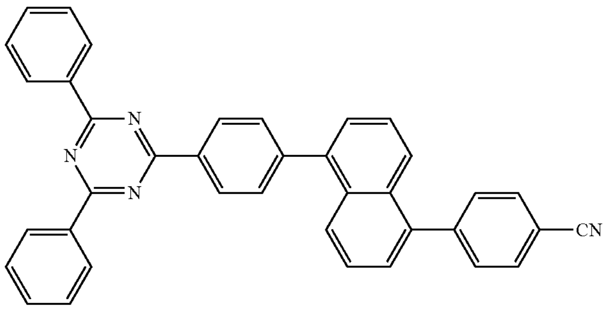
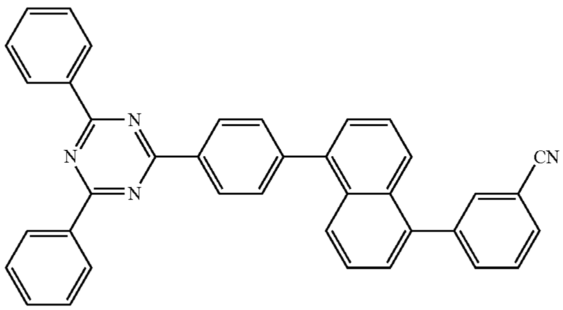
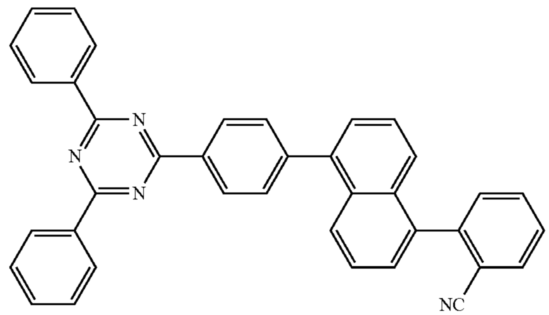
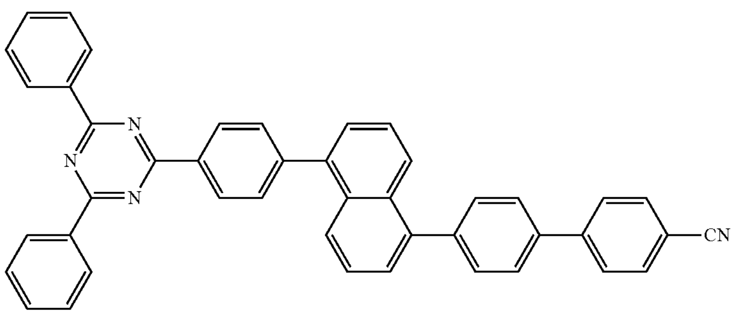
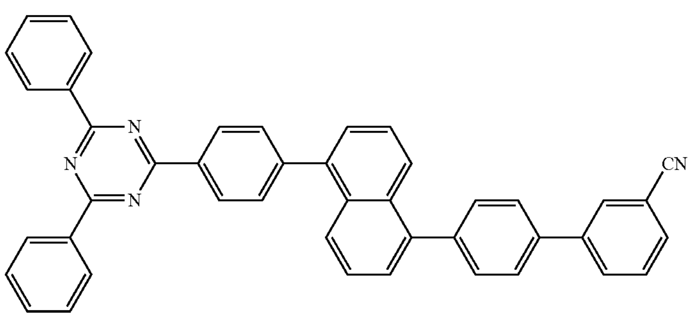
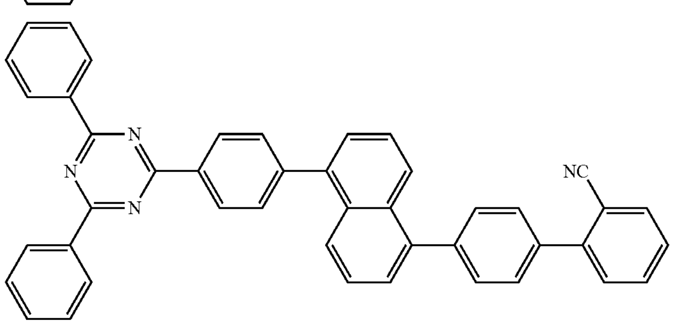
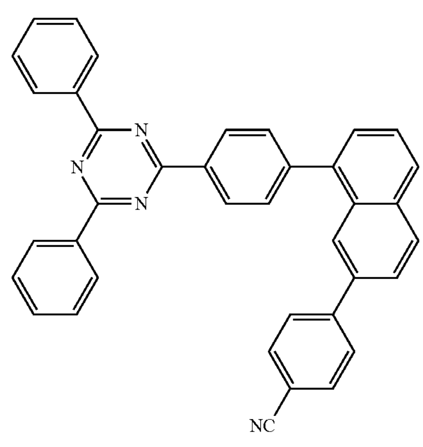

-continued
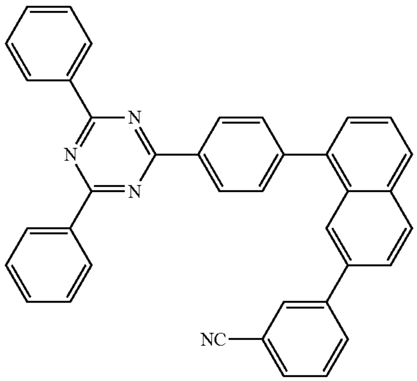
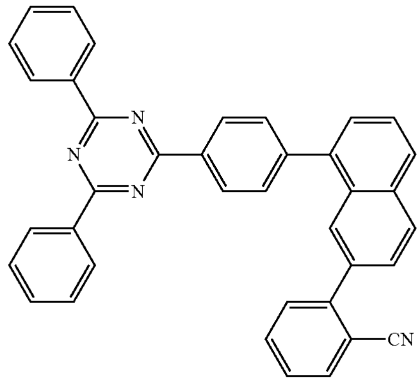
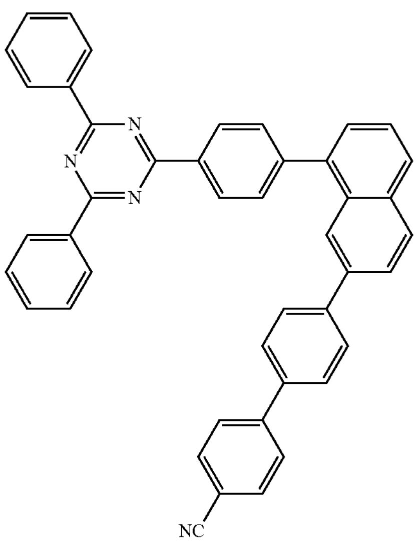
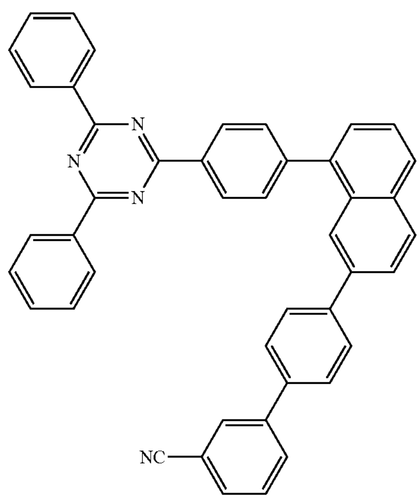
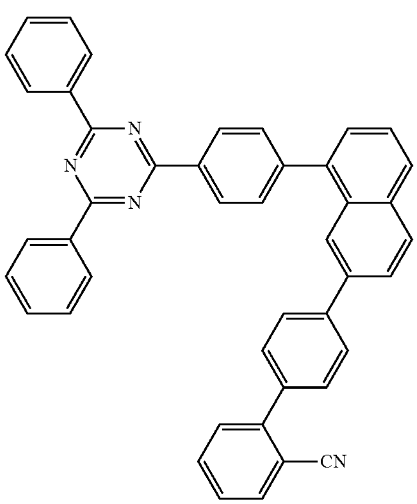
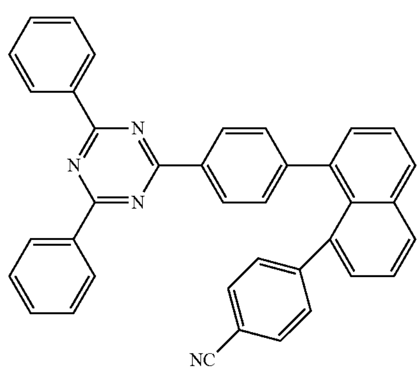

-continued
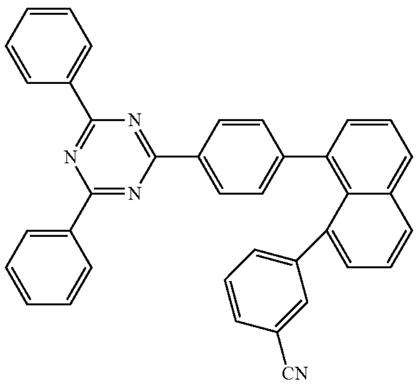
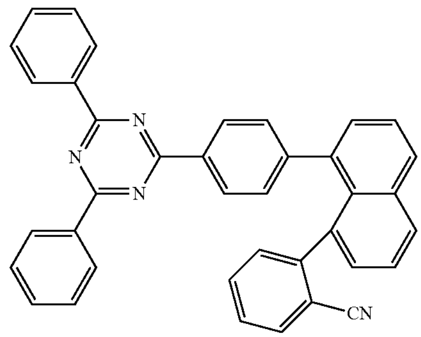
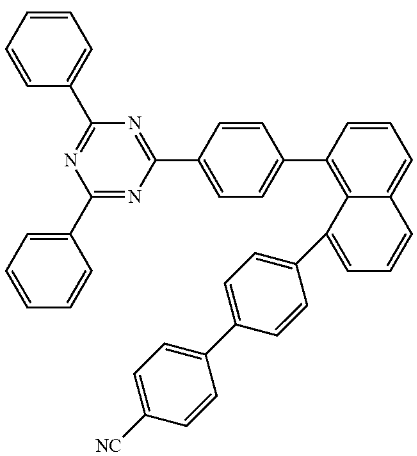
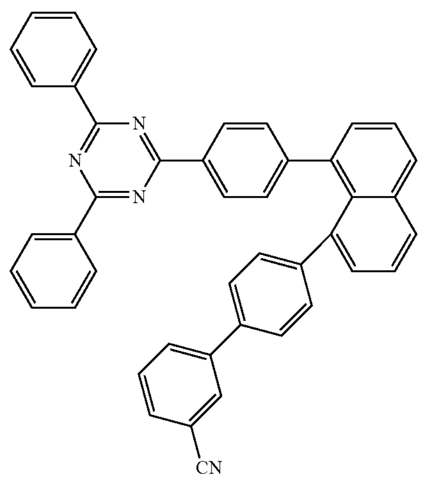
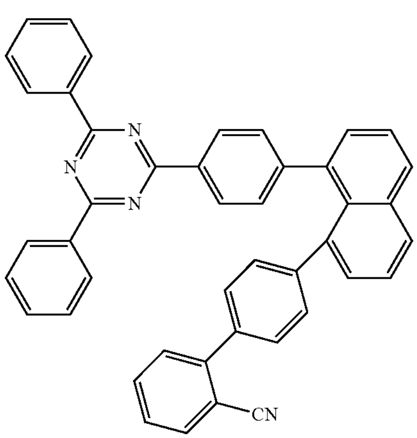
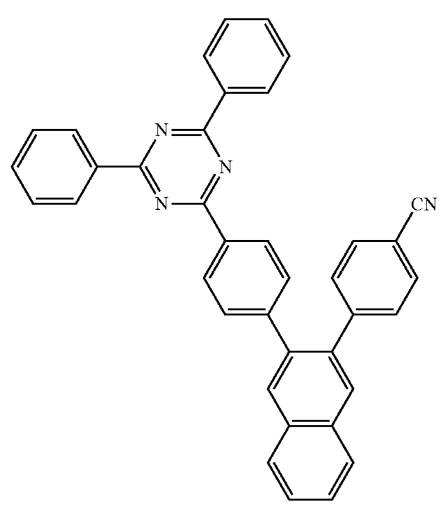

-continued
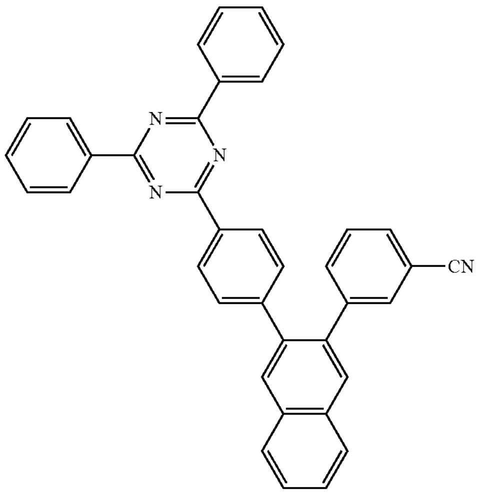
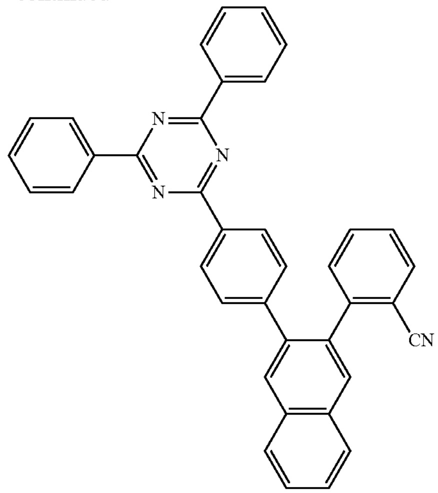
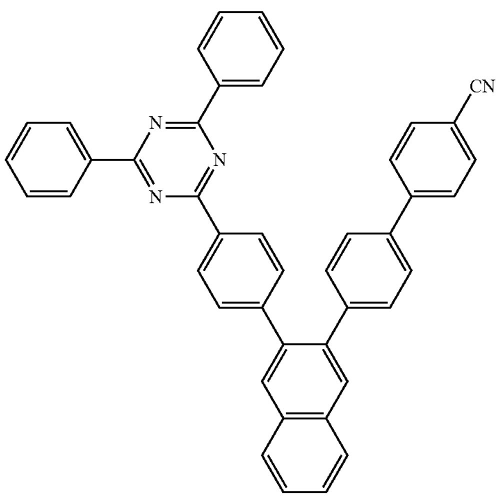
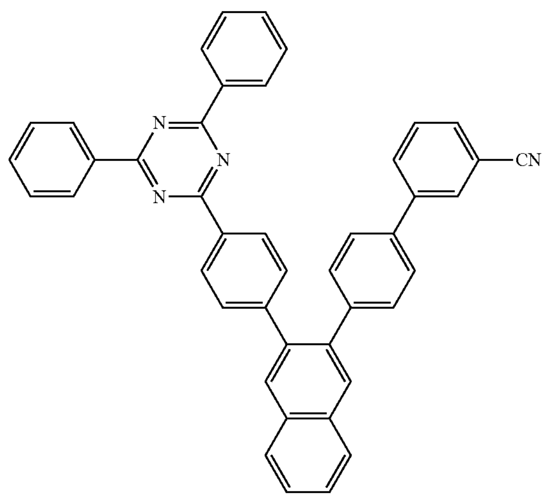
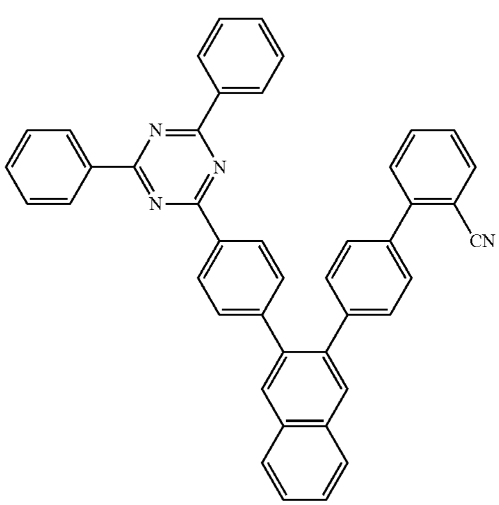
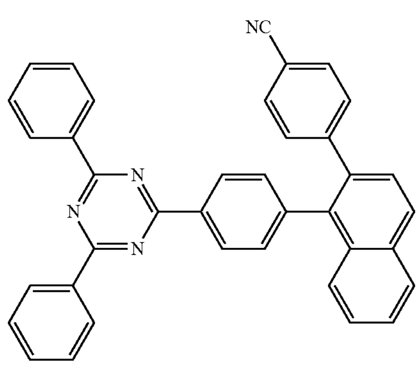

-continued
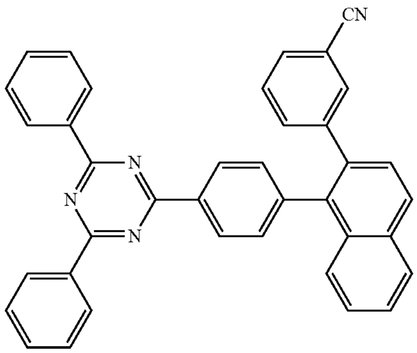
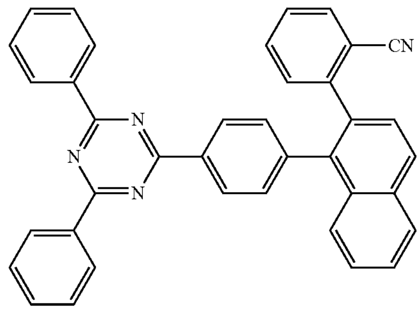
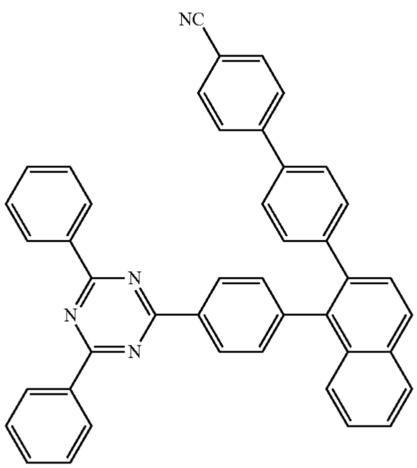
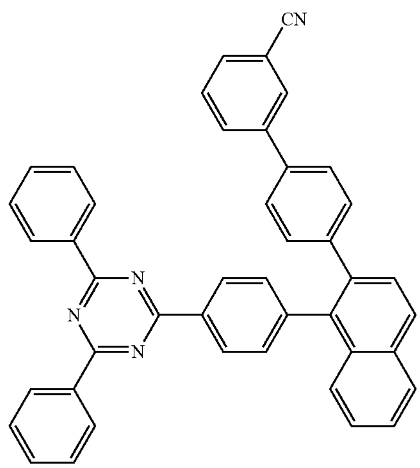
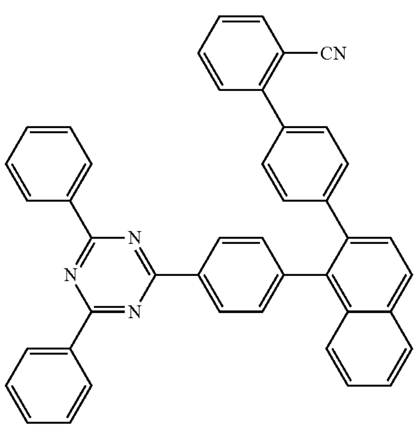
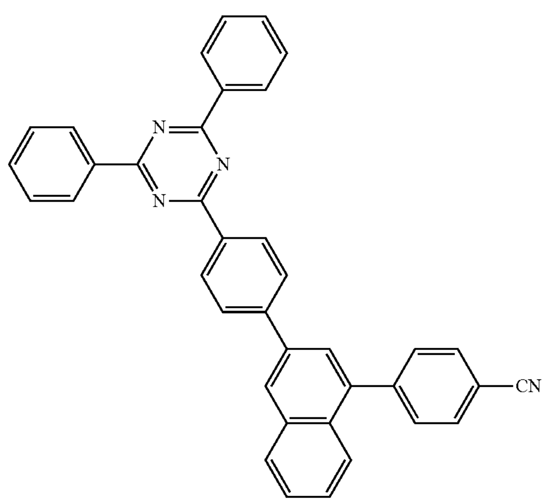

-continued
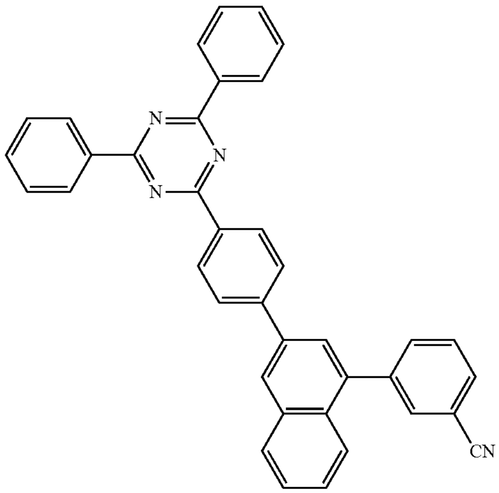
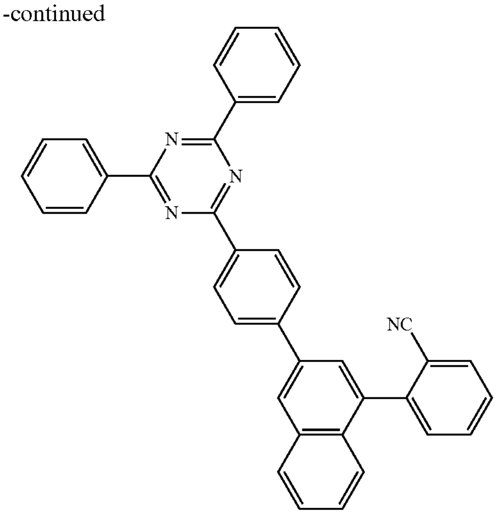
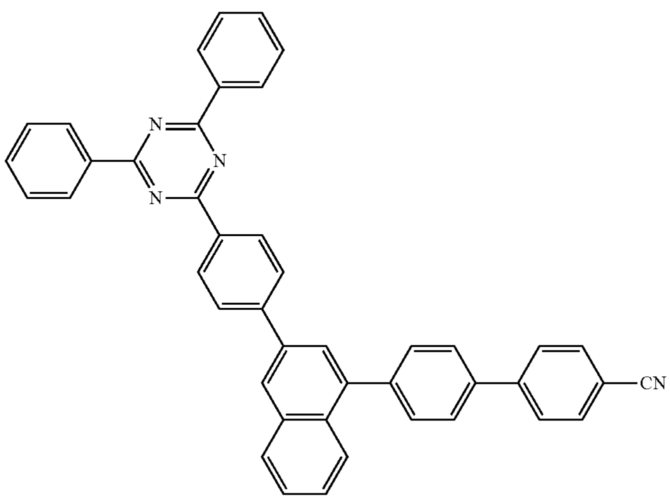
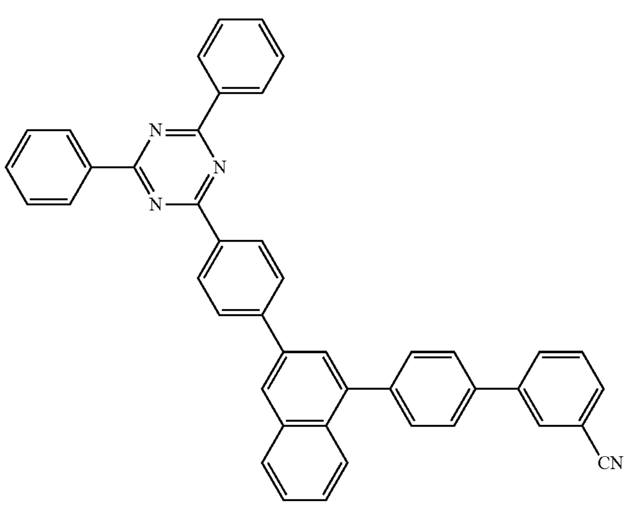

-continued
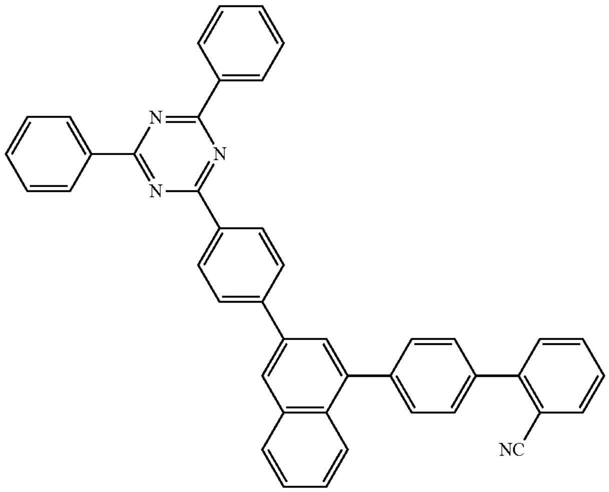
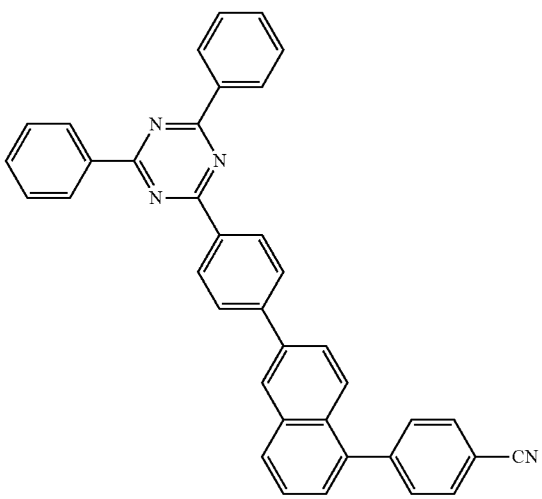
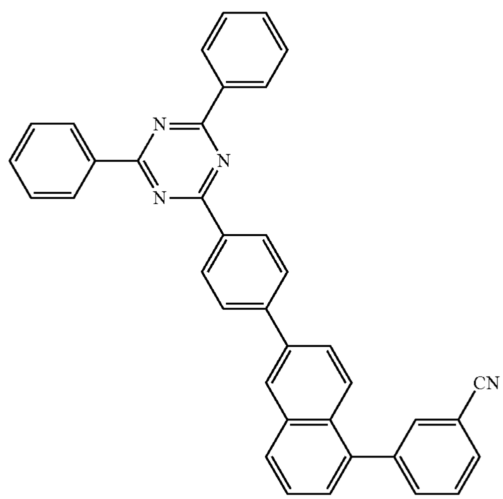
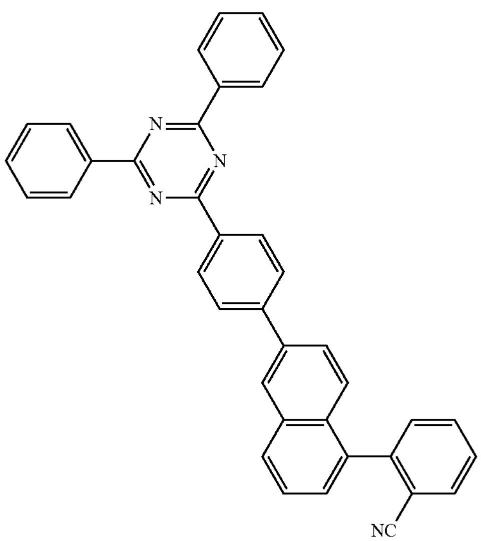

-continued
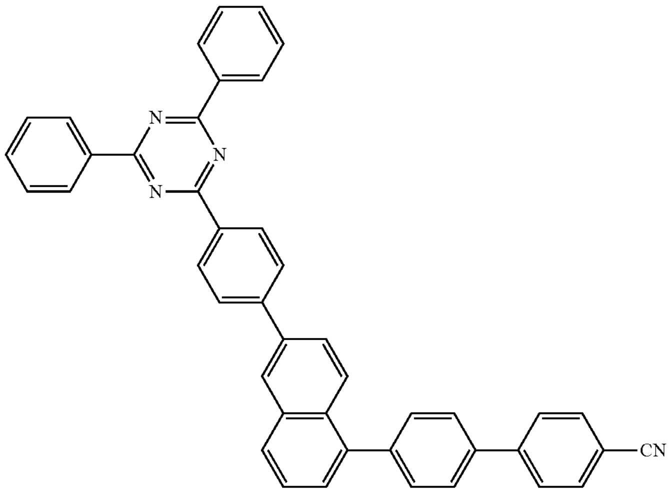
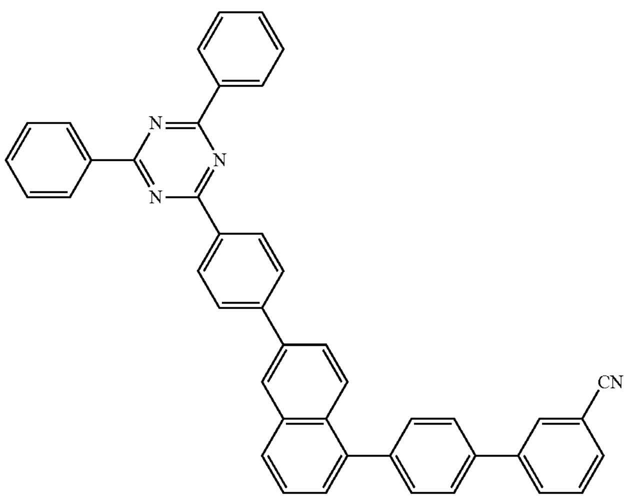
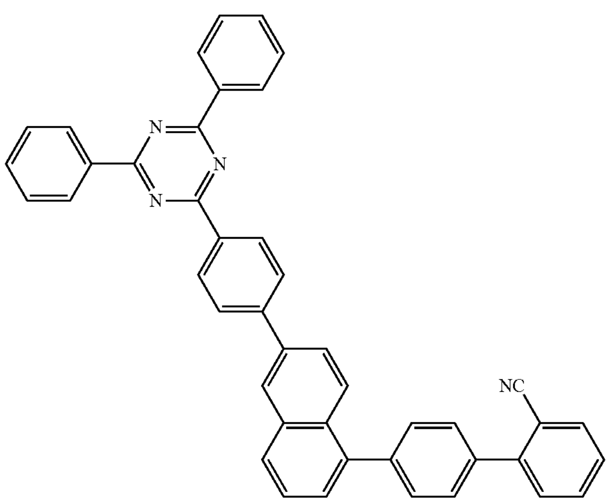

-continued
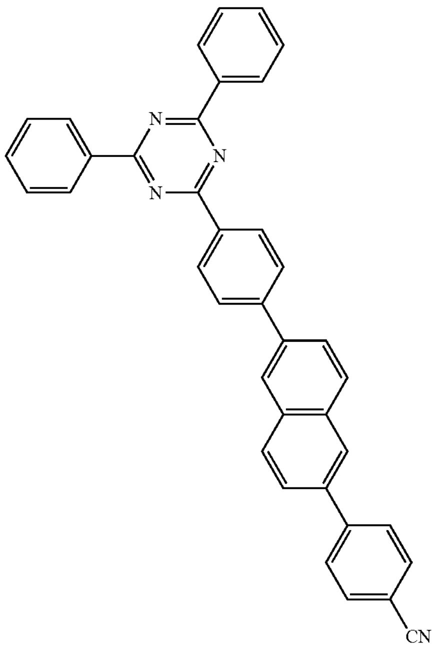
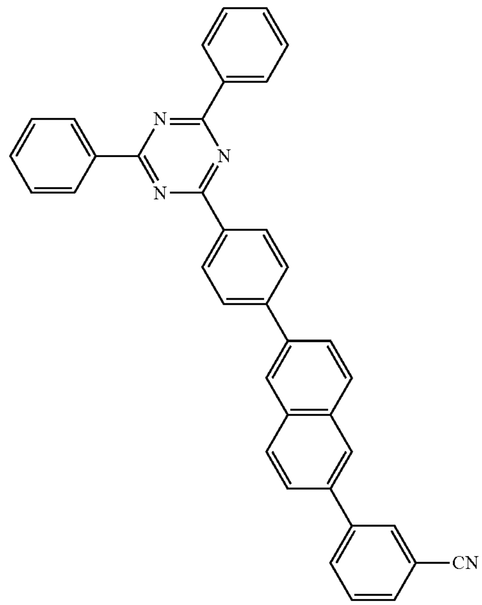
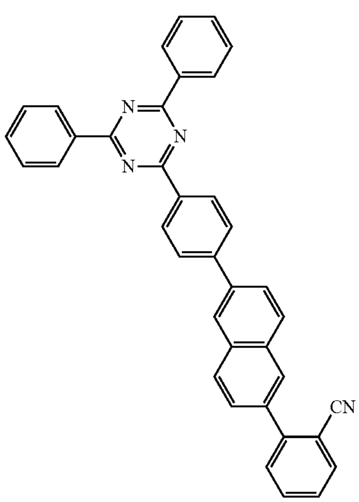
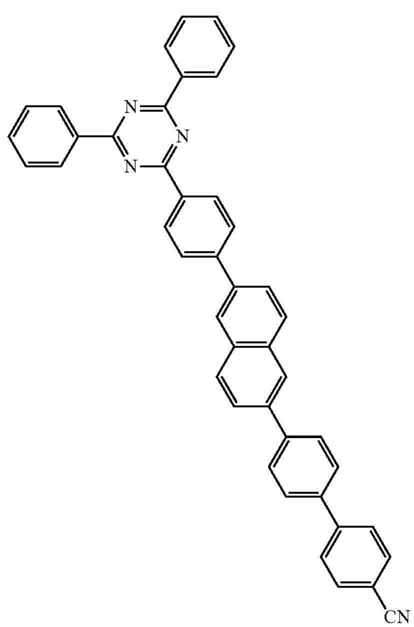

-continued
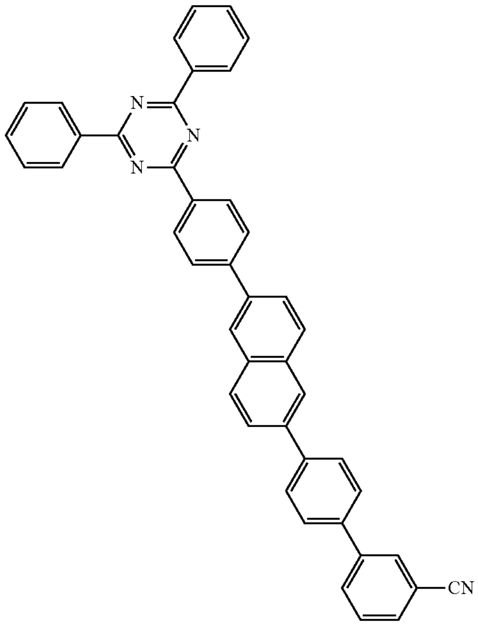
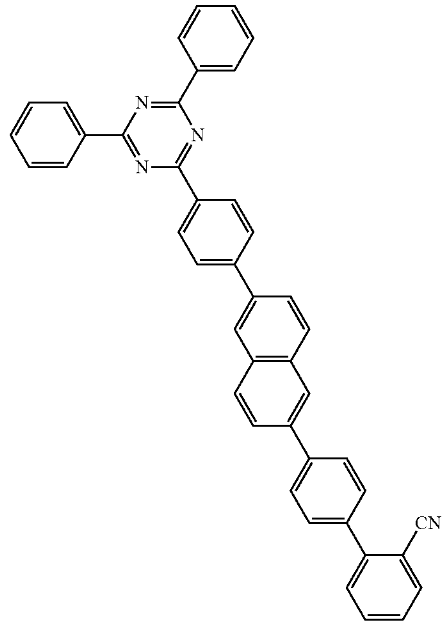
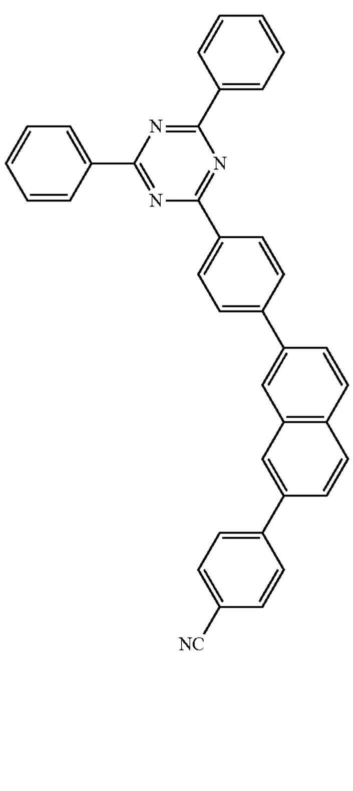
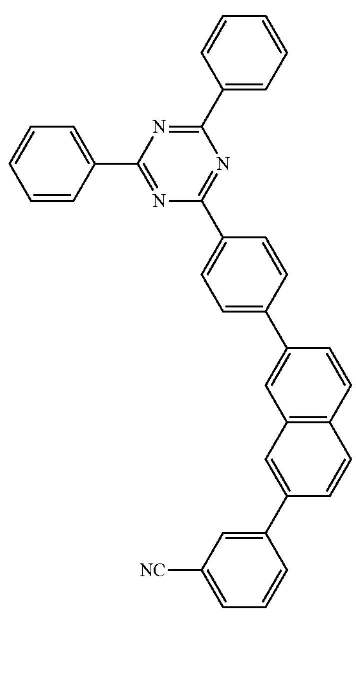
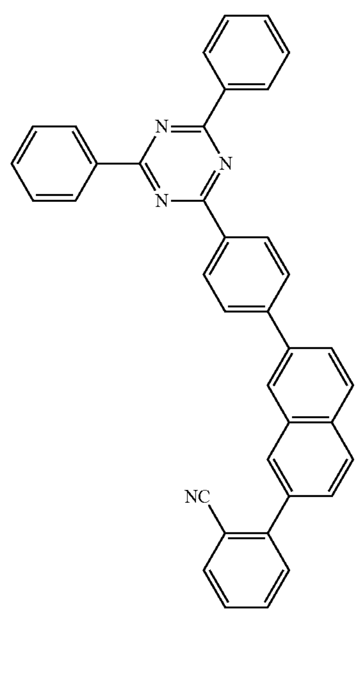

-continued
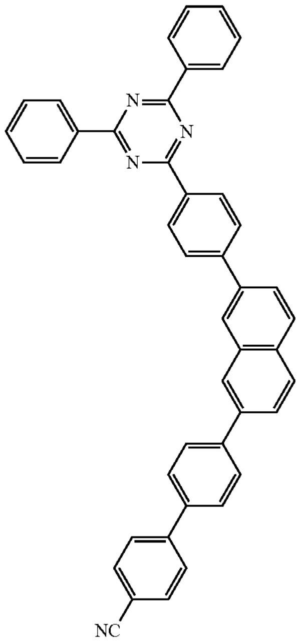
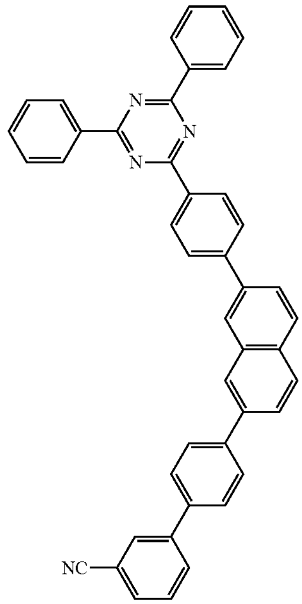
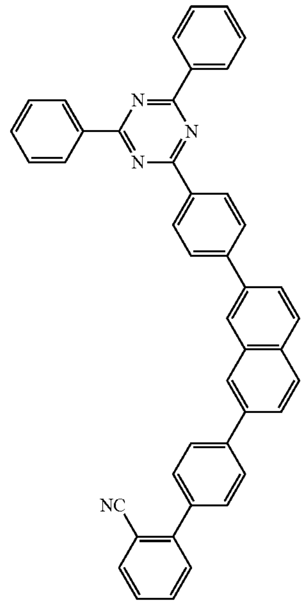
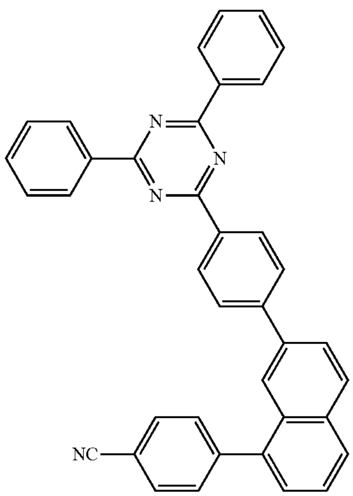
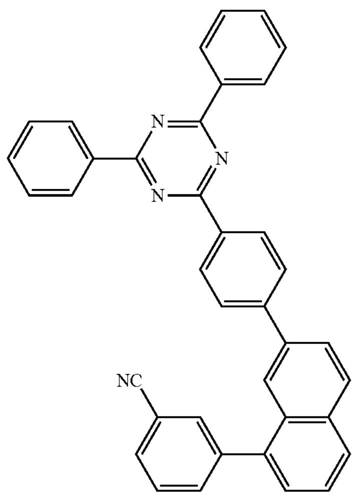
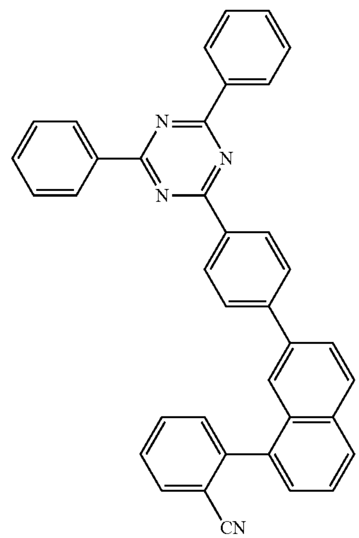
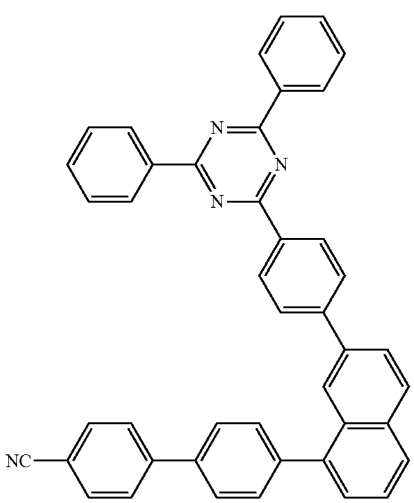
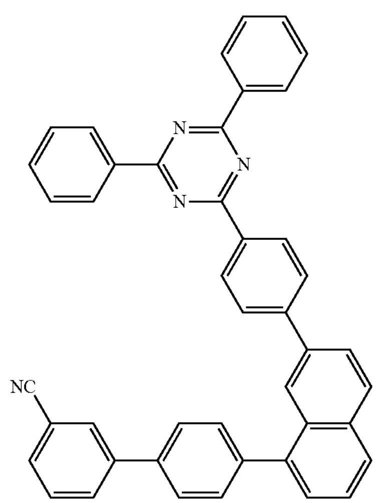

-continued
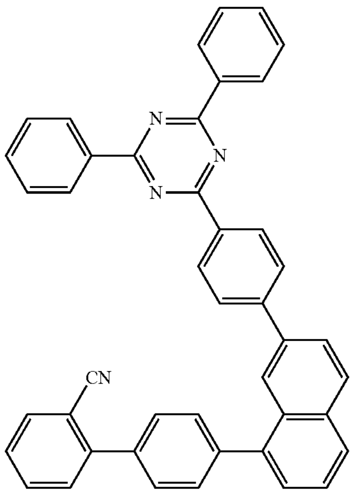
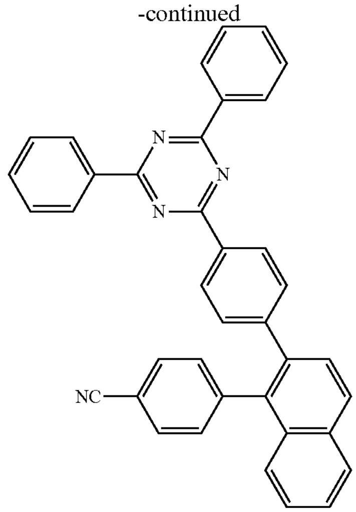
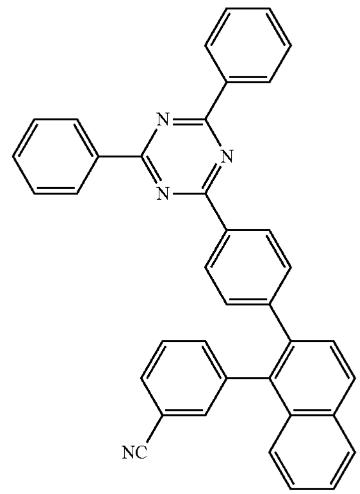
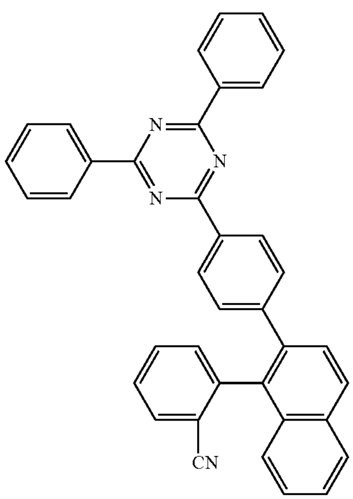
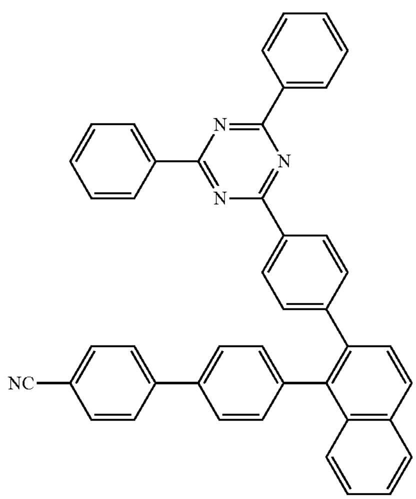
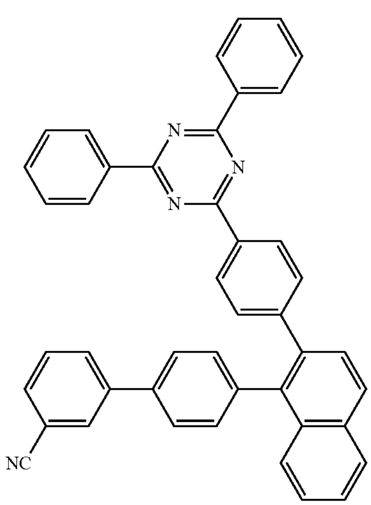
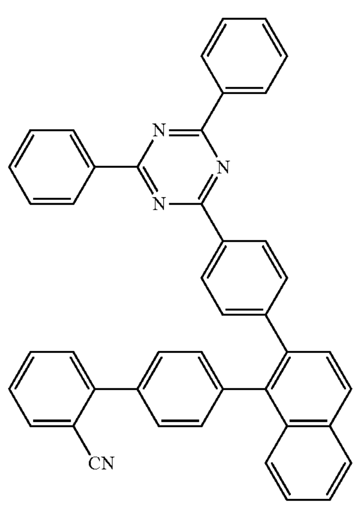

-continued
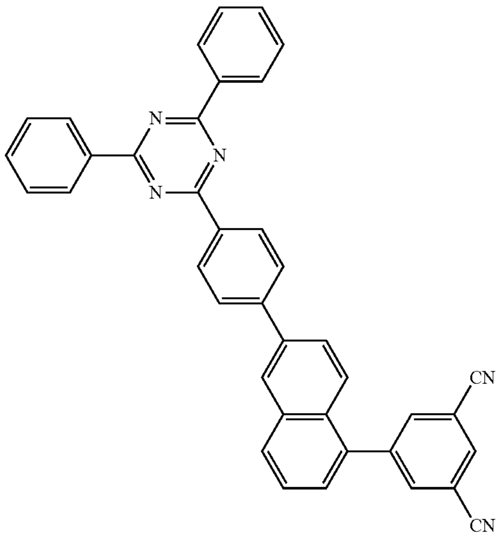
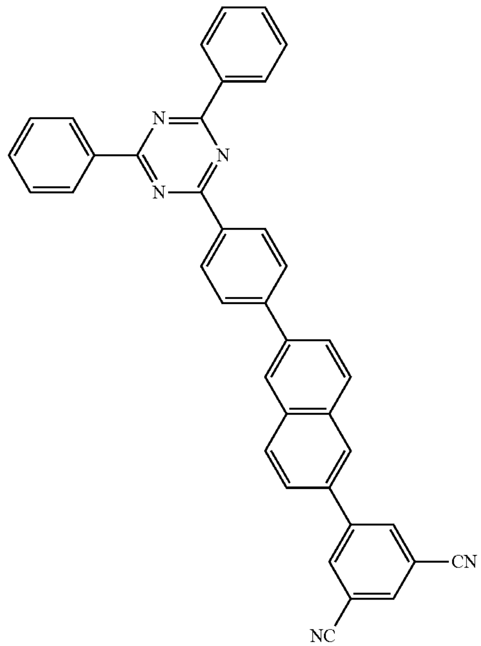
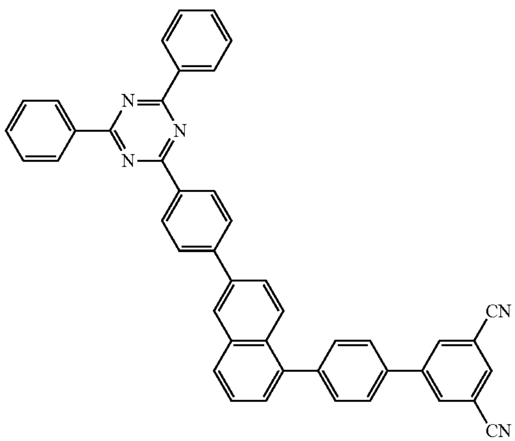
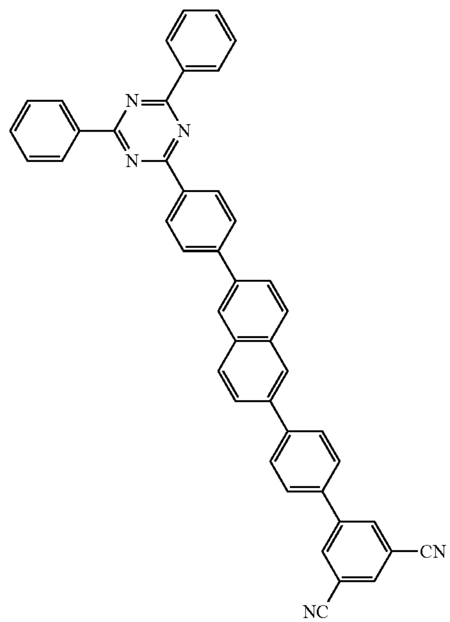
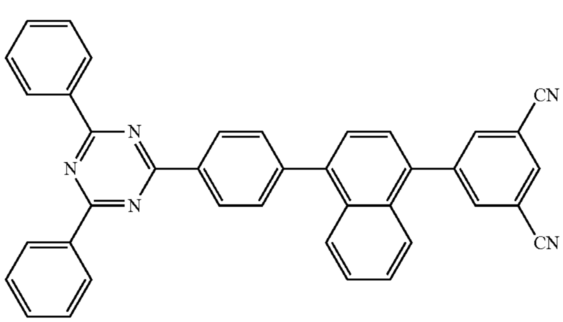
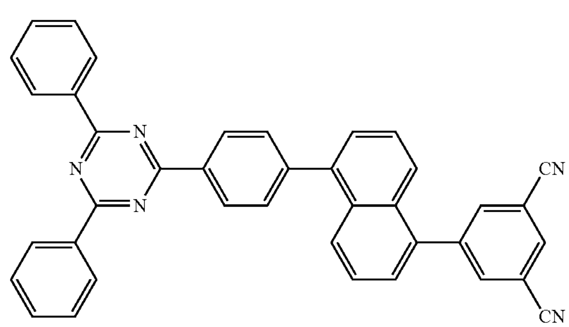

-continued
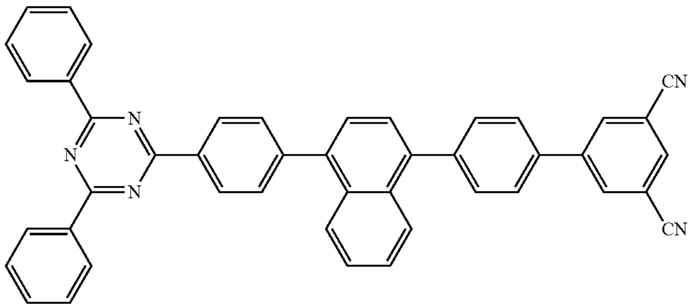
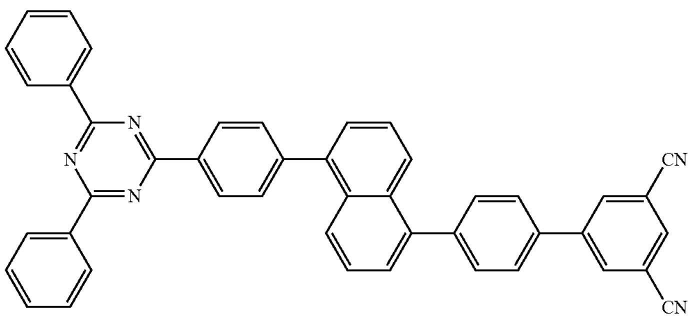
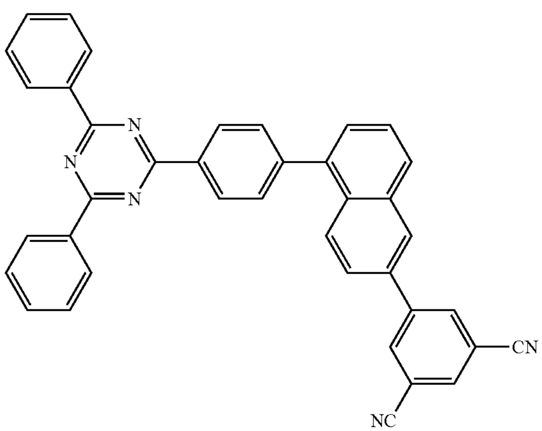
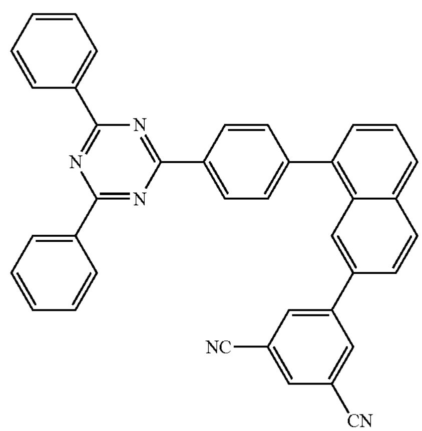
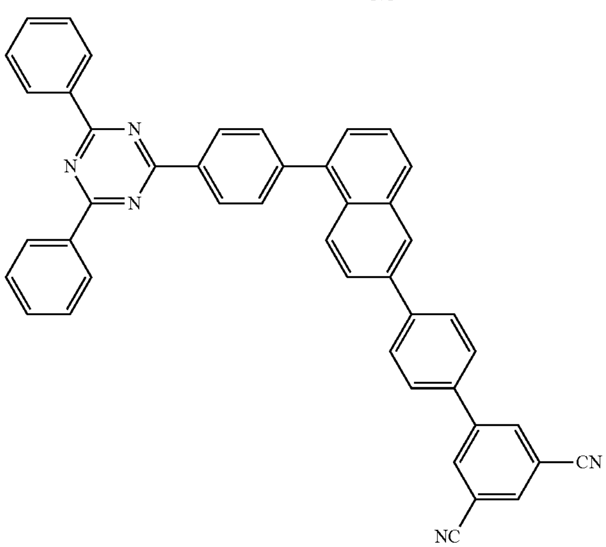
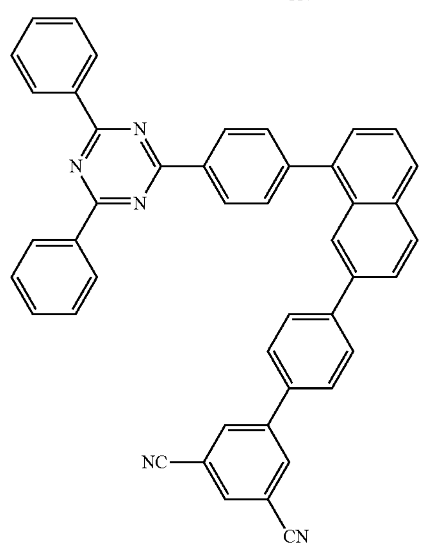

-continued
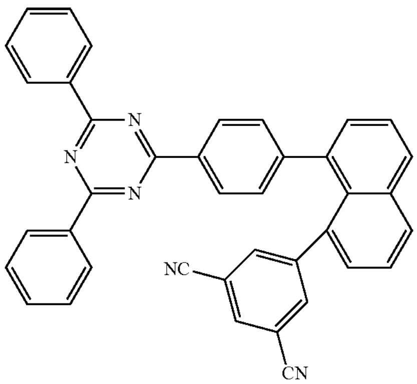
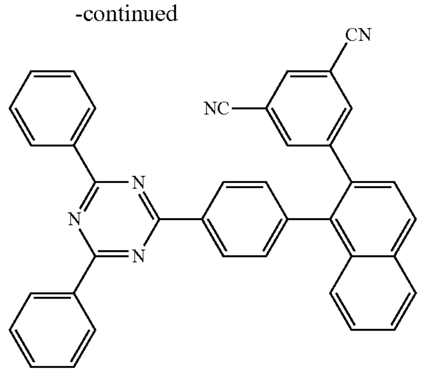
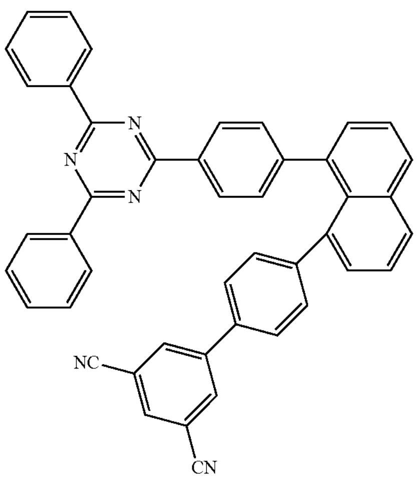
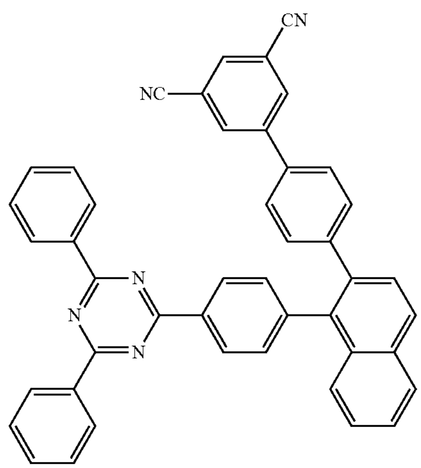
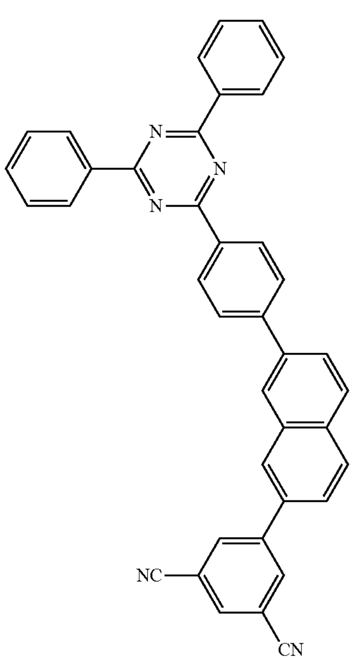
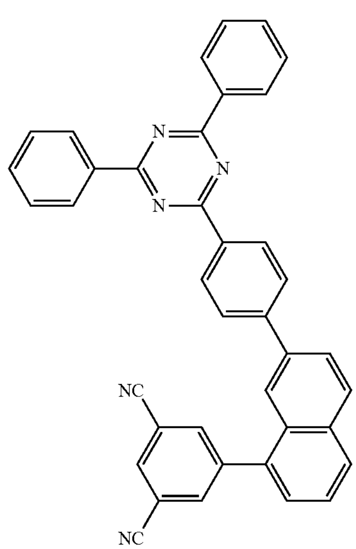

-continued
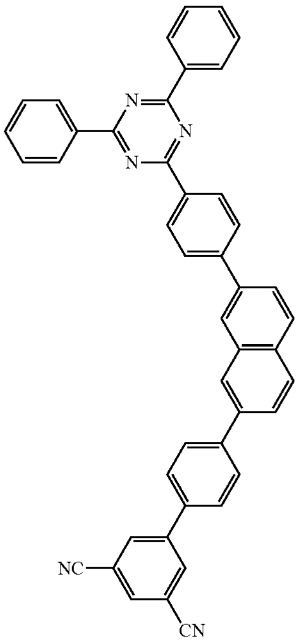
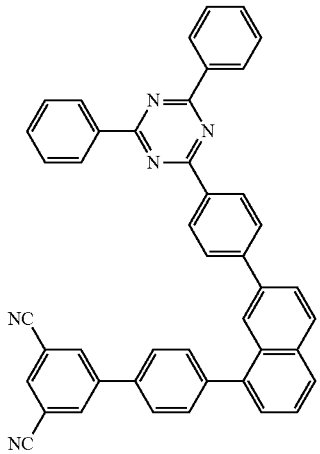
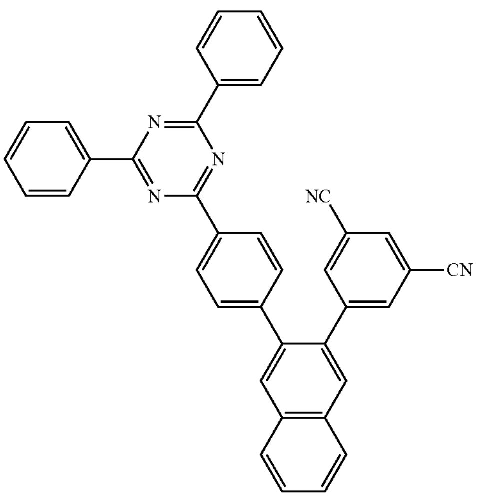
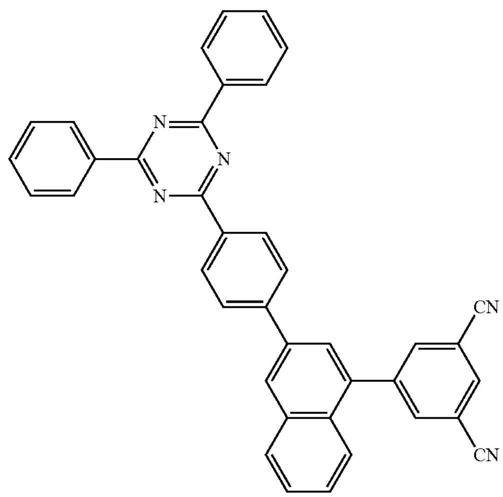
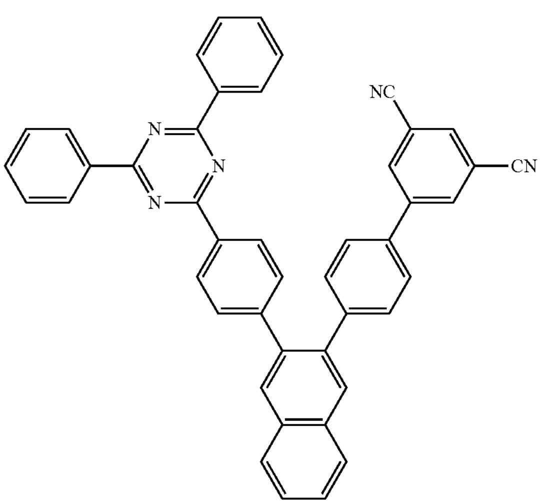

-continued

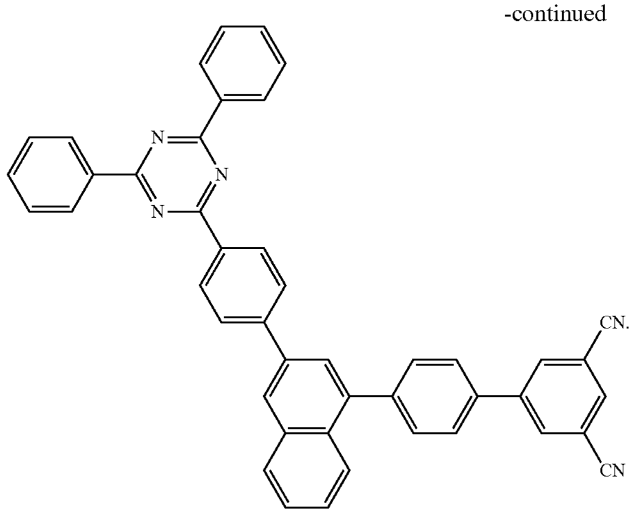

13. The organic light emitting device of claim 1, wherein the compound of Chemical Formula 1 has a HOMO energy level of 6.0 eV or greater.

14. The organic light emitting device of claim 1, wherein the compound of Chemical Formula 1 has a triplet energy level of 2.5 eV or greater.

15. The organic light emitting device of claim 1, wherein the compound of Chemical Formula 1 has a bandgap of 3.0 eV or greater.

16. The organic light emitting device of claim 1, wherein the organic material layer further includes one or more organic material layers selected from among a hole injection layer, a hole transfer layer and an electron injection layer.

* * * * *

UNITED STATES PATENT AND TRADEMARK OFFICE
CERTIFICATE OF CORRECTION

PATENT NO. : 11,152,576 B2
APPLICATION NO. : 16/604117
DATED : October 19, 2021
INVENTOR(S) : Dong Uk Heo et al.

It is certified that error appears in the above-identified patent and that said Letters Patent is hereby corrected as shown below:

In the Claims

At Column 419, Lines 63-67, Column 420, Lines 15-67, Column 421, Lines 1-67, and Column 422, Lines 1-56, please replace Claim 1 with the following Claim 1:

1. An organic light emitting device, comprising:

an anode;

a cathode; and a light emitting layer provided between the anode and the cathode, the device further comprising:

an electron control layer provided between the light emitting layer and the cathode and including a compound of the following Chemical Formula 1; and an electron transfer layer provided between the electron control layer and the cathode and including a compound of the following Chemical Formula 3:

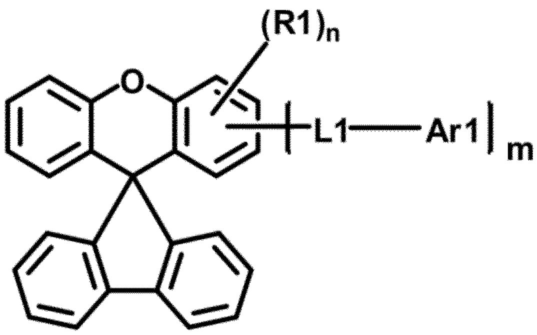

[Chemical Formula 1]

wherein in Chemical Formula 1:

Rl is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office* substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

L1 is a direct bond, a substituted or unsubstituted arylene group, or a substituted or unsubstituted heteroarylene group;

Ar1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, a substituted or unsubstituted monocyclic heterocyclic group, a substituted or unsubstituted tricyclic or higher heterocyclic group, a substituted or unsubstituted dicyclic heterocyclic group including two or more Ns, a substituted or unsubstituted isoquinolyl group, or a structure of the following Chemical Formula 2;

m is an integer of 1 to 4, n is an integer of 0 to 3, and $1 \leq n+m \leq 4$; and when m and n are each an integer of 2 or greater, structures in the two or more parentheses are the same as or different from each other,

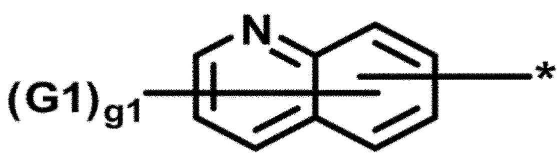

[Chemical Formula 2]

wherein in Chemical Formula 2:

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted orunsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, G1s are the same as or different from each other; and

* is a site bonding to L1 of Chemical Formula 1,

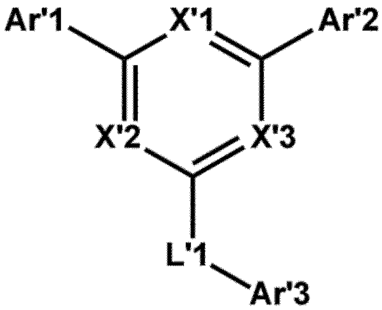

[Chemical Formula 3]

wherein in Chemical Formula 3:

Ar'1 and Ar'2 are the same as or different from each other, and each independently is a substituted or unsubstituted aryl group or a substituted or unsubstituted heteroaryl group;

X'1 is N or CR'1, X'2 is N or CR'2, and X'3 is N or CR'3;

at least two of X'1 to X'3 are N;

L'1 is a direct bond, a substituted or unsubstituted arylene group, or a substituted or unsubstituted heteroarylene group;

R'1 to R'3 are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group; and Ar'3 is one of the following Chemical Formula 4a, 4b or 4c:

[Chemical Formula 4a]

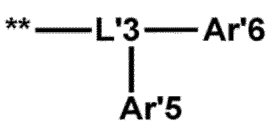

[Chemical Formula 4b]

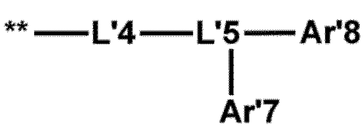

[Chemical Formula 4c]

wherein in in Chemical Formulae 4a to 4c:

** is a site bonding to L'1 of Chemical Formula 3;

n1 is an integer of 1 to 3;

L'2 and L'4 are the same as or different from each other, and each independently is a direct bond, a substituted or unsubstituted alkylene group, a substituted or unsubstituted arylene group, or a substituted or unsubstituted heteroarylene group;

L'3 and L'5 are the same as or different from each other, and each independently is a substituted or unsubstituted trivalent aryl group or a substituted or unsubstituted trivalent heteroaryl group;

Ar'4 to Ar'8 are the same as or different from each other, and each independently is a nitrile group, an aryl group unsubstituted or substituted with one, two or more substituents selected from the group consisting of a substituted or unsubstituted alkyl group, a substituted or unsubstituted aryl group, a substituted or unsubstituted pyridyl group, a substituted or unsubstituted carbazole group and a nitrile group, or a substituted or unsubstituted heteroaryl group.

In Claim 11, at Column 738, Lines 15-29, please replace the second chemical structure with the following structure:

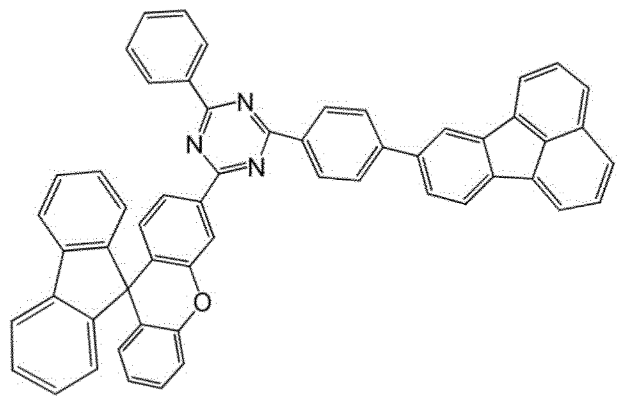

In Claim 12, at Column 793, please add a period at the end of the claim: